US012514107B2

(12) United States Patent
Parham et al.

(10) Patent No.: US 12,514,107 B2
(45) Date of Patent: Dec. 30, 2025

(54) ORGANIC ELECTROLUMINESCENT APPARATUS

(71) Applicant: Merck Patent GmbH, Darmstadt (DE)

(72) Inventors: Amir Hossain Parham, Darmstadt (DE); Christian Ehrenreich, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 648 days.

(21) Appl. No.: 17/910,003

(22) PCT Filed: Mar. 8, 2021

(86) PCT No.: PCT/EP2021/055735

§ 371 (c)(1),
(2) Date: Sep. 8, 2022

(87) PCT Pub. No.: WO2021/180625

PCT Pub. Date: Sep. 16, 2021

(65) Prior Publication Data

US 2023/0157151 A1 May 18, 2023

(30) Foreign Application Priority Data

Mar. 11, 2020 (EP) .................................... 20162386

(51) Int. Cl.

| | |
|---|---|
| ***H10K 50/12*** | (2023.01) |
| ***H10K 50/81*** | (2023.01) |
| ***H10K 50/82*** | (2023.01) |
| ***H10K 71/16*** | (2023.01) |
| ***H10K 85/30*** | (2023.01) |
| ***H10K 85/60*** | (2023.01) |

(52) U.S. Cl.

CPC ........... *H10K 85/342* (2023.02); *H10K 50/12* (2023.02); *H10K 50/81* (2023.02); *H10K 50/82* (2023.02); *H10K 71/164* (2023.02); *H10K 85/6572* (2023.02)

(58) Field of Classification Search

CPC .. H10K 85/342; H10K 85/6572; H10K 50/12; H10K 50/81; H10K 50/82; H10K 71/164

USPC .................................................... 252/301.16

See application file for complete search history.

(56) References Cited

U.S. PATENT DOCUMENTS

| | | | |
|---|---|---|---|
| 6,392,250 | B1 | 5/2002 | Aziz et al. |
| 6,803,720 | B2 | 10/2004 | Kwong et al. |
| 2015/0333273 | A1 | 11/2015 | Lee et al. |
| 2016/0329506 | A1 | 11/2016 | Lee et al. |
| 2018/0337348 | A1 | 11/2018 | Jung et al. |
| 2019/0006590 | A1 | 1/2019 | Park et al. |
| 2019/0013490 | A1 | 1/2019 | Cho et al. |
| 2019/0037012 | A1 | 1/2019 | Stöcker |
| 2019/0047991 | A1 | 2/2019 | Jung et al. |
| 2019/0372012 | A1 | 12/2019 | Cho et al. |
| 2020/0111969 | A1 | 4/2020 | No et al. |
| 2021/0184131 | A1 | 6/2021 | Jung et al. |

FOREIGN PATENT DOCUMENTS

| | | | |
|---|---|---|---|
| CN | 107973786 | A | 5/2018 |
| JP | 2019-513131 | A | 5/2019 |
| KR | 2012-0129733 | A | 11/2011 |
| KR | 10-2016-0046077 | A | 4/2016 |
| KR | 10-2017-0113318 | A | 10/2017 |
| KR | 10-2018-0012499 | A | 2/2018 |
| KR | 10-2018-0061076 | A | 6/2018 |
| WO | 2011/088877 | A1 | 7/2011 |
| WO | 2015/105251 | A1 | 7/2015 |
| WO | 2015/169412 | A1 | 11/2015 |
| WO | 2018/174679 | A1 | 9/2018 |
| WO | 2019/031679 | A1 | 2/2019 |
| WO | 2019/070083 | A1 | 4/2019 |
| WO | 2020/022779 | A1 | 1/2020 |
| WO | 2020/022860 | A1 | 1/2020 |

OTHER PUBLICATIONS

International Search Report received for PCT Patent Application No. PCT/EP2021/055735, mailed on Jun. 22, 2021, 11 pages (2 pages of English Translation and 9 pages of Original Document).

*Primary Examiner* — Anita Nassiri-Motlagh
(74) *Attorney, Agent, or Firm* — Faegre Drinker Biddle & Reath LLP

(57) ABSTRACT

The present invention relates to an organic electroluminescent device comprising a mixture comprising an electron-transporting host material and a hole-transporting host material, and to a formulation comprising a mixture of the host materials and to a mixture comprising the host materials. The electron-transporting host material corresponds to a compound of the formula (1) from the class of dibenzofuran or dibenzothiophene derivatives containing a substituted pyridine, pyrimidine or triazine unit and a substituted further dibenzofuran or dibenzothiophene unit.

15 Claims, No Drawings

ORGANIC ELECTROLUMINESCENT APPARATUS

CROSS-REFERENCE TO RELATED APPLICATIONS

This application is a national stage application (under 35 U.S.C. § 371) of PCT/EP2021/055735, filed Mar. 8, 2021, which claims benefit of European Application No. 20162386.5, filed Mar. 11, 2020, both of which are incorporated herein by reference in their entirety.

The present invention relates to an organic electroluminescent device comprising a mixture comprising an electron-transporting host material and a hole-transporting host material, and to a formulation comprising a mixture of the host materials and to a mixture comprising the host materials. The electron-transporting host material corresponds to a compound of the formula (1) from the class of dibenzofuran or dibenzothiophene derivatives containing a substituted pyridine, pyrimidine or triazine unit and a substituted further dibenzofuran or dibenzothiophene unit.

The structure of organic electroluminescent devices (e.g. OLEDs—organic light-emitting diodes or OLECs—organic light-emitting electrochemical cells) in which organic semiconductors are used as functional materials has long been known. Emitting materials used here, aside from fluorescent emitters, are increasingly organometallic complexes which exhibit phosphorescence rather than fluorescence. For quantum-mechanical reasons, up to a fourfold increase in energy efficiency and power efficiency is possible using organometallic compounds as phosphorescent emitters. In general terms, however, there is still a need for improvement in OLEDs, especially also in OLEDs which exhibit triplet emission (phosphorescence), for example with regard to efficiency, operating voltage and lifetime.

The properties of organic electroluminescent devices are not only determined by the emitters used. Also of particular significance here are especially the other materials used, such as host and matrix materials, hole blocker materials, electron transport materials, hole transport materials and electron or exciton blocker materials, and among these especially the host or matrix materials. Improvements to these materials can lead to distinct improvements to electroluminescent devices.

Host materials for use in organic electronic devices are well known to the person skilled in the art. The term "matrix material" is also frequently used in the prior art when what is meant is a host material for phosphorescent emitters. This use of the term is also applicable to the present invention. In the meantime, a multitude of host materials has been developed both for fluorescent and for phosphorescent electronic devices.

A further means of improving the performance data of electronic devices, especially of organic electroluminescent devices, is to use combinations of two or more materials, especially host materials or matrix materials.

U.S. Pat. No. 6,392,250 B1 discloses the use of a mixture consisting of an electron transport material, a hole transport material and a fluorescent emitter in the emission layer of an OLED. With the aid of this mixture, it was possible to improve the lifetime of the OLED compared to the prior art.

U.S. Pat. No. 6,803,720 B1 discloses the use of a mixture comprising a phosphorescent emitter and a hole transport material and an electron transport material in the emission layer of an OLED. Both the hole transport material and the electron transport material are small organic molecules.

According to KR20120129733, for example, it is possible to use compounds containing two dibenzothiophene units in a light-emitting layer.

WO2011088877 describes specific heterocyclic compounds that can be used in an organic light-emitting device as light-emitting compound, or as host material or hole-transporting material.

According to WO2015169412, it is possible to use triazine-dibenzofuran-carbazole derivatives and triazine-dibenzothiophene-carbazole derivatives, for example, in a light-emitting layer as host material.

According to WO2015105251, it is possible to use dibenzofuran-dibenzofuran derivatives, for example, as host material in a light-emitting layer.

U.S. Pat. No. 9,771,373 describes specific carbazole derivatives as host material for a light-emitting layer of an electroluminescent device that can be used together with a further host material.

KR20160046077 describes specific triazine-dibenzofuran-carbazole and triazine-dibenzothiophene-carbazole derivatives in a light-emitting layer together with a further host material and a specific emitter. The carbazole here is bonded to the dibenzofuran or dibenzothiophene unit via the nitrogen atom.

KR20170113318 describes specific heterocyclic compounds that can be used as host material in a light-emitting layer of an organic light-emitting device.

CN107973786 describes triazine-dibenzofuran-carbazole and triazine-dibenzothiophene-carbazole compounds. The triazine substituent is bonded directly or via a linker in the 1 position of the dibenzofuran/dibenzothiophene. The carbazole derivative is bonded directly via the nitrogen atom or via a linker in the 6 position of the dibenzofuran/dibenzothiophene. It is further reported that these materials can be mixed with a biscarbazole H2 in a ratio of 10:90 to 90:10.

US2018337348 describes an electronic device comprising, in the light-emitting layer, two host materials as described, for example, in table 2.

WO2018174679 describes an electronic device comprising, in the light-emitting layer, two host materials as described, for example, in table 19.

KR20180061076 describes an electronic device comprising, in the light-emitting layer, two host materials as described, for example, in table 1.

US2019013490 describes an electronic device comprising, in the light-emitting layer, two host materials as described, for example, in table 3.

US20190006590 describes an electronic device comprising a specific sequence of two emitting layers, where each emitting layer contains two host materials. The first emitting layer comprises host 1-1 and host 1-2. The second emitting layer comprises host 2-1 and host 2-2, where host 1-2 and host 2-1 are the same material. Claims 7 and 8 describe specific biscarbazoles as host material 1-2. Claims 9 and 10 describe specific triazine derivatives as host material 2-2.

US2019047991 describes doubly substituted triazine-dibenzofuran derivatives and the use thereof as organic material in an organic light-emitting device.

WO19031679 describes organic light-emitting devices containing, in the emitting layer, a first host material comprising doubly substituted triazine-dibenzofuran derivative and a second host material.

US2019037012 describes organic light-emitting devices comprising, in the emitting layer, a first host material comprising two dibenzofuran units bonded to one another, and a second host material, for example biscarbazoles.

WO2020022779 describes organic light-emitting devices comprising, in the emitting layer, a first host material comprising three dibenzofuran and/or dibenzothiophene units bonded to one another, and a second host material, for example biscarbazoles.

WO2020022860 describes organic light-emitting devices containing, in the emitting layer, a deuterated triazine derivative and a biscarbazole derivative.

However, there is still need for improvement in the case of use of these materials or in the case of use of mixtures of the materials, especially in relation to efficiency, operating voltage and/or lifetime of the organic electroluminescent device.

The problem addressed by the present invention is therefore that of providing a combination of host materials which are suitable for use in an organic electroluminescent device, especially in a fluorescent or phosphorescent OLED, and lead to good device properties, especially with regard to an improved lifetime, and that of providing the corresponding electroluminescent device.

It has now been found that this problem is solved, and the disadvantages from the prior art are eliminated, by the combination of at least one compound of the formula (1) as first host material and at least one hole-transporting compound of the formula (2) as second host material in a light-emitting layer of an organic electroluminescent device. The use of such a material combination for production of the light-emitting layer in an organic electroluminescent device leads to very good properties of these devices, especially with regard to lifetime, especially with equal or improved efficiency and/or operating voltage. The advantages are especially also manifested in the presence of a light-emitting component in the emission layer, especially in the case of combination with emitters of the formula (III), at concentrations between 2% and 15% by weight.

The present invention therefore first provides an organic electroluminescent device comprising an anode, a cathode and at least one organic layer, containing at least one light-emitting layer, wherein the at least one light-emitting layer contains at least one compound of the formula (1) as host material 1 and at least one compound of the formula (2) as host material 2

Formula (1)

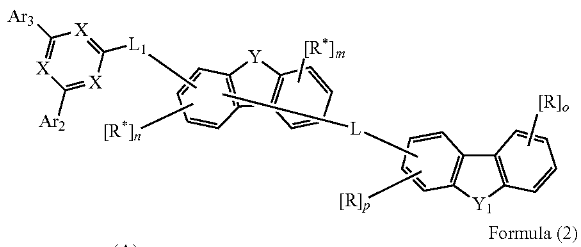

Formula (2)

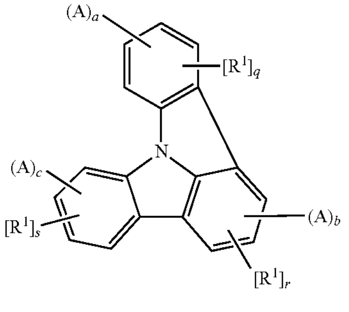

where the symbols and indices used are as follows:

X is the same or different at each instance and is $CR^0$ or N, where at least one symbol X is N;

$X_2$ is the same or different at each instance and is CH, $CR^1$ or N, where not more than 2 symbols $X_2$ can be N;

Y and $Y_1$ are the same or different at each instance and are selected from O and S;

L is the same or different at each instance and is a single bond or an aromatic ring system having 6 to 30 aromatic ring atoms;

$L_1$ is the same or different at each instance and is a single bond or an aromatic or heteroaromatic ring system having 5 to 30 aromatic ring atoms;

$R^0$ at each instance is independently H, D or an unsubstituted or partly or fully deuterated aromatic ring system having 6 to 18 carbon atoms;

R* at each instance is independently D or an aromatic or heteroaromatic ring system that has 6 to 18 carbon atoms and may be partly or fully deuterated;

R #is the same or different at each instance and is selected from the group consisting of D, F, Cl, Br, I, CN, $NO_2$, $C(=O)R^2$, $P(=O)(Ar_1)_2$, $P(Ar_1)_2$, $B(Ar_1)_2$, $Si(Ar_1)_3$, $Si(R^2)_3$, a straight-chain alkyl, alkoxy or thioalkyl group having 1 to 20 carbon atoms or a branched or cyclic alkyl, alkoxy or thioalkyl group having 3 to 20 carbon atoms or an alkenyl group having 2 to 20 carbon atoms, each of which may be substituted by one or more $R^2$ radicals, where one or more nonadjacent $CH_2$ groups may be replaced by $R^2C{=}CR^2$, $Si(R^2)_2$, C=O, C=S, $C{=}NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals;

R is the same or different at each instance and is selected from the CN group, an aromatic ring system having 6 to 40 aromatic ring atoms and a heteroaromatic ring system having 10 to 40 aromatic ring atoms, where the ring systems may be substituted by one or more $R^2$ radicals and where the heteroaromatic ring system is bonded via N when the heteroaromatic ring system contains a nitrogen atom;

$R^1$ is the same or different at each instance and is selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, or an aryloxy or heteroaryloxy group having 5 to 40 aromatic ring atoms, or an aralkyl or heteroaralkyl group having 5 to 40 aromatic ring atoms; at the same time, it is possible for two substituents bonded to the same carbon atom or to adjacent carbon atoms to form a monocyclic or polycyclic, aliphatic, aromatic or heteroaromatic ring system that may be substituted by one or more $R^2$ radicals;

$R^2$ is the same or different at each instance and is selected from the group consisting of H, D, F, Cl, Br, I, CN, $NO_2$, $N(Ar_1)_2$, $NH_2$, $N(R^3)_2$, $C(=O)Ar_1$, C(=O)H, $C(=O)R^3$, $P(=O)(Ar_1)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^3$ radicals, where one or more nonadjacent $CH_2$ groups may be replaced by HC═CH, $R^3C$═$CR^3$, C≡C, $Si(R^3)_2$, $Ge(R^3)_2$, $Sn(R^3)_2$, C═O, C═S, C═Se, C═$NR^3$, P(═O)($R^3$), SO, $SO_2$, NH, $NR^3$, O, S, CONH or $CONR^3$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^3$ radicals, an aryloxy or heteroaryloxy group which has 5 to 60 aromatic ring atoms and may be substituted by one or more $R^3$ radicals, or a combination of these systems, where it is optionally possible for two or more adjacent substituents $R^2$ to form a monocyclic or polycyclic, aliphatic, aromatic or heteroaromatic ring system which may be substituted by one or more $R^3$ radicals;

$R^3$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F, Cl, Br, I or CN and which may be substituted by one or more alkyl groups each having 1 to 4 carbon atoms; at the same time, it is possible for two or more adjacent $R^3$ substituents together to form a mono- or polycyclic, aliphatic ring system;

$Ar_1$ is the same or different at each instance and is an aromatic or heteroaromatic ring system which has 5 to 30 aromatic ring atoms and may be substituted by one or more nonaromatic $R^3$ radicals; at the same time, two $Ar_1$ radicals bonded to the same nitrogen atom, phosphorus atom or boron atom may also be bridged to one another by a single bond or a bridge selected from $N(R^3)$, $C(R^3)_2$, O and S;

$Ar_2$ and $Ar_3$ at each instance are each independently an aryl or heteroaryl group which has 5 to 40 aromatic ring atoms and may be substituted by one or more $R^2$ radicals;

A at each instance is independently a group of the formula (3) or (4),

Formula (3)

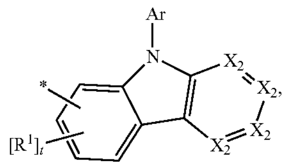

Formula (4)

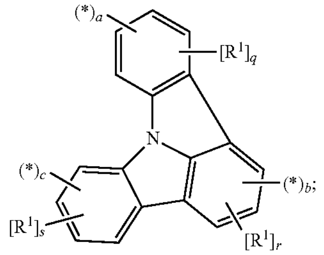

Ar at each instance is in each case independently an aryl group which has 6 to 40 aromatic ring atoms and may be substituted by one or more R #radicals, or a heteroaryl group which has 5 to 40 aromatic ring atoms and may be substituted by one or more R #radicals;

* indicates the binding site to the formula (2);

a, b, c at each instance are each independently 0 or 1, where the sum total of the indices at each instance a+b+c is 1;

m and o at each instance are independently 0, 1, 2, 3 or 4;

n and p at each instance are each independently 0, 1, 2 or 3; and q, r, s, t at each instance are each independently 0 or 1.

The invention further provides a process for producing the organic electroluminescent devices and mixtures comprising at least one compound of the formula (1) and at least one compound of the formula (2), specific material combinations and formulations that contain such mixtures or material combinations. The corresponding preferred embodiments as described hereinafter likewise form part of the subject-matter of the present invention. The surprising and advantageous effects are achieved through specific selection of the compounds of the formula (1) and the compounds of the formula (2).

The organic electroluminescent device of the invention is, for example, an organic light-emitting transistor (OLET), an organic field quench device (OFQD), an organic light-emitting electrochemical cell (OLEC, LEC, LEEC), an organic laser diode (0-laser) or an organic light-emitting diode (OLED). The organic electroluminescent device of the invention is especially an organic light-emitting diode or an organic light-emitting electrochemical cell. The device of the invention is more preferably an OLED.

The organic layer of the device of the invention that contains the light-emitting layer containing the material combination of at least one compound of the formula (1) and at least one compound of the formula (2), as described above or described hereinafter, preferably comprises, in addition to this light-emitting layer (EML), a hole injection layer (HIL), a hole transport layer (HTL), an electron transport layer (ETL), an electron injection layer (EIL) and/or a hole blocker layer (HBL). It is also possible for the device of the invention to include multiple layers from this group selected from EML, HIL, HTL, ETL, EIL and HBL.

However, the device may also comprise inorganic materials or else layers formed entirely from inorganic materials.

It is preferable that the light-emitting layer containing at least one compound of the formula (1) and at least one compound of the formula (2) is a phosphorescent layer which is characterized in that it comprises, in addition to the host material combination of the compounds of the formula (1) and formula (2), as described above, at least one phosphorescent emitter. A suitable selection of emitters and preferred emitters is described hereinafter.

An aryl group in the context of this invention contains 6 to 40 aromatic ring atoms, preferably carbon atoms. A heteroaryl group in the context of this invention contains 5 to 40 aromatic ring atoms, where the ring atoms include carbon atoms and at least one heteroatom, with the proviso that the sum total of carbon atoms and heteroatoms adds up to at least 5. The heteroatoms are preferably selected from N, O and/or S. An aryl group or heteroaryl group is understood here to mean either a simple aromatic cycle, i.e. phenyl, derived from benzene, or a simple heteroaromatic cycle, for example derived from pyridine, pyrimidine or thiophene, or a fused aryl or heteroaryl group, for example derived from naphthalene, anthracene, phenanthrene, quinoline or isoquinoline. An aryl group having 6 to 18 carbon atoms is therefore preferably phenyl, naphthyl, phenanthryl or triphenylenyl, with no restriction in the attachment of the aryl group as substituent. The aryl or heteroaryl group in the context of this invention may bear one or more R radicals, where the substituent R is described below.

An aromatic ring system in the context of this invention contains 6 to 40 carbon atoms in the ring system. The aromatic ring system also includes aryl groups as described above.

An aromatic ring system having 6 to 18 carbon atoms is preferably selected from phenyl, fully deuterated phenyl, biphenyl, naphthyl, phenanthryl and triphenylenyl.

A heteroaromatic ring system in the context of this invention contains 5 to 40 ring atoms and at least one heteroatom. A preferred heteroaromatic ring system has 10 to 40 ring atoms and at least one heteroatom. The heteroaromatic ring system also includes heteroaryl groups as described above. The heteroatoms in the heteroaromatic ring system are preferably selected from N, O and/or S.

An aromatic or heteroaromatic ring system in the context of this invention is understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic or heteroaromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, are likewise encompassed by the definition of the aromatic or heteroaromatic ring system.

An aromatic or heteroaromatic ring system which has 5-40 aromatic ring atoms and may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

The abbreviation $Ar_1$ is the same or different at each instance and is an aromatic or heteroaromatic ring system which has 5 to 30 aromatic ring atoms and may be substituted by one or more nonaromatic $R^3$ radicals; at the same time, two $Ar_1$ radicals bonded to the same nitrogen atom, phosphorus atom or boron atom may also be bridged to one another by a single bond or a bridge selected from $N(R^3)$, $C(R^3)_2$, O and S, where the $R^3$ radical or the substituents $R^3$ has/have a definition as described above or hereinafter. Preferably, $Ar_1$ is an aryl group having 6 to 40 aromatic ring atoms as described above. Most preferably, $Ar_1$ is phenyl which may be substituted by one or more nonaromatic $R^3$ radicals. $Ar_1$ is preferably unsubstituted.

The abbreviation $Ar_2$ at each instance is in each case independently an aryl or heteroaryl group which has 5 to 40 aromatic ring atoms and may be substituted by one or more $R^2$ radicals, where the $R^2$ radical or the substituents $R^2$ has/have a definition as described above or hereinafter. The details given for the aryl and heteroaryl groups having 5 to 40 aromatic ring atoms apply here correspondingly.

The abbreviation $Ar_3$ at each instance is in each case independently an aryl or heteroaryl group which has 5 to 40 aromatic ring atoms and may be substituted by one or more $R^2$ radicals, where the $R^2$ radical or the substituents $R^2$ has/have a definition as described above or hereinafter. The details given for the aryl and heteroaryl groups having 5 to 40 aromatic ring atoms apply here correspondingly.

The abbreviation Ar at each instance is in each case independently an aryl group which has 6 to 40 aromatic ring atoms and may be substituted by one or more R #radicals, or a heteroaryl group which has 5 to 40 aromatic ring atoms and may be substituted by one or more R #radicals, where the details for the aryl group or heteroaryl group apply correspondingly, as described above. The R #radical or the R #radicals has/have a definition as described above or described hereinafter. The abbreviation Ar at each instance is preferably in each case independently an aryl group which has 6 to 40 aromatic ring atoms and may be substituted by one or more R #radicals, or a heteroaryl group having 5 to 40 aromatic ring atoms and containing 0 or S as heteroatom, which may be substituted by one or more R #radicals, where the details for the aryl group, heteroaryl group and R #as described above or hereinafter are applicable correspondingly.

A cyclic alkyl, alkoxy or thioalkyl group in the context of this invention is understood to mean a monocyclic, bicyclic or polycyclic group.

In the context of the present invention, a straight-chain, branched or cyclic $C_1$- to $C_{20}$-alkyl group is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals.

A straight-chain or branched $C_1$- to $C_{20}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

A straight-chain $C_1$- to $C_{20}$-thioalkyl group is understood to mean, for example, S-alkyl groups, for example thiomethyl, 1-thioethyl, 1-thio-i-propyl, 1-thio-n-propyl, 1-thio-i-butyl, 1-thio-n-butyl or 1-thio-t-butyl.

An aryloxy or heteroaryloxy group having 5 to 40 aromatic ring atoms means O-aryl or O-heteroaryl and means that the aryl or heteroaryl group is bonded via an oxygen atom, where the aryl or heteroaryl group is defined as described above.

An aralkyl or heteroaralkyl group having 5 to 40 aromatic ring atoms means that an alkyl group as described above is substituted by an aryl group or heteroaryl group, where the aryl or heteroaryl group is defined as described above.

A phosphorescent emitter in the context of the present invention is a compound that exhibits luminescence from an excited state with higher spin multiplicity, i.e. a spin state >1, especially from an excited triplet state. In the context of this application, all luminescent complexes with transition metals or lanthanides are to be regarded as phosphorescent emitters. A more exact definition is given hereinafter.

When the host materials of the light-emitting layer comprising at least one compound of the formula (1) as described above or described as preferred hereinafter and at least one compound of the formula (2) as described above or described hereinafter are used for a phosphorescent emitter, it is preferable when the triplet energy thereof is not significantly less than the triplet energy of the phosphorescent emitter. In respect of the triplet level, it is preferably the case that $T_1(\text{emitter})-T_1(\text{matrix})\leq 0.2$ eV, more preferably $\leq 0.15$ eV, most preferably $\leq 0.1$ eV. $T_1(\text{matrix})$ here is the triplet level of the matrix material in the emission layer, this condition being applicable to each of the two matrix materials, and $T_1(\text{emitter})$ is the triplet level of the phosphorescent emitter. If the emission layer contains more than two matrix materials, the abovementioned relationship is preferably also applicable to every further matrix material.

There follows a description of the host material 1 and its preferred embodiments that is/are present in the device of the invention. The preferred embodiments of the host material 1 of the formula (1) are also applicable to the mixture and/or formulation of the invention.

In compounds of the formula (1), the symbol Y is O or S.

In a preferred embodiment of the compounds of the formula (1), the symbol Y is preferably O.

The invention therefore further provides the electroluminescent device as described above, wherein Y in the host material 1 is O.

Compounds of the formula (1) in which Y is preferably O can be described by the formulae (1a) and (1b)

Formula (1a)

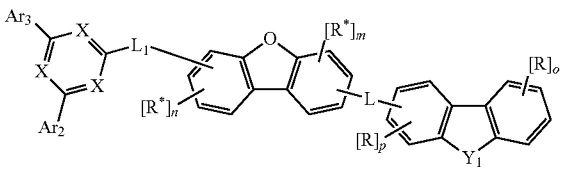

Formula (1b)

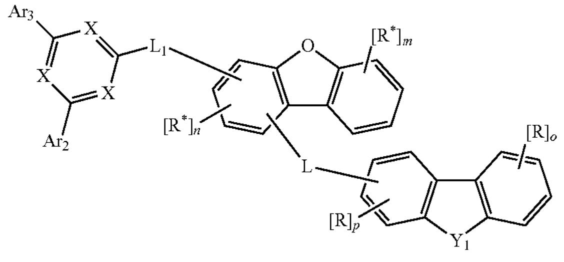

where $Ar_2$, $Ar_3$, $L_1$, R*, n, m, L, R, p, $Y_1$ and o have a definition given above or a definition given hereinafter as preferred.

In a preferred embodiment of the compounds of the formula (1), the symbol Y is preferably S.

The invention therefore further provides the electroluminescent device as described above, wherein Y in the host material 1 is S.

Compounds of the formula (1) in which Y is preferably S can be described by the formulae (1c) and (1d)

Formula (1c)

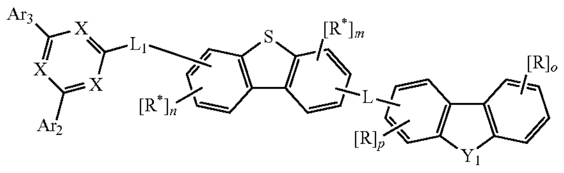

Formula (1d)

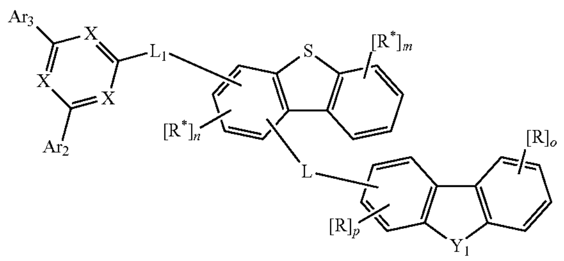

where $Ar_2$, $Ar_3$, $L_1$, R*, n, m, L, R, p, $Y_1$ and o have a definition given above or a definition given hereinafter as preferred.

In compounds of the formulae (1), (1a), (1b), (1c) and (1d) or preferred embodiments of the host material of the formulae (1), (1a), (1b), (1c) and (1d), the symbol X is $CR^0$ or N, where at least one X group is N.

The substituent

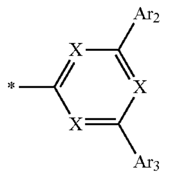

therefore has the following definitions, where * indicates the bonding site via $L_1$ to the dibenzofuran or dibenzothiophene and $R^0$, $Ar_2$ and $Ar_3$ have a definition given above or a definition given as preferred:

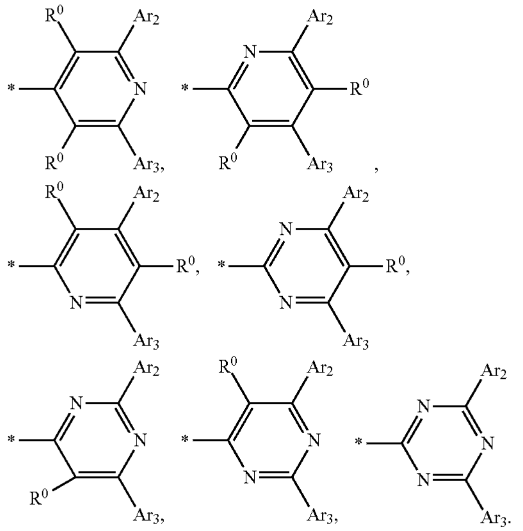

In host material 1, X is preferably N at two instances and one X is $CR^0$, or all X are N.

The present invention therefore further provides the electroluminescent device as described above or described as preferred, wherein, in host material 1, the symbol X is N at two instances and one X is $CR^0$, or the symbol X is N at three instances.

In host material 1, all X are more preferably N, where $R^0$ has a definition given above or given hereinafter.

$R^0$ at each instance is the same or different and is preferably selected from the group of H, D or an unsubstituted or partly or fully deuterated aromatic ring system having 6 to 18 carbon atoms. $R^0$ at each instance is preferably H, D or an unsubstituted aromatic ring system having 6 to 18 carbon atoms. $R^0$ at each instance is more preferably H.

In compounds of the formulae (1), (1a), (1b), (1c) and (1d) or preferred embodiments of the host material of the formulae (1), (1a), (1b), (1c) and (1d), the linker $L_1$ is a single bond or an aromatic or heteroaromatic ring system having 5 to 30 aromatic ring atoms.

In compounds of the formulae (1), (1a), (1 b), (1c) and (1d) or preferred embodiments of the host material of the formulae (1), (1a), (1 b), (1c) and (1d), the linker $L_1$ is preferably a bond or a linker selected from the group of L-1 to L-20

L-1

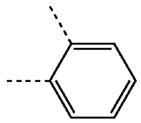

L-2

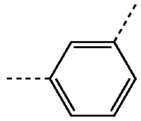

L-3

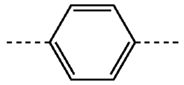

L-4

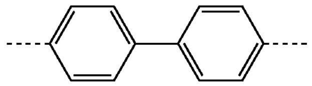

L-5

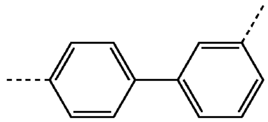

L-6

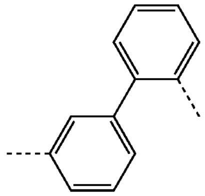

L-7

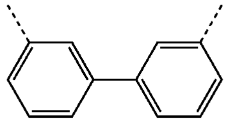

L-8

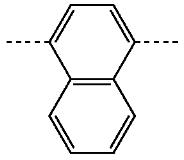

L-9

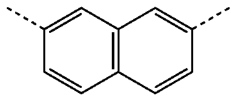

L-10

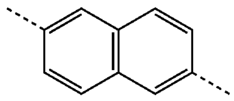

L-11

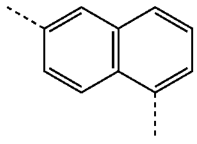

-continued

L-12

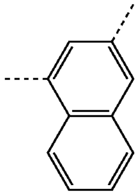

L-13

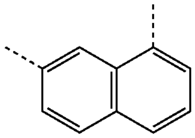

L-14

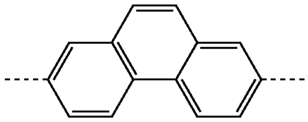

L-15

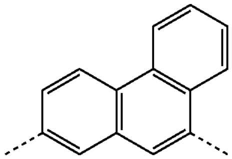

L-16

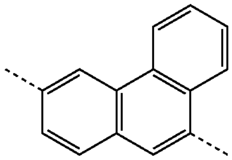

L-17

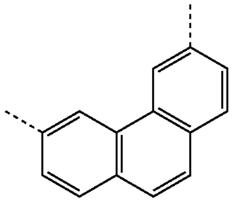

L-18

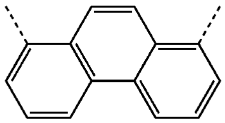

L-19

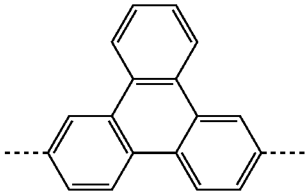

-continued

L-20

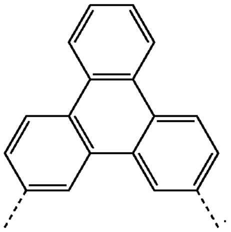

In compounds of the formulae (1), (1a), (1b), (1c) and (1d) or preferred embodiments of the host material of the formulae (1), (1a), (1b), (1c) and (1d), the linker $L_1$ is more preferably a bond or a linker selected from the group of L-2 and L-3.

In compounds of the formulae (1), (1a), (1b), (1c) and (1d) or preferred embodiments of the host material of the formulae (1), (1a), (1b), (1c) and (1d), the linker $L_1$ is most preferably a bond.

In compounds of the formulae (1), (1a), (1b), (1c) and (1d) or preferred embodiments of the host material of the formulae (1), (1a), (1b), (1c) and (1d), the linker L is a single bond or an aromatic ring system having 6 to 30 aromatic ring atoms.

In compounds of the formulae (1), (1a), (1 b), (1c) and (1d) or preferred embodiments of the host material of the formulae (1), (1a), (1 b), (1c) and (1d), the linker L is preferably a bond or a linker selected from the group of L-1 to L-20, as described above.

In compounds of the formulae (1), (1a), (1 b), (1c) and (1d) or preferred embodiments of the host material of the formulae (1), (1a), (1 b), (1c) and (1d), the linker L is more preferably a bond or a linker selected from the group of L-2 and L-3.

In compounds of the formulae (1), (1a), (1 b), (1c) and (1d) or preferred embodiments of the host material of the formulae (1), (1a), (1 b), (1c) and (1d), the linker L is most preferably a bond.

In compounds of the formulae (1), (1a), (1b), (1c) and (1d) or preferred embodiments of the host material of the formulae (1), (1a), (1b), (1c) and (1d), o is preferably 0, 1 or 2, more preferably 0 or 1, most preferably 1, where R has a preferred definition given above or given hereinafter.

In compounds of the formulae (1), (1a), (1b), (1c) and (1d) or preferred embodiments of the host material of the formulae (1), (1a), (1b), (1c) and (1d), p is preferably 0 or 1, more preferably 0, where R has a preferred definition given above or given hereinafter.

In compounds of the formulae (1), (1a), (1b), (1c) and (1d) or preferred embodiments of the host material of the formulae (1), (1a), (1b), (1c) and (1d), m is preferably 0, 1 or 2, more preferably 0 or 1, where R* has a preferred definition given above or given hereinafter.

In compounds of the formulae (1), (1a), (1b), (1c) and (1d) or preferred embodiments of the host material of the formulae (1), (1a), (1b), (1c) and (1d), n is preferably 0 or 1, more preferably 0, where R* has a preferred definition given above or given hereinafter.

R* is the same or different at each instance and is preferably selected from the group of D or an aromatic or heteroaromatic ring system which has 6 to 18 carbon atoms and may be partly or fully deuterated. R* at each instance is preferably phenyl, 1,3-biphenyl, 1,4-biphenyl, dibenzofuranyl or dibenzothiophenyl. R* at each instance is more preferably phenyl, 1,3-biphenyl, 1,4-biphenyl or dibenzofuranyl.

R is the same or different at each instance and is selected from the CN group, an aromatic ring system having 6 to 40 aromatic ring atoms and a heteroaromatic ring system having 10 to 40 aromatic ring atoms, where the ring systems may be substituted by one or more $R^2$ radicals and where the heteroaromatic ring system is bonded via N when the heteroaromatic ring system contains a nitrogen atom. R at each instance is preferably independently phenyl, triphenyl, biphenyl, dibenzofuranyl, dibenzothiophenyl, N-carbazolyl, fluorenyl, spirobifluorenyl, indolocarbazolyl, indenocarbazolyl, which may be substituted by one or more $R^2$ radicals. N-Carbazolyl is preferably substituted by phenyl. R at each instance is more preferably independently phenyl, triphenyl, biphenyl, dibenzofuranyl, dibenzothiophenyl, N-carbazolyl, fluorenyl, spirobifluorenyl, indolocarbazolyl, indenocarbazolyl or phenyl-substituted N-carbazolyl. R at each instance is most preferably independently phenyl, dibenzofuranyl or phenyl-substituted N-carbazolyl.

Compounds of the formula (1a) are preferred embodiments of the compounds of the formula (1) and of the host material 1.

In compounds of the formulae (1), (1a), (1b), (1c) and (1d) or preferred embodiments of the host material of the formulae (1), (1a), (1b), (1c) and (1d), $Y_1$ is O or S, preferably O.

In compounds of the formulae (1), (1a), (1b), (1c) and (1d), or preferred embodiments of the host material of the formulae (1), (1a), (1b), (1c) and (1d), each $Ar_2$ is preferably independently an aryl group having 6 to 40 carbon atoms, as described above or described as preferred, which may be substituted by one or more $R^2$ radicals, or is a heteroaryl group having 10 to 40 carbon atoms, as described above, which may be substituted by one or more $R^2$ radicals. It is possible here for two or more $R^2$ radicals bonded to the same carbon atom or to adjacent carbon atoms to form a monocyclic or polycyclic, aliphatic, aromatic or heteroaromatic ring system which may be substituted by one or more $R^3$ radicals.

The linkage of the aryl group or heteroaryl group is not limited here, and may be via a carbon atom or via a heteroatom, for example a nitrogen atom.

$Ar_2$ may preferably be selected from the following groups Ar-1 to Ar-19, where $R^2$ and $Ar_1$ have a definition specified above or specified as preferred, and wherein direct linkage of two heteroatoms to one another by $R^2$ or $Ar_1$ is ruled out:

Ar-1

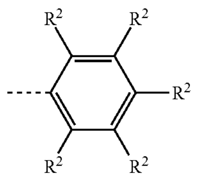

Ar-2

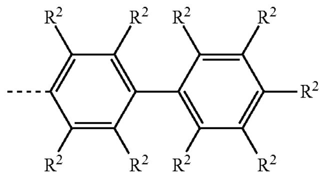

-continued

Ar-3

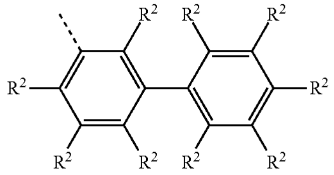

Ar-4

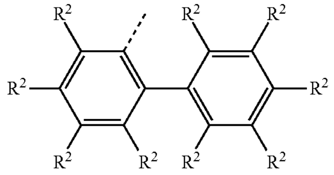

Ar-5

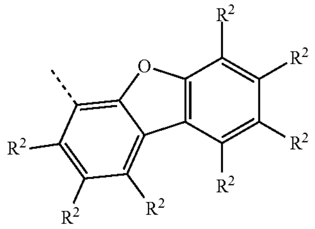

Ar-6

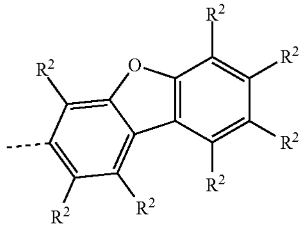

Ar-7

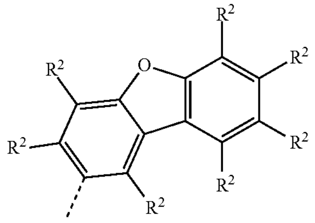

Ar-8

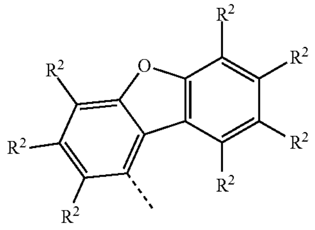

Ar-9

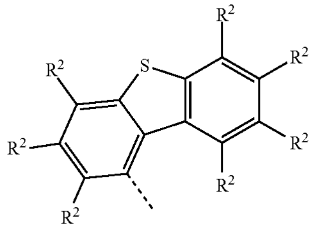

-continued

Ar-10

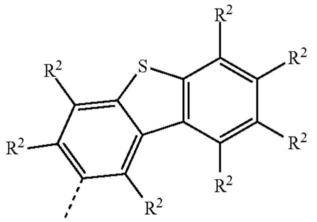

Ar-11

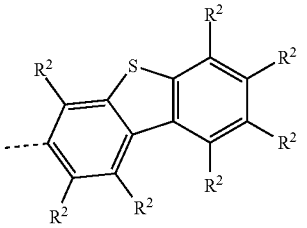

Ar-12

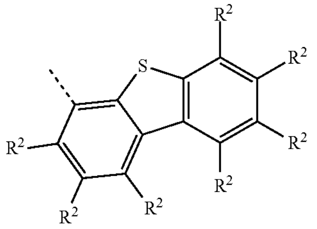

Ar-13

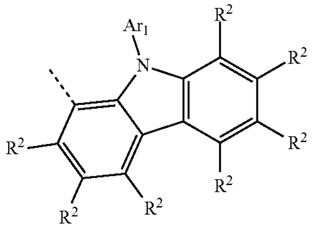

Ar-14

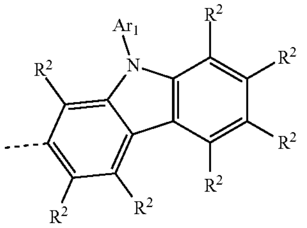

Ar-15

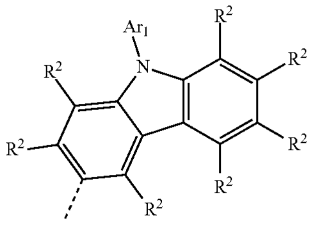

Ar-16

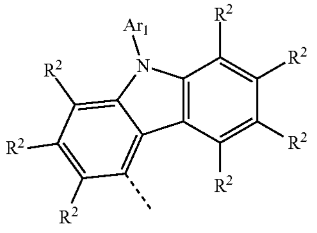

-continued

Ar-17

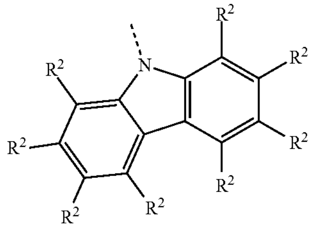

Ar-18

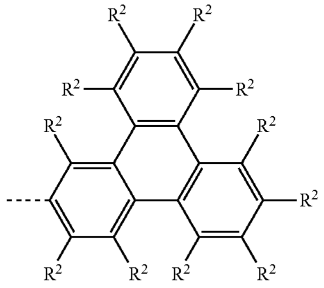

Ar-19

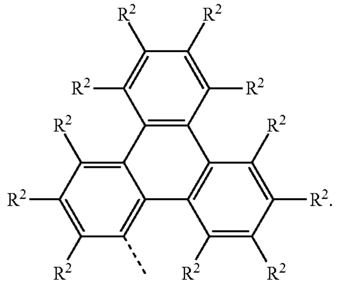

The dotted line indicates the bonding site to the radical of the formulae (1), (1a), (1b), (1c) or (1d).

More preferably, $Ar_2$ is Ar-1, Ar-2, Ar-3, Ar-6, Ar-14, Ar-17 and Ar-18, where $R^2$ and $Ar_1$ have a definition specified above or specified as preferred hereinafter.

In compounds of the formulae (1), (1a), (1b), (1c) and (1d), or preferred embodiments of the host material of the formulae (1), (1a), (1b), (1c) and (1d), each $Ar_3$ is preferably independently an aryl group having 6 to 40 carbon atoms, as described above or described as preferred, which may be substituted by one or more $R^2$ radicals, or is a heteroaryl group having 10 to 40 carbon atoms, as described above, which may be substituted by one or more $R^2$ radicals. It is possible here for two or more $R^2$ radicals bonded to the same carbon atom or to adjacent carbon atoms to form a monocyclic or polycyclic, aliphatic, aromatic or heteroaromatic ring system which may be substituted by one or more $R^3$ radicals.

The linkage of the aryl group or heteroaryl group is not limited here, and may be via a carbon atom or via a heteroatom, for example a nitrogen atom.

$Ar_3$ may preferably be selected from the following groups Ar-1 to Ar-19, where $R^2$ and $Ar_1$ have a definition specified above or specified as preferred, and wherein direct linkage of two heteroatoms to one another by $R^2$ or $Ar_1$ is ruled out.

More preferably, $Ar_3$ is Ar-1, Ar-2 and Ar-3, where $R^2$ and $Ar_1$ have a definition specified above or specified as preferred hereinafter.

$R^2$ in substituents of the formulae Ar-1 to Ar-19, as described above, is preferably selected from the group of H, D, CN, an aromatic or heteroaromatic ring system which has 5 to 40 aromatic ring atoms and may be substituted in each case by one or more $R^3$ radicals.

$R^2$ in substituents of the formulae Ar-1 to Ar-19, as described above, is more preferably H, D, phenyl or N-carbazolyl.

$Ar_1$ in substituents of the formulae Ar-13 to Ar-16, as described above, is preferably phenyl.

The linkage of the groups bonded via the linkers $L_1$ or L in the compounds of the formulae (1), (1a), (1b), (1c) and (1d) or preferred compounds of the formulae (1), (1a), (1b), (1c) and (1d) is not limited here and may be via any carbon atom.

More preferably, the substituent

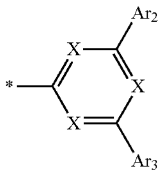

is bonded to the radical of the formulae (1), (1a), (1b), (1c) or (1d) via the linker $L_1$ in position 1, which, for compounds of the formula (1), can be represented in the formula (1e):

Formula (1e)

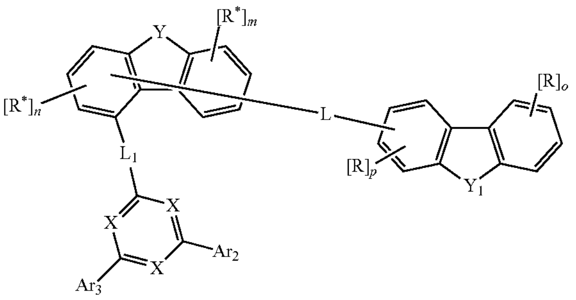

where $Ar_2$, $Ar_3$, X, $L_1$, R*, n, m, Y, L, R, p, o and $Y_1$ have a definition given above or given as preferred.

The substituent

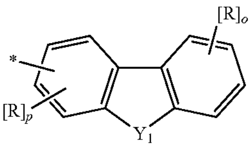

may be bonded to the radical of the formulae (1), (1a), (1b), (1c), (1d) and (1e) via the linker L in any position, as represented here by the substituents P-1 to P-4 and P-6 to P-9:

P-1

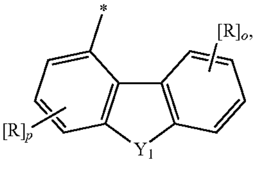

-continued

P-2

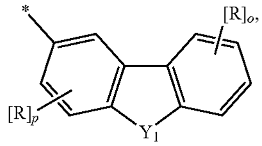

P-3

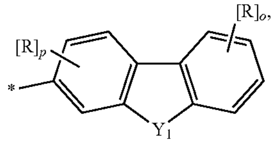

P-4

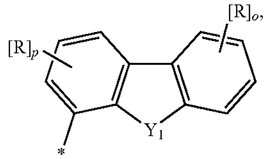

P-6

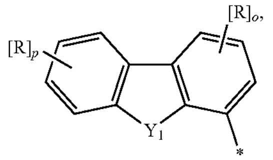

P-7

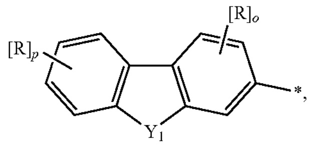

P-8

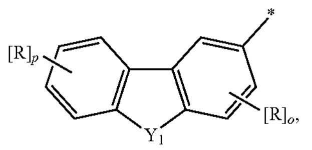

P-9

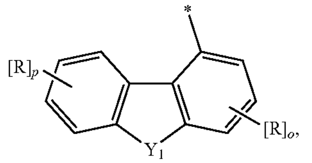

where * marks the bonding site to the linker L and R, p, o and $Y_1$ have a definition as described above or described as preferred.

More preferably, P-1 binds to the linker L.

More preferably, the substituent

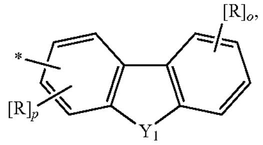

as described above or described with preference as P-1 to P-4 and P-5 to P-9, is attached to the central dibenzofuran or dibenzothiophene in position 6 or 8 thereof via the linker L to the rest of the formulae (1), (1a), (1b), (1c), (1d) and (1e).

For compounds of the formula (1), this is represented by the compounds of the formulae (1f) and (1g):

Formula (1f)

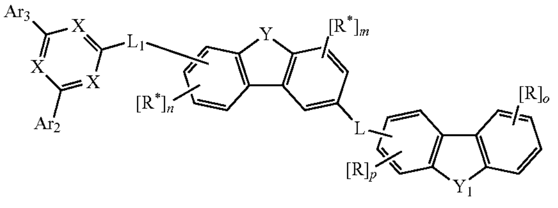

Formula (1g)

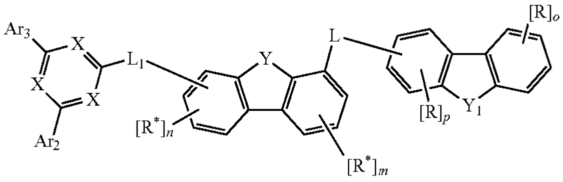

where X, $Ar_2$, $Ar_3$, $L_1$, Y, R*, n, m, L, R, p, o, L and $Y_1$ have a definition given above or given as preferred, and the substituents

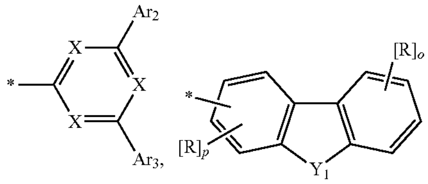

likewise have a definition described above or described as preferred.

$R^3$ in compounds of the formulae (1), (1a), (1b), (1c), (1d), (1e), (1f) and (1g), as described above or described as preferred, is preferably selected independently at each instance from the group of H, CN, an aromatic or heteroaromatic ring system having 5 to 40 aromatic ring atoms in which one or more hydrogen atoms may be replaced by D or CN. $R^3$ in compounds of the formulae (1), (1a), (1b), (1c), (1d), (1e), (1f) and (1g), as described above or described as preferred, is more preferably selected independently at each instance from H, phenyl or deuterated phenyl.

Examples of suitable host materials of the formulae (1), (1a), (1b), (1c), (1d), (1e), (1f) and (1g) that are selected in accordance with the invention and are preferably used in combination with at least one compound of the formula (2) in the electroluminescent device of the invention are the structures given below in table 1.

TABLE 1

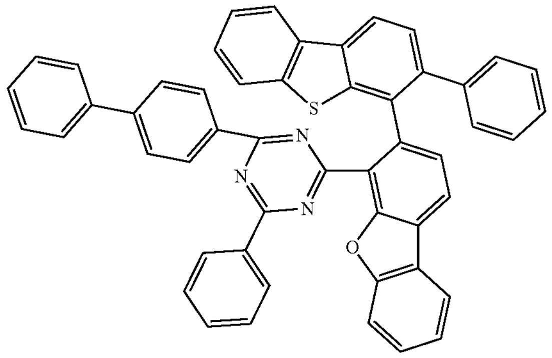 [SMILES: c1ccc(-c2ccc(-c3nc(-c4ccccc4)nc(-c4c(-c5c(-c6ccccc6)ccc6c5sc5ccccc56)ccc5c4oc4ccccc45)n3)cc2)cc1]

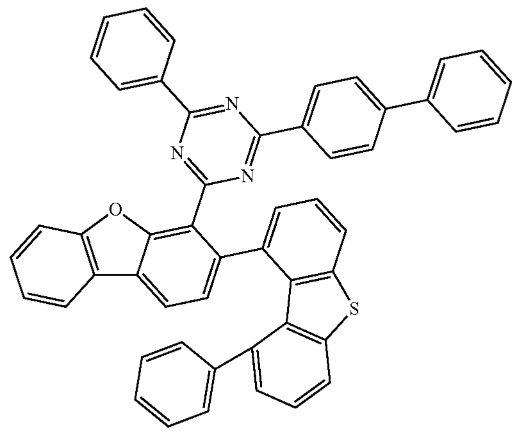 [SMILES: c1ccc(-c2ccc(-c3nc(-c4ccccc4)nc(-c4c(-c5cccc6sc7cccc(-c8ccccc8)c7c56)ccc5c4oc4ccccc45)n3)cc2)cc1]

TABLE 1-continued
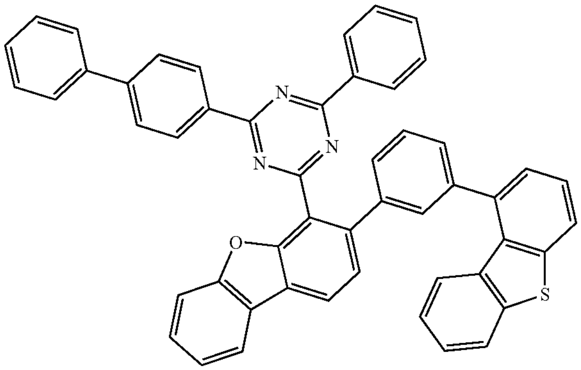 [SMILES: c1ccc(-c2ccc(-c3nc(-c4ccccc4)nc(-c4c(-c5cccc(-c6cccc7sc8ccccc8c67)c5)ccc5c4oc4ccccc45)n3)cc2)cc1]
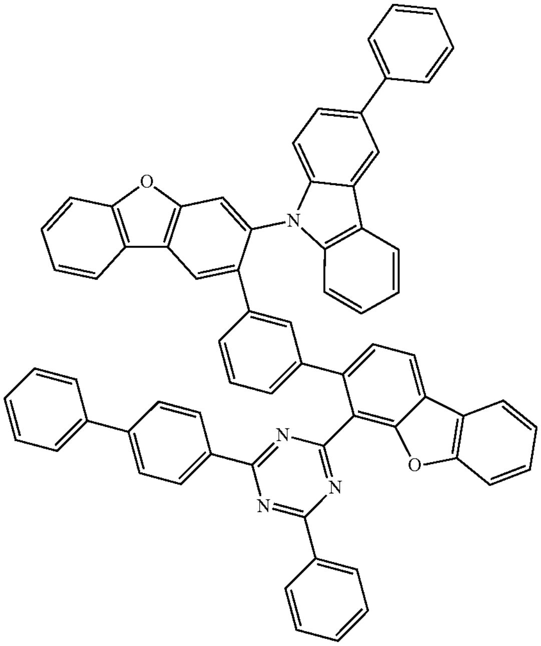 [SMILES: c1ccc(-c2ccc(-c3nc(-c4ccccc4)nc(-c4c(-c5cccc(-c6cc7c(cc6-n6c8ccccc8c8cc(-c9ccccc9)ccc86)oc6ccccc67)c5)ccc5c4oc4ccccc45)n3)cc2)cc1]
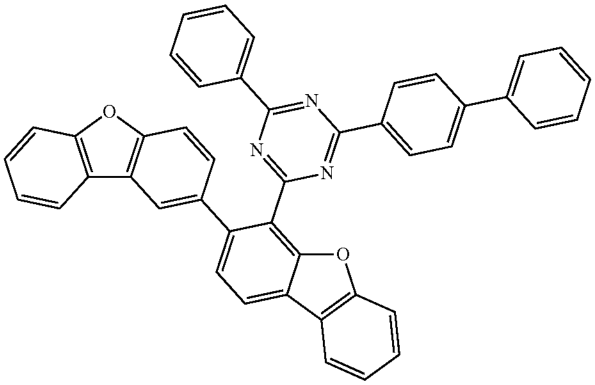 [SMILES: c1ccc(-c2ccc(-c3nc(-c4ccccc4)nc(-c4c(-c5ccc6oc7ccccc7c6c5)ccc5c4oc4ccccc45)n3)cc2)cc1]

TABLE 1-continued
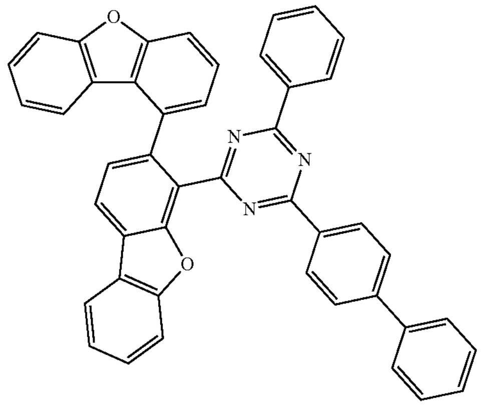 [SMILES: c1ccc(-c2ccc(-c3nc(-c4ccccc4)nc(-c4c(-c5cccc6oc7ccccc7c56)ccc5c4oc4ccccc45)n3)cc2)cc1]
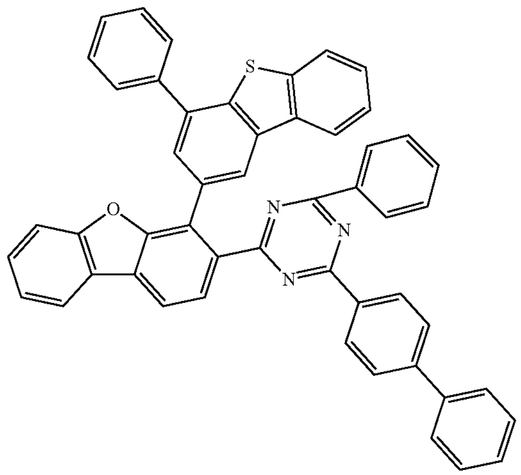 [SMILES: c1ccc(-c2ccc(-c3nc(-c4ccccc4)nc(-c4ccc5c(oc6ccccc65)c4-c4cc(-c5ccccc5)c5sc6ccccc6c5c4)n3)cc2)cc1]
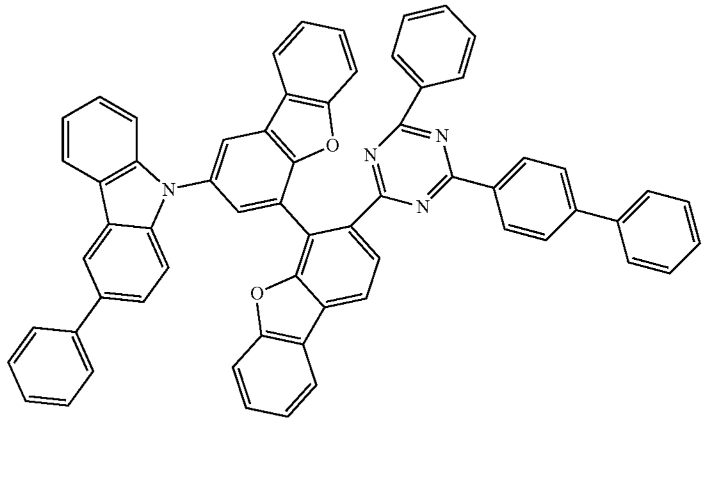 [SMILES: c1ccc(-c2ccc(-c3nc(-c4ccccc4)nc(-c4ccc5c(oc6ccccc65)c4-c4cc(-n5c6ccccc6c6cc(-c7ccccc7)ccc65)cc5c4oc4ccccc45)n3)cc2)cc1]

TABLE 1-continued
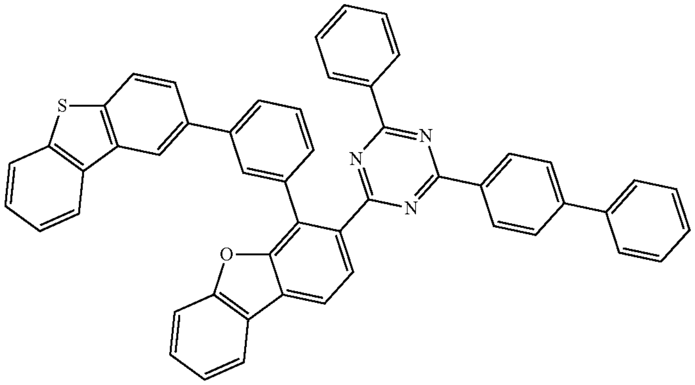 [SMILES: c1ccc(-c2ccc(-c3nc(-c4ccccc4)nc(-c4ccc5c(oc6ccccc65)c4-c4cccc(-c5ccc6sc7ccccc7c6c5)c4)n3)cc2)cc1]
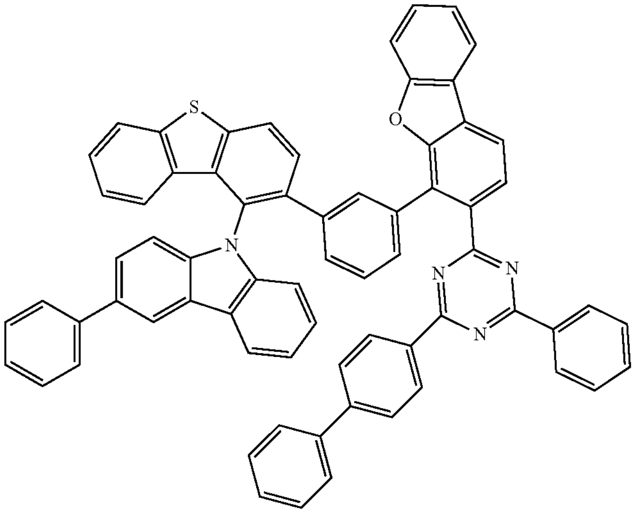 [SMILES: c1ccc(-c2ccc(-c3nc(-c4ccccc4)nc(-c4ccc5c(oc6ccccc65)c4-c4cccc(-c5ccc6sc7ccccc7c6c5-n5c6ccccc6c6cc(-c7ccccc7)ccc65)c4)n3)cc2)cc1]
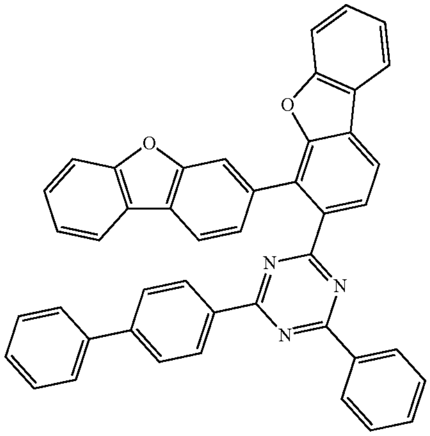 [SMILES: c1ccc(-c2ccc(-c3nc(-c4ccccc4)nc(-c4ccc5c(oc6ccccc65)c4-c4ccc5c(c4)oc4ccccc45)n3)cc2)cc1]

TABLE 1-continued
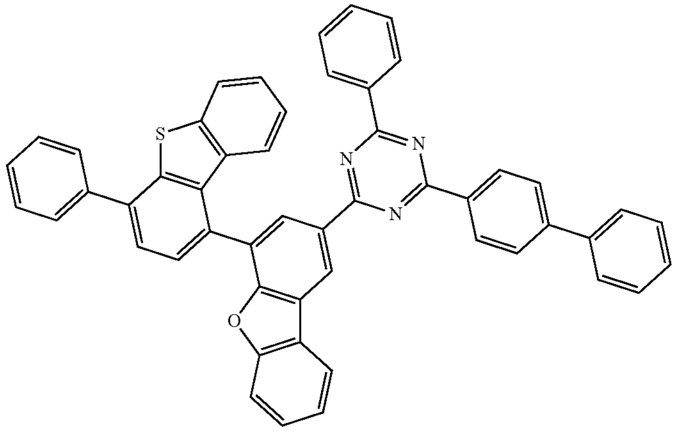 [SMILES: c1ccc(-c2ccc(-c3nc(-c4ccccc4)nc(-c4cc(-c5ccc(-c6ccccc6)c6sc7ccccc7c56)c5oc6ccccc6c5c4)n3)cc2)cc1]
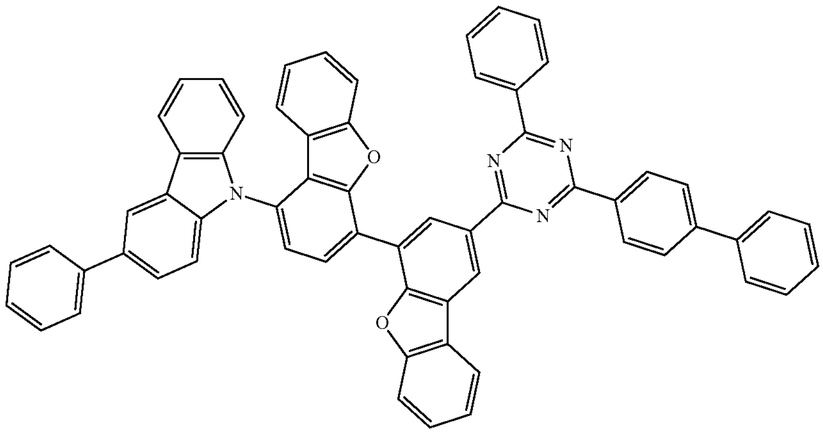 [SMILES: c1ccc(-c2ccc(-c3nc(-c4ccccc4)nc(-c4cc(-c5ccc(-n6c7ccccc7c7cc(-c8ccccc8)ccc76)c6c5oc5ccccc56)c5oc6ccccc6c5c4)n3)cc2)cc1]
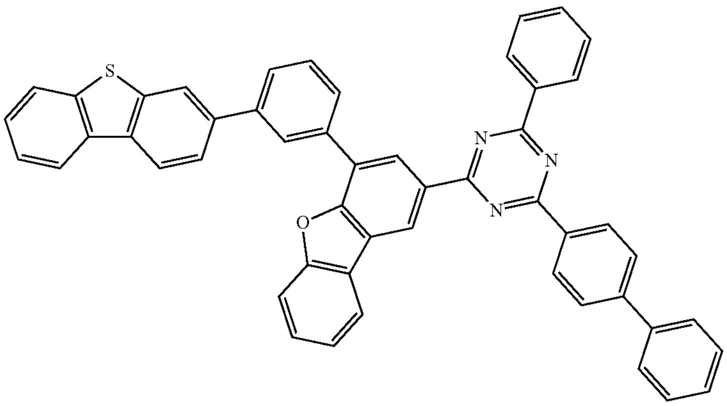 [SMILES: c1ccc(-c2ccc(-c3nc(-c4ccccc4)nc(-c4cc(-c5cccc(-c6ccc7c(c6)sc6ccccc67)c5)c5oc6ccccc6c5c4)n3)cc2)cc1]

TABLE 1-continued
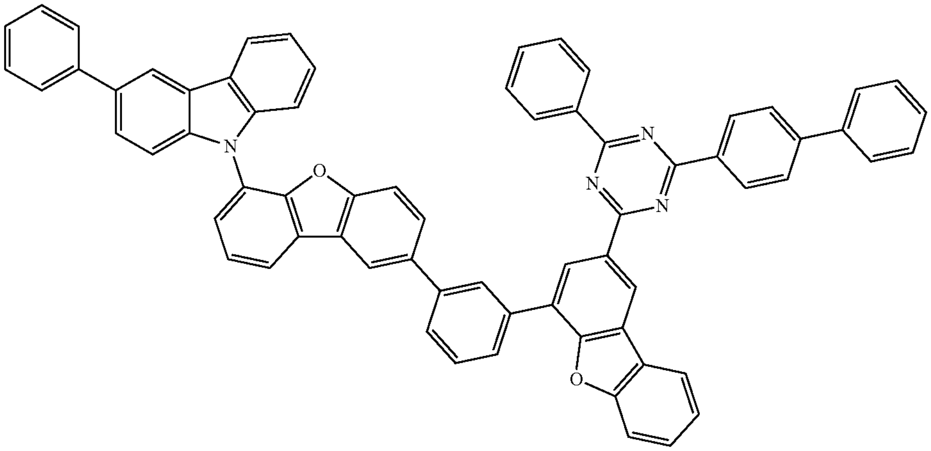 [SMILES: c1ccc(-c2ccc(-c3nc(-c4ccccc4)nc(-c4cc(-c5cccc(-c6ccc7oc8c(-n9c%10ccccc%10c%10cc(-c%11ccccc%11)ccc%109)cccc8c7c6)c5)c5oc6ccccc6c5c4)n3)cc2)cc1]
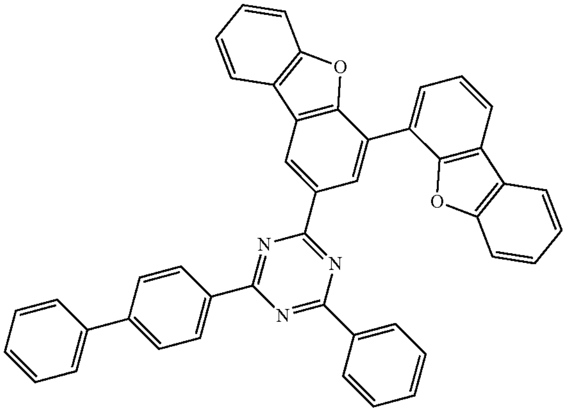 [SMILES: c1ccc(-c2ccc(-c3nc(-c4ccccc4)nc(-c4cc(-c5cccc6c5oc5ccccc56)c5oc6ccccc6c5c4)n3)cc2)cc1]
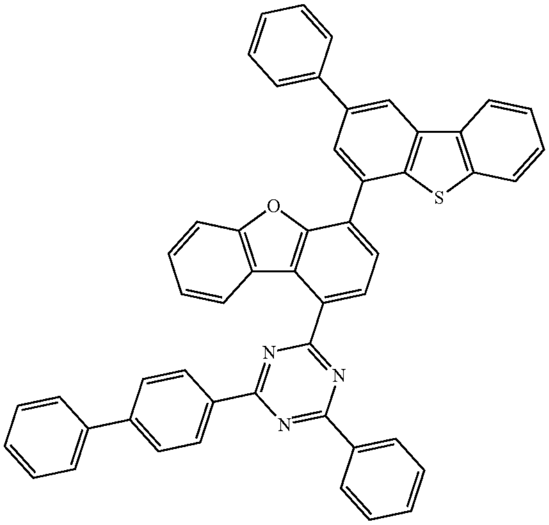 [SMILES: c1ccc(-c2ccc(-c3nc(-c4ccccc4)nc(-c4ccc(-c5cc(-c6ccccc6)cc6c5sc5ccccc56)c5oc6ccccc6c45)n3)cc2)cc1]

TABLE 1-continued
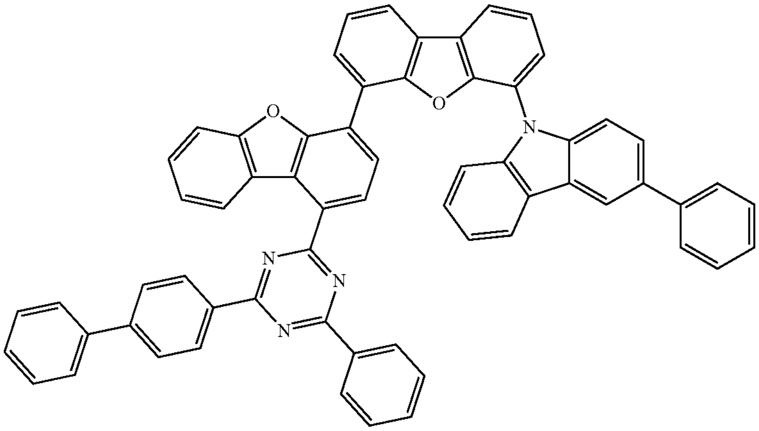 [SMILES: c1ccc(-c2ccc(-c3nc(-c4ccccc4)nc(-c4ccc(-c5cccc6c5oc5c(-n7c8ccccc8c8cc(-c9ccccc9)ccc87)cccc56)c5oc6ccccc6c45)n3)cc2)cc1]
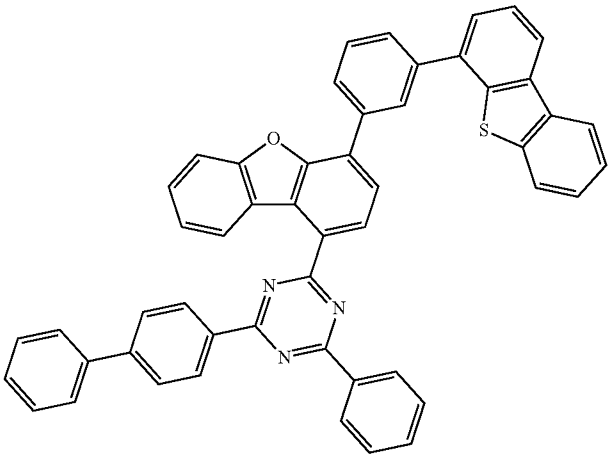 [SMILES: c1ccc(-c2ccc(-c3nc(-c4ccccc4)nc(-c4ccc(-c5cccc(-c6cccc7c6sc6ccccc67)c5)c5oc6ccccc6c45)n3)cc2)cc1]
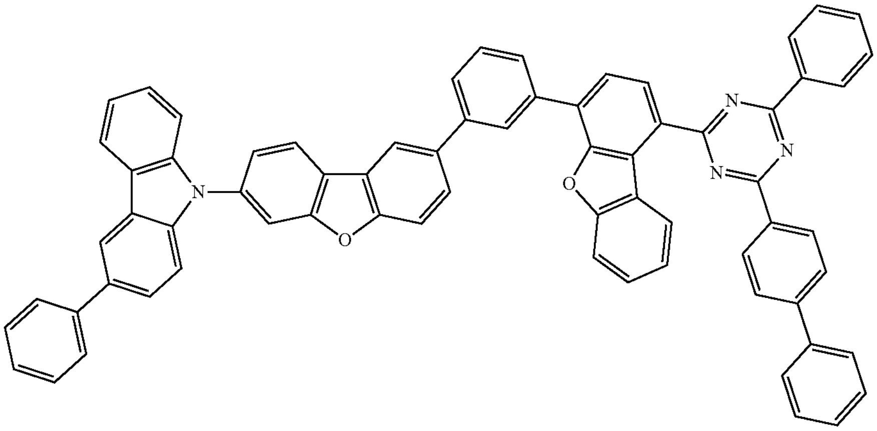 [SMILES: c1ccc(-c2ccc(-c3nc(-c4ccccc4)nc(-c4ccc(-c5cccc(-c6ccc7oc8cc(-n9c%10ccccc%10c%10cc(-c%11ccccc%11)ccc%109)ccc8c7c6)c5)c5oc6ccccc6c45)n3)cc2)cc1]

TABLE 1-continued
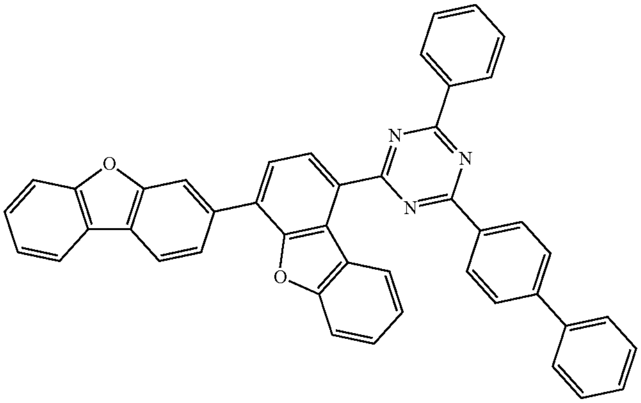 [SMILES: c1ccc(-c2ccc(-c3nc(-c4ccccc4)nc(-c4ccc(-c5ccc6c(c5)oc5ccccc56)c5oc6ccccc6c45)n3)cc2)cc1]
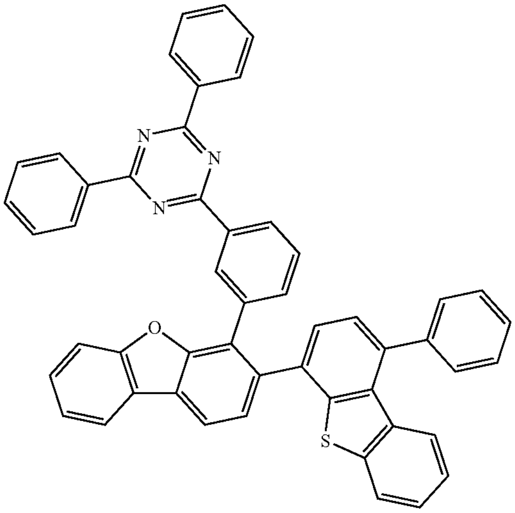 [SMILES: c1ccc(-c2nc(-c3ccccc3)nc(-c3cccc(-c4c(-c5ccc(-c6ccccc6)c6c5sc5ccccc56)ccc5c4oc4ccccc45)c3)n2)cc1]
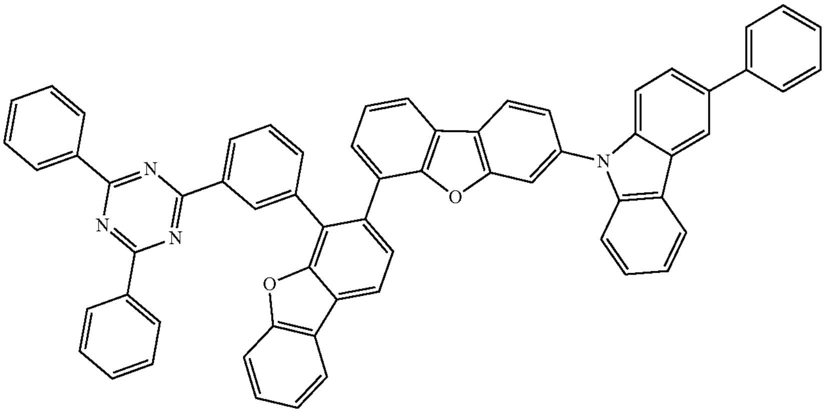 [SMILES: c1ccc(-c2ccc3c(c2)c2ccccc2n3-c2ccc3c(c2)oc2c(-c4ccc5c(oc6ccccc65)c4-c4cccc(-c5nc(-c6ccccc6)nc(-c6ccccc6)n5)c4)cccc23)cc1]

TABLE 1-continued
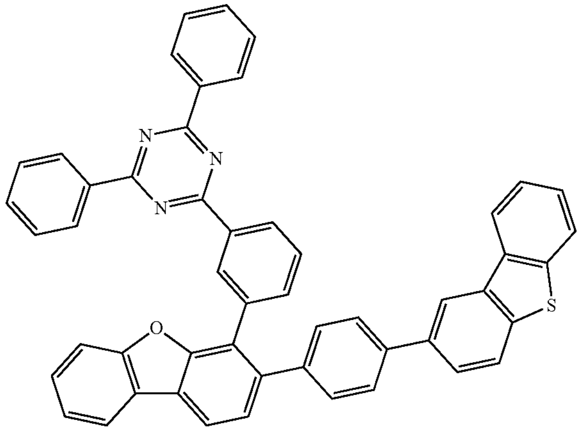 [SMILES: c1ccc(-c2nc(-c3ccccc3)nc(-c3cccc(-c4c(-c5ccc(-c6ccc7sc8ccccc8c7c6)cc5)ccc5c4oc4ccccc45)c3)n2)cc1]
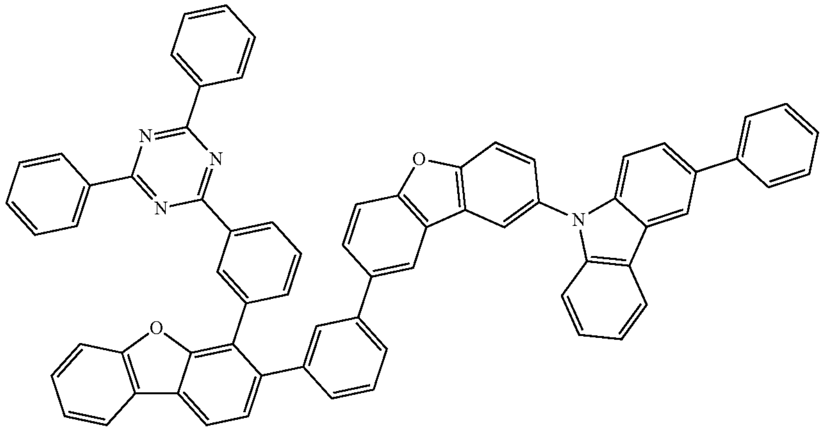 [SMILES: c1ccc(-c2ccc3c(c2)c2ccccc2n3-c2ccc3oc4ccc(-c5cccc(-c6ccc7c(oc8ccccc87)c6-c6cccc(-c7nc(-c8ccccc8)nc(-c8ccccc8)n7)c6)c5)cc4c3c2)cc1]
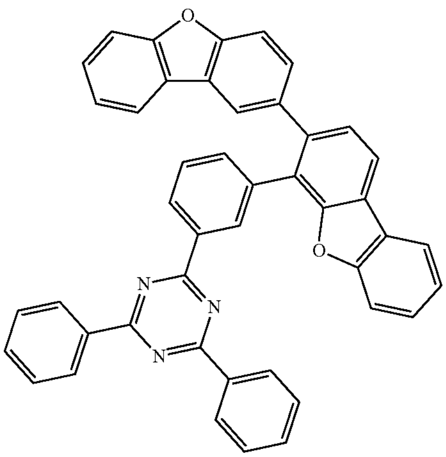 [SMILES: c1ccc(-c2nc(-c3ccccc3)nc(-c3cccc(-c4c(-c5ccc6oc7ccccc7c6c5)ccc5c4oc4ccccc45)c3)n2)cc1]
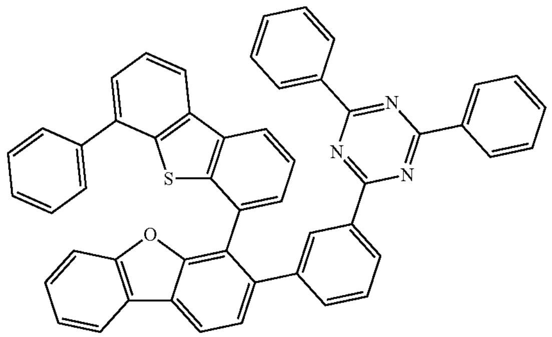 [SMILES: c1ccc(-c2nc(-c3ccccc3)nc(-c3cccc(-c4ccc5c(oc6ccccc65)c4-c4cccc5c4sc4c(-c6ccccc6)cccc45)c3)n2)cc1]

TABLE 1-continued
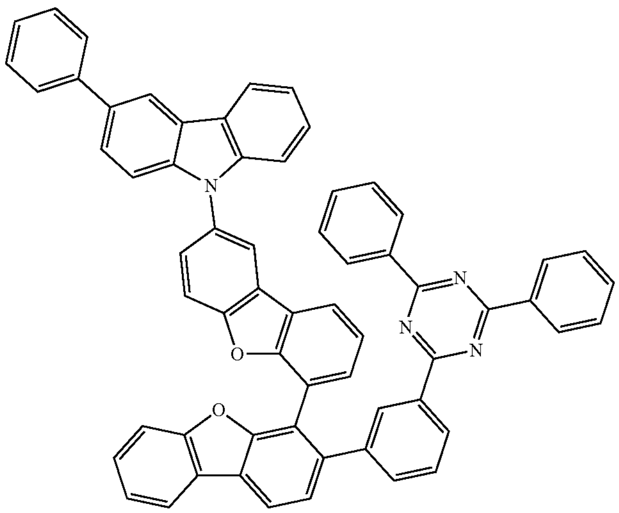 [SMILES: c1ccc(-c2ccc3c(c2)c2ccccc2n3-c2ccc3oc4c(-c5c(-c6cccc(-c7nc(-c8ccccc8)nc(-c8ccccc8)n7)c6)ccc6c5oc5ccccc56)cccc4c3c2)cc1]
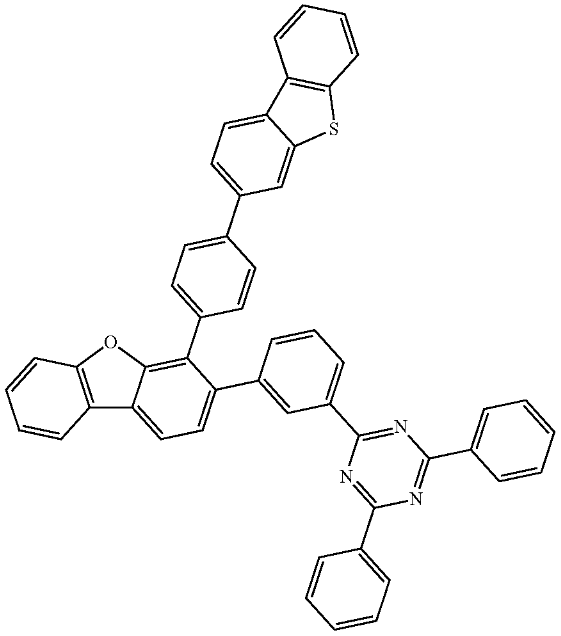 [SMILES: c1ccc(-c2nc(-c3ccccc3)nc(-c3cccc(-c4ccc5c(oc6ccccc65)c4-c4ccc(-c5ccc6c(c5)sc5ccccc56)cc4)c3)n2)cc1]

TABLE 1-continued
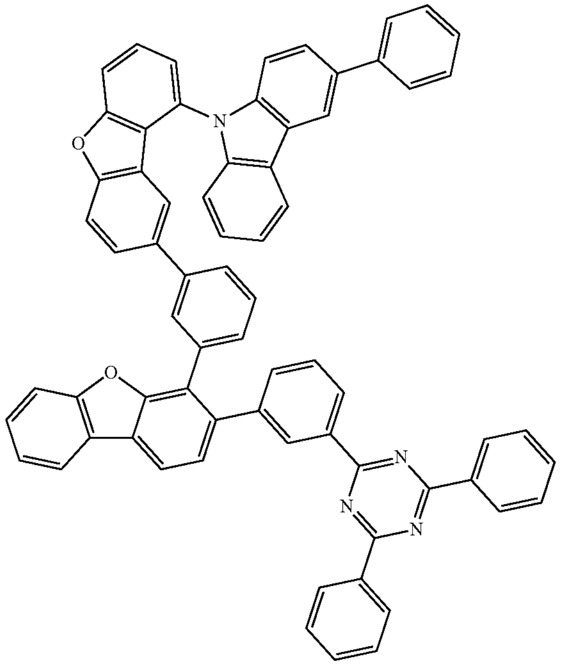 [SMILES: c1ccc(-c2ccc3c(c2)c2ccccc2n3-c2cccc3oc4ccc(-c5cccc(-c6c(-c7cccc(-c8nc(-c9ccccc9)nc(-c9ccccc9)n8)c7)ccc7c6oc6ccccc67)c5)cc4c23)cc1]
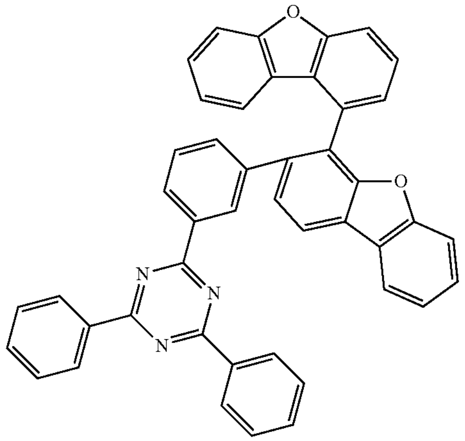 [SMILES: c1ccc(-c2nc(-c3ccccc3)nc(-c3cccc(-c4ccc5c(oc6ccccc65)c4-c4cccc5oc6ccccc6c45)c3)n2)cc1]
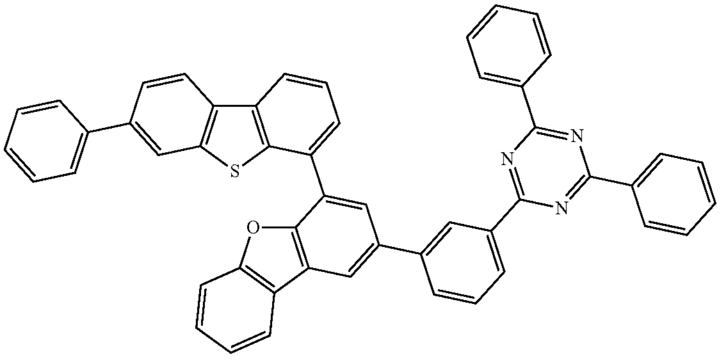 [SMILES: c1ccc(-c2ccc3c(c2)sc2c(-c4cc(-c5cccc(-c6nc(-c7ccccc7)nc(-c7ccccc7)n6)c5)cc5c4oc4ccccc45)cccc23)cc1]

TABLE 1-continued
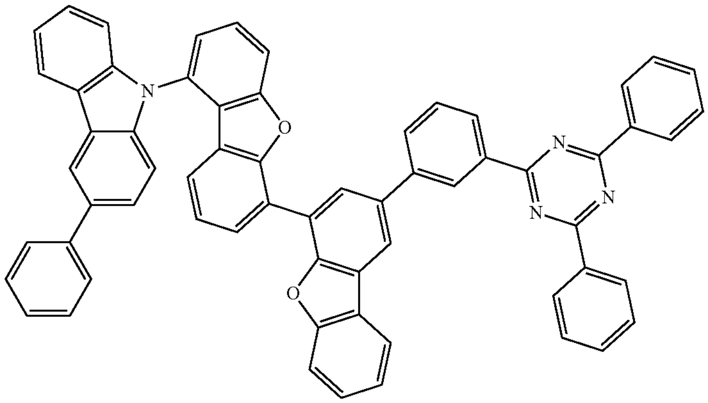 [SMILES: c1ccc(-c2ccc3c(c2)c2ccccc2n3-c2cccc3oc4c(-c5cc(-c6cccc(-c7nc(-c8ccccc8)nc(-c8ccccc8)n7)c6)cc6c5oc5ccccc56)cccc4c23)cc1]
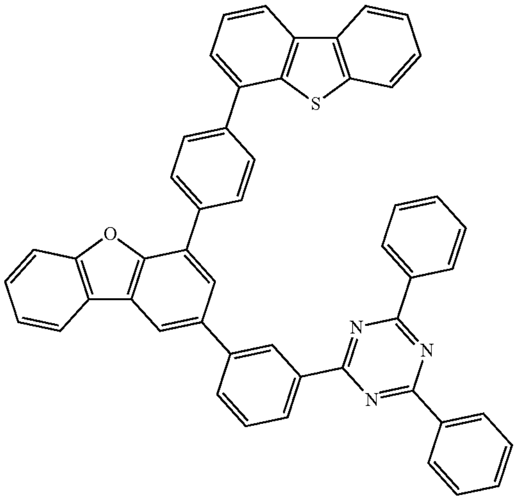 [SMILES: c1ccc(-c2nc(-c3ccccc3)nc(-c3cccc(-c4cc(-c5ccc(-c6cccc7c6sc6ccccc67)cc5)c5oc6ccccc6c5c4)c3)n2)cc1]
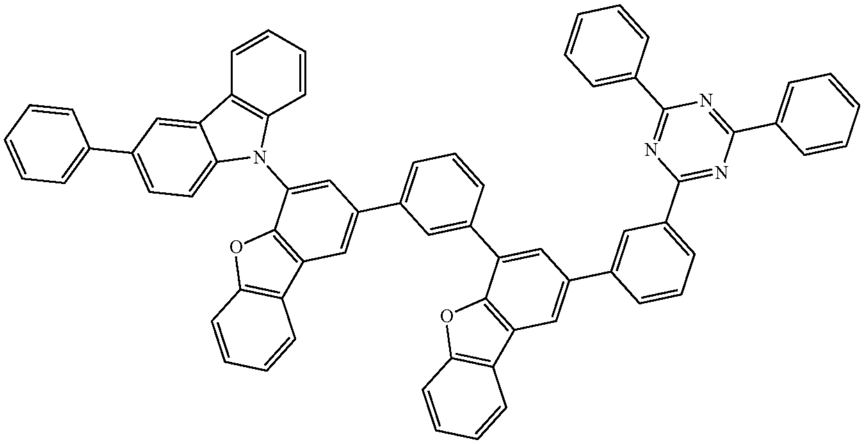 [SMILES: c1ccc(-c2ccc3c(c2)c2ccccc2n3-c2cc(-c3cccc(-c4cc(-c5cccc(-c6nc(-c7ccccc7)nc(-c7ccccc7)n6)c5)cc5c4oc4ccccc45)c3)cc3c2oc2ccccc23)cc1]

TABLE 1-continued
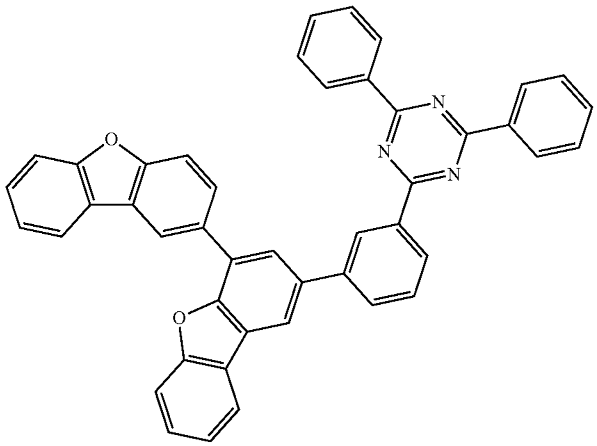 [SMILES: c1ccc(-c2nc(-c3ccccc3)nc(-c3cccc(-c4cc(-c5ccc6oc7ccccc7c6c5)c5oc6ccccc6c5c4)c3)n2)cc1]
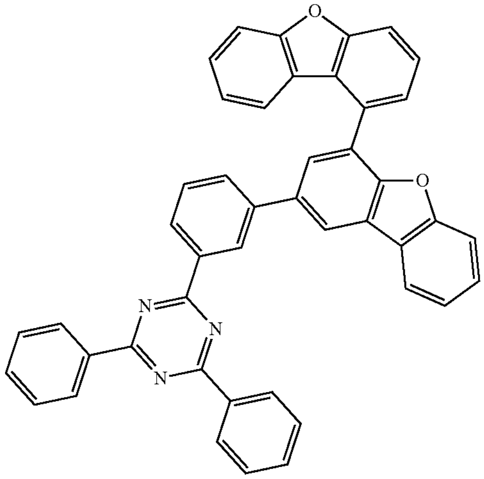 [SMILES: c1ccc(-c2nc(-c3ccccc3)nc(-c3cccc(-c4cc(-c5cccc6oc7ccccc7c56)c5oc6ccccc6c5c4)c3)n2)cc1]
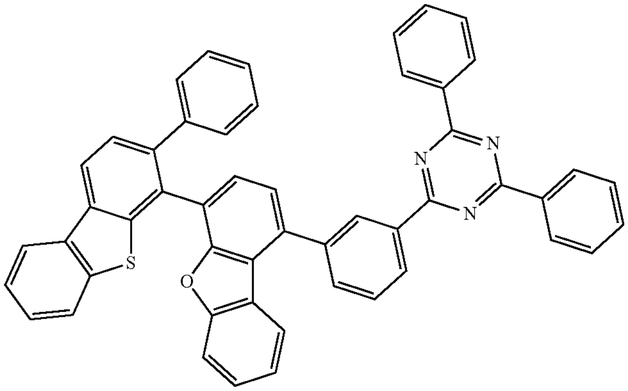 [SMILES: c1ccc(-c2nc(-c3ccccc3)nc(-c3cccc(-c4ccc(-c5c(-c6ccccc6)ccc6c5sc5ccccc56)c5oc6ccccc6c45)c3)n2)cc1]

TABLE 1-continued
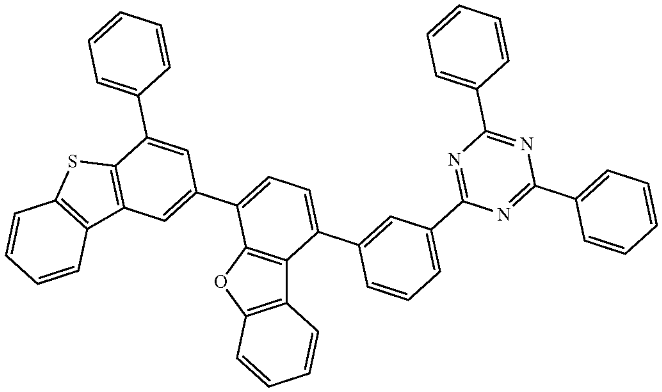 [SMILES: c1ccc(-c2nc(-c3ccccc3)nc(-c3cccc(-c4ccc(-c5cc(-c6ccccc6)c6sc7ccccc7c6c5)c5oc6ccccc6c45)c3)n2)cc1]
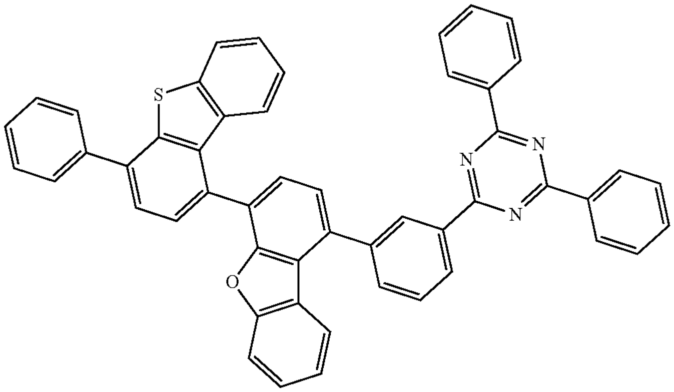 [SMILES: c1ccc(-c2nc(-c3ccccc3)nc(-c3cccc(-c4ccc(-c5ccc(-c6ccccc6)c6sc7ccccc7c56)c5oc6ccccc6c45)c3)n2)cc1]
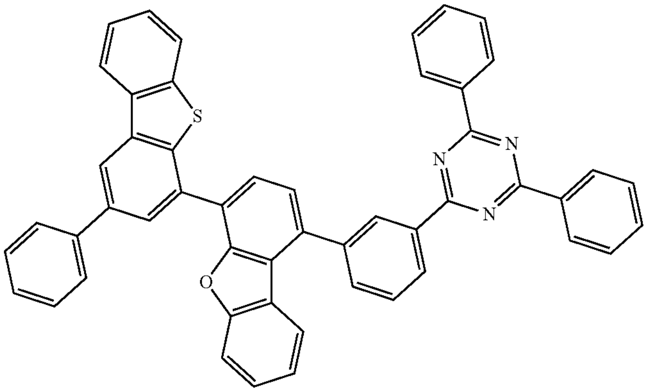 [SMILES: c1ccc(-c2cc(-c3ccc(-c4cccc(-c5nc(-c6ccccc6)nc(-c6ccccc6)n5)c4)c4c3oc3ccccc34)c3sc4ccccc4c3c2)cc1]
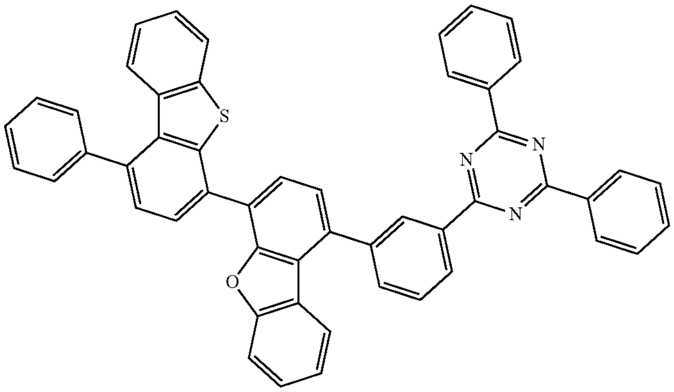 [SMILES: c1ccc(-c2nc(-c3ccccc3)nc(-c3cccc(-c4ccc(-c5ccc(-c6ccccc6)c6c5sc5ccccc56)c5oc6ccccc6c45)c3)n2)cc1]

TABLE 1-continued
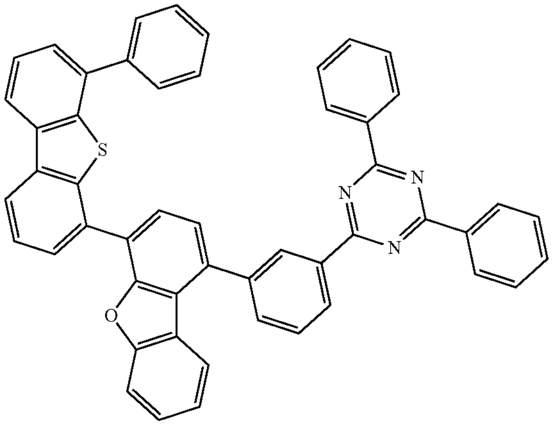 [SMILES: c1ccc(-c2nc(-c3ccccc3)nc(-c3cccc(-c4ccc(-c5cccc6c5sc5c(-c7ccccc7)cccc56)c5oc6ccccc6c45)c3)n2)cc1]
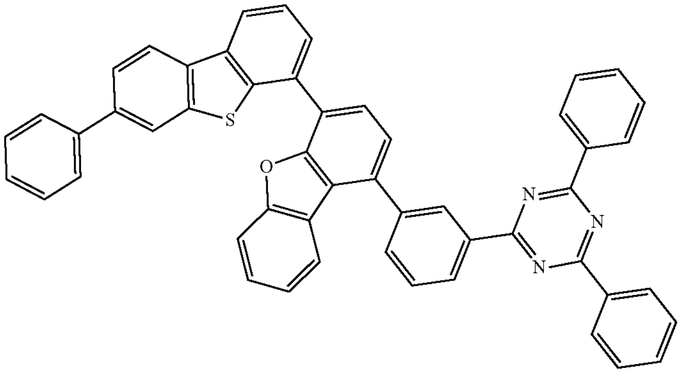 [SMILES: c1ccc(-c2ccc3c(c2)sc2c(-c4ccc(-c5cccc(-c6nc(-c7ccccc7)nc(-c7ccccc7)n6)c5)c5c4oc4ccccc45)cccc23)cc1]
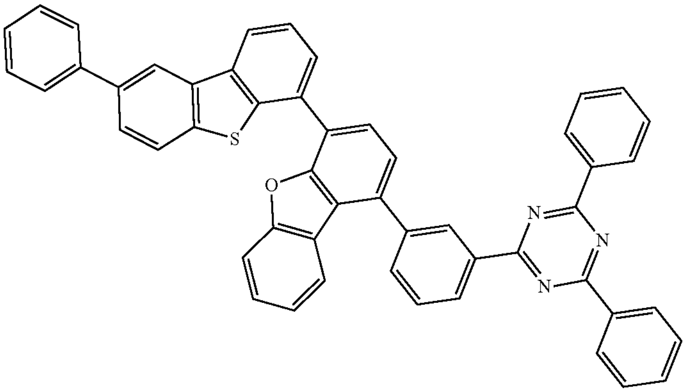 [SMILES: c1ccc(-c2ccc3sc4c(-c5ccc(-c6cccc(-c7nc(-c8ccccc8)nc(-c8ccccc8)n7)c6)c6c5oc5ccccc56)cccc4c3c2)cc1]
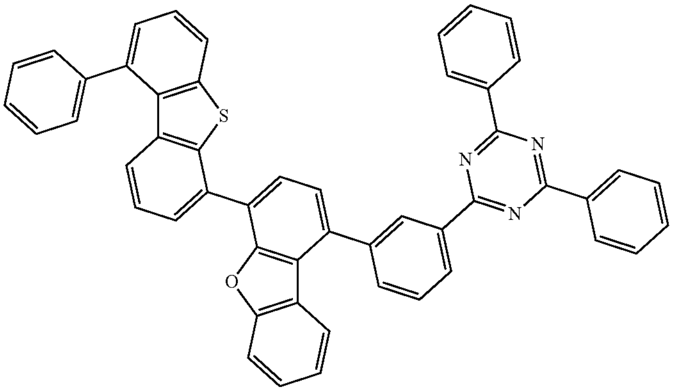 [SMILES: c1ccc(-c2nc(-c3ccccc3)nc(-c3cccc(-c4ccc(-c5cccc6c5sc5cccc(-c7ccccc7)c56)c5oc6ccccc6c45)c3)n2)cc1]

TABLE 1-continued
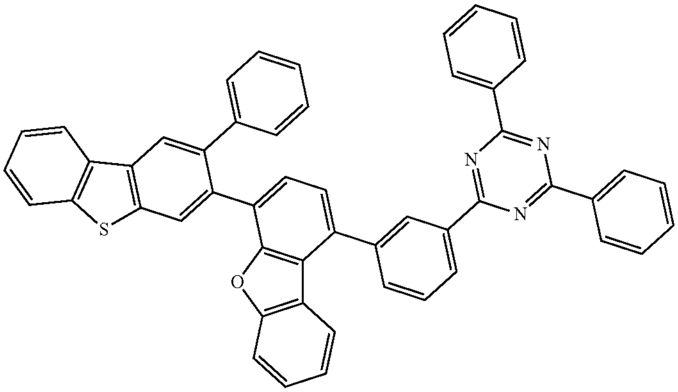 [SMILES: c1ccc(-c2nc(-c3ccccc3)nc(-c3cccc(-c4ccc(-c5cc6sc7ccccc7c6cc5-c5ccccc5)c5oc6ccccc6c45)c3)n2)cc1]
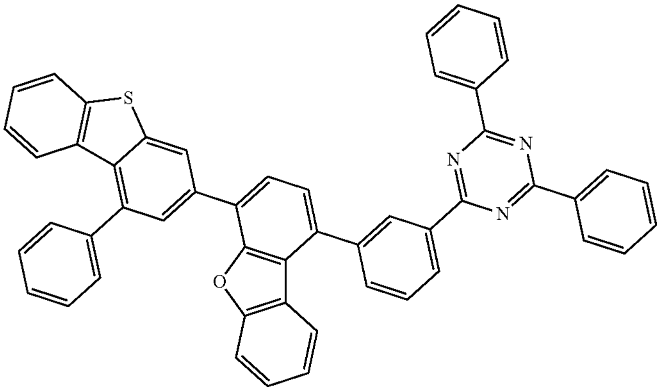 [SMILES: c1ccc(-c2nc(-c3ccccc3)nc(-c3cccc(-c4ccc(-c5cc(-c6ccccc6)c6c(c5)sc5ccccc56)c5oc6ccccc6c45)c3)n2)cc1]
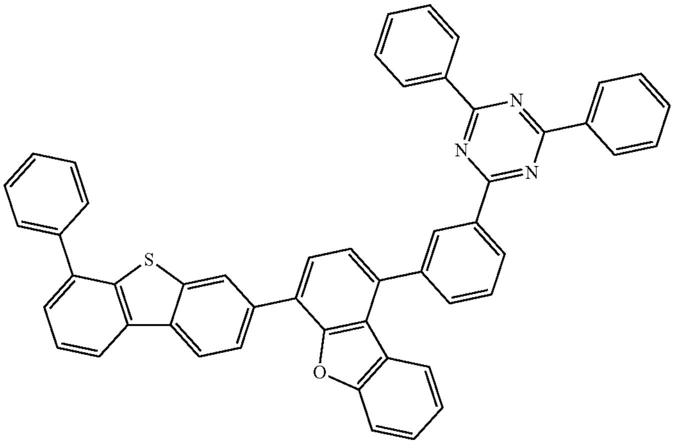 [SMILES: c1ccc(-c2nc(-c3ccccc3)nc(-c3cccc(-c4ccc(-c5ccc6c(c5)sc5c(-c7ccccc7)cccc56)c5oc6ccccc6c45)c3)n2)cc1]
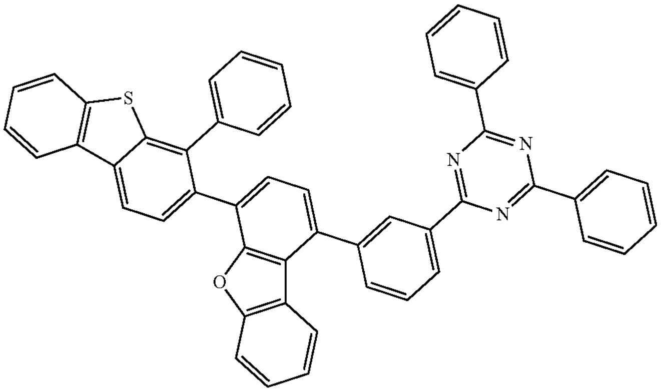 [SMILES: c1ccc(-c2nc(-c3ccccc3)nc(-c3cccc(-c4ccc(-c5ccc6c(sc7ccccc76)c5-c5ccccc5)c5oc6ccccc6c45)c3)n2)cc1]

TABLE 1-continued
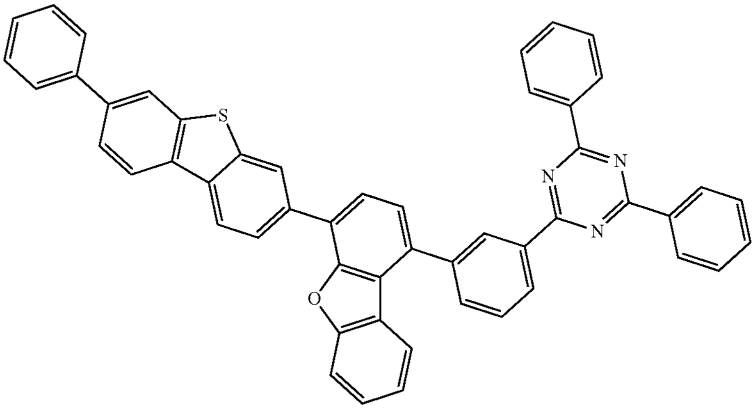 [SMILES: c1ccc(-c2ccc3c(c2)sc2cc(-c4ccc(-c5cccc(-c6nc(-c7ccccc7)nc(-c7ccccc7)n6)c5)c5c4oc4ccccc45)ccc23)cc1]
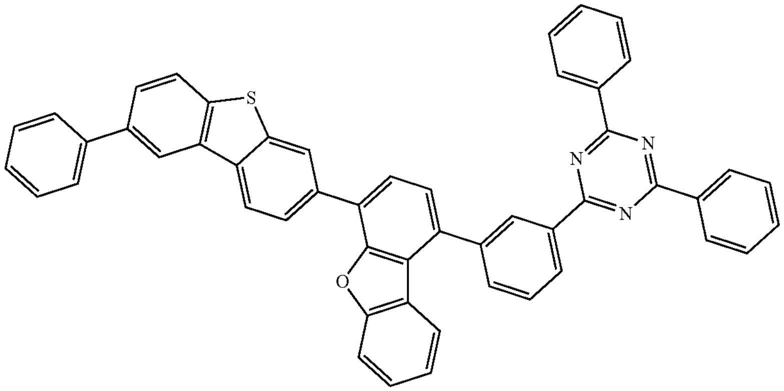 [SMILES: c1ccc(-c2ccc3sc4cc(-c5ccc(-c6cccc(-c7nc(-c8ccccc8)nc(-c8ccccc8)n7)c6)c6c5oc5ccccc56)ccc4c3c2)cc1]
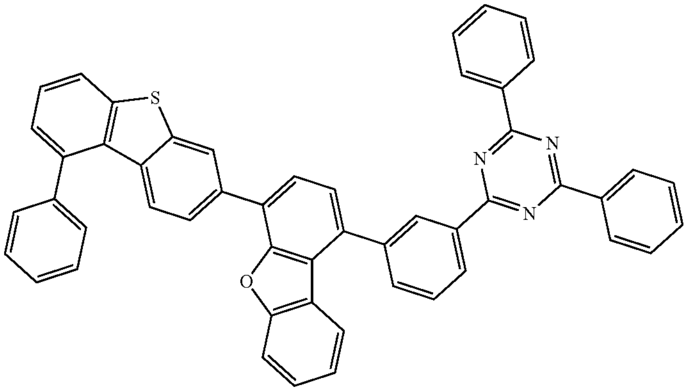 [SMILES: c1ccc(-c2nc(-c3ccccc3)nc(-c3cccc(-c4ccc(-c5ccc6c(c5)sc5cccc(-c7ccccc7)c56)c5oc6ccccc6c45)c3)n2)cc1]
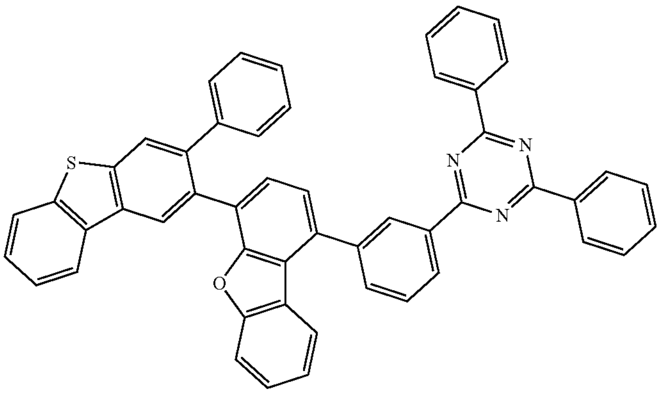 [SMILES: c1ccc(-c2nc(-c3ccccc3)nc(-c3cccc(-c4ccc(-c5cc6c(cc5-c5ccccc5)sc5ccccc56)c5oc6ccccc6c45)c3)n2)cc1]

TABLE 1-continued
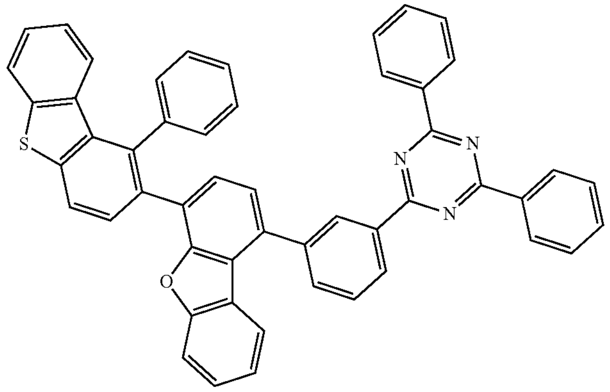 [SMILES: c1ccc(-c2nc(-c3ccccc3)nc(-c3cccc(-c4ccc(-c5ccc6sc7ccccc7c6c5-c5ccccc5)c5oc6ccccc6c45)c3)n2)cc1]
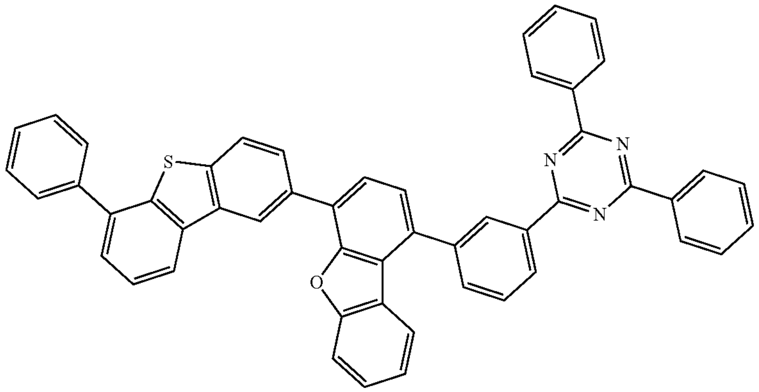 [SMILES: c1ccc(-c2nc(-c3ccccc3)nc(-c3cccc(-c4ccc(-c5ccc6sc7c(-c8ccccc8)cccc7c6c5)c5oc6ccccc6c45)c3)n2)cc1]
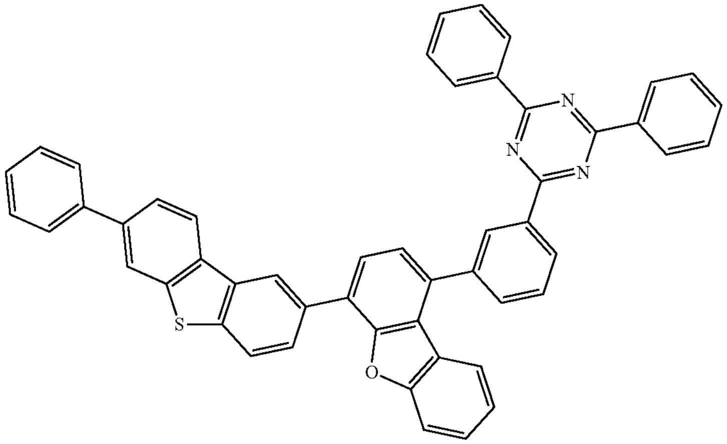 [SMILES: c1ccc(-c2ccc3c(c2)sc2ccc(-c4ccc(-c5cccc(-c6nc(-c7ccccc7)nc(-c7ccccc7)n6)c5)c5c4oc4ccccc45)cc23)cc1]
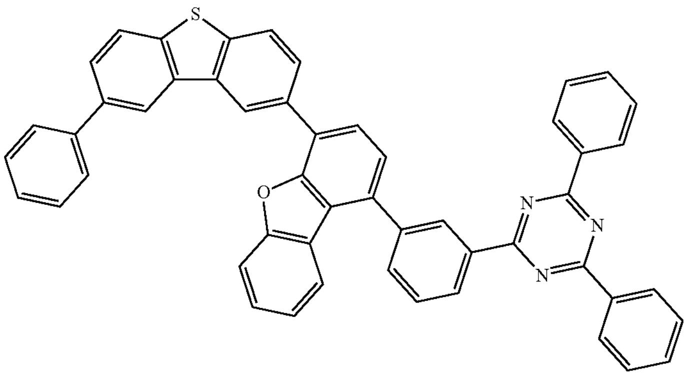 [SMILES: c1ccc(-c2ccc3sc4ccc(-c5ccc(-c6cccc(-c7nc(-c8ccccc8)nc(-c8ccccc8)n7)c6)c6c5oc5ccccc56)cc4c3c2)cc1]

TABLE 1-continued
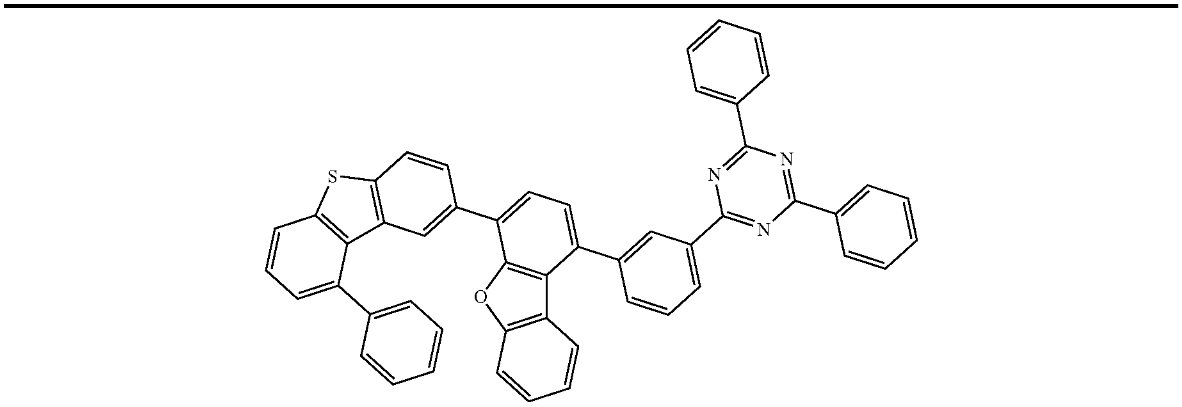
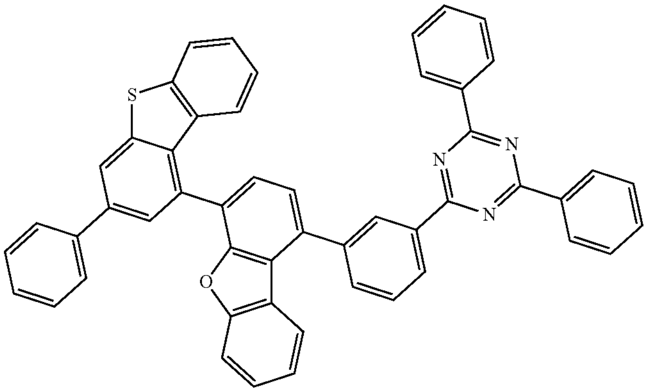 [SMILES: c1ccc(-c2cc(-c3ccc(-c4cccc(-c5nc(-c6ccccc6)nc(-c6ccccc6)n5)c4)c4c3oc3ccccc34)c3c(c2)sc2ccccc23)cc1]
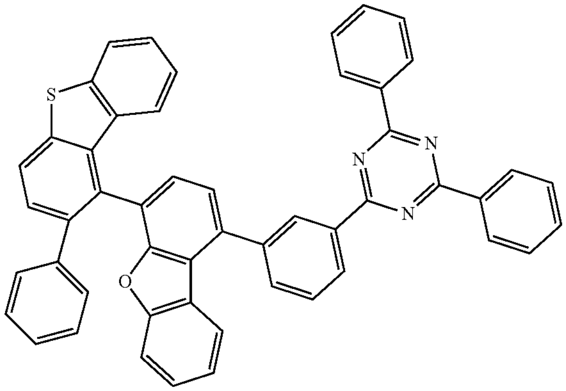 [SMILES: c1ccc(-c2nc(-c3ccccc3)nc(-c3cccc(-c4ccc(-c5c(-c6ccccc6)ccc6sc7ccccc7c56)c5oc6ccccc6c45)c3)n2)cc1]
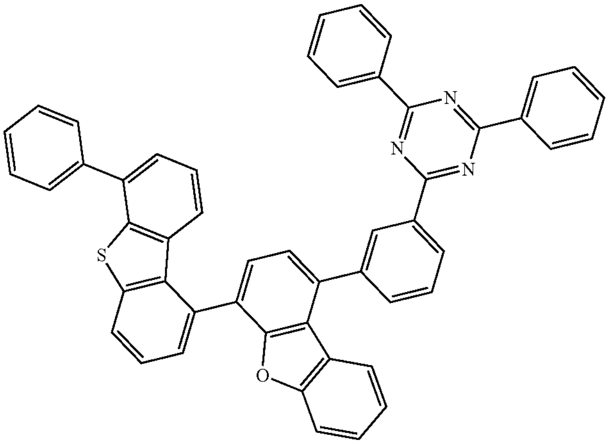 [SMILES: c1ccc(-c2nc(-c3ccccc3)nc(-c3cccc(-c4ccc(-c5cccc6sc7c(-c8ccccc8)cccc7c56)c5oc6ccccc6c45)c3)n2)cc1]

TABLE 1-continued
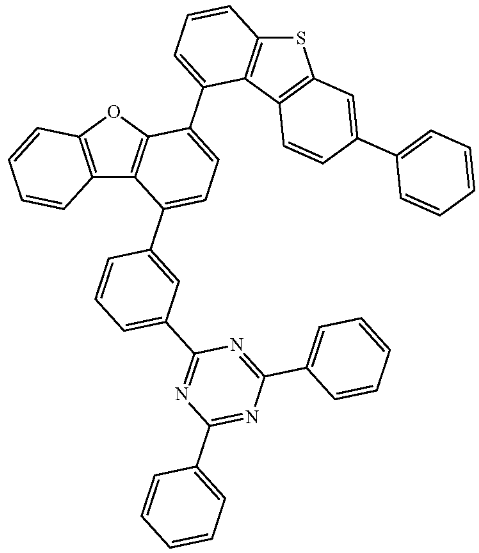 [SMILES: c1ccc(-c2ccc3c(c2)sc2cccc(-c4ccc(-c5cccc(-c6nc(-c7ccccc7)nc(-c7ccccc7)n6)c5)c5c4oc4ccccc45)c23)cc1]
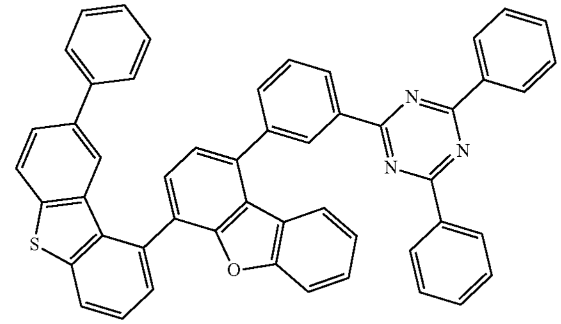 [SMILES: c1ccc(-c2ccc3sc4cccc(-c5ccc(-c6cccc(-c7nc(-c8ccccc8)nc(-c8ccccc8)n7)c6)c6c5oc5ccccc56)c4c3c2)cc1]
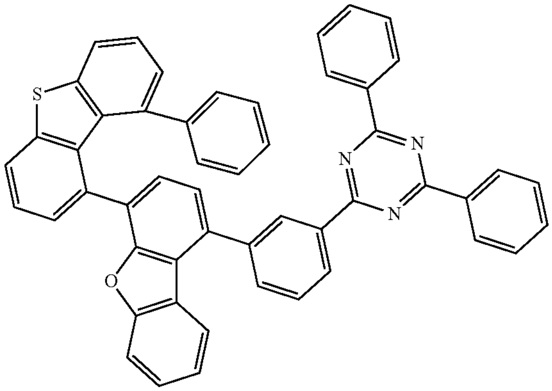 [SMILES: c1ccc(-c2nc(-c3ccccc3)nc(-c3cccc(-c4ccc(-c5cccc6sc7cccc(-c8ccccc8)c7c56)c5oc6ccccc6c45)c3)n2)cc1]

TABLE 1-continued
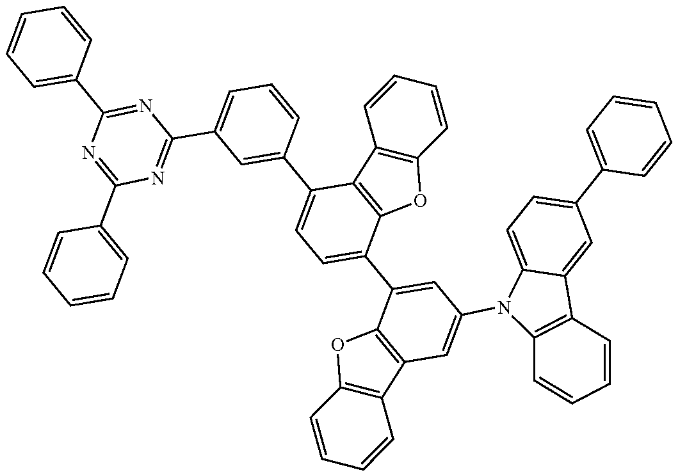 [SMILES: c1ccc(-c2ccc3c(c2)c2ccccc2n3-c2cc(-c3ccc(-c4cccc(-c5nc(-c6ccccc6)nc(-c6ccccc6)n5)c4)c4c3oc3ccccc34)c3oc4ccccc4c3c2)cc1]
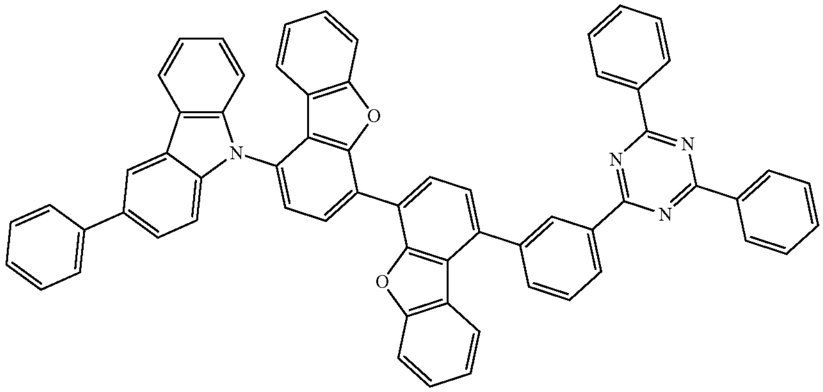 [SMILES: c1ccc(-c2ccc3c(c2)c2ccccc2n3-c2ccc(-c3ccc(-c4cccc(-c5nc(-c6ccccc6)nc(-c6ccccc6)n5)c4)c4c3oc3ccccc34)c3oc4ccccc4c23)cc1]
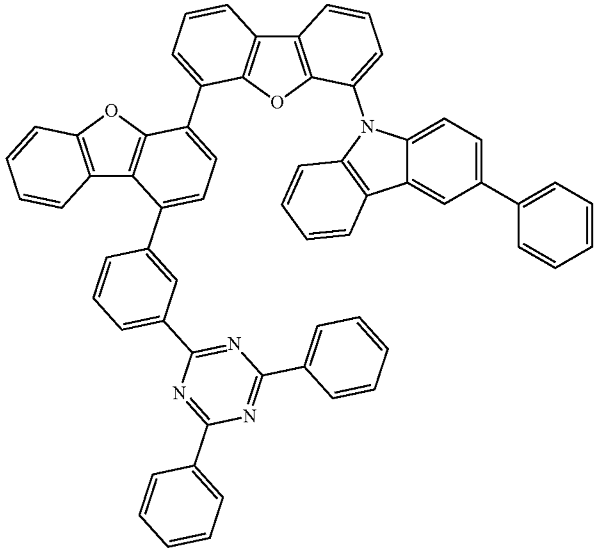 [SMILES: c1ccc(-c2ccc3c(c2)c2ccccc2n3-c2cccc3c2oc2c(-c4ccc(-c5cccc(-c6nc(-c7ccccc7)nc(-c7ccccc7)n6)c5)c5c4oc4ccccc45)cccc23)cc1]

TABLE 1-continued
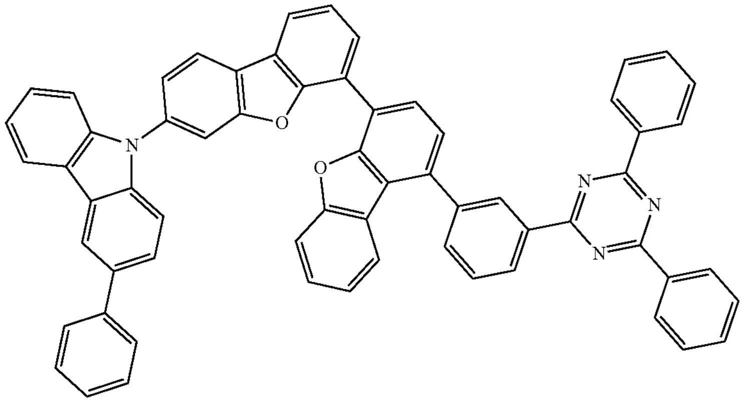 [SMILES: c1ccc(-c2ccc3c(c2)c2ccccc2n3-c2ccc3c(c2)oc2c(-c4ccc(-c5cccc(-c6nc(-c7ccccc7)nc(-c7ccccc7)n6)c5)c5c4oc4ccccc45)cccc23)cc1]
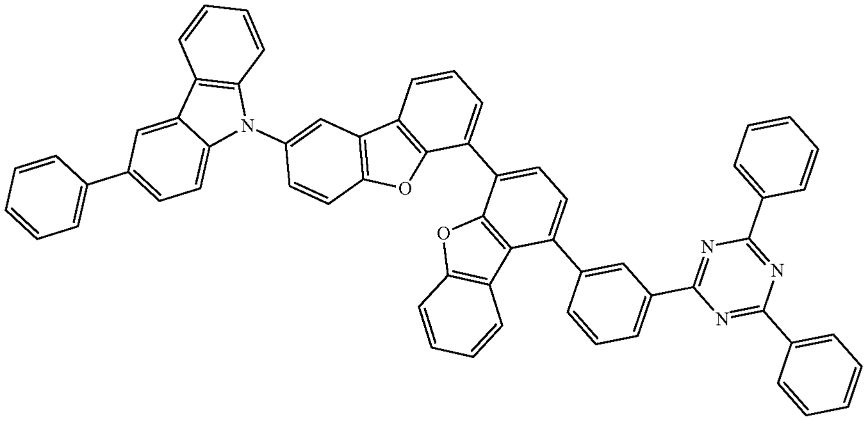 [SMILES: c1ccc(-c2ccc3c(c2)c2ccccc2n3-c2ccc3oc4c(-c5ccc(-c6cccc(-c7nc(-c8ccccc8)nc(-c8ccccc8)n7)c6)c6c5oc5ccccc56)cccc4c3c2)cc1]
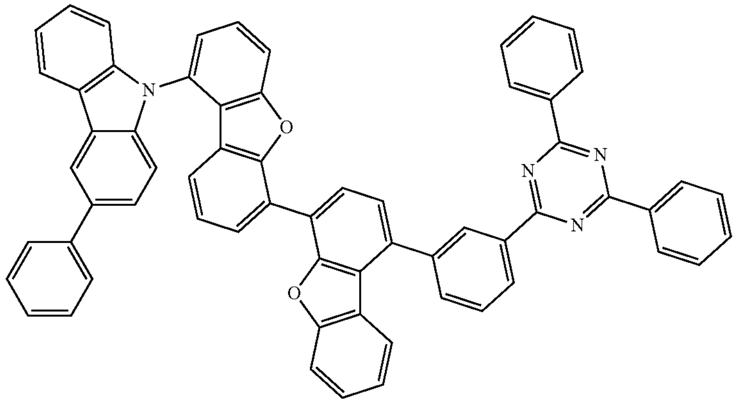 [SMILES: c1ccc(-c2ccc3c(c2)c2ccccc2n3-c2cccc3oc4c(-c5ccc(-c6cccc(-c7nc(-c8ccccc8)nc(-c8ccccc8)n7)c6)c6c5oc5ccccc56)cccc4c23)cc1]

TABLE 1-continued
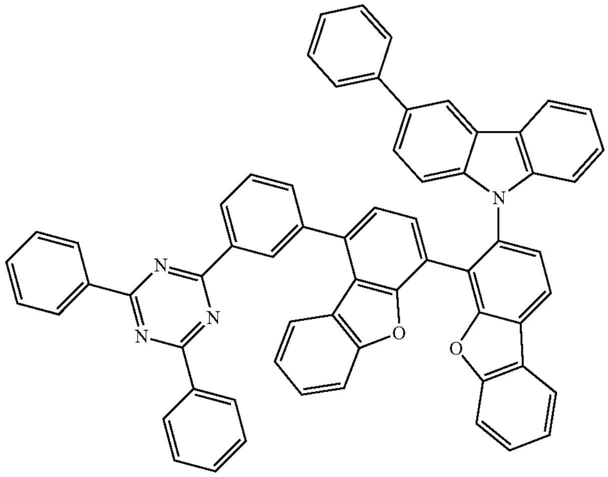 [SMILES: c1ccc(-c2ccc3c(c2)c2ccccc2n3-c2ccc3c(oc4ccccc43)c2-c2ccc(-c3cccc(-c4nc(-c5ccccc5)nc(-c5ccccc5)n4)c3)c3c2oc2ccccc23)cc1]
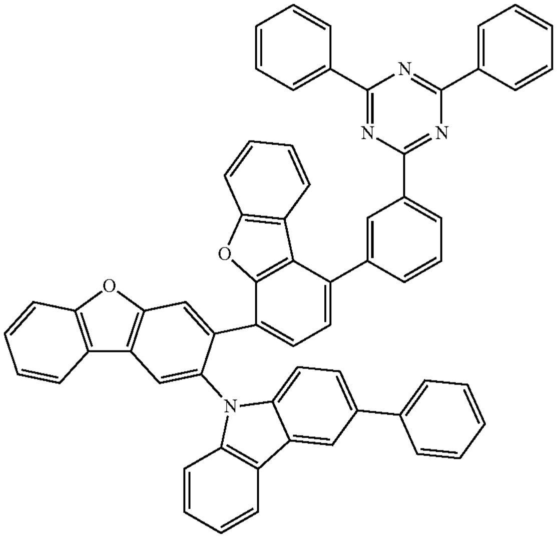 [SMILES: c1ccc(-c2ccc3c(c2)c2ccccc2n3-c2cc3c(cc2-c2ccc(-c4cccc(-c5nc(-c6ccccc6)nc(-c6ccccc6)n5)c4)c4c2oc2ccccc24)oc2ccccc23)cc1]
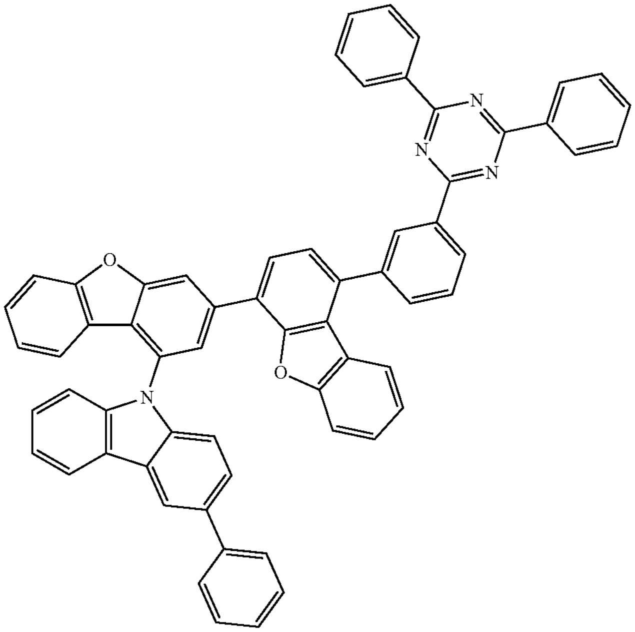 [SMILES: c1ccc(-c2ccc3c(c2)c2ccccc2n3-c2cc(-c3ccc(-c4cccc(-c5nc(-c6ccccc6)nc(-c6ccccc6)n5)c4)c4c3oc3ccccc34)cc3oc4ccccc4c23)cc1]

TABLE 1-continued
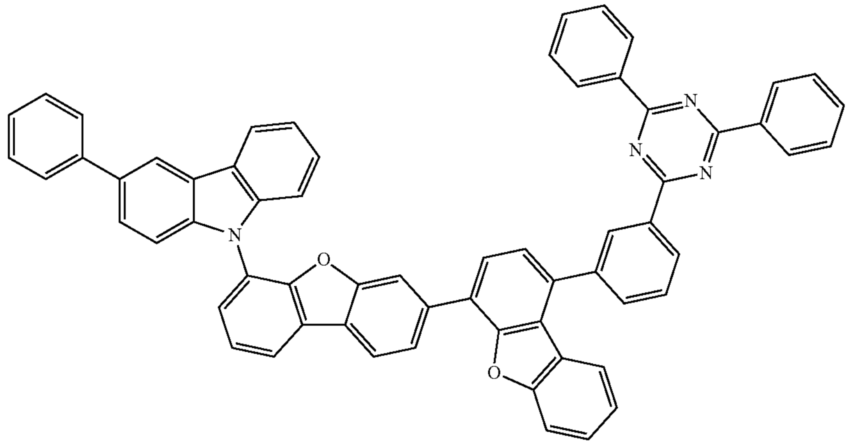 [SMILES: c1ccc(-c2ccc3c(c2)c2ccccc2n3-c2cccc3c2oc2cc(-c4ccc(-c5cccc(-c6nc(-c7ccccc7)nc(-c7ccccc7)n6)c5)c5c4oc4ccccc45)ccc23)cc1]
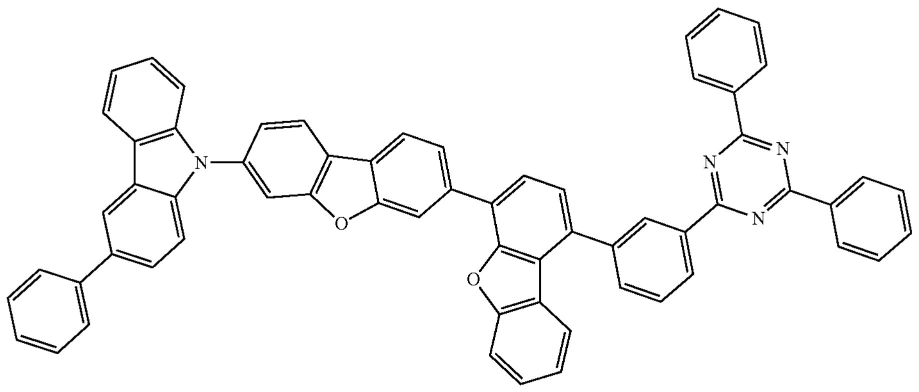 [SMILES: c1ccc(-c2ccc3c(c2)c2ccccc2n3-c2ccc3c(c2)oc2cc(-c4ccc(-c5cccc(-c6nc(-c7ccccc7)nc(-c7ccccc7)n6)c5)c5c4oc4ccccc45)ccc23)cc1]
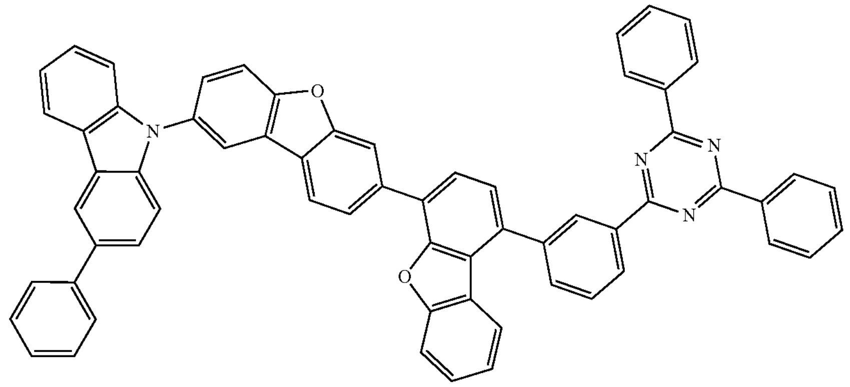 [SMILES: c1ccc(-c2ccc3c(c2)c2ccccc2n3-c2ccc3oc4cc(-c5ccc(-c6cccc(-c7nc(-c8ccccc8)nc(-c8ccccc8)n7)c6)c6c5oc5ccccc56)ccc4c3c2)cc1]

TABLE 1-continued
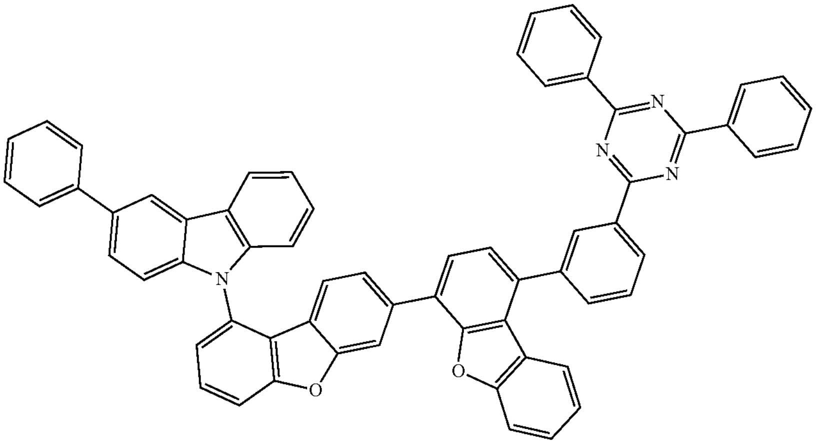 [SMILES: c1ccc(-c2ccc3c(c2)c2ccccc2n3-c2cccc3oc4cc(-c5ccc(-c6cccc(-c7nc(-c8ccccc8)nc(-c8ccccc8)n7)c6)c6c5oc5ccccc56)ccc4c23)cc1]
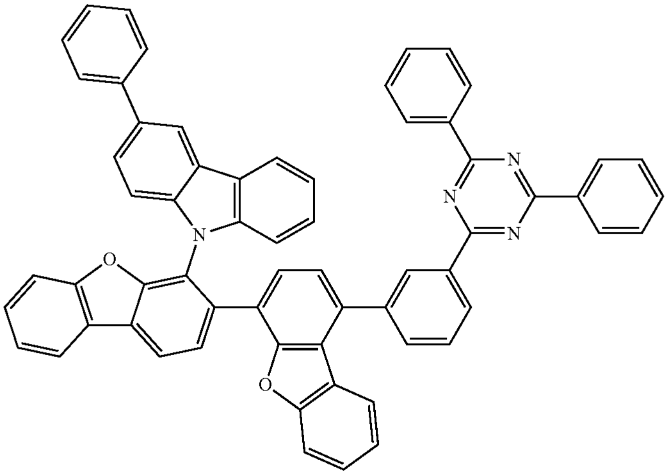 [SMILES: c1ccc(-c2ccc3c(c2)c2ccccc2n3-c2c(-c3ccc(-c4cccc(-c5nc(-c6ccccc6)nc(-c6ccccc6)n5)c4)c4c3oc3ccccc34)ccc3c2oc2ccccc23)cc1]
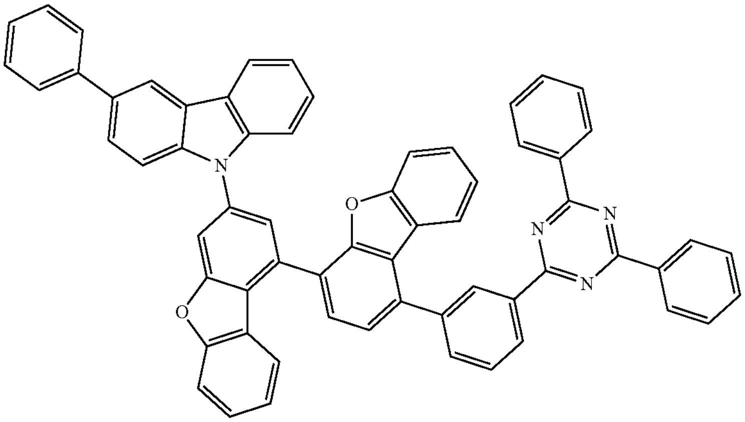 [SMILES: c1ccc(-c2ccc3c(c2)c2ccccc2n3-c2cc(-c3ccc(-c4cccc(-c5nc(-c6ccccc6)nc(-c6ccccc6)n5)c4)c4c3oc3ccccc34)c3c(c2)oc2ccccc23)cc1]

TABLE 1-continued
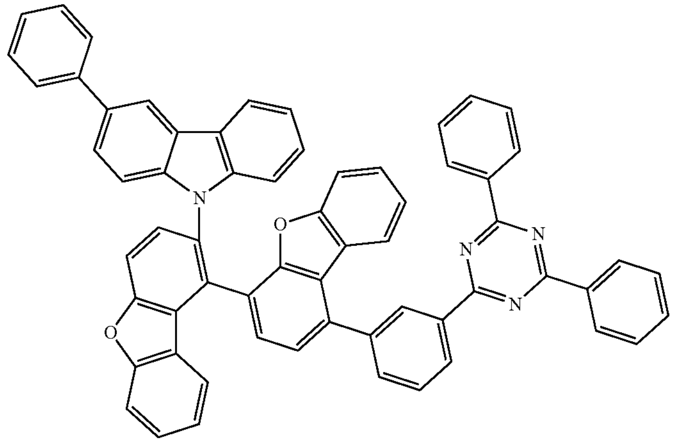 [SMILES: c1ccc(-c2ccc3c(c2)c2ccccc2n3-c2ccc3oc4ccccc4c3c2-c2ccc(-c3cccc(-c4nc(-c5ccccc5)nc(-c5ccccc5)n4)c3)c3c2oc2ccccc23)cc1]
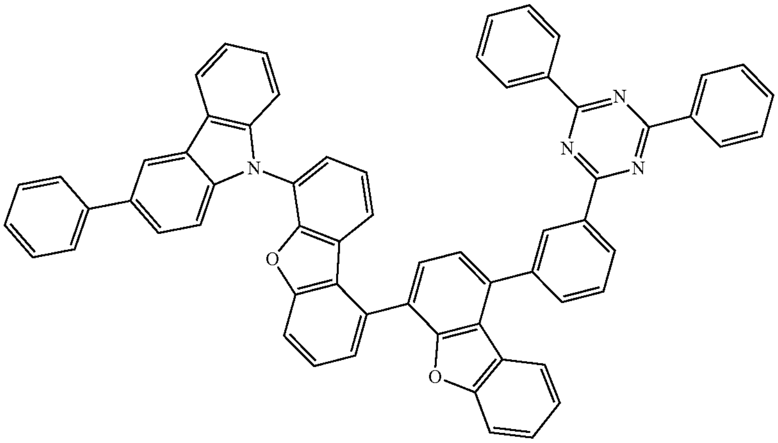 [SMILES: c1ccc(-c2ccc3c(c2)c2ccccc2n3-c2cccc3c2oc2cccc(-c4ccc(-c5cccc(-c6nc(-c7ccccc7)nc(-c7ccccc7)n6)c5)c5c4oc4ccccc45)c23)cc1]
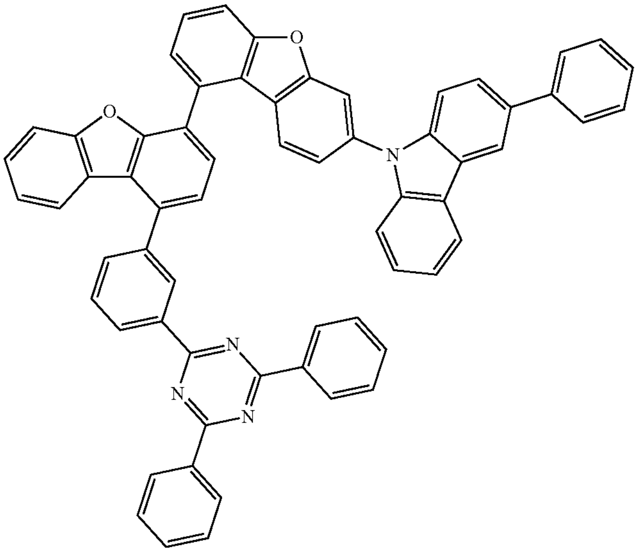 [SMILES: c1ccc(-c2ccc3c(c2)c2ccccc2n3-c2ccc3c(c2)oc2cccc(-c4ccc(-c5cccc(-c6nc(-c7ccccc7)nc(-c7ccccc7)n6)c5)c5c4oc4ccccc45)c23)cc1]

TABLE 1-continued
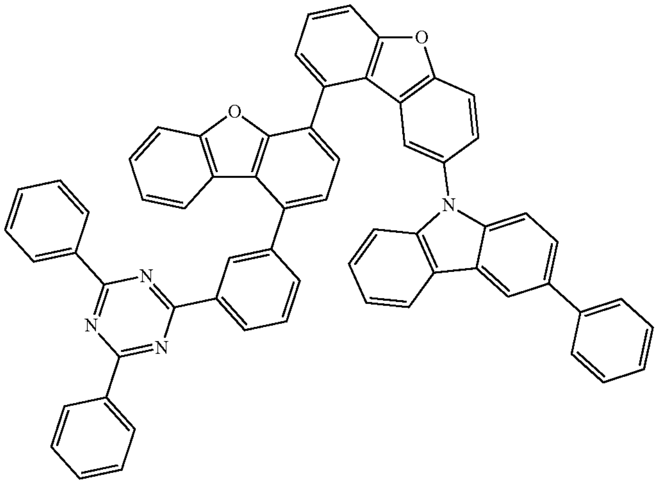 [SMILES: c1ccc(-c2ccc3c(c2)c2ccccc2n3-c2ccc3oc4cccc(-c5ccc(-c6cccc(-c7nc(-c8ccccc8)nc(-c8ccccc8)n7)c6)c6c5oc5ccccc56)c4c3c2)cc1]
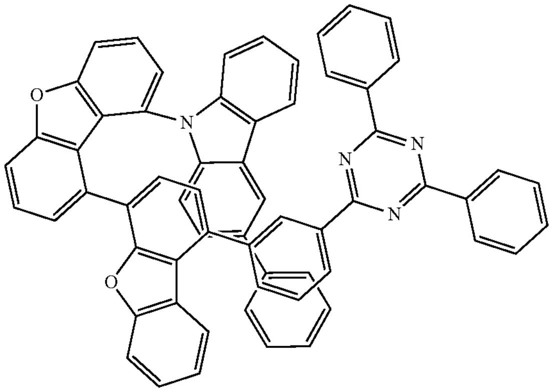 [SMILES: c1ccc(-c2ccc3c(c2)c2ccccc2n3-c2cccc3oc4cccc(-c5ccc(-c6cccc(-c7nc(-c8ccccc8)nc(-c8ccccc8)n7)c6)c6c5oc5ccccc56)c4c23)cc1]
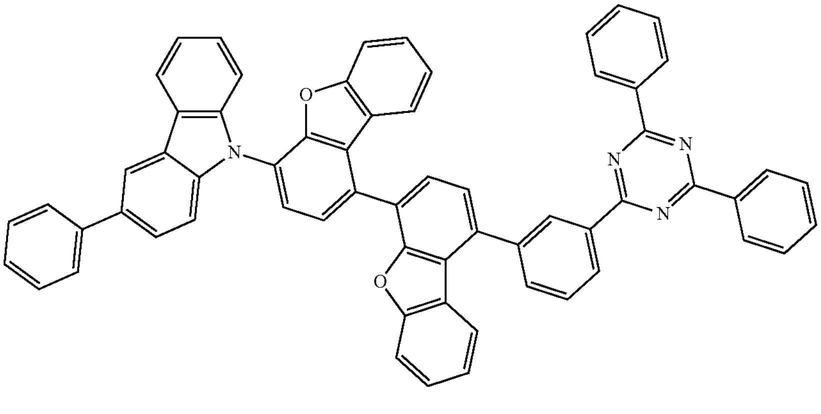 [SMILES: c1ccc(-c2ccc3c(c2)c2ccccc2n3-c2ccc(-c3ccc(-c4cccc(-c5nc(-c6ccccc6)nc(-c6ccccc6)n5)c4)c4c3oc3ccccc34)c3c2oc2ccccc23)cc1]

TABLE 1-continued
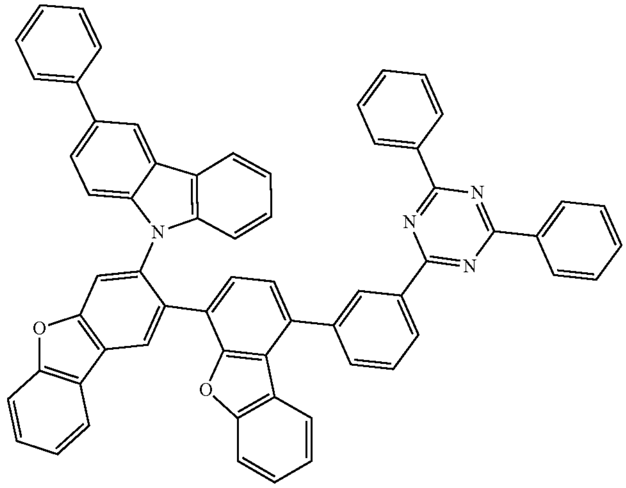 [SMILES: c1ccc(-c2ccc3c(c2)c2ccccc2n3-c2cc3oc4ccccc4c3cc2-c2ccc(-c3cccc(-c4nc(-c5ccccc5)nc(-c5ccccc5)n4)c3)c3c2oc2ccccc23)cc1]
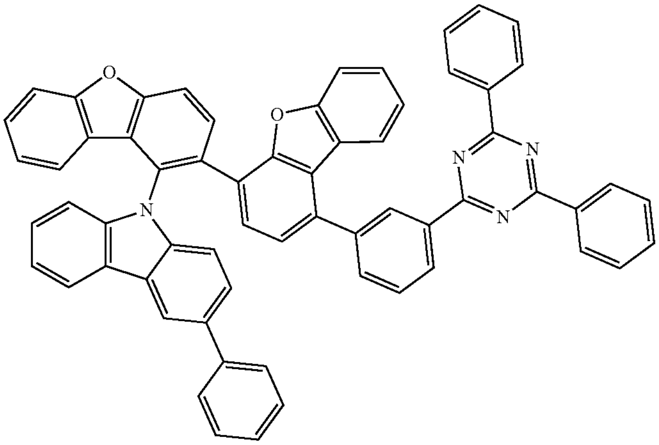 [SMILES: c1ccc(-c2ccc3c(c2)c2ccccc2n3-c2c(-c3ccc(-c4cccc(-c5nc(-c6ccccc6)nc(-c6ccccc6)n5)c4)c4c3oc3ccccc34)ccc3oc4ccccc4c23)cc1]
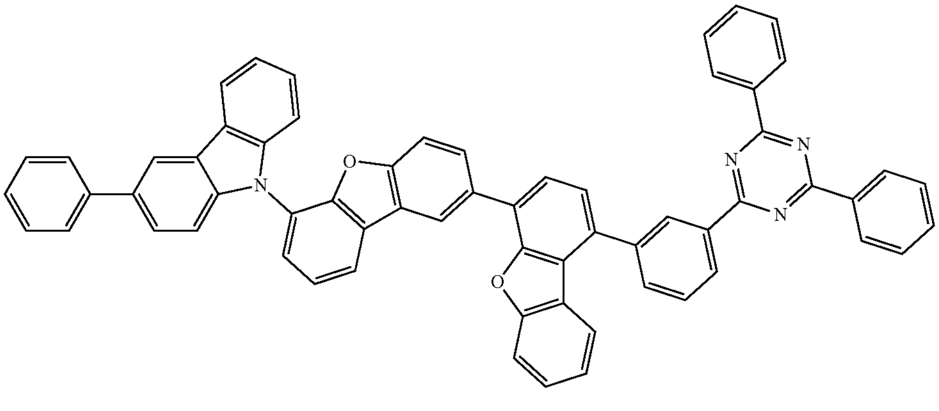 [SMILES: c1ccc(-c2ccc3c(c2)c2ccccc2n3-c2cccc3c2oc2ccc(-c4ccc(-c5cccc(-c6nc(-c7ccccc7)nc(-c7ccccc7)n6)c5)c5c4oc4ccccc45)cc23)cc1]

TABLE 1-continued
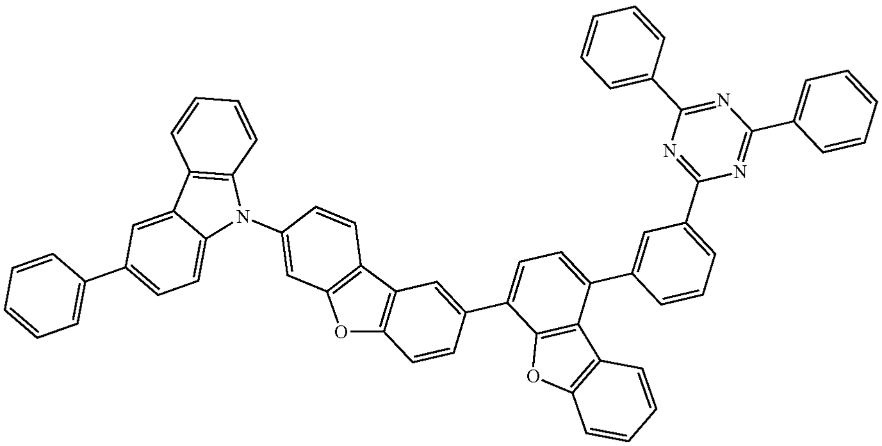 [SMILES: c1ccc(-c2ccc3c(c2)c2ccccc2n3-c2ccc3c(c2)oc2ccc(-c4ccc(-c5cccc(-c6nc(-c7ccccc7)nc(-c7ccccc7)n6)c5)c5c4oc4ccccc45)cc23)cc1]
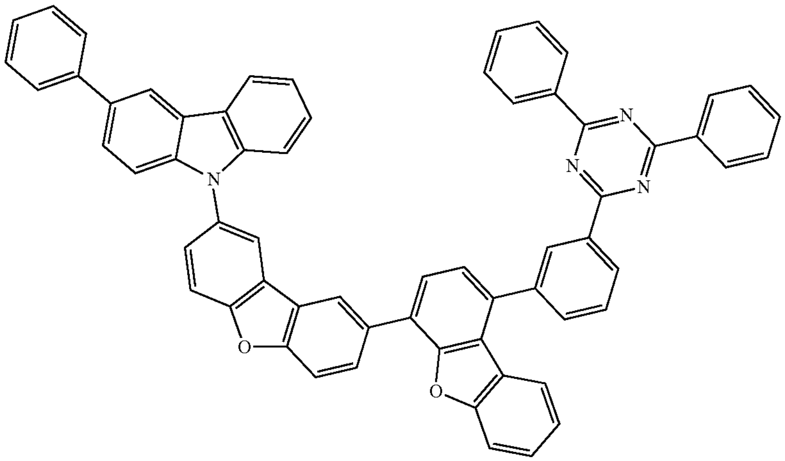 [SMILES: c1ccc(-c2ccc3c(c2)c2ccccc2n3-c2ccc3oc4ccc(-c5ccc(-c6cccc(-c7nc(-c8ccccc8)nc(-c8ccccc8)n7)c6)c6c5oc5ccccc56)cc4c3c2)cc1]
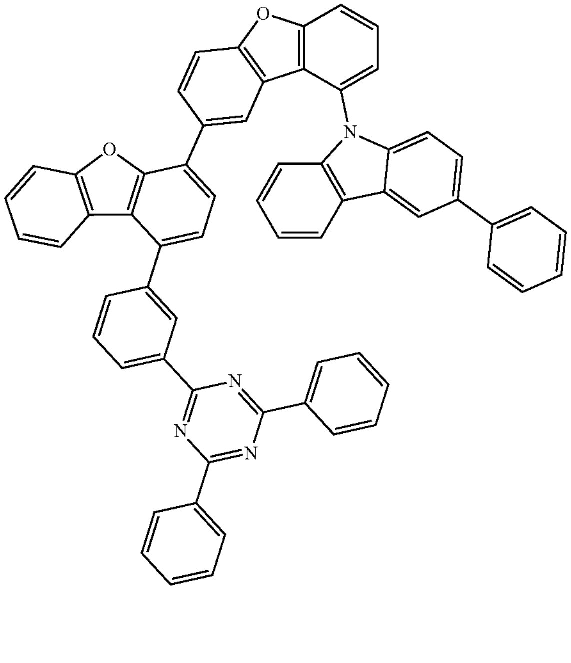 [SMILES: c1ccc(-c2ccc3c(c2)c2ccccc2n3-c2cccc3oc4ccc(-c5ccc(-c6cccc(-c7nc(-c8ccccc8)nc(-c8ccccc8)n7)c6)c6c5oc5ccccc56)cc4c23)cc1]

TABLE 1-continued
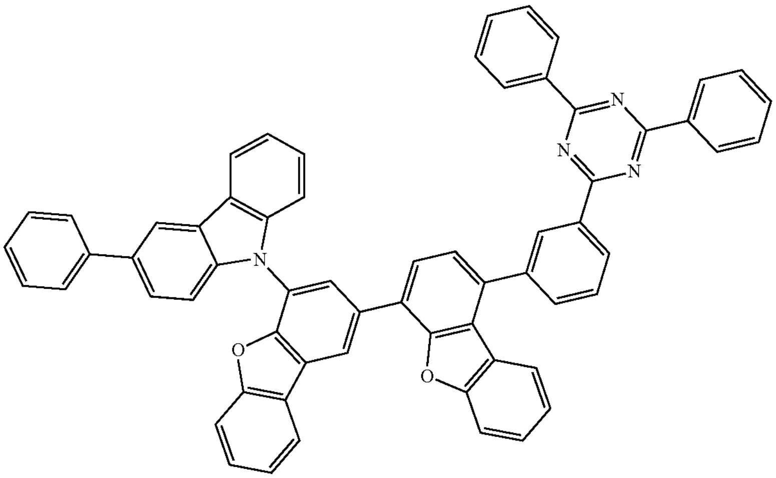 [SMILES: c1ccc(-c2ccc3c(c2)c2ccccc2n3-c2cc(-c3ccc(-c4cccc(-c5nc(-c6ccccc6)nc(-c6ccccc6)n5)c4)c4c3oc3ccccc34)cc3c2oc2ccccc23)cc1]
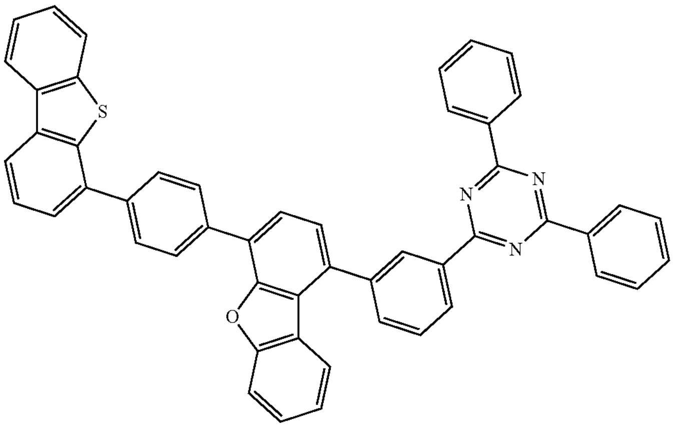 [SMILES: c1ccc(-c2nc(-c3ccccc3)nc(-c3cccc(-c4ccc(-c5ccc(-c6cccc7c6sc6ccccc67)cc5)c5oc6ccccc6c45)c3)n2)cc1]
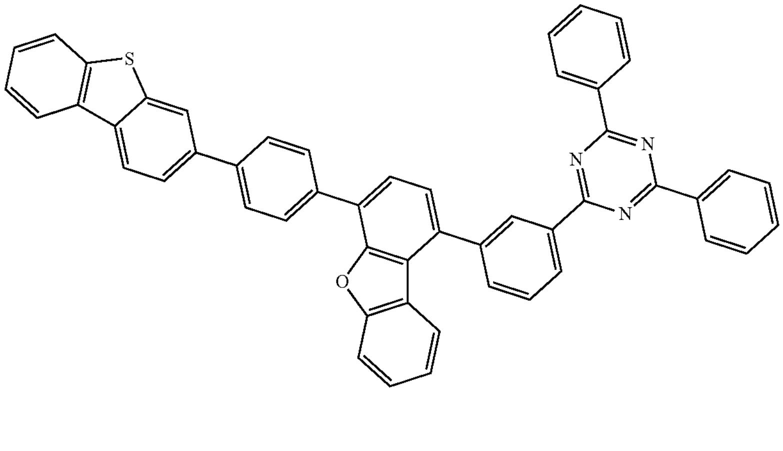 [SMILES: c1ccc(-c2nc(-c3ccccc3)nc(-c3cccc(-c4ccc(-c5ccc(-c6ccc7c(c6)sc6ccccc67)cc5)c5oc6ccccc6c45)c3)n2)cc1]

TABLE 1-continued
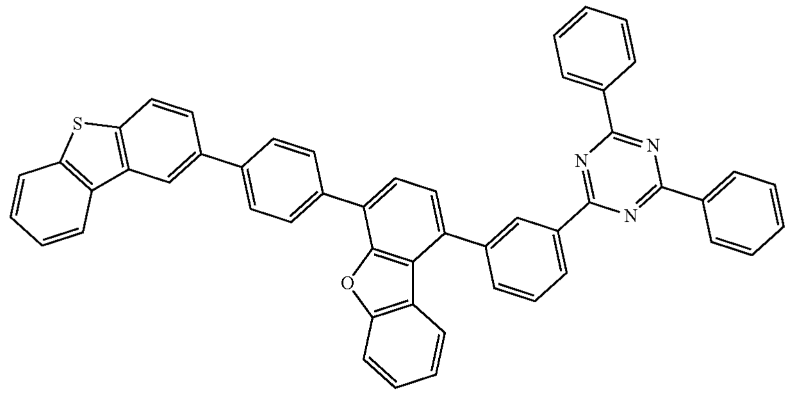 [SMILES: c1ccc(-c2nc(-c3ccccc3)nc(-c3cccc(-c4ccc(-c5ccc(-c6ccc7sc8ccccc8c7c6)cc5)c5oc6ccccc6c45)c3)n2)cc1]
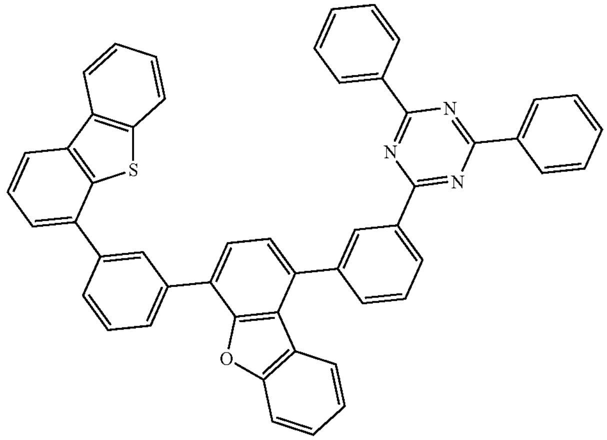 [SMILES: c1ccc(-c2nc(-c3ccccc3)nc(-c3cccc(-c4ccc(-c5cccc(-c6cccc7c6sc6ccccc67)c5)c5oc6ccccc6c45)c3)n2)cc1]
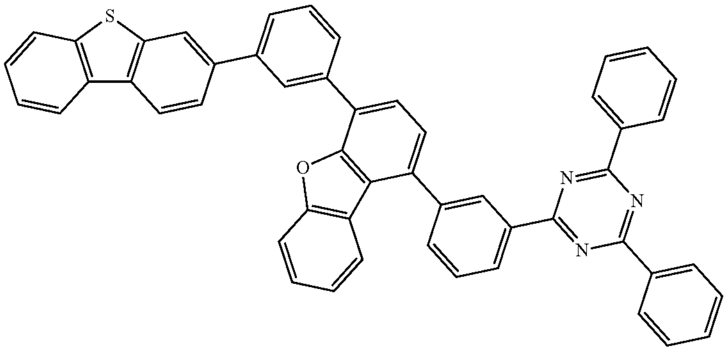 [SMILES: c1ccc(-c2nc(-c3ccccc3)nc(-c3cccc(-c4ccc(-c5cccc(-c6ccc7c(c6)sc6ccccc67)c5)c5oc6ccccc6c45)c3)n2)cc1]
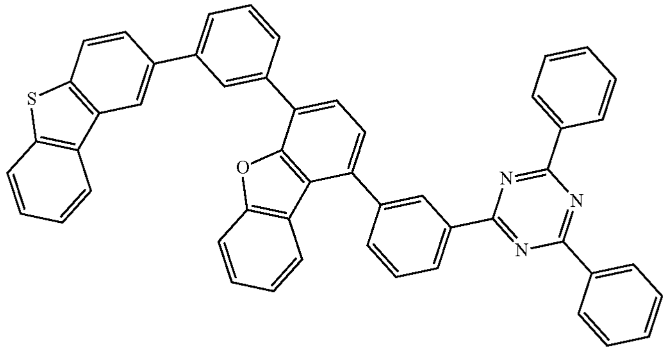 [SMILES: c1ccc(-c2nc(-c3ccccc3)nc(-c3cccc(-c4ccc(-c5cccc(-c6ccc7sc8ccccc8c7c6)c5)c5oc6ccccc6c45)c3)n2)cc1]

TABLE 1-continued
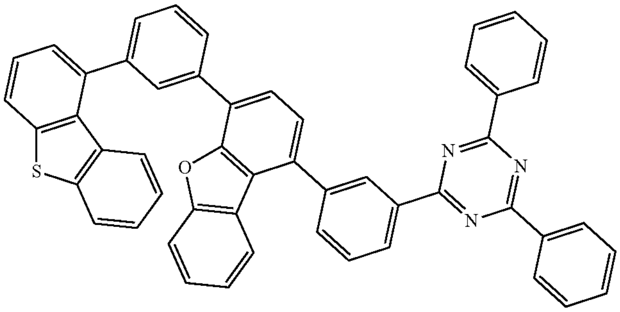 [SMILES: c1ccc(-c2nc(-c3ccccc3)nc(-c3cccc(-c4ccc(-c5cccc(-c6cccc7sc8ccccc8c67)c5)c5oc6ccccc6c45)c3)n2)cc1]
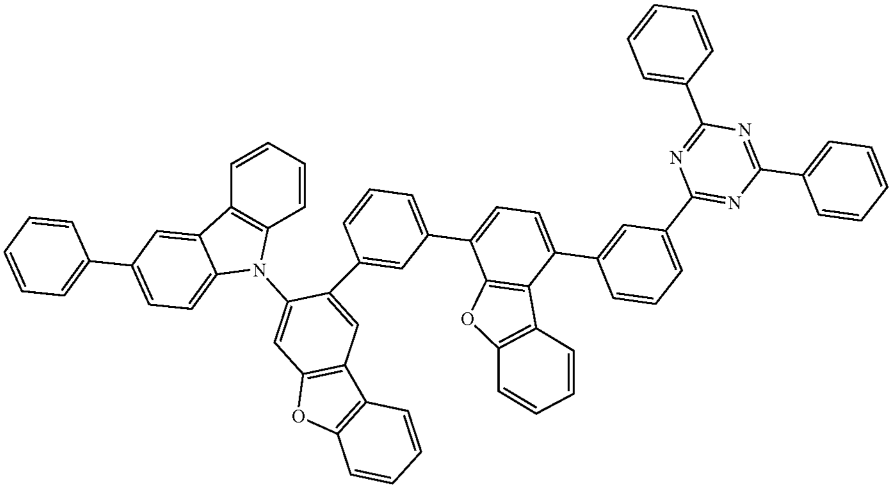 [SMILES: c1ccc(-c2ccc3c(c2)c2ccccc2n3-c2cc3oc4ccccc4c3cc2-c2cccc(-c3ccc(-c4cccc(-c5nc(-c6ccccc6)nc(-c6ccccc6)n5)c4)c4c3oc3ccccc34)c2)cc1]
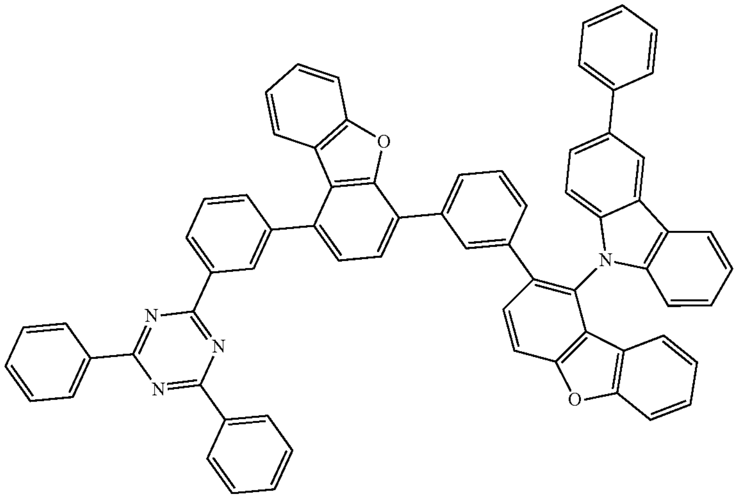 [SMILES: c1ccc(-c2ccc3c(c2)c2ccccc2n3-c2c(-c3cccc(-c4ccc(-c5cccc(-c6nc(-c7ccccc7)nc(-c7ccccc7)n6)c5)c5c4oc4ccccc45)c3)ccc3oc4ccccc4c23)cc1]

TABLE 1-continued
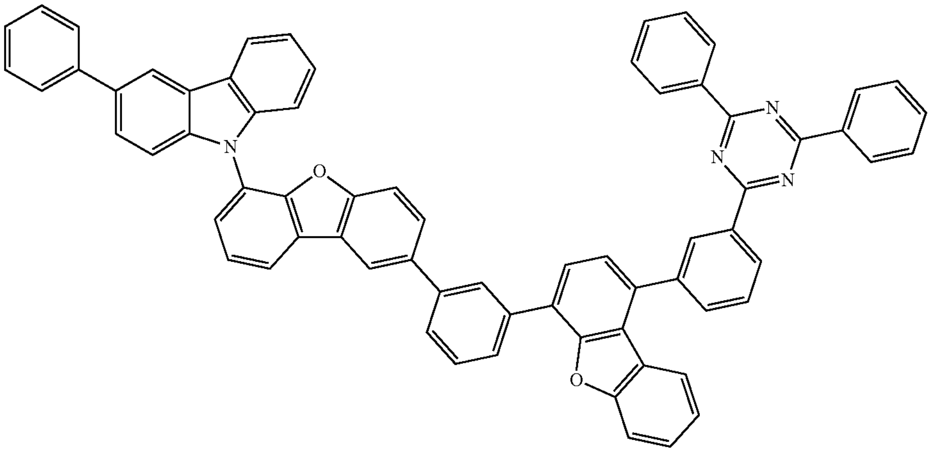 [SMILES: c1ccc(-c2ccc3c(c2)c2ccccc2n3-c2cccc3c2oc2ccc(-c4cccc(-c5ccc(-c6cccc(-c7nc(-c8ccccc8)nc(-c8ccccc8)n7)c6)c6c5oc5ccccc56)c4)cc23)cc1]
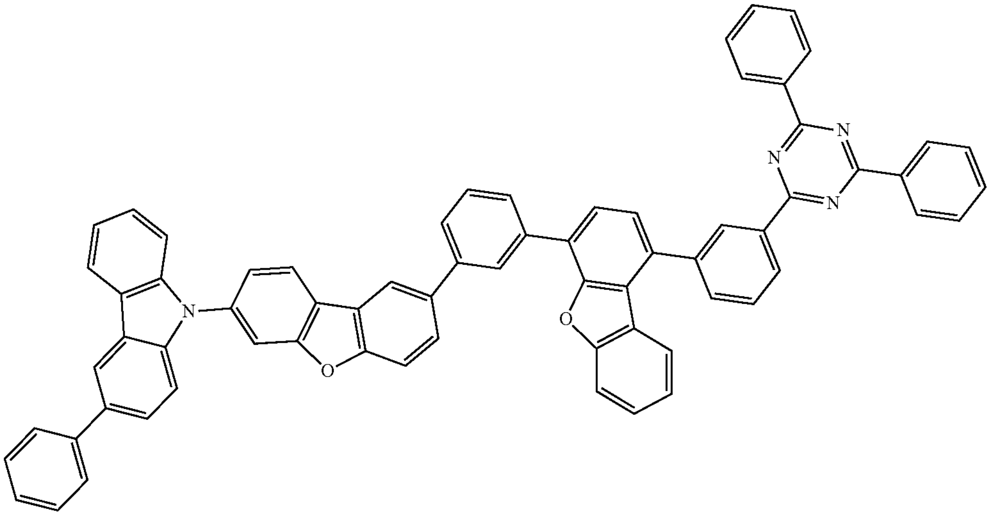 [SMILES: c1ccc(-c2ccc3c(c2)c2ccccc2n3-c2ccc3c(c2)oc2ccc(-c4cccc(-c5ccc(-c6cccc(-c7nc(-c8ccccc8)nc(-c8ccccc8)n7)c6)c6c5oc5ccccc56)c4)cc23)cc1]
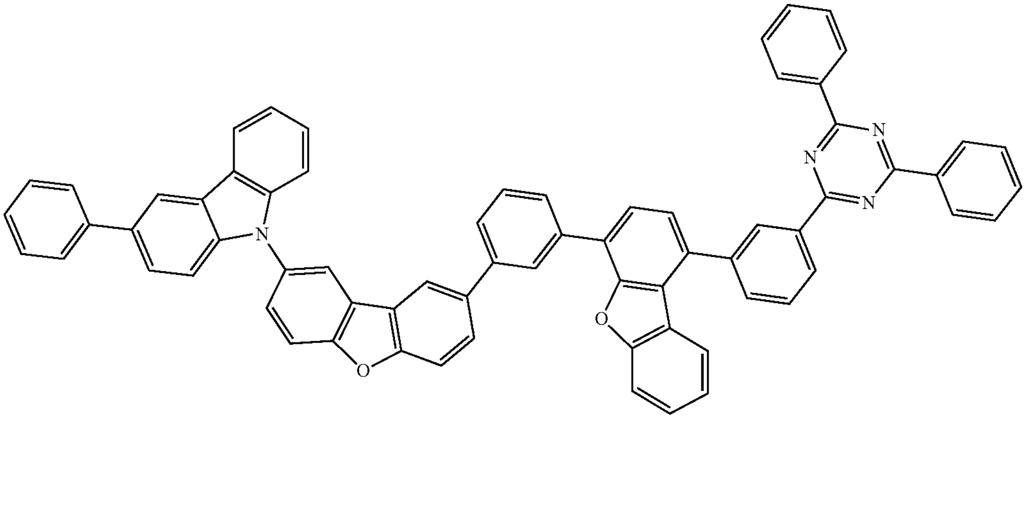 [SMILES: c1ccc(-c2ccc3c(c2)c2ccccc2n3-c2ccc3oc4ccc(-c5cccc(-c6ccc(-c7cccc(-c8nc(-c9ccccc9)nc(-c9ccccc9)n8)c7)c7c6oc6ccccc67)c5)cc4c3c2)cc1]

TABLE 1-continued
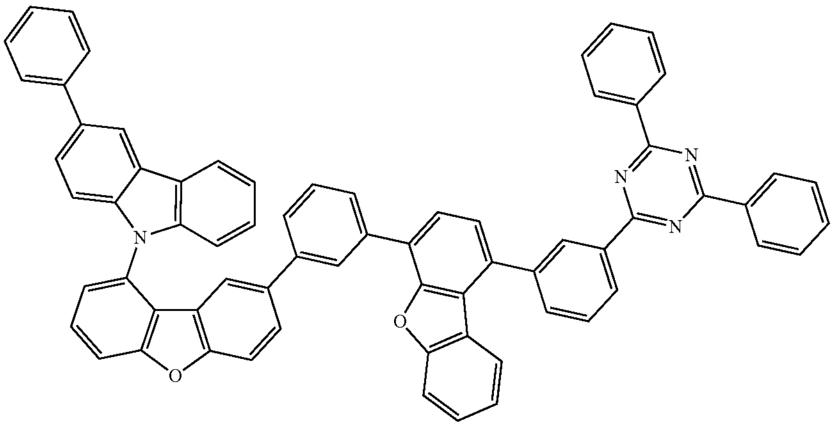 [SMILES: c1ccc(-c2ccc3c(c2)c2ccccc2n3-c2cccc3oc4ccc(-c5cccc(-c6ccc(-c7cccc(-c8nc(-c9ccccc9)nc(-c9ccccc9)n8)c7)c7c6oc6ccccc67)c5)cc4c23)cc1]
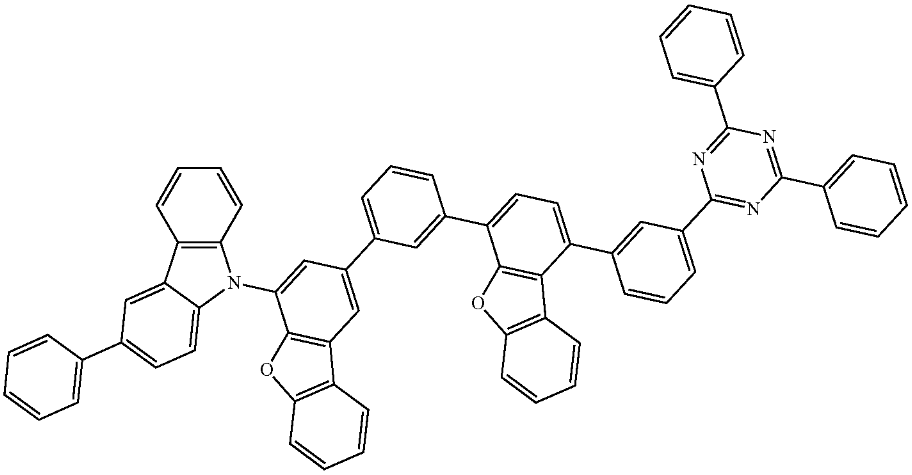 [SMILES: c1ccc(-c2ccc3c(c2)c2ccccc2n3-c2cc(-c3cccc(-c4ccc(-c5cccc(-c6nc(-c7ccccc7)nc(-c7ccccc7)n6)c5)c5c4oc4ccccc45)c3)cc3c2oc2ccccc23)cc1]
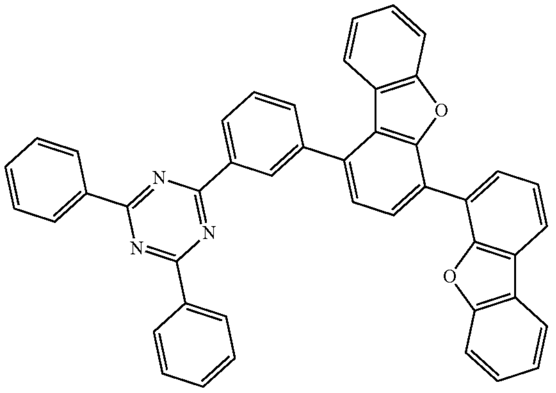 [SMILES: c1ccc(-c2nc(-c3ccccc3)nc(-c3cccc(-c4ccc(-c5cccc6c5oc5ccccc56)c5oc6ccccc6c45)c3)n2)cc1]

TABLE 1-continued
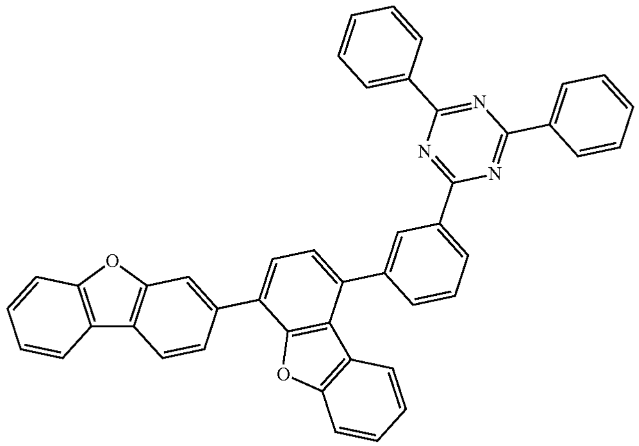 [SMILES: c1ccc(-c2nc(-c3ccccc3)nc(-c3cccc(-c4ccc(-c5ccc6c(c5)oc5ccccc56)c5oc6ccccc6c45)c3)n2)cc1]
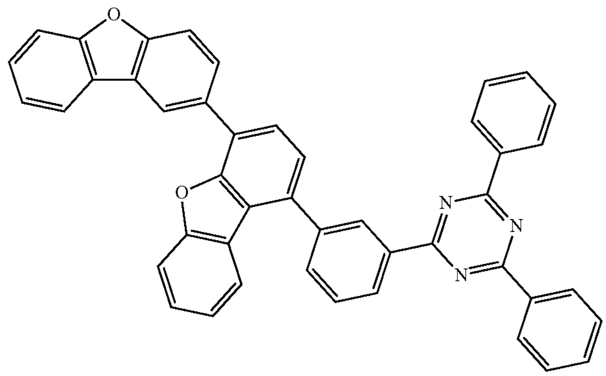 [SMILES: c1ccc(-c2nc(-c3ccccc3)nc(-c3cccc(-c4ccc(-c5ccc6oc7ccccc7c6c5)c5oc6ccccc6c45)c3)n2)cc1]
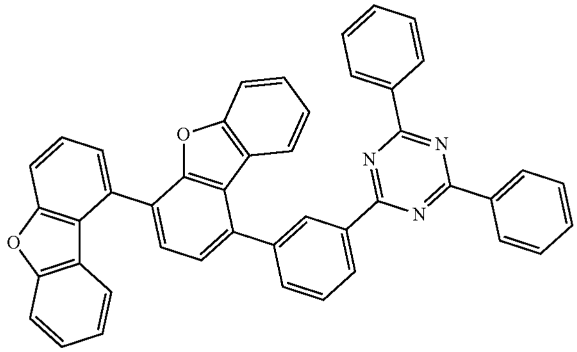 [SMILES: c1ccc(-c2nc(-c3ccccc3)nc(-c3cccc(-c4ccc(-c5cccc6oc7ccccc7c56)c5oc6ccccc6c45)c3)n2)cc1]

TABLE 1-continued
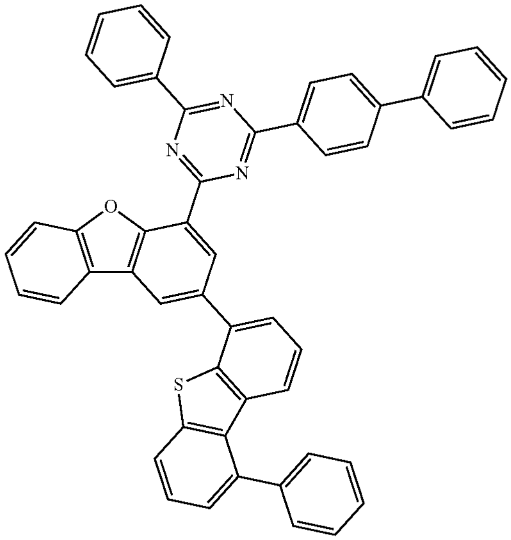 [SMILES: c1ccc(-c2ccc(-c3nc(-c4ccccc4)nc(-c4cc(-c5cccc6c5sc5cccc(-c7ccccc7)c56)cc5c4oc4ccccc45)n3)cc2)cc1]
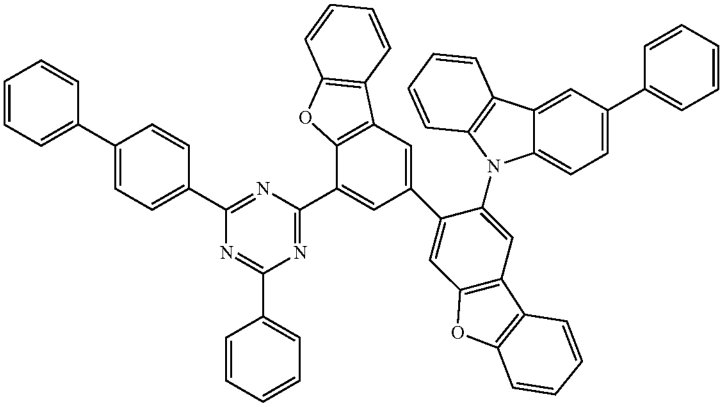 [SMILES: c1ccc(-c2ccc(-c3nc(-c4ccccc4)nc(-c4cc(-c5cc6oc7ccccc7c6cc5-n5c6ccccc6c6cc(-c7ccccc7)ccc65)cc5c4oc4ccccc45)n3)cc2)cc1]
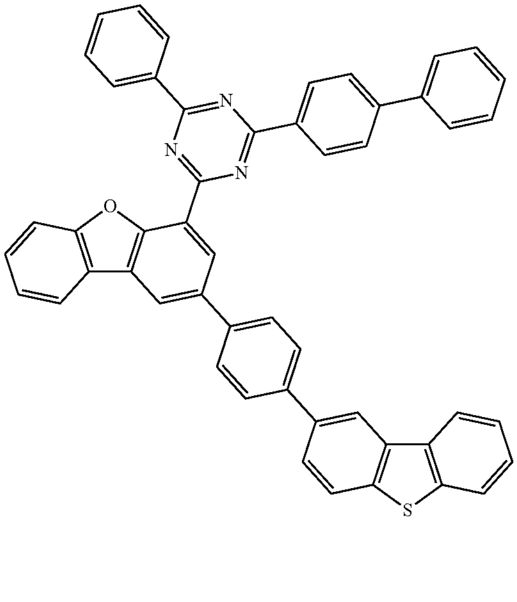 [SMILES: c1ccc(-c2ccc(-c3nc(-c4ccccc4)nc(-c4cc(-c5ccc(-c6ccc7sc8ccccc8c7c6)cc5)cc5c4oc4ccccc45)n3)cc2)cc1]

TABLE 1-continued
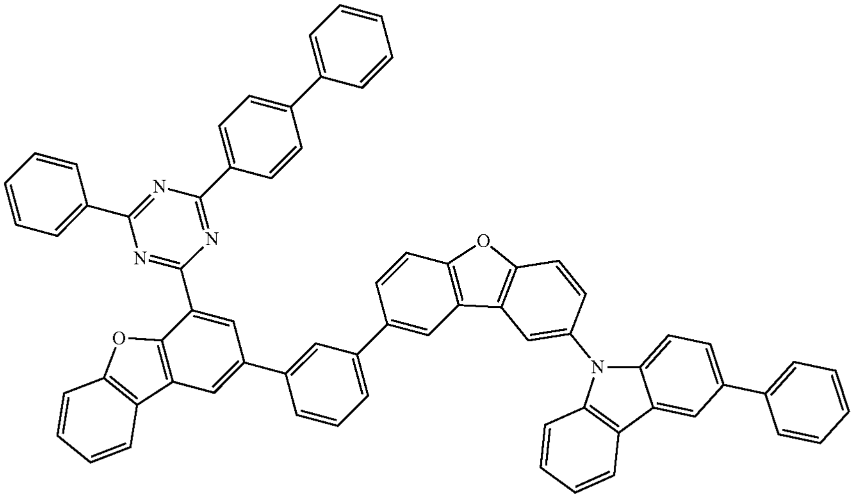 [SMILES: c1ccc(-c2ccc(-c3nc(-c4ccccc4)nc(-c4cc(-c5cccc(-c6ccc7oc8ccc(-n9c%10ccccc%10c%10cc(-c%11ccccc%11)ccc%109)cc8c7c6)c5)cc5c4oc4ccccc45)n3)cc2)cc1]
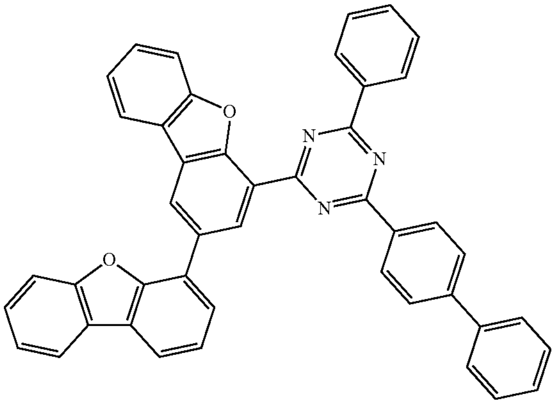 [SMILES: c1ccc(-c2ccc(-c3nc(-c4ccccc4)nc(-c4cc(-c5cccc6c5oc5ccccc56)cc5c4oc4ccccc45)n3)cc2)cc1]
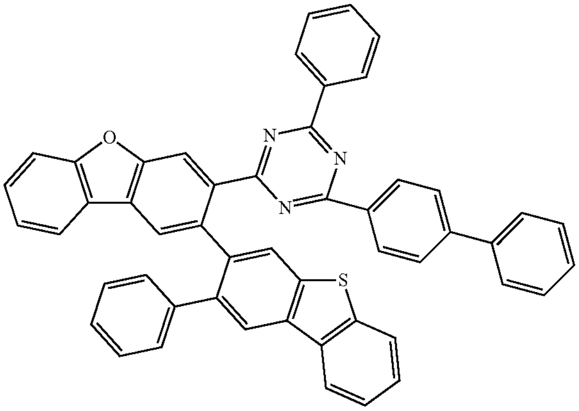 [SMILES: c1ccc(-c2ccc(-c3nc(-c4ccccc4)nc(-c4cc5oc6ccccc6c5cc4-c4cc5sc6ccccc6c5cc4-c4ccccc4)n3)cc2)cc1]

TABLE 1-continued
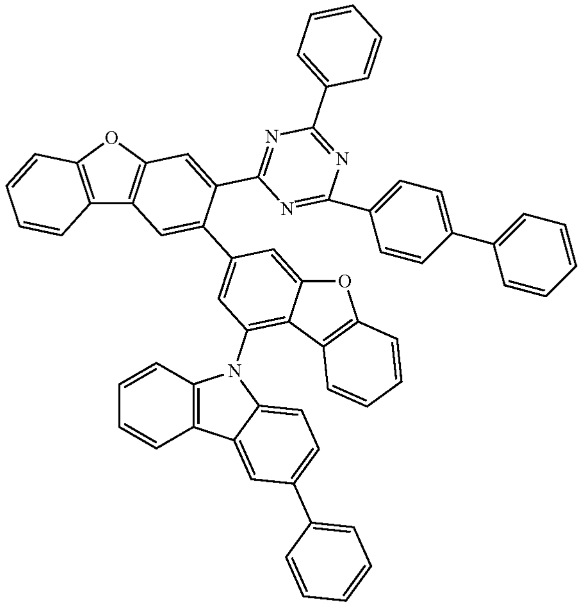 [SMILES: c1ccc(-c2ccc(-c3nc(-c4ccccc4)nc(-c4cc5oc6ccccc6c5cc4-c4cc(-n5c6ccccc6c6cc(-c7ccccc7)ccc65)c5c(c4)oc4ccccc45)n3)cc2)cc1]
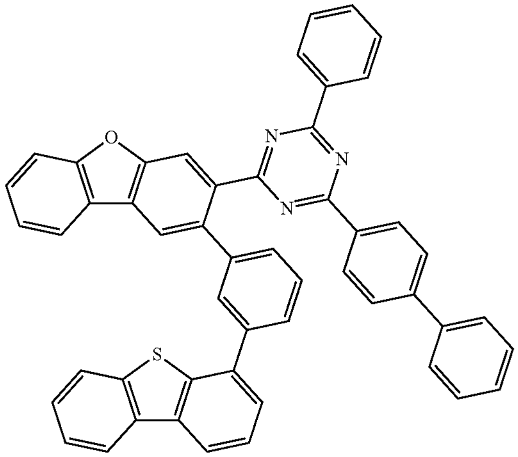 [SMILES: c1ccc(-c2ccc(-c3nc(-c4ccccc4)nc(-c4cc5oc6ccccc6c5cc4-c4cccc(-c5cccc6c5sc5ccccc56)c4)n3)cc2)cc1]
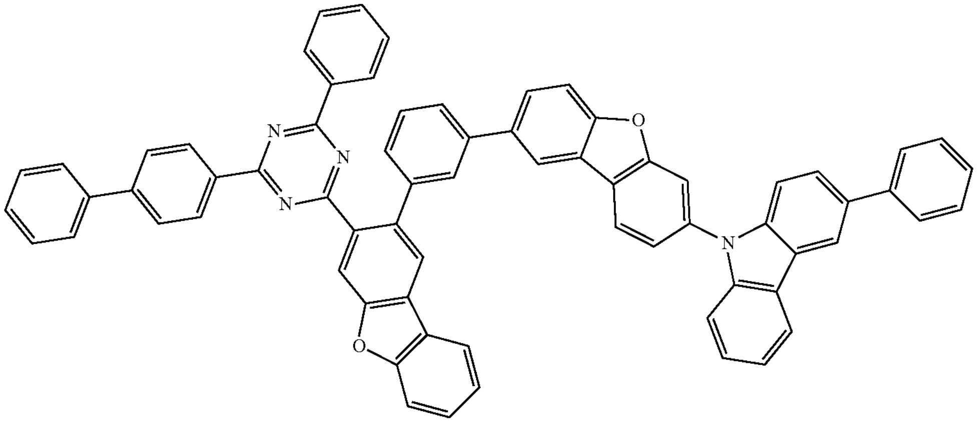 [SMILES: c1ccc(-c2ccc(-c3nc(-c4ccccc4)nc(-c4cc5oc6ccccc6c5cc4-c4cccc(-c5ccc6oc7cc(-n8c9ccccc9c9cc(-c%10ccccc%10)ccc98)ccc7c6c5)c4)n3)cc2)cc1]

TABLE 1-continued
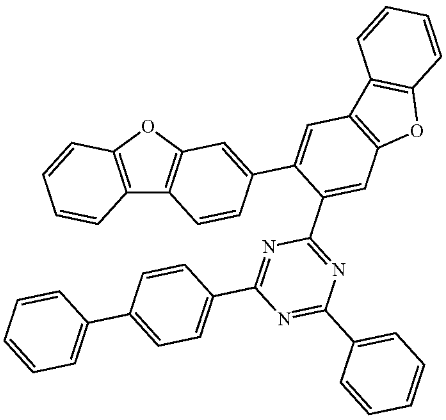 [SMILES: c1ccc(-c2ccc(-c3nc(-c4ccccc4)nc(-c4cc5oc6ccccc6c5cc4-c4ccc5c(c4)oc4ccccc45)n3)cc2)cc1]
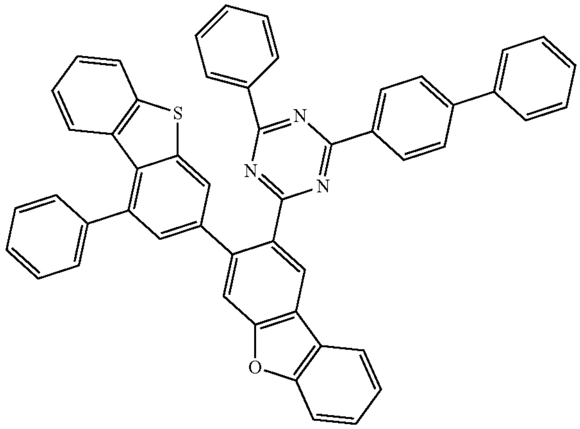 [SMILES: c1ccc(-c2ccc(-c3nc(-c4ccccc4)nc(-c4cc5c(cc4-c4cc(-c6ccccc6)c6c(c4)sc4ccccc46)oc4ccccc45)n3)cc2)cc1]
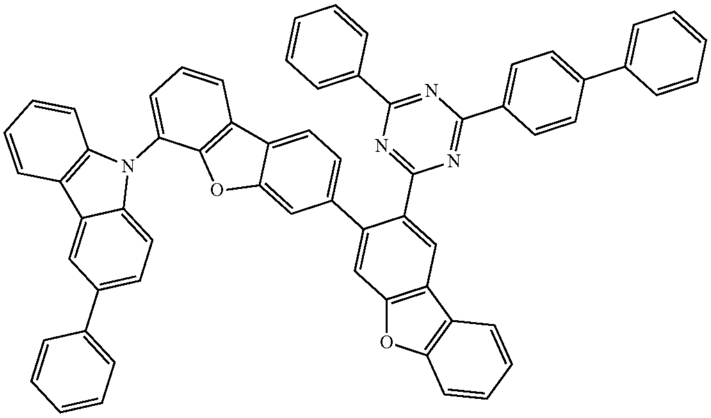 [SMILES: c1ccc(-c2ccc(-c3nc(-c4ccccc4)nc(-c4cc5c(cc4-c4ccc6c(c4)oc4c(-n7c8ccccc8c8cc(-c9ccccc9)ccc87)cccc46)oc4ccccc45)n3)cc2)cc1]

TABLE 1-continued
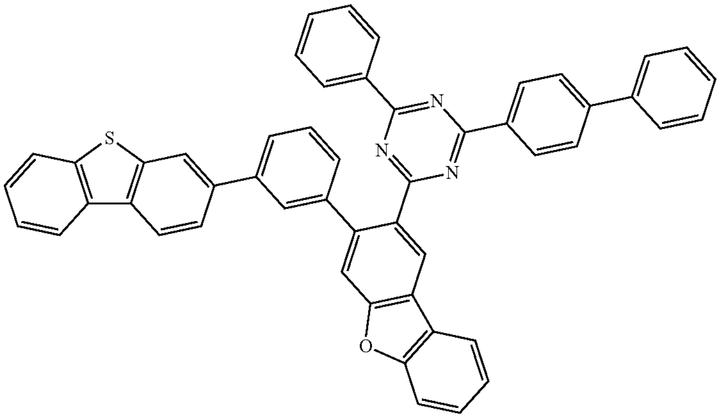 [SMILES: c1ccc(-c2ccc(-c3nc(-c4ccccc4)nc(-c4cc5c(cc4-c4cccc(-c6ccc7c(c6)sc6ccccc67)c4)oc4ccccc45)n3)cc2)cc1]
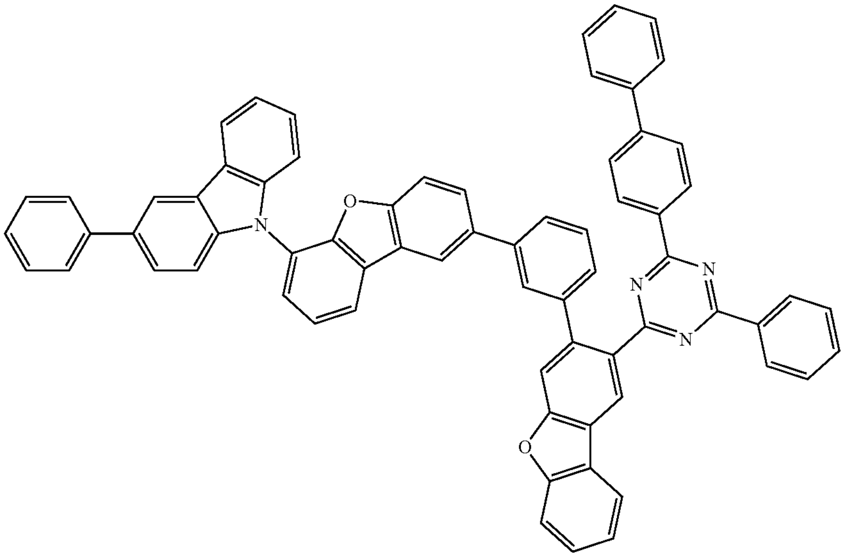 [SMILES: c1ccc(-c2ccc(-c3nc(-c4ccccc4)nc(-c4cc5c(cc4-c4cccc(-c6ccc7oc8c(-n9c%10ccccc%10c%10cc(-c%11ccccc%11)ccc%109)cccc8c7c6)c4)oc4ccccc45)n3)cc2)cc1]
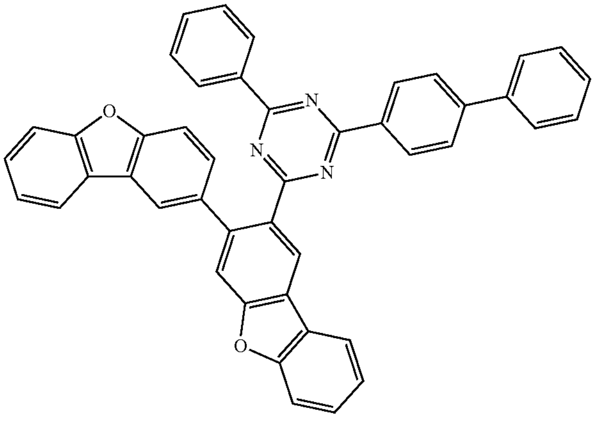 [SMILES: c1ccc(-c2ccc(-c3nc(-c4ccccc4)nc(-c4cc5c(cc4-c4ccc6oc7ccccc7c6c4)oc4ccccc45)n3)cc2)cc1]

TABLE 1-continued
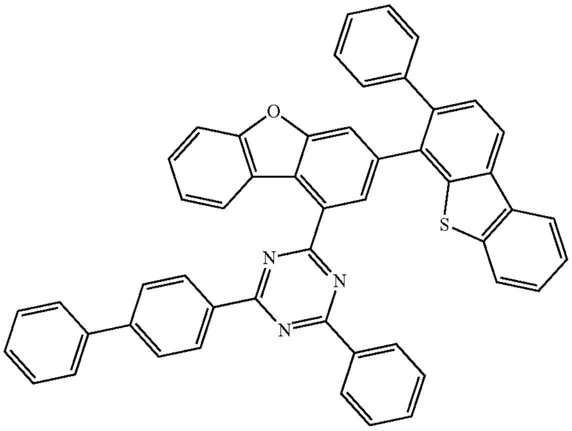 [SMILES: c1ccc(-c2ccc(-c3nc(-c4ccccc4)nc(-c4cc(-c5c(-c6ccccc6)ccc6c5sc5ccccc56)cc5oc6ccccc6c45)n3)cc2)cc1]
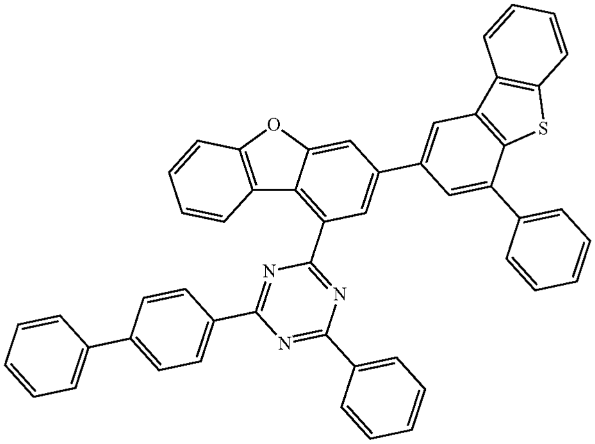 [SMILES: c1ccc(-c2ccc(-c3nc(-c4ccccc4)nc(-c4cc(-c5cc(-c6ccccc6)c6sc7ccccc7c6c5)cc5oc6ccccc6c45)n3)cc2)cc1]
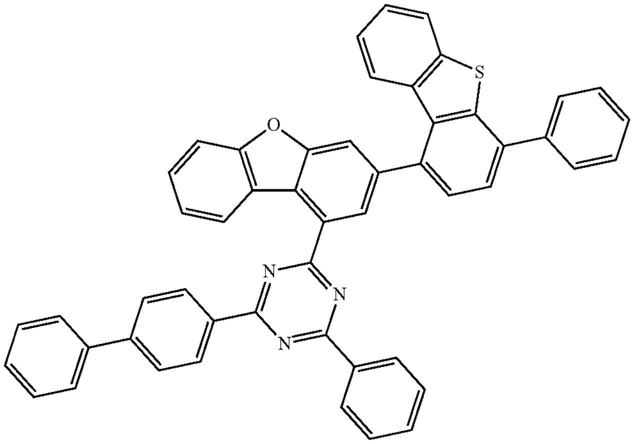 [SMILES: c1ccc(-c2ccc(-c3nc(-c4ccccc4)nc(-c4cc(-c5ccc(-c6ccccc6)c6sc7ccccc7c56)cc5oc6ccccc6c45)n3)cc2)cc1]

TABLE 1-continued
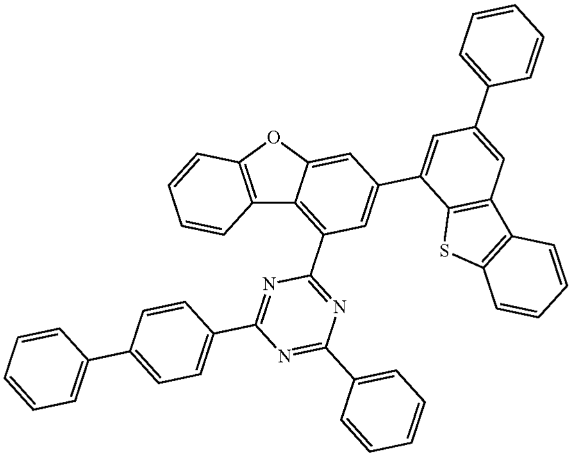 [SMILES: c1ccc(-c2ccc(-c3nc(-c4ccccc4)nc(-c4cc(-c5cc(-c6ccccc6)cc6c5sc5ccccc56)cc5oc6ccccc6c45)n3)cc2)cc1]
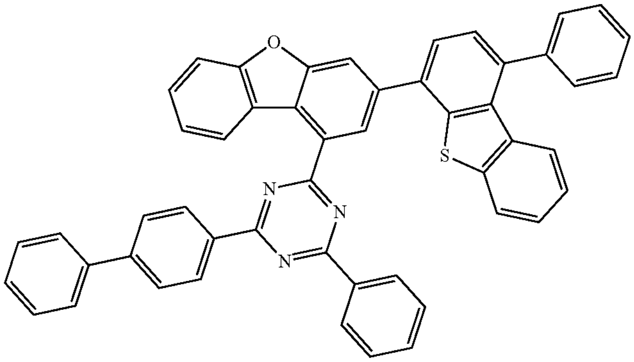 [SMILES: c1ccc(-c2ccc(-c3nc(-c4ccccc4)nc(-c4cc(-c5ccc(-c6ccccc6)c6c5sc5ccccc56)cc5oc6ccccc6c45)n3)cc2)cc1]
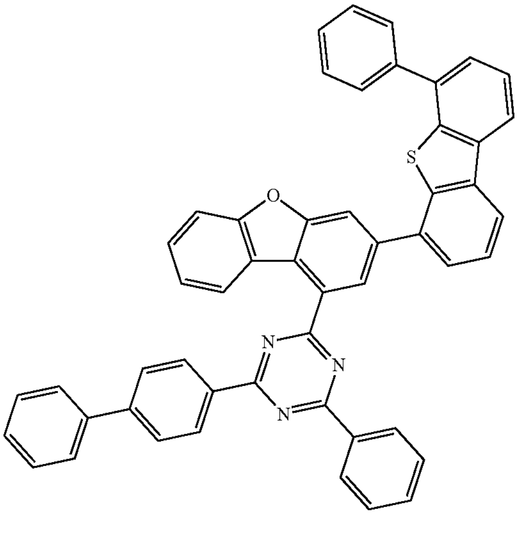 [SMILES: c1ccc(-c2ccc(-c3nc(-c4ccccc4)nc(-c4cc(-c5cccc6c5sc5c(-c7ccccc7)cccc56)cc5oc6ccccc6c45)n3)cc2)cc1]

TABLE 1-continued
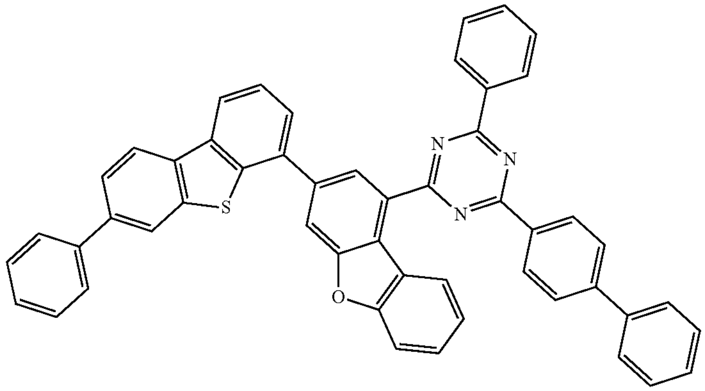 [SMILES: c1ccc(-c2ccc(-c3nc(-c4ccccc4)nc(-c4cc(-c5cccc6c5sc5cc(-c7ccccc7)ccc56)cc5oc6ccccc6c45)n3)cc2)cc1]
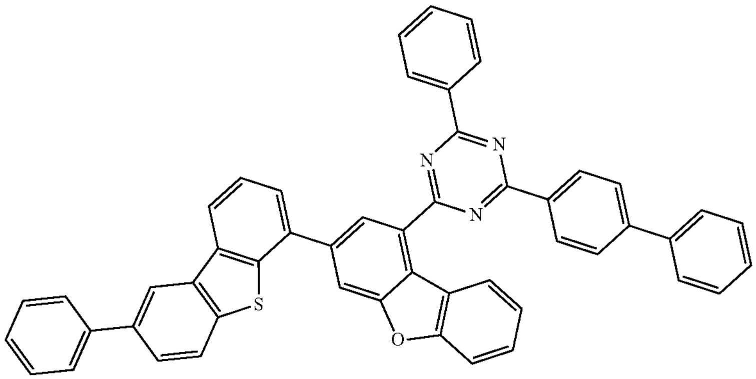 [SMILES: c1ccc(-c2ccc(-c3nc(-c4ccccc4)nc(-c4cc(-c5cccc6c5sc5ccc(-c7ccccc7)cc56)cc5oc6ccccc6c45)n3)cc2)cc1]
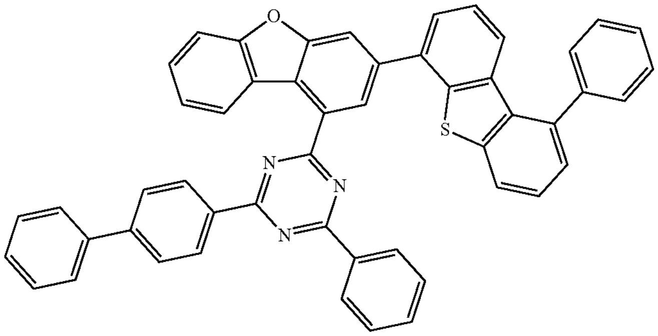 [SMILES: c1ccc(-c2ccc(-c3nc(-c4ccccc4)nc(-c4cc(-c5cccc6c5sc5cccc(-c7ccccc7)c56)cc5oc6ccccc6c45)n3)cc2)cc1]
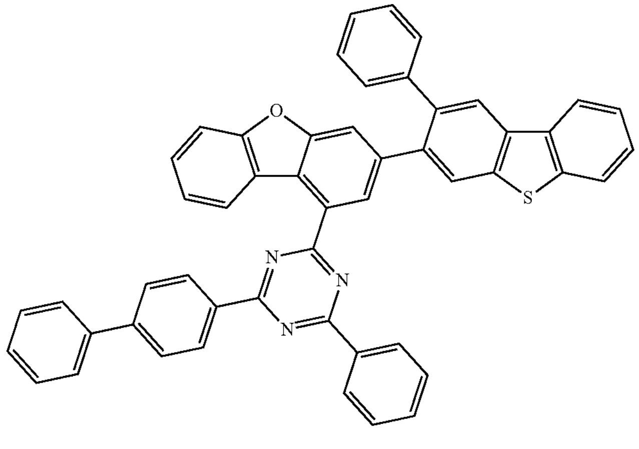 [SMILES: c1ccc(-c2ccc(-c3nc(-c4ccccc4)nc(-c4cc(-c5cc6sc7ccccc7c6cc5-c5ccccc5)cc5oc6ccccc6c45)n3)cc2)cc1]

TABLE 1-continued
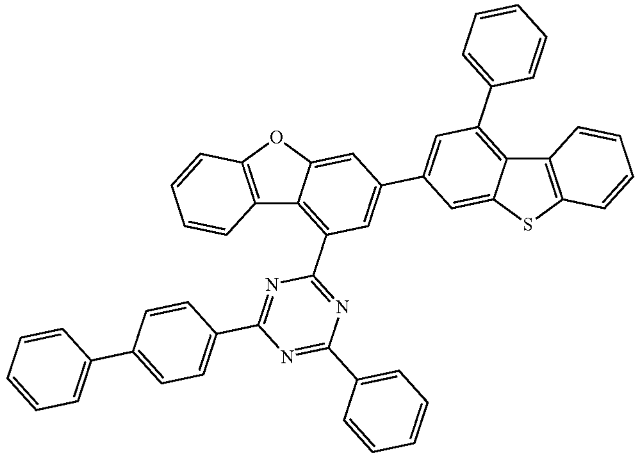 [SMILES: c1ccc(-c2ccc(-c3nc(-c4ccccc4)nc(-c4cc(-c5cc(-c6ccccc6)c6c(c5)sc5ccccc56)cc5oc6ccccc6c45)n3)cc2)cc1]
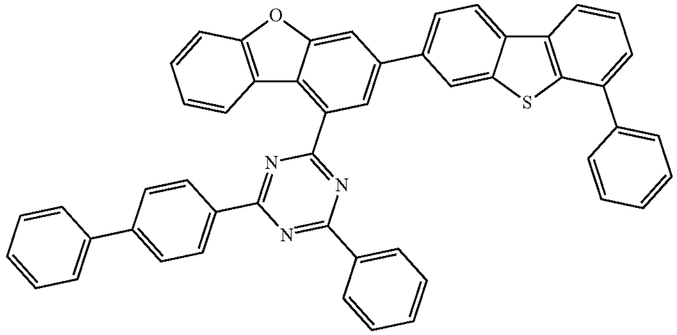 [SMILES: c1ccc(-c2ccc(-c3nc(-c4ccccc4)nc(-c4cc(-c5ccc6c(c5)sc5c(-c7ccccc7)cccc56)cc5oc6ccccc6c45)n3)cc2)cc1]
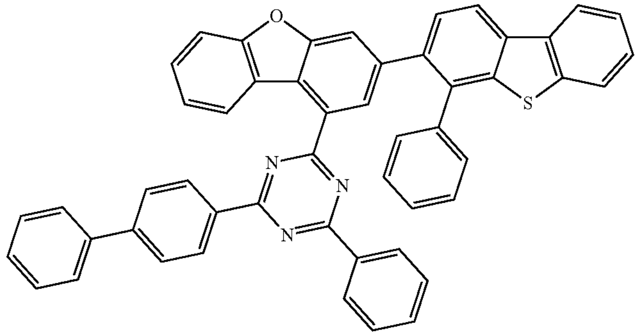 [SMILES: c1ccc(-c2ccc(-c3nc(-c4ccccc4)nc(-c4cc(-c5ccc6c(sc7ccccc76)c5-c5ccccc5)cc5oc6ccccc6c45)n3)cc2)cc1]
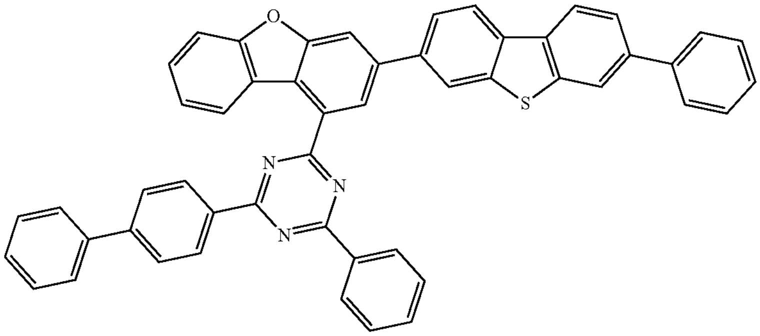 [SMILES: c1ccc(-c2ccc(-c3nc(-c4ccccc4)nc(-c4cc(-c5ccc6c(c5)sc5cc(-c7ccccc7)ccc56)cc5oc6ccccc6c45)n3)cc2)cc1]

TABLE 1-continued
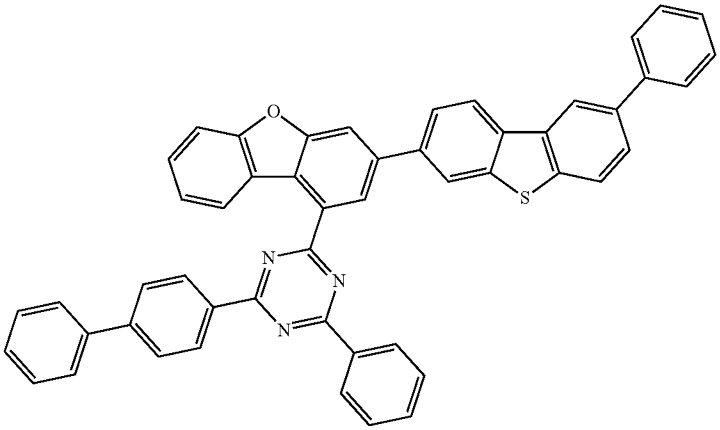 [SMILES: c1ccc(-c2ccc(-c3nc(-c4ccccc4)nc(-c4cc(-c5ccc6c(c5)sc5ccc(-c7ccccc7)cc56)cc5oc6ccccc6c45)n3)cc2)cc1]
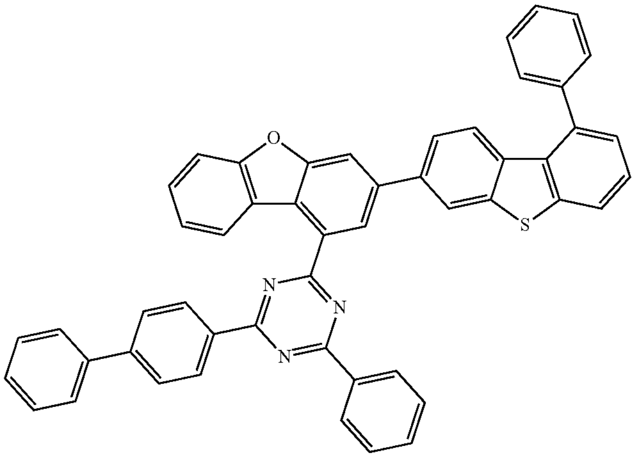 [SMILES: c1ccc(-c2ccc(-c3nc(-c4ccccc4)nc(-c4cc(-c5ccc6c(c5)sc5cccc(-c7ccccc7)c56)cc5oc6ccccc6c45)n3)cc2)cc1]
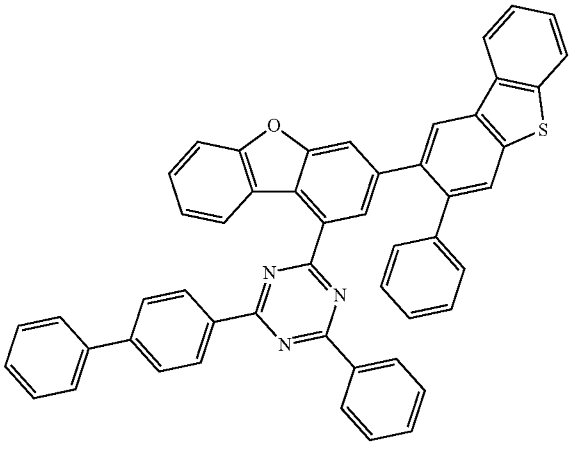 [SMILES: c1ccc(-c2ccc(-c3nc(-c4ccccc4)nc(-c4cc(-c5cc6c(cc5-c5ccccc5)sc5ccccc56)cc5oc6ccccc6c45)n3)cc2)cc1]

TABLE 1-continued
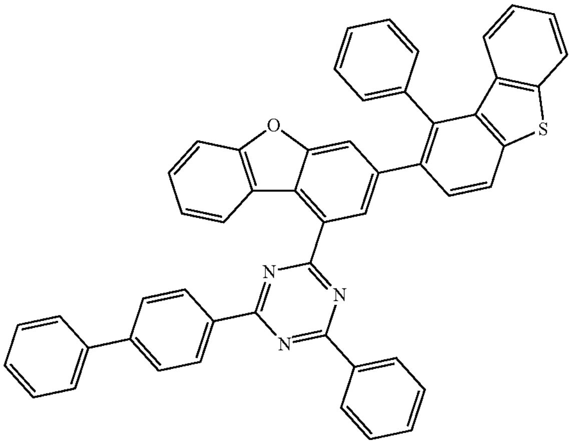 [SMILES: c1ccc(-c2ccc(-c3nc(-c4ccccc4)nc(-c4cc(-c5ccc6sc7ccccc7c6c5-c5ccccc5)cc5oc6ccccc6c45)n3)cc2)cc1]
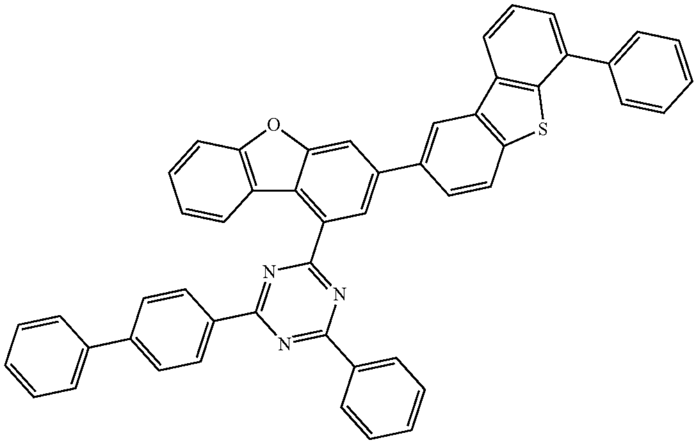 [SMILES: c1ccc(-c2ccc(-c3nc(-c4ccccc4)nc(-c4cc(-c5ccc6sc7c(-c8ccccc8)cccc7c6c5)cc5oc6ccccc6c45)n3)cc2)cc1]
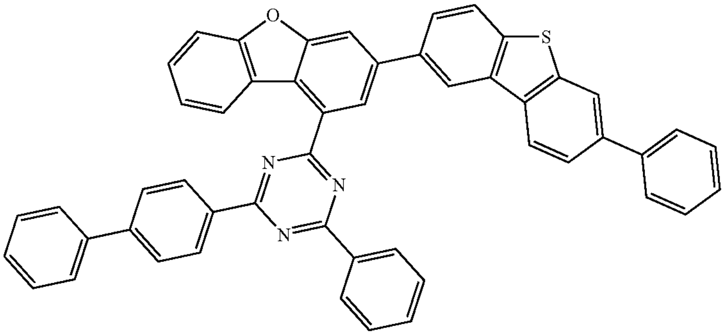 [SMILES: c1ccc(-c2ccc(-c3nc(-c4ccccc4)nc(-c4cc(-c5ccc6sc7cc(-c8ccccc8)ccc7c6c5)cc5oc6ccccc6c45)n3)cc2)cc1]
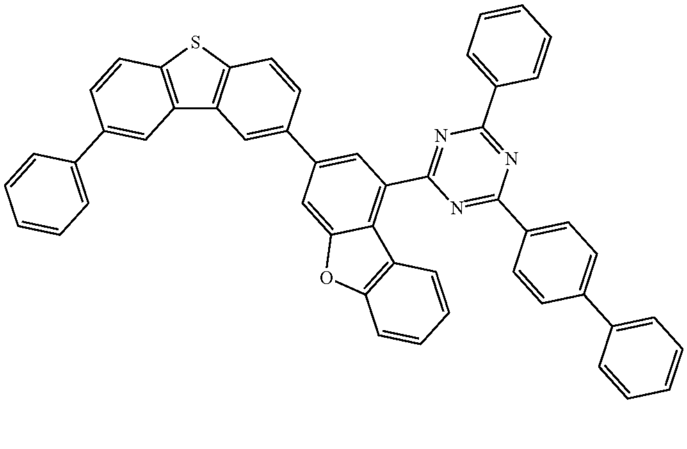 [SMILES: c1ccc(-c2ccc(-c3nc(-c4ccccc4)nc(-c4cc(-c5ccc6sc7ccc(-c8ccccc8)cc7c6c5)cc5oc6ccccc6c45)n3)cc2)cc1]

TABLE 1-continued
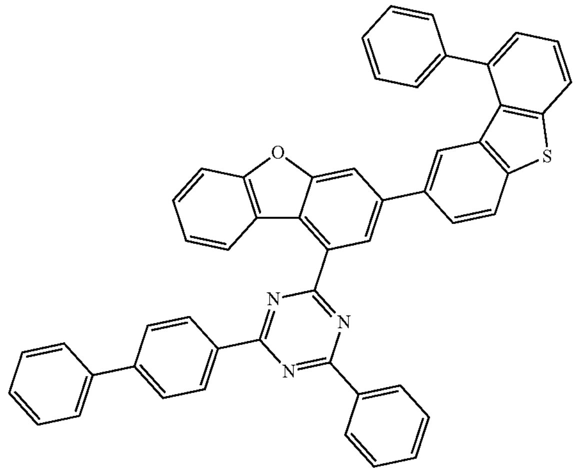 [SMILES: c1ccc(-c2ccc(-c3nc(-c4ccccc4)nc(-c4cc(-c5ccc6sc7cccc(-c8ccccc8)c7c6c5)cc5oc6ccccc6c45)n3)cc2)cc1]
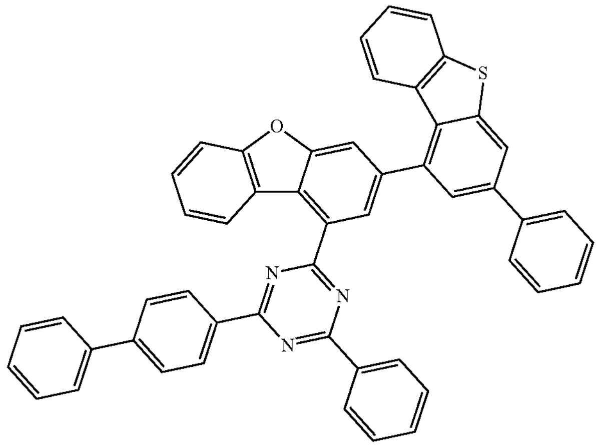 [SMILES: c1ccc(-c2ccc(-c3nc(-c4ccccc4)nc(-c4cc(-c5cc(-c6ccccc6)cc6sc7ccccc7c56)cc5oc6ccccc6c45)n3)cc2)cc1]
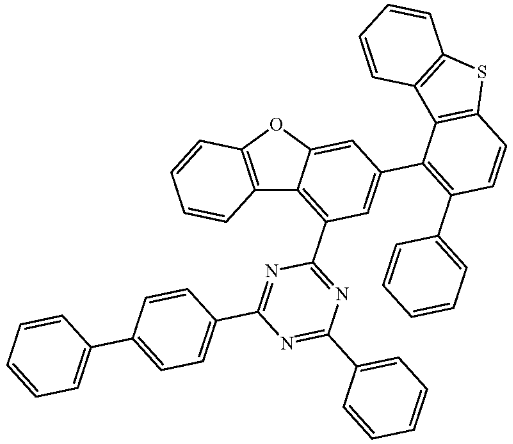 [SMILES: c1ccc(-c2ccc(-c3nc(-c4ccccc4)nc(-c4cc(-c5c(-c6ccccc6)ccc6sc7ccccc7c56)cc5oc6ccccc6c45)n3)cc2)cc1]

TABLE 1-continued
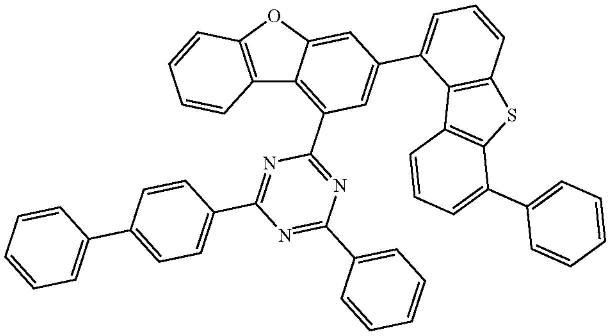 [SMILES: c1ccc(-c2ccc(-c3nc(-c4ccccc4)nc(-c4cc(-c5cccc6sc7c(-c8ccccc8)cccc7c56)cc5oc6ccccc6c45)n3)cc2)cc1]
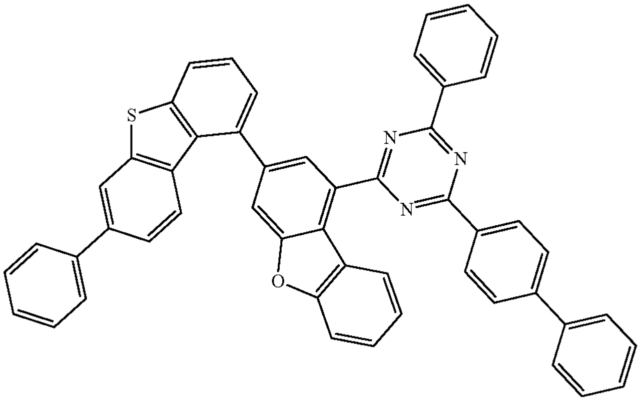 [SMILES: c1ccc(-c2ccc(-c3nc(-c4ccccc4)nc(-c4cc(-c5cccc6sc7cc(-c8ccccc8)ccc7c56)cc5oc6ccccc6c45)n3)cc2)cc1]
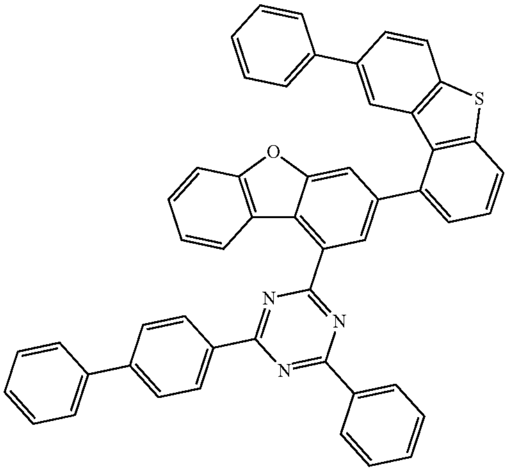 [SMILES: c1ccc(-c2ccc(-c3nc(-c4ccccc4)nc(-c4cc(-c5cccc6sc7ccc(-c8ccccc8)cc7c56)cc5oc6ccccc6c45)n3)cc2)cc1]

TABLE 1-continued
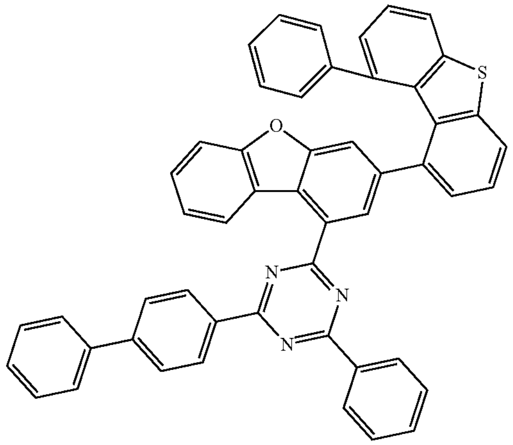 [SMILES: c1ccc(-c2ccc(-c3nc(-c4ccccc4)nc(-c4cc(-c5cccc6sc7cccc(-c8ccccc8)c7c56)cc5oc6ccccc6c45)n3)cc2)cc1]
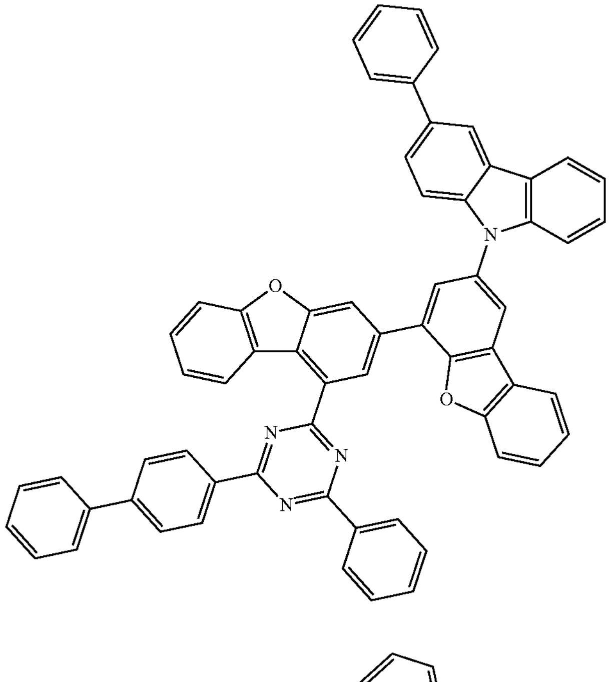
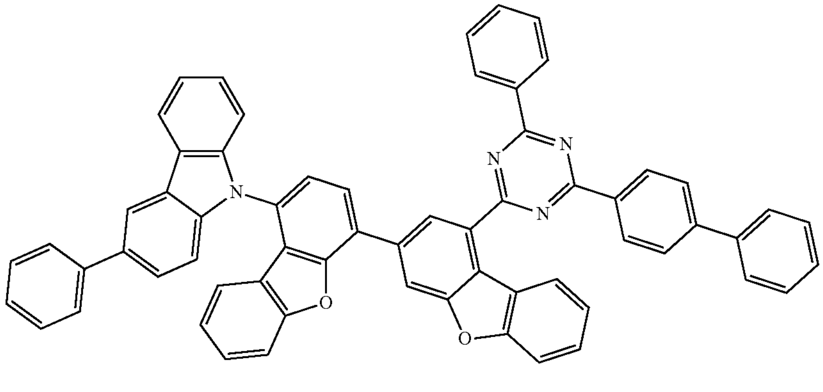 [SMILES: c1ccc(-c2ccc(-c3nc(-c4ccccc4)nc(-c4cc(-c5ccc(-n6c7ccccc7c7cc(-c8ccccc8)ccc76)c6c5oc5ccccc56)cc5oc6ccccc6c45)n3)cc2)cc1]

TABLE 1-continued
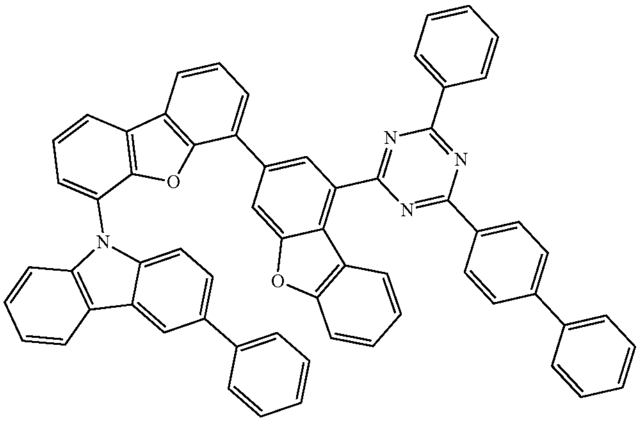 [SMILES: c1ccc(-c2ccc(-c3nc(-c4ccccc4)nc(-c4cc(-c5cccc6c5oc5c(-n7c8ccccc8c8cc(-c9ccccc9)ccc87)cccc56)cc5oc6ccccc6c45)n3)cc2)cc1]
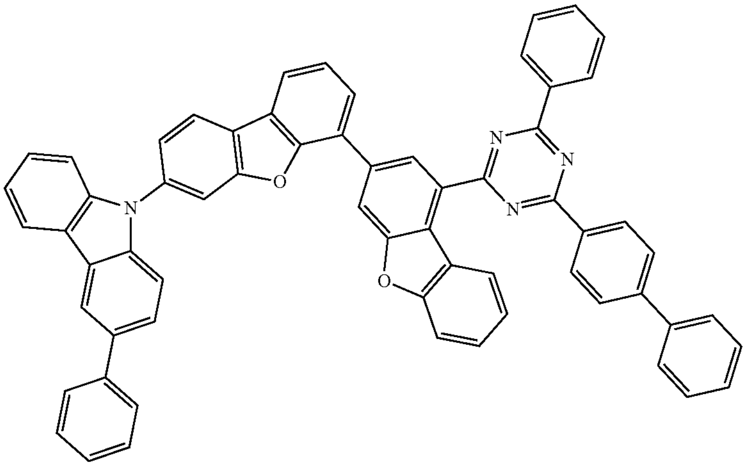 [SMILES: c1ccc(-c2ccc(-c3nc(-c4ccccc4)nc(-c4cc(-c5cccc6c5oc5cc(-n7c8ccccc8c8cc(-c9ccccc9)ccc87)ccc56)cc5oc6ccccc6c45)n3)cc2)cc1]
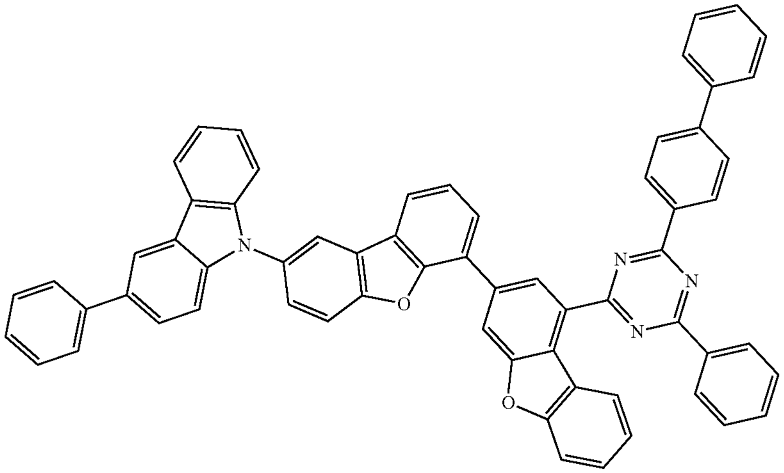 [SMILES: c1ccc(-c2ccc(-c3nc(-c4ccccc4)nc(-c4cc(-c5cccc6c5oc5ccc(-n7c8ccccc8c8cc(-c9ccccc9)ccc87)cc56)cc5oc6ccccc6c45)n3)cc2)cc1]

TABLE 1-continued
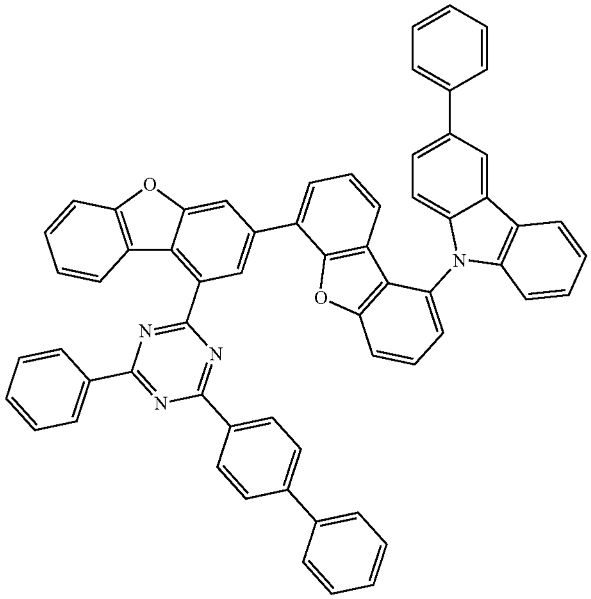 [SMILES: c1ccc(-c2ccc(-c3nc(-c4ccccc4)nc(-c4cc(-c5cccc6c5oc5cccc(-n7c8ccccc8c8cc(-c9ccccc9)ccc87)c56)cc5oc6ccccc6c45)n3)cc2)cc1]
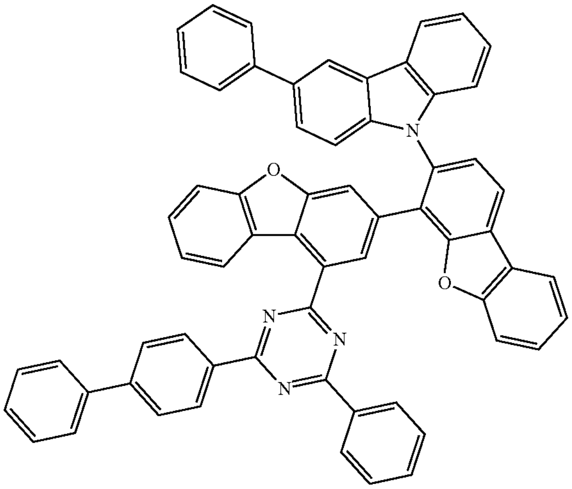 [SMILES: c1ccc(-c2ccc(-c3nc(-c4ccccc4)nc(-c4cc(-c5c(-n6c7ccccc7c7cc(-c8ccccc8)ccc76)ccc6c5oc5ccccc56)cc5oc6ccccc6c45)n3)cc2)cc1]
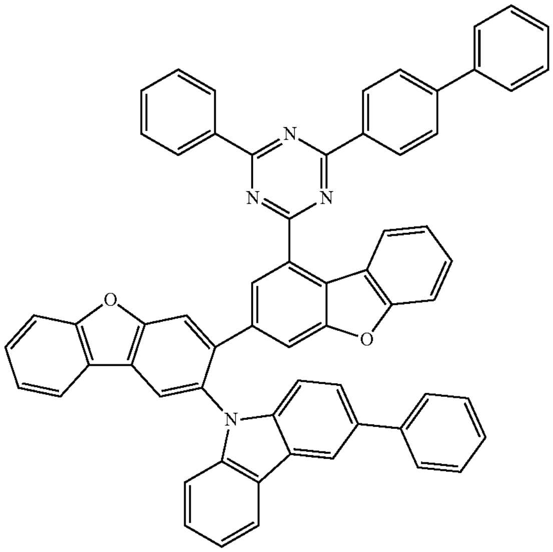 [SMILES: c1ccc(-c2ccc(-c3nc(-c4ccccc4)nc(-c4cc(-c5cc6oc7ccccc7c6cc5-n5c6ccccc6c6cc(-c7ccccc7)ccc65)cc5oc6ccccc6c45)n3)cc2)cc1]

TABLE 1-continued
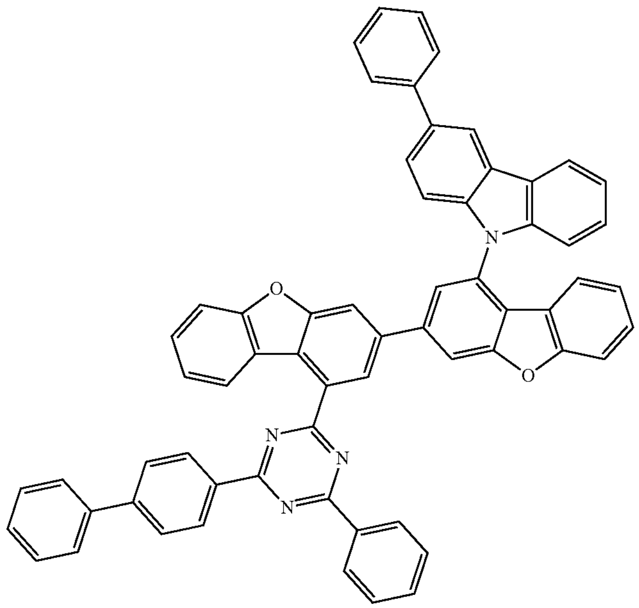 [SMILES: c1ccc(-c2ccc(-c3nc(-c4ccccc4)nc(-c4cc(-c5cc(-n6c7ccccc7c7cc(-c8ccccc8)ccc76)c6c(c5)oc5ccccc56)cc5oc6ccccc6c45)n3)cc2)cc1]
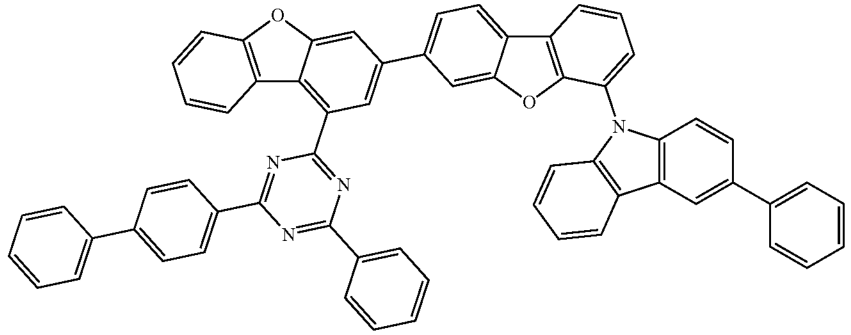 [SMILES: c1ccc(-c2ccc(-c3nc(-c4ccccc4)nc(-c4cc(-c5ccc6c(c5)oc5c(-n7c8ccccc8c8cc(-c9ccccc9)ccc87)cccc56)cc5oc6ccccc6c45)n3)cc2)cc1]
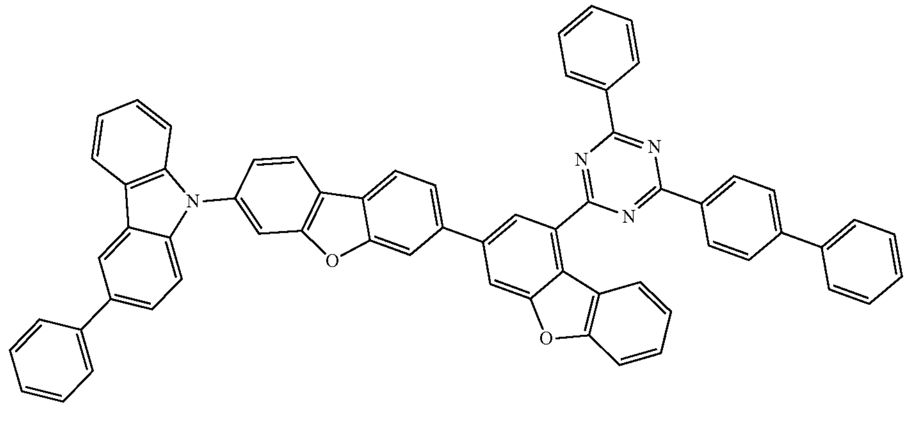 [SMILES: c1ccc(-c2ccc(-c3nc(-c4ccccc4)nc(-c4cc(-c5ccc6c(c5)oc5cc(-n7c8ccccc8c8cc(-c9ccccc9)ccc87)ccc56)cc5oc6ccccc6c45)n3)cc2)cc1]

TABLE 1-continued
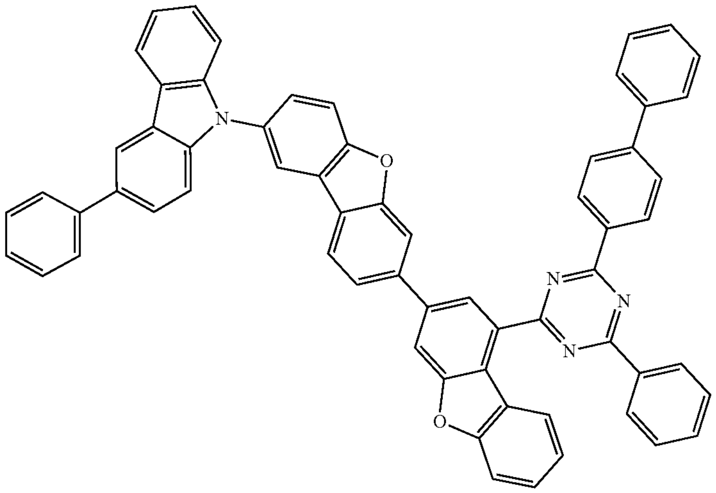 [SMILES: c1ccc(-c2ccc(-c3nc(-c4ccccc4)nc(-c4cc(-c5ccc6c(c5)oc5ccc(-n7c8ccccc8c8cc(-c9ccccc9)ccc87)cc56)cc5oc6ccccc6c45)n3)cc2)cc1]
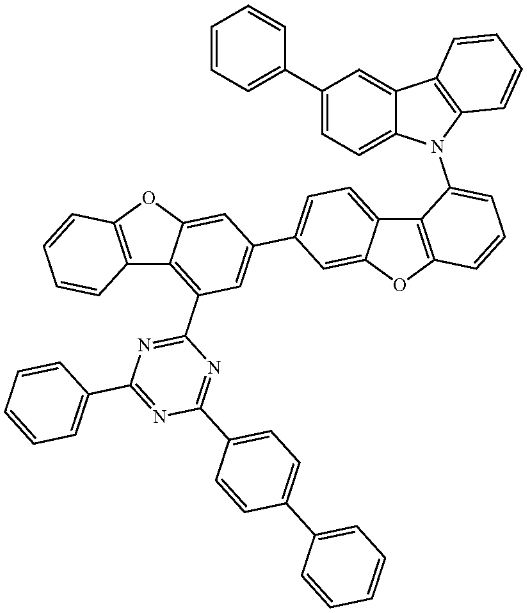 [SMILES: c1ccc(-c2ccc(-c3nc(-c4ccccc4)nc(-c4cc(-c5ccc6c(c5)oc5cccc(-n7c8ccccc8c8cc(-c9ccccc9)ccc87)c56)cc5oc6ccccc6c45)n3)cc2)cc1]
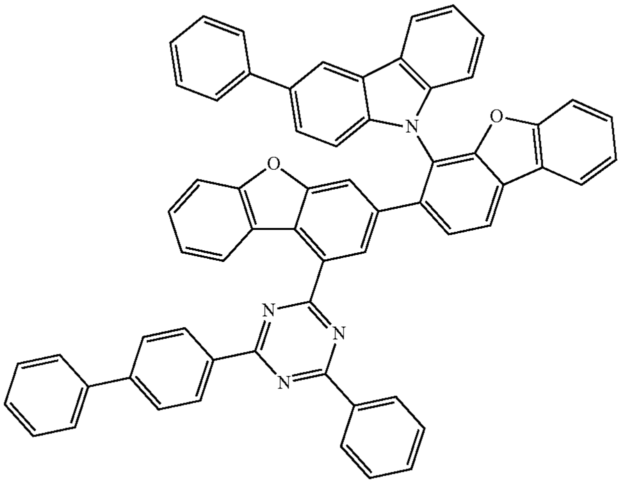 [SMILES: c1ccc(-c2ccc(-c3nc(-c4ccccc4)nc(-c4cc(-c5ccc6c(oc7ccccc76)c5-n5c6ccccc6c6cc(-c7ccccc7)ccc65)cc5oc6ccccc6c45)n3)cc2)cc1]

TABLE 1-continued
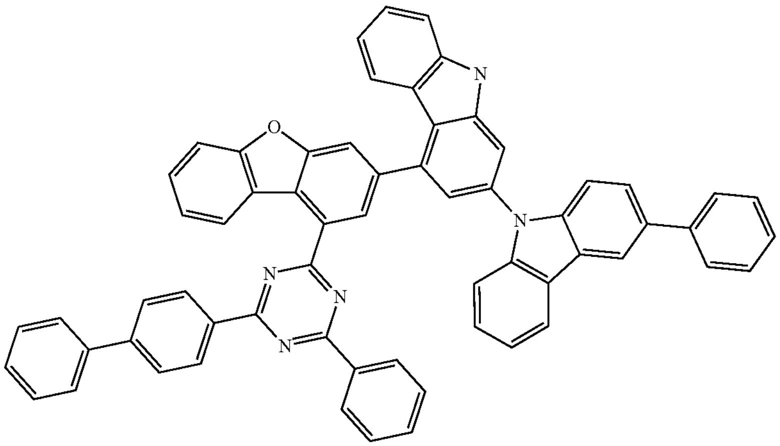 [SMILES: c1ccc(-c2ccc(-c3nc(-c4ccccc4)nc(-c4cc(-c5cc(-n6c7ccccc7c7cc(-c8ccccc8)ccc76)cc6[nH]c7ccccc7c56)cc5oc6ccccc6c45)n3)cc2)cc1]
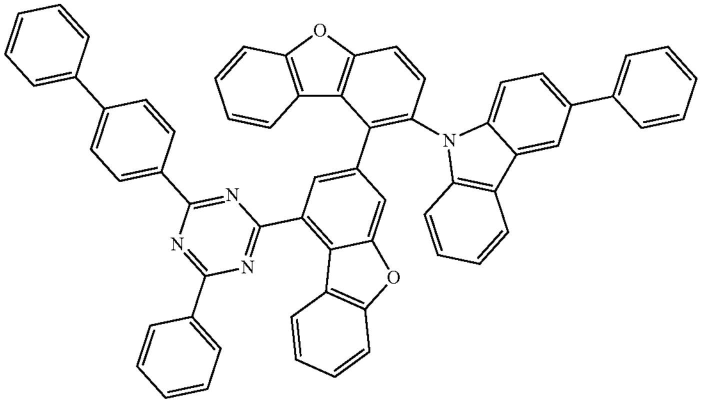 [SMILES: c1ccc(-c2ccc(-c3nc(-c4ccccc4)nc(-c4cc(-c5c(-n6c7ccccc7c7cc(-c8ccccc8)ccc76)ccc6oc7ccccc7c56)cc5oc6ccccc6c45)n3)cc2)cc1]
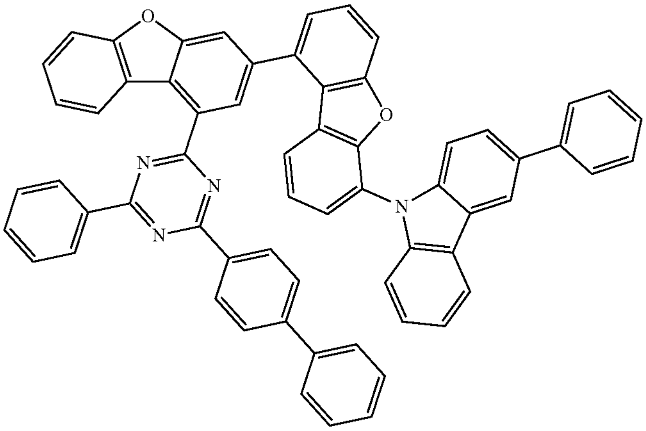 [SMILES: c1ccc(-c2ccc(-c3nc(-c4ccccc4)nc(-c4cc(-c5cccc6oc7c(-n8c9ccccc9c9cc(-c%10ccccc%10)ccc98)cccc7c56)cc5oc6ccccc6c45)n3)cc2)cc1]

TABLE 1-continued
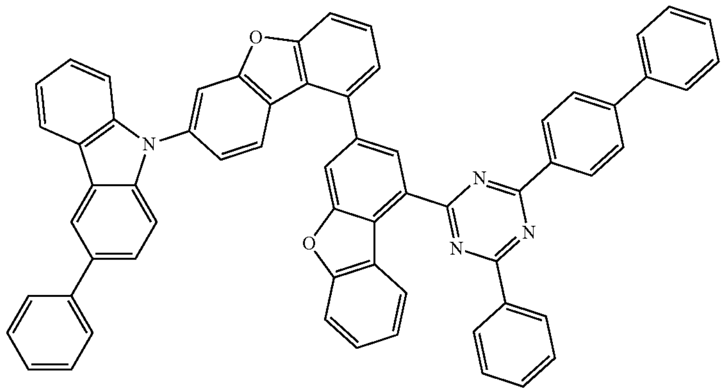 [SMILES: c1ccc(-c2ccc(-c3nc(-c4ccccc4)nc(-c4cc(-c5cccc6oc7cc(-n8c9ccccc9c9cc(-c%10ccccc%10)ccc98)ccc7c56)cc5oc6ccccc6c45)n3)cc2)cc1]
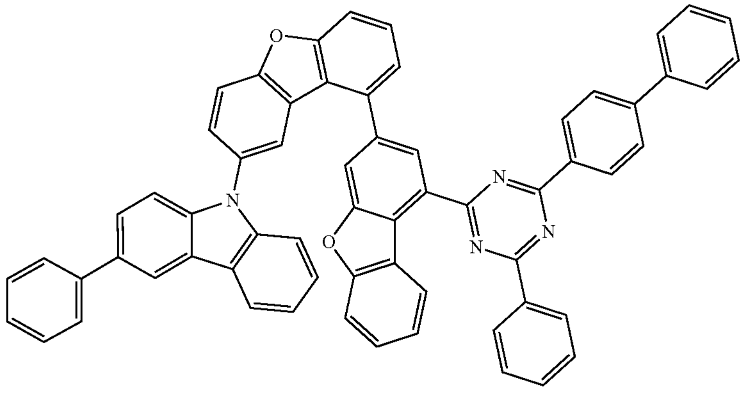 [SMILES: c1ccc(-c2ccc(-c3nc(-c4ccccc4)nc(-c4cc(-c5cccc6oc7ccc(-n8c9ccccc9c9cc(-c%10ccccc%10)ccc98)cc7c56)cc5oc6ccccc6c45)n3)cc2)cc1]
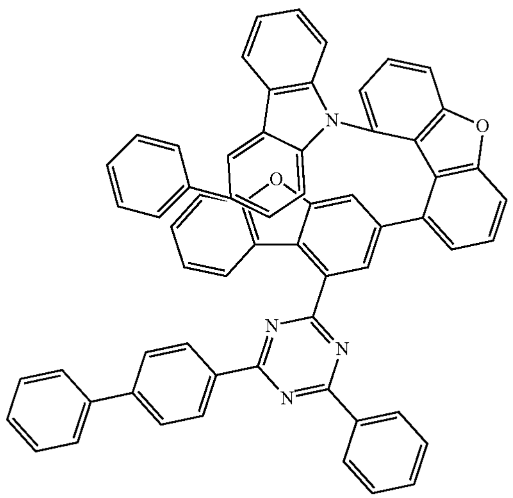 [SMILES: c1ccc(-c2ccc(-c3nc(-c4ccccc4)nc(-c4cc(-c5cccc6oc7cccc(-n8c9ccccc9c9cc(-c%10ccccc%10)ccc98)c7c56)cc5oc6ccccc6c45)n3)cc2)cc1]

TABLE 1-continued
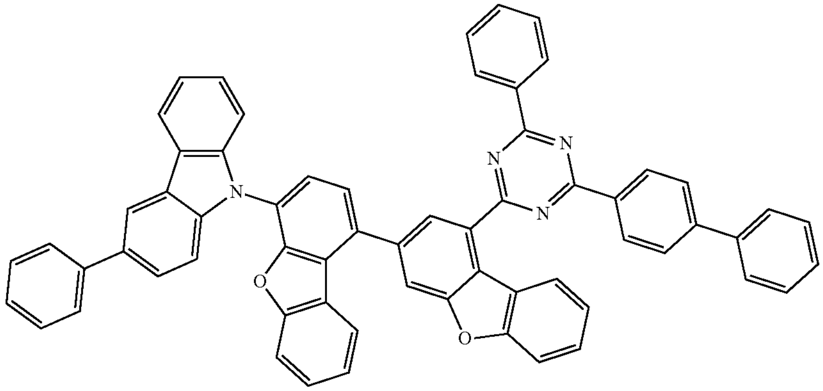 [SMILES: c1ccc(-c2ccc(-c3nc(-c4ccccc4)nc(-c4cc(-c5ccc(-n6c7ccccc7c7cc(-c8ccccc8)ccc76)c6oc7ccccc7c56)cc5oc6ccccc6c45)n3)cc2)cc1]
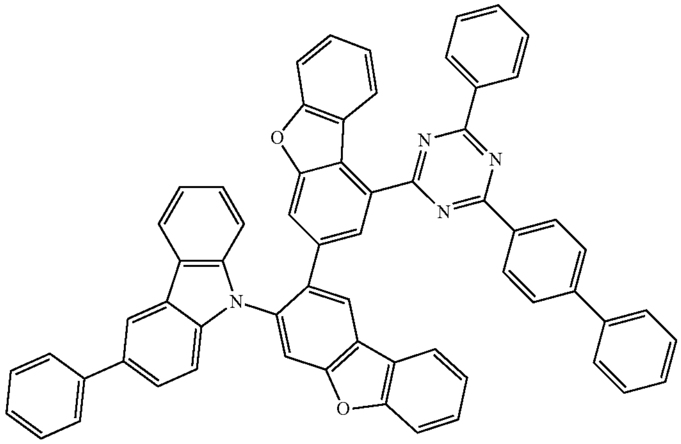 [SMILES: c1ccc(-c2ccc(-c3nc(-c4ccccc4)nc(-c4cc(-c5cc6c(cc5-n5c7ccccc7c7cc(-c8ccccc8)ccc75)oc5ccccc56)cc5oc6ccccc6c45)n3)cc2)cc1]
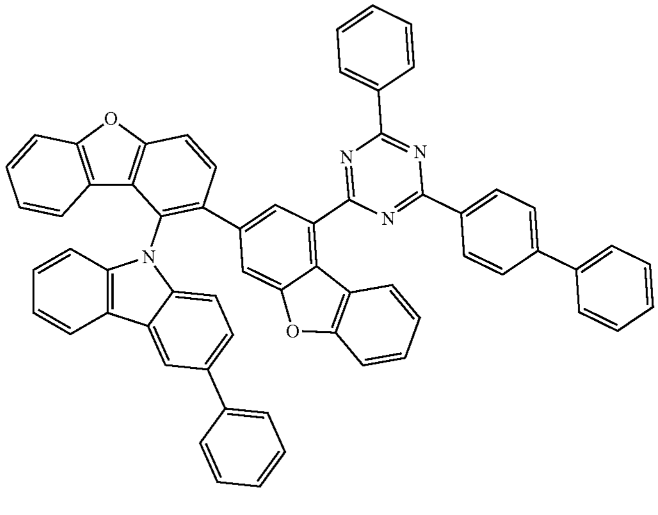 [SMILES: c1ccc(-c2ccc(-c3nc(-c4ccccc4)nc(-c4cc(-c5ccc6oc7ccccc7c6c5-n5c6ccccc6c6cc(-c7ccccc7)ccc65)cc5oc6ccccc6c45)n3)cc2)cc1]

TABLE 1-continued
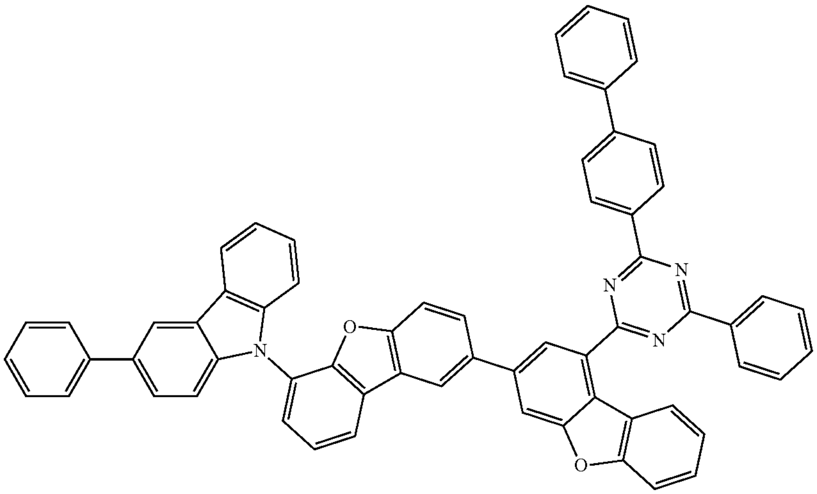 [SMILES: c1ccc(-c2ccc(-c3nc(-c4ccccc4)nc(-c4cc(-c5ccc6oc7c(-n8c9ccccc9c9cc(-c%10ccccc%10)ccc98)cccc7c6c5)cc5oc6ccccc6c45)n3)cc2)cc1]
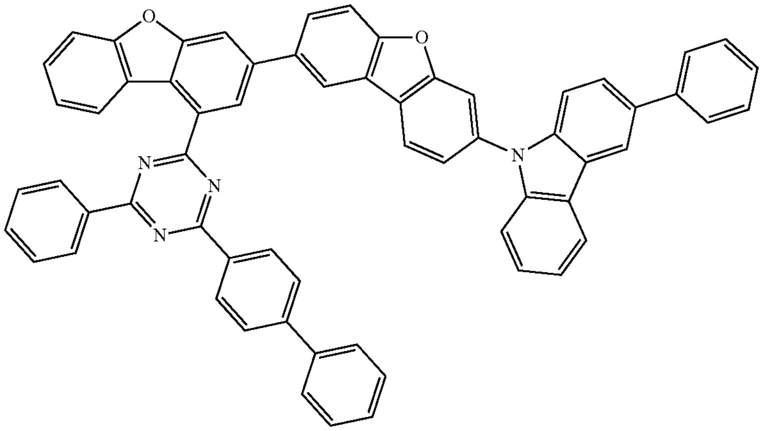 [SMILES: c1ccc(-c2ccc(-c3nc(-c4ccccc4)nc(-c4cc(-c5ccc6oc7cc(-n8c9ccccc9c9cc(-c%10ccccc%10)ccc98)ccc7c6c5)cc5oc6ccccc6c45)n3)cc2)cc1]
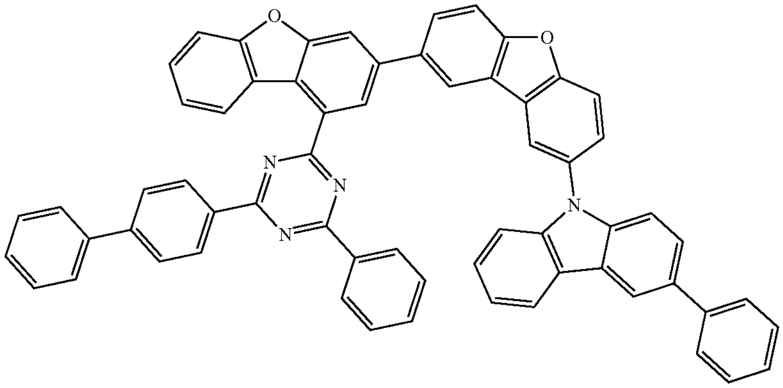 [SMILES: c1ccc(-c2ccc(-c3nc(-c4ccccc4)nc(-c4cc(-c5ccc6oc7ccc(-n8c9ccccc9c9cc(-c%10ccccc%10)ccc98)cc7c6c5)cc5oc6ccccc6c45)n3)cc2)cc1]

TABLE 1-continued
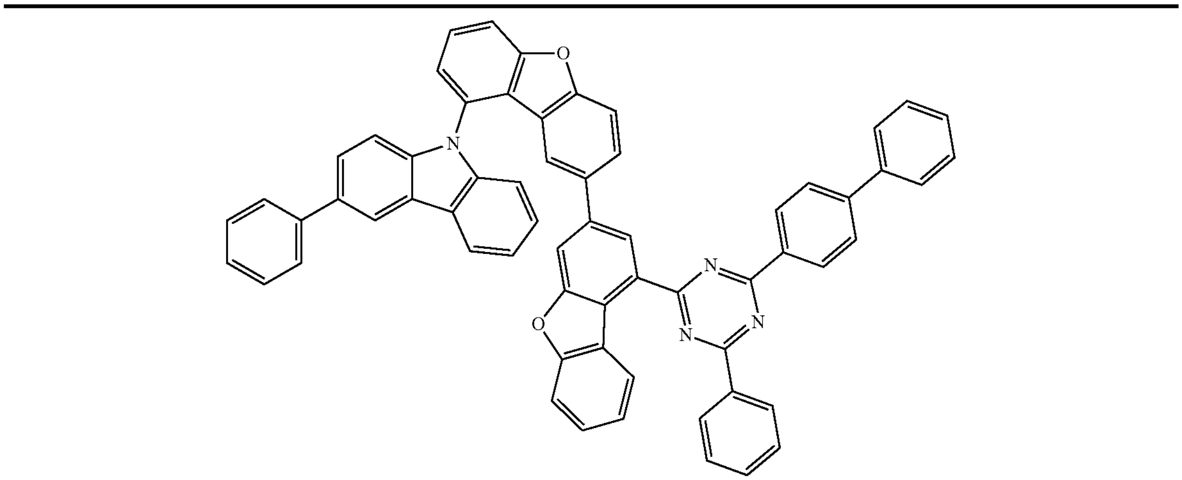
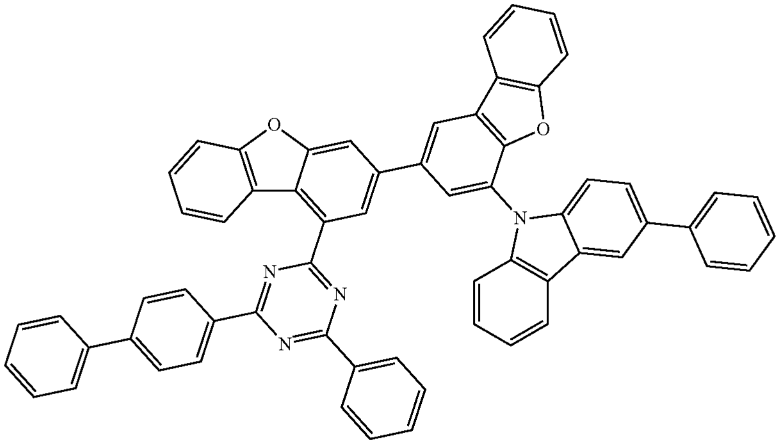 [SMILES: c1ccc(-c2ccc(-c3nc(-c4ccccc4)nc(-c4cc(-c5cc(-n6c7ccccc7c7cc(-c8ccccc8)ccc76)c6oc7ccccc7c6c5)cc5oc6ccccc6c45)n3)cc2)cc1]
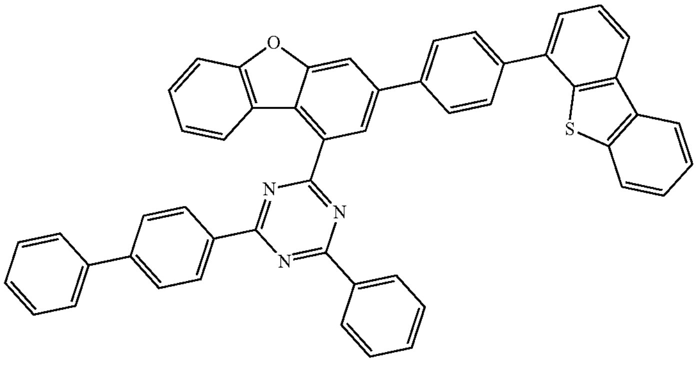 [SMILES: c1ccc(-c2ccc(-c3nc(-c4ccccc4)nc(-c4cc(-c5ccc(-c6cccc7c6sc6ccccc67)cc5)cc5oc6ccccc6c45)n3)cc2)cc1]
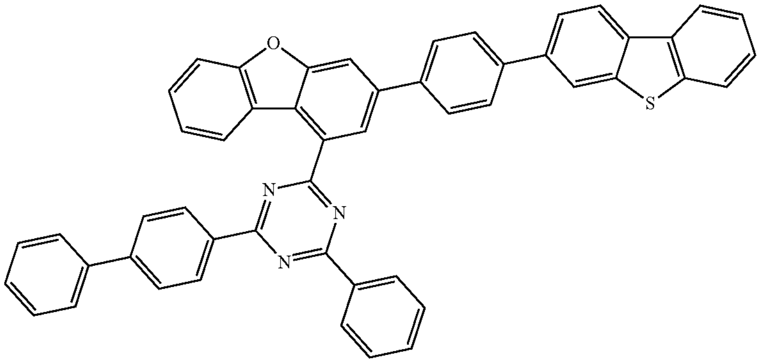 [SMILES: c1ccc(-c2ccc(-c3nc(-c4ccccc4)nc(-c4cc(-c5ccc(-c6ccc7c(c6)sc6ccccc67)cc5)cc5oc6ccccc6c45)n3)cc2)cc1]

TABLE 1-continued
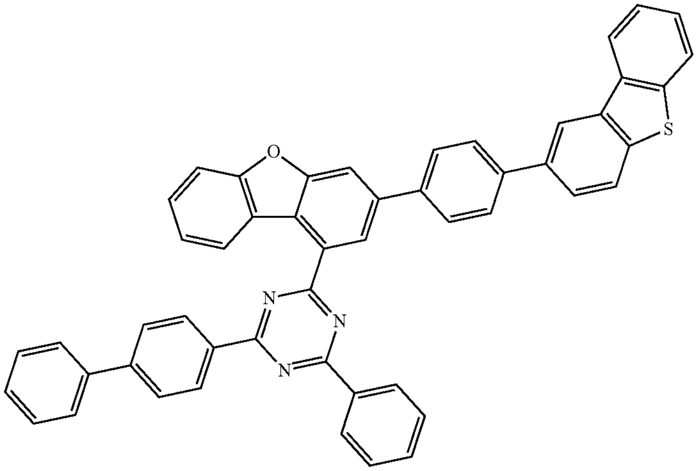 [SMILES: c1ccc(-c2ccc(-c3nc(-c4ccccc4)nc(-c4cc(-c5ccc(-c6ccc7sc8ccccc8c7c6)cc5)cc5oc6ccccc6c45)n3)cc2)cc1]
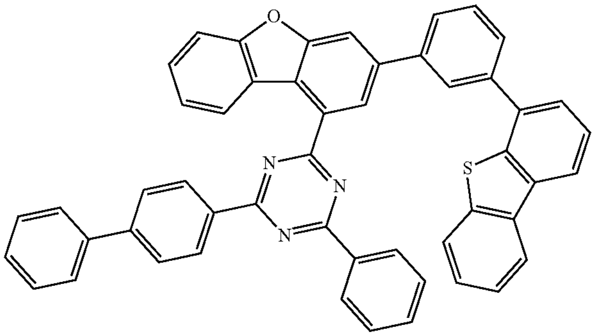 [SMILES: c1ccc(-c2ccc(-c3nc(-c4ccccc4)nc(-c4cc(-c5cccc(-c6cccc7c6sc6ccccc67)c5)cc5oc6ccccc6c45)n3)cc2)cc1]
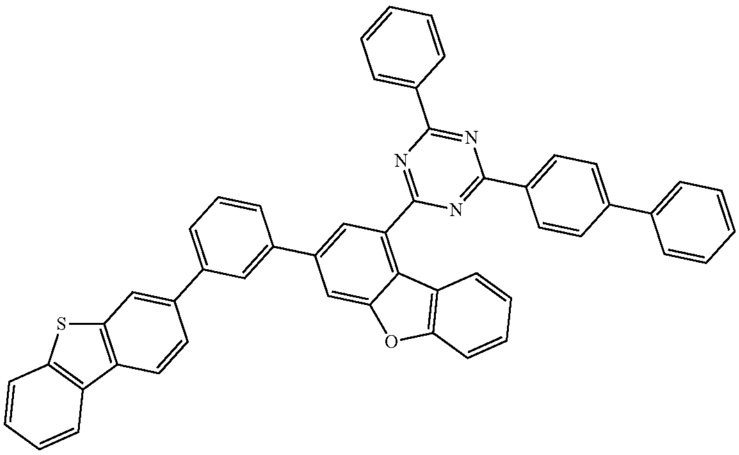 [SMILES: c1ccc(-c2ccc(-c3nc(-c4ccccc4)nc(-c4cc(-c5cccc(-c6ccc7c(c6)sc6ccccc67)c5)cc5oc6ccccc6c45)n3)cc2)cc1]

TABLE 1-continued
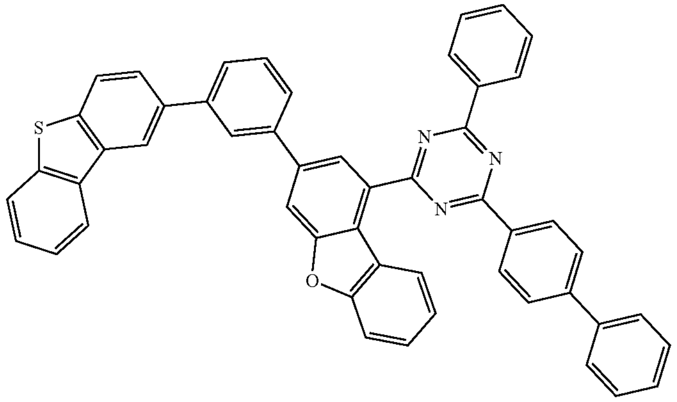 [SMILES: c1ccc(-c2ccc(-c3nc(-c4ccccc4)nc(-c4cc(-c5cccc(-c6ccc7sc8ccccc8c7c6)c5)cc5oc6ccccc6c45)n3)cc2)cc1]
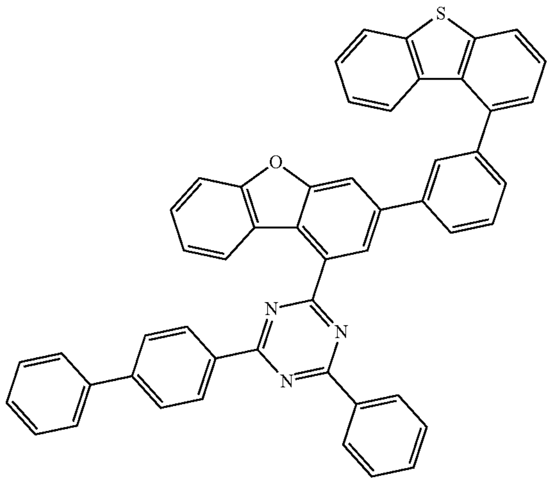 [SMILES: c1ccc(-c2ccc(-c3nc(-c4ccccc4)nc(-c4cc(-c5cccc(-c6cccc7sc8ccccc8c67)c5)cc5oc6ccccc6c45)n3)cc2)cc1]
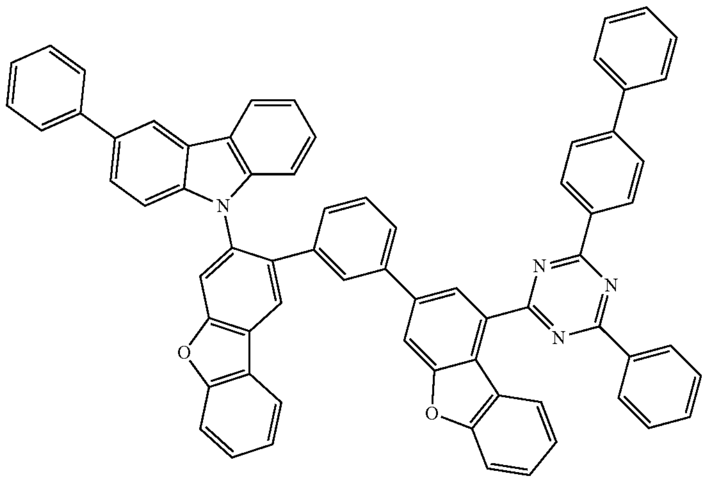 [SMILES: c1ccc(-c2ccc(-c3nc(-c4ccccc4)nc(-c4cc(-c5cccc(-c6cc7c(cc6-n6c8ccccc8c8cc(-c9ccccc9)ccc86)oc6ccccc67)c5)cc5oc6ccccc6c45)n3)cc2)cc1]

TABLE 1-continued
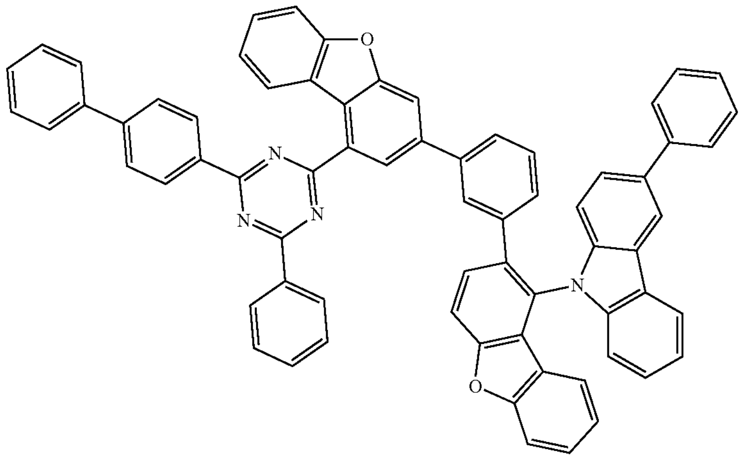 [SMILES: c1ccc(-c2ccc(-c3nc(-c4ccccc4)nc(-c4cc(-c5cccc(-c6ccc7oc8ccccc8c7c6-n6c7ccccc7c7cc(-c8ccccc8)ccc76)c5)cc5oc6ccccc6c45)n3)cc2)cc1]
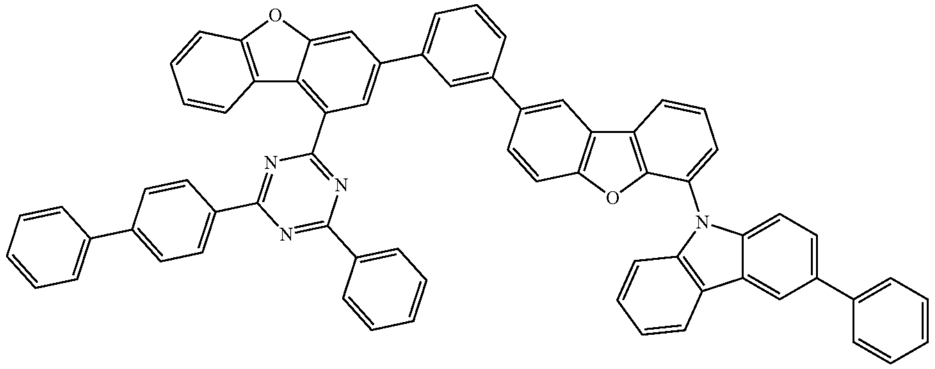 [SMILES: c1ccc(-c2ccc(-c3nc(-c4ccccc4)nc(-c4cc(-c5cccc(-c6ccc7oc8c(-n9c%10ccccc%10c%10cc(-c%11ccccc%11)ccc%109)cccc8c7c6)c5)cc5oc6ccccc6c45)n3)cc2)cc1]
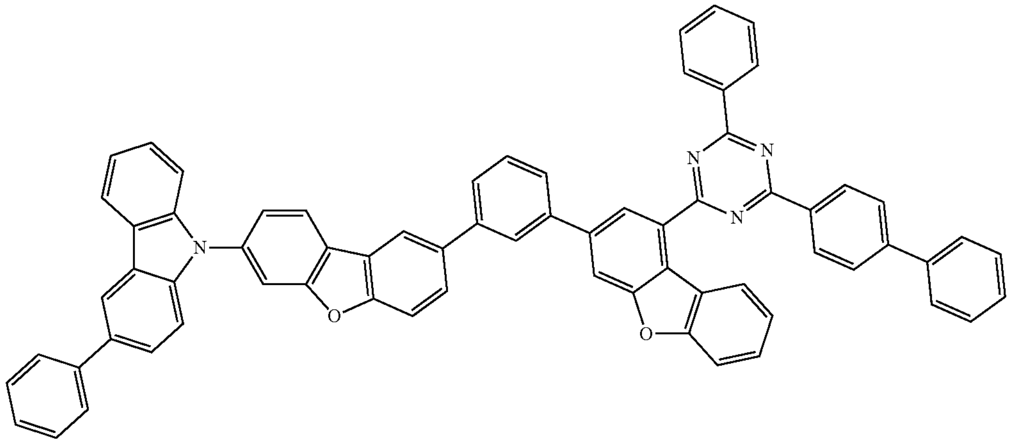 [SMILES: c1ccc(-c2ccc(-c3nc(-c4ccccc4)nc(-c4cc(-c5cccc(-c6ccc7oc8cc(-n9c%10ccccc%10c%10cc(-c%11ccccc%11)ccc%109)ccc8c7c6)c5)cc5oc6ccccc6c45)n3)cc2)cc1]

TABLE 1-continued
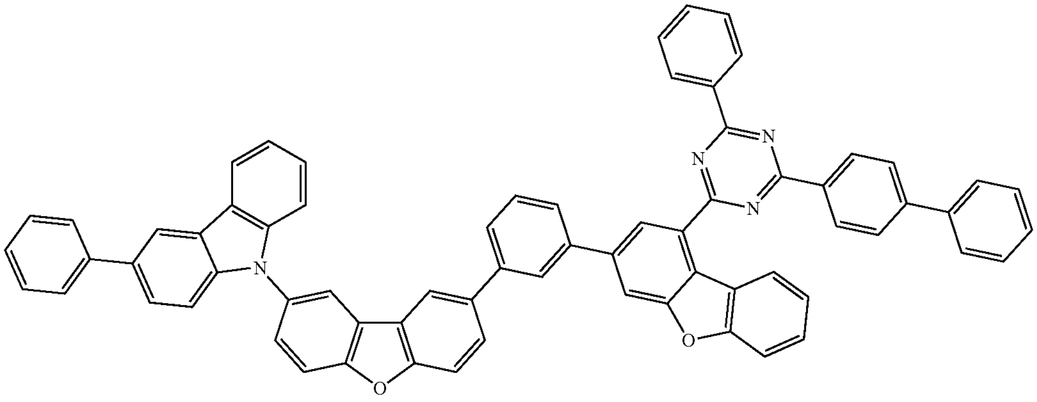 [SMILES: c1ccc(-c2ccc(-c3nc(-c4ccccc4)nc(-c4cc(-c5cccc(-c6ccc7oc8ccc(-n9c%10ccccc%10c%10cc(-c%11ccccc%11)ccc%109)cc8c7c6)c5)cc5oc6ccccc6c45)n3)cc2)cc1]
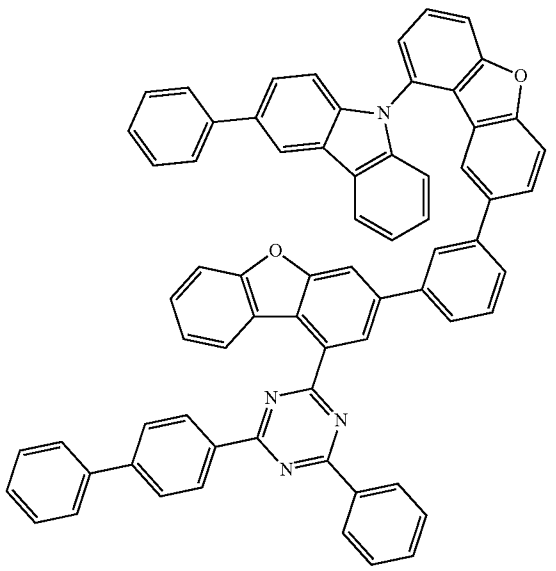 [SMILES: c1ccc(-c2ccc(-c3nc(-c4ccccc4)nc(-c4cc(-c5cccc(-c6ccc7oc8cccc(-n9c%10ccccc%10c%10cc(-c%11ccccc%11)ccc%109)c8c7c6)c5)cc5oc6ccccc6c45)n3)cc2)cc1]
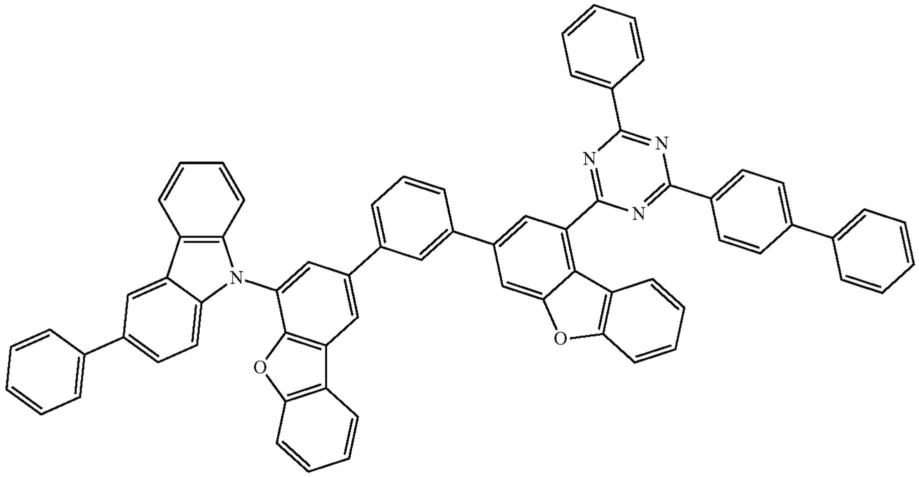 [SMILES: c1ccc(-c2ccc(-c3nc(-c4ccccc4)nc(-c4cc(-c5cccc(-c6cc(-n7c8ccccc8c8cc(-c9ccccc9)ccc87)c7oc8ccccc8c7c6)c5)cc5oc6ccccc6c45)n3)cc2)cc1]

TABLE 1-continued
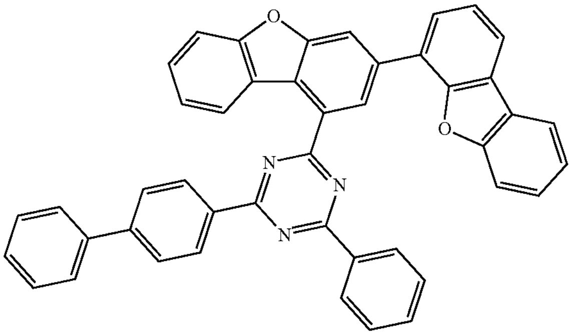 [SMILES: c1ccc(-c2ccc(-c3nc(-c4ccccc4)nc(-c4cc(-c5cccc6c5oc5ccccc56)cc5oc6ccccc6c45)n3)cc2)cc1]
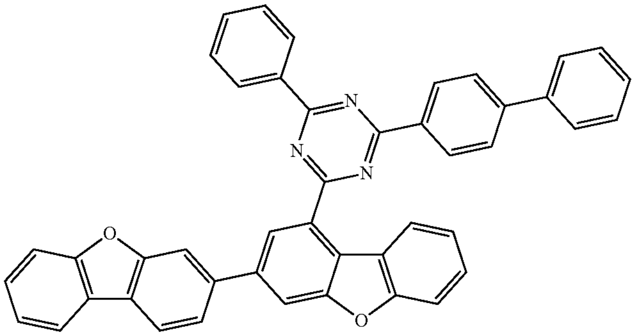 [SMILES: c1ccc(-c2ccc(-c3nc(-c4ccccc4)nc(-c4cc(-c5ccc6c(c5)oc5ccccc56)cc5oc6ccccc6c45)n3)cc2)cc1]
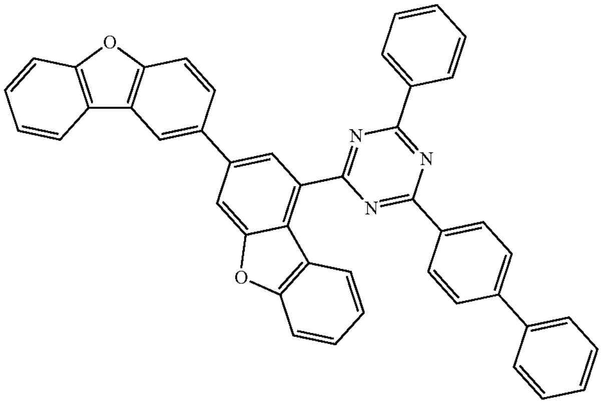 [SMILES: c1ccc(-c2ccc(-c3nc(-c4ccccc4)nc(-c4cc(-c5ccc6oc7ccccc7c6c5)cc5oc6ccccc6c45)n3)cc2)cc1]
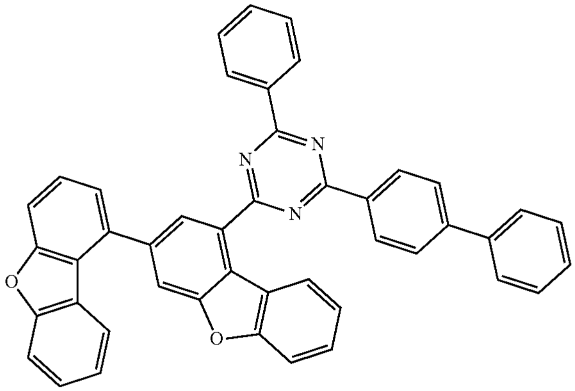 [SMILES: c1ccc(-c2ccc(-c3nc(-c4ccccc4)nc(-c4cc(-c5cccc6oc7ccccc7c56)cc5oc6ccccc6c45)n3)cc2)cc1]

TABLE 1-continued
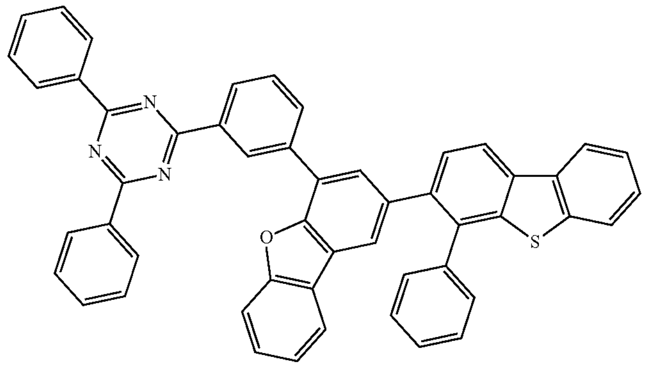 [SMILES: c1ccc(-c2nc(-c3ccccc3)nc(-c3cccc(-c4cc(-c5ccc6c(sc7ccccc76)c5-c5ccccc5)cc5c4oc4ccccc45)c3)n2)cc1]
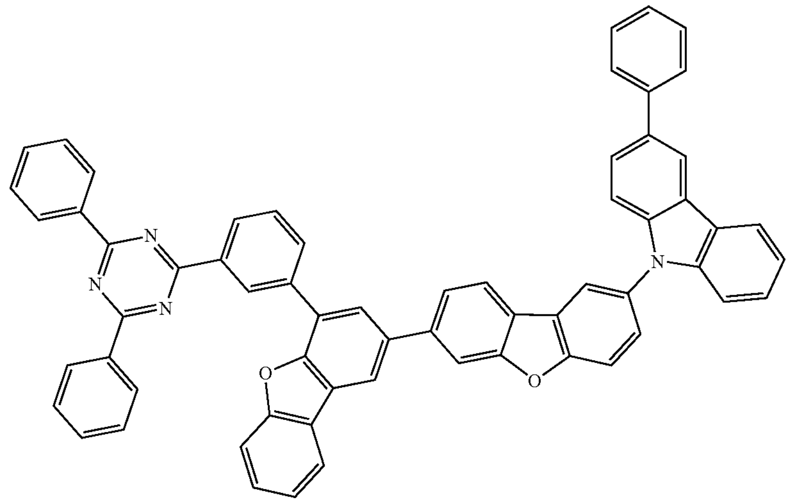 [SMILES: c1ccc(-c2ccc3c(c2)c2ccccc2n3-c2ccc3oc4cc(-c5cc(-c6cccc(-c7nc(-c8ccccc8)nc(-c8ccccc8)n7)c6)c6oc7ccccc7c6c5)ccc4c3c2)cc1]
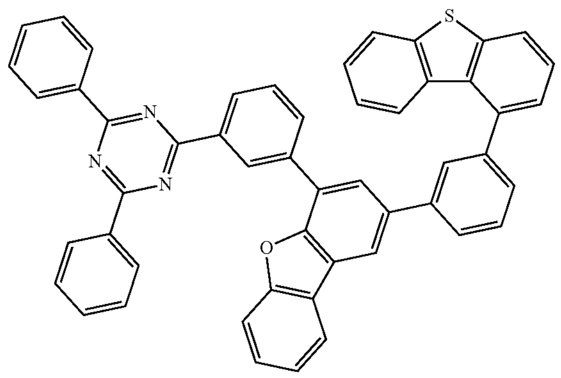 [SMILES: c1ccc(-c2nc(-c3ccccc3)nc(-c3cccc(-c4cc(-c5cccc(-c6cccc7sc8ccccc8c67)c5)cc5c4oc4ccccc45)c3)n2)cc1]

TABLE 1-continued
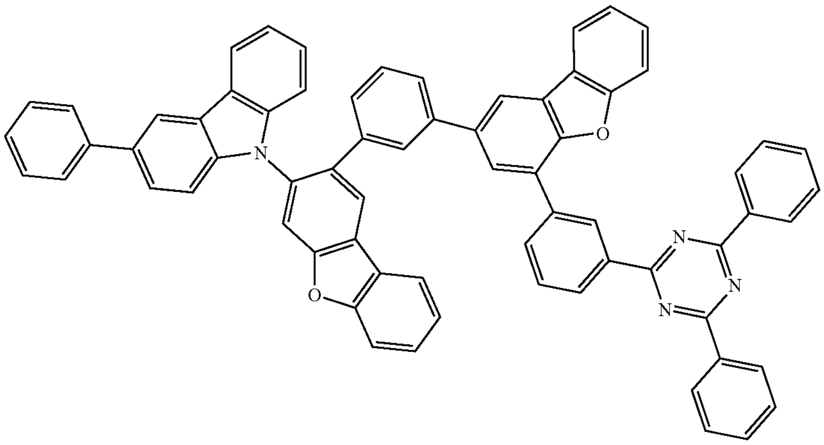 [SMILES: c1ccc(-c2ccc3c(c2)c2ccccc2n3-c2cc3oc4ccccc4c3cc2-c2cccc(-c3cc(-c4cccc(-c5nc(-c6ccccc6)nc(-c6ccccc6)n5)c4)c4oc5ccccc5c4c3)c2)cc1]
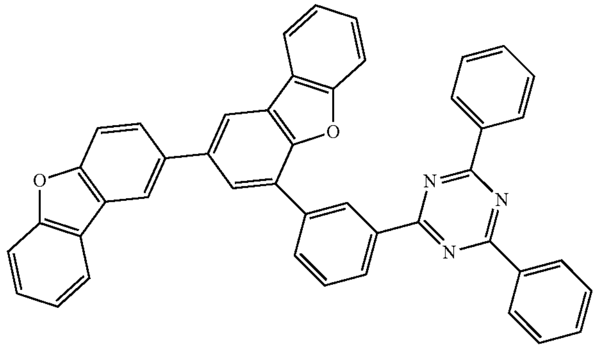 [SMILES: c1ccc(-c2nc(-c3ccccc3)nc(-c3cccc(-c4cc(-c5ccc6oc7ccccc7c6c5)cc5c4oc4ccccc45)c3)n2)cc1]
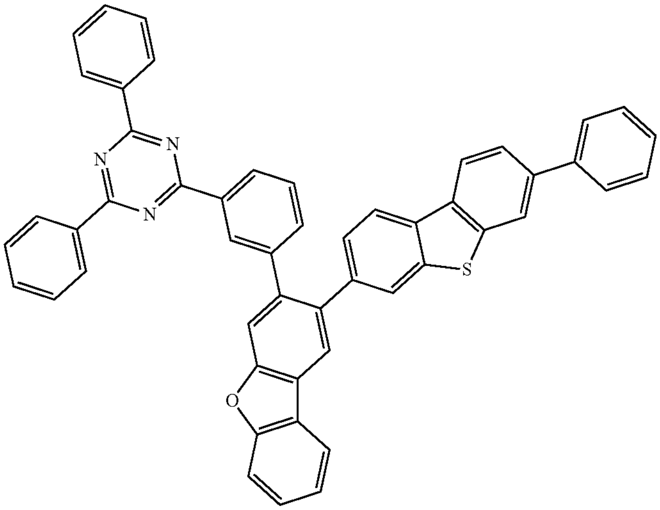 [SMILES: c1ccc(-c2ccc3c(c2)sc2cc(-c4cc5c(cc4-c4cccc(-c6nc(-c7ccccc7)nc(-c7ccccc7)n6)c4)oc4ccccc45)ccc23)cc1]

TABLE 1-continued
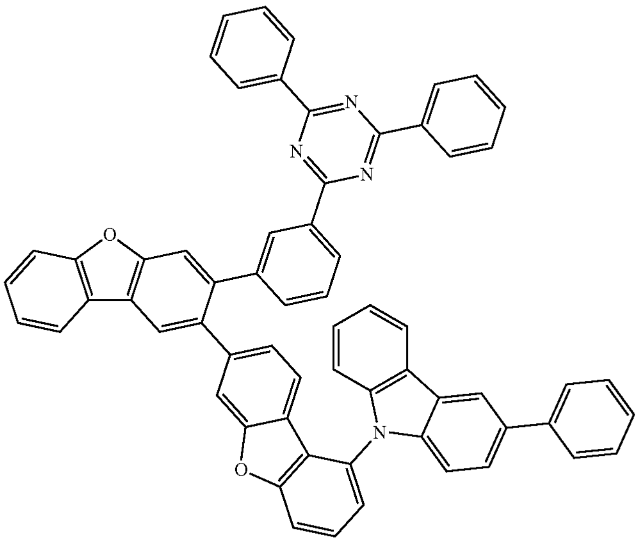 [SMILES: c1ccc(-c2ccc3c(c2)c2ccccc2n3-c2cccc3oc4cc(-c5cc6c(cc5-c5cccc(-c7nc(-c8ccccc8)nc(-c8ccccc8)n7)c5)oc5ccccc56)ccc4c23)cc1]
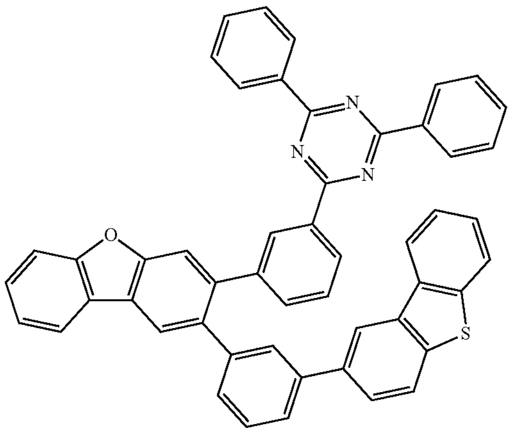 [SMILES: c1ccc(-c2nc(-c3ccccc3)nc(-c3cccc(-c4cc5oc6ccccc6c5cc4-c4cccc(-c5ccc6sc7ccccc7c6c5)c4)c3)n2)cc1]
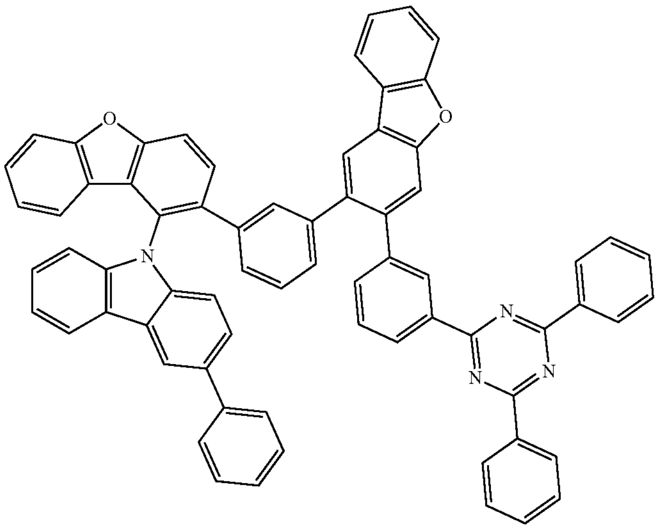 [SMILES: c1ccc(-c2ccc3c(c2)c2ccccc2n3-c2c(-c3cccc(-c4cc5c(cc4-c4cccc(-c6nc(-c7ccccc7)nc(-c7ccccc7)n6)c4)oc4ccccc45)c3)ccc3oc4ccccc4c23)cc1]

TABLE 1-continued
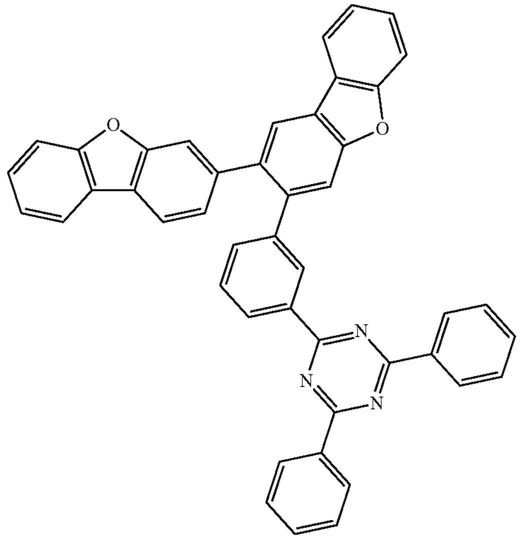 [SMILES: c1ccc(-c2nc(-c3ccccc3)nc(-c3cccc(-c4cc5oc6ccccc6c5cc4-c4ccc5c(c4)oc4ccccc45)c3)n2)cc1]
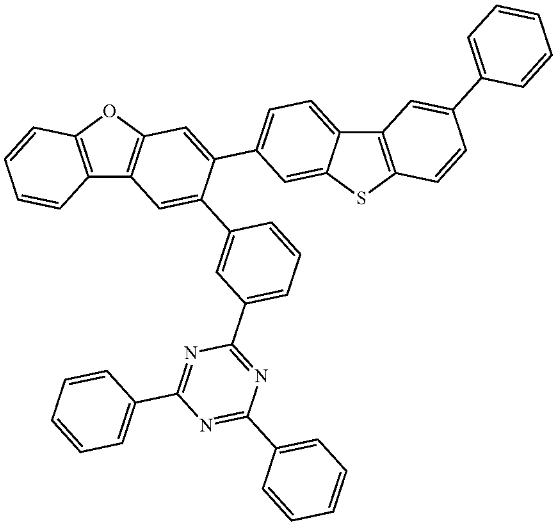 [SMILES: c1ccc(-c2ccc3sc4cc(-c5cc6oc7ccccc7c6cc5-c5cccc(-c6nc(-c7ccccc7)nc(-c7ccccc7)n6)c5)ccc4c3c2)cc1]
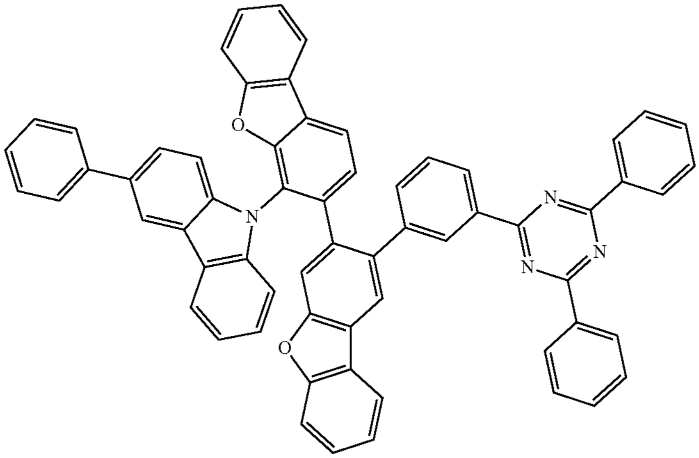 [SMILES: c1ccc(-c2ccc3c(c2)c2ccccc2n3-c2c(-c3cc4oc5ccccc5c4cc3-c3cccc(-c4nc(-c5ccccc5)nc(-c5ccccc5)n4)c3)ccc3c2oc2ccccc23)cc1]

TABLE 1-continued
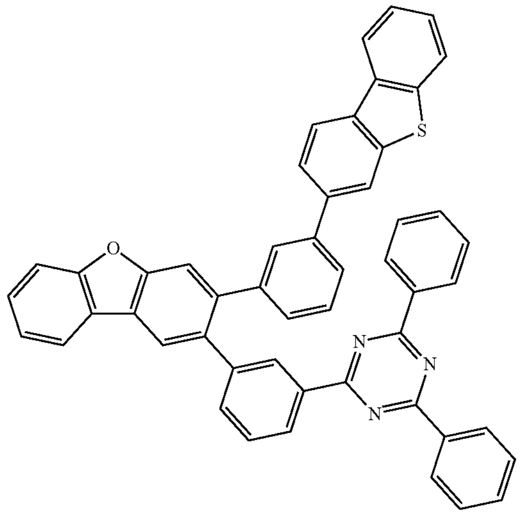 [SMILES: c1ccc(-c2nc(-c3ccccc3)nc(-c3cccc(-c4cc5c(cc4-c4cccc(-c6ccc7c(c6)sc6ccccc67)c4)oc4ccccc45)c3)n2)cc1]
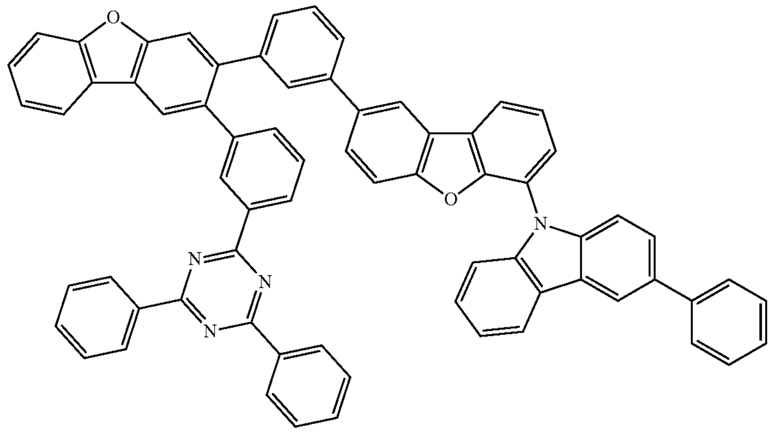 [SMILES: c1ccc(-c2ccc3c(c2)c2ccccc2n3-c2cccc3c2oc2ccc(-c4cccc(-c5cc6oc7ccccc7c6cc5-c5cccc(-c6nc(-c7ccccc7)nc(-c7ccccc7)n6)c5)c4)cc23)cc1]
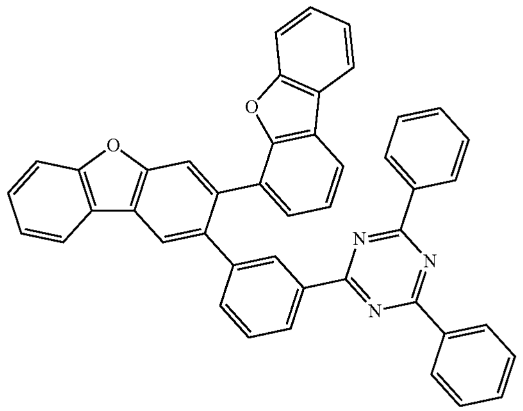 [SMILES: c1ccc(-c2nc(-c3ccccc3)nc(-c3cccc(-c4cc5c(cc4-c4cccc6c4oc4ccccc46)oc4ccccc45)c3)n2)cc1]

TABLE 1-continued
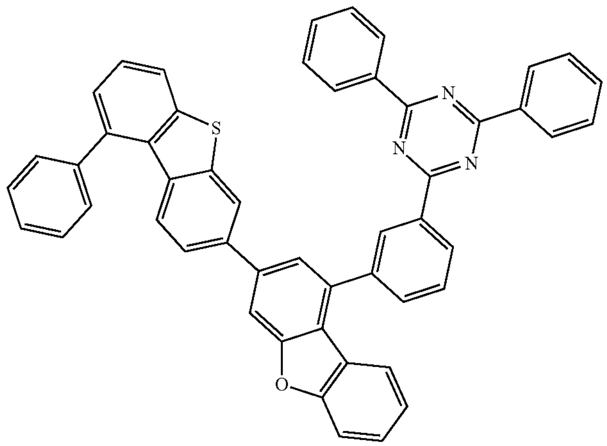 [SMILES: c1ccc(-c2nc(-c3ccccc3)nc(-c3cccc(-c4cc(-c5ccc6c(c5)sc5cccc(-c7ccccc7)c56)cc5oc6ccccc6c45)c3)n2)cc1]
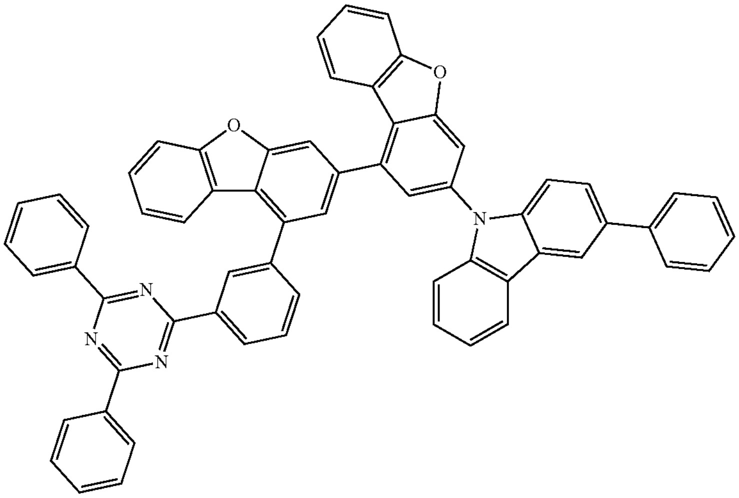 [SMILES: c1ccc(-c2ccc3c(c2)c2ccccc2n3-c2cc(-c3cc(-c4cccc(-c5nc(-c6ccccc6)nc(-c6ccccc6)n5)c4)c4c(c3)oc3ccccc34)c3c(c2)oc2ccccc23)cc1]
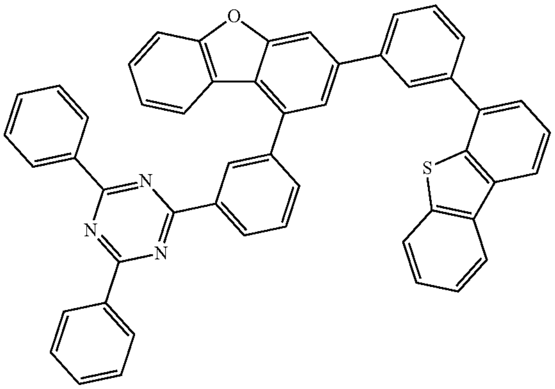 [SMILES: c1ccc(-c2nc(-c3ccccc3)nc(-c3cccc(-c4cc(-c5cccc(-c6cccc7c6sc6ccccc67)c5)cc5oc6ccccc6c45)c3)n2)cc1]

TABLE 1-continued
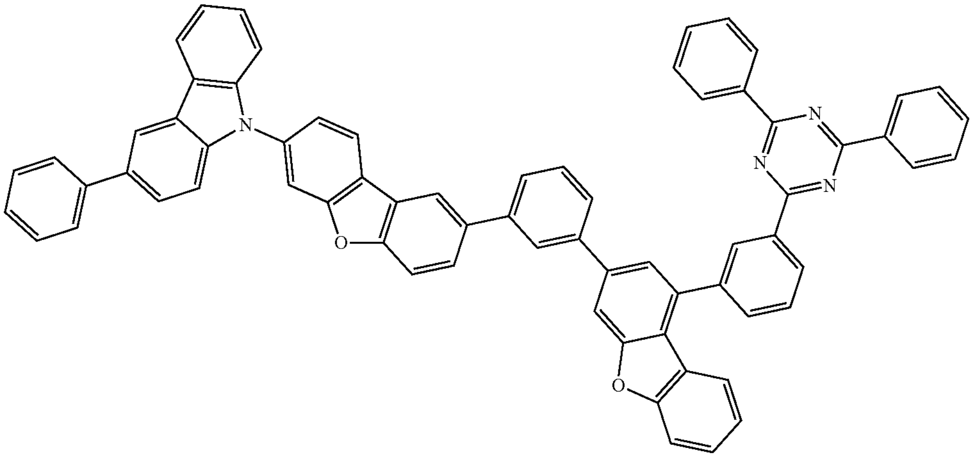 [SMILES: c1ccc(-c2ccc3c(c2)c2ccccc2n3-c2ccc3c(c2)oc2ccc(-c4cccc(-c5cc(-c6cccc(-c7nc(-c8ccccc8)nc(-c8ccccc8)n7)c6)c6c(c5)oc5ccccc56)c4)cc23)cc1]
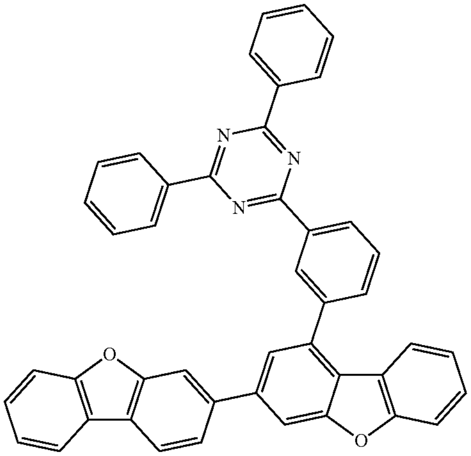 [SMILES: c1ccc(-c2nc(-c3ccccc3)nc(-c3cccc(-c4cc(-c5ccc6c(c5)oc5ccccc56)cc5oc6ccccc6c45)c3)n2)cc1]
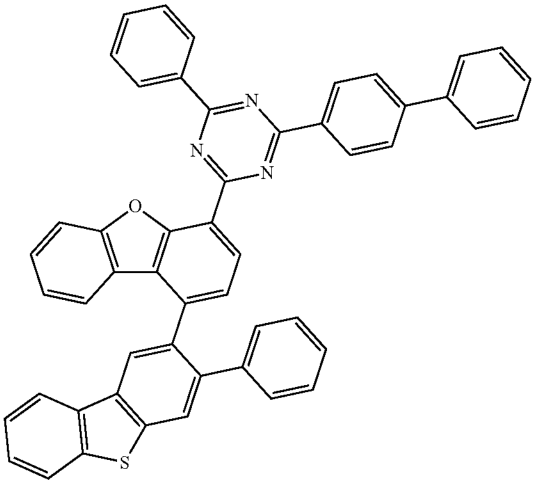 [SMILES: c1ccc(-c2ccc(-c3nc(-c4ccccc4)nc(-c4ccc(-c5cc6c(cc5-c5ccccc5)sc5ccccc56)c5c4oc4ccccc45)n3)cc2)cc1]

TABLE 1-continued
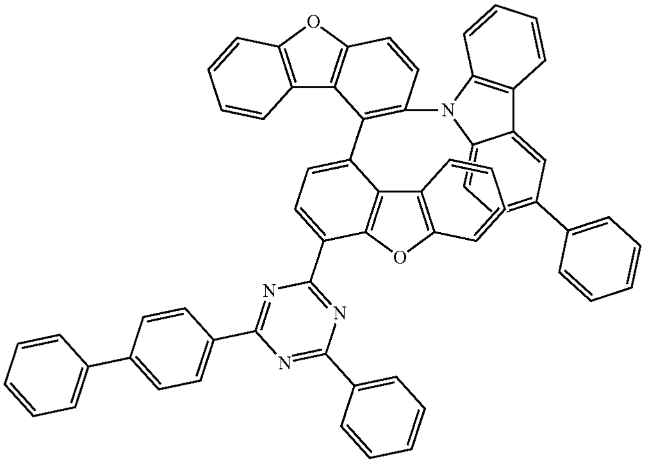 [SMILES: c1ccc(-c2ccc(-c3nc(-c4ccccc4)nc(-c4ccc(-c5c(-n6c7ccccc7c7cc(-c8ccccc8)ccc76)ccc6oc7ccccc7c56)c5c4oc4ccccc45)n3)cc2)cc1]
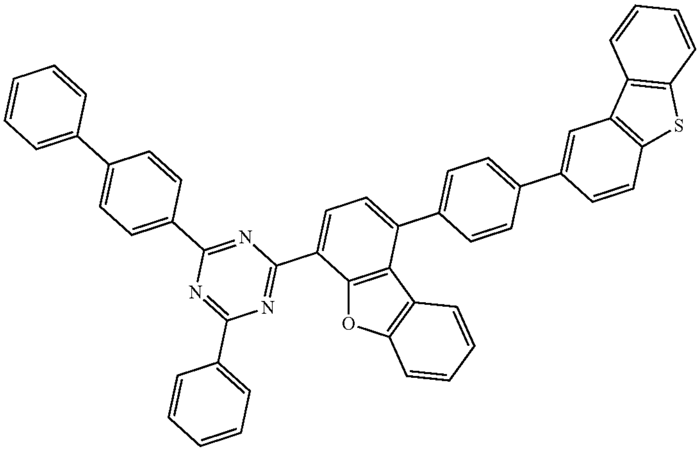 [SMILES: c1ccc(-c2ccc(-c3nc(-c4ccccc4)nc(-c4ccc(-c5ccc(-c6ccc7sc8ccccc8c7c6)cc5)c5c4oc4ccccc45)n3)cc2)cc1]
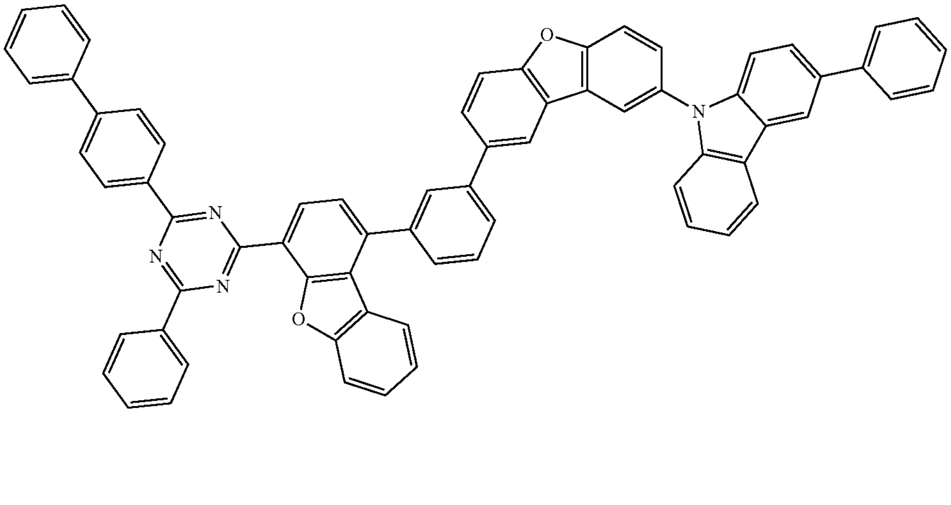 [SMILES: c1ccc(-c2ccc(-c3nc(-c4ccccc4)nc(-c4ccc(-c5cccc(-c6ccc7oc8ccc(-n9c%10ccccc%10c%10cc(-c%11ccccc%11)ccc%109)cc8c7c6)c5)c5c4oc4ccccc45)n3)cc2)cc1]

TABLE 1-continued
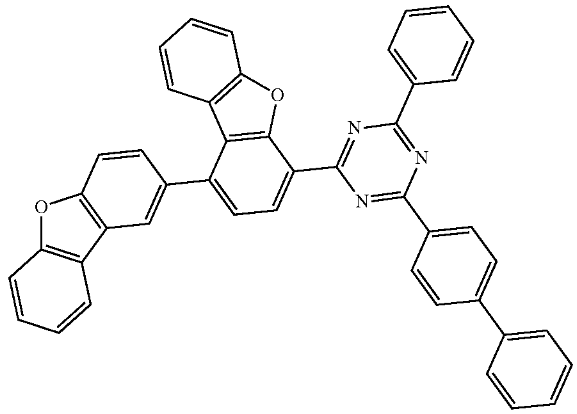 [SMILES: c1ccc(-c2ccc(-c3nc(-c4ccccc4)nc(-c4ccc(-c5ccc6oc7ccccc7c6c5)c5c4oc4ccccc45)n3)cc2)cc1]
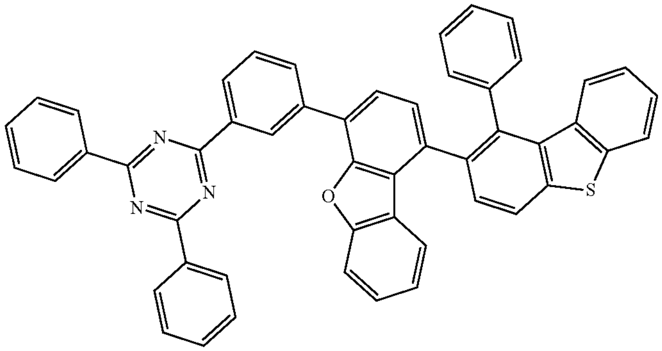 [SMILES: c1ccc(-c2nc(-c3ccccc3)nc(-c3cccc(-c4ccc(-c5ccc6sc7ccccc7c6c5-c5ccccc5)c5c4oc4ccccc45)c3)n2)cc1]
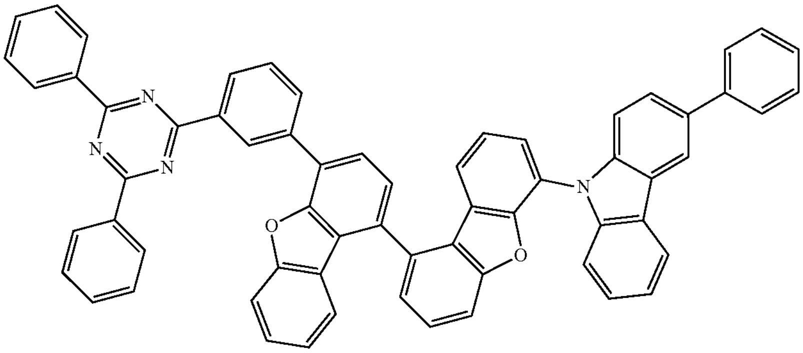 [SMILES: c1ccc(-c2ccc3c(c2)c2ccccc2n3-c2cccc3c2oc2cccc(-c4ccc(-c5cccc(-c6nc(-c7ccccc7)nc(-c7ccccc7)n6)c5)c5oc6ccccc6c45)c23)cc1]
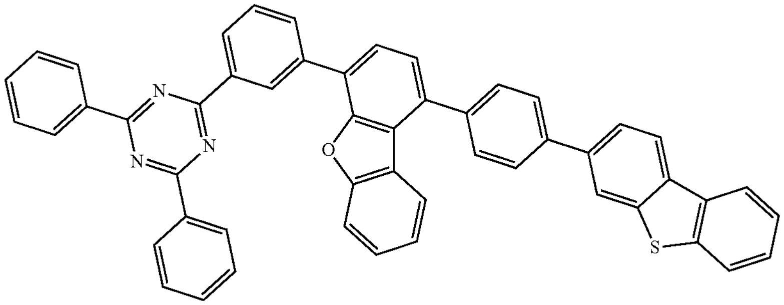 [SMILES: c1ccc(-c2nc(-c3ccccc3)nc(-c3cccc(-c4ccc(-c5ccc(-c6ccc7c(c6)sc6ccccc67)cc5)c5c4oc4ccccc45)c3)n2)cc1]

TABLE 1-continued
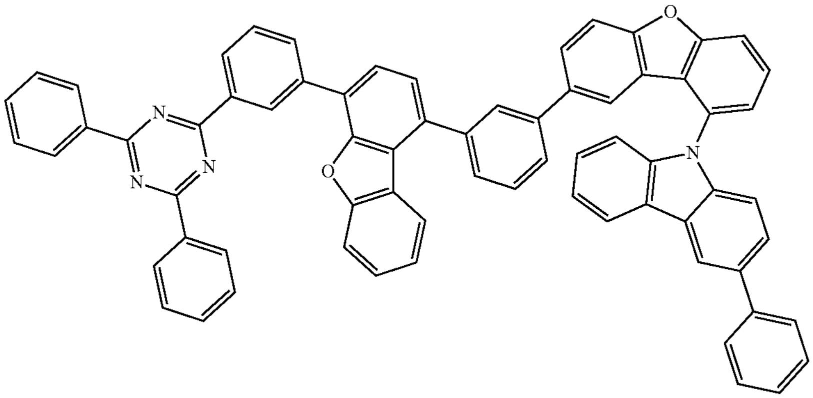 [SMILES: c1ccc(-c2ccc3c(c2)c2ccccc2n3-c2cccc3oc4ccc(-c5cccc(-c6ccc(-c7cccc(-c8nc(-c9ccccc9)nc(-c9ccccc9)n8)c7)c7oc8ccccc8c67)c5)cc4c23)cc1]
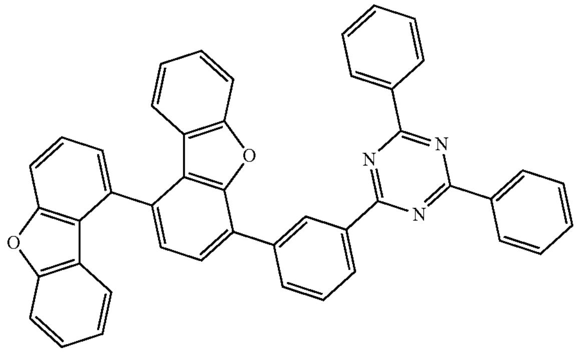 [SMILES: c1ccc(-c2nc(-c3ccccc3)nc(-c3cccc(-c4ccc(-c5cccc6oc7ccccc7c56)c5c4oc4ccccc45)c3)n2)cc1]
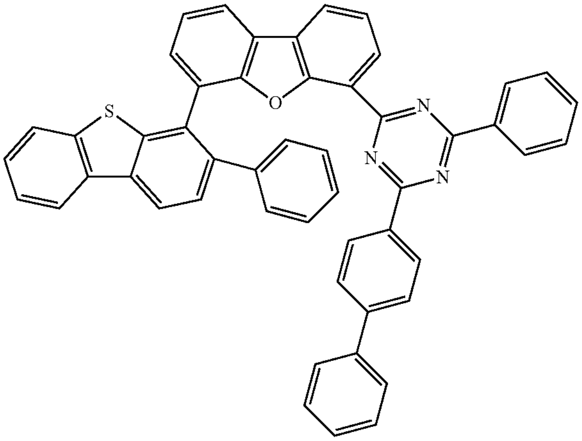 [SMILES: c1ccc(-c2ccc(-c3nc(-c4ccccc4)nc(-c4cccc5c4oc4c(-c6c(-c7ccccc7)ccc7c6sc6ccccc67)cccc45)n3)cc2)cc1]

TABLE 1-continued
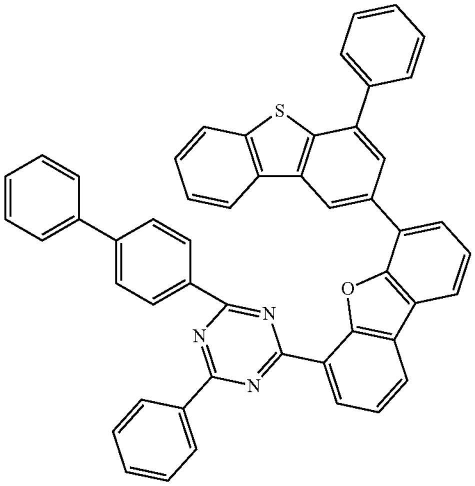 [SMILES: c1ccc(-c2ccc(-c3nc(-c4ccccc4)nc(-c4cccc5c4oc4c(-c6cc(-c7ccccc7)c7sc8ccccc8c7c6)cccc45)n3)cc2)cc1]
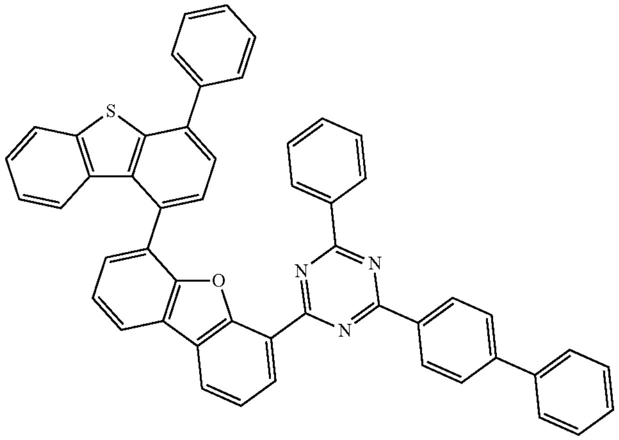 [SMILES: c1ccc(-c2ccc(-c3nc(-c4ccccc4)nc(-c4cccc5c4oc4c(-c6ccc(-c7ccccc7)c7sc8ccccc8c67)cccc45)n3)cc2)cc1]
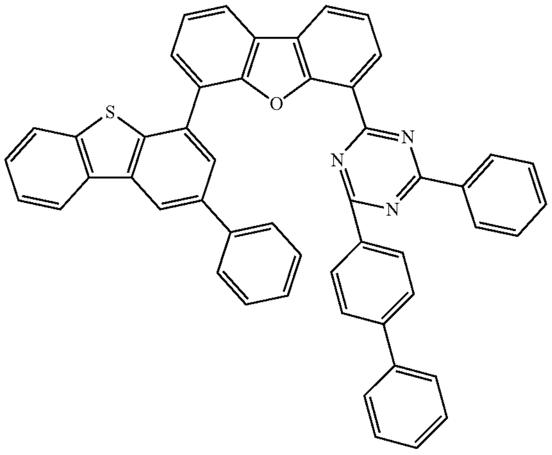 [SMILES: c1ccc(-c2ccc(-c3nc(-c4ccccc4)nc(-c4cccc5c4oc4c(-c6cc(-c7ccccc7)cc7c6sc6ccccc67)cccc45)n3)cc2)cc1]

TABLE 1-continued
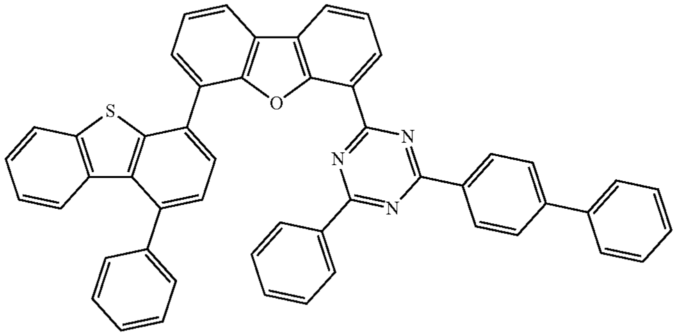 [SMILES: c1ccc(-c2ccc(-c3nc(-c4ccccc4)nc(-c4cccc5c4oc4c(-c6ccc(-c7ccccc7)c7c6sc6ccccc67)cccc45)n3)cc2)cc1]
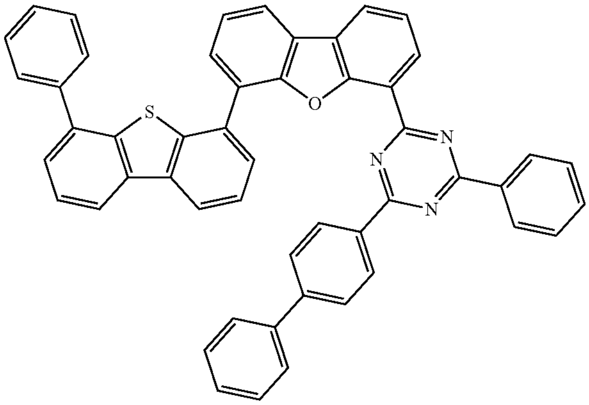 [SMILES: c1ccc(-c2ccc(-c3nc(-c4ccccc4)nc(-c4cccc5c4oc4c(-c6cccc7c6sc6c(-c8ccccc8)cccc67)cccc45)n3)cc2)cc1]
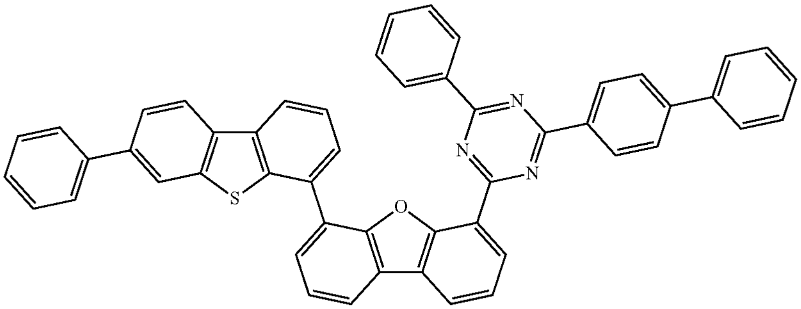 [SMILES: c1ccc(-c2ccc(-c3nc(-c4ccccc4)nc(-c4cccc5c4oc4c(-c6cccc7c6sc6cc(-c8ccccc8)ccc67)cccc45)n3)cc2)cc1]
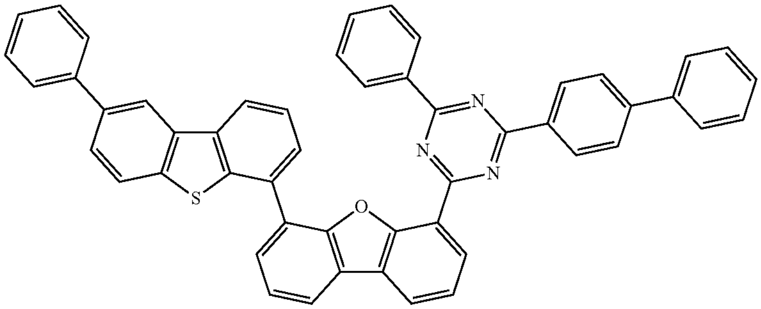 [SMILES: c1ccc(-c2ccc(-c3nc(-c4ccccc4)nc(-c4cccc5c4oc4c(-c6cccc7c6sc6ccc(-c8ccccc8)cc67)cccc45)n3)cc2)cc1]

TABLE 1-continued
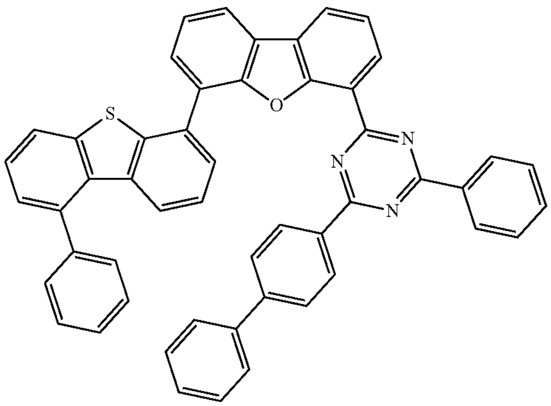 [SMILES: c1ccc(-c2ccc(-c3nc(-c4ccccc4)nc(-c4cccc5c4oc4c(-c6cccc7c6sc6cccc(-c8ccccc8)c67)cccc45)n3)cc2)cc1]
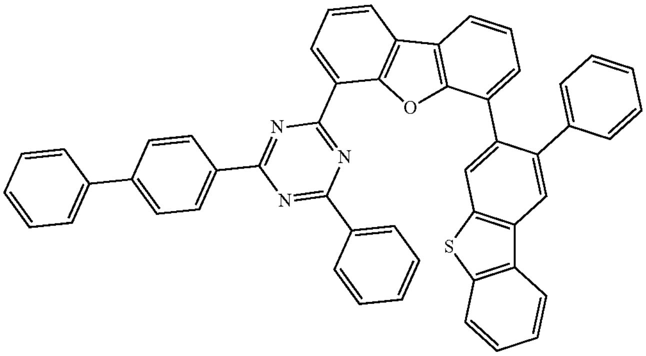 [SMILES: c1ccc(-c2ccc(-c3nc(-c4ccccc4)nc(-c4cccc5c4oc4c(-c6cc7sc8ccccc8c7cc6-c6ccccc6)cccc45)n3)cc2)cc1]
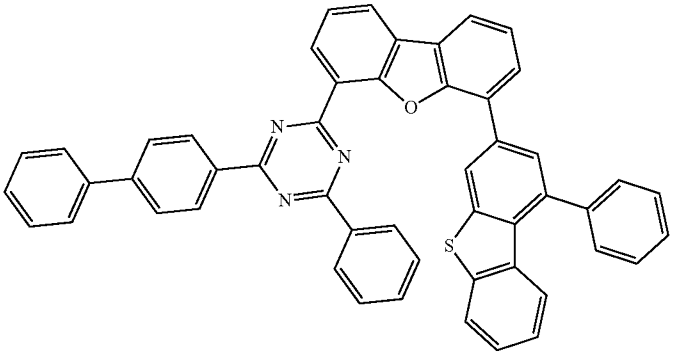 [SMILES: c1ccc(-c2ccc(-c3nc(-c4ccccc4)nc(-c4cccc5c4oc4c(-c6cc(-c7ccccc7)c7c(c6)sc6ccccc67)cccc45)n3)cc2)cc1]
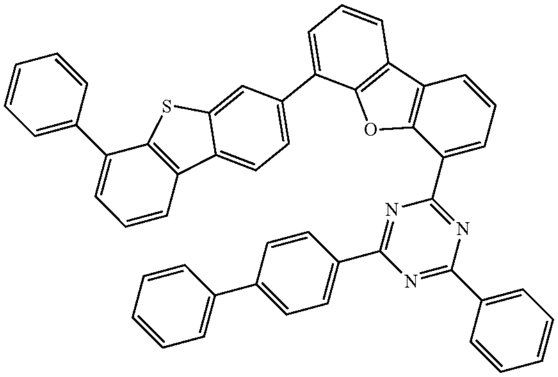 [SMILES: c1ccc(-c2ccc(-c3nc(-c4ccccc4)nc(-c4cccc5c4oc4c(-c6ccc7c(c6)sc6c(-c8ccccc8)cccc67)cccc45)n3)cc2)cc1]

TABLE 1-continued
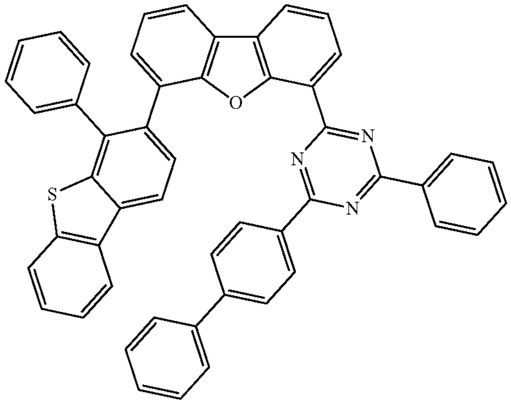 [SMILES: c1ccc(-c2ccc(-c3nc(-c4ccccc4)nc(-c4cccc5c4oc4c(-c6ccc7c(sc8ccccc87)c6-c6ccccc6)cccc45)n3)cc2)cc1]
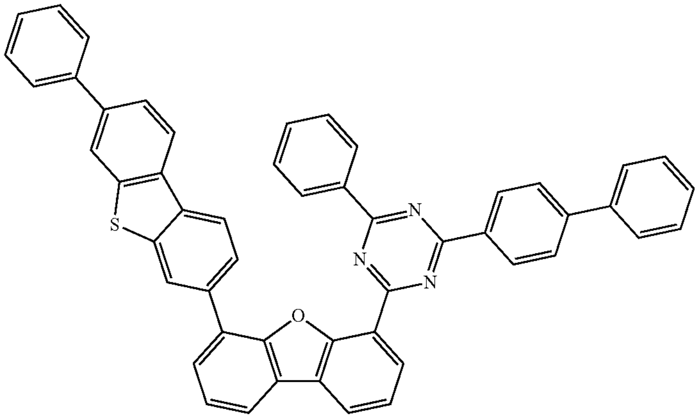 [SMILES: c1ccc(-c2ccc(-c3nc(-c4ccccc4)nc(-c4cccc5c4oc4c(-c6ccc7c(c6)sc6cc(-c8ccccc8)ccc67)cccc45)n3)cc2)cc1]
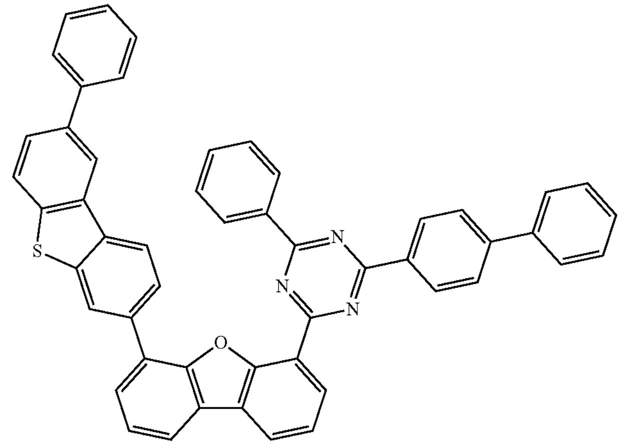 [SMILES: c1ccc(-c2ccc(-c3nc(-c4ccccc4)nc(-c4cccc5c4oc4c(-c6ccc7c(c6)sc6ccc(-c8ccccc8)cc67)cccc45)n3)cc2)cc1]
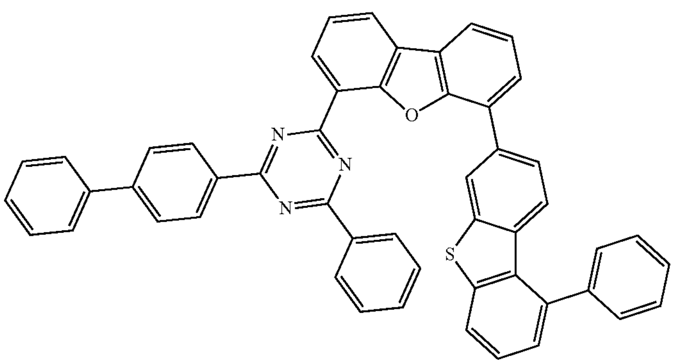 [SMILES: c1ccc(-c2ccc(-c3nc(-c4ccccc4)nc(-c4cccc5c4oc4c(-c6ccc7c(c6)sc6cccc(-c8ccccc8)c67)cccc45)n3)cc2)cc1]

TABLE 1-continued
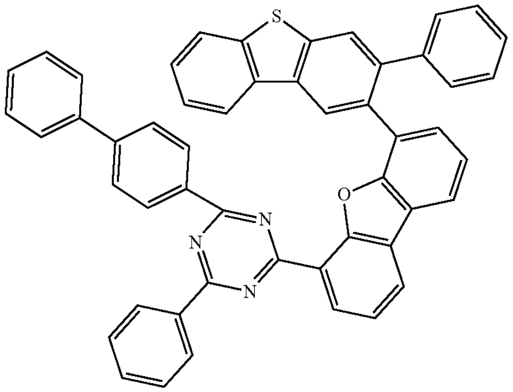 [SMILES: c1ccc(-c2ccc(-c3nc(-c4ccccc4)nc(-c4cccc5c4oc4c(-c6cc7c(cc6-c6ccccc6)sc6ccccc67)cccc45)n3)cc2)cc1]
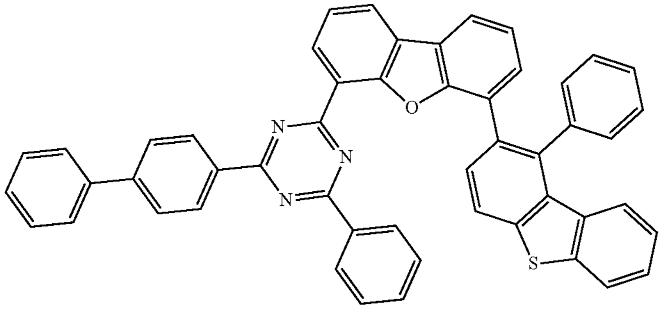 [SMILES: c1ccc(-c2ccc(-c3nc(-c4ccccc4)nc(-c4cccc5c4oc4c(-c6ccc7sc8ccccc8c7c6-c6ccccc6)cccc45)n3)cc2)cc1]
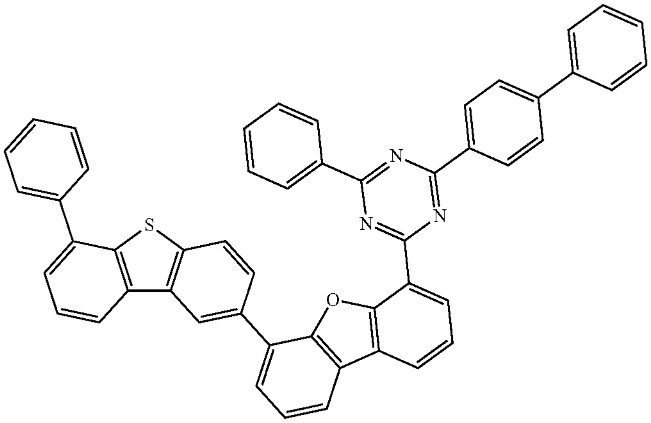 [SMILES: c1ccc(-c2ccc(-c3nc(-c4ccccc4)nc(-c4cccc5c4oc4c(-c6ccc7sc8c(-c9ccccc9)cccc8c7c6)cccc45)n3)cc2)cc1]
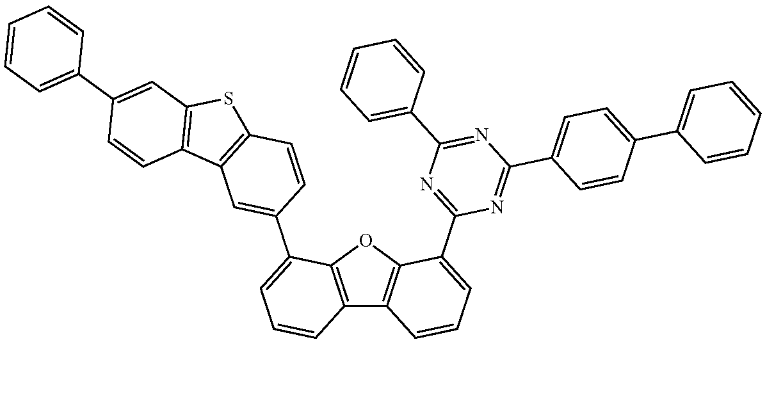 [SMILES: c1ccc(-c2ccc(-c3nc(-c4ccccc4)nc(-c4cccc5c4oc4c(-c6ccc7sc8cc(-c9ccccc9)ccc8c7c6)cccc45)n3)cc2)cc1]

TABLE 1-continued
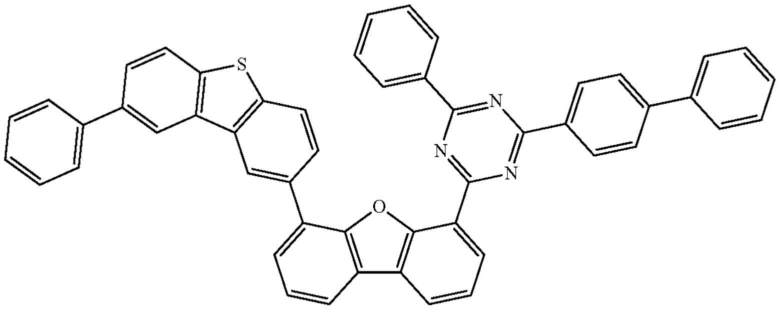 [SMILES: c1ccc(-c2ccc(-c3nc(-c4ccccc4)nc(-c4cccc5c4oc4c(-c6ccc7sc8ccc(-c9ccccc9)cc8c7c6)cccc45)n3)cc2)cc1]
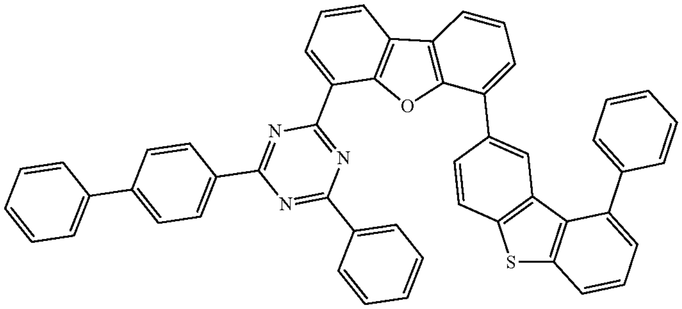 [SMILES: c1ccc(-c2ccc(-c3nc(-c4ccccc4)nc(-c4cccc5c4oc4c(-c6ccc7sc8cccc(-c9ccccc9)c8c7c6)cccc45)n3)cc2)cc1]
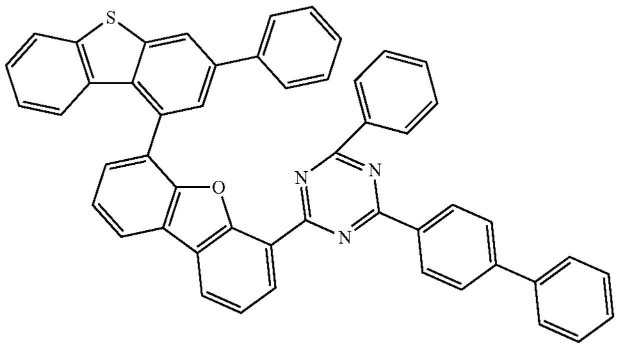 [SMILES: c1ccc(-c2ccc(-c3nc(-c4ccccc4)nc(-c4cccc5c4oc4c(-c6cc(-c7ccccc7)cc7sc8ccccc8c67)cccc45)n3)cc2)cc1]
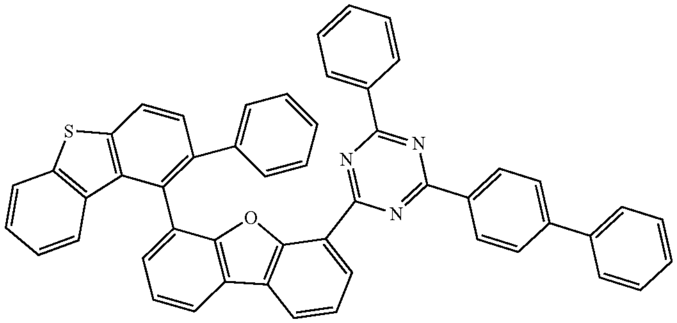 [SMILES: c1ccc(-c2ccc(-c3nc(-c4ccccc4)nc(-c4cccc5c4oc4c(-c6c(-c7ccccc7)ccc7sc8ccccc8c67)cccc45)n3)cc2)cc1]

TABLE 1-continued
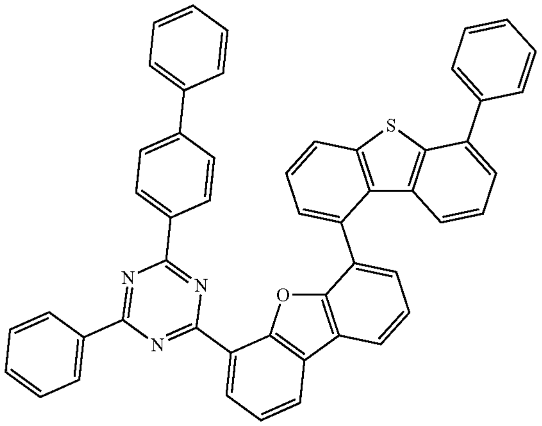 [SMILES: c1ccc(-c2ccc(-c3nc(-c4ccccc4)nc(-c4cccc5c4oc4c(-c6cccc7sc8c(-c9ccccc9)cccc8c67)cccc45)n3)cc2)cc1]
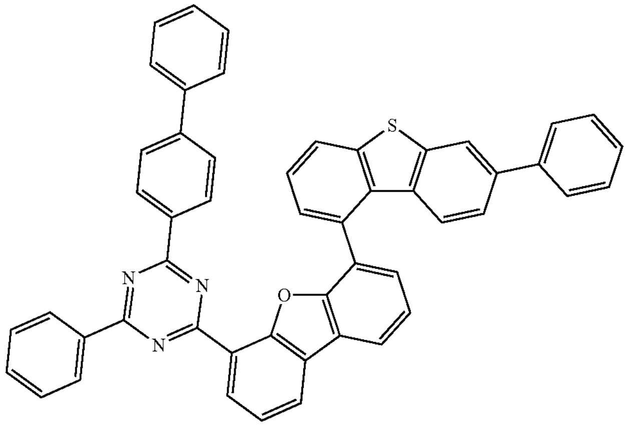 [SMILES: c1ccc(-c2ccc(-c3nc(-c4ccccc4)nc(-c4cccc5c4oc4c(-c6cccc7sc8cc(-c9ccccc9)ccc8c67)cccc45)n3)cc2)cc1]
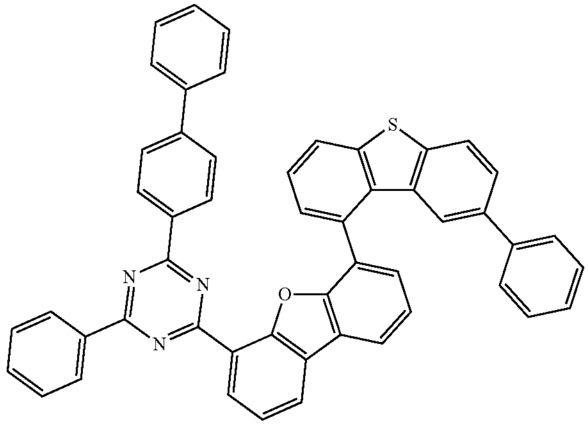 [SMILES: c1ccc(-c2ccc(-c3nc(-c4ccccc4)nc(-c4cccc5c4oc4c(-c6cccc7sc8ccc(-c9ccccc9)cc8c67)cccc45)n3)cc2)cc1]
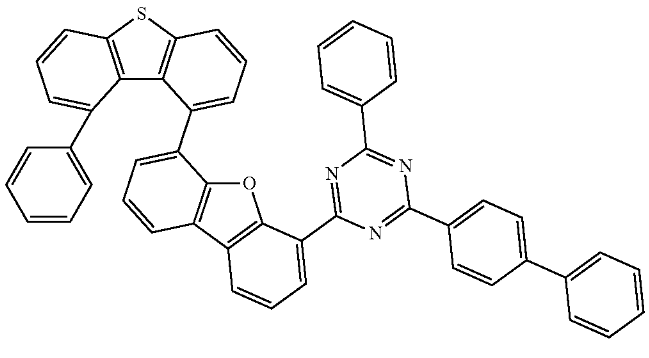 [SMILES: c1ccc(-c2ccc(-c3nc(-c4ccccc4)nc(-c4cccc5c4oc4c(-c6cccc7sc8cccc(-c9ccccc9)c8c67)cccc45)n3)cc2)cc1]

TABLE 1-continued
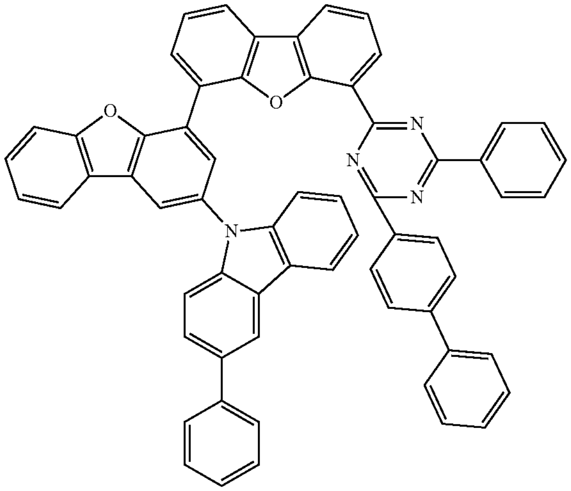 [SMILES: c1ccc(-c2ccc(-c3nc(-c4ccccc4)nc(-c4cccc5c4oc4c(-c6cc(-n7c8ccccc8c8cc(-c9ccccc9)ccc87)cc7c6oc6ccccc67)cccc45)n3)cc2)cc1]
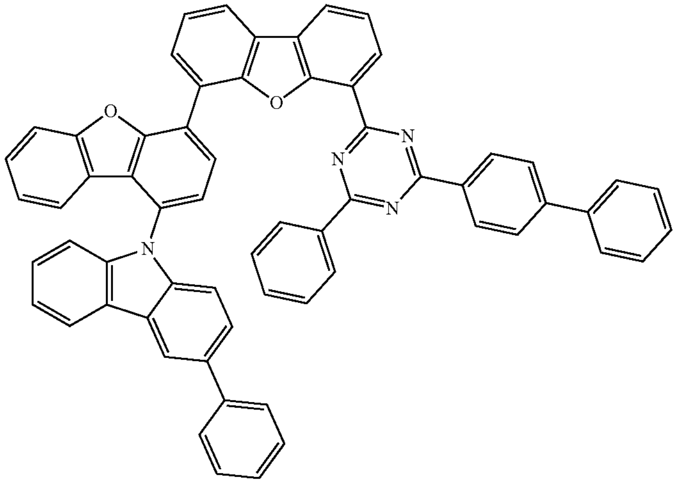 [SMILES: c1ccc(-c2ccc(-c3nc(-c4ccccc4)nc(-c4cccc5c4oc4c(-c6ccc(-n7c8ccccc8c8cc(-c9ccccc9)ccc87)c7c6oc6ccccc67)cccc45)n3)cc2)cc1]
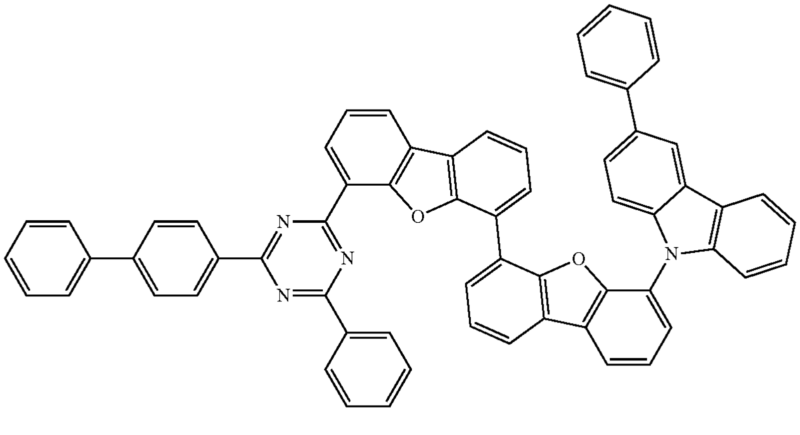 [SMILES: c1ccc(-c2ccc(-c3nc(-c4ccccc4)nc(-c4cccc5c4oc4c(-c6cccc7c6oc6c(-n8c9ccccc9c9cc(-c%10ccccc%10)ccc98)cccc67)cccc45)n3)cc2)cc1]

TABLE 1-continued
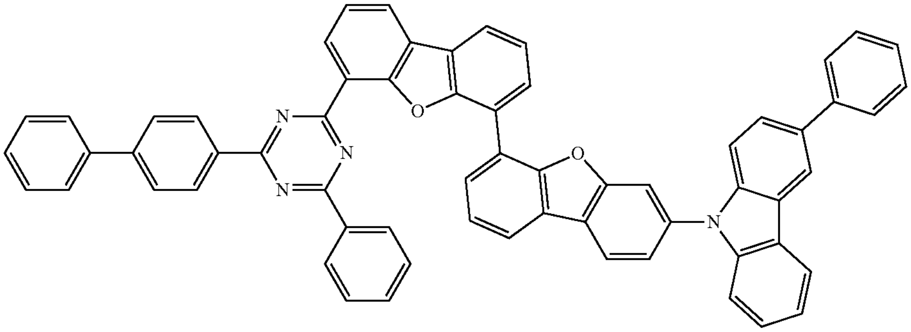 [SMILES: c1ccc(-c2ccc(-c3nc(-c4ccccc4)nc(-c4cccc5c4oc4c(-c6cccc7c6oc6cc(-n8c9ccccc9c9cc(-c%10ccccc%10)ccc98)ccc67)cccc45)n3)cc2)cc1]
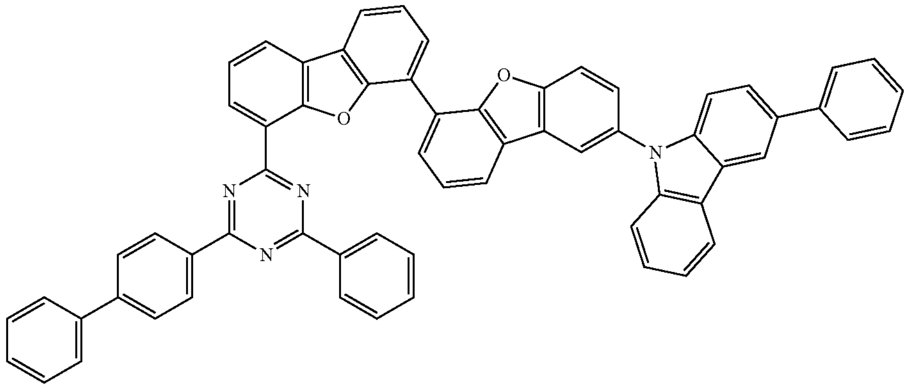 [SMILES: c1ccc(-c2ccc(-c3nc(-c4ccccc4)nc(-c4cccc5c4oc4c(-c6cccc7c6oc6ccc(-n8c9ccccc9c9cc(-c%10ccccc%10)ccc98)cc67)cccc45)n3)cc2)cc1]
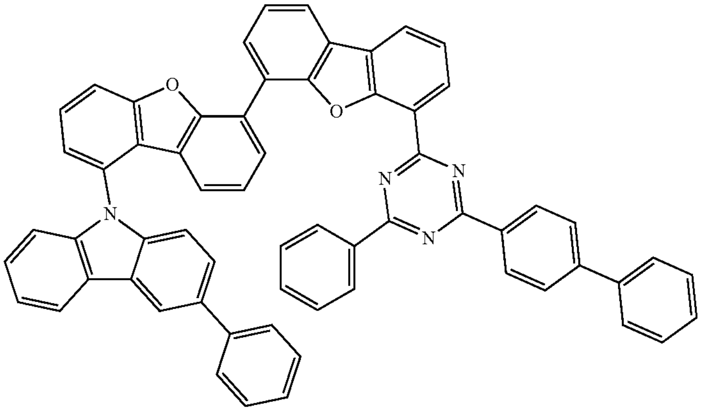 [SMILES: c1ccc(-c2ccc(-c3nc(-c4ccccc4)nc(-c4cccc5c4oc4c(-c6cccc7c6oc6cccc(-n8c9ccccc9c9cc(-c%10ccccc%10)ccc98)c67)cccc45)n3)cc2)cc1]
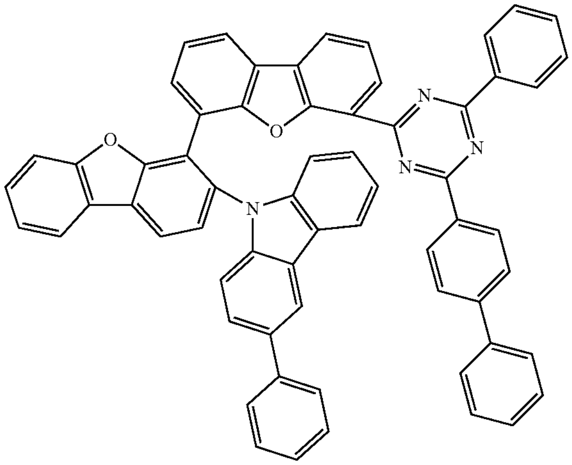 [SMILES: c1ccc(-c2ccc(-c3nc(-c4ccccc4)nc(-c4cccc5c4oc4c(-c6c(-n7c8ccccc8c8cc(-c9ccccc9)ccc87)ccc7c6oc6ccccc67)cccc45)n3)cc2)cc1]

TABLE 1-continued
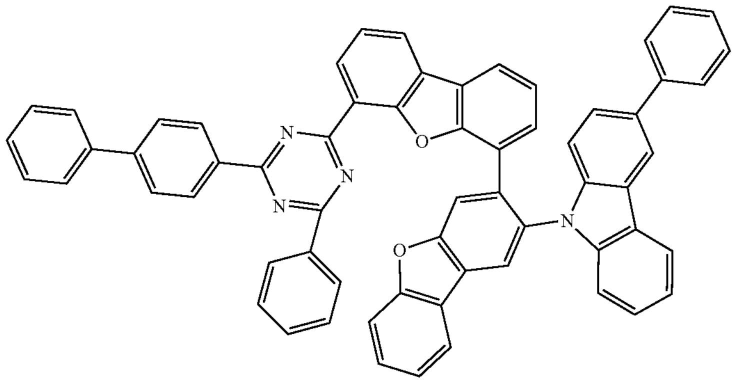 [SMILES: c1ccc(-c2ccc(-c3nc(-c4ccccc4)nc(-c4cccc5c4oc4c(-c6cc7oc8ccccc8c7cc6-n6c7ccccc7c7cc(-c8ccccc8)ccc76)cccc45)n3)cc2)cc1]
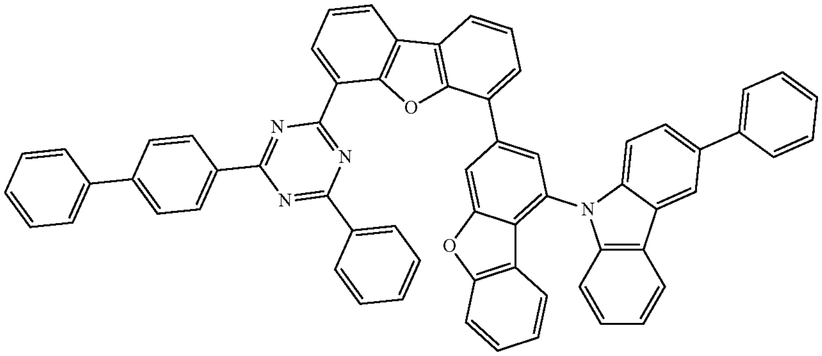 [SMILES: c1ccc(-c2ccc(-c3nc(-c4ccccc4)nc(-c4cccc5c4oc4c(-c6cc(-n7c8ccccc8c8cc(-c9ccccc9)ccc87)c7c(c6)oc6ccccc67)cccc45)n3)cc2)cc1]
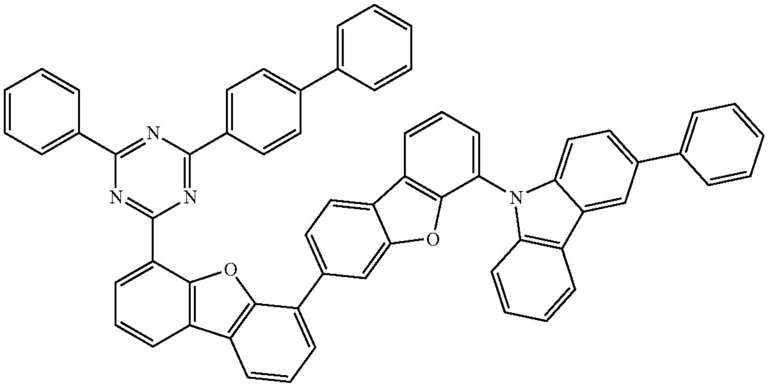 [SMILES: c1ccc(-c2ccc(-c3nc(-c4ccccc4)nc(-c4cccc5c4oc4c(-c6ccc7c(c6)oc6c(-n8c9ccccc9c9cc(-c%10ccccc%10)ccc98)cccc67)cccc45)n3)cc2)cc1]
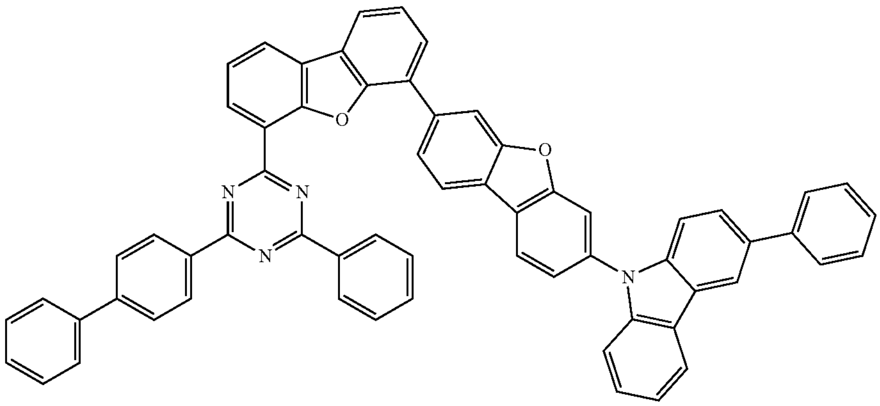 [SMILES: c1ccc(-c2ccc(-c3nc(-c4ccccc4)nc(-c4cccc5c4oc4c(-c6ccc7c(c6)oc6cc(-n8c9ccccc9c9cc(-c%10ccccc%10)ccc98)ccc67)cccc45)n3)cc2)cc1]

TABLE 1-continued
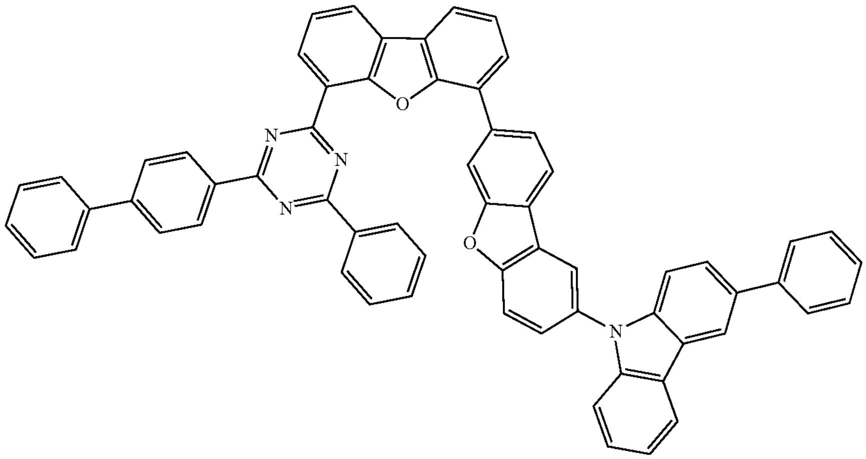 [SMILES: c1ccc(-c2ccc(-c3nc(-c4ccccc4)nc(-c4cccc5c4oc4c(-c6ccc7c(c6)oc6ccc(-n8c9ccccc9c9cc(-c%10ccccc%10)ccc98)cc67)cccc45)n3)cc2)cc1]
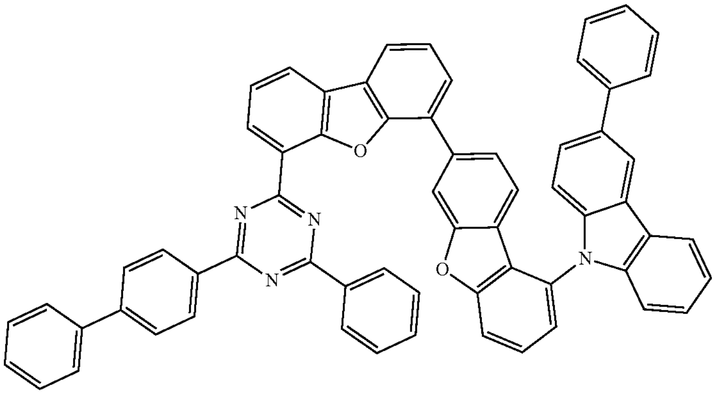 [SMILES: c1ccc(-c2ccc(-c3nc(-c4ccccc4)nc(-c4cccc5c4oc4c(-c6ccc7c(c6)oc6cccc(-n8c9ccccc9c9cc(-c%10ccccc%10)ccc98)c67)cccc45)n3)cc2)cc1]
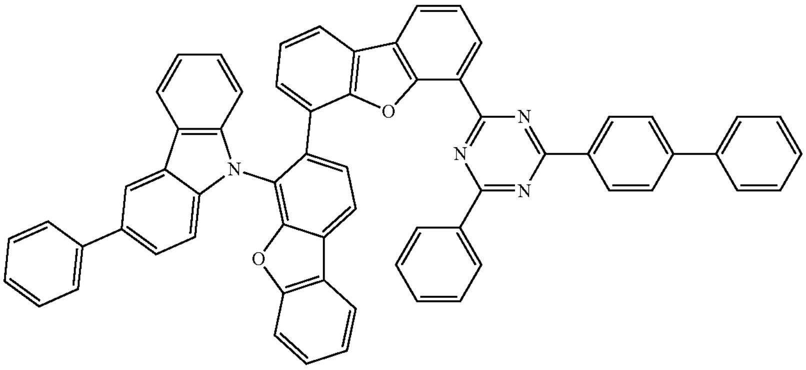 [SMILES: c1ccc(-c2ccc(-c3nc(-c4ccccc4)nc(-c4cccc5c4oc4c(-c6ccc7c(oc8ccccc87)c6-n6c7ccccc7c7cc(-c8ccccc8)ccc76)cccc45)n3)cc2)cc1]

TABLE 1-continued
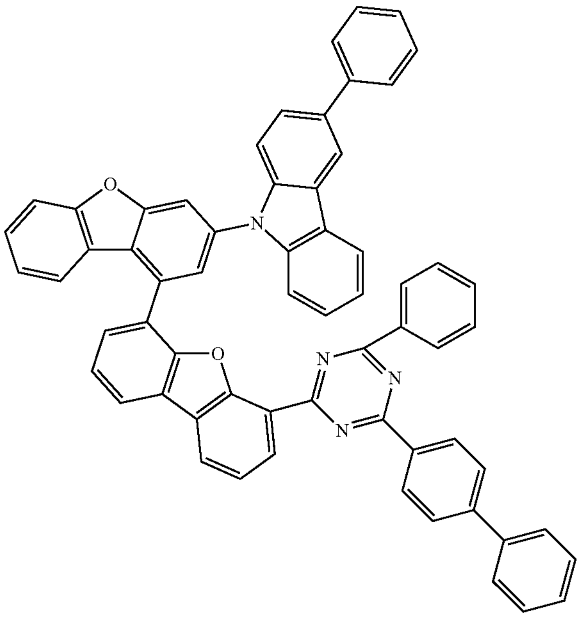 [SMILES: c1ccc(-c2ccc(-c3nc(-c4ccccc4)nc(-c4cccc5c4oc4c(-c6cc(-n7c8ccccc8c8cc(-c9ccccc9)ccc87)cc7oc8ccccc8c67)cccc45)n3)cc2)cc1]
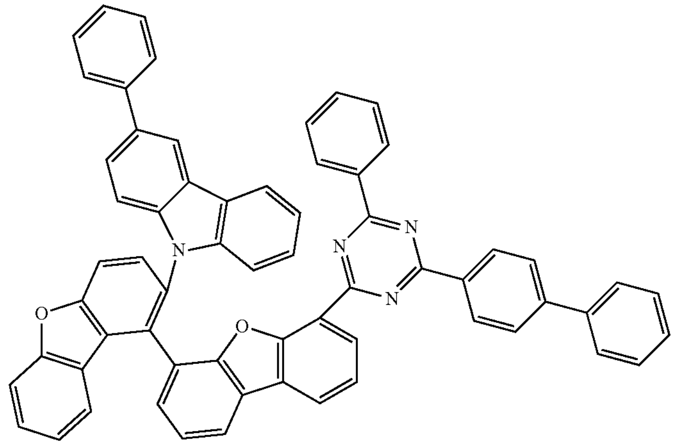 [SMILES: c1ccc(-c2ccc(-c3nc(-c4ccccc4)nc(-c4cccc5c4oc4c(-c6c(-n7c8ccccc8c8cc(-c9ccccc9)ccc87)ccc7oc8ccccc8c67)cccc45)n3)cc2)cc1]
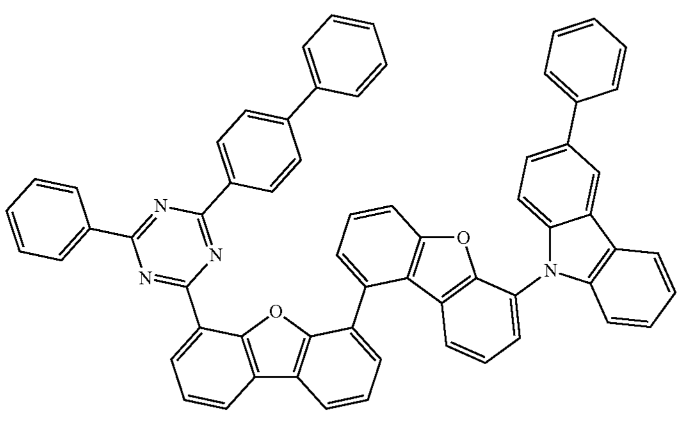 [SMILES: c1ccc(-c2ccc(-c3nc(-c4ccccc4)nc(-c4cccc5c4oc4c(-c6cccc7oc8c(-n9c%10ccccc%10c%10cc(-c%11ccccc%11)ccc%109)cccc8c67)cccc45)n3)cc2)cc1]

TABLE 1-continued
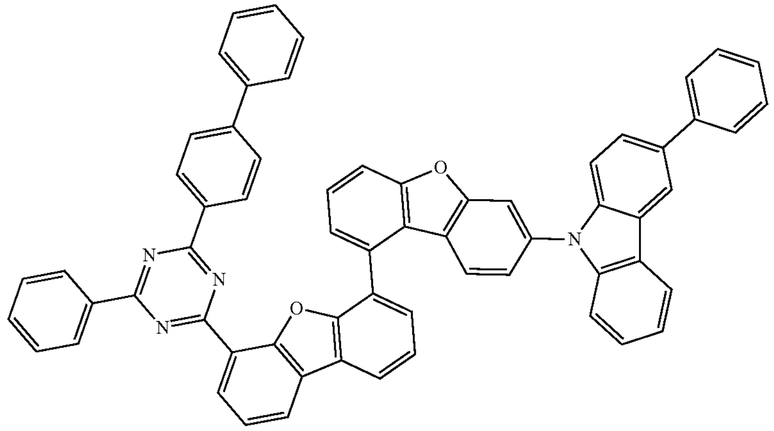 [SMILES: c1ccc(-c2ccc(-c3nc(-c4ccccc4)nc(-c4cccc5c4oc4c(-c6cccc7oc8cc(-n9c%10ccccc%10c%10cc(-c%11ccccc%11)ccc%109)ccc8c67)cccc45)n3)cc2)cc1]
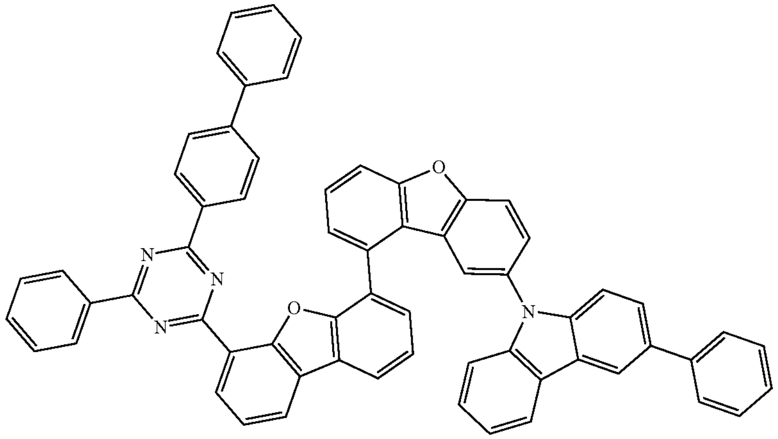 [SMILES: c1ccc(-c2ccc(-c3nc(-c4ccccc4)nc(-c4cccc5c4oc4c(-c6cccc7oc8ccc(-n9c%10ccccc%10c%10cc(-c%11ccccc%11)ccc%109)cc8c67)cccc45)n3)cc2)cc1]
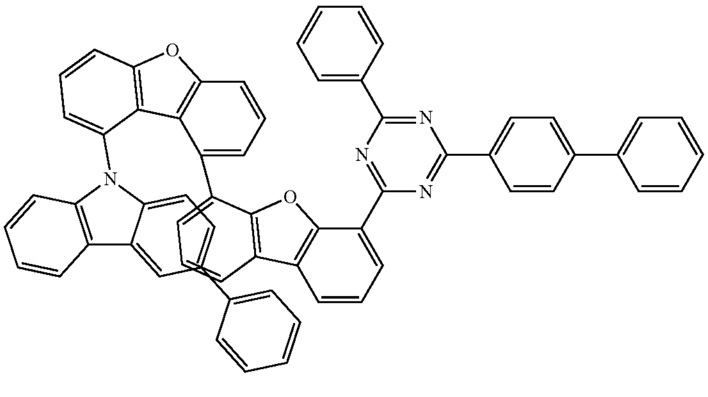 [SMILES: c1ccc(-c2ccc(-c3nc(-c4ccccc4)nc(-c4cccc5c4oc4c(-c6cccc7oc8cccc(-n9c%10ccccc%10c%10cc(-c%11ccccc%11)ccc%109)c8c67)cccc45)n3)cc2)cc1]

TABLE 1-continued
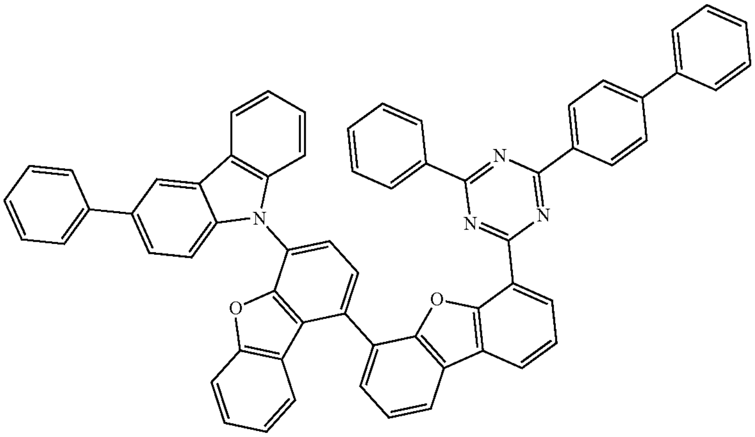 [SMILES: c1ccc(-c2ccc(-c3nc(-c4ccccc4)nc(-c4cccc5c4oc4c(-c6ccc(-n7c8ccccc8c8cc(-c9ccccc9)ccc87)c7oc8ccccc8c67)cccc45)n3)cc2)cc1]
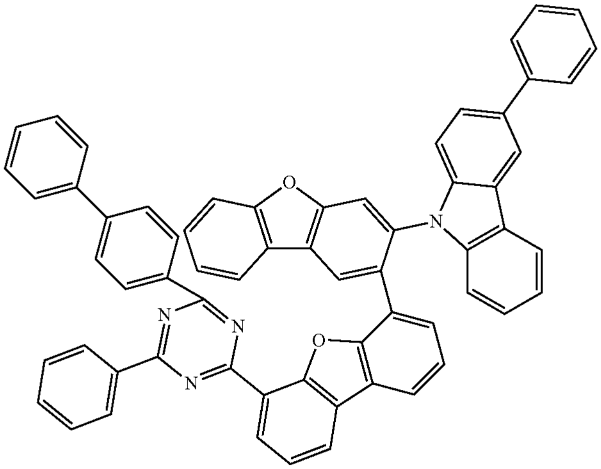 [SMILES: c1ccc(-c2ccc(-c3nc(-c4ccccc4)nc(-c4cccc5c4oc4c(-c6cc7c(cc6-n6c8ccccc8c8cc(-c9ccccc9)ccc86)oc6ccccc67)cccc45)n3)cc2)cc1]
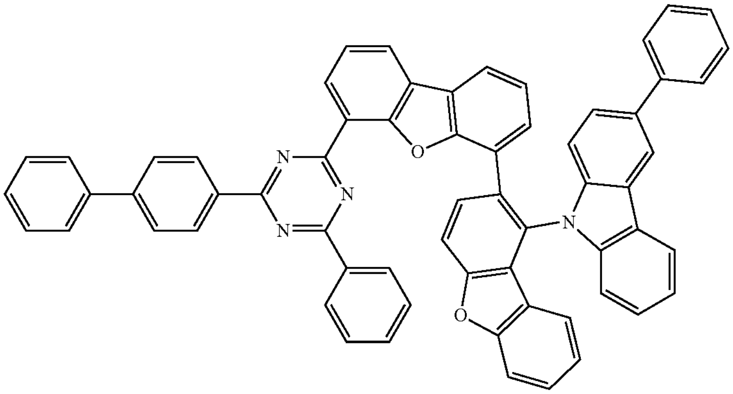 [SMILES: c1ccc(-c2ccc(-c3nc(-c4ccccc4)nc(-c4cccc5c4oc4c(-c6ccc7oc8ccccc8c7c6-n6c7ccccc7c7cc(-c8ccccc8)ccc76)cccc45)n3)cc2)cc1]

TABLE 1-continued
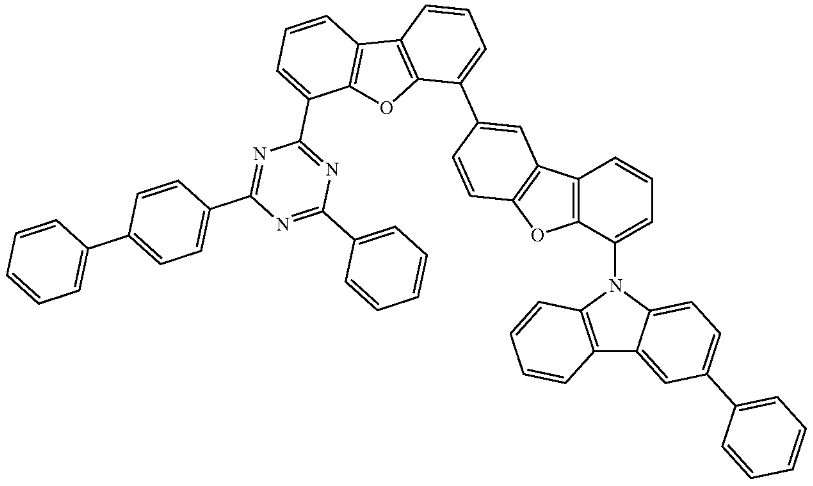 [SMILES: c1ccc(-c2ccc(-c3nc(-c4ccccc4)nc(-c4cccc5c4oc4c(-c6ccc7oc8c(-n9c%10ccccc%10c%10cc(-c%11ccccc%11)ccc%109)cccc8c7c6)cccc45)n3)cc2)cc1]
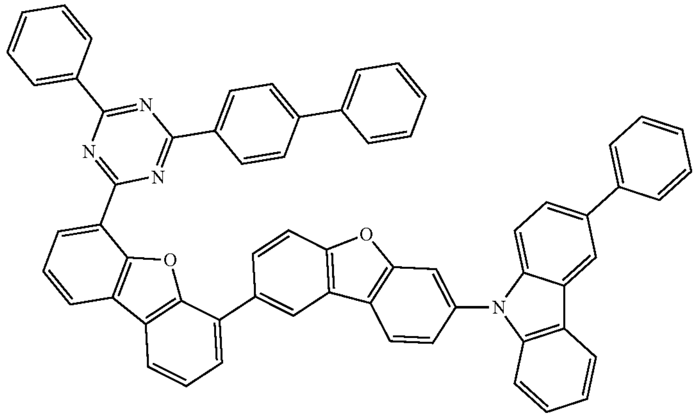 [SMILES: c1ccc(-c2ccc(-c3nc(-c4ccccc4)nc(-c4cccc5c4oc4c(-c6ccc7oc8cc(-n9c%10ccccc%10c%10cc(-c%11ccccc%11)ccc%109)ccc8c7c6)cccc45)n3)cc2)cc1]
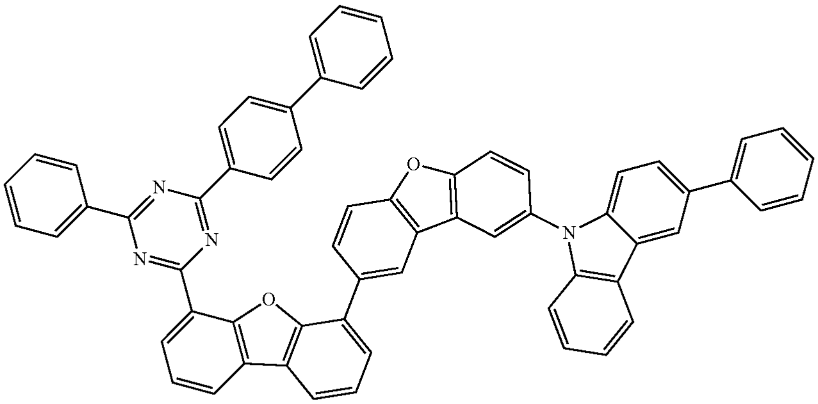 [SMILES: c1ccc(-c2ccc(-c3nc(-c4ccccc4)nc(-c4cccc5c4oc4c(-c6ccc7oc8ccc(-n9c%10ccccc%10c%10cc(-c%11ccccc%11)ccc%109)cc8c7c6)cccc45)n3)cc2)cc1]

TABLE 1-continued
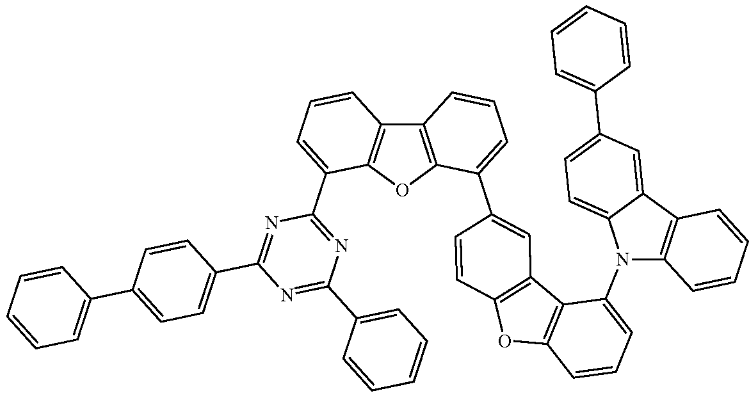 [SMILES: c1ccc(-c2ccc(-c3nc(-c4ccccc4)nc(-c4cccc5c4oc4c(-c6ccc7oc8cccc(-n9c%10ccccc%10c%10cc(-c%11ccccc%11)ccc%109)c8c7c6)cccc45)n3)cc2)cc1]
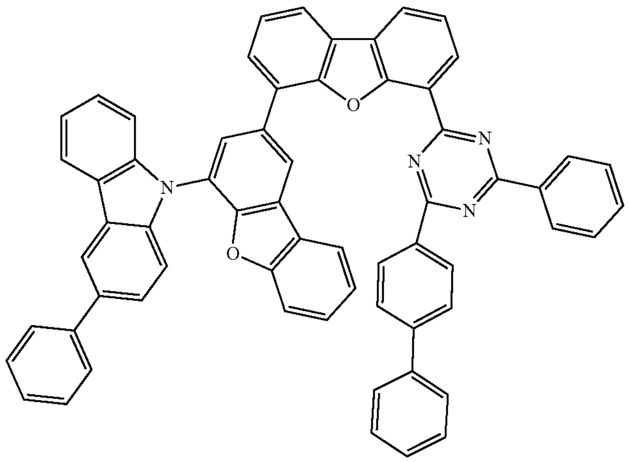 [SMILES: c1ccc(-c2ccc(-c3nc(-c4ccccc4)nc(-c4cccc5c4oc4c(-c6cc(-n7c8ccccc8c8cc(-c9ccccc9)ccc87)c7oc8ccccc8c7c6)cccc45)n3)cc2)cc1]
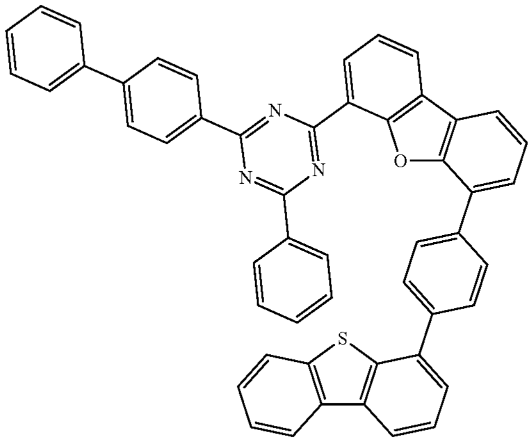 [SMILES: c1ccc(-c2ccc(-c3nc(-c4ccccc4)nc(-c4cccc5c4oc4c(-c6ccc(-c7cccc8c7sc7ccccc78)cc6)cccc45)n3)cc2)cc1]

TABLE 1-continued
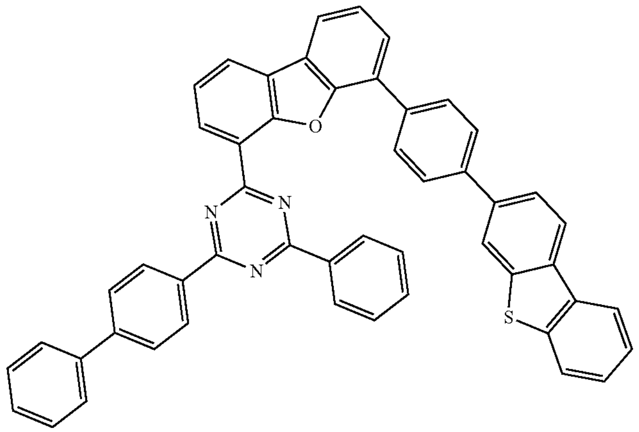 [SMILES: c1ccc(-c2ccc(-c3nc(-c4ccccc4)nc(-c4cccc5c4oc4c(-c6ccc(-c7ccc8c(c7)sc7ccccc78)cc6)cccc45)n3)cc2)cc1]
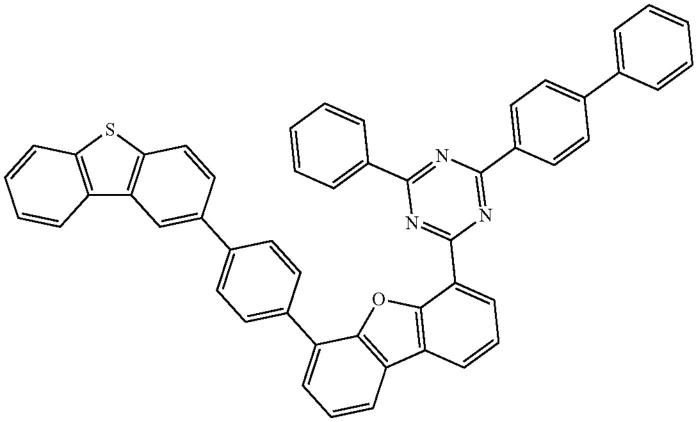 [SMILES: c1ccc(-c2ccc(-c3nc(-c4ccccc4)nc(-c4cccc5c4oc4c(-c6ccc(-c7ccc8sc9ccccc9c8c7)cc6)cccc45)n3)cc2)cc1]
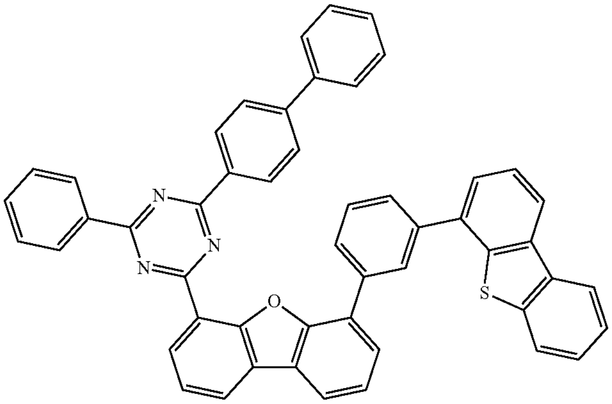 [SMILES: c1ccc(-c2ccc(-c3nc(-c4ccccc4)nc(-c4cccc5c4oc4c(-c6cccc(-c7cccc8c7sc7ccccc78)c6)cccc45)n3)cc2)cc1]

TABLE 1-continued
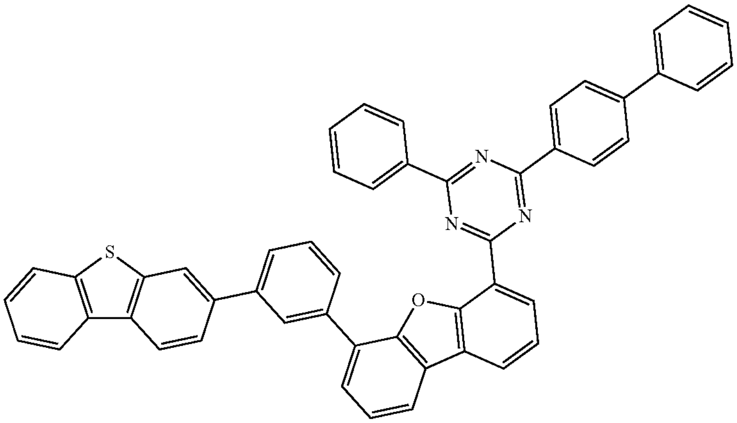 [SMILES: c1ccc(-c2ccc(-c3nc(-c4ccccc4)nc(-c4cccc5c4oc4c(-c6cccc(-c7ccc8c(c7)sc7ccccc78)c6)cccc45)n3)cc2)cc1]
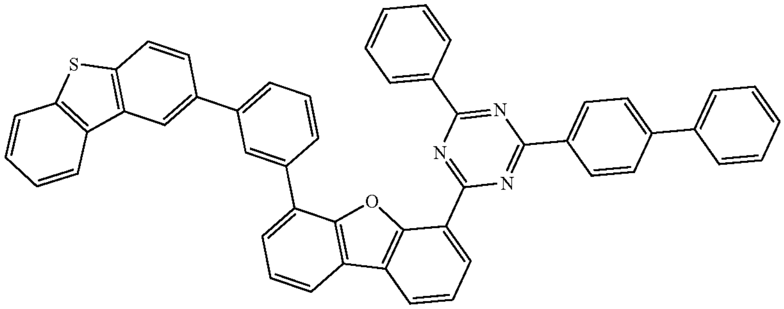 [SMILES: c1ccc(-c2ccc(-c3nc(-c4ccccc4)nc(-c4cccc5c4oc4c(-c6cccc(-c7ccc8sc9ccccc9c8c7)c6)cccc45)n3)cc2)cc1]
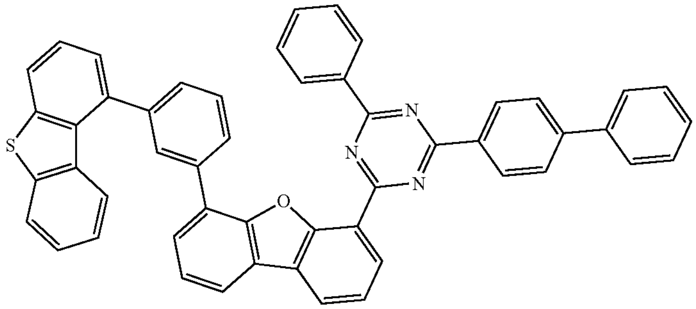 [SMILES: c1ccc(-c2ccc(-c3nc(-c4ccccc4)nc(-c4cccc5c4oc4c(-c6cccc(-c7cccc8sc9ccccc9c78)c6)cccc45)n3)cc2)cc1]
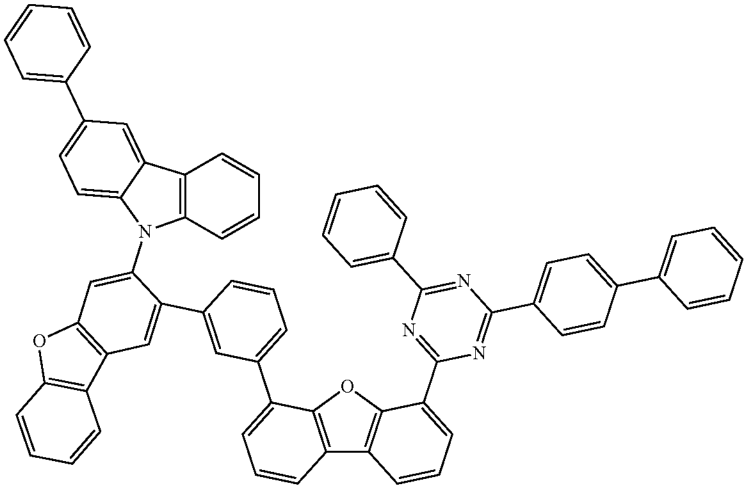 [SMILES: c1ccc(-c2ccc(-c3nc(-c4ccccc4)nc(-c4cccc5c4oc4c(-c6cccc(-c7cc8c(cc7-n7c9ccccc9c9cc(-c%10ccccc%10)ccc97)oc7ccccc78)c6)cccc45)n3)cc2)cc1]

TABLE 1-continued
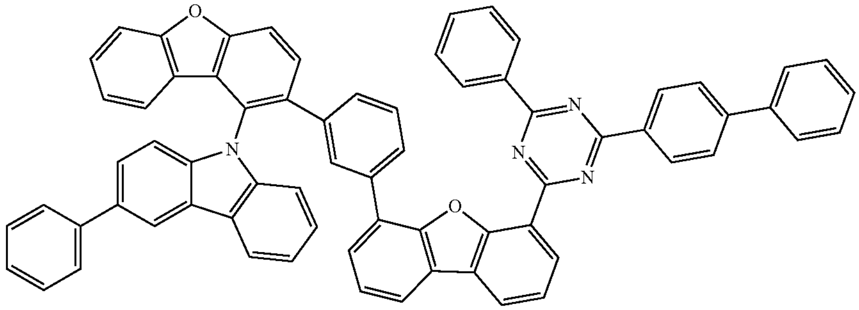 [SMILES: c1ccc(-c2ccc(-c3nc(-c4ccccc4)nc(-c4cccc5c4oc4c(-c6cccc(-c7ccc8oc9ccccc9c8c7-n7c8ccccc8c8cc(-c9ccccc9)ccc87)c6)cccc45)n3)cc2)cc1]
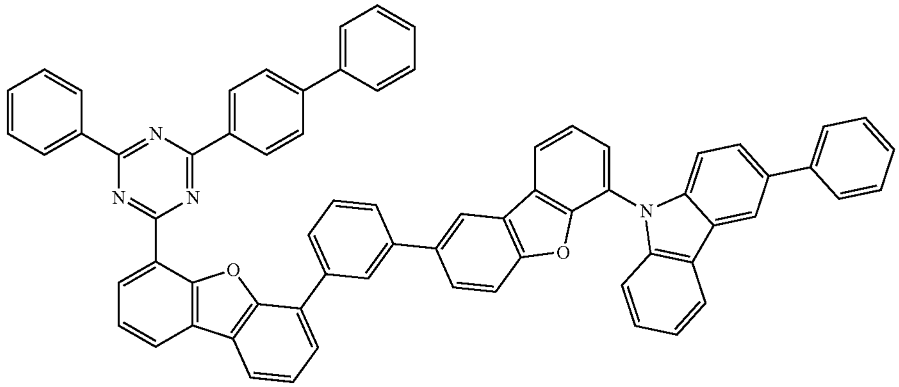 [SMILES: c1ccc(-c2ccc(-c3nc(-c4ccccc4)nc(-c4cccc5c4oc4c(-c6cccc(-c7ccc8oc9c(-n%10c%11ccccc%11c%11cc(-c%12ccccc%12)ccc%11%10)cccc9c8c7)c6)cccc45)n3)cc2)cc1]
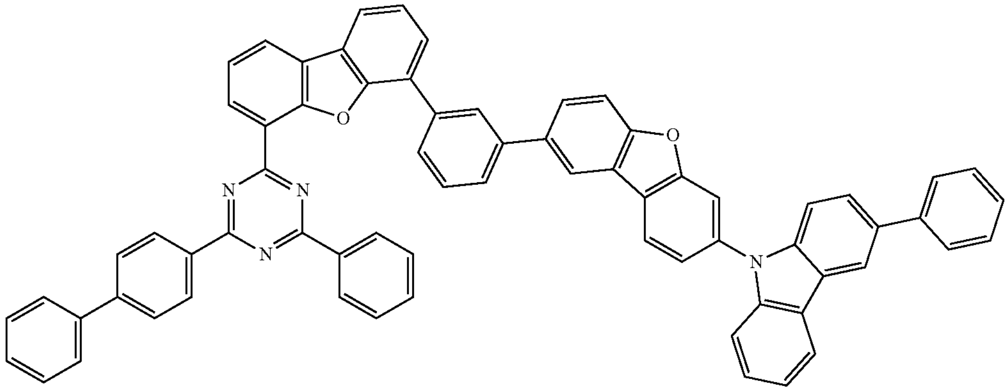 [SMILES: c1ccc(-c2ccc(-c3nc(-c4ccccc4)nc(-c4cccc5c4oc4c(-c6cccc(-c7ccc8oc9cc(-n%10c%11ccccc%11c%11cc(-c%12ccccc%12)ccc%11%10)ccc9c8c7)c6)cccc45)n3)cc2)cc1]
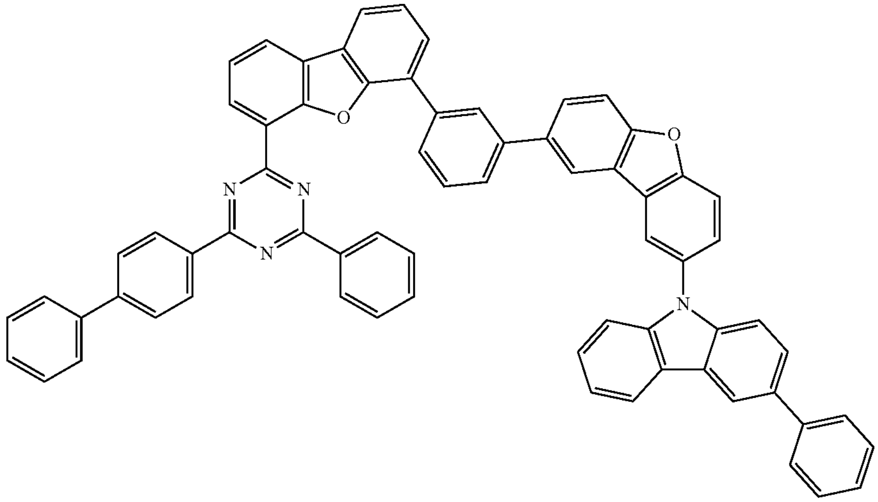 [SMILES: c1ccc(-c2ccc(-c3nc(-c4ccccc4)nc(-c4cccc5c4oc4c(-c6cccc(-c7ccc8oc9ccc(-n%10c%11ccccc%11c%11cc(-c%12ccccc%12)ccc%11%10)cc9c8c7)c6)cccc45)n3)cc2)cc1]

TABLE 1-continued
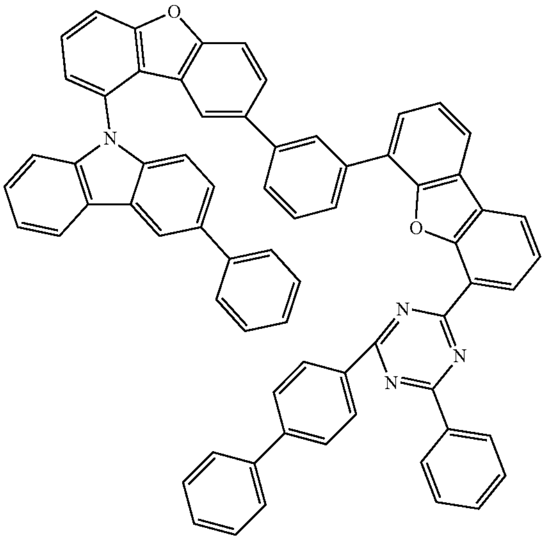 [SMILES: c1ccc(-c2ccc(-c3nc(-c4ccccc4)nc(-c4cccc5c4oc4c(-c6cccc(-c7ccc8oc9cccc(-n%10c%11ccccc%11c%11cc(-c%12ccccc%12)ccc%11%10)c9c8c7)c6)cccc45)n3)cc2)cc1]
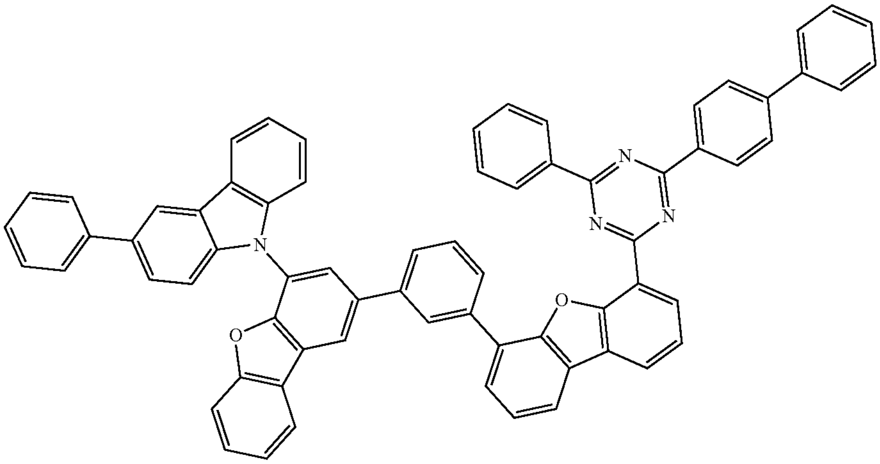 [SMILES: c1ccc(-c2ccc(-c3nc(-c4ccccc4)nc(-c4cccc5c4oc4c(-c6cccc(-c7cc(-n8c9ccccc9c9cc(-c%10ccccc%10)ccc98)c8oc9ccccc9c8c7)c6)cccc45)n3)cc2)cc1]
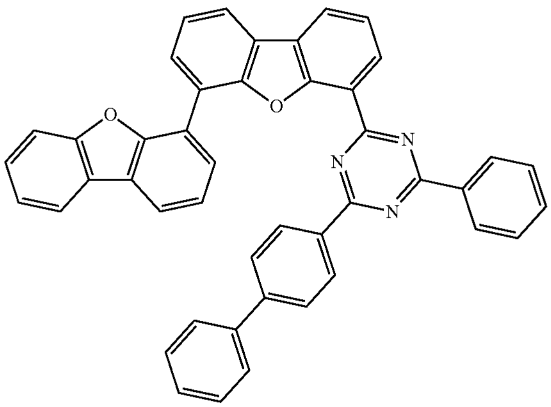 [SMILES: c1ccc(-c2ccc(-c3nc(-c4ccccc4)nc(-c4cccc5c4oc4c(-c6cccc7c6oc6ccccc67)cccc45)n3)cc2)cc1]

TABLE 1-continued
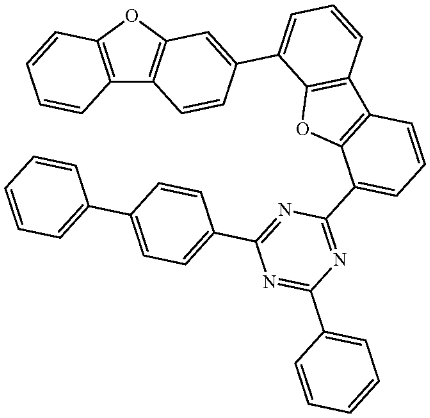 [SMILES: c1ccc(-c2ccc(-c3nc(-c4ccccc4)nc(-c4cccc5c4oc4c(-c6ccc7c(c6)oc6ccccc67)cccc45)n3)cc2)cc1]
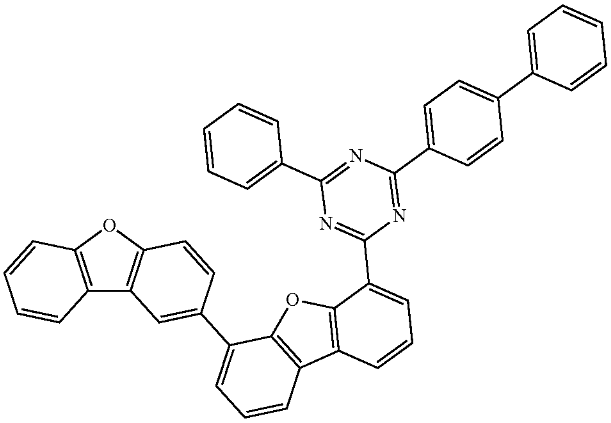 [SMILES: c1ccc(-c2ccc(-c3nc(-c4ccccc4)nc(-c4cccc5c4oc4c(-c6ccc7oc8ccccc8c7c6)cccc45)n3)cc2)cc1]
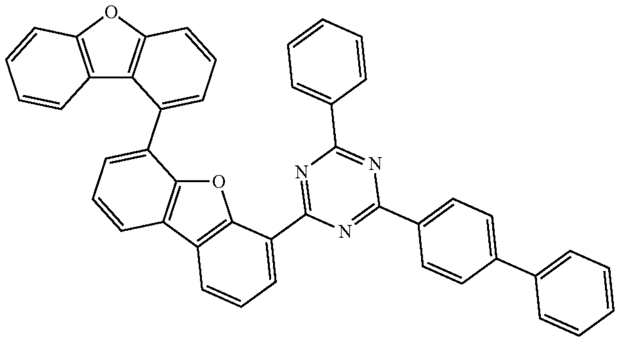 [SMILES: c1ccc(-c2ccc(-c3nc(-c4ccccc4)nc(-c4cccc5c4oc4c(-c6cccc7oc8ccccc8c67)cccc45)n3)cc2)cc1]
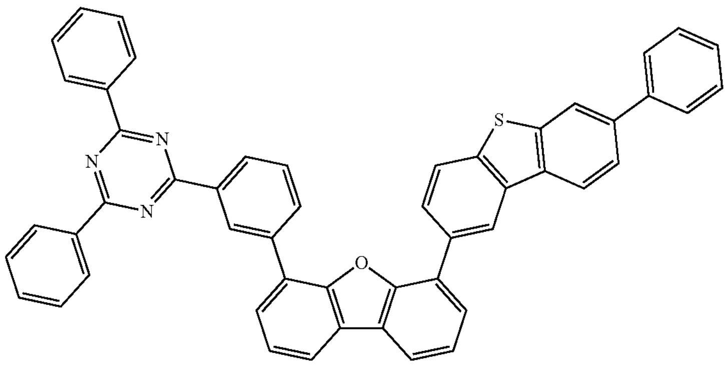 [SMILES: c1ccc(-c2ccc3c(c2)sc2ccc(-c4cccc5c4oc4c(-c6cccc(-c7nc(-c8ccccc8)nc(-c8ccccc8)n7)c6)cccc45)cc23)cc1]

TABLE 1-continued
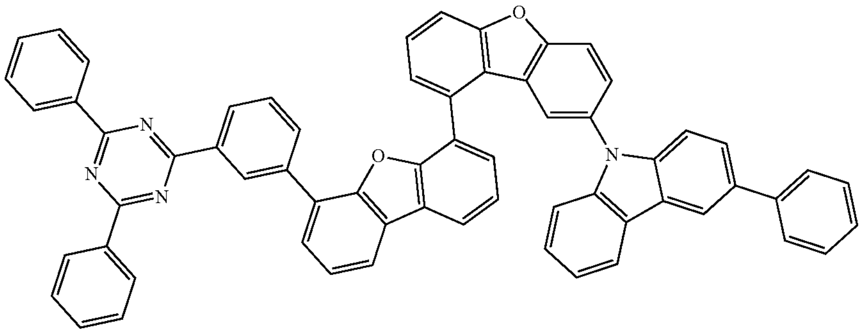 [SMILES: c1ccc(-c2ccc3c(c2)c2ccccc2n3-c2ccc3oc4cccc(-c5cccc6c5oc5c(-c7cccc(-c8nc(-c9ccccc9)nc(-c9ccccc9)n8)c7)cccc56)c4c3c2)cc1]
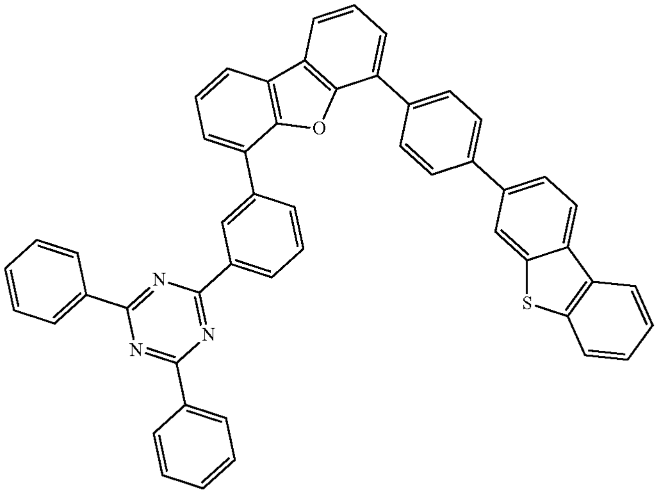 [SMILES: c1ccc(-c2nc(-c3ccccc3)nc(-c3cccc(-c4cccc5c4oc4c(-c6ccc(-c7ccc8c(c7)sc7ccccc78)cc6)cccc45)c3)n2)cc1]
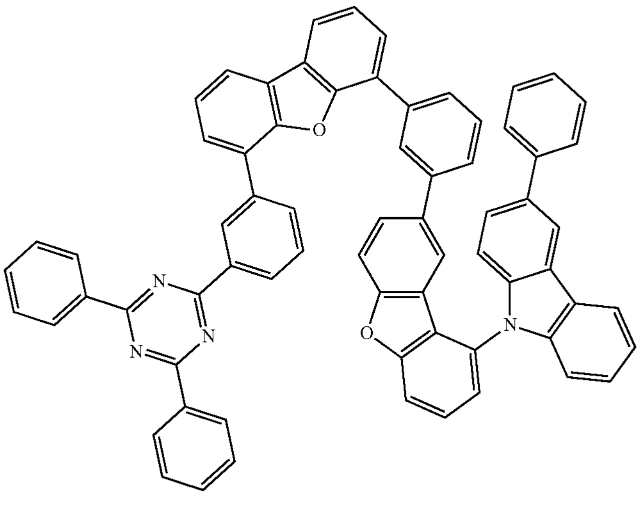 [SMILES: c1ccc(-c2ccc3c(c2)c2ccccc2n3-c2cccc3oc4ccc(-c5cccc(-c6cccc7c6oc6c(-c8cccc(-c9nc(-c%10ccccc%10)nc(-c%10ccccc%10)n9)c8)cccc67)c5)cc4c23)cc1]

TABLE 1-continued
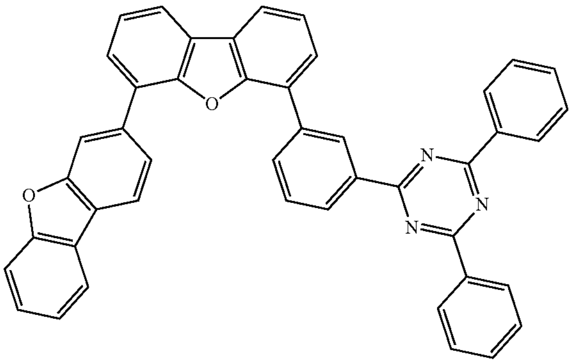 [SMILES: c1ccc(-c2nc(-c3ccccc3)nc(-c3cccc(-c4cccc5c4oc4c(-c6ccc7c(c6)oc6ccccc67)cccc45)c3)n2)cc1]
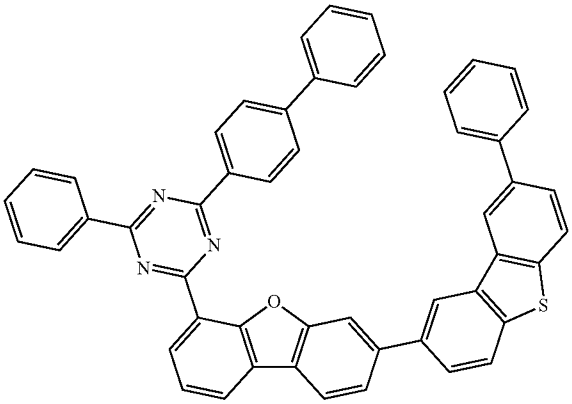 [SMILES: c1ccc(-c2ccc(-c3nc(-c4ccccc4)nc(-c4cccc5c4oc4cc(-c6ccc7sc8ccc(-c9ccccc9)cc8c7c6)ccc45)n3)cc2)cc1]
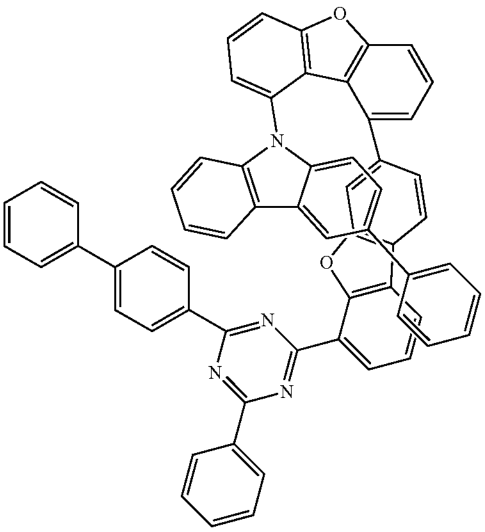 [SMILES: c1ccc(-c2ccc(-c3nc(-c4ccccc4)nc(-c4cccc5c4oc4cc(-c6cccc7oc8cccc(-n9c%10ccccc%10c%10cc(-c%11ccccc%11)ccc%109)c8c67)ccc45)n3)cc2)cc1]

TABLE 1-continued
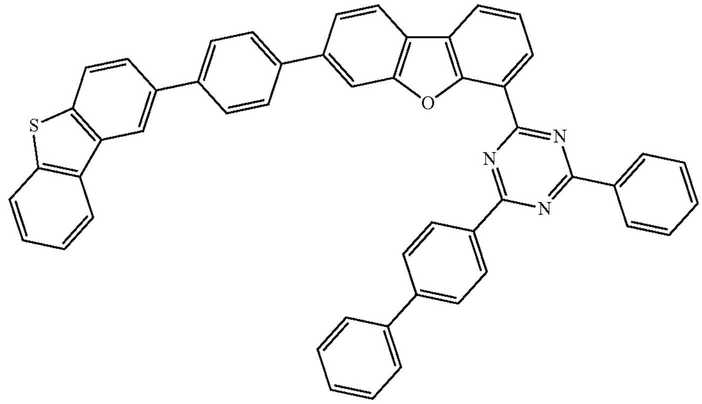 [SMILES: c1ccc(-c2ccc(-c3nc(-c4ccccc4)nc(-c4cccc5c4oc4cc(-c6ccc(-c7ccc8sc9ccccc9c8c7)cc6)ccc45)n3)cc2)cc1]
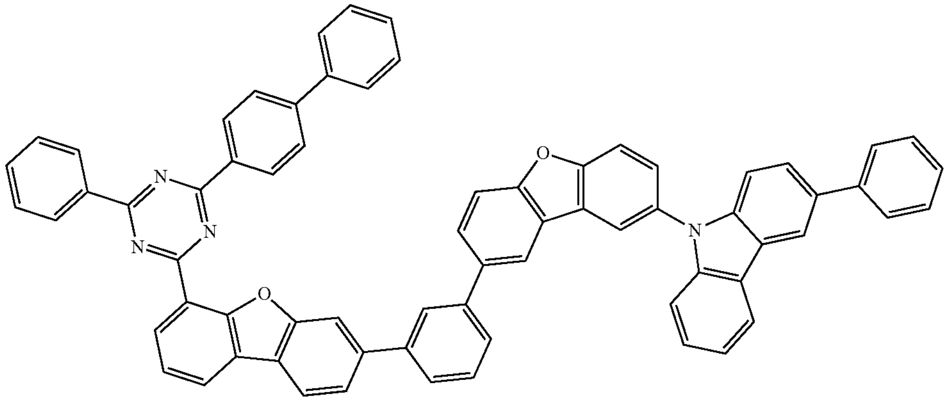 [SMILES: c1ccc(-c2ccc(-c3nc(-c4ccccc4)nc(-c4cccc5c4oc4cc(-c6cccc(-c7ccc8oc9ccc(-n%10c%11ccccc%11c%11cc(-c%12ccccc%12)ccc%11%10)cc9c8c7)c6)ccc45)n3)cc2)cc1]
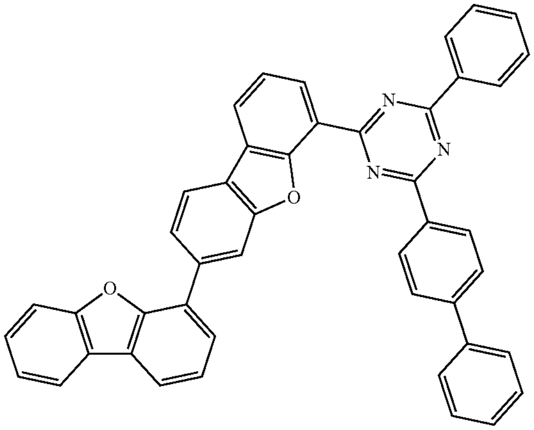 [SMILES: c1ccc(-c2ccc(-c3nc(-c4ccccc4)nc(-c4cccc5c4oc4cc(-c6cccc7c6oc6ccccc67)ccc45)n3)cc2)cc1]
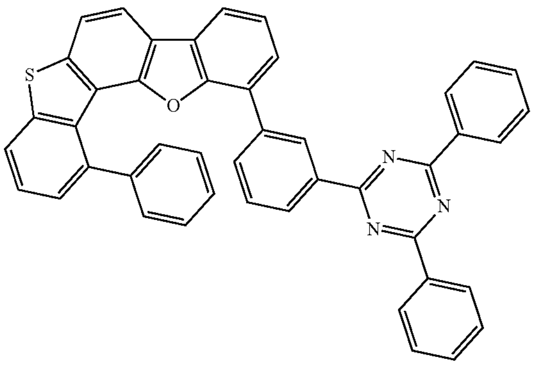 [SMILES: c1ccc(-c2nc(-c3ccccc3)nc(-c3cccc(-c4cccc5c4oc4c5ccc5sc6cccc(-c7ccccc7)c6c54)c3)n2)cc1]

TABLE 1-continued
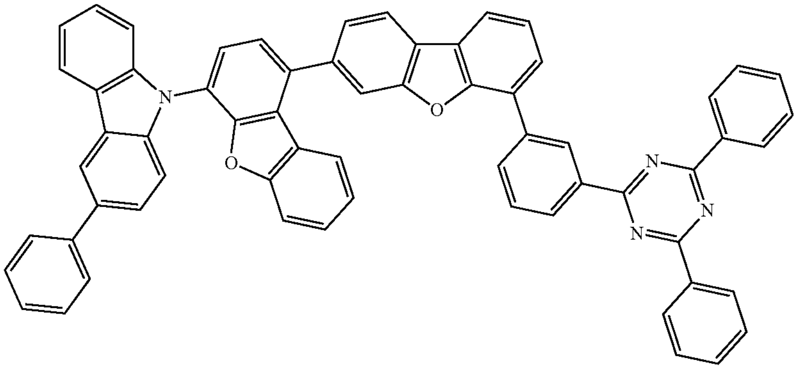 [SMILES: c1ccc(-c2ccc3c(c2)c2ccccc2n3-c2ccc(-c3ccc4c(c3)oc3c(-c5cccc(-c6nc(-c7ccccc7)nc(-c7ccccc7)n6)c5)cccc34)c3c2oc2ccccc23)cc1]
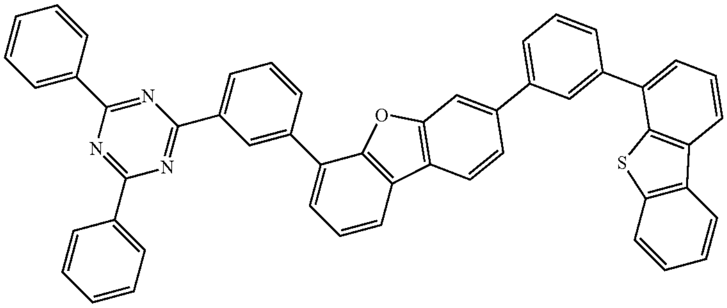 [SMILES: c1ccc(-c2nc(-c3ccccc3)nc(-c3cccc(-c4cccc5c4oc4cc(-c6cccc(-c7cccc8c7sc7ccccc78)c6)ccc45)c3)n2)cc1]
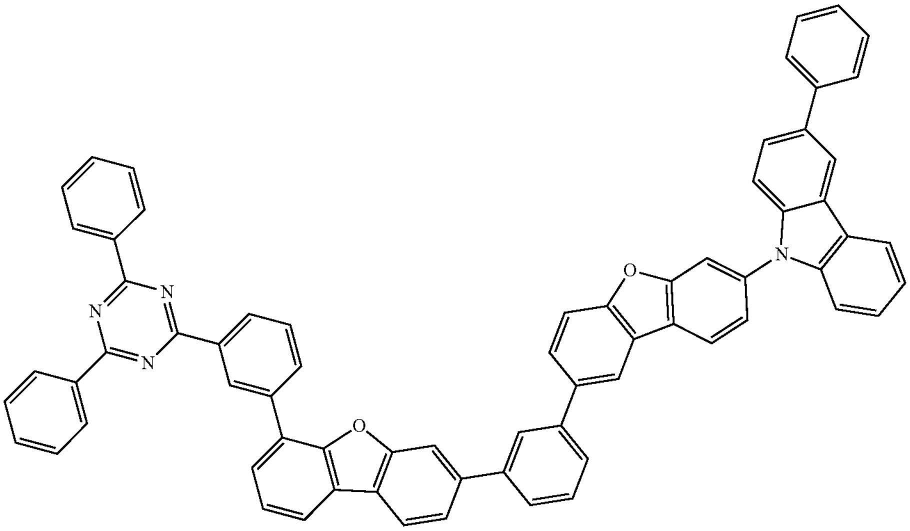 [SMILES: c1ccc(-c2ccc3c(c2)c2ccccc2n3-c2ccc3c(c2)oc2ccc(-c4cccc(-c5ccc6c(c5)oc5c(-c7cccc(-c8nc(-c9ccccc9)nc(-c9ccccc9)n8)c7)cccc56)c4)cc23)cc1]
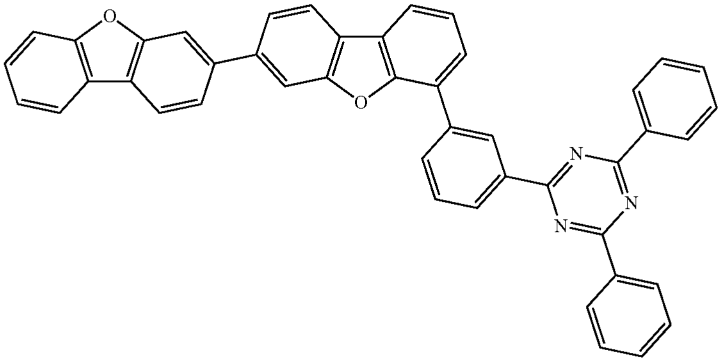 [SMILES: c1ccc(-c2nc(-c3ccccc3)nc(-c3cccc(-c4cccc5c4oc4cc(-c6ccc7c(c6)oc6ccccc67)ccc45)c3)n2)cc1]

TABLE 1-continued
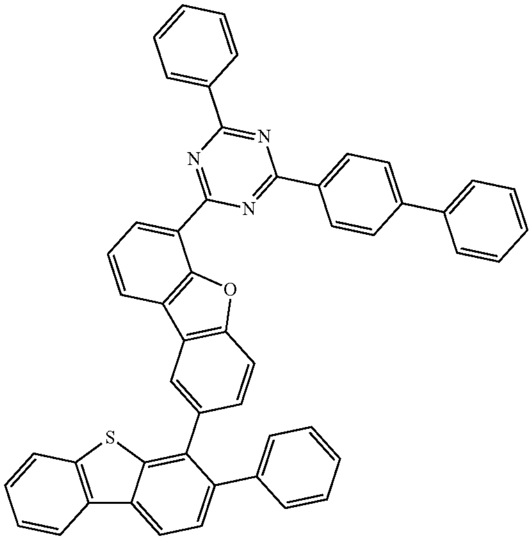 [SMILES: c1ccc(-c2ccc(-c3nc(-c4ccccc4)nc(-c4cccc5c4oc4ccc(-c6c(-c7ccccc7)ccc7c6sc6ccccc67)cc45)n3)cc2)cc1]
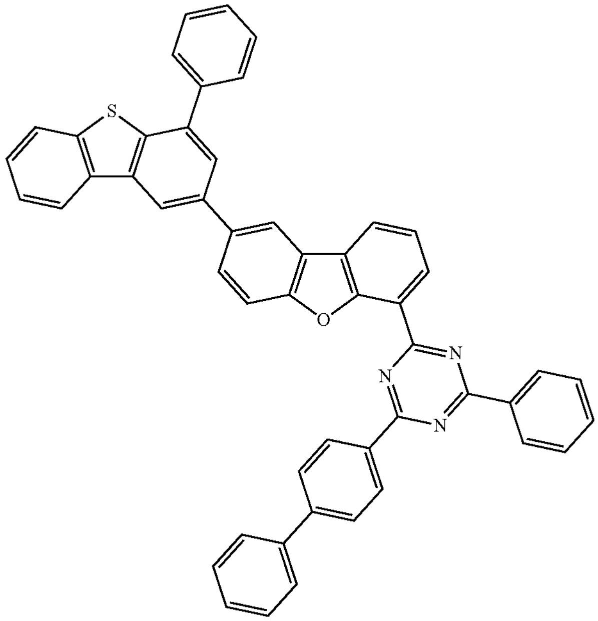 [SMILES: c1ccc(-c2ccc(-c3nc(-c4ccccc4)nc(-c4cccc5c4oc4ccc(-c6cc(-c7ccccc7)c7sc8ccccc8c7c6)cc45)n3)cc2)cc1]
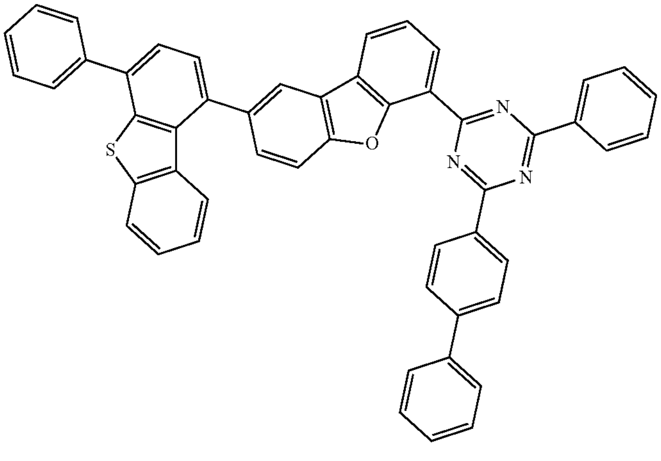 [SMILES: c1ccc(-c2ccc(-c3nc(-c4ccccc4)nc(-c4cccc5c4oc4ccc(-c6ccc(-c7ccccc7)c7sc8ccccc8c67)cc45)n3)cc2)cc1]

TABLE 1-continued
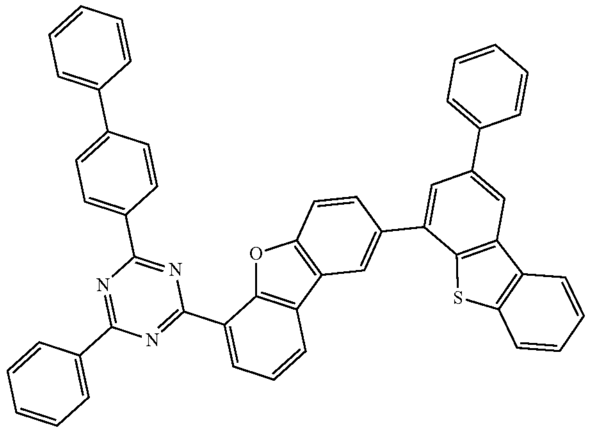 [SMILES: c1ccc(-c2ccc(-c3nc(-c4ccccc4)nc(-c4cccc5c4oc4ccc(-c6cc(-c7ccccc7)cc7c6sc6ccccc67)cc45)n3)cc2)cc1]
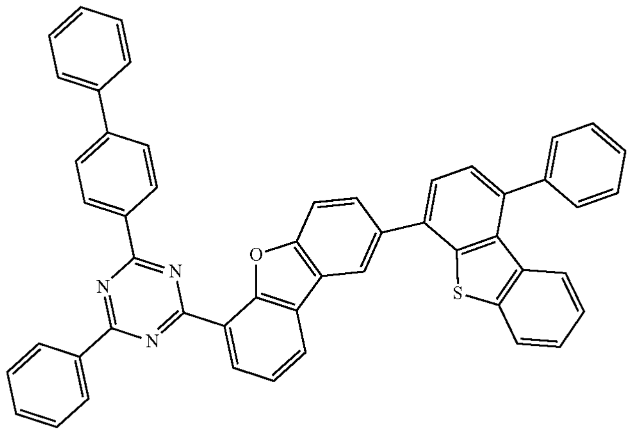 [SMILES: c1ccc(-c2ccc(-c3nc(-c4ccccc4)nc(-c4cccc5c4oc4ccc(-c6ccc(-c7ccccc7)c7c6sc6ccccc67)cc45)n3)cc2)cc1]
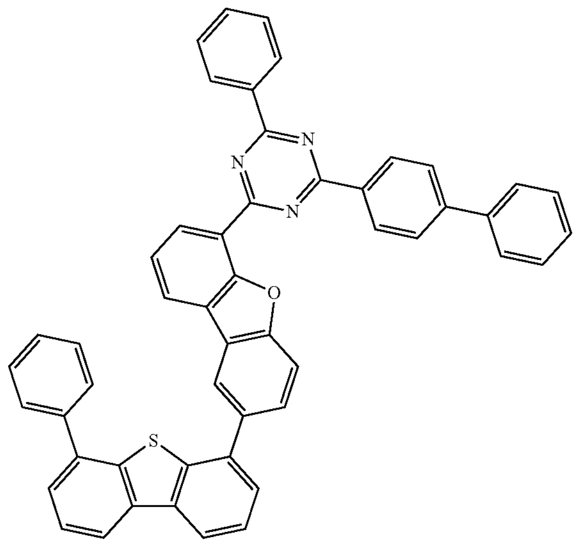 [SMILES: c1ccc(-c2ccc(-c3nc(-c4ccccc4)nc(-c4cccc5c4oc4ccc(-c6cccc7c6sc6c(-c8ccccc8)cccc67)cc45)n3)cc2)cc1]

TABLE 1-continued
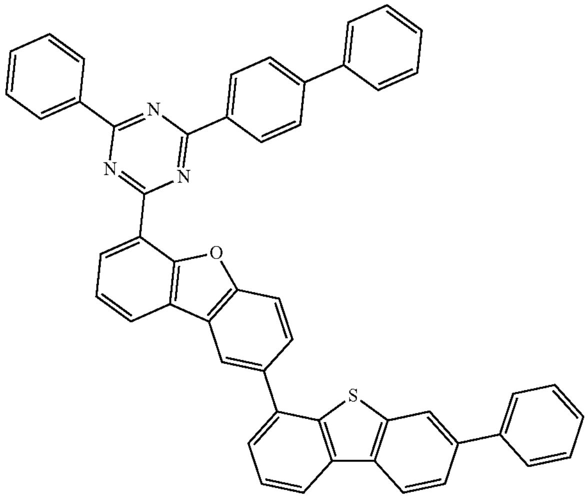 [SMILES: c1ccc(-c2ccc(-c3nc(-c4ccccc4)nc(-c4cccc5c4oc4ccc(-c6cccc7c6sc6cc(-c8ccccc8)ccc67)cc45)n3)cc2)cc1]
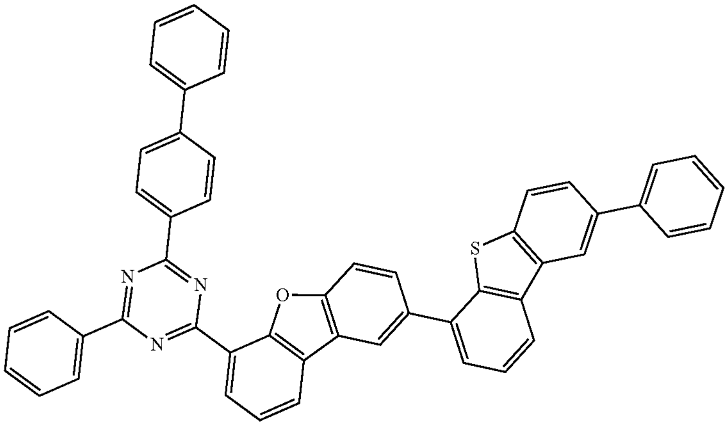 [SMILES: c1ccc(-c2ccc(-c3nc(-c4ccccc4)nc(-c4cccc5c4oc4ccc(-c6cccc7c6sc6ccc(-c8ccccc8)cc67)cc45)n3)cc2)cc1]
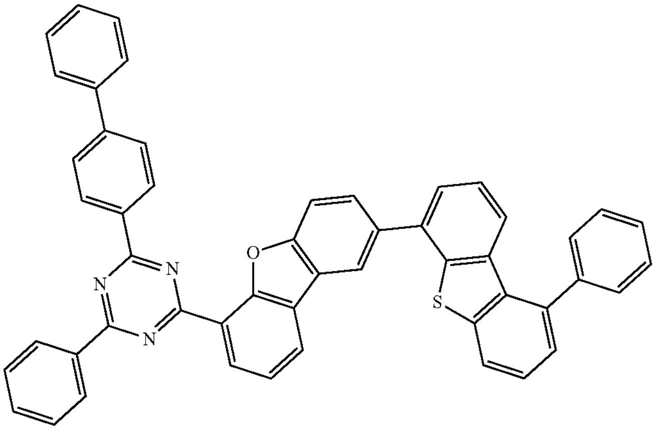 [SMILES: c1ccc(-c2ccc(-c3nc(-c4ccccc4)nc(-c4cccc5c4oc4ccc(-c6cccc7c6sc6cccc(-c8ccccc8)c67)cc45)n3)cc2)cc1]

TABLE 1-continued
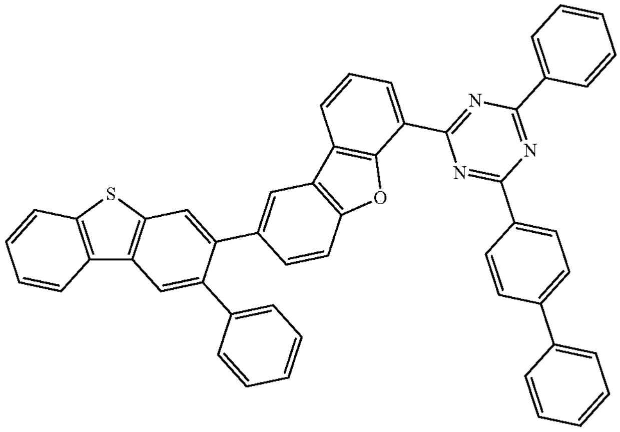 [SMILES: c1ccc(-c2ccc(-c3nc(-c4ccccc4)nc(-c4cccc5c4oc4ccc(-c6cc7sc8ccccc8c7cc6-c6ccccc6)cc45)n3)cc2)cc1]
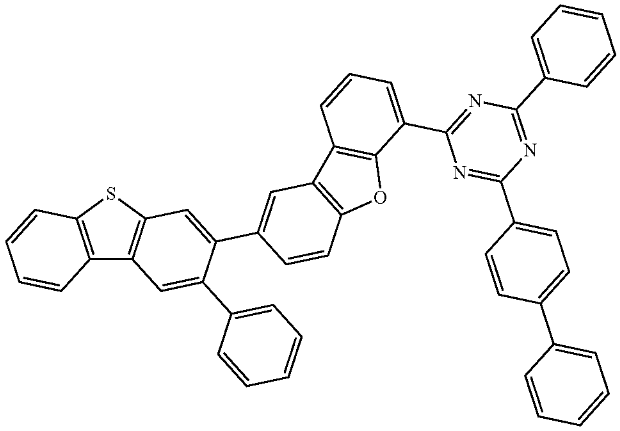 [SMILES: c1ccc(-c2ccc(-c3nc(-c4ccccc4)nc(-c4cccc5c4oc4ccc(-c6cc7sc8ccccc8c7cc6-c6ccccc6)cc45)n3)cc2)cc1]
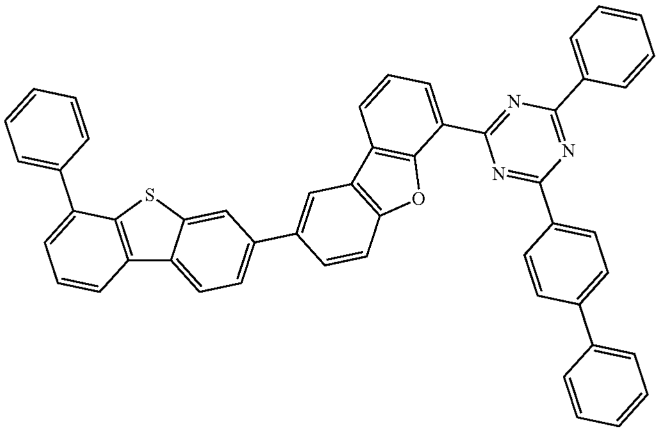 [SMILES: c1ccc(-c2ccc(-c3nc(-c4ccccc4)nc(-c4cccc5c4oc4ccc(-c6ccc7c(c6)sc6c(-c8ccccc8)cccc67)cc45)n3)cc2)cc1]

TABLE 1-continued
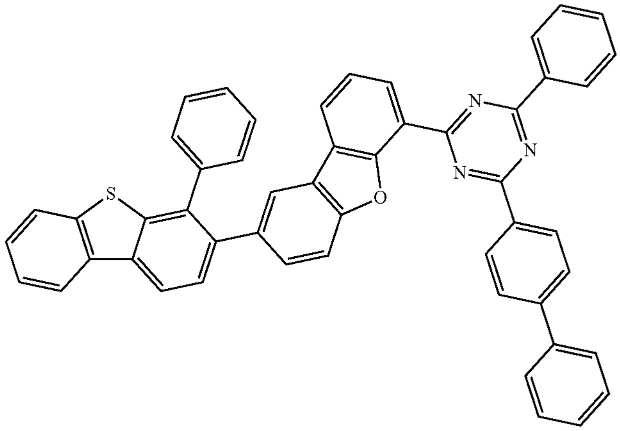 [SMILES: c1ccc(-c2ccc(-c3nc(-c4ccccc4)nc(-c4cccc5c4oc4ccc(-c6ccc7c(sc8ccccc87)c6-c6ccccc6)cc45)n3)cc2)cc1]
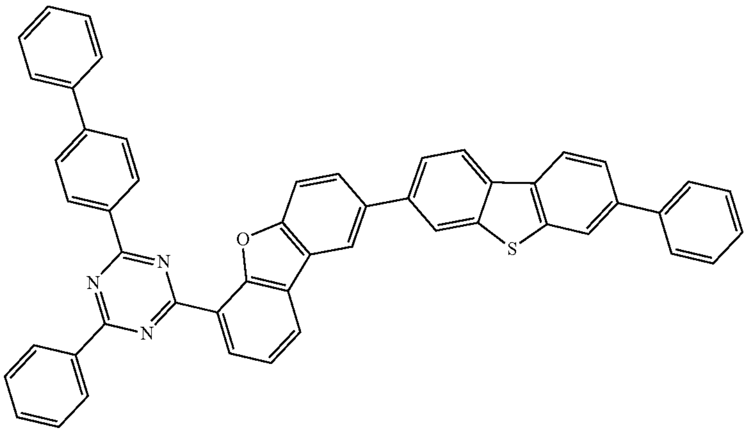 [SMILES: c1ccc(-c2ccc(-c3nc(-c4ccccc4)nc(-c4cccc5c4oc4ccc(-c6ccc7c(c6)sc6cc(-c8ccccc8)ccc67)cc45)n3)cc2)cc1]
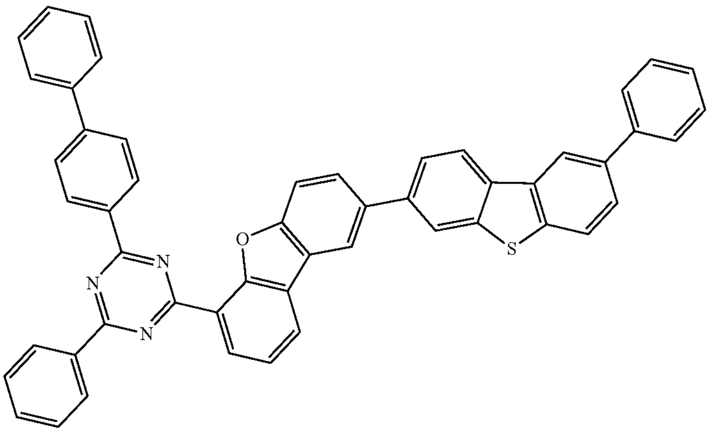 [SMILES: c1ccc(-c2ccc(-c3nc(-c4ccccc4)nc(-c4cccc5c4oc4ccc(-c6ccc7c(c6)sc6ccc(-c8ccccc8)cc67)cc45)n3)cc2)cc1]

TABLE 1-continued
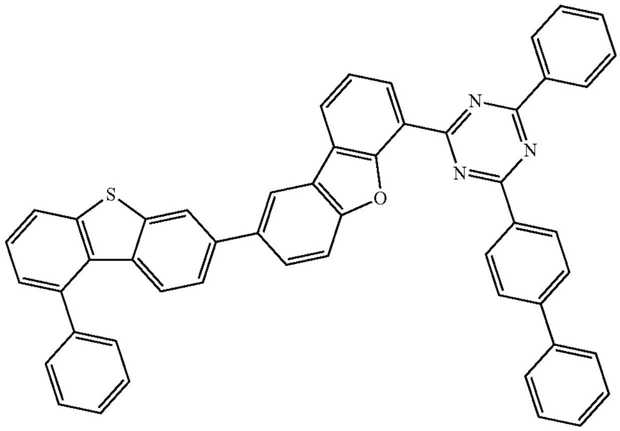 [SMILES: c1ccc(-c2ccc(-c3nc(-c4ccccc4)nc(-c4cccc5c4oc4ccc(-c6ccc7c(c6)sc6cccc(-c8ccccc8)c67)cc45)n3)cc2)cc1]
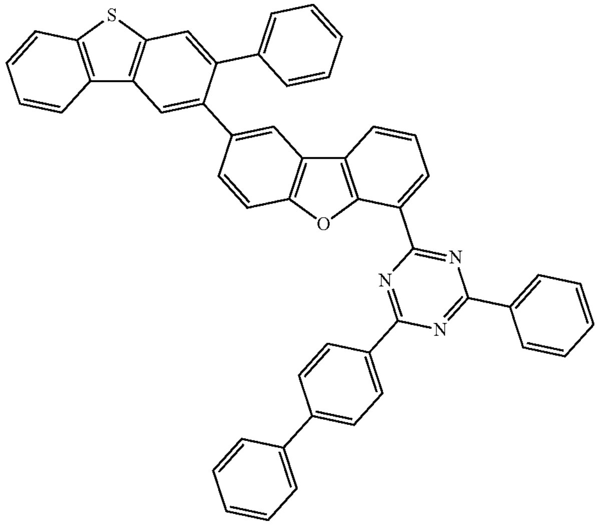 [SMILES: c1ccc(-c2ccc(-c3nc(-c4ccccc4)nc(-c4cccc5c4oc4ccc(-c6cc7c(cc6-c6ccccc6)sc6ccccc67)cc45)n3)cc2)cc1]
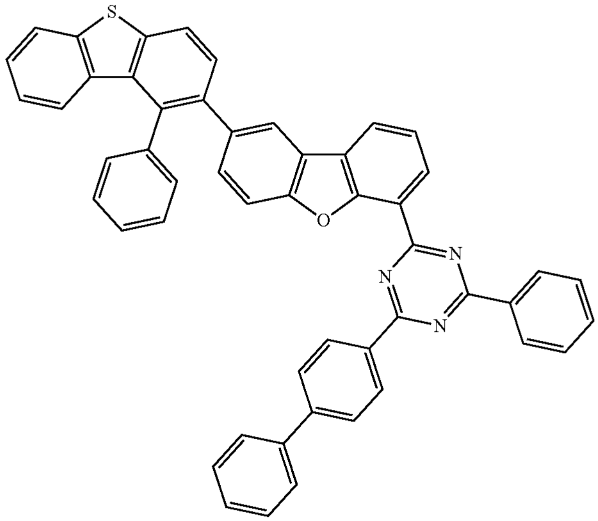 [SMILES: c1ccc(-c2ccc(-c3nc(-c4ccccc4)nc(-c4cccc5c4oc4ccc(-c6ccc7sc8ccccc8c7c6-c6ccccc6)cc45)n3)cc2)cc1]

TABLE 1-continued
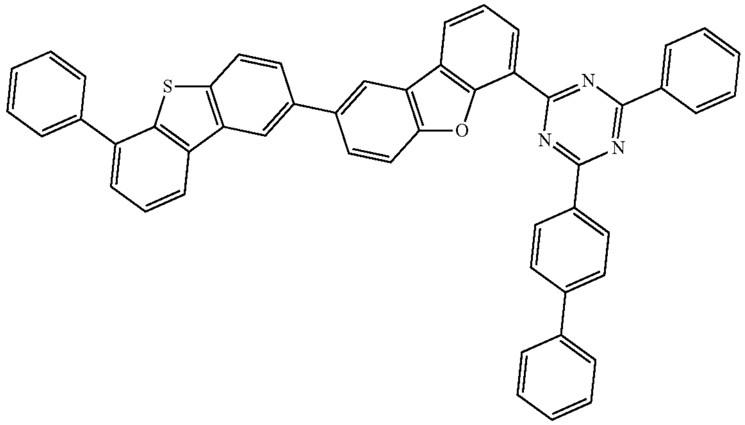 [SMILES: c1ccc(-c2ccc(-c3nc(-c4ccccc4)nc(-c4cccc5c4oc4ccc(-c6ccc7sc8c(-c9ccccc9)cccc8c7c6)cc45)n3)cc2)cc1]
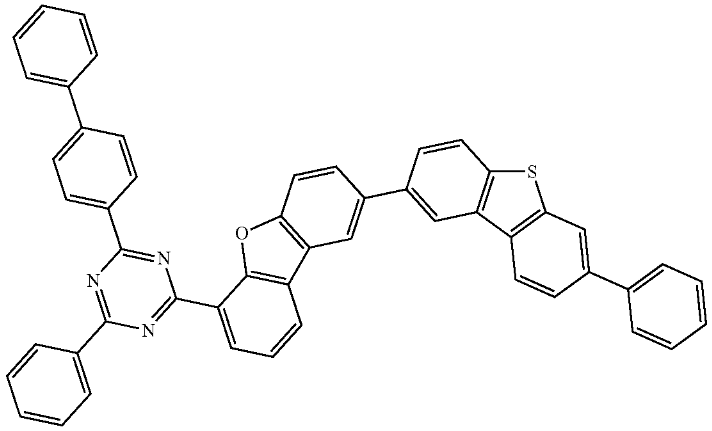 [SMILES: c1ccc(-c2ccc(-c3nc(-c4ccccc4)nc(-c4cccc5c4oc4ccc(-c6ccc7sc8cc(-c9ccccc9)ccc8c7c6)cc45)n3)cc2)cc1]
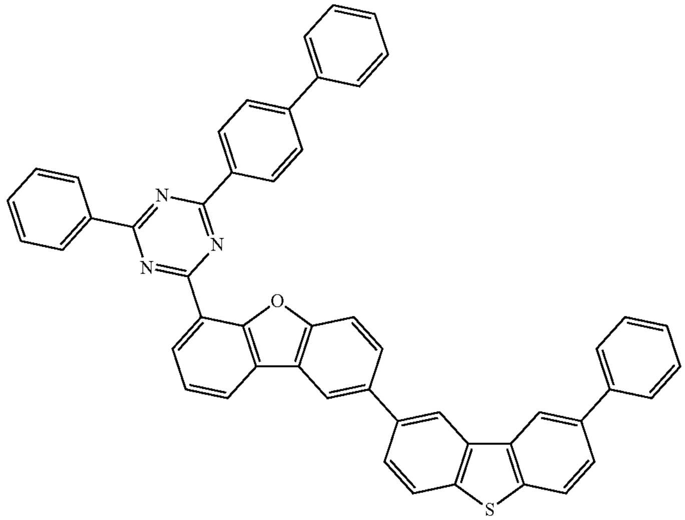 [SMILES: c1ccc(-c2ccc(-c3nc(-c4ccccc4)nc(-c4cccc5c4oc4ccc(-c6ccc7sc8ccc(-c9ccccc9)cc8c7c6)cc45)n3)cc2)cc1]

TABLE 1-continued
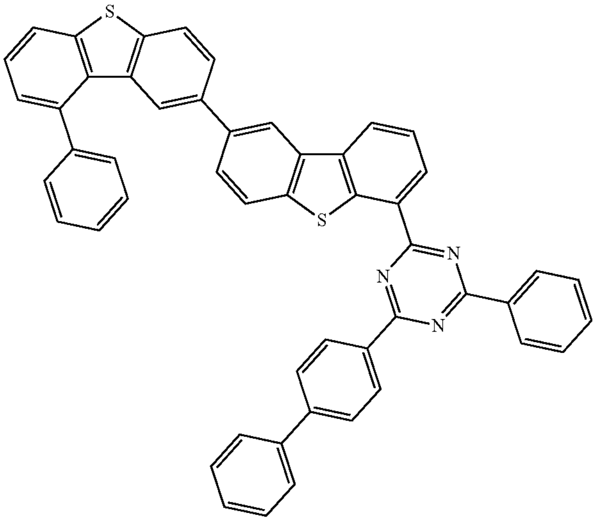 [SMILES: c1ccc(-c2ccc(-c3nc(-c4ccccc4)nc(-c4cccc5c4sc4ccc(-c6ccc7sc8cccc(-c9ccccc9)c8c7c6)cc45)n3)cc2)cc1]
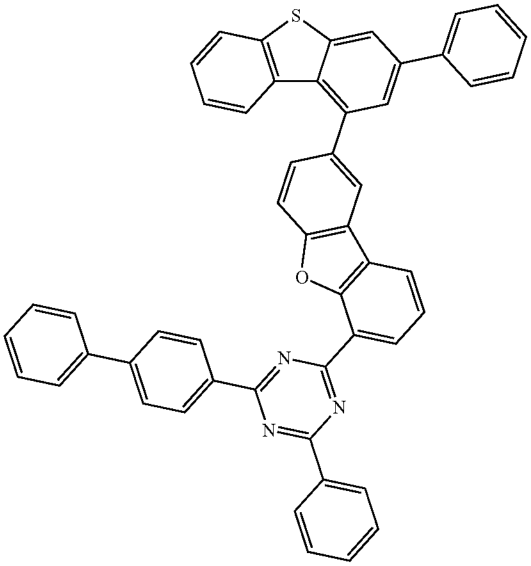 [SMILES: c1ccc(-c2ccc(-c3nc(-c4ccccc4)nc(-c4cccc5c4oc4ccc(-c6cc(-c7ccccc7)cc7sc8ccccc8c67)cc45)n3)cc2)cc1]
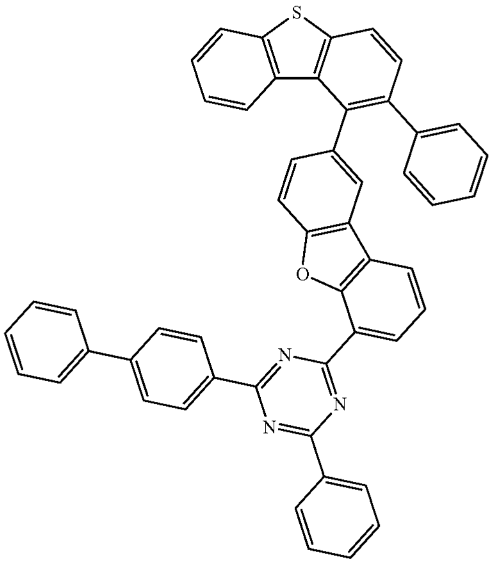 [SMILES: c1ccc(-c2ccc(-c3nc(-c4ccccc4)nc(-c4cccc5c4oc4ccc(-c6c(-c7ccccc7)ccc7sc8ccccc8c67)cc45)n3)cc2)cc1]

TABLE 1-continued
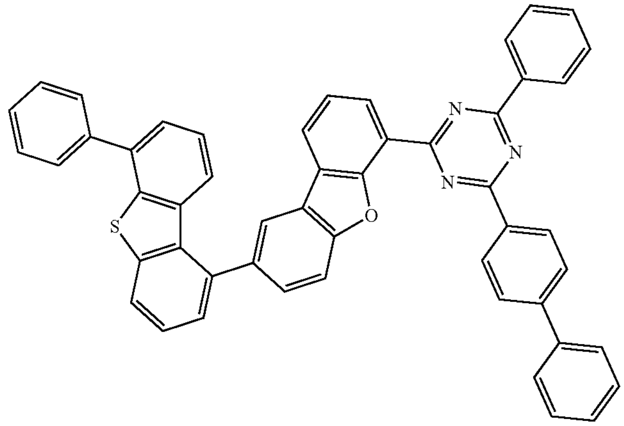 [SMILES: c1ccc(-c2ccc(-c3nc(-c4ccccc4)nc(-c4cccc5c4oc4ccc(-c6cccc7sc8c(-c9ccccc9)cccc8c67)cc45)n3)cc2)cc1]
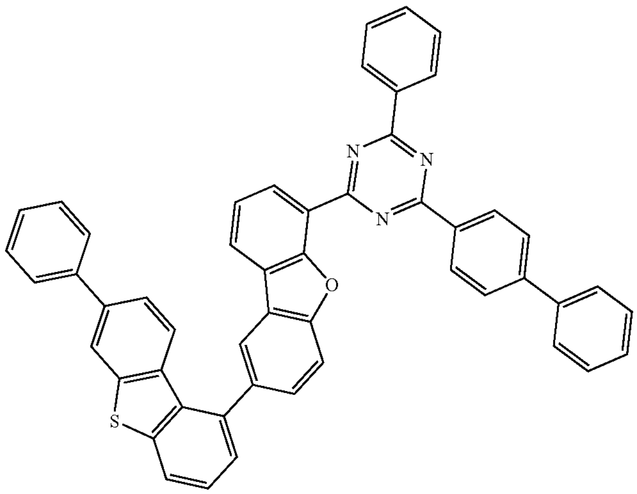 [SMILES: c1ccc(-c2ccc(-c3nc(-c4ccccc4)nc(-c4cccc5c4oc4ccc(-c6cccc7sc8cc(-c9ccccc9)ccc8c67)cc45)n3)cc2)cc1]
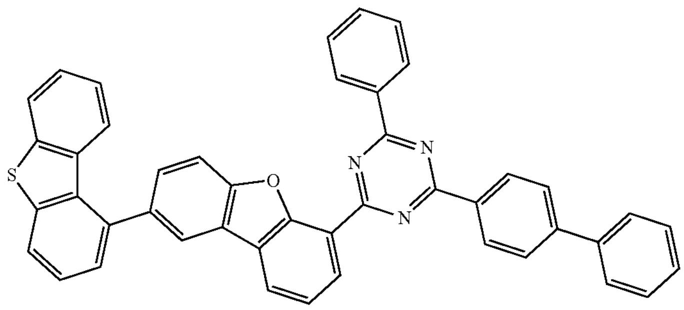 [SMILES: c1ccc(-c2ccc(-c3nc(-c4ccccc4)nc(-c4cccc5c4oc4ccc(-c6cccc7sc8ccccc8c67)cc45)n3)cc2)cc1]

TABLE 1-continued
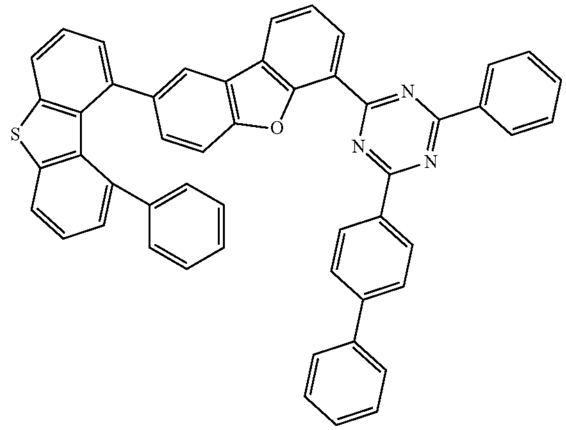 [SMILES: c1ccc(-c2ccc(-c3nc(-c4ccccc4)nc(-c4cccc5c4oc4ccc(-c6cccc7sc8cccc(-c9ccccc9)c8c67)cc45)n3)cc2)cc1]
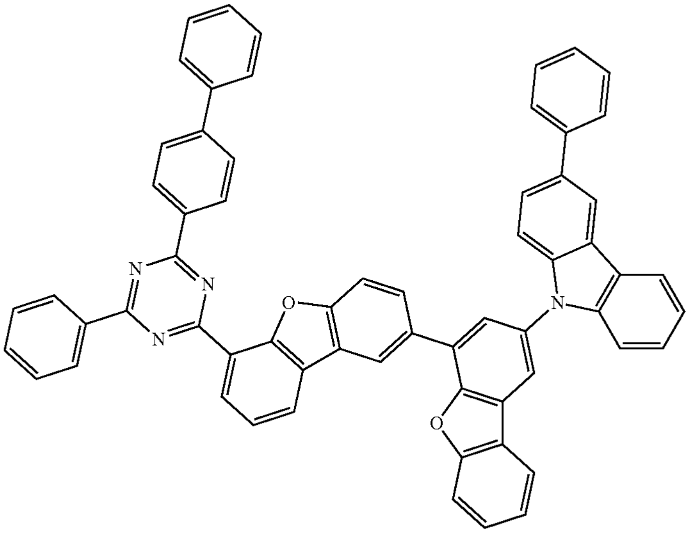 [SMILES: c1ccc(-c2ccc(-c3nc(-c4ccccc4)nc(-c4cccc5c4oc4ccc(-c6cc(-n7c8ccccc8c8cc(-c9ccccc9)ccc87)cc7c6oc6ccccc67)cc45)n3)cc2)cc1]
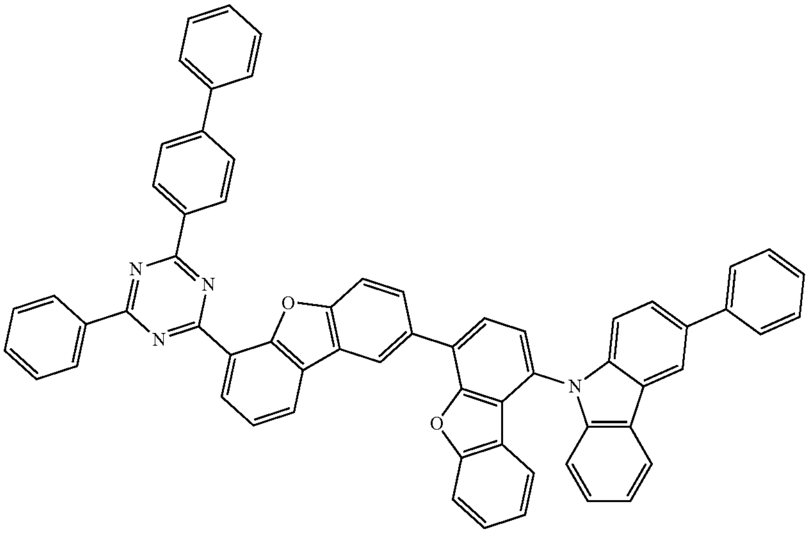 [SMILES: c1ccc(-c2ccc(-c3nc(-c4ccccc4)nc(-c4cccc5c4oc4ccc(-c6ccc(-n7c8ccccc8c8cc(-c9ccccc9)ccc87)c7c6oc6ccccc67)cc45)n3)cc2)cc1]

TABLE 1-continued
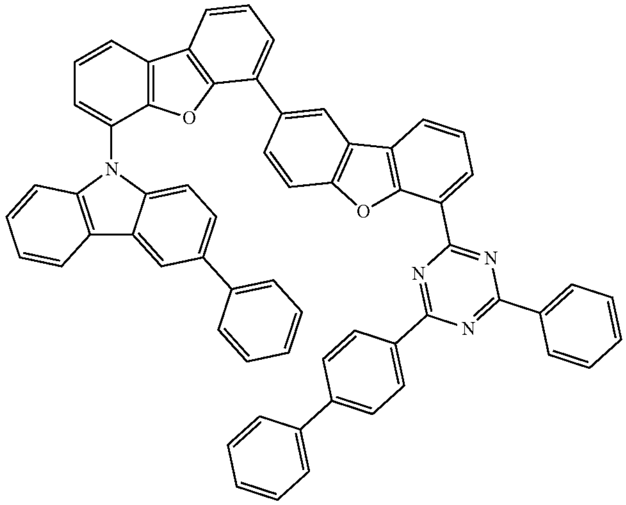 [SMILES: c1ccc(-c2ccc(-c3nc(-c4ccccc4)nc(-c4cccc5c4oc4ccc(-c6cccc7c6oc6c(-n8c9ccccc9c9cc(-c%10ccccc%10)ccc98)cccc67)cc45)n3)cc2)cc1]
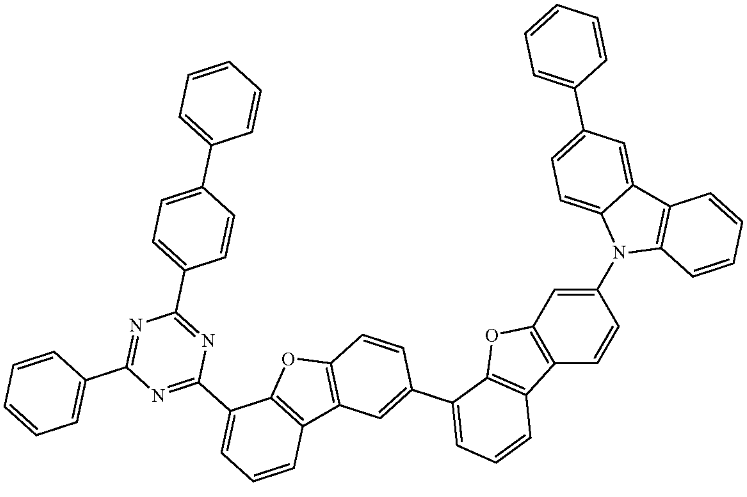 [SMILES: c1ccc(-c2ccc(-c3nc(-c4ccccc4)nc(-c4cccc5c4oc4ccc(-c6cccc7c6oc6cc(-n8c9ccccc9c9cc(-c%10ccccc%10)ccc98)ccc67)cc45)n3)cc2)cc1]
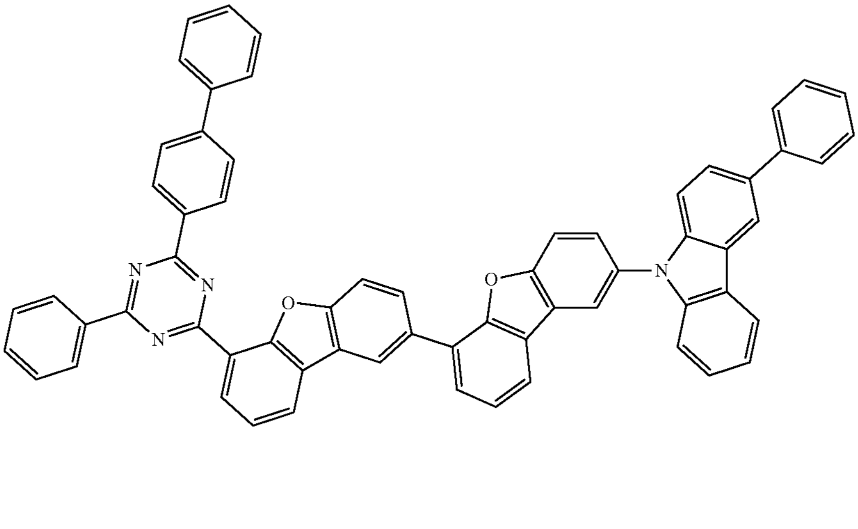 [SMILES: c1ccc(-c2ccc(-c3nc(-c4ccccc4)nc(-c4cccc5c4oc4ccc(-c6cccc7c6oc6ccc(-n8c9ccccc9c9cc(-c%10ccccc%10)ccc98)cc67)cc45)n3)cc2)cc1]

TABLE 1-continued
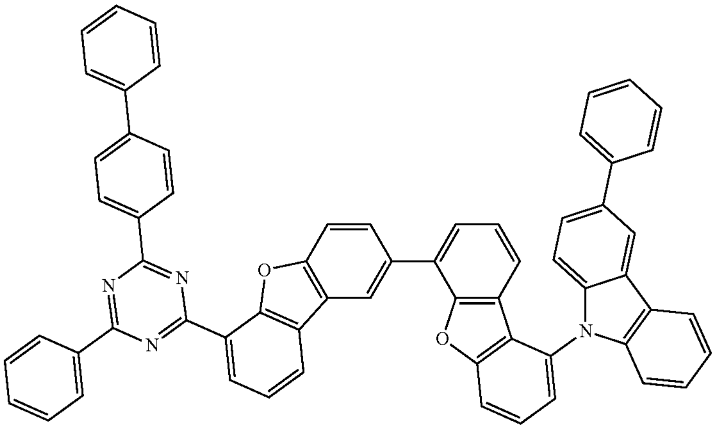 [SMILES: c1ccc(-c2ccc(-c3nc(-c4ccccc4)nc(-c4cccc5c4oc4ccc(-c6cccc7c6oc6cccc(-n8c9ccccc9c9cc(-c%10ccccc%10)ccc98)c67)cc45)n3)cc2)cc1]
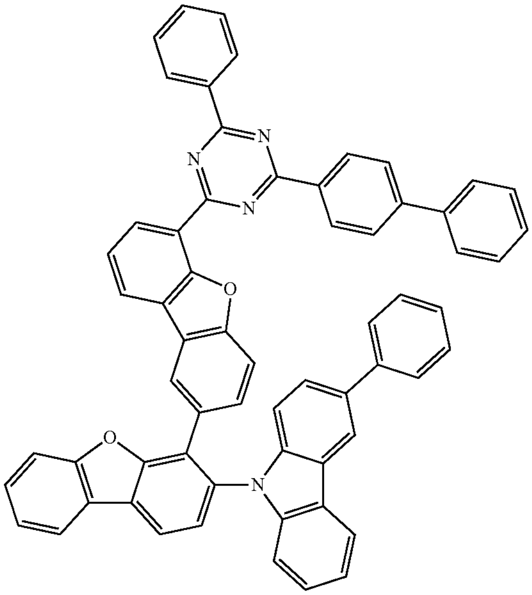 [SMILES: c1ccc(-c2ccc(-c3nc(-c4ccccc4)nc(-c4cccc5c4oc4ccc(-c6c(-n7c8ccccc8c8cc(-c9ccccc9)ccc87)ccc7c6oc6ccccc67)cc45)n3)cc2)cc1]
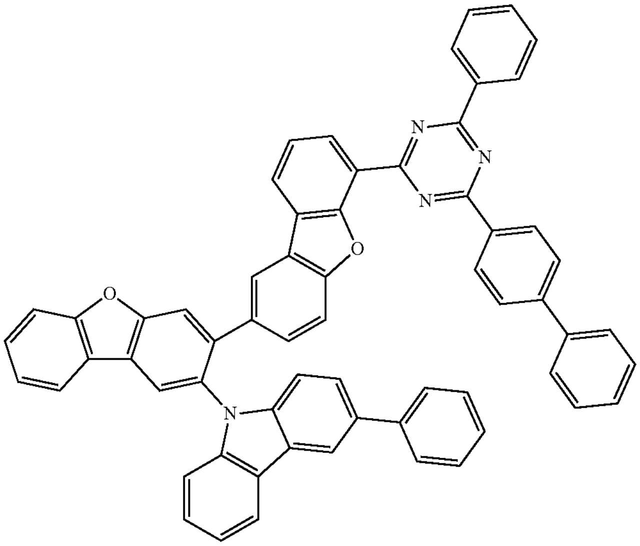 [SMILES: c1ccc(-c2ccc(-c3nc(-c4ccccc4)nc(-c4cccc5c4oc4ccc(-c6cc7oc8ccccc8c7cc6-n6c7ccccc7c7cc(-c8ccccc8)ccc76)cc45)n3)cc2)cc1]

TABLE 1-continued
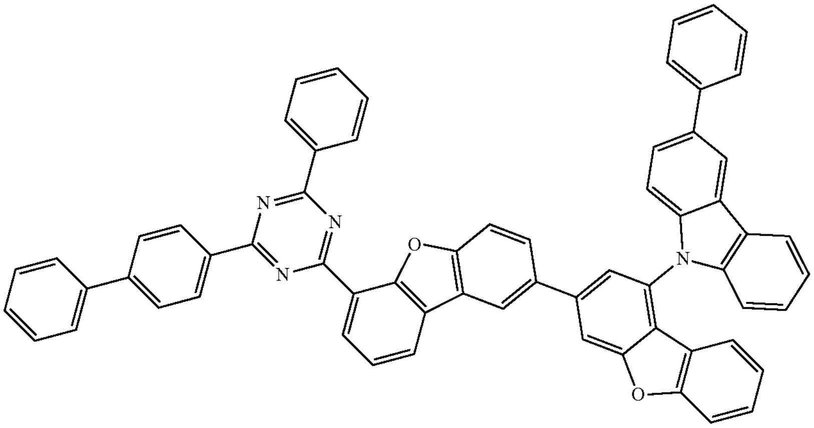 [SMILES: c1ccc(-c2ccc(-c3nc(-c4ccccc4)nc(-c4cccc5c4oc4ccc(-c6cc(-n7c8ccccc8c8cc(-c9ccccc9)ccc87)c7c(c6)oc6ccccc67)cc45)n3)cc2)cc1]
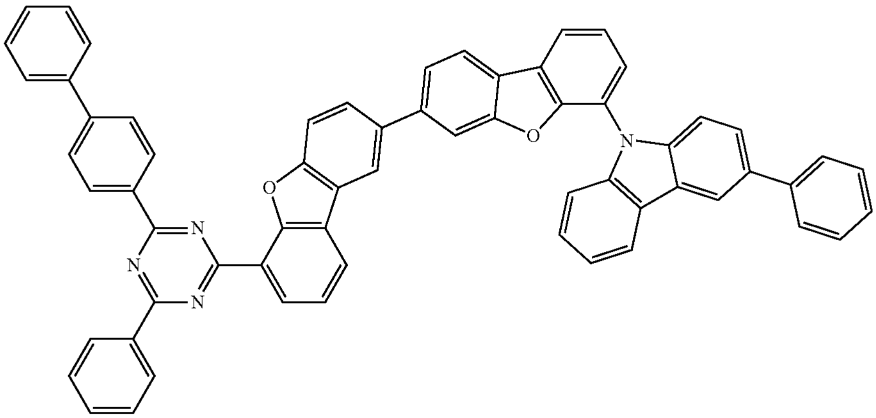 [SMILES: c1ccc(-c2ccc(-c3nc(-c4ccccc4)nc(-c4cccc5c4oc4ccc(-c6ccc7c(c6)oc6c(-n8c9ccccc9c9cc(-c%10ccccc%10)ccc98)cccc67)cc45)n3)cc2)cc1]
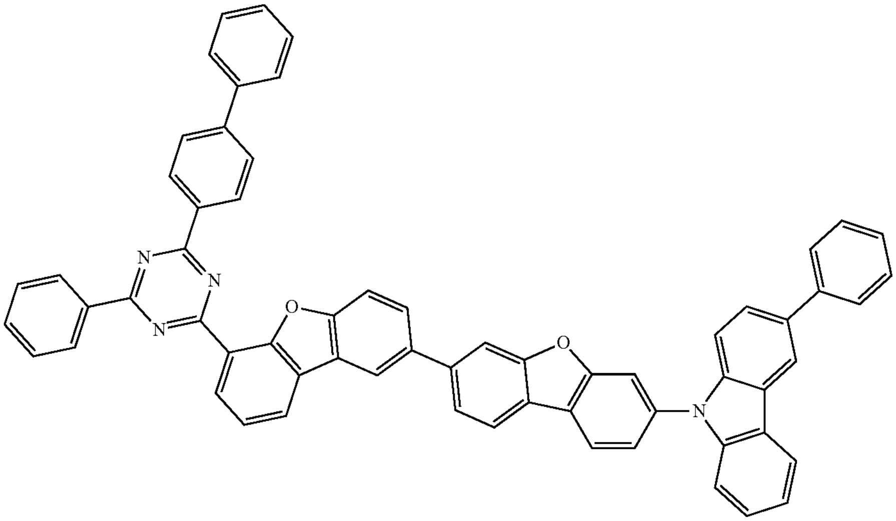 [SMILES: c1ccc(-c2ccc(-c3nc(-c4ccccc4)nc(-c4cccc5c4oc4ccc(-c6ccc7c(c6)oc6cc(-n8c9ccccc9c9cc(-c%10ccccc%10)ccc98)ccc67)cc45)n3)cc2)cc1]

TABLE 1-continued
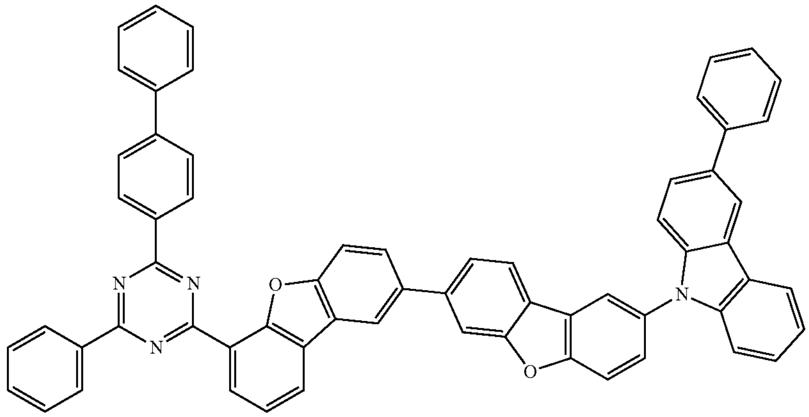 [SMILES: c1ccc(-c2ccc(-c3nc(-c4ccccc4)nc(-c4cccc5c4oc4ccc(-c6ccc7c(c6)oc6ccc(-n8c9ccccc9c9cc(-c%10ccccc%10)ccc98)cc67)cc45)n3)cc2)cc1]
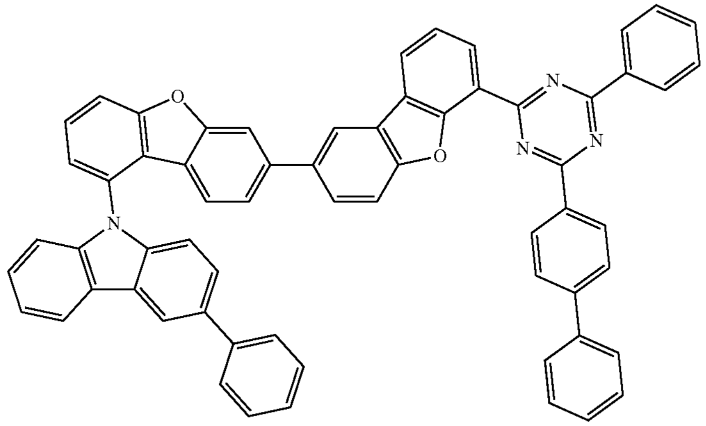 [SMILES: c1ccc(-c2ccc(-c3nc(-c4ccccc4)nc(-c4cccc5c4oc4ccc(-c6ccc7c(c6)oc6cccc(-n8c9ccccc9c9cc(-c%10ccccc%10)ccc98)c67)cc45)n3)cc2)cc1]
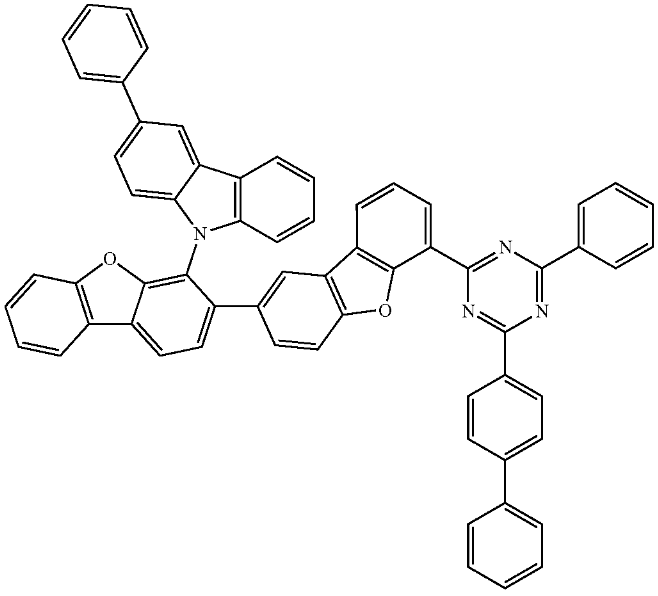 [SMILES: c1ccc(-c2ccc(-c3nc(-c4ccccc4)nc(-c4cccc5c4oc4ccc(-c6ccc7c(oc8ccccc87)c6-n6c7ccccc7c7cc(-c8ccccc8)ccc76)cc45)n3)cc2)cc1]

TABLE 1-continued
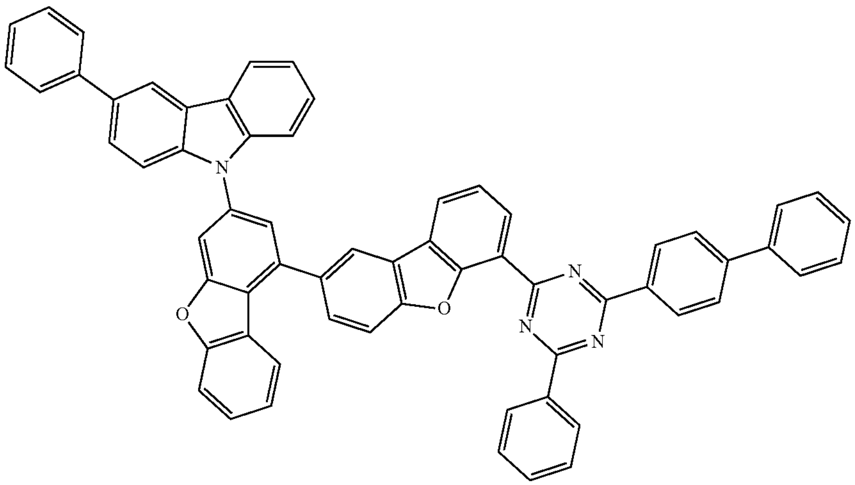 [SMILES: c1ccc(-c2ccc(-c3nc(-c4ccccc4)nc(-c4cccc5c4oc4ccc(-c6cc(-n7c8ccccc8c8cc(-c9ccccc9)ccc87)cc7oc8ccccc8c67)cc45)n3)cc2)cc1]
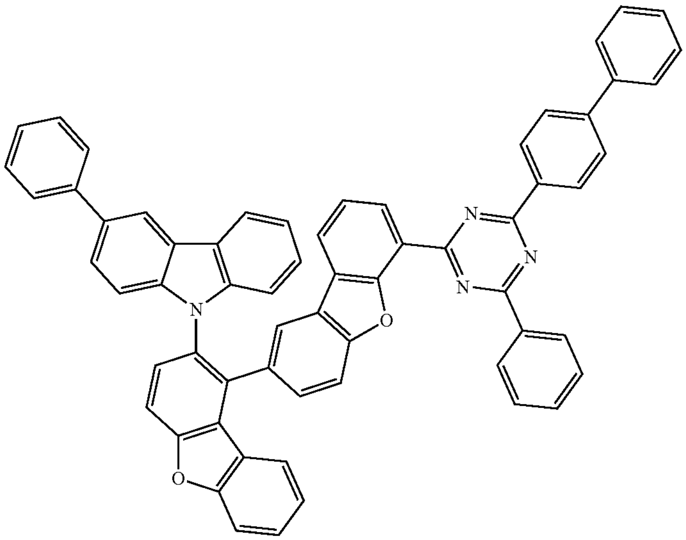 [SMILES: c1ccc(-c2ccc(-c3nc(-c4ccccc4)nc(-c4cccc5c4oc4ccc(-c6c(-n7c8ccccc8c8cc(-c9ccccc9)ccc87)ccc7oc8ccccc8c67)cc45)n3)cc2)cc1]
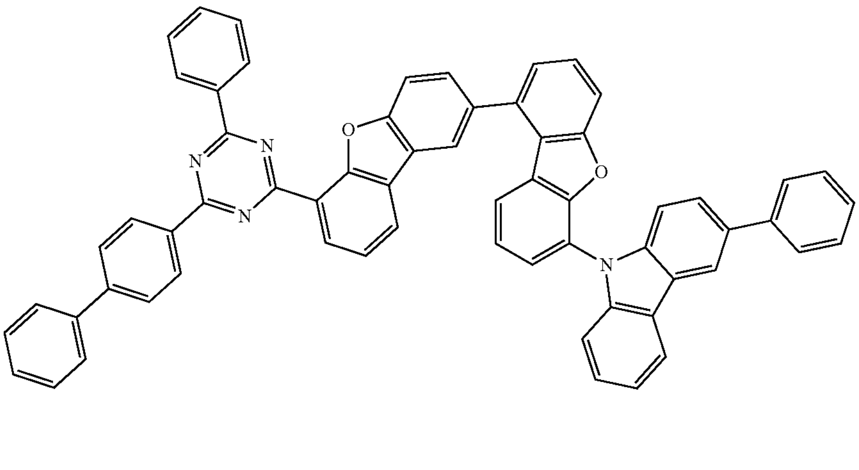 [SMILES: c1ccc(-c2ccc(-c3nc(-c4ccccc4)nc(-c4cccc5c4oc4ccc(-c6cccc7oc8c(-n9c%10ccccc%10c%10cc(-c%11ccccc%11)ccc%109)cccc8c67)cc45)n3)cc2)cc1]

TABLE 1-continued
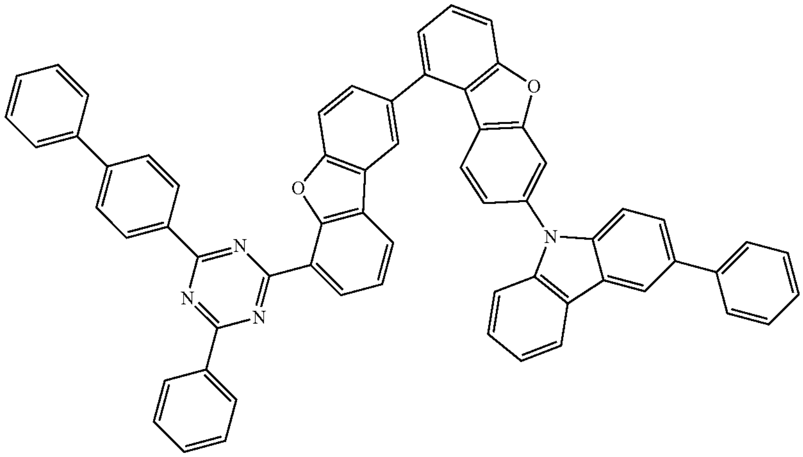 [SMILES: c1ccc(-c2ccc(-c3nc(-c4ccccc4)nc(-c4cccc5c4oc4ccc(-c6cccc7oc8cc(-n9c%10ccccc%10c%10cc(-c%11ccccc%11)ccc%109)ccc8c67)cc45)n3)cc2)cc1]
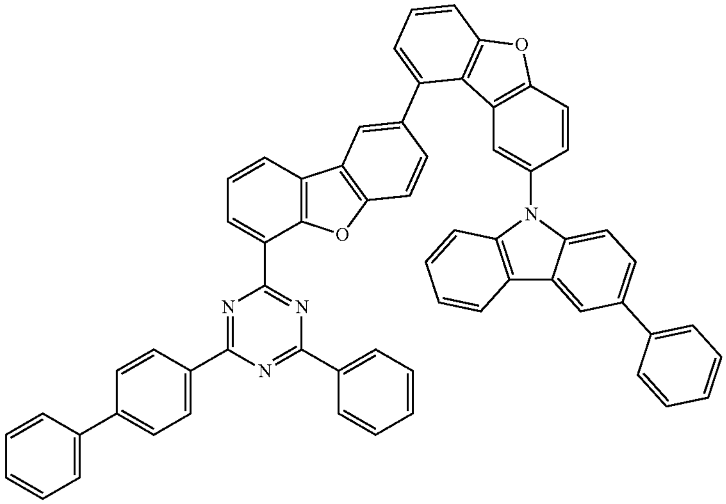 [SMILES: c1ccc(-c2ccc(-c3nc(-c4ccccc4)nc(-c4cccc5c4oc4ccc(-c6cccc7oc8ccc(-n9c%10ccccc%10c%10cc(-c%11ccccc%11)ccc%109)cc8c67)cc45)n3)cc2)cc1]
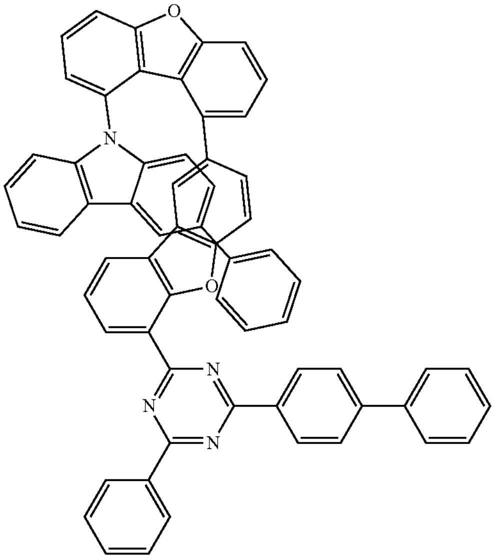 [SMILES: c1ccc(-c2ccc(-c3nc(-c4ccccc4)nc(-c4cccc5c4oc4ccc(-c6cccc7oc8cccc(-n9c%10ccccc%10c%10cc(-c%11ccccc%11)ccc%109)c8c67)cc45)n3)cc2)cc1]

TABLE 1-continued
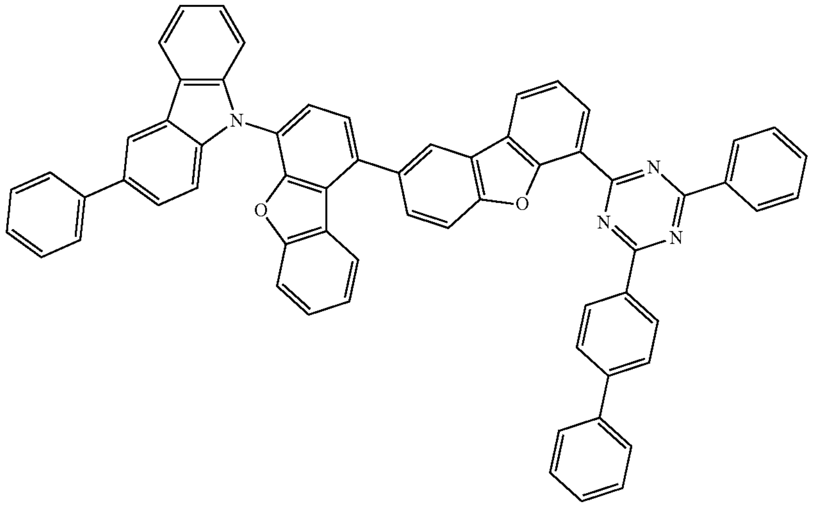 [SMILES: c1ccc(-c2ccc(-c3nc(-c4ccccc4)nc(-c4cccc5c4oc4ccc(-c6ccc(-n7c8ccccc8c8cc(-c9ccccc9)ccc87)c7oc8ccccc8c67)cc45)n3)cc2)cc1]
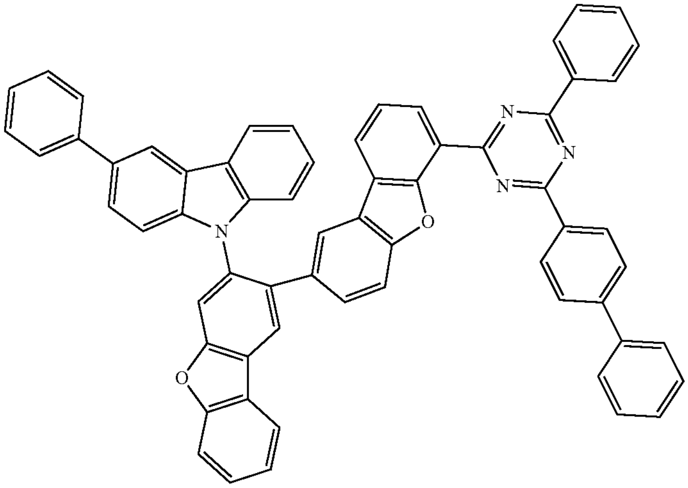 [SMILES: c1ccc(-c2ccc(-c3nc(-c4ccccc4)nc(-c4cccc5c4oc4ccc(-c6cc7c(cc6-n6c8ccccc8c8cc(-c9ccccc9)ccc86)oc6ccccc67)cc45)n3)cc2)cc1]
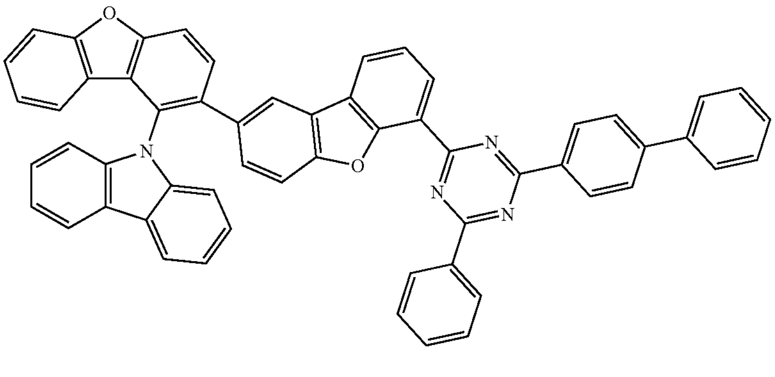 [SMILES: c1ccc(-c2ccc(-c3nc(-c4ccccc4)nc(-c4cccc5c4oc4ccc(-c6ccc7oc8ccccc8c7c6-n6c7ccccc7c7ccccc76)cc45)n3)cc2)cc1]

TABLE 1-continued
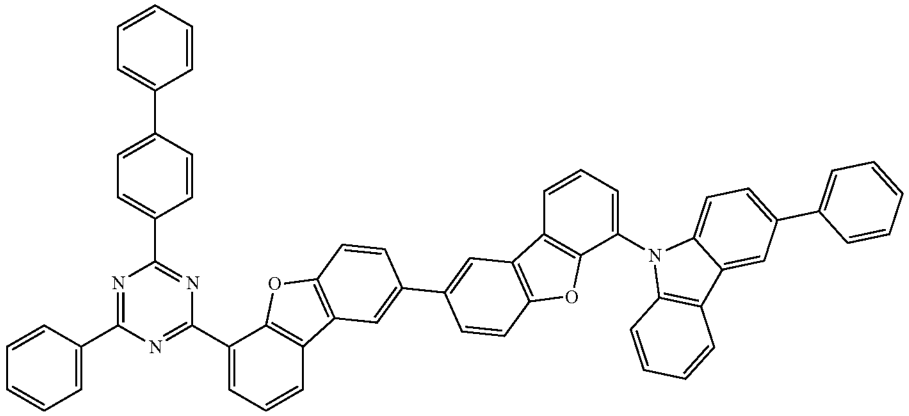 [SMILES: c1ccc(-c2ccc(-c3nc(-c4ccccc4)nc(-c4cccc5c4oc4ccc(-c6ccc7oc8c(-n9c%10ccccc%10c%10cc(-c%11ccccc%11)ccc%109)cccc8c7c6)cc45)n3)cc2)cc1]
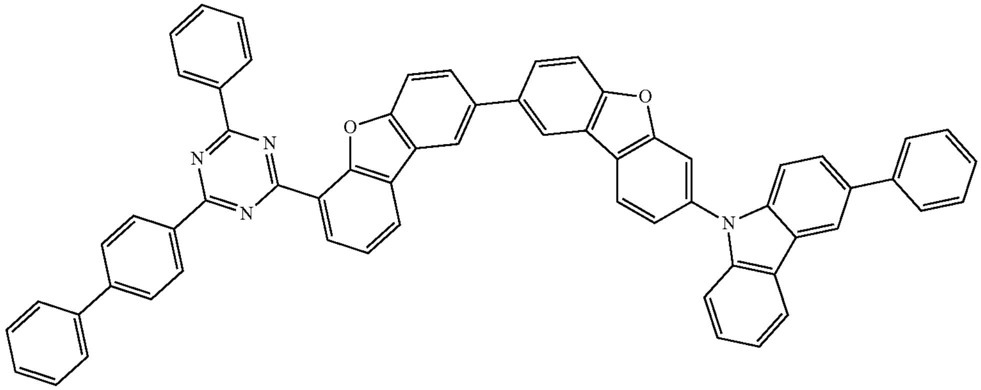 [SMILES: c1ccc(-c2ccc(-c3nc(-c4ccccc4)nc(-c4cccc5c4oc4ccc(-c6ccc7oc8cc(-n9c%10ccccc%10c%10cc(-c%11ccccc%11)ccc%109)ccc8c7c6)cc45)n3)cc2)cc1]
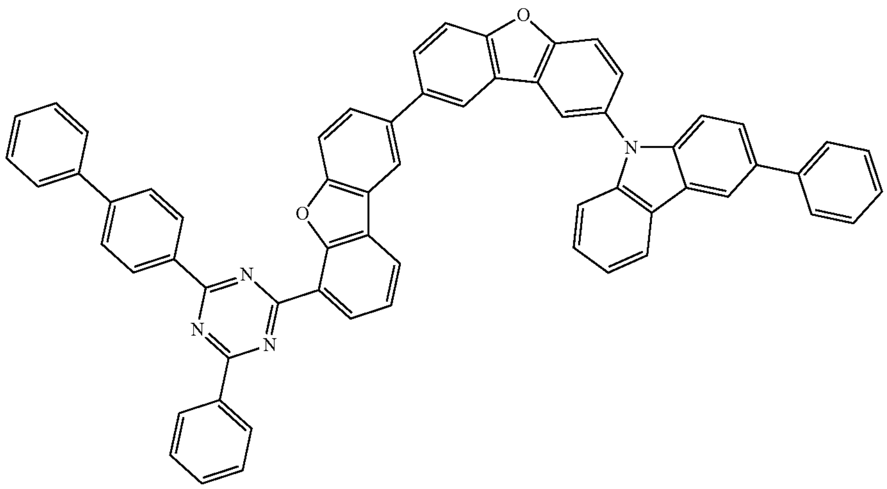 [SMILES: c1ccc(-c2ccc(-c3nc(-c4ccccc4)nc(-c4cccc5c4oc4ccc(-c6ccc7oc8ccc(-n9c%10ccccc%10c%10cc(-c%11ccccc%11)ccc%109)cc8c7c6)cc45)n3)cc2)cc1]

TABLE 1-continued
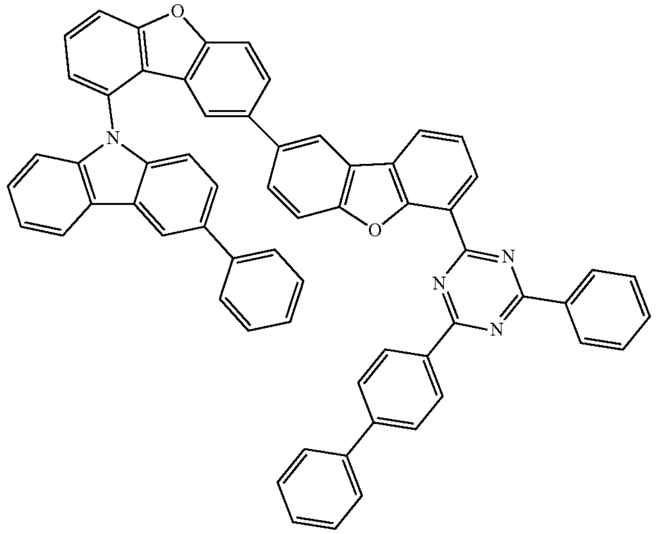 [SMILES: c1ccc(-c2ccc(-c3nc(-c4ccccc4)nc(-c4cccc5c4oc4ccc(-c6ccc7oc8cccc(-n9c%10ccccc%10c%10cc(-c%11ccccc%11)ccc%109)c8c7c6)cc45)n3)cc2)cc1]
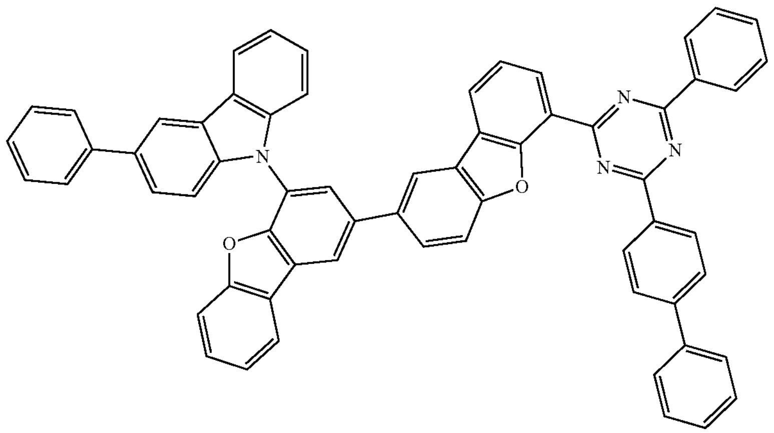 [SMILES: c1ccc(-c2ccc(-c3nc(-c4ccccc4)nc(-c4cccc5c4oc4ccc(-c6cc(-n7c8ccccc8c8cc(-c9ccccc9)ccc87)c7oc8ccccc8c7c6)cc45)n3)cc2)cc1]
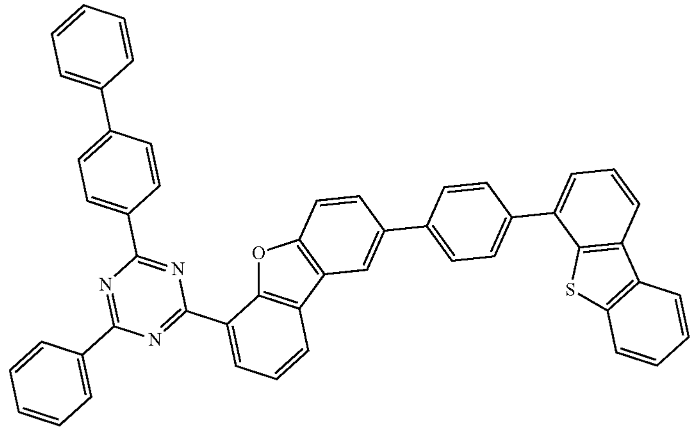 [SMILES: c1ccc(-c2ccc(-c3nc(-c4ccccc4)nc(-c4cccc5c4oc4ccc(-c6ccc(-c7cccc8c7sc7ccccc78)cc6)cc45)n3)cc2)cc1]

TABLE 1-continued
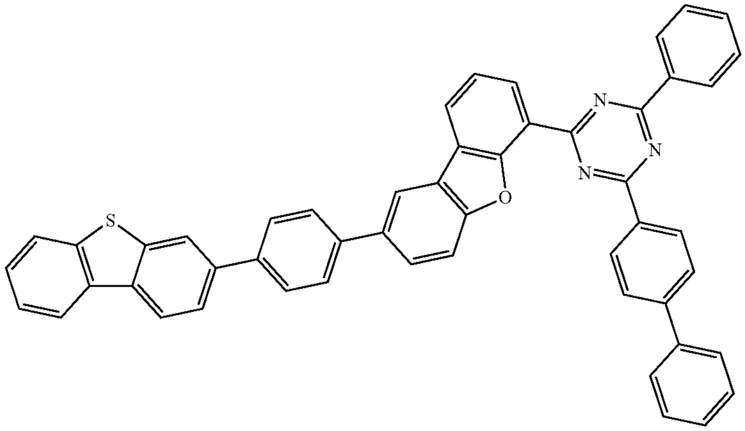 [SMILES: c1ccc(-c2ccc(-c3nc(-c4ccccc4)nc(-c4cccc5c4oc4ccc(-c6ccc(-c7ccc8c(c7)sc7ccccc78)cc6)cc45)n3)cc2)cc1]
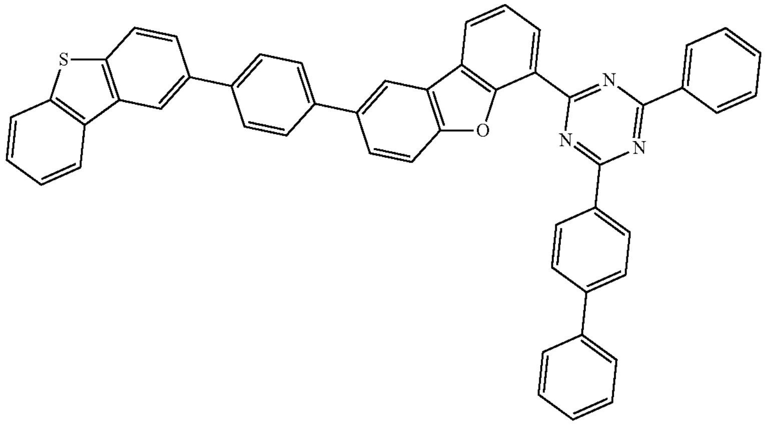 [SMILES: c1ccc(-c2ccc(-c3nc(-c4ccccc4)nc(-c4cccc5c4oc4ccc(-c6ccc(-c7ccc8sc9ccccc9c8c7)cc6)cc45)n3)cc2)cc1]
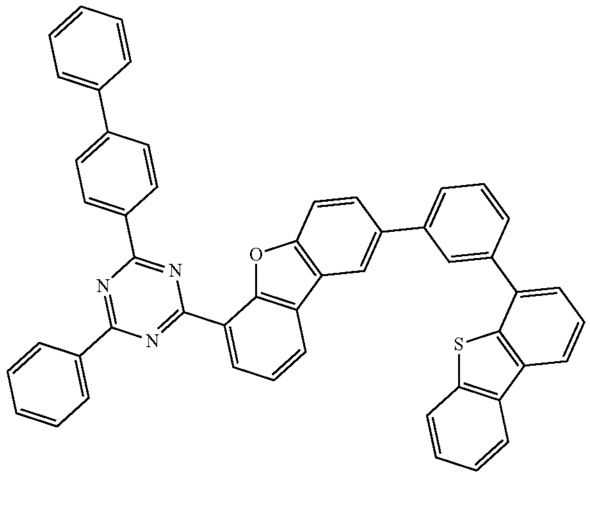 [SMILES: c1ccc(-c2ccc(-c3nc(-c4ccccc4)nc(-c4cccc5c4oc4ccc(-c6cccc(-c7cccc8c7sc7ccccc78)c6)cc45)n3)cc2)cc1]

TABLE 1-continued
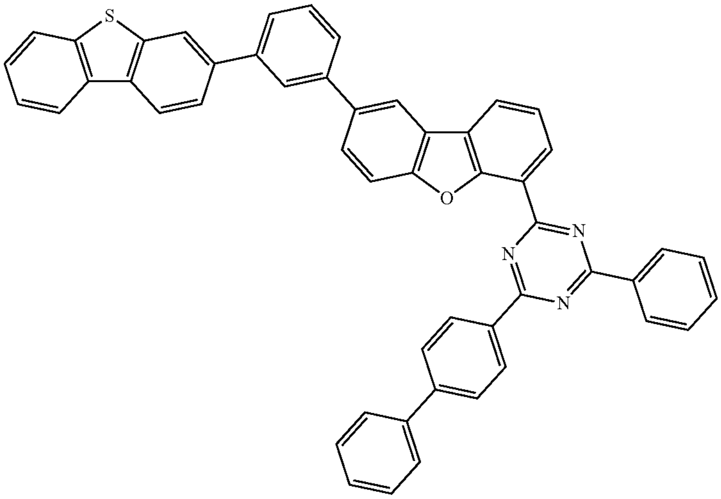 [SMILES: c1ccc(-c2ccc(-c3nc(-c4ccccc4)nc(-c4cccc5c4oc4ccc(-c6cccc(-c7ccc8c(c7)sc7ccccc78)c6)cc45)n3)cc2)cc1]
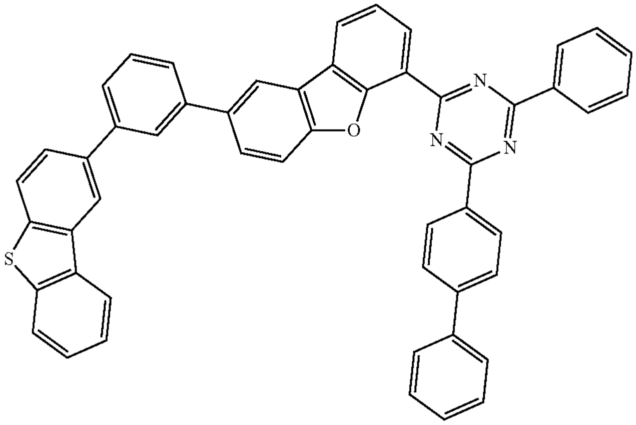 [SMILES: c1ccc(-c2ccc(-c3nc(-c4ccccc4)nc(-c4cccc5c4oc4ccc(-c6cccc(-c7ccc8sc9ccccc9c8c7)c6)cc45)n3)cc2)cc1]
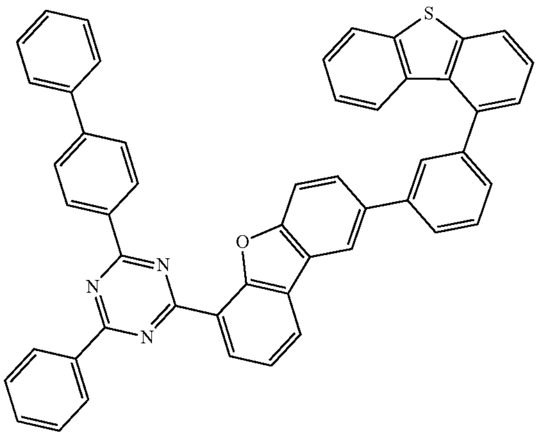 [SMILES: c1ccc(-c2ccc(-c3nc(-c4ccccc4)nc(-c4cccc5c4oc4ccc(-c6cccc(-c7cccc8sc9ccccc9c78)c6)cc45)n3)cc2)cc1]

TABLE 1-continued
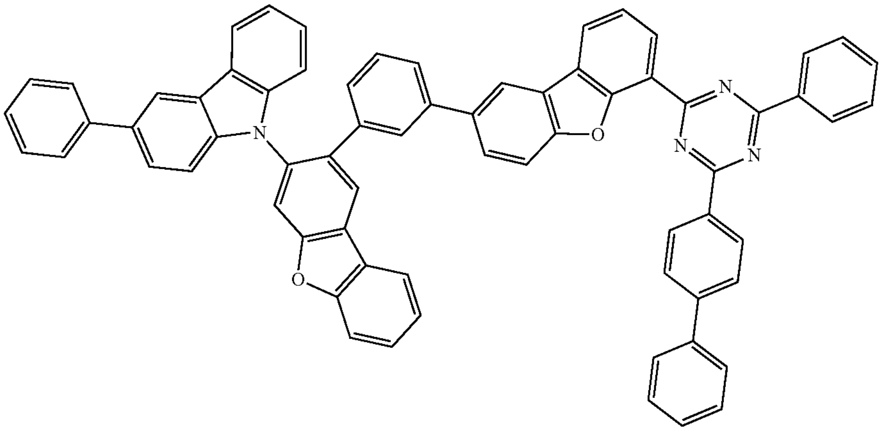 [SMILES: c1ccc(-c2ccc(-c3nc(-c4ccccc4)nc(-c4cccc5c4oc4ccc(-c6cccc(-c7cc8c(cc7-n7c9ccccc9c9cc(-c%10ccccc%10)ccc97)oc7ccccc78)c6)cc45)n3)cc2)cc1]
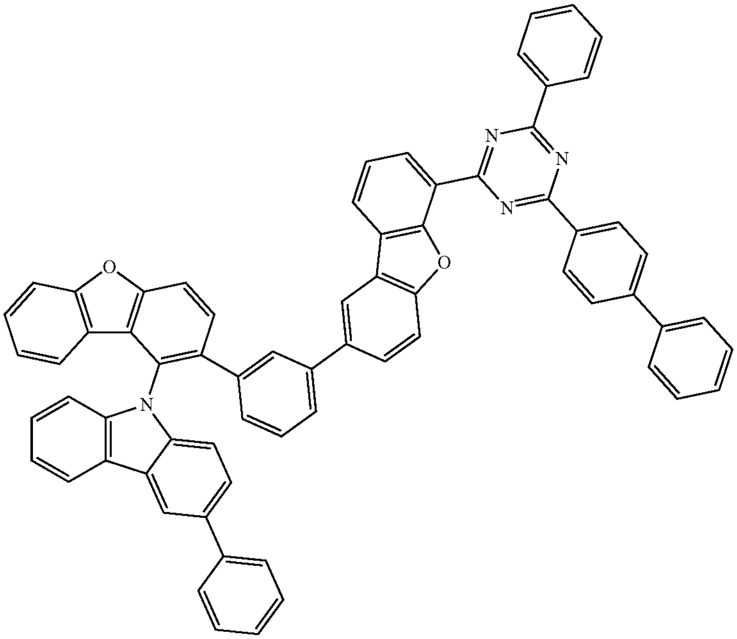 [SMILES: c1ccc(-c2ccc(-c3nc(-c4ccccc4)nc(-c4cccc5c4oc4ccc(-c6cccc(-c7ccc8oc9ccccc9c8c7-n7c8ccccc8c8cc(-c9ccccc9)ccc87)c6)cc45)n3)cc2)cc1]
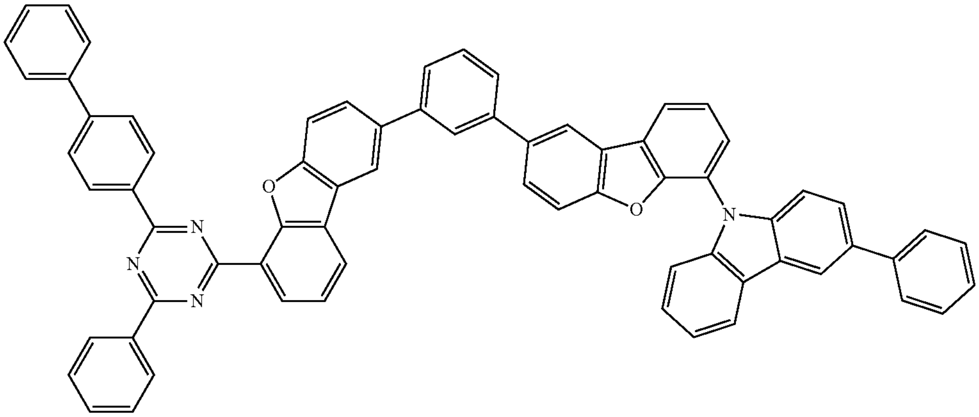 [SMILES: c1ccc(-c2ccc(-c3nc(-c4ccccc4)nc(-c4cccc5c4oc4ccc(-c6cccc(-c7ccc8oc9c(-n%10c%11ccccc%11c%11cc(-c%12ccccc%12)ccc%11%10)cccc9c8c7)c6)cc45)n3)cc2)cc1]

TABLE 1-continued
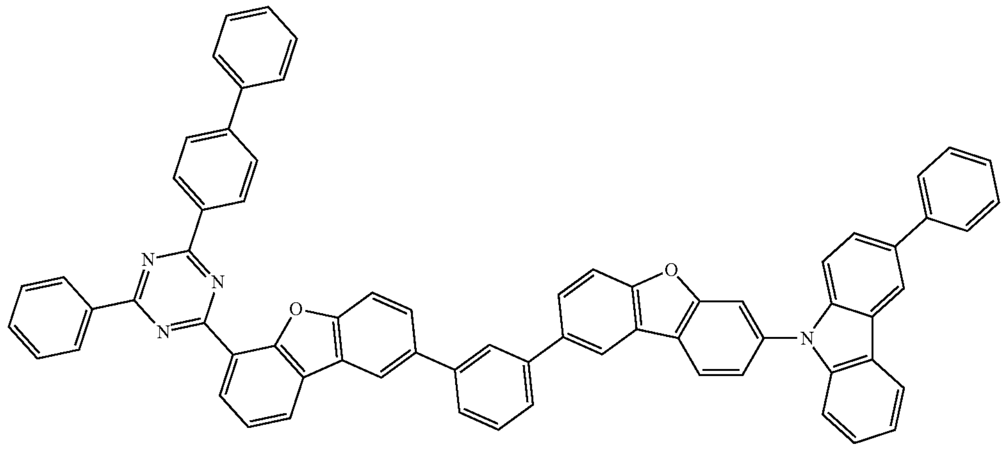 [SMILES: c1ccc(-c2ccc(-c3nc(-c4ccccc4)nc(-c4cccc5c4oc4ccc(-c6cccc(-c7ccc8oc9cc(-n%10c%11ccccc%11c%11cc(-c%12ccccc%12)ccc%11%10)ccc9c8c7)c6)cc45)n3)cc2)cc1]
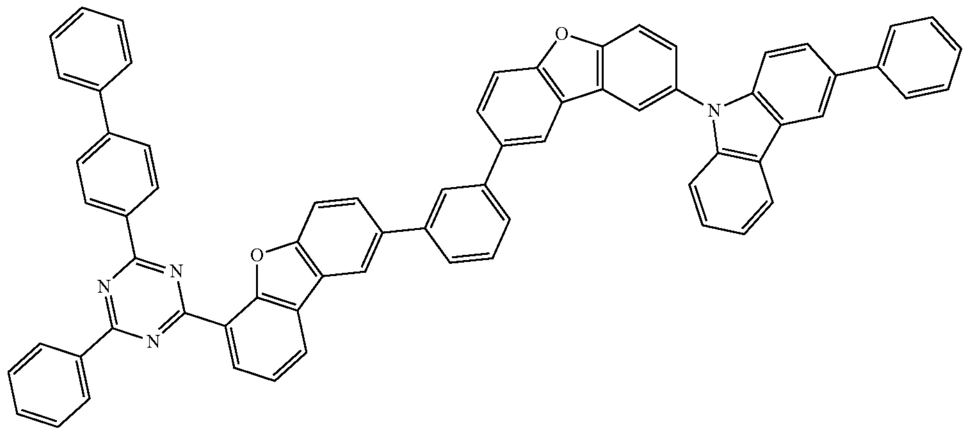 [SMILES: c1ccc(-c2ccc(-c3nc(-c4ccccc4)nc(-c4cccc5c4oc4ccc(-c6cccc(-c7ccc8oc9ccc(-n%10c%11ccccc%11c%11cc(-c%12ccccc%12)ccc%11%10)cc9c8c7)c6)cc45)n3)cc2)cc1]
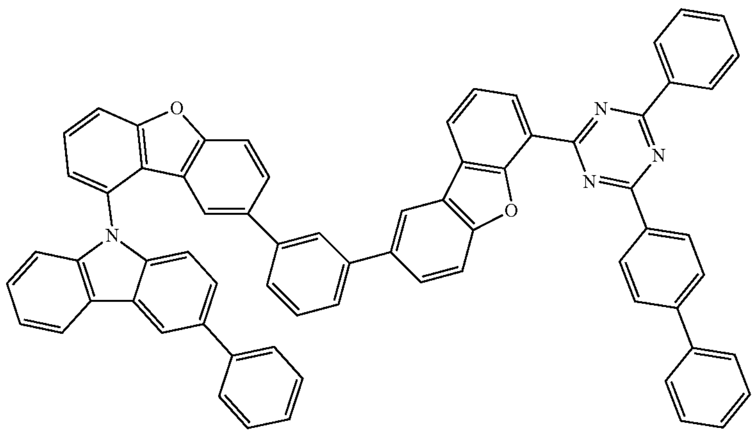 [SMILES: c1ccc(-c2ccc(-c3nc(-c4ccccc4)nc(-c4cccc5c4oc4ccc(-c6cccc(-c7ccc8oc9cccc(-n%10c%11ccccc%11c%11cc(-c%12ccccc%12)ccc%11%10)c9c8c7)c6)cc45)n3)cc2)cc1]

TABLE 1-continued
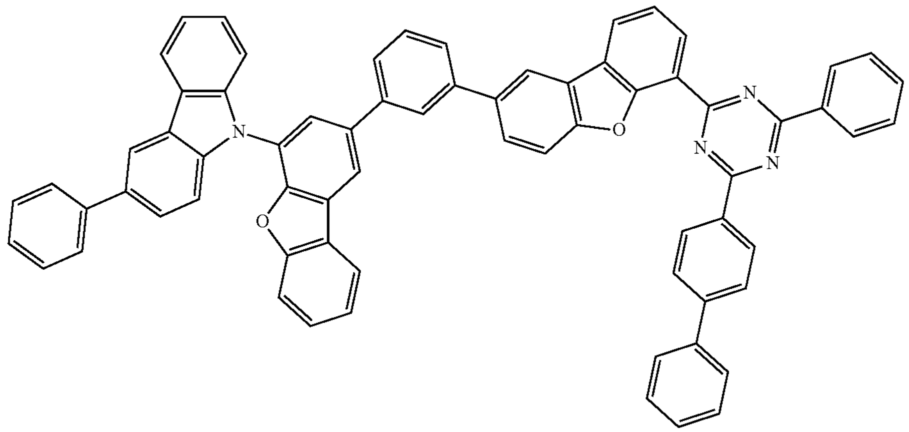 [SMILES: c1ccc(-c2ccc(-c3nc(-c4ccccc4)nc(-c4cccc5c4oc4ccc(-c6cccc(-c7cc(-n8c9ccccc9c9cc(-c%10ccccc%10)ccc98)c8oc9ccccc9c8c7)c6)cc45)n3)cc2)cc1]
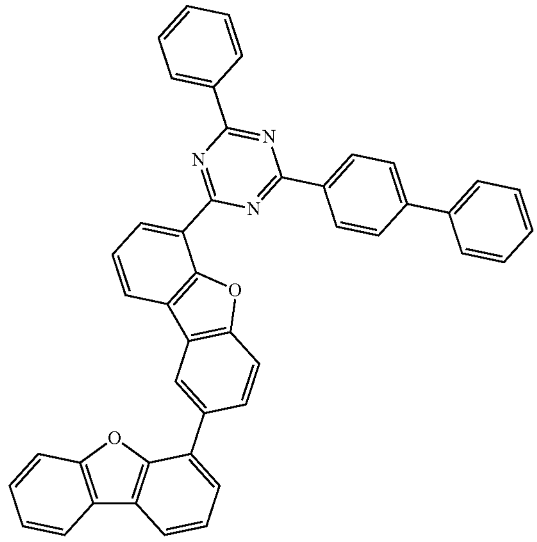 [SMILES: c1ccc(-c2ccc(-c3nc(-c4ccccc4)nc(-c4cccc5c4oc4ccc(-c6cccc7c6oc6ccccc67)cc45)n3)cc2)cc1]
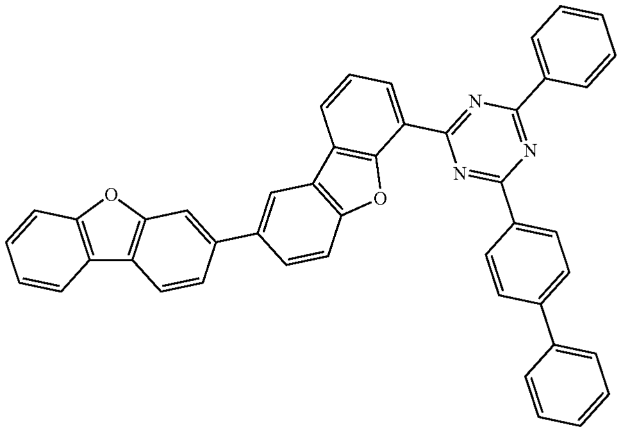 [SMILES: c1ccc(-c2ccc(-c3nc(-c4ccccc4)nc(-c4cccc5c4oc4ccc(-c6ccc7c(c6)oc6ccccc67)cc45)n3)cc2)cc1]

TABLE 1-continued
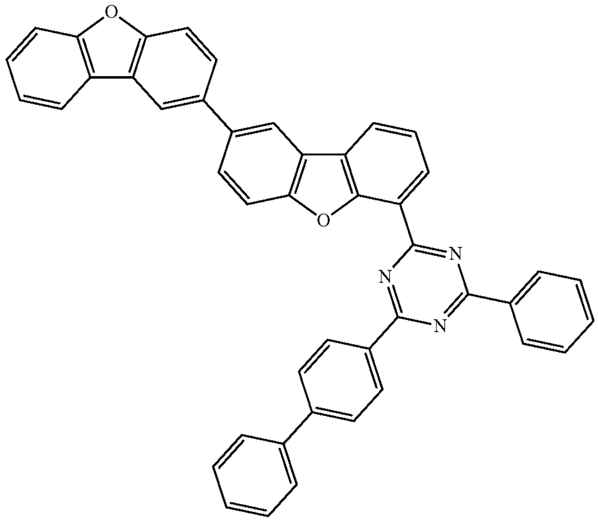 [SMILES: c1ccc(-c2ccc(-c3nc(-c4ccccc4)nc(-c4cccc5c4oc4ccc(-c6ccc7oc8ccccc8c7c6)cc45)n3)cc2)cc1]
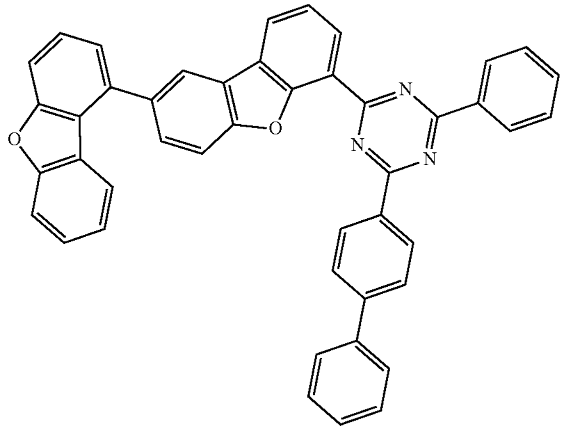 [SMILES: c1ccc(-c2ccc(-c3nc(-c4ccccc4)nc(-c4cccc5c4oc4ccc(-c6cccc7oc8ccccc8c67)cc45)n3)cc2)cc1]
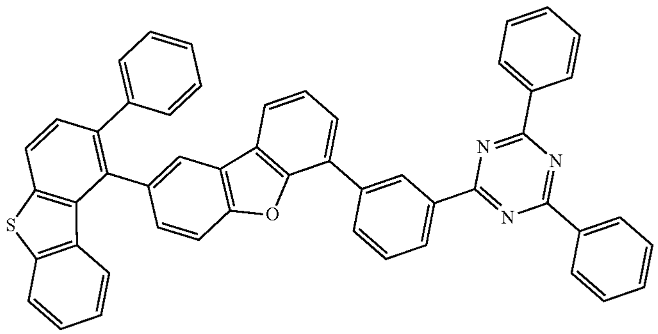 [SMILES: c1ccc(-c2nc(-c3ccccc3)nc(-c3cccc(-c4cccc5c4oc4ccc(-c6c(-c7ccccc7)ccc7sc8ccccc8c67)cc45)c3)n2)cc1]

TABLE 1-continued
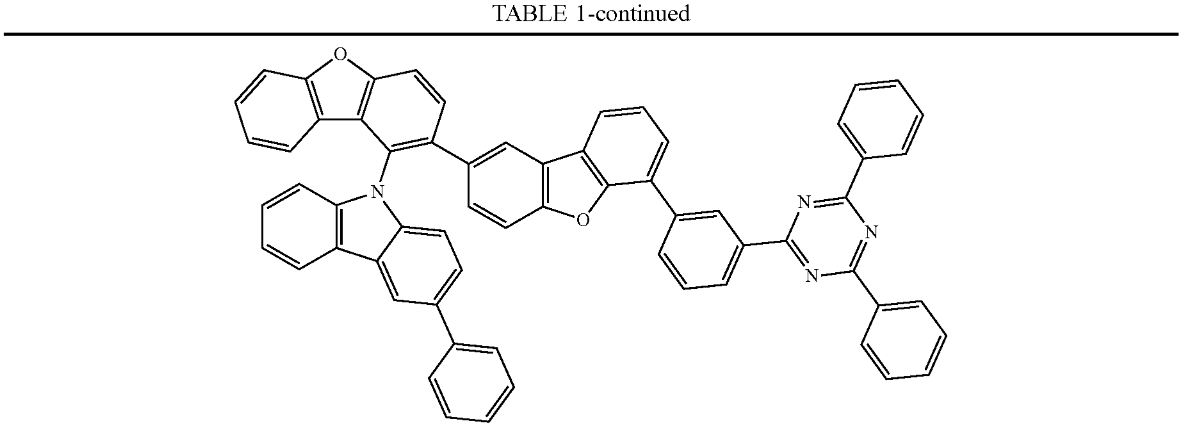
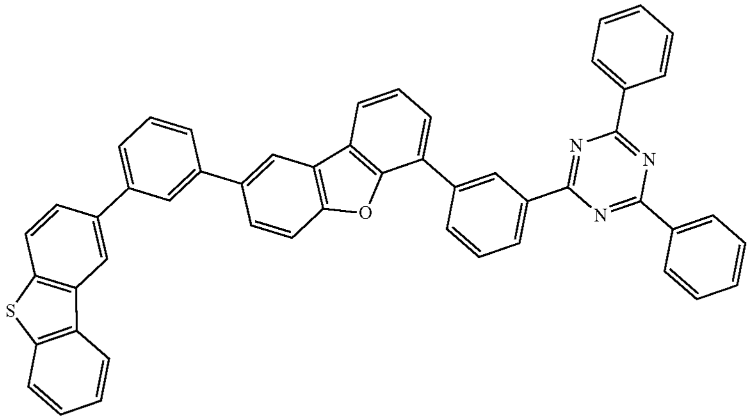 [SMILES: c1ccc(-c2nc(-c3ccccc3)nc(-c3cccc(-c4cccc5c4oc4ccc(-c6cccc(-c7ccc8sc9ccccc9c8c7)c6)cc45)c3)n2)cc1]
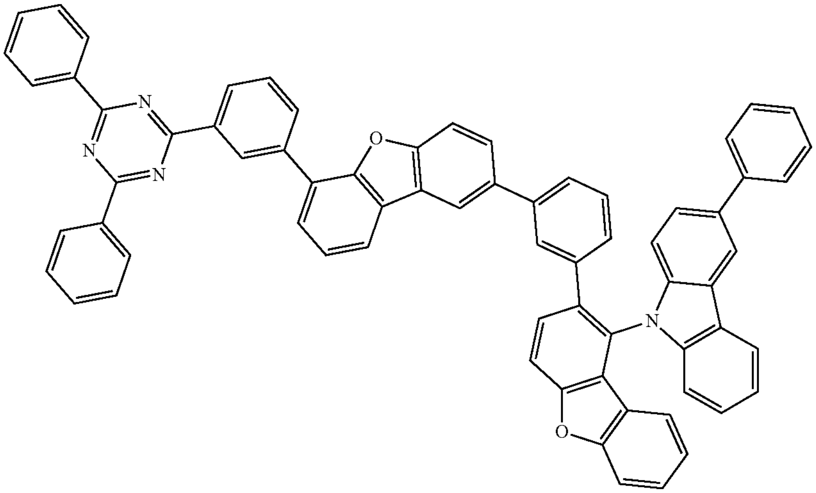 [SMILES: c1ccc(-c2ccc3c(c2)c2ccccc2n3-c2c(-c3cccc(-c4ccc5oc6c(-c7cccc(-c8nc(-c9ccccc9)nc(-c9ccccc9)n8)c7)cccc6c5c4)c3)ccc3oc4ccccc4c23)cc1]
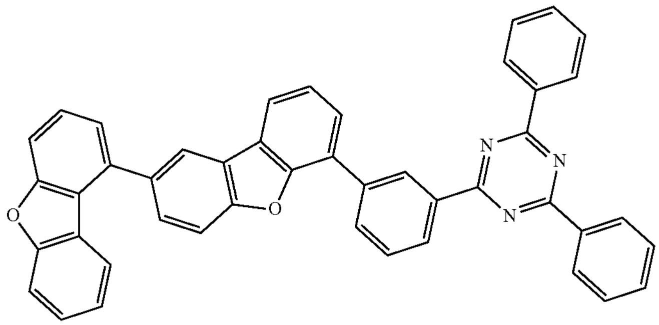 [SMILES: c1ccc(-c2nc(-c3ccccc3)nc(-c3cccc(-c4cccc5c4oc4ccc(-c6cccc7oc8ccccc8c67)cc45)c3)n2)cc1]

TABLE 1-continued
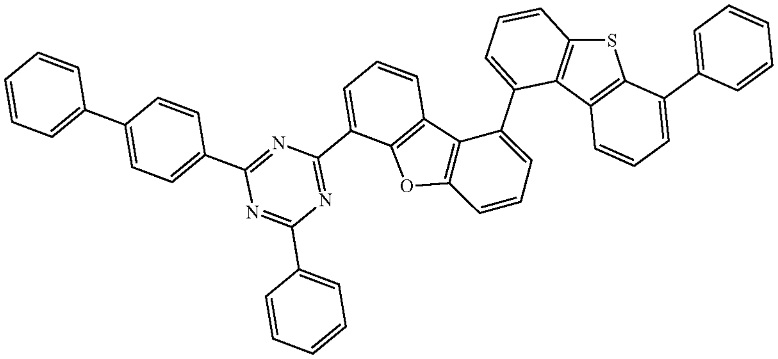 [SMILES: c1ccc(-c2ccc(-c3nc(-c4ccccc4)nc(-c4cccc5c4oc4cccc(-c6cccc7sc8c(-c9ccccc9)cccc8c67)c45)n3)cc2)cc1]
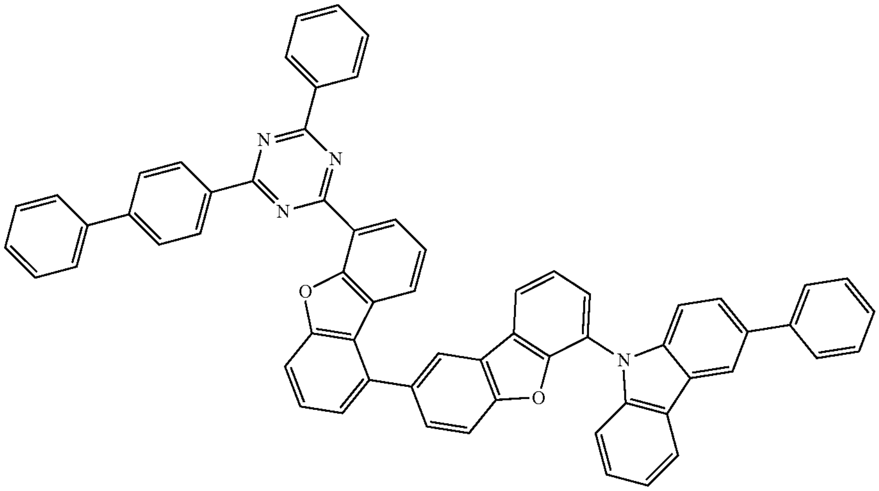 [SMILES: c1ccc(-c2ccc(-c3nc(-c4ccccc4)nc(-c4cccc5c4oc4cccc(-c6ccc7oc8c(-n9c%10ccccc%10c%10cc(-c%11ccccc%11)ccc%109)cccc8c7c6)c45)n3)cc2)cc1]
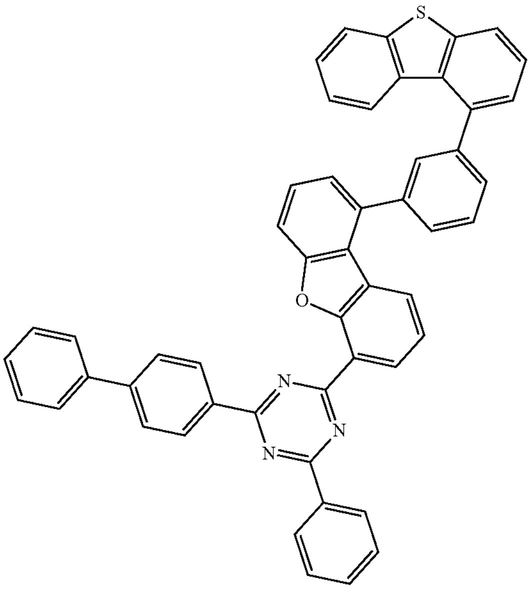 [SMILES: c1ccc(-c2ccc(-c3nc(-c4ccccc4)nc(-c4cccc5c4oc4cccc(-c6cccc(-c7cccc8sc9ccccc9c78)c6)c45)n3)cc2)cc1]

TABLE 1-continued
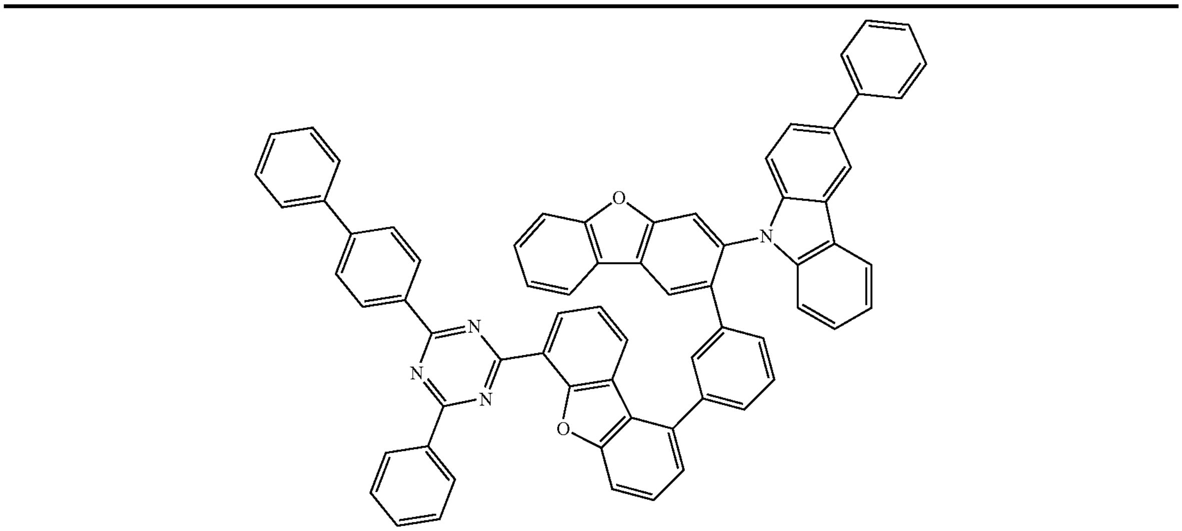
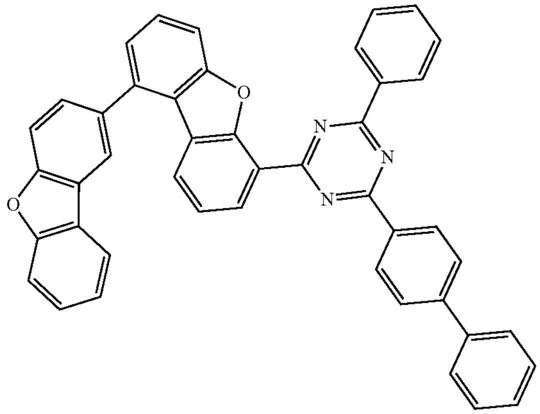 [SMILES: c1ccc(-c2ccc(-c3nc(-c4ccccc4)nc(-c4cccc5c4oc4cccc(-c6ccc7oc8ccccc8c7c6)c45)n3)cc2)cc1]
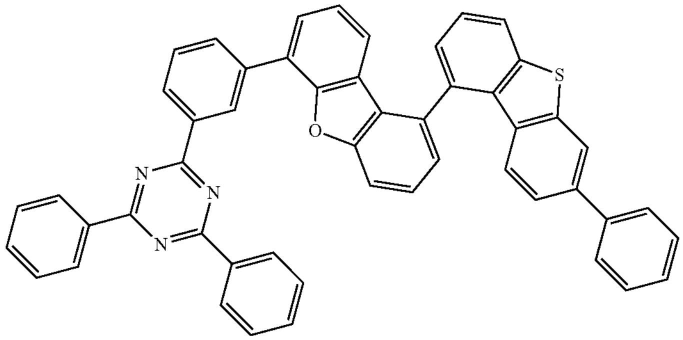 [SMILES: c1ccc(-c2ccc3c(c2)sc2cccc(-c4cccc5oc6c(-c7cccc(-c8nc(-c9ccccc9)nc(-c9ccccc9)n8)c7)cccc6c45)c23)cc1]
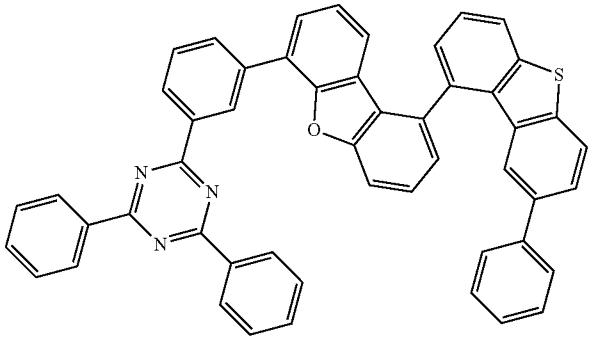 [SMILES: c1ccc(-c2ccc3sc4cccc(-c5cccc6oc7c(-c8cccc(-c9nc(-c%10ccccc%10)nc(-c%10ccccc%10)n9)c8)cccc7c56)c4c3c2)cc1]

TABLE 1-continued
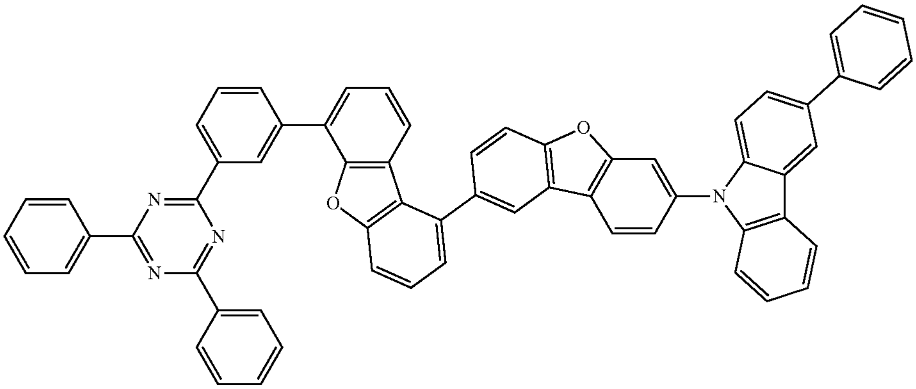 [SMILES: c1ccc(-c2ccc3c(c2)c2ccccc2n3-c2ccc3c(c2)oc2ccc(-c4cccc5oc6c(-c7cccc(-c8nc(-c9ccccc9)nc(-c9ccccc9)n8)c7)cccc6c45)cc23)cc1]
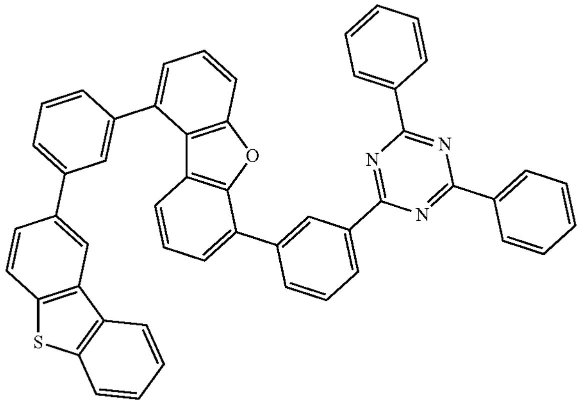 [SMILES: c1ccc(-c2nc(-c3ccccc3)nc(-c3cccc(-c4cccc5c4oc4cccc(-c6cccc(-c7ccc8sc9ccccc9c8c7)c6)c45)c3)n2)cc1]
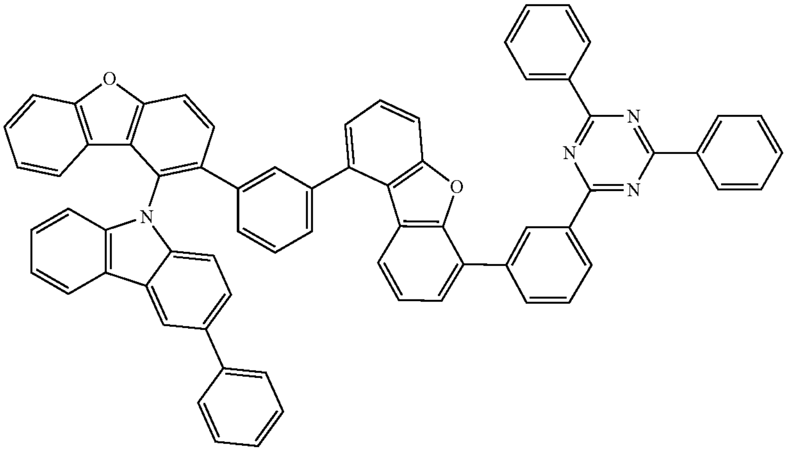 [SMILES: c1ccc(-c2ccc3c(c2)c2ccccc2n3-c2c(-c3cccc(-c4cccc5oc6c(-c7cccc(-c8nc(-c9ccccc9)nc(-c9ccccc9)n8)c7)cccc6c45)c3)ccc3oc4ccccc4c23)cc1]
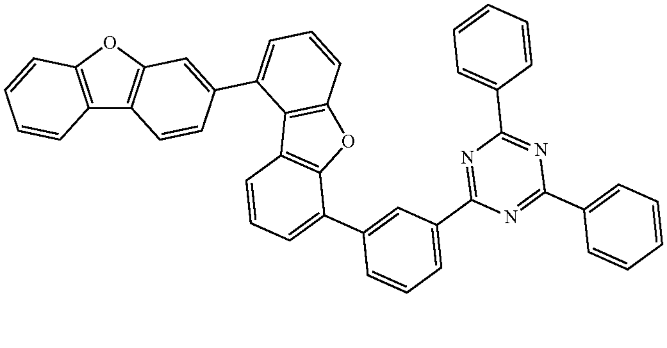 [SMILES: c1ccc(-c2nc(-c3ccccc3)nc(-c3cccc(-c4cccc5c4oc4cccc(-c6ccc7c(c6)oc6ccccc67)c45)c3)n2)cc1]

TABLE 1-continued
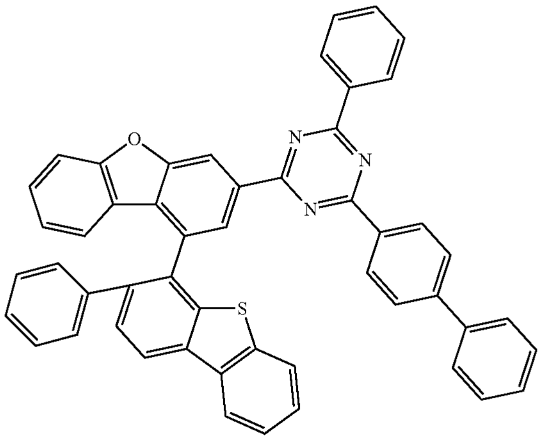 [SMILES: c1ccc(-c2ccc(-c3nc(-c4ccccc4)nc(-c4cc(-c5c(-c6ccccc6)ccc6c5sc5ccccc56)c5c(c4)oc4ccccc45)n3)cc2)cc1]
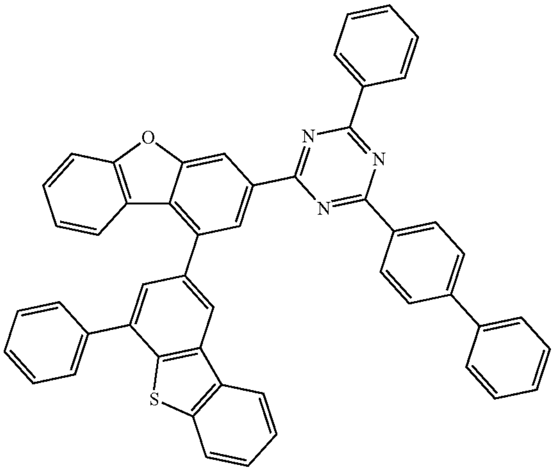 [SMILES: c1ccc(-c2ccc(-c3nc(-c4ccccc4)nc(-c4cc(-c5cc(-c6ccccc6)c6sc7ccccc7c6c5)c5c(c4)oc4ccccc45)n3)cc2)cc1]
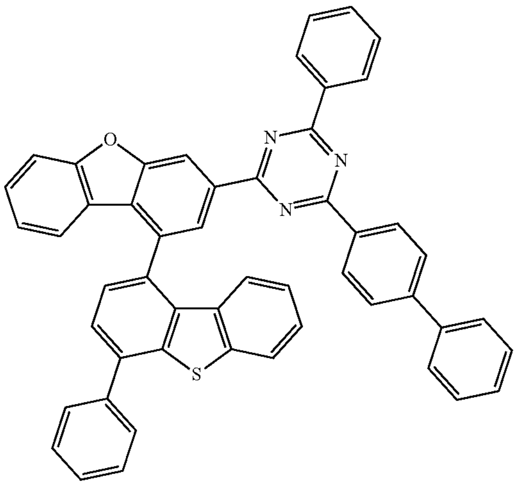 [SMILES: c1ccc(-c2ccc(-c3nc(-c4ccccc4)nc(-c4cc(-c5ccc(-c6ccccc6)c6sc7ccccc7c56)c5c(c4)oc4ccccc45)n3)cc2)cc1]

TABLE 1-continued
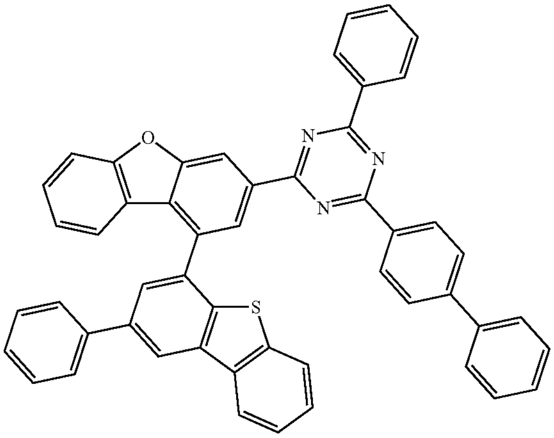 [SMILES: c1ccc(-c2ccc(-c3nc(-c4ccccc4)nc(-c4cc(-c5cc(-c6ccccc6)cc6c5sc5ccccc56)c5c(c4)oc4ccccc45)n3)cc2)cc1]
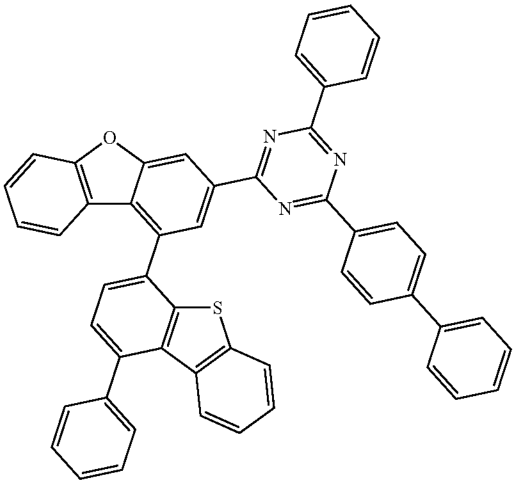 [SMILES: c1ccc(-c2ccc(-c3nc(-c4ccccc4)nc(-c4cc(-c5ccc(-c6ccccc6)c6c5sc5ccccc56)c5c(c4)oc4ccccc45)n3)cc2)cc1]
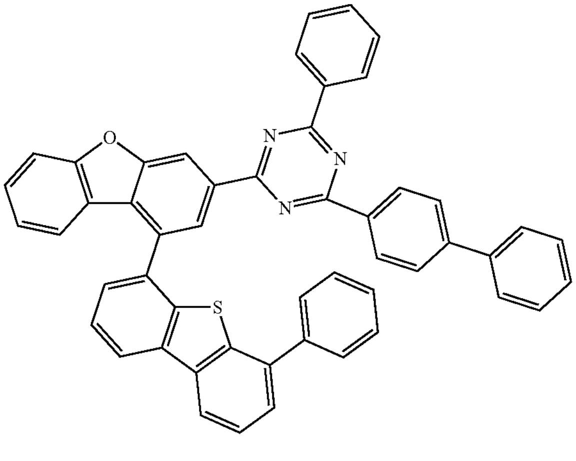 [SMILES: c1ccc(-c2ccc(-c3nc(-c4ccccc4)nc(-c4cc(-c5cccc6c5sc5c(-c7ccccc7)cccc56)c5c(c4)oc4ccccc45)n3)cc2)cc1]

TABLE 1-continued
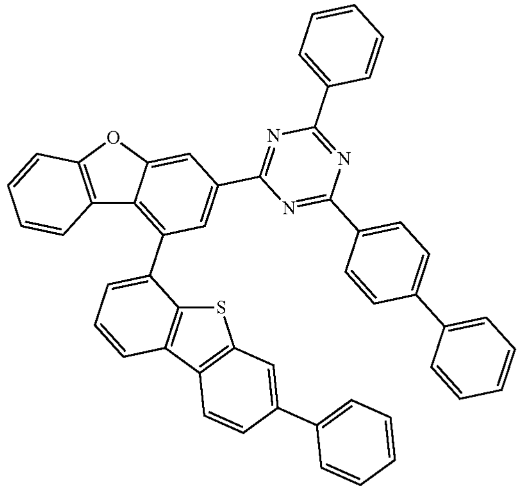 [SMILES: c1ccc(-c2ccc(-c3nc(-c4ccccc4)nc(-c4cc(-c5cccc6c5sc5cc(-c7ccccc7)ccc56)c5c(c4)oc4ccccc45)n3)cc2)cc1]
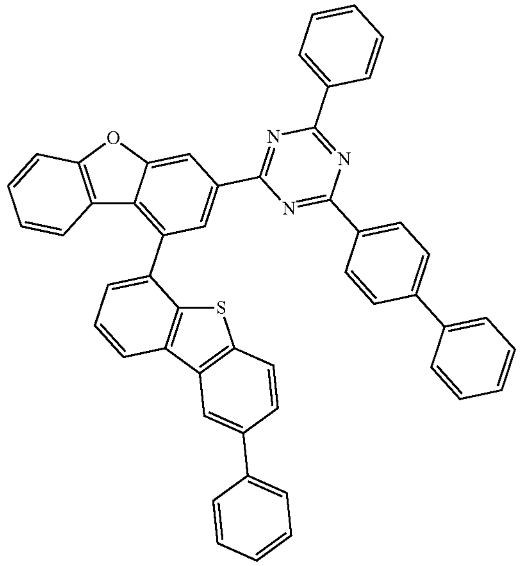 [SMILES: c1ccc(-c2ccc(-c3nc(-c4ccccc4)nc(-c4cc(-c5cccc6c5sc5ccc(-c7ccccc7)cc56)c5c(c4)oc4ccccc45)n3)cc2)cc1]
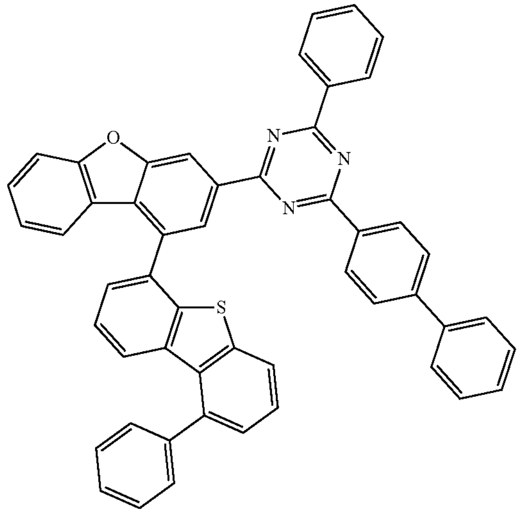 [SMILES: c1ccc(-c2ccc(-c3nc(-c4ccccc4)nc(-c4cc(-c5cccc6c5sc5cccc(-c7ccccc7)c56)c5c(c4)oc4ccccc45)n3)cc2)cc1]

TABLE 1-continued
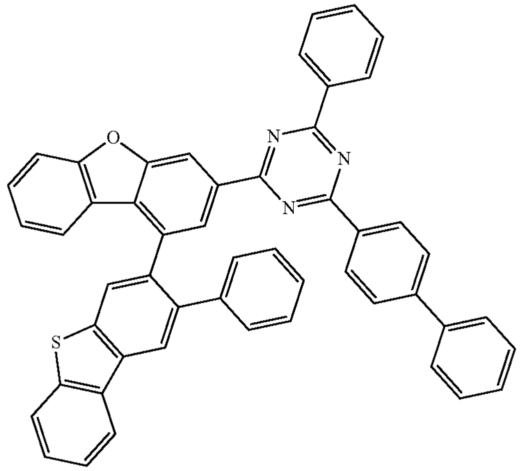 [SMILES: c1ccc(-c2ccc(-c3nc(-c4ccccc4)nc(-c4cc(-c5cc6sc7ccccc7c6cc5-c5ccccc5)c5c(c4)oc4ccccc45)n3)cc2)cc1]
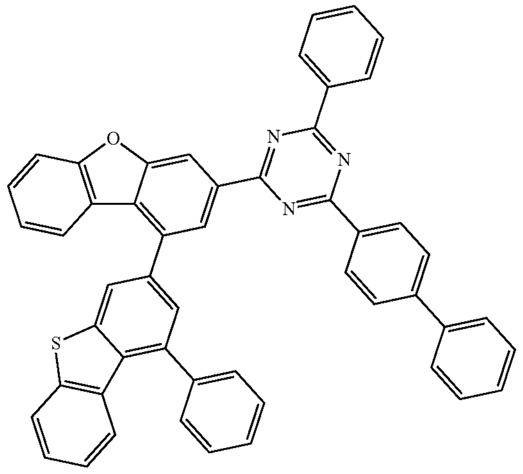 [SMILES: c1ccc(-c2ccc(-c3nc(-c4ccccc4)nc(-c4cc(-c5cc(-c6ccccc6)c6c(c5)sc5ccccc56)c5c(c4)oc4ccccc45)n3)cc2)cc1]
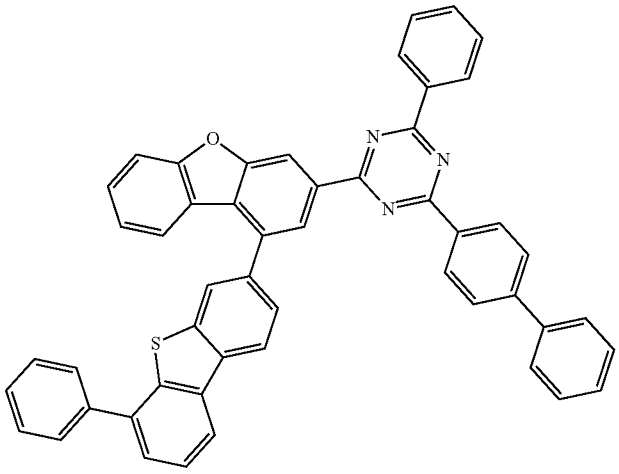 [SMILES: c1ccc(-c2ccc(-c3nc(-c4ccccc4)nc(-c4cc(-c5ccc6c(c5)sc5c(-c7ccccc7)cccc56)c5c(c4)oc4ccccc45)n3)cc2)cc1]

TABLE 1-continued
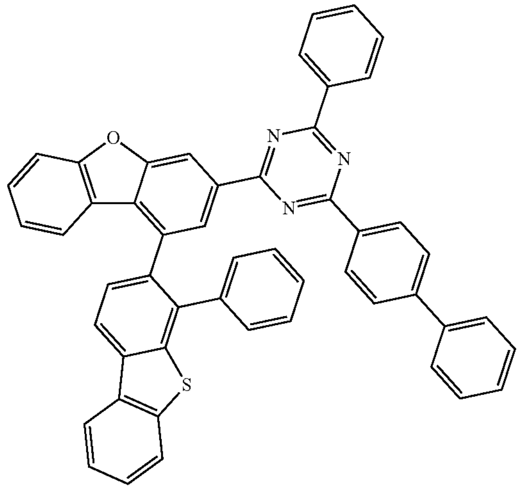 [SMILES: c1ccc(-c2ccc(-c3nc(-c4ccccc4)nc(-c4cc(-c5ccc6c(sc7ccccc76)c5-c5ccccc5)c5c(c4)oc4ccccc45)n3)cc2)cc1]
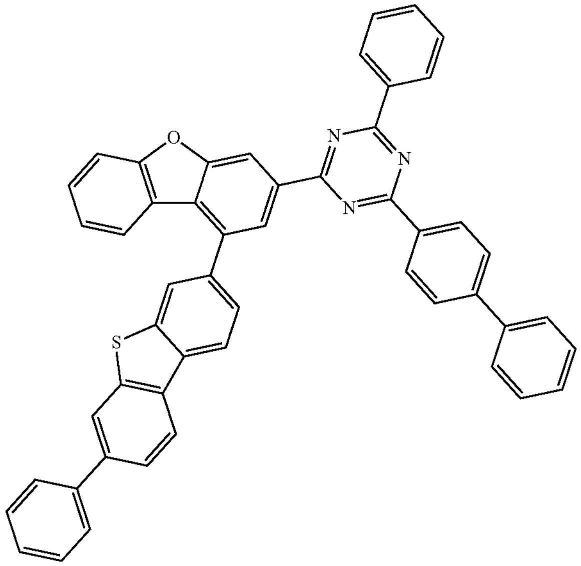 [SMILES: c1ccc(-c2ccc(-c3nc(-c4ccccc4)nc(-c4cc(-c5ccc6c(c5)sc5cc(-c7ccccc7)ccc56)c5c(c4)oc4ccccc45)n3)cc2)cc1]
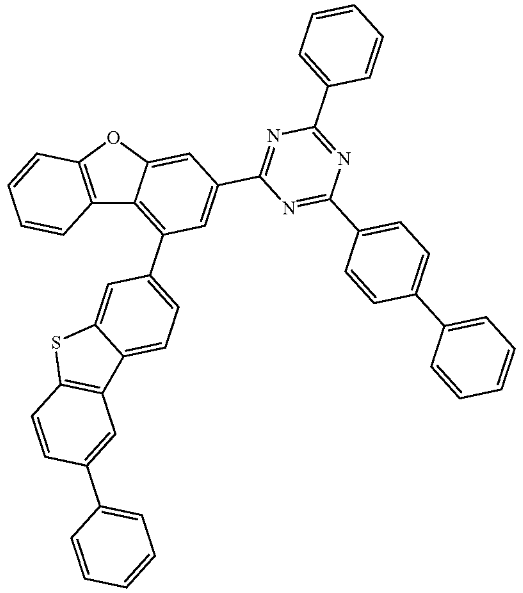 [SMILES: c1ccc(-c2ccc(-c3nc(-c4ccccc4)nc(-c4cc(-c5ccc6c(c5)sc5ccc(-c7ccccc7)cc56)c5c(c4)oc4ccccc45)n3)cc2)cc1]

TABLE 1-continued
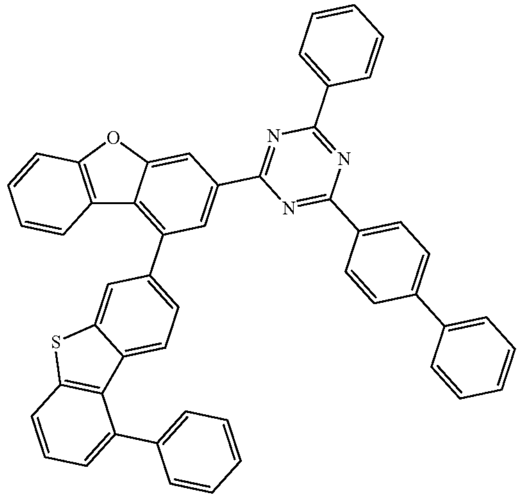 [SMILES: c1ccc(-c2ccc(-c3nc(-c4ccccc4)nc(-c4cc(-c5ccc6c(c5)sc5cccc(-c7ccccc7)c56)c5c(c4)oc4ccccc45)n3)cc2)cc1]
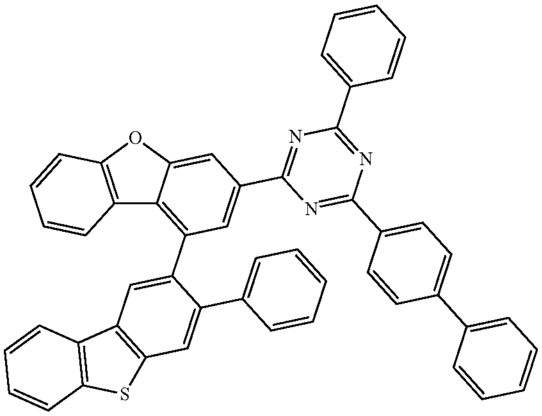 [SMILES: c1ccc(-c2ccc(-c3nc(-c4ccccc4)nc(-c4cc(-c5cc6c(cc5-c5ccccc5)sc5ccccc56)c5c(c4)oc4ccccc45)n3)cc2)cc1]
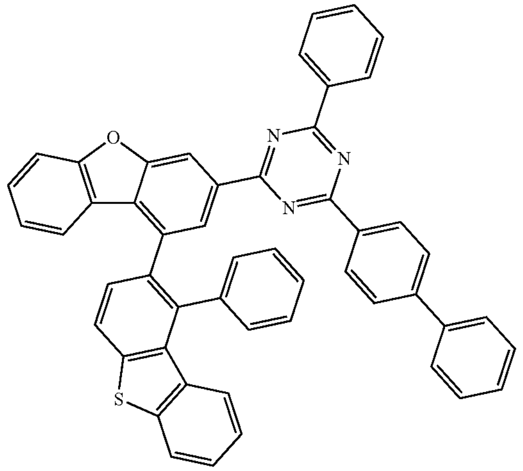 [SMILES: c1ccc(-c2ccc(-c3nc(-c4ccccc4)nc(-c4cc(-c5ccc6sc7ccccc7c6c5-c5ccccc5)c5c(c4)oc4ccccc45)n3)cc2)cc1]

TABLE 1-continued
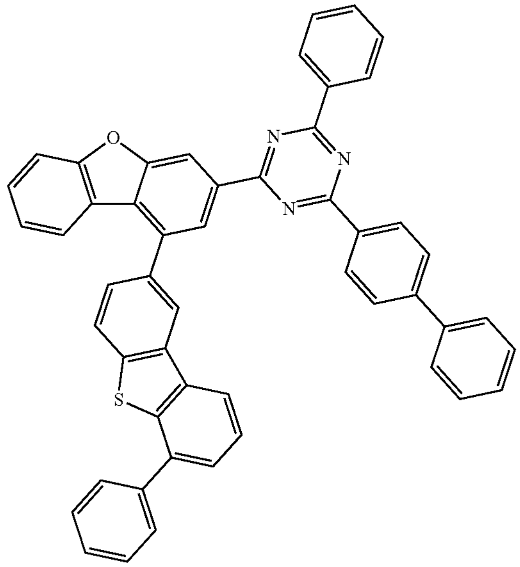 [SMILES: c1ccc(-c2ccc(-c3nc(-c4ccccc4)nc(-c4cc(-c5ccc6sc7c(-c8ccccc8)cccc7c6c5)c5c(c4)oc4ccccc45)n3)cc2)cc1]
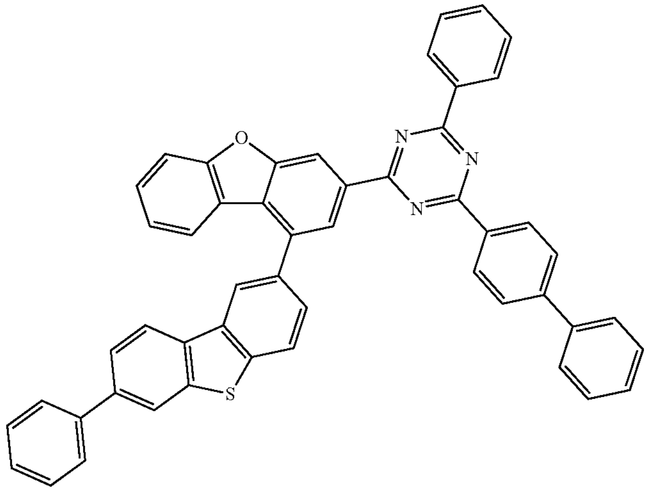 [SMILES: c1ccc(-c2ccc(-c3nc(-c4ccccc4)nc(-c4cc(-c5ccc6sc7cc(-c8ccccc8)ccc7c6c5)c5c(c4)oc4ccccc45)n3)cc2)cc1]
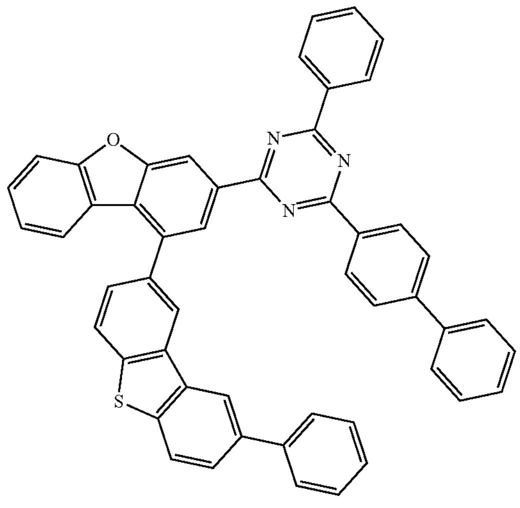 [SMILES: c1ccc(-c2ccc(-c3nc(-c4ccccc4)nc(-c4cc(-c5ccc6sc7ccc(-c8ccccc8)cc7c6c5)c5c(c4)oc4ccccc45)n3)cc2)cc1]

TABLE 1-continued
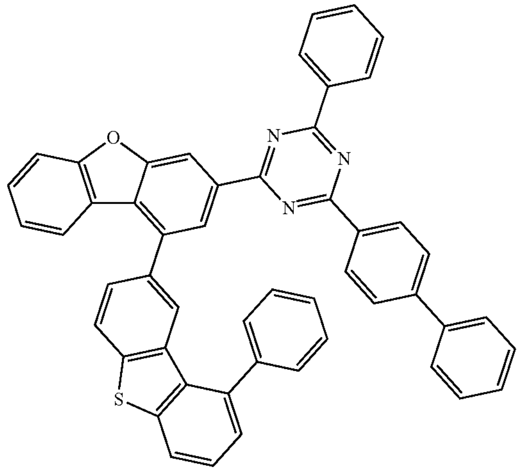 [SMILES: c1ccc(-c2ccc(-c3nc(-c4ccccc4)nc(-c4cc(-c5ccc6sc7cccc(-c8ccccc8)c7c6c5)c5c(c4)oc4ccccc45)n3)cc2)cc1]
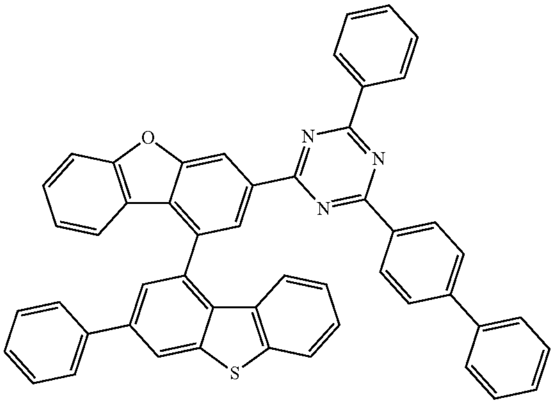 [SMILES: c1ccc(-c2ccc(-c3nc(-c4ccccc4)nc(-c4cc(-c5cc(-c6ccccc6)cc6sc7ccccc7c56)c5c(c4)oc4ccccc45)n3)cc2)cc1]
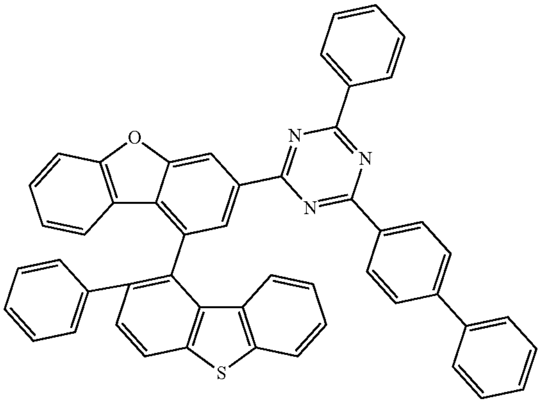 [SMILES: c1ccc(-c2ccc(-c3nc(-c4ccccc4)nc(-c4cc(-c5c(-c6ccccc6)ccc6sc7ccccc7c56)c5c(c4)oc4ccccc45)n3)cc2)cc1]

TABLE 1-continued
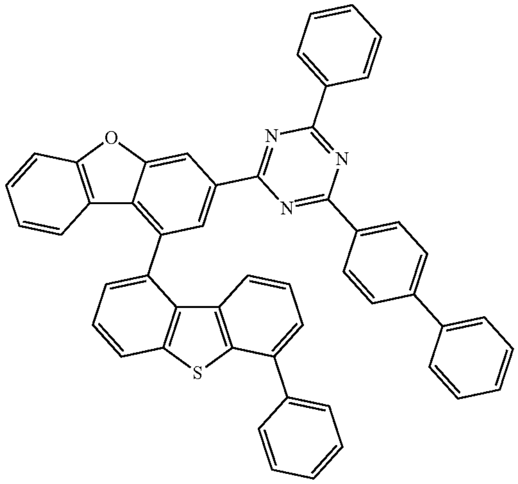 [SMILES: c1ccc(-c2ccc(-c3nc(-c4ccccc4)nc(-c4cc(-c5cccc6sc7c(-c8ccccc8)cccc7c56)c5c(c4)oc4ccccc45)n3)cc2)cc1]
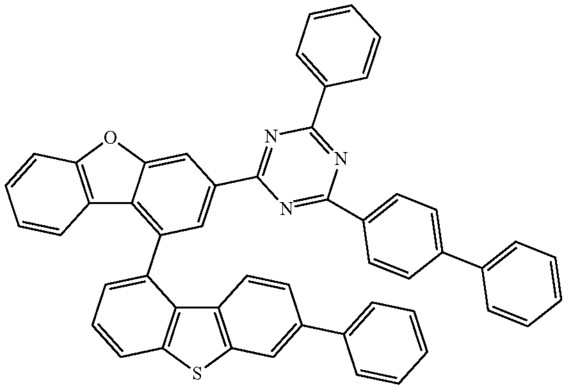 [SMILES: c1ccc(-c2ccc(-c3nc(-c4ccccc4)nc(-c4cc(-c5cccc6sc7cc(-c8ccccc8)ccc7c56)c5c(c4)oc4ccccc45)n3)cc2)cc1]
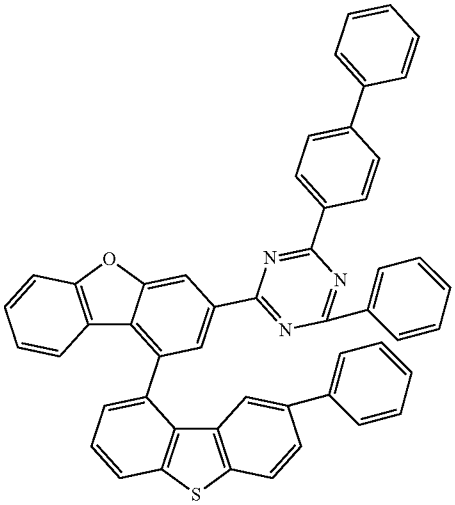 [SMILES: c1ccc(-c2ccc(-c3nc(-c4ccccc4)nc(-c4cc(-c5cccc6sc7ccc(-c8ccccc8)cc7c56)c5c(c4)oc4ccccc45)n3)cc2)cc1]

TABLE 1-continued
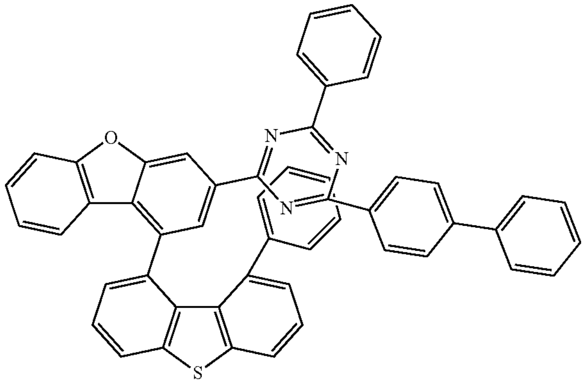 [SMILES: c1ccc(-c2ccc(-c3nc(-c4ccccc4)nc(-c4cc(-c5cccc6sc7cccc(-c8ccccc8)c7c56)c5c(c4)oc4ccccc45)n3)cc2)cc1]
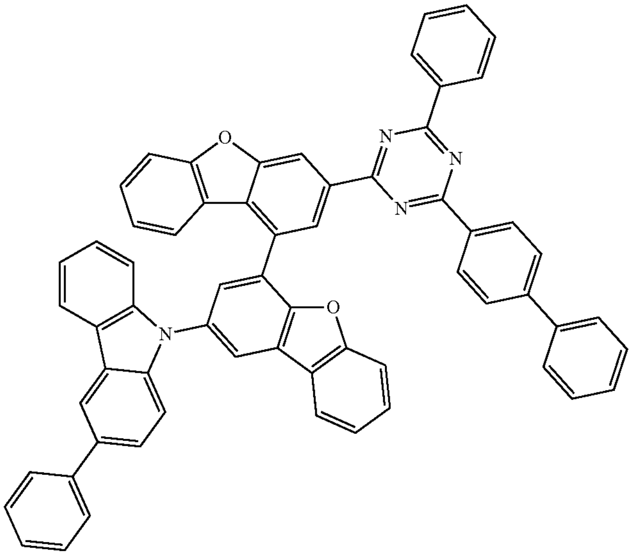 [SMILES: c1ccc(-c2ccc(-c3nc(-c4ccccc4)nc(-c4cc(-c5cc(-n6c7ccccc7c7cc(-c8ccccc8)ccc76)cc6c5oc5ccccc56)c5c(c4)oc4ccccc45)n3)cc2)cc1]
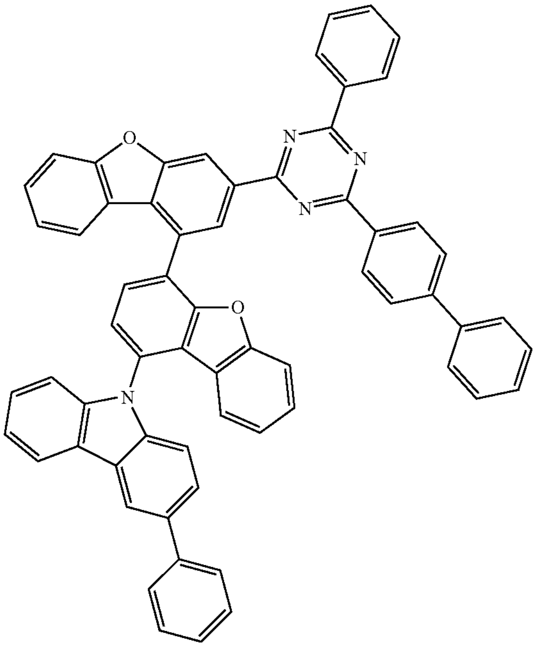 [SMILES: c1ccc(-c2ccc(-c3nc(-c4ccccc4)nc(-c4cc(-c5ccc(-n6c7ccccc7c7cc(-c8ccccc8)ccc76)c6c5oc5ccccc56)c5c(c4)oc4ccccc45)n3)cc2)cc1]

TABLE 1-continued
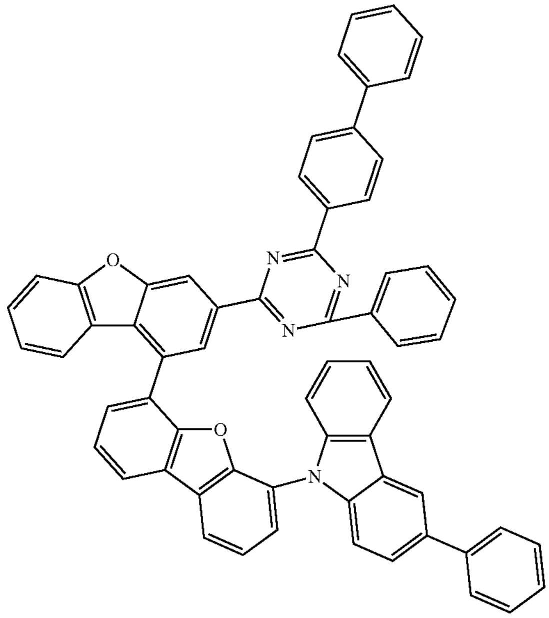 [SMILES: c1ccc(-c2ccc(-c3nc(-c4ccccc4)nc(-c4cc(-c5cccc6c5oc5c(-n7c8ccccc8c8cc(-c9ccccc9)ccc87)cccc56)c5c(c4)oc4ccccc45)n3)cc2)cc1]
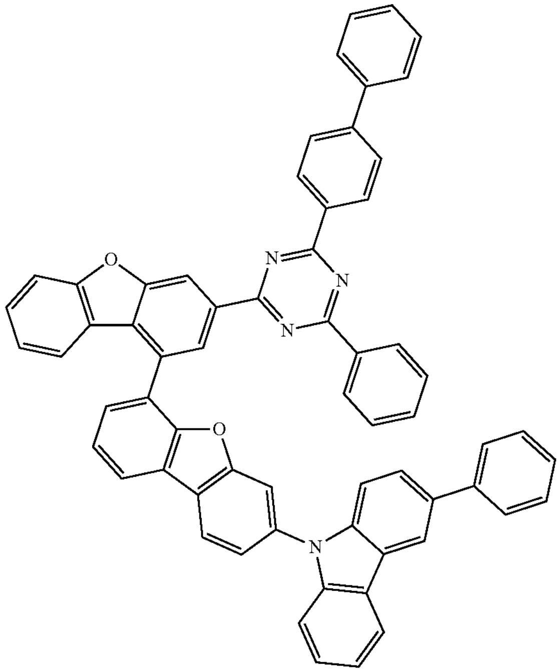 [SMILES: c1ccc(-c2ccc(-c3nc(-c4ccccc4)nc(-c4cc(-c5cccc6c5oc5cc(-n7c8ccccc8c8cc(-c9ccccc9)ccc87)ccc56)c5c(c4)oc4ccccc45)n3)cc2)cc1]

TABLE 1-continued
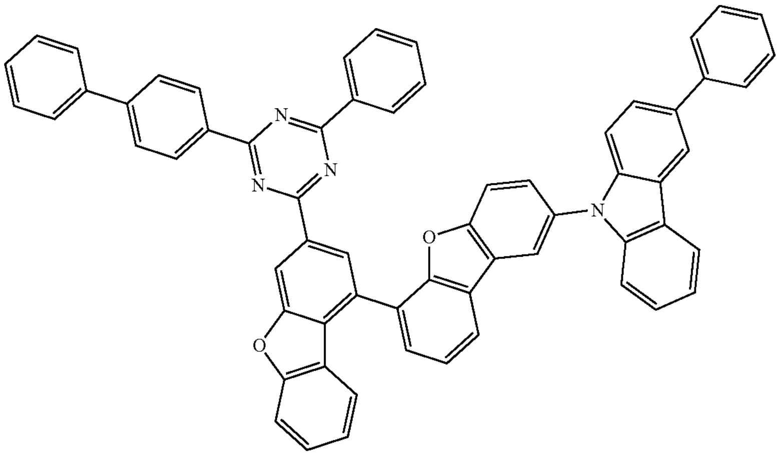 [SMILES: c1ccc(-c2ccc(-c3nc(-c4ccccc4)nc(-c4cc(-c5cccc6c5oc5ccc(-n7c8ccccc8c8cc(-c9ccccc9)ccc87)cc56)c5c(c4)oc4ccccc45)n3)cc2)cc1]
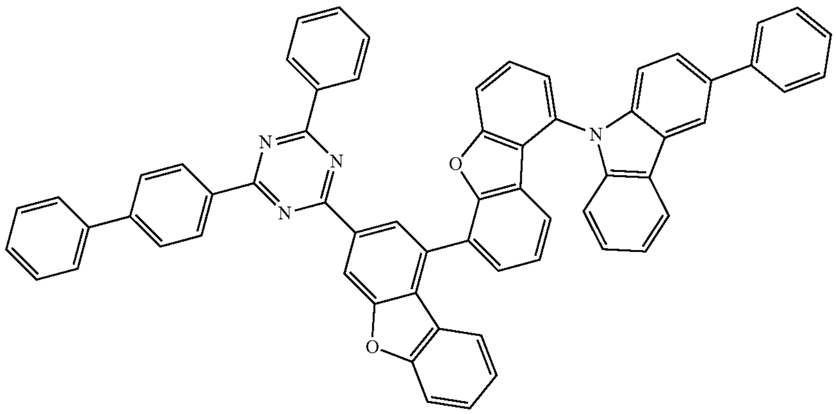 [SMILES: c1ccc(-c2ccc(-c3nc(-c4ccccc4)nc(-c4cc(-c5cccc6c5oc5cccc(-n7c8ccccc8c8cc(-c9ccccc9)ccc87)c56)c5c(c4)oc4ccccc45)n3)cc2)cc1]
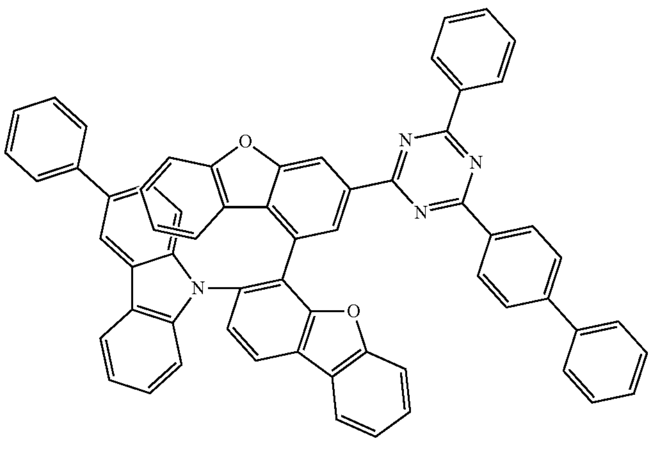 [SMILES: c1ccc(-c2ccc(-c3nc(-c4ccccc4)nc(-c4cc(-c5c(-n6c7ccccc7c7cc(-c8ccccc8)ccc76)ccc6c5oc5ccccc56)c5c(c4)oc4ccccc45)n3)cc2)cc1]

TABLE 1-continued
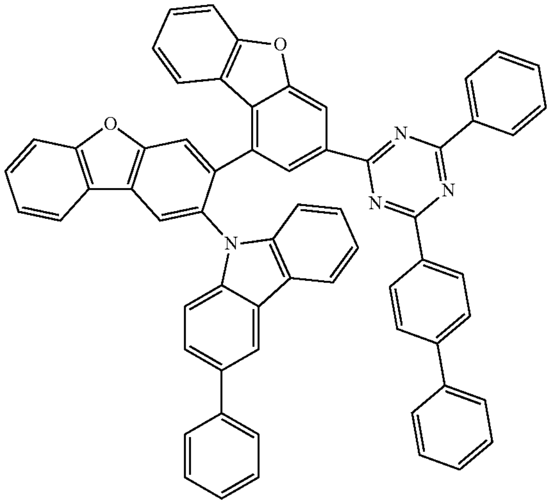 [SMILES: c1ccc(-c2ccc(-c3nc(-c4ccccc4)nc(-c4cc(-c5cc6oc7ccccc7c6cc5-n5c6ccccc6c6cc(-c7ccccc7)ccc65)c5c(c4)oc4ccccc45)n3)cc2)cc1]
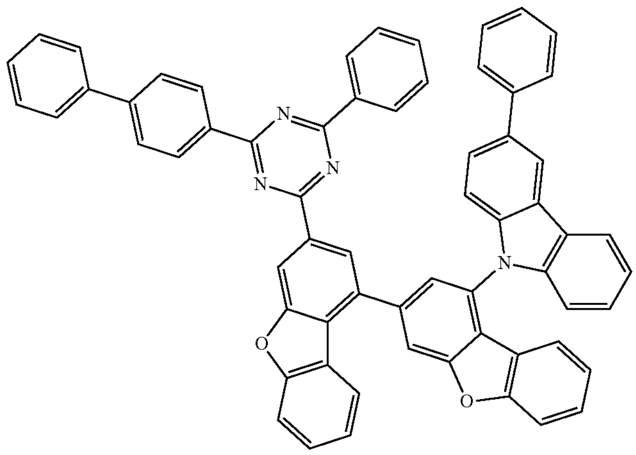 [SMILES: c1ccc(-c2ccc(-c3nc(-c4ccccc4)nc(-c4cc(-c5cc(-n6c7ccccc7c7cc(-c8ccccc8)ccc76)c6c(c5)oc5ccccc56)c5c(c4)oc4ccccc45)n3)cc2)cc1]
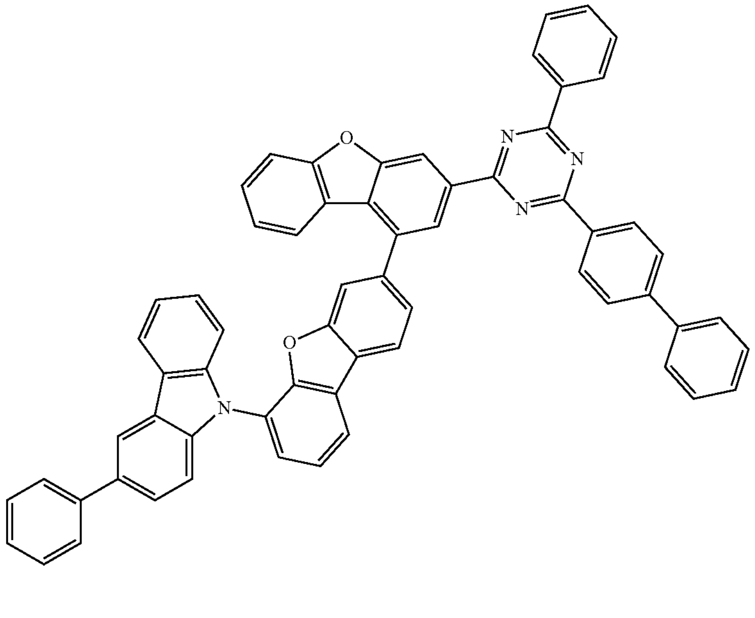 [SMILES: c1ccc(-c2ccc(-c3nc(-c4ccccc4)nc(-c4cc(-c5ccc6c(c5)oc5c(-n7c8ccccc8c8cc(-c9ccccc9)ccc87)cccc56)c5c(c4)oc4ccccc45)n3)cc2)cc1]

TABLE 1-continued
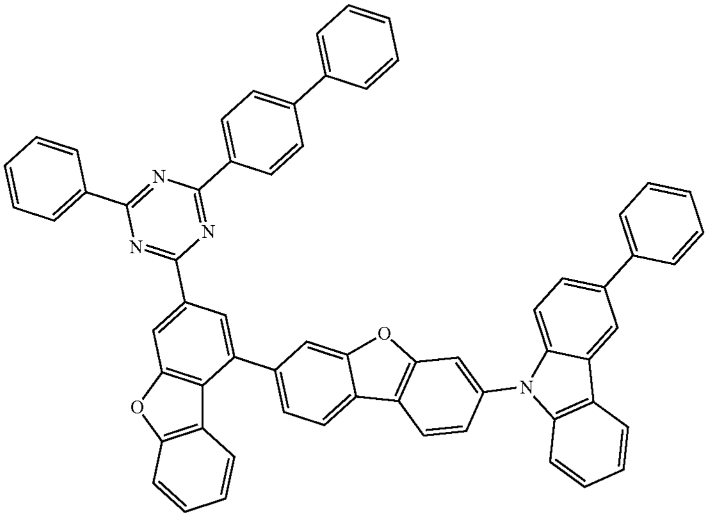 [SMILES: c1ccc(-c2ccc(-c3nc(-c4ccccc4)nc(-c4cc(-c5ccc6c(c5)oc5cc(-n7c8ccccc8c8cc(-c9ccccc9)ccc87)ccc56)c5c(c4)oc4ccccc45)n3)cc2)cc1]
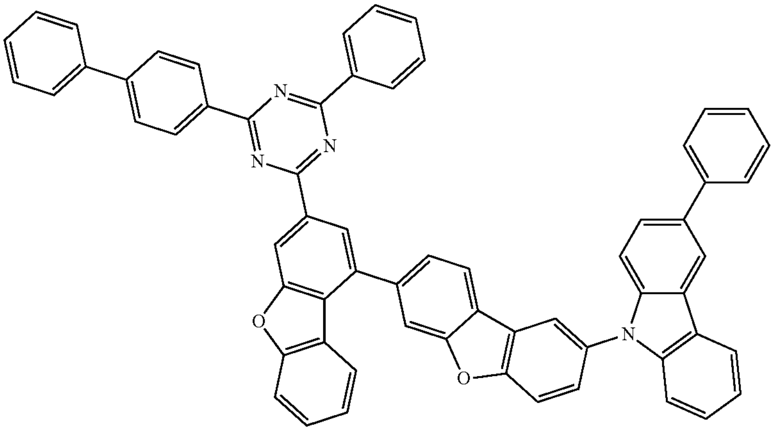 [SMILES: c1ccc(-c2ccc(-c3nc(-c4ccccc4)nc(-c4cc(-c5ccc6c(c5)oc5ccc(-n7c8ccccc8c8cc(-c9ccccc9)ccc87)cc56)c5c(c4)oc4ccccc45)n3)cc2)cc1]
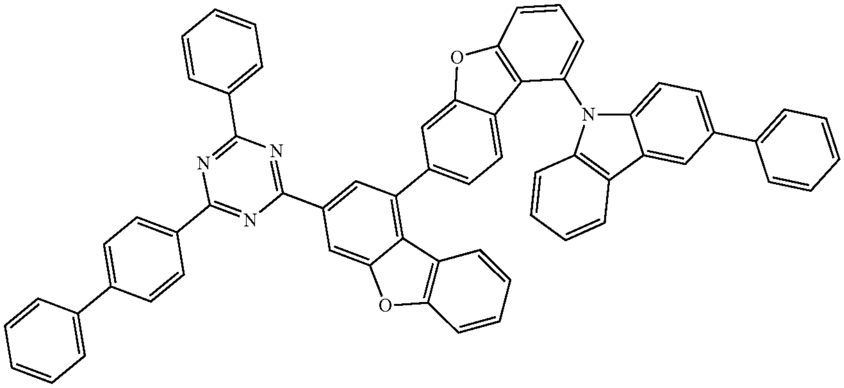 [SMILES: c1ccc(-c2ccc(-c3nc(-c4ccccc4)nc(-c4cc(-c5ccc6c(c5)oc5cccc(-n7c8ccccc8c8cc(-c9ccccc9)ccc87)c56)c5c(c4)oc4ccccc45)n3)cc2)cc1]

TABLE 1-continued
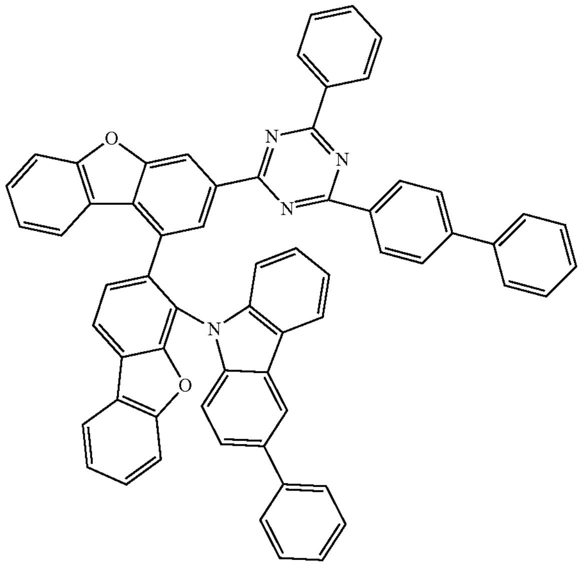 [SMILES: c1ccc(-c2ccc(-c3nc(-c4ccccc4)nc(-c4cc(-c5ccc6c(oc7ccccc76)c5-n5c6ccccc6c6cc(-c7ccccc7)ccc65)c5c(c4)oc4ccccc45)n3)cc2)cc1]
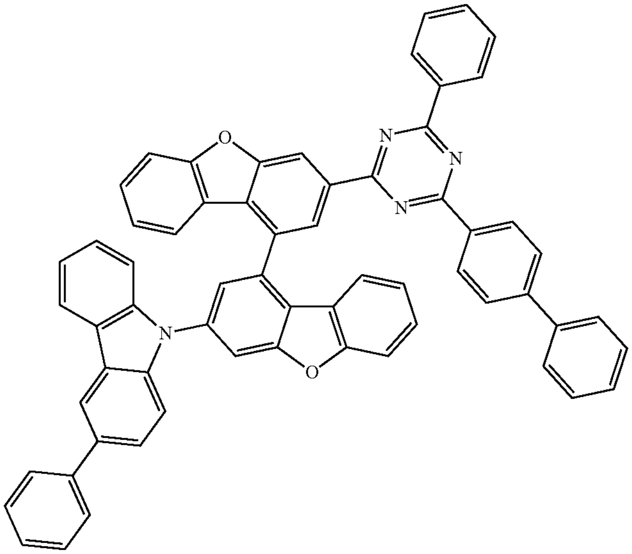 [SMILES: c1ccc(-c2ccc(-c3nc(-c4ccccc4)nc(-c4cc(-c5cc(-n6c7ccccc7c7cc(-c8ccccc8)ccc76)cc6oc7ccccc7c56)c5c(c4)oc4ccccc45)n3)cc2)cc1]
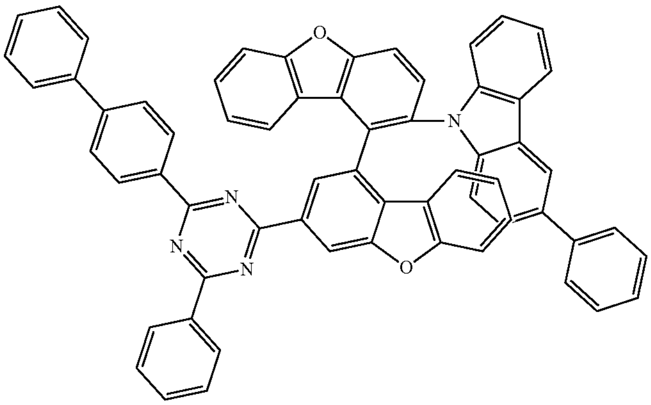 [SMILES: c1ccc(-c2ccc(-c3nc(-c4ccccc4)nc(-c4cc(-c5c(-n6c7ccccc7c7cc(-c8ccccc8)ccc76)ccc6oc7ccccc7c56)c5c(c4)oc4ccccc45)n3)cc2)cc1]

TABLE 1-continued
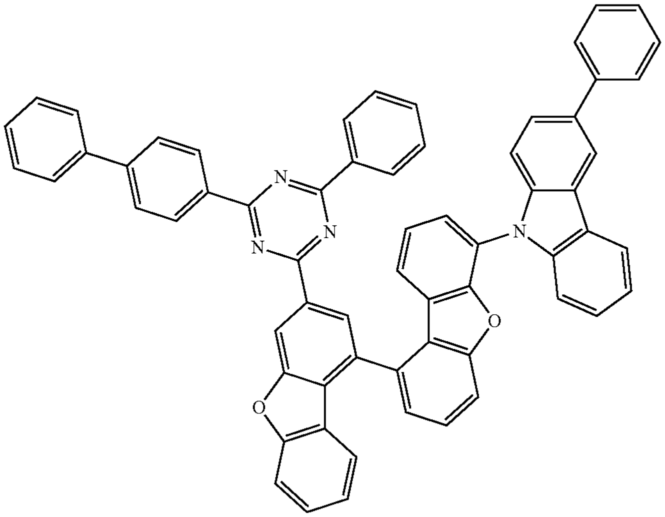 [SMILES: c1ccc(-c2ccc(-c3nc(-c4ccccc4)nc(-c4cc(-c5cccc6oc7c(-n8c9ccccc9c9cc(-c%10ccccc%10)ccc98)cccc7c56)c5c(c4)oc4ccccc45)n3)cc2)cc1]
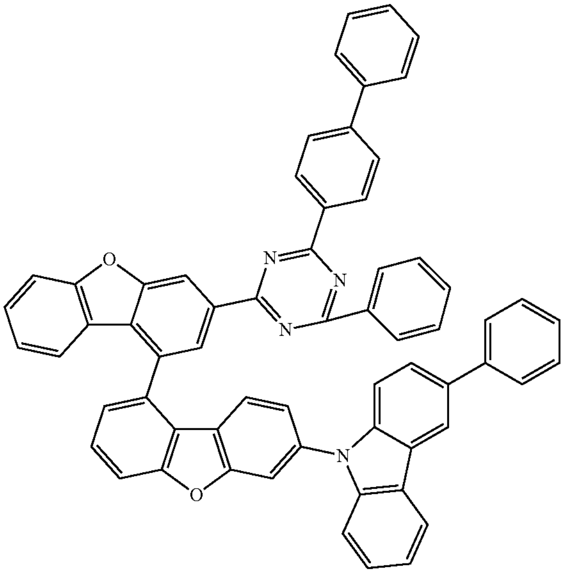 [SMILES: c1ccc(-c2ccc(-c3nc(-c4ccccc4)nc(-c4cc(-c5cccc6oc7cc(-n8c9ccccc9c9cc(-c%10ccccc%10)ccc98)ccc7c56)c5c(c4)oc4ccccc45)n3)cc2)cc1]
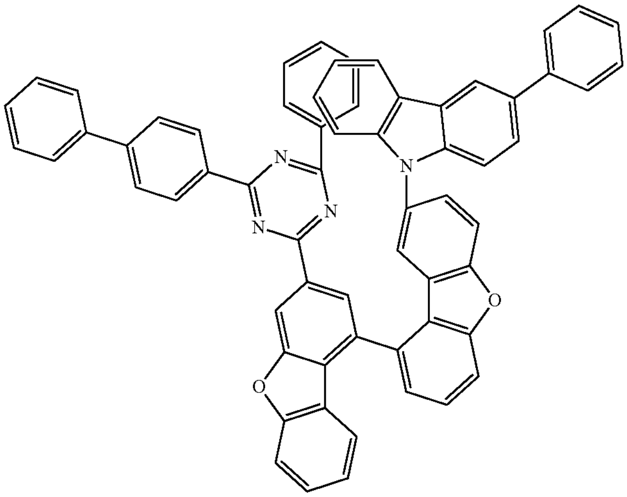 [SMILES: c1ccc(-c2ccc(-c3nc(-c4ccccc4)nc(-c4cc(-c5cccc6oc7ccc(-n8c9ccccc9c9cc(-c%10ccccc%10)ccc98)cc7c56)c5c(c4)oc4ccccc45)n3)cc2)cc1]

TABLE 1-continued
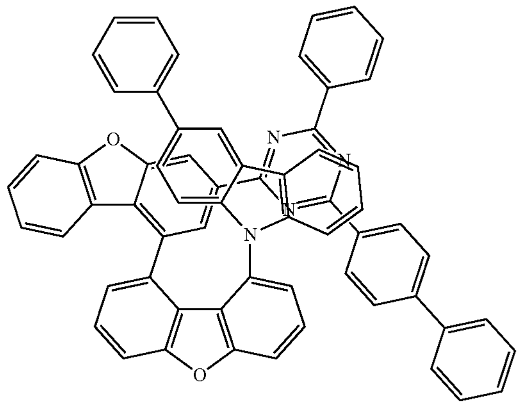 [SMILES: c1ccc(-c2ccc(-c3nc(-c4ccccc4)nc(-c4cc(-c5cccc6oc7cccc(-n8c9ccccc9c9cc(-c%10ccccc%10)ccc98)c7c56)c5c(c4)oc4ccccc45)n3)cc2)cc1]
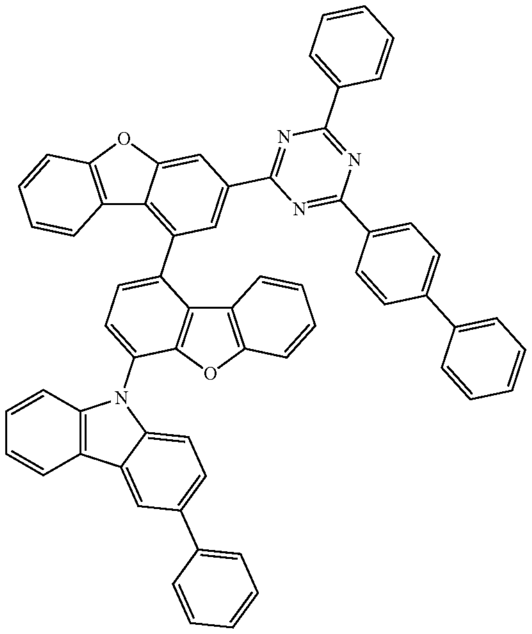 [SMILES: c1ccc(-c2ccc(-c3nc(-c4ccccc4)nc(-c4cc(-c5ccc(-n6c7ccccc7c7cc(-c8ccccc8)ccc76)c6oc7ccccc7c56)c5c(c4)oc4ccccc45)n3)cc2)cc1]
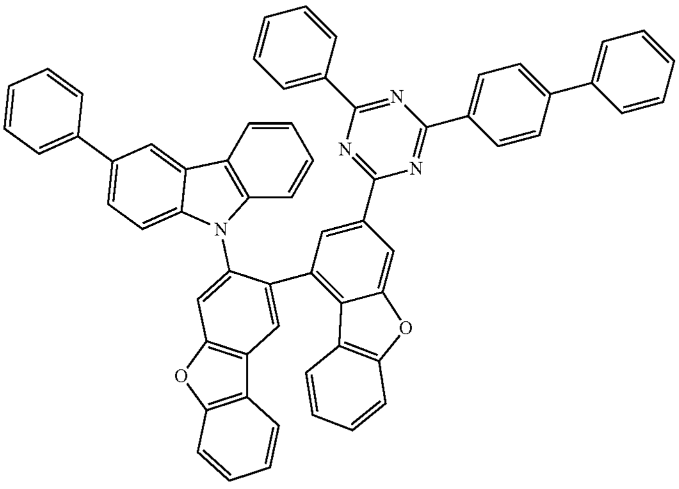 [SMILES: c1ccc(-c2ccc(-c3nc(-c4ccccc4)nc(-c4cc(-c5cc6c(cc5-n5c7ccccc7c7cc(-c8ccccc8)ccc75)oc5ccccc56)c5c(c4)oc4ccccc45)n3)cc2)cc1]

TABLE 1-continued
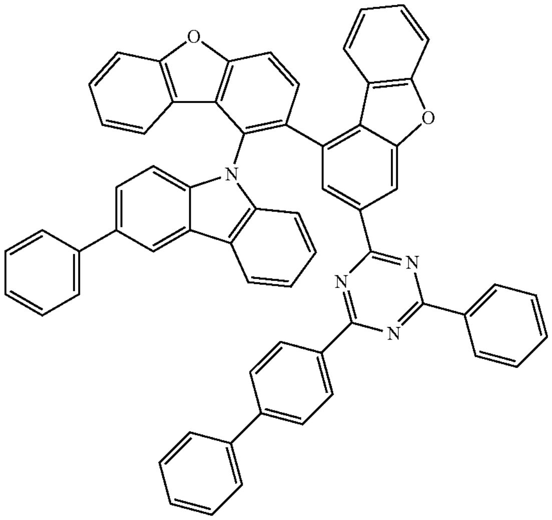 [SMILES: c1ccc(-c2ccc(-c3nc(-c4ccccc4)nc(-c4cc(-c5ccc6oc7ccccc7c6c5-n5c6ccccc6c6cc(-c7ccccc7)ccc65)c5c(c4)oc4ccccc45)n3)cc2)cc1]
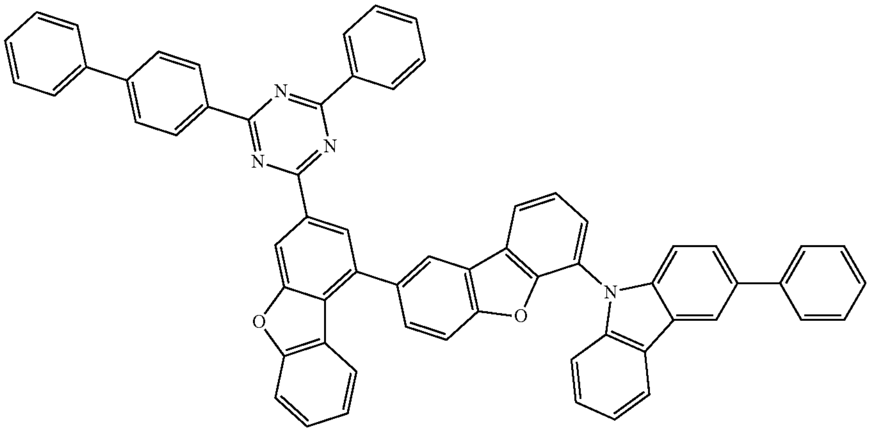 [SMILES: c1ccc(-c2ccc(-c3nc(-c4ccccc4)nc(-c4cc(-c5ccc6oc7c(-n8c9ccccc9c9cc(-c%10ccccc%10)ccc98)cccc7c6c5)c5c(c4)oc4ccccc45)n3)cc2)cc1]
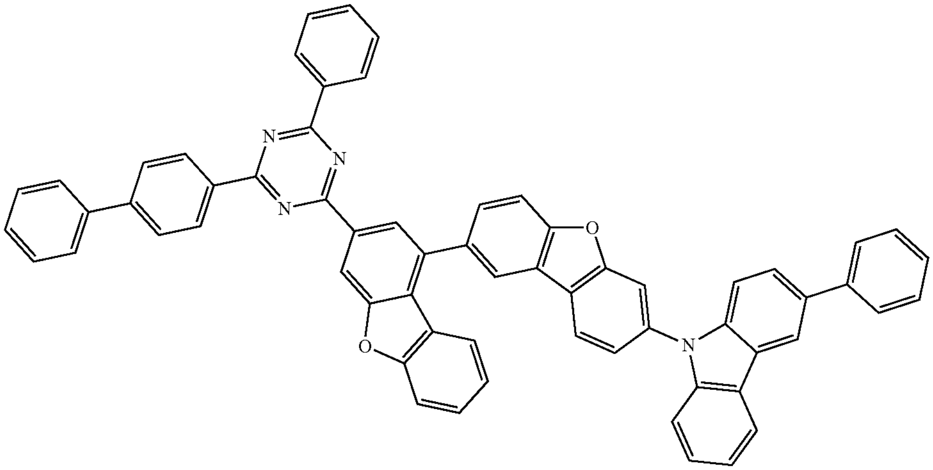 [SMILES: c1ccc(-c2ccc(-c3nc(-c4ccccc4)nc(-c4cc(-c5ccc6oc7cc(-n8c9ccccc9c9cc(-c%10ccccc%10)ccc98)ccc7c6c5)c5c(c4)oc4ccccc45)n3)cc2)cc1]

TABLE 1-continued
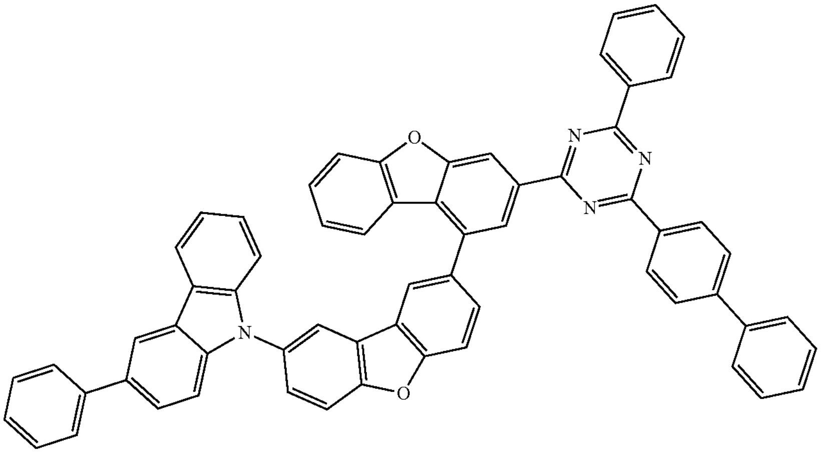 [SMILES: c1ccc(-c2ccc(-c3nc(-c4ccccc4)nc(-c4cc(-c5ccc6oc7ccc(-n8c9ccccc9c9cc(-c%10ccccc%10)ccc98)cc7c6c5)c5c(c4)oc4ccccc45)n3)cc2)cc1]
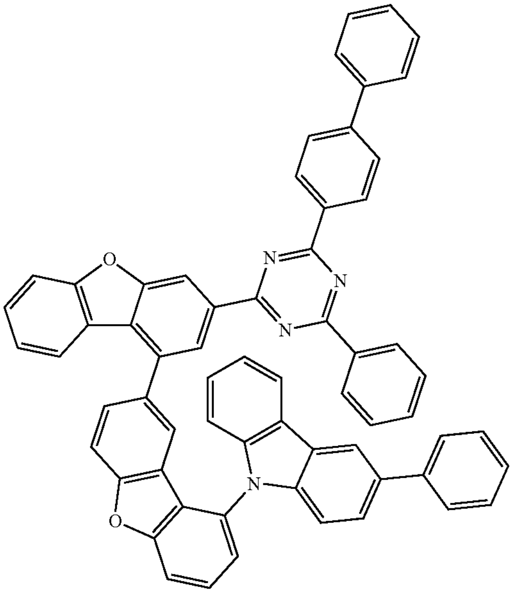 [SMILES: c1ccc(-c2ccc(-c3nc(-c4ccccc4)nc(-c4cc(-c5ccc6oc7cccc(-n8c9ccccc9c9cc(-c%10ccccc%10)ccc98)c7c6c5)c5c(c4)oc4ccccc45)n3)cc2)cc1]
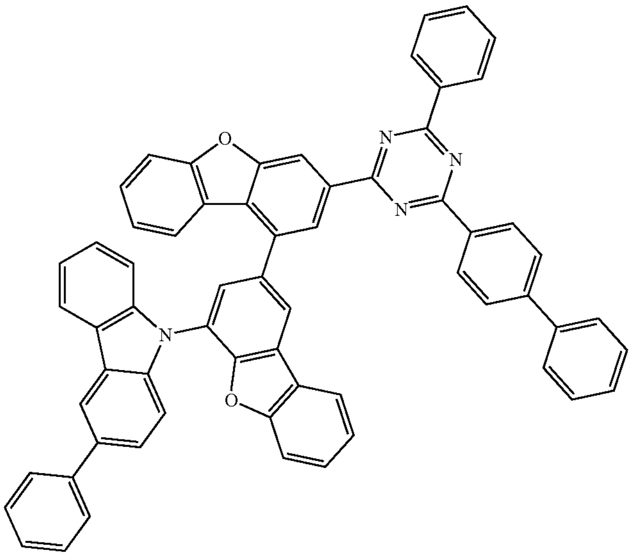 [SMILES: c1ccc(-c2ccc(-c3nc(-c4ccccc4)nc(-c4cc(-c5cc(-n6c7ccccc7c7cc(-c8ccccc8)ccc76)c6oc7ccccc7c6c5)c5c(c4)oc4ccccc45)n3)cc2)cc1]

TABLE 1-continued
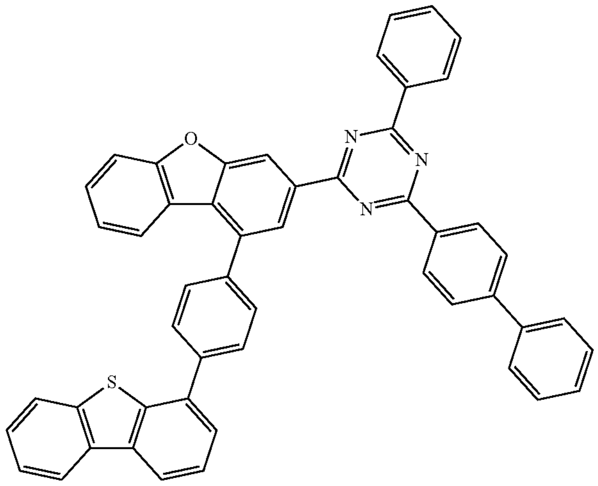 [SMILES: c1ccc(-c2ccc(-c3nc(-c4ccccc4)nc(-c4cc(-c5ccc(-c6cccc7c6sc6ccccc67)cc5)c5c(c4)oc4ccccc45)n3)cc2)cc1]
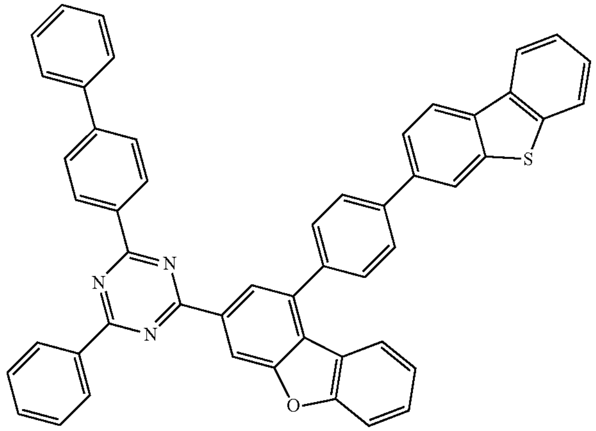 [SMILES: c1ccc(-c2ccc(-c3nc(-c4ccccc4)nc(-c4cc(-c5ccc(-c6ccc7c(c6)sc6ccccc67)cc5)c5c(c4)oc4ccccc45)n3)cc2)cc1]
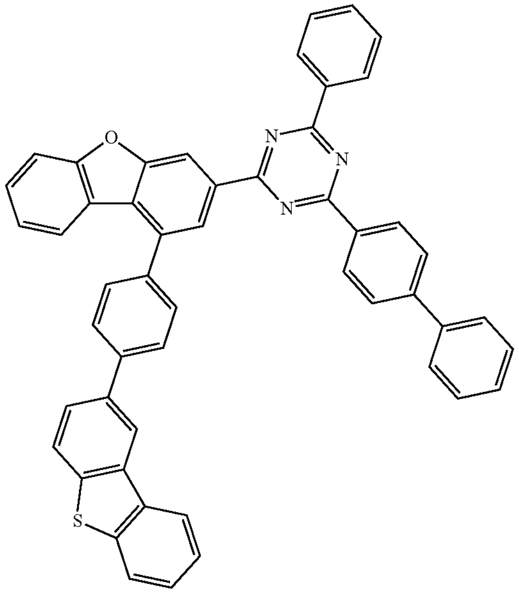 [SMILES: c1ccc(-c2ccc(-c3nc(-c4ccccc4)nc(-c4cc(-c5ccc(-c6ccc7sc8ccccc8c7c6)cc5)c5c(c4)oc4ccccc45)n3)cc2)cc1]

TABLE 1-continued
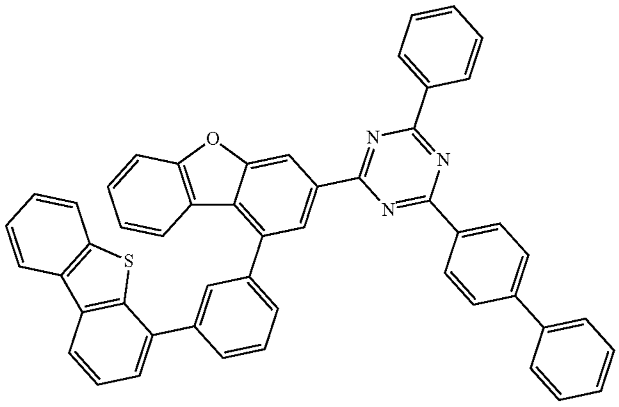 [SMILES: c1ccc(-c2ccc(-c3nc(-c4ccccc4)nc(-c4cc(-c5cccc(-c6cccc7c6sc6ccccc67)c5)c5c(c4)oc4ccccc45)n3)cc2)cc1]
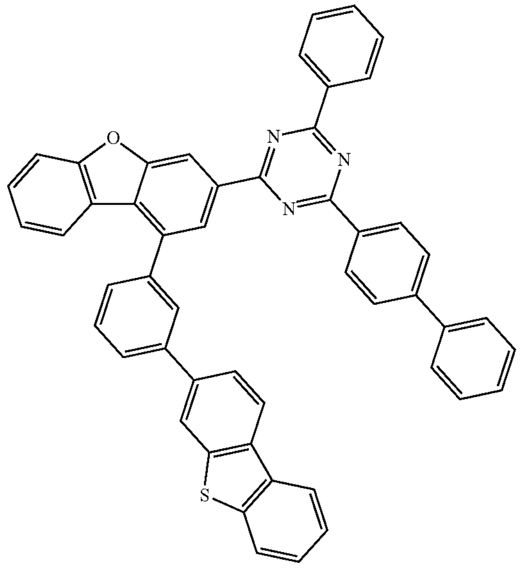 [SMILES: c1ccc(-c2ccc(-c3nc(-c4ccccc4)nc(-c4cc(-c5cccc(-c6ccc7c(c6)sc6ccccc67)c5)c5c(c4)oc4ccccc45)n3)cc2)cc1]
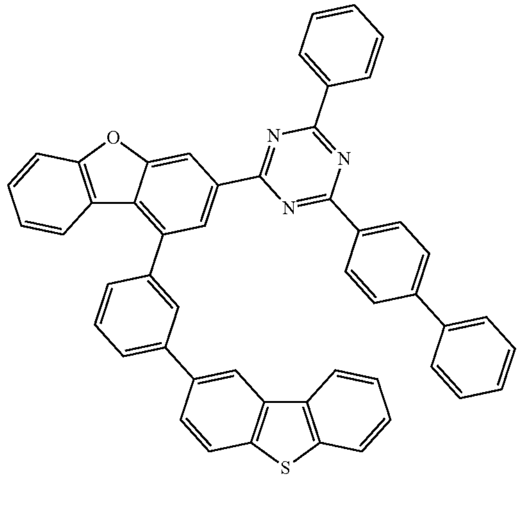 [SMILES: c1ccc(-c2ccc(-c3nc(-c4ccccc4)nc(-c4cc(-c5cccc(-c6ccc7sc8ccccc8c7c6)c5)c5c(c4)oc4ccccc45)n3)cc2)cc1]

TABLE 1-continued
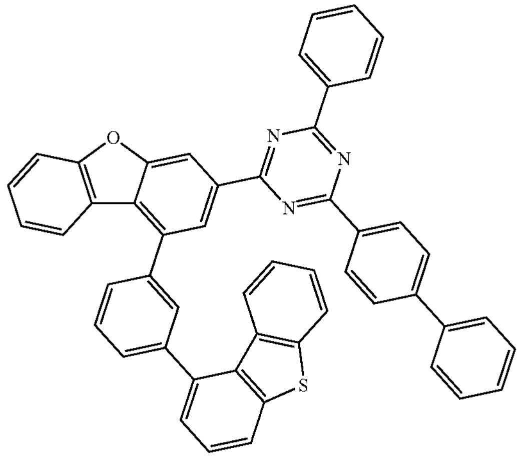 [SMILES: c1ccc(-c2ccc(-c3nc(-c4ccccc4)nc(-c4cc(-c5cccc(-c6cccc7sc8ccccc8c67)c5)c5c(c4)oc4ccccc45)n3)cc2)cc1]
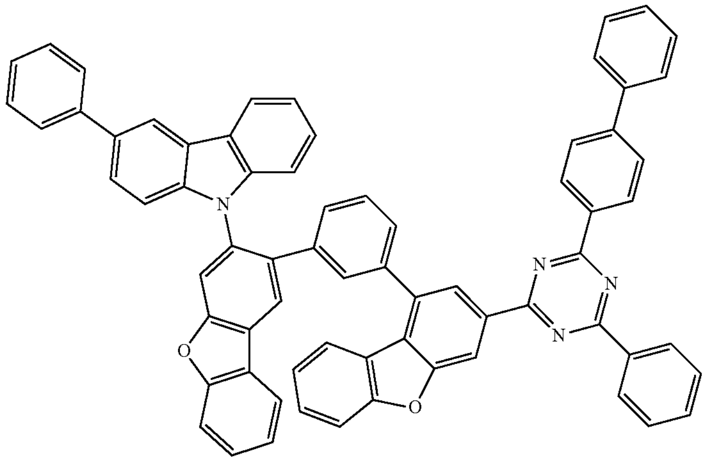 [SMILES: c1ccc(-c2ccc(-c3nc(-c4ccccc4)nc(-c4cc(-c5cccc(-c6cc7c(cc6-n6c8ccccc8c8cc(-c9ccccc9)ccc86)oc6ccccc67)c5)c5c(c4)oc4ccccc45)n3)cc2)cc1]
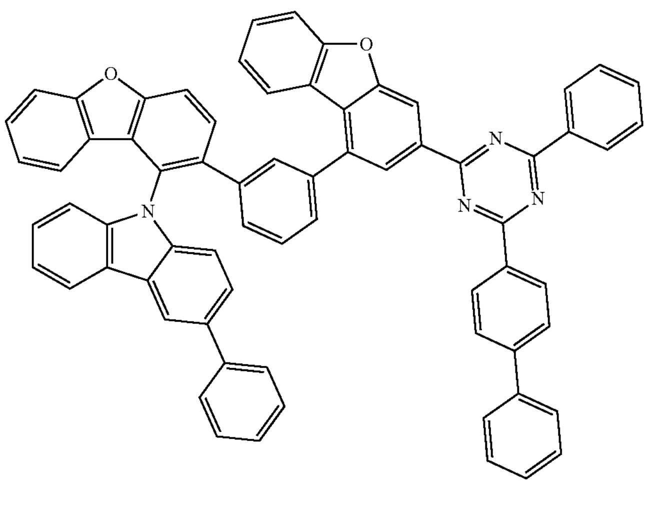 [SMILES: c1ccc(-c2ccc(-c3nc(-c4ccccc4)nc(-c4cc(-c5cccc(-c6ccc7oc8ccccc8c7c6-n6c7ccccc7c7cc(-c8ccccc8)ccc76)c5)c5c(c4)oc4ccccc45)n3)cc2)cc1]

TABLE 1-continued
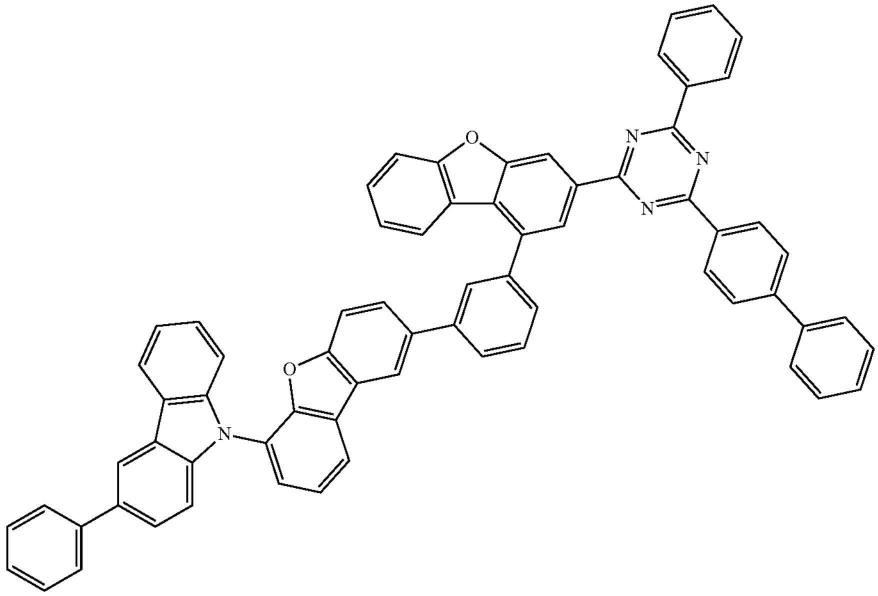 [SMILES: c1ccc(-c2ccc(-c3nc(-c4ccccc4)nc(-c4cc(-c5cccc(-c6ccc7oc8c(-n9c%10ccccc%10c%10cc(-c%11ccccc%11)ccc%109)cccc8c7c6)c5)c5c(c4)oc4ccccc45)n3)cc2)cc1]
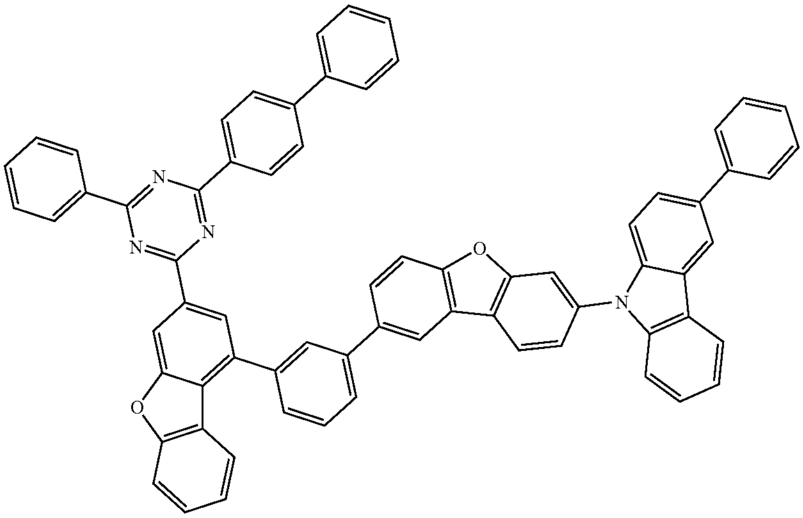 [SMILES: c1ccc(-c2ccc(-c3nc(-c4ccccc4)nc(-c4cc(-c5cccc(-c6ccc7oc8cc(-n9c%10ccccc%10c%10cc(-c%11ccccc%11)ccc%109)ccc8c7c6)c5)c5c(c4)oc4ccccc45)n3)cc2)cc1]
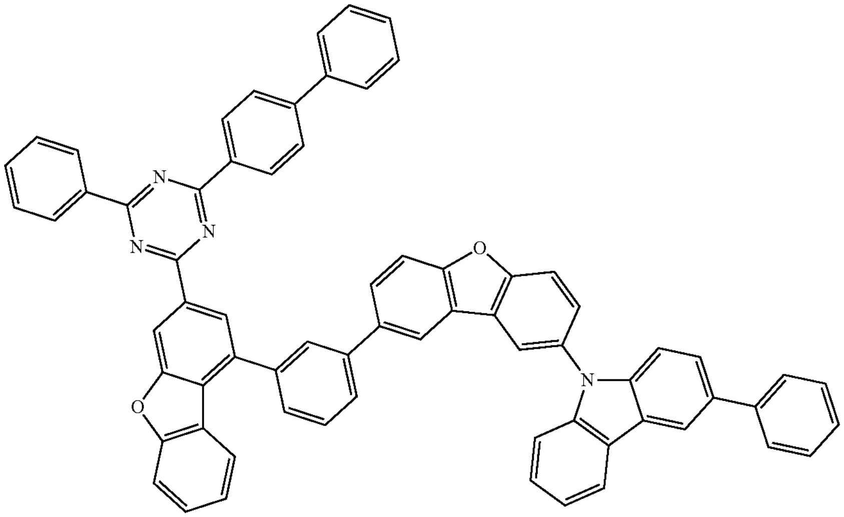 [SMILES: c1ccc(-c2ccc(-c3nc(-c4ccccc4)nc(-c4cc(-c5cccc(-c6ccc7oc8ccc(-n9c%10ccccc%10c%10cc(-c%11ccccc%11)ccc%109)cc8c7c6)c5)c5c(c4)oc4ccccc45)n3)cc2)cc1]

TABLE 1-continued
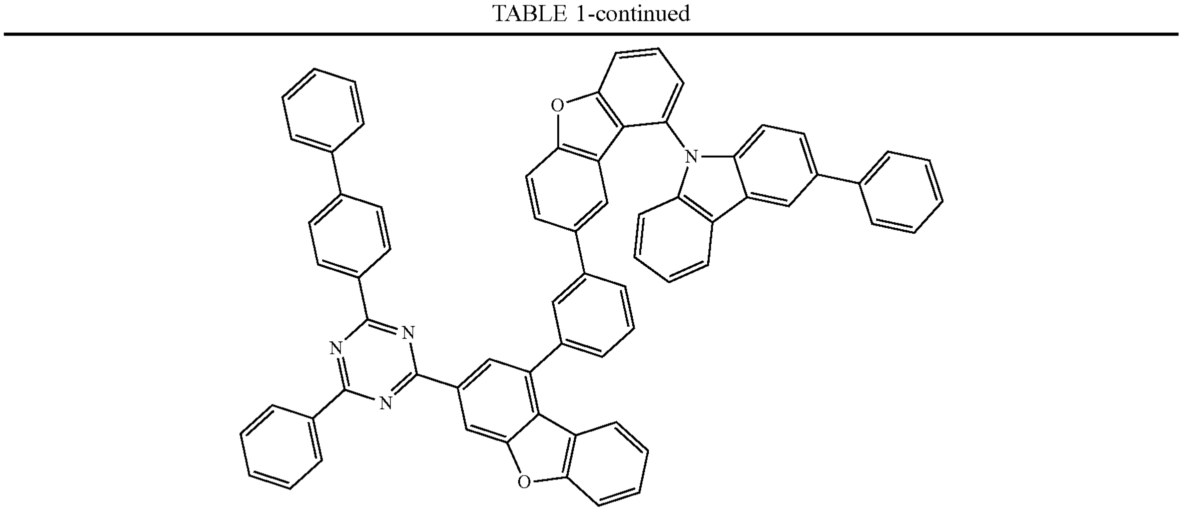
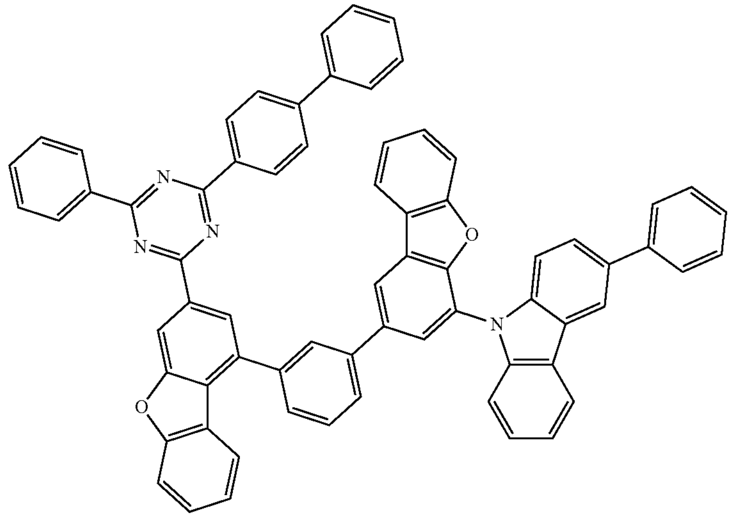 [SMILES: c1ccc(-c2ccc(-c3nc(-c4ccccc4)nc(-c4cc(-c5cccc(-c6cc(-n7c8ccccc8c8cc(-c9ccccc9)ccc87)c7oc8ccccc8c7c6)c5)c5c(c4)oc4ccccc45)n3)cc2)cc1]
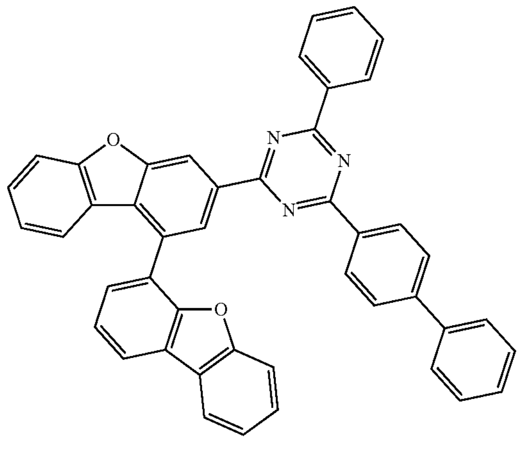 [SMILES: c1ccc(-c2ccc(-c3nc(-c4ccccc4)nc(-c4cc(-c5cccc6c5oc5ccccc56)c5c(c4)oc4ccccc45)n3)cc2)cc1]

TABLE 1-continued
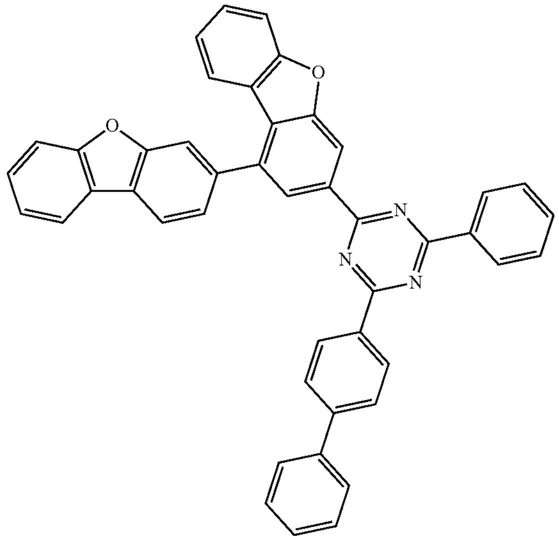 [SMILES: c1ccc(-c2ccc(-c3nc(-c4ccccc4)nc(-c4cc(-c5ccc6c(c5)oc5ccccc56)c5c(c4)oc4ccccc45)n3)cc2)cc1]
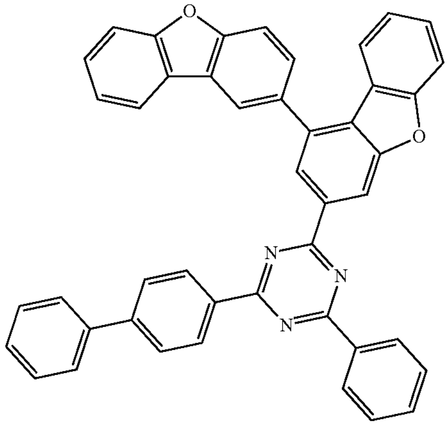 [SMILES: c1ccc(-c2ccc(-c3nc(-c4ccccc4)nc(-c4cc(-c5ccc6oc7ccccc7c6c5)c5c(c4)oc4ccccc45)n3)cc2)cc1]
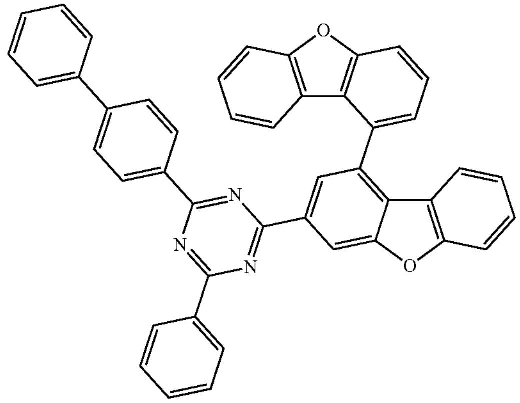 [SMILES: c1ccc(-c2ccc(-c3nc(-c4ccccc4)nc(-c4cc(-c5cccc6oc7ccccc7c56)c5c(c4)oc4ccccc45)n3)cc2)cc1]

TABLE 1-continued
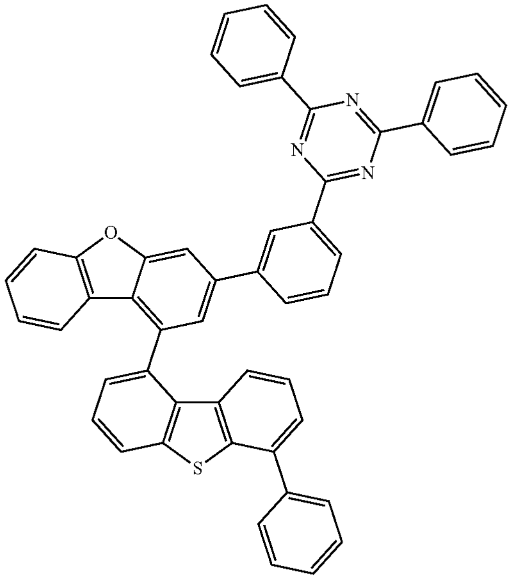 [SMILES: c1ccc(-c2nc(-c3ccccc3)nc(-c3cccc(-c4cc(-c5cccc6sc7c(-c8ccccc8)cccc7c56)c5c(c4)oc4ccccc45)c3)n2)cc1]
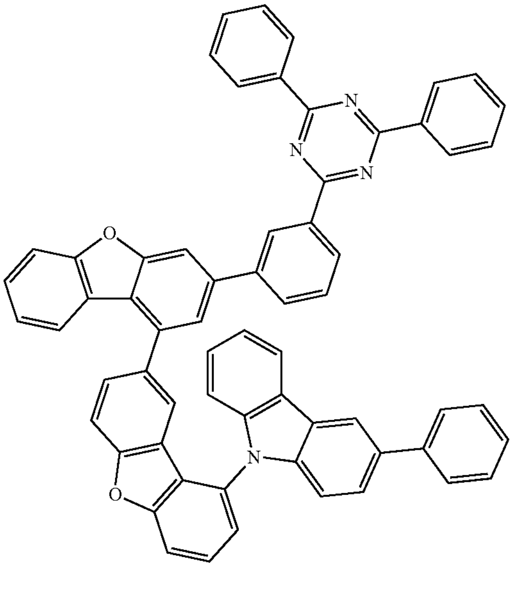 [SMILES: c1ccc(-c2ccc3c(c2)c2ccccc2n3-c2cccc3oc4ccc(-c5cc(-c6cccc(-c7nc(-c8ccccc8)nc(-c8ccccc8)n7)c6)cc6oc7ccccc7c56)cc4c23)cc1]
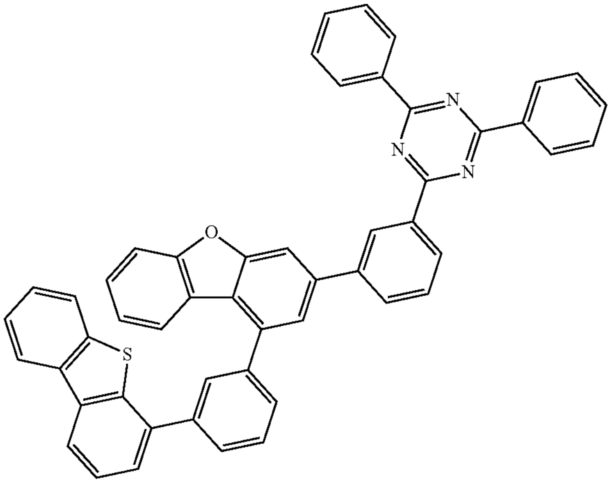 [SMILES: c1ccc(-c2nc(-c3ccccc3)nc(-c3cccc(-c4cc(-c5cccc(-c6cccc7c6sc6ccccc67)c5)c5c(c4)oc4ccccc45)c3)n2)cc1]

TABLE 1-continued
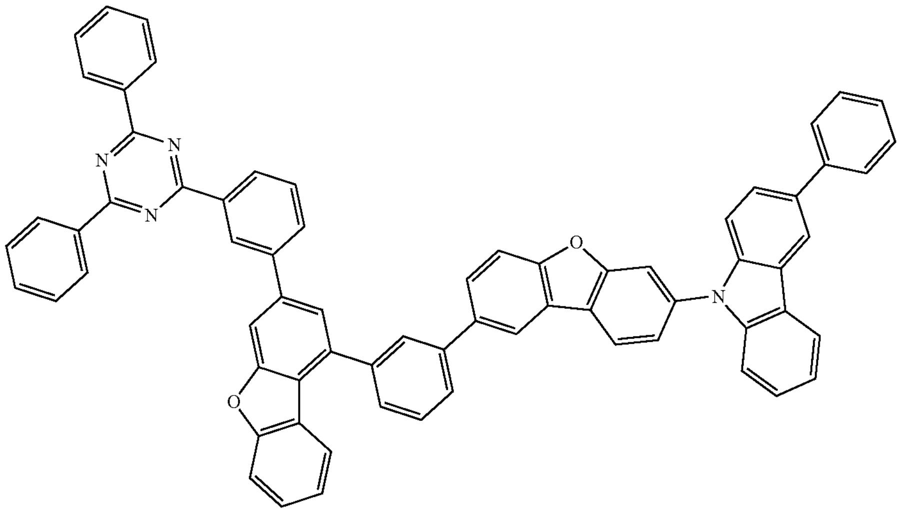 [SMILES: c1ccc(-c2ccc3c(c2)c2ccccc2n3-c2ccc3c(c2)oc2ccc(-c4cccc(-c5cc(-c6cccc(-c7nc(-c8ccccc8)nc(-c8ccccc8)n7)c6)cc6oc7ccccc7c56)c4)cc23)cc1]
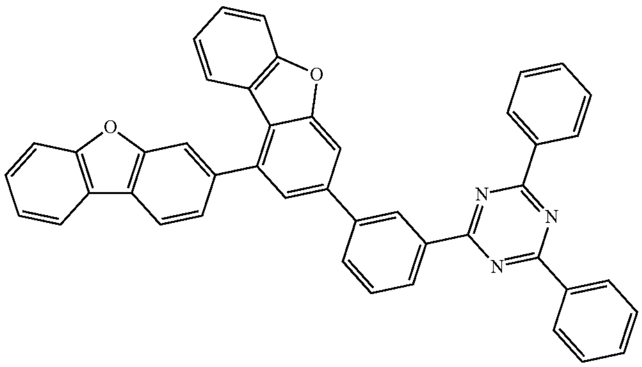 [SMILES: c1ccc(-c2nc(-c3ccccc3)nc(-c3cccc(-c4cc(-c5ccc6c(c5)oc5ccccc56)c5c(c4)oc4ccccc45)c3)n2)cc1]
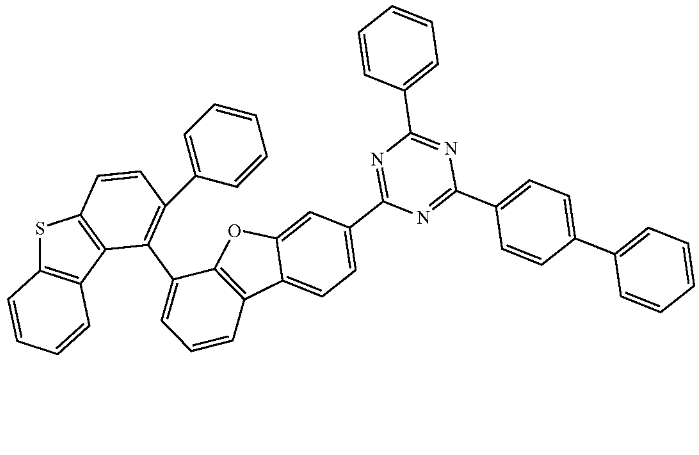 [SMILES: c1ccc(-c2ccc(-c3nc(-c4ccccc4)nc(-c4ccc5c(c4)oc4c(-c6c(-c7ccccc7)ccc7sc8ccccc8c67)cccc45)n3)cc2)cc1]

TABLE 1-continued
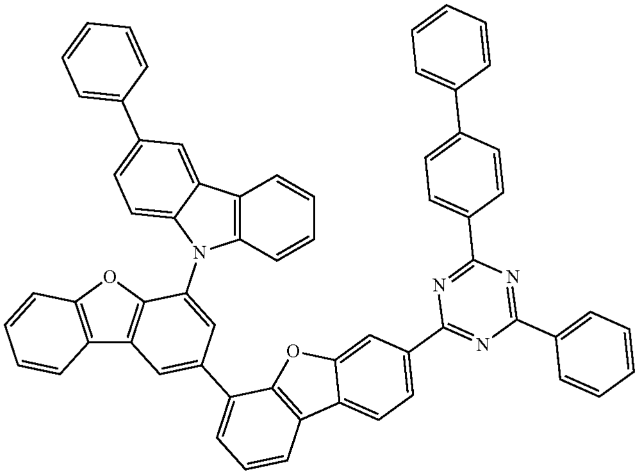 [SMILES: c1ccc(-c2ccc(-c3nc(-c4ccccc4)nc(-c4ccc5c(c4)oc4c(-c6cc(-n7c8ccccc8c8cc(-c9ccccc9)ccc87)c7oc8ccccc8c7c6)cccc45)n3)cc2)cc1]
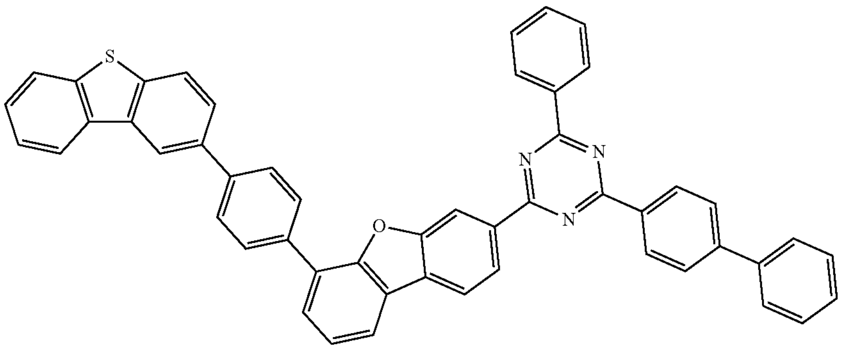 [SMILES: c1ccc(-c2ccc(-c3nc(-c4ccccc4)nc(-c4ccc5c(c4)oc4c(-c6ccc(-c7ccc8sc9ccccc9c8c7)cc6)cccc45)n3)cc2)cc1]
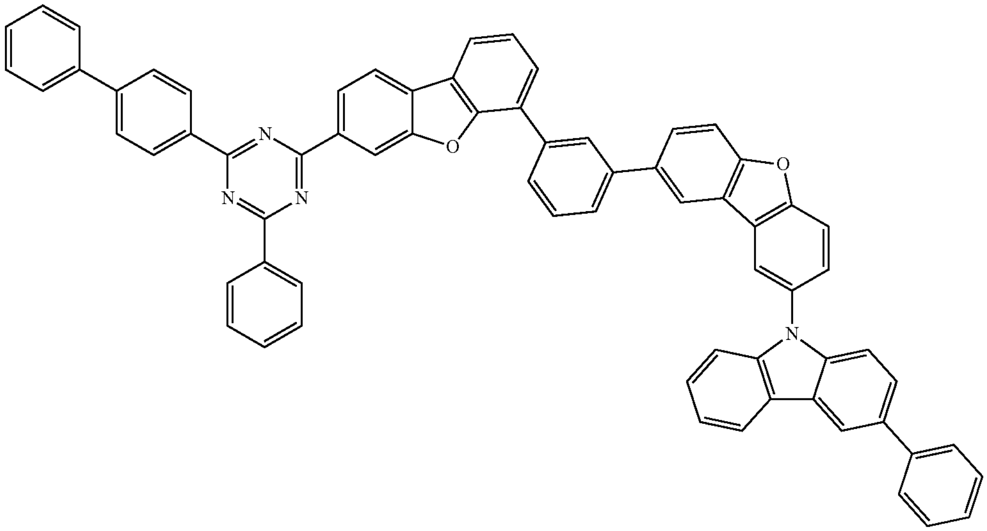 [SMILES: c1ccc(-c2ccc(-c3nc(-c4ccccc4)nc(-c4ccc5c(c4)oc4c(-c6cccc(-c7ccc8oc9ccc(-n%10c%11ccccc%11c%11cc(-c%12ccccc%12)ccc%11%10)cc9c8c7)c6)cccc45)n3)cc2)cc1]

TABLE 1-continued
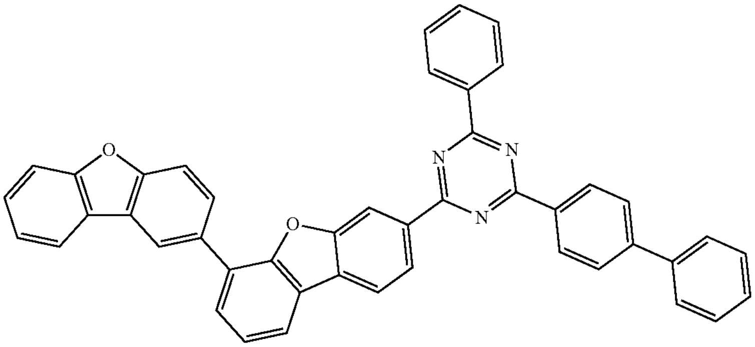 [SMILES: c1ccc(-c2ccc(-c3nc(-c4ccccc4)nc(-c4ccc5c(c4)oc4c(-c6ccc7oc8ccccc8c7c6)cccc45)n3)cc2)cc1]
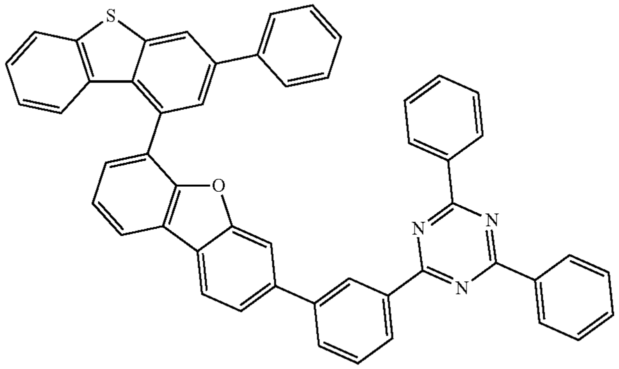 [SMILES: c1ccc(-c2cc(-c3cccc4c3oc3cc(-c5cccc(-c6nc(-c7ccccc7)nc(-c7ccccc7)n6)c5)ccc34)c3c(c2)sc2ccccc23)cc1]
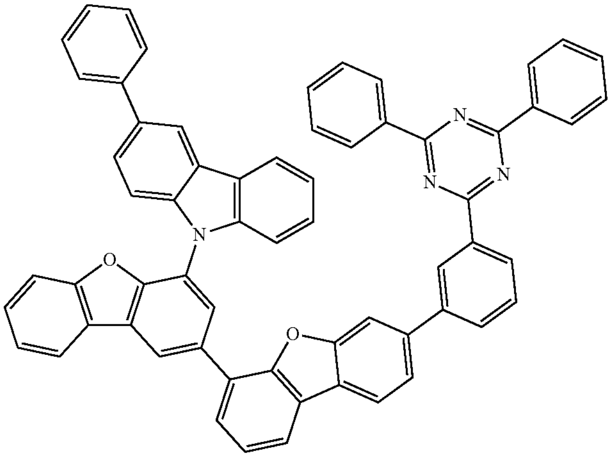 [SMILES: c1ccc(-c2ccc3c(c2)c2ccccc2n3-c2cc(-c3cccc4c3oc3cc(-c5cccc(-c6nc(-c7ccccc7)nc(-c7ccccc7)n6)c5)ccc34)cc3c2oc2ccccc23)cc1]
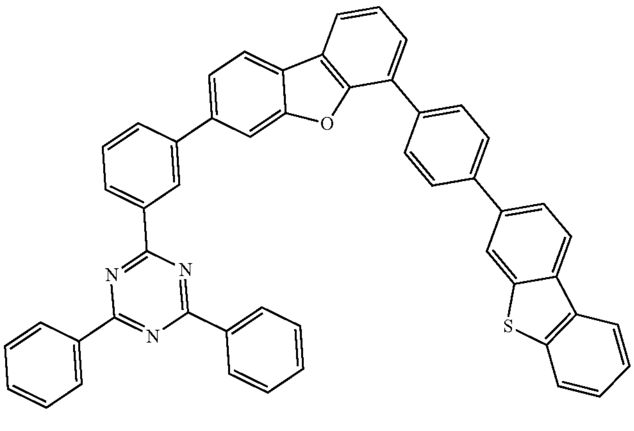 [SMILES: c1ccc(-c2nc(-c3ccccc3)nc(-c3cccc(-c4ccc5c(c4)oc4c(-c6ccc(-c7ccc8c(c7)sc7ccccc78)cc6)cccc45)c3)n2)cc1]

TABLE 1-continued
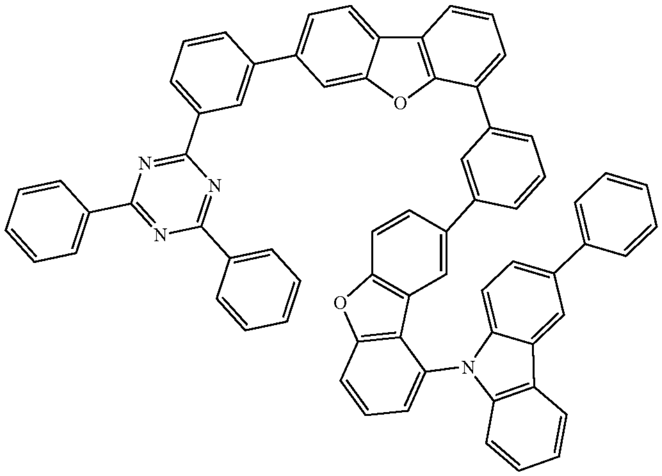 [SMILES: c1ccc(-c2ccc3c(c2)c2ccccc2n3-c2cccc3oc4ccc(-c5cccc(-c6cccc7c6oc6cc(-c8cccc(-c9nc(-c%10ccccc%10)nc(-c%10ccccc%10)n9)c8)ccc67)c5)cc4c23)cc1]
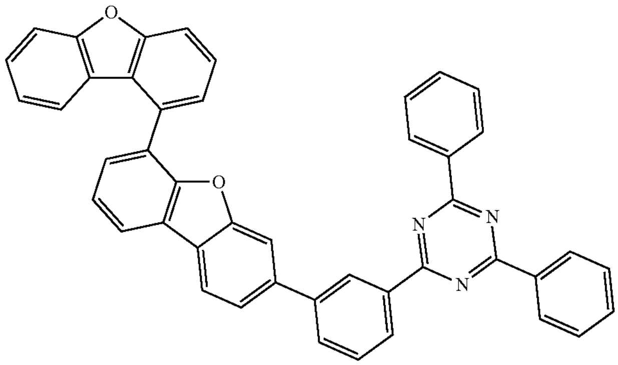 [SMILES: c1ccc(-c2nc(-c3ccccc3)nc(-c3cccc(-c4ccc5c(c4)oc4c(-c6cccc7oc8ccccc8c67)cccc45)c3)n2)cc1]
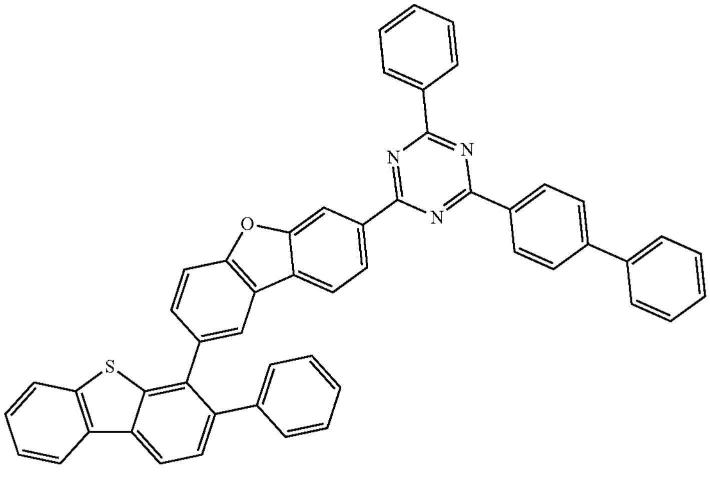 [SMILES: c1ccc(-c2ccc(-c3nc(-c4ccccc4)nc(-c4ccc5c(c4)oc4ccc(-c6c(-c7ccccc7)ccc7c6sc6ccccc67)cc45)n3)cc2)cc1]

TABLE 1-continued
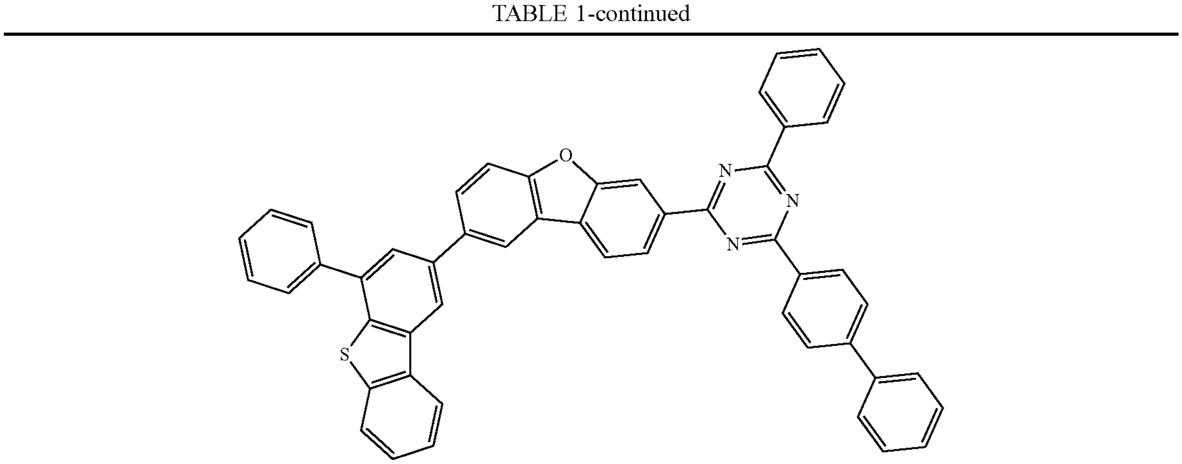
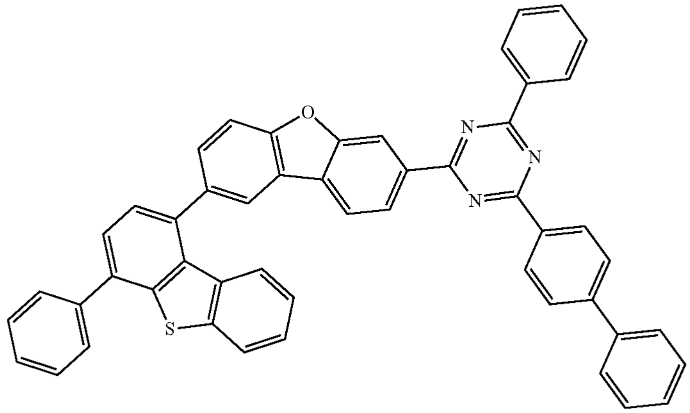 [SMILES: c1ccc(-c2ccc(-c3nc(-c4ccccc4)nc(-c4ccc5c(c4)oc4ccc(-c6ccc(-c7ccccc7)c7sc8ccccc8c67)cc45)n3)cc2)cc1]
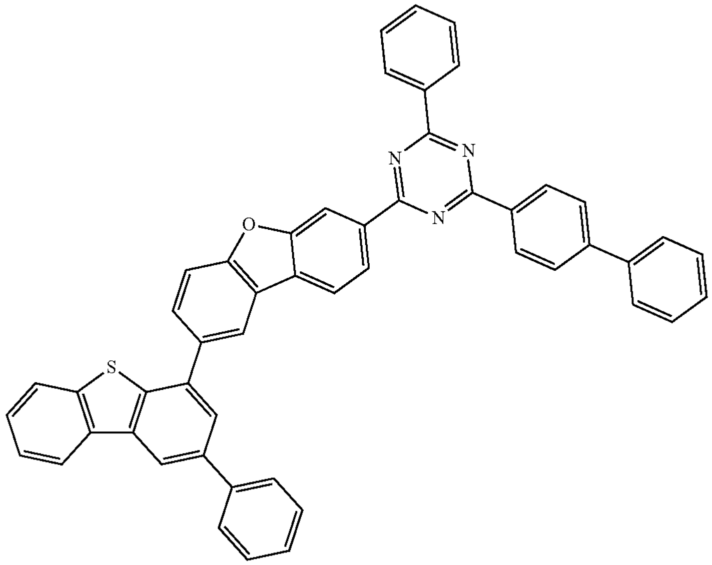 [SMILES: c1ccc(-c2ccc(-c3nc(-c4ccccc4)nc(-c4ccc5c(c4)oc4ccc(-c6cc(-c7ccccc7)cc7c6sc6ccccc67)cc45)n3)cc2)cc1]

TABLE 1-continued
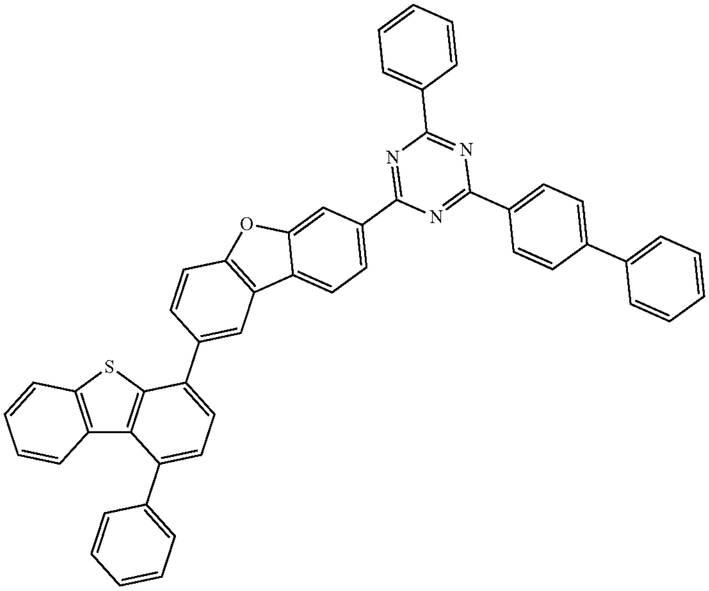 [SMILES: c1ccc(-c2ccc(-c3nc(-c4ccccc4)nc(-c4ccc5c(c4)oc4ccc(-c6ccc(-c7ccccc7)c7c6sc6ccccc67)cc45)n3)cc2)cc1]
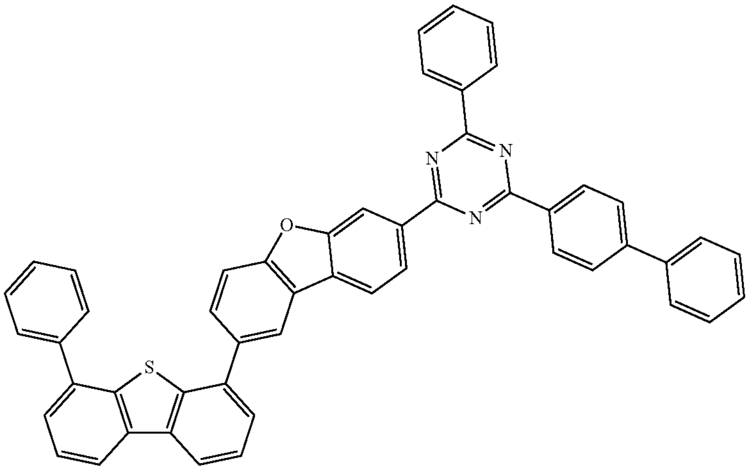 [SMILES: c1ccc(-c2ccc(-c3nc(-c4ccccc4)nc(-c4ccc5c(c4)oc4ccc(-c6cccc7c6sc6c(-c8ccccc8)cccc67)cc45)n3)cc2)cc1]
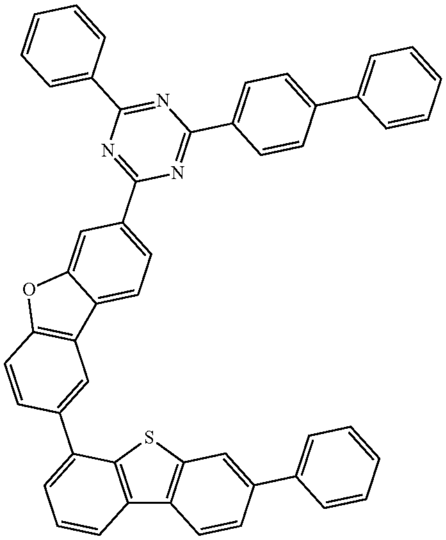 [SMILES: c1ccc(-c2ccc(-c3nc(-c4ccccc4)nc(-c4ccc5c(c4)oc4ccc(-c6cccc7c6sc6cc(-c8ccccc8)ccc67)cc45)n3)cc2)cc1]

TABLE 1-continued
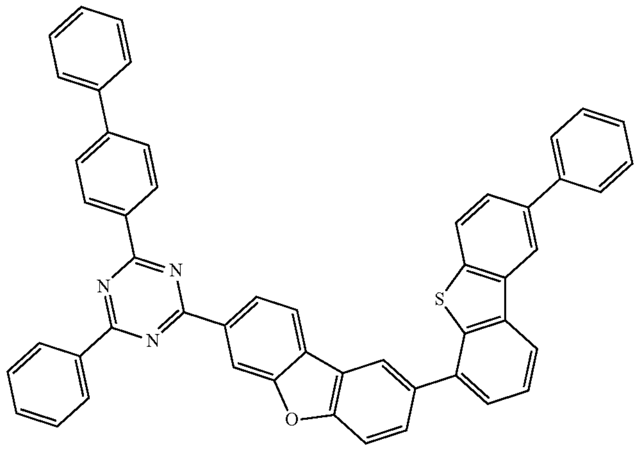 [SMILES: c1ccc(-c2ccc(-c3nc(-c4ccccc4)nc(-c4ccc5c(c4)oc4ccc(-c6cccc7c6sc6ccc(-c8ccccc8)cc67)cc45)n3)cc2)cc1]
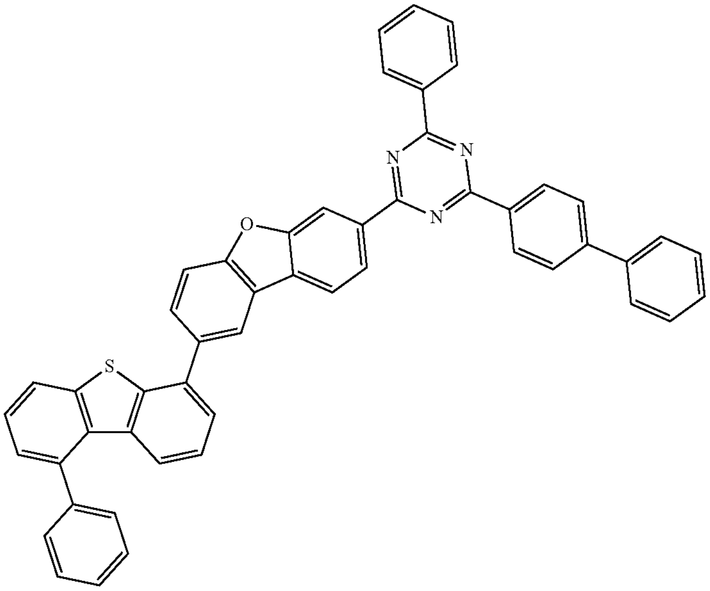 [SMILES: c1ccc(-c2ccc(-c3nc(-c4ccccc4)nc(-c4ccc5c(c4)oc4ccc(-c6cccc7c6sc6cccc(-c8ccccc8)c67)cc45)n3)cc2)cc1]
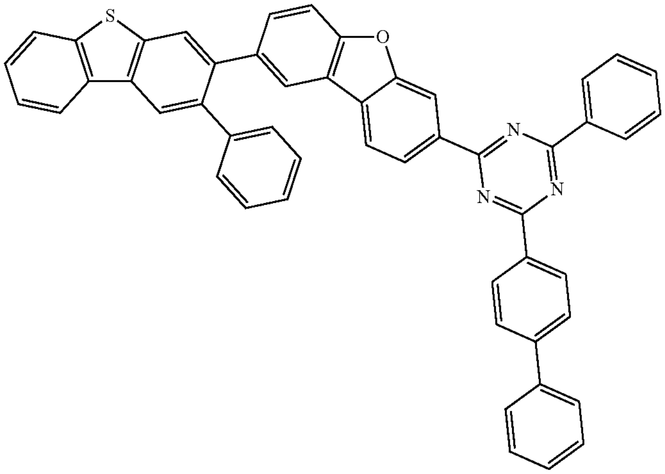 [SMILES: c1ccc(-c2ccc(-c3nc(-c4ccccc4)nc(-c4ccc5c(c4)oc4ccc(-c6cc7sc8ccccc8c7cc6-c6ccccc6)cc45)n3)cc2)cc1]

TABLE 1-continued
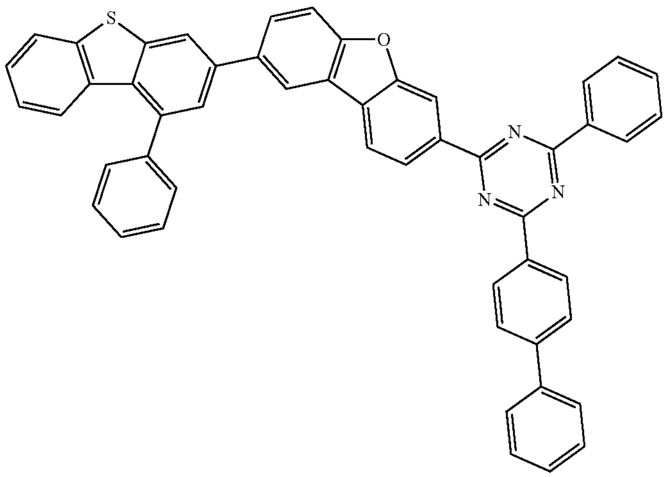 [SMILES: c1ccc(-c2ccc(-c3nc(-c4ccccc4)nc(-c4ccc5c(c4)oc4ccc(-c6cc(-c7ccccc7)c7c(c6)sc6ccccc67)cc45)n3)cc2)cc1]
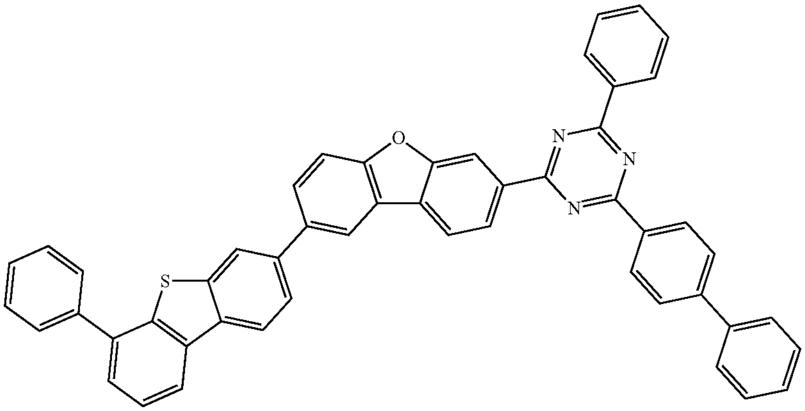 [SMILES: c1ccc(-c2ccc(-c3nc(-c4ccccc4)nc(-c4ccc5c(c4)oc4ccc(-c6ccc7c(c6)sc6c(-c8ccccc8)cccc67)cc45)n3)cc2)cc1]
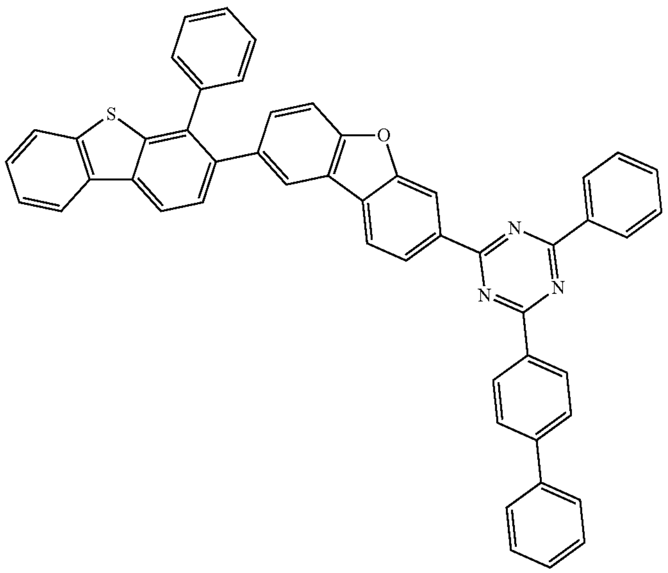 [SMILES: c1ccc(-c2ccc(-c3nc(-c4ccccc4)nc(-c4ccc5c(c4)oc4ccc(-c6ccc7c(sc8ccccc87)c6-c6ccccc6)cc45)n3)cc2)cc1]

TABLE 1-continued
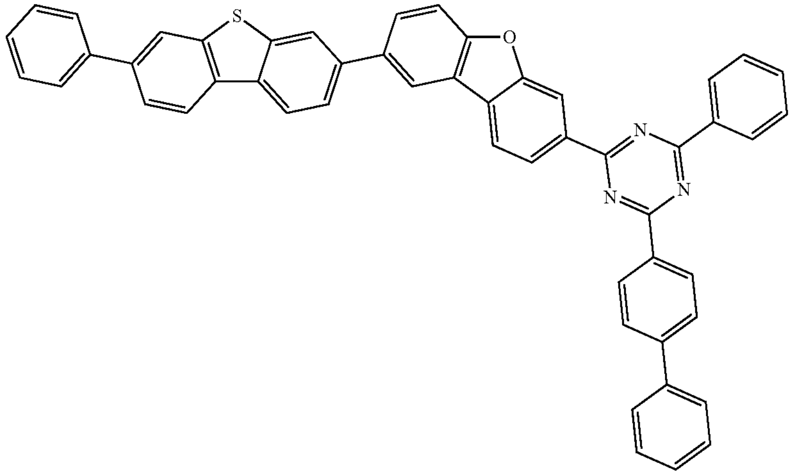 [SMILES: c1ccc(-c2ccc(-c3nc(-c4ccccc4)nc(-c4ccc5c(c4)oc4ccc(-c6ccc7c(c6)sc6cc(-c8ccccc8)ccc67)cc45)n3)cc2)cc1]
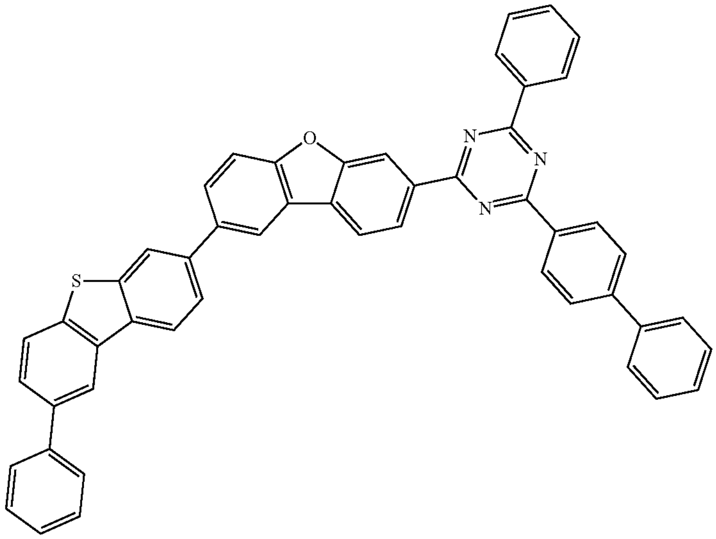 [SMILES: c1ccc(-c2ccc(-c3nc(-c4ccccc4)nc(-c4ccc5c(c4)oc4ccc(-c6ccc7c(c6)sc6ccc(-c8ccccc8)cc67)cc45)n3)cc2)cc1]
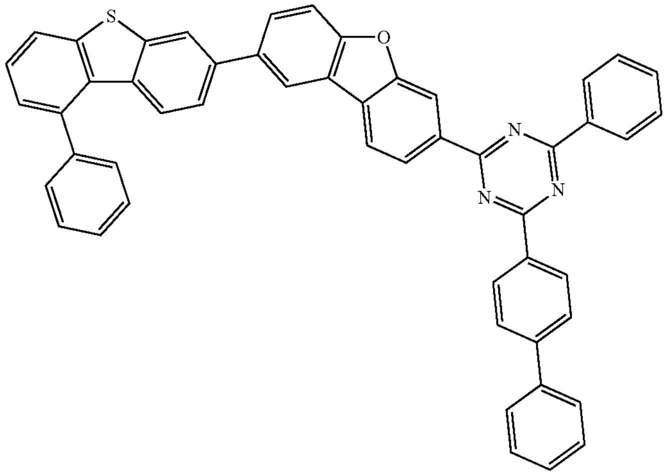 [SMILES: c1ccc(-c2ccc(-c3nc(-c4ccccc4)nc(-c4ccc5c(c4)oc4ccc(-c6ccc7c(c6)sc6cccc(-c8ccccc8)c67)cc45)n3)cc2)cc1]

TABLE 1-continued
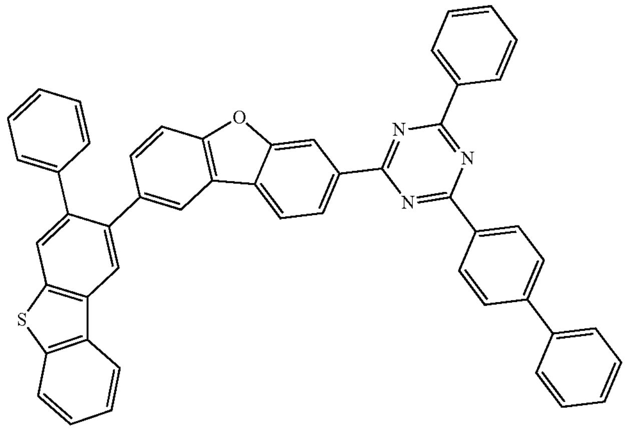 [SMILES: c1ccc(-c2ccc(-c3nc(-c4ccccc4)nc(-c4ccc5c(c4)oc4ccc(-c6cc7c(cc6-c6ccccc6)sc6ccccc67)cc45)n3)cc2)cc1]
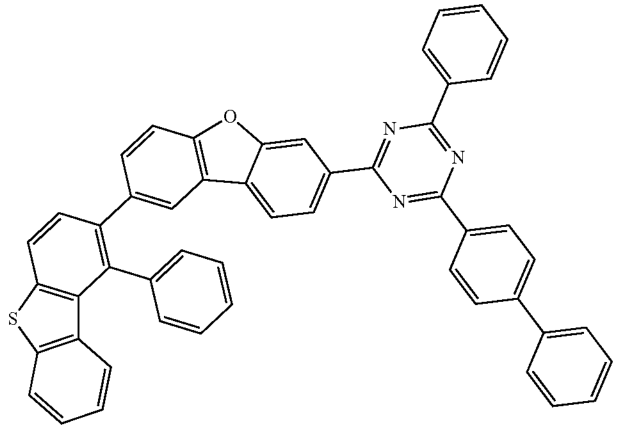 [SMILES: c1ccc(-c2ccc(-c3nc(-c4ccccc4)nc(-c4ccc5c(c4)oc4ccc(-c6ccc7sc8ccccc8c7c6-c6ccccc6)cc45)n3)cc2)cc1]
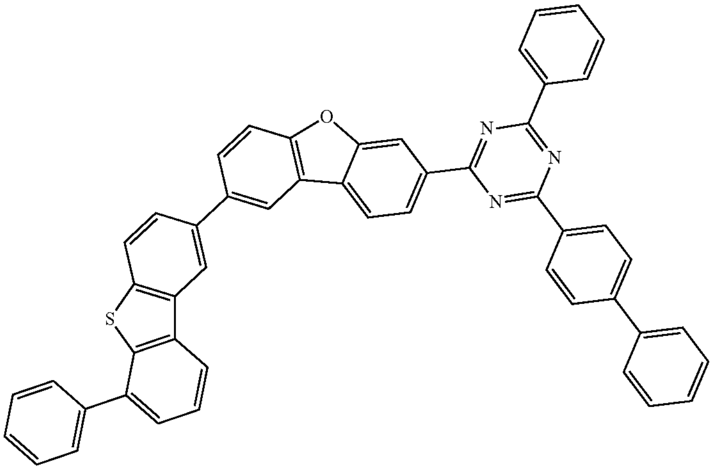 [SMILES: c1ccc(-c2ccc(-c3nc(-c4ccccc4)nc(-c4ccc5c(c4)oc4ccc(-c6ccc7sc8c(-c9ccccc9)cccc8c7c6)cc45)n3)cc2)cc1]

TABLE 1-continued
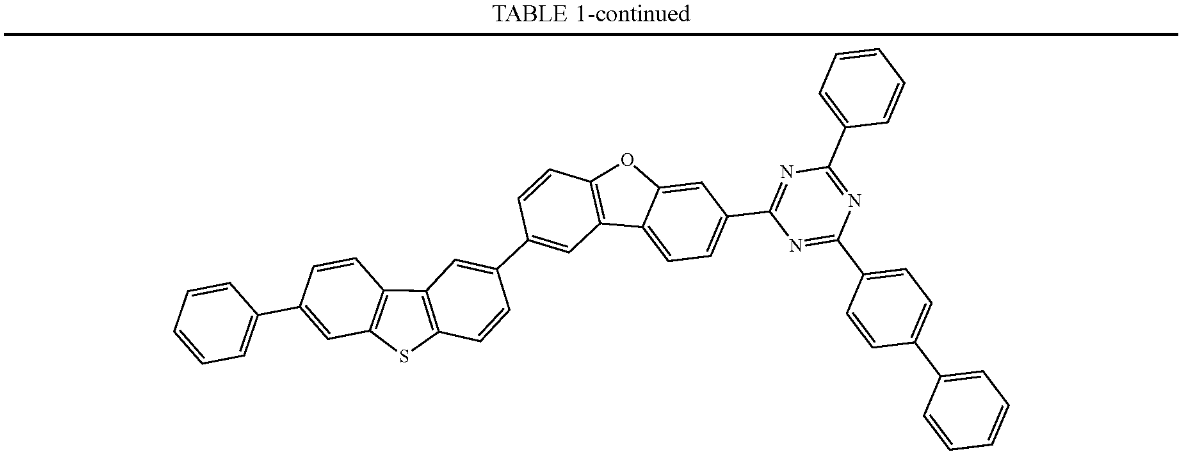
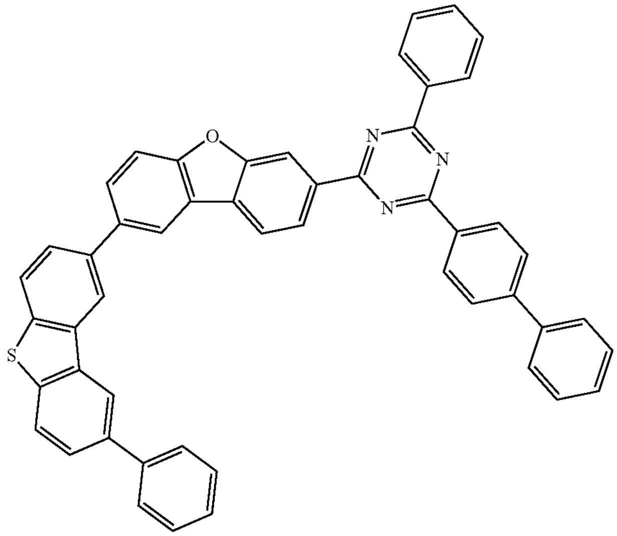 [SMILES: c1ccc(-c2ccc(-c3nc(-c4ccccc4)nc(-c4ccc5c(c4)oc4ccc(-c6ccc7sc8ccc(-c9ccccc9)cc8c7c6)cc45)n3)cc2)cc1]
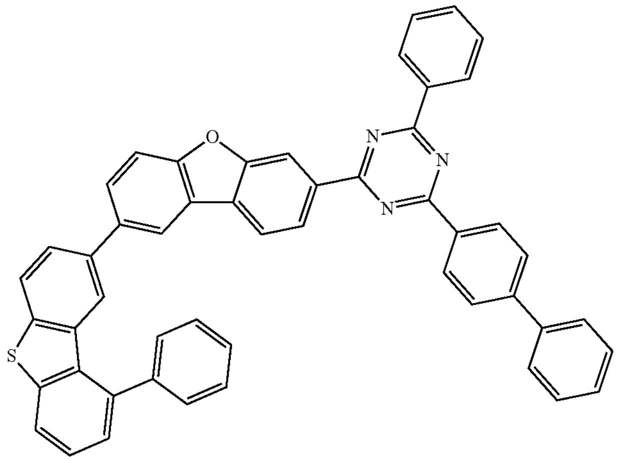 [SMILES: c1ccc(-c2ccc(-c3nc(-c4ccccc4)nc(-c4ccc5c(c4)oc4ccc(-c6ccc7sc8cccc(-c9ccccc9)c8c7c6)cc45)n3)cc2)cc1]

TABLE 1-continued
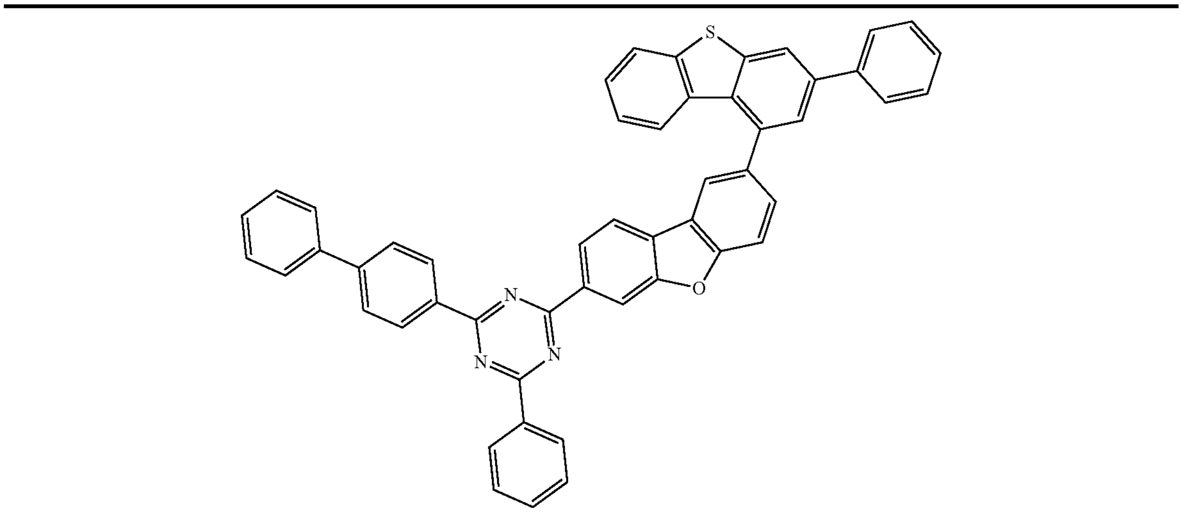
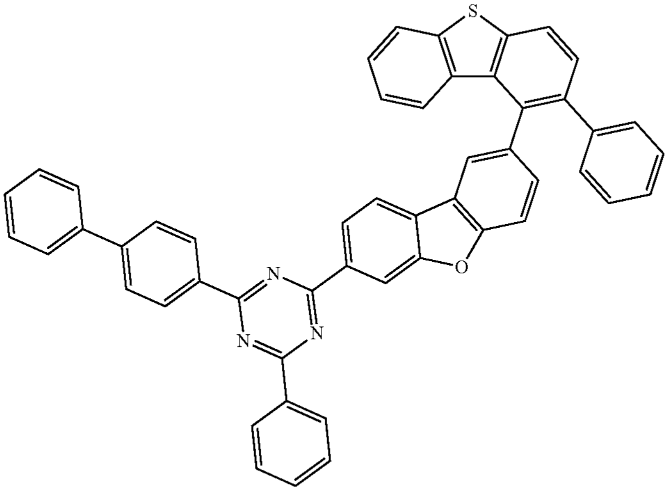 [SMILES: c1ccc(-c2ccc(-c3nc(-c4ccccc4)nc(-c4ccc5c(c4)oc4ccc(-c6c(-c7ccccc7)ccc7sc8ccccc8c67)cc45)n3)cc2)cc1]
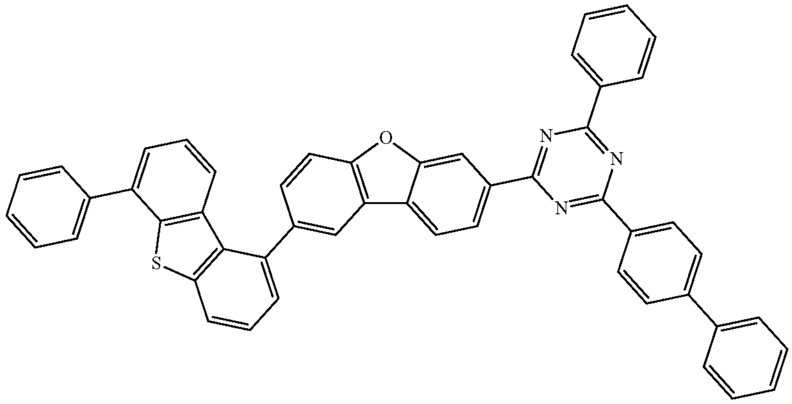 [SMILES: c1ccc(-c2ccc(-c3nc(-c4ccccc4)nc(-c4ccc5c(c4)oc4ccc(-c6cccc7sc8c(-c9ccccc9)cccc8c67)cc45)n3)cc2)cc1]

TABLE 1-continued
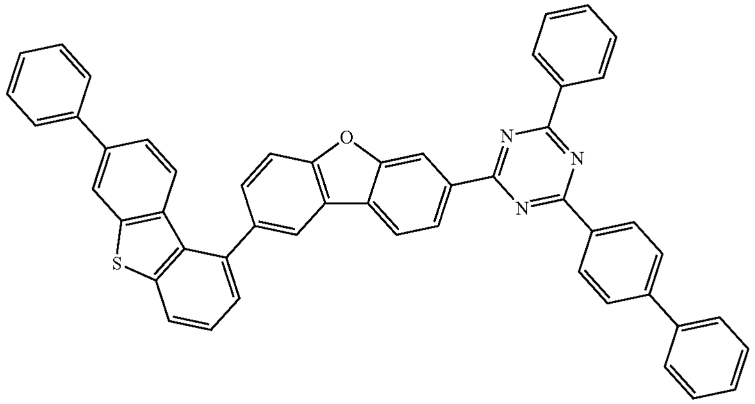 [SMILES: c1ccc(-c2ccc(-c3nc(-c4ccccc4)nc(-c4ccc5c(c4)oc4ccc(-c6cccc7sc8cc(-c9ccccc9)ccc8c67)cc45)n3)cc2)cc1]
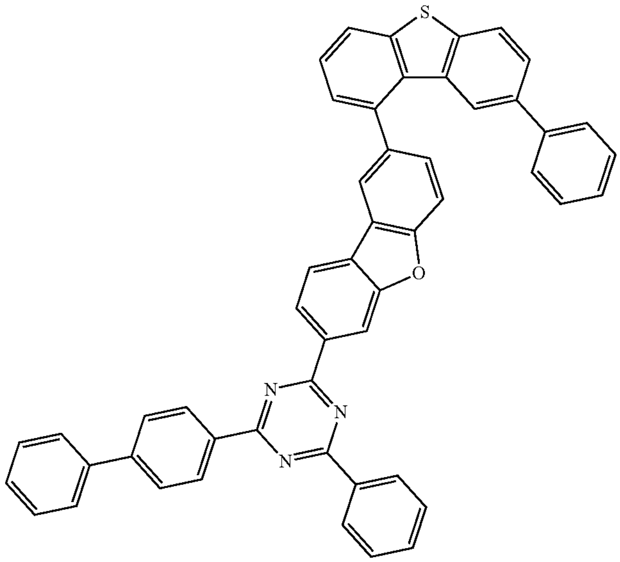 [SMILES: c1ccc(-c2ccc(-c3nc(-c4ccccc4)nc(-c4ccc5c(c4)oc4ccc(-c6cccc7sc8ccc(-c9ccccc9)cc8c67)cc45)n3)cc2)cc1]
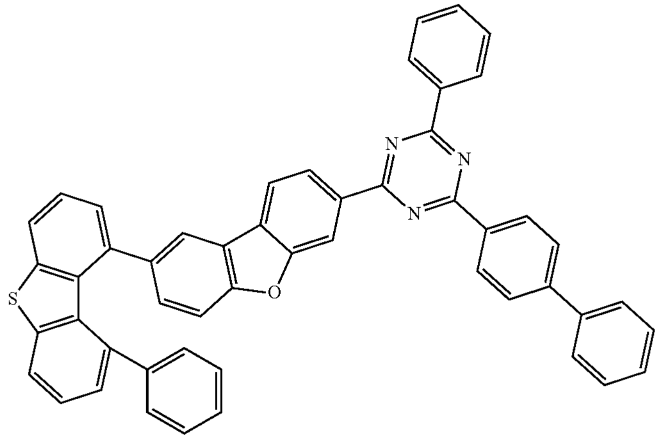 [SMILES: c1ccc(-c2ccc(-c3nc(-c4ccccc4)nc(-c4ccc5c(c4)oc4ccc(-c6cccc7sc8cccc(-c9ccccc9)c8c67)cc45)n3)cc2)cc1]

TABLE 1-continued
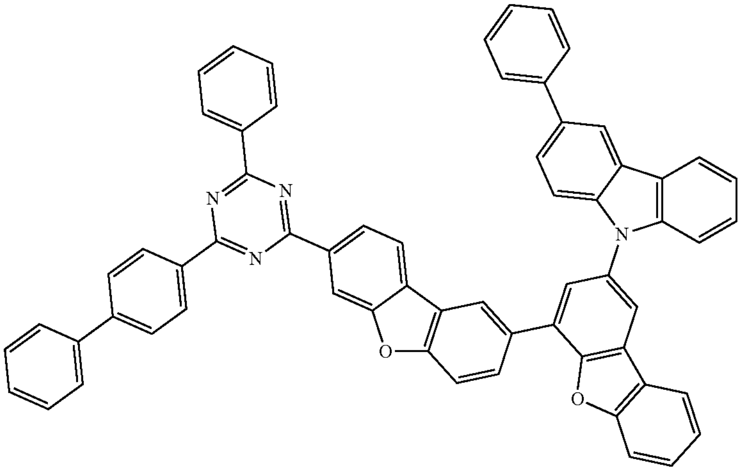 [SMILES: c1ccc(-c2ccc(-c3nc(-c4ccccc4)nc(-c4ccc5c(c4)oc4ccc(-c6cc(-n7c8ccccc8c8cc(-c9ccccc9)ccc87)cc7c6oc6ccccc67)cc45)n3)cc2)cc1]
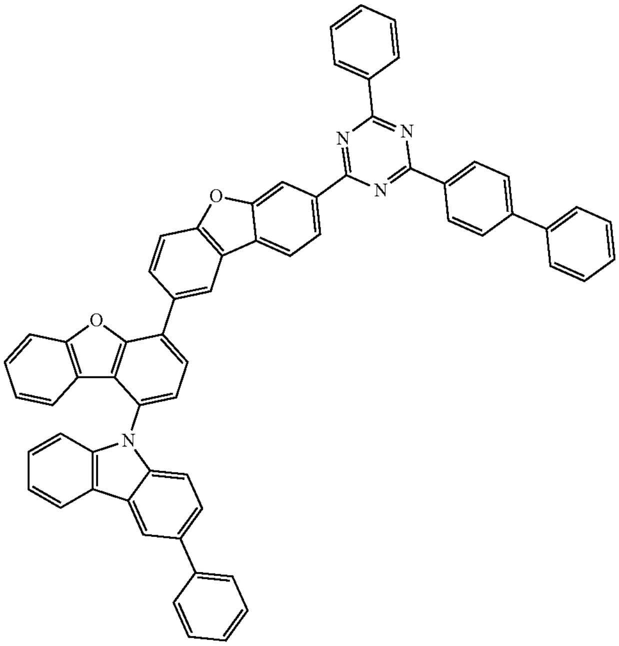 [SMILES: c1ccc(-c2ccc(-c3nc(-c4ccccc4)nc(-c4ccc5c(c4)oc4ccc(-c6ccc(-n7c8ccccc8c8cc(-c9ccccc9)ccc87)c7c6oc6ccccc67)cc45)n3)cc2)cc1]
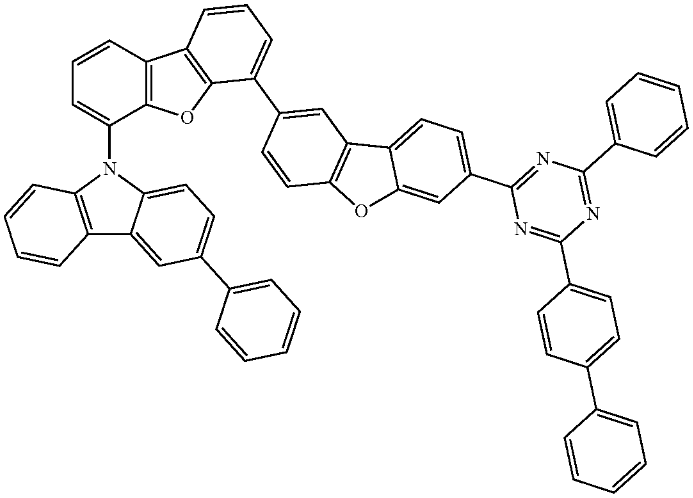 [SMILES: c1ccc(-c2ccc(-c3nc(-c4ccccc4)nc(-c4ccc5c(c4)oc4ccc(-c6cccc7c6oc6c(-n8c9ccccc9c9cc(-c%10ccccc%10)ccc98)cccc67)cc45)n3)cc2)cc1]

TABLE 1-continued
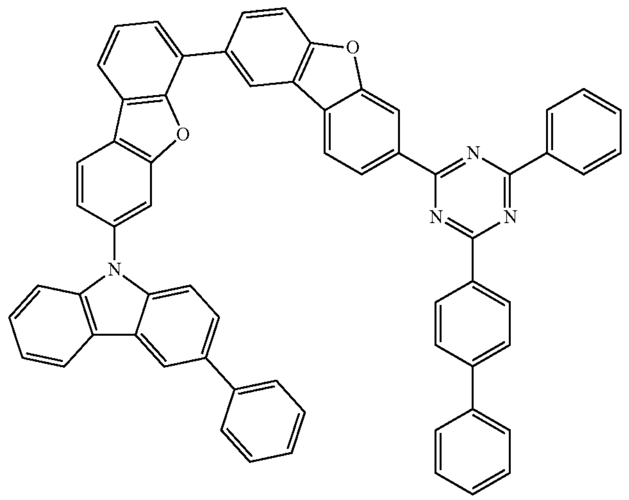 [SMILES: c1ccc(-c2ccc(-c3nc(-c4ccccc4)nc(-c4ccc5c(c4)oc4ccc(-c6cccc7c6oc6cc(-n8c9ccccc9c9cc(-c%10ccccc%10)ccc98)ccc67)cc45)n3)cc2)cc1]
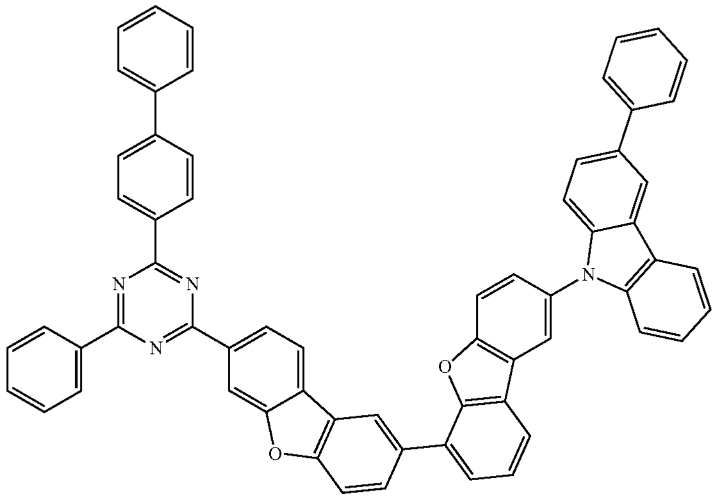 [SMILES: c1ccc(-c2ccc(-c3nc(-c4ccccc4)nc(-c4ccc5c(c4)oc4ccc(-c6cccc7c6oc6ccc(-n8c9ccccc9c9cc(-c%10ccccc%10)ccc98)cc67)cc45)n3)cc2)cc1]
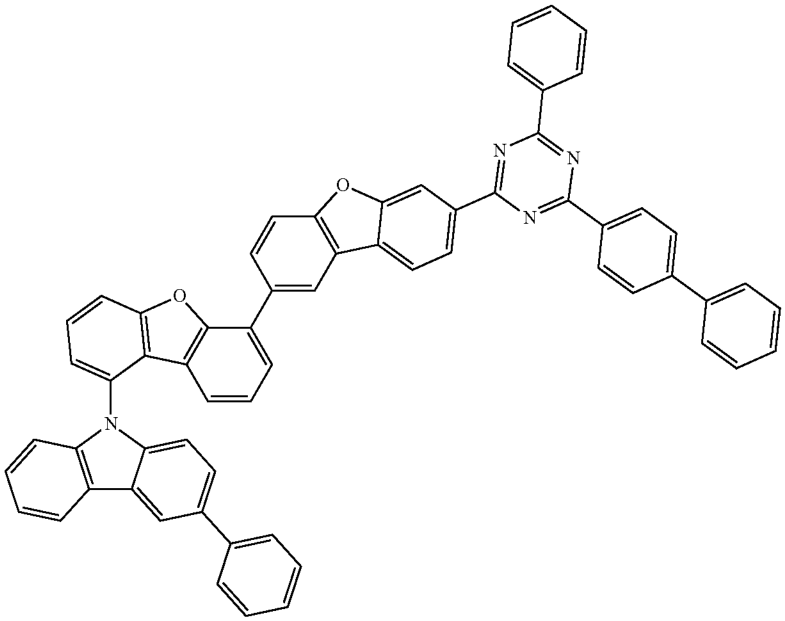 [SMILES: c1ccc(-c2ccc(-c3nc(-c4ccccc4)nc(-c4ccc5c(c4)oc4ccc(-c6cccc7c6oc6cccc(-n8c9ccccc9c9cc(-c%10ccccc%10)ccc98)c67)cc45)n3)cc2)cc1]

TABLE 1-continued
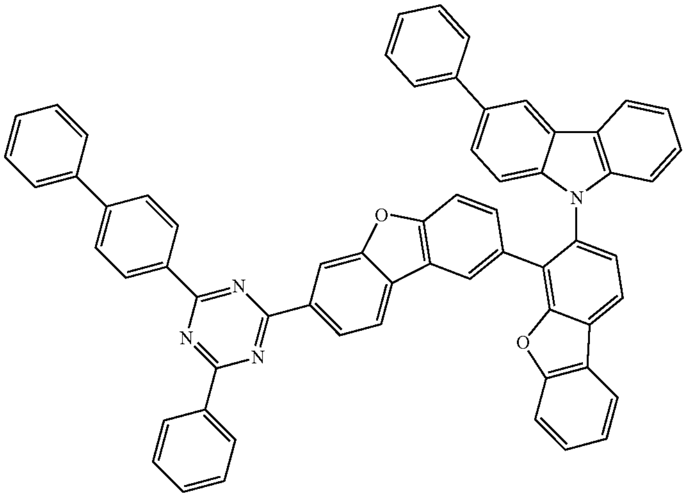 [SMILES: c1ccc(-c2ccc(-c3nc(-c4ccccc4)nc(-c4ccc5c(c4)oc4ccc(-c6c(-n7c8ccccc8c8cc(-c9ccccc9)ccc87)ccc7c6oc6ccccc67)cc45)n3)cc2)cc1]
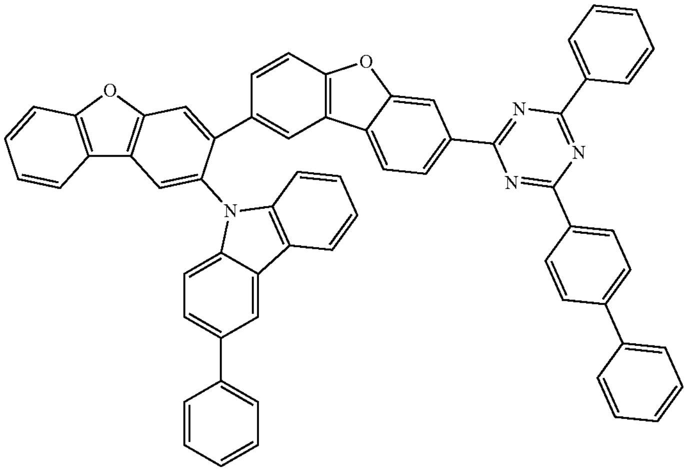 [SMILES: c1ccc(-c2ccc(-c3nc(-c4ccccc4)nc(-c4ccc5c(c4)oc4ccc(-c6cc7oc8ccccc8c7cc6-n6c7ccccc7c7cc(-c8ccccc8)ccc76)cc45)n3)cc2)cc1]
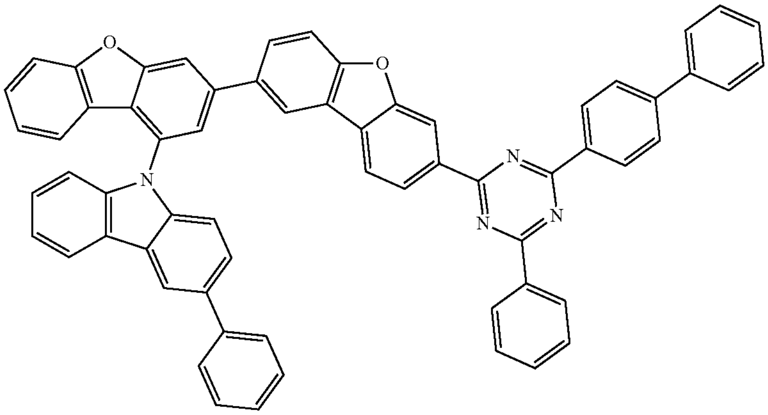 [SMILES: c1ccc(-c2ccc(-c3nc(-c4ccccc4)nc(-c4ccc5c(c4)oc4ccc(-c6cc(-n7c8ccccc8c8cc(-c9ccccc9)ccc87)c7c(c6)oc6ccccc67)cc45)n3)cc2)cc1]

TABLE 1-continued
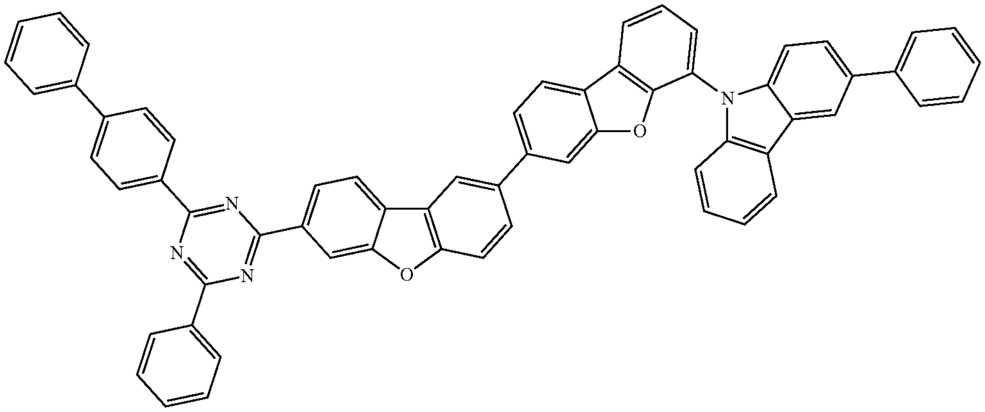 [SMILES: c1ccc(-c2ccc(-c3nc(-c4ccccc4)nc(-c4ccc5c(c4)oc4ccc(-c6ccc7c(c6)oc6c(-n8c9ccccc9c9cc(-c%10ccccc%10)ccc98)cccc67)cc45)n3)cc2)cc1]
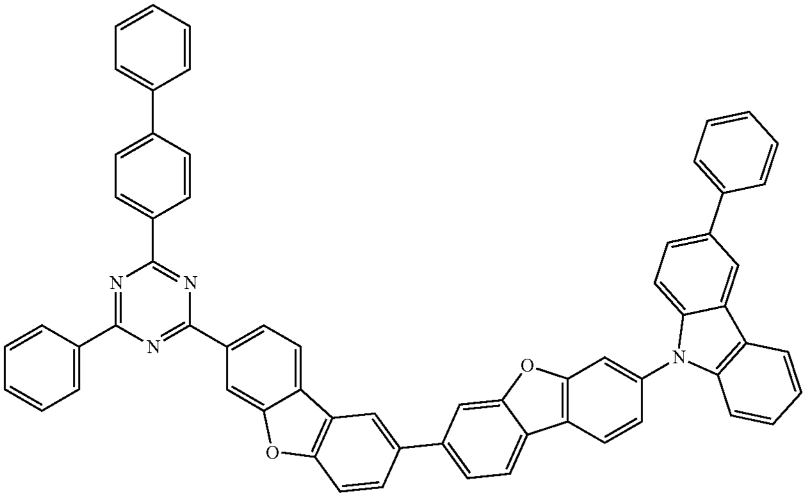 [SMILES: c1ccc(-c2ccc(-c3nc(-c4ccccc4)nc(-c4ccc5c(c4)oc4ccc(-c6ccc7c(c6)oc6cc(-n8c9ccccc9c9cc(-c%10ccccc%10)ccc98)ccc67)cc45)n3)cc2)cc1]
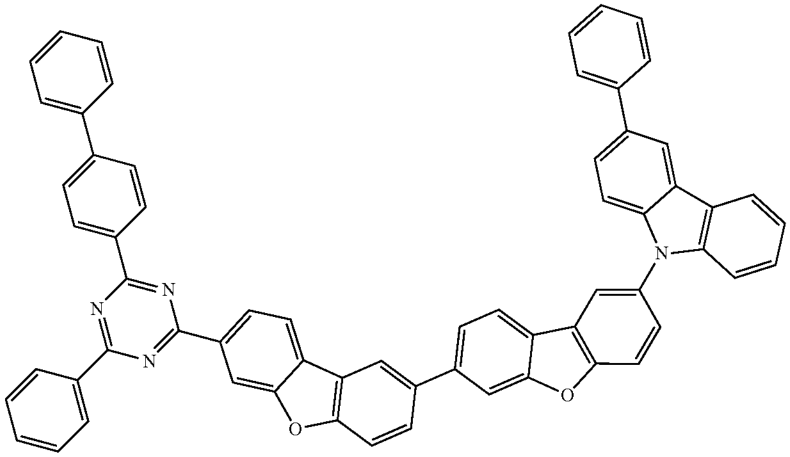 [SMILES: c1ccc(-c2ccc(-c3nc(-c4ccccc4)nc(-c4ccc5c(c4)oc4ccc(-c6ccc7c(c6)oc6ccc(-n8c9ccccc9c9cc(-c%10ccccc%10)ccc98)cc67)cc45)n3)cc2)cc1]

TABLE 1-continued
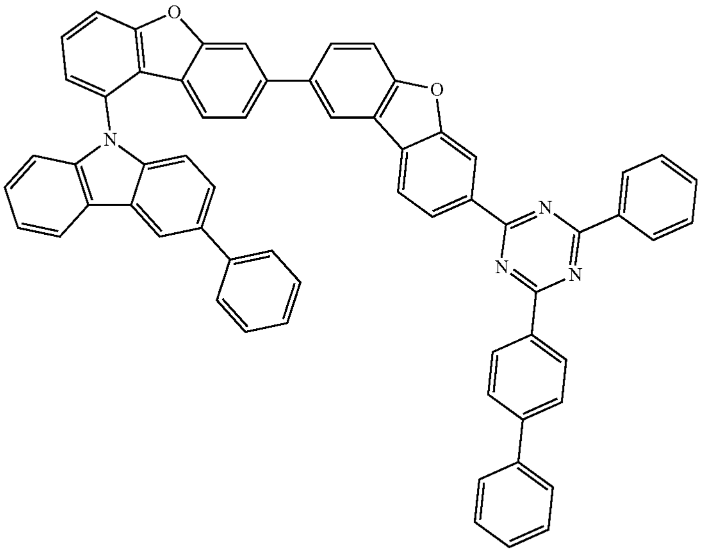 [SMILES: c1ccc(-c2ccc(-c3nc(-c4ccccc4)nc(-c4ccc5c(c4)oc4ccc(-c6ccc7c(c6)oc6cccc(-n8c9ccccc9c9cc(-c%10ccccc%10)ccc98)c67)cc45)n3)cc2)cc1]
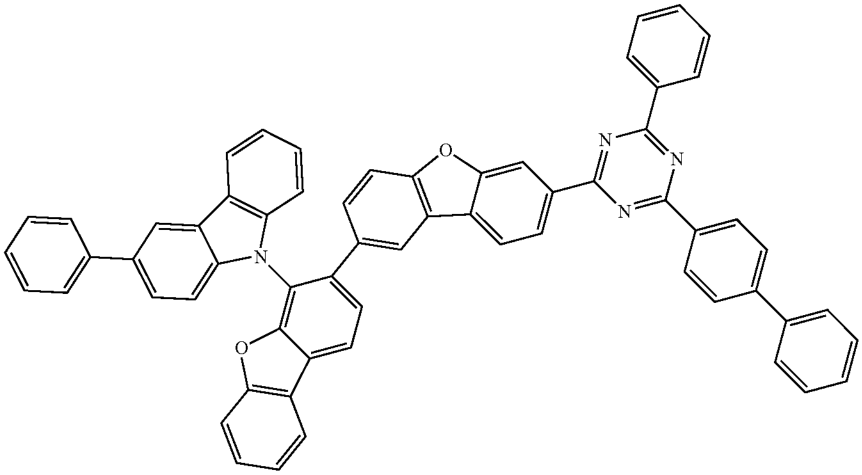 [SMILES: c1ccc(-c2ccc(-c3nc(-c4ccccc4)nc(-c4ccc5c(c4)oc4ccc(-c6ccc7c(oc8ccccc87)c6-n6c7ccccc7c7cc(-c8ccccc8)ccc76)cc45)n3)cc2)cc1]
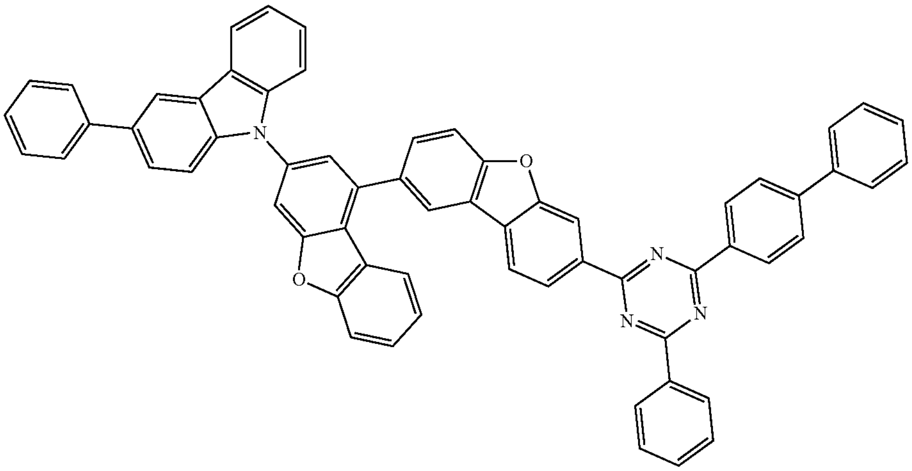 [SMILES: c1ccc(-c2ccc(-c3nc(-c4ccccc4)nc(-c4ccc5c(c4)oc4ccc(-c6cc(-n7c8ccccc8c8cc(-c9ccccc9)ccc87)cc7oc8ccccc8c67)cc45)n3)cc2)cc1]

TABLE 1-continued
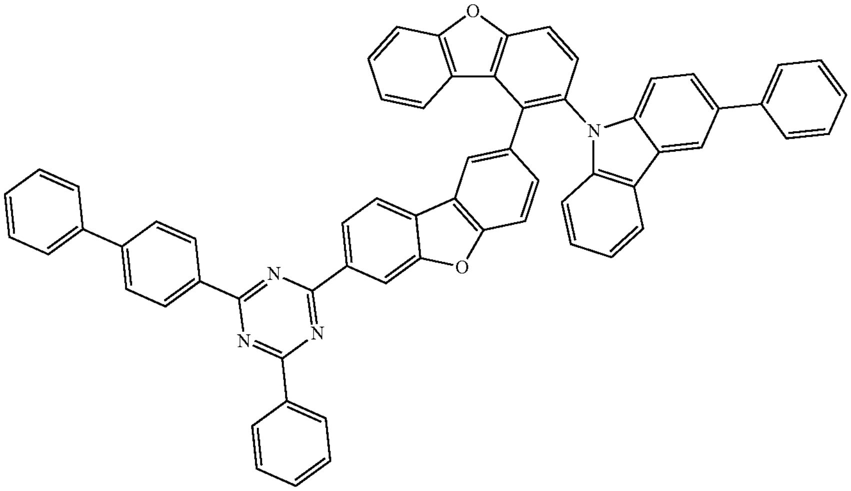 [SMILES: c1ccc(-c2ccc(-c3nc(-c4ccccc4)nc(-c4ccc5c(c4)oc4ccc(-c6c(-n7c8ccccc8c8cc(-c9ccccc9)ccc87)ccc7oc8ccccc8c67)cc45)n3)cc2)cc1]
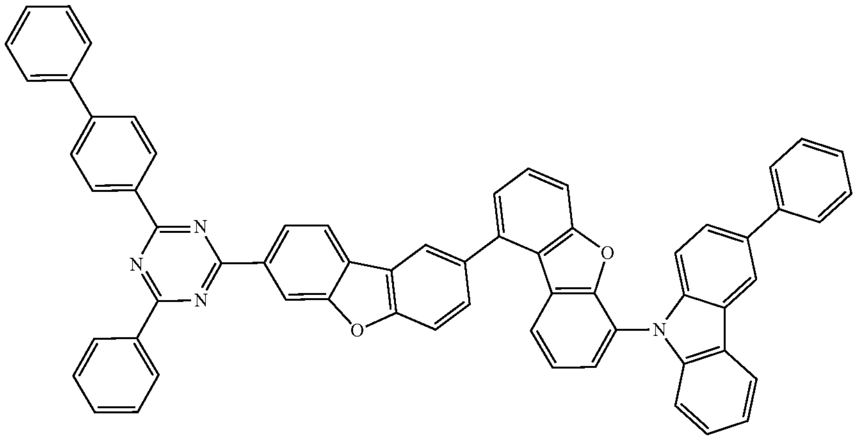 [SMILES: c1ccc(-c2ccc(-c3nc(-c4ccccc4)nc(-c4ccc5c(c4)oc4ccc(-c6cccc7oc8c(-n9c%10ccccc%10c%10cc(-c%11ccccc%11)ccc%109)cccc8c67)cc45)n3)cc2)cc1]
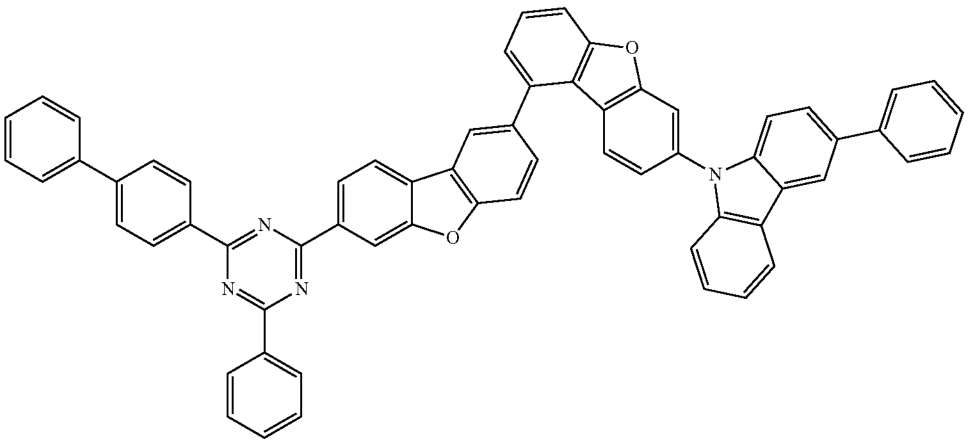 [SMILES: c1ccc(-c2ccc(-c3nc(-c4ccccc4)nc(-c4ccc5c(c4)oc4ccc(-c6cccc7oc8cc(-n9c%10ccccc%10c%10cc(-c%11ccccc%11)ccc%109)ccc8c67)cc45)n3)cc2)cc1]

TABLE 1-continued
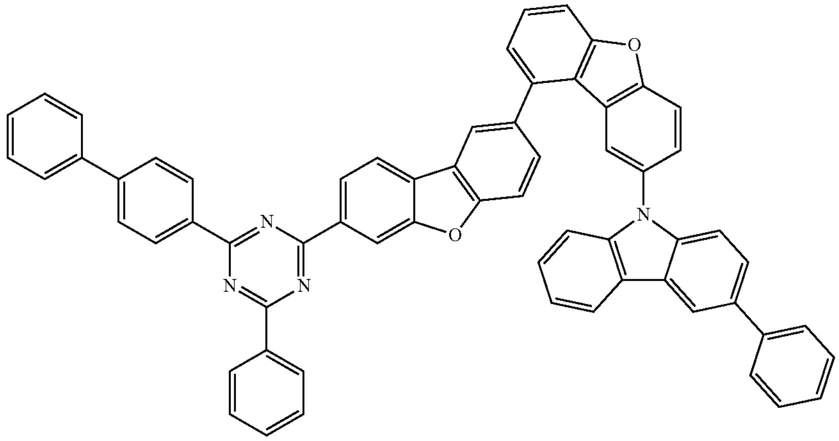 [SMILES: c1ccc(-c2ccc(-c3nc(-c4ccccc4)nc(-c4ccc5c(c4)oc4ccc(-c6cccc7oc8ccc(-n9c%10ccccc%10c%10cc(-c%11ccccc%11)ccc%109)cc8c67)cc45)n3)cc2)cc1]
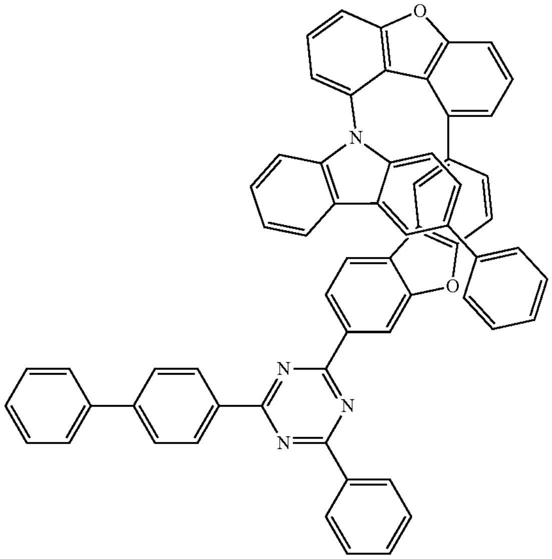 [SMILES: c1ccc(-c2ccc(-c3nc(-c4ccccc4)nc(-c4ccc5c(c4)oc4ccc(-c6cccc7oc8cccc(-n9c%10ccccc%10c%10cc(-c%11ccccc%11)ccc%109)c8c67)cc45)n3)cc2)cc1]
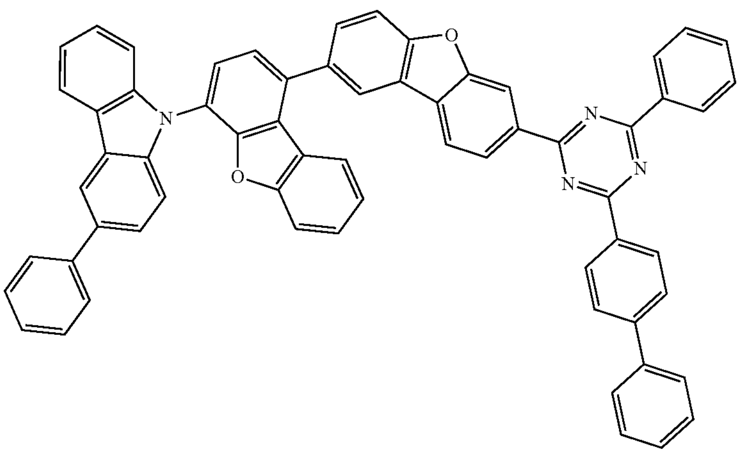 [SMILES: c1ccc(-c2ccc(-c3nc(-c4ccccc4)nc(-c4ccc5c(c4)oc4ccc(-c6ccc(-n7c8ccccc8c8cc(-c9ccccc9)ccc87)c7oc8ccccc8c67)cc45)n3)cc2)cc1]

TABLE 1-continued
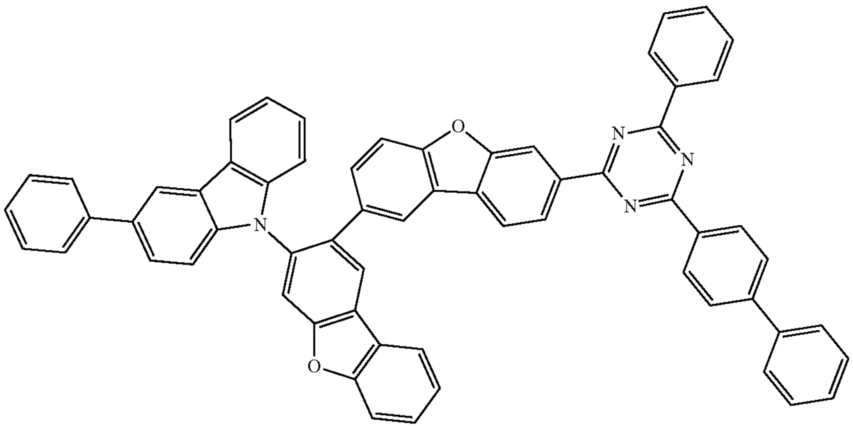 [SMILES: c1ccc(-c2ccc(-c3nc(-c4ccccc4)nc(-c4ccc5c(c4)oc4ccc(-c6cc7c(cc6-n6c8ccccc8c8cc(-c9ccccc9)ccc86)oc6ccccc67)cc45)n3)cc2)cc1]
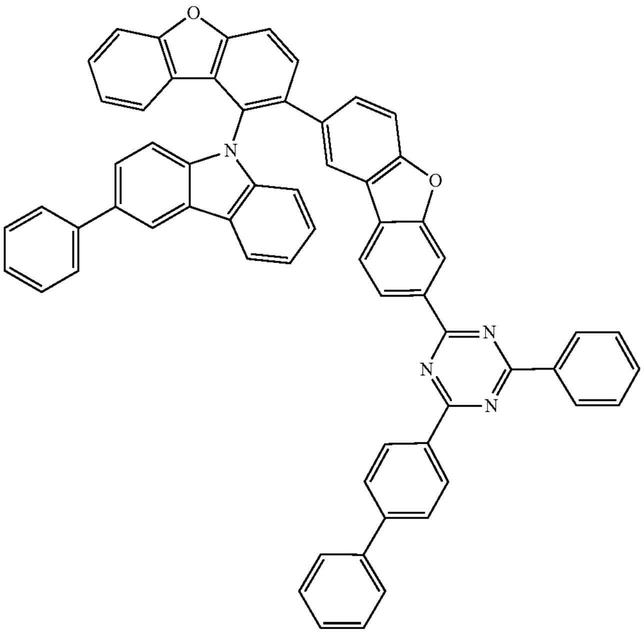 [SMILES: c1ccc(-c2ccc(-c3nc(-c4ccccc4)nc(-c4ccc5c(c4)oc4ccc(-c6ccc7oc8ccccc8c7c6-n6c7ccccc7c7cc(-c8ccccc8)ccc76)cc45)n3)cc2)cc1]
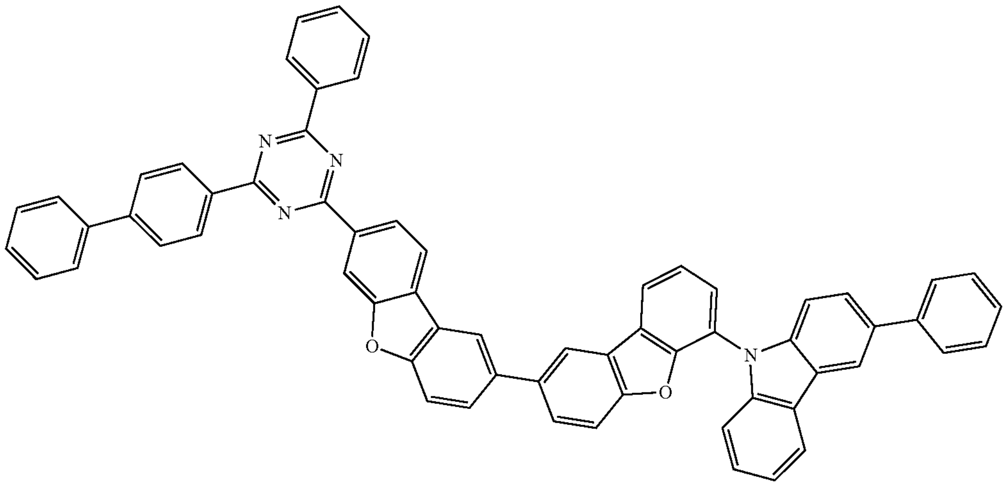 [SMILES: c1ccc(-c2ccc(-c3nc(-c4ccccc4)nc(-c4ccc5c(c4)oc4ccc(-c6ccc7oc8c(-n9c%10ccccc%10c%10cc(-c%11ccccc%11)ccc%109)cccc8c7c6)cc45)n3)cc2)cc1]

TABLE 1-continued
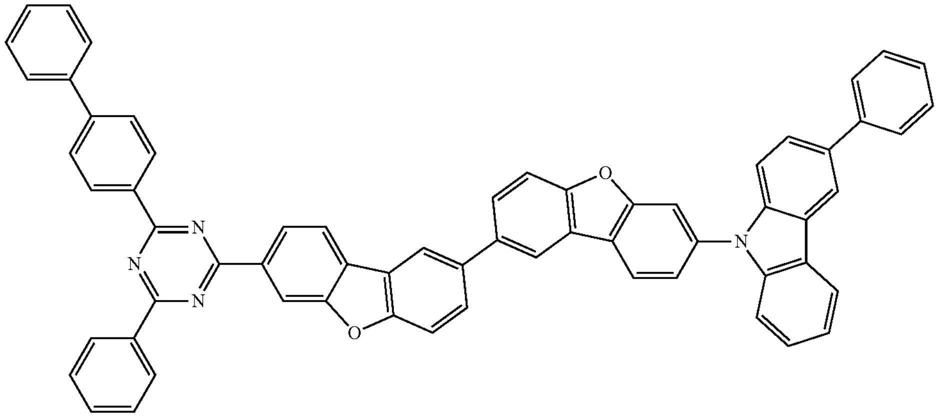 [SMILES: c1ccc(-c2ccc(-c3nc(-c4ccccc4)nc(-c4ccc5c(c4)oc4ccc(-c6ccc7oc8cc(-n9c%10ccccc%10c%10cc(-c%11ccccc%11)ccc%109)ccc8c7c6)cc45)n3)cc2)cc1]
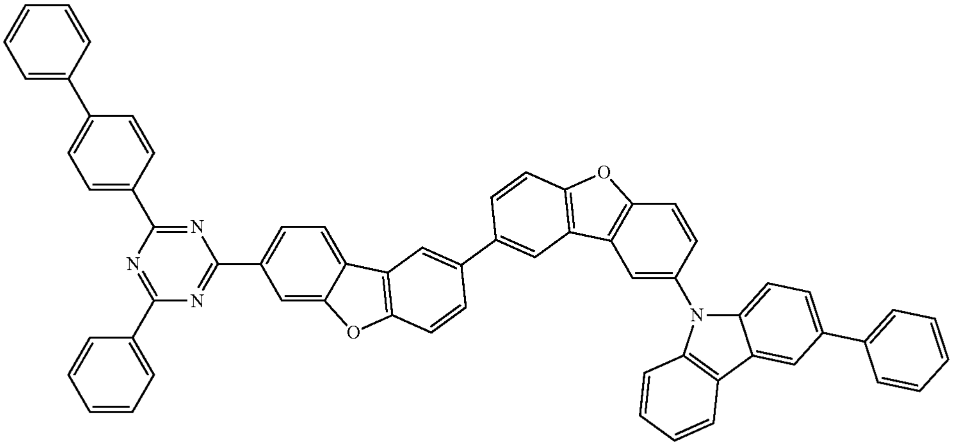 [SMILES: c1ccc(-c2ccc(-c3nc(-c4ccccc4)nc(-c4ccc5c(c4)oc4ccc(-c6ccc7oc8ccc(-n9c%10ccccc%10c%10cc(-c%11ccccc%11)ccc%109)cc8c7c6)cc45)n3)cc2)cc1]
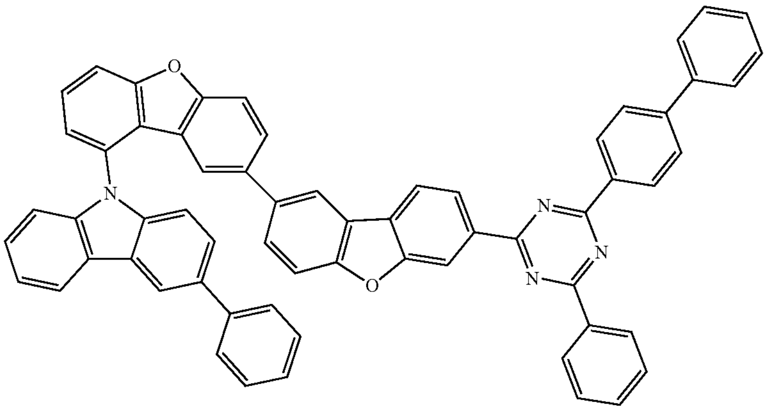 [SMILES: c1ccc(-c2ccc(-c3nc(-c4ccccc4)nc(-c4ccc5c(c4)oc4ccc(-c6ccc7oc8cccc(-n9c%10ccccc%10c%10cc(-c%11ccccc%11)ccc%109)c8c7c6)cc45)n3)cc2)cc1]

TABLE 1-continued
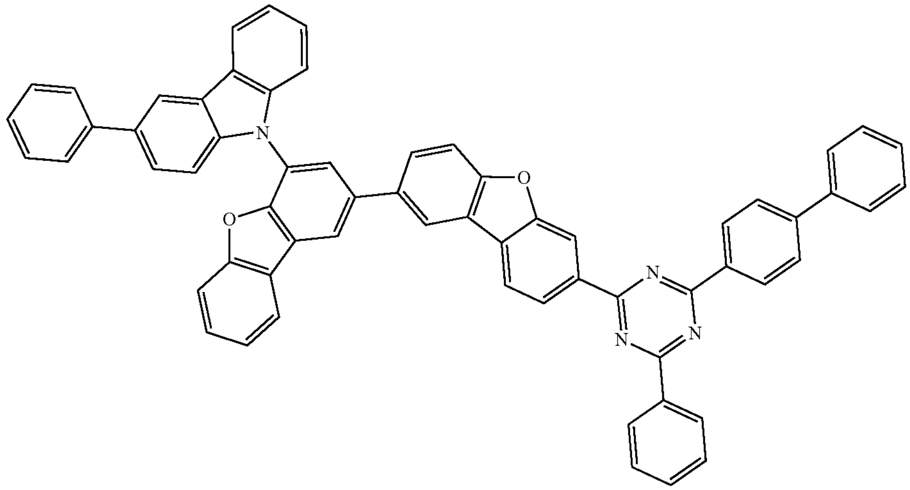 [SMILES: c1ccc(-c2ccc(-c3nc(-c4ccccc4)nc(-c4ccc5c(c4)oc4ccc(-c6cc(-n7c8ccccc8c8cc(-c9ccccc9)ccc87)c7oc8ccccc8c7c6)cc45)n3)cc2)cc1]
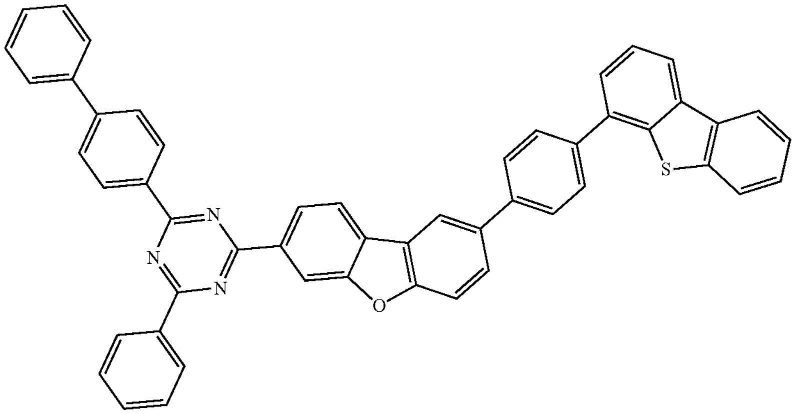 [SMILES: c1ccc(-c2ccc(-c3nc(-c4ccccc4)nc(-c4ccc5c(c4)oc4ccc(-c6ccc(-c7cccc8c7sc7ccccc78)cc6)cc45)n3)cc2)cc1]
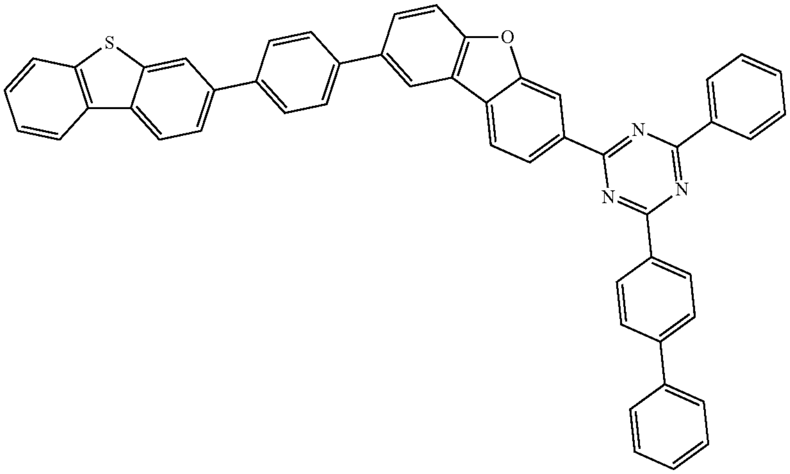 [SMILES: c1ccc(-c2ccc(-c3nc(-c4ccccc4)nc(-c4ccc5c(c4)oc4ccc(-c6ccc(-c7ccc8c(c7)sc7ccccc78)cc6)cc45)n3)cc2)cc1]

TABLE 1-continued
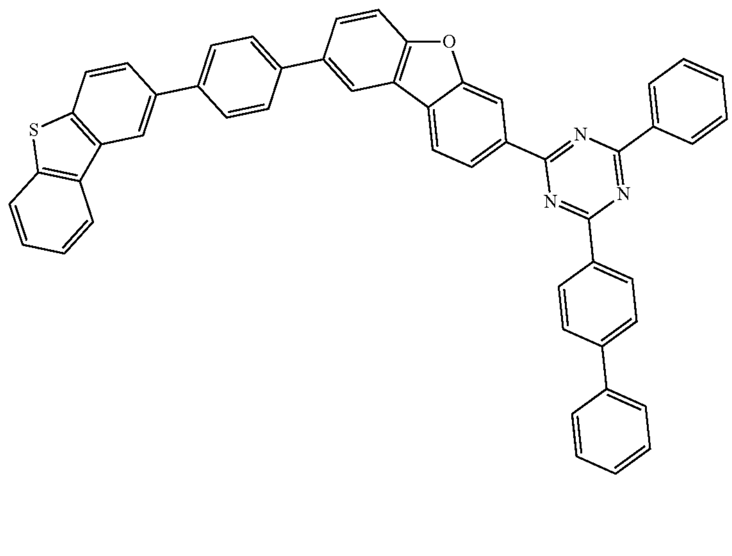 [SMILES: c1ccc(-c2ccc(-c3nc(-c4ccccc4)nc(-c4ccc5c(c4)oc4ccc(-c6ccc(-c7ccc8sc9ccccc9c8c7)cc6)cc45)n3)cc2)cc1]
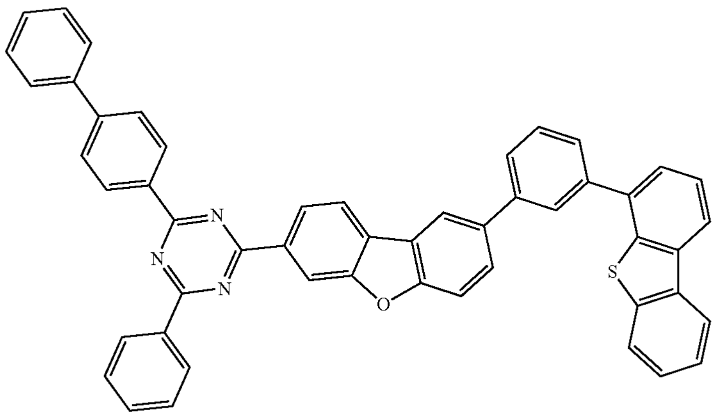 [SMILES: c1ccc(-c2ccc(-c3nc(-c4ccccc4)nc(-c4ccc5c(c4)oc4ccc(-c6cccc(-c7cccc8c7sc7ccccc78)c6)cc45)n3)cc2)cc1]
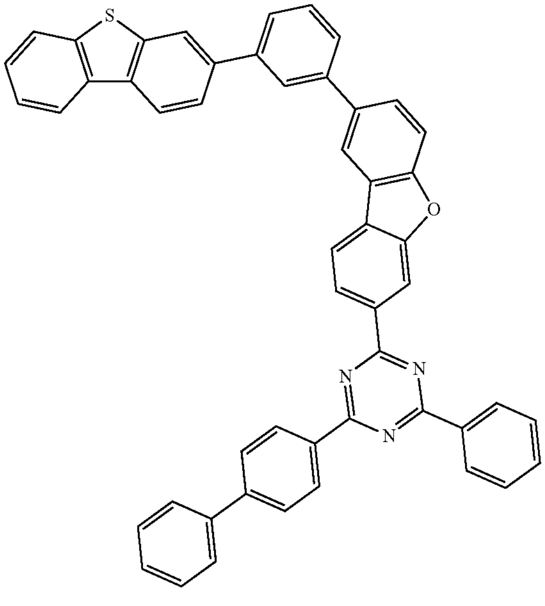 [SMILES: c1ccc(-c2ccc(-c3nc(-c4ccccc4)nc(-c4ccc5c(c4)oc4ccc(-c6cccc(-c7ccc8c(c7)sc7ccccc78)c6)cc45)n3)cc2)cc1]

TABLE 1-continued
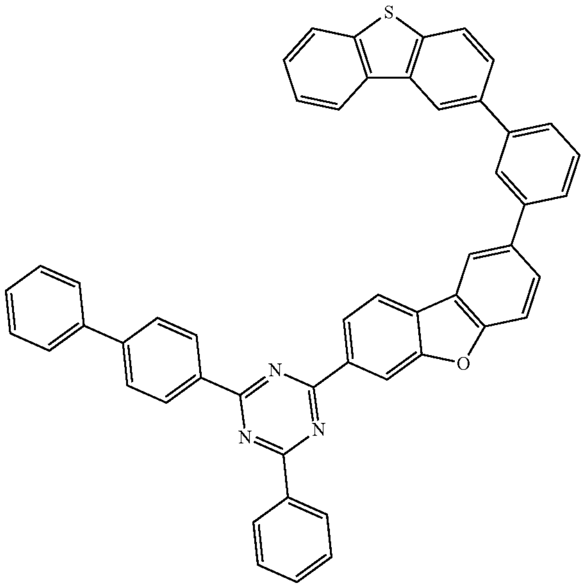 [SMILES: c1ccc(-c2ccc(-c3nc(-c4ccccc4)nc(-c4ccc5c(c4)oc4ccc(-c6cccc(-c7ccc8sc9ccccc9c8c7)c6)cc45)n3)cc2)cc1]
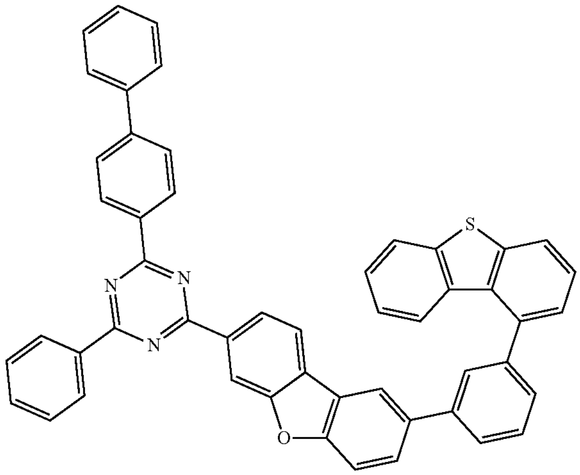 [SMILES: c1ccc(-c2ccc(-c3nc(-c4ccccc4)nc(-c4ccc5c(c4)oc4ccc(-c6cccc(-c7cccc8sc9ccccc9c78)c6)cc45)n3)cc2)cc1]
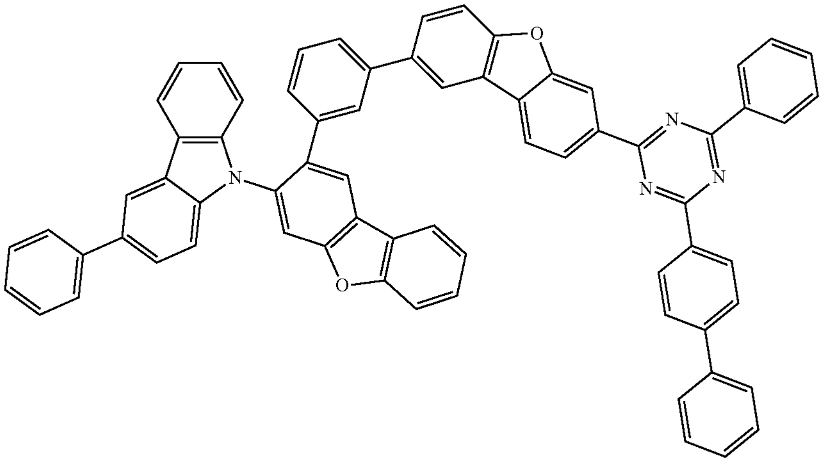 [SMILES: c1ccc(-c2ccc(-c3nc(-c4ccccc4)nc(-c4ccc5c(c4)oc4ccc(-c6cccc(-c7cc8c(cc7-n7c9ccccc9c9cc(-c%10ccccc%10)ccc97)oc7ccccc78)c6)cc45)n3)cc2)cc1]

TABLE 1-continued
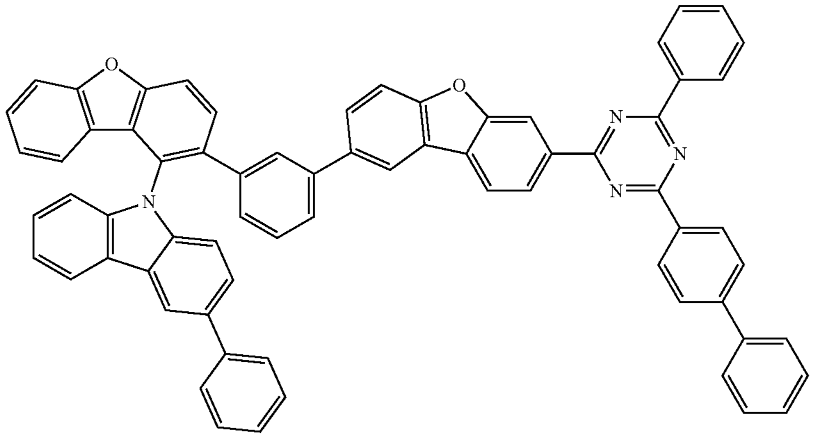 [SMILES: c1ccc(-c2ccc(-c3nc(-c4ccccc4)nc(-c4ccc5c(c4)oc4ccc(-c6cccc(-c7ccc8oc9ccccc9c8c7-n7c8ccccc8c8cc(-c9ccccc9)ccc87)c6)cc45)n3)cc2)cc1]
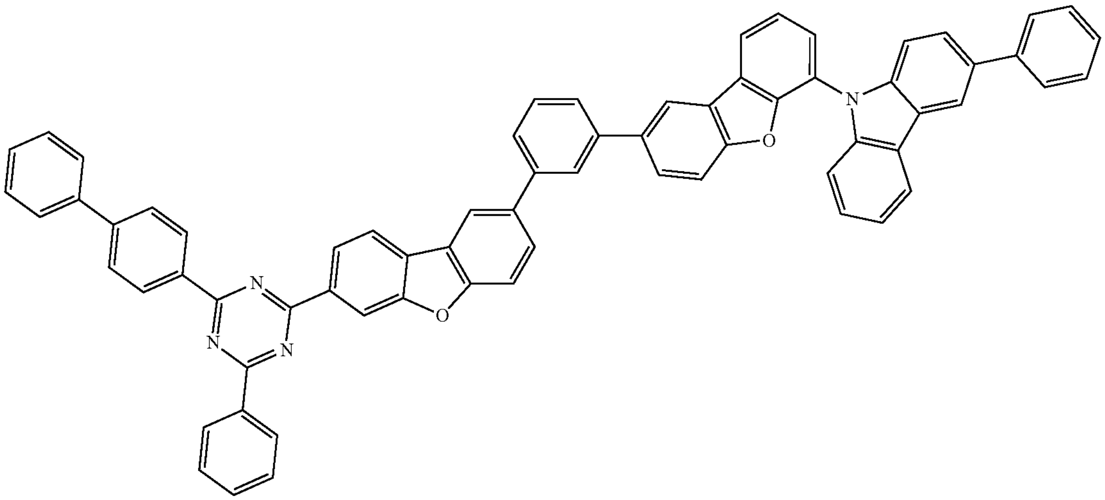 [SMILES: c1ccc(-c2ccc(-c3nc(-c4ccccc4)nc(-c4ccc5c(c4)oc4ccc(-c6cccc(-c7ccc8oc9c(-n%10c%11ccccc%11c%11cc(-c%12ccccc%12)ccc%11%10)cccc9c8c7)c6)cc45)n3)cc2)cc1]
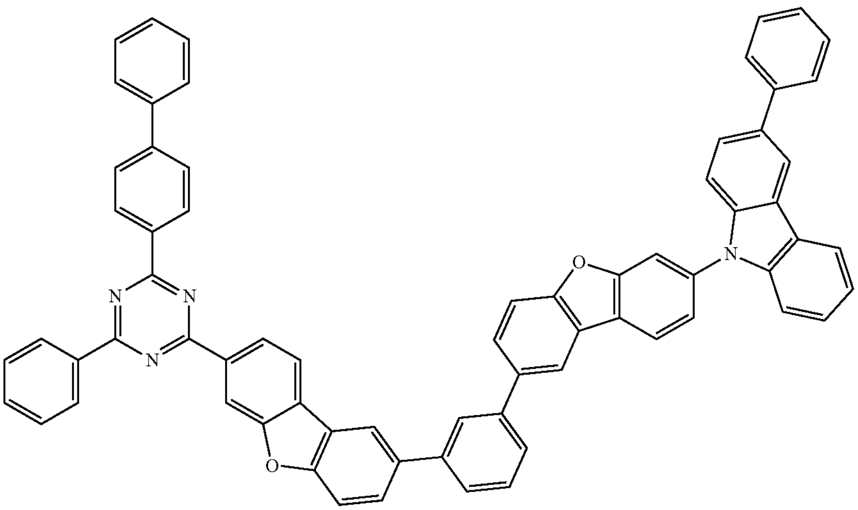 [SMILES: c1ccc(-c2ccc(-c3nc(-c4ccccc4)nc(-c4ccc5c(c4)oc4ccc(-c6cccc(-c7ccc8oc9cc(-n%10c%11ccccc%11c%11cc(-c%12ccccc%12)ccc%11%10)ccc9c8c7)c6)cc45)n3)cc2)cc1]

TABLE 1-continued
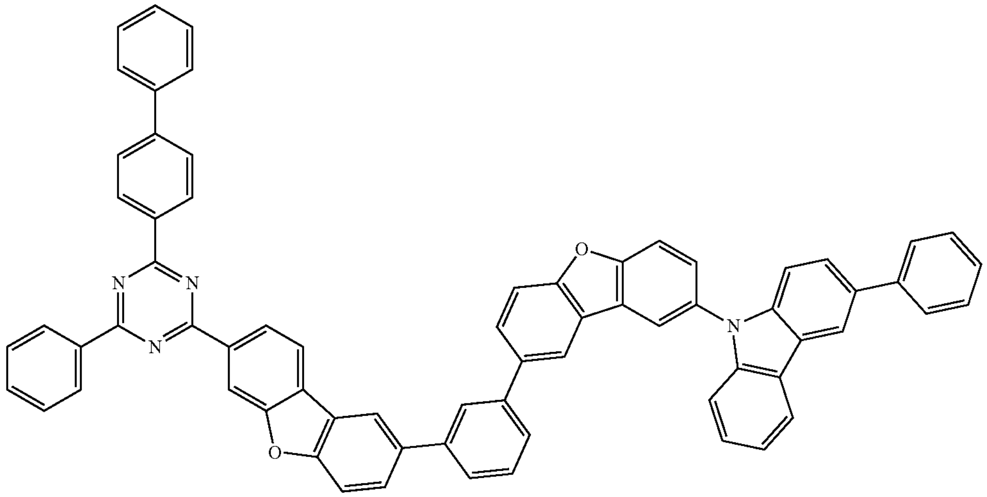 [SMILES: c1ccc(-c2ccc(-c3nc(-c4ccccc4)nc(-c4ccc5c(c4)oc4ccc(-c6cccc(-c7ccc8oc9ccc(-n%10c%11ccccc%11c%11cc(-c%12ccccc%12)ccc%11%10)cc9c8c7)c6)cc45)n3)cc2)cc1]
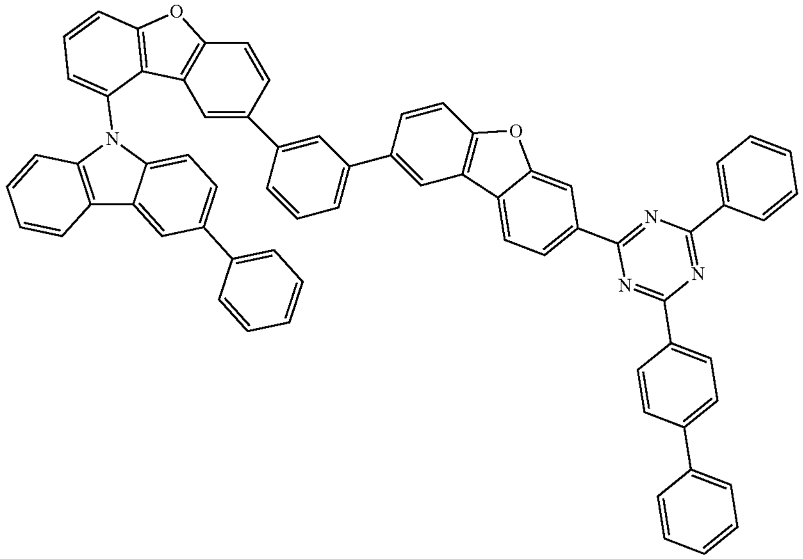 [SMILES: c1ccc(-c2ccc(-c3nc(-c4ccccc4)nc(-c4ccc5c(c4)oc4ccc(-c6cccc(-c7ccc8oc9cccc(-n%10c%11ccccc%11c%11cc(-c%12ccccc%12)ccc%11%10)c9c8c7)c6)cc45)n3)cc2)cc1]
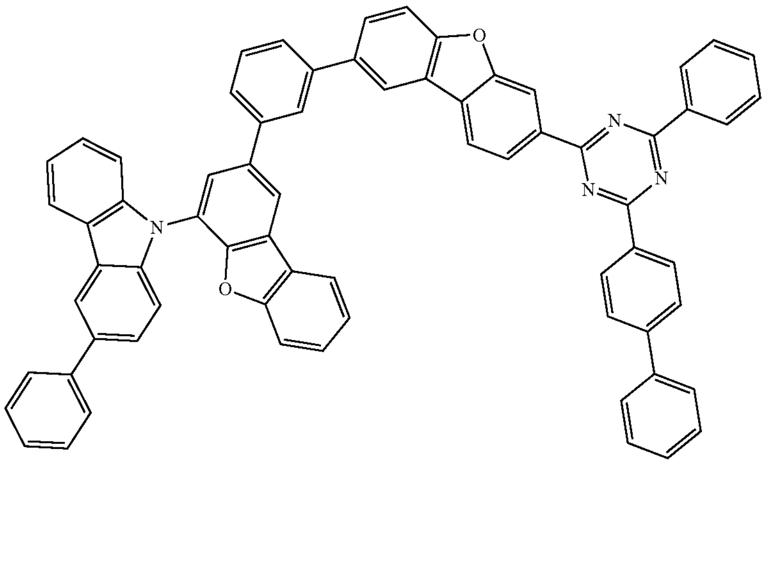 [SMILES: c1ccc(-c2ccc(-c3nc(-c4ccccc4)nc(-c4ccc5c(c4)oc4ccc(-c6cccc(-c7cc(-n8c9ccccc9c9cc(-c%10ccccc%10)ccc98)c8oc9ccccc9c8c7)c6)cc45)n3)cc2)cc1]

TABLE 1-continued
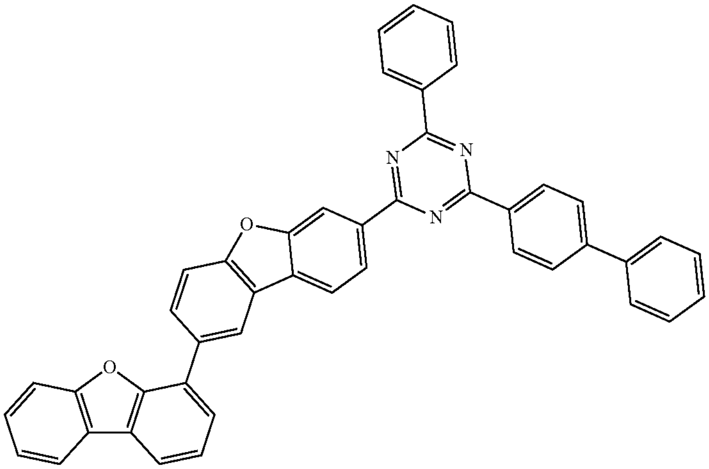 [SMILES: c1ccc(-c2ccc(-c3nc(-c4ccccc4)nc(-c4ccc5c(c4)oc4ccc(-c6cccc7c6oc6ccccc67)cc45)n3)cc2)cc1]
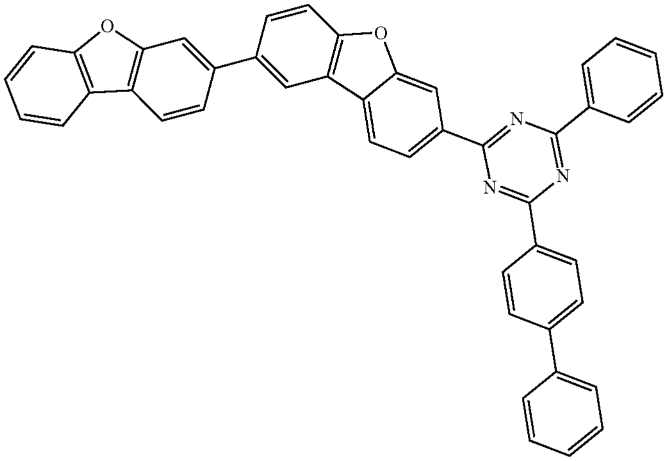 [SMILES: c1ccc(-c2ccc(-c3nc(-c4ccccc4)nc(-c4ccc5c(c4)oc4ccc(-c6ccc7c(c6)oc6ccccc67)cc45)n3)cc2)cc1]
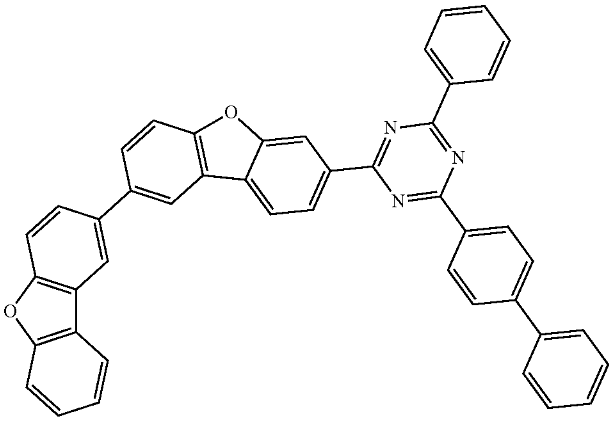 [SMILES: c1ccc(-c2ccc(-c3nc(-c4ccccc4)nc(-c4ccc5c(c4)oc4ccc(-c6ccc7oc8ccccc8c7c6)cc45)n3)cc2)cc1]

TABLE 1-continued
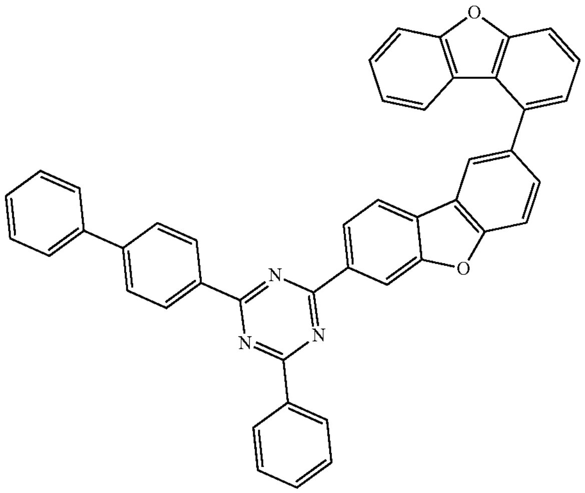 [SMILES: c1ccc(-c2ccc(-c3nc(-c4ccccc4)nc(-c4ccc5c(c4)oc4ccc(-c6cccc7oc8ccccc8c67)cc45)n3)cc2)cc1]
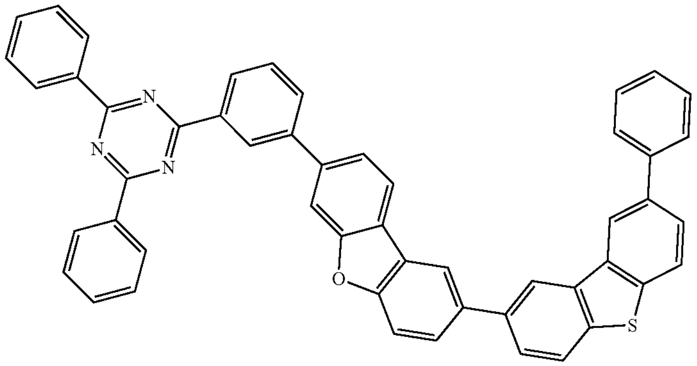 [SMILES: c1ccc(-c2ccc3sc4ccc(-c5ccc6oc7cc(-c8cccc(-c9nc(-c%10ccccc%10)nc(-c%10ccccc%10)n9)c8)ccc7c6c5)cc4c3c2)cc1]
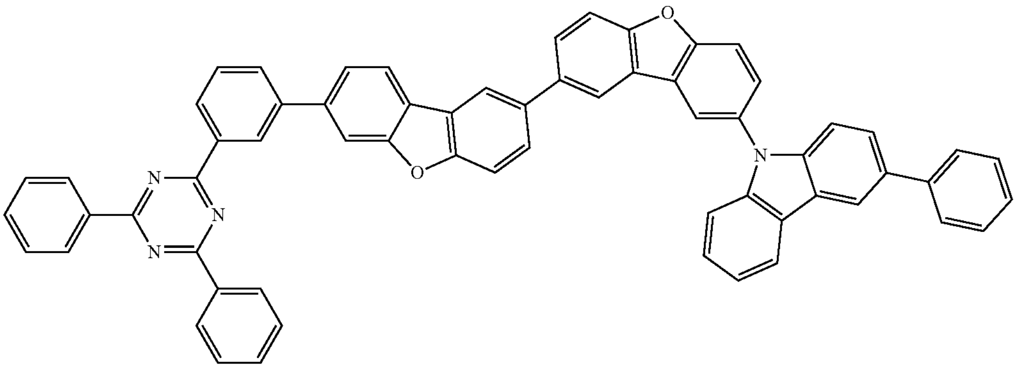 [SMILES: c1ccc(-c2ccc3c(c2)c2ccccc2n3-c2ccc3oc4ccc(-c5ccc6oc7cc(-c8cccc(-c9nc(-c%10ccccc%10)nc(-c%10ccccc%10)n9)c8)ccc7c6c5)cc4c3c2)cc1]
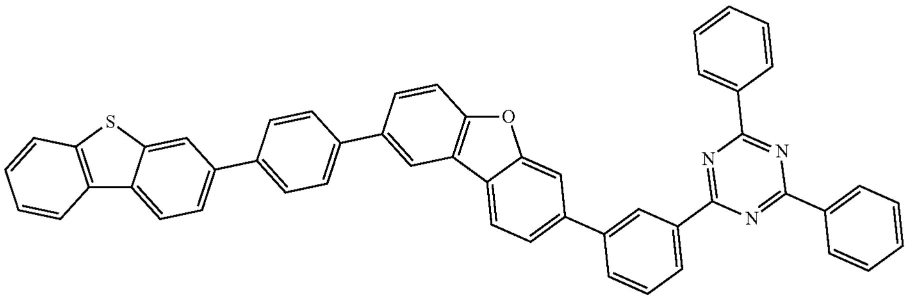 [SMILES: c1ccc(-c2nc(-c3ccccc3)nc(-c3cccc(-c4ccc5c(c4)oc4ccc(-c6ccc(-c7ccc8c(c7)sc7ccccc78)cc6)cc45)c3)n2)cc1]

TABLE 1-continued
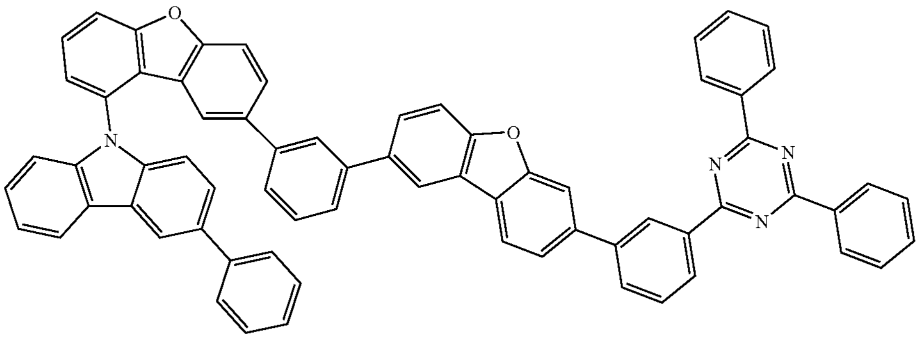 [SMILES: c1ccc(-c2ccc3c(c2)c2ccccc2n3-c2cccc3oc4ccc(-c5cccc(-c6ccc7oc8cc(-c9cccc(-c%10nc(-c%11ccccc%11)nc(-c%11ccccc%11)n%10)c9)ccc8c7c6)c5)cc4c23)cc1]
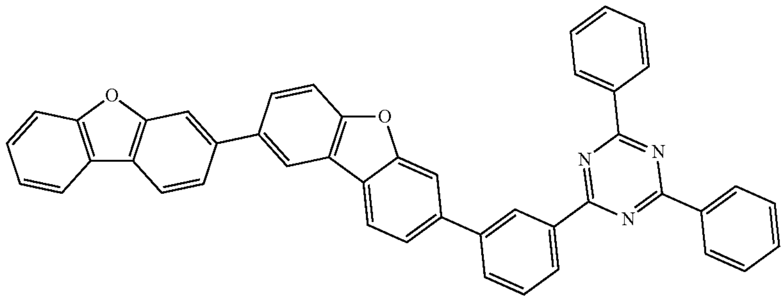 [SMILES: c1ccc(-c2nc(-c3ccccc3)nc(-c3cccc(-c4ccc5c(c4)oc4ccc(-c6ccc7c(c6)oc6ccccc67)cc45)c3)n2)cc1]
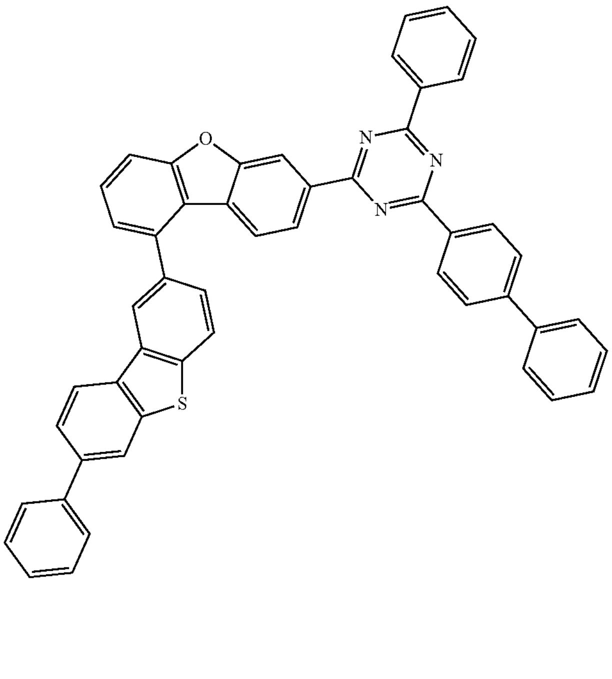 [SMILES: c1ccc(-c2ccc(-c3nc(-c4ccccc4)nc(-c4ccc5c(c4)oc4cccc(-c6ccc7sc8cc(-c9ccccc9)ccc8c7c6)c45)n3)cc2)cc1]

TABLE 1-continued
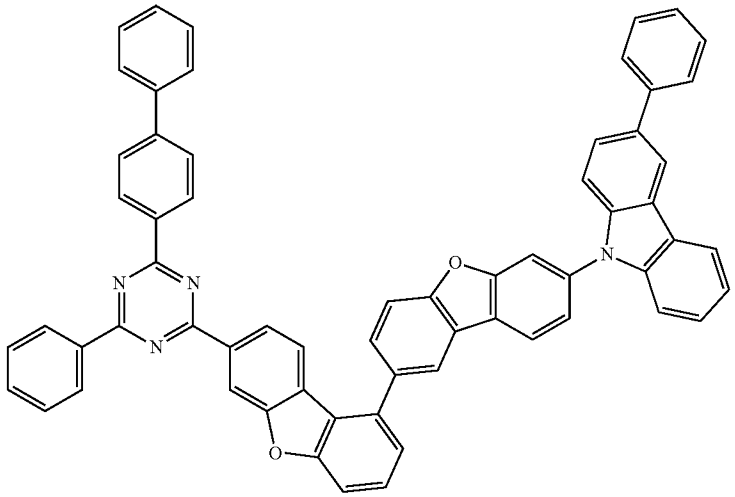 [SMILES: c1ccc(-c2ccc(-c3nc(-c4ccccc4)nc(-c4ccc5c(c4)oc4cccc(-c6ccc7oc8cc(-n9c%10ccccc%10c%10cc(-c%11ccccc%11)ccc%109)ccc8c7c6)c45)n3)cc2)cc1]
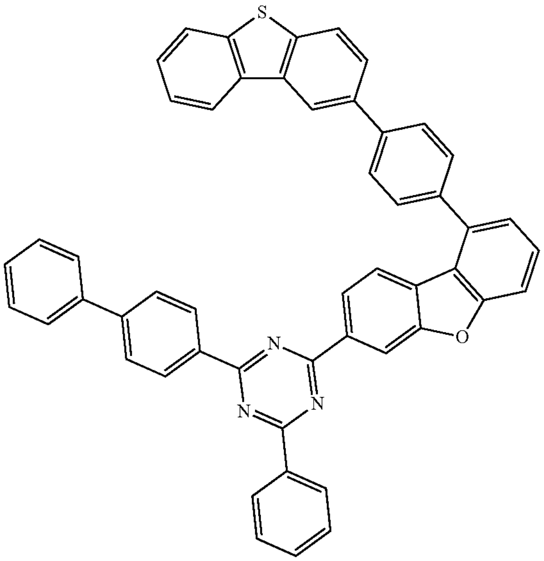 [SMILES: c1ccc(-c2ccc(-c3nc(-c4ccccc4)nc(-c4ccc5c(c4)oc4cccc(-c6ccc(-c7ccc8sc9ccccc9c8c7)cc6)c45)n3)cc2)cc1]
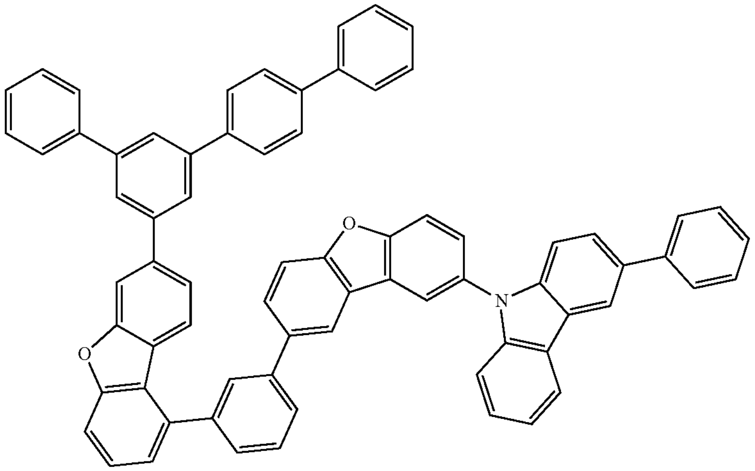 [SMILES: c1ccc(-c2ccc(-c3cc(-c4ccccc4)cc(-c4ccc5c(c4)oc4cccc(-c6cccc(-c7ccc8oc9ccc(-n%10c%11ccccc%11c%11cc(-c%12ccccc%12)ccc%11%10)cc9c8c7)c6)c45)c3)cc2)cc1]

TABLE 1-continued
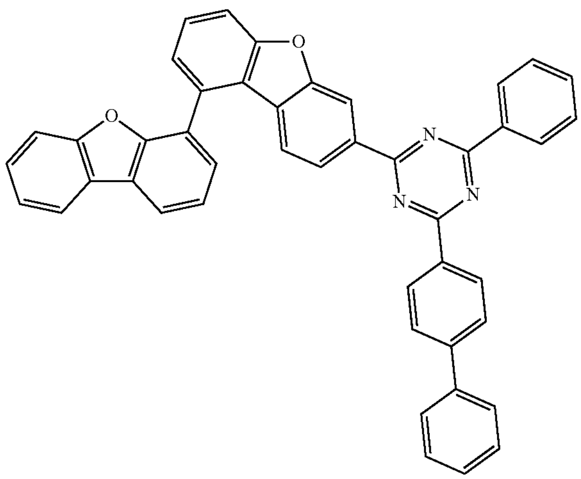 [SMILES: c1ccc(-c2ccc(-c3nc(-c4ccccc4)nc(-c4ccc5c(c4)oc4cccc(-c6cccc7c6oc6ccccc67)c45)n3)cc2)cc1]
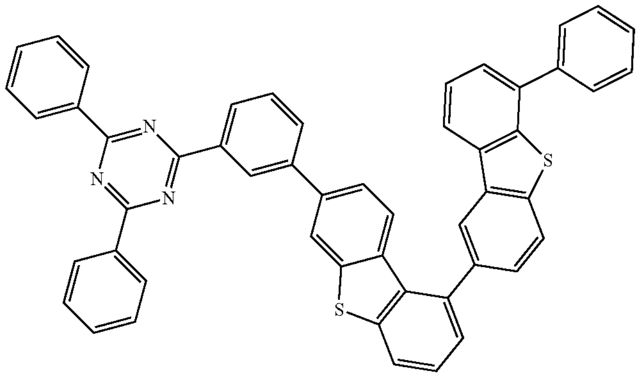 [SMILES: c1ccc(-c2nc(-c3ccccc3)nc(-c3cccc(-c4ccc5c(c4)sc4cccc(-c6ccc7sc8c(-c9ccccc9)cccc8c7c6)c45)c3)n2)cc1]
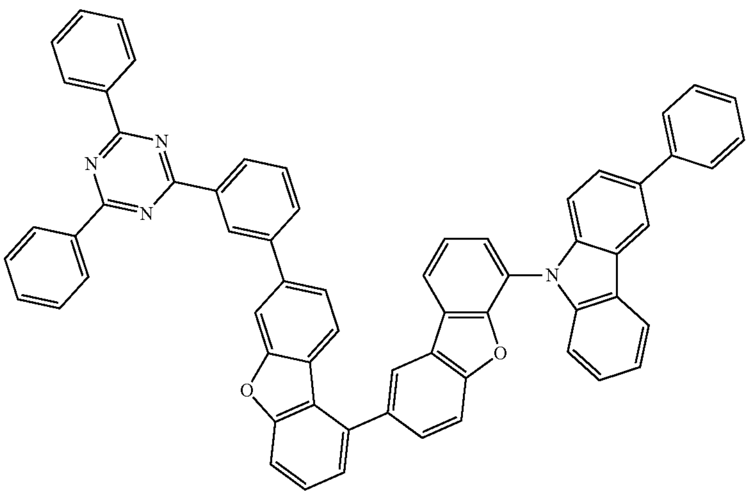 [SMILES: c1ccc(-c2ccc3c(c2)c2ccccc2n3-c2cccc3c2oc2ccc(-c4cccc5oc6cc(-c7cccc(-c8nc(-c9ccccc9)nc(-c9ccccc9)n8)c7)ccc6c45)cc23)cc1]

TABLE 1-continued
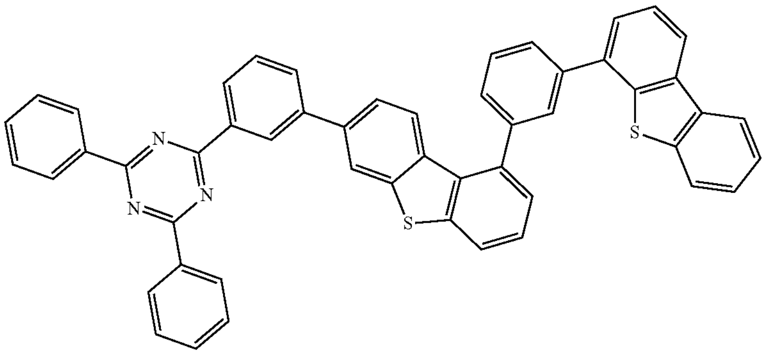 [SMILES: c1ccc(-c2nc(-c3ccccc3)nc(-c3cccc(-c4ccc5c(c4)sc4cccc(-c6cccc(-c7cccc8c7sc7ccccc78)c6)c45)c3)n2)cc1]
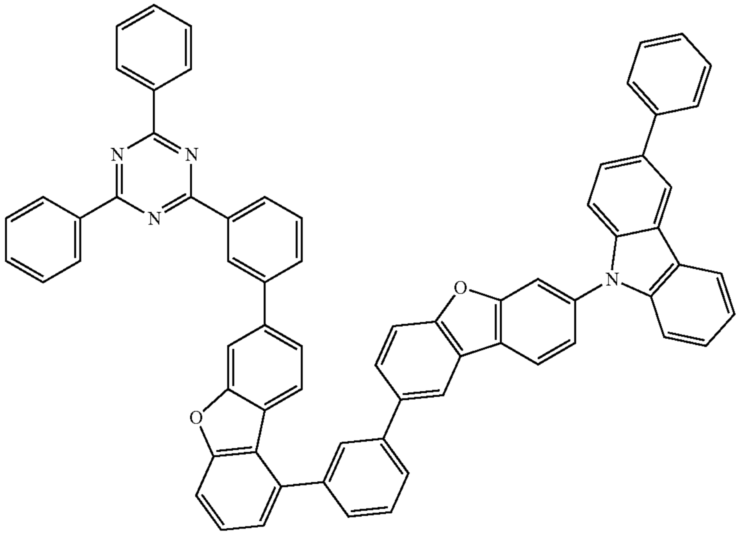 [SMILES: c1ccc(-c2ccc3c(c2)c2ccccc2n3-c2ccc3c(c2)oc2ccc(-c4cccc(-c5cccc6oc7cc(-c8cccc(-c9nc(-c%10ccccc%10)nc(-c%10ccccc%10)n9)c8)ccc7c56)c4)cc23)cc1]
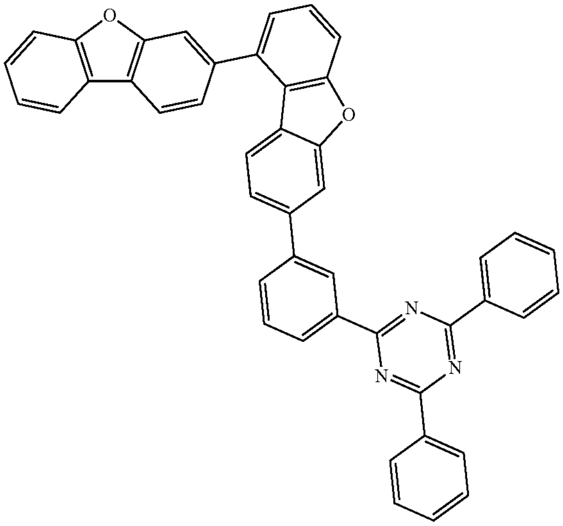 [SMILES: c1ccc(-c2nc(-c3ccccc3)nc(-c3cccc(-c4ccc5c(c4)oc4cccc(-c6ccc7c(c6)oc6ccccc67)c45)c3)n2)cc1]

TABLE 1-continued
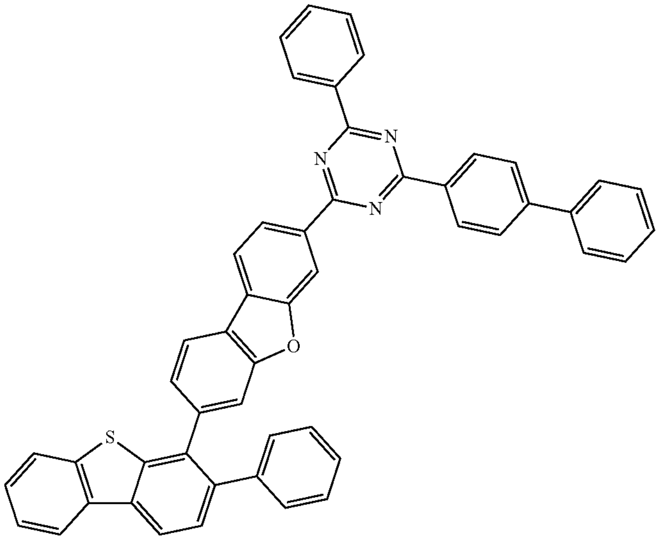 [SMILES: c1ccc(-c2ccc(-c3nc(-c4ccccc4)nc(-c4ccc5c(c4)oc4cc(-c6c(-c7ccccc7)ccc7c6sc6ccccc67)ccc45)n3)cc2)cc1]
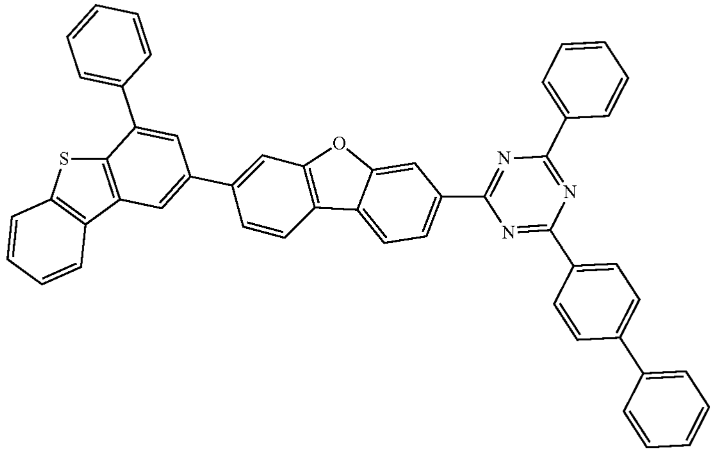 [SMILES: c1ccc(-c2ccc(-c3nc(-c4ccccc4)nc(-c4ccc5c(c4)oc4cc(-c6cc(-c7ccccc7)c7sc8ccccc8c7c6)ccc45)n3)cc2)cc1]
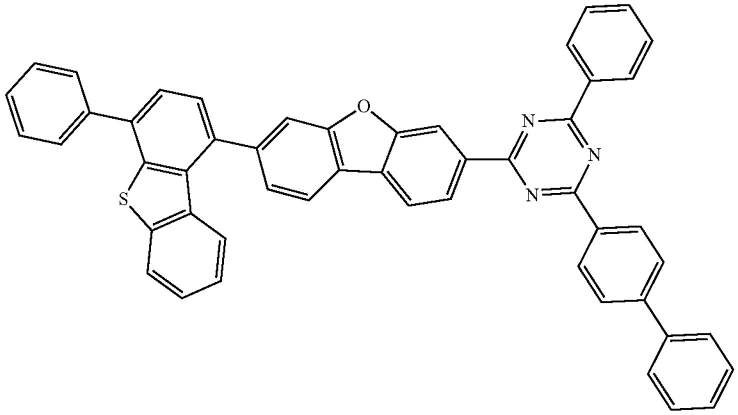 [SMILES: c1ccc(-c2ccc(-c3nc(-c4ccccc4)nc(-c4ccc5c(c4)oc4cc(-c6ccc(-c7ccccc7)c7sc8ccccc8c67)ccc45)n3)cc2)cc1]

TABLE 1-continued
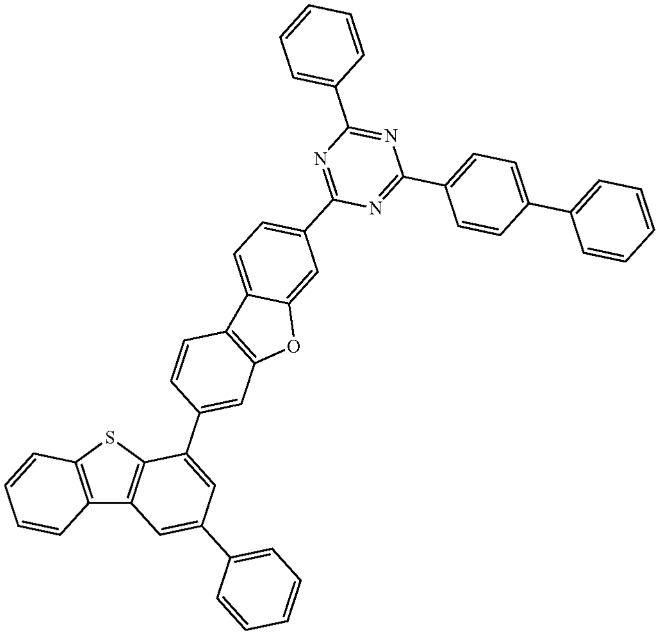 [SMILES: c1ccc(-c2ccc(-c3nc(-c4ccccc4)nc(-c4ccc5c(c4)oc4cc(-c6cc(-c7ccccc7)cc7c6sc6ccccc67)ccc45)n3)cc2)cc1]
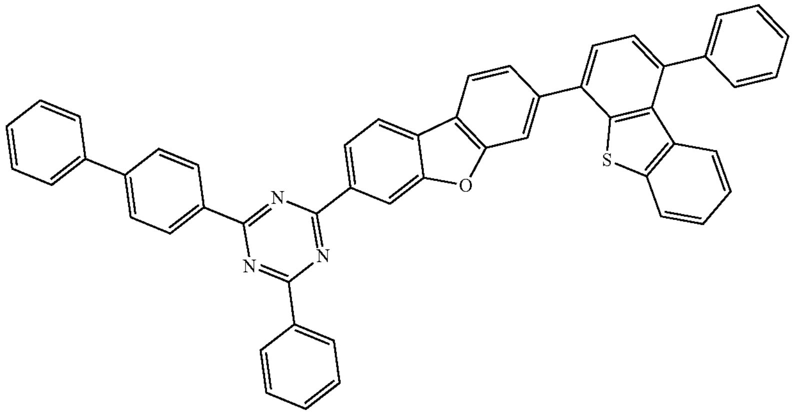 [SMILES: c1ccc(-c2ccc(-c3nc(-c4ccccc4)nc(-c4ccc5c(c4)oc4cc(-c6ccc(-c7ccccc7)c7c6sc6ccccc67)ccc45)n3)cc2)cc1]
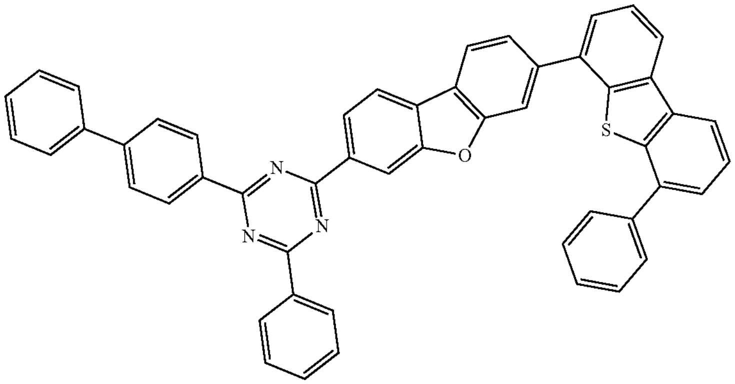 [SMILES: c1ccc(-c2ccc(-c3nc(-c4ccccc4)nc(-c4ccc5c(c4)oc4cc(-c6cccc7c6sc6c(-c8ccccc8)cccc67)ccc45)n3)cc2)cc1]

TABLE 1-continued
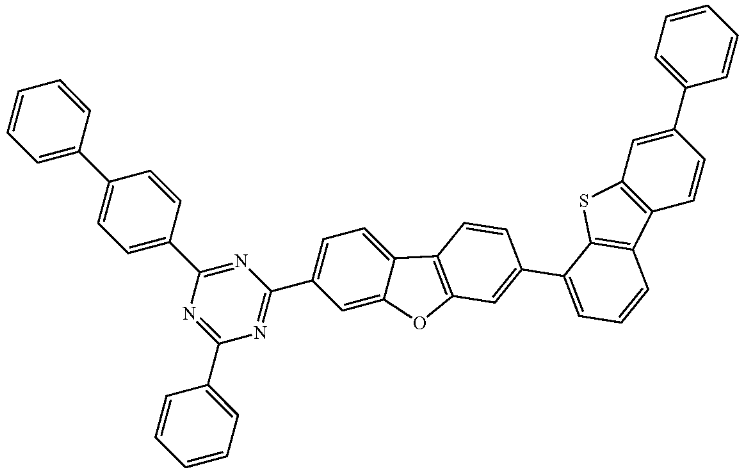 [SMILES: c1ccc(-c2ccc(-c3nc(-c4ccccc4)nc(-c4ccc5c(c4)oc4cc(-c6cccc7c6sc6cc(-c8ccccc8)ccc67)ccc45)n3)cc2)cc1]
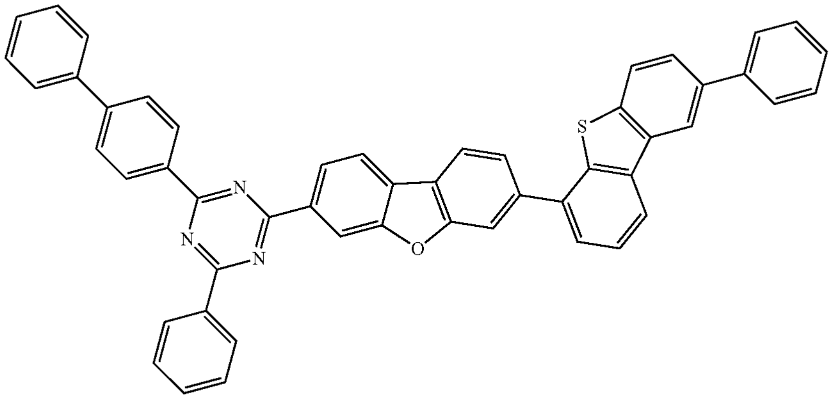 [SMILES: c1ccc(-c2ccc(-c3nc(-c4ccccc4)nc(-c4ccc5c(c4)oc4cc(-c6cccc7c6sc6ccc(-c8ccccc8)cc67)ccc45)n3)cc2)cc1]
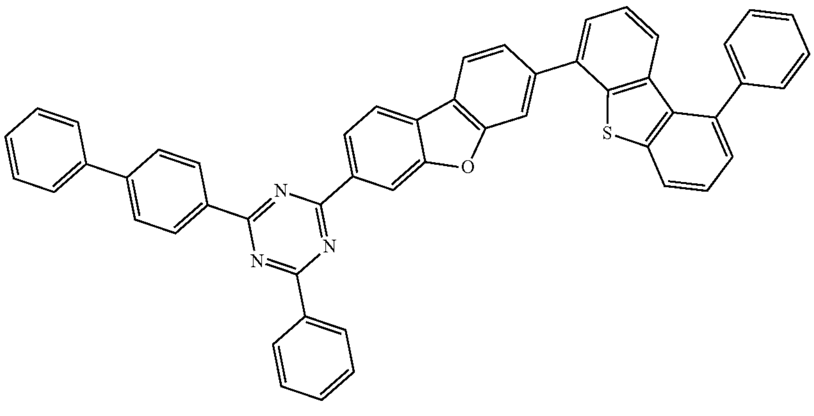 [SMILES: c1ccc(-c2ccc(-c3nc(-c4ccccc4)nc(-c4ccc5c(c4)oc4cc(-c6cccc7c6sc6cccc(-c8ccccc8)c67)ccc45)n3)cc2)cc1]

TABLE 1-continued
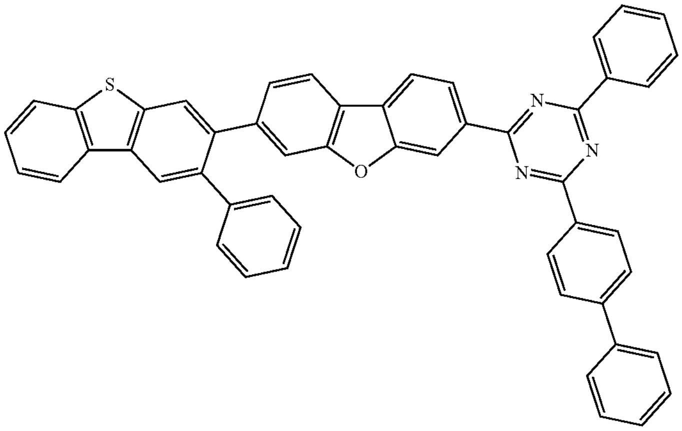 [SMILES: c1ccc(-c2ccc(-c3nc(-c4ccccc4)nc(-c4ccc5c(c4)oc4cc(-c6cc7sc8ccccc8c7cc6-c6ccccc6)ccc45)n3)cc2)cc1]
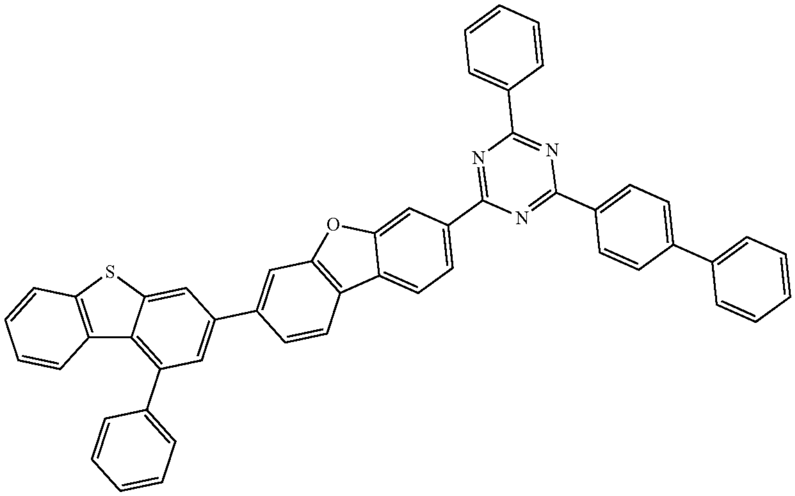 [SMILES: c1ccc(-c2ccc(-c3nc(-c4ccccc4)nc(-c4ccc5c(c4)oc4cc(-c6cc(-c7ccccc7)c7c(c6)sc6ccccc67)ccc45)n3)cc2)cc1]
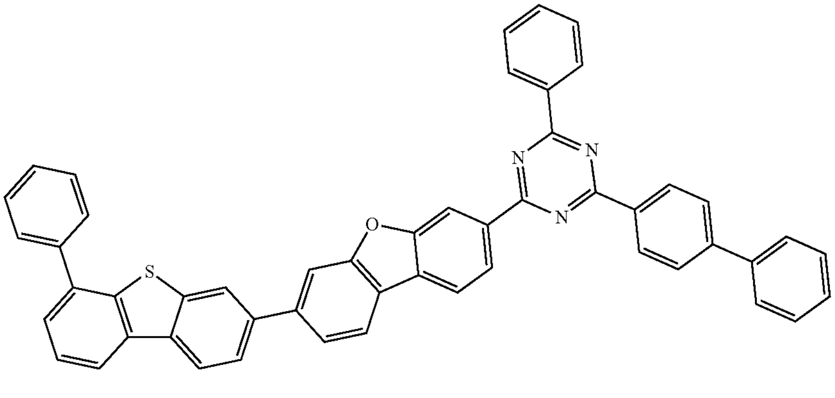 [SMILES: c1ccc(-c2ccc(-c3nc(-c4ccccc4)nc(-c4ccc5c(c4)oc4cc(-c6ccc7c(c6)sc6c(-c8ccccc8)cccc67)ccc45)n3)cc2)cc1]

TABLE 1-continued
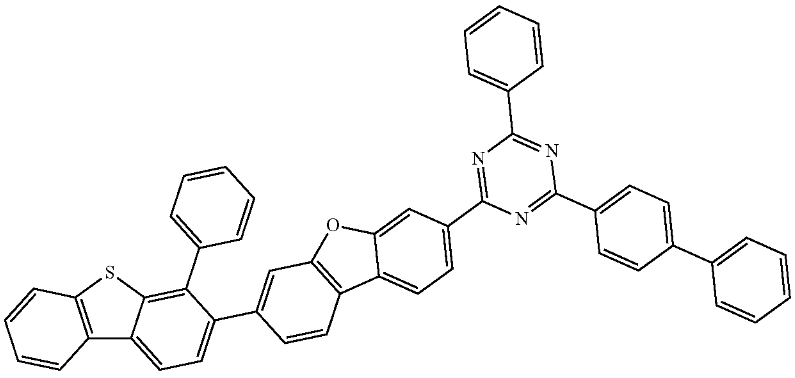 [SMILES: c1ccc(-c2ccc(-c3nc(-c4ccccc4)nc(-c4ccc5c(c4)oc4cc(-c6ccc7c(sc8ccccc87)c6-c6ccccc6)ccc45)n3)cc2)cc1]
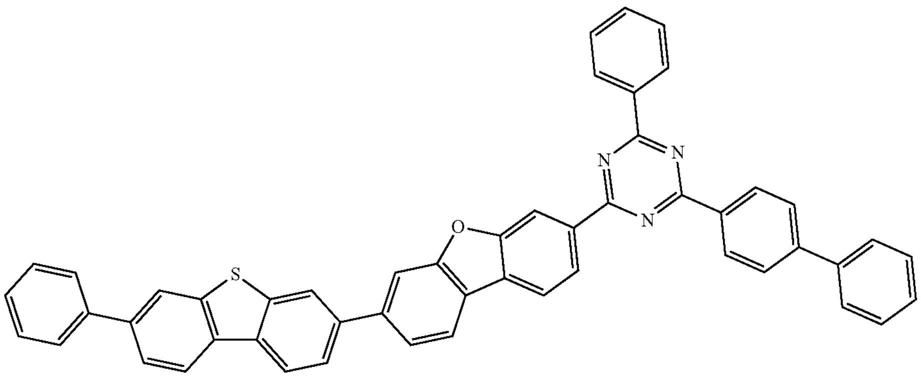 [SMILES: c1ccc(-c2ccc(-c3nc(-c4ccccc4)nc(-c4ccc5c(c4)oc4cc(-c6ccc7c(c6)sc6cc(-c8ccccc8)ccc67)ccc45)n3)cc2)cc1]
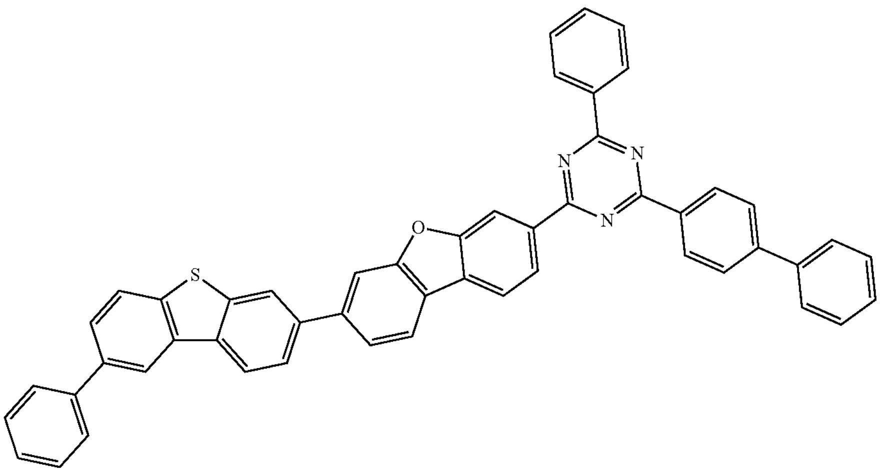 [SMILES: c1ccc(-c2ccc(-c3nc(-c4ccccc4)nc(-c4ccc5c(c4)oc4cc(-c6ccc7c(c6)sc6ccc(-c8ccccc8)cc67)ccc45)n3)cc2)cc1]

TABLE 1-continued
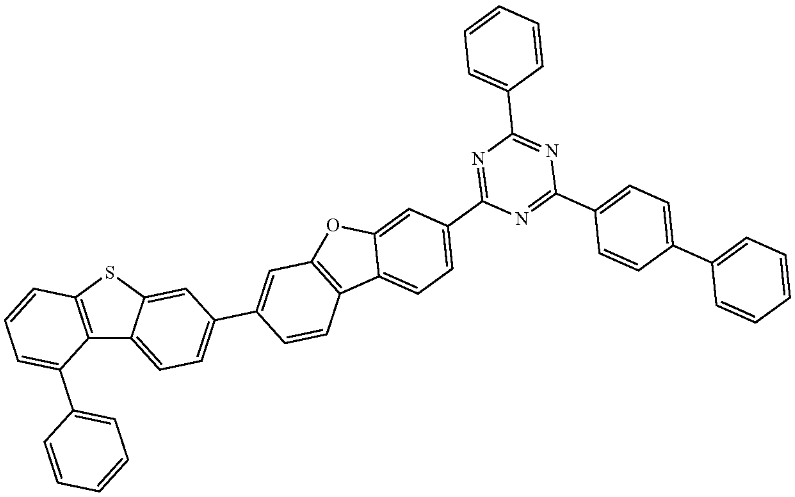 [SMILES: c1ccc(-c2ccc(-c3nc(-c4ccccc4)nc(-c4ccc5c(c4)oc4cc(-c6ccc7c(c6)sc6cccc(-c8ccccc8)c67)ccc45)n3)cc2)cc1]
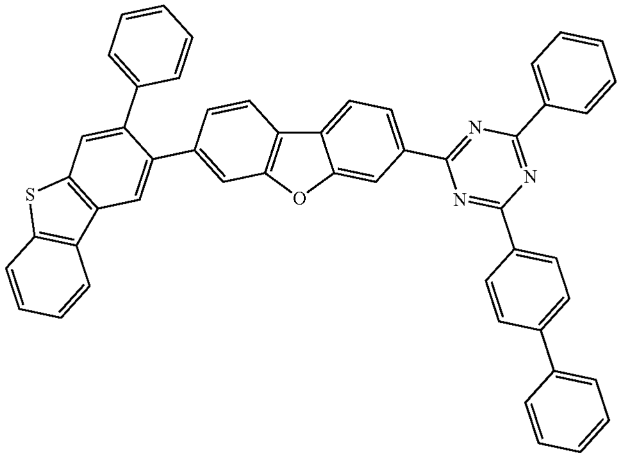 [SMILES: c1ccc(-c2ccc(-c3nc(-c4ccccc4)nc(-c4ccc5c(c4)oc4cc(-c6cc7c(cc6-c6ccccc6)sc6ccccc67)ccc45)n3)cc2)cc1]
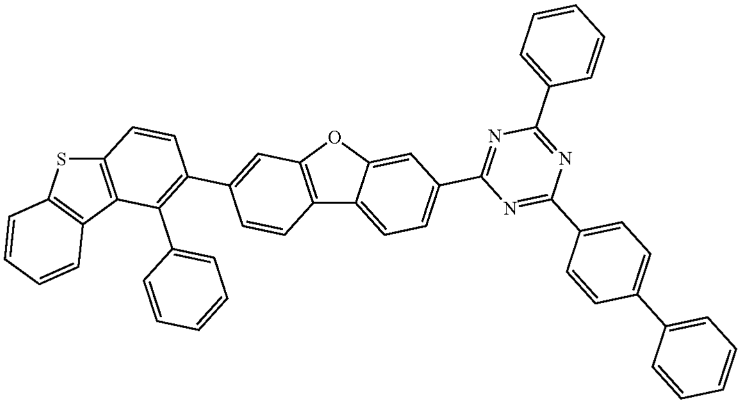 [SMILES: c1ccc(-c2ccc(-c3nc(-c4ccccc4)nc(-c4ccc5c(c4)oc4cc(-c6ccc7sc8ccccc8c7c6-c6ccccc6)ccc45)n3)cc2)cc1]

TABLE 1-continued
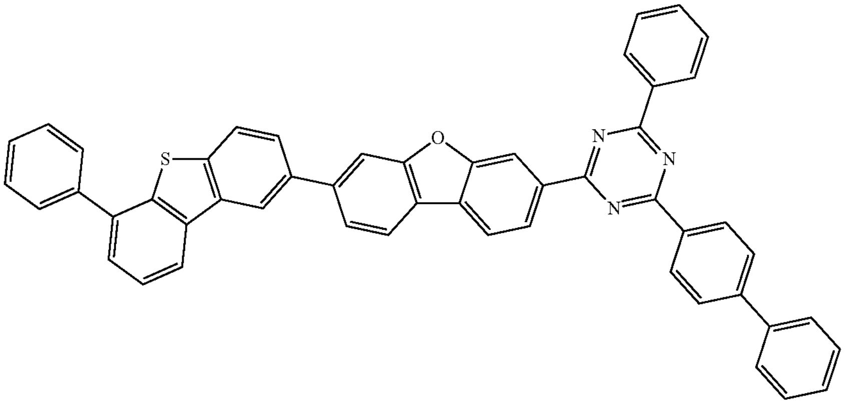 [SMILES: c1ccc(-c2ccc(-c3nc(-c4ccccc4)nc(-c4ccc5c(c4)oc4cc(-c6ccc7sc8c(-c9ccccc9)cccc8c7c6)ccc45)n3)cc2)cc1]
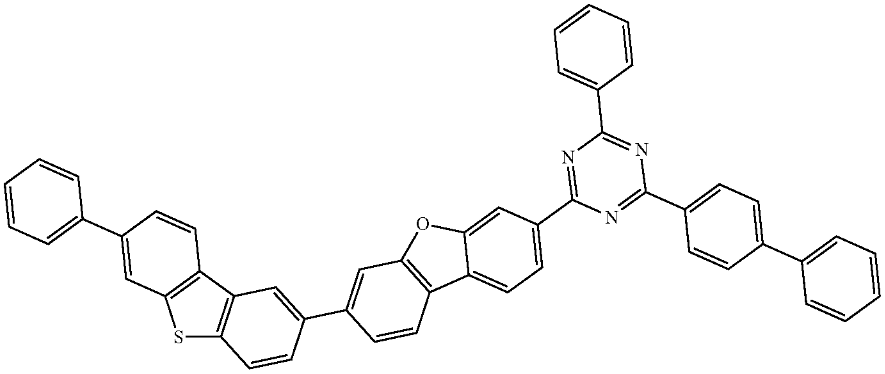 [SMILES: c1ccc(-c2ccc(-c3nc(-c4ccccc4)nc(-c4ccc5c(c4)oc4cc(-c6ccc7sc8cc(-c9ccccc9)ccc8c7c6)ccc45)n3)cc2)cc1]
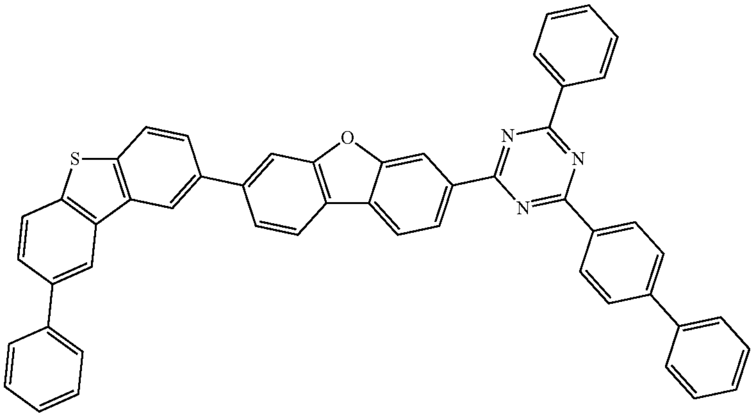 [SMILES: c1ccc(-c2ccc(-c3nc(-c4ccccc4)nc(-c4ccc5c(c4)oc4cc(-c6ccc7sc8ccc(-c9ccccc9)cc8c7c6)ccc45)n3)cc2)cc1]
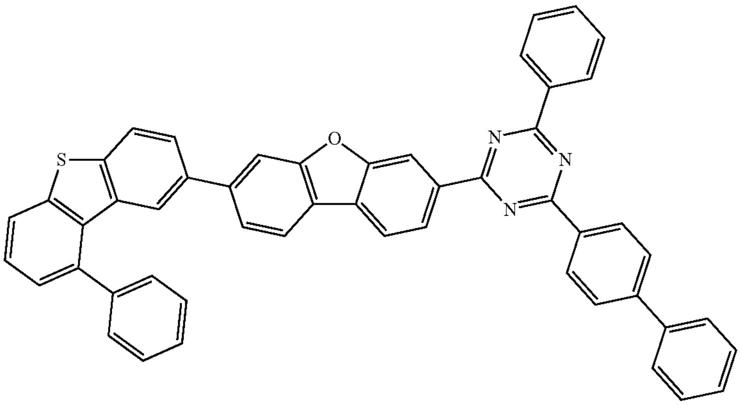 [SMILES: c1ccc(-c2ccc(-c3nc(-c4ccccc4)nc(-c4ccc5c(c4)oc4cc(-c6ccc7sc8cccc(-c9ccccc9)c8c7c6)ccc45)n3)cc2)cc1]

TABLE 1-continued
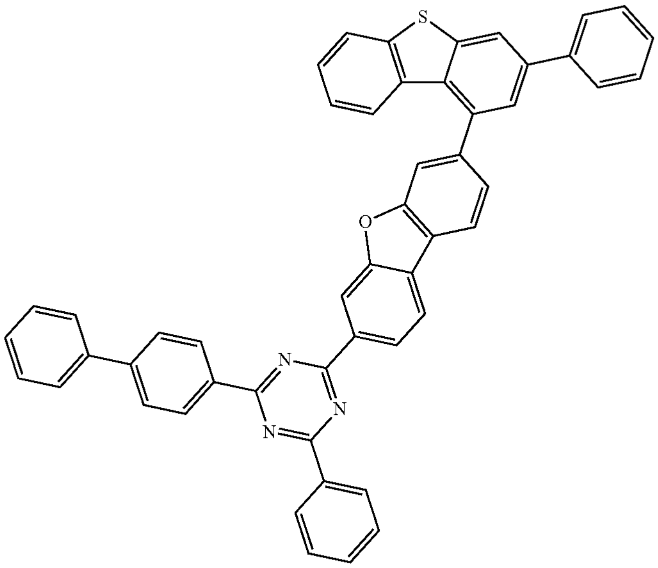 [SMILES: c1ccc(-c2ccc(-c3nc(-c4ccccc4)nc(-c4ccc5c(c4)oc4cc(-c6cc(-c7ccccc7)cc7sc8ccccc8c67)ccc45)n3)cc2)cc1]
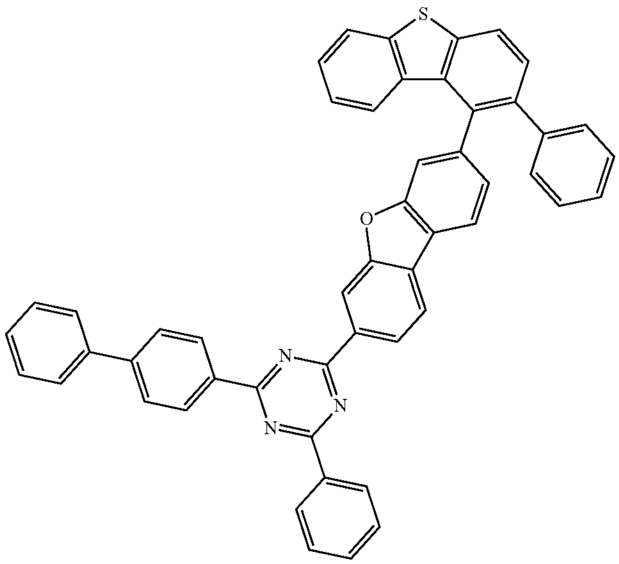 [SMILES: c1ccc(-c2ccc(-c3nc(-c4ccccc4)nc(-c4ccc5c(c4)oc4cc(-c6c(-c7ccccc7)ccc7sc8ccccc8c67)ccc45)n3)cc2)cc1]
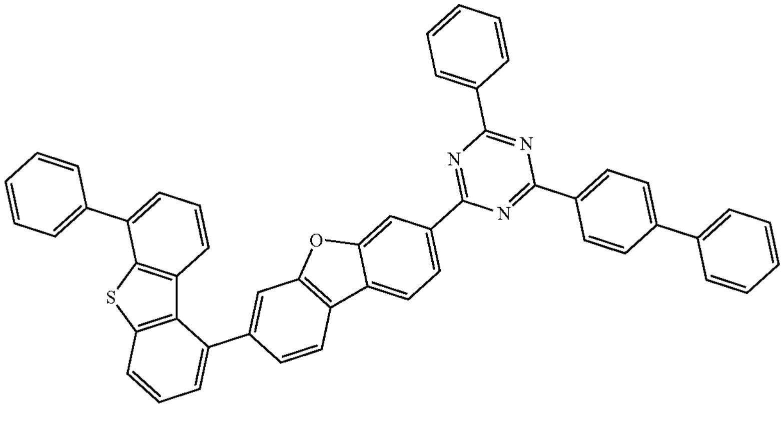 [SMILES: c1ccc(-c2ccc(-c3nc(-c4ccccc4)nc(-c4ccc5c(c4)oc4cc(-c6cccc7sc8c(-c9ccccc9)cccc8c67)ccc45)n3)cc2)cc1]

TABLE 1-continued
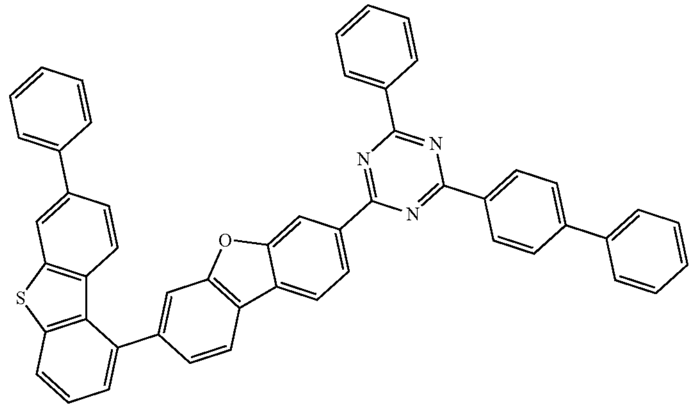 [SMILES: c1ccc(-c2ccc(-c3nc(-c4ccccc4)nc(-c4ccc5c(c4)oc4cc(-c6cccc7sc8cc(-c9ccccc9)ccc8c67)ccc45)n3)cc2)cc1]
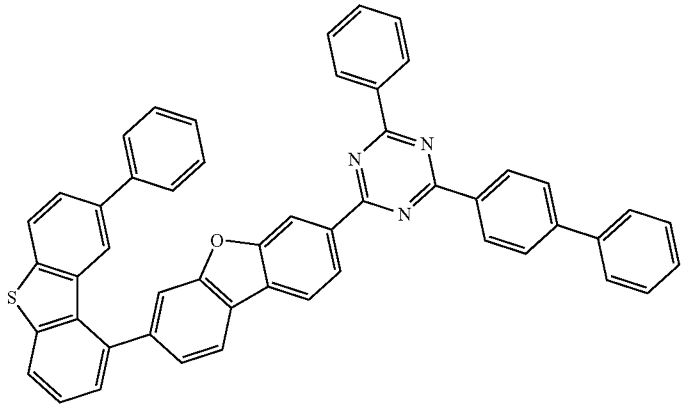 [SMILES: c1ccc(-c2ccc(-c3nc(-c4ccccc4)nc(-c4ccc5c(c4)oc4cc(-c6cccc7sc8ccc(-c9ccccc9)cc8c67)ccc45)n3)cc2)cc1]
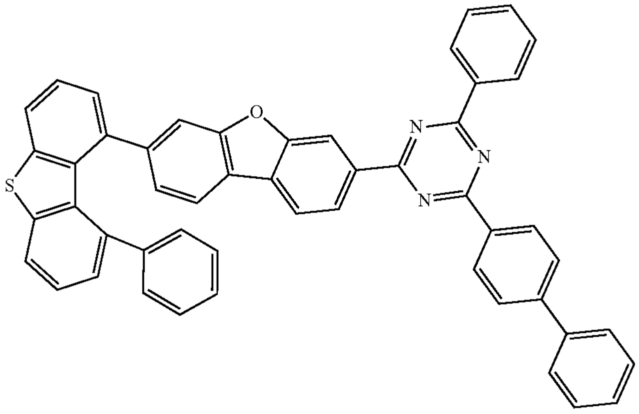 [SMILES: c1ccc(-c2ccc(-c3nc(-c4ccccc4)nc(-c4ccc5c(c4)oc4cc(-c6cccc7sc8cccc(-c9ccccc9)c8c67)ccc45)n3)cc2)cc1]

TABLE 1-continued
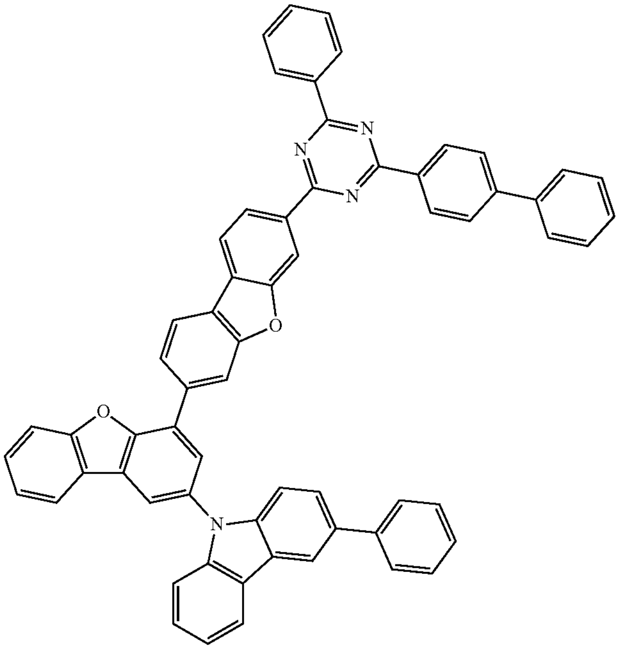 [SMILES: c1ccc(-c2ccc(-c3nc(-c4ccccc4)nc(-c4ccc5c(c4)oc4cc(-c6cc(-n7c8ccccc8c8cc(-c9ccccc9)ccc87)cc7c6oc6ccccc67)ccc45)n3)cc2)cc1]
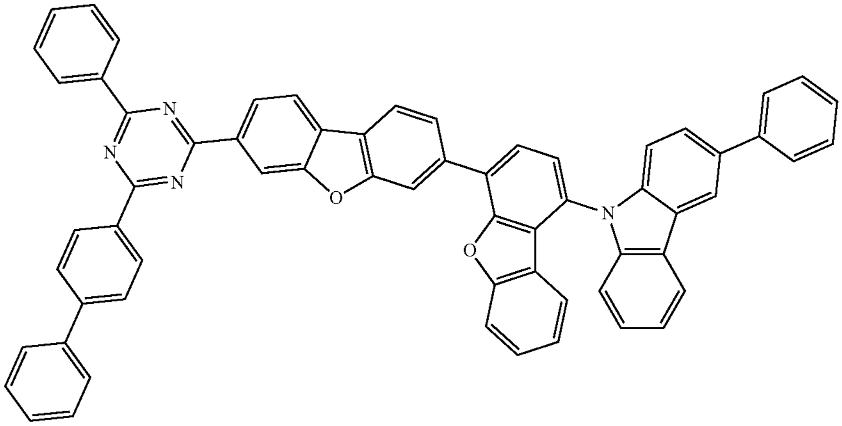 [SMILES: c1ccc(-c2ccc(-c3nc(-c4ccccc4)nc(-c4ccc5c(c4)oc4cc(-c6ccc(-n7c8ccccc8c8cc(-c9ccccc9)ccc87)c7c6oc6ccccc67)ccc45)n3)cc2)cc1]
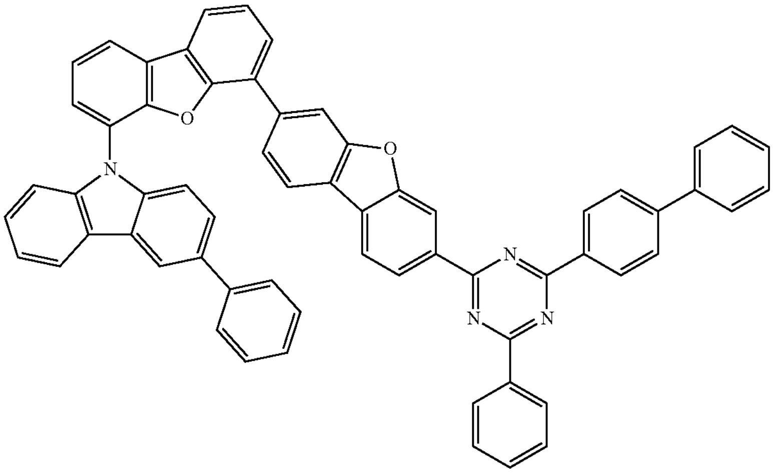 [SMILES: c1ccc(-c2ccc(-c3nc(-c4ccccc4)nc(-c4ccc5c(c4)oc4cc(-c6cccc7c6oc6c(-n8c9ccccc9c9cc(-c%10ccccc%10)ccc98)cccc67)ccc45)n3)cc2)cc1]

TABLE 1-continued
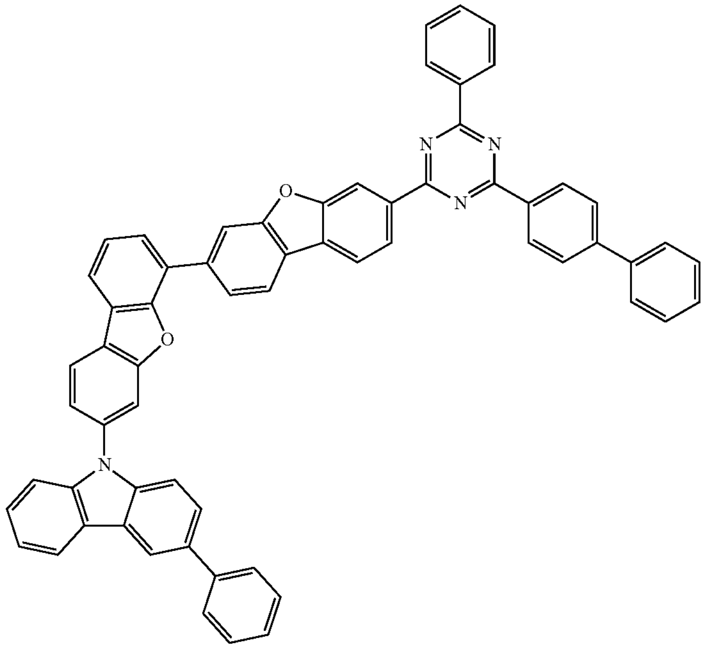 [SMILES: c1ccc(-c2ccc(-c3nc(-c4ccccc4)nc(-c4ccc5c(c4)oc4cc(-c6cccc7c6oc6cc(-n8c9ccccc9c9cc(-c%10ccccc%10)ccc98)ccc67)ccc45)n3)cc2)cc1]
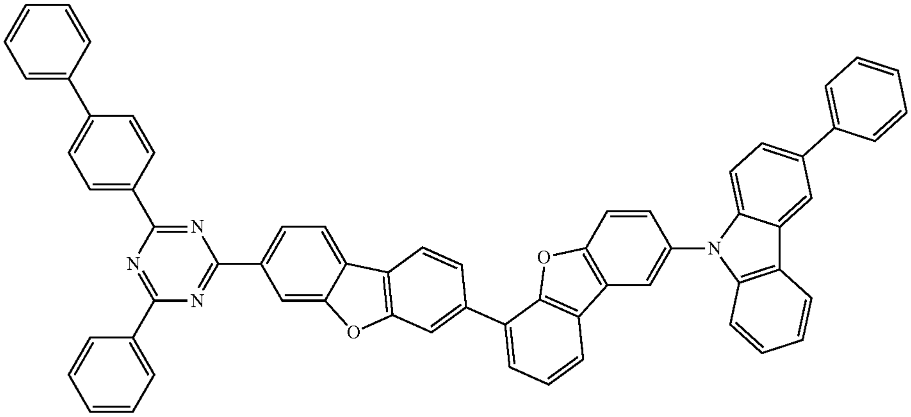 [SMILES: c1ccc(-c2ccc(-c3nc(-c4ccccc4)nc(-c4ccc5c(c4)oc4cc(-c6cccc7c6oc6ccc(-n8c9ccccc9c9cc(-c%10ccccc%10)ccc98)cc67)ccc45)n3)cc2)cc1]
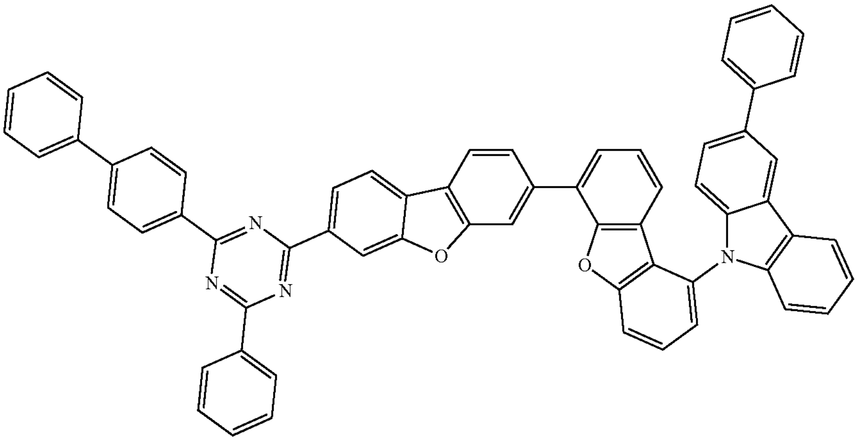 [SMILES: c1ccc(-c2ccc(-c3nc(-c4ccccc4)nc(-c4ccc5c(c4)oc4cc(-c6cccc7c6oc6cccc(-n8c9ccccc9c9cc(-c%10ccccc%10)ccc98)c67)ccc45)n3)cc2)cc1]

TABLE 1-continued
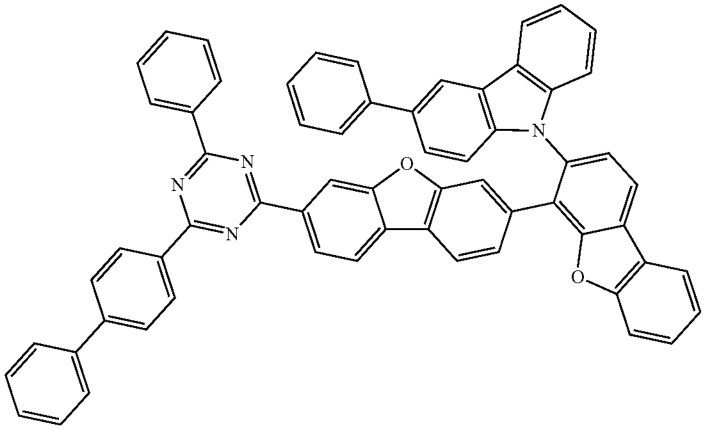 [SMILES: c1ccc(-c2ccc(-c3nc(-c4ccccc4)nc(-c4ccc5c(c4)oc4cc(-c6c(-n7c8ccccc8c8cc(-c9ccccc9)ccc87)ccc7c6oc6ccccc67)ccc45)n3)cc2)cc1]
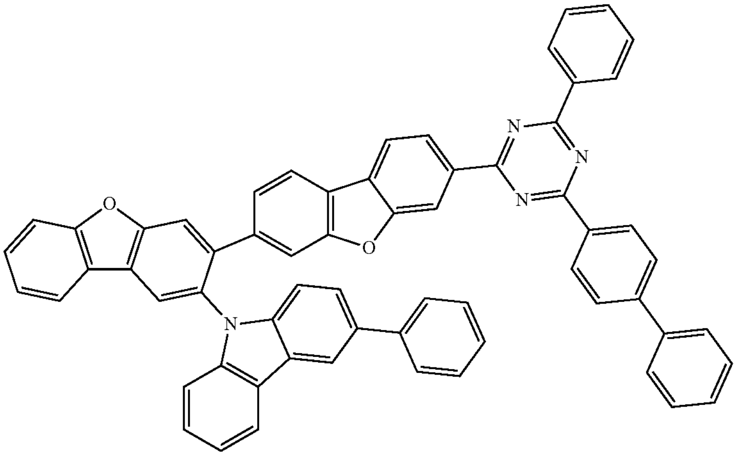 [SMILES: c1ccc(-c2ccc(-c3nc(-c4ccccc4)nc(-c4ccc5c(c4)oc4cc(-c6cc7oc8ccccc8c7cc6-n6c7ccccc7c7cc(-c8ccccc8)ccc76)ccc45)n3)cc2)cc1]
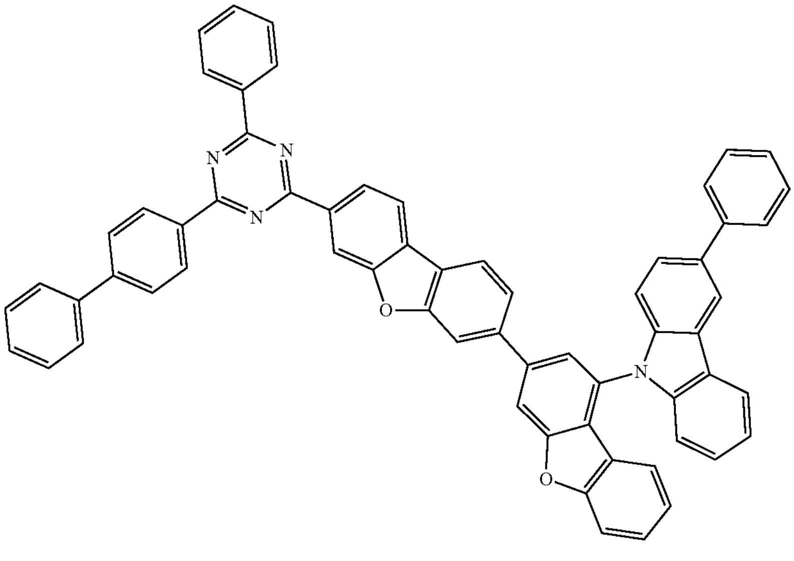 [SMILES: c1ccc(-c2ccc(-c3nc(-c4ccccc4)nc(-c4ccc5c(c4)oc4cc(-c6cc(-n7c8ccccc8c8cc(-c9ccccc9)ccc87)c7c(c6)oc6ccccc67)ccc45)n3)cc2)cc1]

TABLE 1-continued
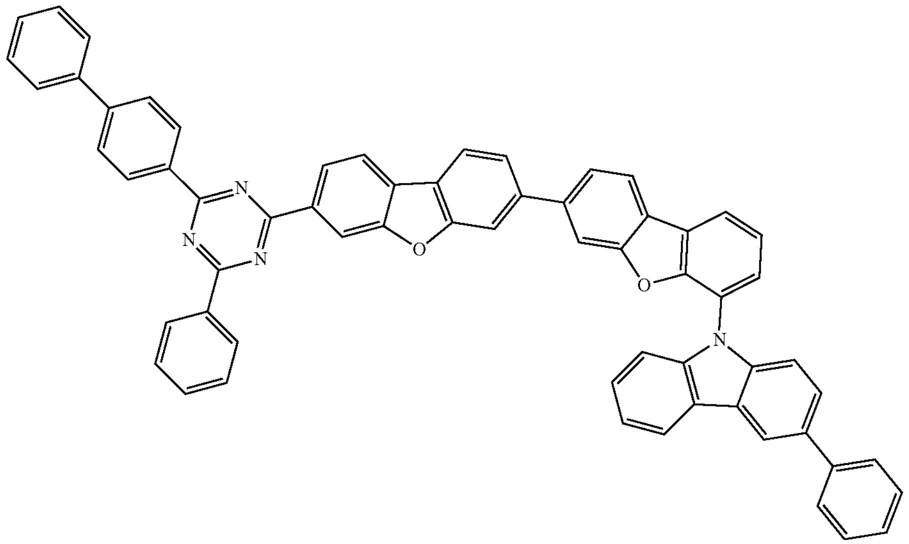 [SMILES: c1ccc(-c2ccc(-c3nc(-c4ccccc4)nc(-c4ccc5c(c4)oc4cc(-c6ccc7c(c6)oc6c(-n8c9ccccc9c9cc(-c%10ccccc%10)ccc98)cccc67)ccc45)n3)cc2)cc1]
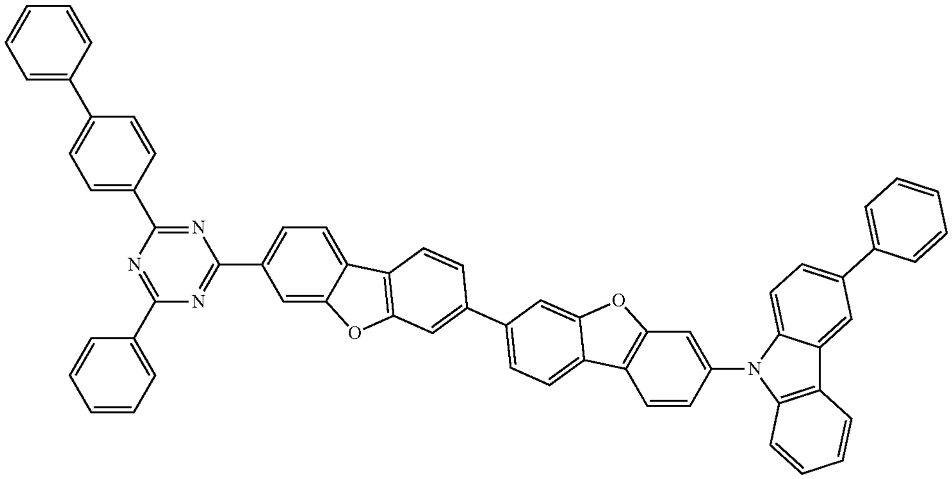 [SMILES: c1ccc(-c2ccc(-c3nc(-c4ccccc4)nc(-c4ccc5c(c4)oc4cc(-c6ccc7c(c6)oc6cc(-n8c9ccccc9c9cc(-c%10ccccc%10)ccc98)ccc67)ccc45)n3)cc2)cc1]
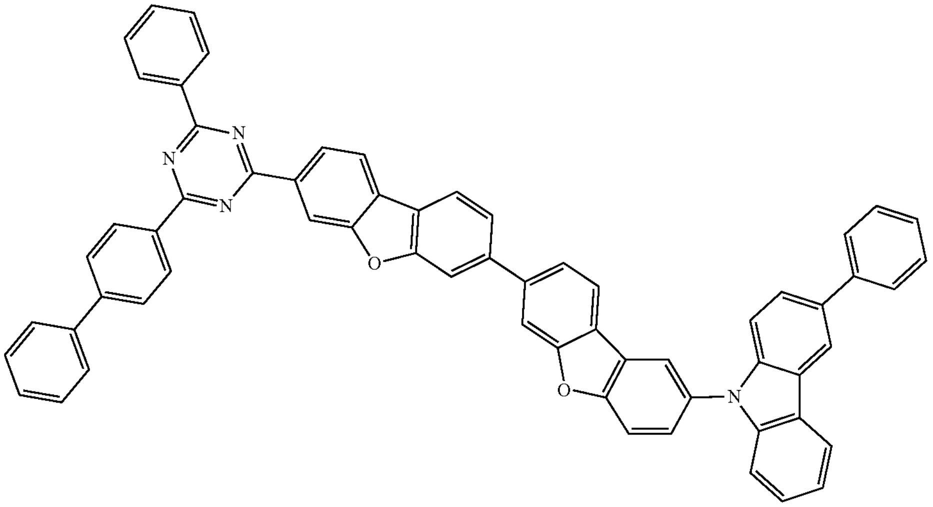 [SMILES: c1ccc(-c2ccc(-c3nc(-c4ccccc4)nc(-c4ccc5c(c4)oc4cc(-c6ccc7c(c6)oc6ccc(-n8c9ccccc9c9cc(-c%10ccccc%10)ccc98)cc67)ccc45)n3)cc2)cc1]

TABLE 1-continued
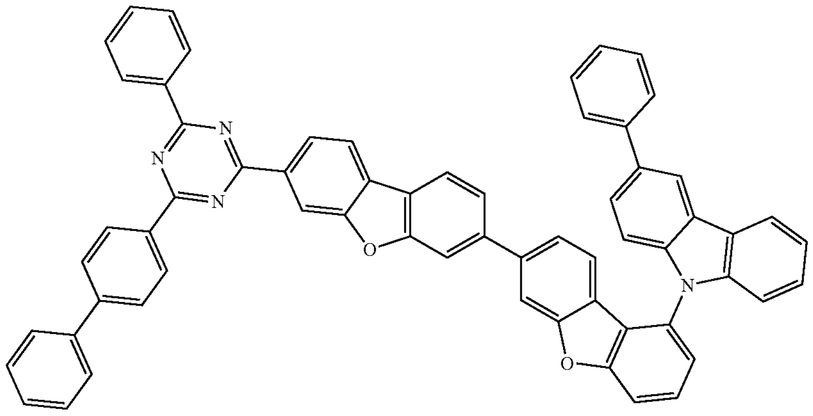 [SMILES: c1ccc(-c2ccc(-c3nc(-c4ccccc4)nc(-c4ccc5c(c4)oc4cc(-c6ccc7c(c6)oc6cccc(-n8c9ccccc9c9cc(-c%10ccccc%10)ccc98)c67)ccc45)n3)cc2)cc1]
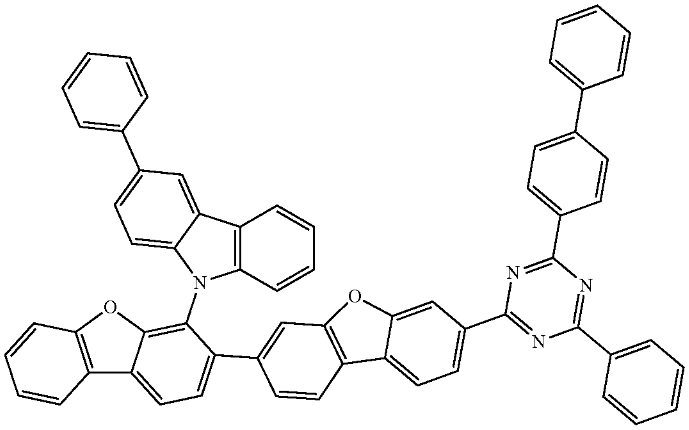 [SMILES: c1ccc(-c2ccc(-c3nc(-c4ccccc4)nc(-c4ccc5c(c4)oc4cc(-c6ccc7c(oc8ccccc87)c6-n6c7ccccc7c7cc(-c8ccccc8)ccc76)ccc45)n3)cc2)cc1]
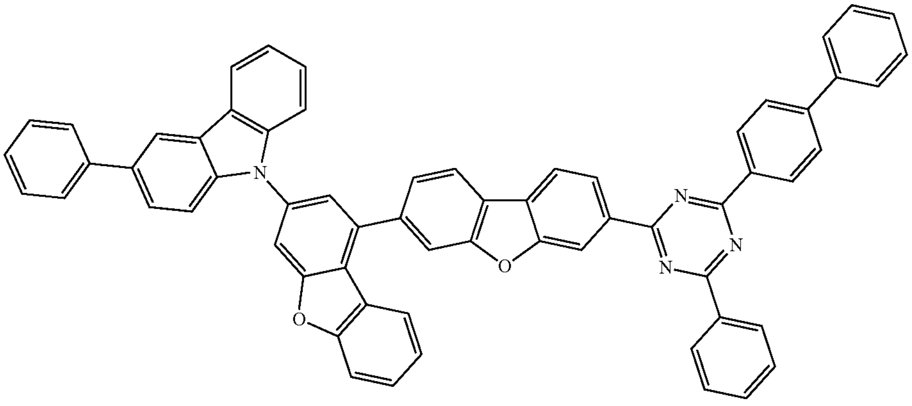 [SMILES: c1ccc(-c2ccc(-c3nc(-c4ccccc4)nc(-c4ccc5c(c4)oc4cc(-c6cc(-n7c8ccccc8c8cc(-c9ccccc9)ccc87)cc7oc8ccccc8c67)ccc45)n3)cc2)cc1]

TABLE 1-continued
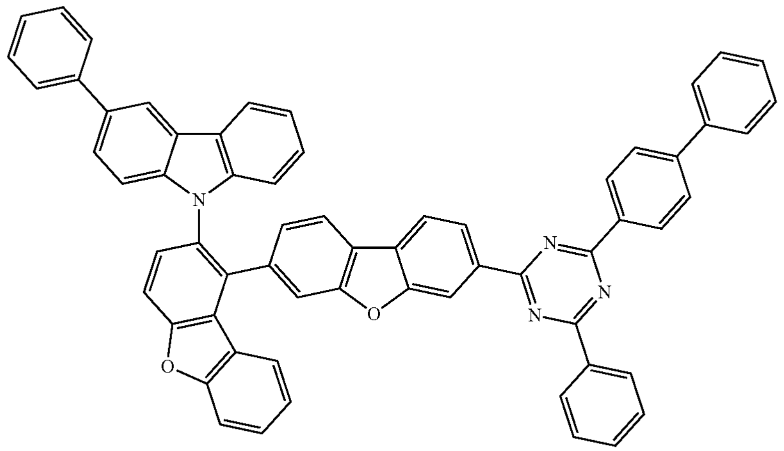 [SMILES: c1ccc(-c2ccc(-c3nc(-c4ccccc4)nc(-c4ccc5c(c4)oc4cc(-c6c(-n7c8ccccc8c8cc(-c9ccccc9)ccc87)ccc7oc8ccccc8c67)ccc45)n3)cc2)cc1]
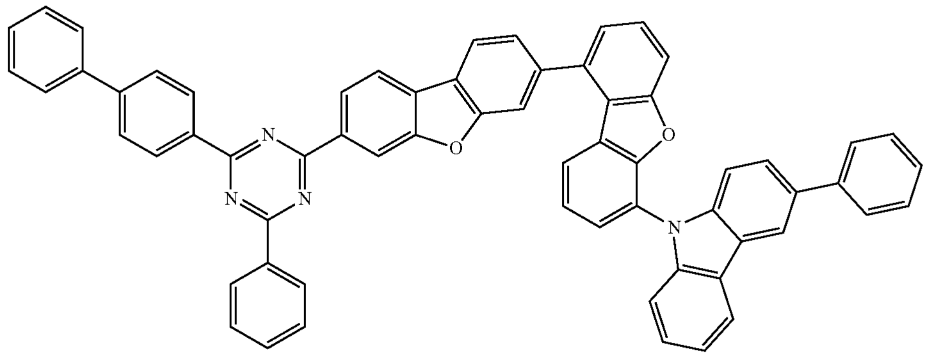 [SMILES: c1ccc(-c2ccc(-c3nc(-c4ccccc4)nc(-c4ccc5c(c4)oc4cc(-c6cccc7oc8c(-n9c%10ccccc%10c%10cc(-c%11ccccc%11)ccc%109)cccc8c67)ccc45)n3)cc2)cc1]
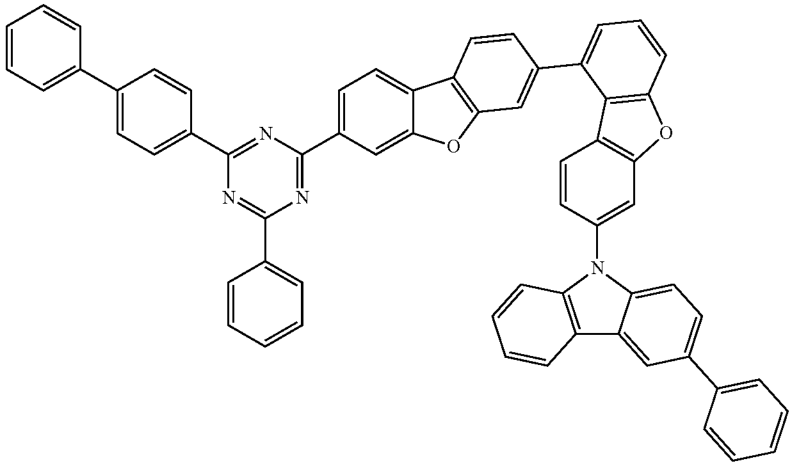 [SMILES: c1ccc(-c2ccc(-c3nc(-c4ccccc4)nc(-c4ccc5c(c4)oc4cc(-c6cccc7oc8cc(-n9c%10ccccc%10c%10cc(-c%11ccccc%11)ccc%109)ccc8c67)ccc45)n3)cc2)cc1]

TABLE 1-continued
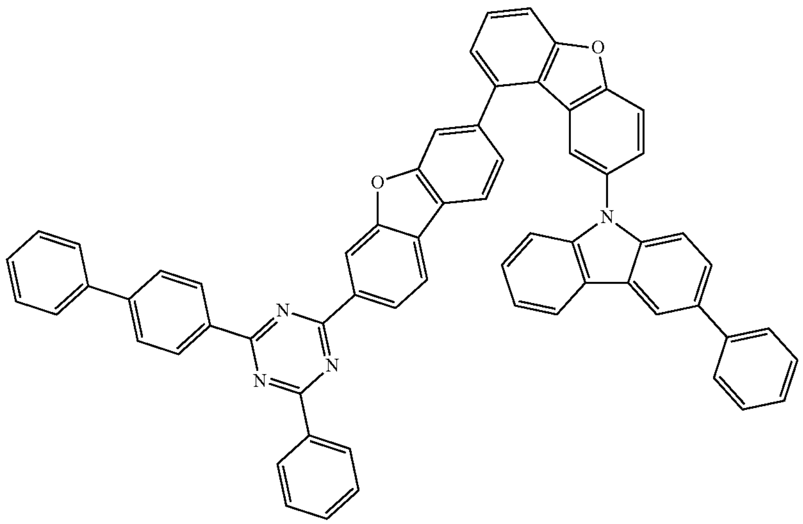 [SMILES: c1ccc(-c2ccc(-c3nc(-c4ccccc4)nc(-c4ccc5c(c4)oc4cc(-c6cccc7oc8ccc(-n9c%10ccccc%10c%10cc(-c%11ccccc%11)ccc%109)cc8c67)ccc45)n3)cc2)cc1]
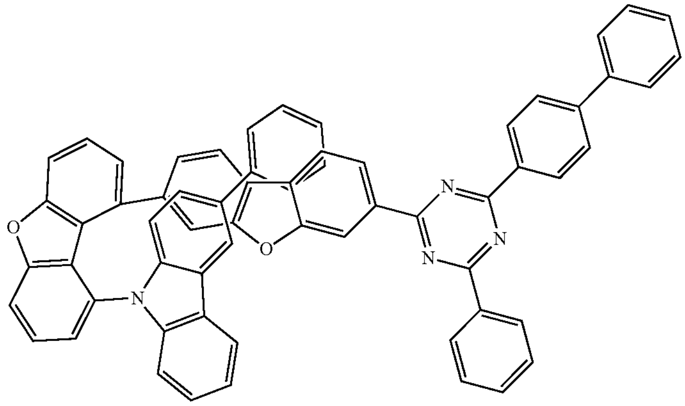 [SMILES: c1ccc(-c2ccc(-c3nc(-c4ccccc4)nc(-c4ccc5c(c4)oc4cc(-c6cccc7oc8cccc(-n9c%10ccccc%10c%10cc(-c%11ccccc%11)ccc%109)c8c67)ccc45)n3)cc2)cc1]
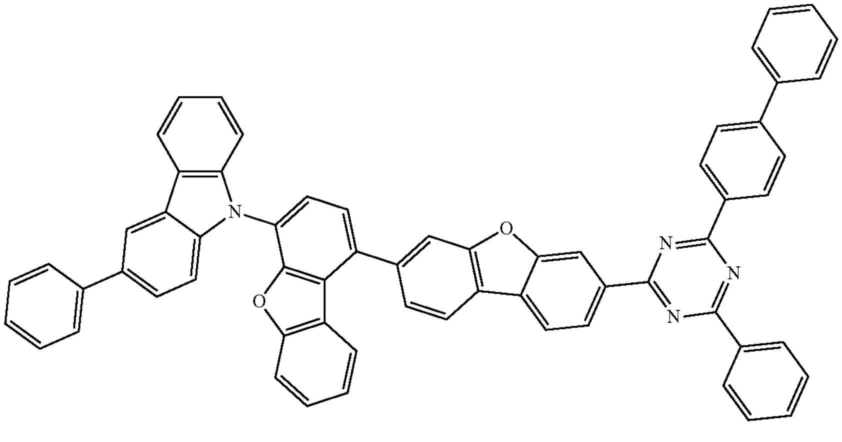 [SMILES: c1ccc(-c2ccc(-c3nc(-c4ccccc4)nc(-c4ccc5c(c4)oc4cc(-c6ccc(-n7c8ccccc8c8cc(-c9ccccc9)ccc87)c7oc8ccccc8c67)ccc45)n3)cc2)cc1]

TABLE 1-continued
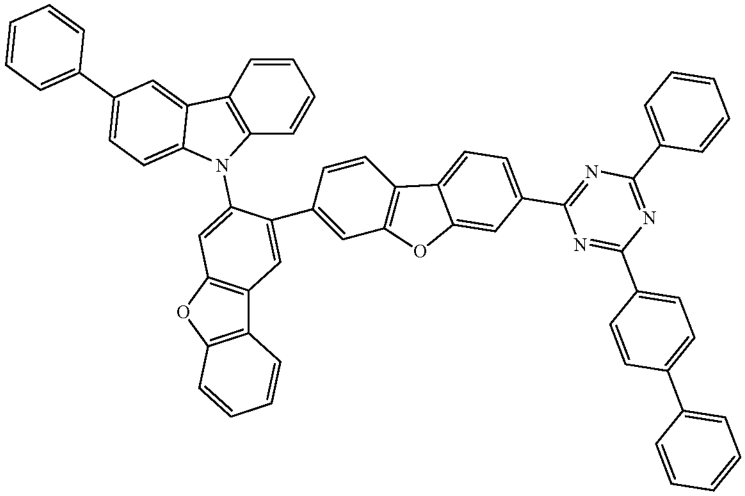 [SMILES: c1ccc(-c2ccc(-c3nc(-c4ccccc4)nc(-c4ccc5c(c4)oc4cc(-c6cc7c(cc6-n6c8ccccc8c8cc(-c9ccccc9)ccc86)oc6ccccc67)ccc45)n3)cc2)cc1]
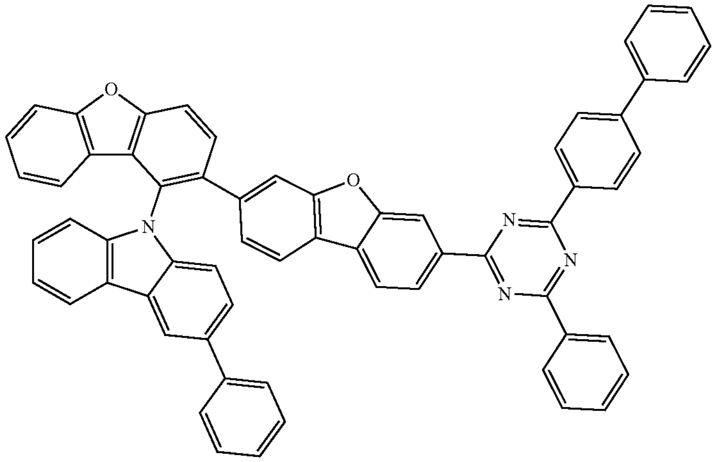 [SMILES: c1ccc(-c2ccc(-c3nc(-c4ccccc4)nc(-c4ccc5c(c4)oc4cc(-c6ccc7oc8ccccc8c7c6-n6c7ccccc7c7cc(-c8ccccc8)ccc76)ccc45)n3)cc2)cc1]
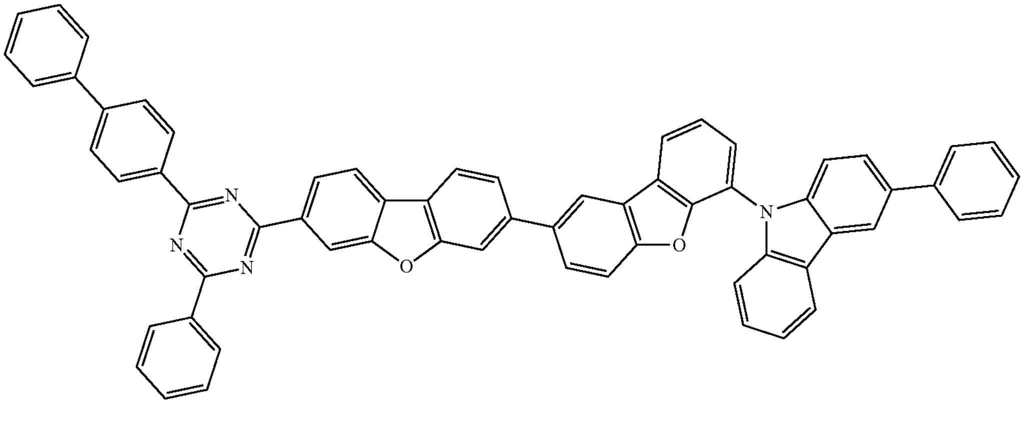 [SMILES: c1ccc(-c2ccc(-c3nc(-c4ccccc4)nc(-c4ccc5c(c4)oc4cc(-c6ccc7oc8c(-n9c%10ccccc%10c%10cc(-c%11ccccc%11)ccc%109)cccc8c7c6)ccc45)n3)cc2)cc1]

TABLE 1-continued
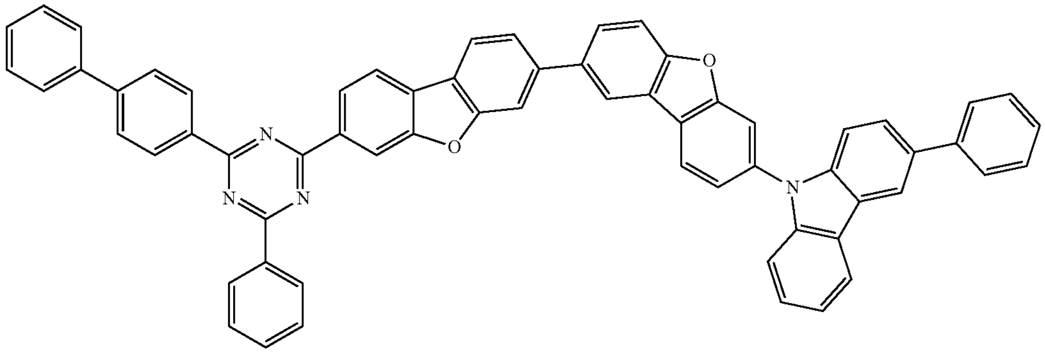 [SMILES: c1ccc(-c2ccc(-c3nc(-c4ccccc4)nc(-c4ccc5c(c4)oc4cc(-c6ccc7oc8cc(-n9c%10ccccc%10c%10cc(-c%11ccccc%11)ccc%109)ccc8c7c6)ccc45)n3)cc2)cc1]
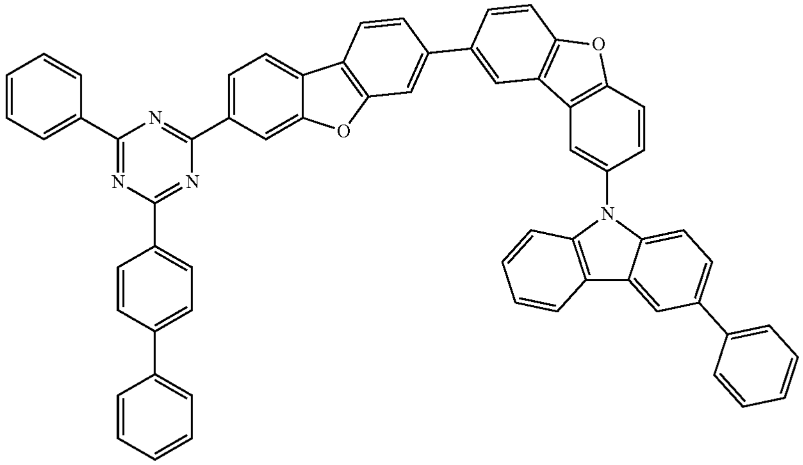 [SMILES: c1ccc(-c2ccc(-c3nc(-c4ccccc4)nc(-c4ccc5c(c4)oc4cc(-c6ccc7oc8ccc(-n9c%10ccccc%10c%10cc(-c%11ccccc%11)ccc%109)cc8c7c6)ccc45)n3)cc2)cc1]
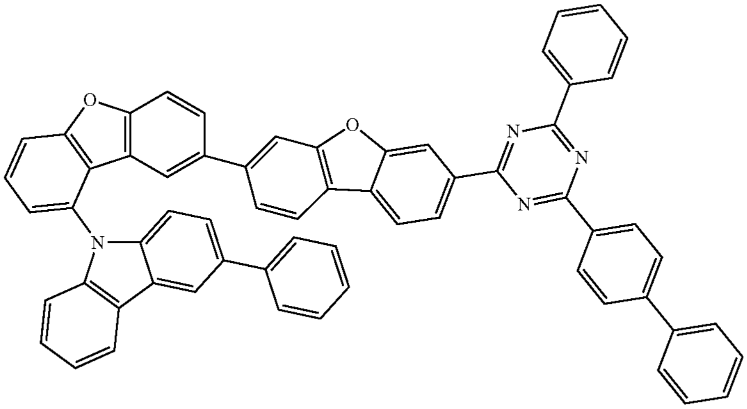 [SMILES: c1ccc(-c2ccc(-c3nc(-c4ccccc4)nc(-c4ccc5c(c4)oc4cc(-c6ccc7oc8cccc(-n9c%10ccccc%10c%10cc(-c%11ccccc%11)ccc%109)c8c7c6)ccc45)n3)cc2)cc1]

TABLE 1-continued
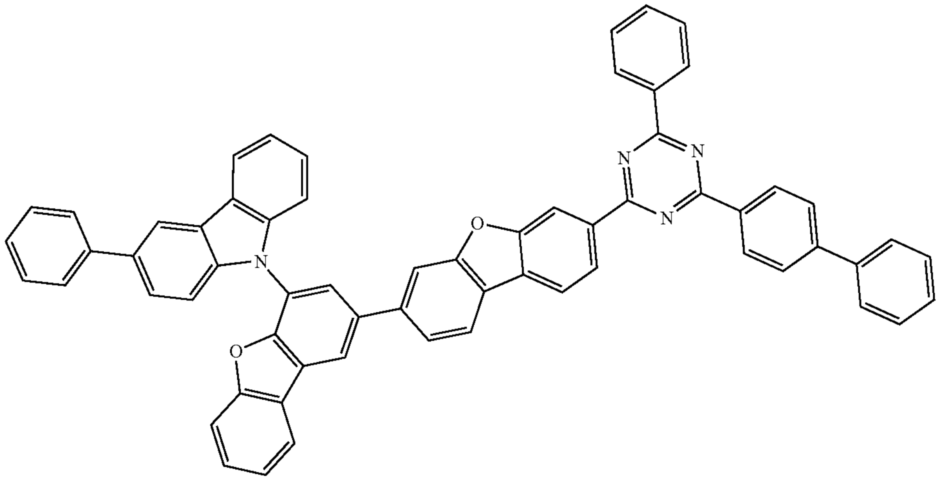 [SMILES: c1ccc(-c2ccc(-c3nc(-c4ccccc4)nc(-c4ccc5c(c4)oc4cc(-c6cc(-n7c8ccccc8c8cc(-c9ccccc9)ccc87)c7oc8ccccc8c7c6)ccc45)n3)cc2)cc1]
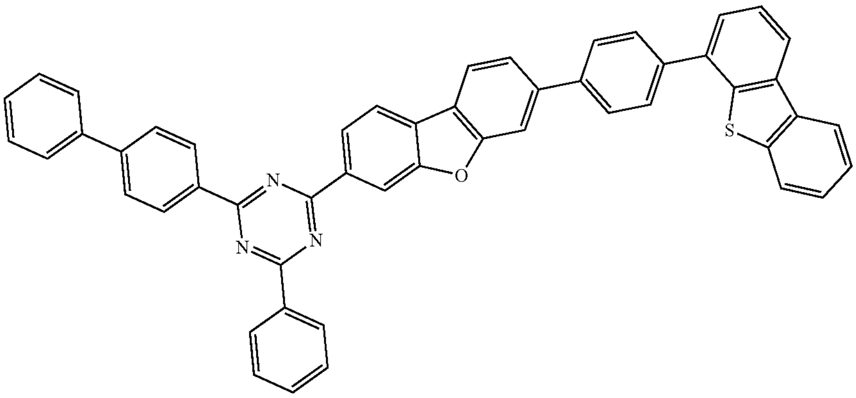 [SMILES: c1ccc(-c2ccc(-c3nc(-c4ccccc4)nc(-c4ccc5c(c4)oc4cc(-c6ccc(-c7cccc8c7sc7ccccc78)cc6)ccc45)n3)cc2)cc1]
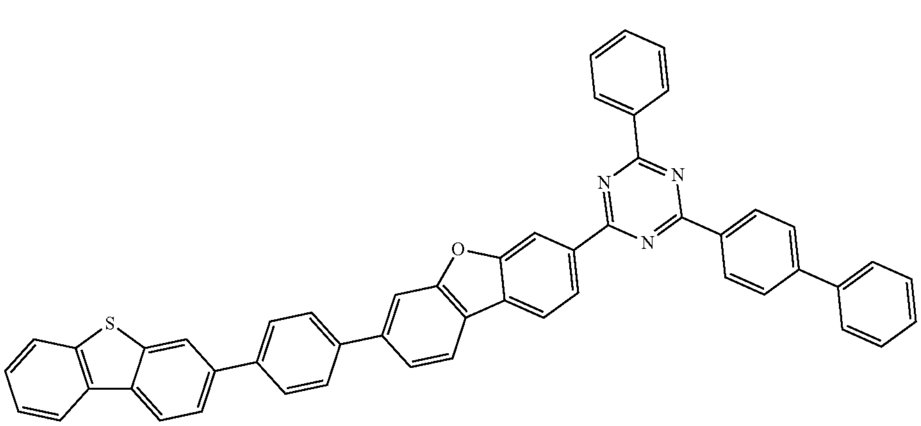 [SMILES: c1ccc(-c2ccc(-c3nc(-c4ccccc4)nc(-c4ccc5c(c4)oc4cc(-c6ccc(-c7ccc8c(c7)sc7ccccc78)cc6)ccc45)n3)cc2)cc1]

TABLE 1-continued
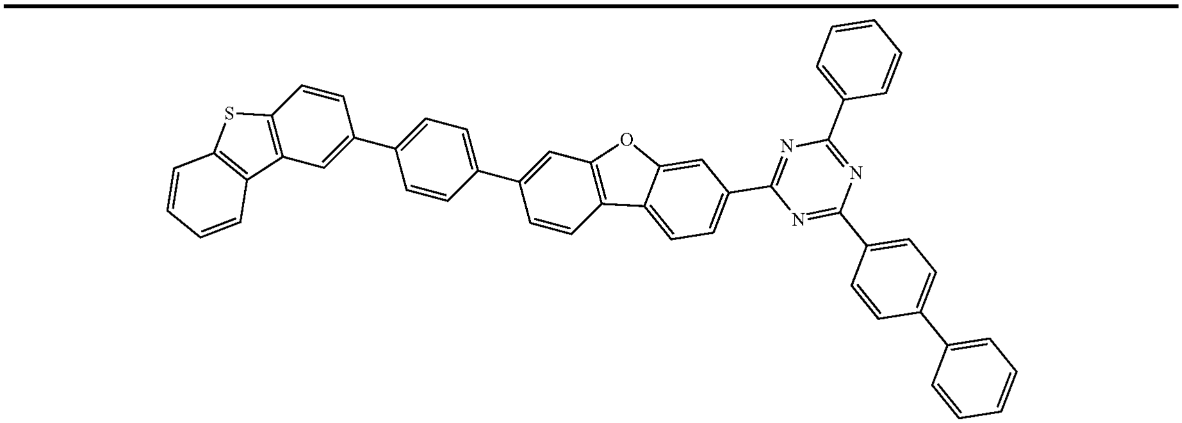
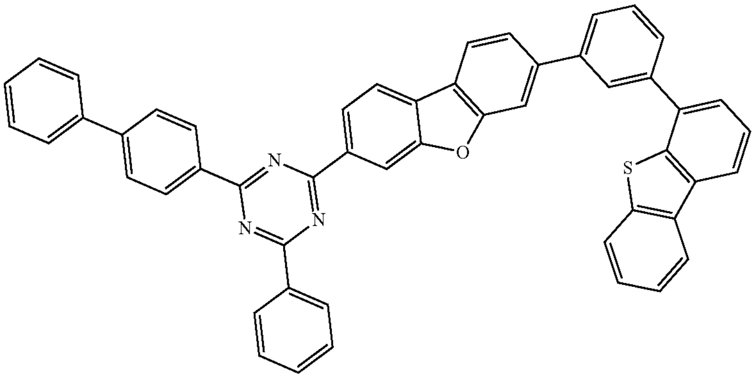 [SMILES: c1ccc(-c2ccc(-c3nc(-c4ccccc4)nc(-c4ccc5c(c4)oc4cc(-c6cccc(-c7cccc8c7sc7ccccc78)c6)ccc45)n3)cc2)cc1]
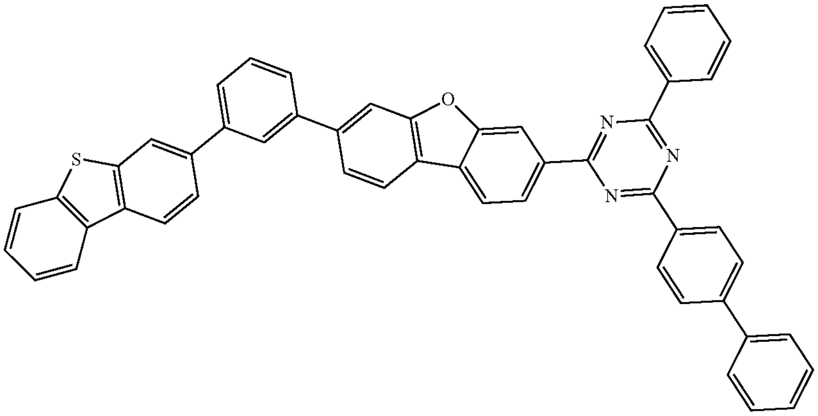 [SMILES: c1ccc(-c2ccc(-c3nc(-c4ccccc4)nc(-c4ccc5c(c4)oc4cc(-c6cccc(-c7ccc8c(c7)sc7ccccc78)c6)ccc45)n3)cc2)cc1]
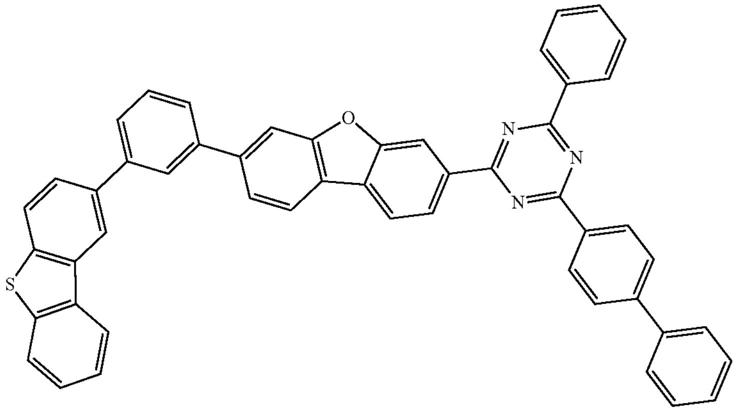 [SMILES: c1ccc(-c2ccc(-c3nc(-c4ccccc4)nc(-c4ccc5c(c4)oc4cc(-c6cccc(-c7ccc8sc9ccccc9c8c7)c6)ccc45)n3)cc2)cc1]

TABLE 1-continued
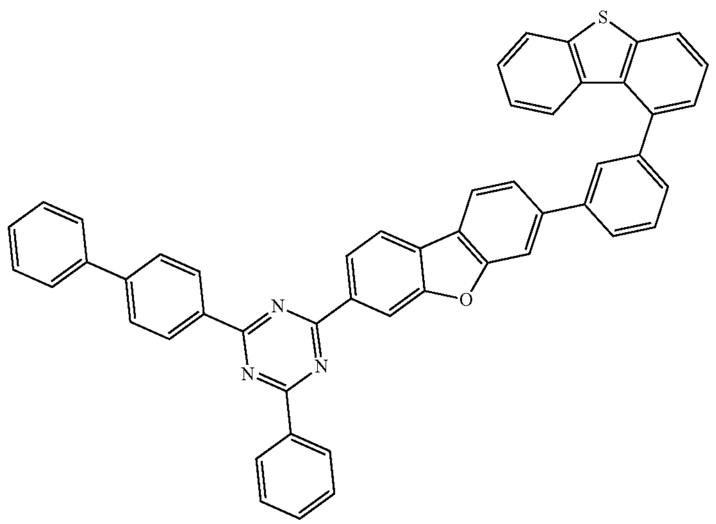 [SMILES: c1ccc(-c2ccc(-c3nc(-c4ccccc4)nc(-c4ccc5c(c4)oc4cc(-c6cccc(-c7cccc8sc9ccccc9c78)c6)ccc45)n3)cc2)cc1]
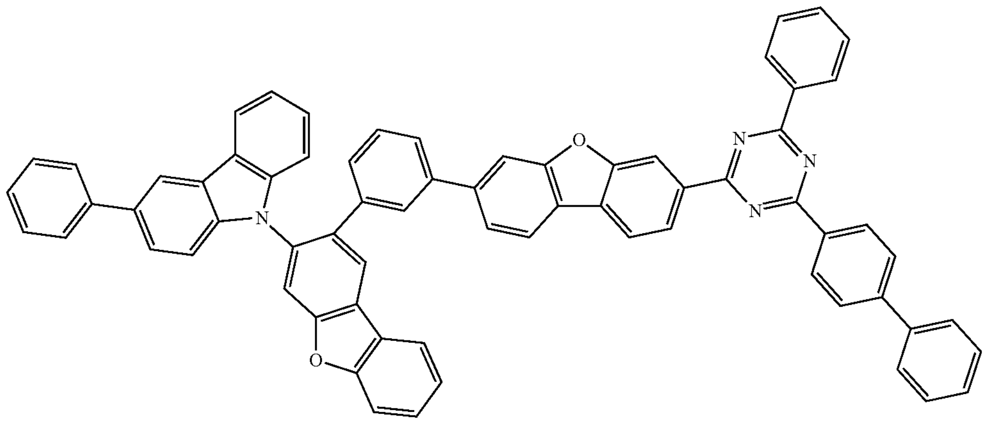 [SMILES: c1ccc(-c2ccc(-c3nc(-c4ccccc4)nc(-c4ccc5c(c4)oc4cc(-c6cccc(-c7cc8c(cc7-n7c9ccccc9c9cc(-c%10ccccc%10)ccc97)oc7ccccc78)c6)ccc45)n3)cc2)cc1]
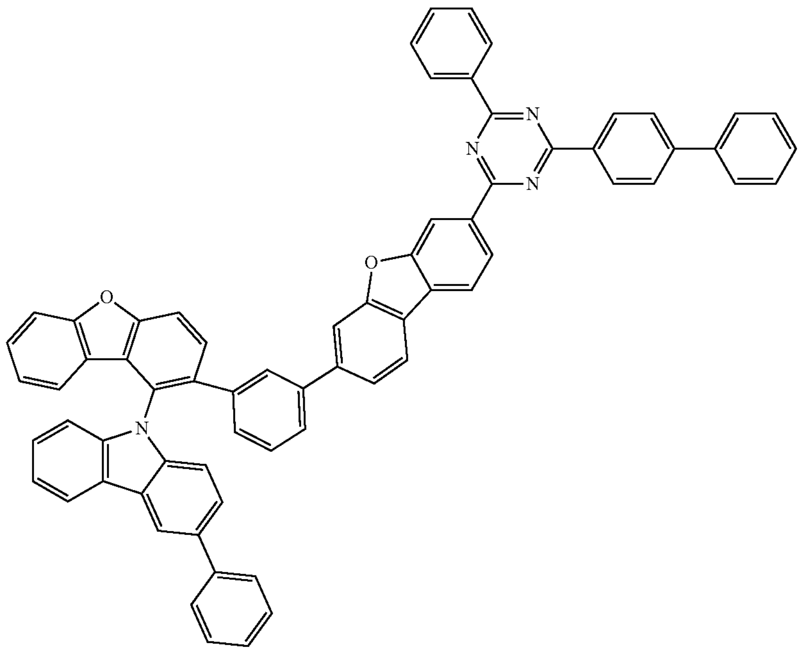 [SMILES: c1ccc(-c2ccc(-c3nc(-c4ccccc4)nc(-c4ccc5c(c4)oc4cc(-c6cccc(-c7ccc8oc9ccccc9c8c7-n7c8ccccc8c8cc(-c9ccccc9)ccc87)c6)ccc45)n3)cc2)cc1]

TABLE 1-continued
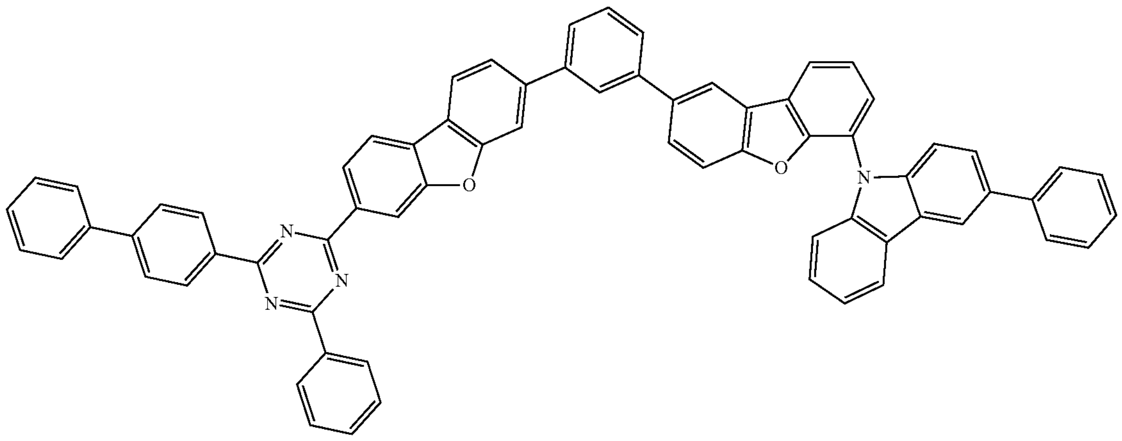 [SMILES: c1ccc(-c2ccc(-c3nc(-c4ccccc4)nc(-c4ccc5c(c4)oc4cc(-c6cccc(-c7ccc8oc9c(-n%10c%11ccccc%11c%11cc(-c%12ccccc%12)ccc%11%10)cccc9c8c7)c6)ccc45)n3)cc2)cc1]
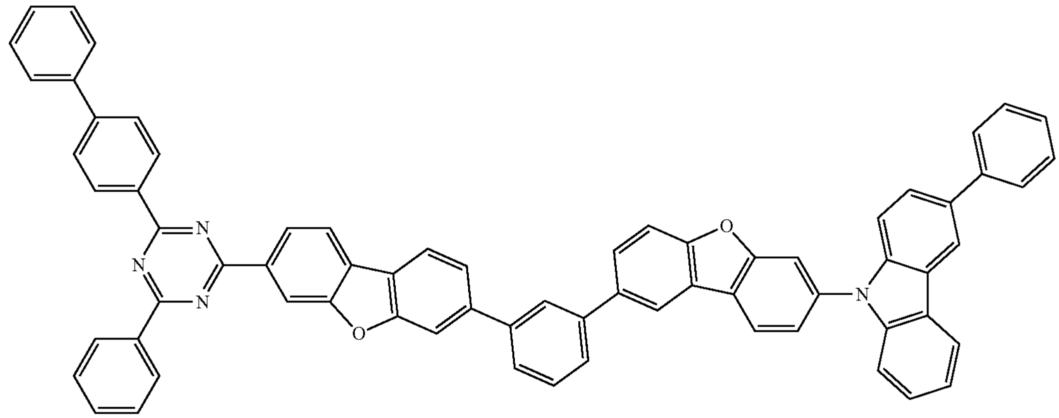 [SMILES: c1ccc(-c2ccc(-c3nc(-c4ccccc4)nc(-c4ccc5c(c4)oc4cc(-c6cccc(-c7ccc8oc9cc(-n%10c%11ccccc%11c%11cc(-c%12ccccc%12)ccc%11%10)ccc9c8c7)c6)ccc45)n3)cc2)cc1]
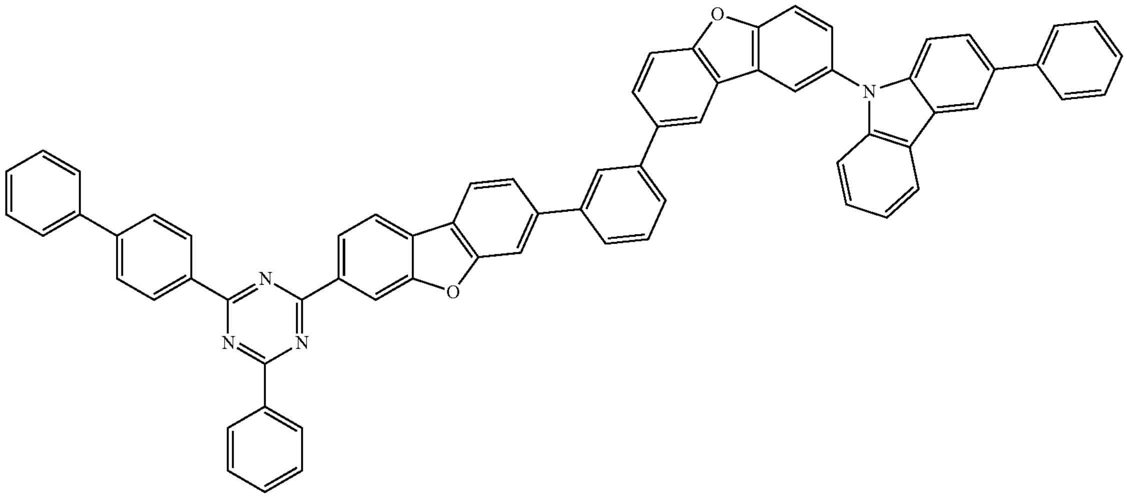 [SMILES: c1ccc(-c2ccc(-c3nc(-c4ccccc4)nc(-c4ccc5c(c4)oc4cc(-c6cccc(-c7ccc8oc9ccc(-n%10c%11ccccc%11c%11cc(-c%12ccccc%12)ccc%11%10)cc9c8c7)c6)ccc45)n3)cc2)cc1]

TABLE 1-continued
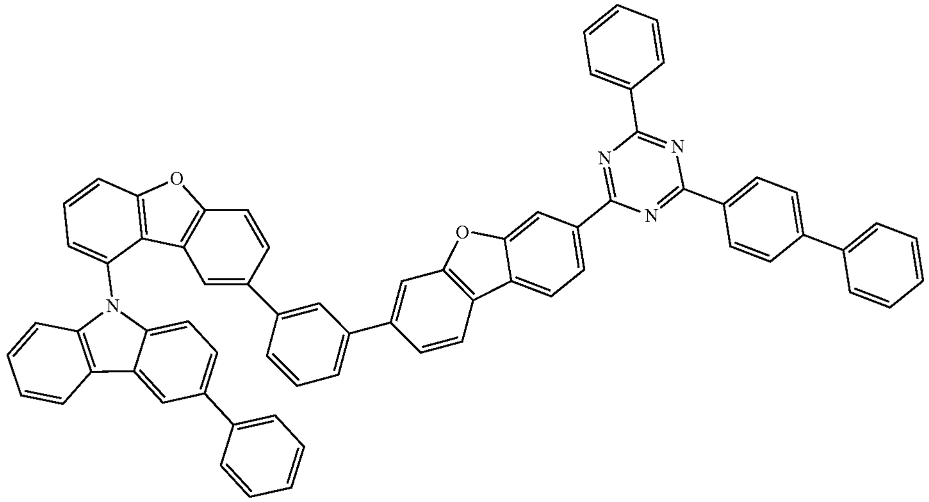 [SMILES: c1ccc(-c2ccc(-c3nc(-c4ccccc4)nc(-c4ccc5c(c4)oc4cc(-c6cccc(-c7ccc8oc9cccc(-n%10c%11ccccc%11c%11cc(-c%12ccccc%12)ccc%11%10)c9c8c7)c6)ccc45)n3)cc2)cc1]
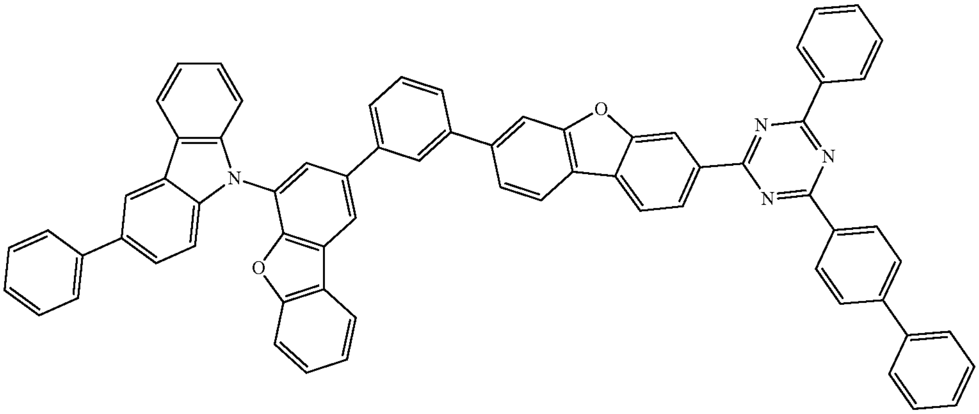 [SMILES: c1ccc(-c2ccc(-c3nc(-c4ccccc4)nc(-c4ccc5c(c4)oc4cc(-c6cccc(-c7cc(-n8c9ccccc9c9cc(-c%10ccccc%10)ccc98)c8oc9ccccc9c8c7)c6)ccc45)n3)cc2)cc1]
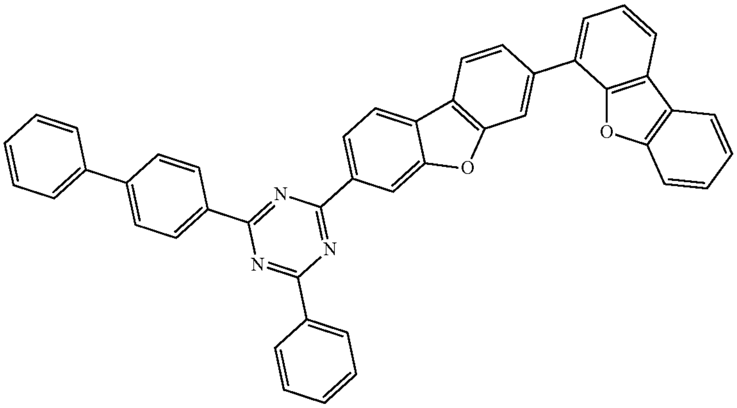 [SMILES: c1ccc(-c2ccc(-c3nc(-c4ccccc4)nc(-c4ccc5c(c4)oc4cc(-c6cccc7c6oc6ccccc67)ccc45)n3)cc2)cc1]

TABLE 1-continued
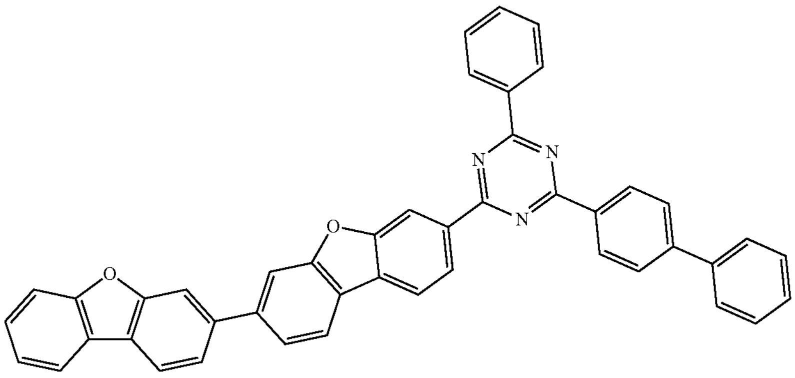 [SMILES: c1ccc(-c2ccc(-c3nc(-c4ccccc4)nc(-c4ccc5c(c4)oc4cc(-c6ccc7c(c6)oc6ccccc67)ccc45)n3)cc2)cc1]
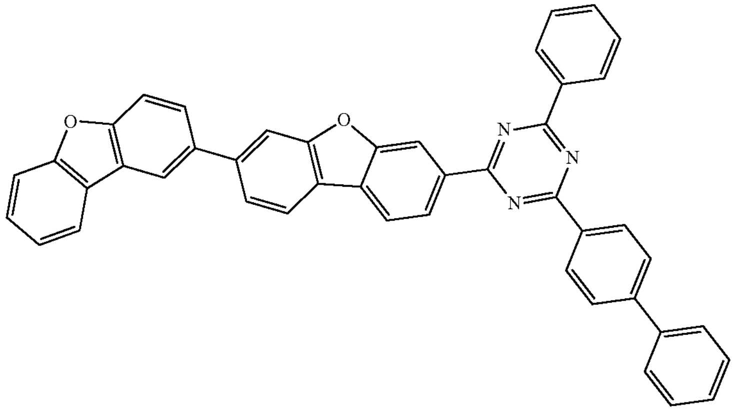 [SMILES: c1ccc(-c2ccc(-c3nc(-c4ccccc4)nc(-c4ccc5c(c4)oc4cc(-c6ccc7oc8ccccc8c7c6)ccc45)n3)cc2)cc1]
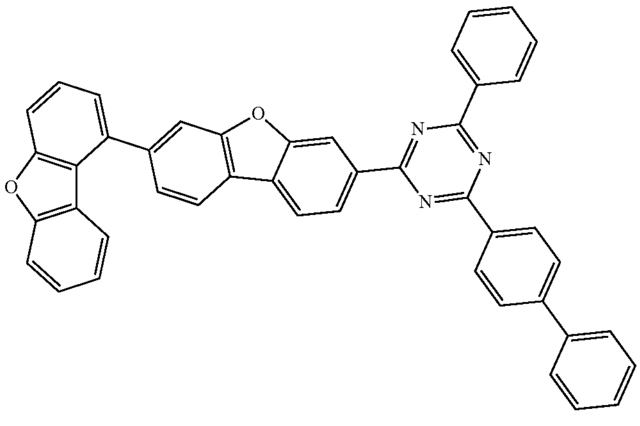 [SMILES: c1ccc(-c2ccc(-c3nc(-c4ccccc4)nc(-c4ccc5c(c4)oc4cc(-c6cccc7oc8ccccc8c67)ccc45)n3)cc2)cc1]

TABLE 1-continued
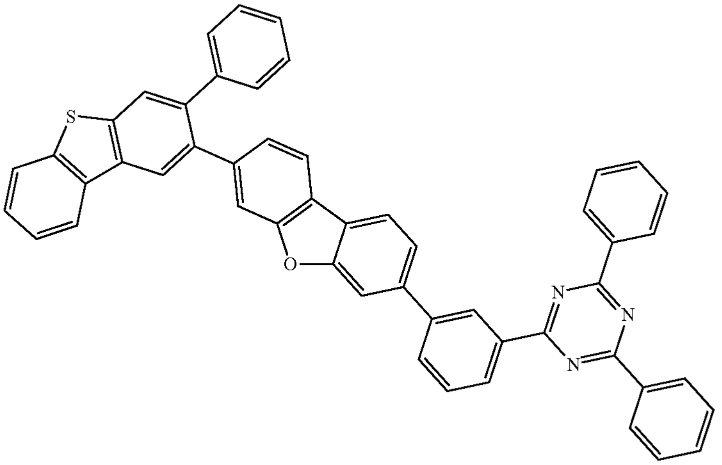 [SMILES: c1ccc(-c2nc(-c3ccccc3)nc(-c3cccc(-c4ccc5c(c4)oc4cc(-c6cc7c(cc6-c6ccccc6)sc6ccccc67)ccc45)c3)n2)cc1]
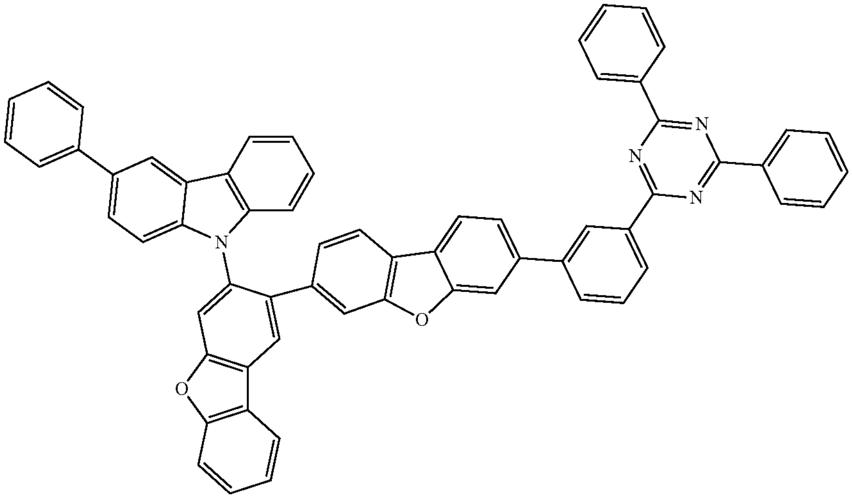 [SMILES: c1ccc(-c2ccc3c(c2)c2ccccc2n3-c2cc3oc4ccccc4c3cc2-c2ccc3c(c2)oc2cc(-c4cccc(-c5nc(-c6ccccc6)nc(-c6ccccc6)n5)c4)ccc23)cc1]
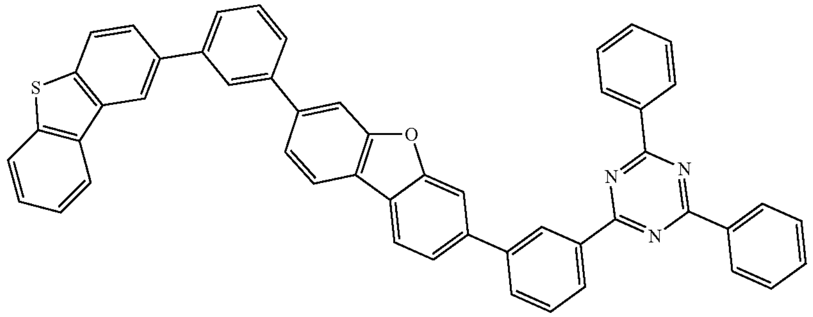 [SMILES: c1ccc(-c2nc(-c3ccccc3)nc(-c3cccc(-c4ccc5c(c4)oc4cc(-c6cccc(-c7ccc8sc9ccccc9c8c7)c6)ccc45)c3)n2)cc1]

TABLE 1-continued
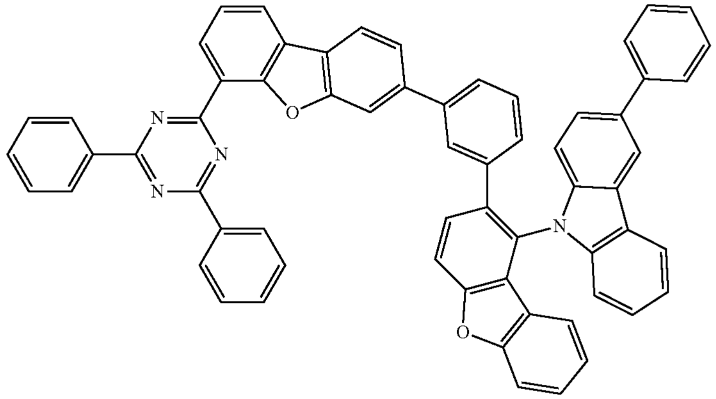 [SMILES: c1ccc(-c2ccc3c(c2)c2ccccc2n3-c2c(-c3cccc(-c4ccc5c(c4)oc4c(-c6nc(-c7ccccc7)nc(-c7ccccc7)n6)cccc45)c3)ccc3oc4ccccc4c23)cc1]
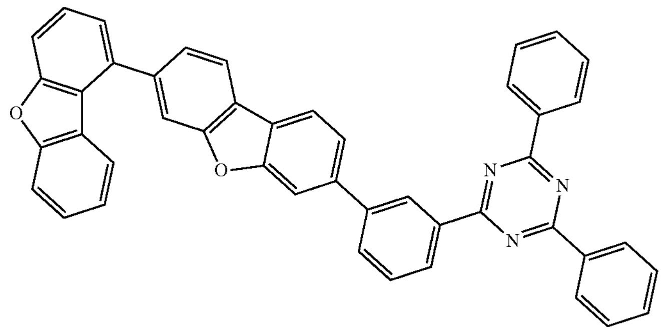 [SMILES: c1ccc(-c2nc(-c3ccccc3)nc(-c3cccc(-c4ccc5c(c4)oc4cc(-c6cccc7oc8ccccc8c67)ccc45)c3)n2)cc1]
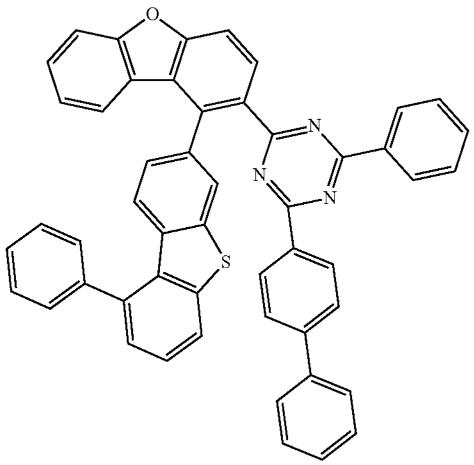 [SMILES: c1ccc(-c2ccc(-c3nc(-c4ccccc4)nc(-c4ccc5oc6ccccc6c5c4-c4ccc5c(c4)sc4cccc(-c6ccccc6)c45)n3)cc2)cc1]

TABLE 1-continued
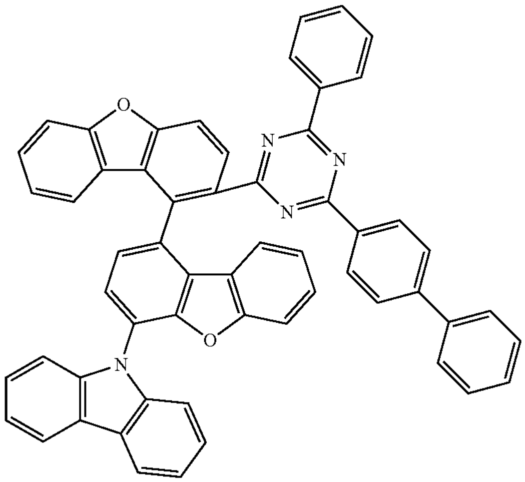 [SMILES: c1ccc(-c2ccc(-c3nc(-c4ccccc4)nc(-c4ccc5oc6ccccc6c5c4-c4ccc(-n5c6ccccc6c6ccccc65)c5oc6ccccc6c45)n3)cc2)cc1]
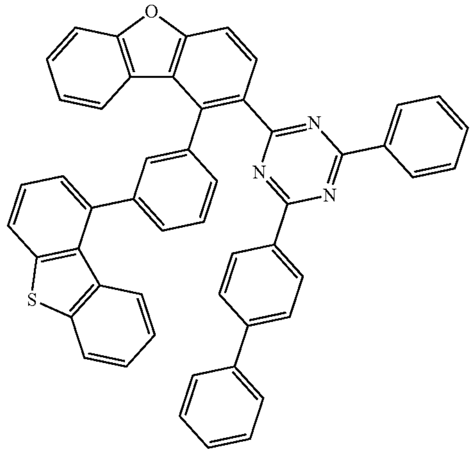 [SMILES: c1ccc(-c2ccc(-c3nc(-c4ccccc4)nc(-c4ccc5oc6ccccc6c5c4-c4cccc(-c5cccc6sc7ccccc7c56)c4)n3)cc2)cc1]
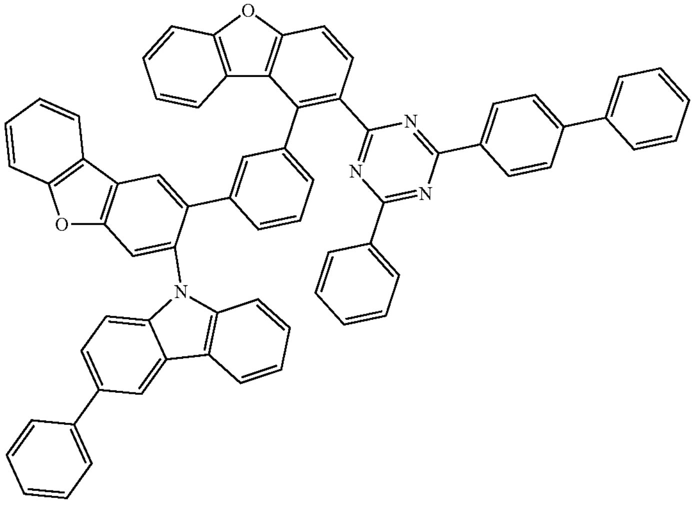 [SMILES: c1ccc(-c2ccc(-c3nc(-c4ccccc4)nc(-c4ccc5oc6ccccc6c5c4-c4cccc(-c5cc6c(cc5-n5c7ccccc7c7cc(-c8ccccc8)ccc75)oc5ccccc56)c4)n3)cc2)cc1]

TABLE 1-continued
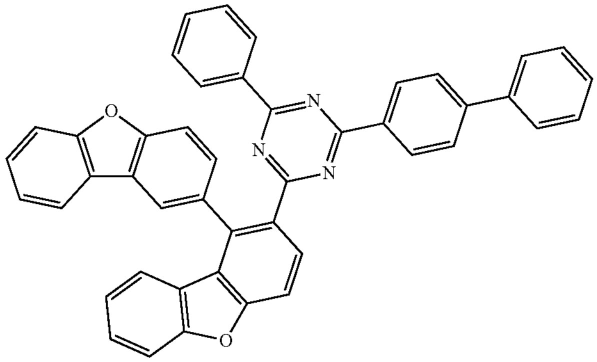 [SMILES: c1ccc(-c2ccc(-c3nc(-c4ccccc4)nc(-c4ccc5oc6ccccc6c5c4-c4ccc5oc6ccccc6c5c4)n3)cc2)cc1]
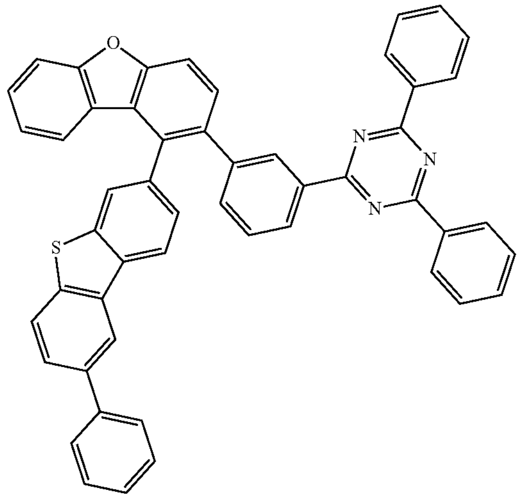 [SMILES: c1ccc(-c2ccc3sc4cc(-c5c(-c6cccc(-c7nc(-c8ccccc8)nc(-c8ccccc8)n7)c6)ccc6oc7ccccc7c56)ccc4c3c2)cc1]
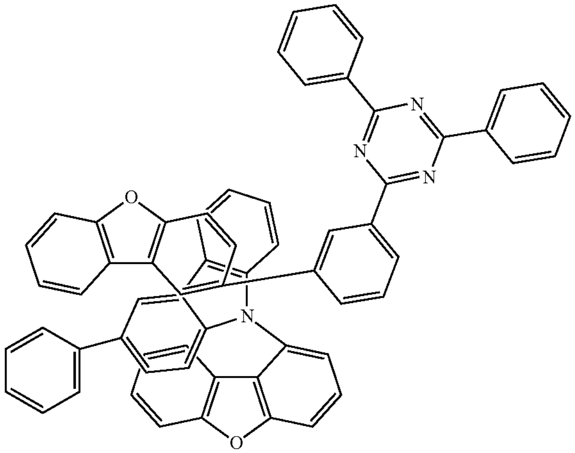

TABLE 1-continued
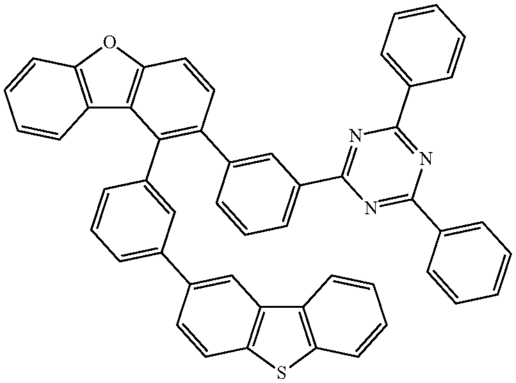 [SMILES: c1ccc(-c2nc(-c3ccccc3)nc(-c3cccc(-c4ccc5oc6ccccc6c5c4-c4cccc(-c5ccc6sc7ccccc7c6c5)c4)c3)n2)cc1]
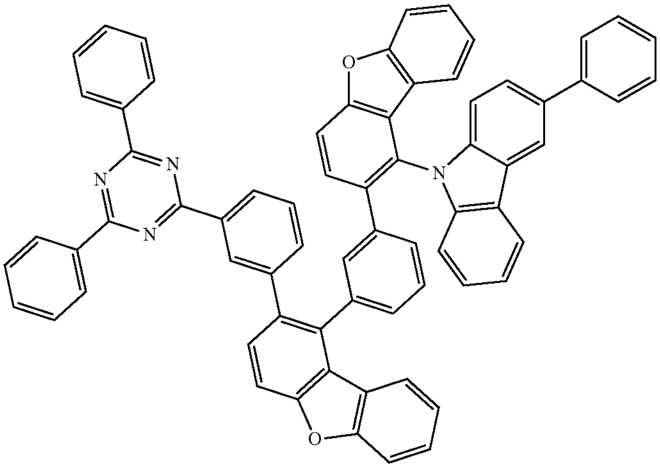 [SMILES: c1ccc(-c2ccc3c(c2)c2ccccc2n3-c2c(-c3cccc(-c4c(-c5cccc(-c6nc(-c7ccccc7)nc(-c7ccccc7)n6)c5)ccc5oc6ccccc6c45)c3)ccc3oc4ccccc4c23)cc1]
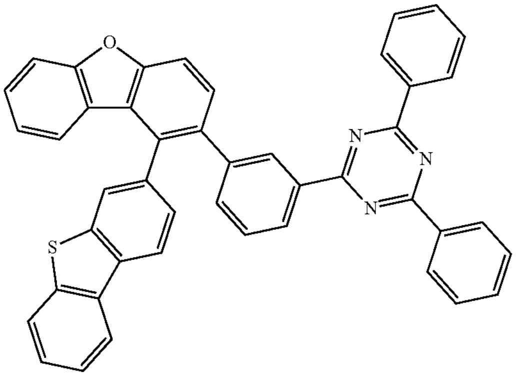 [SMILES: c1ccc(-c2nc(-c3ccccc3)nc(-c3cccc(-c4ccc5oc6ccccc6c5c4-c4ccc5c(c4)sc4ccccc45)c3)n2)cc1]
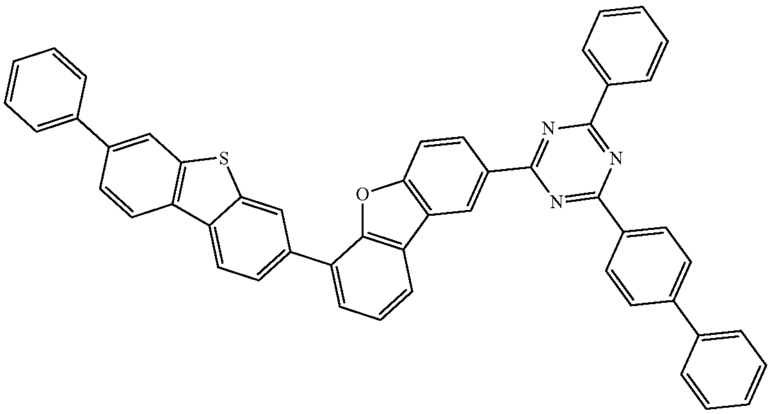 [SMILES: c1ccc(-c2ccc(-c3nc(-c4ccccc4)nc(-c4ccc5oc6c(-c7ccc8c(c7)sc7cc(-c9ccccc9)ccc78)cccc6c5c4)n3)cc2)cc1]

TABLE 1-continued
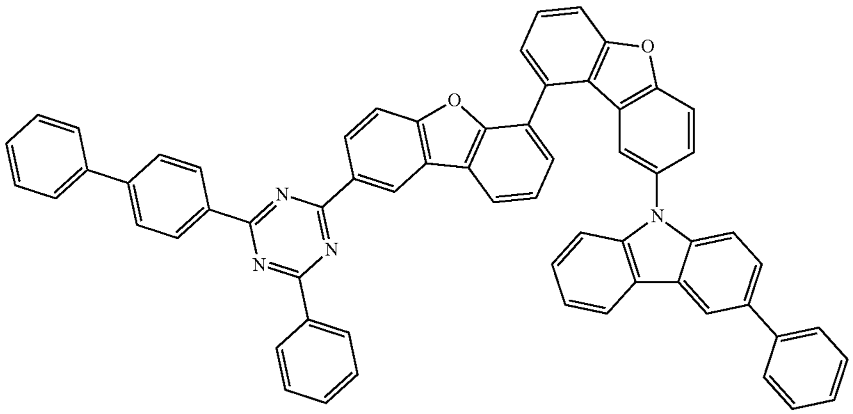 [SMILES: c1ccc(-c2ccc(-c3nc(-c4ccccc4)nc(-c4ccc5oc6c(-c7cccc8oc9ccc(-n%10c%11ccccc%11c%11cc(-c%12ccccc%12)ccc%11%10)cc9c78)cccc6c5c4)n3)cc2)cc1]
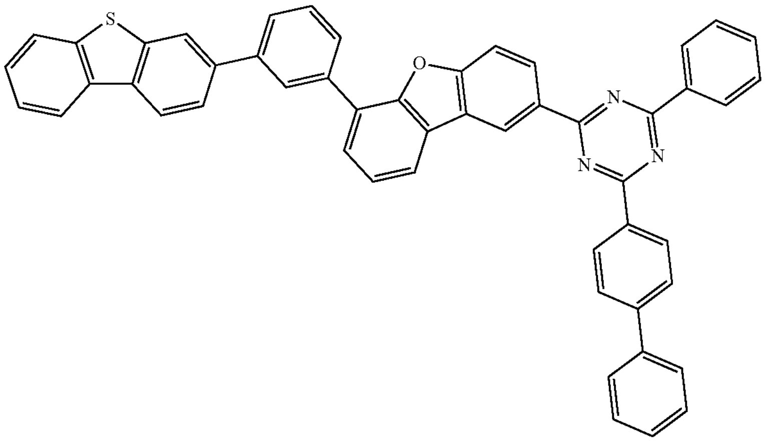 [SMILES: c1ccc(-c2ccc(-c3nc(-c4ccccc4)nc(-c4ccc5oc6c(-c7cccc(-c8ccc9c(c8)sc8ccccc89)c7)cccc6c5c4)n3)cc2)cc1]
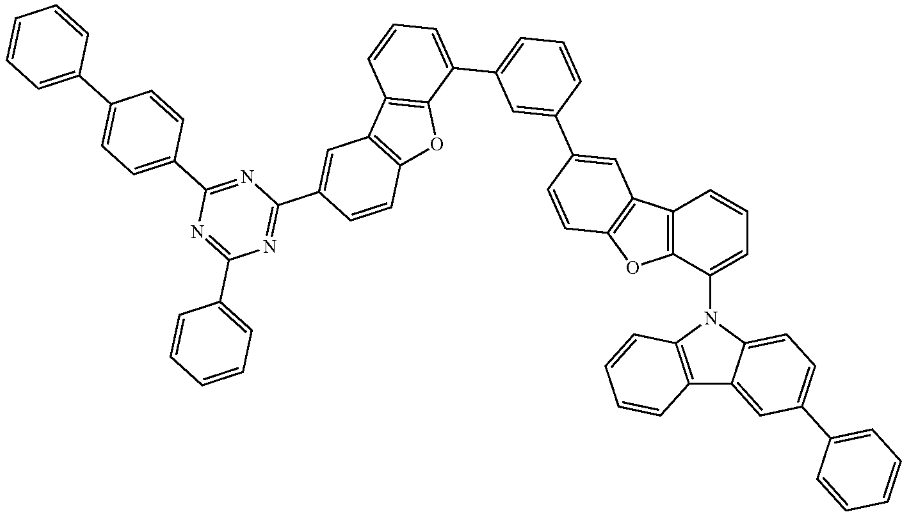 [SMILES: c1ccc(-c2ccc(-c3nc(-c4ccccc4)nc(-c4ccc5oc6c(-c7cccc(-c8ccc9oc%10c(-n%11c%12ccccc%12c%12cc(-c%13ccccc%13)ccc%12%11)cccc%10c9c8)c7)cccc6c5c4)n3)cc2)cc1]

TABLE 1-continued
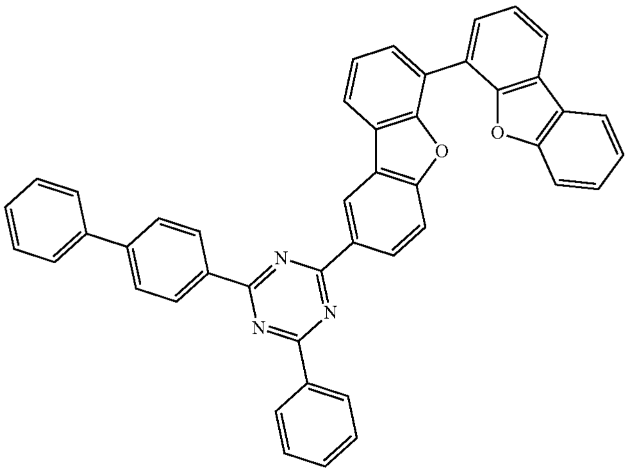 [SMILES: c1ccc(-c2ccc(-c3nc(-c4ccccc4)nc(-c4ccc5oc6c(-c7cccc8c7oc7ccccc78)cccc6c5c4)n3)cc2)cc1]
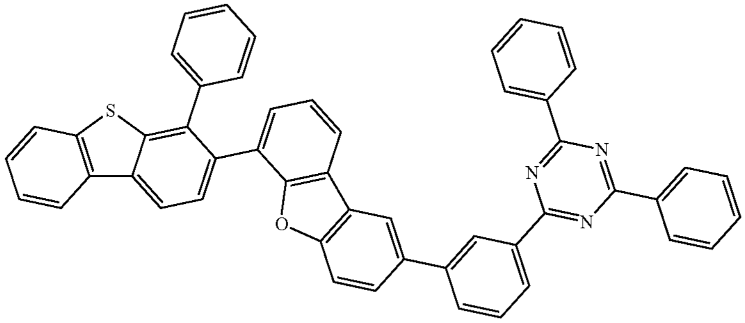 [SMILES: c1ccc(-c2nc(-c3ccccc3)nc(-c3cccc(-c4ccc5oc6c(-c7ccc8c(sc9ccccc98)c7-c7ccccc7)cccc6c5c4)c3)n2)cc1]
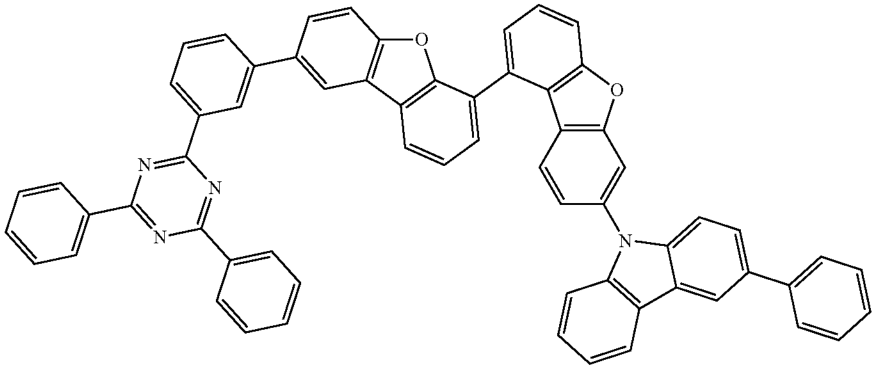 [SMILES: c1ccc(-c2ccc3c(c2)c2ccccc2n3-c2ccc3c(c2)oc2cccc(-c4cccc5c4oc4ccc(-c6cccc(-c7nc(-c8ccccc8)nc(-c8ccccc8)n7)c6)cc45)c23)cc1]
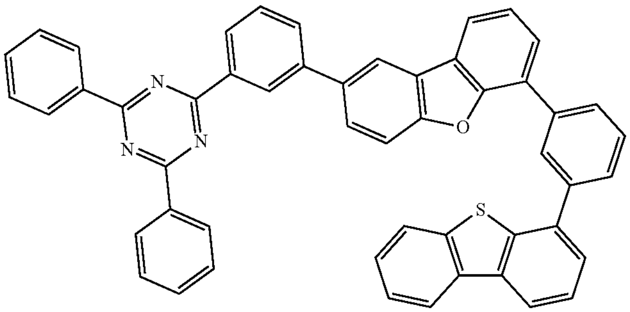 [SMILES: c1ccc(-c2nc(-c3ccccc3)nc(-c3cccc(-c4ccc5oc6c(-c7cccc(-c8cccc9c8sc8ccccc89)c7)cccc6c5c4)c3)n2)cc1]

TABLE 1-continued
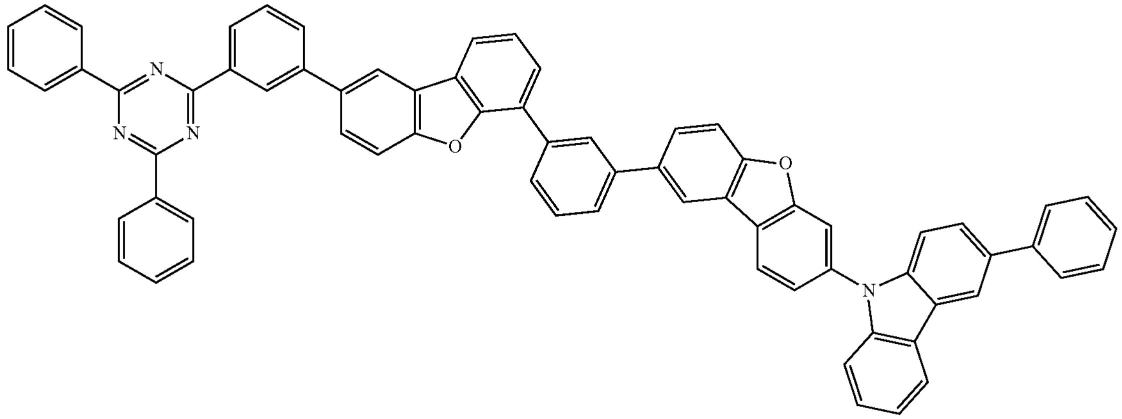 [SMILES: c1ccc(-c2ccc3c(c2)c2ccccc2n3-c2ccc3c(c2)oc2ccc(-c4cccc(-c5cccc6c5oc5ccc(-c7cccc(-c8nc(-c9ccccc9)nc(-c9ccccc9)n8)c7)cc56)c4)cc23)cc1]
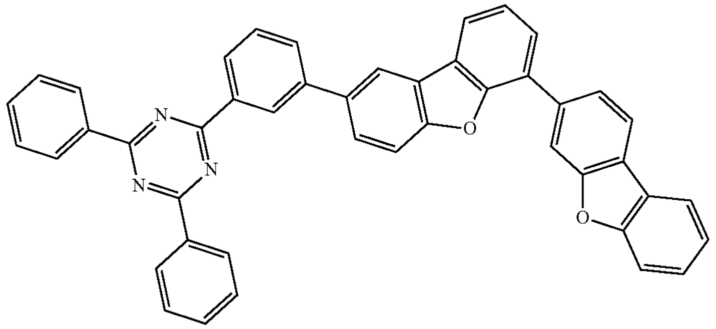 [SMILES: c1ccc(-c2nc(-c3ccccc3)nc(-c3cccc(-c4ccc5oc6c(-c7ccc8c(c7)oc7ccccc78)cccc6c5c4)c3)n2)cc1]
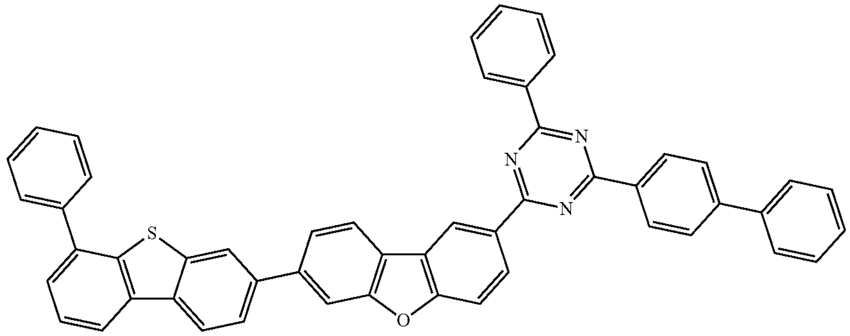 [SMILES: c1ccc(-c2ccc(-c3nc(-c4ccccc4)nc(-c4ccc5oc6cc(-c7ccc8c(c7)sc7c(-c9ccccc9)cccc78)ccc6c5c4)n3)cc2)cc1]
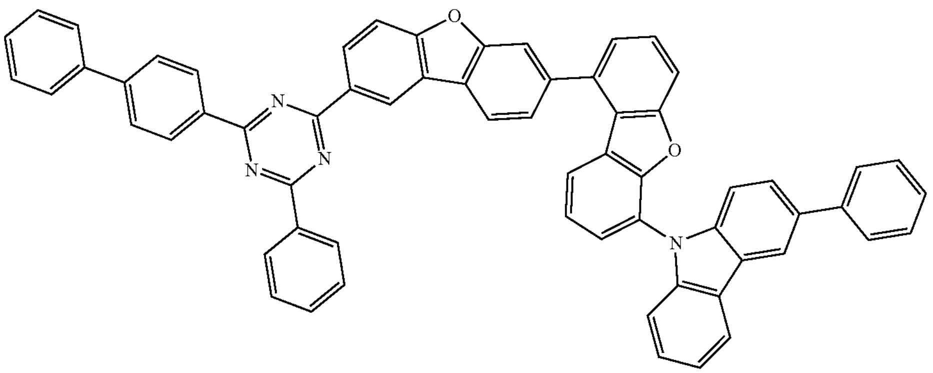 [SMILES: c1ccc(-c2ccc(-c3nc(-c4ccccc4)nc(-c4ccc5oc6cc(-c7cccc8oc9c(-n%10c%11ccccc%11c%11cc(-c%12ccccc%12)ccc%11%10)cccc9c78)ccc6c5c4)n3)cc2)cc1]

TABLE 1-continued
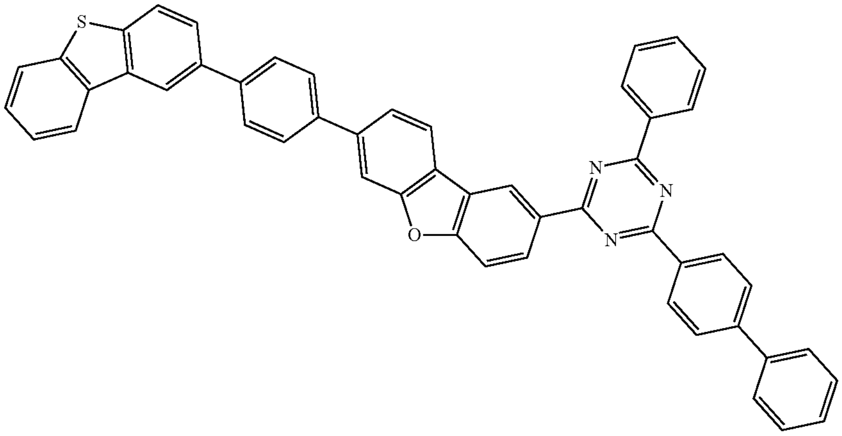 [SMILES: c1ccc(-c2ccc(-c3nc(-c4ccccc4)nc(-c4ccc5oc6cc(-c7ccc(-c8ccc9sc%10ccccc%10c9c8)cc7)ccc6c5c4)n3)cc2)cc1]
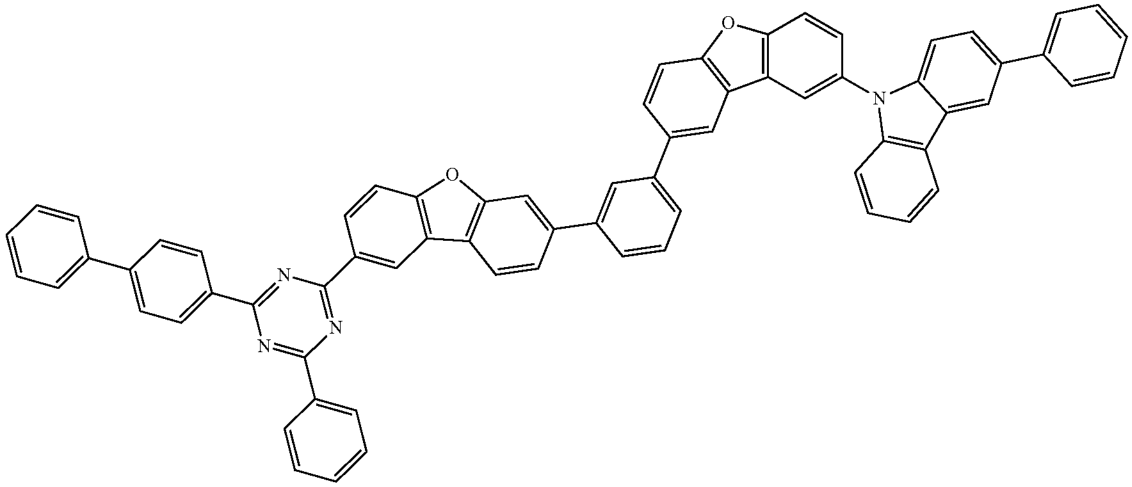 [SMILES: c1ccc(-c2ccc(-c3nc(-c4ccccc4)nc(-c4ccc5oc6cc(-c7cccc(-c8ccc9oc%10ccc(-n%11c%12ccccc%12c%12cc(-c%13ccccc%13)ccc%12%11)cc%10c9c8)c7)ccc6c5c4)n3)cc2)cc1]
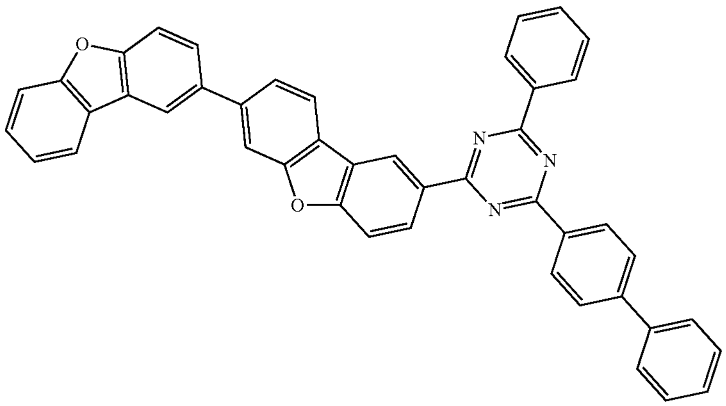 [SMILES: c1ccc(-c2ccc(-c3nc(-c4ccccc4)nc(-c4ccc5oc6cc(-c7ccc8oc9ccccc9c8c7)ccc6c5c4)n3)cc2)cc1]

TABLE 1-continued
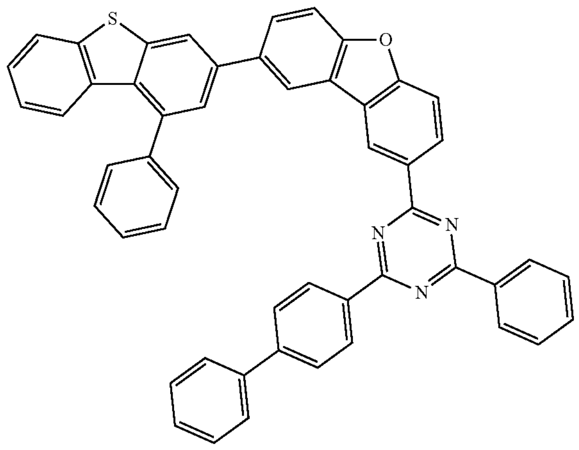 [SMILES: c1ccc(-c2ccc(-c3nc(-c4ccccc4)nc(-c4ccc5oc6ccc(-c7cc(-c8ccccc8)c8c(c7)sc7ccccc78)cc6c5c4)n3)cc2)cc1]
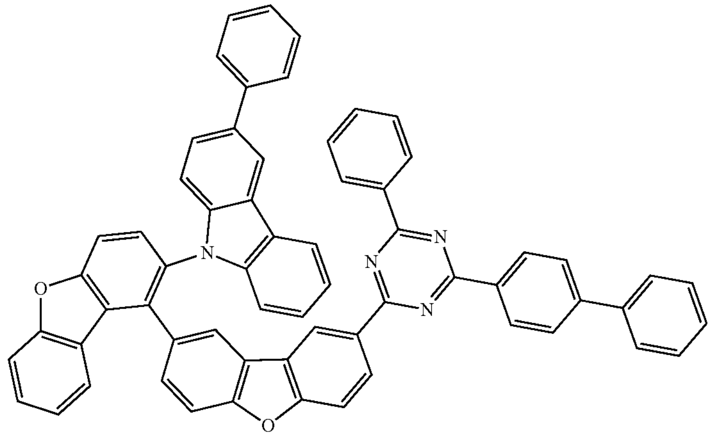 [SMILES: c1ccc(-c2ccc(-c3nc(-c4ccccc4)nc(-c4ccc5oc6ccc(-c7c(-n8c9ccccc9c9cc(-c%10ccccc%10)ccc98)ccc8oc9ccccc9c78)cc6c5c4)n3)cc2)cc1]
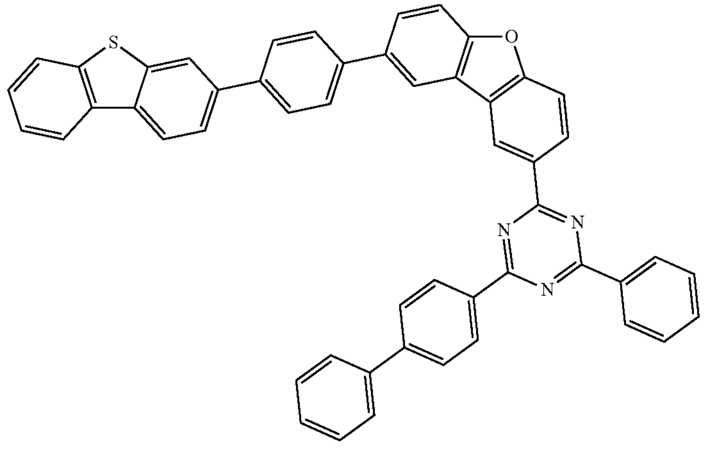 [SMILES: c1ccc(-c2ccc(-c3nc(-c4ccccc4)nc(-c4ccc5oc6ccc(-c7ccc(-c8ccc9c(c8)sc8ccccc89)cc7)cc6c5c4)n3)cc2)cc1]

TABLE 1-continued
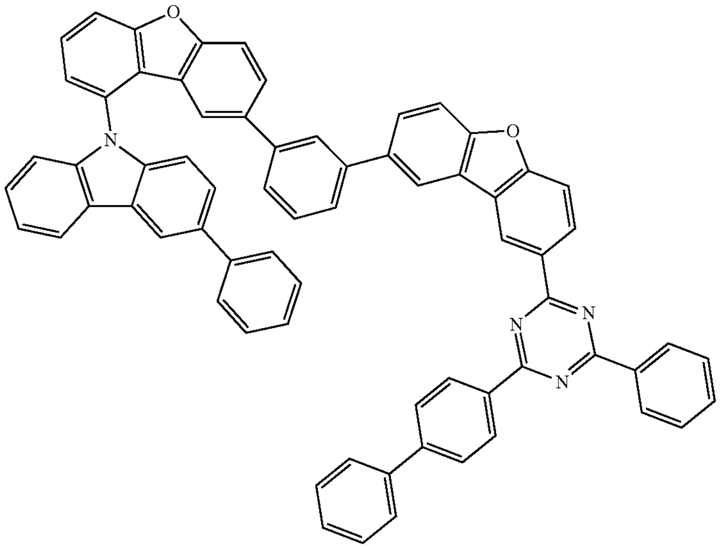 [SMILES: c1ccc(-c2ccc(-c3nc(-c4ccccc4)nc(-c4ccc5oc6ccc(-c7cccc(-c8ccc9oc%10cccc(-n%11c%12ccccc%12c%12cc(-c%13ccccc%13)ccc%12%11)c%10c9c8)c7)cc6c5c4)n3)cc2)cc1]
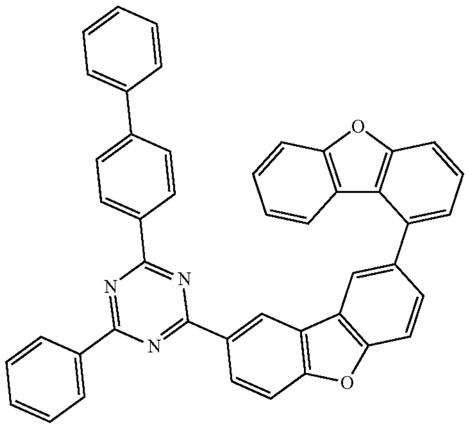 [SMILES: c1ccc(-c2ccc(-c3nc(-c4ccccc4)nc(-c4ccc5oc6ccc(-c7cccc8oc9ccccc9c78)cc6c5c4)n3)cc2)cc1]
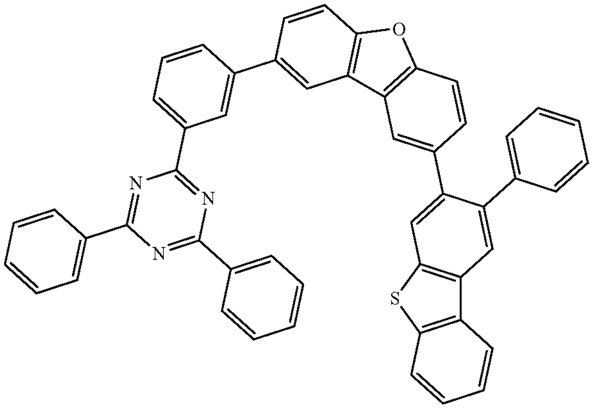 [SMILES: c1ccc(-c2nc(-c3ccccc3)nc(-c3cccc(-c4ccc5oc6ccc(-c7cc8sc9ccccc9c8cc7-c7ccccc7)cc6c5c4)c3)n2)cc1]

TABLE 1-continued
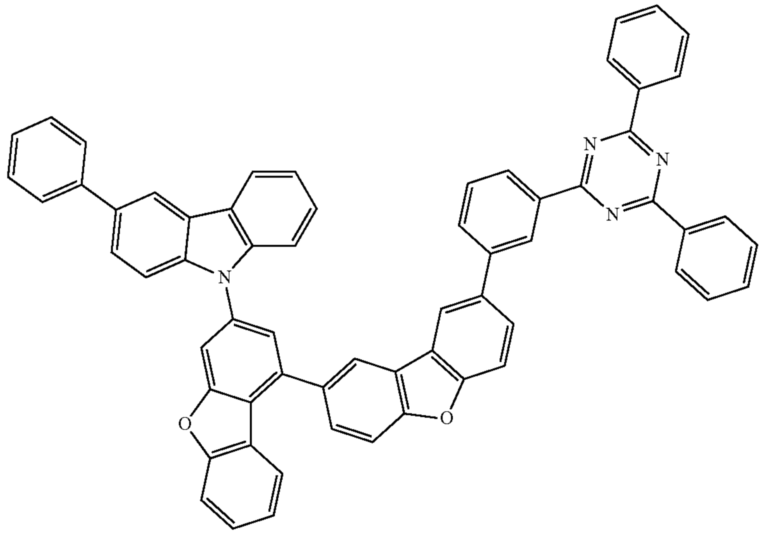 [SMILES: c1ccc(-c2ccc3c(c2)c2ccccc2n3-c2cc(-c3ccc4oc5ccc(-c6cccc(-c7nc(-c8ccccc8)nc(-c8ccccc8)n7)c6)cc5c4c3)c3c(c2)oc2ccccc23)cc1]
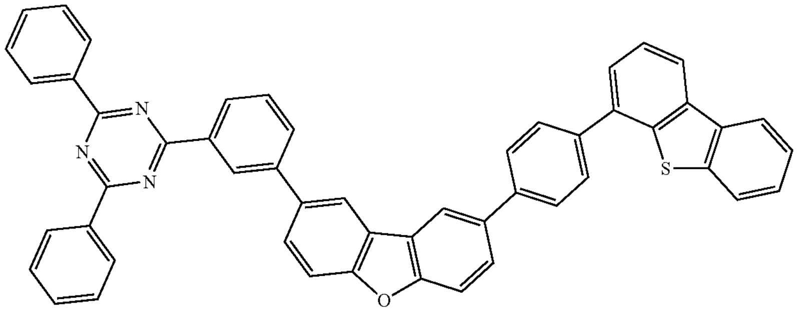 [SMILES: c1ccc(-c2nc(-c3ccccc3)nc(-c3cccc(-c4ccc5oc6ccc(-c7ccc(-c8cccc9c8sc8ccccc89)cc7)cc6c5c4)c3)n2)cc1]
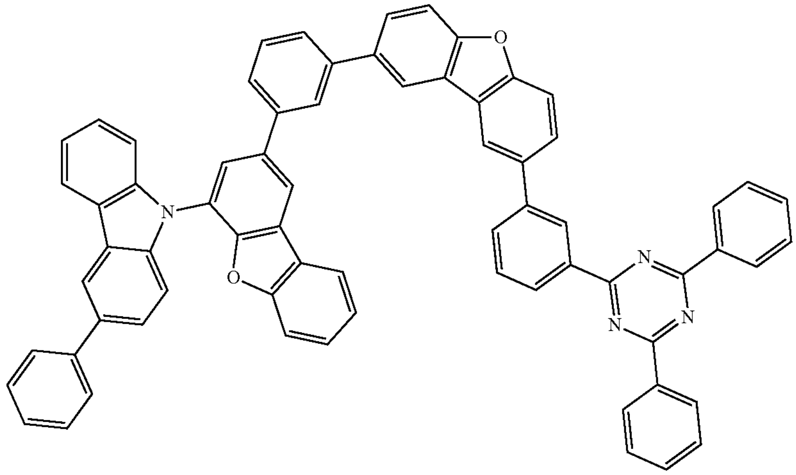 [SMILES: c1ccc(-c2ccc3c(c2)c2ccccc2n3-c2cc(-c3cccc(-c4ccc5oc6ccc(-c7cccc(-c8nc(-c9ccccc9)nc(-c9ccccc9)n8)c7)cc6c5c4)c3)cc3c2oc2ccccc23)cc1]

TABLE 1-continued
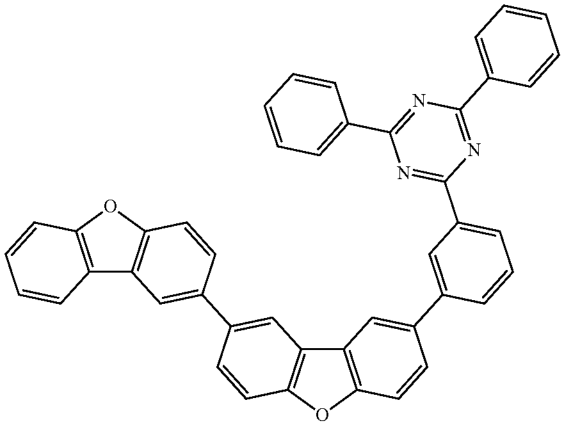 [SMILES: c1ccc(-c2nc(-c3ccccc3)nc(-c3cccc(-c4ccc5oc6ccc(-c7ccc8oc9ccccc9c8c7)cc6c5c4)c3)n2)cc1]
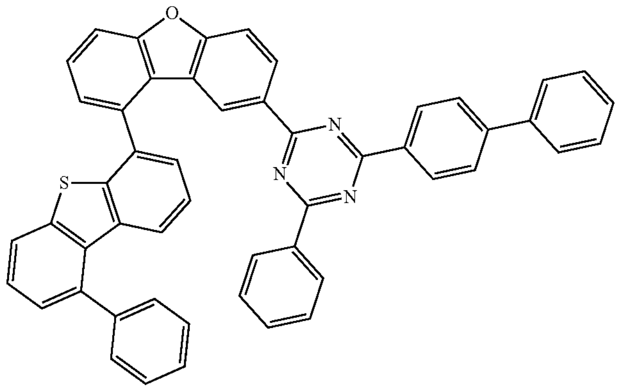 [SMILES: c1ccc(-c2ccc(-c3nc(-c4ccccc4)nc(-c4ccc5oc6cccc(-c7cccc8c7sc7cccc(-c9ccccc9)c78)c6c5c4)n3)cc2)cc1]
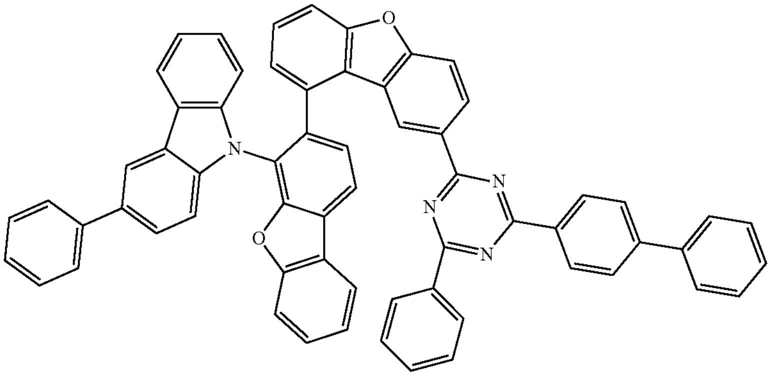 [SMILES: c1ccc(-c2ccc(-c3nc(-c4ccccc4)nc(-c4ccc5oc6cccc(-c7ccc8c(oc9ccccc98)c7-n7c8ccccc8c8cc(-c9ccccc9)ccc87)c6c5c4)n3)cc2)cc1]
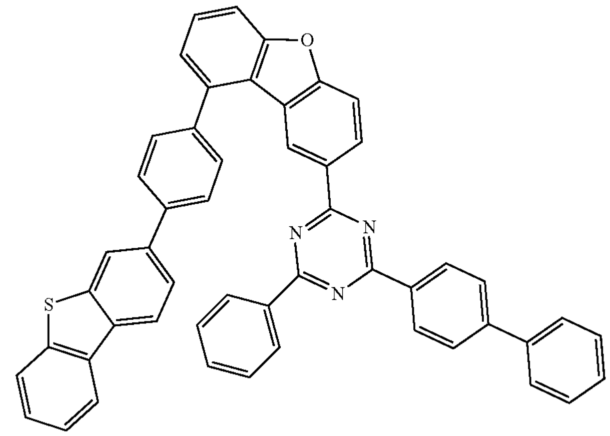 [SMILES: c1ccc(-c2ccc(-c3nc(-c4ccccc4)nc(-c4ccc5oc6cccc(-c7ccc(-c8ccc9c(c8)sc8ccccc89)cc7)c6c5c4)n3)cc2)cc1]

TABLE 1-continued
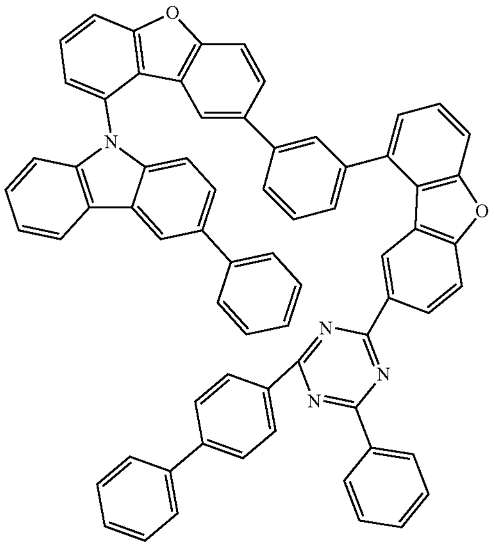 [SMILES: c1ccc(-c2ccc(-c3nc(-c4ccccc4)nc(-c4ccc5oc6cccc(-c7cccc(-c8ccc9oc%10cccc(-n%11c%12ccccc%12c%12cc(-c%13ccccc%13)ccc%12%11)c%10c9c8)c7)c6c5c4)n3)cc2)cc1]
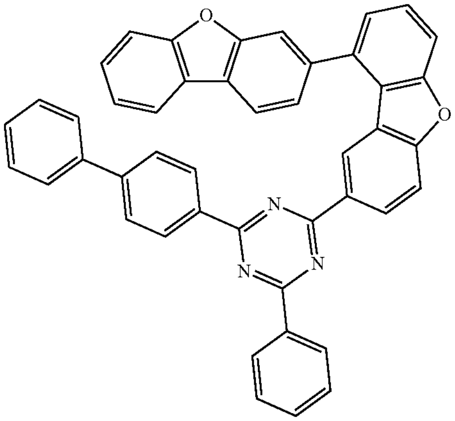 [SMILES: c1ccc(-c2ccc(-c3nc(-c4ccccc4)nc(-c4ccc5oc6cccc(-c7ccc8c(c7)oc7ccccc78)c6c5c4)n3)cc2)cc1]
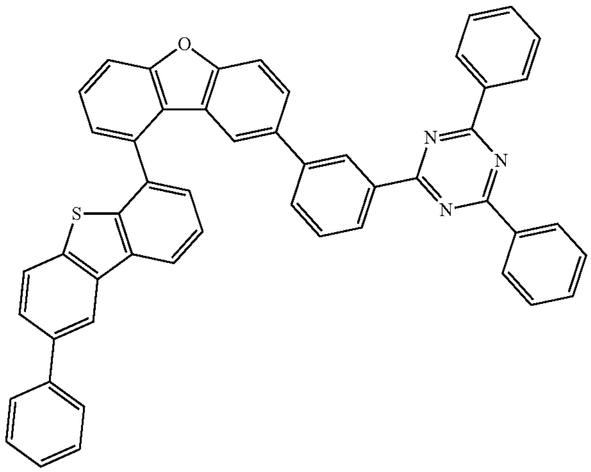 [SMILES: c1ccc(-c2ccc3sc4c(-c5cccc6oc7ccc(-c8cccc(-c9nc(-c%10ccccc%10)nc(-c%10ccccc%10)n9)c8)cc7c56)cccc4c3c2)cc1]

TABLE 1-continued
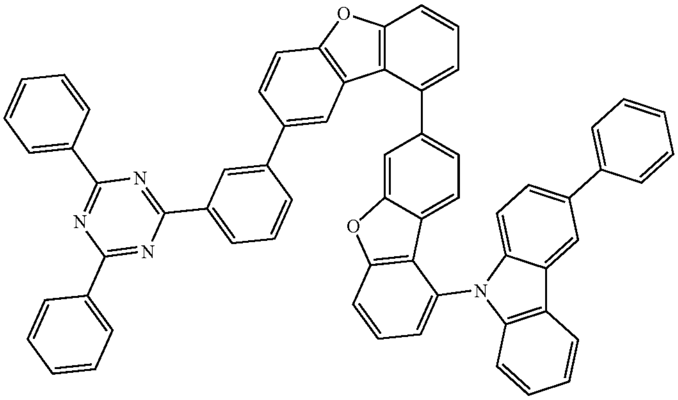 [SMILES: c1ccc(-c2ccc3c(c2)c2ccccc2n3-c2cccc3oc4cc(-c5cccc6oc7ccc(-c8cccc(-c9nc(-c%10ccccc%10)nc(-c%10ccccc%10)n9)c8)cc7c56)ccc4c23)cc1]
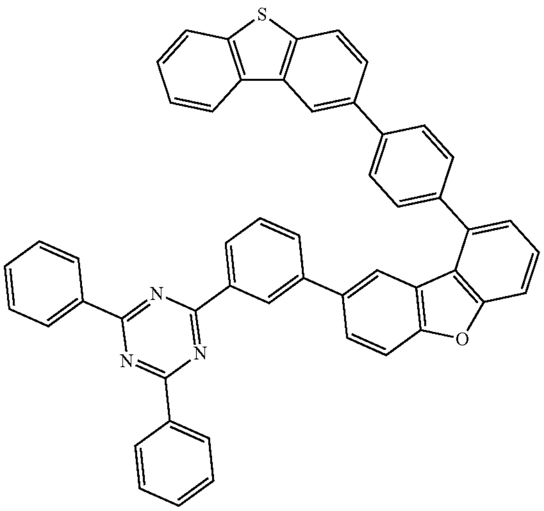 [SMILES: c1ccc(-c2nc(-c3ccccc3)nc(-c3cccc(-c4ccc5oc6cccc(-c7ccc(-c8ccc9sc%10ccccc%10c9c8)cc7)c6c5c4)c3)n2)cc1]
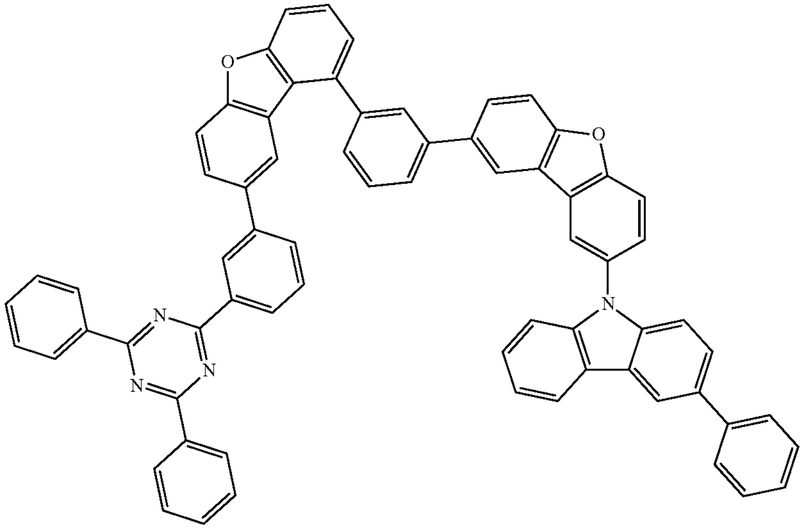 [SMILES: c1ccc(-c2ccc3c(c2)c2ccccc2n3-c2ccc3oc4ccc(-c5cccc(-c6cccc7oc8ccc(-c9cccc(-c%10nc(-c%11ccccc%11)nc(-c%11ccccc%11)n%10)c9)cc8c67)c5)cc4c3c2)cc1]

TABLE 1-continued
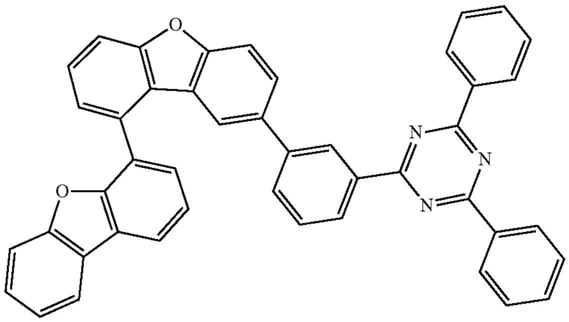 [SMILES: c1ccc(-c2nc(-c3ccccc3)nc(-c3cccc(-c4ccc5oc6cccc(-c7cccc8c7oc7ccccc78)c6c5c4)c3)n2)cc1]
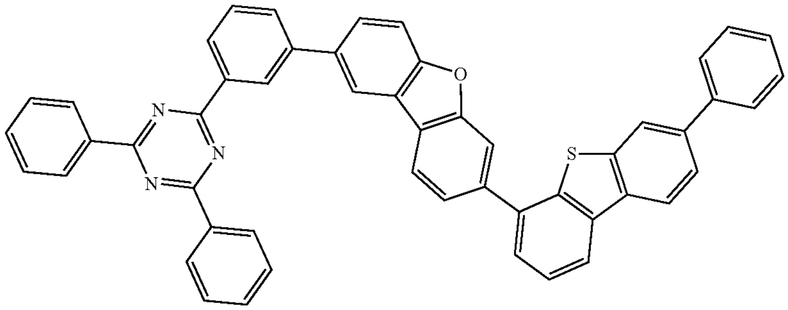 [SMILES: c1ccc(-c2ccc3c(c2)sc2c(-c4ccc5c(c4)oc4ccc(-c6cccc(-c7nc(-c8ccccc8)nc(-c8ccccc8)n7)c6)cc45)cccc23)cc1]
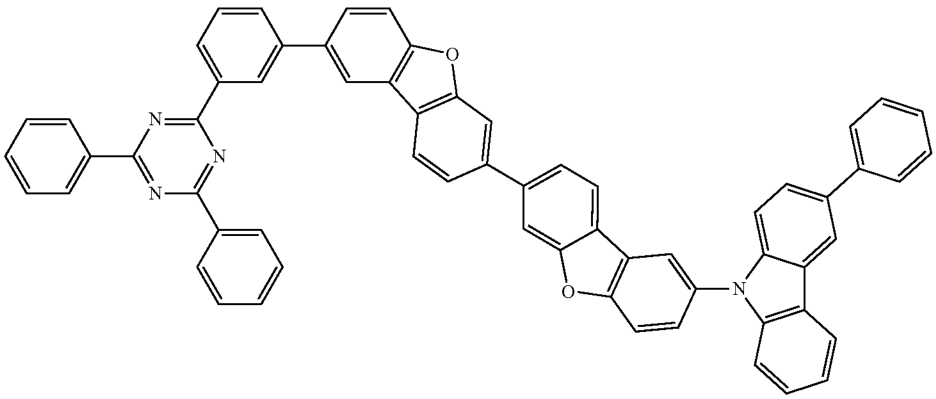 [SMILES: c1ccc(-c2ccc3c(c2)c2ccccc2n3-c2ccc3oc4cc(-c5ccc6c(c5)oc5ccc(-c7cccc(-c8nc(-c9ccccc9)nc(-c9ccccc9)n8)c7)cc56)ccc4c3c2)cc1]
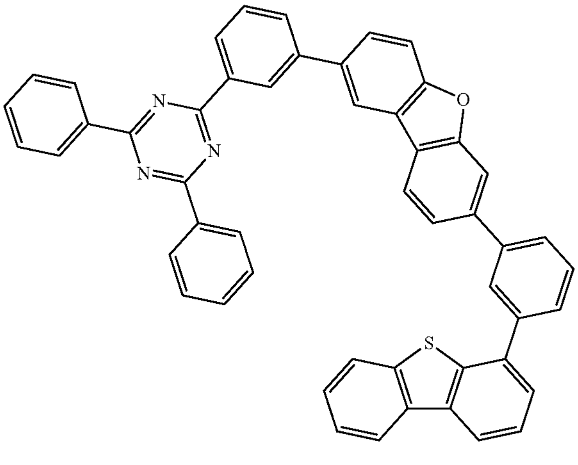 [SMILES: c1ccc(-c2nc(-c3ccccc3)nc(-c3cccc(-c4ccc5oc6cc(-c7cccc(-c8cccc9c8sc8ccccc89)c7)ccc6c5c4)c3)n2)cc1]

TABLE 1-continued
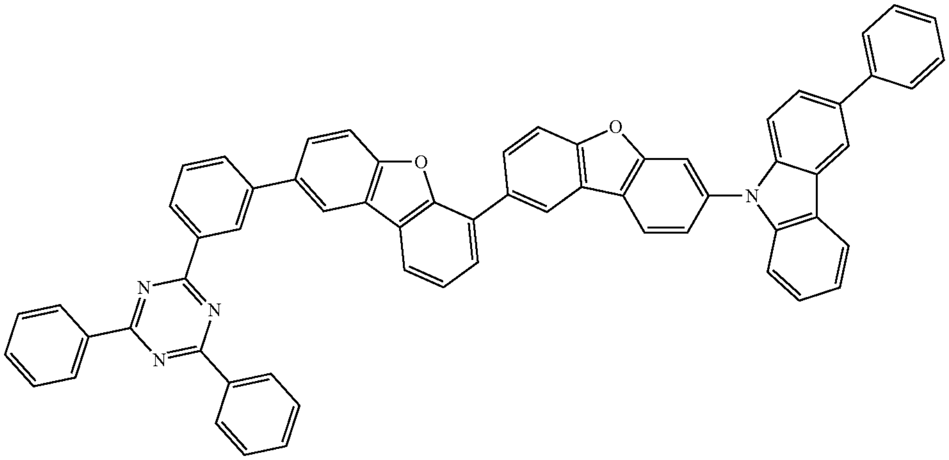 [SMILES: c1ccc(-c2ccc3c(c2)c2ccccc2n3-c2ccc3c(c2)oc2ccc(-c4cccc5c4oc4ccc(-c6cccc(-c7nc(-c8ccccc8)nc(-c8ccccc8)n7)c6)cc45)cc23)cc1]
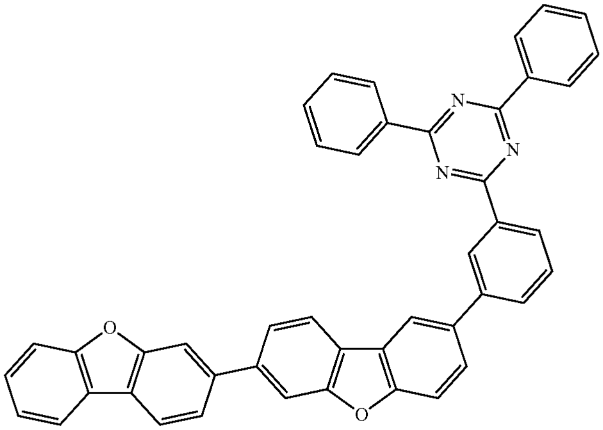 [SMILES: c1ccc(-c2nc(-c3ccccc3)nc(-c3cccc(-c4ccc5oc6cc(-c7ccc8c(c7)oc7ccccc78)ccc6c5c4)c3)n2)cc1]
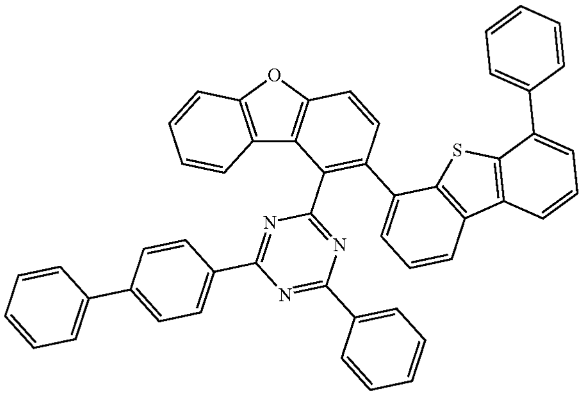 [SMILES: c1ccc(-c2ccc(-c3nc(-c4ccccc4)nc(-c4c(-c5cccc6c5sc5c(-c7ccccc7)cccc56)ccc5oc6ccccc6c45)n3)cc2)cc1]

TABLE 1-continued
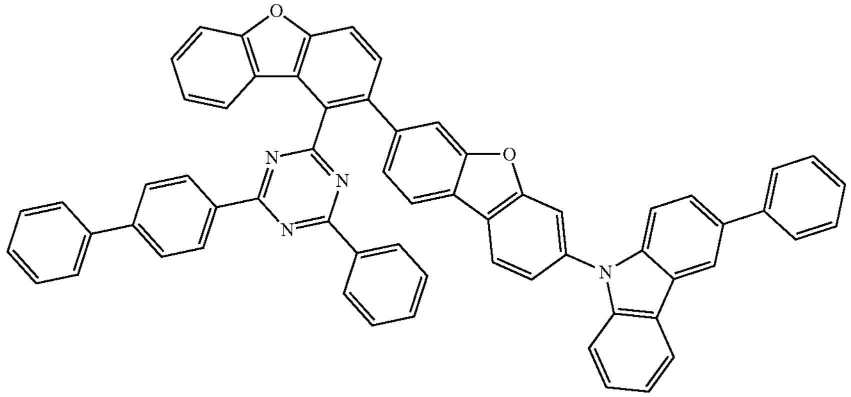 [SMILES: c1ccc(-c2ccc(-c3nc(-c4ccccc4)nc(-c4c(-c5ccc6c(c5)oc5cc(-n7c8ccccc8c8cc(-c9ccccc9)ccc87)ccc56)ccc5oc6ccccc6c45)n3)cc2)cc1]
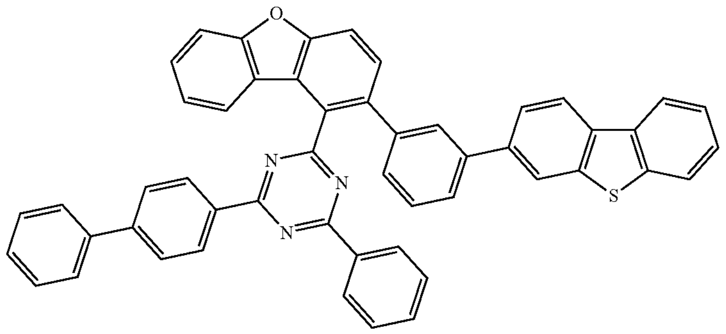 [SMILES: c1ccc(-c2ccc(-c3nc(-c4ccccc4)nc(-c4c(-c5cccc(-c6ccc7c(c6)sc6ccccc67)c5)ccc5oc6ccccc6c45)n3)cc2)cc1]
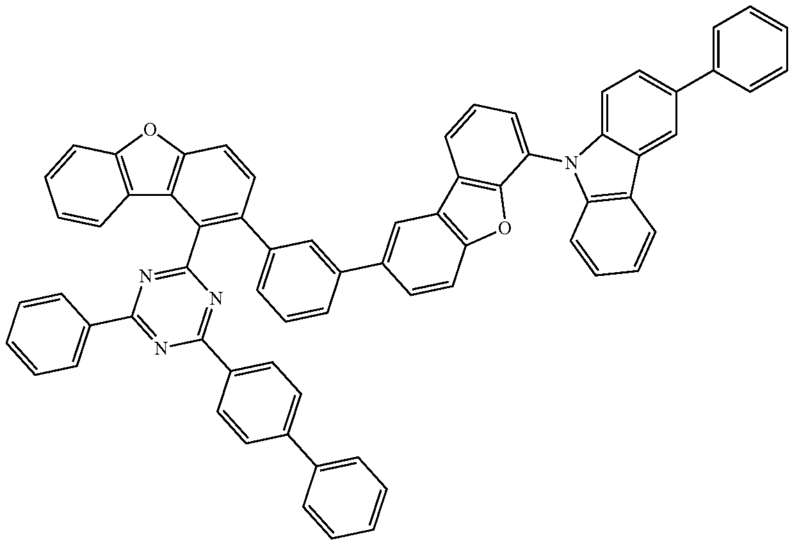 [SMILES: c1ccc(-c2ccc(-c3nc(-c4ccccc4)nc(-c4c(-c5cccc(-c6ccc7oc8c(-n9c%10ccccc%10c%10cc(-c%11ccccc%11)ccc%109)cccc8c7c6)c5)ccc5oc6ccccc6c45)n3)cc2)cc1]
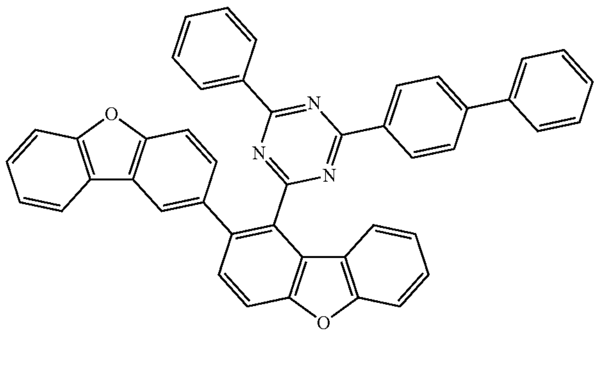 [SMILES: c1ccc(-c2ccc(-c3nc(-c4ccccc4)nc(-c4c(-c5ccc6oc7ccccc7c6c5)ccc5oc6ccccc6c45)n3)cc2)cc1]

TABLE 1-continued
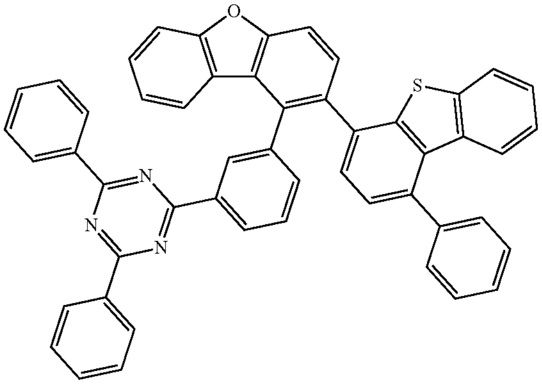 [SMILES: c1ccc(-c2nc(-c3ccccc3)nc(-c3cccc(-c4c(-c5ccc(-c6ccccc6)c6c5sc5ccccc56)ccc5oc6ccccc6c45)c3)n2)cc1]
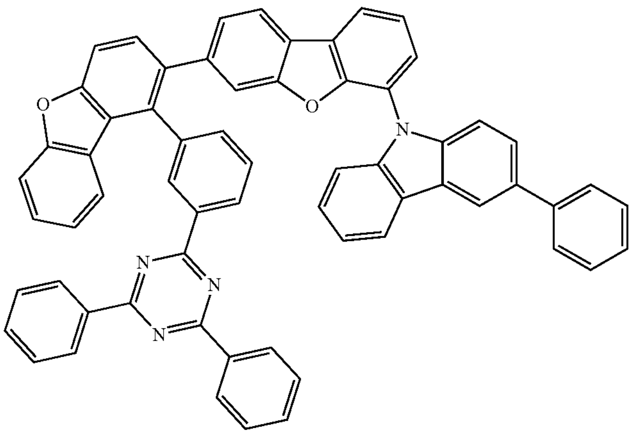 [SMILES: c1ccc(-c2ccc3c(c2)c2ccccc2n3-c2cccc3c2oc2cc(-c4ccc5oc6ccccc6c5c4-c4cccc(-c5nc(-c6ccccc6)nc(-c6ccccc6)n5)c4)ccc23)cc1]
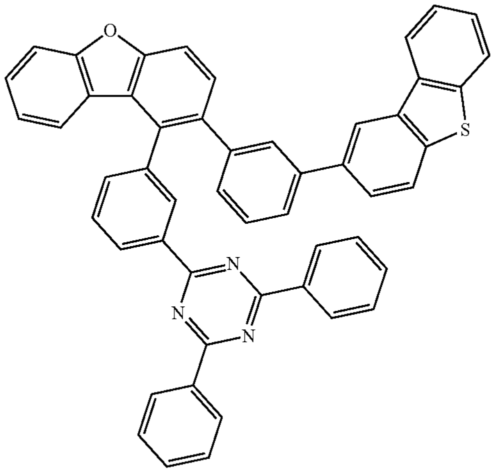 [SMILES: c1ccc(-c2nc(-c3ccccc3)nc(-c3cccc(-c4c(-c5cccc(-c6ccc7sc8ccccc8c7c6)c5)ccc5oc6ccccc6c45)c3)n2)cc1]

TABLE 1-continued
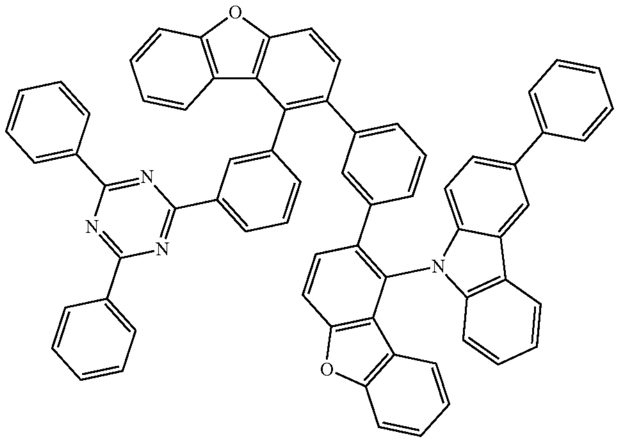 [SMILES: c1ccc(-c2ccc3c(c2)c2ccccc2n3-c2c(-c3cccc(-c4ccc5oc6ccccc6c5c4-c4cccc(-c5nc(-c6ccccc6)nc(-c6ccccc6)n5)c4)c3)ccc3oc4ccccc4c23)cc1]
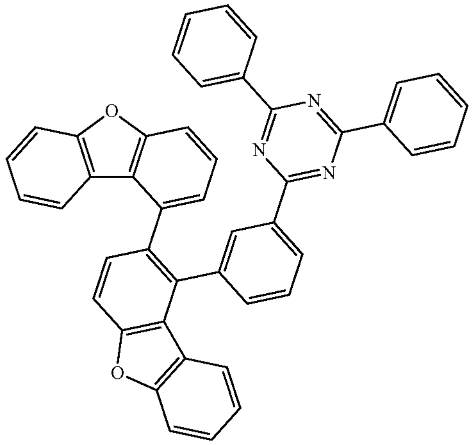 [SMILES: c1ccc(-c2nc(-c3ccccc3)nc(-c3cccc(-c4c(-c5cccc6oc7ccccc7c56)ccc5oc6ccccc6c45)c3)n2)cc1]
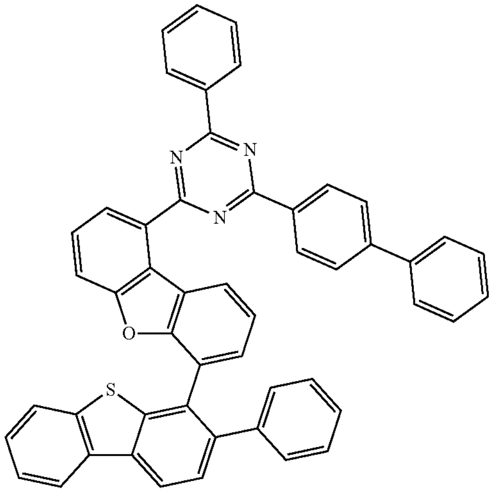 [SMILES: c1ccc(-c2ccc(-c3nc(-c4ccccc4)nc(-c4cccc5oc6c(-c7c(-c8ccccc8)ccc8c7sc7ccccc78)cccc6c45)n3)cc2)cc1]

TABLE 1-continued
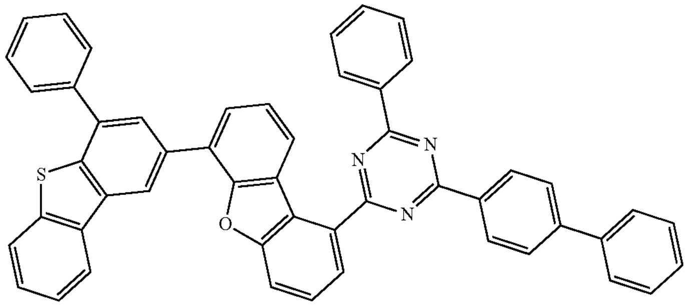 [SMILES: c1ccc(-c2ccc(-c3nc(-c4ccccc4)nc(-c4cccc5oc6c(-c7cc(-c8ccccc8)c8sc9ccccc9c8c7)cccc6c45)n3)cc2)cc1]
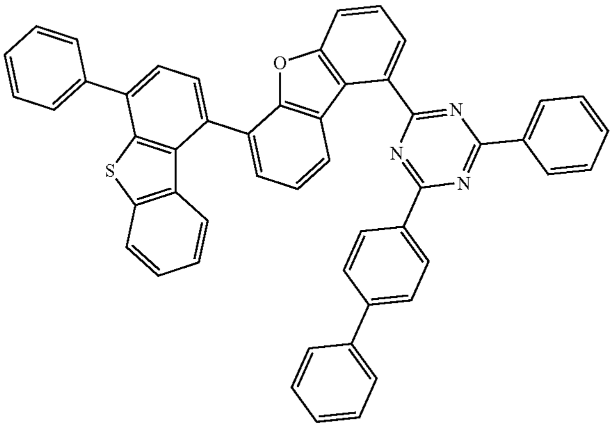 [SMILES: c1ccc(-c2ccc(-c3nc(-c4ccccc4)nc(-c4cccc5oc6c(-c7ccc(-c8ccccc8)c8sc9ccccc9c78)cccc6c45)n3)cc2)cc1]
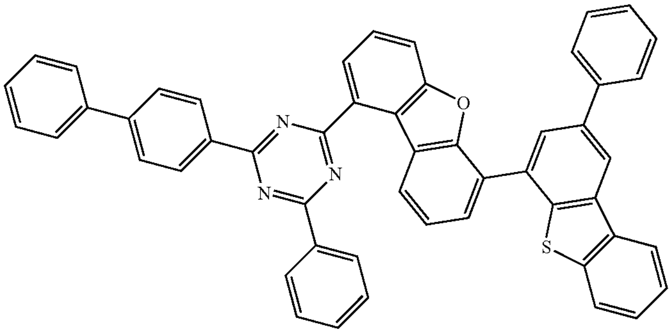 [SMILES: c1ccc(-c2ccc(-c3nc(-c4ccccc4)nc(-c4cccc5oc6c(-c7cc(-c8ccccc8)cc8c7sc7ccccc78)cccc6c45)n3)cc2)cc1]
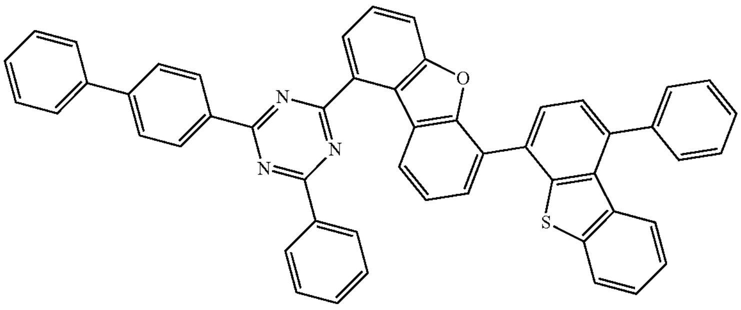 [SMILES: c1ccc(-c2ccc(-c3nc(-c4ccccc4)nc(-c4cccc5oc6c(-c7ccc(-c8ccccc8)c8c7sc7ccccc78)cccc6c45)n3)cc2)cc1]

TABLE 1-continued
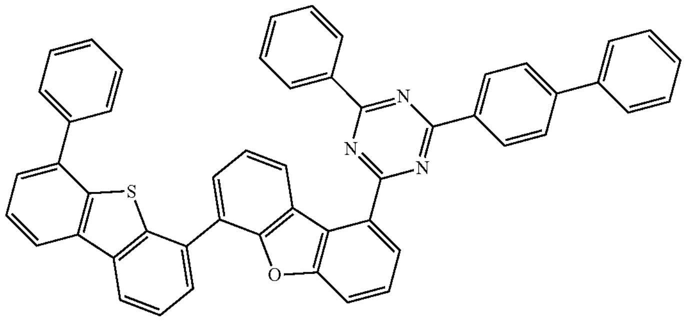 [SMILES: c1ccc(-c2ccc(-c3nc(-c4ccccc4)nc(-c4cccc5oc6c(-c7cccc8c7sc7c(-c9ccccc9)cccc78)cccc6c45)n3)cc2)cc1]
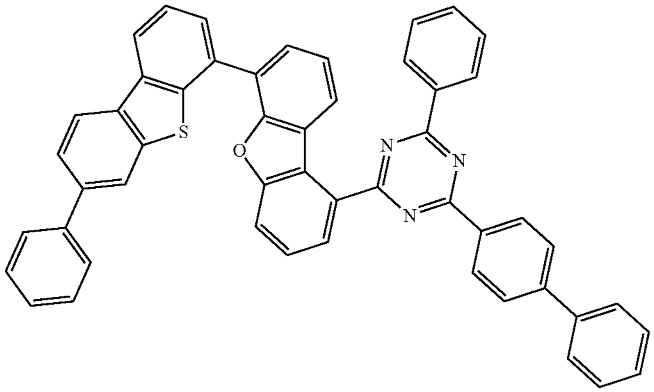 [SMILES: c1ccc(-c2ccc(-c3nc(-c4ccccc4)nc(-c4cccc5oc6c(-c7cccc8c7sc7cc(-c9ccccc9)ccc78)cccc6c45)n3)cc2)cc1]
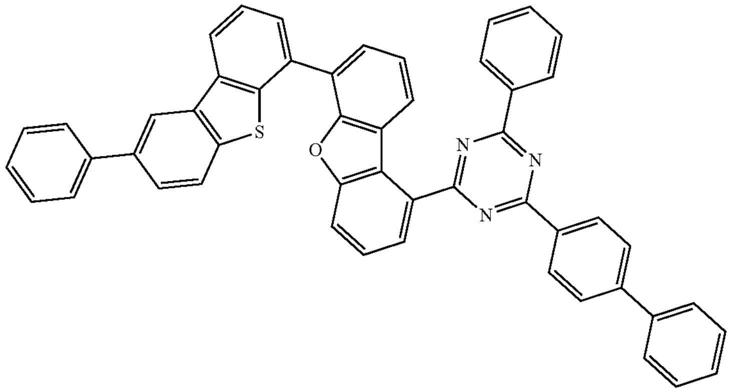 [SMILES: c1ccc(-c2ccc(-c3nc(-c4ccccc4)nc(-c4cccc5oc6c(-c7cccc8c7sc7ccc(-c9ccccc9)cc78)cccc6c45)n3)cc2)cc1]
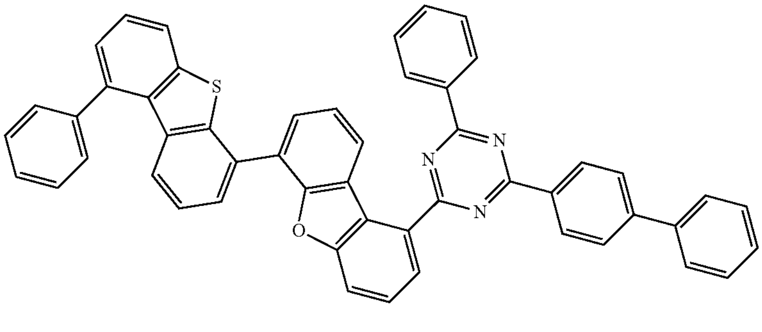 [SMILES: c1ccc(-c2ccc(-c3nc(-c4ccccc4)nc(-c4cccc5oc6c(-c7cccc8c7sc7cccc(-c9ccccc9)c78)cccc6c45)n3)cc2)cc1]

TABLE 1-continued
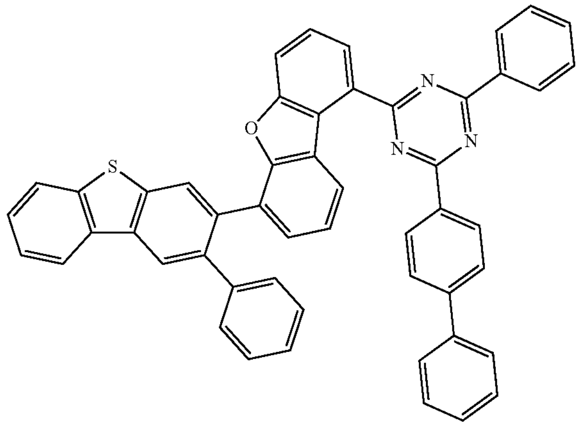 [SMILES: c1ccc(-c2ccc(-c3nc(-c4ccccc4)nc(-c4cccc5oc6c(-c7cc8sc9ccccc9c8cc7-c7ccccc7)cccc6c45)n3)cc2)cc1]
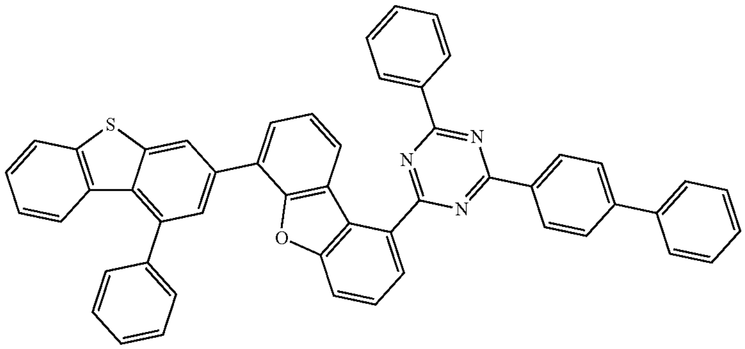 [SMILES: c1ccc(-c2ccc(-c3nc(-c4ccccc4)nc(-c4cccc5oc6c(-c7cc(-c8ccccc8)c8c(c7)sc7ccccc78)cccc6c45)n3)cc2)cc1]
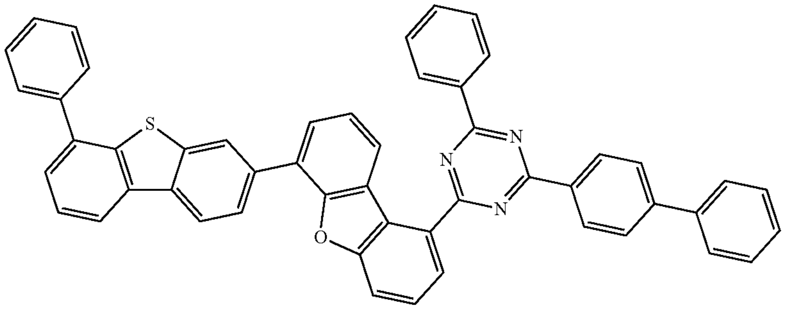 [SMILES: c1ccc(-c2ccc(-c3nc(-c4ccccc4)nc(-c4cccc5oc6c(-c7ccc8c(c7)sc7c(-c9ccccc9)cccc78)cccc6c45)n3)cc2)cc1]
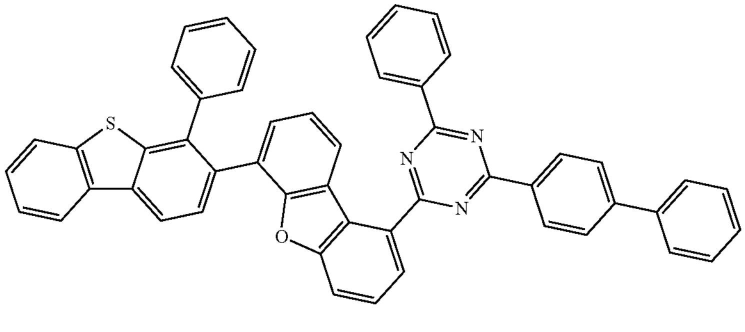 [SMILES: c1ccc(-c2ccc(-c3nc(-c4ccccc4)nc(-c4cccc5oc6c(-c7ccc8c(sc9ccccc98)c7-c7ccccc7)cccc6c45)n3)cc2)cc1]

TABLE 1-continued
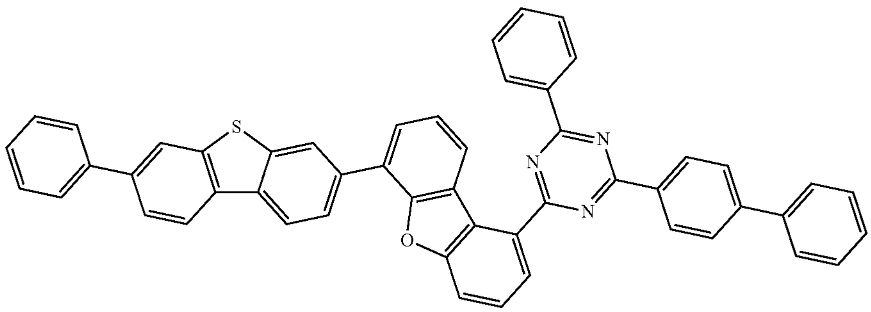 [SMILES: c1ccc(-c2ccc(-c3nc(-c4ccccc4)nc(-c4cccc5oc6c(-c7ccc8c(c7)sc7cc(-c9ccccc9)ccc78)cccc6c45)n3)cc2)cc1]
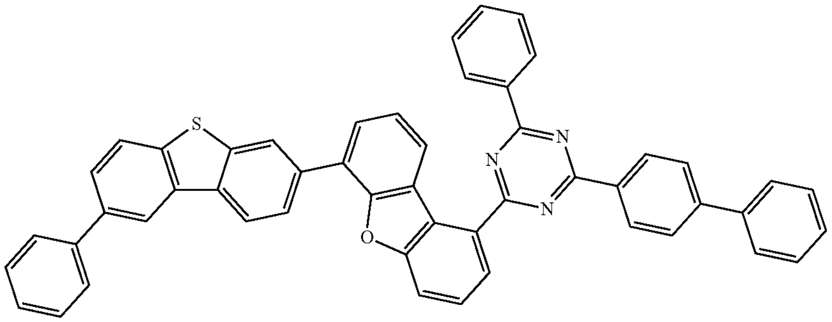 [SMILES: c1ccc(-c2ccc(-c3nc(-c4ccccc4)nc(-c4cccc5oc6c(-c7ccc8c(c7)sc7ccc(-c9ccccc9)cc78)cccc6c45)n3)cc2)cc1]
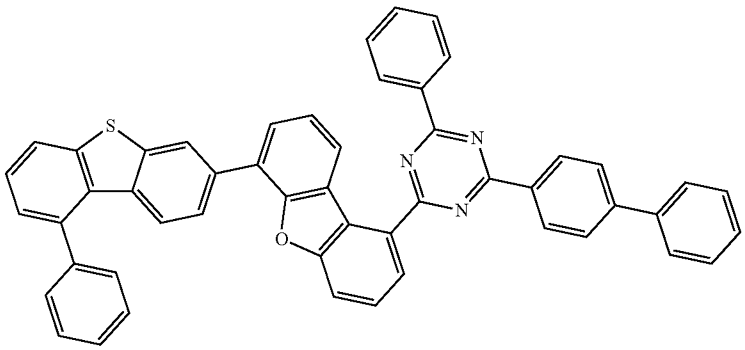 [SMILES: c1ccc(-c2ccc(-c3nc(-c4ccccc4)nc(-c4cccc5oc6c(-c7ccc8c(c7)sc7cccc(-c9ccccc9)c78)cccc6c45)n3)cc2)cc1]
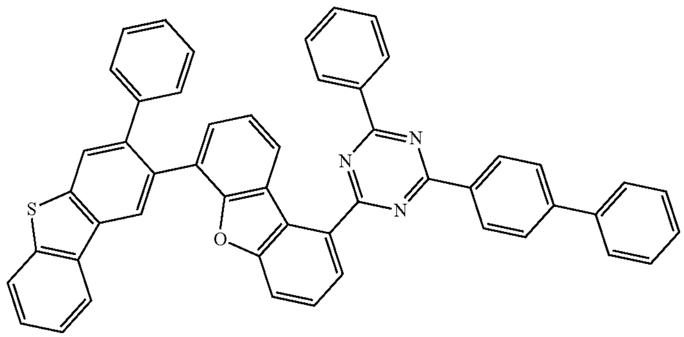 [SMILES: c1ccc(-c2ccc(-c3nc(-c4ccccc4)nc(-c4cccc5oc6c(-c7cc8c(cc7-c7ccccc7)sc7ccccc78)cccc6c45)n3)cc2)cc1]

TABLE 1-continued
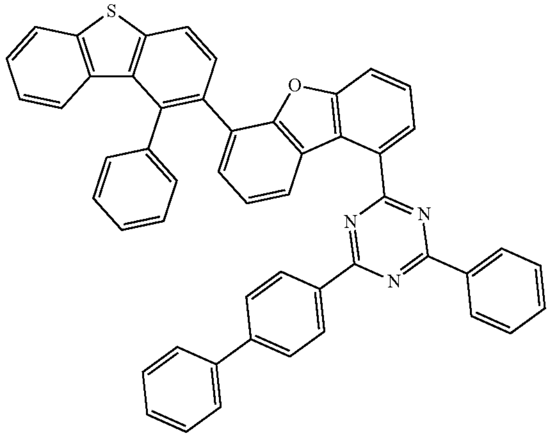 [SMILES: c1ccc(-c2ccc(-c3nc(-c4ccccc4)nc(-c4cccc5oc6c(-c7ccc8sc9ccccc9c8c7-c7ccccc7)cccc6c45)n3)cc2)cc1]
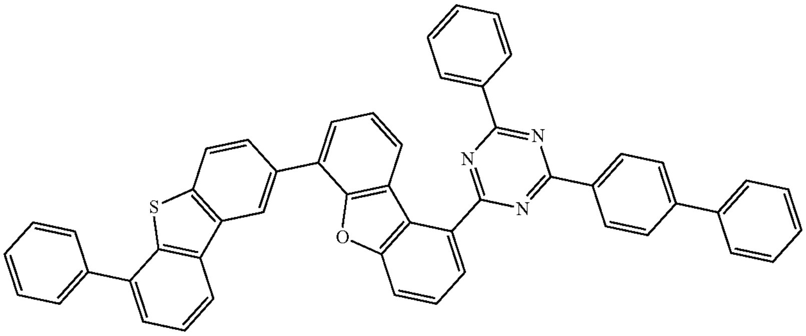 [SMILES: c1ccc(-c2ccc(-c3nc(-c4ccccc4)nc(-c4cccc5oc6c(-c7ccc8sc9c(-c%10ccccc%10)cccc9c8c7)cccc6c45)n3)cc2)cc1]
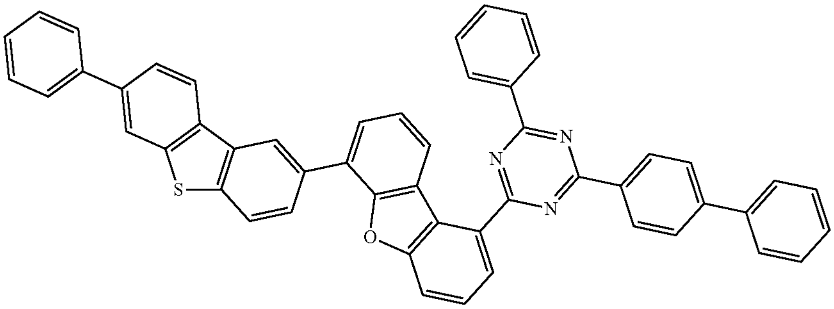 [SMILES: c1ccc(-c2ccc(-c3nc(-c4ccccc4)nc(-c4cccc5oc6c(-c7ccc8sc9cc(-c%10ccccc%10)ccc9c8c7)cccc6c45)n3)cc2)cc1]
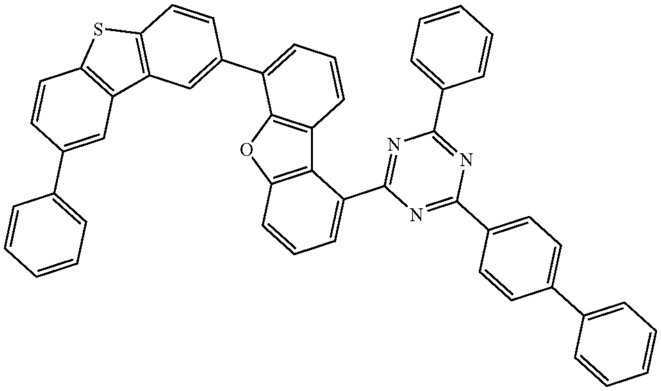 [SMILES: c1ccc(-c2ccc(-c3nc(-c4ccccc4)nc(-c4cccc5oc6c(-c7ccc8sc9ccc(-c%10ccccc%10)cc9c8c7)cccc6c45)n3)cc2)cc1]

TABLE 1-continued
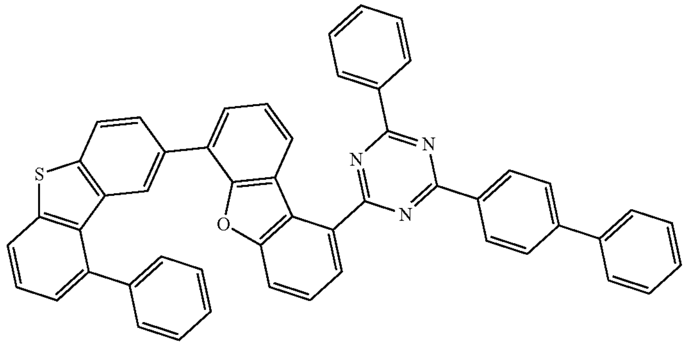 [SMILES: c1ccc(-c2ccc(-c3nc(-c4ccccc4)nc(-c4cccc5oc6c(-c7ccc8sc9cccc(-c%10ccccc%10)c9c8c7)cccc6c45)n3)cc2)cc1]
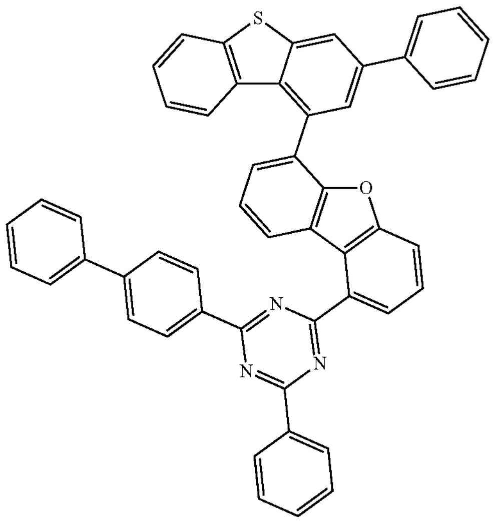 [SMILES: c1ccc(-c2ccc(-c3nc(-c4ccccc4)nc(-c4cccc5oc6c(-c7cc(-c8ccccc8)cc8sc9ccccc9c78)cccc6c45)n3)cc2)cc1]
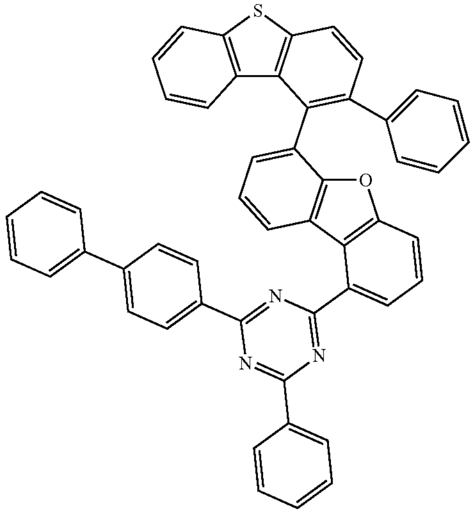 [SMILES: c1ccc(-c2ccc(-c3nc(-c4ccccc4)nc(-c4cccc5oc6c(-c7c(-c8ccccc8)ccc8sc9ccccc9c78)cccc6c45)n3)cc2)cc1]

TABLE 1-continued
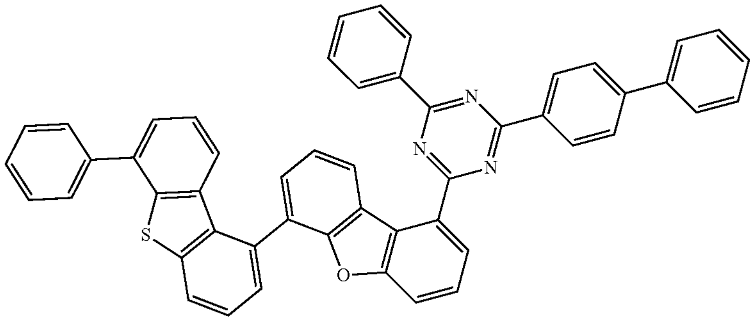 [SMILES: c1ccc(-c2ccc(-c3nc(-c4ccccc4)nc(-c4cccc5oc6c(-c7cccc8sc9c(-c%10ccccc%10)cccc9c78)cccc6c45)n3)cc2)cc1]
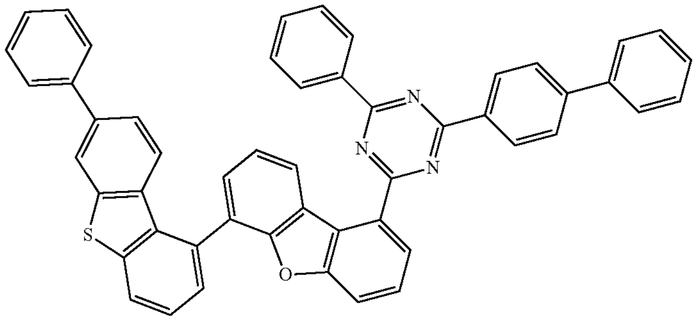 [SMILES: c1ccc(-c2ccc(-c3nc(-c4ccccc4)nc(-c4cccc5oc6c(-c7cccc8sc9cc(-c%10ccccc%10)ccc9c78)cccc6c45)n3)cc2)cc1]
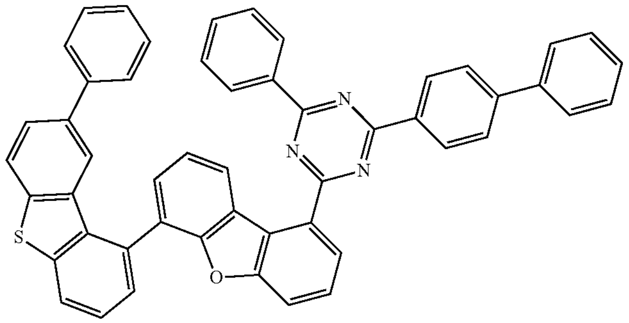 [SMILES: c1ccc(-c2ccc(-c3nc(-c4ccccc4)nc(-c4cccc5oc6c(-c7cccc8sc9ccc(-c%10ccccc%10)cc9c78)cccc6c45)n3)cc2)cc1]
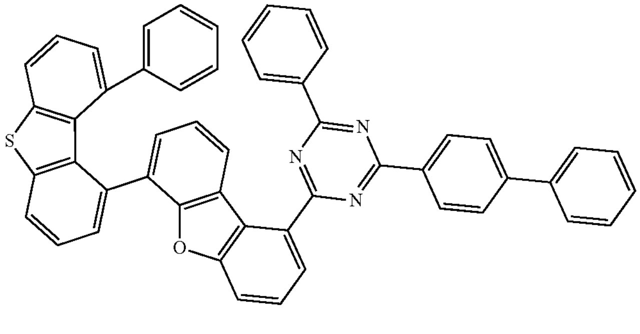 [SMILES: c1ccc(-c2ccc(-c3nc(-c4ccccc4)nc(-c4cccc5oc6c(-c7cccc8sc9cccc(-c%10ccccc%10)c9c78)cccc6c45)n3)cc2)cc1]

TABLE 1-continued
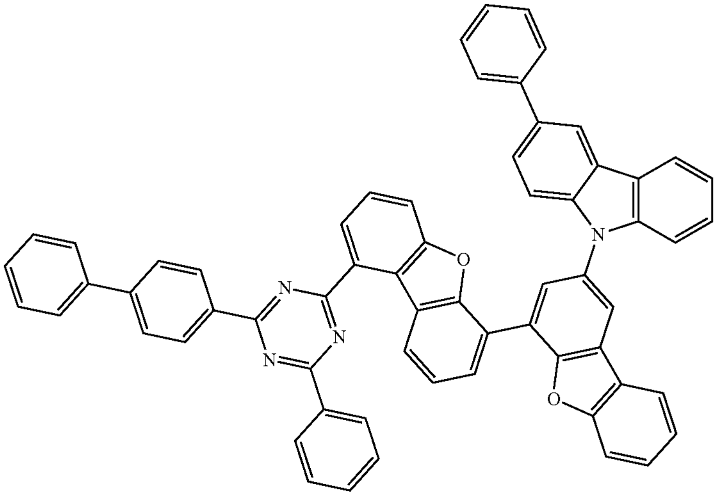 [SMILES: c1ccc(-c2ccc(-c3nc(-c4ccccc4)nc(-c4cccc5oc6c(-c7cc(-n8c9ccccc9c9cc(-c%10ccccc%10)ccc98)cc8c7oc7ccccc78)cccc6c45)n3)cc2)cc1]
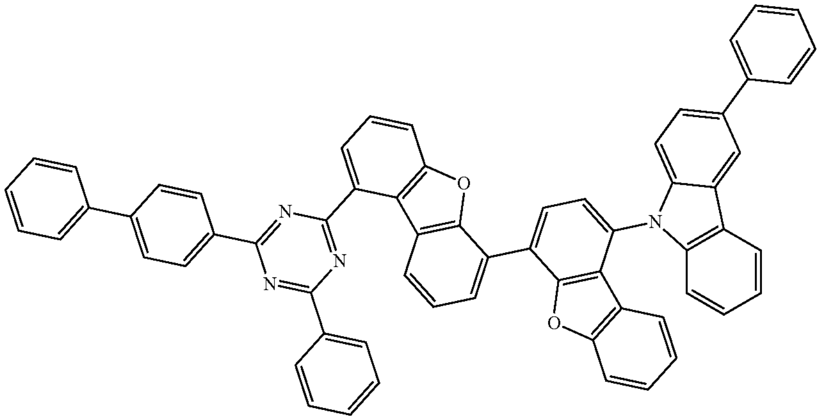 [SMILES: c1ccc(-c2ccc(-c3nc(-c4ccccc4)nc(-c4cccc5oc6c(-c7ccc(-n8c9ccccc9c9cc(-c%10ccccc%10)ccc98)c8c7oc7ccccc78)cccc6c45)n3)cc2)cc1]
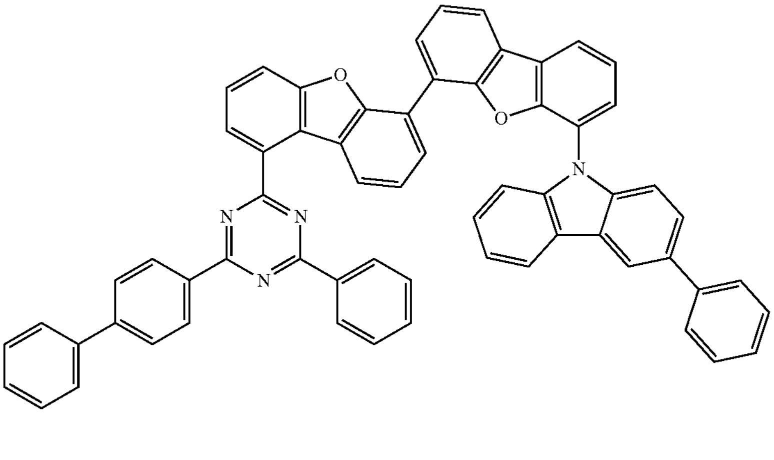 [SMILES: c1ccc(-c2ccc(-c3nc(-c4ccccc4)nc(-c4cccc5oc6c(-c7cccc8c7oc7c(-n9c%10ccccc%10c%10cc(-c%11ccccc%11)ccc%109)cccc78)cccc6c45)n3)cc2)cc1]

TABLE 1-continued
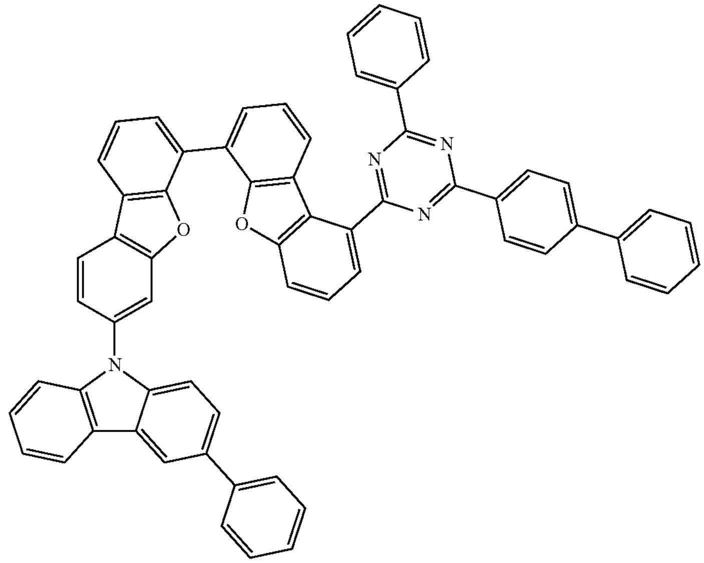 [SMILES: c1ccc(-c2ccc(-c3nc(-c4ccccc4)nc(-c4cccc5oc6c(-c7cccc8c7oc7cc(-n9c%10ccccc%10c%10cc(-c%11ccccc%11)ccc%109)ccc78)cccc6c45)n3)cc2)cc1]
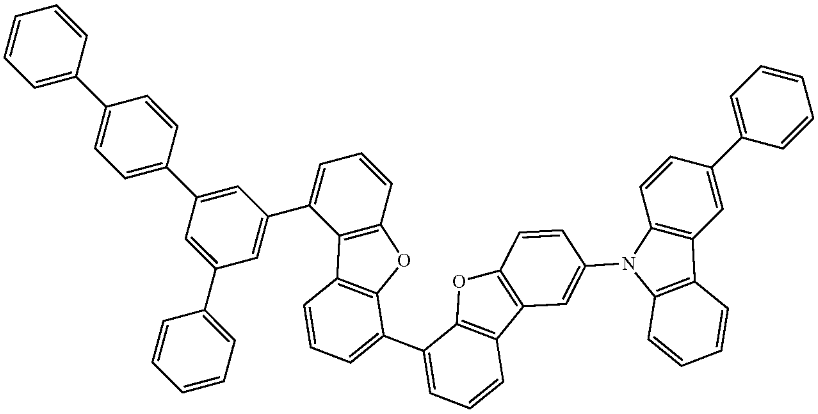 [SMILES: c1ccc(-c2ccc(-c3cc(-c4ccccc4)cc(-c4cccc5oc6c(-c7cccc8c7oc7ccc(-n9c%10ccccc%10c%10cc(-c%11ccccc%11)ccc%109)cc78)cccc6c45)c3)cc2)cc1]
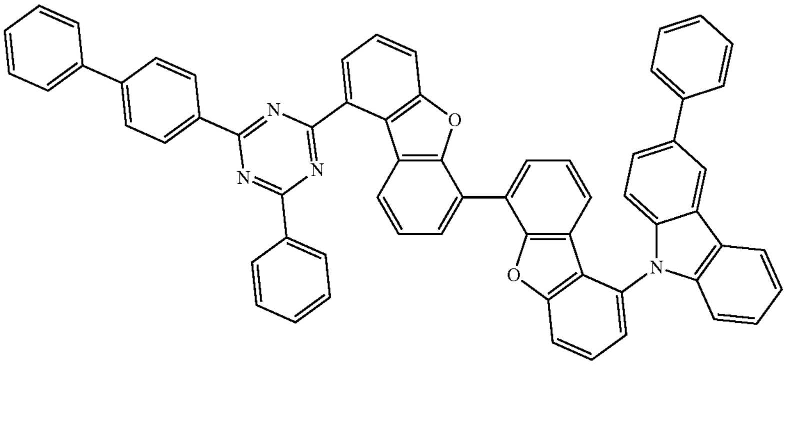 [SMILES: c1ccc(-c2ccc(-c3nc(-c4ccccc4)nc(-c4cccc5oc6c(-c7cccc8c7oc7cccc(-n9c%10ccccc%10c%10cc(-c%11ccccc%11)ccc%109)c78)cccc6c45)n3)cc2)cc1]

TABLE 1-continued
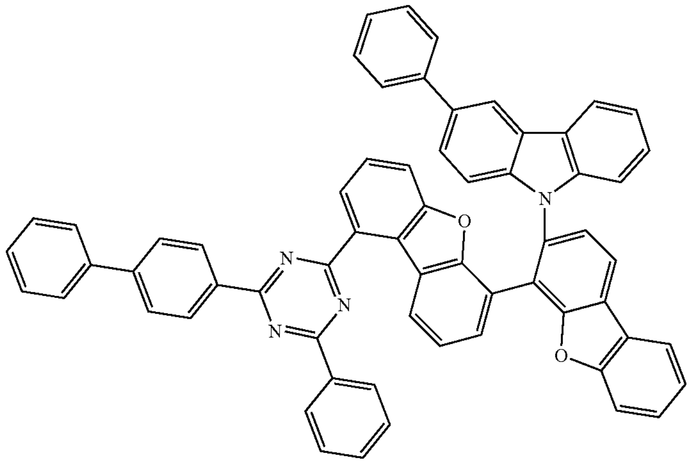 [SMILES: c1ccc(-c2ccc(-c3nc(-c4ccccc4)nc(-c4cccc5oc6c(-c7c(-n8c9ccccc9c9cc(-c%10ccccc%10)ccc98)ccc8c7oc7ccccc78)cccc6c45)n3)cc2)cc1]
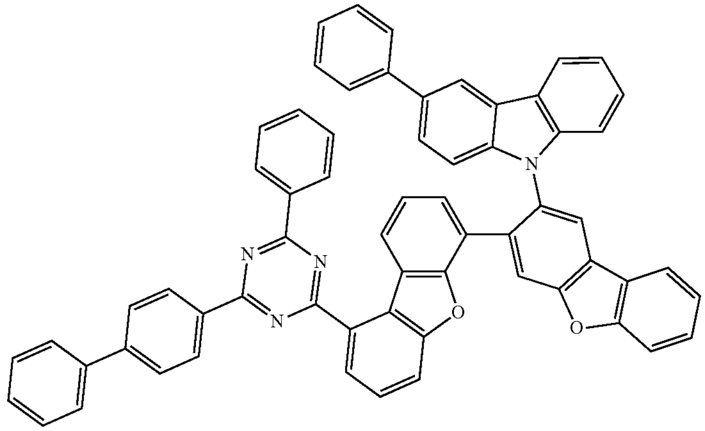 [SMILES: c1ccc(-c2ccc(-c3nc(-c4ccccc4)nc(-c4cccc5oc6c(-c7cc8oc9ccccc9c8cc7-n7c8ccccc8c8cc(-c9ccccc9)ccc87)cccc6c45)n3)cc2)cc1]
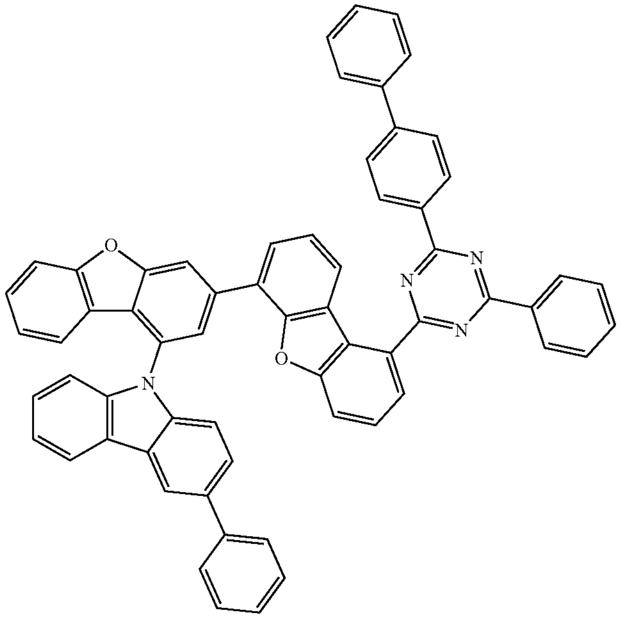 [SMILES: c1ccc(-c2ccc(-c3nc(-c4ccccc4)nc(-c4cccc5oc6c(-c7cc(-n8c9ccccc9c9cc(-c%10ccccc%10)ccc98)c8c(c7)oc7ccccc78)cccc6c45)n3)cc2)cc1]

TABLE 1-continued
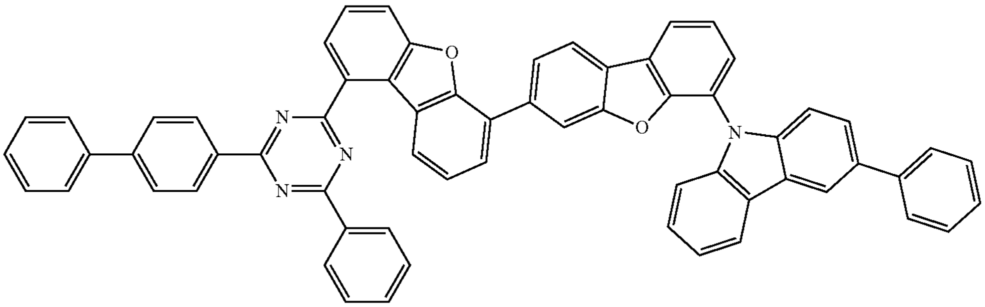 [SMILES: c1ccc(-c2ccc(-c3nc(-c4ccccc4)nc(-c4cccc5oc6c(-c7ccc8c(c7)oc7c(-n9c%10ccccc%10c%10cc(-c%11ccccc%11)ccc%109)cccc78)cccc6c45)n3)cc2)cc1]
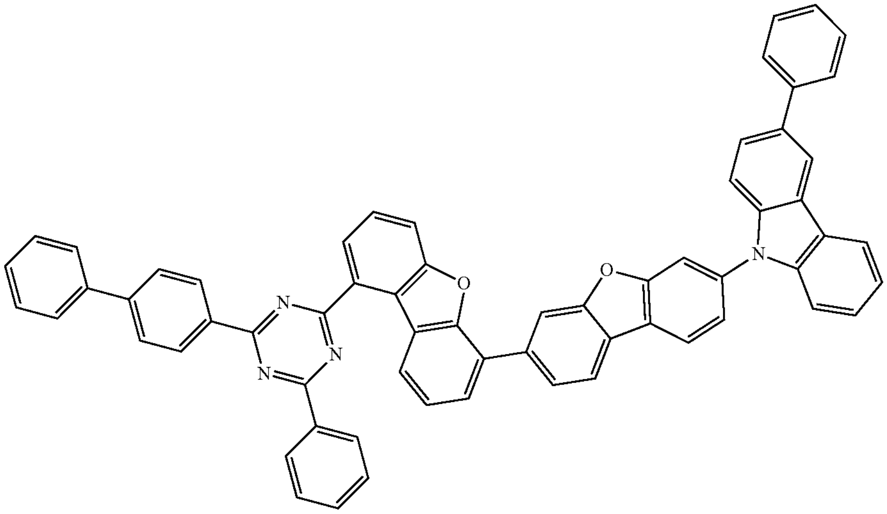 [SMILES: c1ccc(-c2ccc(-c3nc(-c4ccccc4)nc(-c4cccc5oc6c(-c7ccc8c(c7)oc7cc(-n9c%10ccccc%10c%10cc(-c%11ccccc%11)ccc%109)ccc78)cccc6c45)n3)cc2)cc1]
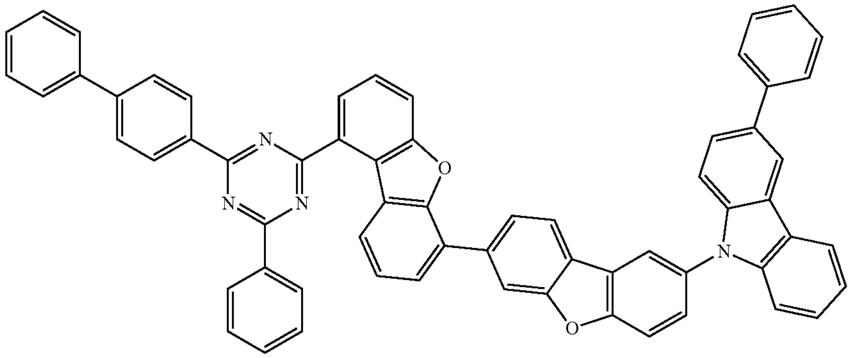 [SMILES: c1ccc(-c2ccc(-c3nc(-c4ccccc4)nc(-c4cccc5oc6c(-c7ccc8c(c7)oc7ccc(-n9c%10ccccc%10c%10cc(-c%11ccccc%11)ccc%109)cc78)cccc6c45)n3)cc2)cc1]
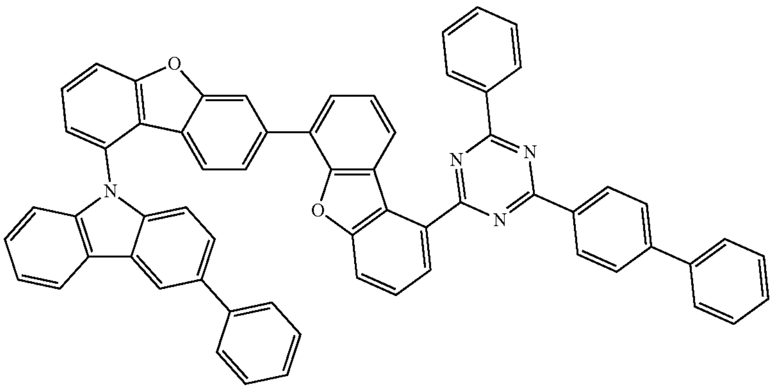 [SMILES: c1ccc(-c2ccc(-c3nc(-c4ccccc4)nc(-c4cccc5oc6c(-c7ccc8c(c7)oc7cccc(-n9c%10ccccc%10c%10cc(-c%11ccccc%11)ccc%109)c78)cccc6c45)n3)cc2)cc1]

TABLE 1-continued
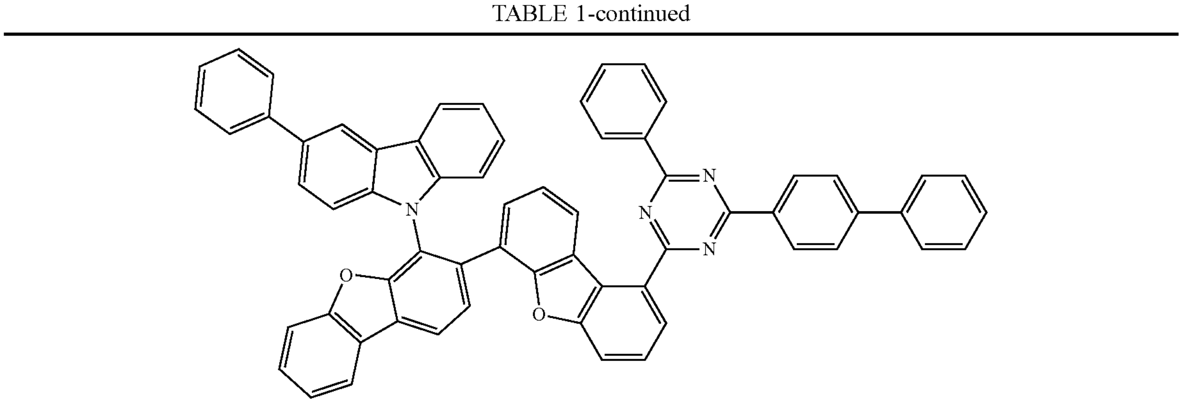
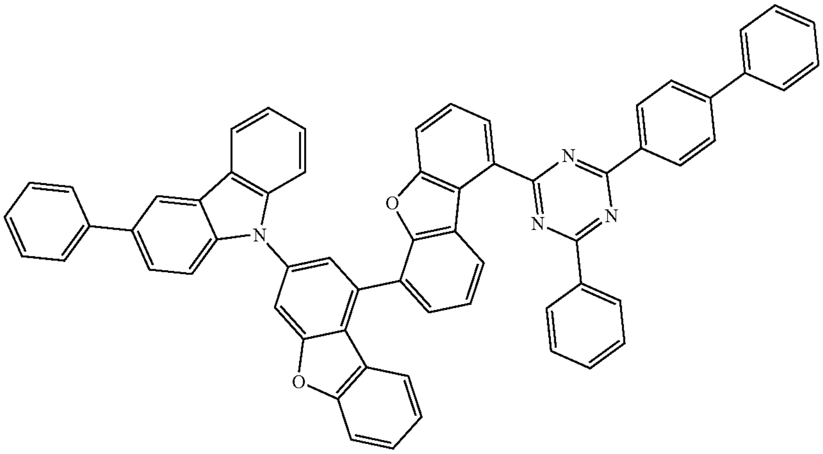 [SMILES: c1ccc(-c2ccc(-c3nc(-c4ccccc4)nc(-c4cccc5oc6c(-c7cc(-n8c9ccccc9c9cc(-c%10ccccc%10)ccc98)cc8oc9ccccc9c78)cccc6c45)n3)cc2)cc1]
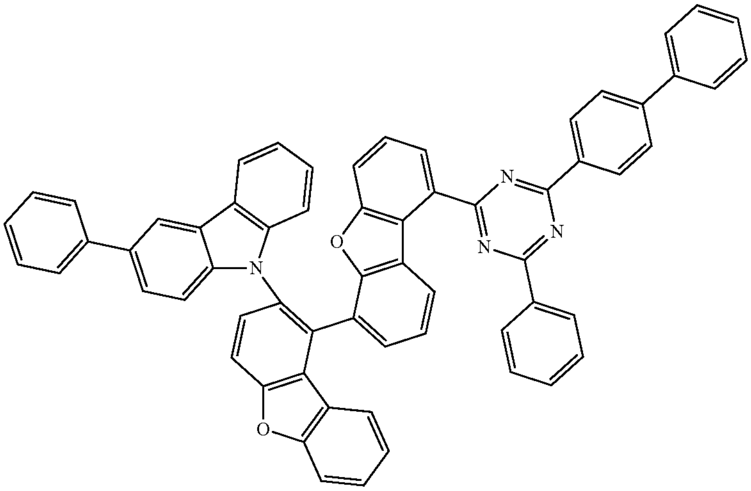 [SMILES: c1ccc(-c2ccc(-c3nc(-c4ccccc4)nc(-c4cccc5oc6c(-c7c(-n8c9ccccc9c9cc(-c%10ccccc%10)ccc98)ccc8oc9ccccc9c78)cccc6c45)n3)cc2)cc1]
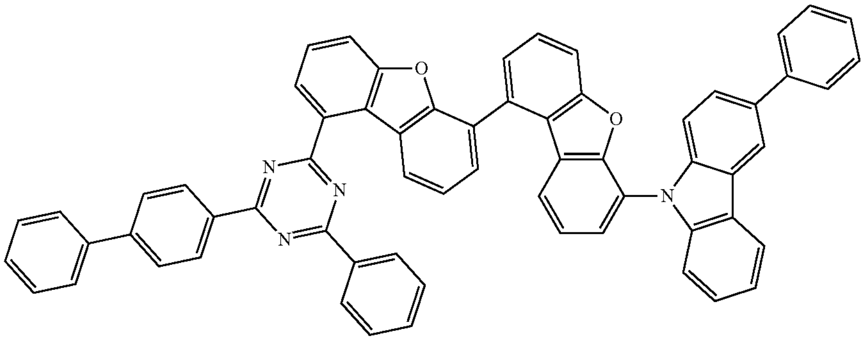 [SMILES: c1ccc(-c2ccc(-c3nc(-c4ccccc4)nc(-c4cccc5oc6c(-c7cccc8oc9c(-n%10c%11ccccc%11c%11cc(-c%12ccccc%12)ccc%11%10)cccc9c78)cccc6c45)n3)cc2)cc1]

TABLE 1-continued
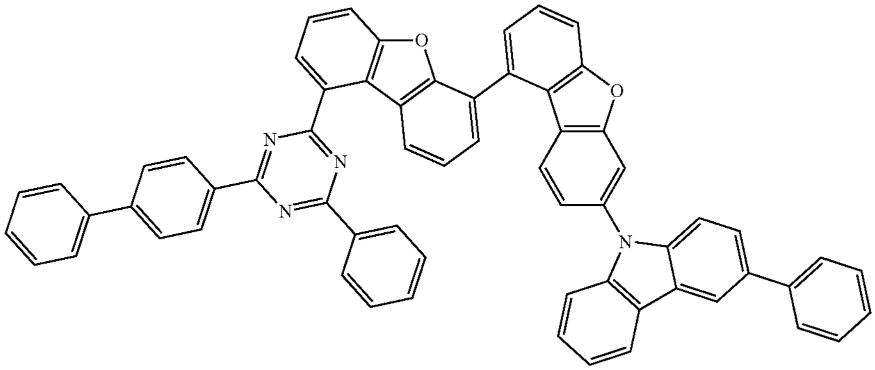 [SMILES: c1ccc(-c2ccc(-c3nc(-c4ccccc4)nc(-c4cccc5oc6c(-c7cccc8oc9cc(-n%10c%11ccccc%11c%11cc(-c%12ccccc%12)ccc%11%10)ccc9c78)cccc6c45)n3)cc2)cc1]
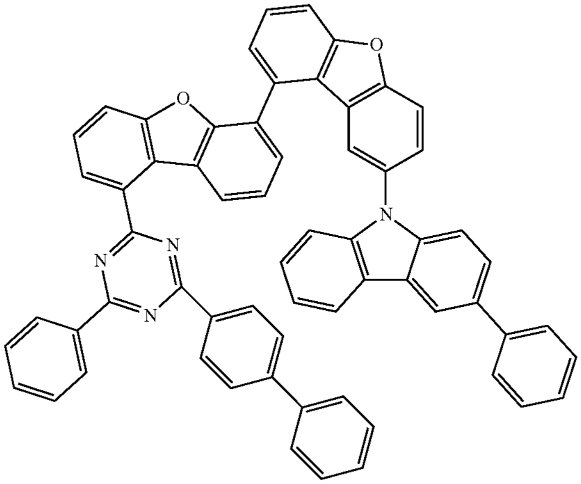 [SMILES: c1ccc(-c2ccc(-c3nc(-c4ccccc4)nc(-c4cccc5oc6c(-c7cccc8oc9ccc(-n%10c%11ccccc%11c%11cc(-c%12ccccc%12)ccc%11%10)cc9c78)cccc6c45)n3)cc2)cc1]
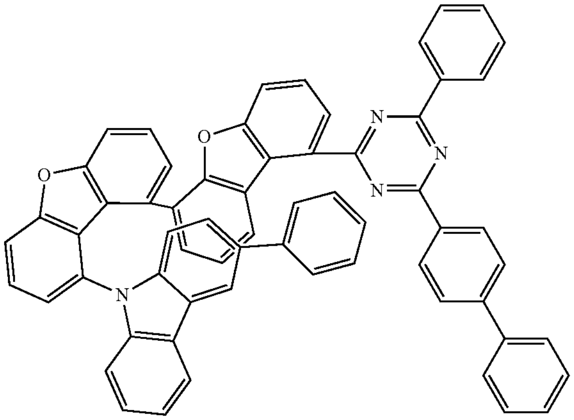 [SMILES: c1ccc(-c2ccc(-c3nc(-c4ccccc4)nc(-c4cccc5oc6c(-c7cccc8oc9cccc(-n%10c%11ccccc%11c%11cc(-c%12ccccc%12)ccc%11%10)c9c78)cccc6c45)n3)cc2)cc1]

TABLE 1-continued
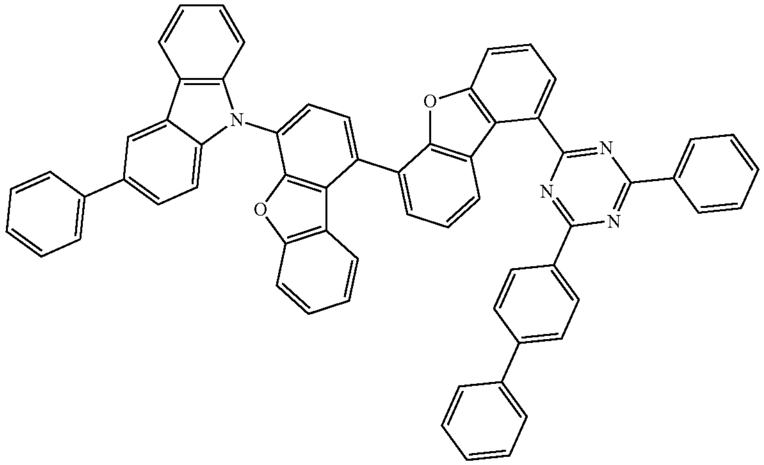 [SMILES: c1ccc(-c2ccc(-c3nc(-c4ccccc4)nc(-c4cccc5oc6c(-c7ccc(-n8c9ccccc9c9cc(-c%10ccccc%10)ccc98)c8oc9ccccc9c78)cccc6c45)n3)cc2)cc1]
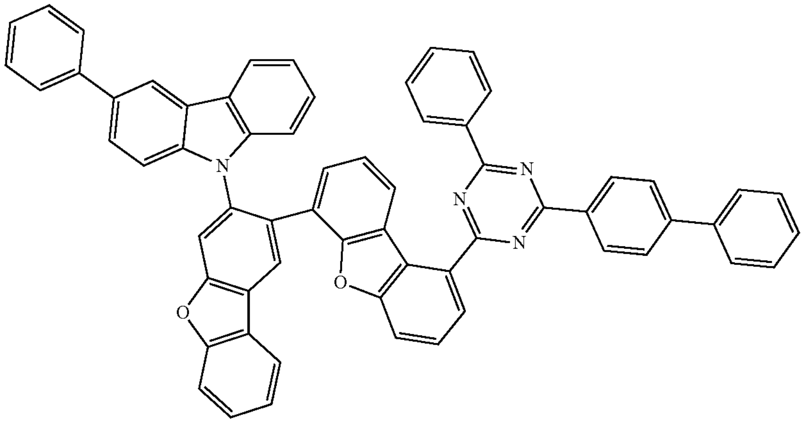 [SMILES: c1ccc(-c2ccc(-c3nc(-c4ccccc4)nc(-c4cccc5oc6c(-c7cc8c(cc7-n7c9ccccc9c9cc(-c%10ccccc%10)ccc97)oc7ccccc78)cccc6c45)n3)cc2)cc1]
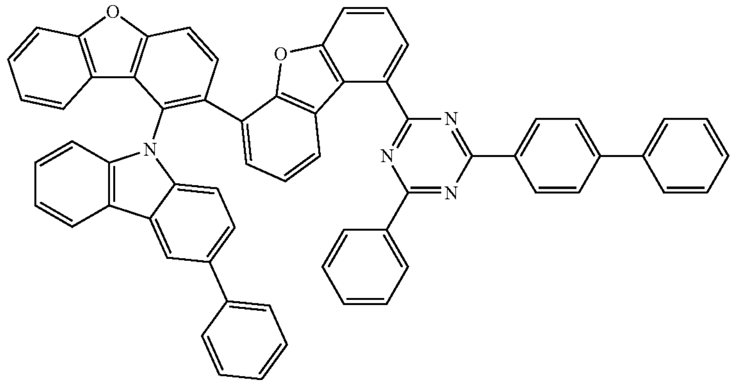 [SMILES: c1ccc(-c2ccc(-c3nc(-c4ccccc4)nc(-c4cccc5oc6c(-c7ccc8oc9ccccc9c8c7-n7c8ccccc8c8cc(-c9ccccc9)ccc87)cccc6c45)n3)cc2)cc1]

TABLE 1-continued
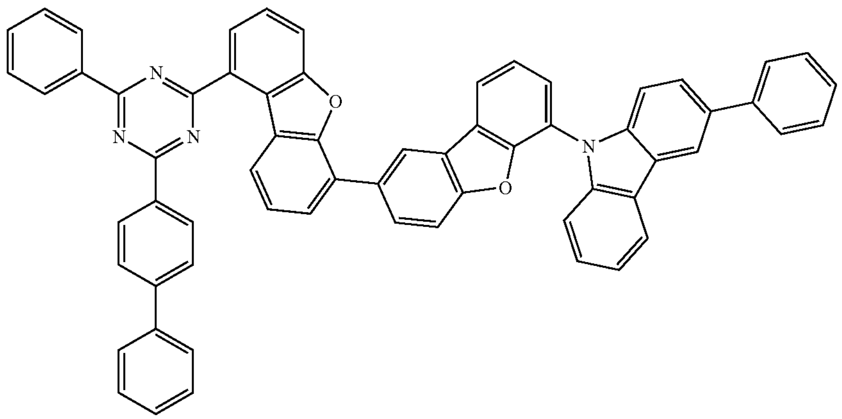 [SMILES: c1ccc(-c2ccc(-c3nc(-c4ccccc4)nc(-c4cccc5oc6c(-c7ccc8oc9c(-n%10c%11ccccc%11c%11cc(-c%12ccccc%12)ccc%11%10)cccc9c8c7)cccc6c45)n3)cc2)cc1]
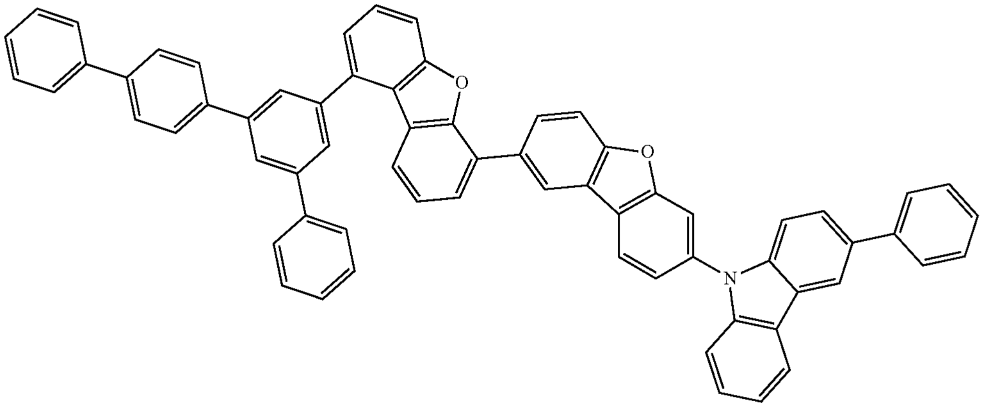 [SMILES: c1ccc(-c2ccc(-c3cc(-c4ccccc4)cc(-c4cccc5oc6c(-c7ccc8oc9cc(-n%10c%11ccccc%11c%11cc(-c%12ccccc%12)ccc%11%10)ccc9c8c7)cccc6c45)c3)cc2)cc1]
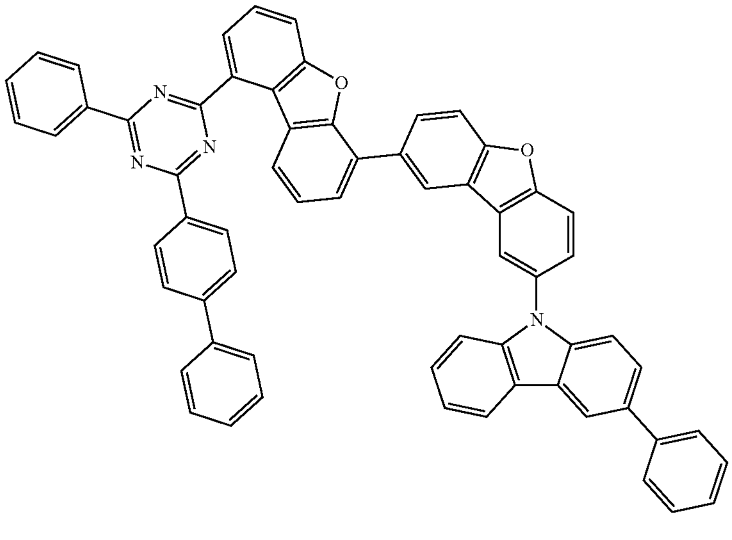 [SMILES: c1ccc(-c2ccc(-c3nc(-c4ccccc4)nc(-c4cccc5oc6c(-c7ccc8oc9ccc(-n%10c%11ccccc%11c%11cc(-c%12ccccc%12)ccc%11%10)cc9c8c7)cccc6c45)n3)cc2)cc1]

TABLE 1-continued
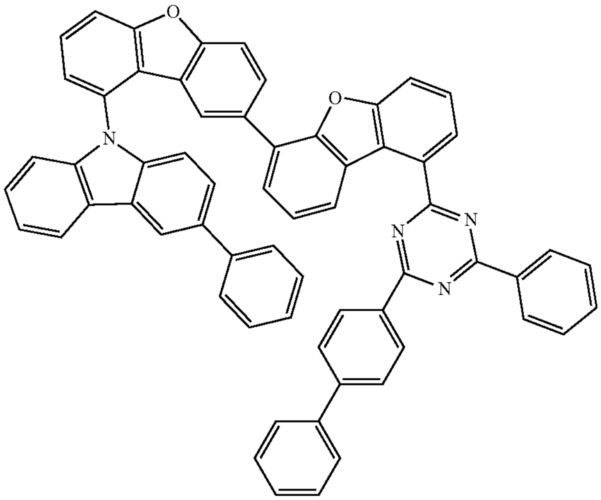 [SMILES: c1ccc(-c2ccc(-c3nc(-c4ccccc4)nc(-c4cccc5oc6c(-c7ccc8oc9cccc(-n%10c%11ccccc%11c%11cc(-c%12ccccc%12)ccc%11%10)c9c8c7)cccc6c45)n3)cc2)cc1]
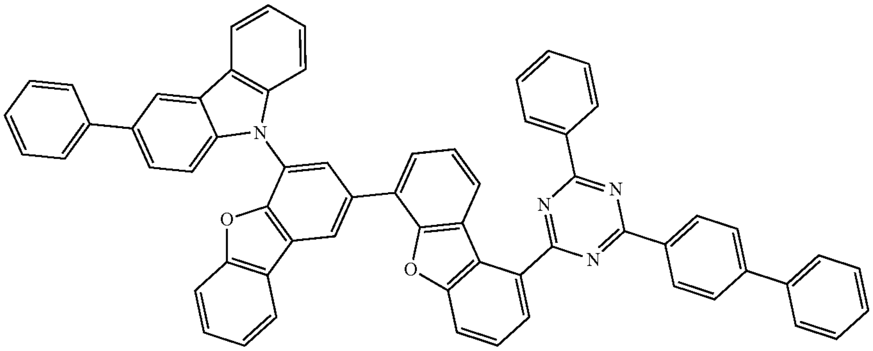 [SMILES: c1ccc(-c2ccc(-c3nc(-c4ccccc4)nc(-c4cccc5oc6c(-c7cc(-n8c9ccccc9c9cc(-c%10ccccc%10)ccc98)c8oc9ccccc9c8c7)cccc6c45)n3)cc2)cc1]
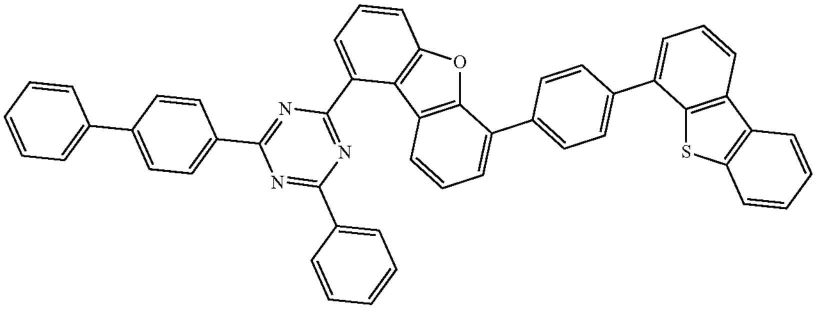 [SMILES: c1ccc(-c2ccc(-c3nc(-c4ccccc4)nc(-c4cccc5oc6c(-c7ccc(-c8cccc9c8sc8ccccc89)cc7)cccc6c45)n3)cc2)cc1]
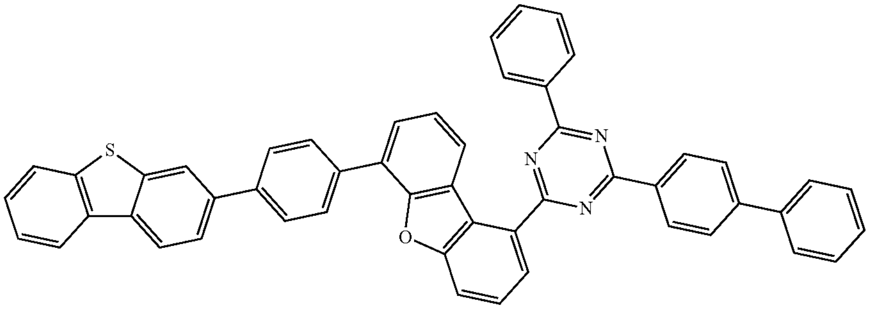 [SMILES: c1ccc(-c2ccc(-c3nc(-c4ccccc4)nc(-c4cccc5oc6c(-c7ccc(-c8ccc9c(c8)sc8ccccc89)cc7)cccc6c45)n3)cc2)cc1]

TABLE 1-continued
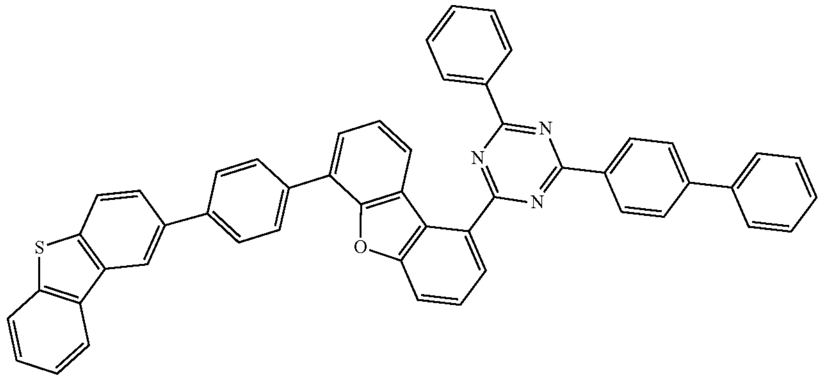 [SMILES: c1ccc(-c2ccc(-c3nc(-c4ccccc4)nc(-c4cccc5oc6c(-c7ccc(-c8ccc9sc%10ccccc%10c9c8)cc7)cccc6c45)n3)cc2)cc1]
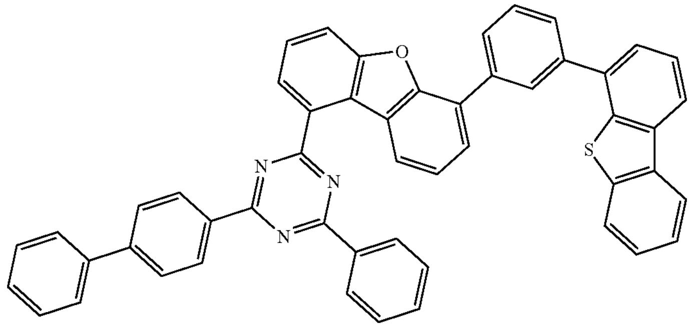 [SMILES: c1ccc(-c2ccc(-c3nc(-c4ccccc4)nc(-c4cccc5oc6c(-c7cccc(-c8cccc9c8sc8ccccc89)c7)cccc6c45)n3)cc2)cc1]
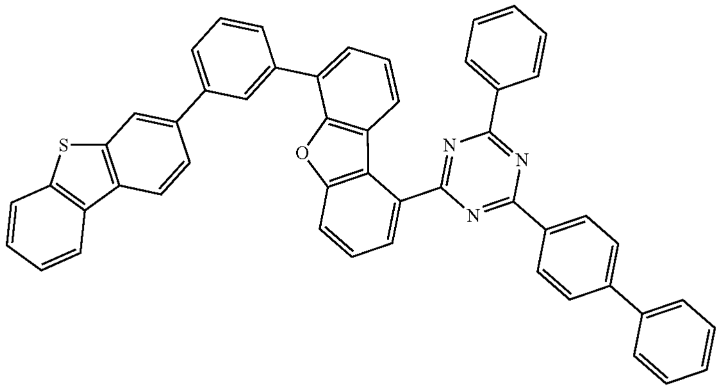 [SMILES: c1ccc(-c2ccc(-c3nc(-c4ccccc4)nc(-c4cccc5oc6c(-c7cccc(-c8ccc9c(c8)sc8ccccc89)c7)cccc6c45)n3)cc2)cc1]
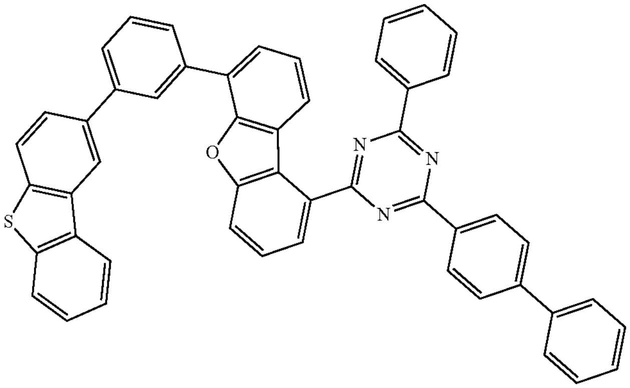 [SMILES: c1ccc(-c2ccc(-c3nc(-c4ccccc4)nc(-c4cccc5oc6c(-c7cccc(-c8ccc9sc%10ccccc%10c9c8)c7)cccc6c45)n3)cc2)cc1]

TABLE 1-continued
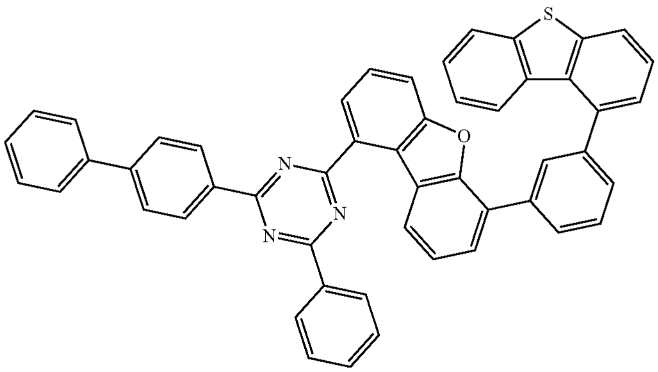 [SMILES: c1ccc(-c2ccc(-c3nc(-c4ccccc4)nc(-c4cccc5oc6c(-c7cccc(-c8cccc9sc%10ccccc%10c89)c7)cccc6c45)n3)cc2)cc1]
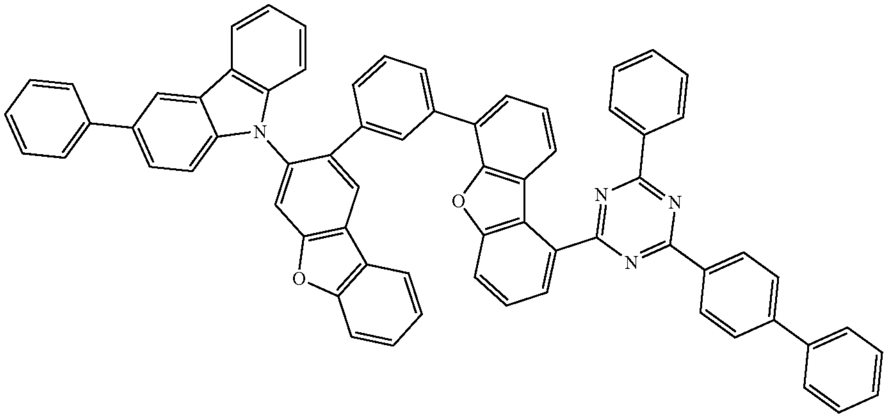 [SMILES: c1ccc(-c2ccc(-c3nc(-c4ccccc4)nc(-c4cccc5oc6c(-c7cccc(-c8cc9c(cc8-n8c%10ccccc%10c%10cc(-c%11ccccc%11)ccc%108)oc8ccccc89)c7)cccc6c45)n3)cc2)cc1]
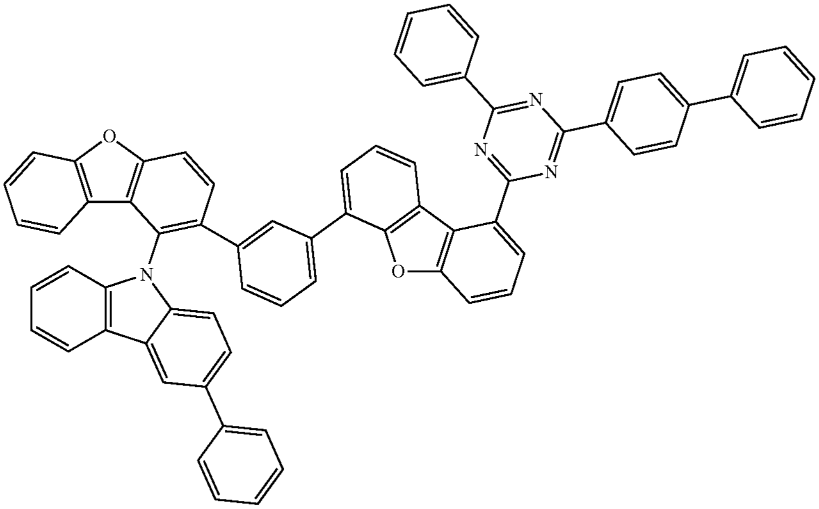 [SMILES: c1ccc(-c2ccc(-c3nc(-c4ccccc4)nc(-c4cccc5oc6c(-c7cccc(-c8ccc9oc%10ccccc%10c9c8-n8c9ccccc9c9cc(-c%10ccccc%10)ccc98)c7)cccc6c45)n3)cc2)cc1]
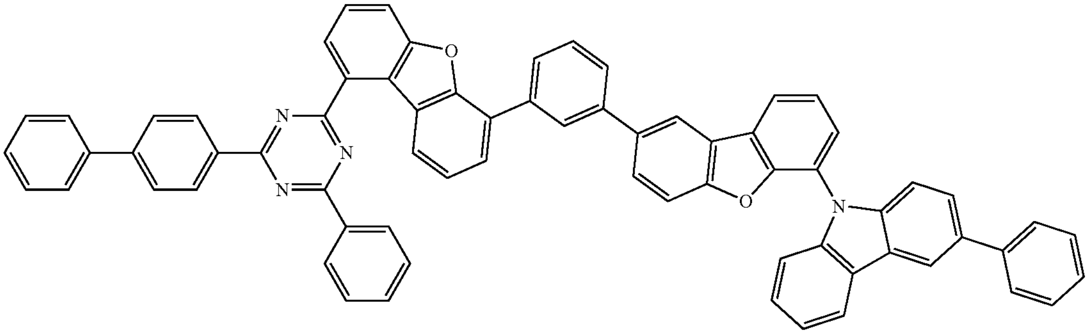 [SMILES: c1ccc(-c2ccc(-c3nc(-c4ccccc4)nc(-c4cccc5oc6c(-c7cccc(-c8ccc9oc%10c(-n%11c%12ccccc%12c%12cc(-c%13ccccc%13)ccc%12%11)cccc%10c9c8)c7)cccc6c45)n3)cc2)cc1]

TABLE 1-continued
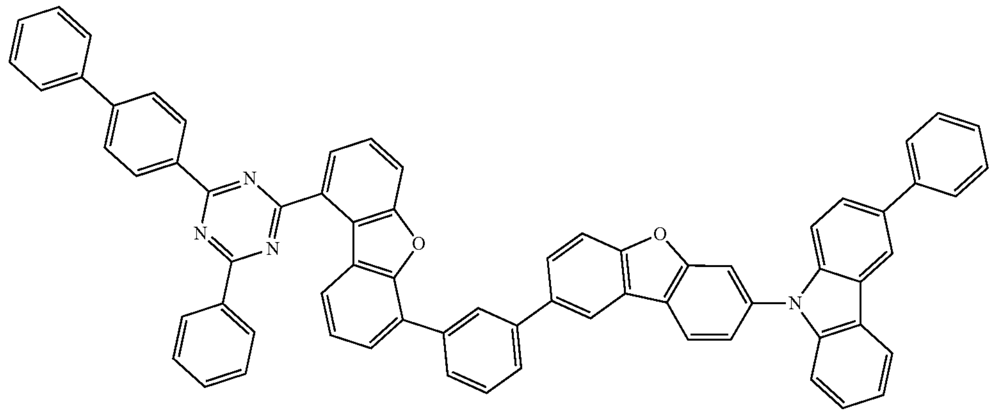 [SMILES: c1ccc(-c2ccc(-c3nc(-c4ccccc4)nc(-c4cccc5oc6c(-c7cccc(-c8ccc9oc%10cc(-n%11c%12ccccc%12c%12cc(-c%13ccccc%13)ccc%12%11)ccc%10c9c8)c7)cccc6c45)n3)cc2)cc1]
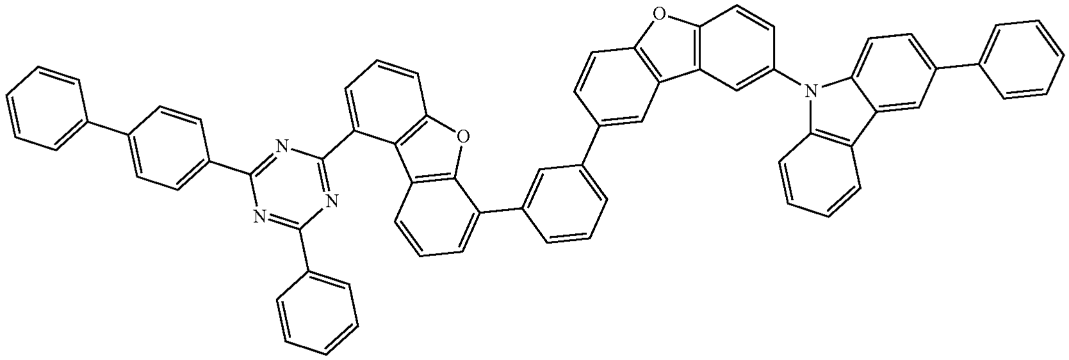 [SMILES: c1ccc(-c2ccc(-c3nc(-c4ccccc4)nc(-c4cccc5oc6c(-c7cccc(-c8ccc9oc%10ccc(-n%11c%12ccccc%12c%12cc(-c%13ccccc%13)ccc%12%11)cc%10c9c8)c7)cccc6c45)n3)cc2)cc1]
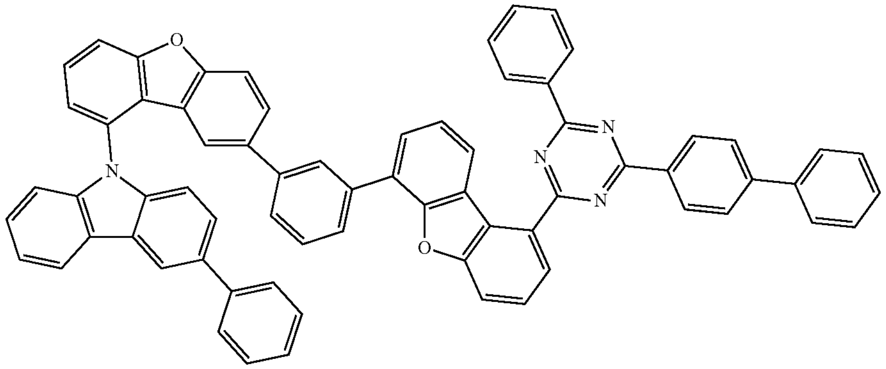 [SMILES: c1ccc(-c2ccc(-c3nc(-c4ccccc4)nc(-c4cccc5oc6c(-c7cccc(-c8ccc9oc%10cccc(-n%11c%12ccccc%12c%12cc(-c%13ccccc%13)ccc%12%11)c%10c9c8)c7)cccc6c45)n3)cc2)cc1]
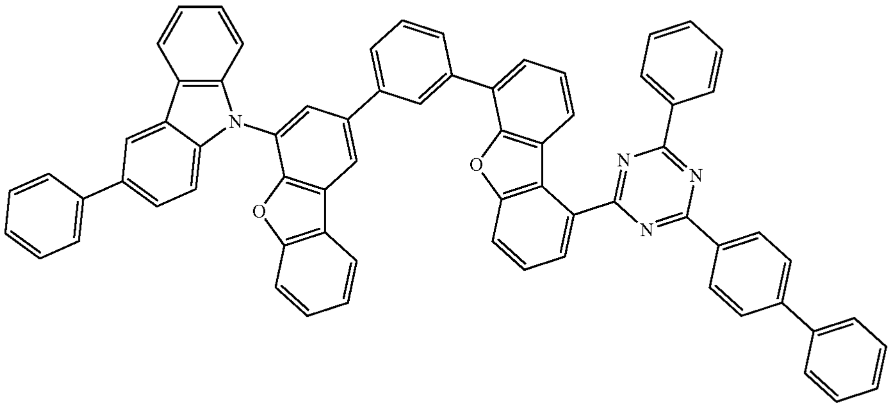 [SMILES: c1ccc(-c2ccc(-c3nc(-c4ccccc4)nc(-c4cccc5oc6c(-c7cccc(-c8cc(-n9c%10ccccc%10c%10cc(-c%11ccccc%11)ccc%109)c9oc%10ccccc%10c9c8)c7)cccc6c45)n3)cc2)cc1]

TABLE 1-continued
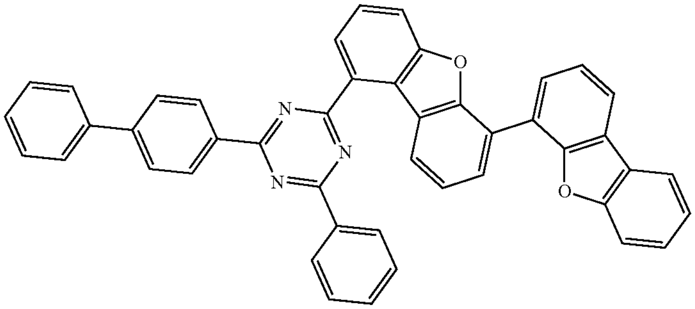 [SMILES: c1ccc(-c2ccc(-c3nc(-c4ccccc4)nc(-c4cccc5oc6c(-c7cccc8c7oc7ccccc78)cccc6c45)n3)cc2)cc1]
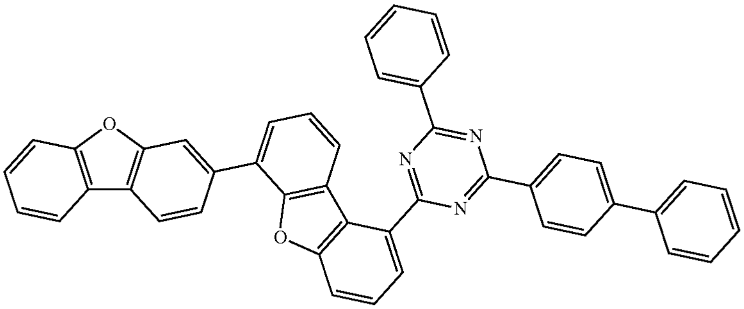 [SMILES: c1ccc(-c2ccc(-c3nc(-c4ccccc4)nc(-c4cccc5oc6c(-c7ccc8c(c7)oc7ccccc78)cccc6c45)n3)cc2)cc1]
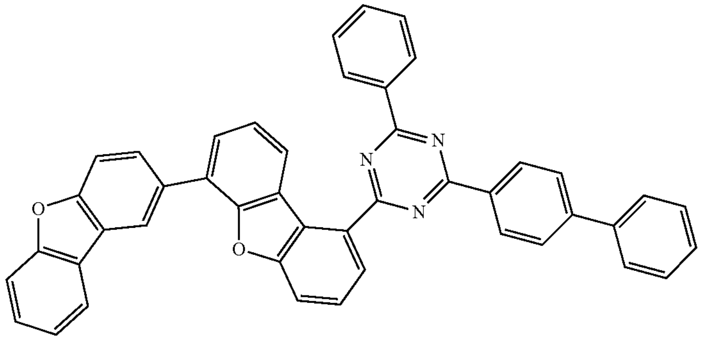 [SMILES: c1ccc(-c2ccc(-c3nc(-c4ccccc4)nc(-c4cccc5oc6c(-c7ccc8oc9ccccc9c8c7)cccc6c45)n3)cc2)cc1]
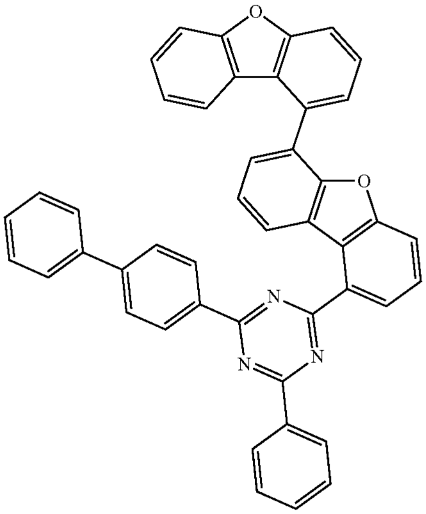 [SMILES: c1ccc(-c2ccc(-c3nc(-c4ccccc4)nc(-c4cccc5oc6c(-c7cccc8oc9ccccc9c78)cccc6c45)n3)cc2)cc1]

TABLE 1-continued
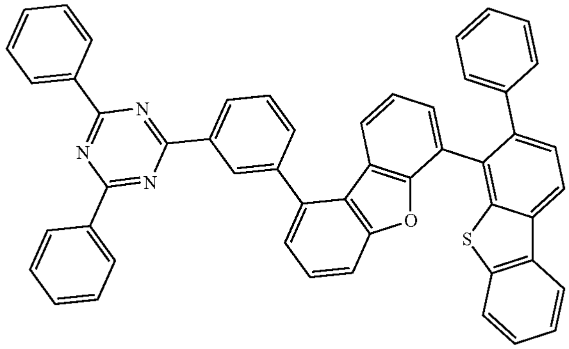 [SMILES: c1ccc(-c2nc(-c3ccccc3)nc(-c3cccc(-c4cccc5oc6c(-c7c(-c8ccccc8)ccc8c7sc7ccccc78)cccc6c45)c3)n2)cc1]
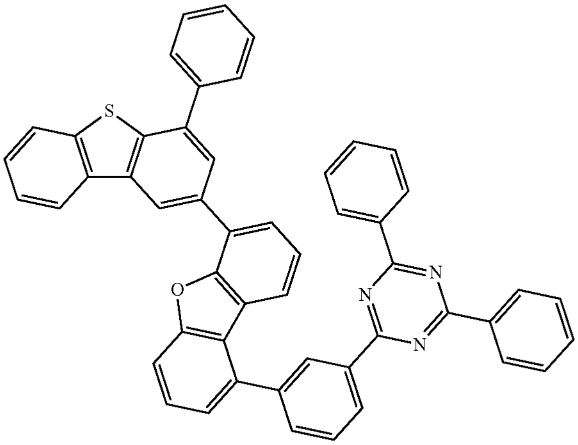 [SMILES: c1ccc(-c2nc(-c3ccccc3)nc(-c3cccc(-c4cccc5oc6c(-c7cc(-c8ccccc8)c8sc9ccccc9c8c7)cccc6c45)c3)n2)cc1]
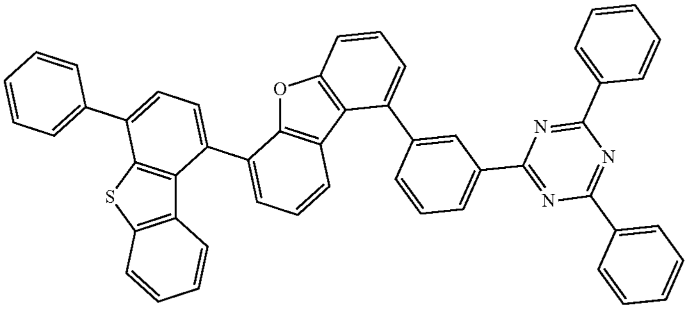 [SMILES: c1ccc(-c2nc(-c3ccccc3)nc(-c3cccc(-c4cccc5oc6c(-c7ccc(-c8ccccc8)c8sc9ccccc9c78)cccc6c45)c3)n2)cc1]
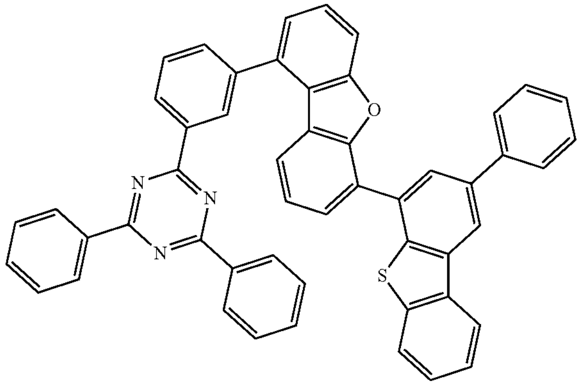 [SMILES: c1ccc(-c2cc(-c3cccc4c3oc3cccc(-c5cccc(-c6nc(-c7ccccc7)nc(-c7ccccc7)n6)c5)c34)c3sc4ccccc4c3c2)cc1]

TABLE 1-continued
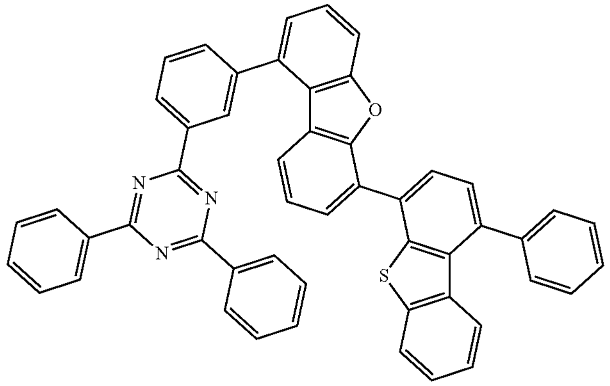 [SMILES: c1ccc(-c2nc(-c3ccccc3)nc(-c3cccc(-c4cccc5oc6c(-c7ccc(-c8ccccc8)c8c7sc7ccccc78)cccc6c45)c3)n2)cc1]
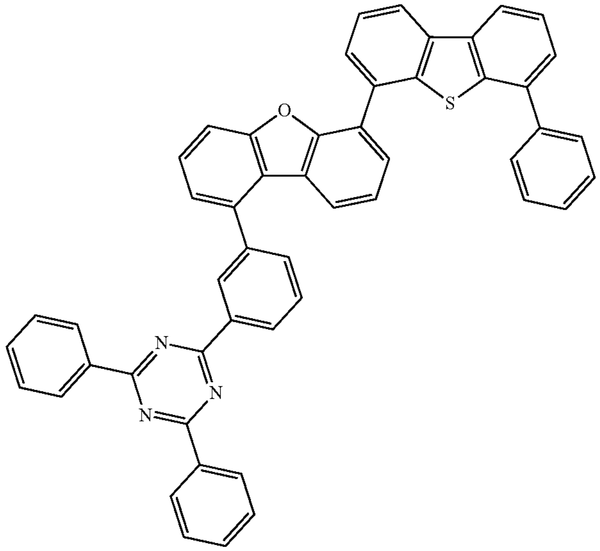 [SMILES: c1ccc(-c2nc(-c3ccccc3)nc(-c3cccc(-c4cccc5oc6c(-c7cccc8c7sc7c(-c9ccccc9)cccc78)cccc6c45)c3)n2)cc1]
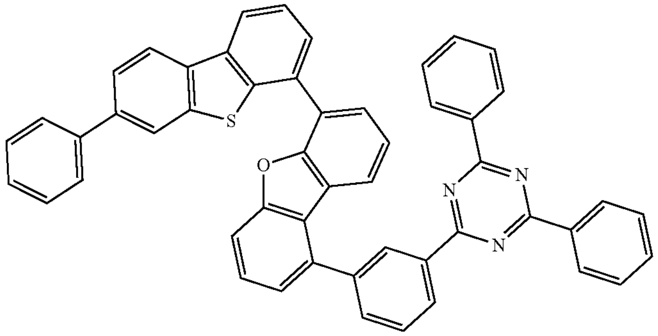 [SMILES: c1ccc(-c2ccc3c(c2)sc2c(-c4cccc5c4oc4cccc(-c6cccc(-c7nc(-c8ccccc8)nc(-c8ccccc8)n7)c6)c45)cccc23)cc1]
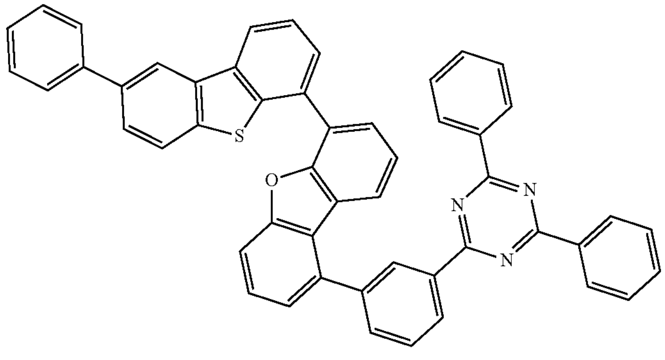 [SMILES: c1ccc(-c2ccc3sc4c(-c5cccc6c5oc5cccc(-c7cccc(-c8nc(-c9ccccc9)nc(-c9ccccc9)n8)c7)c56)cccc4c3c2)cc1]

TABLE 1-continued
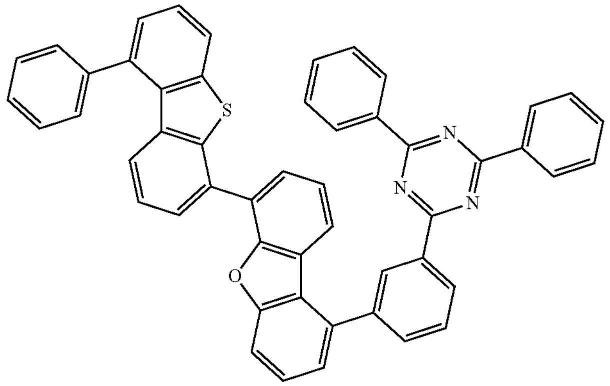
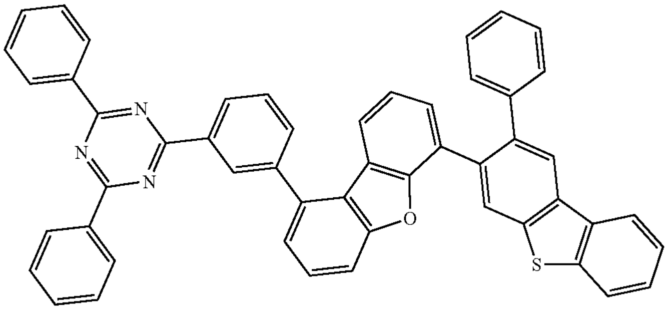 [SMILES: c1ccc(-c2nc(-c3ccccc3)nc(-c3cccc(-c4cccc5oc6c(-c7cc8sc9ccccc9c8cc7-c7ccccc7)cccc6c45)c3)n2)cc1]
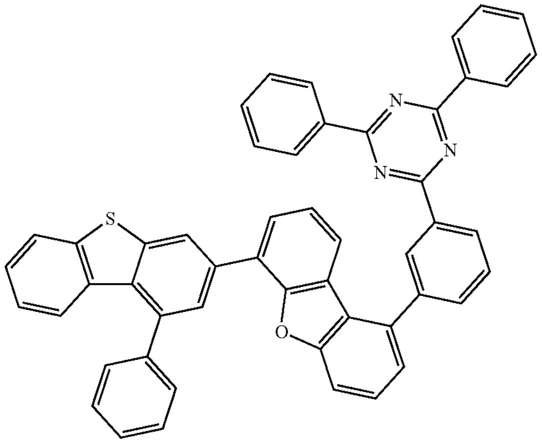 [SMILES: c1ccc(-c2nc(-c3ccccc3)nc(-c3cccc(-c4cccc5oc6c(-c7cc(-c8ccccc8)c8c(c7)sc7ccccc78)cccc6c45)c3)n2)cc1]
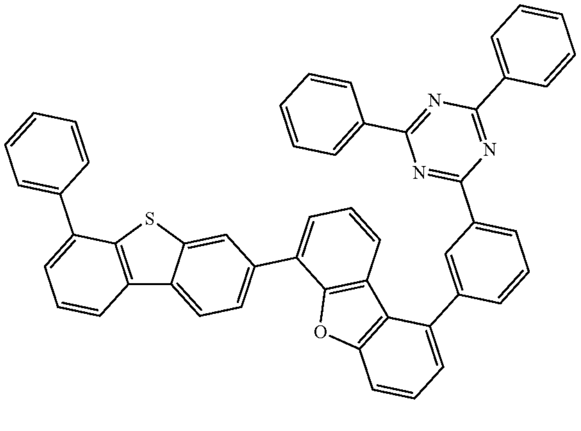 [SMILES: c1ccc(-c2nc(-c3ccccc3)nc(-c3cccc(-c4cccc5oc6c(-c7ccc8c(c7)sc7c(-c9ccccc9)cccc78)cccc6c45)c3)n2)cc1]

TABLE 1-continued
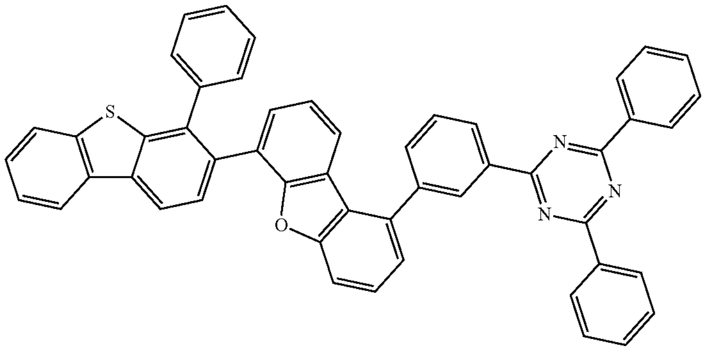 [SMILES: c1ccc(-c2nc(-c3ccccc3)nc(-c3cccc(-c4cccc5oc6c(-c7ccc8c(sc9ccccc98)c7-c7ccccc7)cccc6c45)c3)n2)cc1]
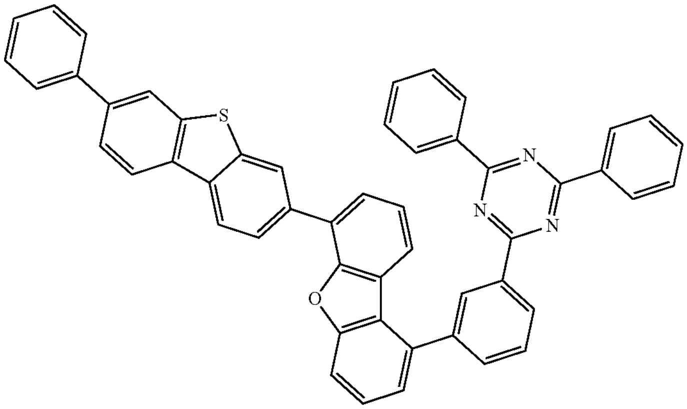 [SMILES: c1ccc(-c2ccc3c(c2)sc2cc(-c4cccc5c4oc4cccc(-c6cccc(-c7nc(-c8ccccc8)nc(-c8ccccc8)n7)c6)c45)ccc23)cc1]
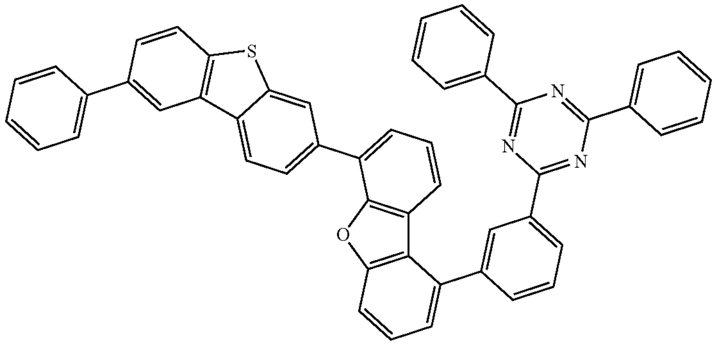 [SMILES: c1ccc(-c2ccc3sc4cc(-c5cccc6c5oc5cccc(-c7cccc(-c8nc(-c9ccccc9)nc(-c9ccccc9)n8)c7)c56)ccc4c3c2)cc1]
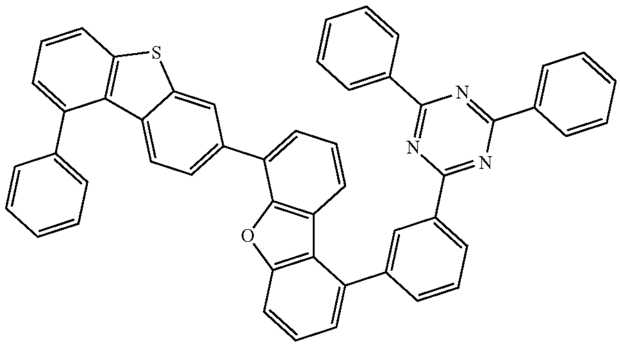 [SMILES: c1ccc(-c2nc(-c3ccccc3)nc(-c3cccc(-c4cccc5oc6c(-c7ccc8c(c7)sc7cccc(-c9ccccc9)c78)cccc6c45)c3)n2)cc1]

TABLE 1-continued
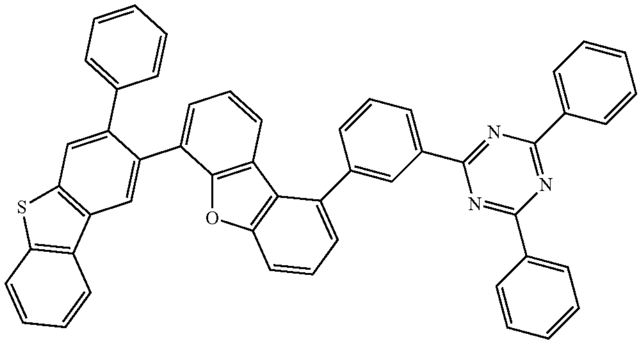 [SMILES: c1ccc(-c2nc(-c3ccccc3)nc(-c3cccc(-c4cccc5oc6c(-c7cc8c(cc7-c7ccccc7)sc7ccccc78)cccc6c45)c3)n2)cc1]
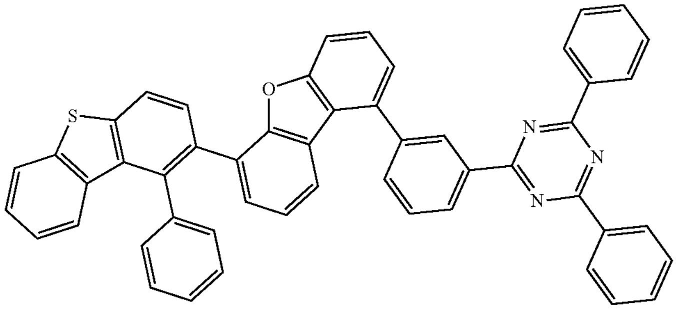 [SMILES: c1ccc(-c2nc(-c3ccccc3)nc(-c3cccc(-c4cccc5oc6c(-c7ccc8sc9ccccc9c8c7-c7ccccc7)cccc6c45)c3)n2)cc1]
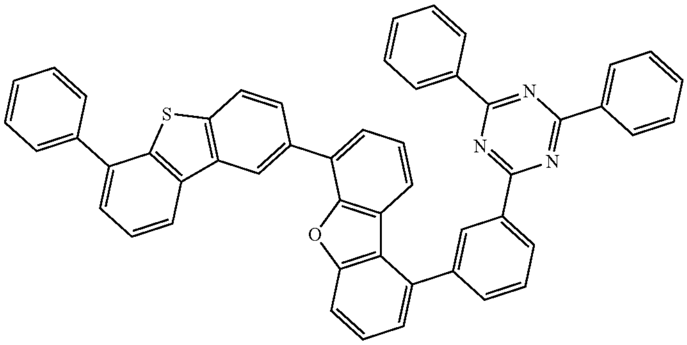 [SMILES: c1ccc(-c2nc(-c3ccccc3)nc(-c3cccc(-c4cccc5oc6c(-c7ccc8sc9c(-c%10ccccc%10)cccc9c8c7)cccc6c45)c3)n2)cc1]
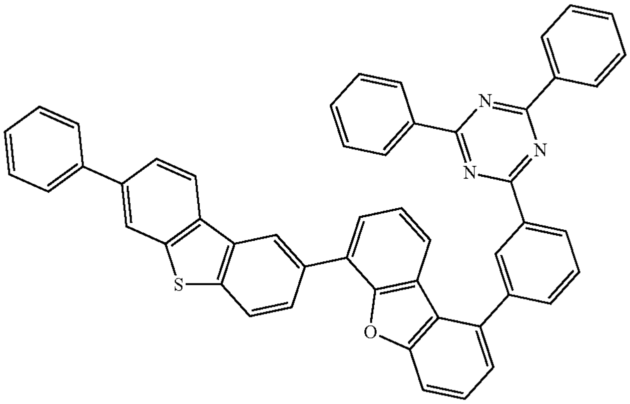 [SMILES: c1ccc(-c2ccc3c(c2)sc2ccc(-c4cccc5c4oc4cccc(-c6cccc(-c7nc(-c8ccccc8)nc(-c8ccccc8)n7)c6)c45)cc23)cc1]

TABLE 1-continued
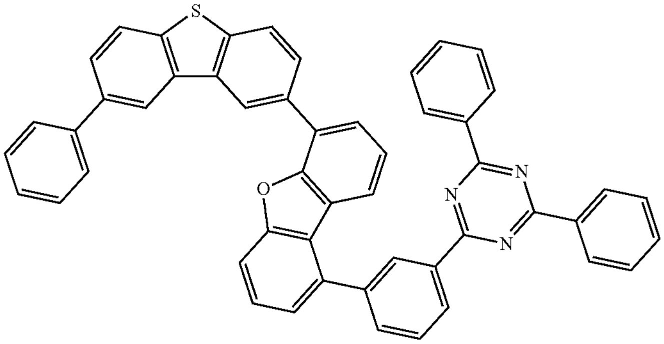 [SMILES: c1ccc(-c2ccc3sc4ccc(-c5cccc6c5oc5cccc(-c7cccc(-c8nc(-c9ccccc9)nc(-c9ccccc9)n8)c7)c56)cc4c3c2)cc1]
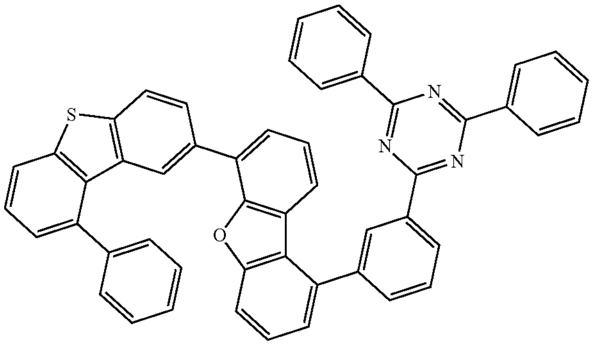 [SMILES: c1ccc(-c2nc(-c3ccccc3)nc(-c3cccc(-c4cccc5oc6c(-c7ccc8sc9cccc(-c%10ccccc%10)c9c8c7)cccc6c45)c3)n2)cc1]
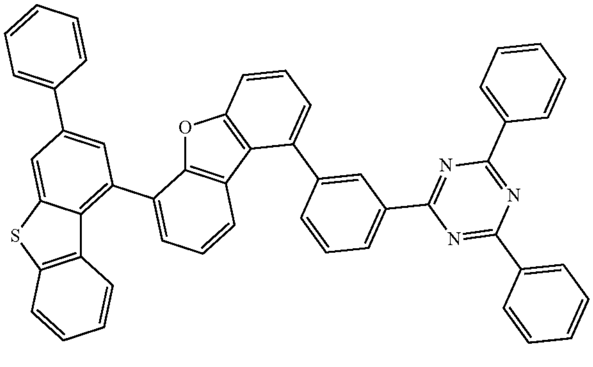 [SMILES: c1ccc(-c2cc(-c3cccc4c3oc3cccc(-c5cccc(-c6nc(-c7ccccc7)nc(-c7ccccc7)n6)c5)c34)c3c(c2)sc2ccccc23)cc1]
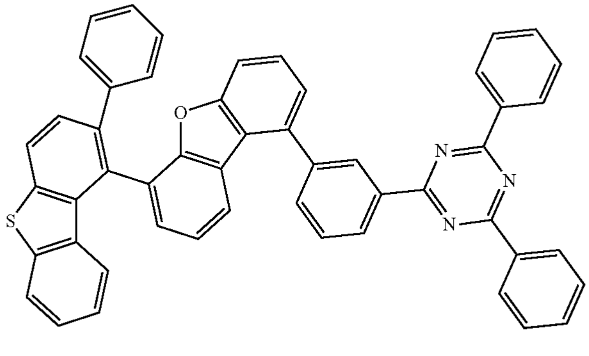 [SMILES: c1ccc(-c2nc(-c3ccccc3)nc(-c3cccc(-c4cccc5oc6c(-c7c(-c8ccccc8)ccc8sc9ccccc9c78)cccc6c45)c3)n2)cc1]

TABLE 1-continued
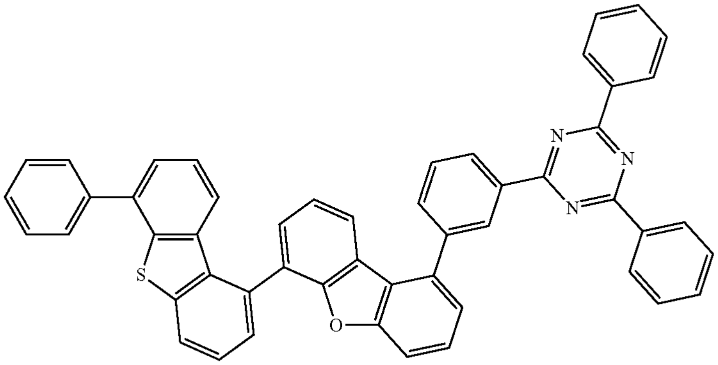 [SMILES: c1ccc(-c2nc(-c3ccccc3)nc(-c3cccc(-c4cccc5oc6c(-c7cccc8sc9c(-c%10ccccc%10)cccc9c78)cccc6c45)c3)n2)cc1]
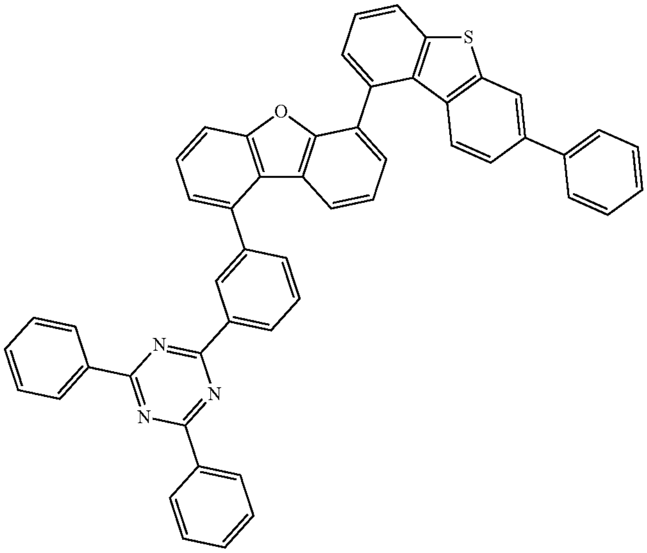 [SMILES: c1ccc(-c2ccc3c(c2)sc2cccc(-c4cccc5c4oc4cccc(-c6cccc(-c7nc(-c8ccccc8)nc(-c8ccccc8)n7)c6)c45)c23)cc1]
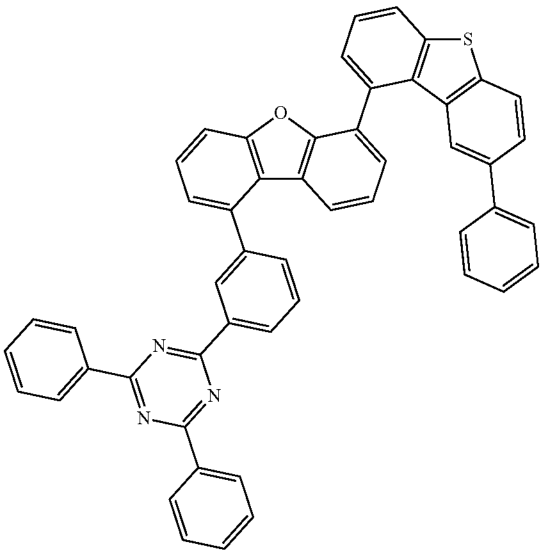 [SMILES: c1ccc(-c2ccc3sc4cccc(-c5cccc6c5oc5cccc(-c7cccc(-c8nc(-c9ccccc9)nc(-c9ccccc9)n8)c7)c56)c4c3c2)cc1]

TABLE 1-continued
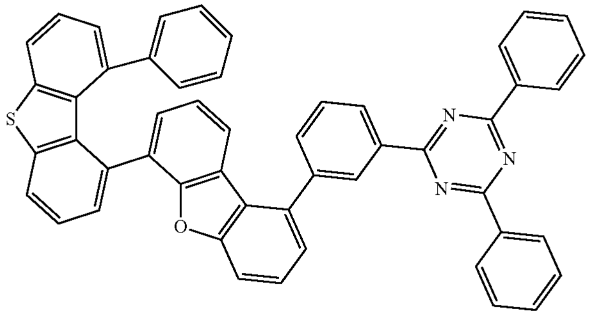 [SMILES: c1ccc(-c2nc(-c3ccccc3)nc(-c3cccc(-c4cccc5oc6c(-c7cccc8sc9cccc(-c%10ccccc%10)c9c78)cccc6c45)c3)n2)cc1]
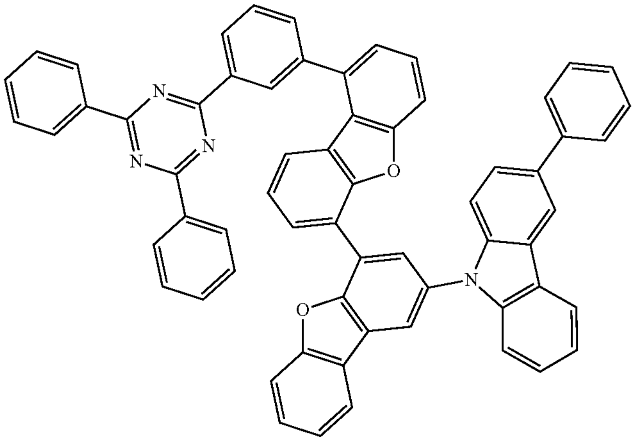 [SMILES: c1ccc(-c2ccc3c(c2)c2ccccc2n3-c2cc(-c3cccc4c3oc3cccc(-c5cccc(-c6nc(-c7ccccc7)nc(-c7ccccc7)n6)c5)c34)c3oc4ccccc4c3c2)cc1]
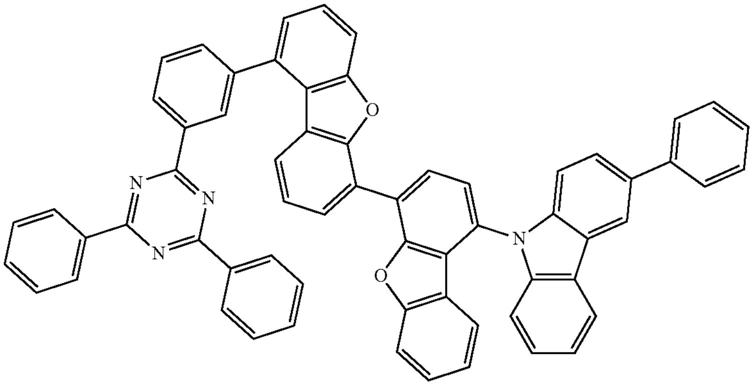 [SMILES: c1ccc(-c2ccc3c(c2)c2ccccc2n3-c2ccc(-c3cccc4c3oc3cccc(-c5cccc(-c6nc(-c7ccccc7)nc(-c7ccccc7)n6)c5)c34)c3oc4ccccc4c23)cc1]
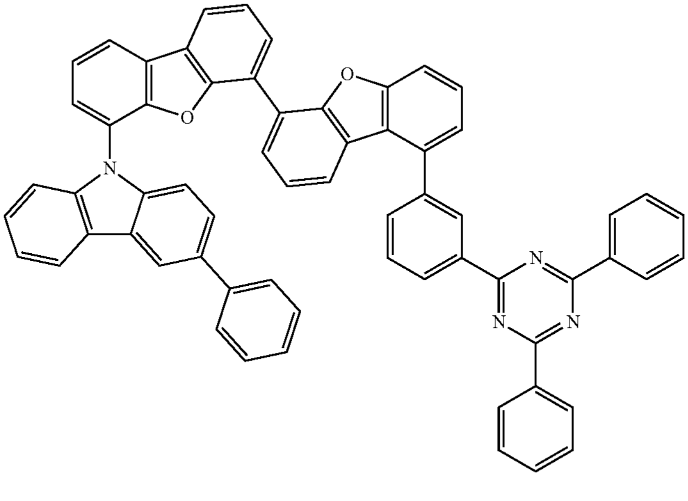 [SMILES: c1ccc(-c2ccc3c(c2)c2ccccc2n3-c2cccc3c2oc2c(-c4cccc5c4oc4cccc(-c6cccc(-c7nc(-c8ccccc8)nc(-c8ccccc8)n7)c6)c45)cccc23)cc1]

TABLE 1-continued
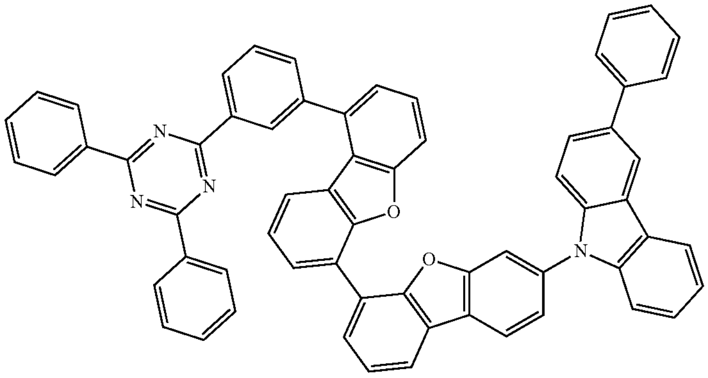 [SMILES: c1ccc(-c2ccc3c(c2)c2ccccc2n3-c2ccc3c(c2)oc2c(-c4cccc5c4oc4cccc(-c6cccc(-c7nc(-c8ccccc8)nc(-c8ccccc8)n7)c6)c45)cccc23)cc1]
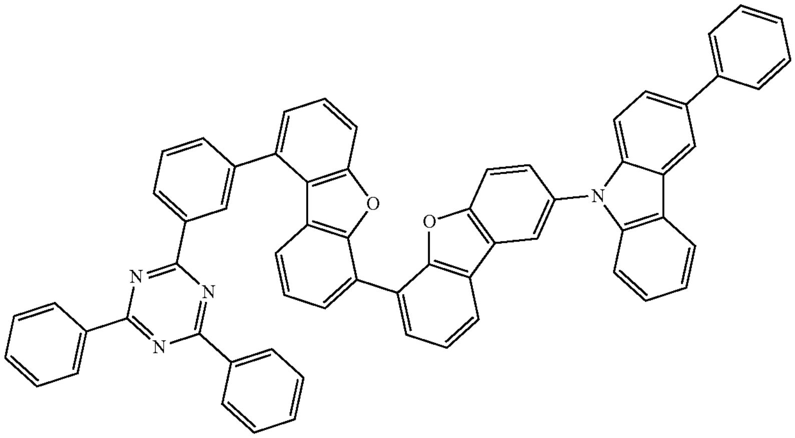 [SMILES: c1ccc(-c2ccc3c(c2)c2ccccc2n3-c2ccc3oc4c(-c5cccc6c5oc5cccc(-c7cccc(-c8nc(-c9ccccc9)nc(-c9ccccc9)n8)c7)c56)cccc4c3c2)cc1]
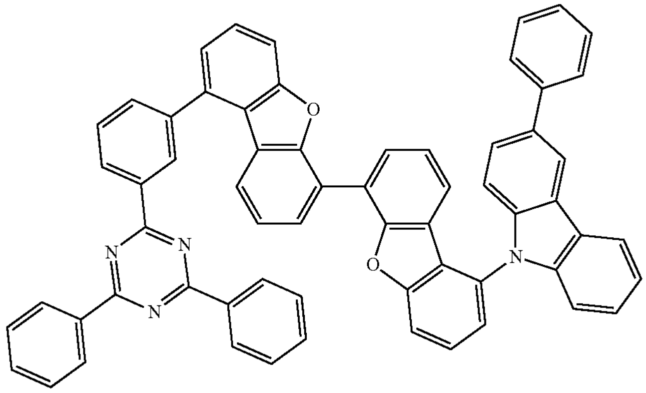 [SMILES: c1ccc(-c2ccc3c(c2)c2ccccc2n3-c2cccc3oc4c(-c5cccc6c5oc5cccc(-c7cccc(-c8nc(-c9ccccc9)nc(-c9ccccc9)n8)c7)c56)cccc4c23)cc1]

TABLE 1-continued
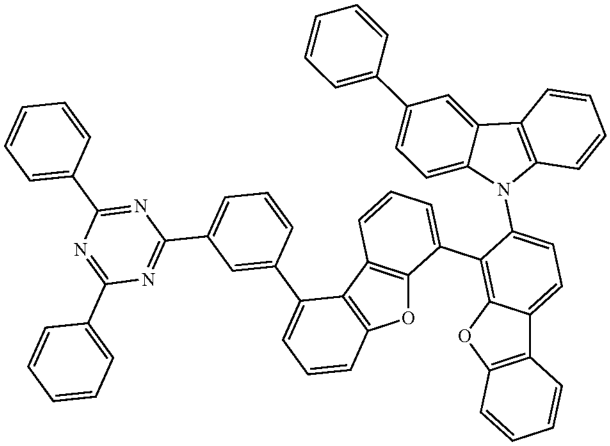 [SMILES: c1ccc(-c2ccc3c(c2)c2ccccc2n3-c2ccc3c(oc4ccccc43)c2-c2cccc3c2oc2cccc(-c4cccc(-c5nc(-c6ccccc6)nc(-c6ccccc6)n5)c4)c23)cc1]
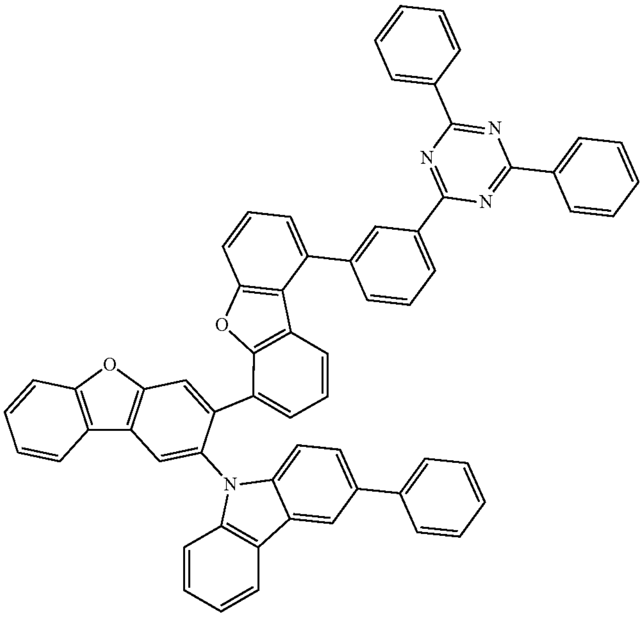 [SMILES: c1ccc(-c2ccc3c(c2)c2ccccc2n3-c2cc3c(cc2-c2cccc4c2oc2cccc(-c5cccc(-c6nc(-c7ccccc7)nc(-c7ccccc7)n6)c5)c24)oc2ccccc23)cc1]
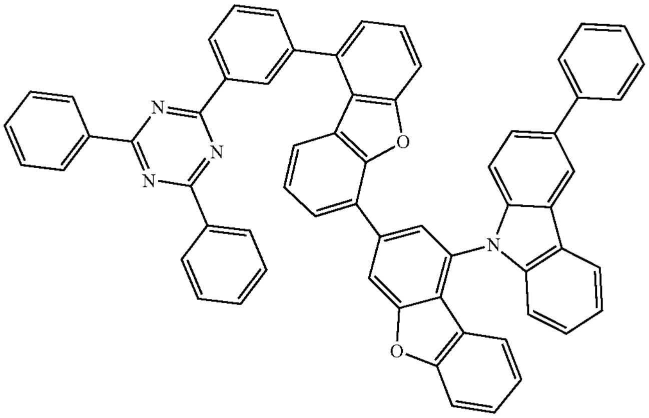 [SMILES: c1ccc(-c2ccc3c(c2)c2ccccc2n3-c2cc(-c3cccc4c3oc3cccc(-c5cccc(-c6nc(-c7ccccc7)nc(-c7ccccc7)n6)c5)c34)cc3oc4ccccc4c23)cc1]

TABLE 1-continued
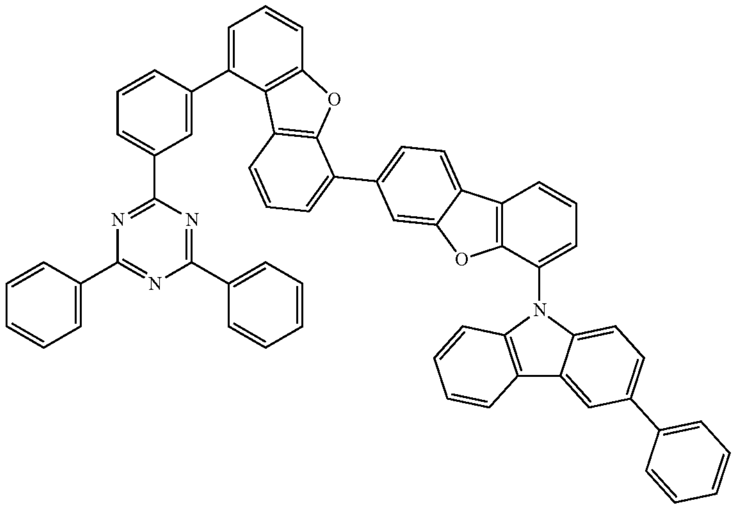 [SMILES: c1ccc(-c2ccc3c(c2)c2ccccc2n3-c2cccc3c2oc2cc(-c4cccc5c4oc4cccc(-c6cccc(-c7nc(-c8ccccc8)nc(-c8ccccc8)n7)c6)c45)ccc23)cc1]
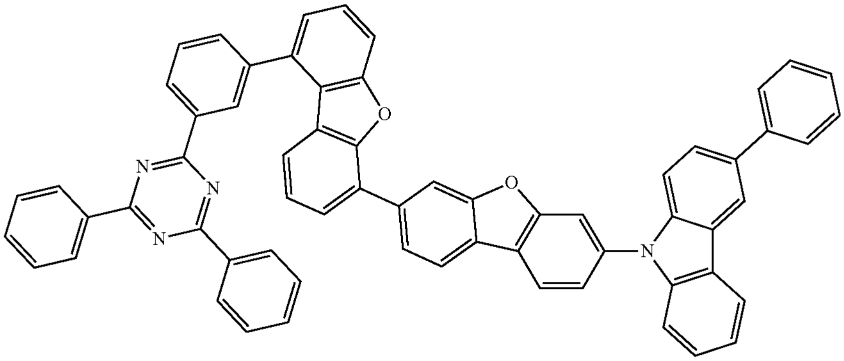 [SMILES: c1ccc(-c2ccc3c(c2)c2ccccc2n3-c2ccc3c(c2)oc2cc(-c4cccc5c4oc4cccc(-c6cccc(-c7nc(-c8ccccc8)nc(-c8ccccc8)n7)c6)c45)ccc23)cc1]
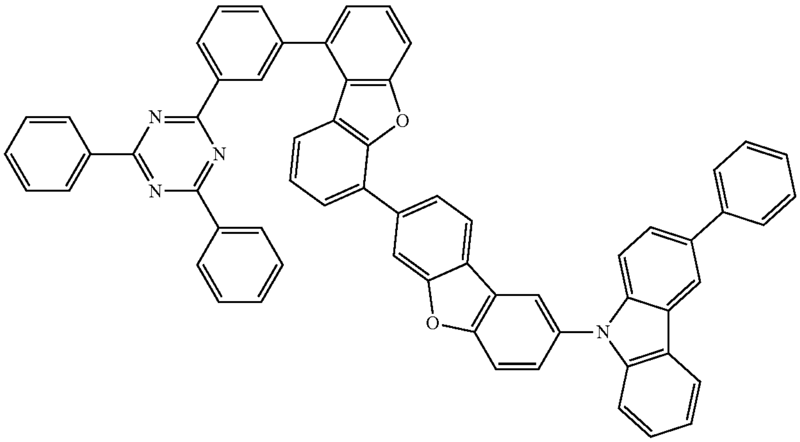 [SMILES: c1ccc(-c2ccc3c(c2)c2ccccc2n3-c2ccc3oc4cc(-c5cccc6c5oc5cccc(-c7cccc(-c8nc(-c9ccccc9)nc(-c9ccccc9)n8)c7)c56)ccc4c3c2)cc1]

TABLE 1-continued
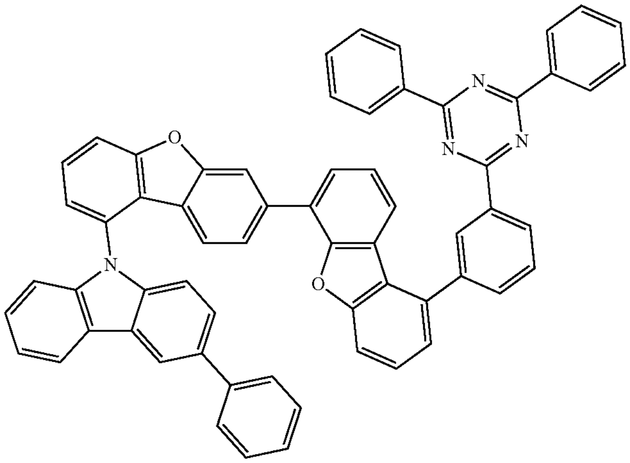 [SMILES: c1ccc(-c2ccc3c(c2)c2ccccc2n3-c2cccc3oc4cc(-c5cccc6c5oc5cccc(-c7cccc(-c8nc(-c9ccccc9)nc(-c9ccccc9)n8)c7)c56)ccc4c23)cc1]
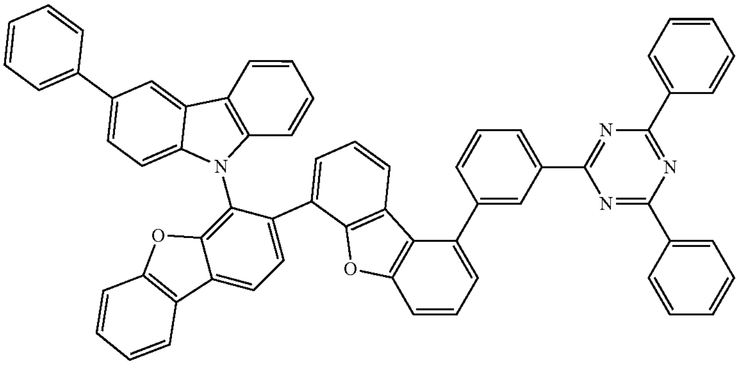 [SMILES: c1ccc(-c2ccc3c(c2)c2ccccc2n3-c2c(-c3cccc4c3oc3cccc(-c5cccc(-c6nc(-c7ccccc7)nc(-c7ccccc7)n6)c5)c34)ccc3c2oc2ccccc23)cc1]
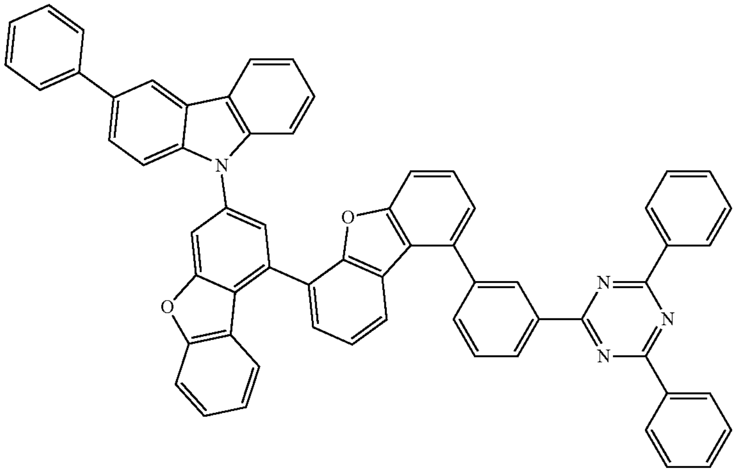 [SMILES: c1ccc(-c2ccc3c(c2)c2ccccc2n3-c2cc(-c3cccc4c3oc3cccc(-c5cccc(-c6nc(-c7ccccc7)nc(-c7ccccc7)n6)c5)c34)c3c(c2)oc2ccccc23)cc1]

TABLE 1-continued
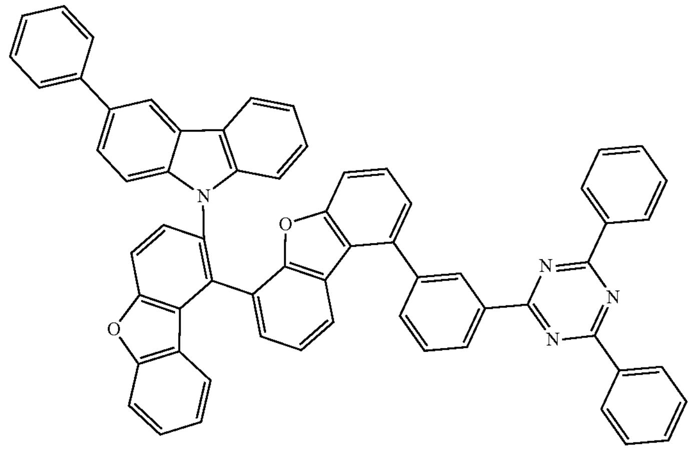 [SMILES: c1ccc(-c2ccc3c(c2)c2ccccc2n3-c2ccc3oc4ccccc4c3c2-c2cccc3c2oc2cccc(-c4cccc(-c5nc(-c6ccccc6)nc(-c6ccccc6)n5)c4)c23)cc1]
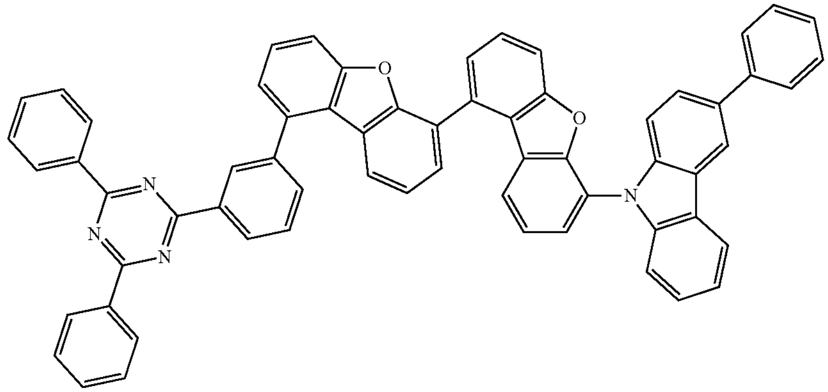 [SMILES: c1ccc(-c2ccc3c(c2)c2ccccc2n3-c2cccc3c2oc2cccc(-c4cccc5c4oc4cccc(-c6cccc(-c7nc(-c8ccccc8)nc(-c8ccccc8)n7)c6)c45)c23)cc1]
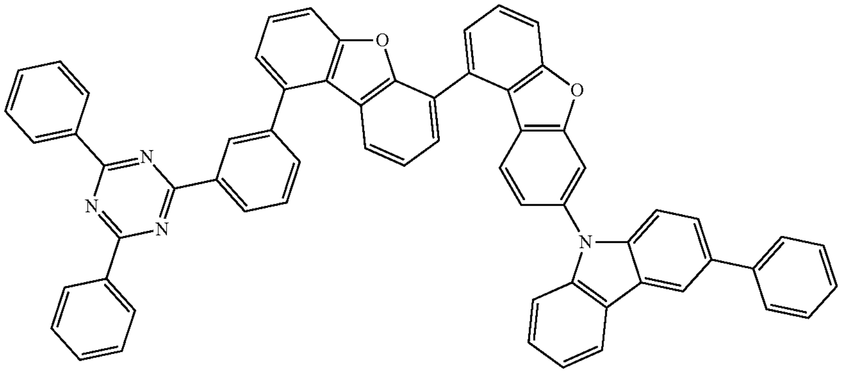 [SMILES: c1ccc(-c2ccc3c(c2)c2ccccc2n3-c2ccc3c(c2)oc2cccc(-c4cccc5c4oc4cccc(-c6cccc(-c7nc(-c8ccccc8)nc(-c8ccccc8)n7)c6)c45)c23)cc1]

TABLE 1-continued
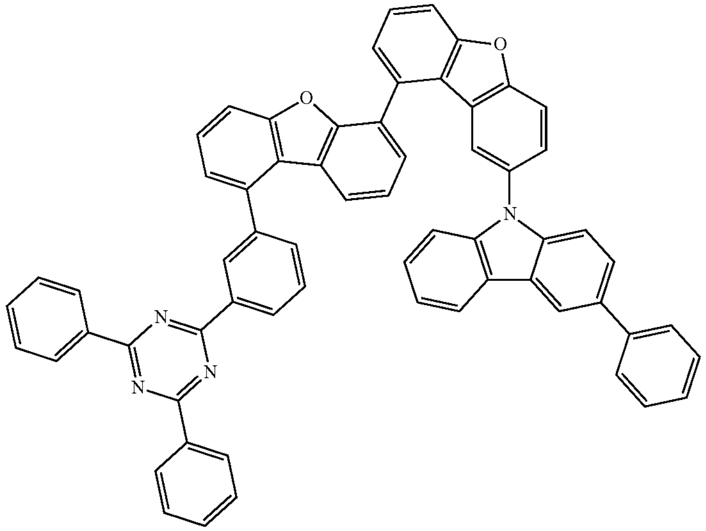 [SMILES: c1ccc(-c2ccc3c(c2)c2ccccc2n3-c2ccc3oc4cccc(-c5cccc6c5oc5cccc(-c7cccc(-c8nc(-c9ccccc9)nc(-c9ccccc9)n8)c7)c56)c4c3c2)cc1]
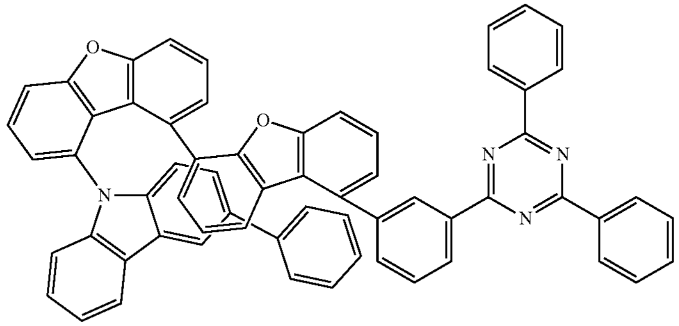 [SMILES: c1ccc(-c2ccc3c(c2)c2ccccc2n3-c2cccc3oc4cccc(-c5cccc6c5oc5cccc(-c7cccc(-c8nc(-c9ccccc9)nc(-c9ccccc9)n8)c7)c56)c4c23)cc1]
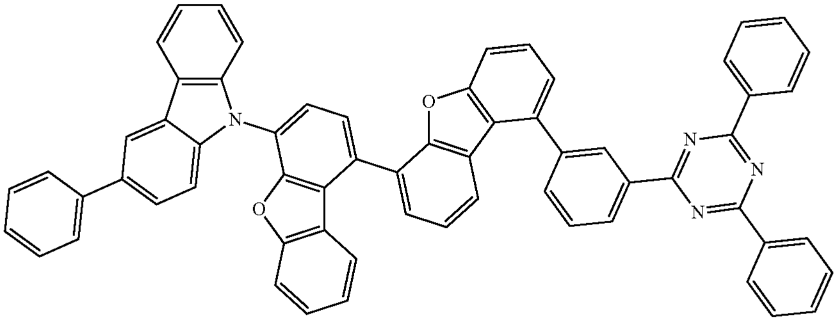 [SMILES: c1ccc(-c2ccc3c(c2)c2ccccc2n3-c2ccc(-c3cccc4c3oc3cccc(-c5cccc(-c6nc(-c7ccccc7)nc(-c7ccccc7)n6)c5)c34)c3c2oc2ccccc23)cc1]
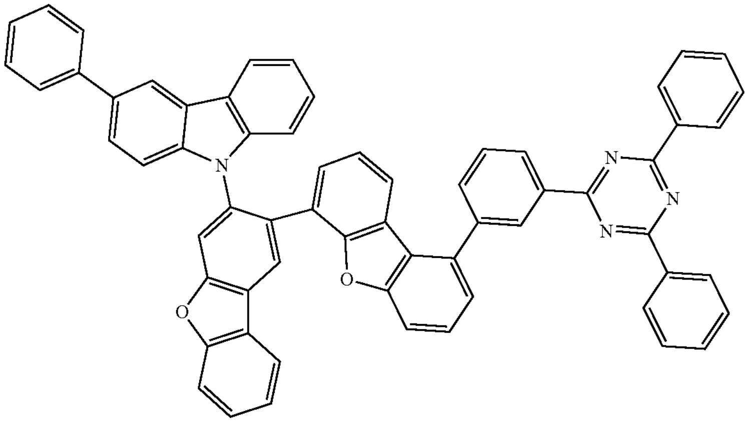 [SMILES: c1ccc(-c2ccc3c(c2)c2ccccc2n3-c2cc3oc4ccccc4c3cc2-c2cccc3c2oc2cccc(-c4cccc(-c5nc(-c6ccccc6)nc(-c6ccccc6)n5)c4)c23)cc1]

TABLE 1-continued
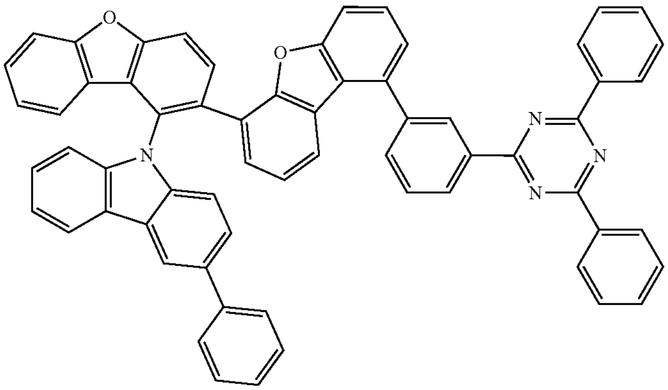 [SMILES: c1ccc(-c2ccc3c(c2)c2ccccc2n3-c2c(-c3cccc4c3oc3cccc(-c5cccc(-c6nc(-c7ccccc7)nc(-c7ccccc7)n6)c5)c34)ccc3oc4ccccc4c23)cc1]
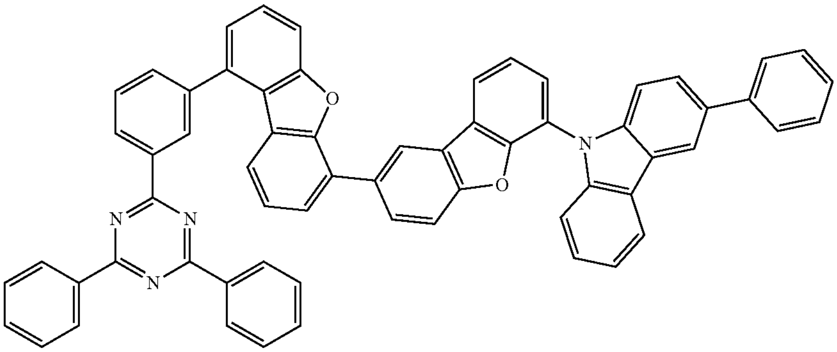 [SMILES: c1ccc(-c2ccc3c(c2)c2ccccc2n3-c2cccc3c2oc2ccc(-c4cccc5c4oc4cccc(-c6cccc(-c7nc(-c8ccccc8)nc(-c8ccccc8)n7)c6)c45)cc23)cc1]
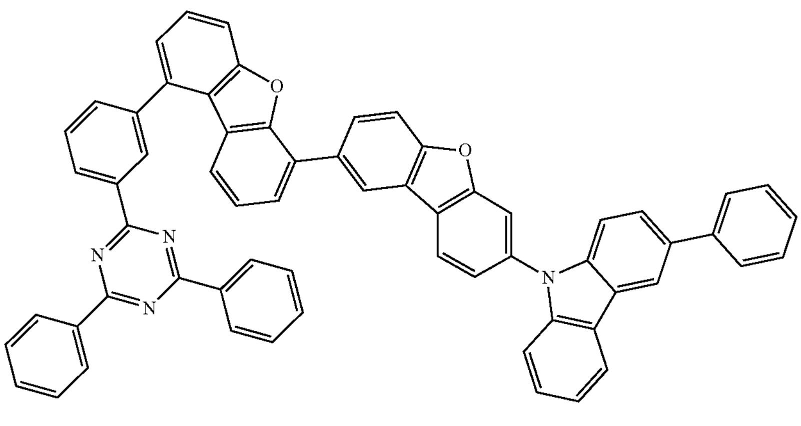 [SMILES: c1ccc(-c2ccc3c(c2)c2ccccc2n3-c2ccc3c(c2)oc2ccc(-c4cccc5c4oc4cccc(-c6cccc(-c7nc(-c8ccccc8)nc(-c8ccccc8)n7)c6)c45)cc23)cc1]

TABLE 1-continued
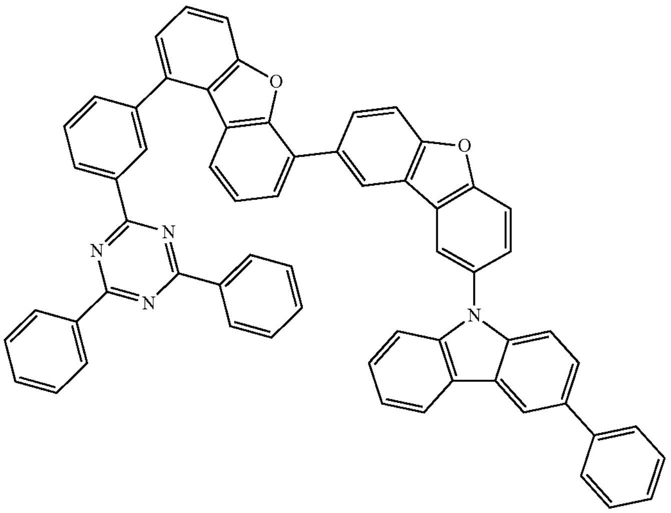 [SMILES: c1ccc(-c2ccc3c(c2)c2ccccc2n3-c2ccc3oc4ccc(-c5cccc6c5oc5cccc(-c7cccc(-c8nc(-c9ccccc9)nc(-c9ccccc9)n8)c7)c56)cc4c3c2)cc1]
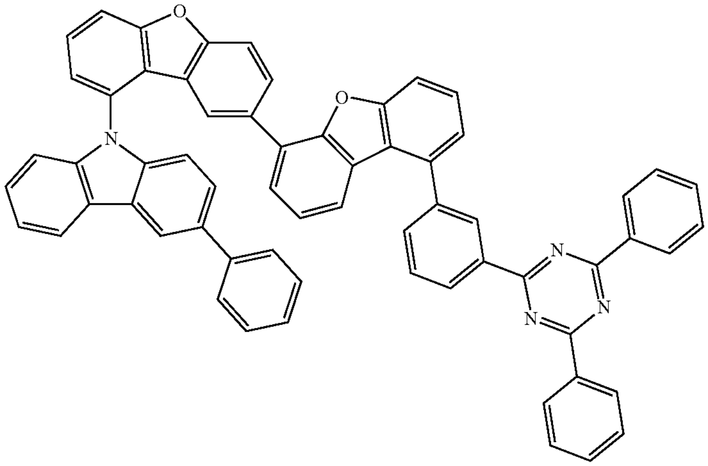 [SMILES: c1ccc(-c2ccc3c(c2)c2ccccc2n3-c2cccc3oc4ccc(-c5cccc6c5oc5cccc(-c7cccc(-c8nc(-c9ccccc9)nc(-c9ccccc9)n8)c7)c56)cc4c23)cc1]
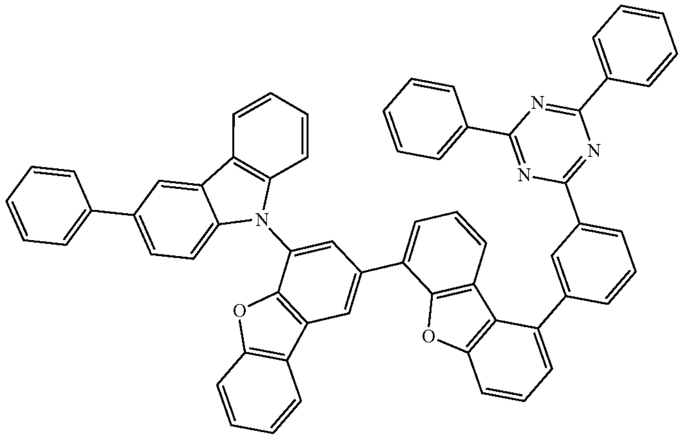 [SMILES: c1ccc(-c2ccc3c(c2)c2ccccc2n3-c2cc(-c3cccc4c3oc3cccc(-c5cccc(-c6nc(-c7ccccc7)nc(-c7ccccc7)n6)c5)c34)cc3c2oc2ccccc23)cc1]

TABLE 1-continued
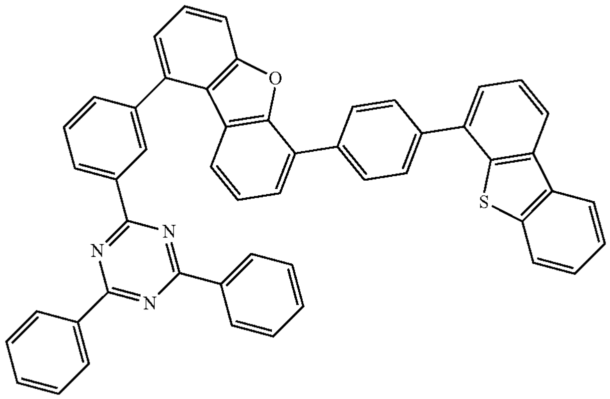 [SMILES: c1ccc(-c2nc(-c3ccccc3)nc(-c3cccc(-c4cccc5oc6c(-c7ccc(-c8cccc9c8sc8ccccc89)cc7)cccc6c45)c3)n2)cc1]
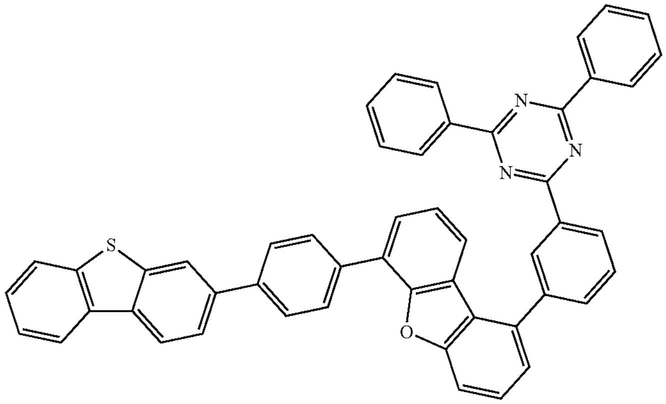 [SMILES: c1ccc(-c2nc(-c3ccccc3)nc(-c3cccc(-c4cccc5oc6c(-c7ccc(-c8ccc9c(c8)sc8ccccc89)cc7)cccc6c45)c3)n2)cc1]
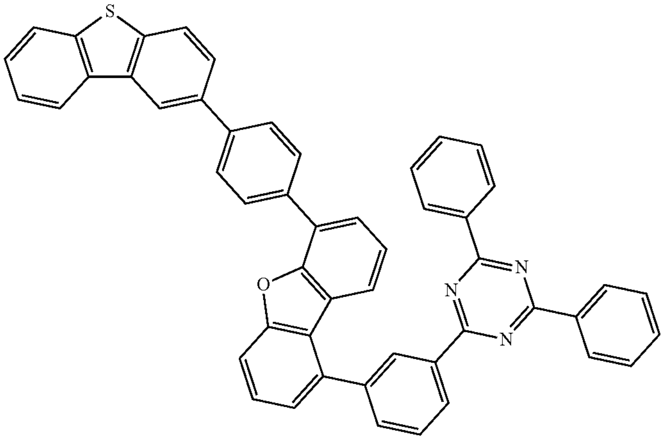 [SMILES: c1ccc(-c2nc(-c3ccccc3)nc(-c3cccc(-c4cccc5oc6c(-c7ccc(-c8ccc9sc%10ccccc%10c9c8)cc7)cccc6c45)c3)n2)cc1]

TABLE 1-continued
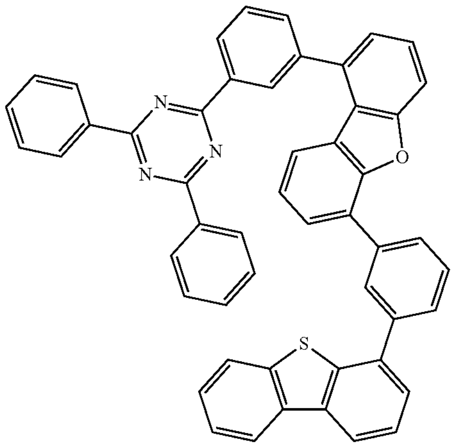 [SMILES: c1ccc(-c2nc(-c3ccccc3)nc(-c3cccc(-c4cccc5oc6c(-c7cccc(-c8cccc9c8sc8ccccc89)c7)cccc6c45)c3)n2)cc1]
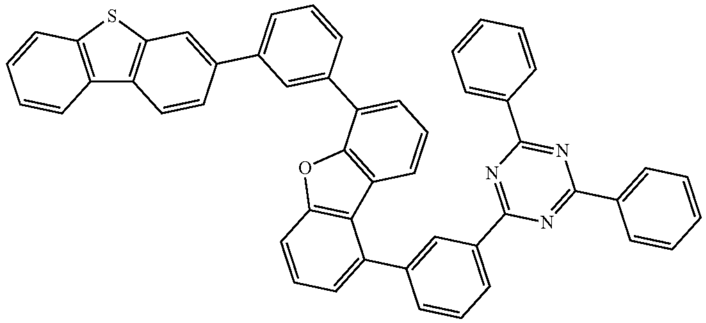 [SMILES: c1ccc(-c2nc(-c3ccccc3)nc(-c3cccc(-c4cccc5oc6c(-c7cccc(-c8ccc9c(c8)sc8ccccc89)c7)cccc6c45)c3)n2)cc1]
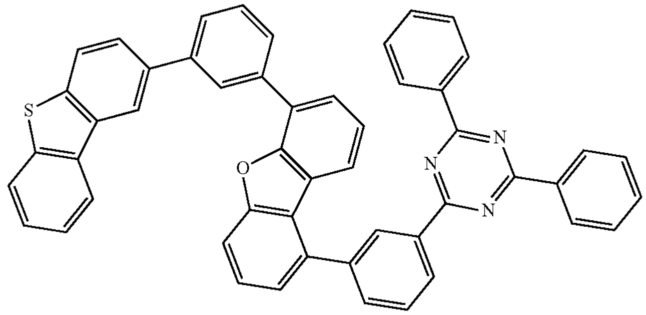 [SMILES: c1ccc(-c2nc(-c3ccccc3)nc(-c3cccc(-c4cccc5oc6c(-c7cccc(-c8ccc9sc%10ccccc%10c9c8)c7)cccc6c45)c3)n2)cc1]
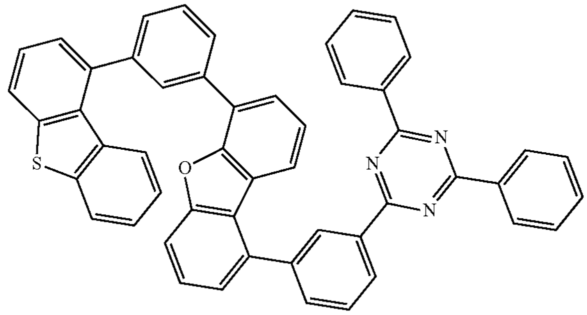 [SMILES: c1ccc(-c2nc(-c3ccccc3)nc(-c3cccc(-c4cccc5oc6c(-c7cccc(-c8cccc9sc%10ccccc%10c89)c7)cccc6c45)c3)n2)cc1]

TABLE 1-continued
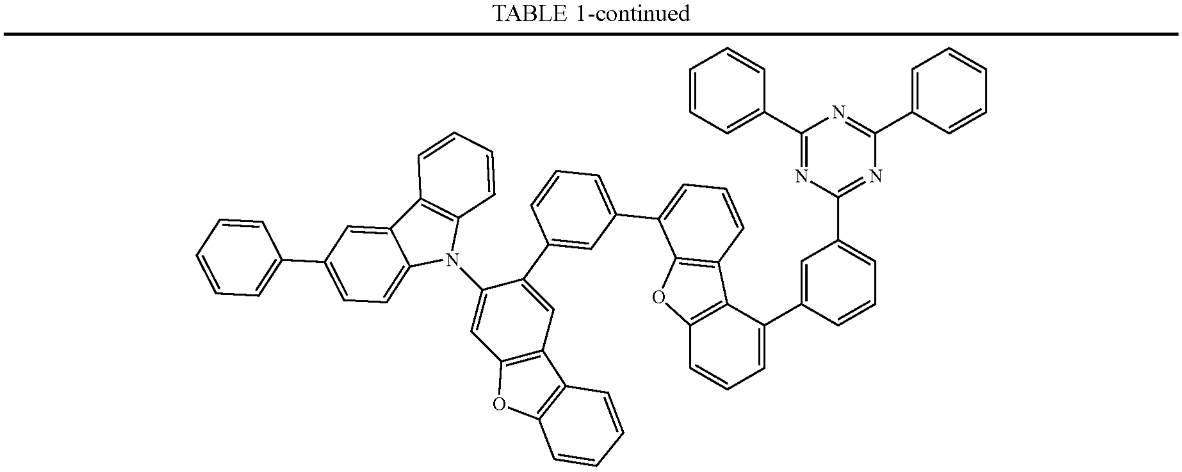
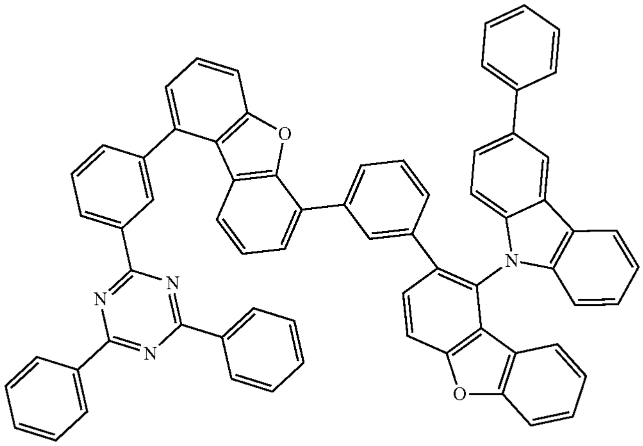 [SMILES: c1ccc(-c2ccc3c(c2)c2ccccc2n3-c2c(-c3cccc(-c4cccc5c4oc4cccc(-c6cccc(-c7nc(-c8ccccc8)nc(-c8ccccc8)n7)c6)c45)c3)ccc3oc4ccccc4c23)cc1]
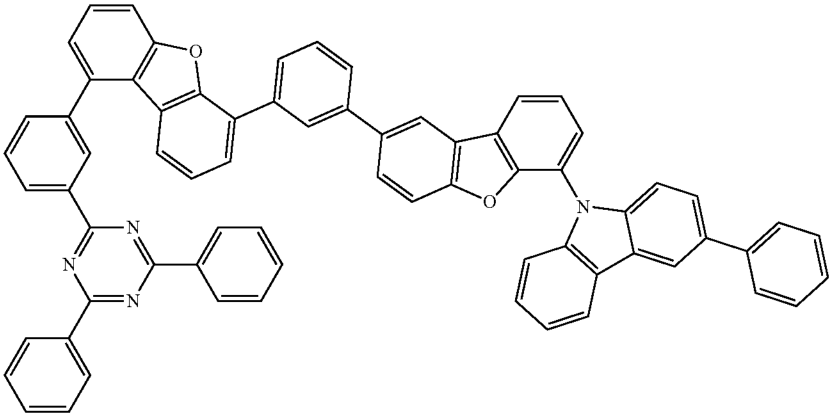 [SMILES: c1ccc(-c2ccc3c(c2)c2ccccc2n3-c2cccc3c2oc2ccc(-c4cccc(-c5cccc6c5oc5cccc(-c7cccc(-c8nc(-c9ccccc9)nc(-c9ccccc9)n8)c7)c56)c4)cc23)cc1]
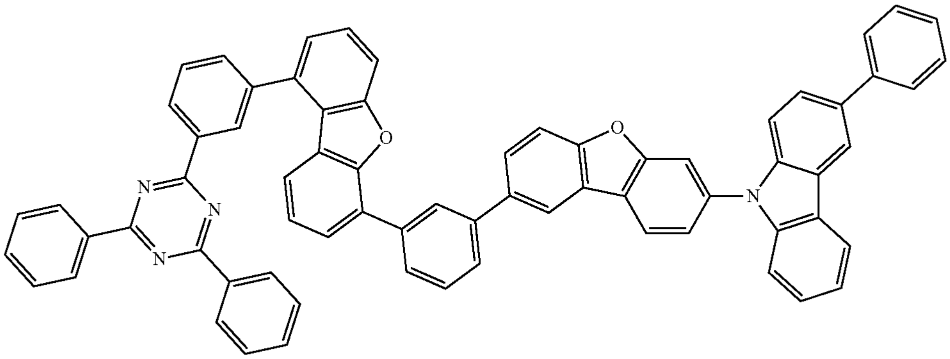 [SMILES: c1ccc(-c2ccc3c(c2)c2ccccc2n3-c2ccc3c(c2)oc2ccc(-c4cccc(-c5cccc6c5oc5cccc(-c7cccc(-c8nc(-c9ccccc9)nc(-c9ccccc9)n8)c7)c56)c4)cc23)cc1]

TABLE 1-continued
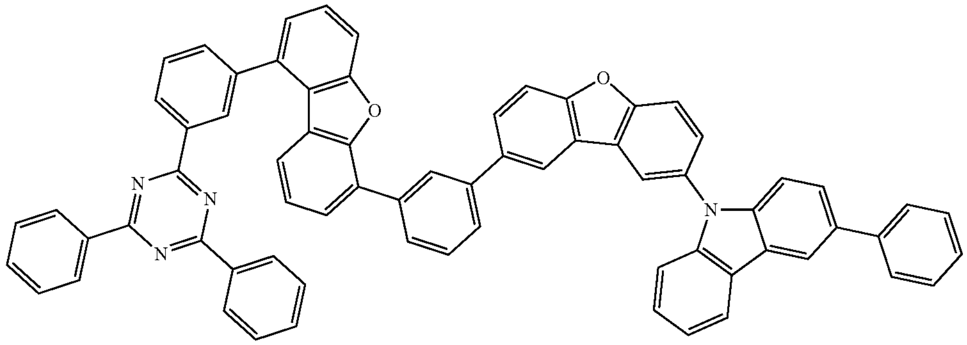 [SMILES: c1ccc(-c2ccc3c(c2)c2ccccc2n3-c2ccc3oc4ccc(-c5cccc(-c6cccc7c6oc6cccc(-c8cccc(-c9nc(-c%10ccccc%10)nc(-c%10ccccc%10)n9)c8)c67)c5)cc4c3c2)cc1]
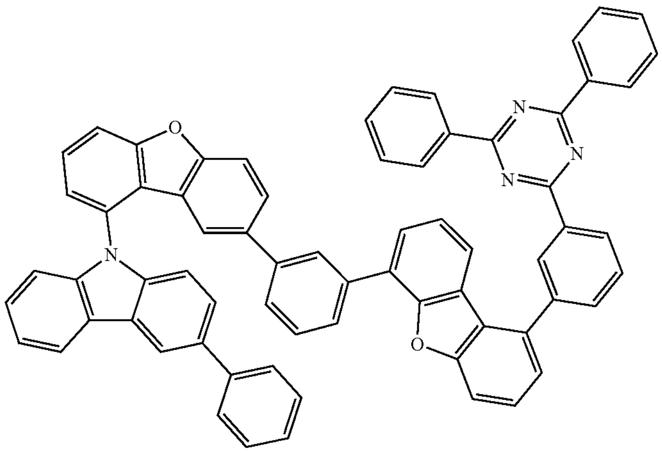 [SMILES: c1ccc(-c2ccc3c(c2)c2ccccc2n3-c2cccc3oc4ccc(-c5cccc(-c6cccc7c6oc6cccc(-c8cccc(-c9nc(-c%10ccccc%10)nc(-c%10ccccc%10)n9)c8)c67)c5)cc4c23)cc1]
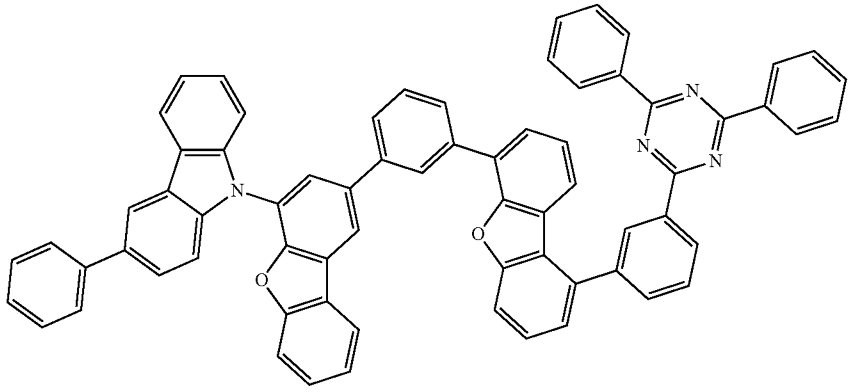 [SMILES: c1ccc(-c2ccc3c(c2)c2ccccc2n3-c2cc(-c3cccc(-c4cccc5c4oc4cccc(-c6cccc(-c7nc(-c8ccccc8)nc(-c8ccccc8)n7)c6)c45)c3)cc3c2oc2ccccc23)cc1]
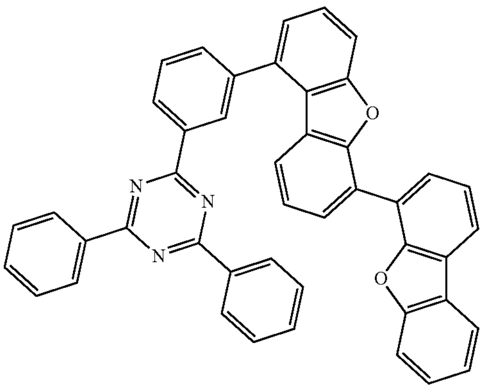 [SMILES: c1ccc(-c2nc(-c3ccccc3)nc(-c3cccc(-c4cccc5oc6c(-c7cccc8c7oc7ccccc78)cccc6c45)c3)n2)cc1]

TABLE 1-continued
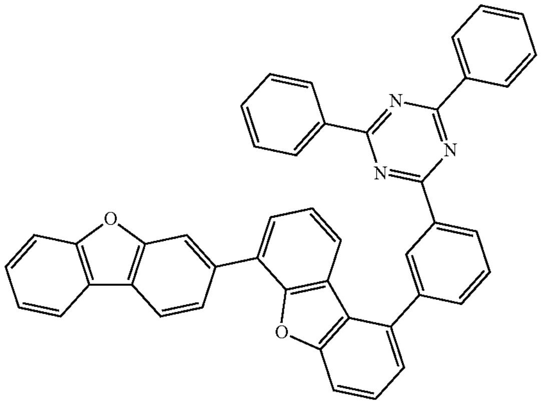 [SMILES: c1ccc(-c2nc(-c3ccccc3)nc(-c3cccc(-c4cccc5oc6c(-c7ccc8c(c7)oc7ccccc78)cccc6c45)c3)n2)cc1]
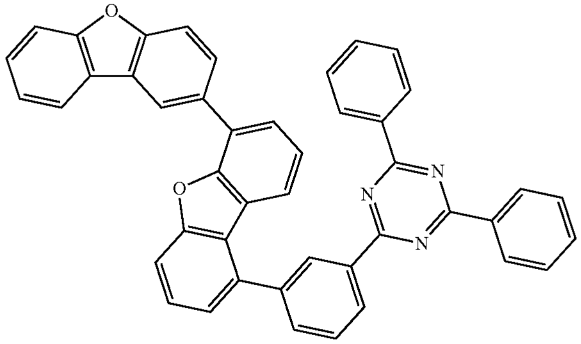 [SMILES: c1ccc(-c2nc(-c3ccccc3)nc(-c3cccc(-c4cccc5oc6c(-c7ccc8oc9ccccc9c8c7)cccc6c45)c3)n2)cc1]
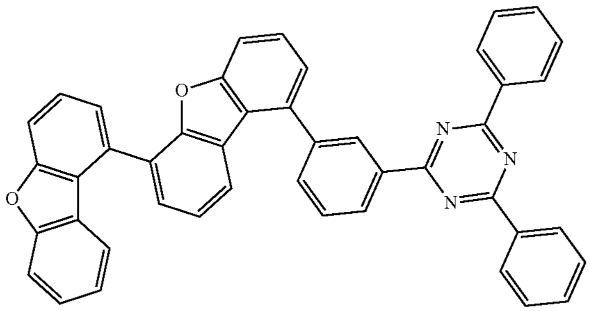 [SMILES: c1ccc(-c2nc(-c3ccccc3)nc(-c3cccc(-c4cccc5oc6c(-c7cccc8oc9ccccc9c78)cccc6c45)c3)n2)cc1]
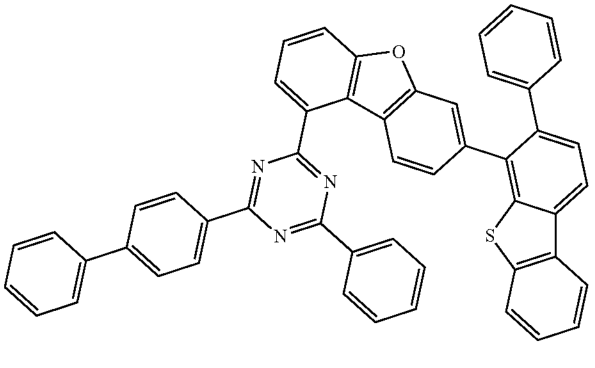 [SMILES: c1ccc(-c2ccc(-c3nc(-c4ccccc4)nc(-c4cccc5oc6cc(-c7c(-c8ccccc8)ccc8c7sc7ccccc78)ccc6c45)n3)cc2)cc1]

TABLE 1-continued
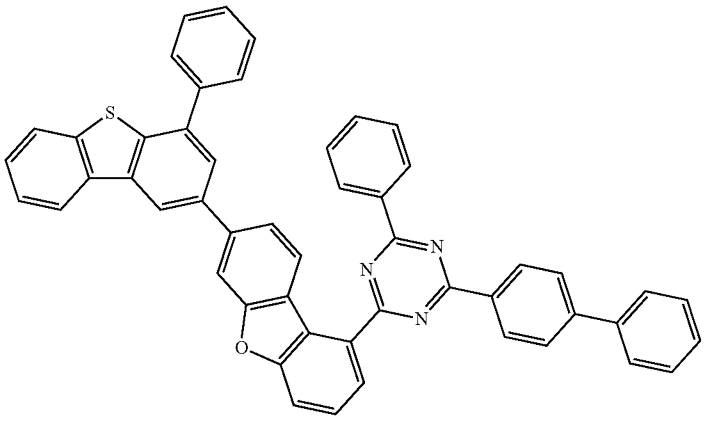 [SMILES: c1ccc(-c2ccc(-c3nc(-c4ccccc4)nc(-c4cccc5oc6cc(-c7cc(-c8ccccc8)c8sc9ccccc9c8c7)ccc6c45)n3)cc2)cc1]
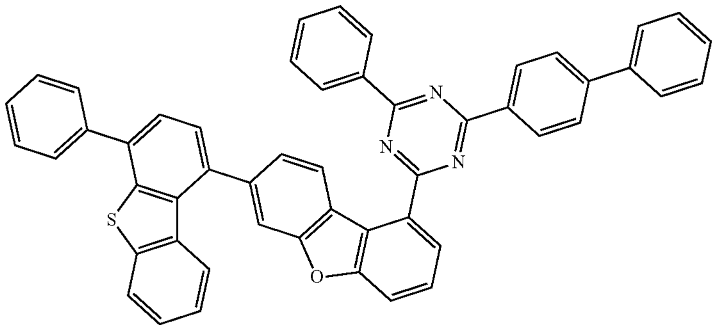 [SMILES: c1ccc(-c2ccc(-c3nc(-c4ccccc4)nc(-c4cccc5oc6cc(-c7ccc(-c8ccccc8)c8sc9ccccc9c78)ccc6c45)n3)cc2)cc1]
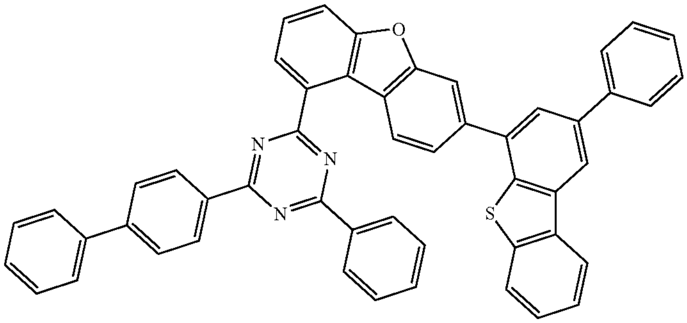 [SMILES: c1ccc(-c2ccc(-c3nc(-c4ccccc4)nc(-c4cccc5oc6cc(-c7cc(-c8ccccc8)cc8c7sc7ccccc78)ccc6c45)n3)cc2)cc1]
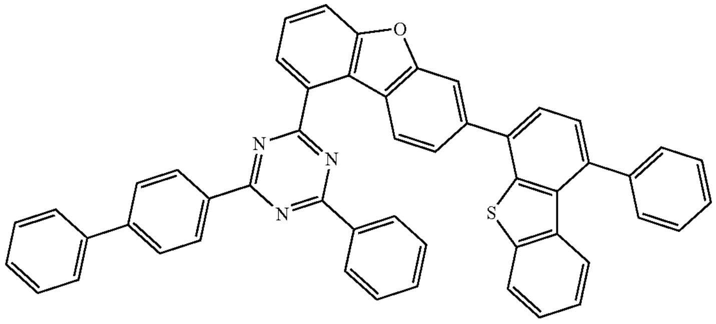 [SMILES: c1ccc(-c2ccc(-c3nc(-c4ccccc4)nc(-c4cccc5oc6cc(-c7ccc(-c8ccccc8)c8c7sc7ccccc78)ccc6c45)n3)cc2)cc1]

TABLE 1-continued
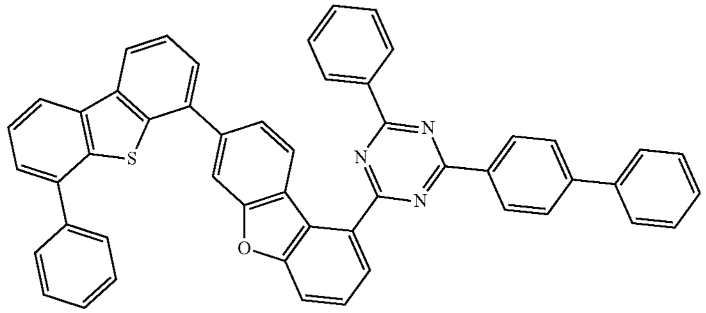 [SMILES: c1ccc(-c2ccc(-c3nc(-c4ccccc4)nc(-c4cccc5oc6cc(-c7cccc8c7sc7c(-c9ccccc9)cccc78)ccc6c45)n3)cc2)cc1]
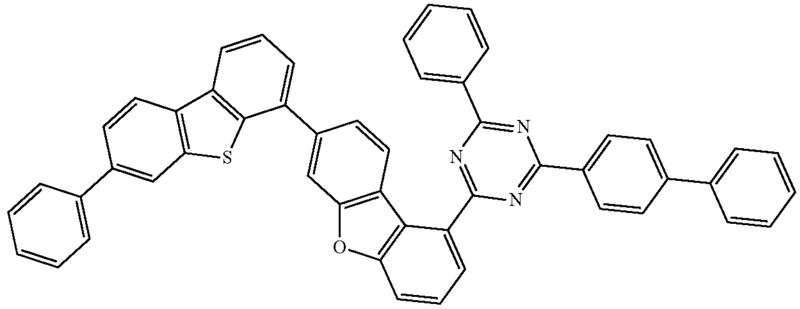 [SMILES: c1ccc(-c2ccc(-c3nc(-c4ccccc4)nc(-c4cccc5oc6cc(-c7cccc8c7sc7cc(-c9ccccc9)ccc78)ccc6c45)n3)cc2)cc1]
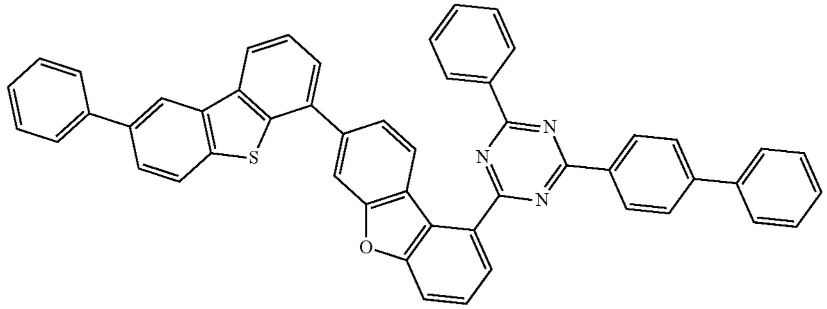 [SMILES: c1ccc(-c2ccc(-c3nc(-c4ccccc4)nc(-c4cccc5oc6cc(-c7cccc8c7sc7ccc(-c9ccccc9)cc78)ccc6c45)n3)cc2)cc1]
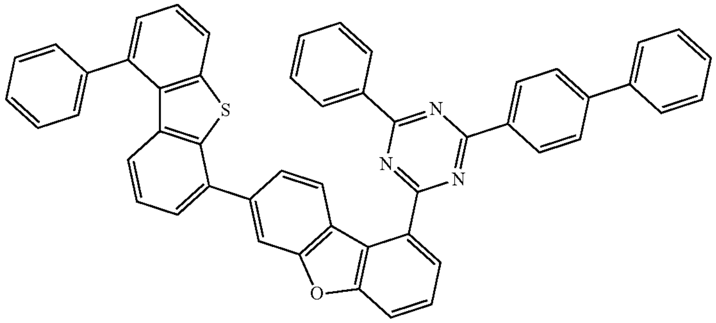 [SMILES: c1ccc(-c2ccc(-c3nc(-c4ccccc4)nc(-c4cccc5oc6cc(-c7cccc8c7sc7cccc(-c9ccccc9)c78)ccc6c45)n3)cc2)cc1]
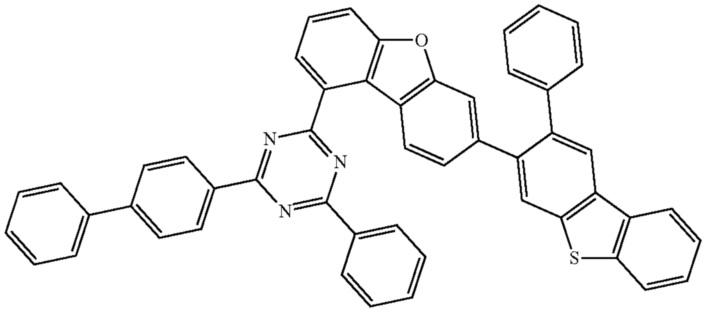 [SMILES: c1ccc(-c2ccc(-c3nc(-c4ccccc4)nc(-c4cccc5oc6cc(-c7cc8sc9ccccc9c8cc7-c7ccccc7)ccc6c45)n3)cc2)cc1]

TABLE 1-continued
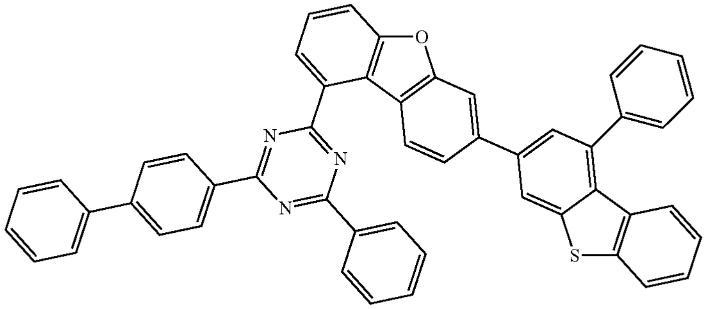 [SMILES: c1ccc(-c2ccc(-c3nc(-c4ccccc4)nc(-c4cccc5oc6cc(-c7cc(-c8ccccc8)c8c(c7)sc7ccccc78)ccc6c45)n3)cc2)cc1]
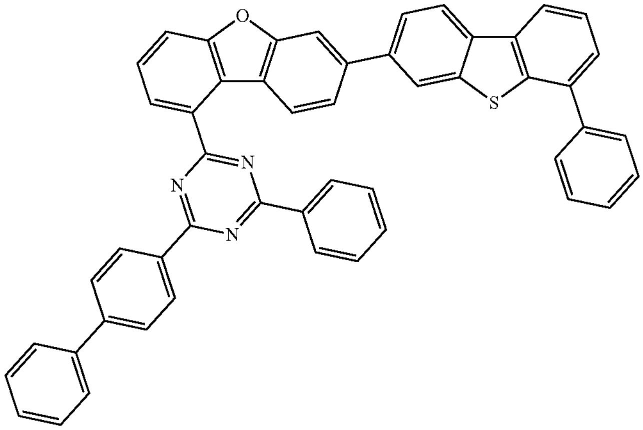 [SMILES: c1ccc(-c2ccc(-c3nc(-c4ccccc4)nc(-c4cccc5oc6cc(-c7ccc8c(c7)sc7c(-c9ccccc9)cccc78)ccc6c45)n3)cc2)cc1]
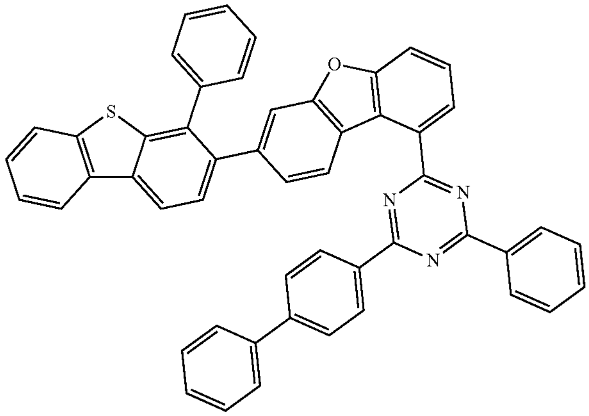 [SMILES: c1ccc(-c2ccc(-c3nc(-c4ccccc4)nc(-c4cccc5oc6cc(-c7ccc8c(sc9ccccc98)c7-c7ccccc7)ccc6c45)n3)cc2)cc1]
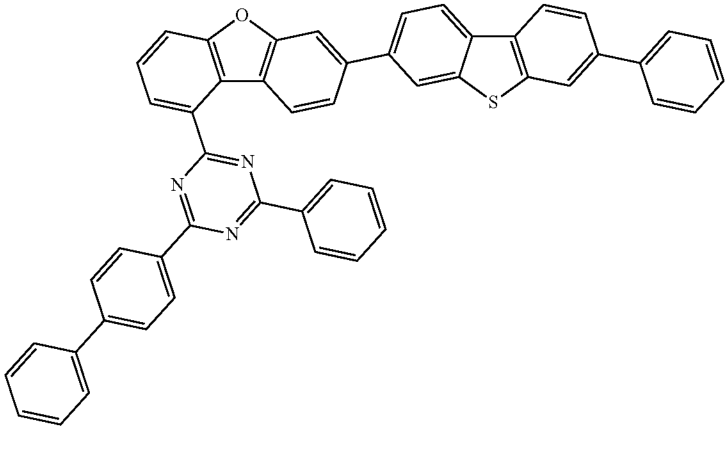 [SMILES: c1ccc(-c2ccc(-c3nc(-c4ccccc4)nc(-c4cccc5oc6cc(-c7ccc8c(c7)sc7cc(-c9ccccc9)ccc78)ccc6c45)n3)cc2)cc1]

TABLE 1-continued
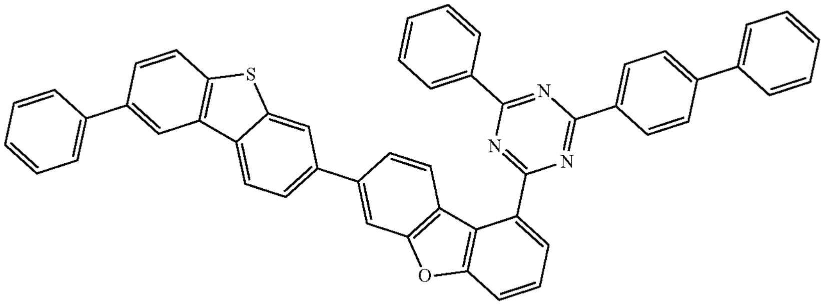 [SMILES: c1ccc(-c2ccc(-c3nc(-c4ccccc4)nc(-c4cccc5oc6cc(-c7ccc8c(c7)sc7ccc(-c9ccccc9)cc78)ccc6c45)n3)cc2)cc1]
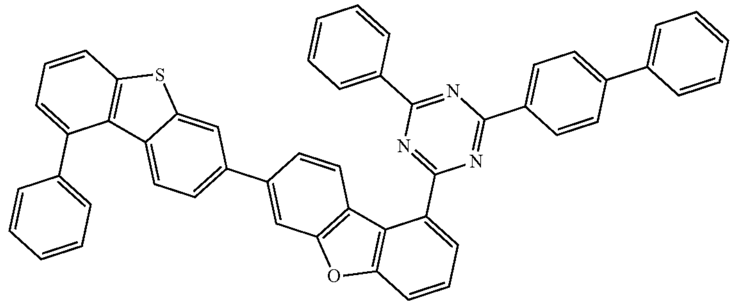 [SMILES: c1ccc(-c2ccc(-c3nc(-c4ccccc4)nc(-c4cccc5oc6cc(-c7ccc8c(c7)sc7cccc(-c9ccccc9)c78)ccc6c45)n3)cc2)cc1]
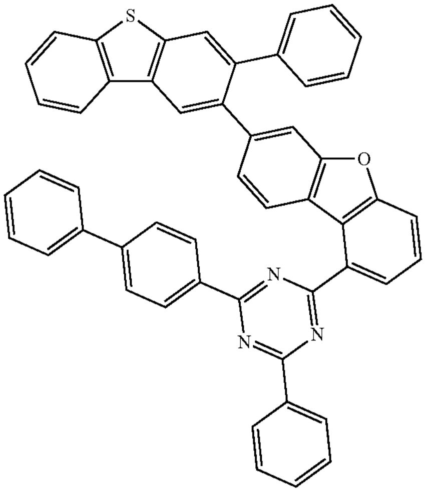 [SMILES: c1ccc(-c2ccc(-c3nc(-c4ccccc4)nc(-c4cccc5oc6cc(-c7cc8c(cc7-c7ccccc7)sc7ccccc78)ccc6c45)n3)cc2)cc1]
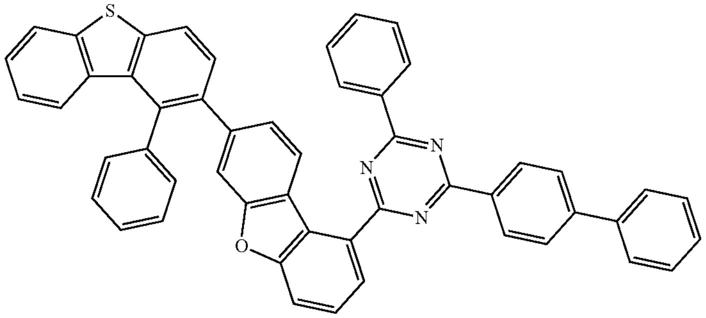 [SMILES: c1ccc(-c2ccc(-c3nc(-c4ccccc4)nc(-c4cccc5oc6cc(-c7ccc8sc9ccccc9c8c7-c7ccccc7)ccc6c45)n3)cc2)cc1]

TABLE 1-continued
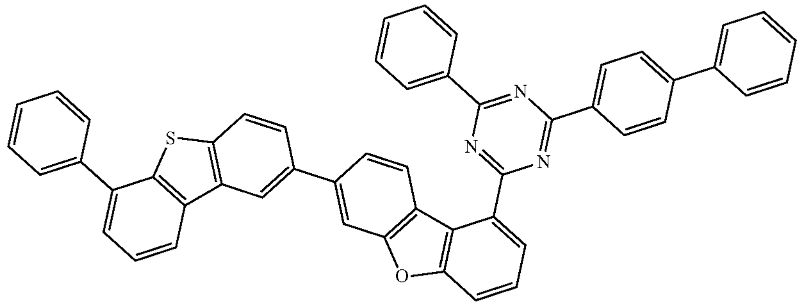 [SMILES: c1ccc(-c2ccc(-c3nc(-c4ccccc4)nc(-c4cccc5oc6cc(-c7ccc8sc9c(-c%10ccccc%10)cccc9c8c7)ccc6c45)n3)cc2)cc1]
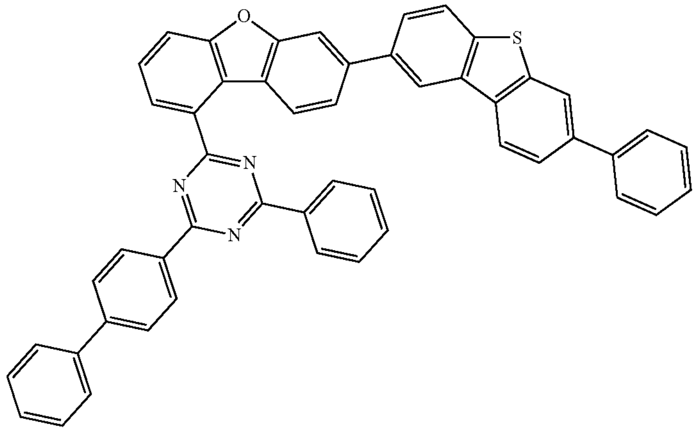 [SMILES: c1ccc(-c2ccc(-c3nc(-c4ccccc4)nc(-c4cccc5oc6cc(-c7ccc8sc9cc(-c%10ccccc%10)ccc9c8c7)ccc6c45)n3)cc2)cc1]
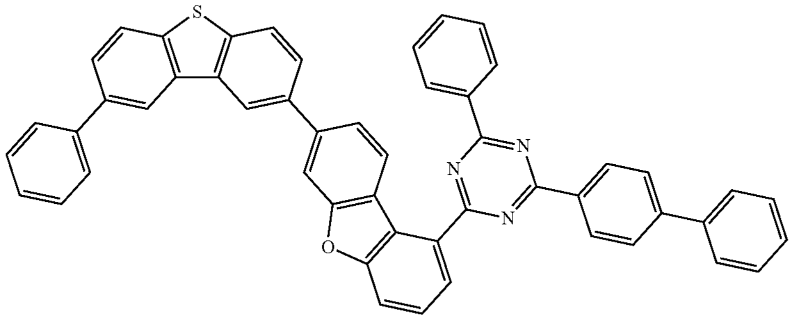 [SMILES: c1ccc(-c2ccc(-c3nc(-c4ccccc4)nc(-c4cccc5oc6cc(-c7ccc8sc9ccc(-c%10ccccc%10)cc9c8c7)ccc6c45)n3)cc2)cc1]
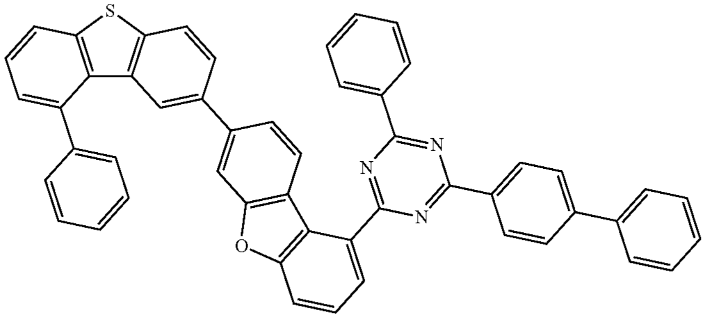 [SMILES: c1ccc(-c2ccc(-c3nc(-c4ccccc4)nc(-c4cccc5oc6cc(-c7ccc8sc9cccc(-c%10ccccc%10)c9c8c7)ccc6c45)n3)cc2)cc1]

TABLE 1-continued
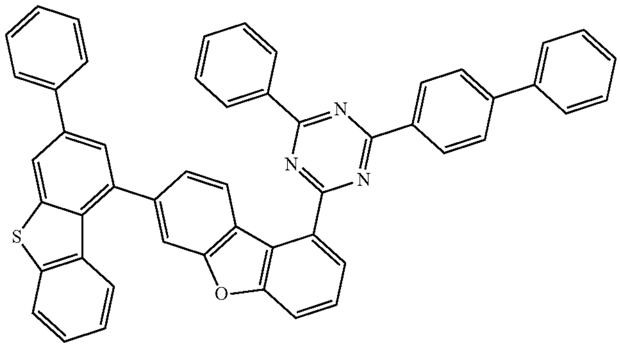 [SMILES: c1ccc(-c2ccc(-c3nc(-c4ccccc4)nc(-c4cccc5oc6cc(-c7cc(-c8ccccc8)cc8sc9ccccc9c78)ccc6c45)n3)cc2)cc1]
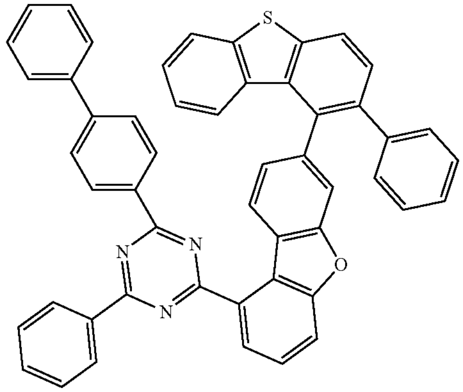 [SMILES: c1ccc(-c2ccc(-c3nc(-c4ccccc4)nc(-c4cccc5oc6cc(-c7c(-c8ccccc8)ccc8sc9ccccc9c78)ccc6c45)n3)cc2)cc1]
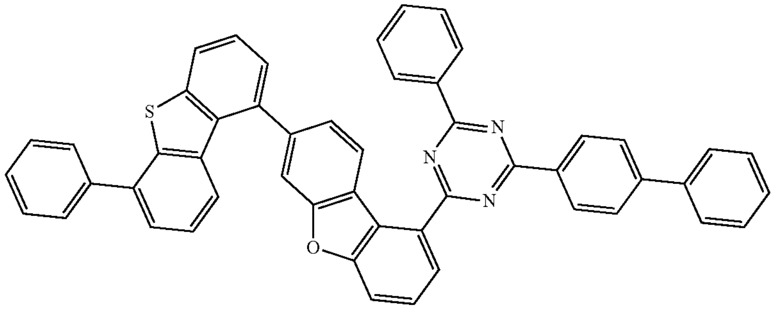 [SMILES: c1ccc(-c2ccc(-c3nc(-c4ccccc4)nc(-c4cccc5oc6cc(-c7cccc8sc9c(-c%10ccccc%10)cccc9c78)ccc6c45)n3)cc2)cc1]
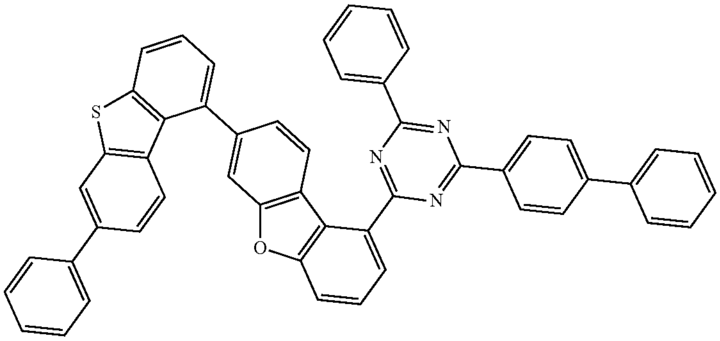 [SMILES: c1ccc(-c2ccc(-c3nc(-c4ccccc4)nc(-c4cccc5oc6cc(-c7cccc8sc9cc(-c%10ccccc%10)ccc9c78)ccc6c45)n3)cc2)cc1]

TABLE 1-continued
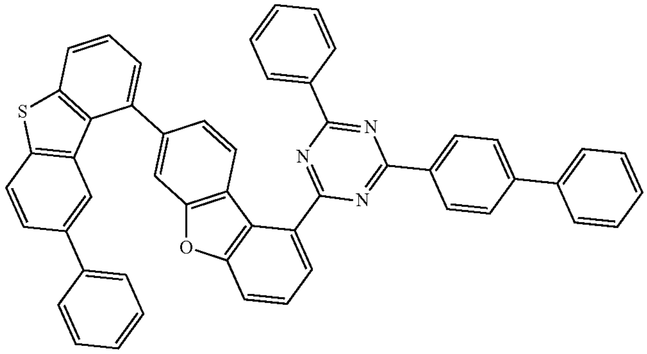 [SMILES: c1ccc(-c2ccc(-c3nc(-c4ccccc4)nc(-c4cccc5oc6cc(-c7cccc8sc9ccc(-c%10ccccc%10)cc9c78)ccc6c45)n3)cc2)cc1]
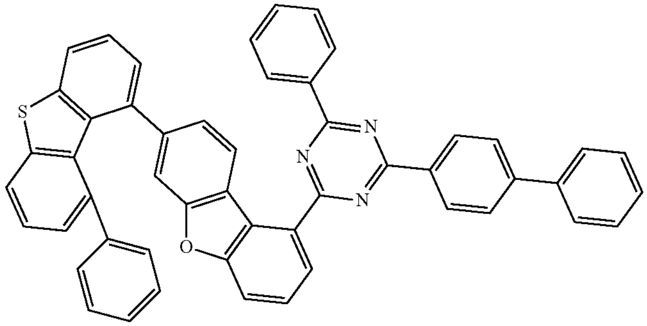 [SMILES: c1ccc(-c2ccc(-c3nc(-c4ccccc4)nc(-c4cccc5oc6cc(-c7cccc8sc9cccc(-c%10ccccc%10)c9c78)ccc6c45)n3)cc2)cc1]
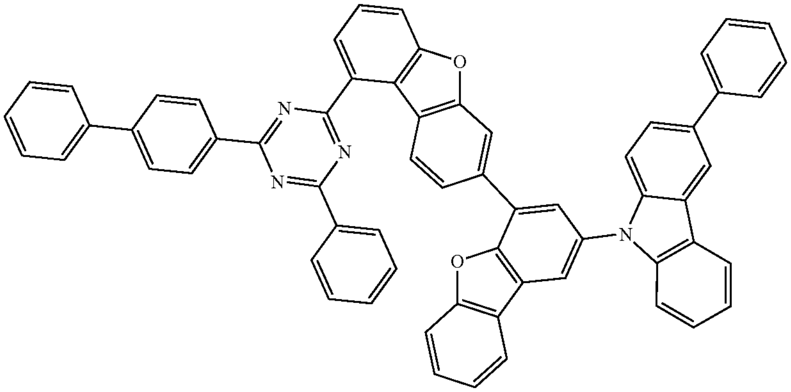 [SMILES: c1ccc(-c2ccc(-c3nc(-c4ccccc4)nc(-c4cccc5oc6cc(-c7cc(-n8c9ccccc9c9cc(-c%10ccccc%10)ccc98)cc8c7oc7ccccc78)ccc6c45)n3)cc2)cc1]
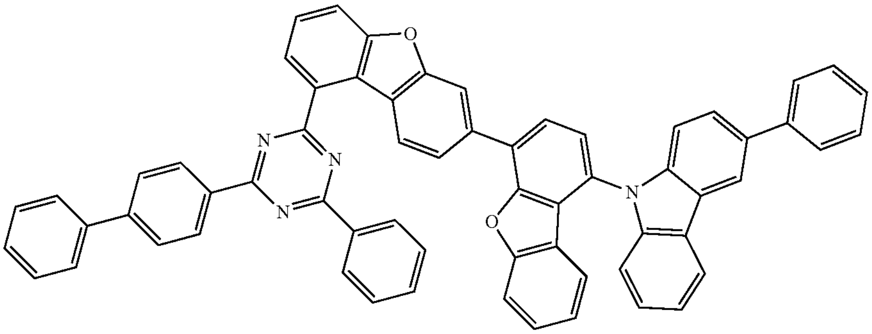 [SMILES: c1ccc(-c2ccc(-c3nc(-c4ccccc4)nc(-c4cccc5oc6cc(-c7ccc(-n8c9ccccc9c9cc(-c%10ccccc%10)ccc98)c8c7oc7ccccc78)ccc6c45)n3)cc2)cc1]

TABLE 1-continued
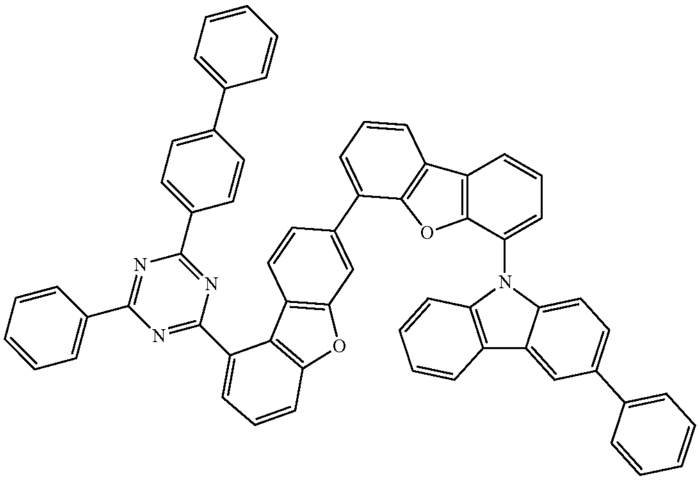 [SMILES: c1ccc(-c2ccc(-c3nc(-c4ccccc4)nc(-c4cccc5oc6cc(-c7cccc8c7oc7c(-n9c%10ccccc%10c%10cc(-c%11ccccc%11)ccc%109)cccc78)ccc6c45)n3)cc2)cc1]
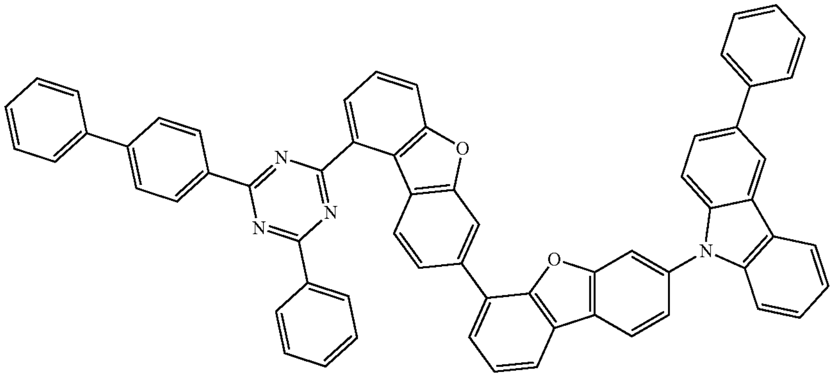 [SMILES: c1ccc(-c2ccc(-c3nc(-c4ccccc4)nc(-c4cccc5oc6cc(-c7cccc8c7oc7cc(-n9c%10ccccc%10c%10cc(-c%11ccccc%11)ccc%109)ccc78)ccc6c45)n3)cc2)cc1]
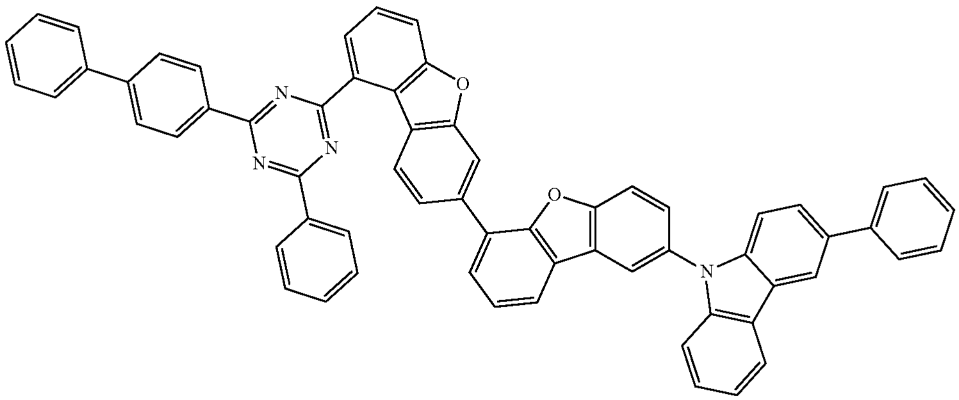 [SMILES: c1ccc(-c2ccc(-c3nc(-c4ccccc4)nc(-c4cccc5oc6cc(-c7cccc8c7oc7ccc(-n9c%10ccccc%10c%10cc(-c%11ccccc%11)ccc%109)cc78)ccc6c45)n3)cc2)cc1]

TABLE 1-continued
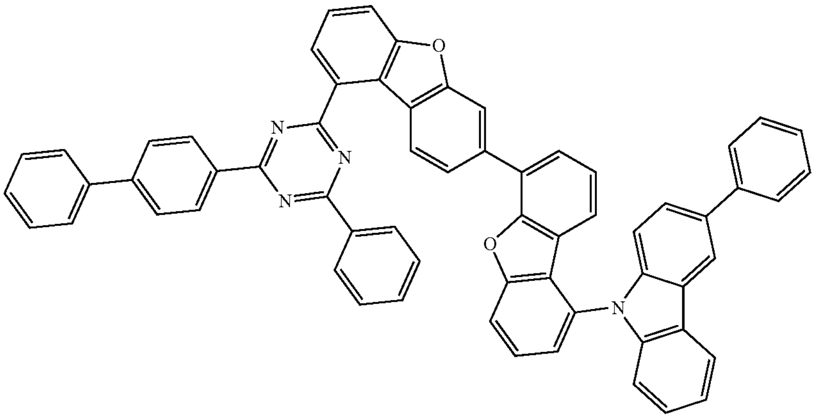 [SMILES: c1ccc(-c2ccc(-c3nc(-c4ccccc4)nc(-c4cccc5oc6cc(-c7cccc8c7oc7cccc(-n9c%10ccccc%10c%10cc(-c%11ccccc%11)ccc%109)c78)ccc6c45)n3)cc2)cc1]
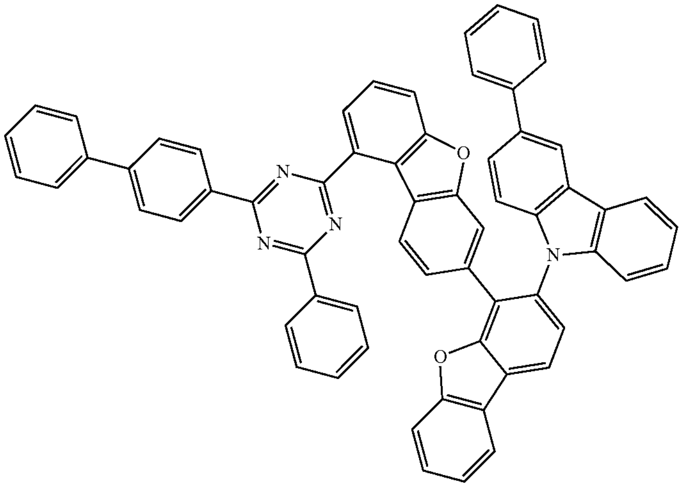 [SMILES: c1ccc(-c2ccc(-c3nc(-c4ccccc4)nc(-c4cccc5oc6cc(-c7c(-n8c9ccccc9c9cc(-c%10ccccc%10)ccc98)ccc8c7oc7ccccc78)ccc6c45)n3)cc2)cc1]
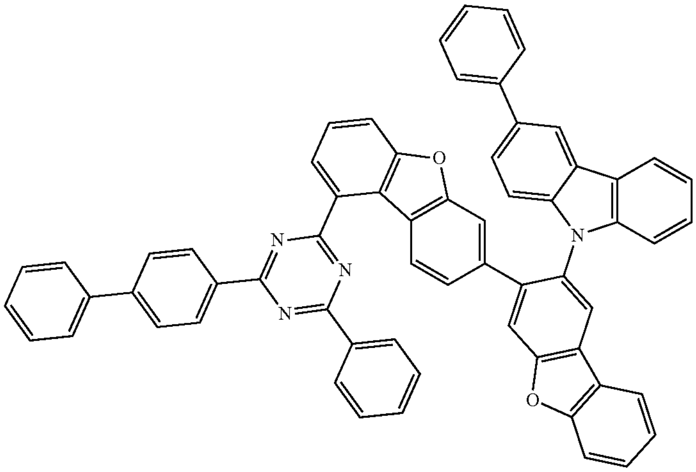 [SMILES: c1ccc(-c2ccc(-c3nc(-c4ccccc4)nc(-c4cccc5oc6cc(-c7cc8oc9ccccc9c8cc7-n7c8ccccc8c8cc(-c9ccccc9)ccc87)ccc6c45)n3)cc2)cc1]

TABLE 1-continued
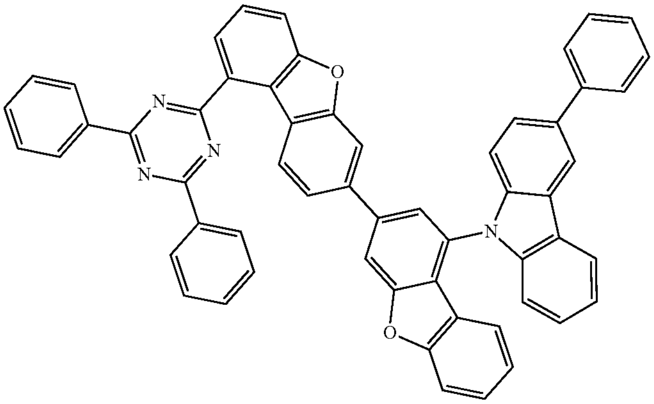 [SMILES: c1ccc(-c2ccc3c(c2)c2ccccc2n3-c2cc(-c3ccc4c(c3)oc3cccc(-c5nc(-c6ccccc6)nc(-c6ccccc6)n5)c34)cc3oc4ccccc4c23)cc1]
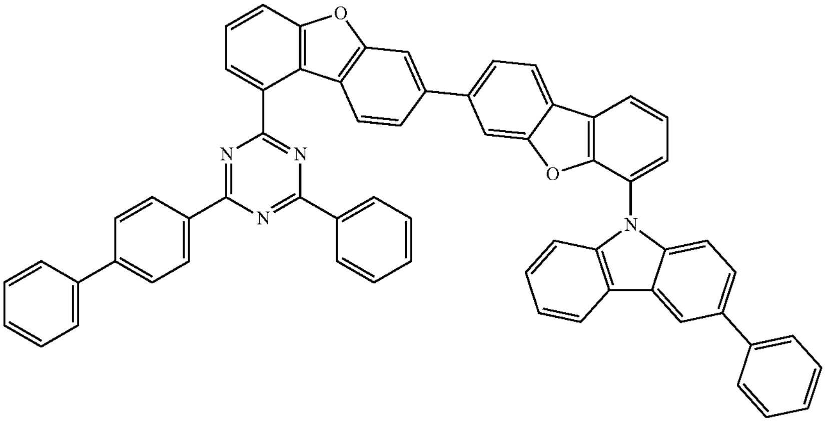 [SMILES: c1ccc(-c2ccc(-c3nc(-c4ccccc4)nc(-c4cccc5oc6cc(-c7ccc8c(c7)oc7c(-n9c%10ccccc%10c%10cc(-c%11ccccc%11)ccc%109)cccc78)ccc6c45)n3)cc2)cc1]
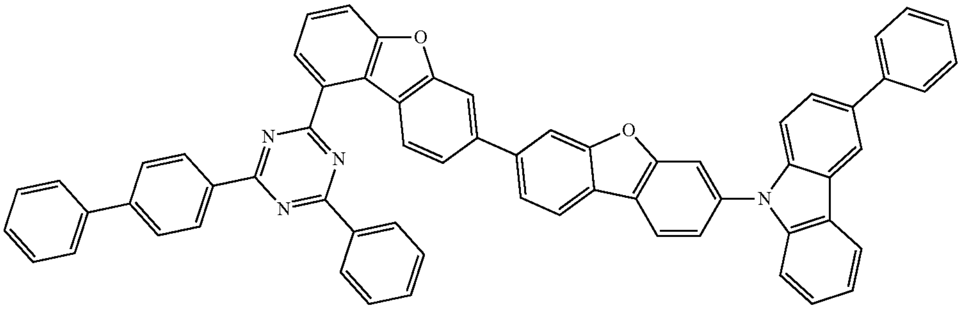 [SMILES: c1ccc(-c2ccc(-c3nc(-c4ccccc4)nc(-c4cccc5oc6cc(-c7ccc8c(c7)oc7cc(-n9c%10ccccc%10c%10cc(-c%11ccccc%11)ccc%109)ccc78)ccc6c45)n3)cc2)cc1]
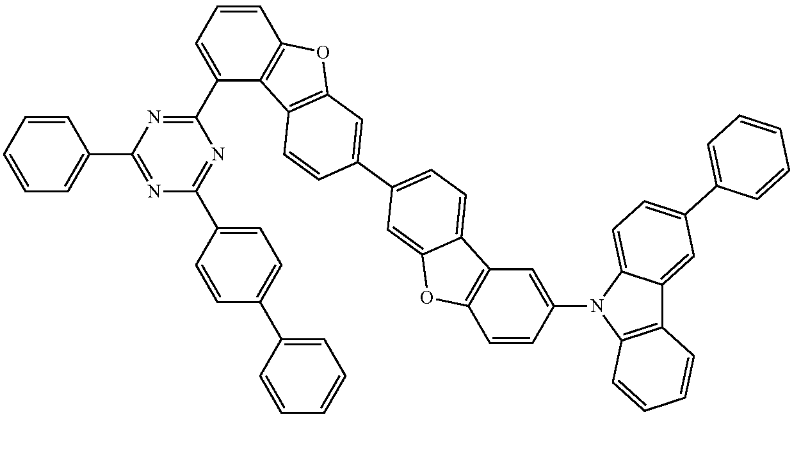 [SMILES: c1ccc(-c2ccc(-c3nc(-c4ccccc4)nc(-c4cccc5oc6cc(-c7ccc8c(c7)oc7ccc(-n9c%10ccccc%10c%10cc(-c%11ccccc%11)ccc%109)cc78)ccc6c45)n3)cc2)cc1]

TABLE 1-continued
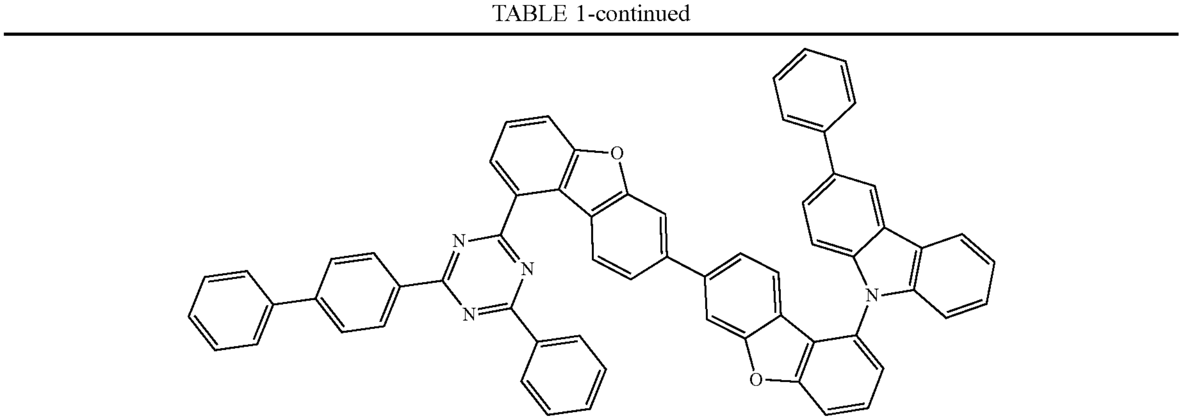
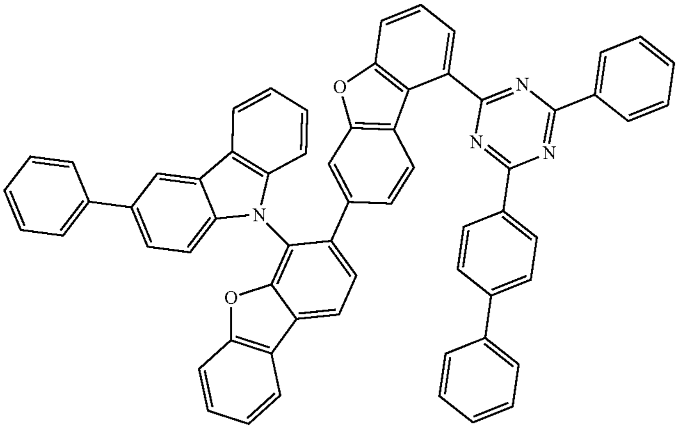 [SMILES: c1ccc(-c2ccc(-c3nc(-c4ccccc4)nc(-c4cccc5oc6cc(-c7ccc8c(oc9ccccc98)c7-n7c8ccccc8c8cc(-c9ccccc9)ccc87)ccc6c45)n3)cc2)cc1]
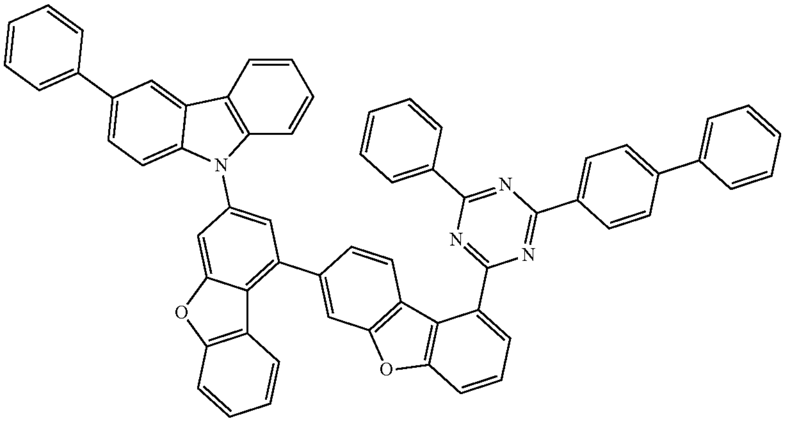 [SMILES: c1ccc(-c2ccc(-c3nc(-c4ccccc4)nc(-c4cccc5oc6cc(-c7cc(-n8c9ccccc9c9cc(-c%10ccccc%10)ccc98)cc8oc9ccccc9c78)ccc6c45)n3)cc2)cc1]
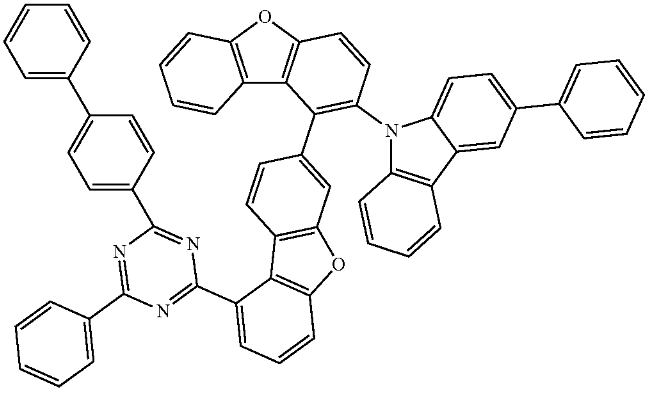 [SMILES: c1ccc(-c2ccc(-c3nc(-c4ccccc4)nc(-c4cccc5oc6cc(-c7c(-n8c9ccccc9c9cc(-c%10ccccc%10)ccc98)ccc8oc9ccccc9c78)ccc6c45)n3)cc2)cc1]

TABLE 1-continued
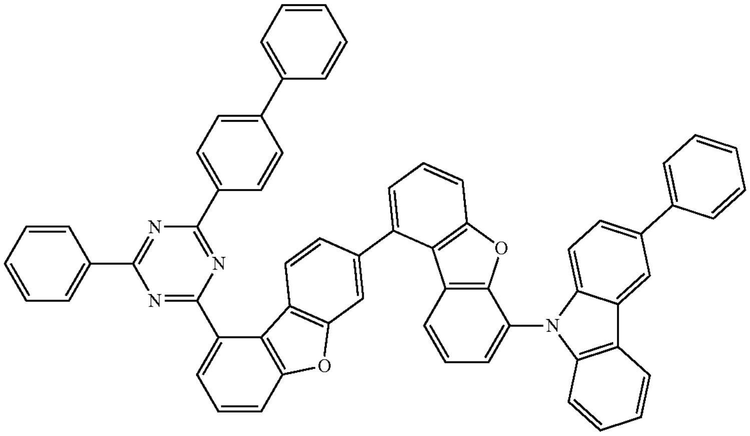 [SMILES: c1ccc(-c2ccc(-c3nc(-c4ccccc4)nc(-c4cccc5oc6cc(-c7cccc8oc9c(-n%10c%11ccccc%11c%11cc(-c%12ccccc%12)ccc%11%10)cccc9c78)ccc6c45)n3)cc2)cc1]
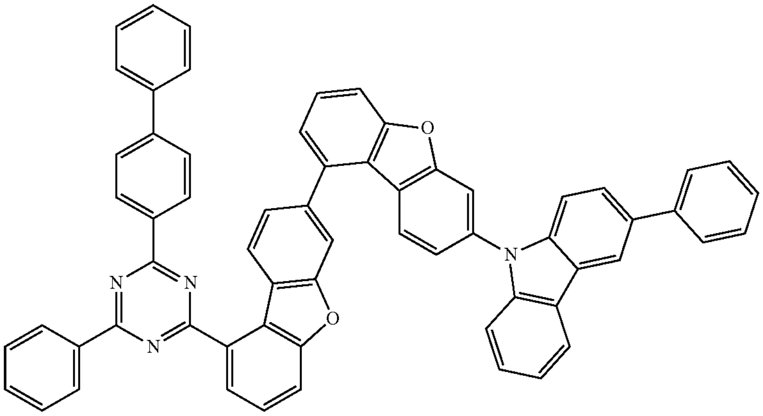 [SMILES: c1ccc(-c2ccc(-c3nc(-c4ccccc4)nc(-c4cccc5oc6cc(-c7cccc8oc9cc(-n%10c%11ccccc%11c%11cc(-c%12ccccc%12)ccc%11%10)ccc9c78)ccc6c45)n3)cc2)cc1]
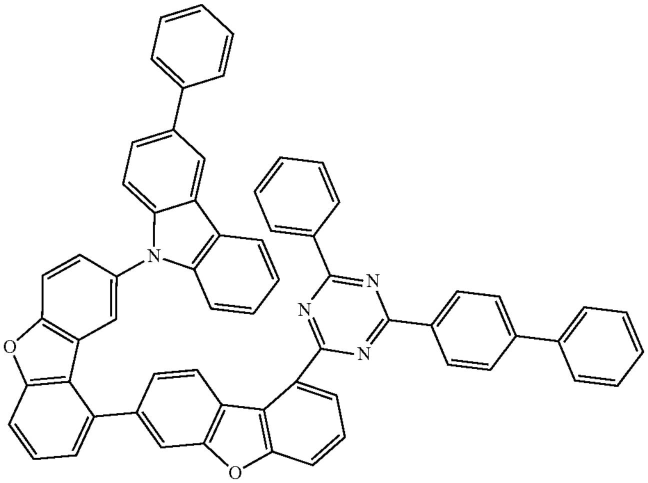 [SMILES: c1ccc(-c2ccc(-c3nc(-c4ccccc4)nc(-c4cccc5oc6cc(-c7cccc8oc9ccc(-n%10c%11ccccc%11c%11cc(-c%12ccccc%12)ccc%11%10)cc9c78)ccc6c45)n3)cc2)cc1]

TABLE 1-continued
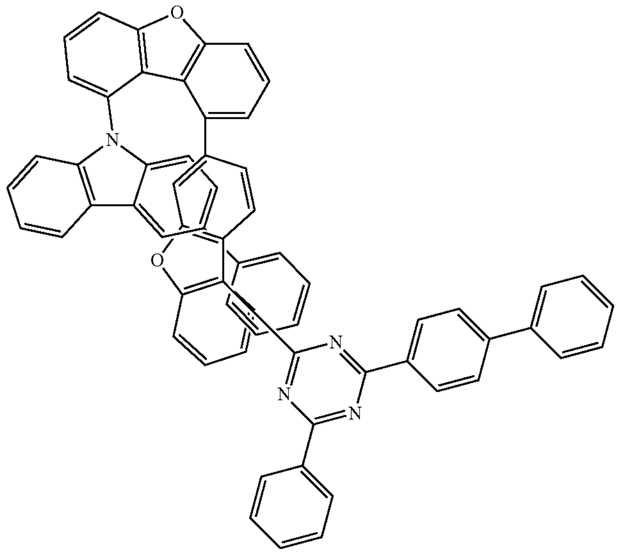
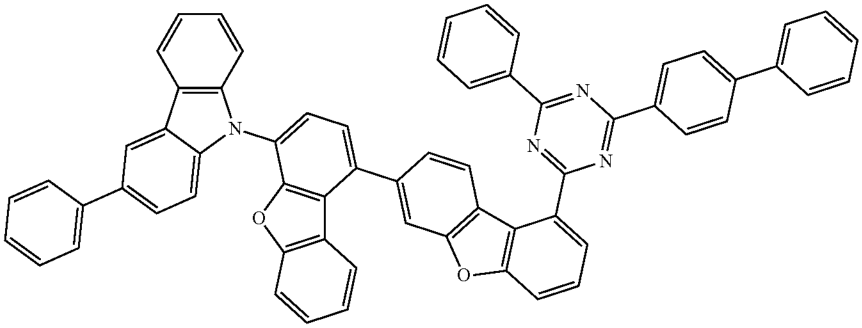 [SMILES: c1ccc(-c2ccc(-c3nc(-c4ccccc4)nc(-c4cccc5oc6cc(-c7ccc(-n8c9ccccc9c9cc(-c%10ccccc%10)ccc98)c8oc9ccccc9c78)ccc6c45)n3)cc2)cc1]
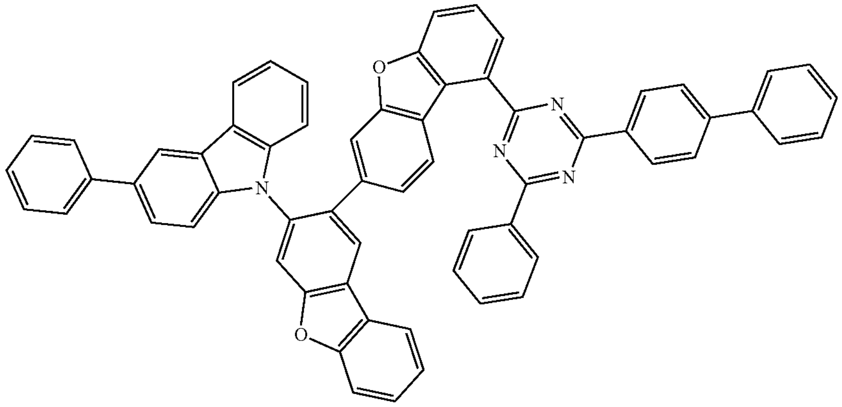 [SMILES: c1ccc(-c2ccc(-c3nc(-c4ccccc4)nc(-c4cccc5oc6cc(-c7cc8c(cc7-n7c9ccccc9c9cc(-c%10ccccc%10)ccc97)oc7ccccc78)ccc6c45)n3)cc2)cc1]

TABLE 1-continued
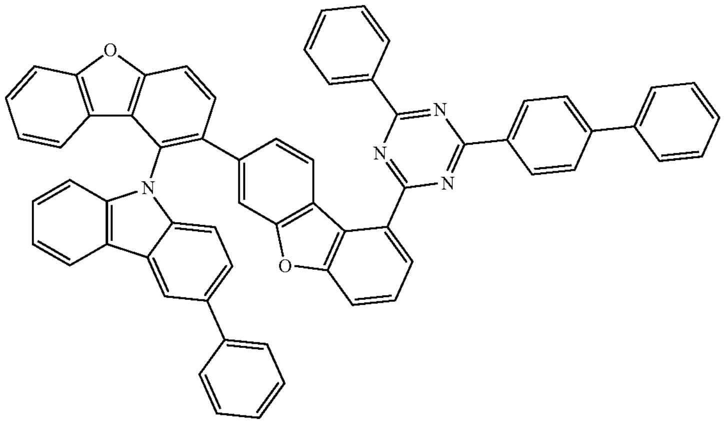 [SMILES: c1ccc(-c2ccc(-c3nc(-c4ccccc4)nc(-c4cccc5oc6cc(-c7ccc8oc9ccccc9c8c7-n7c8ccccc8c8cc(-c9ccccc9)ccc87)ccc6c45)n3)cc2)cc1]
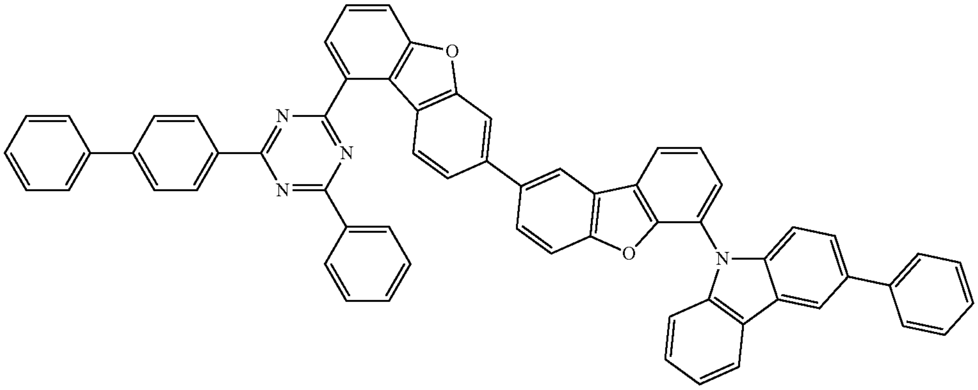 [SMILES: c1ccc(-c2ccc(-c3nc(-c4ccccc4)nc(-c4cccc5oc6cc(-c7ccc8oc9c(-n%10c%11ccccc%11c%11cc(-c%12ccccc%12)ccc%11%10)cccc9c8c7)ccc6c45)n3)cc2)cc1]
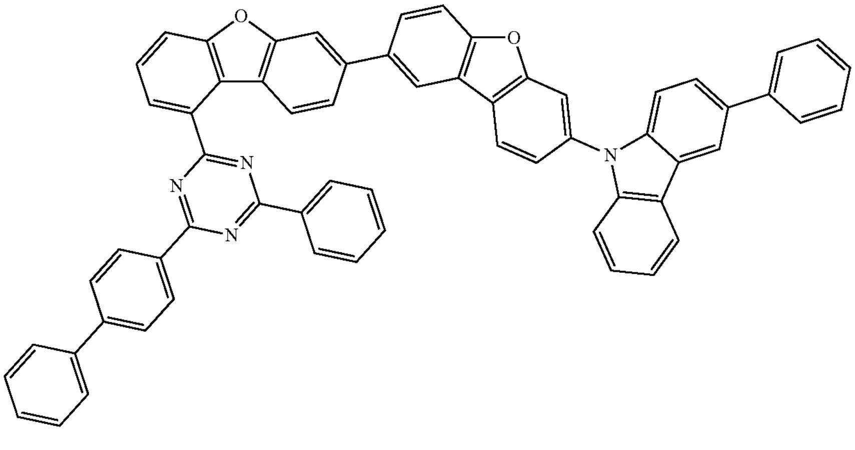 [SMILES: c1ccc(-c2ccc(-c3nc(-c4ccccc4)nc(-c4cccc5oc6cc(-c7ccc8oc9cc(-n%10c%11ccccc%11c%11cc(-c%12ccccc%12)ccc%11%10)ccc9c8c7)ccc6c45)n3)cc2)cc1]

TABLE 1-continued
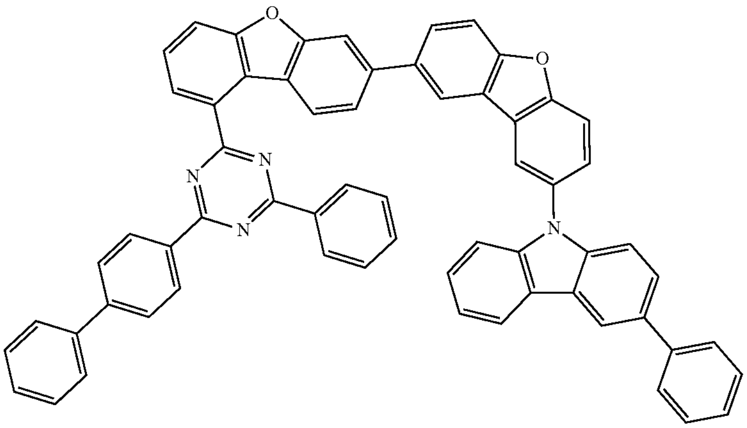 [SMILES: c1ccc(-c2ccc(-c3nc(-c4ccccc4)nc(-c4cccc5oc6cc(-c7ccc8oc9ccc(-n%10c%11ccccc%11c%11cc(-c%12ccccc%12)ccc%11%10)cc9c8c7)ccc6c45)n3)cc2)cc1]
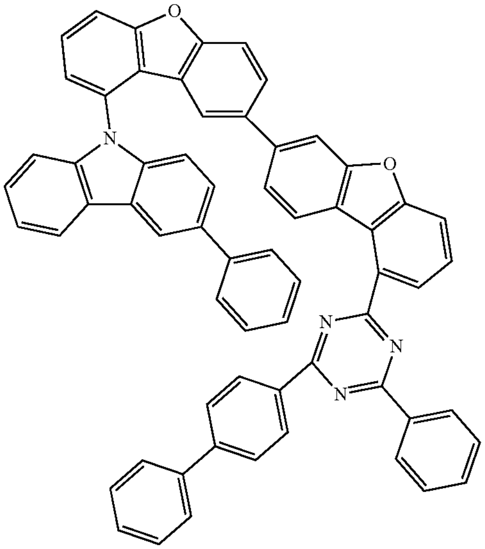 [SMILES: c1ccc(-c2ccc(-c3nc(-c4ccccc4)nc(-c4cccc5oc6cc(-c7ccc8oc9cccc(-n%10c%11ccccc%11c%11cc(-c%12ccccc%12)ccc%11%10)c9c8c7)ccc6c45)n3)cc2)cc1]
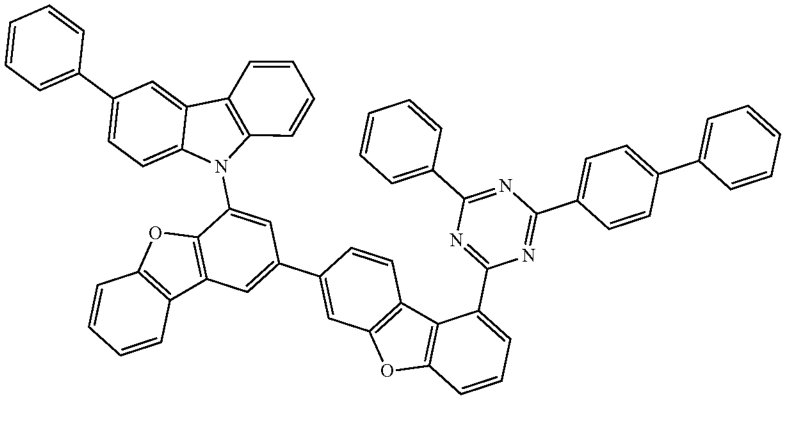 [SMILES: c1ccc(-c2ccc(-c3nc(-c4ccccc4)nc(-c4cccc5oc6cc(-c7cc(-n8c9ccccc9c9cc(-c%10ccccc%10)ccc98)c8oc9ccccc9c8c7)ccc6c45)n3)cc2)cc1]

TABLE 1-continued
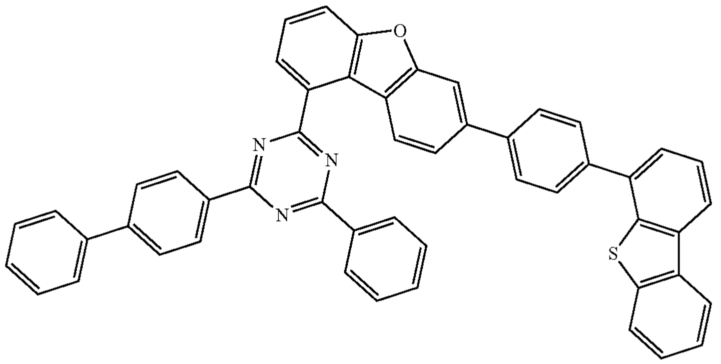 [SMILES: c1ccc(-c2ccc(-c3nc(-c4ccccc4)nc(-c4cccc5oc6cc(-c7ccc(-c8cccc9c8sc8ccccc89)cc7)ccc6c45)n3)cc2)cc1]
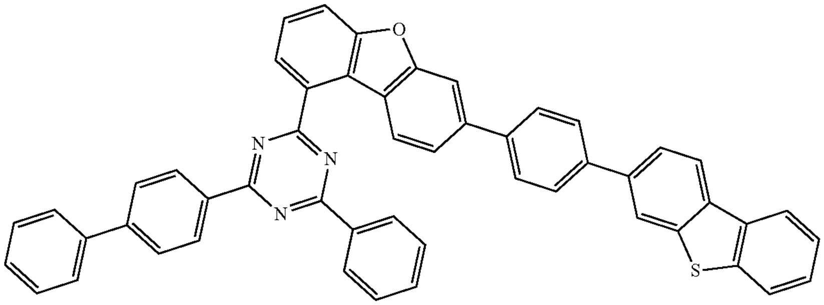 [SMILES: c1ccc(-c2ccc(-c3nc(-c4ccccc4)nc(-c4cccc5oc6cc(-c7ccc(-c8ccc9c(c8)sc8ccccc89)cc7)ccc6c45)n3)cc2)cc1]
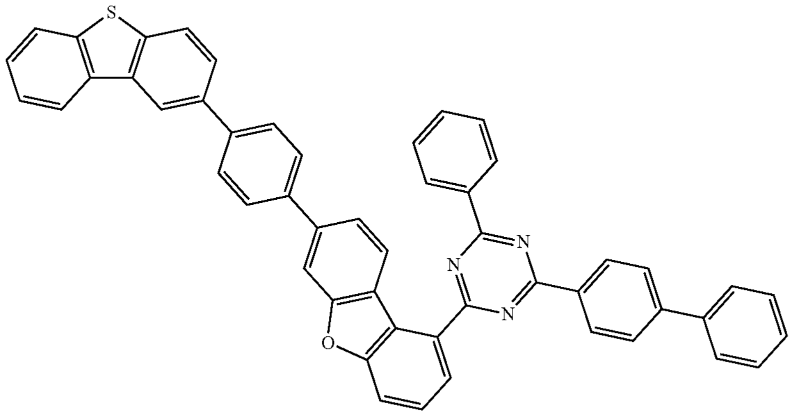 [SMILES: c1ccc(-c2ccc(-c3nc(-c4ccccc4)nc(-c4cccc5oc6cc(-c7ccc(-c8ccc9sc%10ccccc%10c9c8)cc7)ccc6c45)n3)cc2)cc1]
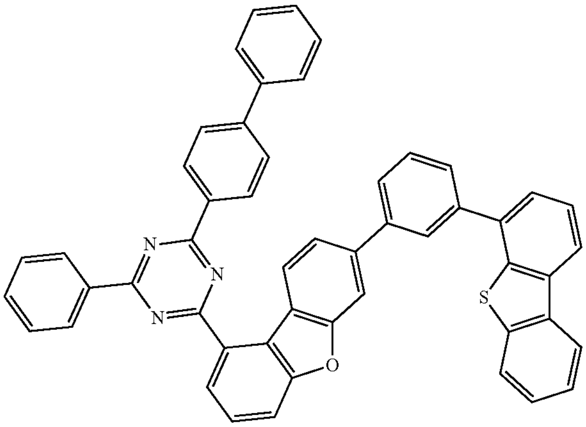 [SMILES: c1ccc(-c2ccc(-c3nc(-c4ccccc4)nc(-c4cccc5oc6cc(-c7cccc(-c8cccc9c8sc8ccccc89)c7)ccc6c45)n3)cc2)cc1]

TABLE 1-continued
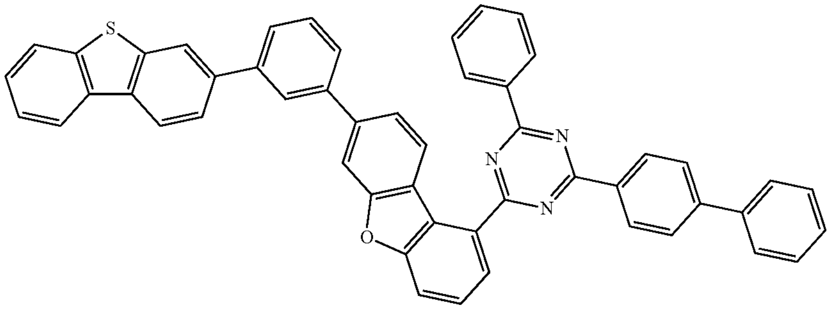 [SMILES: c1ccc(-c2ccc(-c3nc(-c4ccccc4)nc(-c4cccc5oc6cc(-c7cccc(-c8ccc9c(c8)sc8ccccc89)c7)ccc6c45)n3)cc2)cc1]
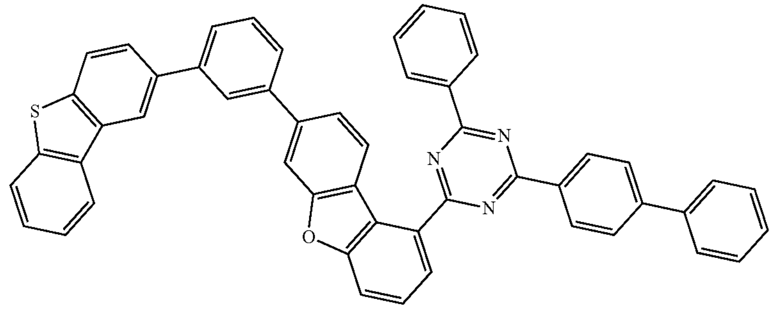 [SMILES: c1ccc(-c2ccc(-c3nc(-c4ccccc4)nc(-c4cccc5oc6cc(-c7cccc(-c8ccc9sc%10ccccc%10c9c8)c7)ccc6c45)n3)cc2)cc1]
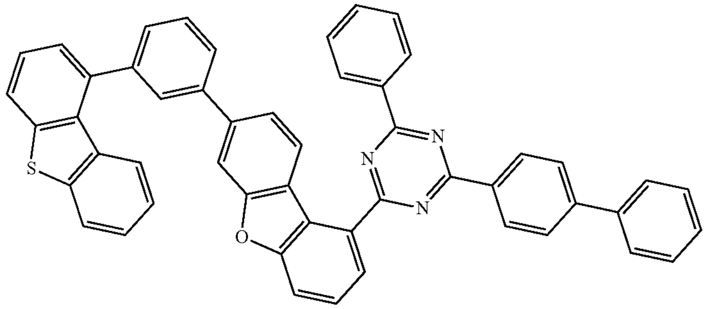 [SMILES: c1ccc(-c2ccc(-c3nc(-c4ccccc4)nc(-c4cccc5oc6cc(-c7cccc(-c8cccc9sc%10ccccc%10c89)c7)ccc6c45)n3)cc2)cc1]
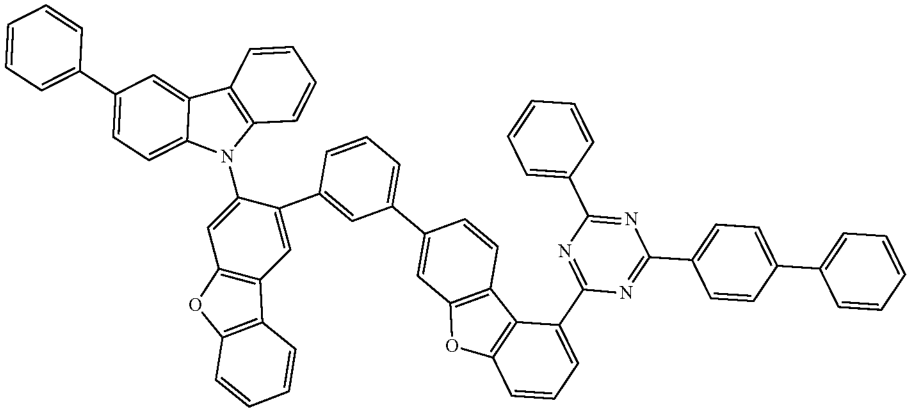 [SMILES: c1ccc(-c2ccc(-c3nc(-c4ccccc4)nc(-c4cccc5oc6cc(-c7cccc(-c8cc9c(cc8-n8c%10ccccc%10c%10cc(-c%11ccccc%11)ccc%108)oc8ccccc89)c7)ccc6c45)n3)cc2)cc1]

TABLE 1-continued
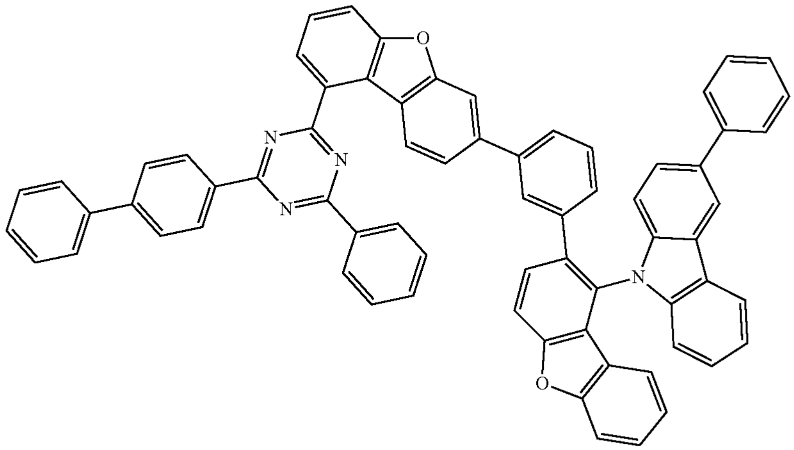 [SMILES: c1ccc(-c2ccc(-c3nc(-c4ccccc4)nc(-c4cccc5oc6cc(-c7cccc(-c8ccc9oc%10ccccc%10c9c8-n8c9ccccc9c9cc(-c%10ccccc%10)ccc98)c7)ccc6c45)n3)cc2)cc1]
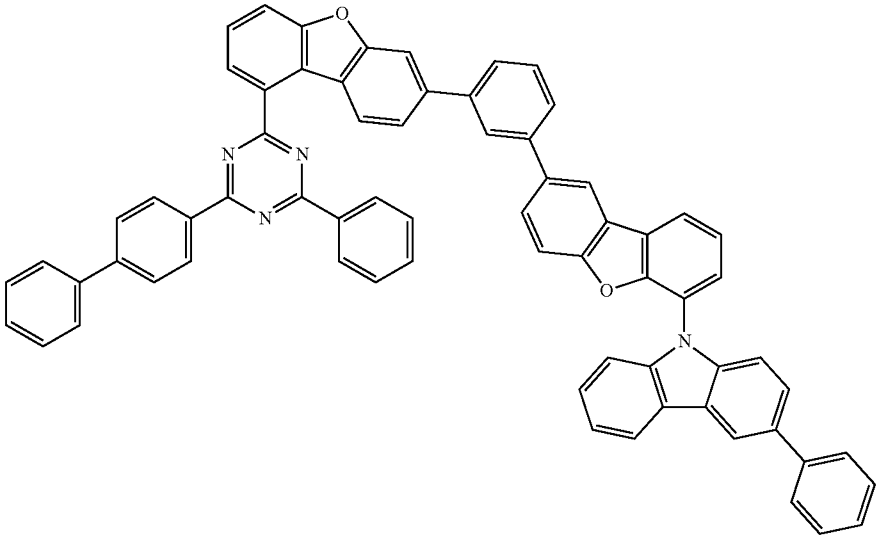 [SMILES: c1ccc(-c2ccc(-c3nc(-c4ccccc4)nc(-c4cccc5oc6cc(-c7cccc(-c8ccc9oc%10c(-n%11c%12ccccc%12c%12cc(-c%13ccccc%13)ccc%12%11)cccc%10c9c8)c7)ccc6c45)n3)cc2)cc1]
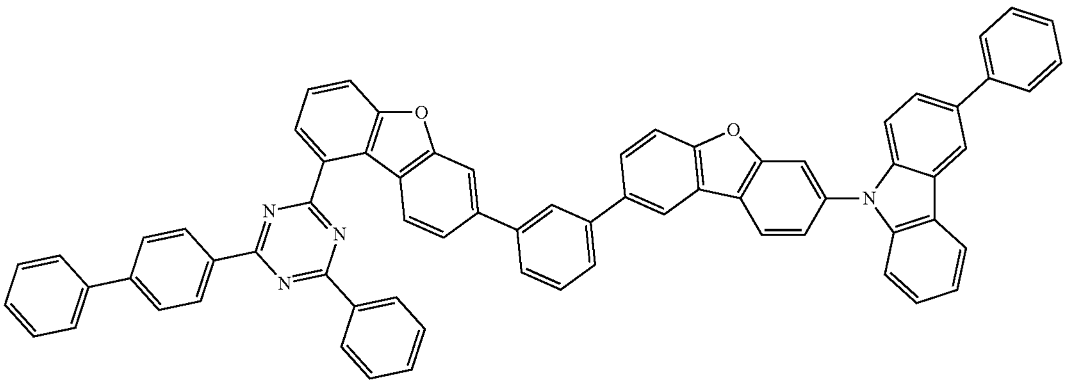 [SMILES: c1ccc(-c2ccc(-c3nc(-c4ccccc4)nc(-c4cccc5oc6cc(-c7cccc(-c8ccc9oc%10cc(-n%11c%12ccccc%12c%12cc(-c%13ccccc%13)ccc%12%11)ccc%10c9c8)c7)ccc6c45)n3)cc2)cc1]

TABLE 1-continued
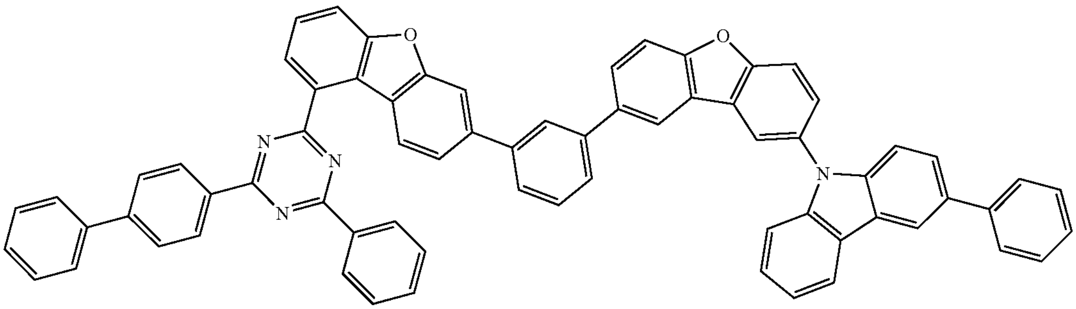 [SMILES: c1ccc(-c2ccc(-c3nc(-c4ccccc4)nc(-c4cccc5oc6cc(-c7cccc(-c8ccc9oc%10ccc(-n%11c%12ccccc%12c%12cc(-c%13ccccc%13)ccc%12%11)cc%10c9c8)c7)ccc6c45)n3)cc2)cc1]
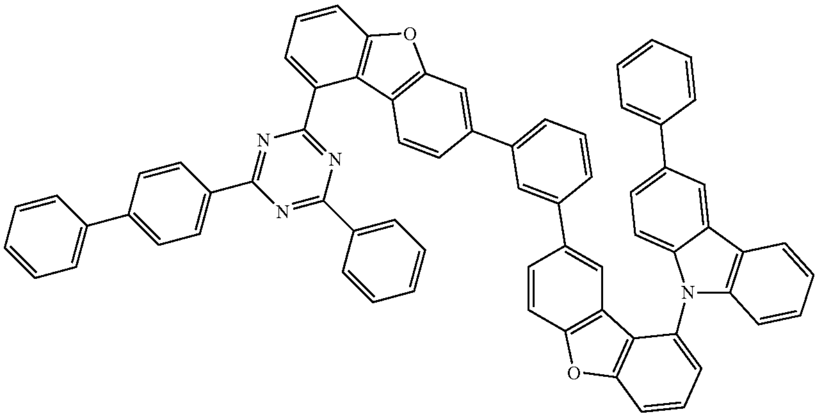 [SMILES: c1ccc(-c2ccc(-c3nc(-c4ccccc4)nc(-c4cccc5oc6cc(-c7cccc(-c8ccc9oc%10cccc(-n%11c%12ccccc%12c%12cc(-c%13ccccc%13)ccc%12%11)c%10c9c8)c7)ccc6c45)n3)cc2)cc1]
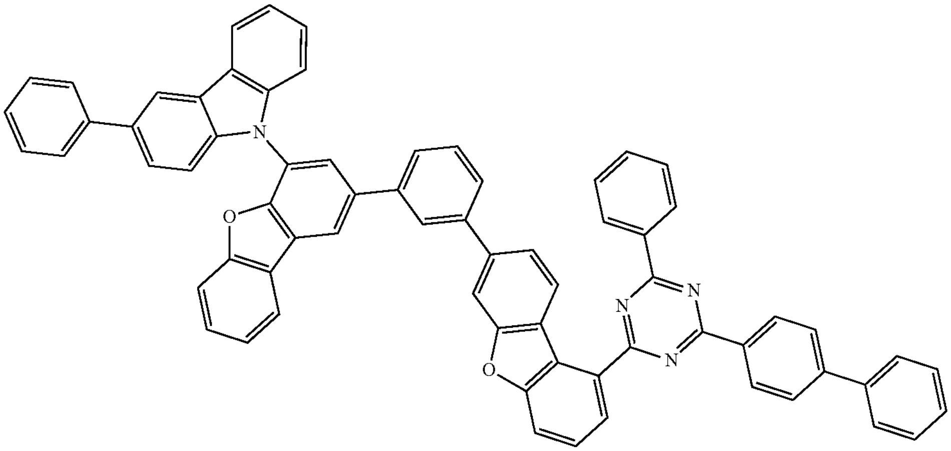 [SMILES: c1ccc(-c2ccc(-c3nc(-c4ccccc4)nc(-c4cccc5oc6cc(-c7cccc(-c8cc(-n9c%10ccccc%10c%10cc(-c%11ccccc%11)ccc%109)c9oc%10ccccc%10c9c8)c7)ccc6c45)n3)cc2)cc1]
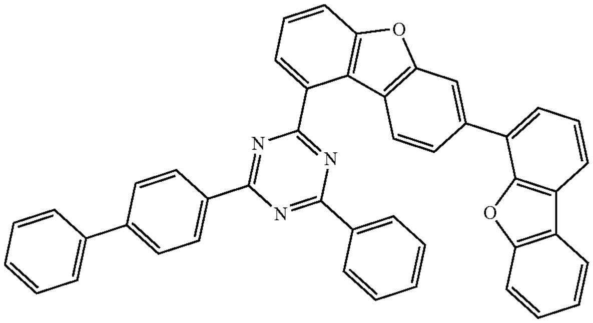 [SMILES: c1ccc(-c2ccc(-c3nc(-c4ccccc4)nc(-c4cccc5oc6cc(-c7cccc8c7oc7ccccc78)ccc6c45)n3)cc2)cc1]

TABLE 1-continued
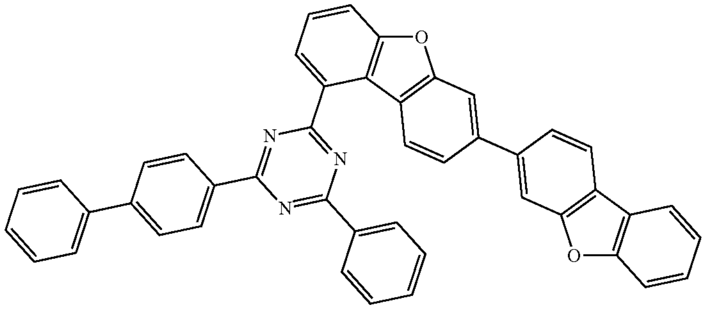 [SMILES: c1ccc(-c2ccc(-c3nc(-c4ccccc4)nc(-c4cccc5oc6cc(-c7ccc8c(c7)oc7ccccc78)ccc6c45)n3)cc2)cc1]
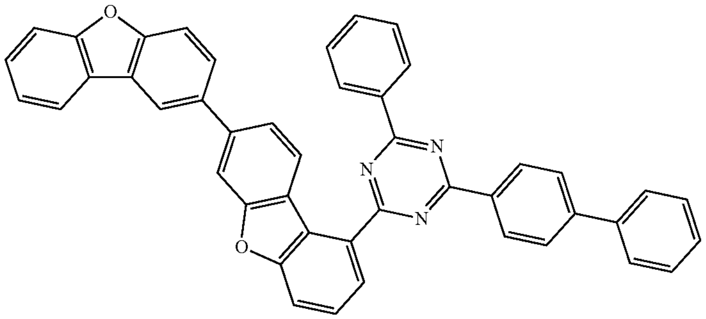 [SMILES: c1ccc(-c2ccc(-c3nc(-c4ccccc4)nc(-c4cccc5oc6cc(-c7ccc8oc9ccccc9c8c7)ccc6c45)n3)cc2)cc1]
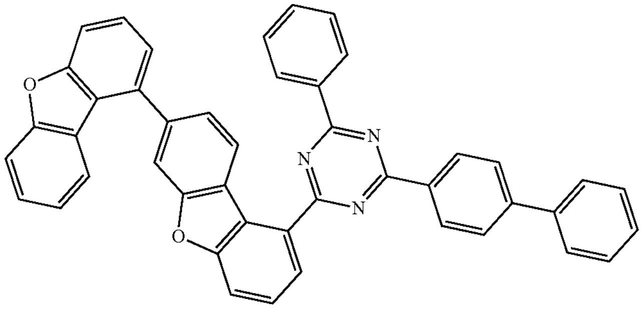 [SMILES: c1ccc(-c2ccc(-c3nc(-c4ccccc4)nc(-c4cccc5oc6cc(-c7cccc8oc9ccccc9c78)ccc6c45)n3)cc2)cc1]
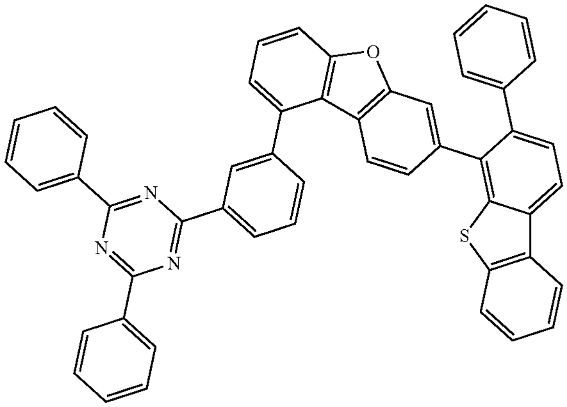 [SMILES: c1ccc(-c2nc(-c3ccccc3)nc(-c3cccc(-c4cccc5oc6cc(-c7c(-c8ccccc8)ccc8c7sc7ccccc78)ccc6c45)c3)n2)cc1]

TABLE 1-continued
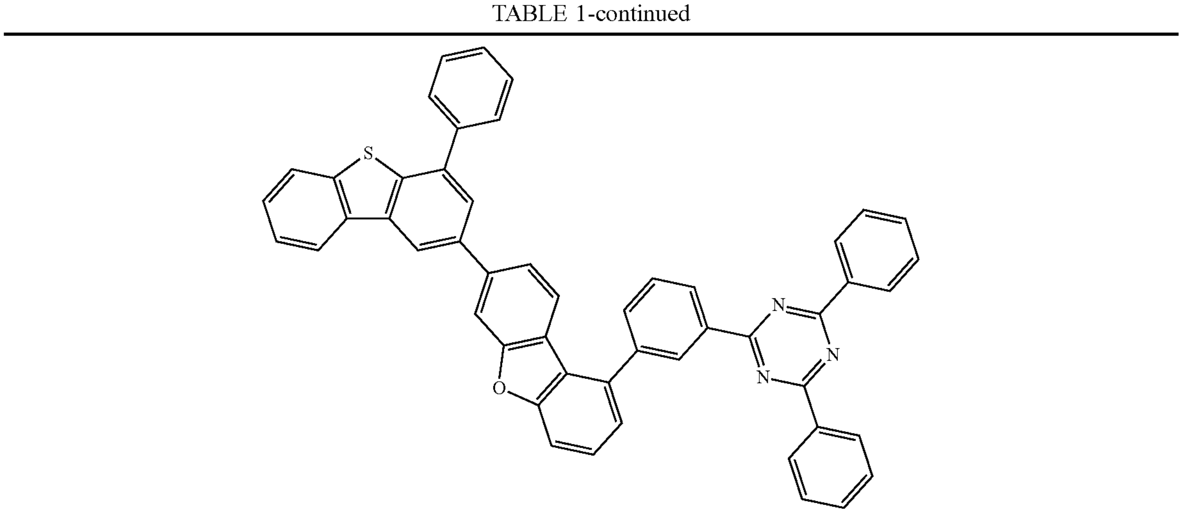
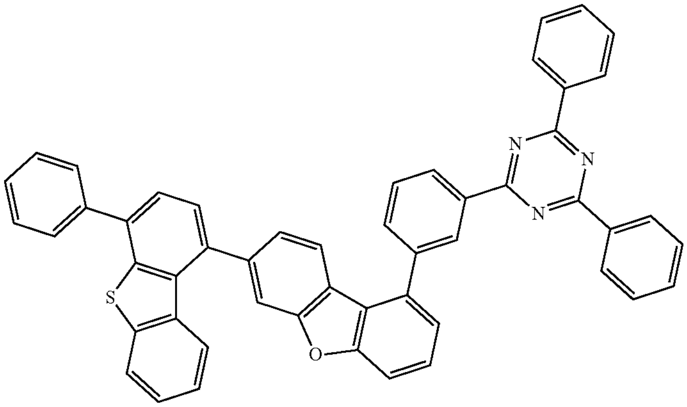 [SMILES: c1ccc(-c2nc(-c3ccccc3)nc(-c3cccc(-c4cccc5oc6cc(-c7ccc(-c8ccccc8)c8sc9ccccc9c78)ccc6c45)c3)n2)cc1]
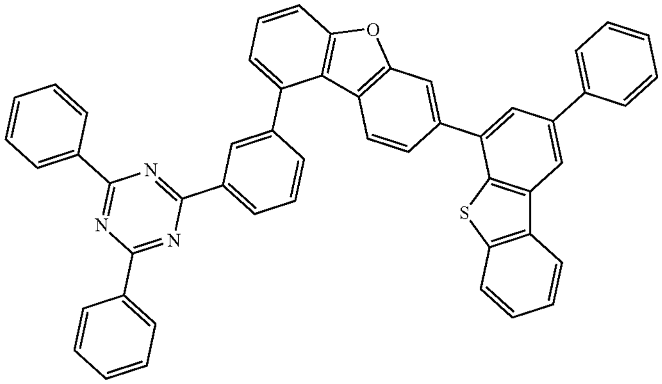 [SMILES: c1ccc(-c2cc(-c3ccc4c(c3)oc3cccc(-c5cccc(-c6nc(-c7ccccc7)nc(-c7ccccc7)n6)c5)c34)c3sc4ccccc4c3c2)cc1]
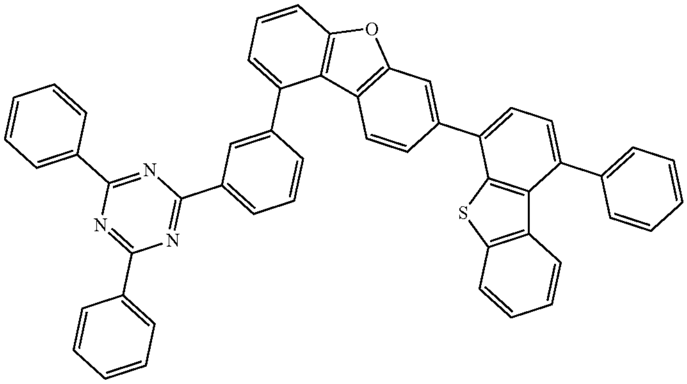 [SMILES: c1ccc(-c2nc(-c3ccccc3)nc(-c3cccc(-c4cccc5oc6cc(-c7ccc(-c8ccccc8)c8c7sc7ccccc78)ccc6c45)c3)n2)cc1]

TABLE 1-continued
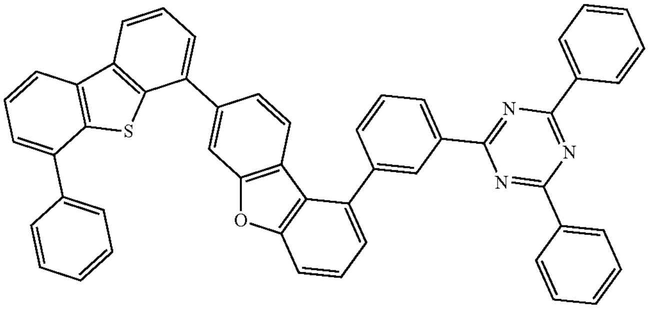 [SMILES: c1ccc(-c2nc(-c3ccccc3)nc(-c3cccc(-c4cccc5oc6cc(-c7cccc8c7sc7c(-c9ccccc9)cccc78)ccc6c45)c3)n2)cc1]
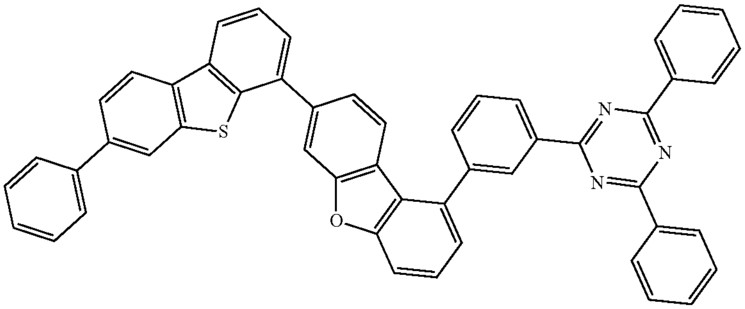 [SMILES: c1ccc(-c2ccc3c(c2)sc2c(-c4ccc5c(c4)oc4cccc(-c6cccc(-c7nc(-c8ccccc8)nc(-c8ccccc8)n7)c6)c45)cccc23)cc1]
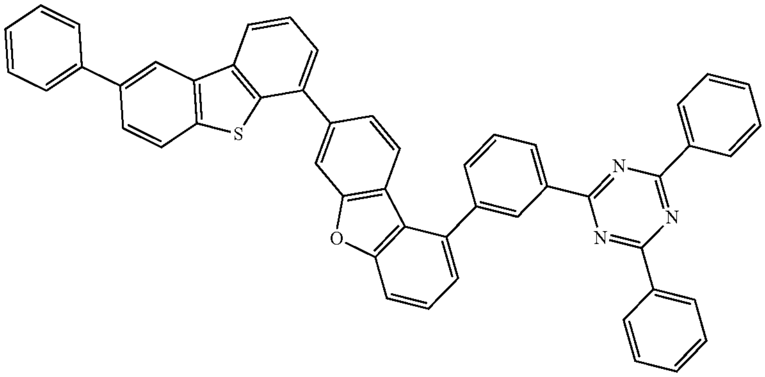 [SMILES: c1ccc(-c2ccc3sc4c(-c5ccc6c(c5)oc5cccc(-c7cccc(-c8nc(-c9ccccc9)nc(-c9ccccc9)n8)c7)c56)cccc4c3c2)cc1]
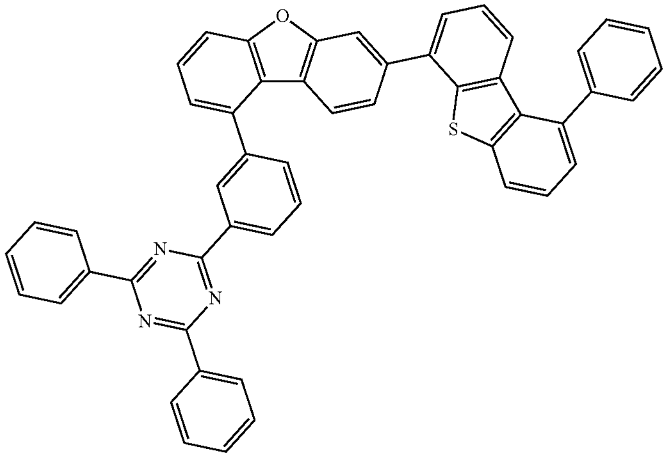 [SMILES: c1ccc(-c2nc(-c3ccccc3)nc(-c3cccc(-c4cccc5oc6cc(-c7cccc8c7sc7cccc(-c9ccccc9)c78)ccc6c45)c3)n2)cc1]

TABLE 1-continued
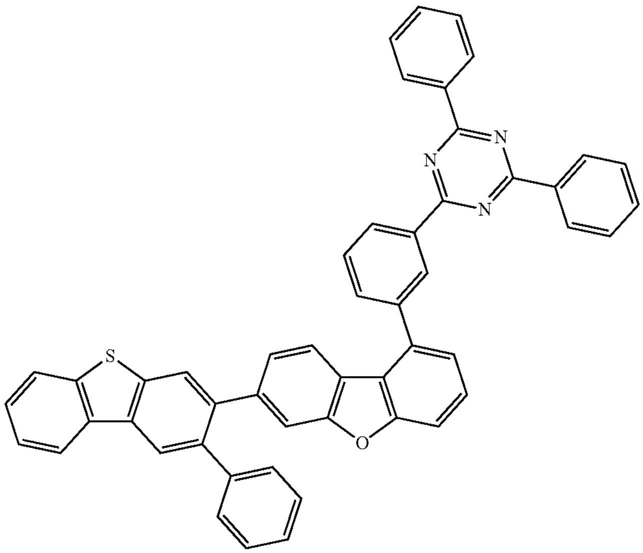 [SMILES: c1ccc(-c2nc(-c3ccccc3)nc(-c3cccc(-c4cccc5oc6cc(-c7cc8sc9ccccc9c8cc7-c7ccccc7)ccc6c45)c3)n2)cc1]
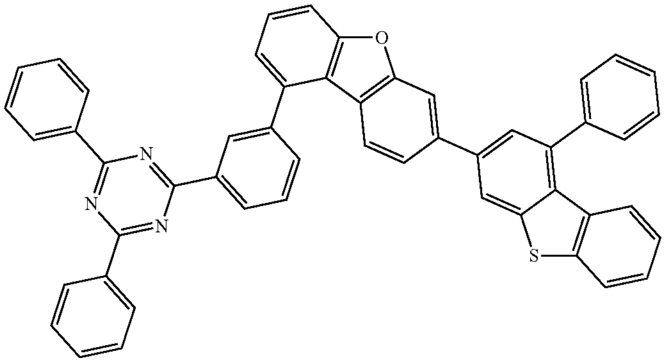 [SMILES: c1ccc(-c2nc(-c3ccccc3)nc(-c3cccc(-c4cccc5oc6cc(-c7cc(-c8ccccc8)c8c(c7)sc7ccccc78)ccc6c45)c3)n2)cc1]
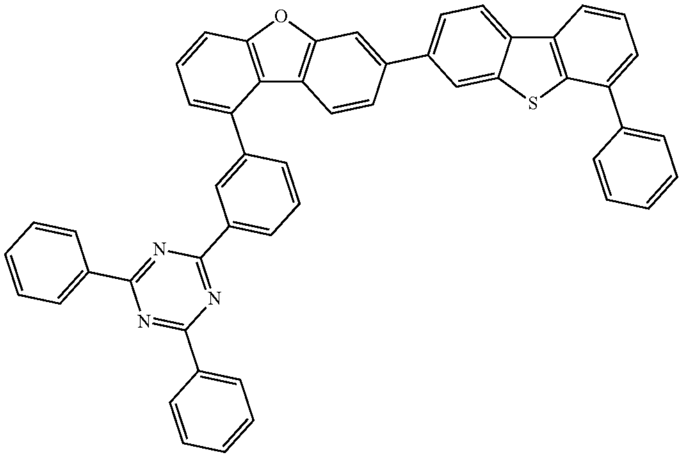 [SMILES: c1ccc(-c2nc(-c3ccccc3)nc(-c3cccc(-c4cccc5oc6cc(-c7ccc8c(c7)sc7c(-c9ccccc9)cccc78)ccc6c45)c3)n2)cc1]

TABLE 1-continued
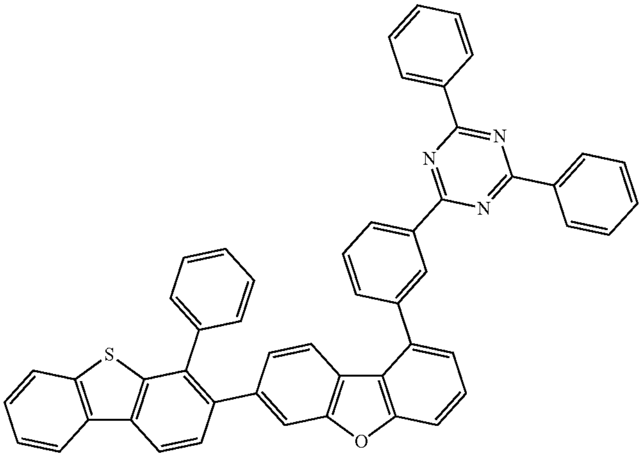 [SMILES: c1ccc(-c2nc(-c3ccccc3)nc(-c3cccc(-c4cccc5oc6cc(-c7ccc8c(sc9ccccc98)c7-c7ccccc7)ccc6c45)c3)n2)cc1]
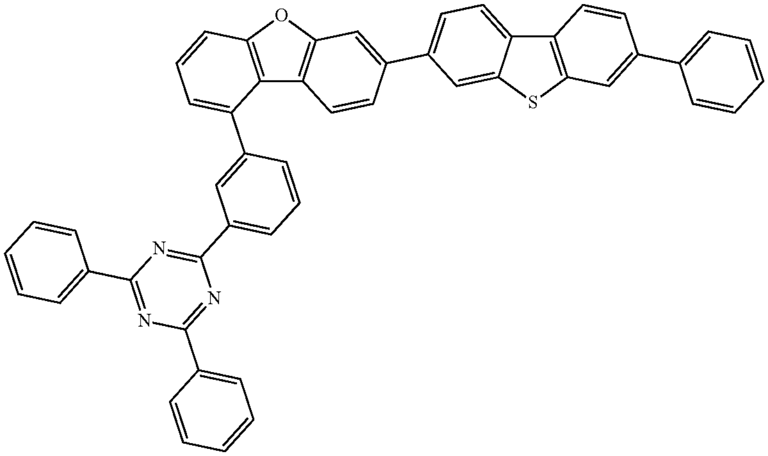 [SMILES: c1ccc(-c2ccc3c(c2)sc2cc(-c4ccc5c(c4)oc4cccc(-c6cccc(-c7nc(-c8ccccc8)nc(-c8ccccc8)n7)c6)c45)ccc23)cc1]
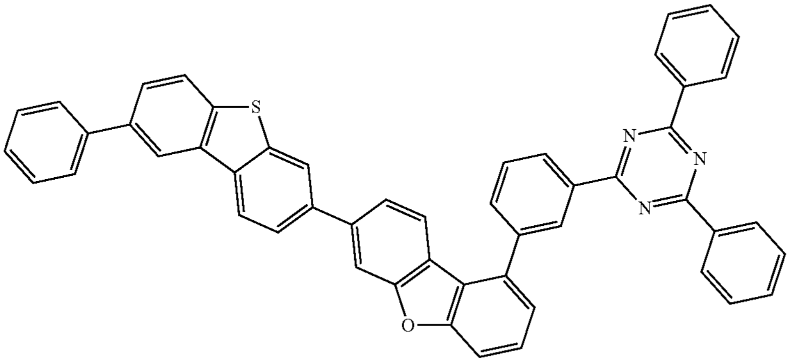 [SMILES: c1ccc(-c2ccc3sc4cc(-c5ccc6c(c5)oc5cccc(-c7cccc(-c8nc(-c9ccccc9)nc(-c9ccccc9)n8)c7)c56)ccc4c3c2)cc1]
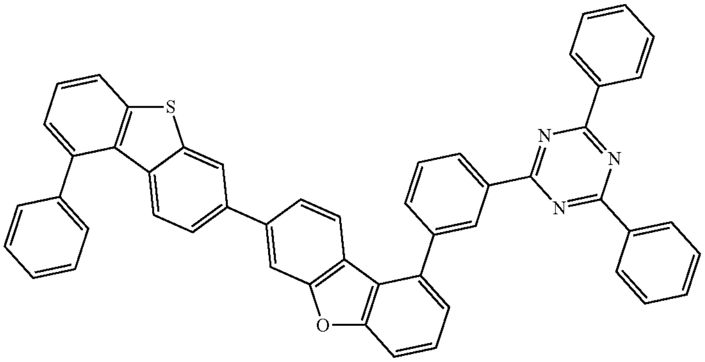 [SMILES: c1ccc(-c2nc(-c3ccccc3)nc(-c3cccc(-c4cccc5oc6cc(-c7ccc8c(c7)sc7cccc(-c9ccccc9)c78)ccc6c45)c3)n2)cc1]

TABLE 1-continued
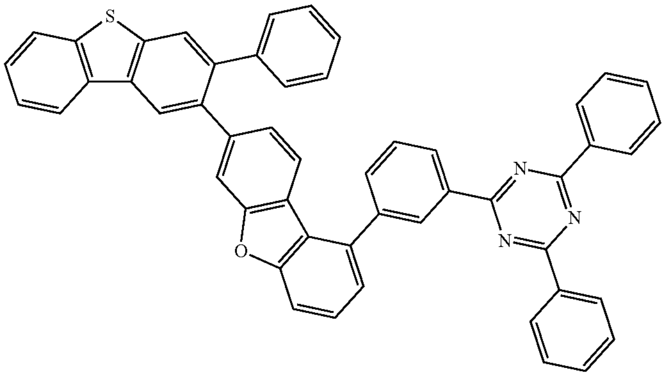 [SMILES: c1ccc(-c2nc(-c3ccccc3)nc(-c3cccc(-c4cccc5oc6cc(-c7cc8c(cc7-c7ccccc7)sc7ccccc78)ccc6c45)c3)n2)cc1]
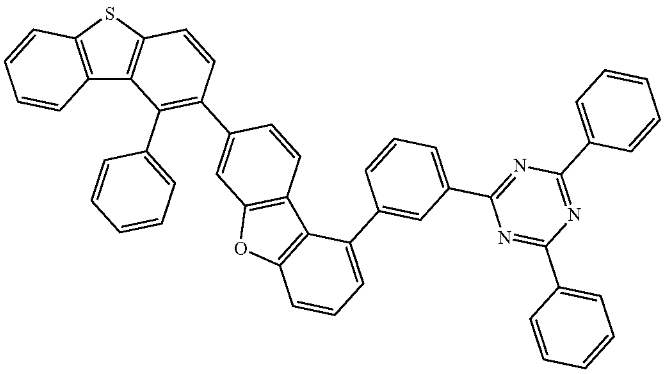 [SMILES: c1ccc(-c2nc(-c3ccccc3)nc(-c3cccc(-c4cccc5oc6cc(-c7ccc8sc9ccccc9c8c7-c7ccccc7)ccc6c45)c3)n2)cc1]
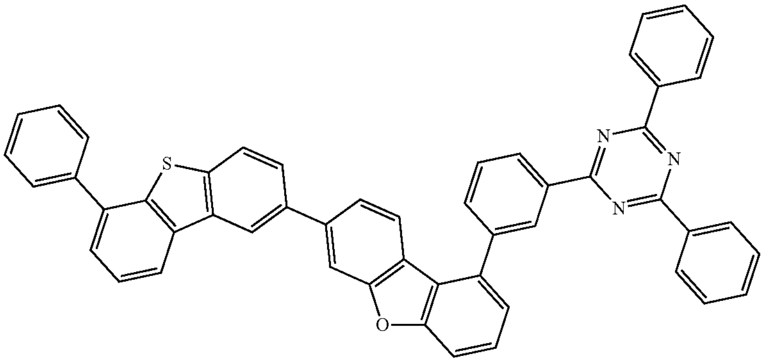 [SMILES: c1ccc(-c2nc(-c3ccccc3)nc(-c3cccc(-c4cccc5oc6cc(-c7ccc8sc9c(-c%10ccccc%10)cccc9c8c7)ccc6c45)c3)n2)cc1]
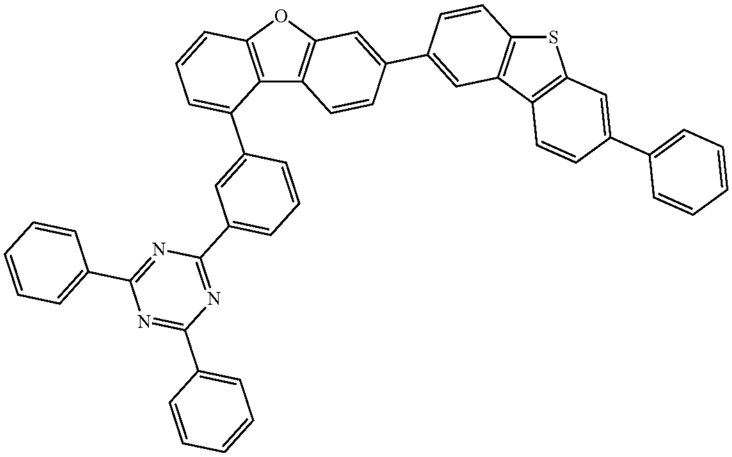 [SMILES: c1ccc(-c2ccc3c(c2)sc2ccc(-c4ccc5c(c4)oc4cccc(-c6cccc(-c7nc(-c8ccccc8)nc(-c8ccccc8)n7)c6)c45)cc23)cc1]

TABLE 1-continued
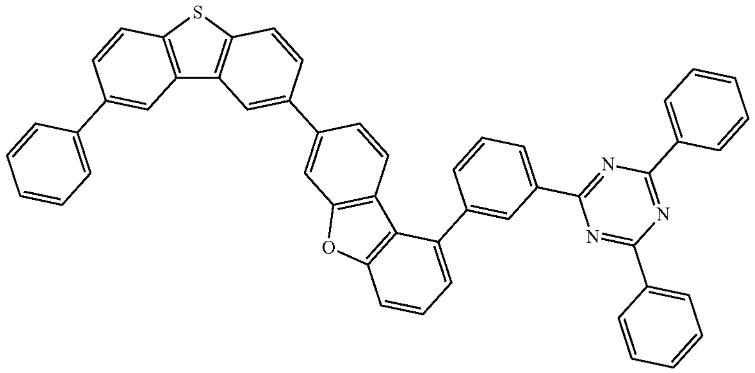 [SMILES: c1ccc(-c2ccc3sc4ccc(-c5ccc6c(c5)oc5cccc(-c7cccc(-c8nc(-c9ccccc9)nc(-c9ccccc9)n8)c7)c56)cc4c3c2)cc1]
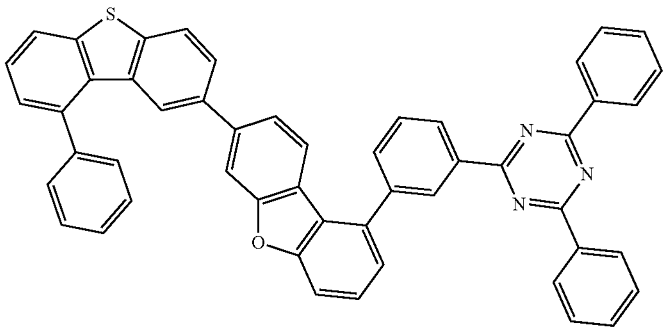 [SMILES: c1ccc(-c2nc(-c3ccccc3)nc(-c3cccc(-c4cccc5oc6cc(-c7ccc8sc9cccc(-c%10ccccc%10)c9c8c7)ccc6c45)c3)n2)cc1]
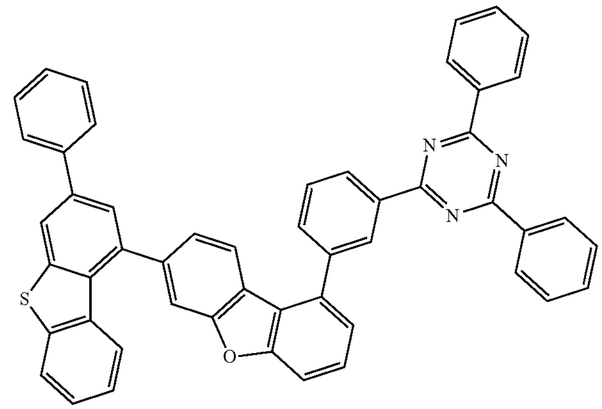 [SMILES: c1ccc(-c2cc(-c3ccc4c(c3)oc3cccc(-c5cccc(-c6nc(-c7ccccc7)nc(-c7ccccc7)n6)c5)c34)c3c(c2)sc2ccccc23)cc1]
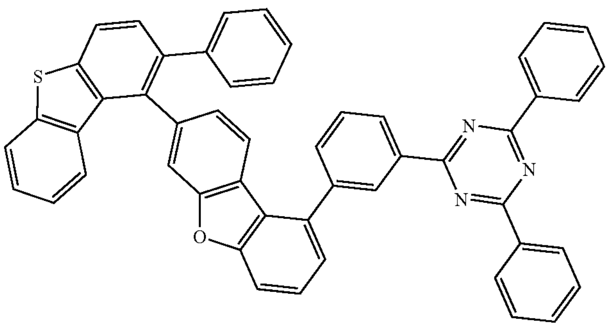 [SMILES: c1ccc(-c2nc(-c3ccccc3)nc(-c3cccc(-c4cccc5oc6cc(-c7c(-c8ccccc8)ccc8sc9ccccc9c78)ccc6c45)c3)n2)cc1]

TABLE 1-continued
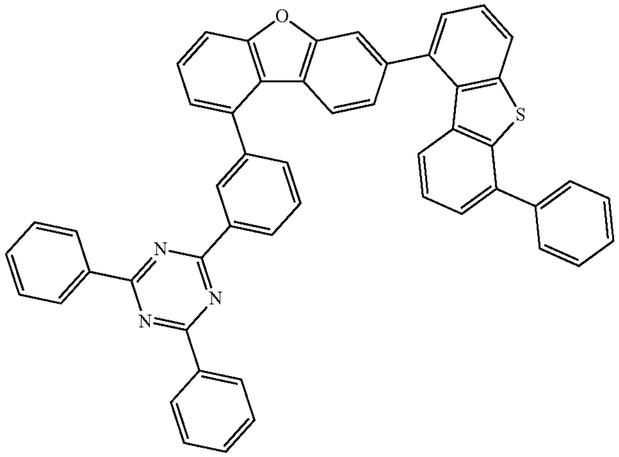 [SMILES: c1ccc(-c2nc(-c3ccccc3)nc(-c3cccc(-c4cccc5oc6cc(-c7cccc8sc9c(-c%10ccccc%10)cccc9c78)ccc6c45)c3)n2)cc1]
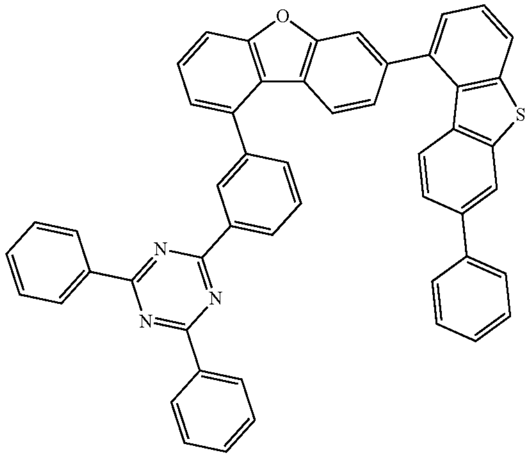 [SMILES: c1ccc(-c2ccc3c(c2)sc2cccc(-c4ccc5c(c4)oc4cccc(-c6cccc(-c7nc(-c8ccccc8)nc(-c8ccccc8)n7)c6)c45)c23)cc1]
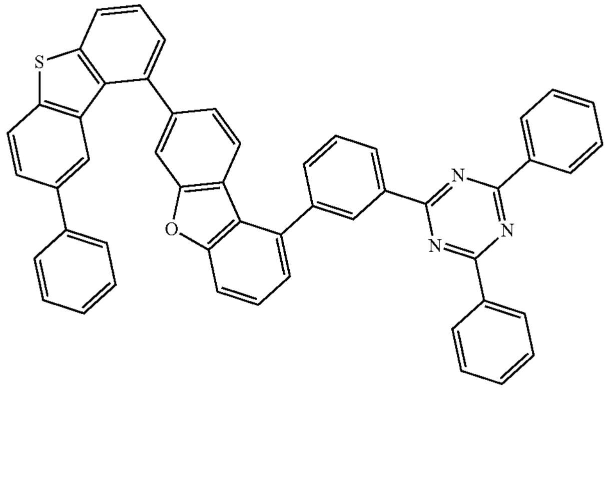 [SMILES: c1ccc(-c2ccc3sc4cccc(-c5ccc6c(c5)oc5cccc(-c7cccc(-c8nc(-c9ccccc9)nc(-c9ccccc9)n8)c7)c56)c4c3c2)cc1]

TABLE 1-continued
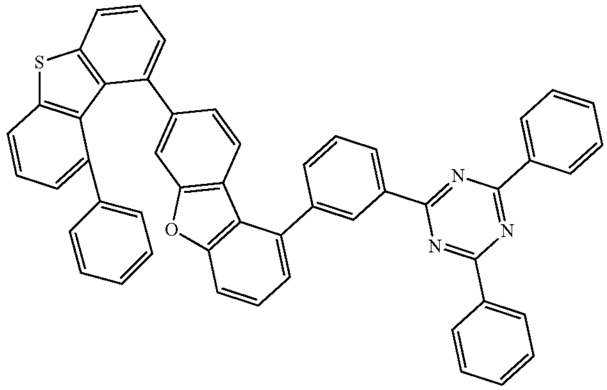 [SMILES: c1ccc(-c2nc(-c3ccccc3)nc(-c3cccc(-c4cccc5oc6cc(-c7cccc8sc9cccc(-c%10ccccc%10)c9c78)ccc6c45)c3)n2)cc1]
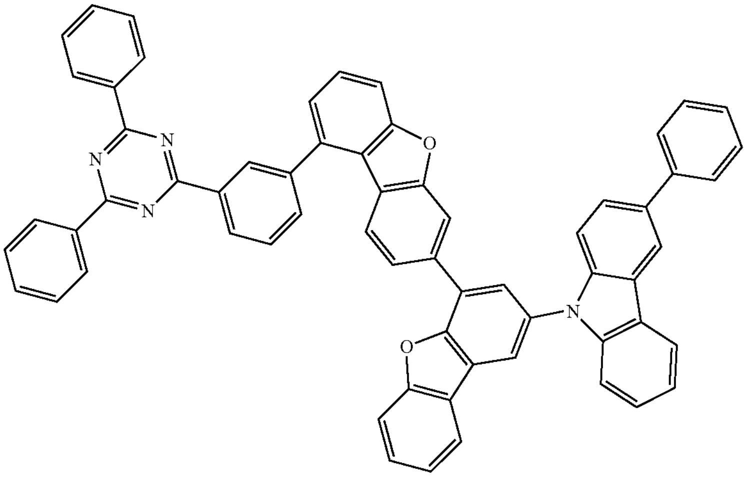 [SMILES: c1ccc(-c2ccc3c(c2)c2ccccc2n3-c2cc(-c3ccc4c(c3)oc3cccc(-c5cccc(-c6nc(-c7ccccc7)nc(-c7ccccc7)n6)c5)c34)c3oc4ccccc4c3c2)cc1]
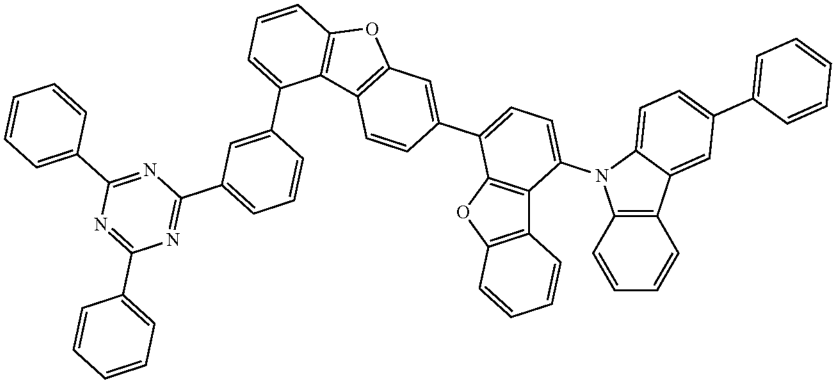 [SMILES: c1ccc(-c2ccc3c(c2)c2ccccc2n3-c2ccc(-c3ccc4c(c3)oc3cccc(-c5cccc(-c6nc(-c7ccccc7)nc(-c7ccccc7)n6)c5)c34)c3oc4ccccc4c23)cc1]
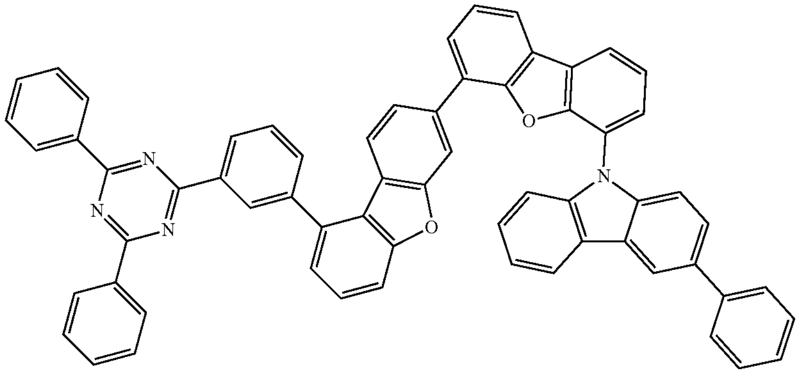 [SMILES: c1ccc(-c2ccc3c(c2)c2ccccc2n3-c2cccc3c2oc2c(-c4ccc5c(c4)oc4cccc(-c6cccc(-c7nc(-c8ccccc8)nc(-c8ccccc8)n7)c6)c45)cccc23)cc1]

TABLE 1-continued
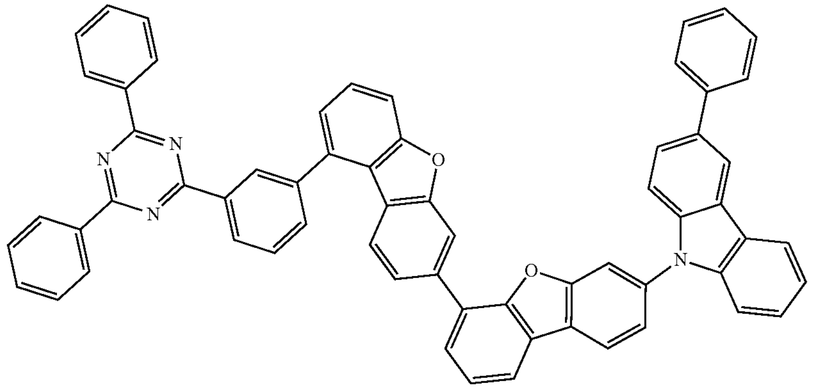 [SMILES: c1ccc(-c2ccc3c(c2)c2ccccc2n3-c2ccc3c(c2)oc2c(-c4ccc5c(c4)oc4cccc(-c6cccc(-c7nc(-c8ccccc8)nc(-c8ccccc8)n7)c6)c45)cccc23)cc1]
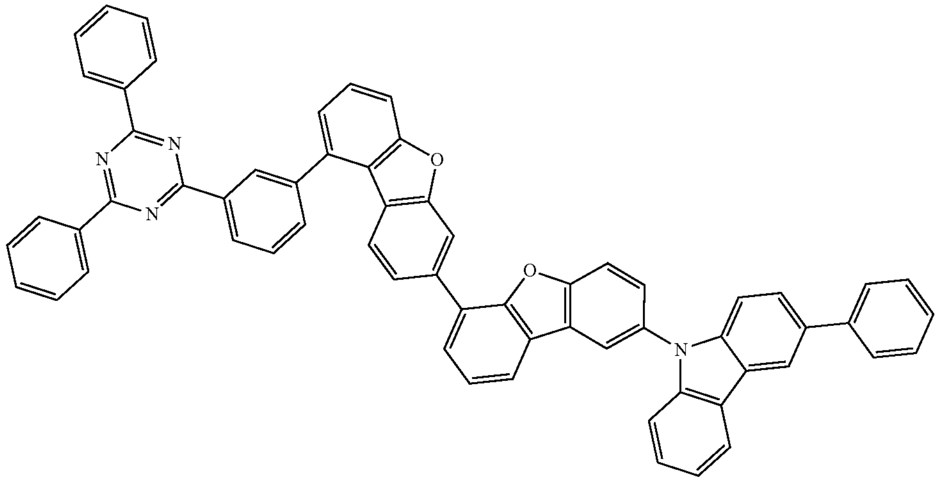 [SMILES: c1ccc(-c2ccc3c(c2)c2ccccc2n3-c2ccc3oc4c(-c5ccc6c(c5)oc5cccc(-c7cccc(-c8nc(-c9ccccc9)nc(-c9ccccc9)n8)c7)c56)cccc4c3c2)cc1]
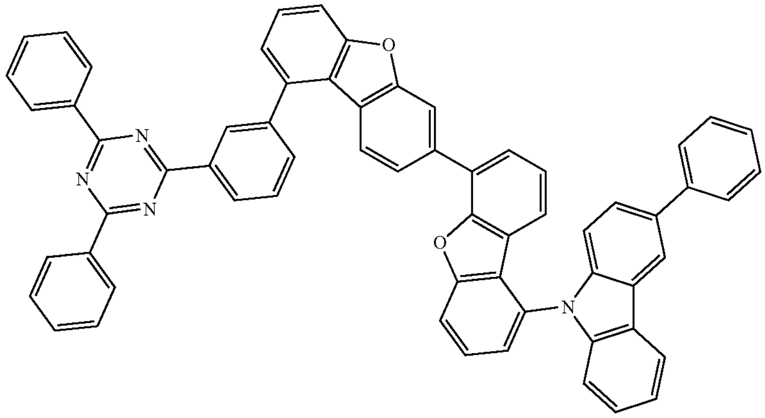 [SMILES: c1ccc(-c2ccc3c(c2)c2ccccc2n3-c2cccc3oc4c(-c5ccc6c(c5)oc5cccc(-c7cccc(-c8nc(-c9ccccc9)nc(-c9ccccc9)n8)c7)c56)cccc4c23)cc1]

TABLE 1-continued
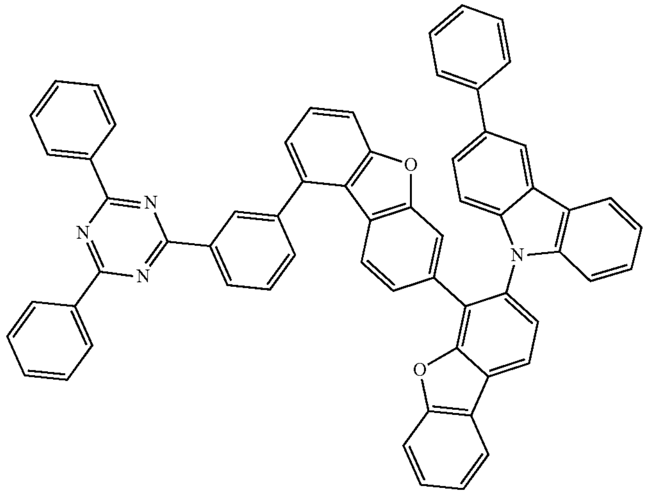 [SMILES: c1ccc(-c2ccc3c(c2)c2ccccc2n3-c2ccc3c(oc4ccccc43)c2-c2ccc3c(c2)oc2cccc(-c4cccc(-c5nc(-c6ccccc6)nc(-c6ccccc6)n5)c4)c23)cc1]
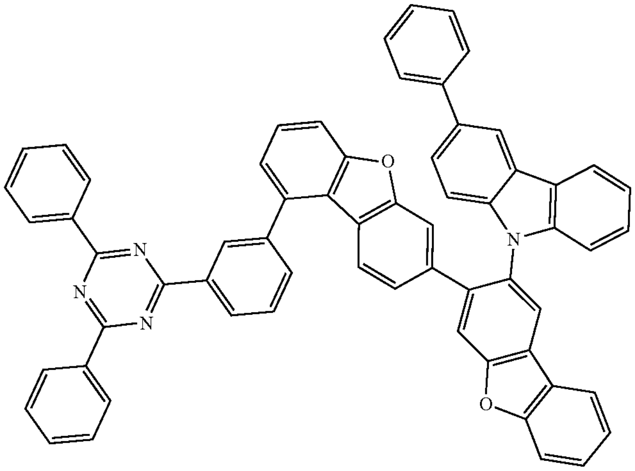 [SMILES: c1ccc(-c2ccc3c(c2)c2ccccc2n3-c2cc3c(cc2-c2ccc4c(c2)oc2cccc(-c5cccc(-c6nc(-c7ccccc7)nc(-c7ccccc7)n6)c5)c24)oc2ccccc23)cc1]
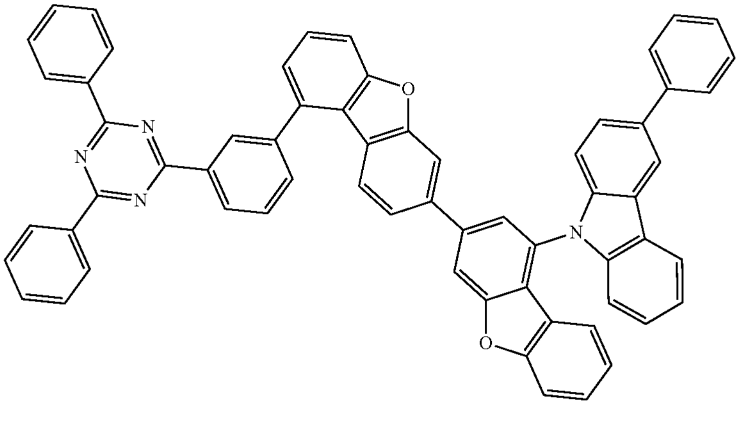 [SMILES: c1ccc(-c2ccc3c(c2)c2ccccc2n3-c2cc(-c3ccc4c(c3)oc3cccc(-c5cccc(-c6nc(-c7ccccc7)nc(-c7ccccc7)n6)c5)c34)cc3oc4ccccc4c23)cc1]

TABLE 1-continued
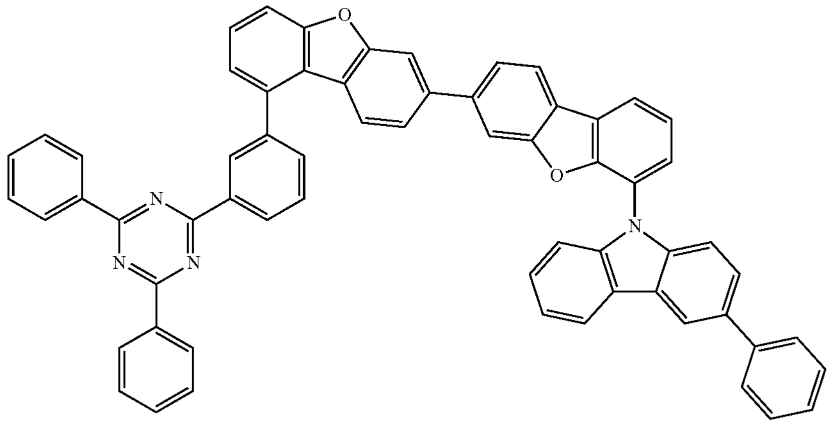 [SMILES: c1ccc(-c2ccc3c(c2)c2ccccc2n3-c2cccc3c2oc2cc(-c4ccc5c(c4)oc4cccc(-c6cccc(-c7nc(-c8ccccc8)nc(-c8ccccc8)n7)c6)c45)ccc23)cc1]
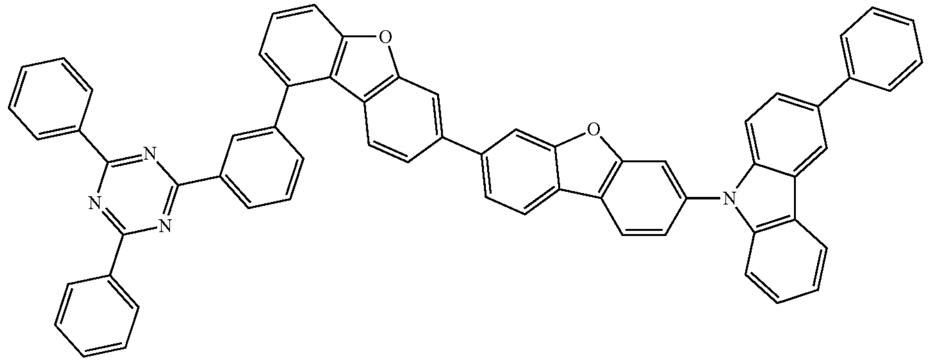 [SMILES: c1ccc(-c2ccc3c(c2)c2ccccc2n3-c2ccc3c(c2)oc2cc(-c4ccc5c(c4)oc4cccc(-c6cccc(-c7nc(-c8ccccc8)nc(-c8ccccc8)n7)c6)c45)ccc23)cc1]
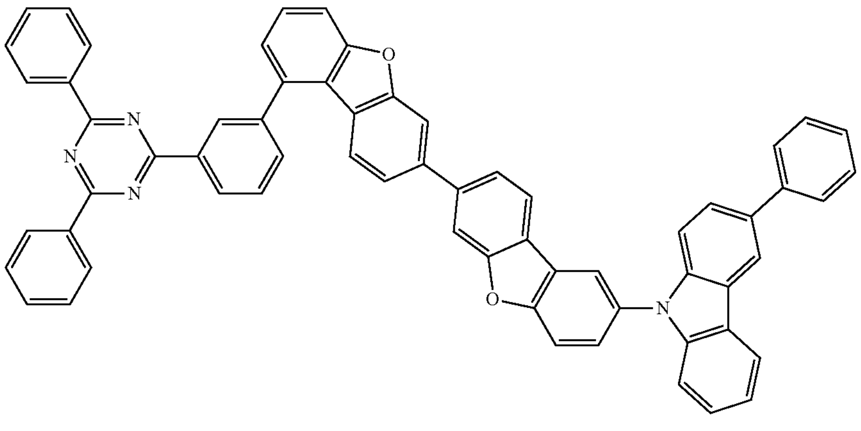 [SMILES: c1ccc(-c2ccc3c(c2)c2ccccc2n3-c2ccc3oc4cc(-c5ccc6c(c5)oc5cccc(-c7cccc(-c8nc(-c9ccccc9)nc(-c9ccccc9)n8)c7)c56)ccc4c3c2)cc1]
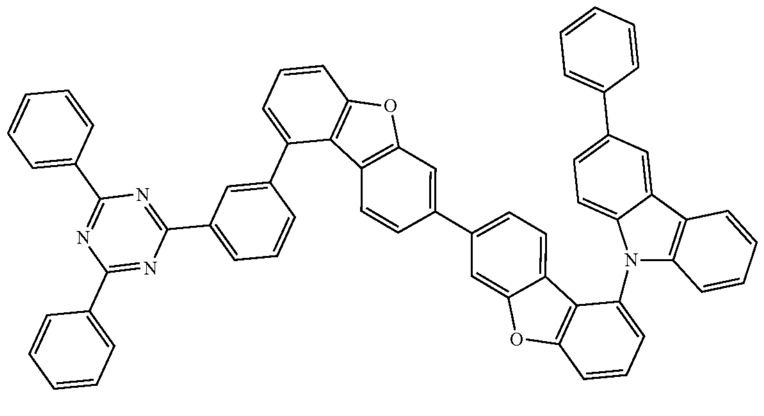 [SMILES: c1ccc(-c2ccc3c(c2)c2ccccc2n3-c2cccc3oc4cc(-c5ccc6c(c5)oc5cccc(-c7cccc(-c8nc(-c9ccccc9)nc(-c9ccccc9)n8)c7)c56)ccc4c23)cc1]

TABLE 1-continued
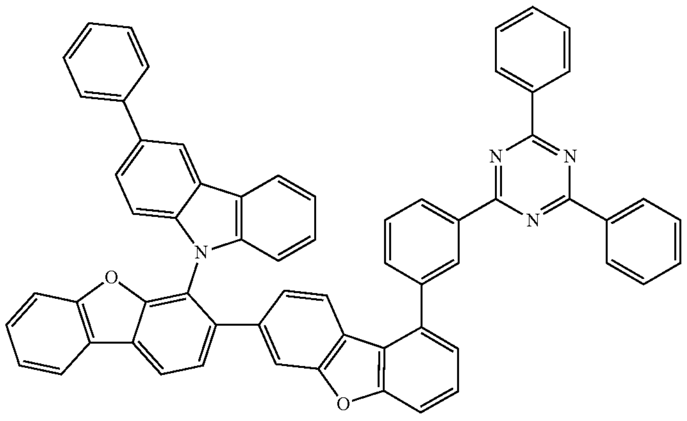 [SMILES: c1ccc(-c2ccc3c(c2)c2ccccc2n3-c2c(-c3ccc4c(c3)oc3cccc(-c5cccc(-c6nc(-c7ccccc7)nc(-c7ccccc7)n6)c5)c34)ccc3c2oc2ccccc23)cc1]
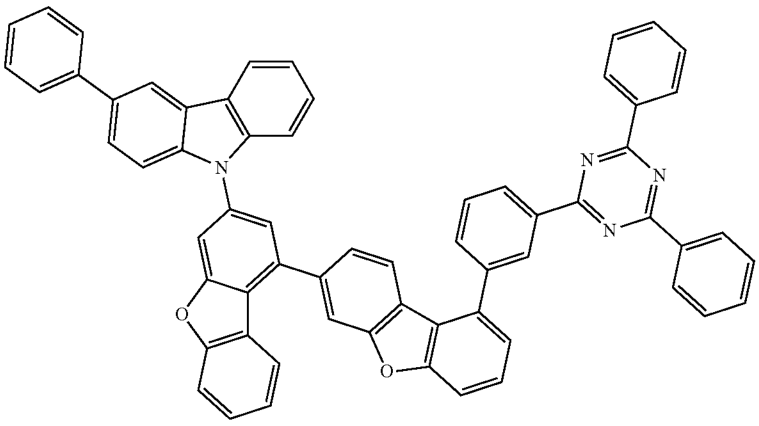 [SMILES: c1ccc(-c2ccc3c(c2)c2ccccc2n3-c2cc(-c3ccc4c(c3)oc3cccc(-c5cccc(-c6nc(-c7ccccc7)nc(-c7ccccc7)n6)c5)c34)c3c(c2)oc2ccccc23)cc1]
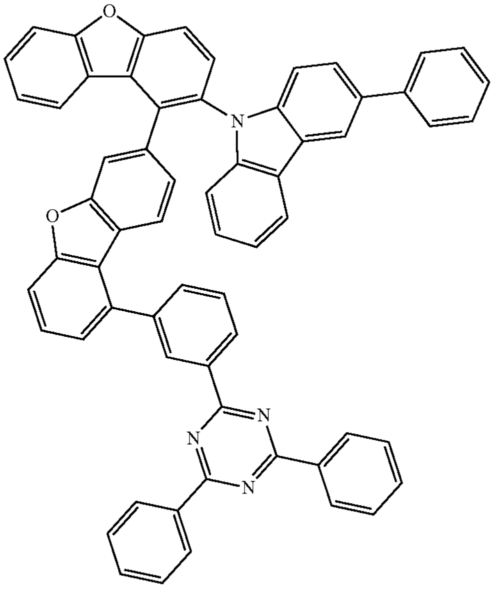 [SMILES: c1ccc(-c2ccc3c(c2)c2ccccc2n3-c2ccc3oc4ccccc4c3c2-c2ccc3c(c2)oc2cccc(-c4cccc(-c5nc(-c6ccccc6)nc(-c6ccccc6)n5)c4)c23)cc1]

TABLE 1-continued
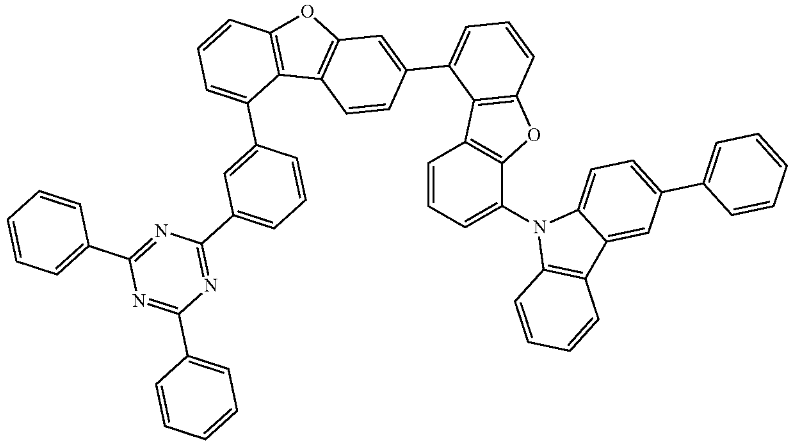 [SMILES: c1ccc(-c2ccc3c(c2)c2ccccc2n3-c2cccc3c2oc2cccc(-c4ccc5c(c4)oc4cccc(-c6cccc(-c7nc(-c8ccccc8)nc(-c8ccccc8)n7)c6)c45)c23)cc1]
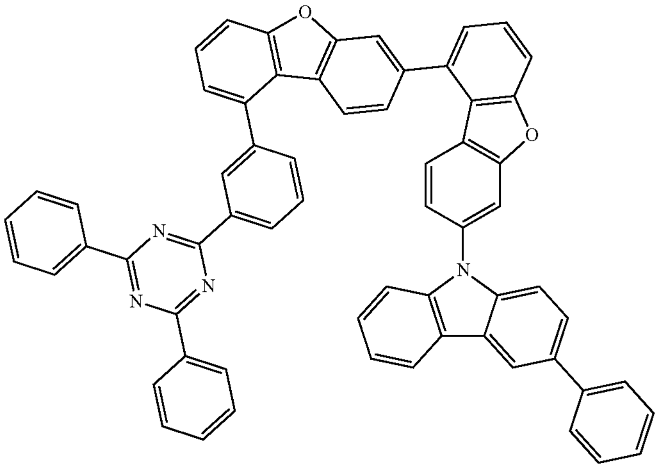 [SMILES: c1ccc(-c2ccc3c(c2)c2ccccc2n3-c2ccc3c(c2)oc2cccc(-c4ccc5c(c4)oc4cccc(-c6cccc(-c7nc(-c8ccccc8)nc(-c8ccccc8)n7)c6)c45)c23)cc1]
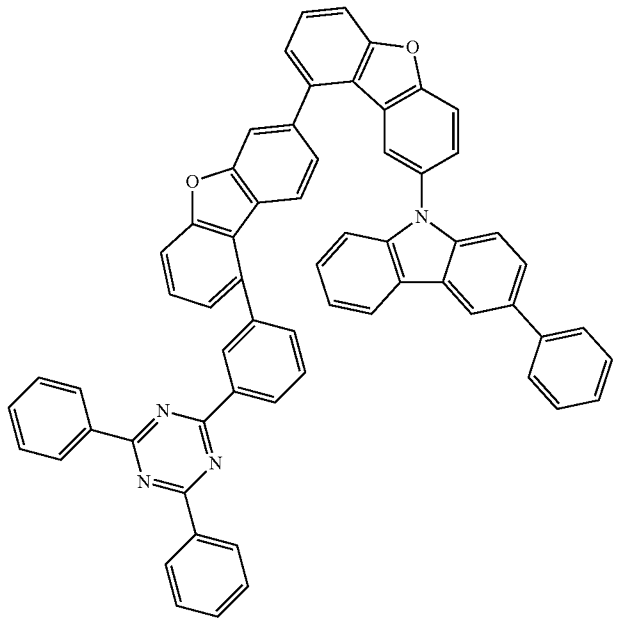 [SMILES: c1ccc(-c2ccc3c(c2)c2ccccc2n3-c2ccc3oc4cccc(-c5ccc6c(c5)oc5cccc(-c7cccc(-c8nc(-c9ccccc9)nc(-c9ccccc9)n8)c7)c56)c4c3c2)cc1]

TABLE 1-continued
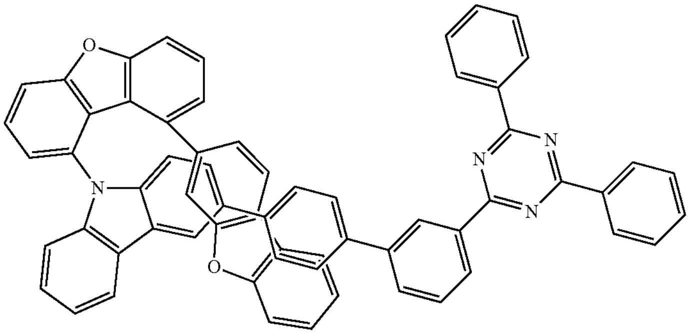 [SMILES: c1ccc(-c2nc(-c3ccccc3)nc(-c3cccc(-c4ccc(-c5ccc6c(c5)c5ccccc5n6-c5cccc6oc7cccc(-c8ccc9c(c8)oc8ccccc89)c7c56)cc4)c3)n2)cc1]
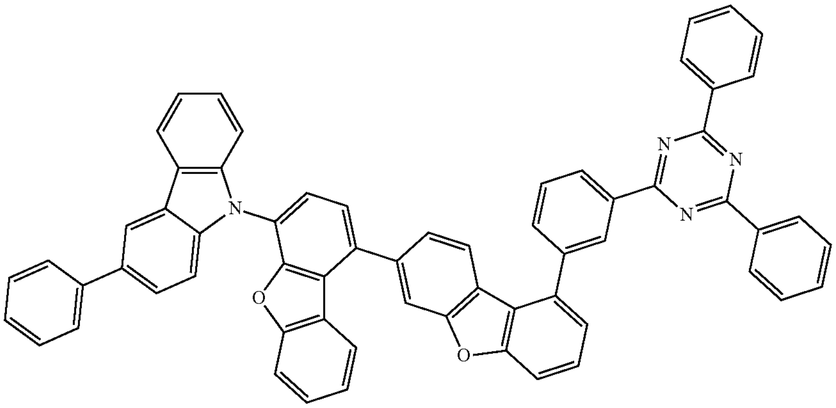 [SMILES: c1ccc(-c2ccc3c(c2)c2ccccc2n3-c2ccc(-c3ccc4c(c3)oc3cccc(-c5cccc(-c6nc(-c7ccccc7)nc(-c7ccccc7)n6)c5)c34)c3c2oc2ccccc23)cc1]
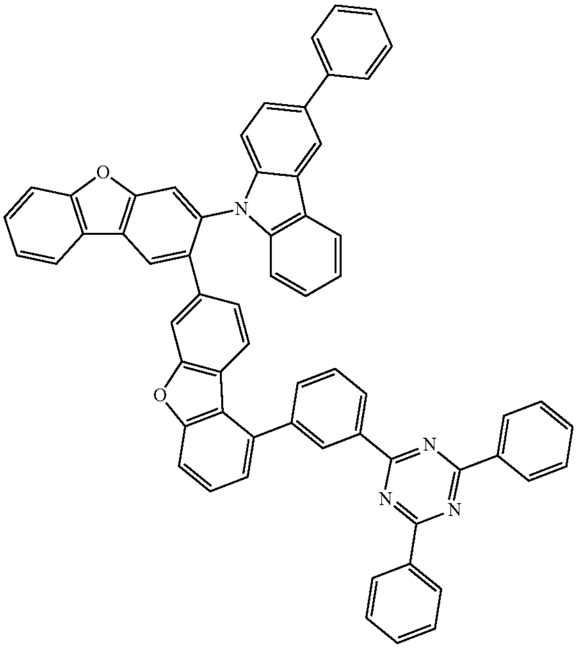 [SMILES: c1ccc(-c2ccc3c(c2)c2ccccc2n3-c2cc3oc4ccccc4c3cc2-c2ccc3c(c2)oc2cccc(-c4cccc(-c5nc(-c6ccccc6)nc(-c6ccccc6)n5)c4)c23)cc1]

TABLE 1-continued
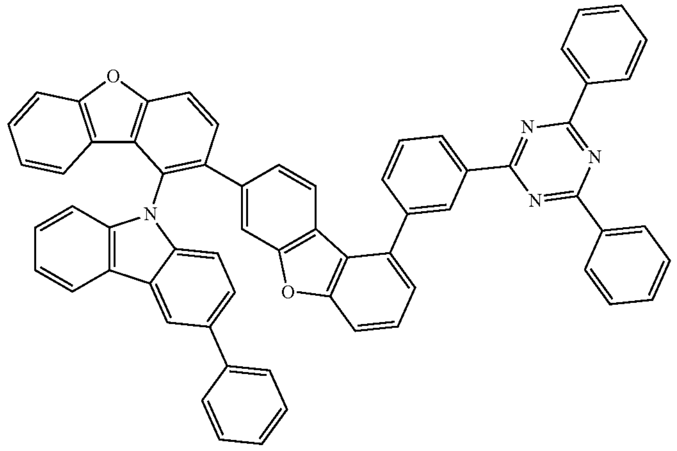 [SMILES: c1ccc(-c2ccc3c(c2)c2ccccc2n3-c2c(-c3ccc4c(c3)oc3cccc(-c5cccc(-c6nc(-c7ccccc7)nc(-c7ccccc7)n6)c5)c34)ccc3oc4ccccc4c23)cc1]
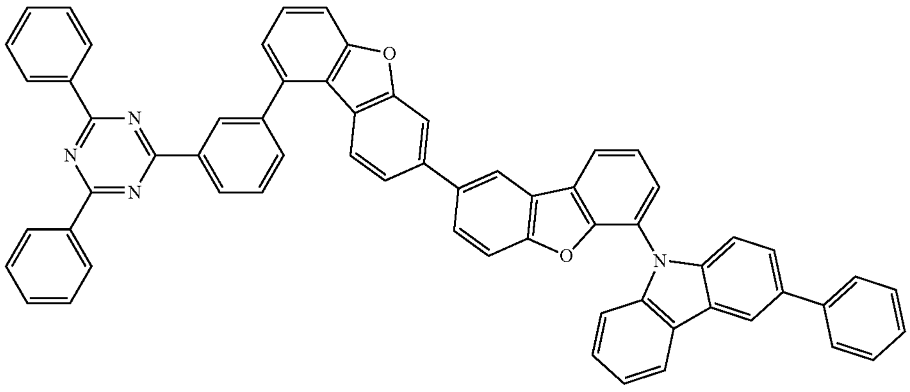 [SMILES: c1ccc(-c2ccc3c(c2)c2ccccc2n3-c2cccc3c2oc2ccc(-c4ccc5c(c4)oc4cccc(-c6cccc(-c7nc(-c8ccccc8)nc(-c8ccccc8)n7)c6)c45)cc23)cc1]
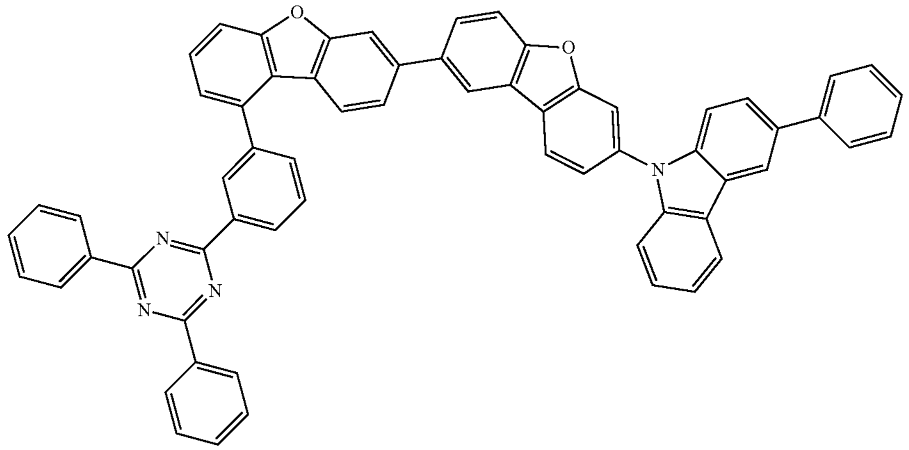 [SMILES: c1ccc(-c2ccc3c(c2)c2ccccc2n3-c2ccc3c(c2)oc2ccc(-c4ccc5c(c4)oc4cccc(-c6cccc(-c7nc(-c8ccccc8)nc(-c8ccccc8)n7)c6)c45)cc23)cc1]

TABLE 1-continued
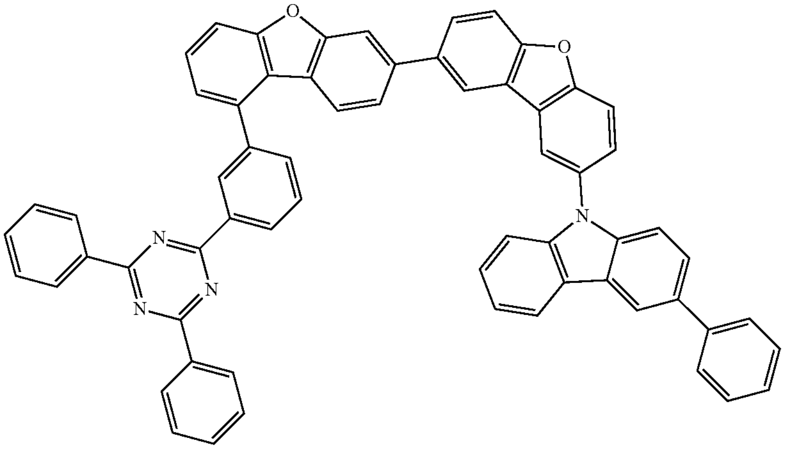 [SMILES: c1ccc(-c2ccc3c(c2)c2ccccc2n3-c2ccc3oc4ccc(-c5ccc6c(c5)oc5cccc(-c7cccc(-c8nc(-c9ccccc9)nc(-c9ccccc9)n8)c7)c56)cc4c3c2)cc1]
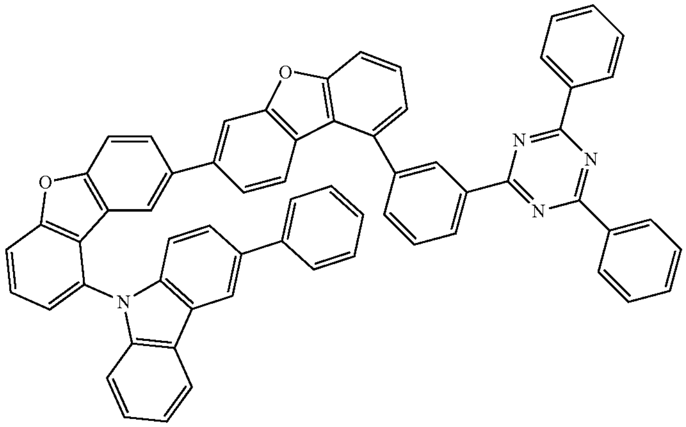 [SMILES: c1ccc(-c2ccc3c(c2)c2ccccc2n3-c2cccc3oc4ccc(-c5ccc6c(c5)oc5cccc(-c7cccc(-c8nc(-c9ccccc9)nc(-c9ccccc9)n8)c7)c56)cc4c23)cc1]
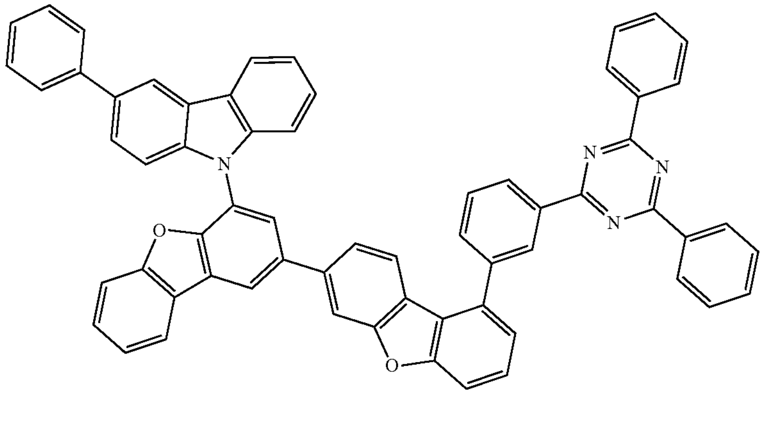 [SMILES: c1ccc(-c2ccc3c(c2)c2ccccc2n3-c2cc(-c3ccc4c(c3)oc3cccc(-c5cccc(-c6nc(-c7ccccc7)nc(-c7ccccc7)n6)c5)c34)cc3c2oc2ccccc23)cc1]

TABLE 1-continued
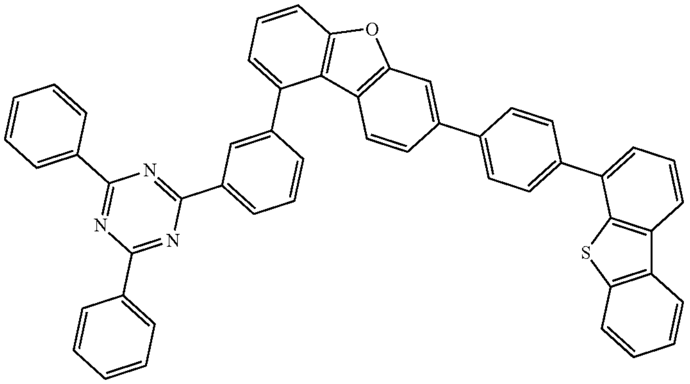 [SMILES: c1ccc(-c2nc(-c3ccccc3)nc(-c3cccc(-c4cccc5oc6cc(-c7ccc(-c8cccc9c8sc8ccccc89)cc7)ccc6c45)c3)n2)cc1]
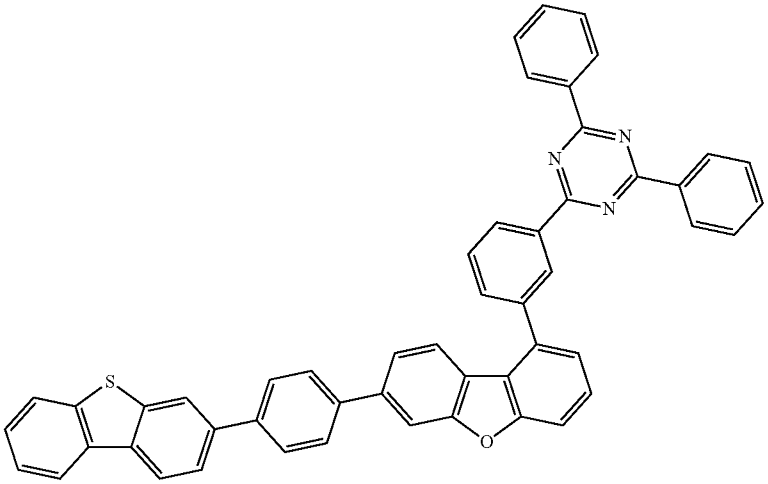 [SMILES: c1ccc(-c2nc(-c3ccccc3)nc(-c3cccc(-c4cccc5oc6cc(-c7ccc(-c8ccc9c(c8)sc8ccccc89)cc7)ccc6c45)c3)n2)cc1]
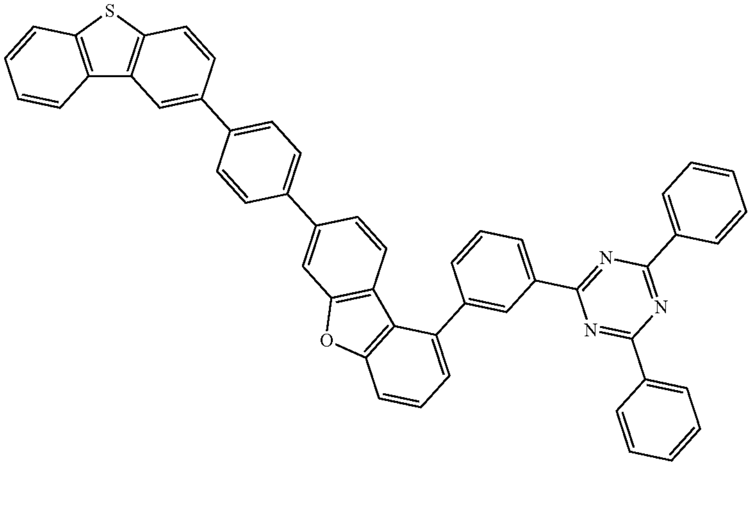 [SMILES: c1ccc(-c2nc(-c3ccccc3)nc(-c3cccc(-c4cccc5oc6cc(-c7ccc(-c8ccc9sc%10ccccc%10c9c8)cc7)ccc6c45)c3)n2)cc1]

TABLE 1-continued
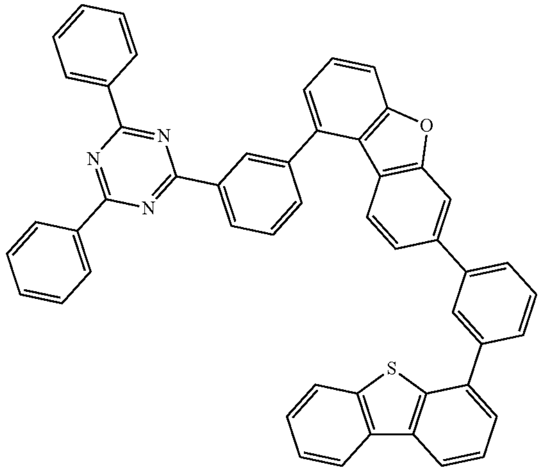 [SMILES: c1ccc(-c2nc(-c3ccccc3)nc(-c3cccc(-c4cccc5oc6cc(-c7cccc(-c8cccc9c8sc8ccccc89)c7)ccc6c45)c3)n2)cc1]
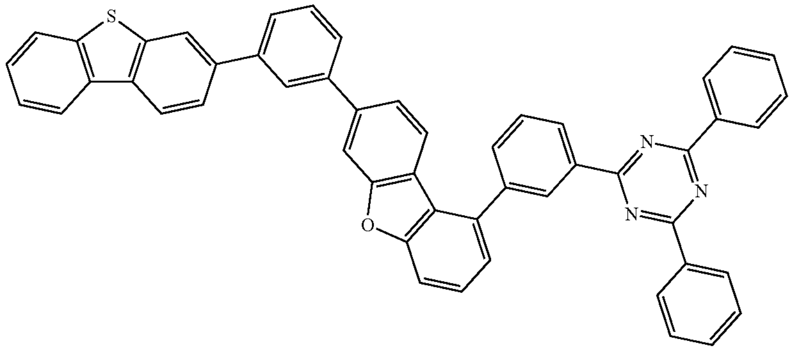 [SMILES: c1ccc(-c2nc(-c3ccccc3)nc(-c3cccc(-c4cccc5oc6cc(-c7cccc(-c8ccc9c(c8)sc8ccccc89)c7)ccc6c45)c3)n2)cc1]
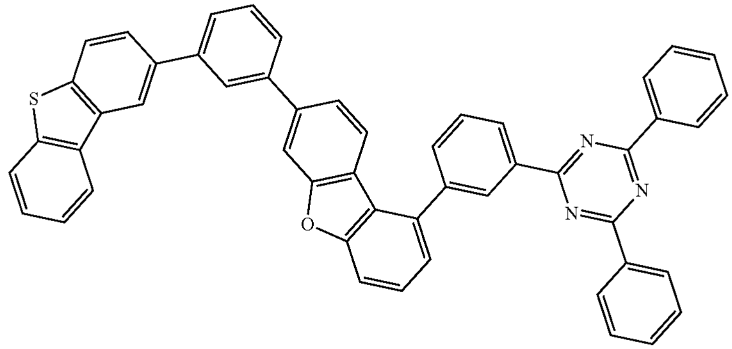 [SMILES: c1ccc(-c2nc(-c3ccccc3)nc(-c3cccc(-c4cccc5oc6cc(-c7cccc(-c8ccc9sc%10ccccc%10c9c8)c7)ccc6c45)c3)n2)cc1]
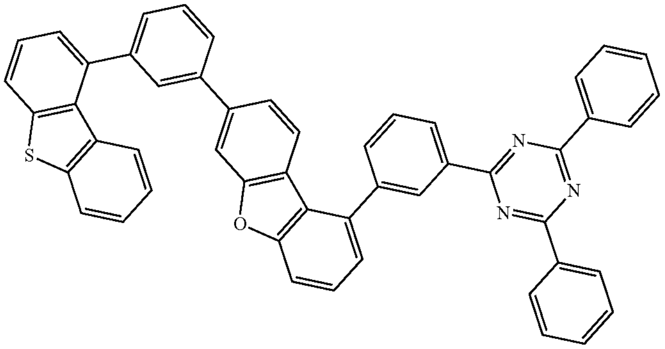 [SMILES: c1ccc(-c2nc(-c3ccccc3)nc(-c3cccc(-c4cccc5oc6cc(-c7cccc(-c8cccc9sc%10ccccc%10c89)c7)ccc6c45)c3)n2)cc1]

TABLE 1-continued
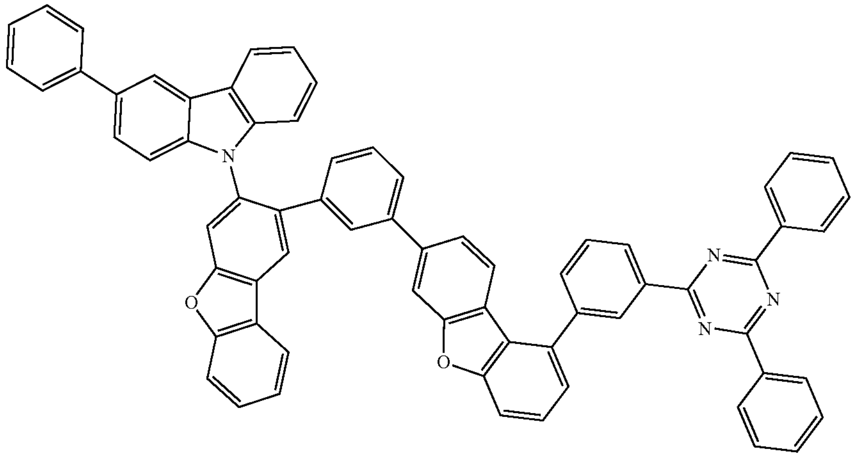 [SMILES: c1ccc(-c2ccc3c(c2)c2ccccc2n3-c2cc3oc4ccccc4c3cc2-c2cccc(-c3ccc4c(c3)oc3cccc(-c5cccc(-c6nc(-c7ccccc7)nc(-c7ccccc7)n6)c5)c34)c2)cc1]
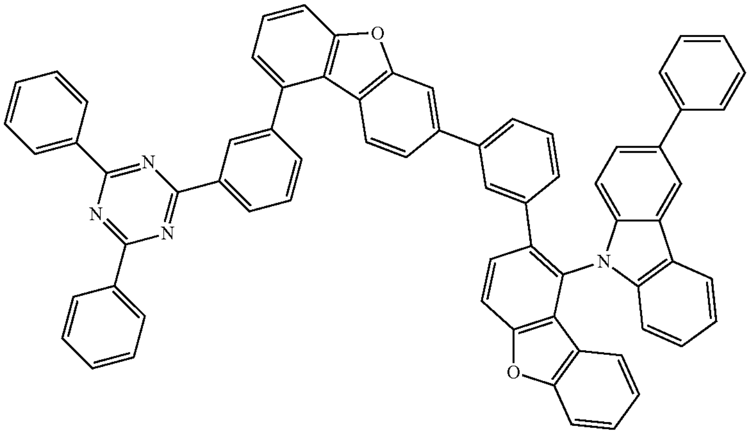 [SMILES: c1ccc(-c2ccc3c(c2)c2ccccc2n3-c2c(-c3cccc(-c4ccc5c(c4)oc4cccc(-c6cccc(-c7nc(-c8ccccc8)nc(-c8ccccc8)n7)c6)c45)c3)ccc3oc4ccccc4c23)cc1]
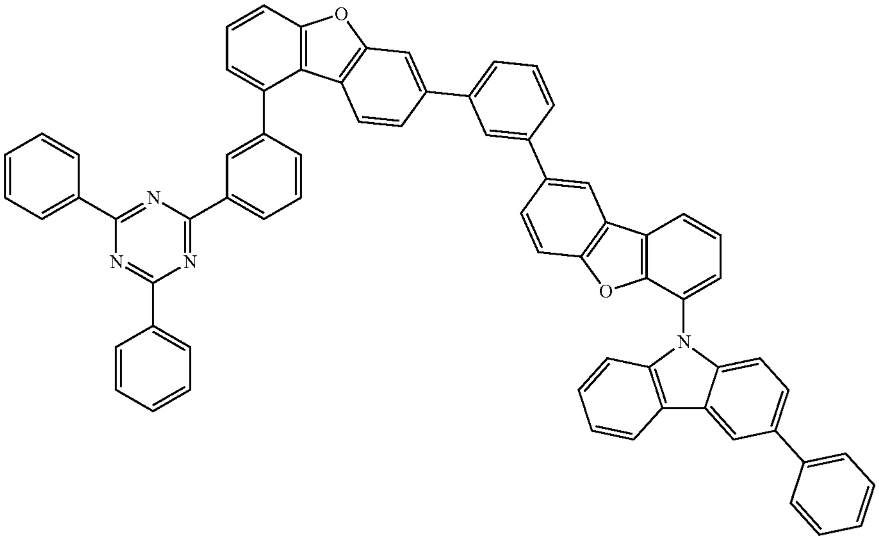 [SMILES: c1ccc(-c2ccc3c(c2)c2ccccc2n3-c2cccc3c2oc2ccc(-c4cccc(-c5ccc6c(c5)oc5cccc(-c7cccc(-c8nc(-c9ccccc9)nc(-c9ccccc9)n8)c7)c56)c4)cc23)cc1]

TABLE 1-continued
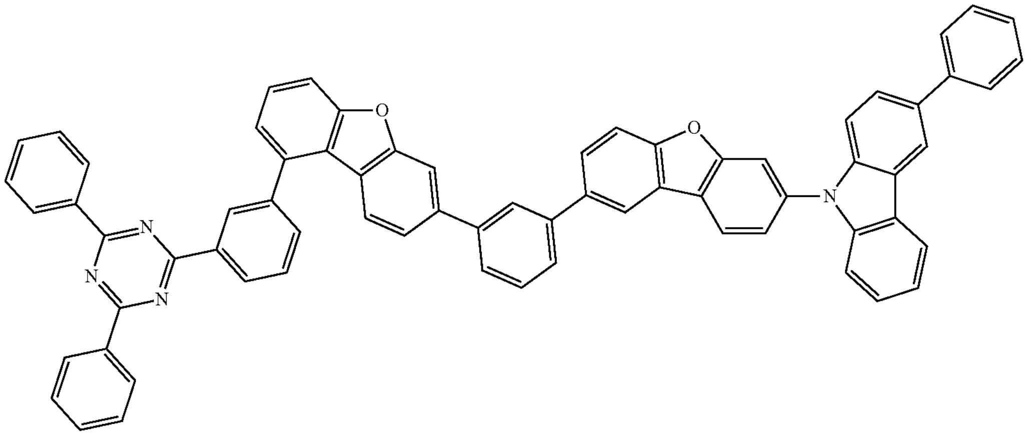 [SMILES: c1ccc(-c2ccc3c(c2)c2ccccc2n3-c2ccc3c(c2)oc2ccc(-c4cccc(-c5ccc6c(c5)oc5cccc(-c7cccc(-c8nc(-c9ccccc9)nc(-c9ccccc9)n8)c7)c56)c4)cc23)cc1]
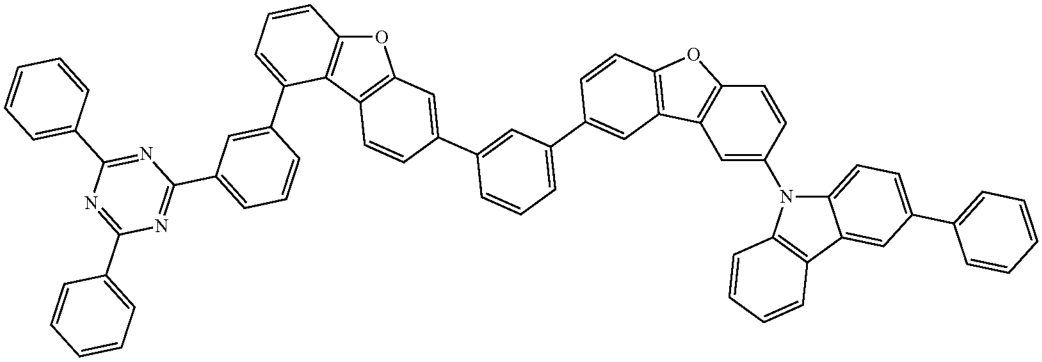 [SMILES: c1ccc(-c2ccc3c(c2)c2ccccc2n3-c2ccc3oc4ccc(-c5cccc(-c6ccc7c(c6)oc6cccc(-c8cccc(-c9nc(-c%10ccccc%10)nc(-c%10ccccc%10)n9)c8)c67)c5)cc4c3c2)cc1]
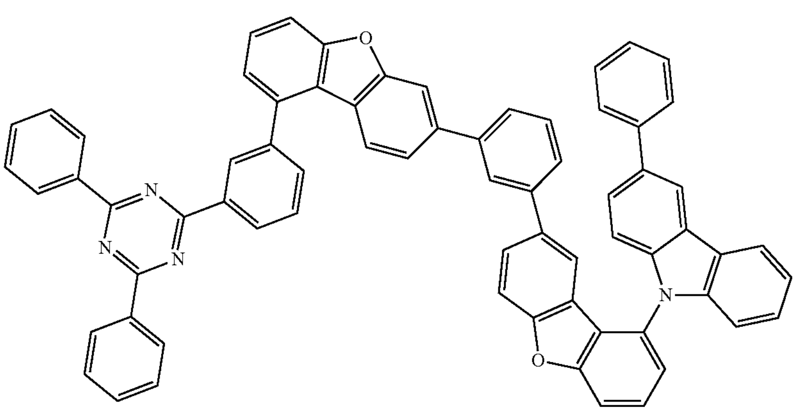 [SMILES: c1ccc(-c2ccc3c(c2)c2ccccc2n3-c2cccc3oc4ccc(-c5cccc(-c6ccc7c(c6)oc6cccc(-c8cccc(-c9nc(-c%10ccccc%10)nc(-c%10ccccc%10)n9)c8)c67)c5)cc4c23)cc1]

TABLE 1-continued
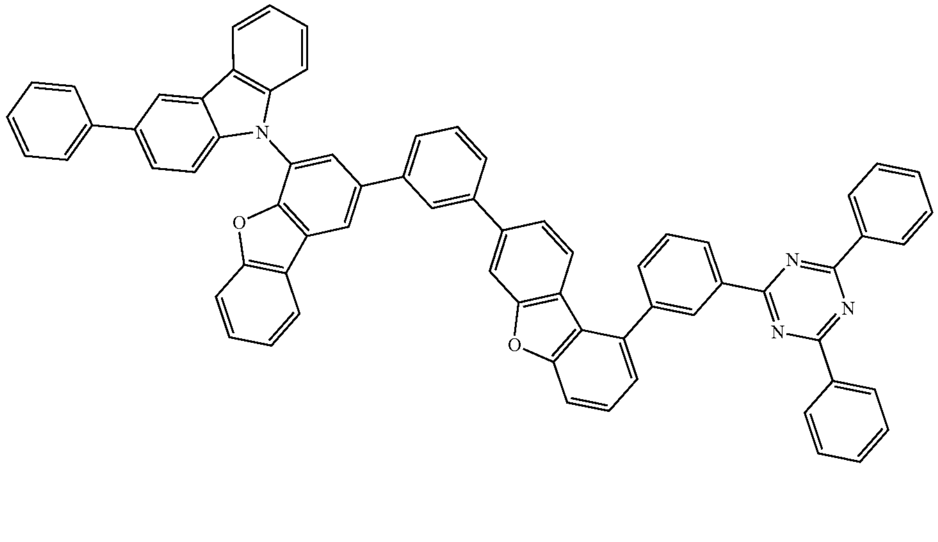 [SMILES: c1ccc(-c2ccc3c(c2)c2ccccc2n3-c2cc(-c3cccc(-c4ccc5c(c4)oc4cccc(-c6cccc(-c7nc(-c8ccccc8)nc(-c8ccccc8)n7)c6)c45)c3)cc3c2oc2ccccc23)cc1]
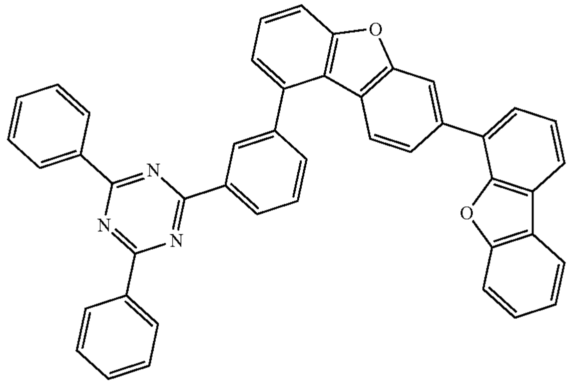 [SMILES: c1ccc(-c2nc(-c3ccccc3)nc(-c3cccc(-c4cccc5oc6cc(-c7cccc8c7oc7ccccc78)ccc6c45)c3)n2)cc1]
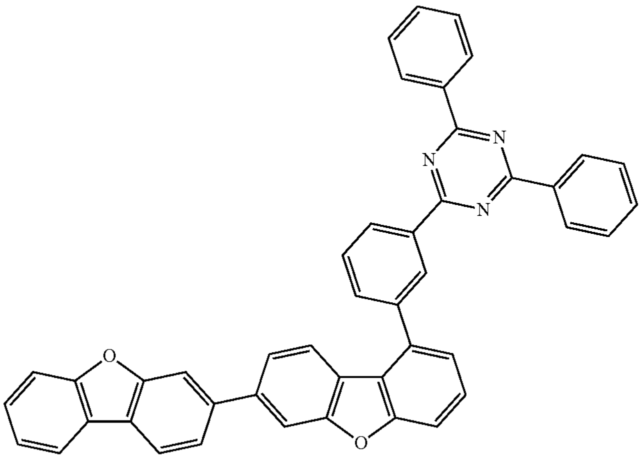 [SMILES: c1ccc(-c2nc(-c3ccccc3)nc(-c3cccc(-c4cccc5oc6cc(-c7ccc8c(c7)oc7ccccc78)ccc6c45)c3)n2)cc1]

TABLE 1-continued
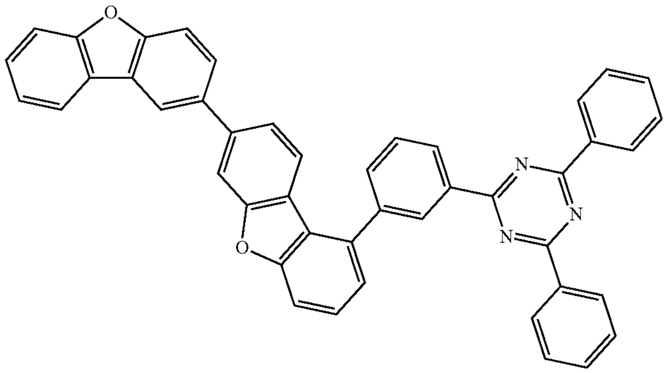 [SMILES: c1ccc(-c2nc(-c3ccccc3)nc(-c3cccc(-c4cccc5oc6cc(-c7ccc8oc9ccccc9c8c7)ccc6c45)c3)n2)cc1]
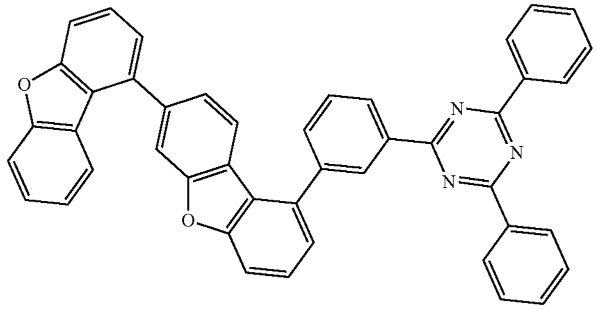 [SMILES: c1ccc(-c2nc(-c3ccccc3)nc(-c3cccc(-c4cccc5oc6cc(-c7cccc8oc9ccccc9c78)ccc6c45)c3)n2)cc1]
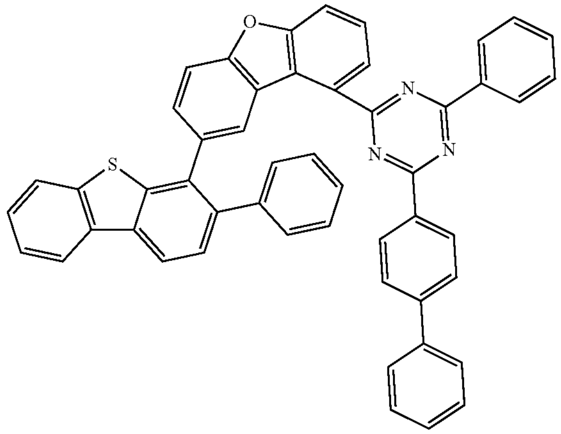 [SMILES: c1ccc(-c2ccc(-c3nc(-c4ccccc4)nc(-c4cccc5oc6ccc(-c7c(-c8ccccc8)ccc8c7sc7ccccc78)cc6c45)n3)cc2)cc1]
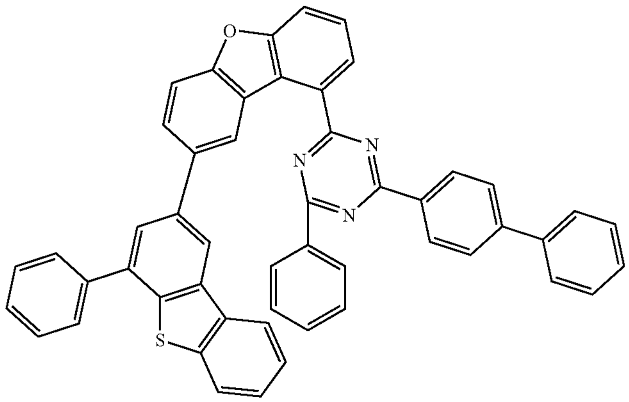 [SMILES: c1ccc(-c2ccc(-c3nc(-c4ccccc4)nc(-c4cccc5oc6ccc(-c7cc(-c8ccccc8)c8sc9ccccc9c8c7)cc6c45)n3)cc2)cc1]

TABLE 1-continued
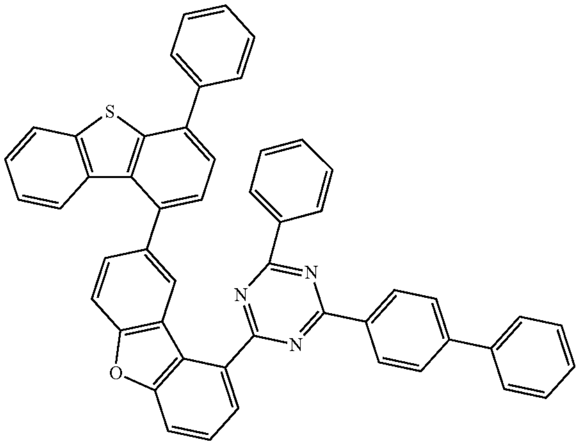 [SMILES: c1ccc(-c2ccc(-c3nc(-c4ccccc4)nc(-c4cccc5oc6ccc(-c7ccc(-c8ccccc8)c8sc9ccccc9c78)cc6c45)n3)cc2)cc1]
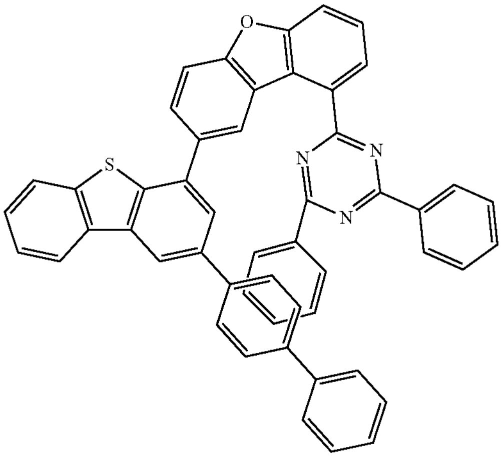 [SMILES: c1ccc(-c2ccc(-c3cc(-c4ccc5oc6cccc(-c7nc(-c8ccccc8)nc(-c8ccccc8)n7)c6c5c4)c4sc5ccccc5c4c3)cc2)cc1]
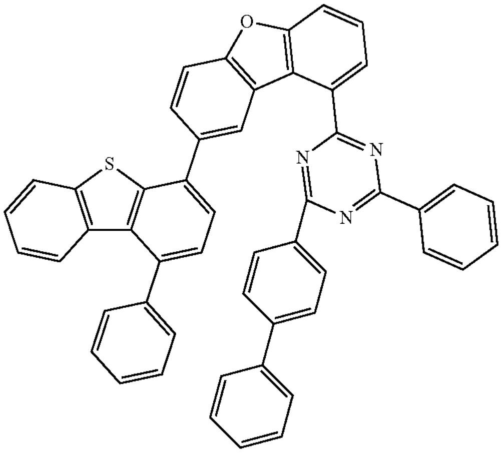 [SMILES: c1ccc(-c2ccc(-c3nc(-c4ccccc4)nc(-c4cccc5oc6ccc(-c7ccc(-c8ccccc8)c8c7sc7ccccc78)cc6c45)n3)cc2)cc1]

TABLE 1-continued
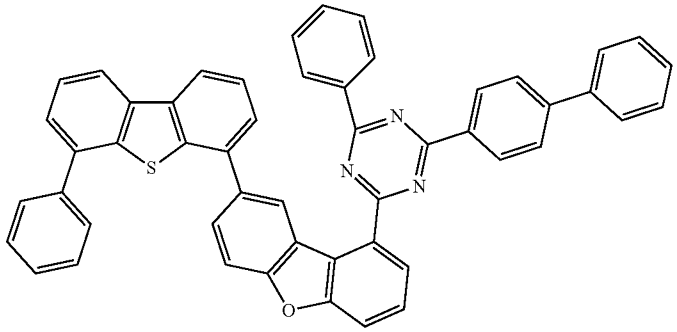 [SMILES: c1ccc(-c2ccc(-c3nc(-c4ccccc4)nc(-c4cccc5oc6ccc(-c7cccc8c7sc7c(-c9ccccc9)cccc78)cc6c45)n3)cc2)cc1]
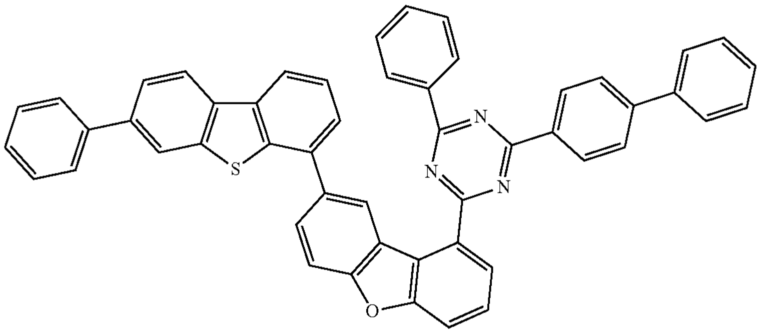 [SMILES: c1ccc(-c2ccc(-c3nc(-c4ccccc4)nc(-c4cccc5oc6ccc(-c7cccc8c7sc7cc(-c9ccccc9)ccc78)cc6c45)n3)cc2)cc1]
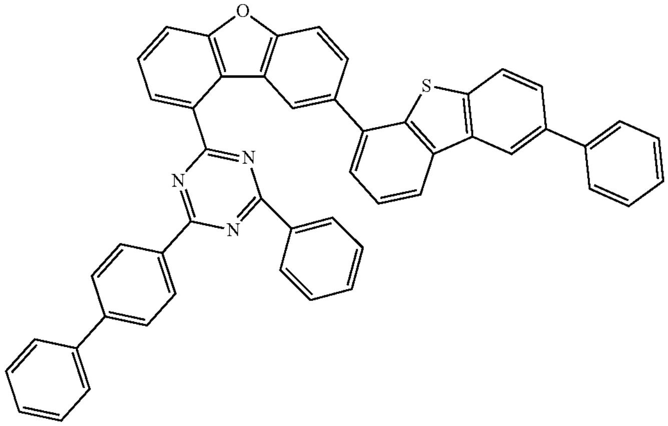 [SMILES: c1ccc(-c2ccc(-c3nc(-c4ccccc4)nc(-c4cccc5oc6ccc(-c7cccc8c7sc7ccc(-c9ccccc9)cc78)cc6c45)n3)cc2)cc1]
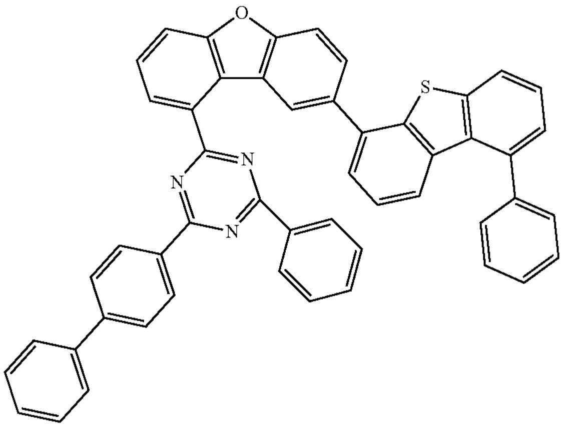 [SMILES: c1ccc(-c2ccc(-c3nc(-c4ccccc4)nc(-c4cccc5oc6ccc(-c7cccc8c7sc7cccc(-c9ccccc9)c78)cc6c45)n3)cc2)cc1]

TABLE 1-continued
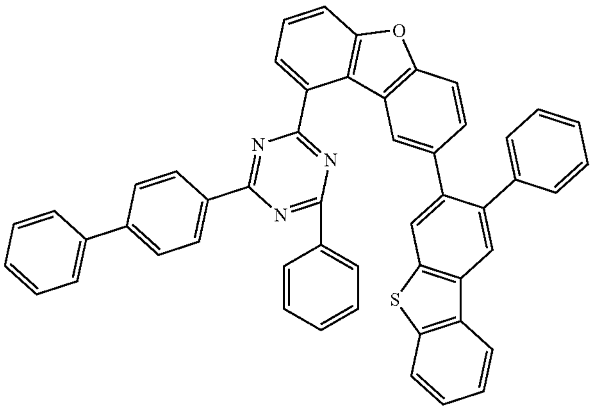 [SMILES: c1ccc(-c2ccc(-c3nc(-c4ccccc4)nc(-c4cccc5oc6ccc(-c7cc8sc9ccccc9c8cc7-c7ccccc7)cc6c45)n3)cc2)cc1]
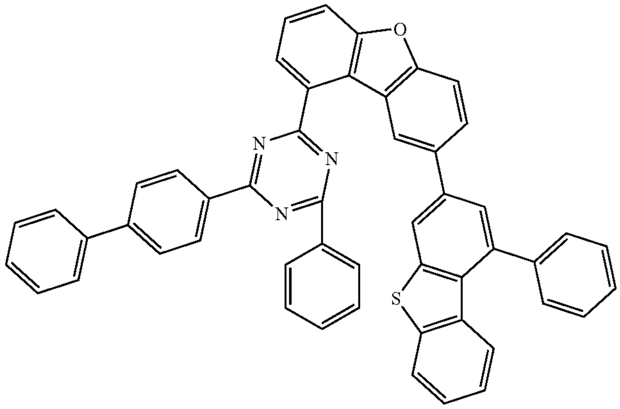 [SMILES: c1ccc(-c2ccc(-c3nc(-c4ccccc4)nc(-c4cccc5oc6ccc(-c7cc(-c8ccccc8)c8c(c7)sc7ccccc78)cc6c45)n3)cc2)cc1]
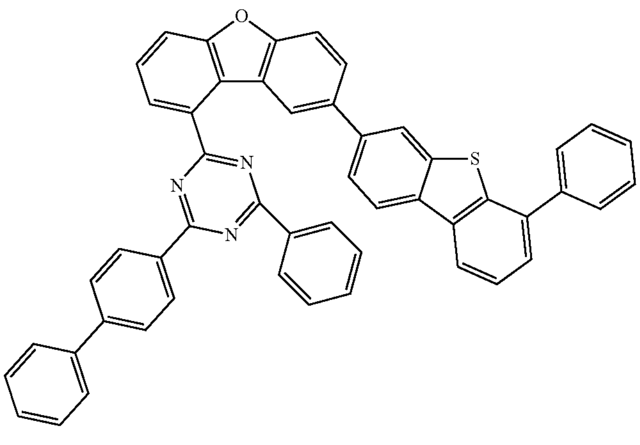 [SMILES: c1ccc(-c2ccc(-c3nc(-c4ccccc4)nc(-c4cccc5oc6ccc(-c7ccc8c(c7)sc7c(-c9ccccc9)cccc78)cc6c45)n3)cc2)cc1]

TABLE 1-continued
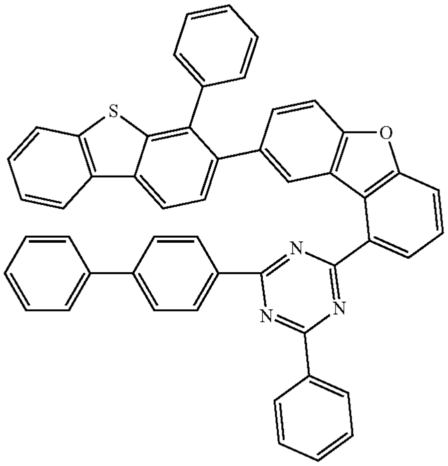 [SMILES: c1ccc(-c2ccc(-c3nc(-c4ccccc4)nc(-c4cccc5oc6ccc(-c7ccc8c(sc9ccccc98)c7-c7ccccc7)cc6c45)n3)cc2)cc1]
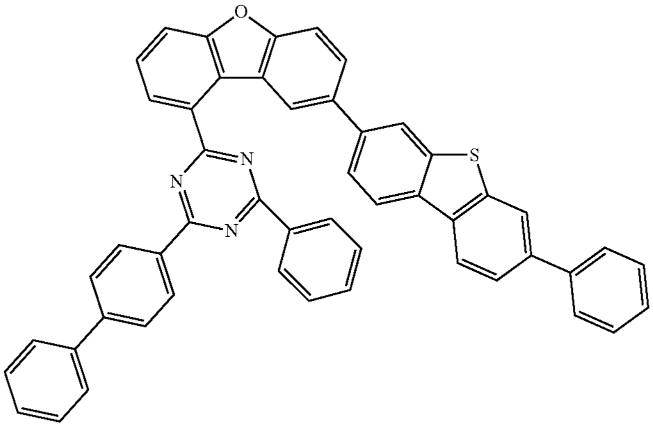 [SMILES: c1ccc(-c2ccc(-c3nc(-c4ccccc4)nc(-c4cccc5oc6ccc(-c7ccc8c(c7)sc7cc(-c9ccccc9)ccc78)cc6c45)n3)cc2)cc1]
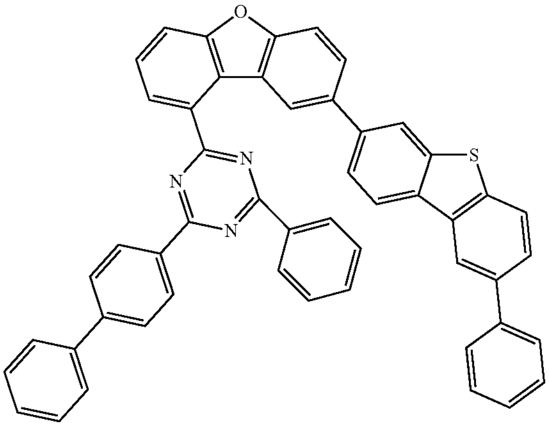 [SMILES: c1ccc(-c2ccc(-c3nc(-c4ccccc4)nc(-c4cccc5oc6ccc(-c7ccc8c(c7)sc7ccc(-c9ccccc9)cc78)cc6c45)n3)cc2)cc1]

TABLE 1-continued
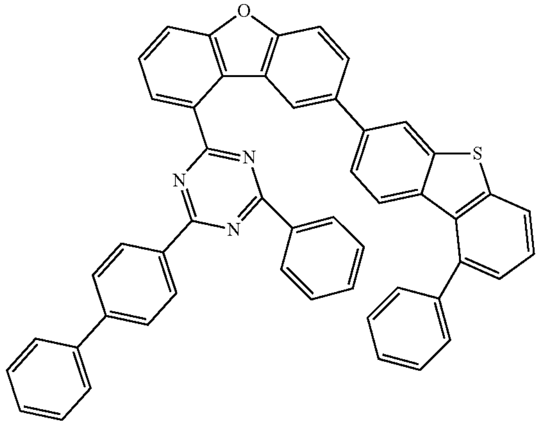 [SMILES: c1ccc(-c2ccc(-c3nc(-c4ccccc4)nc(-c4cccc5oc6ccc(-c7ccc8c(c7)sc7cccc(-c9ccccc9)c78)cc6c45)n3)cc2)cc1]
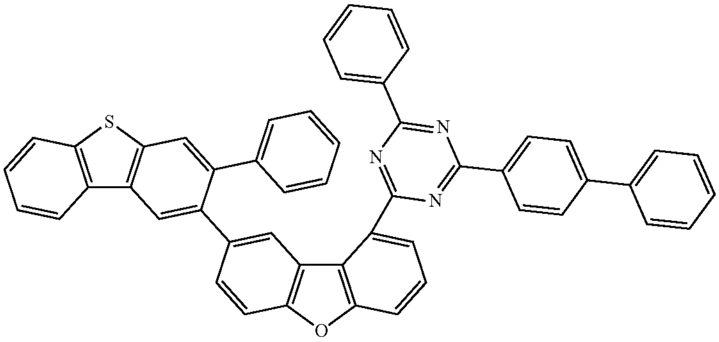 [SMILES: c1ccc(-c2ccc(-c3nc(-c4ccccc4)nc(-c4cccc5oc6ccc(-c7cc8c(cc7-c7ccccc7)sc7ccccc78)cc6c45)n3)cc2)cc1]
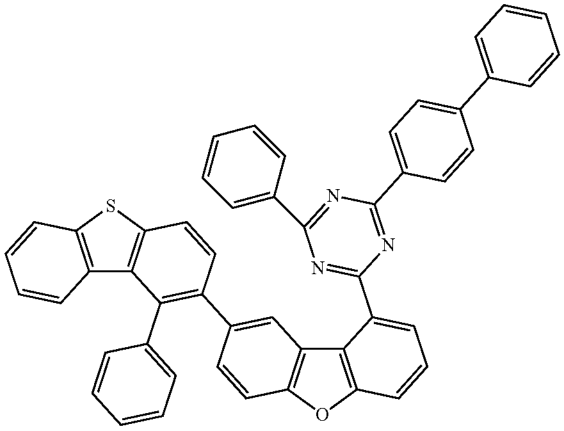 [SMILES: c1ccc(-c2ccc(-c3nc(-c4ccccc4)nc(-c4cccc5oc6ccc(-c7ccc8sc9ccccc9c8c7-c7ccccc7)cc6c45)n3)cc2)cc1]
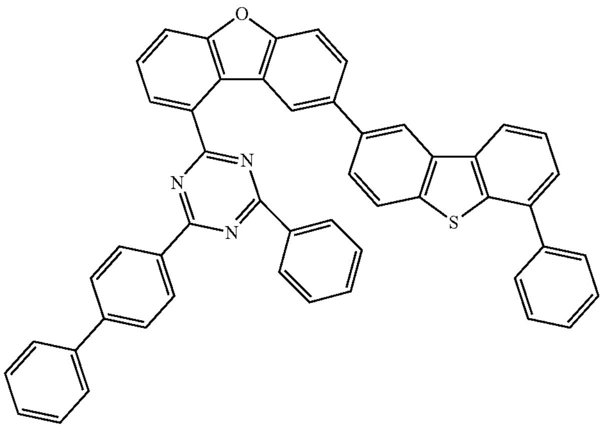 [SMILES: c1ccc(-c2ccc(-c3nc(-c4ccccc4)nc(-c4cccc5oc6ccc(-c7ccc8sc9c(-c%10ccccc%10)cccc9c8c7)cc6c45)n3)cc2)cc1]

TABLE 1-continued
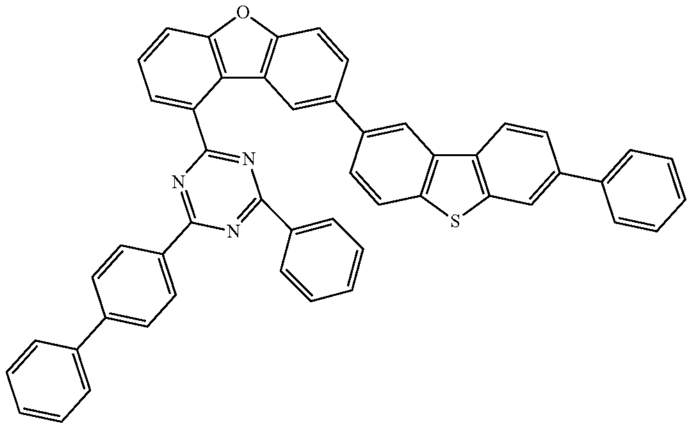 [SMILES: c1ccc(-c2ccc(-c3nc(-c4ccccc4)nc(-c4cccc5oc6ccc(-c7ccc8sc9cc(-c%10ccccc%10)ccc9c8c7)cc6c45)n3)cc2)cc1]
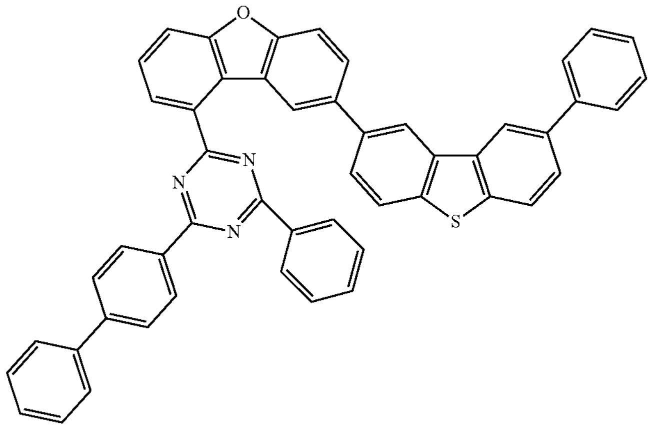 [SMILES: c1ccc(-c2ccc(-c3nc(-c4ccccc4)nc(-c4cccc5oc6ccc(-c7ccc8sc9ccc(-c%10ccccc%10)cc9c8c7)cc6c45)n3)cc2)cc1]
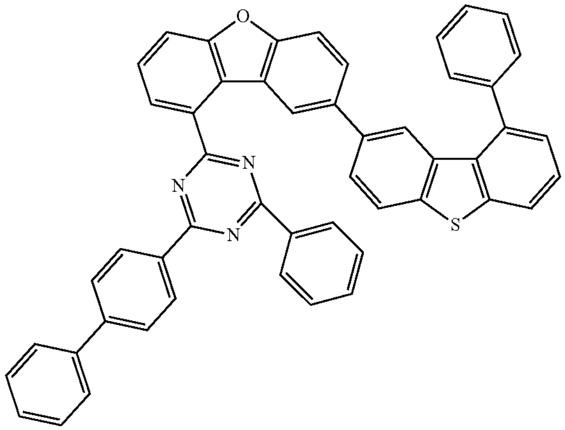 [SMILES: c1ccc(-c2ccc(-c3nc(-c4ccccc4)nc(-c4cccc5oc6ccc(-c7ccc8sc9cccc(-c%10ccccc%10)c9c8c7)cc6c45)n3)cc2)cc1]

TABLE 1-continued
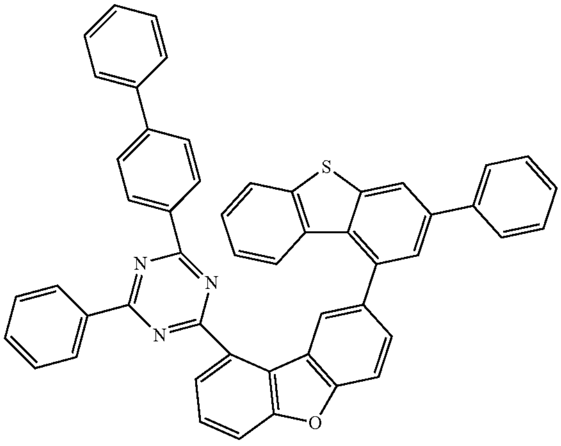 [SMILES: c1ccc(-c2ccc(-c3nc(-c4ccccc4)nc(-c4cccc5oc6ccc(-c7cc(-c8ccccc8)cc8sc9ccccc9c78)cc6c45)n3)cc2)cc1]
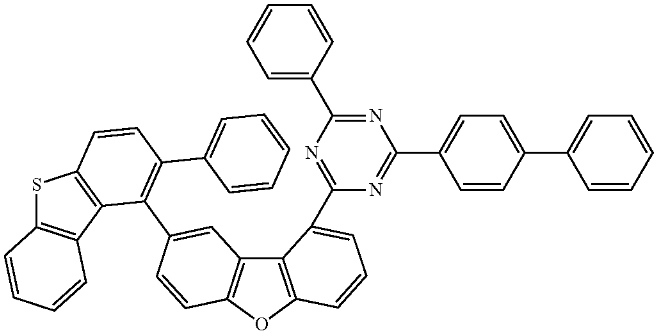 [SMILES: c1ccc(-c2ccc(-c3nc(-c4ccccc4)nc(-c4cccc5oc6ccc(-c7c(-c8ccccc8)ccc8sc9ccccc9c78)cc6c45)n3)cc2)cc1]
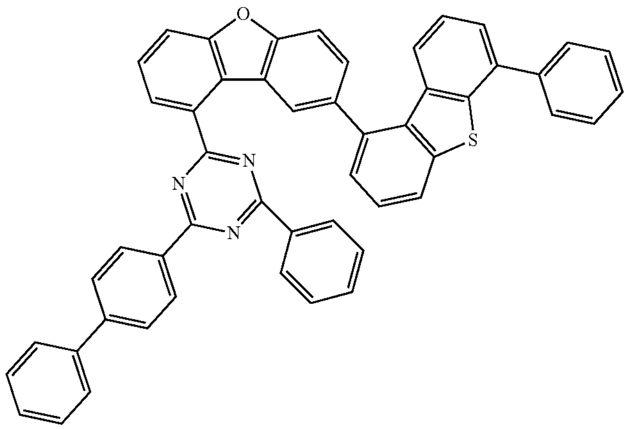 [SMILES: c1ccc(-c2ccc(-c3nc(-c4ccccc4)nc(-c4cccc5oc6ccc(-c7cccc8sc9c(-c%10ccccc%10)cccc9c78)cc6c45)n3)cc2)cc1]
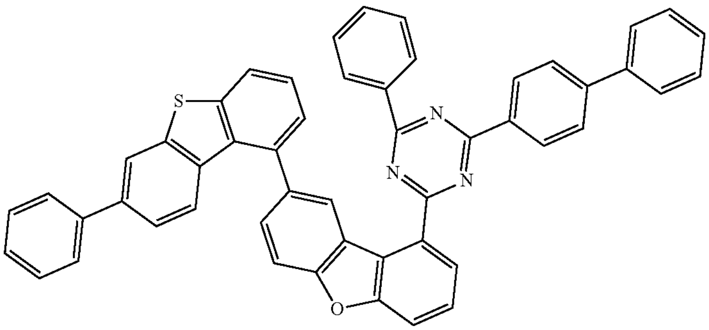 [SMILES: c1ccc(-c2ccc(-c3nc(-c4ccccc4)nc(-c4cccc5oc6ccc(-c7cccc8sc9cc(-c%10ccccc%10)ccc9c78)cc6c45)n3)cc2)cc1]

TABLE 1-continued
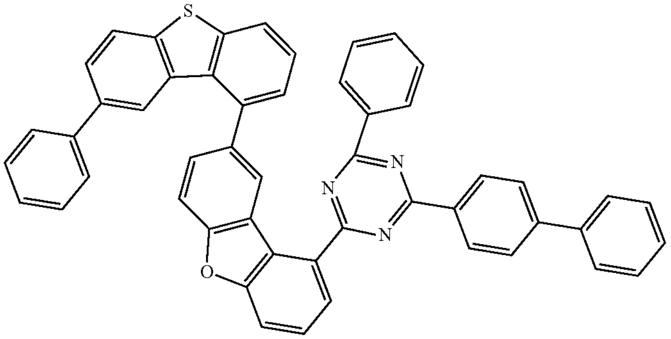 [SMILES: c1ccc(-c2ccc(-c3nc(-c4ccccc4)nc(-c4cccc5oc6ccc(-c7cccc8sc9ccc(-c%10ccccc%10)cc9c78)cc6c45)n3)cc2)cc1]
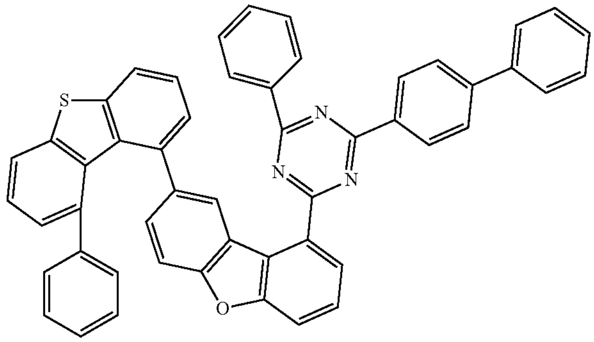 [SMILES: c1ccc(-c2ccc(-c3nc(-c4ccccc4)nc(-c4cccc5oc6ccc(-c7cccc8sc9cccc(-c%10ccccc%10)c9c78)cc6c45)n3)cc2)cc1]
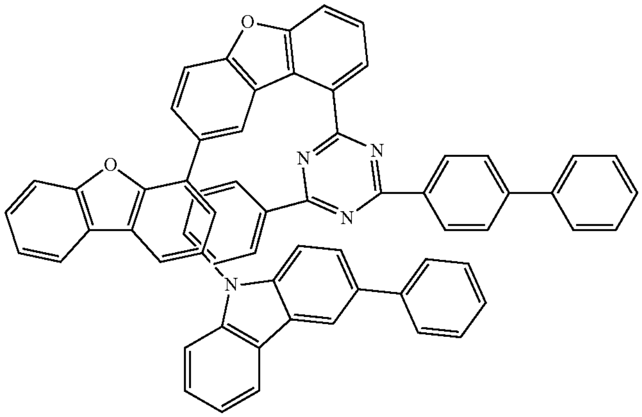 [SMILES: c1ccc(-c2ccc(-c3nc(-c4ccccc4)nc(-c4cccc5oc6ccc(-c7cc(-n8c9ccccc9c9cc(-c%10ccccc%10)ccc98)cc8c7oc7ccccc78)cc6c45)n3)cc2)cc1]
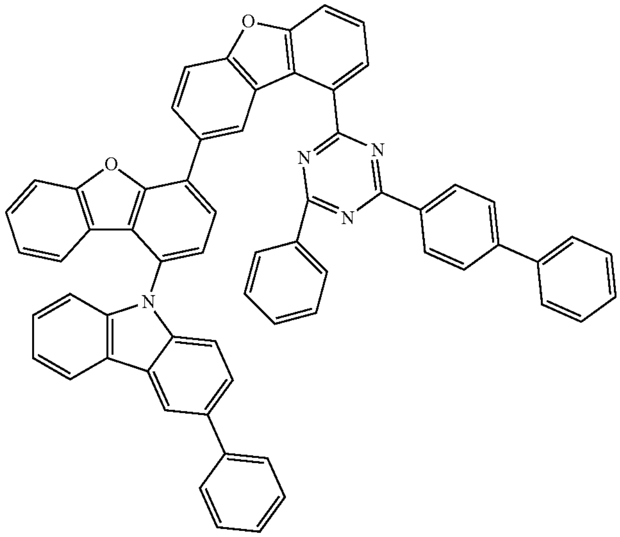 [SMILES: c1ccc(-c2ccc(-c3nc(-c4ccccc4)nc(-c4cccc5oc6ccc(-c7ccc(-n8c9ccccc9c9cc(-c%10ccccc%10)ccc98)c8c7oc7ccccc78)cc6c45)n3)cc2)cc1]

TABLE 1-continued
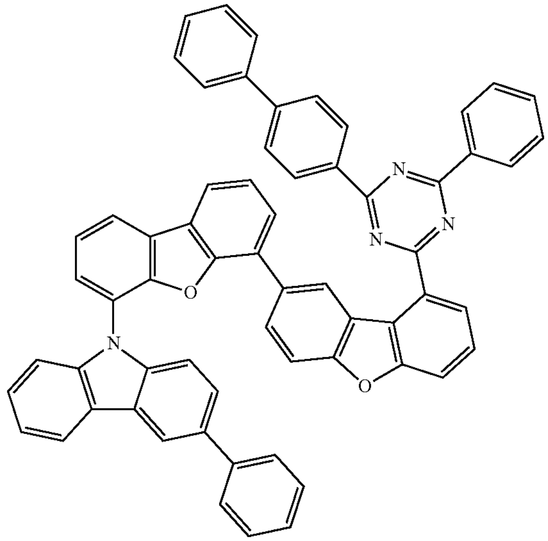 [SMILES: c1ccc(-c2ccc(-c3nc(-c4ccccc4)nc(-c4cccc5oc6ccc(-c7cccc8c7oc7c(-n9c%10ccccc%10c%10cc(-c%11ccccc%11)ccc%109)cccc78)cc6c45)n3)cc2)cc1]
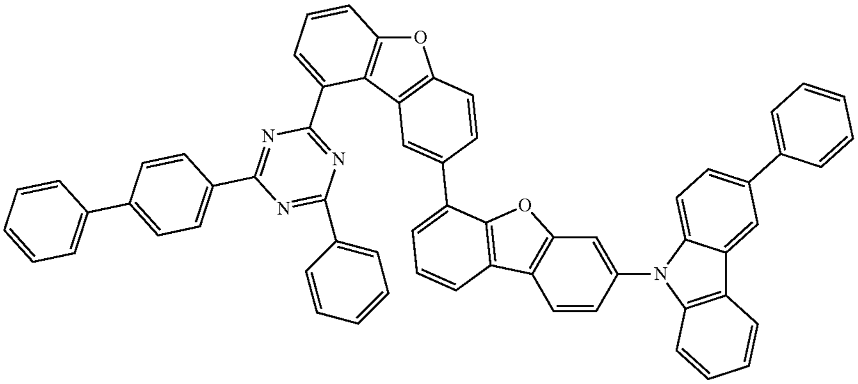 [SMILES: c1ccc(-c2ccc(-c3nc(-c4ccccc4)nc(-c4cccc5oc6ccc(-c7cccc8c7oc7cc(-n9c%10ccccc%10c%10cc(-c%11ccccc%11)ccc%109)ccc78)cc6c45)n3)cc2)cc1]
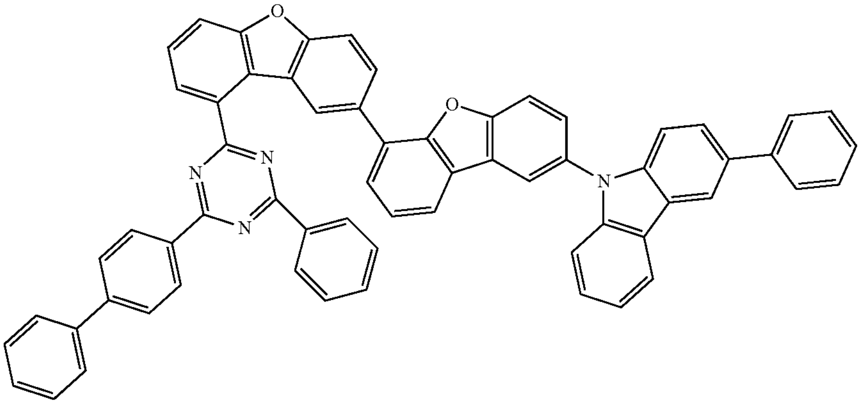 [SMILES: c1ccc(-c2ccc(-c3nc(-c4ccccc4)nc(-c4cccc5oc6ccc(-c7cccc8c7oc7ccc(-n9c%10ccccc%10c%10cc(-c%11ccccc%11)ccc%109)cc78)cc6c45)n3)cc2)cc1]

TABLE 1-continued
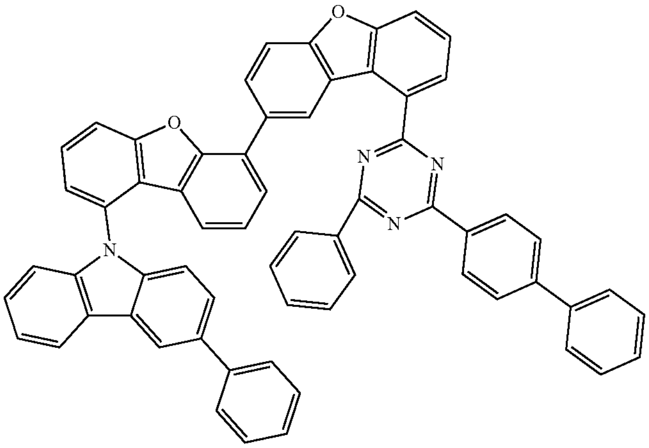 [SMILES: c1ccc(-c2ccc(-c3nc(-c4ccccc4)nc(-c4cccc5oc6ccc(-c7cccc8c7oc7cccc(-n9c%10ccccc%10c%10cc(-c%11ccccc%11)ccc%109)c78)cc6c45)n3)cc2)cc1]
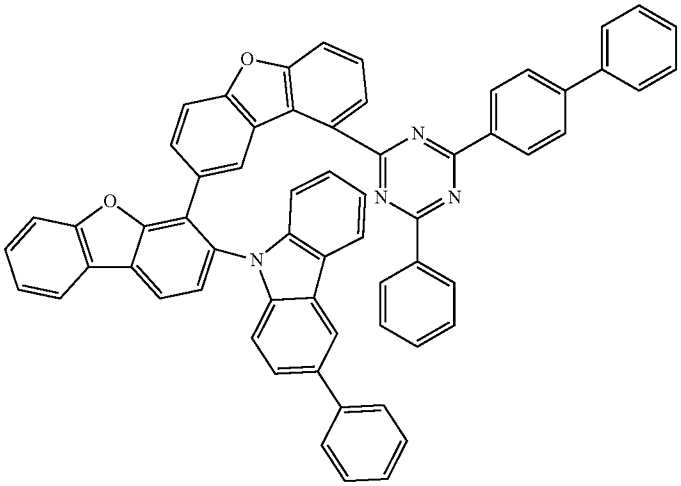 [SMILES: c1ccc(-c2ccc(-c3nc(-c4ccccc4)nc(-c4cccc5oc6ccc(-c7c(-n8c9ccccc9c9cc(-c%10ccccc%10)ccc98)ccc8c7oc7ccccc78)cc6c45)n3)cc2)cc1]
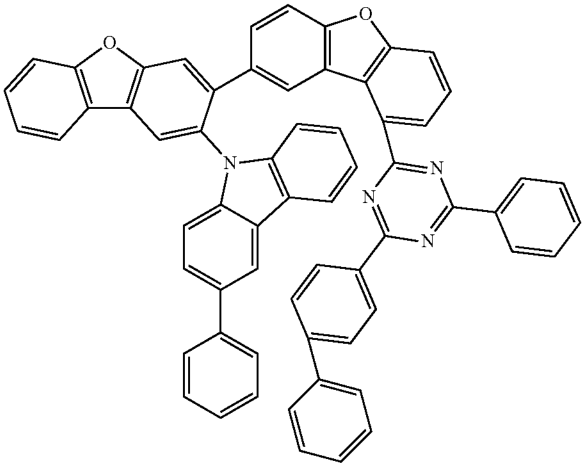 [SMILES: c1ccc(-c2ccc(-c3nc(-c4ccccc4)nc(-c4cccc5oc6ccc(-c7cc8oc9ccccc9c8cc7-n7c8ccccc8c8cc(-c9ccccc9)ccc87)cc6c45)n3)cc2)cc1]

TABLE 1-continued
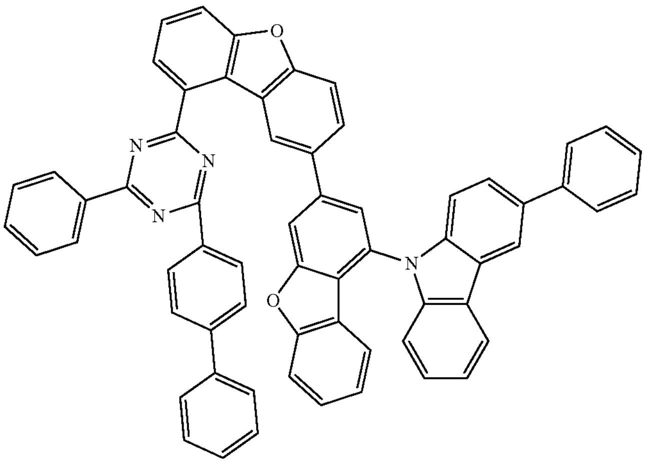 [SMILES: c1ccc(-c2ccc(-c3nc(-c4ccccc4)nc(-c4cccc5oc6ccc(-c7cc(-n8c9ccccc9c9cc(-c%10ccccc%10)ccc98)c8c(c7)oc7ccccc78)cc6c45)n3)cc2)cc1]
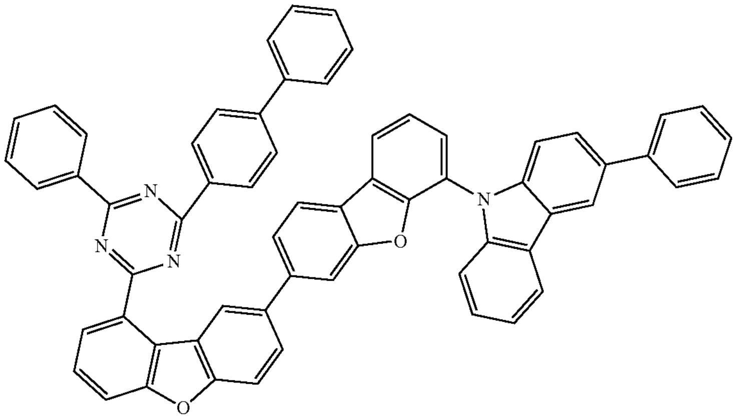 [SMILES: c1ccc(-c2ccc(-c3nc(-c4ccccc4)nc(-c4cccc5oc6ccc(-c7ccc8c(c7)oc7c(-n9c%10ccccc%10c%10cc(-c%11ccccc%11)ccc%109)cccc78)cc6c45)n3)cc2)cc1]
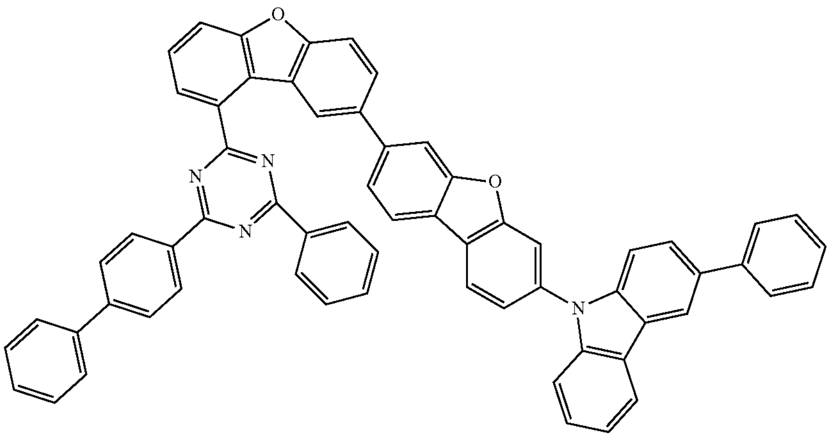 [SMILES: c1ccc(-c2ccc(-c3nc(-c4ccccc4)nc(-c4cccc5oc6ccc(-c7ccc8c(c7)oc7cc(-n9c%10ccccc%10c%10cc(-c%11ccccc%11)ccc%109)ccc78)cc6c45)n3)cc2)cc1]

TABLE 1-continued
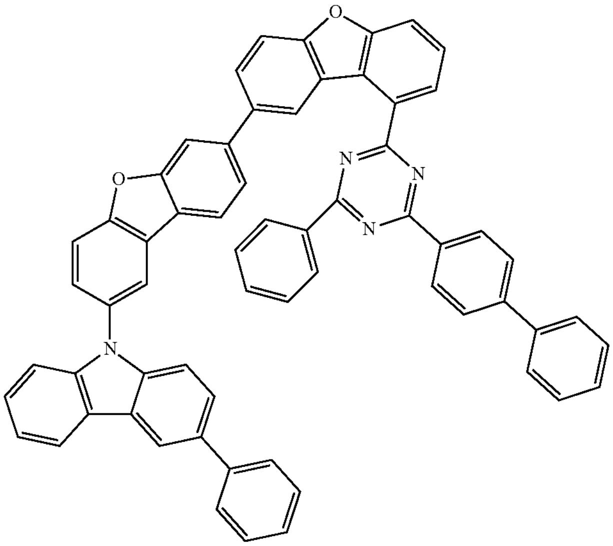 [SMILES: c1ccc(-c2ccc(-c3nc(-c4ccccc4)nc(-c4cccc5oc6ccc(-c7ccc8c(c7)oc7ccc(-n9c%10ccccc%10c%10cc(-c%11ccccc%11)ccc%109)cc78)cc6c45)n3)cc2)cc1]
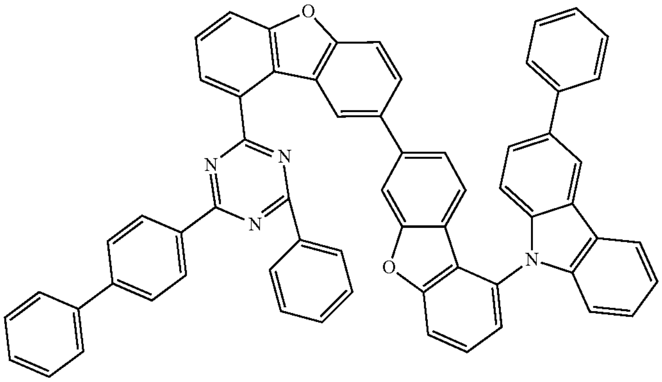 [SMILES: c1ccc(-c2ccc(-c3nc(-c4ccccc4)nc(-c4cccc5oc6ccc(-c7ccc8c(c7)oc7cccc(-n9c%10ccccc%10c%10cc(-c%11ccccc%11)ccc%109)c78)cc6c45)n3)cc2)cc1]
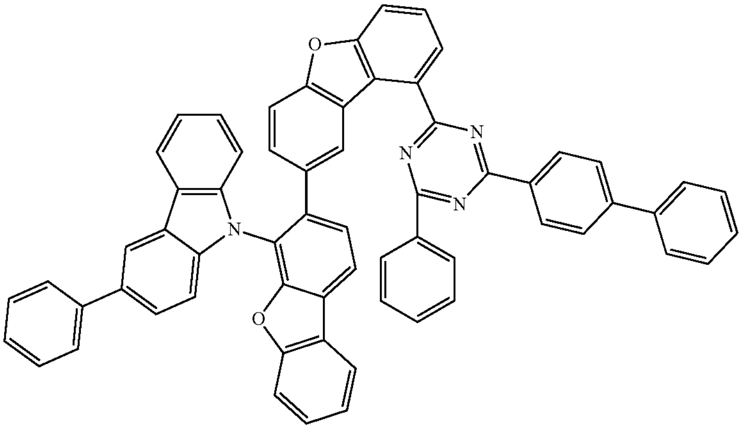 [SMILES: c1ccc(-c2ccc(-c3nc(-c4ccccc4)nc(-c4cccc5oc6ccc(-c7ccc8c(oc9ccccc98)c7-n7c8ccccc8c8cc(-c9ccccc9)ccc87)cc6c45)n3)cc2)cc1]

TABLE 1-continued
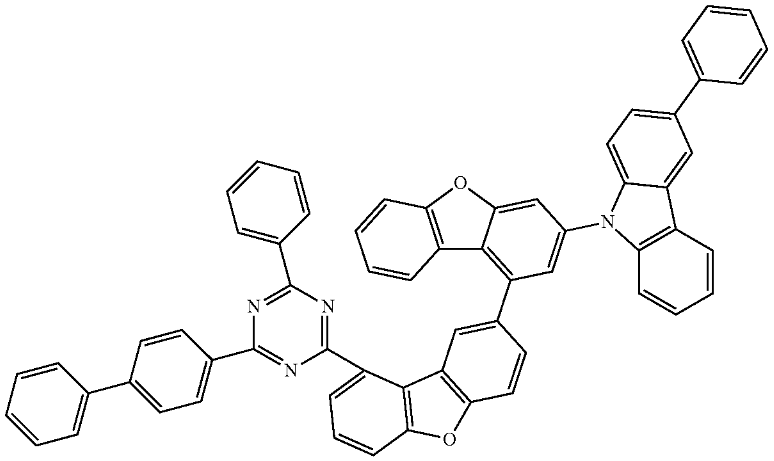 [SMILES: c1ccc(-c2ccc(-c3nc(-c4ccccc4)nc(-c4cccc5oc6ccc(-c7cc(-n8c9ccccc9c9cc(-c%10ccccc%10)ccc98)cc8oc9ccccc9c78)cc6c45)n3)cc2)cc1]
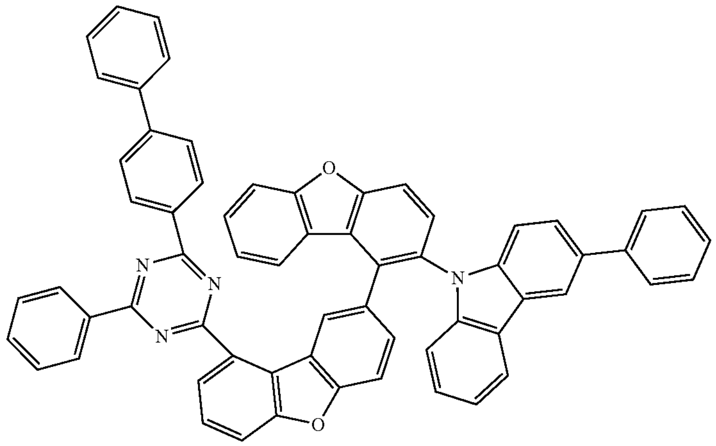 [SMILES: c1ccc(-c2ccc(-c3nc(-c4ccccc4)nc(-c4cccc5oc6ccc(-c7c(-n8c9ccccc9c9cc(-c%10ccccc%10)ccc98)ccc8oc9ccccc9c78)cc6c45)n3)cc2)cc1]
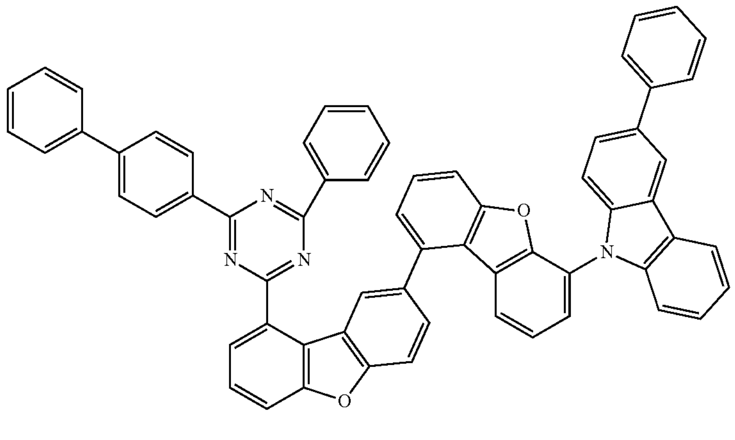 [SMILES: c1ccc(-c2ccc(-c3nc(-c4ccccc4)nc(-c4cccc5oc6ccc(-c7cccc8oc9c(-n%10c%11ccccc%11c%11cc(-c%12ccccc%12)ccc%11%10)cccc9c78)cc6c45)n3)cc2)cc1]

TABLE 1-continued
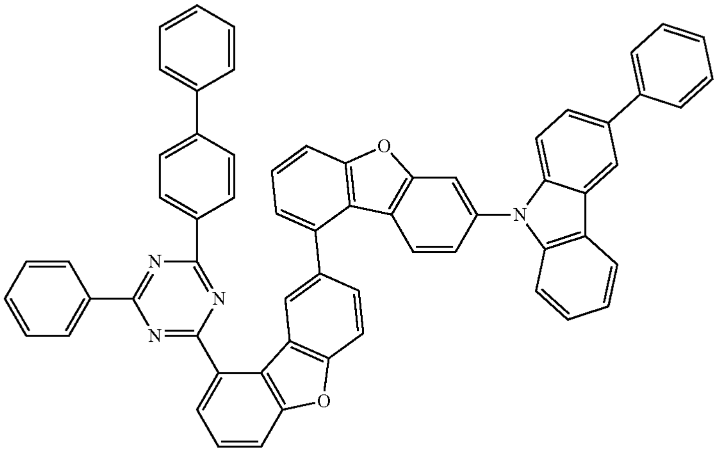 [SMILES: c1ccc(-c2ccc(-c3nc(-c4ccccc4)nc(-c4cccc5oc6ccc(-c7cccc8oc9cc(-n%10c%11ccccc%11c%11cc(-c%12ccccc%12)ccc%11%10)ccc9c78)cc6c45)n3)cc2)cc1]
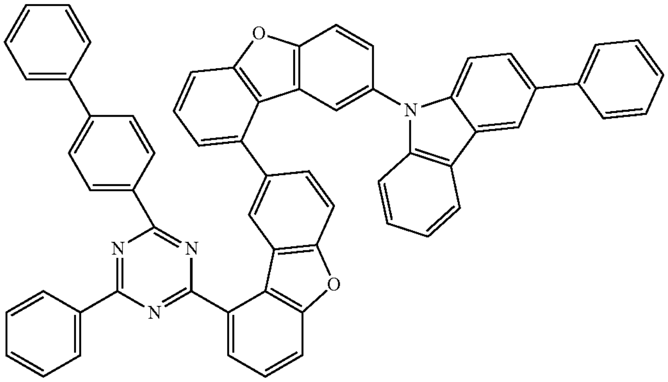 [SMILES: c1ccc(-c2ccc(-c3nc(-c4ccccc4)nc(-c4cccc5oc6ccc(-c7cccc8oc9ccc(-n%10c%11ccccc%11c%11cc(-c%12ccccc%12)ccc%11%10)cc9c78)cc6c45)n3)cc2)cc1]
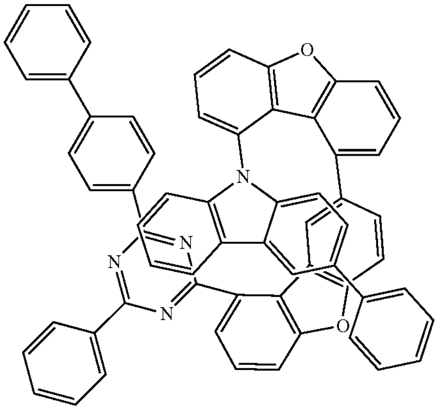 [SMILES: c1ccc(-c2ccc(-c3nc(-c4ccccc4)nc(-c4cccc5oc6ccc(-c7cccc8oc9cccc(-n%10c%11ccccc%11c%11cc(-c%12ccccc%12)ccc%11%10)c9c78)cc6c45)n3)cc2)cc1]

TABLE 1-continued
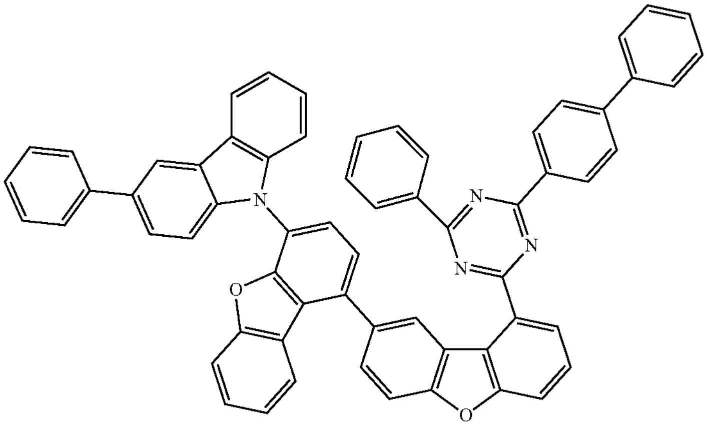 [SMILES: c1ccc(-c2ccc(-c3nc(-c4ccccc4)nc(-c4cccc5oc6ccc(-c7ccc(-n8c9ccccc9c9cc(-c%10ccccc%10)ccc98)c8oc9ccccc9c78)cc6c45)n3)cc2)cc1]
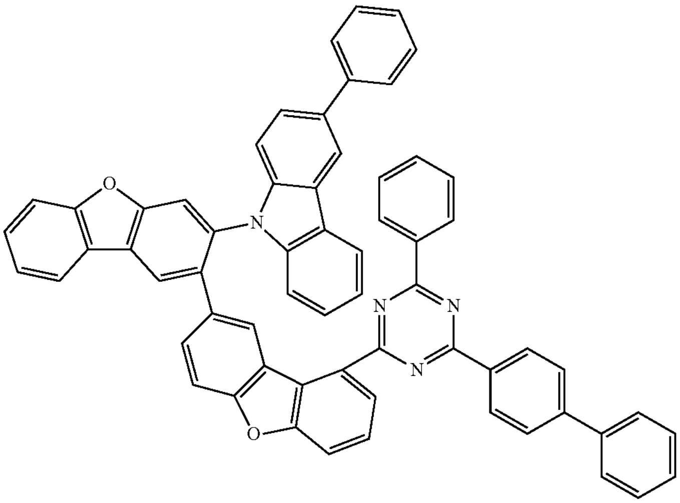 [SMILES: c1ccc(-c2ccc(-c3nc(-c4ccccc4)nc(-c4cccc5oc6ccc(-c7cc8c(cc7-n7c9ccccc9c9cc(-c%10ccccc%10)ccc97)oc7ccccc78)cc6c45)n3)cc2)cc1]
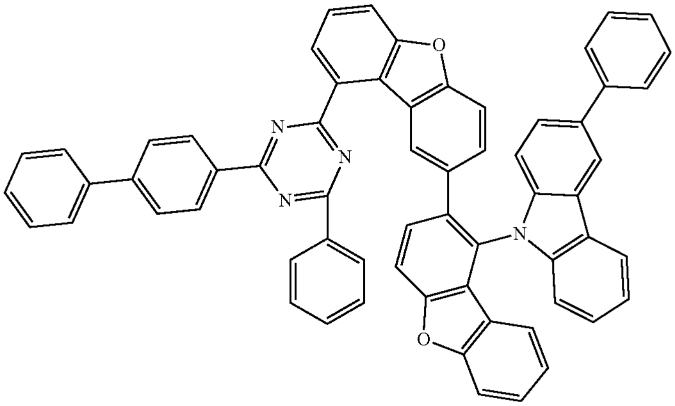 [SMILES: c1ccc(-c2ccc(-c3nc(-c4ccccc4)nc(-c4cccc5oc6ccc(-c7ccc8oc9ccccc9c8c7-n7c8ccccc8c8cc(-c9ccccc9)ccc87)cc6c45)n3)cc2)cc1]

TABLE 1-continued
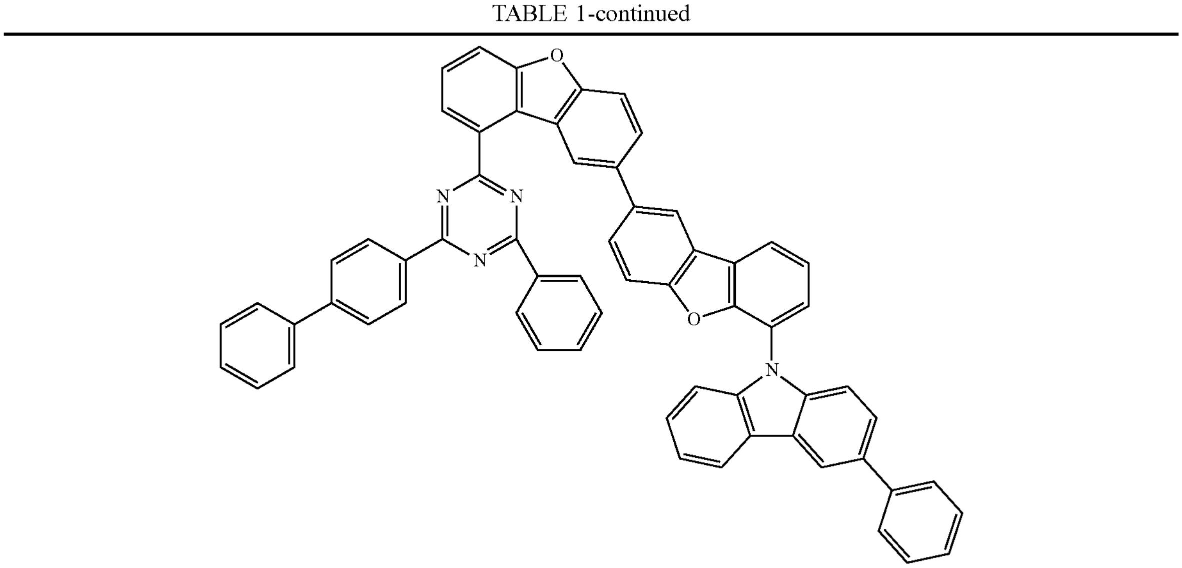
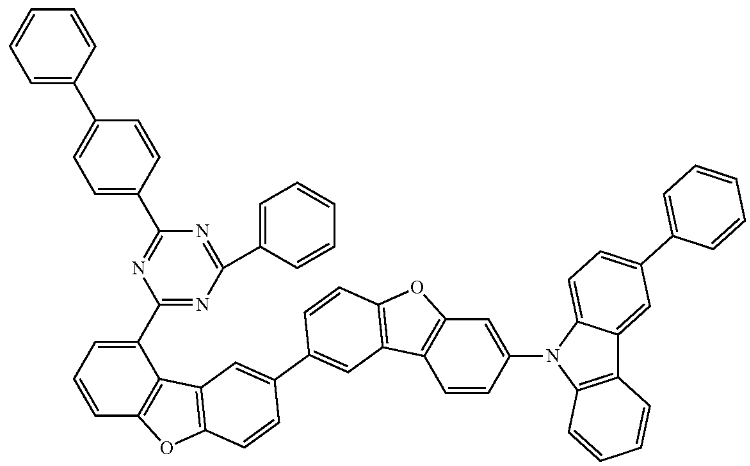 [SMILES: c1ccc(-c2ccc(-c3nc(-c4ccccc4)nc(-c4cccc5oc6ccc(-c7ccc8oc9cc(-n%10c%11ccccc%11c%11cc(-c%12ccccc%12)ccc%11%10)ccc9c8c7)cc6c45)n3)cc2)cc1]
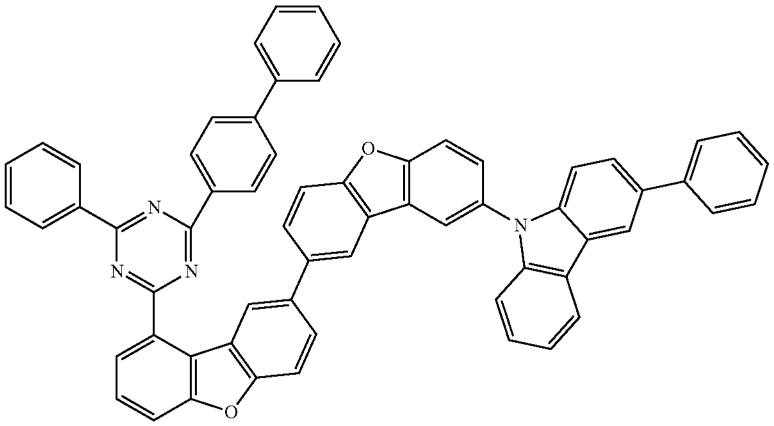 [SMILES: c1ccc(-c2ccc(-c3nc(-c4ccccc4)nc(-c4cccc5oc6ccc(-c7ccc8oc9ccc(-n%10c%11ccccc%11c%11cc(-c%12ccccc%12)ccc%11%10)cc9c8c7)cc6c45)n3)cc2)cc1]

TABLE 1-continued
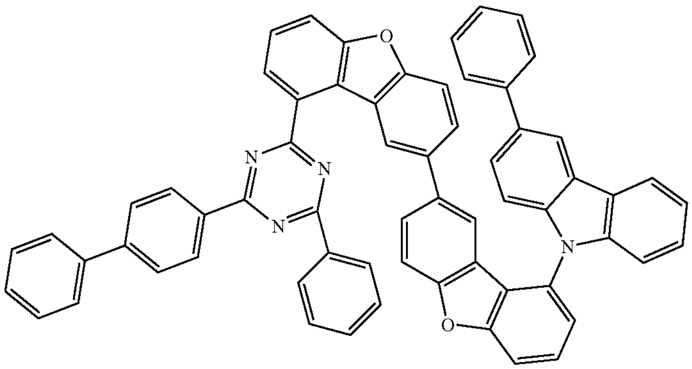 [SMILES: c1ccc(-c2ccc(-c3nc(-c4ccccc4)nc(-c4cccc5oc6ccc(-c7ccc8oc9cccc(-n%10c%11ccccc%11c%11cc(-c%12ccccc%12)ccc%11%10)c9c8c7)cc6c45)n3)cc2)cc1]
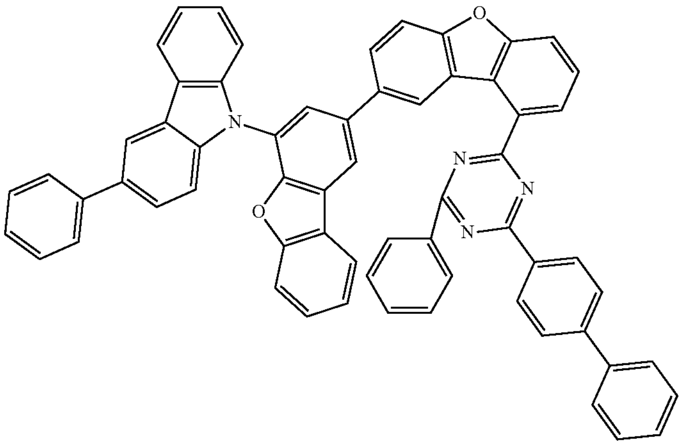 [SMILES: c1ccc(-c2ccc(-c3nc(-c4ccccc4)nc(-c4cccc5oc6ccc(-c7cc(-n8c9ccccc9c9cc(-c%10ccccc%10)ccc98)c8oc9ccccc9c8c7)cc6c45)n3)cc2)cc1]
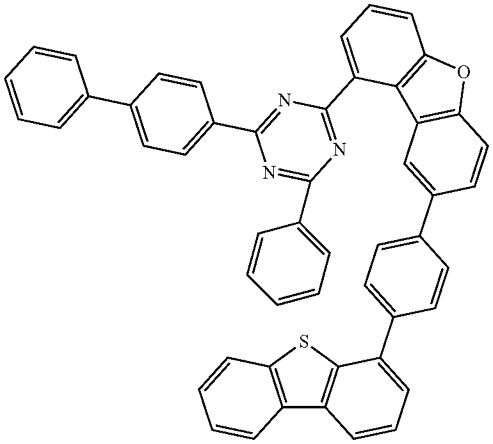 [SMILES: c1ccc(-c2ccc(-c3nc(-c4ccccc4)nc(-c4cccc5oc6ccc(-c7ccc(-c8cccc9c8sc8ccccc89)cc7)cc6c45)n3)cc2)cc1]

TABLE 1-continued
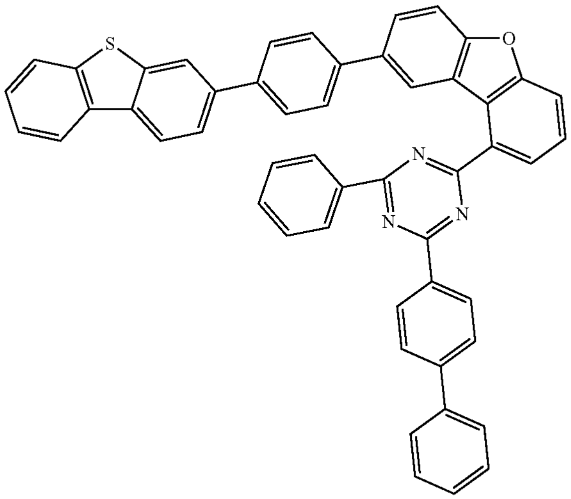 [SMILES: c1ccc(-c2ccc(-c3nc(-c4ccccc4)nc(-c4cccc5oc6ccc(-c7ccc(-c8ccc9c(c8)sc8ccccc89)cc7)cc6c45)n3)cc2)cc1]
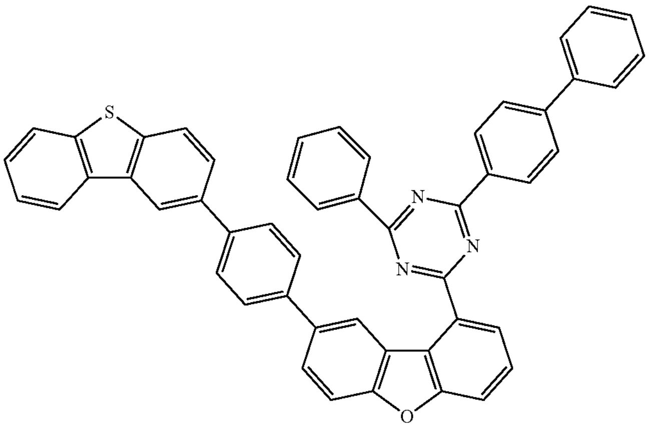 [SMILES: c1ccc(-c2ccc(-c3nc(-c4ccccc4)nc(-c4cccc5oc6ccc(-c7ccc(-c8ccc9sc%10ccccc%10c9c8)cc7)cc6c45)n3)cc2)cc1]
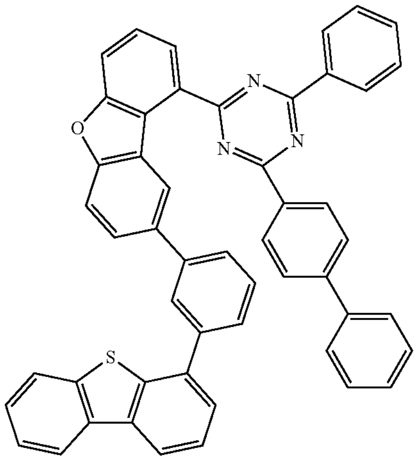 [SMILES: c1ccc(-c2ccc(-c3nc(-c4ccccc4)nc(-c4cccc5oc6ccc(-c7cccc(-c8cccc9c8sc8ccccc89)c7)cc6c45)n3)cc2)cc1]

TABLE 1-continued
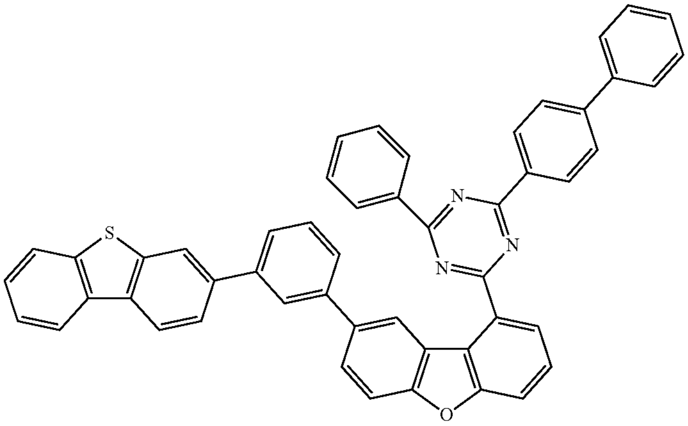 [SMILES: c1ccc(-c2ccc(-c3nc(-c4ccccc4)nc(-c4cccc5oc6ccc(-c7cccc(-c8ccc9c(c8)sc8ccccc89)c7)cc6c45)n3)cc2)cc1]
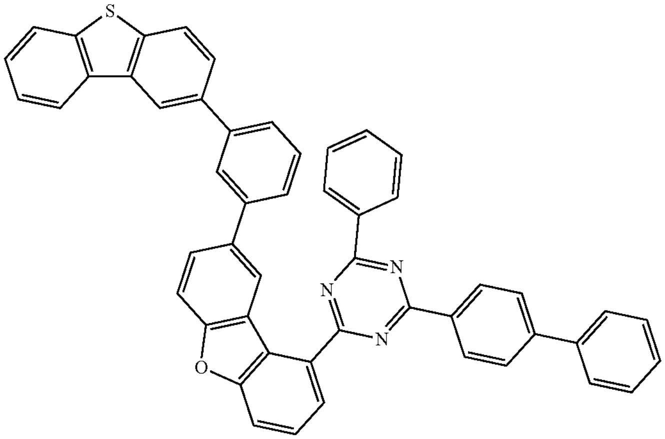 [SMILES: c1ccc(-c2ccc(-c3nc(-c4ccccc4)nc(-c4cccc5oc6ccc(-c7cccc(-c8ccc9sc%10ccccc%10c9c8)c7)cc6c45)n3)cc2)cc1]
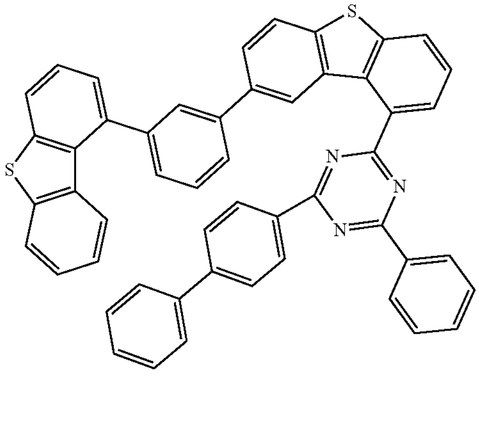 [SMILES: c1ccc(-c2ccc(-c3nc(-c4ccccc4)nc(-c4cccc5sc6ccc(-c7cccc(-c8cccc9sc%10ccccc%10c89)c7)cc6c45)n3)cc2)cc1]

TABLE 1-continued
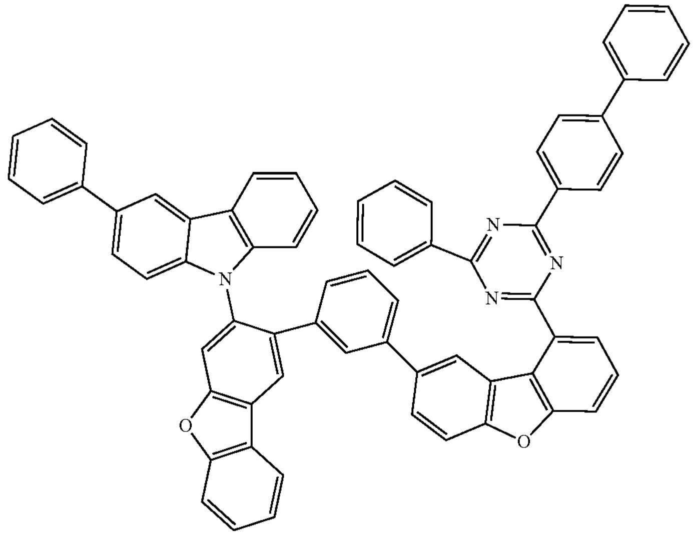 [SMILES: c1ccc(-c2ccc(-c3nc(-c4ccccc4)nc(-c4cccc5oc6ccc(-c7cccc(-c8cc9c(cc8-n8c%10ccccc%10c%10cc(-c%11ccccc%11)ccc%108)oc8ccccc89)c7)cc6c45)n3)cc2)cc1]
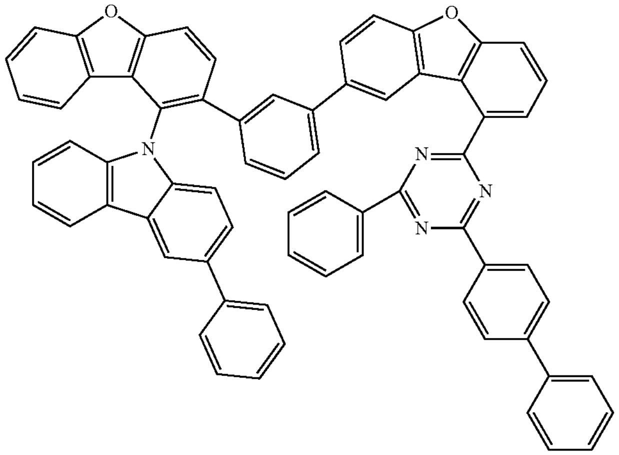 [SMILES: c1ccc(-c2ccc(-c3nc(-c4ccccc4)nc(-c4cccc5oc6ccc(-c7cccc(-c8ccc9oc%10ccccc%10c9c8-n8c9ccccc9c9cc(-c%10ccccc%10)ccc98)c7)cc6c45)n3)cc2)cc1]
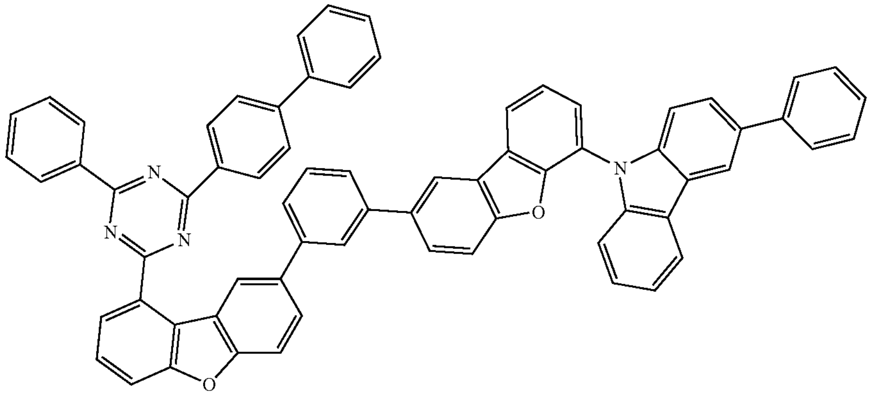 [SMILES: c1ccc(-c2ccc(-c3nc(-c4ccccc4)nc(-c4cccc5oc6ccc(-c7cccc(-c8ccc9oc%10c(-n%11c%12ccccc%12c%12cc(-c%13ccccc%13)ccc%12%11)cccc%10c9c8)c7)cc6c45)n3)cc2)cc1]

TABLE 1-continued
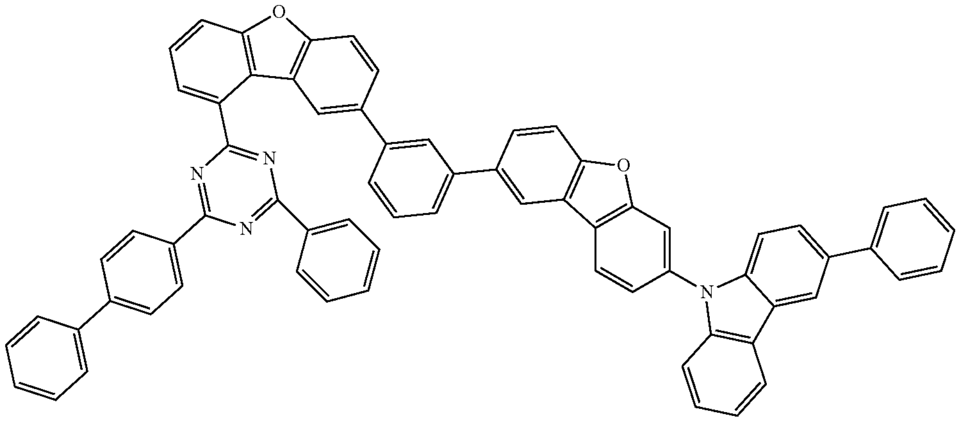 [SMILES: c1ccc(-c2ccc(-c3nc(-c4ccccc4)nc(-c4cccc5oc6ccc(-c7cccc(-c8ccc9oc%10cc(-n%11c%12ccccc%12c%12cc(-c%13ccccc%13)ccc%12%11)ccc%10c9c8)c7)cc6c45)n3)cc2)cc1]
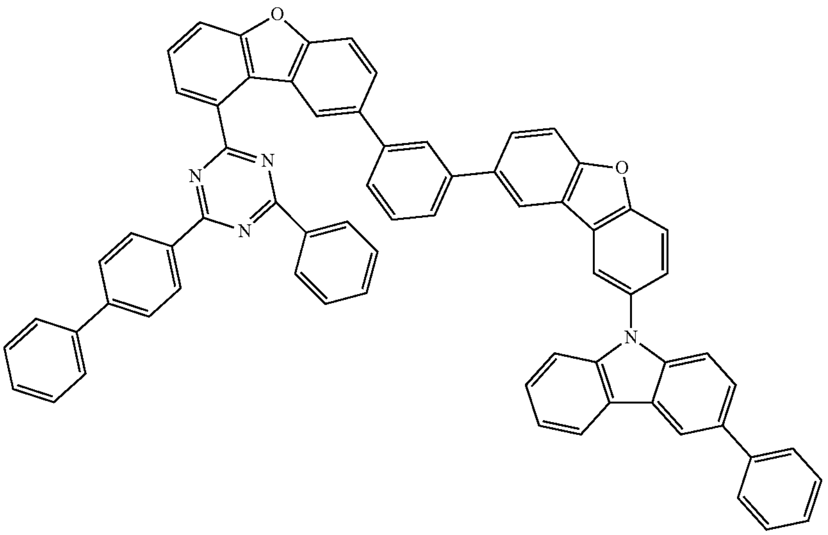 [SMILES: c1ccc(-c2ccc(-c3nc(-c4ccccc4)nc(-c4cccc5oc6ccc(-c7cccc(-c8ccc9oc%10ccc(-n%11c%12ccccc%12c%12cc(-c%13ccccc%13)ccc%12%11)cc%10c9c8)c7)cc6c45)n3)cc2)cc1]
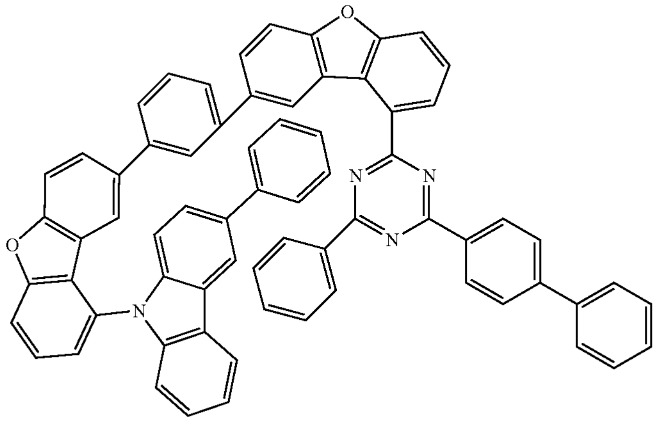 [SMILES: c1ccc(-c2ccc(-c3nc(-c4ccccc4)nc(-c4cccc5oc6ccc(-c7cccc(-c8ccc9oc%10cccc(-n%11c%12ccccc%12c%12cc(-c%13ccccc%13)ccc%12%11)c%10c9c8)c7)cc6c45)n3)cc2)cc1]

TABLE 1-continued
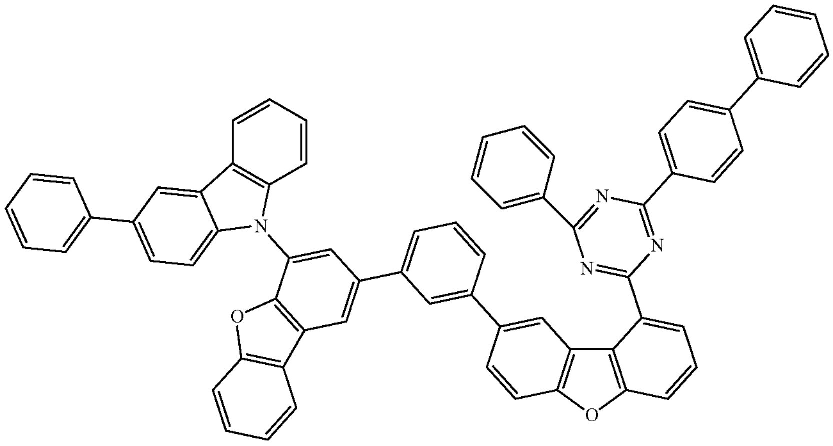 [SMILES: c1ccc(-c2ccc(-c3nc(-c4ccccc4)nc(-c4cccc5oc6ccc(-c7cccc(-c8cc(-n9c%10ccccc%10c%10cc(-c%11ccccc%11)ccc%109)c9oc%10ccccc%10c9c8)c7)cc6c45)n3)cc2)cc1]
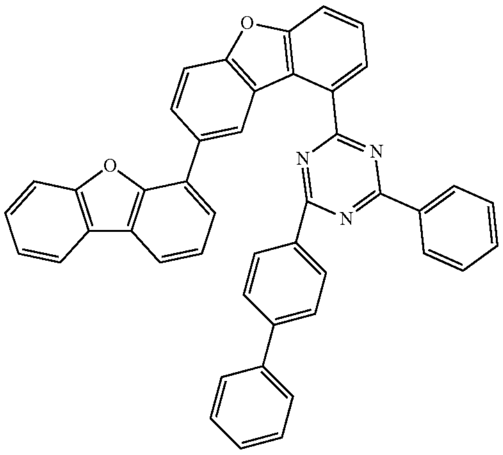 [SMILES: c1ccc(-c2ccc(-c3nc(-c4ccccc4)nc(-c4cccc5oc6ccc(-c7cccc8c7oc7ccccc78)cc6c45)n3)cc2)cc1]
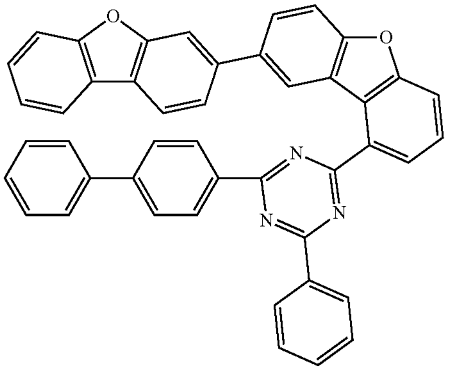 [SMILES: c1ccc(-c2ccc(-c3nc(-c4ccccc4)nc(-c4cccc5oc6ccc(-c7ccc8c(c7)oc7ccccc78)cc6c45)n3)cc2)cc1]

TABLE 1-continued
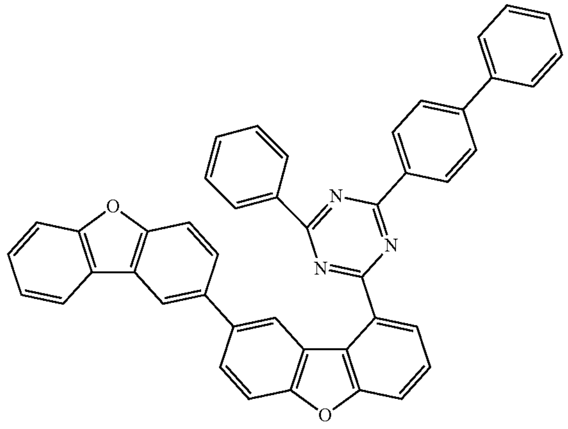 [SMILES: c1ccc(-c2ccc(-c3nc(-c4ccccc4)nc(-c4cccc5oc6ccc(-c7ccc8oc9ccccc9c8c7)cc6c45)n3)cc2)cc1]
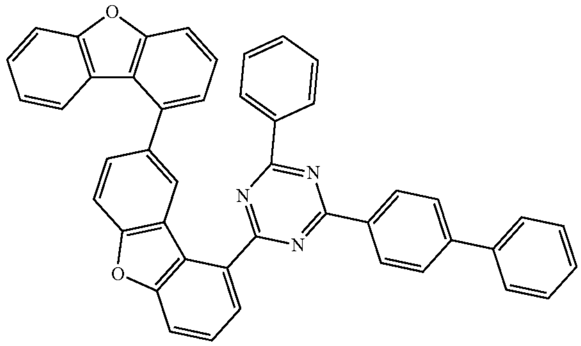 [SMILES: c1ccc(-c2ccc(-c3nc(-c4ccccc4)nc(-c4cccc5oc6ccc(-c7cccc8oc9ccccc9c78)cc6c45)n3)cc2)cc1]
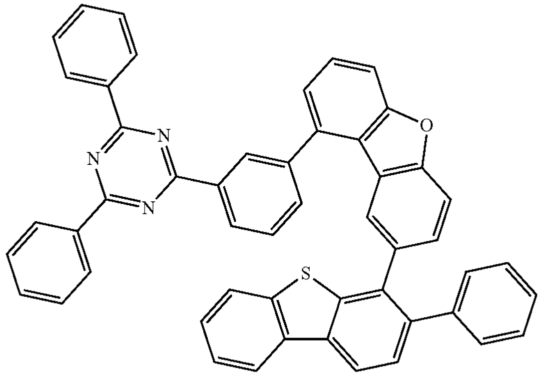 [SMILES: c1ccc(-c2nc(-c3ccccc3)nc(-c3cccc(-c4cccc5oc6ccc(-c7c(-c8ccccc8)ccc8c7sc7ccccc78)cc6c45)c3)n2)cc1]
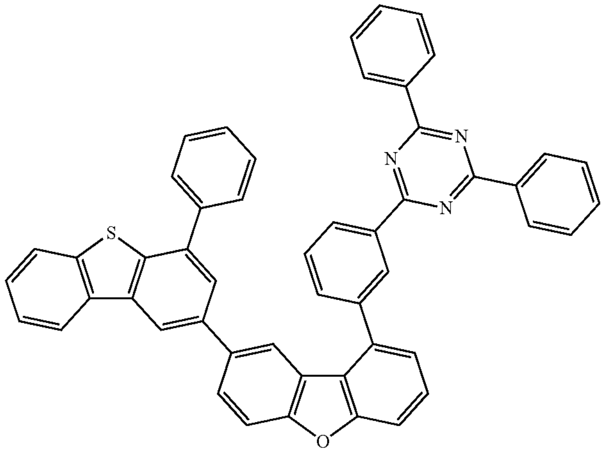 [SMILES: c1ccc(-c2nc(-c3ccccc3)nc(-c3cccc(-c4cccc5oc6ccc(-c7cc(-c8ccccc8)c8sc9ccccc9c8c7)cc6c45)c3)n2)cc1]

TABLE 1-continued
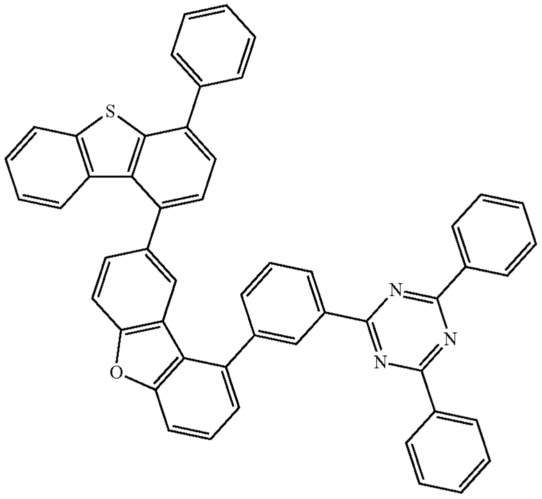 [SMILES: c1ccc(-c2nc(-c3ccccc3)nc(-c3cccc(-c4cccc5oc6ccc(-c7ccc(-c8ccccc8)c8sc9ccccc9c78)cc6c45)c3)n2)cc1]
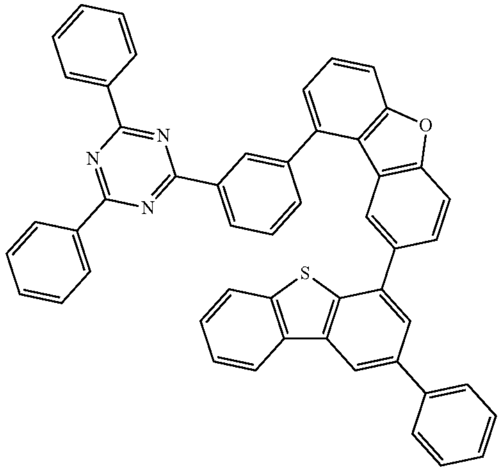 [SMILES: c1ccc(-c2cc(-c3ccc4oc5cccc(-c6cccc(-c7nc(-c8ccccc8)nc(-c8ccccc8)n7)c6)c5c4c3)c3sc4ccccc4c3c2)cc1]
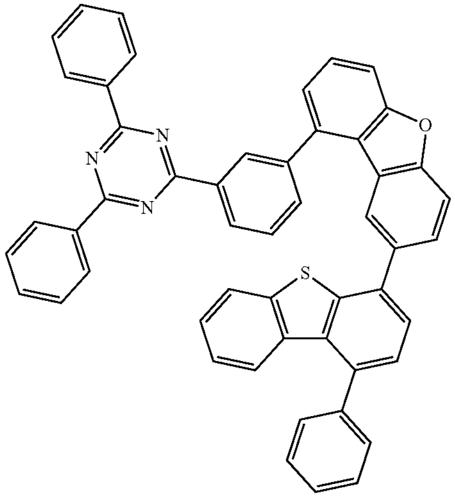 [SMILES: c1ccc(-c2nc(-c3ccccc3)nc(-c3cccc(-c4cccc5oc6ccc(-c7ccc(-c8ccccc8)c8c7sc7ccccc78)cc6c45)c3)n2)cc1]

TABLE 1-continued
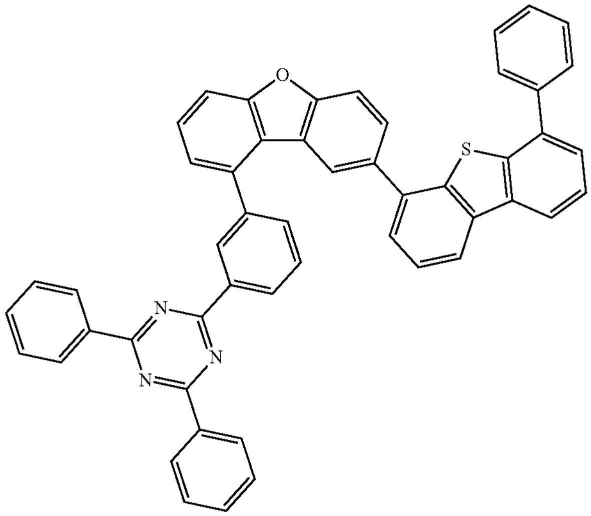 [SMILES: c1ccc(-c2nc(-c3ccccc3)nc(-c3cccc(-c4cccc5oc6ccc(-c7cccc8c7sc7c(-c9ccccc9)cccc78)cc6c45)c3)n2)cc1]
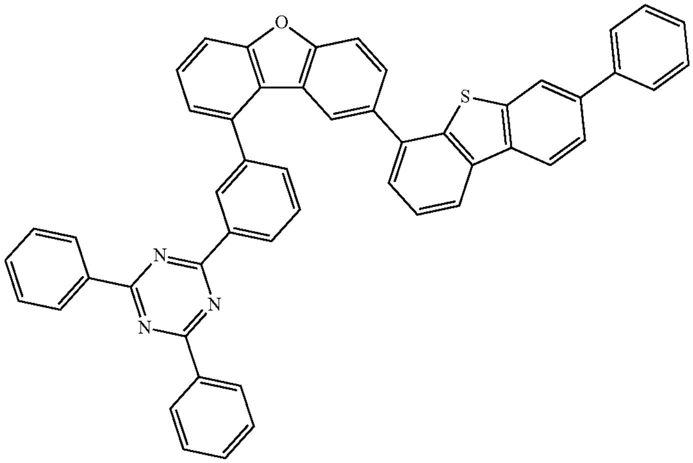 [SMILES: c1ccc(-c2ccc3c(c2)sc2c(-c4ccc5oc6cccc(-c7cccc(-c8nc(-c9ccccc9)nc(-c9ccccc9)n8)c7)c6c5c4)cccc23)cc1]
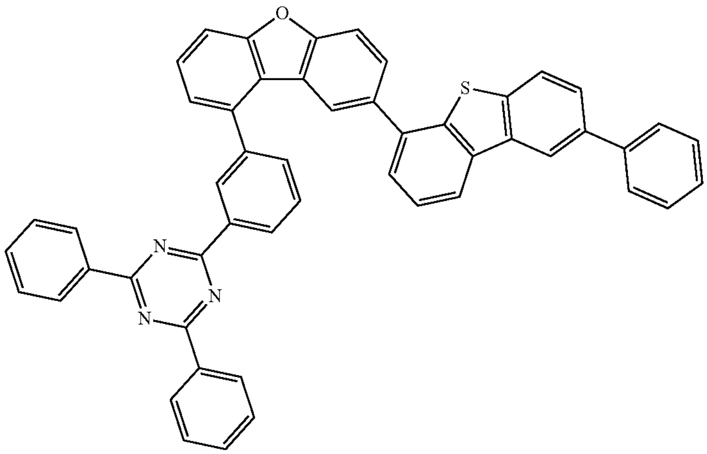 [SMILES: c1ccc(-c2ccc3sc4c(-c5ccc6oc7cccc(-c8cccc(-c9nc(-c%10ccccc%10)nc(-c%10ccccc%10)n9)c8)c7c6c5)cccc4c3c2)cc1]

TABLE 1-continued
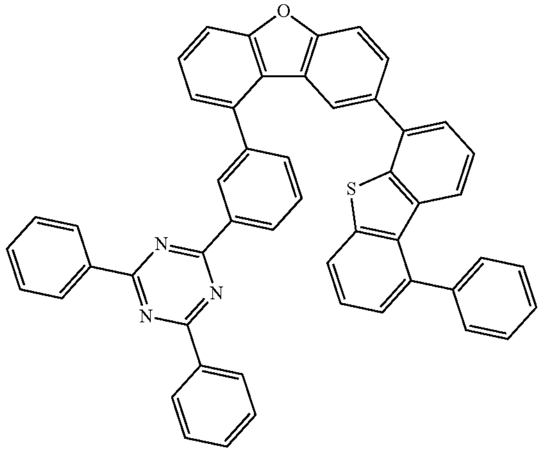 [SMILES: c1ccc(-c2nc(-c3ccccc3)nc(-c3cccc(-c4cccc5oc6ccc(-c7cccc8c7sc7cccc(-c9ccccc9)c78)cc6c45)c3)n2)cc1]
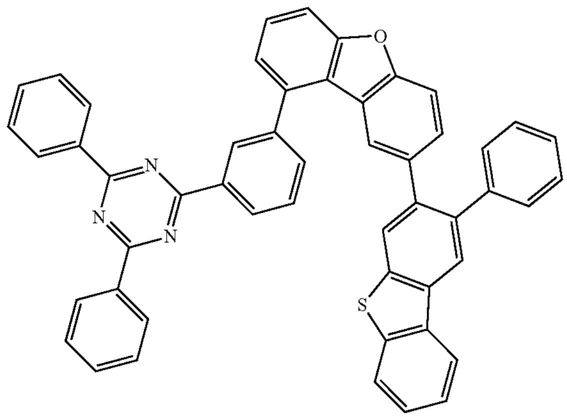 [SMILES: c1ccc(-c2nc(-c3ccccc3)nc(-c3cccc(-c4cccc5oc6ccc(-c7cc8sc9ccccc9c8cc7-c7ccccc7)cc6c45)c3)n2)cc1]
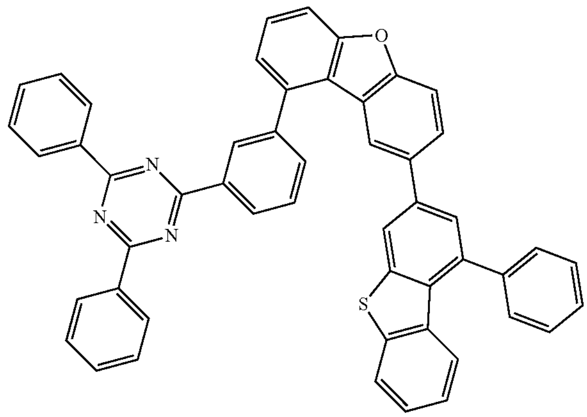 [SMILES: c1ccc(-c2nc(-c3ccccc3)nc(-c3cccc(-c4cccc5oc6ccc(-c7cc(-c8ccccc8)c8c(c7)sc7ccccc78)cc6c45)c3)n2)cc1]

TABLE 1-continued
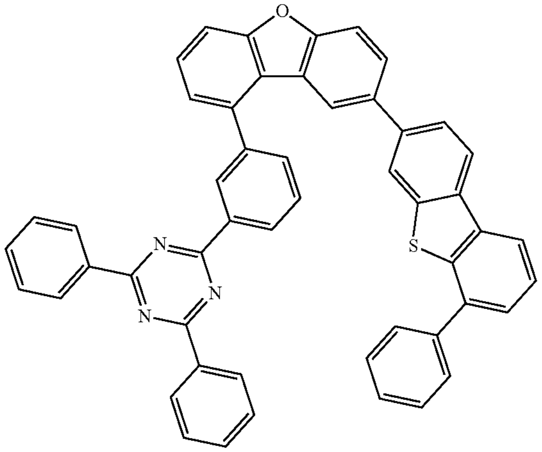 [SMILES: c1ccc(-c2nc(-c3ccccc3)nc(-c3cccc(-c4cccc5oc6ccc(-c7ccc8c(c7)sc7c(-c9ccccc9)cccc78)cc6c45)c3)n2)cc1]
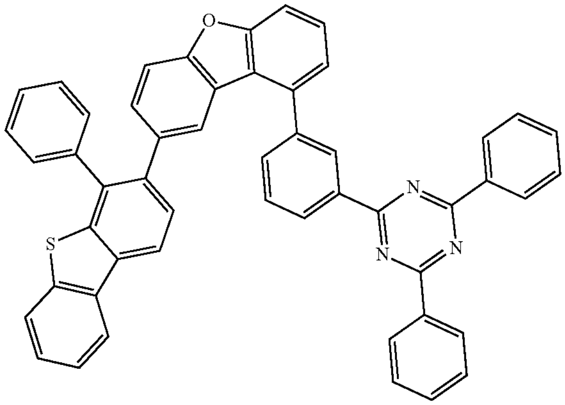 [SMILES: c1ccc(-c2nc(-c3ccccc3)nc(-c3cccc(-c4cccc5oc6ccc(-c7ccc8c(sc9ccccc98)c7-c7ccccc7)cc6c45)c3)n2)cc1]
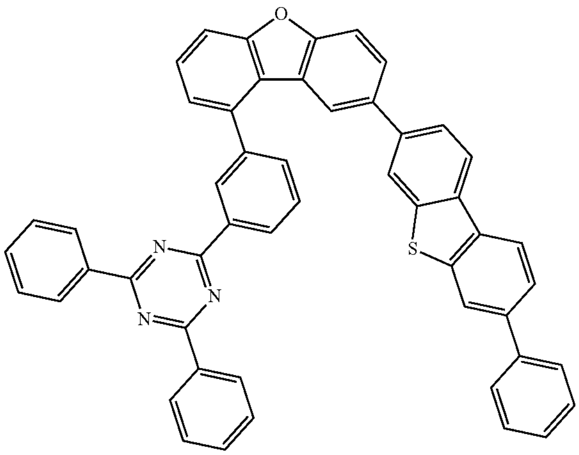 [SMILES: c1ccc(-c2ccc3c(c2)sc2cc(-c4ccc5oc6cccc(-c7cccc(-c8nc(-c9ccccc9)nc(-c9ccccc9)n8)c7)c6c5c4)ccc23)cc1]

TABLE 1-continued
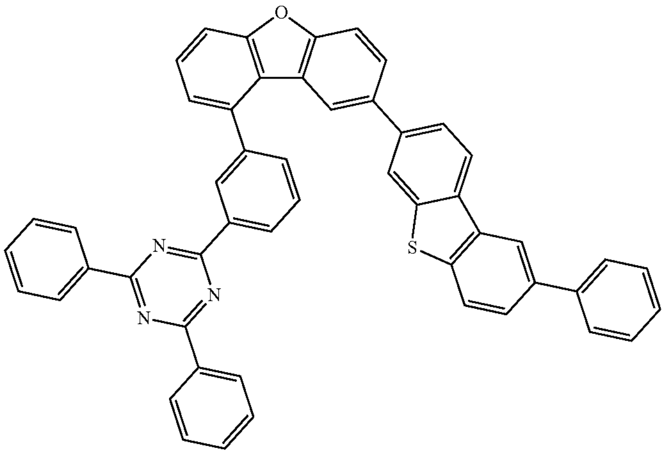 [SMILES: c1ccc(-c2ccc3sc4cc(-c5ccc6oc7cccc(-c8cccc(-c9nc(-c%10ccccc%10)nc(-c%10ccccc%10)n9)c8)c7c6c5)ccc4c3c2)cc1]
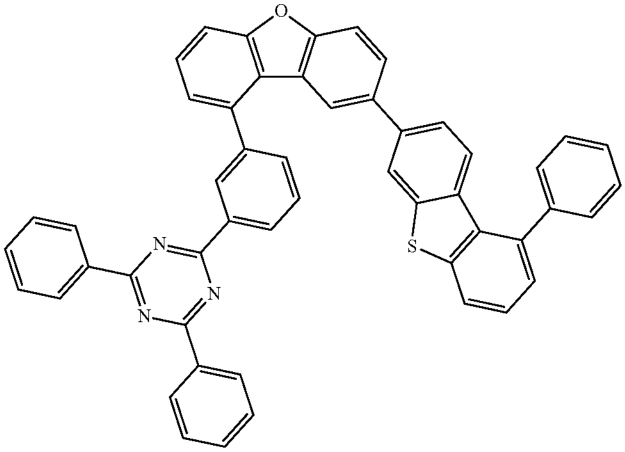 [SMILES: c1ccc(-c2nc(-c3ccccc3)nc(-c3cccc(-c4cccc5oc6ccc(-c7ccc8c(c7)sc7cccc(-c9ccccc9)c78)cc6c45)c3)n2)cc1]
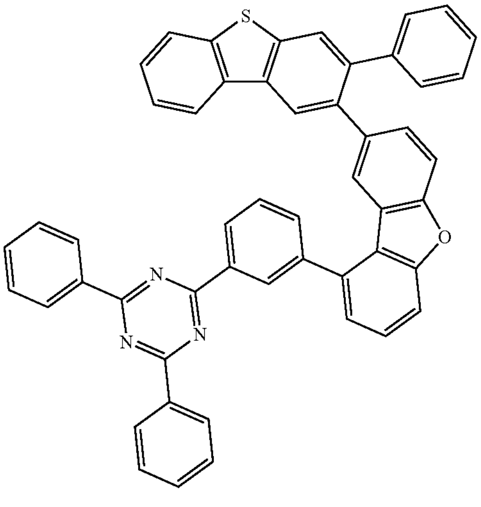 [SMILES: c1ccc(-c2nc(-c3ccccc3)nc(-c3cccc(-c4cccc5oc6ccc(-c7cc8c(cc7-c7ccccc7)sc7ccccc78)cc6c45)c3)n2)cc1]

TABLE 1-continued
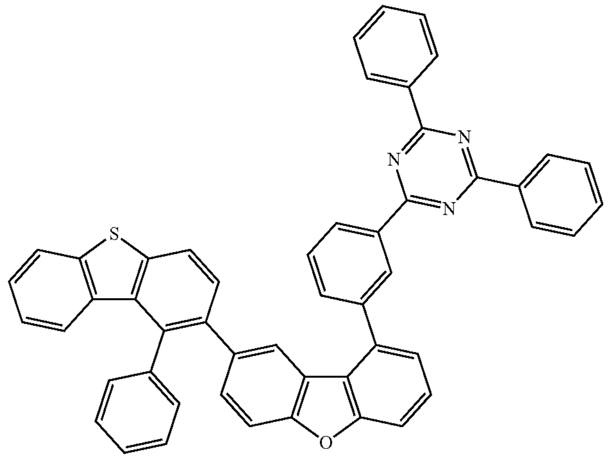 [SMILES: c1ccc(-c2nc(-c3ccccc3)nc(-c3cccc(-c4cccc5oc6ccc(-c7ccc8sc9ccccc9c8c7-c7ccccc7)cc6c45)c3)n2)cc1]
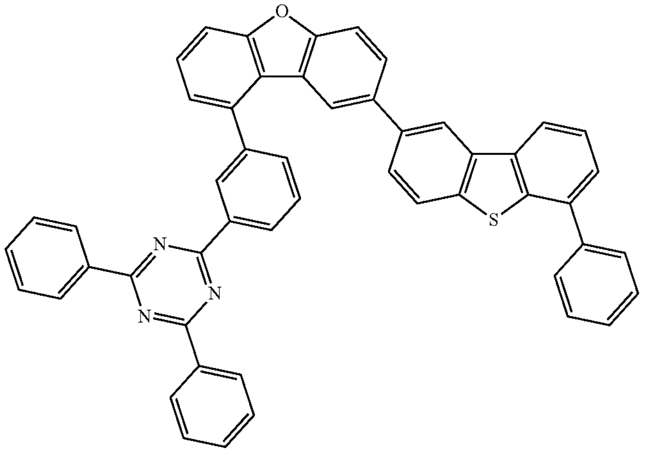 [SMILES: c1ccc(-c2nc(-c3ccccc3)nc(-c3cccc(-c4cccc5oc6ccc(-c7ccc8sc9c(-c%10ccccc%10)cccc9c8c7)cc6c45)c3)n2)cc1]
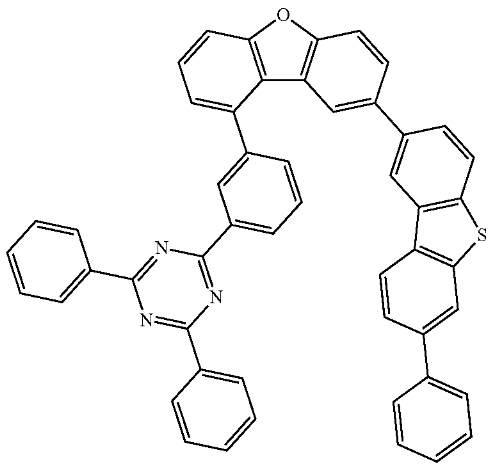 [SMILES: c1ccc(-c2ccc3c(c2)sc2ccc(-c4ccc5oc6cccc(-c7cccc(-c8nc(-c9ccccc9)nc(-c9ccccc9)n8)c7)c6c5c4)cc23)cc1]

TABLE 1-continued
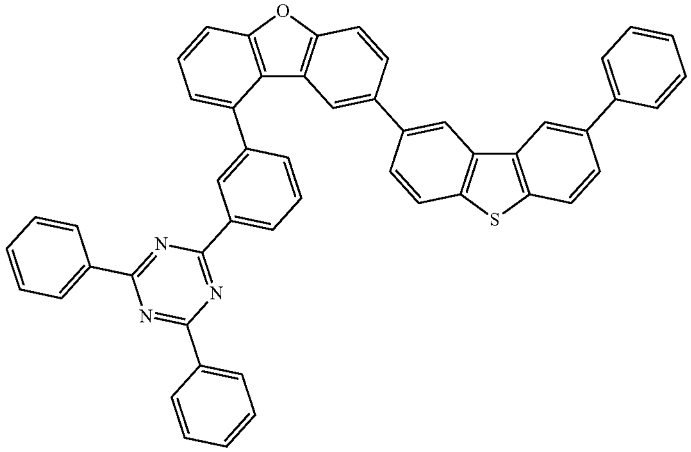 [SMILES: c1ccc(-c2ccc3sc4ccc(-c5ccc6oc7cccc(-c8cccc(-c9nc(-c%10ccccc%10)nc(-c%10ccccc%10)n9)c8)c7c6c5)cc4c3c2)cc1]
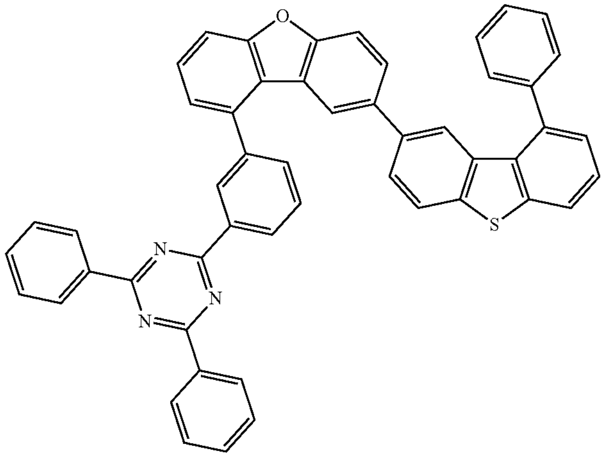 [SMILES: c1ccc(-c2nc(-c3ccccc3)nc(-c3cccc(-c4cccc5oc6ccc(-c7ccc8sc9cccc(-c%10ccccc%10)c9c8c7)cc6c45)c3)n2)cc1]
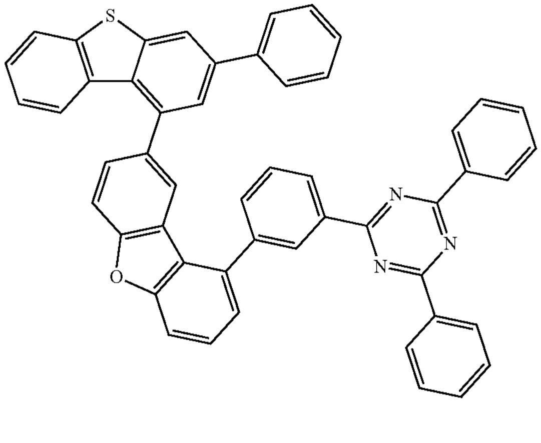 [SMILES: c1ccc(-c2cc(-c3ccc4oc5cccc(-c6cccc(-c7nc(-c8ccccc8)nc(-c8ccccc8)n7)c6)c5c4c3)c3c(c2)sc2ccccc23)cc1]

TABLE 1-continued
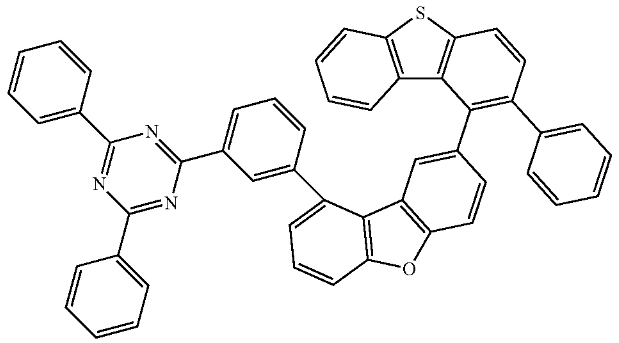 [SMILES: c1ccc(-c2nc(-c3ccccc3)nc(-c3cccc(-c4cccc5oc6ccc(-c7c(-c8ccccc8)ccc8sc9ccccc9c78)cc6c45)c3)n2)cc1]
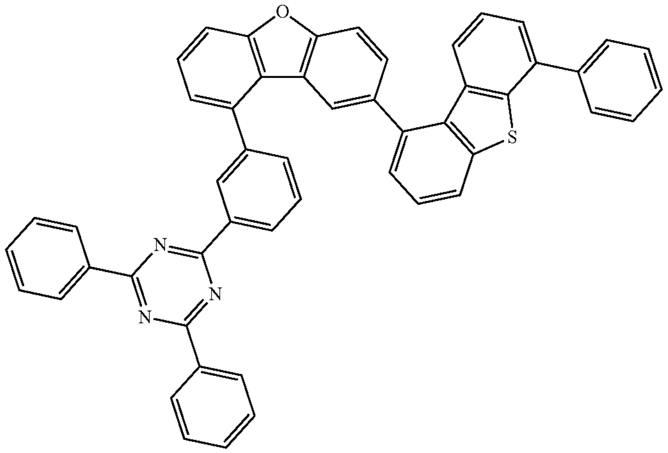 [SMILES: c1ccc(-c2nc(-c3ccccc3)nc(-c3cccc(-c4cccc5oc6ccc(-c7cccc8sc9c(-c%10ccccc%10)cccc9c78)cc6c45)c3)n2)cc1]
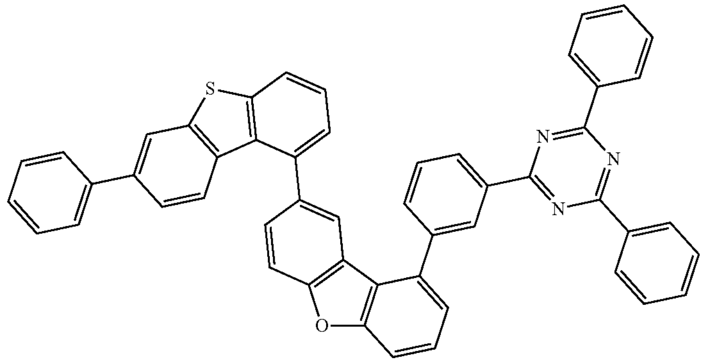 [SMILES: c1ccc(-c2ccc3c(c2)sc2cccc(-c4ccc5oc6cccc(-c7cccc(-c8nc(-c9ccccc9)nc(-c9ccccc9)n8)c7)c6c5c4)c23)cc1]
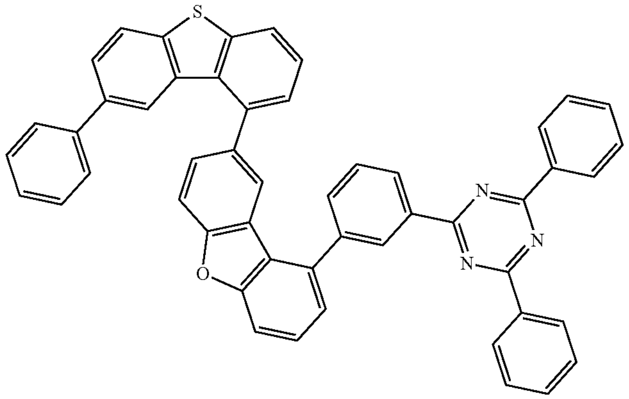 [SMILES: c1ccc(-c2ccc3sc4cccc(-c5ccc6oc7cccc(-c8cccc(-c9nc(-c%10ccccc%10)nc(-c%10ccccc%10)n9)c8)c7c6c5)c4c3c2)cc1]

TABLE 1-continued
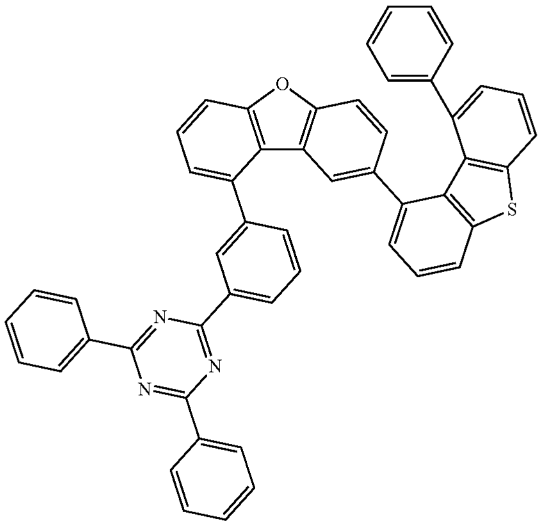 [SMILES: c1ccc(-c2nc(-c3ccccc3)nc(-c3cccc(-c4cccc5oc6ccc(-c7cccc8sc9cccc(-c%10ccccc%10)c9c78)cc6c45)c3)n2)cc1]
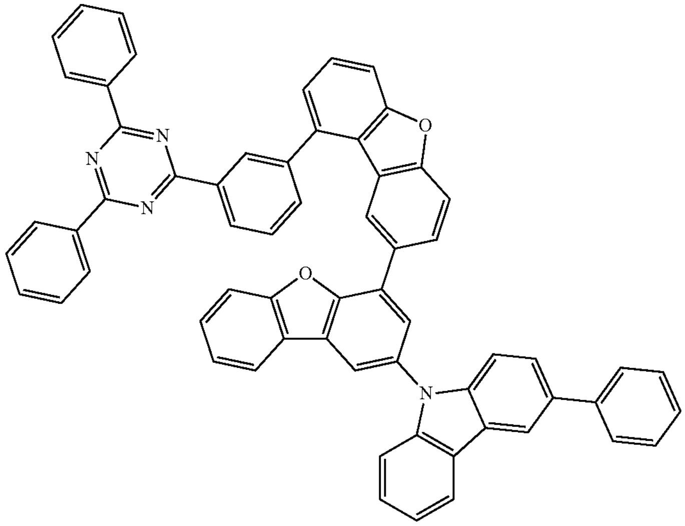 [SMILES: c1ccc(-c2ccc3c(c2)c2ccccc2n3-c2cc(-c3ccc4oc5cccc(-c6cccc(-c7nc(-c8ccccc8)nc(-c8ccccc8)n7)c6)c5c4c3)c3oc4ccccc4c3c2)cc1]
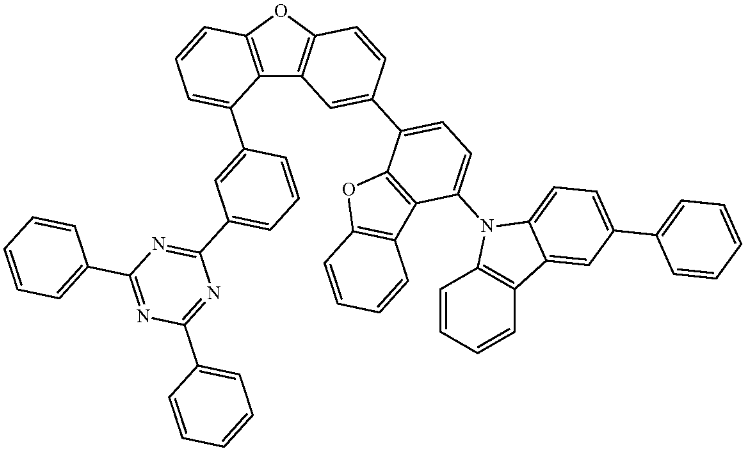 [SMILES: c1ccc(-c2ccc3c(c2)c2ccccc2n3-c2ccc(-c3ccc4oc5cccc(-c6cccc(-c7nc(-c8ccccc8)nc(-c8ccccc8)n7)c6)c5c4c3)c3oc4ccccc4c23)cc1]

TABLE 1-continued
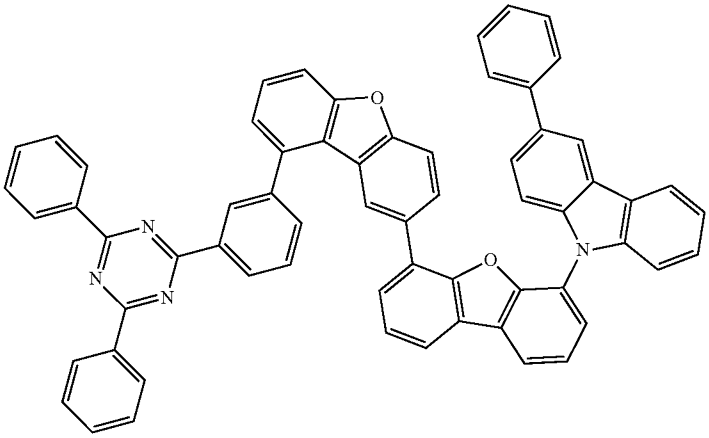 [SMILES: c1ccc(-c2ccc3c(c2)c2ccccc2n3-c2cccc3c2oc2c(-c4ccc5oc6cccc(-c7cccc(-c8nc(-c9ccccc9)nc(-c9ccccc9)n8)c7)c6c5c4)cccc23)cc1]
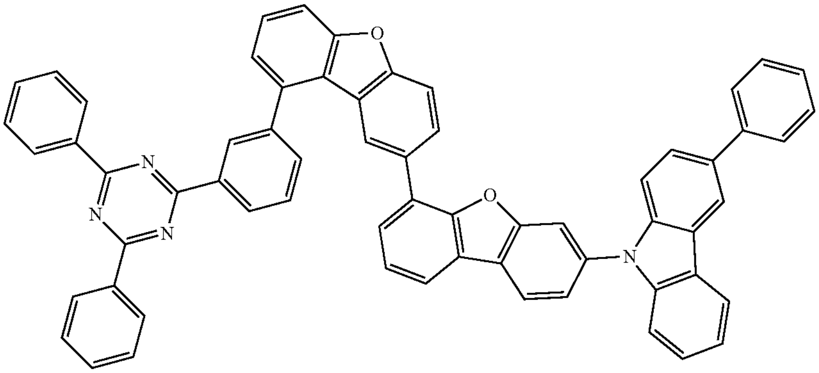 [SMILES: c1ccc(-c2ccc3c(c2)c2ccccc2n3-c2ccc3c(c2)oc2c(-c4ccc5oc6cccc(-c7cccc(-c8nc(-c9ccccc9)nc(-c9ccccc9)n8)c7)c6c5c4)cccc23)cc1]
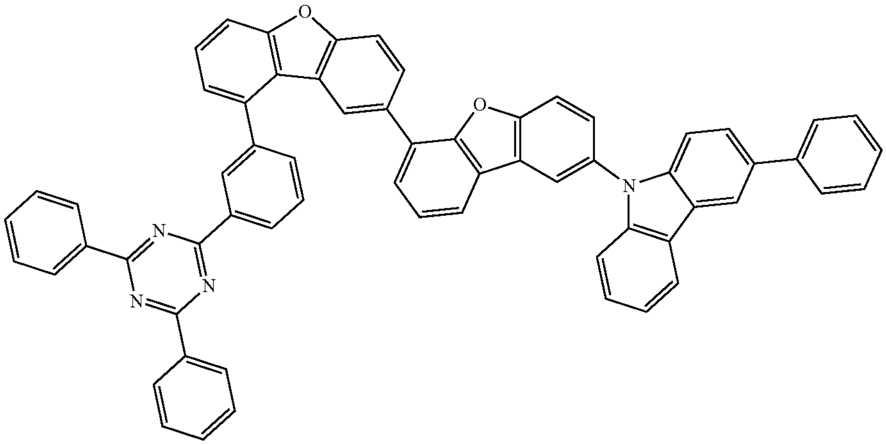 [SMILES: c1ccc(-c2ccc3c(c2)c2ccccc2n3-c2ccc3oc4c(-c5ccc6oc7cccc(-c8cccc(-c9nc(-c%10ccccc%10)nc(-c%10ccccc%10)n9)c8)c7c6c5)cccc4c3c2)cc1]

TABLE 1-continued
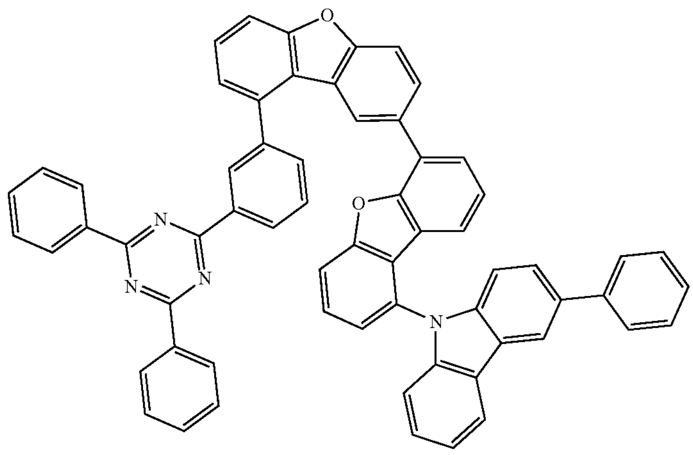 [SMILES: c1ccc(-c2ccc3c(c2)c2ccccc2n3-c2cccc3oc4c(-c5ccc6oc7cccc(-c8cccc(-c9nc(-c%10ccccc%10)nc(-c%10ccccc%10)n9)c8)c7c6c5)cccc4c23)cc1]
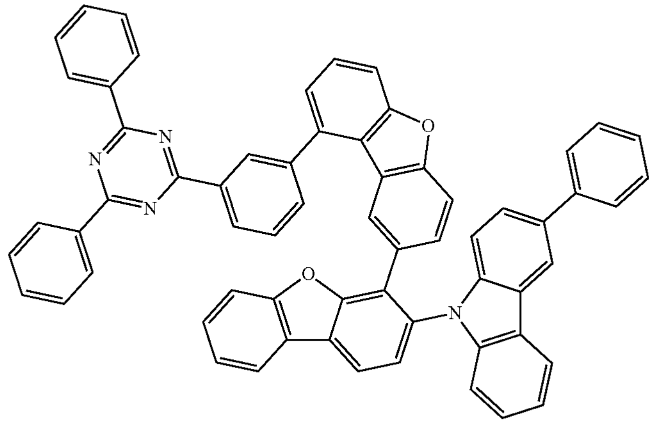 [SMILES: c1ccc(-c2ccc3c(c2)c2ccccc2n3-c2ccc3c(oc4ccccc43)c2-c2ccc3oc4cccc(-c5cccc(-c6nc(-c7ccccc7)nc(-c7ccccc7)n6)c5)c4c3c2)cc1]
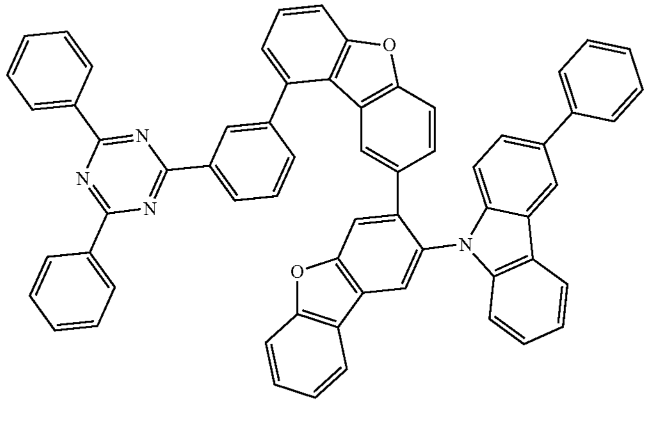 [SMILES: c1ccc(-c2ccc3c(c2)c2ccccc2n3-c2cc3c(cc2-c2ccc4oc5cccc(-c6cccc(-c7nc(-c8ccccc8)nc(-c8ccccc8)n7)c6)c5c4c2)oc2ccccc23)cc1]

TABLE 1-continued
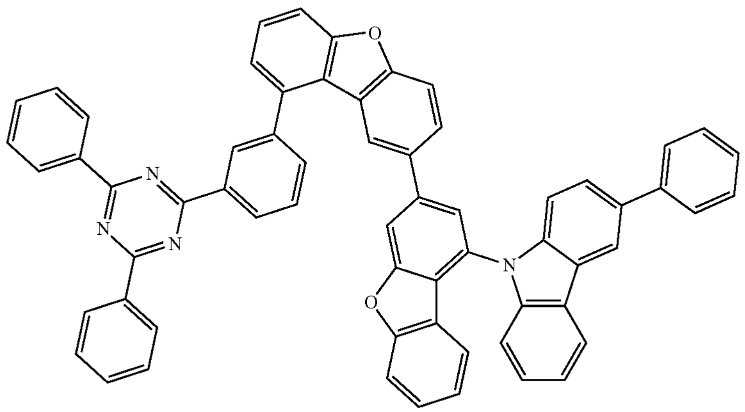 [SMILES: c1ccc(-c2ccc3c(c2)c2ccccc2n3-c2cc(-c3ccc4oc5cccc(-c6cccc(-c7nc(-c8ccccc8)nc(-c8ccccc8)n7)c6)c5c4c3)cc3oc4ccccc4c23)cc1]
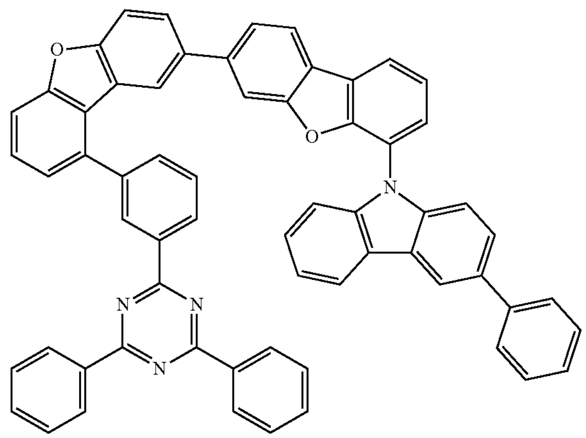 [SMILES: c1ccc(-c2ccc3c(c2)c2ccccc2n3-c2cccc3c2oc2cc(-c4ccc5oc6cccc(-c7cccc(-c8nc(-c9ccccc9)nc(-c9ccccc9)n8)c7)c6c5c4)ccc23)cc1]
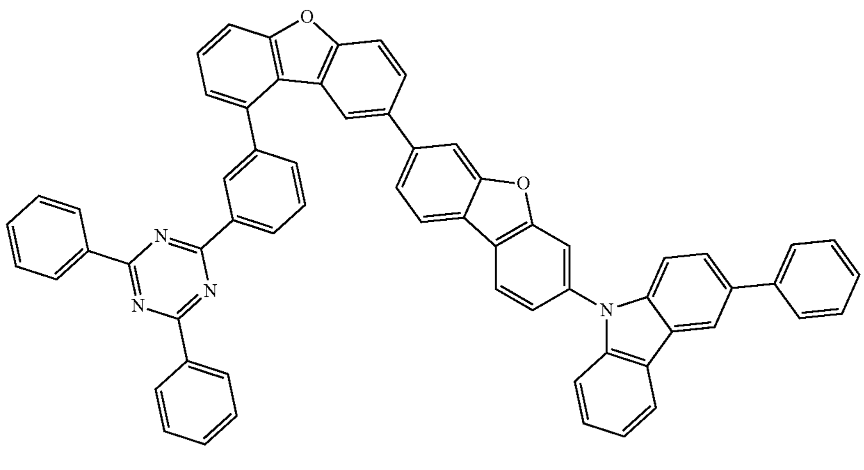 [SMILES: c1ccc(-c2ccc3c(c2)c2ccccc2n3-c2ccc3c(c2)oc2cc(-c4ccc5oc6cccc(-c7cccc(-c8nc(-c9ccccc9)nc(-c9ccccc9)n8)c7)c6c5c4)ccc23)cc1]

TABLE 1-continued
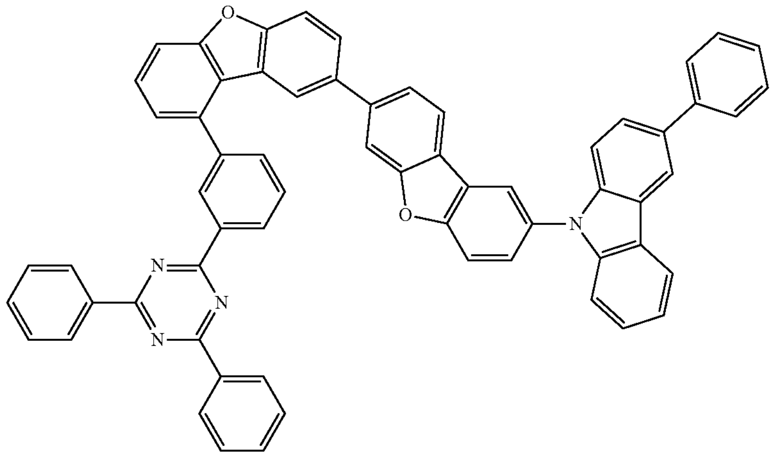 [SMILES: c1ccc(-c2ccc3c(c2)c2ccccc2n3-c2ccc3oc4cc(-c5ccc6oc7cccc(-c8cccc(-c9nc(-c%10ccccc%10)nc(-c%10ccccc%10)n9)c8)c7c6c5)ccc4c3c2)cc1]
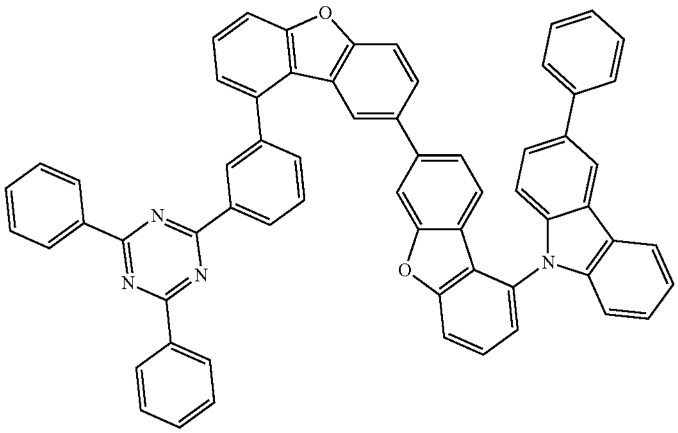 [SMILES: c1ccc(-c2ccc3c(c2)c2ccccc2n3-c2cccc3oc4cc(-c5ccc6oc7cccc(-c8cccc(-c9nc(-c%10ccccc%10)nc(-c%10ccccc%10)n9)c8)c7c6c5)ccc4c23)cc1]
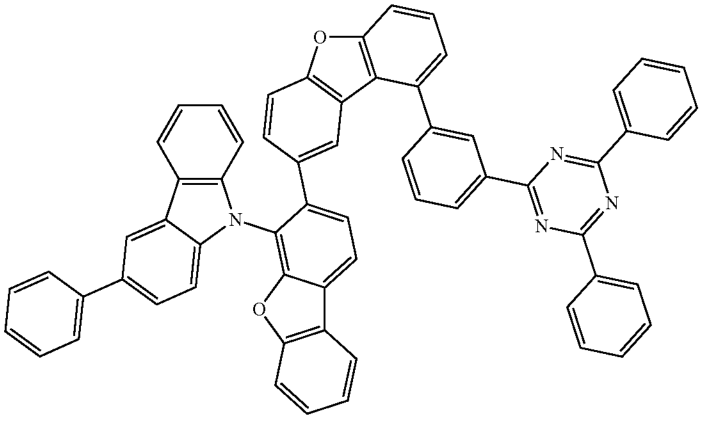 [SMILES: c1ccc(-c2ccc3c(c2)c2ccccc2n3-c2c(-c3ccc4oc5cccc(-c6cccc(-c7nc(-c8ccccc8)nc(-c8ccccc8)n7)c6)c5c4c3)ccc3c2oc2ccccc23)cc1]

TABLE 1-continued
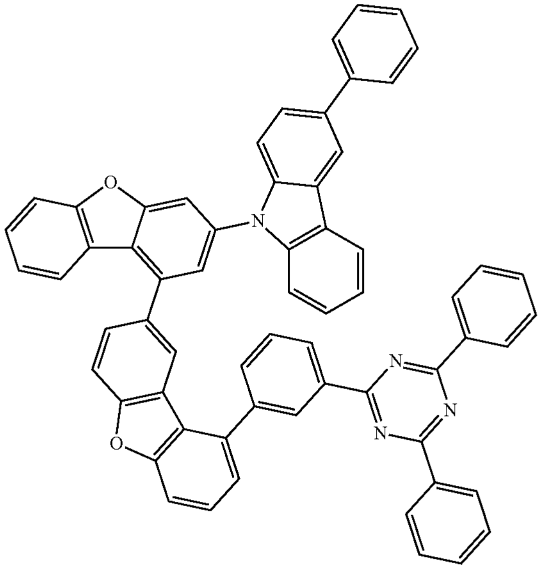 [SMILES: c1ccc(-c2ccc3c(c2)c2ccccc2n3-c2cc(-c3ccc4oc5cccc(-c6cccc(-c7nc(-c8ccccc8)nc(-c8ccccc8)n7)c6)c5c4c3)c3c(c2)oc2ccccc23)cc1]
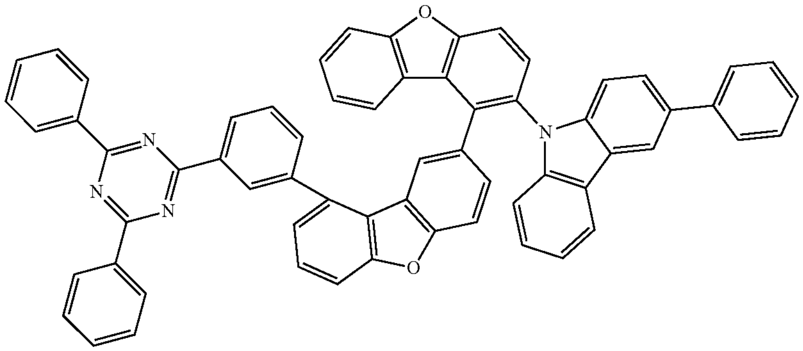 [SMILES: c1ccc(-c2ccc3c(c2)c2ccccc2n3-c2ccc3oc4ccccc4c3c2-c2ccc3oc4cccc(-c5cccc(-c6nc(-c7ccccc7)nc(-c7ccccc7)n6)c5)c4c3c2)cc1]
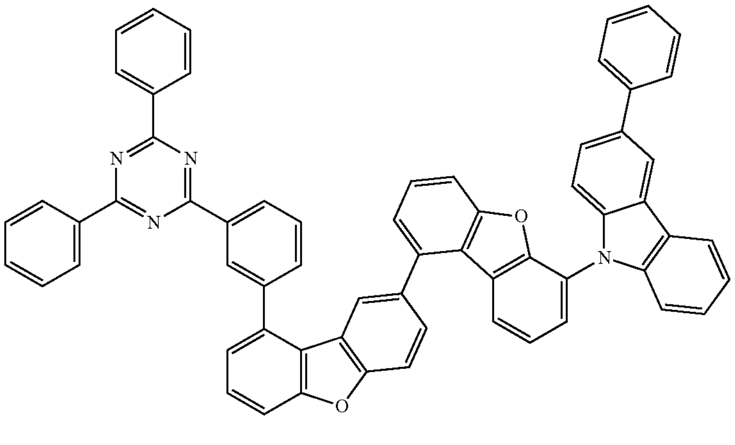 [SMILES: c1ccc(-c2ccc3c(c2)c2ccccc2n3-c2cccc3c2oc2cccc(-c4ccc5oc6cccc(-c7cccc(-c8nc(-c9ccccc9)nc(-c9ccccc9)n8)c7)c6c5c4)c23)cc1]

TABLE 1-continued
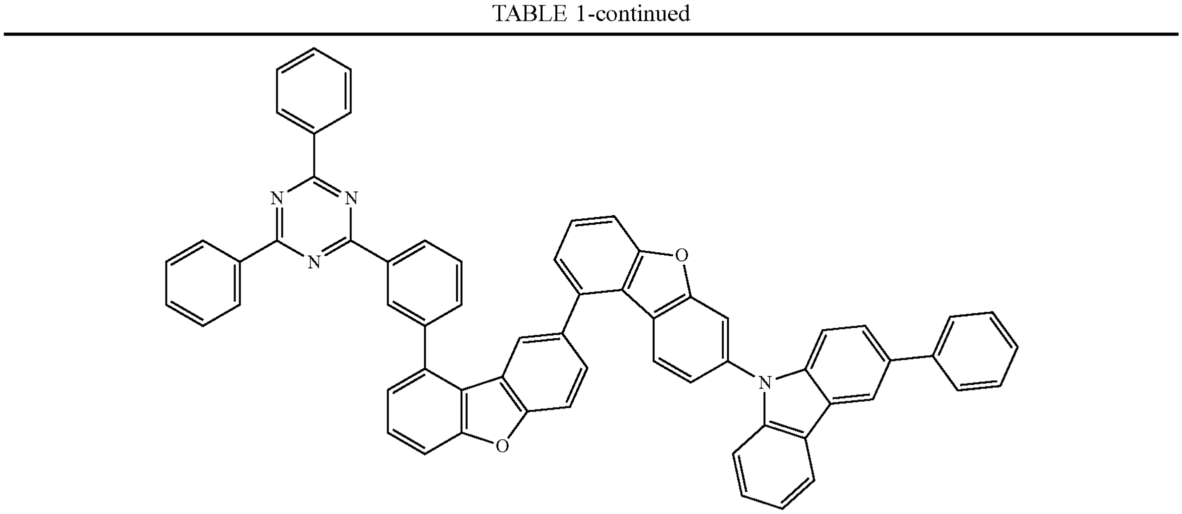
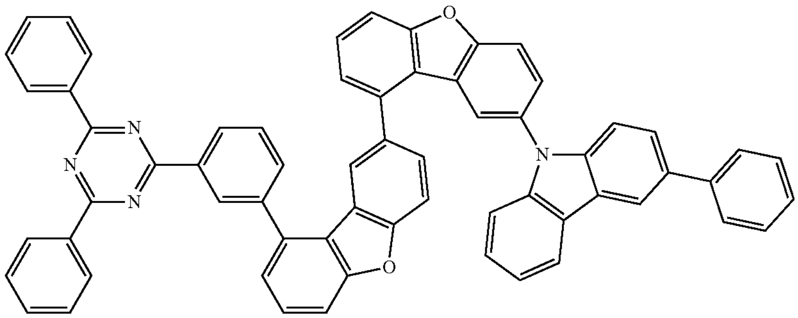 [SMILES: c1ccc(-c2ccc3c(c2)c2ccccc2n3-c2ccc3oc4cccc(-c5ccc6oc7cccc(-c8cccc(-c9nc(-c%10ccccc%10)nc(-c%10ccccc%10)n9)c8)c7c6c5)c4c3c2)cc1]
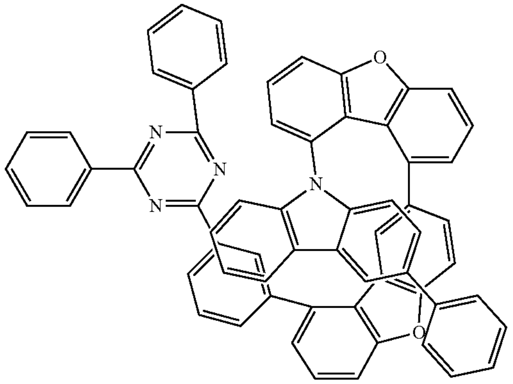 [SMILES: c1ccc(-c2ccc3c(c2)c2ccccc2n3-c2cccc3oc4cccc(-c5ccc6oc7cccc(-c8cccc(-c9nc(-c%10ccccc%10)nc(-c%10ccccc%10)n9)c8)c7c6c5)c4c23)cc1]
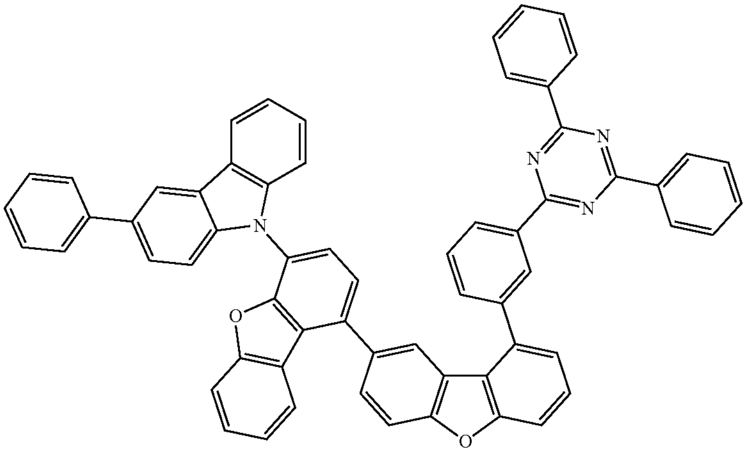 [SMILES: c1ccc(-c2ccc3c(c2)c2ccccc2n3-c2ccc(-c3ccc4oc5cccc(-c6cccc(-c7nc(-c8ccccc8)nc(-c8ccccc8)n7)c6)c5c4c3)c3c2oc2ccccc23)cc1]

TABLE 1-continued
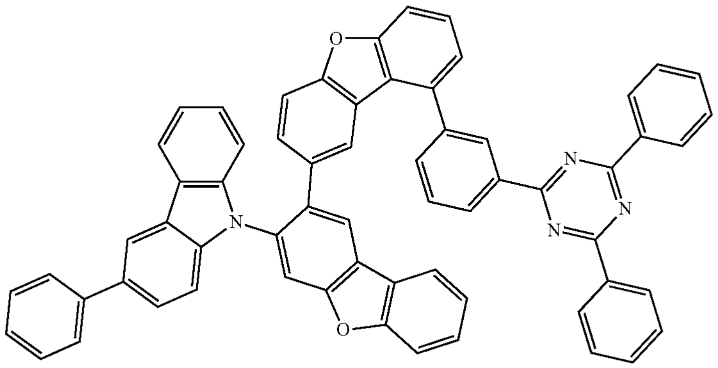 [SMILES: c1ccc(-c2ccc3c(c2)c2ccccc2n3-c2cc3oc4ccccc4c3cc2-c2ccc3oc4cccc(-c5cccc(-c6nc(-c7ccccc7)nc(-c7ccccc7)n6)c5)c4c3c2)cc1]
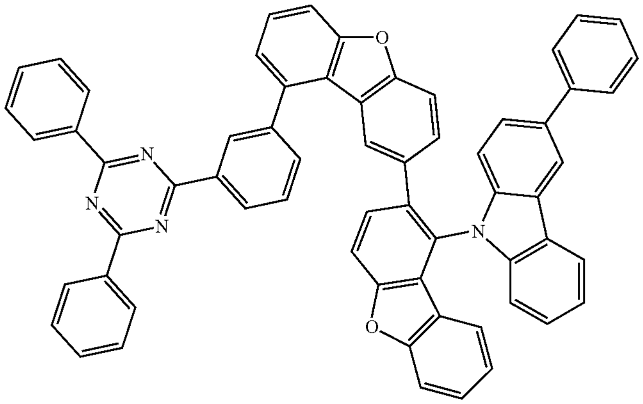 [SMILES: c1ccc(-c2ccc3c(c2)c2ccccc2n3-c2c(-c3ccc4oc5cccc(-c6cccc(-c7nc(-c8ccccc8)nc(-c8ccccc8)n7)c6)c5c4c3)ccc3oc4ccccc4c23)cc1]
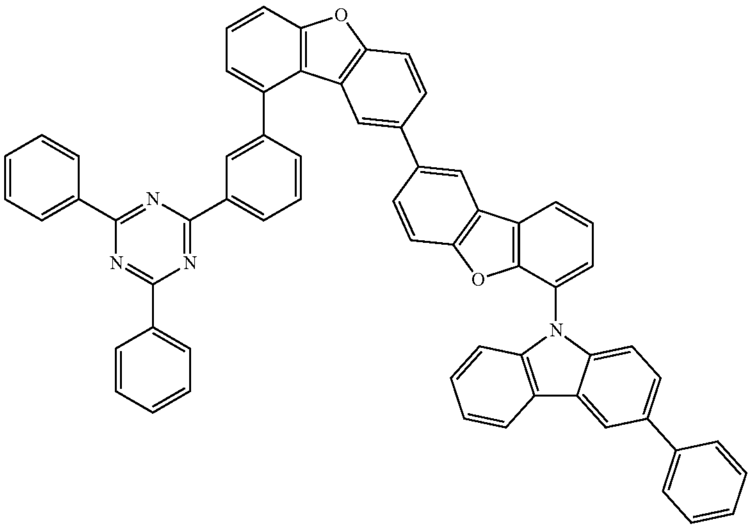 [SMILES: c1ccc(-c2ccc3c(c2)c2ccccc2n3-c2cccc3c2oc2ccc(-c4ccc5oc6cccc(-c7cccc(-c8nc(-c9ccccc9)nc(-c9ccccc9)n8)c7)c6c5c4)cc23)cc1]

TABLE 1-continued
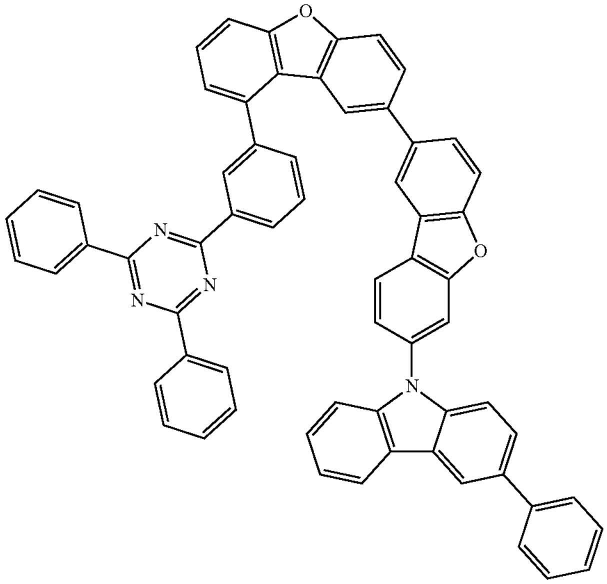 [SMILES: c1ccc(-c2ccc3c(c2)c2ccccc2n3-c2ccc3c(c2)oc2ccc(-c4ccc5oc6cccc(-c7cccc(-c8nc(-c9ccccc9)nc(-c9ccccc9)n8)c7)c6c5c4)cc23)cc1]
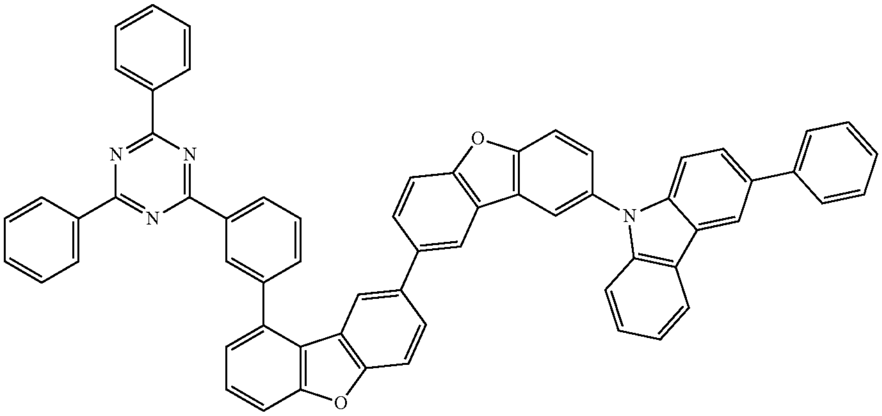 [SMILES: c1ccc(-c2ccc3c(c2)c2ccccc2n3-c2ccc3oc4ccc(-c5ccc6oc7cccc(-c8cccc(-c9nc(-c%10ccccc%10)nc(-c%10ccccc%10)n9)c8)c7c6c5)cc4c3c2)cc1]
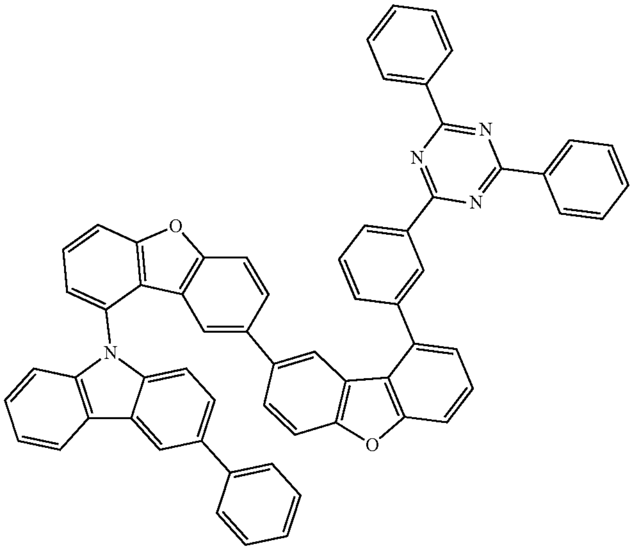 [SMILES: c1ccc(-c2ccc3c(c2)c2ccccc2n3-c2cccc3oc4ccc(-c5ccc6oc7cccc(-c8cccc(-c9nc(-c%10ccccc%10)nc(-c%10ccccc%10)n9)c8)c7c6c5)cc4c23)cc1]

TABLE 1-continued
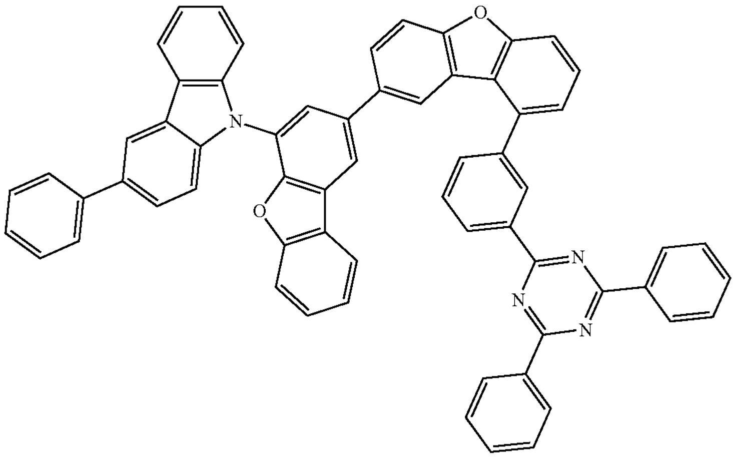 [SMILES: c1ccc(-c2ccc3c(c2)c2ccccc2n3-c2cc(-c3ccc4oc5cccc(-c6cccc(-c7nc(-c8ccccc8)nc(-c8ccccc8)n7)c6)c5c4c3)cc3c2oc2ccccc23)cc1]
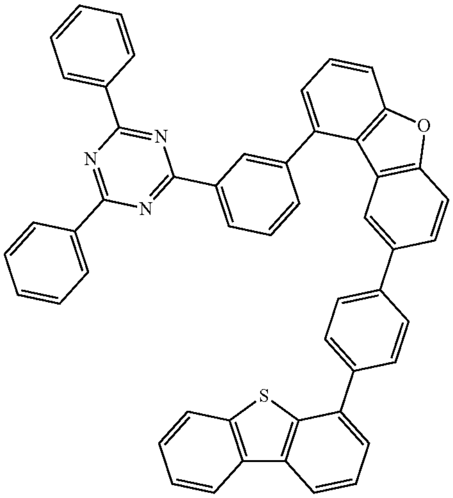 [SMILES: c1ccc(-c2nc(-c3ccccc3)nc(-c3cccc(-c4cccc5oc6ccc(-c7ccc(-c8cccc9c8sc8ccccc89)cc7)cc6c45)c3)n2)cc1]
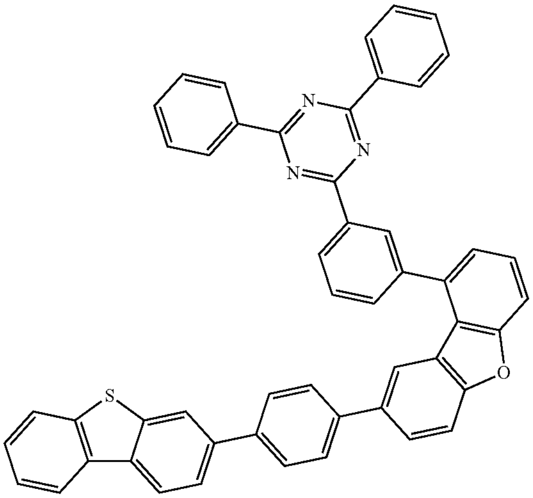 [SMILES: c1ccc(-c2nc(-c3ccccc3)nc(-c3cccc(-c4cccc5oc6ccc(-c7ccc(-c8ccc9c(c8)sc8ccccc89)cc7)cc6c45)c3)n2)cc1]

TABLE 1-continued
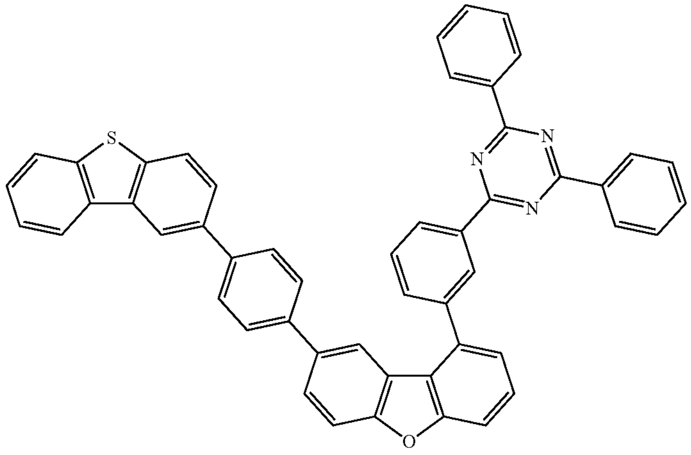 [SMILES: c1ccc(-c2nc(-c3ccccc3)nc(-c3cccc(-c4cccc5oc6ccc(-c7ccc(-c8ccc9sc%10ccccc%10c9c8)cc7)cc6c45)c3)n2)cc1]
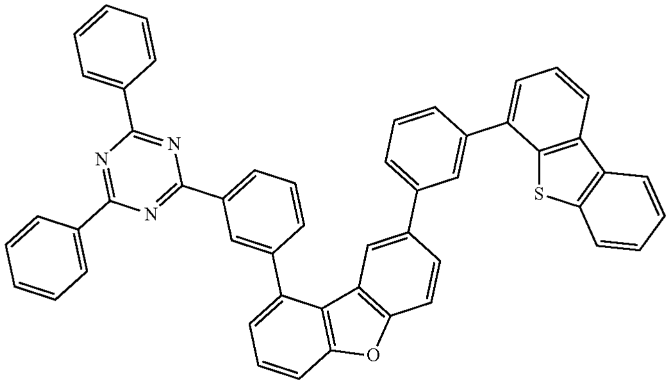 [SMILES: c1ccc(-c2nc(-c3ccccc3)nc(-c3cccc(-c4cccc5oc6ccc(-c7cccc(-c8cccc9c8sc8ccccc89)c7)cc6c45)c3)n2)cc1]
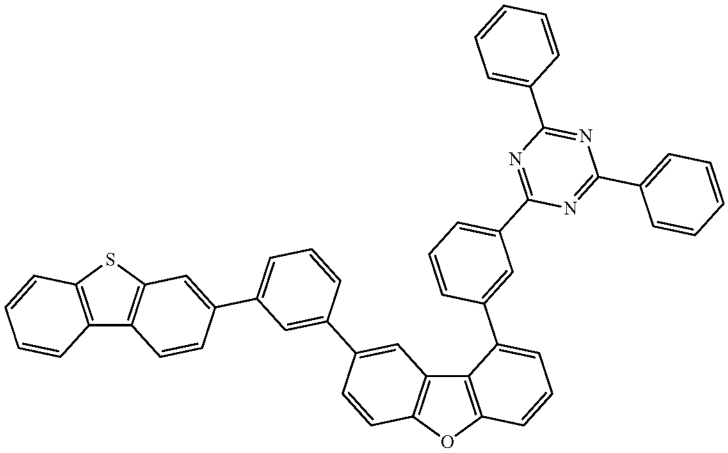 [SMILES: c1ccc(-c2nc(-c3ccccc3)nc(-c3cccc(-c4cccc5oc6ccc(-c7cccc(-c8ccc9c(c8)sc8ccccc89)c7)cc6c45)c3)n2)cc1]

TABLE 1-continued
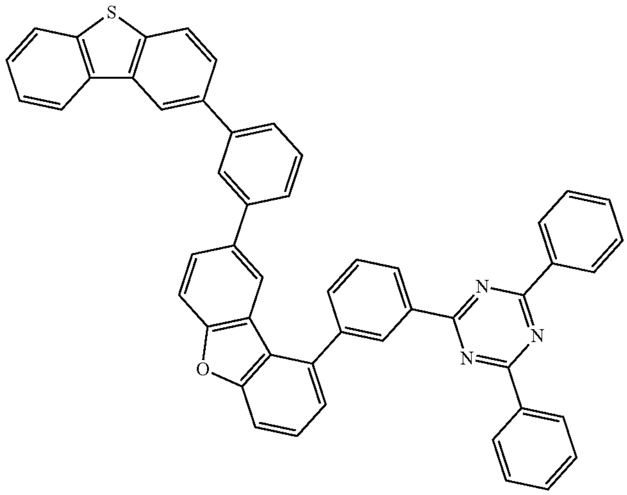 [SMILES: c1ccc(-c2nc(-c3ccccc3)nc(-c3cccc(-c4cccc5oc6ccc(-c7cccc(-c8ccc9sc%10ccccc%10c9c8)c7)cc6c45)c3)n2)cc1]
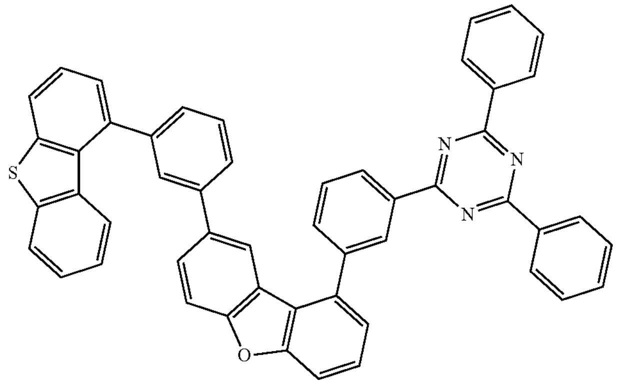 [SMILES: c1ccc(-c2nc(-c3ccccc3)nc(-c3cccc(-c4cccc5oc6ccc(-c7cccc(-c8cccc9sc%10ccccc%10c89)c7)cc6c45)c3)n2)cc1]
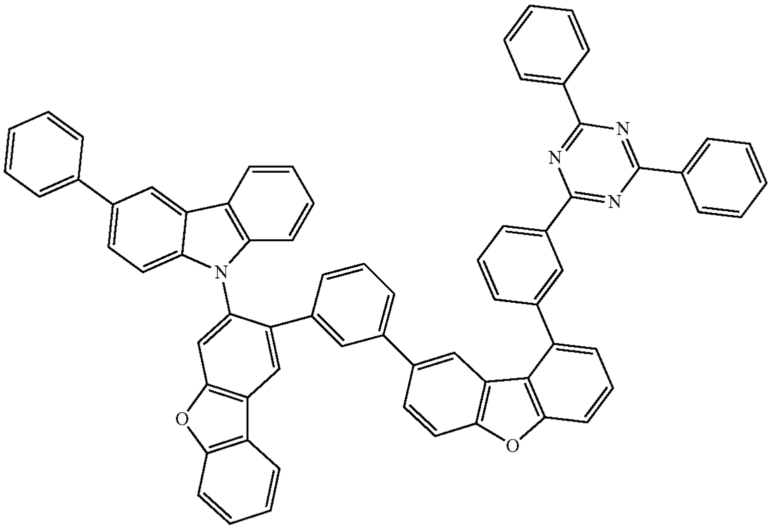 [SMILES: c1ccc(-c2ccc3c(c2)c2ccccc2n3-c2cc3oc4ccccc4c3cc2-c2cccc(-c3ccc4oc5cccc(-c6cccc(-c7nc(-c8ccccc8)nc(-c8ccccc8)n7)c6)c5c4c3)c2)cc1]

TABLE 1-continued
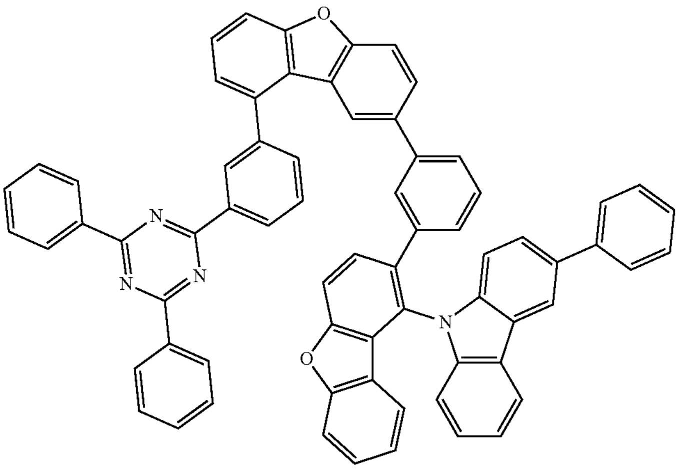 [SMILES: c1ccc(-c2ccc3c(c2)c2ccccc2n3-c2c(-c3cccc(-c4ccc5oc6cccc(-c7cccc(-c8nc(-c9ccccc9)nc(-c9ccccc9)n8)c7)c6c5c4)c3)ccc3oc4ccccc4c23)cc1]
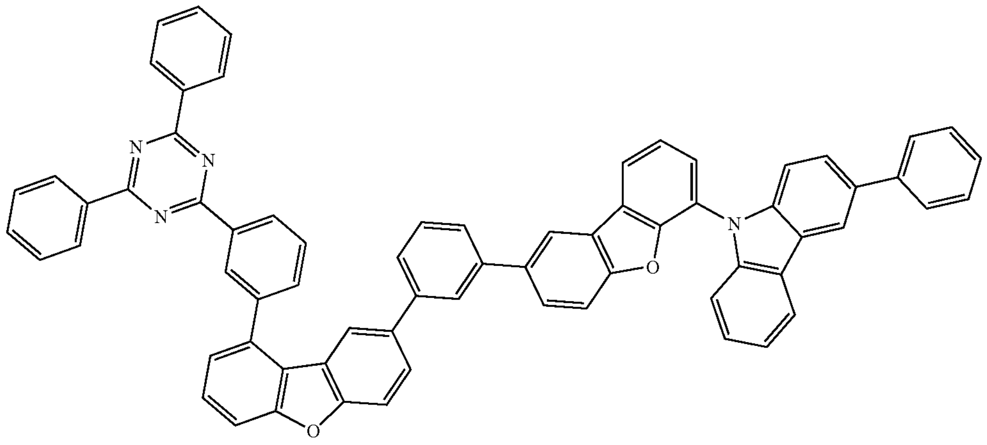 [SMILES: c1ccc(-c2ccc3c(c2)c2ccccc2n3-c2cccc3c2oc2ccc(-c4cccc(-c5ccc6oc7cccc(-c8cccc(-c9nc(-c%10ccccc%10)nc(-c%10ccccc%10)n9)c8)c7c6c5)c4)cc23)cc1]
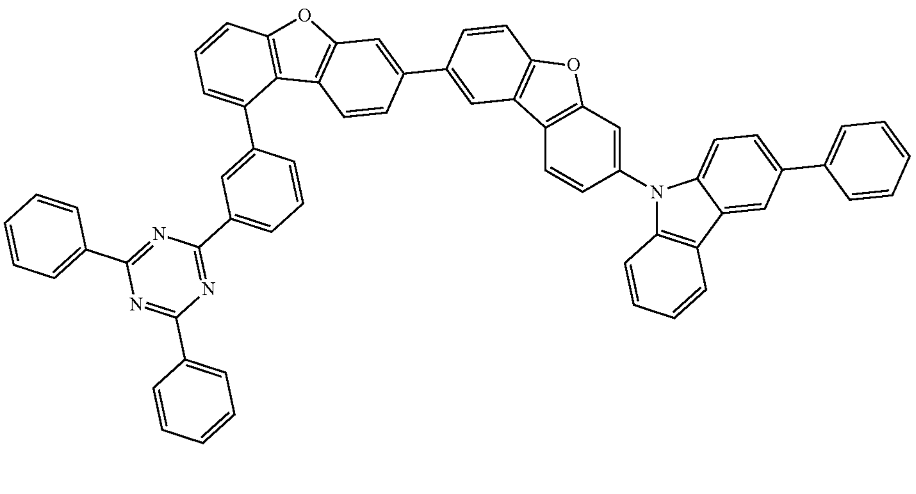 [SMILES: c1ccc(-c2ccc3c(c2)c2ccccc2n3-c2ccc3c(c2)oc2ccc(-c4ccc5c(c4)oc4cccc(-c6cccc(-c7nc(-c8ccccc8)nc(-c8ccccc8)n7)c6)c45)cc23)cc1]

TABLE 1-continued
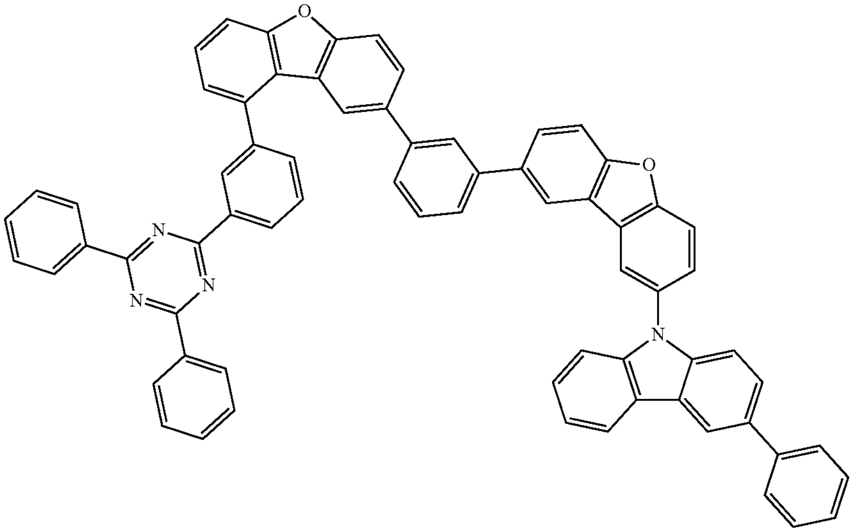 [SMILES: c1ccc(-c2ccc3c(c2)c2ccccc2n3-c2ccc3oc4ccc(-c5cccc(-c6ccc7oc8cccc(-c9cccc(-c%10nc(-c%11ccccc%11)nc(-c%11ccccc%11)n%10)c9)c8c7c6)c5)cc4c3c2)cc1]
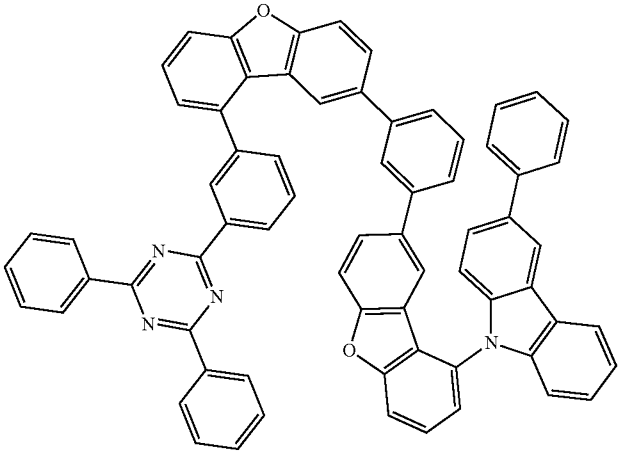 [SMILES: c1ccc(-c2ccc3c(c2)c2ccccc2n3-c2cccc3oc4ccc(-c5cccc(-c6ccc7oc8cccc(-c9cccc(-c%10nc(-c%11ccccc%11)nc(-c%11ccccc%11)n%10)c9)c8c7c6)c5)cc4c23)cc1]
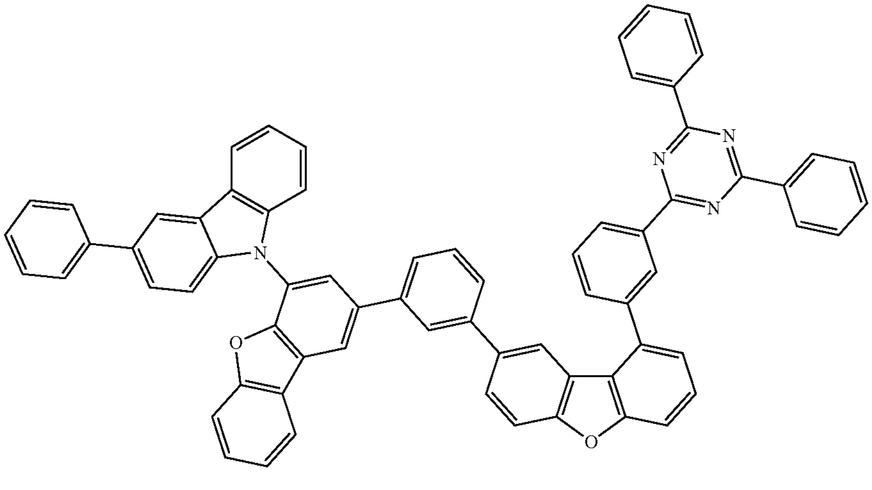 [SMILES: c1ccc(-c2ccc3c(c2)c2ccccc2n3-c2cc(-c3cccc(-c4ccc5oc6cccc(-c7cccc(-c8nc(-c9ccccc9)nc(-c9ccccc9)n8)c7)c6c5c4)c3)cc3c2oc2ccccc23)cc1]

TABLE 1-continued
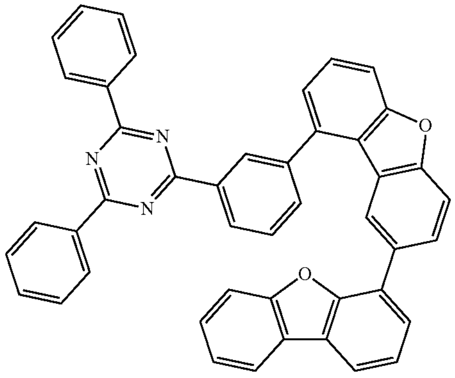 [SMILES: c1ccc(-c2nc(-c3ccccc3)nc(-c3cccc(-c4cccc5oc6ccc(-c7cccc8c7oc7ccccc78)cc6c45)c3)n2)cc1]
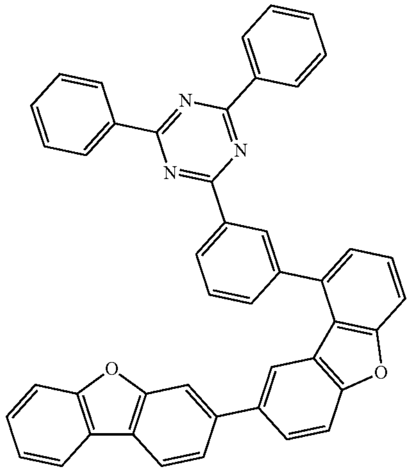 [SMILES: c1ccc(-c2nc(-c3ccccc3)nc(-c3cccc(-c4cccc5oc6ccc(-c7ccc8c(c7)oc7ccccc78)cc6c45)c3)n2)cc1]
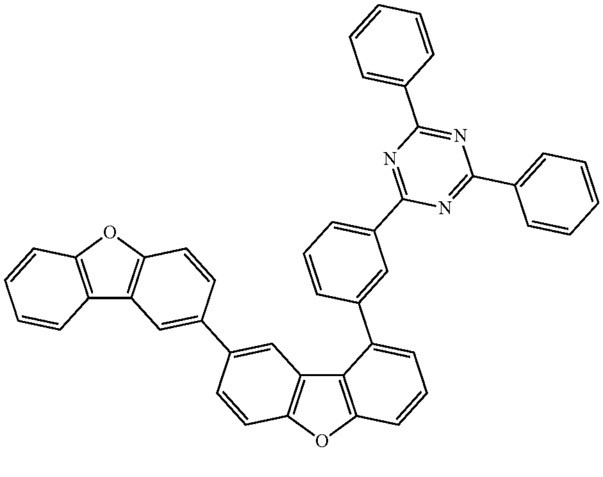 [SMILES: c1ccc(-c2nc(-c3ccccc3)nc(-c3cccc(-c4cccc5oc6ccc(-c7ccc8oc9ccccc9c8c7)cc6c45)c3)n2)cc1]

TABLE 1-continued
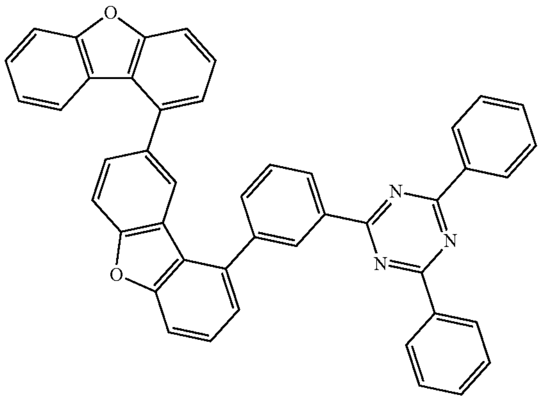 [SMILES: c1ccc(-c2nc(-c3ccccc3)nc(-c3cccc(-c4cccc5oc6ccc(-c7cccc8oc9ccccc9c78)cc6c45)c3)n2)cc1]
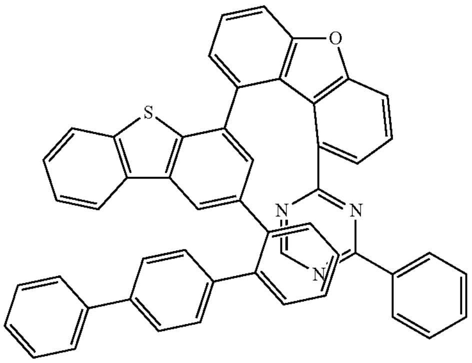 [SMILES: c1ccc(-c2ccc(-c3ccccc3-c3cc(-c4cccc5oc6cccc(-c7ncnc(-c8ccccc8)n7)c6c45)c4sc5ccccc5c4c3)cc2)cc1]
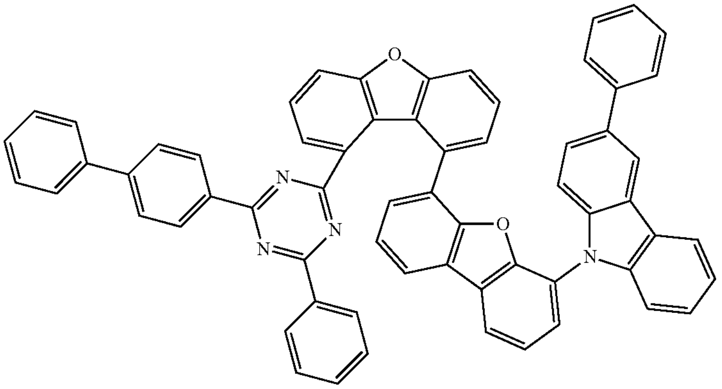 [SMILES: c1ccc(-c2ccc(-c3nc(-c4ccccc4)nc(-c4cccc5oc6cccc(-c7cccc8c7oc7c(-n9c%10ccccc%10c%10cc(-c%11ccccc%11)ccc%109)cccc78)c6c45)n3)cc2)cc1]
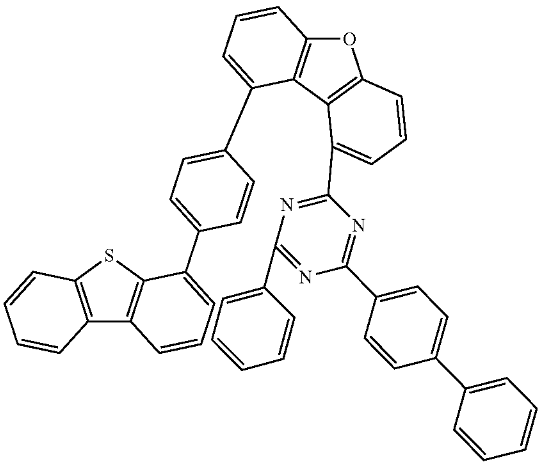 [SMILES: c1ccc(-c2ccc(-c3nc(-c4ccccc4)nc(-c4cccc5oc6cccc(-c7ccc(-c8cccc9c8sc8ccccc89)cc7)c6c45)n3)cc2)cc1]

TABLE 1-continued
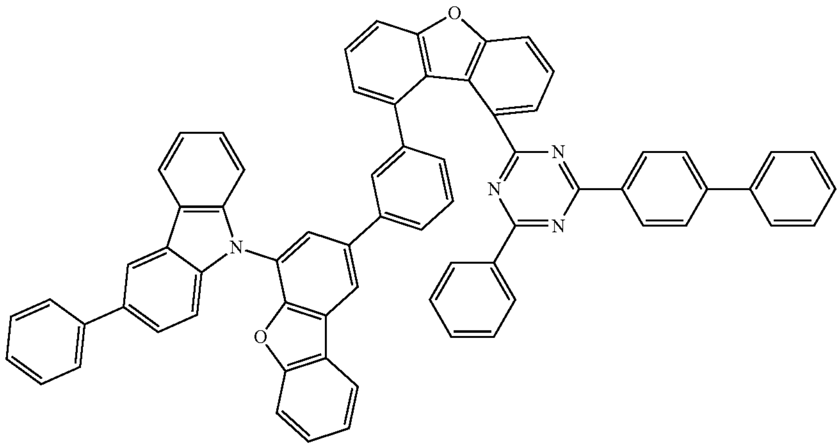 [SMILES: c1ccc(-c2ccc(-c3nc(-c4ccccc4)nc(-c4cccc5oc6cccc(-c7cccc(-c8cc(-n9c%10ccccc%10c%10cc(-c%11ccccc%11)ccc%109)c9oc%10ccccc%10c9c8)c7)c6c45)n3)cc2)cc1]
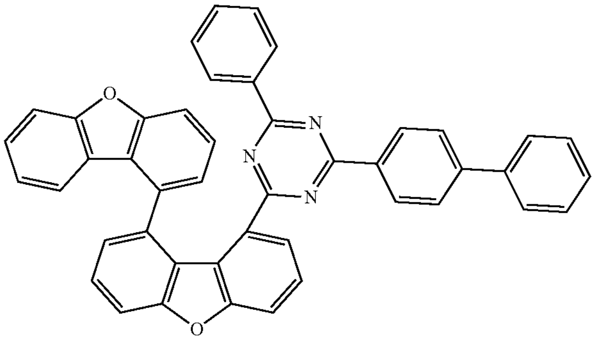 [SMILES: c1ccc(-c2ccc(-c3nc(-c4ccccc4)nc(-c4cccc5oc6cccc(-c7cccc8oc9ccccc9c78)c6c45)n3)cc2)cc1]
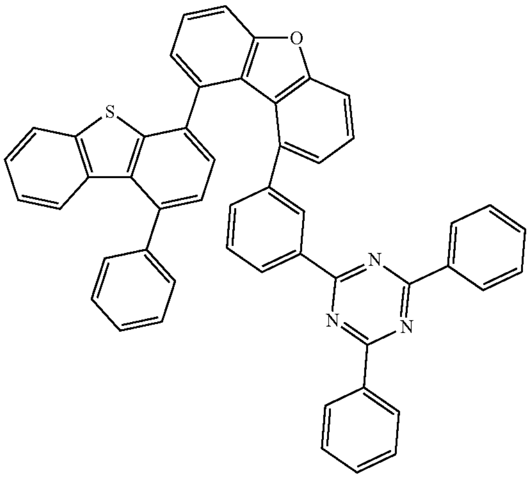 [SMILES: c1ccc(-c2nc(-c3ccccc3)nc(-c3cccc(-c4cccc5oc6cccc(-c7ccc(-c8ccccc8)c8c7sc7ccccc78)c6c45)c3)n2)cc1]

TABLE 1-continued
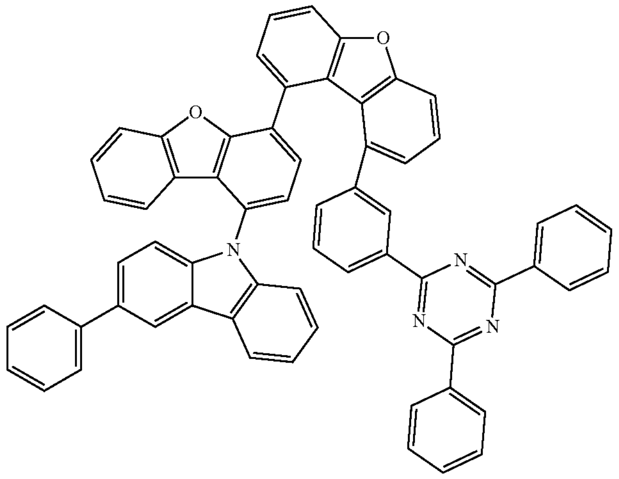 [SMILES: c1ccc(-c2ccc3c(c2)c2ccccc2n3-c2ccc(-c3cccc4oc5cccc(-c6cccc(-c7nc(-c8ccccc8)nc(-c8ccccc8)n7)c6)c5c34)c3oc4ccccc4c23)cc1]
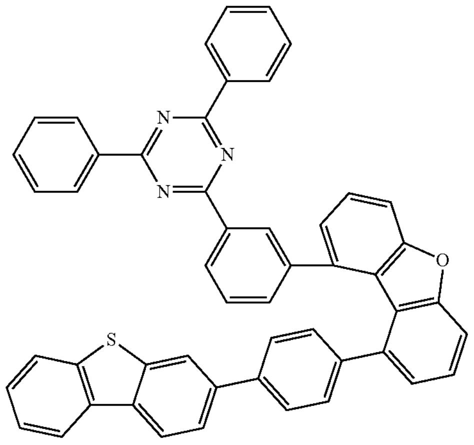 [SMILES: c1ccc(-c2nc(-c3ccccc3)nc(-c3cccc(-c4cccc5oc6cccc(-c7ccc(-c8ccc9c(c8)sc8ccccc89)cc7)c6c45)c3)n2)cc1]
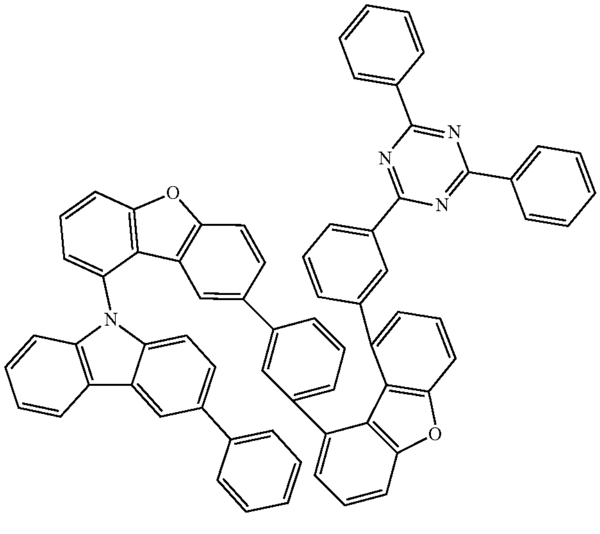 [SMILES: c1ccc(-c2ccc3c(c2)c2ccccc2n3-c2cccc3oc4ccc(-c5cccc(-c6cccc7oc8cccc(-c9cccc(-c%10nc(-c%11ccccc%11)nc(-c%11ccccc%11)n%10)c9)c8c67)c5)cc4c23)cc1]

TABLE 1-continued
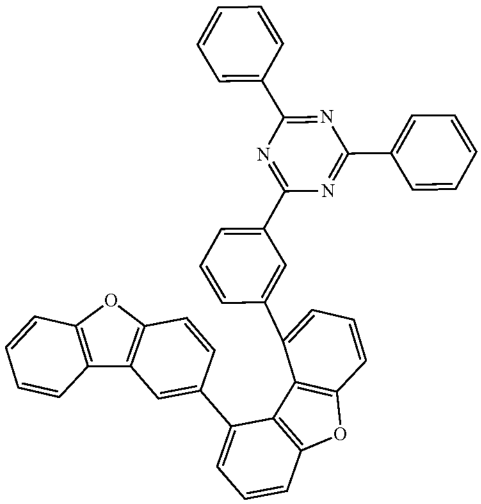 [SMILES: c1ccc(-c2nc(-c3ccccc3)nc(-c3cccc(-c4cccc5oc6cccc(-c7ccc8oc9ccccc9c8c7)c6c45)c3)n2)cc1]
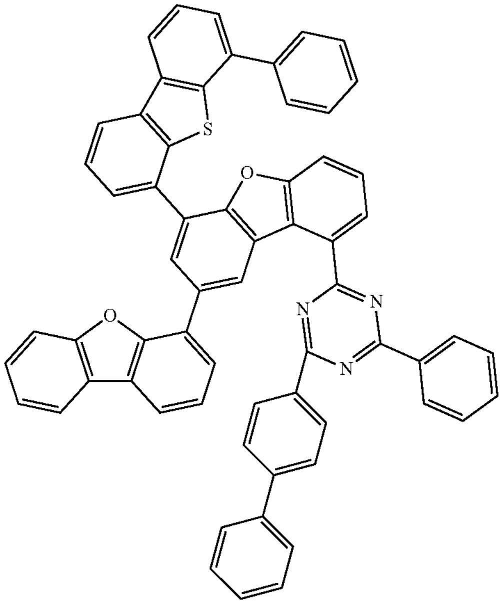 [SMILES: c1ccc(-c2ccc(-c3nc(-c4ccccc4)nc(-c4cccc5oc6c(-c7cccc8c7sc7c(-c9ccccc9)cccc78)cc(-c7cccc8c7oc7ccccc78)cc6c45)n3)cc2)cc1]

TABLE 1-continued
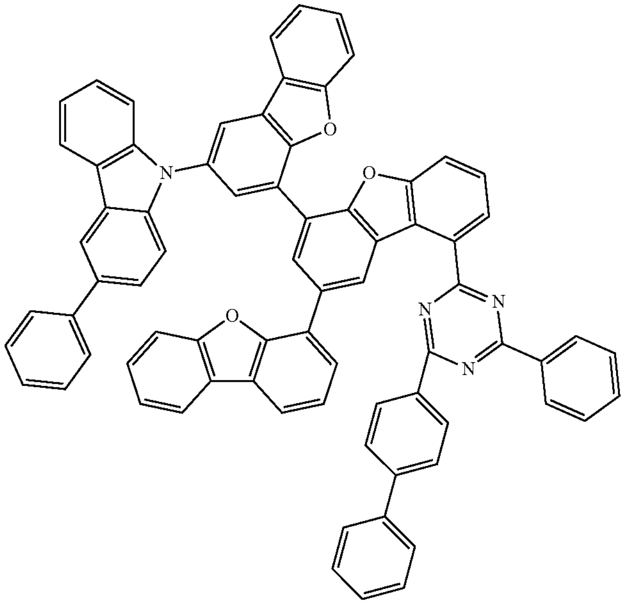 [SMILES: c1ccc(-c2ccc(-c3nc(-c4ccccc4)nc(-c4cccc5oc6c(-c7cc(-n8c9ccccc9c9cc(-c%10ccccc%10)ccc98)cc8c7oc7ccccc78)cc(-c7cccc8c7oc7ccccc78)cc6c45)n3)cc2)cc1]
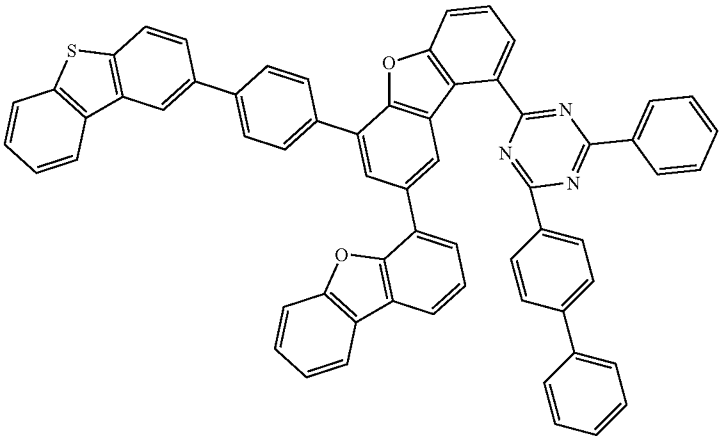 [SMILES: c1ccc(-c2ccc(-c3nc(-c4ccccc4)nc(-c4cccc5oc6c(-c7ccc(-c8ccc9sc%10ccccc%10c9c8)cc7)cc(-c7cccc8c7oc7ccccc78)cc6c45)n3)cc2)cc1]
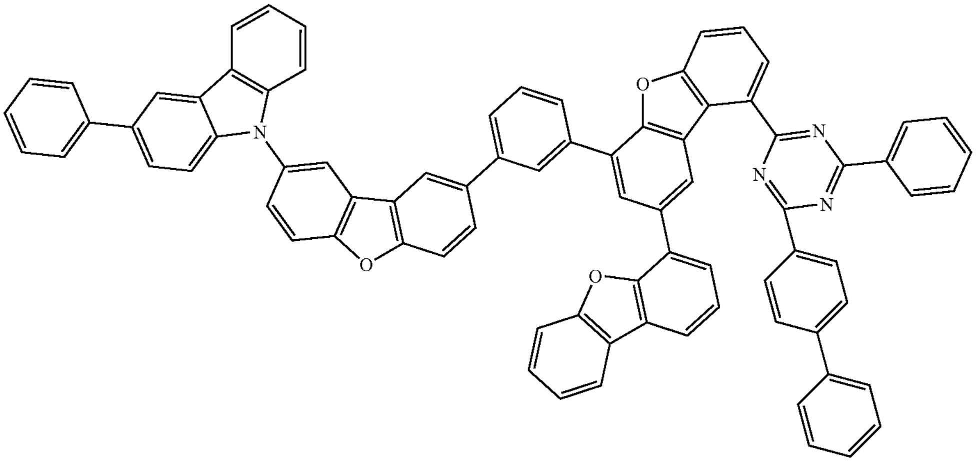 [SMILES: c1ccc(-c2ccc(-c3nc(-c4ccccc4)nc(-c4cccc5oc6c(-c7cccc(-c8ccc9oc%10ccc(-n%11c%12ccccc%12c%12cc(-c%13ccccc%13)ccc%12%11)cc%10c9c8)c7)cc(-c7cccc8c7oc7ccccc78)cc6c45)n3)cc2)cc1]

TABLE 1-continued
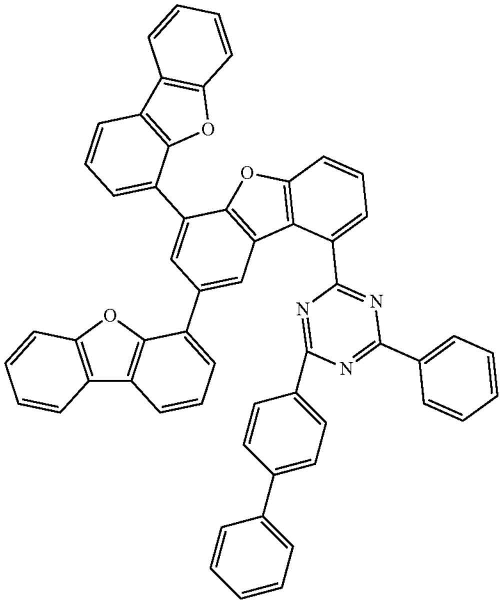 [SMILES: c1ccc(-c2ccc(-c3nc(-c4ccccc4)nc(-c4cccc5oc6c(-c7cccc8c7oc7ccccc78)cc(-c7cccc8c7oc7ccccc78)cc6c45)n3)cc2)cc1]
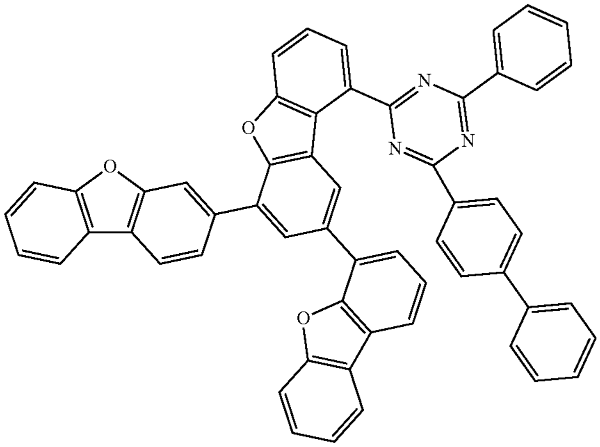 [SMILES: c1ccc(-c2ccc(-c3nc(-c4ccccc4)nc(-c4cccc5oc6c(-c7ccc8c(c7)oc7ccccc78)cc(-c7cccc8c7oc7ccccc78)cc6c45)n3)cc2)cc1]
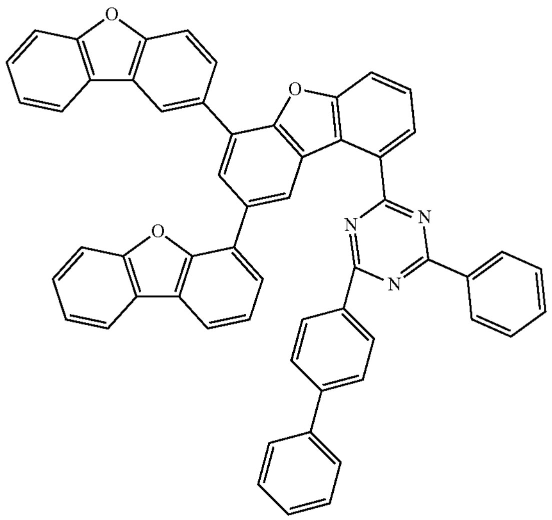 [SMILES: c1ccc(-c2ccc(-c3nc(-c4ccccc4)nc(-c4cccc5oc6c(-c7ccc8oc9ccccc9c8c7)cc(-c7cccc8c7oc7ccccc78)cc6c45)n3)cc2)cc1]

TABLE 1-continued
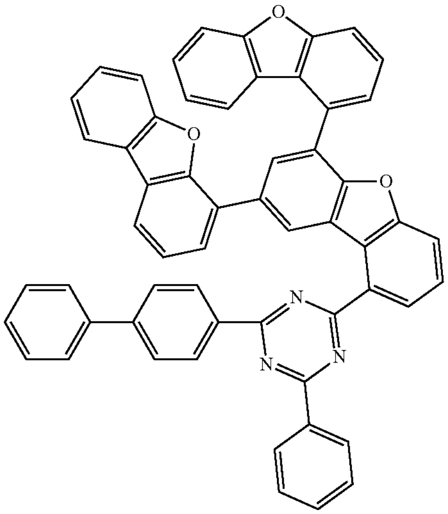 [SMILES: c1ccc(-c2ccc(-c3nc(-c4ccccc4)nc(-c4cccc5oc6c(-c7cccc8oc9ccccc9c78)cc(-c7cccc8c7oc7ccccc78)cc6c45)n3)cc2)cc1]
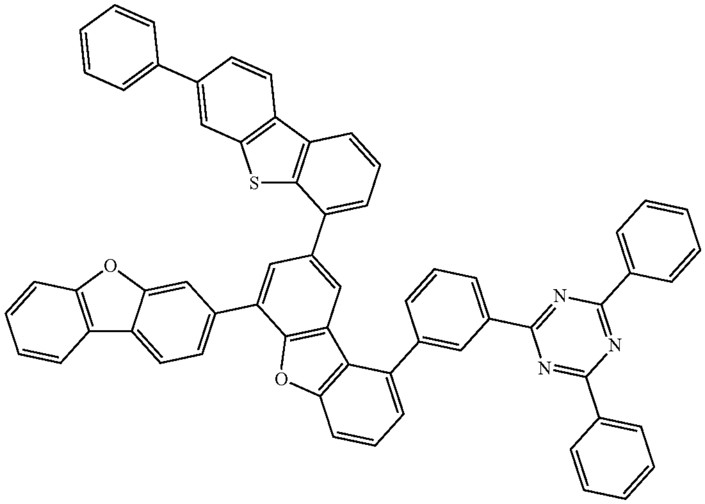 [SMILES: c1ccc(-c2ccc3c(c2)sc2c(-c4cc(-c5ccc6c(c5)oc5ccccc56)c5oc6cccc(-c7cccc(-c8nc(-c9ccccc9)nc(-c9ccccc9)n8)c7)c6c5c4)cccc23)cc1]
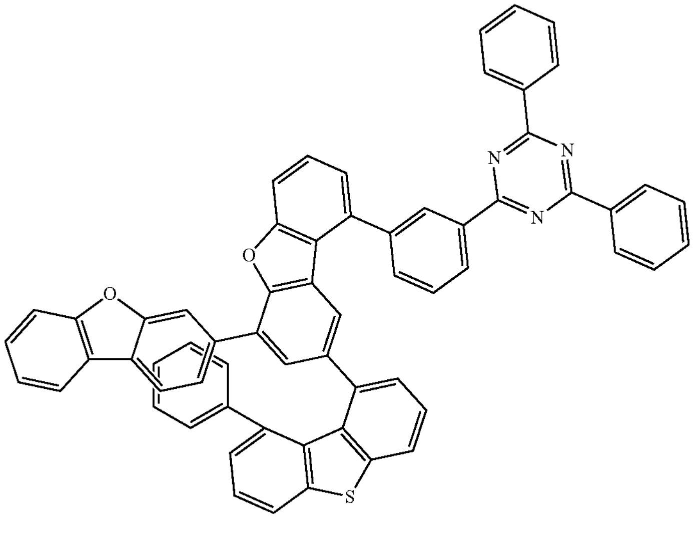 [SMILES: c1ccc(-c2nc(-c3ccccc3)nc(-c3cccc(-c4cccc5oc6c(-c7ccc8c(c7)oc7ccccc78)cc(-c7cccc8sc9cccc(-c%10ccccc%10)c9c78)cc6c45)c3)n2)cc1]

TABLE 1-continued
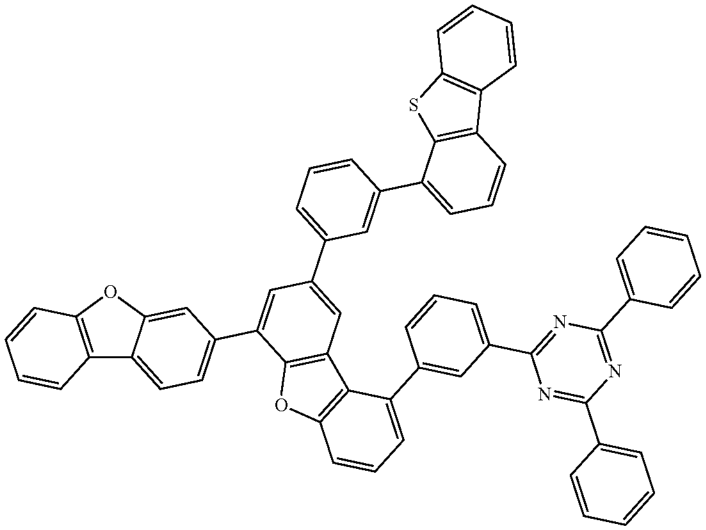 [SMILES: c1ccc(-c2nc(-c3ccccc3)nc(-c3cccc(-c4cccc5oc6c(-c7ccc8c(c7)oc7ccccc78)cc(-c7cccc(-c8cccc9c8sc8ccccc89)c7)cc6c45)c3)n2)cc1]
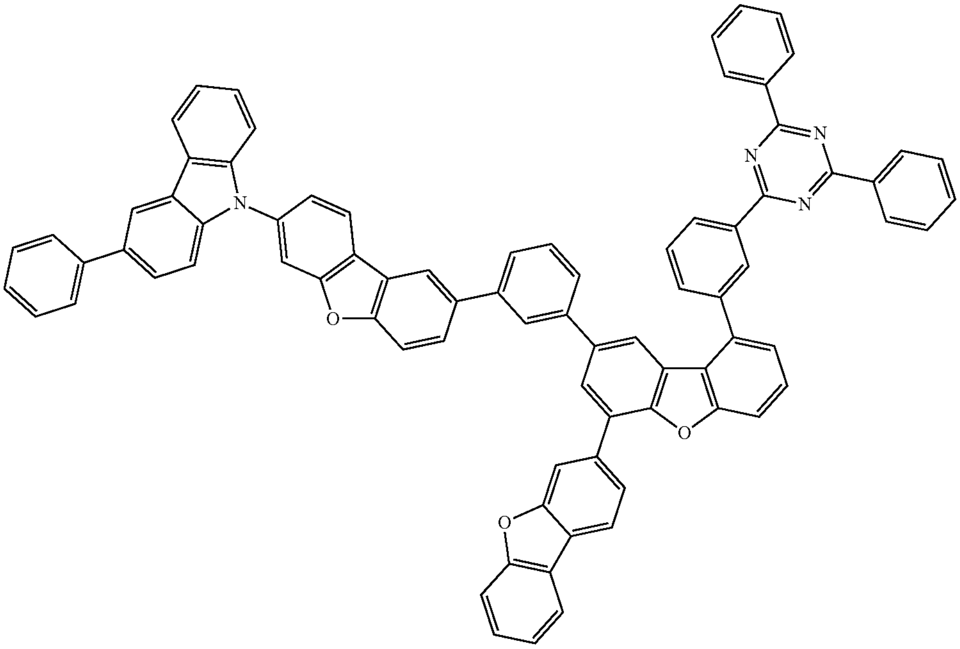 [SMILES: c1ccc(-c2ccc3c(c2)c2ccccc2n3-c2ccc3c(c2)oc2ccc(-c4cccc(-c5cc(-c6ccc7c(c6)oc6ccccc67)c6oc7cccc(-c8cccc(-c9nc(-c%10ccccc%10)nc(-c%10ccccc%10)n9)c8)c7c6c5)c4)cc23)cc1]
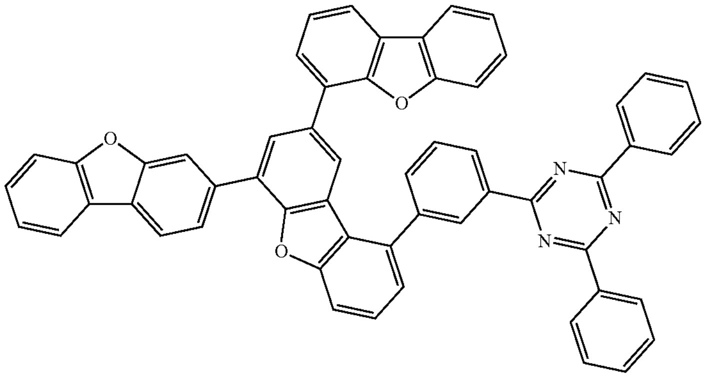 [SMILES: c1ccc(-c2nc(-c3ccccc3)nc(-c3cccc(-c4cccc5oc6c(-c7ccc8c(c7)oc7ccccc78)cc(-c7cccc8c7oc7ccccc78)cc6c45)c3)n2)cc1]

TABLE 1-continued
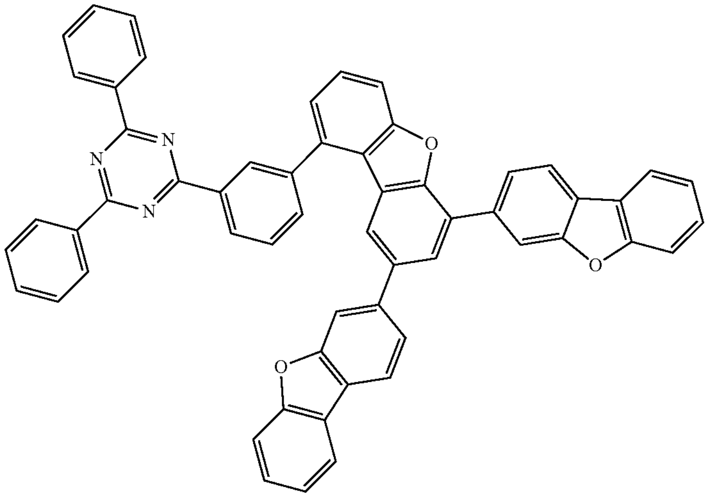 [SMILES: c1ccc(-c2nc(-c3ccccc3)nc(-c3cccc(-c4cccc5oc6c(-c7ccc8c(c7)oc7ccccc78)cc(-c7ccc8c(c7)oc7ccccc78)cc6c45)c3)n2)cc1]
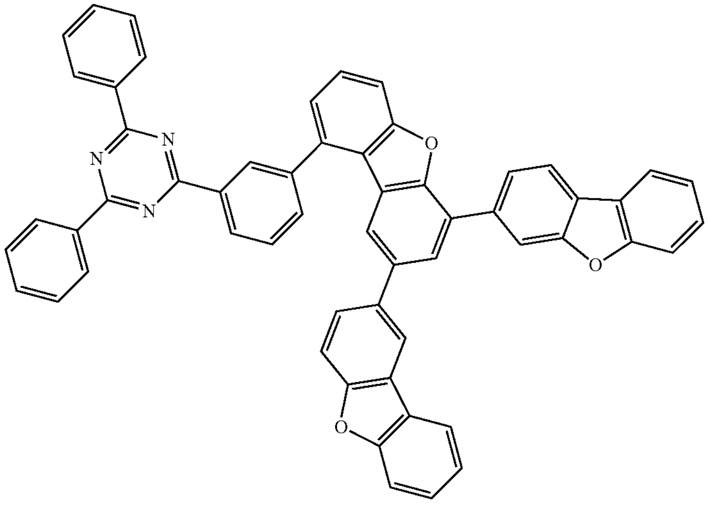 [SMILES: c1ccc(-c2nc(-c3ccccc3)nc(-c3cccc(-c4cccc5oc6c(-c7ccc8c(c7)oc7ccccc78)cc(-c7ccc8oc9ccccc9c8c7)cc6c45)c3)n2)cc1]
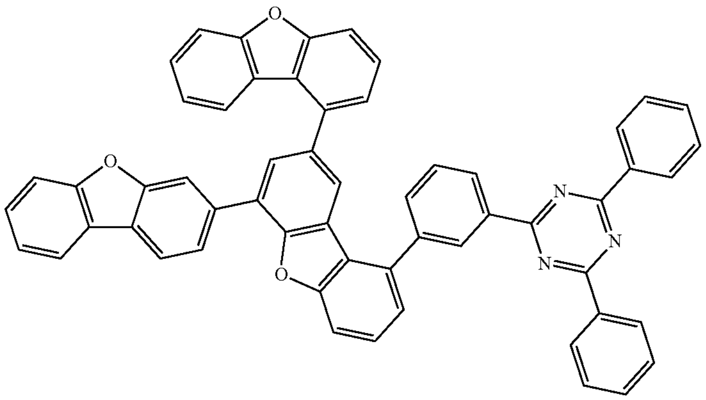 [SMILES: c1ccc(-c2nc(-c3ccccc3)nc(-c3cccc(-c4cccc5oc6c(-c7ccc8c(c7)oc7ccccc78)cc(-c7cccc8oc9ccccc9c78)cc6c45)c3)n2)cc1]
Particularly suitable compounds of the formulae (1), (1a), (1b), (1c), (1d) and (1e) that are preferably used in combination with at least one compound of the formula (2) in the electroluminescent device of the invention are the compounds E1 to E54.

TABLE 2
E1
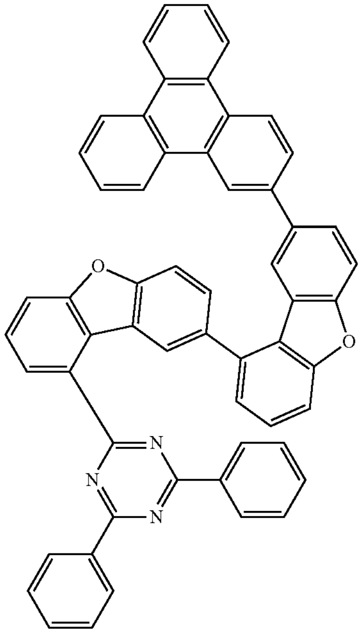 [SMILES: c1ccc(-c2nc(-c3ccccc3)nc(-c3cccc4oc5ccc(-c6cccc7oc8ccc(-c9ccc%10c%11ccccc%11c%11ccccc%11c%10c9)cc8c67)cc5c34)n2)cc1]
E2
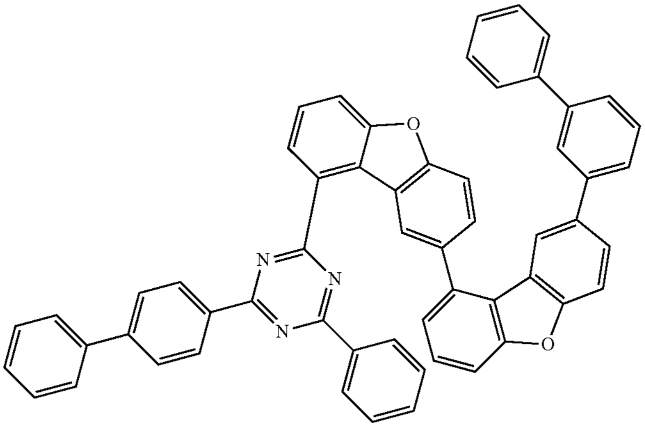 [SMILES: c1ccc(-c2ccc(-c3nc(-c4ccccc4)nc(-c4cccc5oc6ccc(-c7cccc8oc9ccc(-c%10cccc(-c%11ccccc%11)c%10)cc9c78)cc6c45)n3)cc2)cc1]
E3
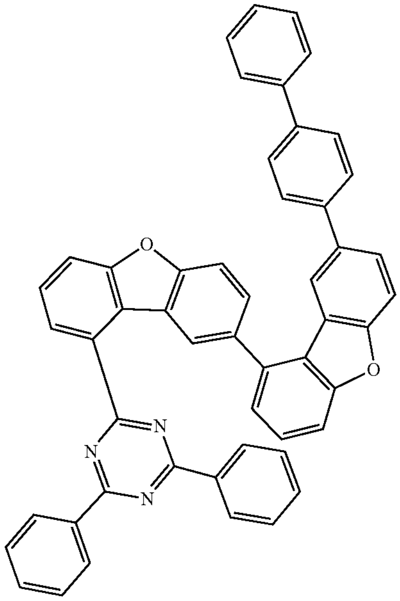 [SMILES: c1ccc(-c2ccc(-c3ccc4oc5cccc(-c6ccc7oc8cccc(-c9nc(-c%10ccccc%10)nc(-c%10ccccc%10)n9)c8c7c6)c5c4c3)cc2)cc1]

TABLE 2-continued
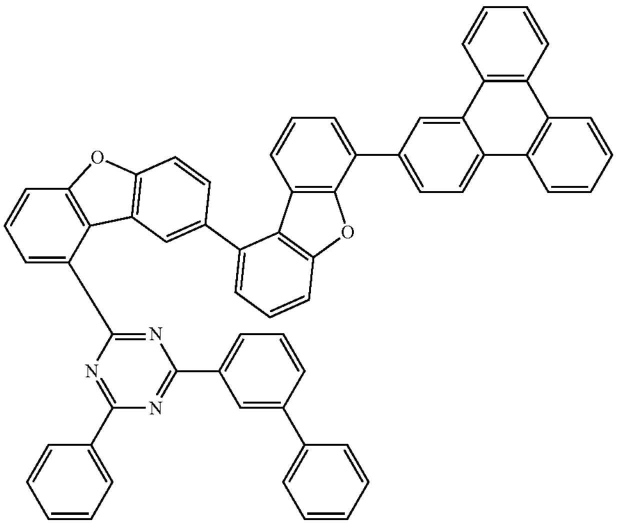 [SMILES: c1ccc(-c2cccc(-c3nc(-c4ccccc4)nc(-c4cccc5oc6ccc(-c7cccc8oc9c(-c%10ccc%11c%12ccccc%12c%12ccccc%12c%11c%10)cccc9c78)cc6c45)n3)c2)cc1]
E4
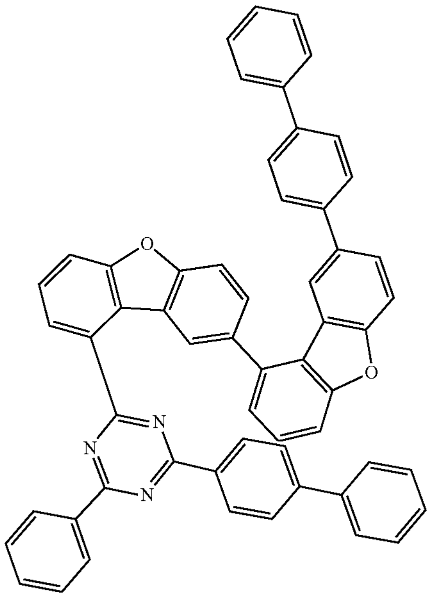 [SMILES: c1ccc(-c2ccc(-c3ccc4oc5cccc(-c6ccc7oc8cccc(-c9nc(-c%10ccccc%10)nc(-c%10ccc(-c%11ccccc%11)cc%10)n9)c8c7c6)c5c4c3)cc2)cc1]
E5

TABLE 2-continued
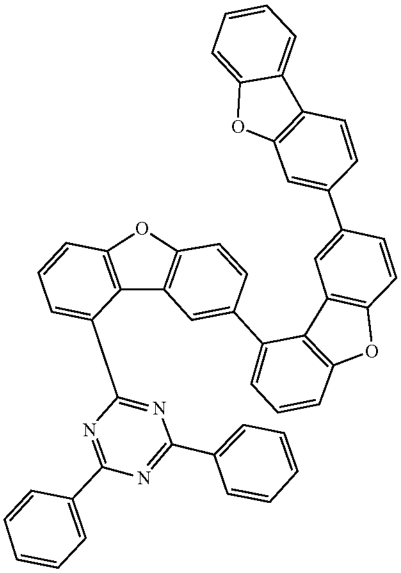 [SMILES: c1ccc(-c2nc(-c3ccccc3)nc(-c3cccc4oc5ccc(-c6cccc7oc8ccc(-c9ccc%10c(c9)oc9ccccc9%10)cc8c67)cc5c34)n2)cc1]
E6
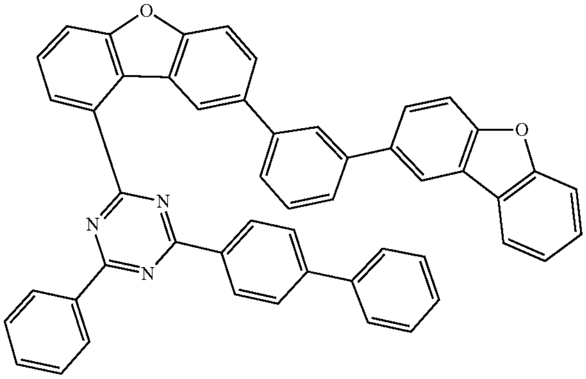 [SMILES: c1ccc(-c2ccc(-c3nc(-c4ccccc4)nc(-c4cccc5oc6ccc(-c7cccc(-c8ccc9oc%10ccccc%10c9c8)c7)cc6c45)n3)cc2)cc1]
E7
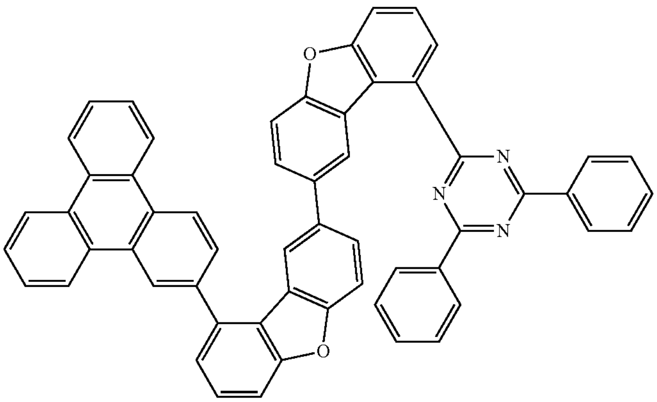 [SMILES: c1ccc(-c2nc(-c3ccccc3)nc(-c3cccc4oc5ccc(-c6ccc7oc8cccc(-c9ccc%10c%11ccccc%11c%11ccccc%11c%10c9)c8c7c6)cc5c34)n2)cc1]
E8

TABLE 2-continued
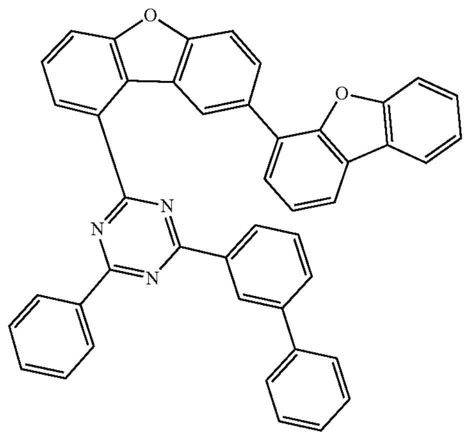 [SMILES: c1ccc(-c2cccc(-c3nc(-c4ccccc4)nc(-c4cccc5oc6ccc(-c7cccc8c7oc7ccccc78)cc6c45)n3)c2)cc1]
E9
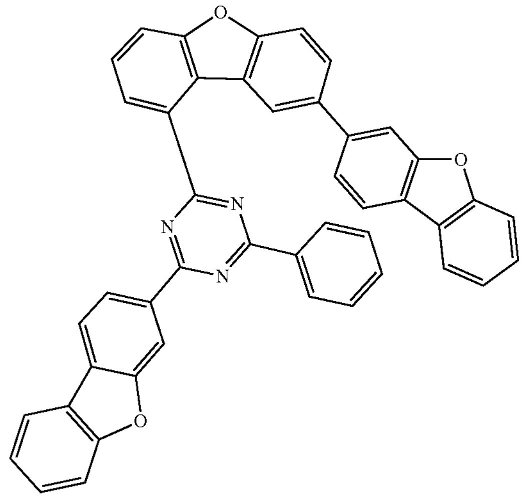 [SMILES: c1ccc(-c2nc(-c3ccc4c(c3)oc3ccccc34)nc(-c3cccc4oc5ccc(-c6ccc7c(c6)oc6ccccc67)cc5c34)n2)cc1]
E10
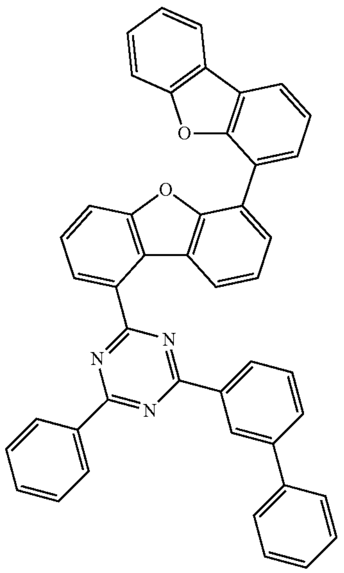 [SMILES: c1ccc(-c2cccc(-c3nc(-c4ccccc4)nc(-c4cccc5oc6c(-c7cccc8c7oc7ccccc78)cccc6c45)n3)c2)cc1]
E11

TABLE 2-continued
E12
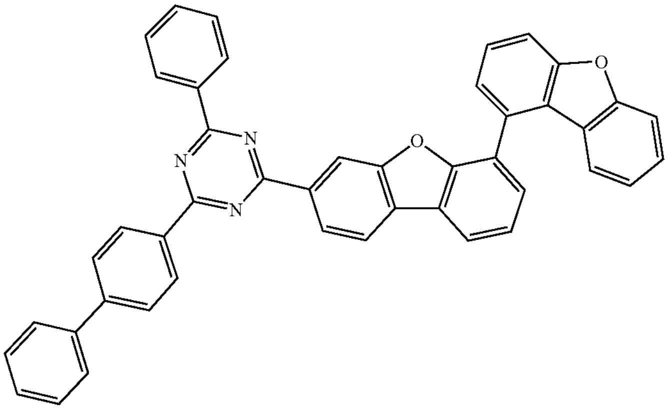 [SMILES: c1ccc(-c2ccc(-c3nc(-c4ccccc4)nc(-c4ccc5c(c4)oc4c(-c6cccc7oc8ccccc8c67)cccc45)n3)cc2)cc1]
E13
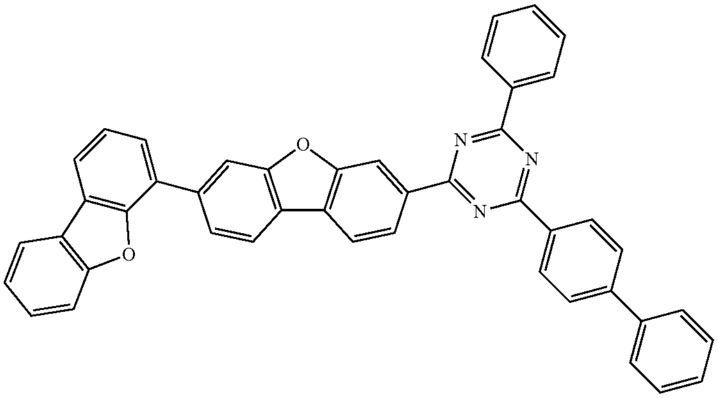 [SMILES: c1ccc(-c2ccc(-c3nc(-c4ccccc4)nc(-c4ccc5c(c4)oc4cc(-c6cccc7c6oc6ccccc67)ccc45)n3)cc2)cc1]
E14
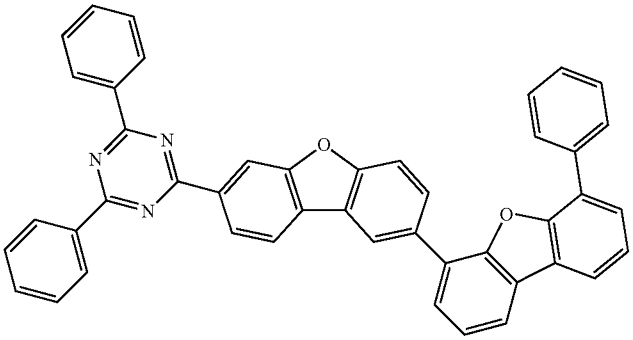 [SMILES: c1ccc(-c2nc(-c3ccccc3)nc(-c3ccc4c(c3)oc3ccc(-c5cccc6c5oc5c(-c7ccccc7)cccc56)cc34)n2)cc1]
E15
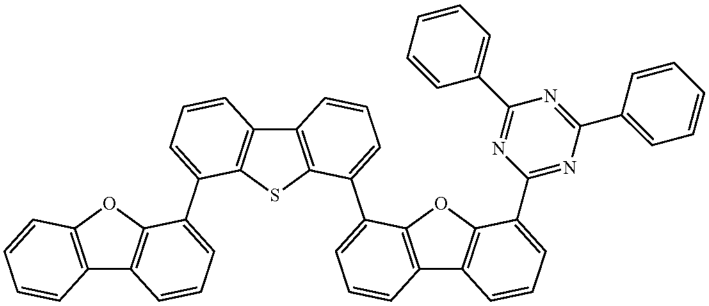 [SMILES: c1ccc(-c2nc(-c3ccccc3)nc(-c3cccc4c3oc3c(-c5cccc6c5sc5c(-c7cccc8c7oc7ccccc78)cccc56)cccc34)n2)cc1]

TABLE 2-continued
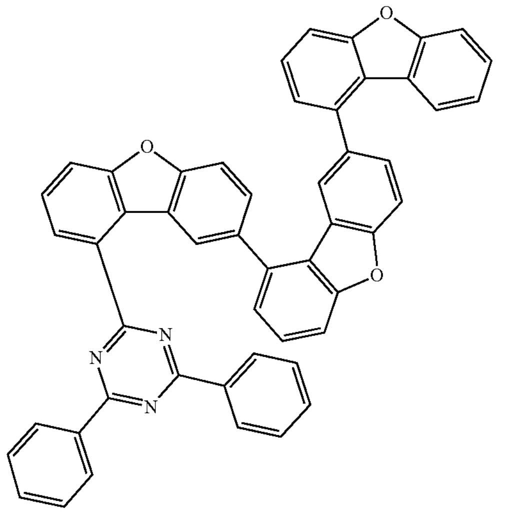 [SMILES: c1ccc(-c2nc(-c3ccccc3)nc(-c3cccc4oc5ccc(-c6cccc7oc8ccc(-c9cccc%10oc%11ccccc%11c9%10)cc8c67)cc5c34)n2)cc1]
E16
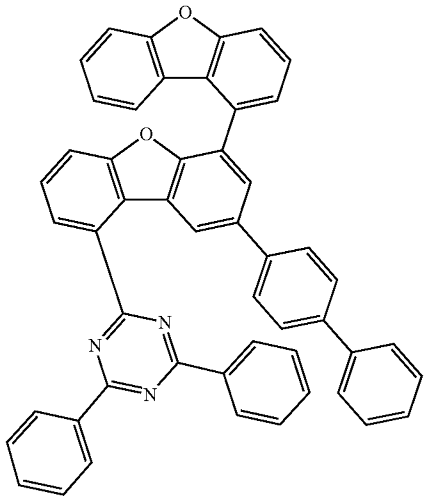 [SMILES: c1ccc(-c2ccc(-c3cc(-c4cccc5oc6ccccc6c45)c4oc5cccc(-c6nc(-c7ccccc7)nc(-c7ccccc7)n6)c5c4c3)cc2)cc1]
E17
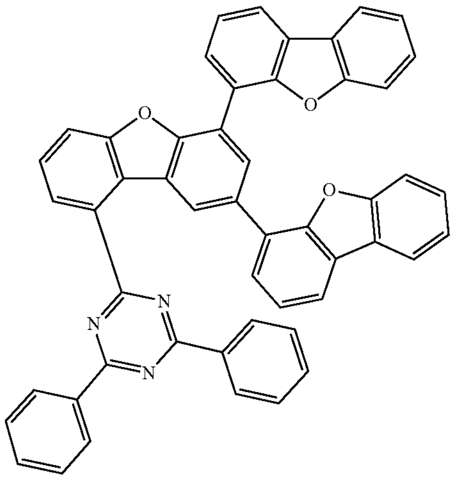 [SMILES: c1ccc(-c2nc(-c3ccccc3)nc(-c3cccc4oc5c(-c6cccc7c6oc6ccccc67)cc(-c6cccc7c6oc6ccccc67)cc5c34)n2)cc1]
E18

TABLE 2-continued
E19
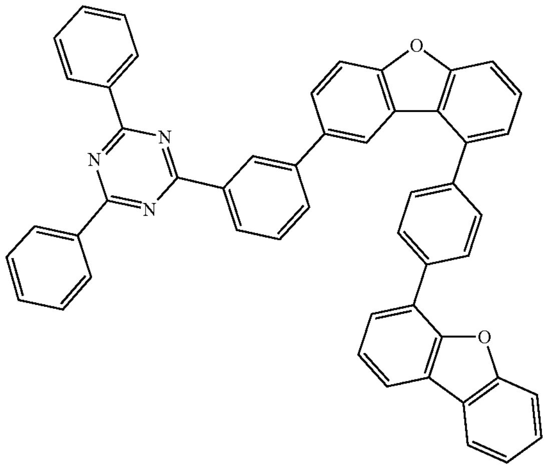 [SMILES: c1ccc(-c2nc(-c3ccccc3)nc(-c3cccc(-c4ccc5oc6cccc(-c7ccc(-c8cccc9c8oc8ccccc89)cc7)c6c5c4)c3)n2)cc1]
E20
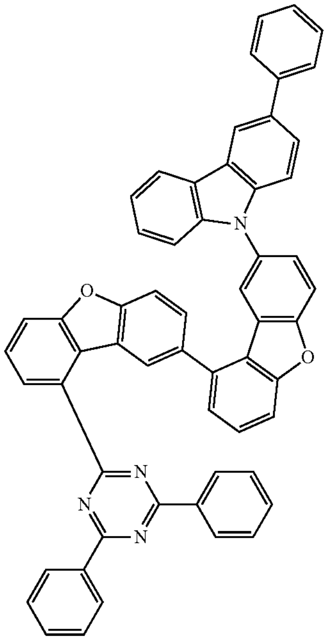 [SMILES: c1ccc(-c2ccc3c(c2)c2ccccc2n3-c2ccc3oc4cccc(-c5ccc6oc7cccc(-c8nc(-c9ccccc9)nc(-c9ccccc9)n8)c7c6c5)c4c3c2)cc1]

TABLE 2-continued
E21
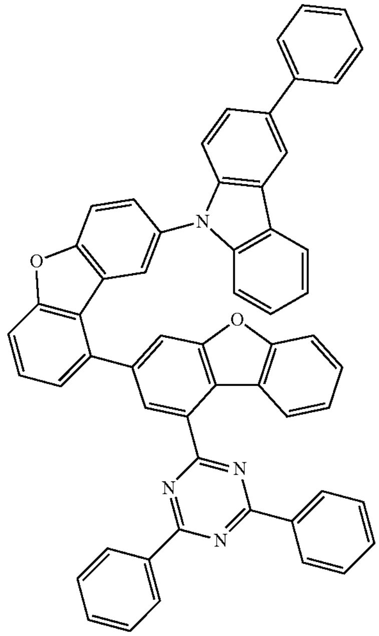 [SMILES: c1ccc(-c2ccc3c(c2)c2ccccc2n3-c2ccc3oc4cccc(-c5cc(-c6nc(-c7ccccc7)nc(-c7ccccc7)n6)c6c(c5)oc5ccccc56)c4c3c2)cc1]
E22
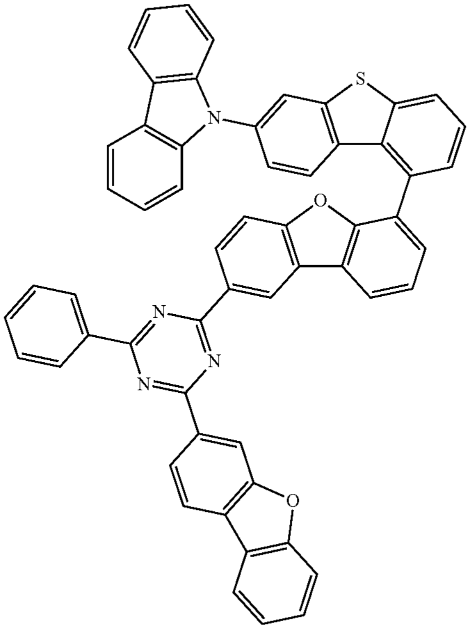 [SMILES: c1ccc(-c2nc(-c3ccc4c(c3)oc3ccccc34)nc(-c3ccc4oc5c(-c6cccc7sc8cc(-n9c%10ccccc%10c%10ccccc%109)ccc8c67)cccc5c4c3)n2)cc1]

TABLE 2-continued
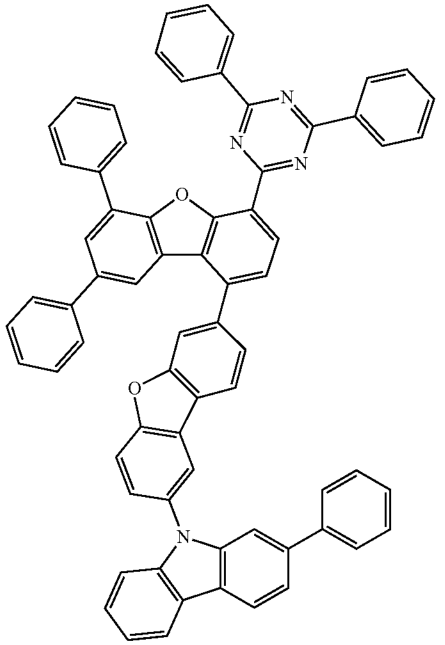 [SMILES: c1ccc(-c2cc(-c3ccccc3)c3oc4c(-c5nc(-c6ccccc6)nc(-c6ccccc6)n5)ccc(-c5ccc6c(c5)oc5ccc(-n7c8ccccc8c8ccc(-c9ccccc9)cc87)cc56)c4c3c2)cc1]
E23
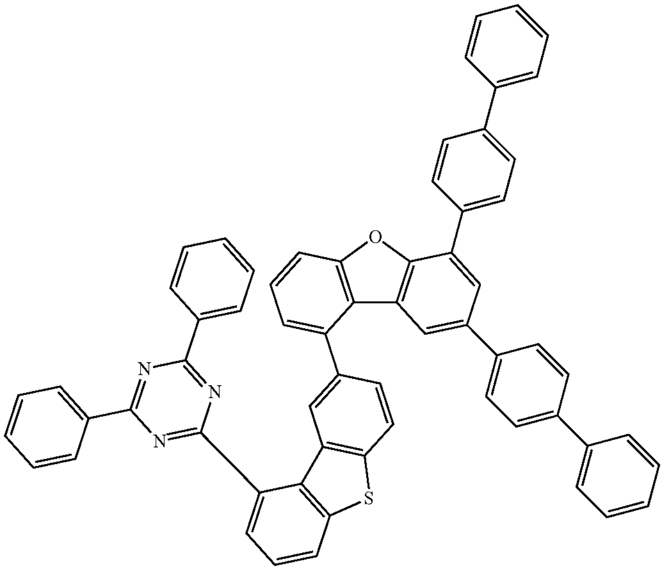 [SMILES: c1ccc(-c2ccc(-c3cc(-c4ccc(-c5ccccc5)cc4)c4oc5cccc(-c6ccc7sc8cccc(-c9nc(-c%10ccccc%10)nc(-c%10ccccc%10)n9)c8c7c6)c5c4c3)cc2)cc1]
E24
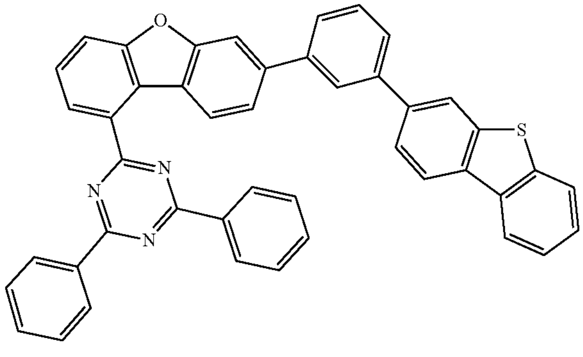 [SMILES: c1ccc(-c2nc(-c3ccccc3)nc(-c3cccc4oc5cc(-c6cccc(-c7ccc8c(c7)sc7ccccc78)c6)ccc5c34)n2)cc1]
E25

TABLE 2-continued
E26
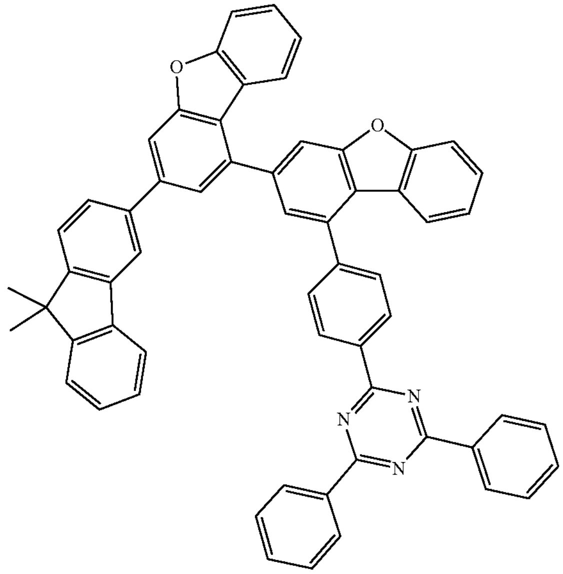 [SMILES: CC1(C)c2ccccc2-c2cc(-c3cc(-c4cc(-c5ccc(-c6nc(-c7ccccc7)nc(-c7ccccc7)n6)cc5)c5c(c4)oc4ccccc45)c4c(c3)oc3ccccc34)ccc21]
E27
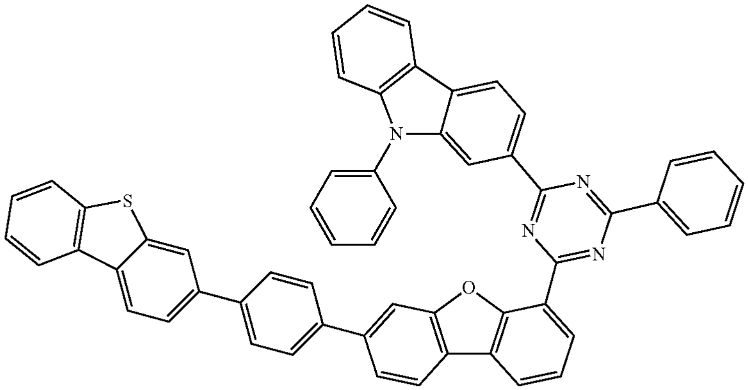 [SMILES: c1ccc(-c2nc(-c3ccc4c5ccccc5n(-c5ccccc5)c4c3)nc(-c3cccc4c3oc3cc(-c5ccc(-c6ccc7c(c6)sc6ccccc67)cc5)ccc34)n2)cc1]
E28
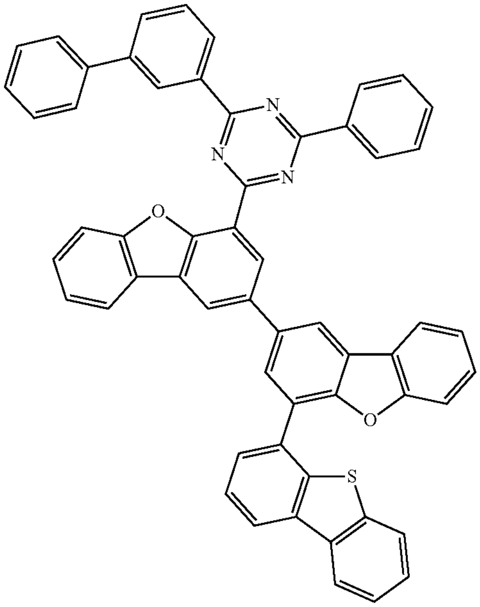 [SMILES: c1ccc(-c2cccc(-c3nc(-c4ccccc4)nc(-c4cc(-c5cc(-c6cccc7c6sc6ccccc67)c6oc7ccccc7c6c5)cc5c4oc4ccccc45)n3)c2)cc1]

TABLE 2-continued
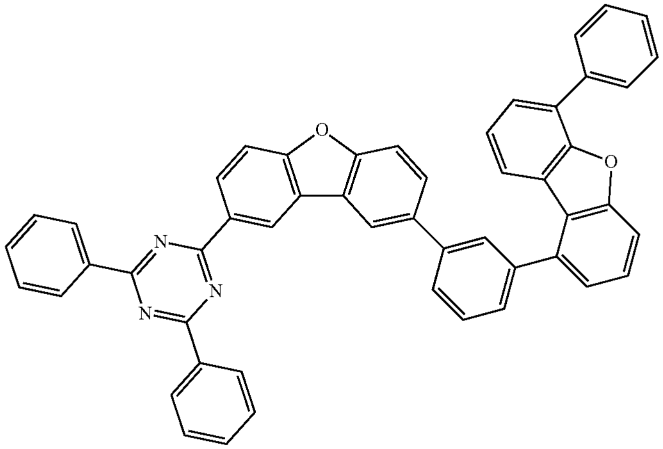 [SMILES: c1ccc(-c2nc(-c3ccccc3)nc(-c3ccc4oc5ccc(-c6cccc(-c7cccc8oc9c(-c%10ccccc%10)cccc9c78)c6)cc5c4c3)n2)cc1]
E29
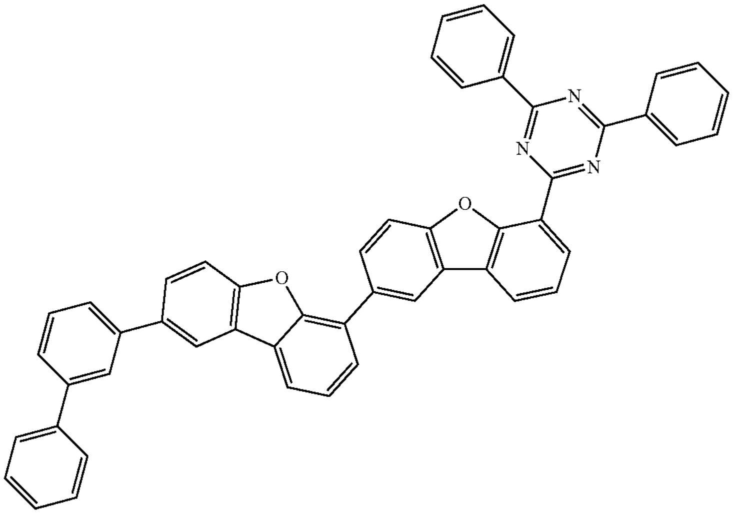 [SMILES: c1ccc(-c2cccc(-c3ccc4oc5c(-c6ccc7oc8c(-c9nc(-c%10ccccc%10)nc(-c%10ccccc%10)n9)cccc8c7c6)cccc5c4c3)c2)cc1]
E30
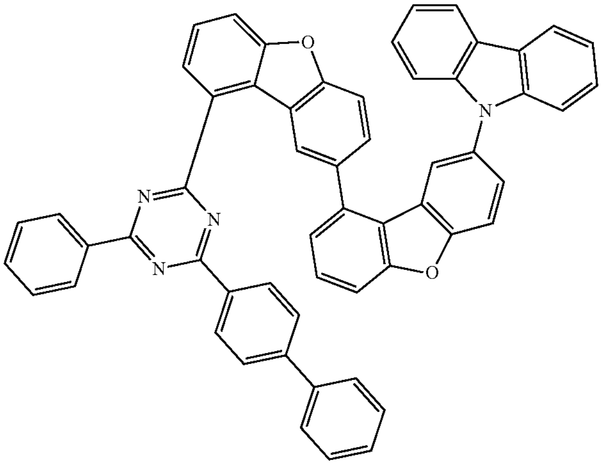 [SMILES: c1ccc(-c2ccc(-c3nc(-c4ccccc4)nc(-c4cccc5oc6ccc(-c7cccc8oc9ccc(-n%10c%11ccccc%11c%11ccccc%11%10)cc9c78)cc6c45)n3)cc2)cc1]
E31

TABLE 2-continued
E32
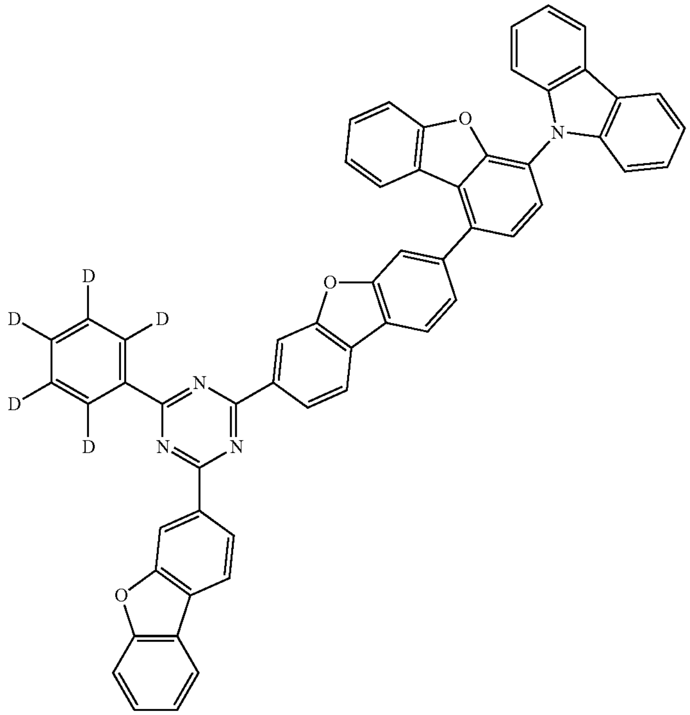 [SMILES: [2H]c1c([2H])c([2H])c(-c2nc(-c3ccc4c(c3)oc3ccccc34)nc(-c3ccc4c(c3)oc3cc(-c5ccc(-n6c7ccccc7c7ccccc76)c6oc7ccccc7c56)ccc34)n2)c([2H])c1[2H]]
E33
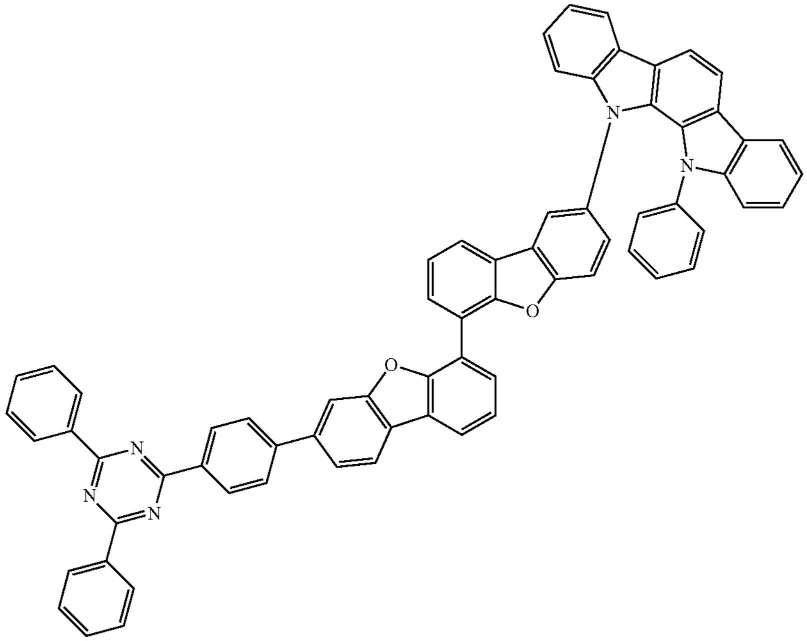 [SMILES: c1ccc(-c2nc(-c3ccccc3)nc(-c3ccc(-c4ccc5c(c4)oc4c(-c6cccc7c6oc6ccc(-n8c9ccccc9c9ccc%10c%11ccccc%11n(-c%11ccccc%11)c%10c98)cc67)cccc45)cc3)n2)cc1]

TABLE 2-continued
E34
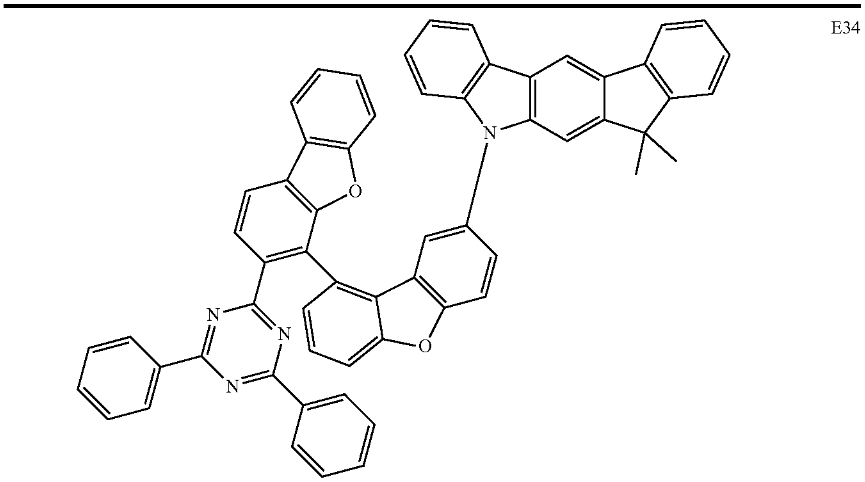
E35
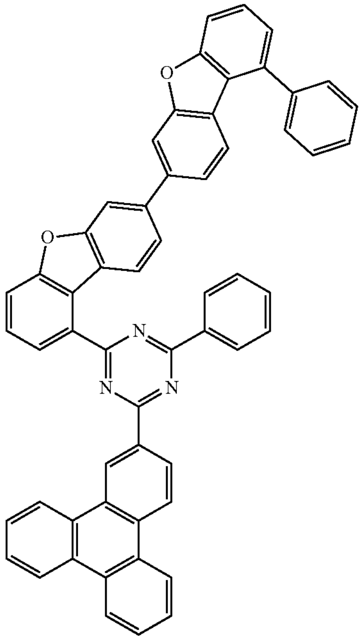 [SMILES: c1ccc(-c2nc(-c3ccc4c5ccccc5c5ccccc5c4c3)nc(-c3cccc4oc5cc(-c6ccc7c(c6)oc6cccc(-c8ccccc8)c67)ccc5c34)n2)cc1]
E36
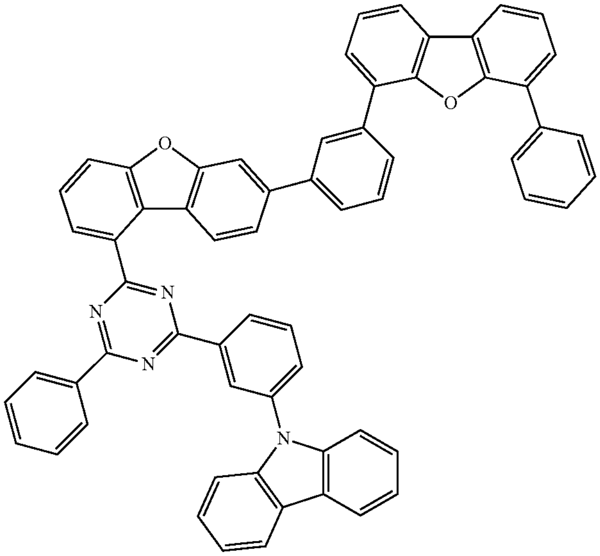 [SMILES: c1ccc(-c2nc(-c3cccc(-n4c5ccccc5c5ccccc54)c3)nc(-c3cccc4oc5cc(-c6cccc(-c7cccc8c7oc7c(-c9ccccc9)cccc78)c6)ccc5c34)n2)cc1]

TABLE 2-continued
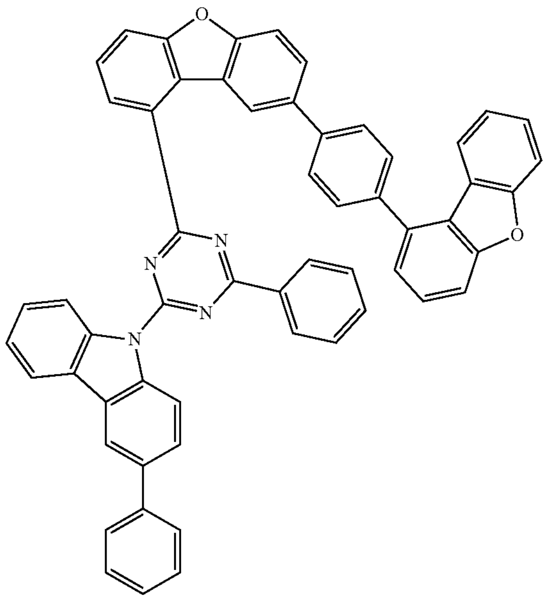 [SMILES: c1ccc(-c2ccc3c(c2)c2ccccc2n3-c2nc(-c3ccccc3)nc(-c3cccc4oc5ccc(-c6ccc(-c7cccc8oc9ccccc9c78)cc6)cc5c34)n2)cc1]
E37
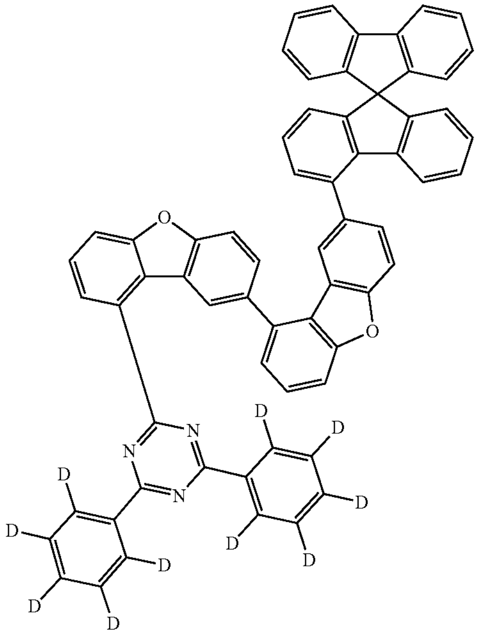 [SMILES: [2H]c1c([2H])c([2H])c(-c2nc(-c3c([2H])c([2H])c([2H])c([2H])c3[2H])nc(-c3cccc4oc5ccc(-c6cccc7oc8ccc(-c9cccc%10c9-c9ccccc9C%109c%10ccccc%10-c%10ccccc%109)cc8c67)cc5c34)n2)c([2H])c1[2H]]
E38

TABLE 2-continued
E39
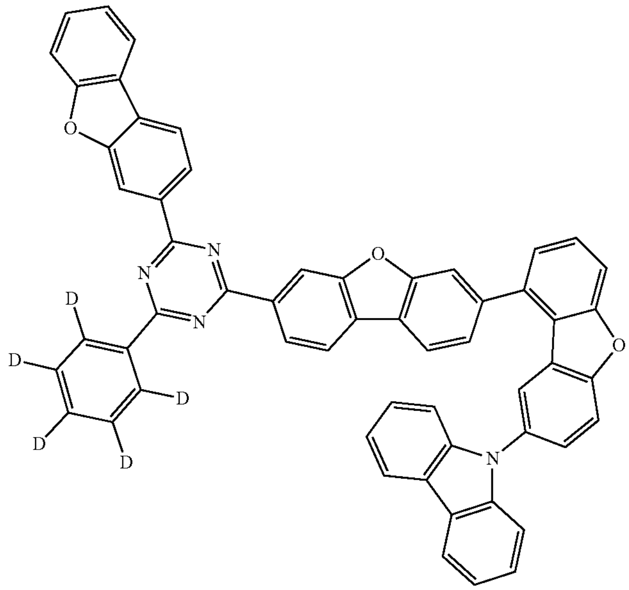 [SMILES: [2H]c1c([2H])c([2H])c(-c2nc(-c3ccc4c(c3)oc3ccccc34)nc(-c3ccc4c(c3)oc3cc(-c5cccc6oc7ccc(-n8c9ccccc9c9ccccc98)cc7c56)ccc34)n2)c([2H])c1[2H]]
E40
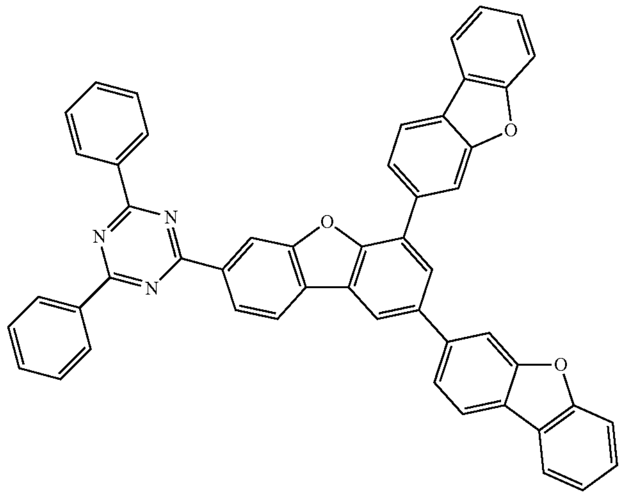 [SMILES: c1ccc(-c2nc(-c3ccccc3)nc(-c3ccc4c(c3)oc3c(-c5ccc6c(c5)oc5ccccc56)cc(-c5ccc6c(c5)oc5ccccc56)cc34)n2)cc1]
E41
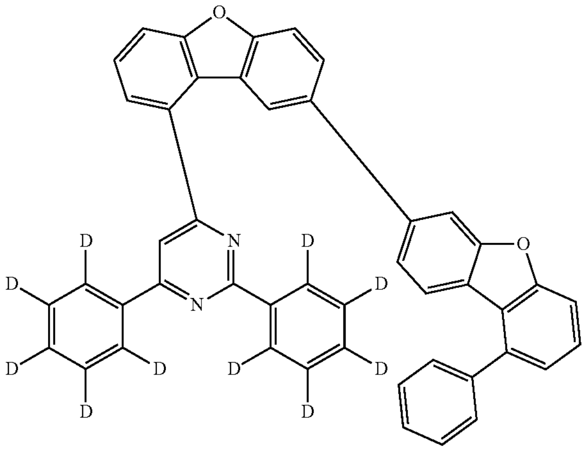 [SMILES: [2H]c1c([2H])c([2H])c(-c2cc(-c3cccc4oc5ccc(-c6ccc7c(c6)oc6cccc(-c8ccccc8)c67)cc5c34)nc(-c3c([2H])c([2H])c([2H])c([2H])c3[2H])n2)c([2H])c1[2H]]

TABLE 2-continued
E42
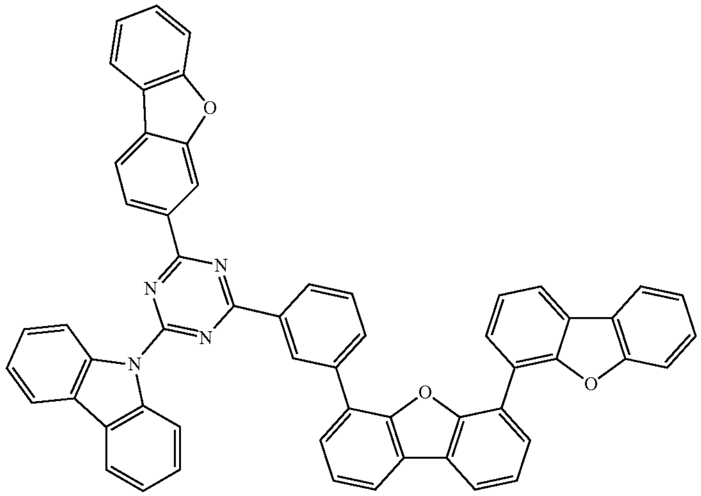 [SMILES: c1cc(-c2nc(-c3ccc4c(c3)oc3ccccc34)nc(-n3c4ccccc4c4ccccc43)n2)cc(-c2cccc3c2oc2c(-c4cccc5c4oc4ccccc45)cccc23)c1]
E43
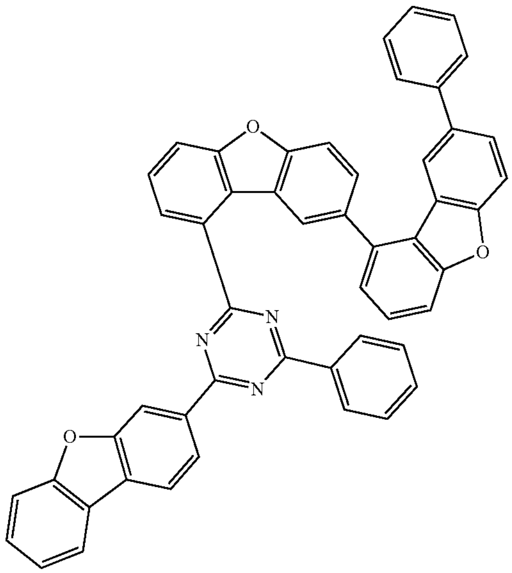 [SMILES: c1ccc(-c2ccc3oc4cccc(-c5ccc6oc7cccc(-c8nc(-c9ccccc9)nc(-c9ccc%10c(c9)oc9ccccc9%10)n8)c7c6c5)c4c3c2)cc1]
E44
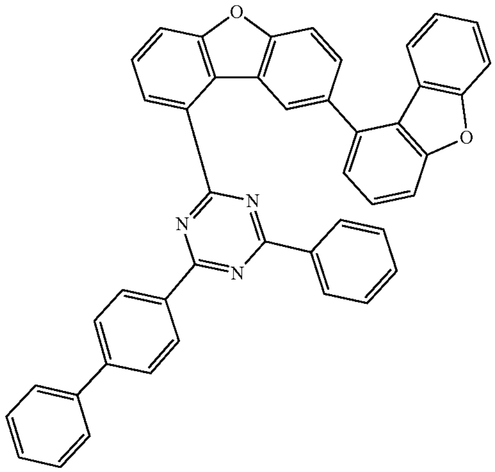 [SMILES: c1ccc(-c2ccc(-c3nc(-c4ccccc4)nc(-c4cccc5oc6ccc(-c7cccc8oc9ccccc9c78)cc6c45)n3)cc2)cc1]

TABLE 2-continued
E45
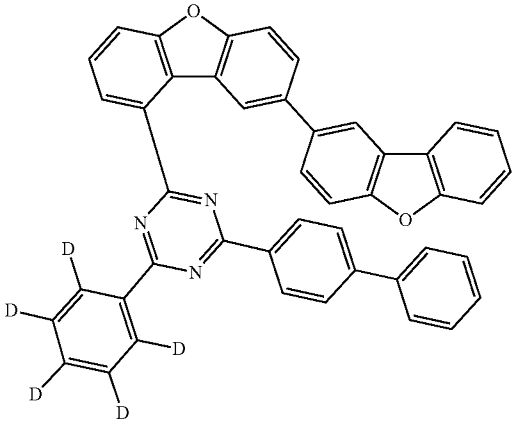 [SMILES: [2H]c1c([2H])c([2H])c(-c2nc(-c3ccc(-c4ccccc4)cc3)nc(-c3cccc4oc5ccc(-c6ccc7oc8ccccc8c7c6)cc5c34)n2)c([2H])c1[2H]]
E46
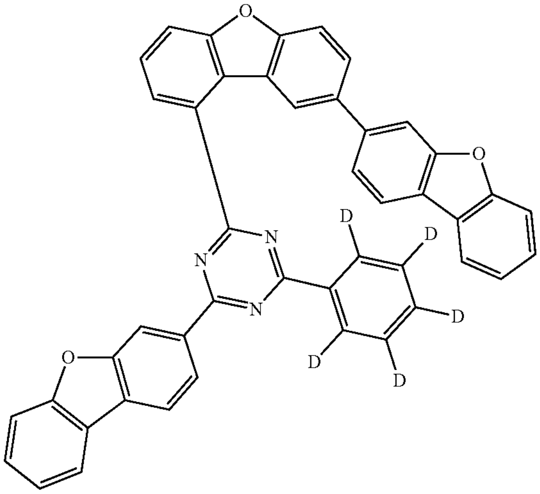 [SMILES: [2H]c1c([2H])c([2H])c(-c2nc(-c3ccc4c(c3)oc3ccccc34)nc(-c3cccc4oc5ccc(-c6ccc7c(c6)oc6ccccc67)cc5c34)n2)c([2H])c1[2H]]
E47
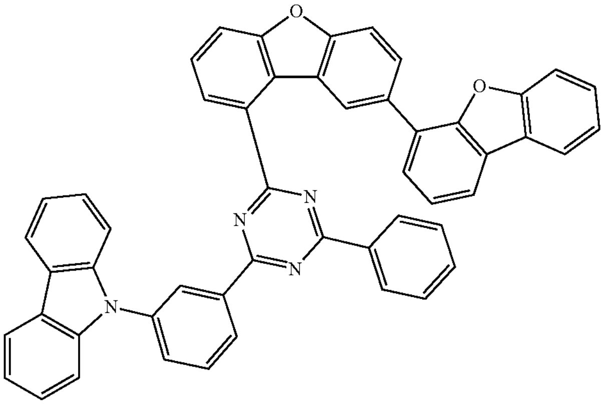 [SMILES: c1ccc(-c2nc(-c3cccc(-n4c5ccccc5c5ccccc54)c3)nc(-c3cccc4oc5ccc(-c6cccc7c6oc6ccccc67)cc5c34)n2)cc1]

TABLE 2-continued
E48
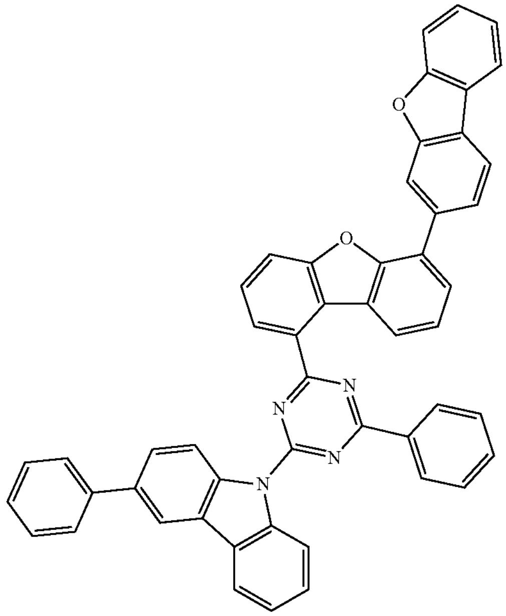 [SMILES: c1ccc(-c2ccc3c(c2)c2ccccc2n3-c2nc(-c3ccccc3)nc(-c3cccc4oc5c(-c6ccc7c(c6)oc6ccccc67)cccc5c34)n2)cc1]
E49
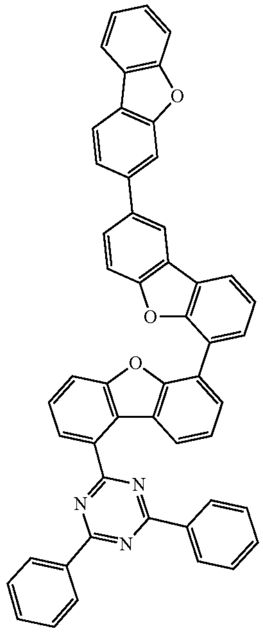 [SMILES: c1ccc(-c2nc(-c3ccccc3)nc(-c3cccc4oc5c(-c6cccc7c6oc6ccc(-c8ccc9c(c8)oc8ccccc89)cc67)cccc5c34)n2)cc1]

TABLE 2-continued
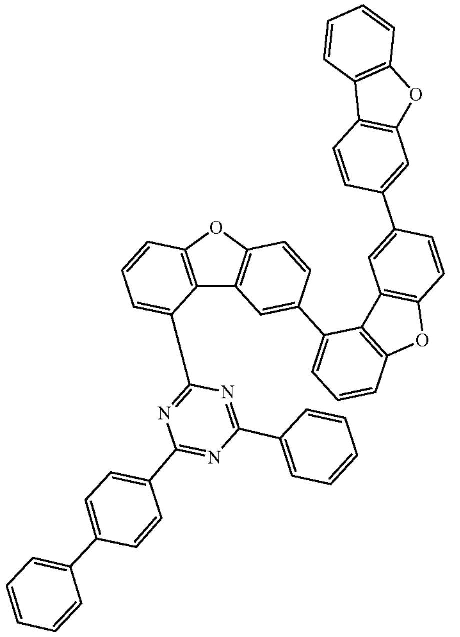 [SMILES: c1ccc(-c2ccc(-c3nc(-c4ccccc4)nc(-c4cccc5oc6ccc(-c7cccc8oc9ccc(-c%10ccc%11c(c%10)oc%10ccccc%10%11)cc9c78)cc6c45)n3)cc2)cc1]
E50
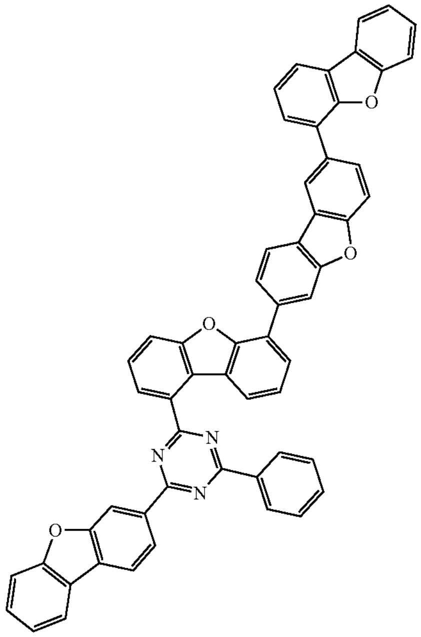 [SMILES: c1ccc(-c2nc(-c3ccc4c(c3)oc3ccccc34)nc(-c3cccc4oc5c(-c6ccc7c(c6)oc6ccc(-c8cccc9c8oc8ccccc89)cc67)cccc5c34)n2)cc1]
E51

TABLE 2-continued
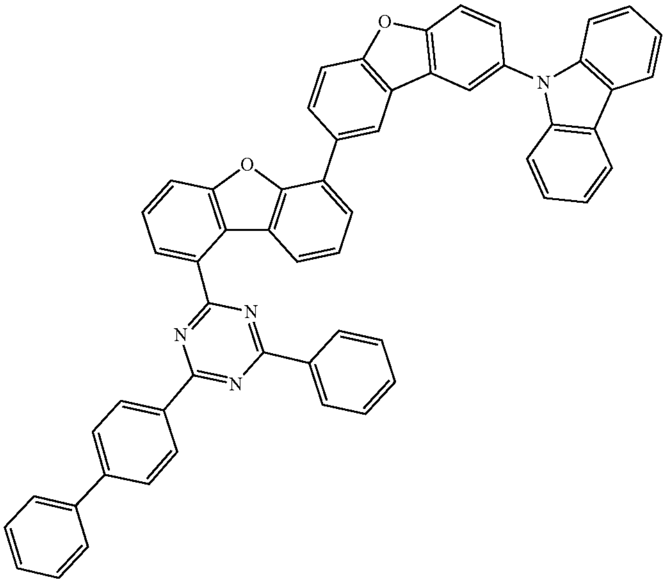 [SMILES: c1ccc(-c2ccc(-c3nc(-c4ccccc4)nc(-c4cccc5oc6c(-c7ccc8oc9ccc(-n%10c%11ccccc%11c%11ccccc%11%10)cc9c8c7)cccc6c45)n3)cc2)cc1]
E52
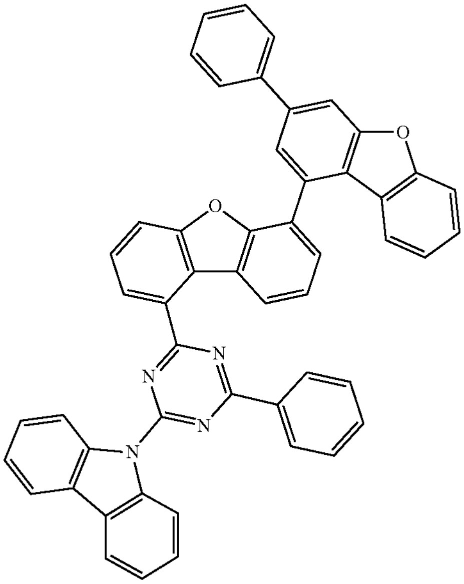 [SMILES: c1ccc(-c2cc(-c3cccc4c3oc3cccc(-c5nc(-c6ccccc6)nc(-n6c7ccccc7c7ccccc76)n5)c34)c3c(c2)oc2ccccc23)cc1]
E53

TABLE 2-continued

E54

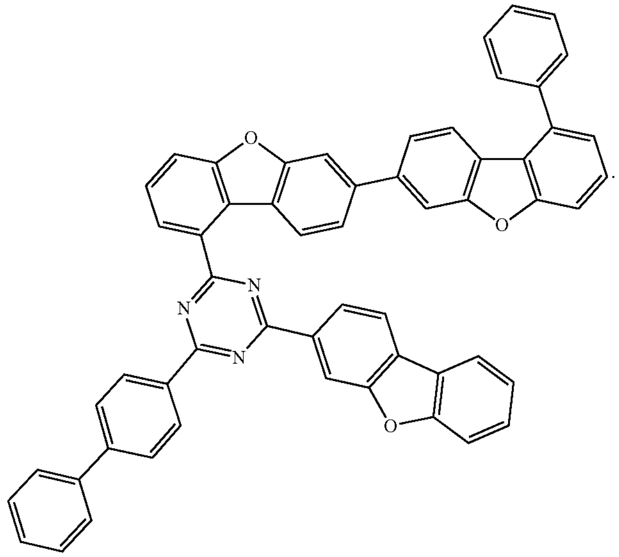 [SMILES: c1ccc(-c2ccc(-c3nc(-c4ccc5c(c4)oc4ccccc45)nc(-c4cccc5oc6cc(-c7ccc8c(c7)oc7cccc(-c9ccccc9)c78)ccc6c45)n3)cc2)cc1 ; "."]

The preparation of the compounds of the formula (1) or of the preferred compounds from table 1 and of the compounds E1 to E54 is known to those skilled in the art. The compounds can be prepared by synthesis steps known to those skilled in the art, for example bromination, Suzuki coupling, Ullmann coupling, Hartwig-Buchwald coupling, etc. A suitable synthesis method is shown in general terms in scheme 1 below, where the symbols and indices used have the definitions given above.

Scheme 1

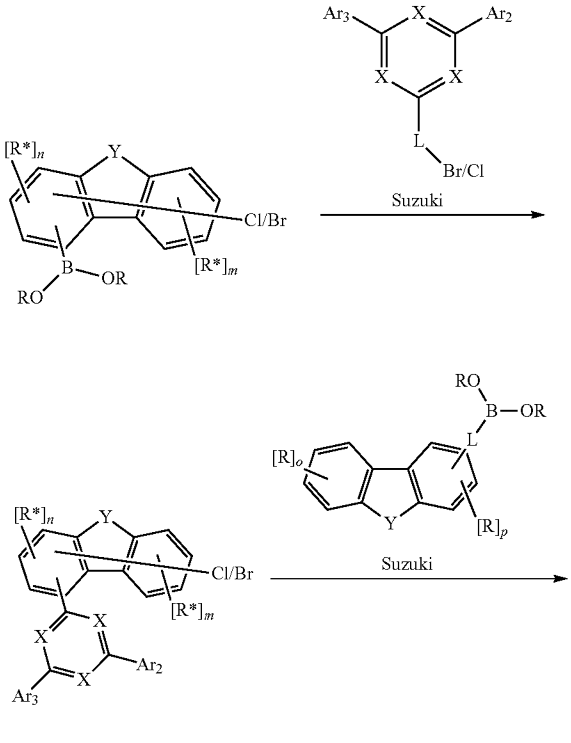

-continued

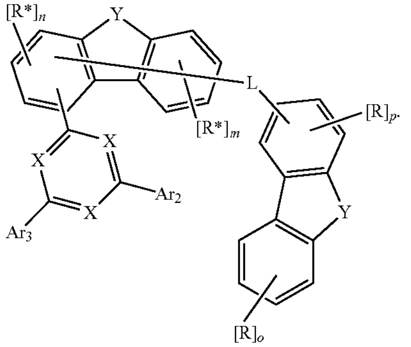

There follows a description of the host material 2 and its preferred embodiments that is/are present in the device of the invention. The preferred embodiments of the host material 2 of the formula (2) are also applicable to the mixture and/or formulation of the invention.

Host material 2 is at least one compound of the formula (2)

Formula (2)

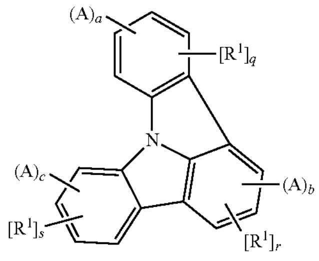

where the symbols and indices used are as follows:

A at each instance is independently a group of the formula (3) or (4),

Formula (3)

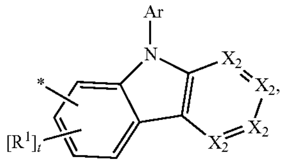

Formula (4)

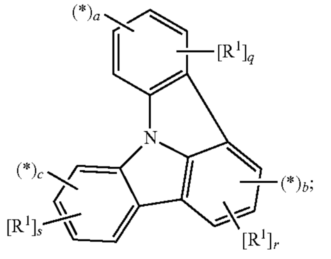

$X_2$ is the same or different at each instance and is CH, $CR^1$ or N, where not more than 2 symbols $X_2$ can be N;

* indicates the binding site to the formula (2);

$R^1$ is the same or different at each instance and is selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, or an aryloxy or heteroaryloxy group having 5 to 40 aromatic ring atoms, or an aralkyl or heteroaralkyl group having 5 to 40 aromatic ring atoms; at the same time, it is possible for two substituents $R^1$ bonded to the same carbon atom or to adjacent carbon atoms to form a monocyclic or polycyclic, aliphatic, aromatic or heteroaromatic ring system that may be substituted by one or more $R^2$ radicals;

Ar at each instance is in each case independently an aryl group which has 6 to 40 aromatic ring atoms and may be substituted by one or more R #radicals; or a heteroaryl group having 5 to 40 aromatic ring atoms, which may be substituted by one or more R #radicals;

R #is the same or different at each instance and is selected from the group consisting of D, F, Cl, Br, I, CN, $NO_2$, $C(=O)R^2$, $P(=O)(Ar_1)_2$, $P(Ar_1)_2$, $B(Ar_1)_2$, $Si(Ar_1)_3$, $Si(R^2)_3$, a straight-chain alkyl, alkoxy or thioalkyl group having 1 to 20 carbon atoms or a branched or cyclic alkyl, alkoxy or thioalkyl group having 3 to 20 carbon atoms or an alkenyl group having 2 to 20 carbon atoms, each of which may be substituted by one or more $R^2$ radicals, where one or more nonadjacent $CH_2$ groups may be replaced by $R^2C=CR^2$, $Si(R^2)_2$, C=O, C=S, $C=NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals;

$R^2$ is the same or different at each instance and is selected from the group consisting of H, D, F, Cl, Br, I, CN, $NO_2$, $N(Ar_1)_2$, $NH_2$, $N(R^3)_2$, $C(=O)Ar_1$, C(=O)H, $C(=O)R^3$, $P(=O)(Ar_1)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^3$ radicals, where one or more nonadjacent $CH_2$ groups may be replaced by HC=CH, $R^3C=CR^3$, C≡C, $Si(R^3)_2$, $Ge(R^3)_2$, $Sn(R^3)_2$, C=O, C=S, C=Se, $C=NR^3$, $P(=O)(R^3)$, SO, $SO_2$, NH, $NR^3$, O, S, CONH or $CONR^3$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^3$ radicals, an aryloxy or heteroaryloxy group which has 5 to 60 aromatic ring atoms and may be substituted by one or more $R^3$ radicals, or a combination of these systems, where it is optionally possible for two or more adjacent substituents $R^2$ to form a monocyclic or polycyclic, aliphatic, aromatic or heteroaromatic ring system which may be substituted by one or more $R^3$ radicals;

$R^3$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F, Cl, Br, I or CN and which may be substituted by one or more alkyl groups each having 1 to 4 carbon atoms; at the same time, it is possible for two or more adjacent $R^3$ substituents together to form a mono- or polycyclic, aliphatic ring system;

$Ar_1$ is the same or different at each instance and is an aromatic or heteroaromatic ring system which has 5 to 30 aromatic ring atoms and may be substituted by one or more nonaromatic $R^3$ radicals; at the same time, two $Ar_1$ radicals bonded to the same nitrogen atom, phosphorus atom or boron atom may also be bridged to one another by a single bond or a bridge selected from $N(R^3)$, $C(R^3)_2$, O and S;

a, b, c at each instance are each independently 0 or 1, where the sum total of the indices at each instance a+b+c is 1; and q, r, s, t at each instance are each independently 0 or 1.

In one embodiment of the invention, for the device of the invention, compounds of the formula (2) as described above are selected, which are used in the light-emitting layer with compounds of the formula (1) as described above or described as preferred, or with the compounds from table 1 or the compounds E1 to E54.

In compounds of the formula (2), a, b, c at each instance are each independently 0 or 1, where the sum total of the indices at each instance a+b+c is 1. c is preferably defined as 1.

Compounds of the formula (2) may be represented by the following formulae (2a), (2b) and (2c):

Formula (2a)

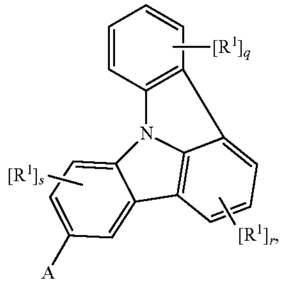

-continued

Formula (2b)

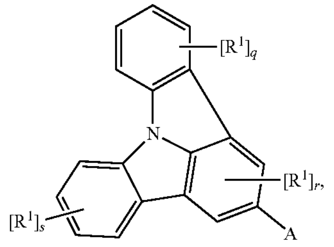

Formula (2c)

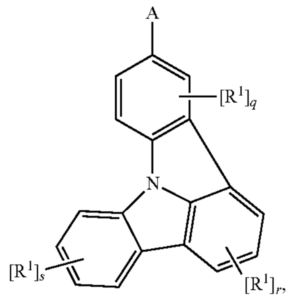

where A, $R^1$, q, r, s and t have a definition given above or given hereinafter. Preference is given here to compounds of the formula (2a).

The invention accordingly further provides an organic electroluminescent device as described above or described as preferred, wherein the host material 2 corresponds to a compound of the formula (2a), (2b) or (2c). $R^1$ in compounds of the formula (2) and of the formulae (2a) to (2c) or preferred compounds of the formulae (2) and (2a) to (2c), as described above, is the same or different at each instance and is selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, or an aryloxy or heteroaryloxy group having 5 to 40 aromatic ring atoms, or an aralkyl or heteroaralkyl group having 5 to 40 aromatic ring atoms; at the same time, it is possible for two substituents $R^1$ bonded to the same carbon atom or to adjacent carbon atoms to form a monocyclic or polycyclic, aliphatic, aromatic or heteroaromatic ring system that may be substituted by one or more $R^2$ radicals.

If two or more $R^1$ radicals are bonded to adjacent carbon atoms, the monocyclic or polycyclic, aliphatic, aromatic or heteroaromatic ring system is preferably selected from the group of (S-1) to (S-4)

(S-1)

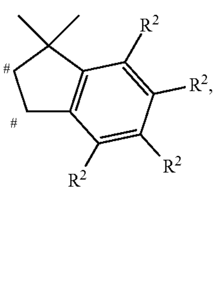

-continued (S-2)

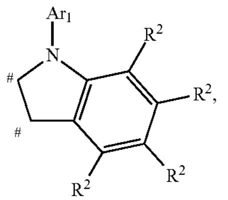

(S-3)

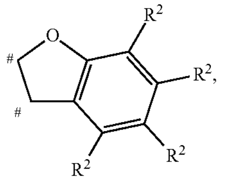

(S-4)

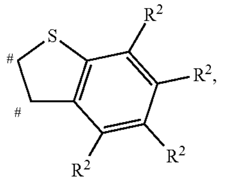

where $Ar_1$ and $R^2$ have a definition given above or definition given as preferred and #indicates the bonding sites to the rest of the respective structure, for example to adjacent positions identified by $X_2$ in compounds of the formulae (2), (2a), (2b) and (2c). Particular preference is given here to selecting (S-1) or (S-2).

$R^1$ in compounds of the formula (2) and of the formulae (2a) to (2c) or preferred compounds of the formulae (2) and (2a) to (2c), as described above, is the same or different at each instance and is preferably selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, an aryloxy or heteroaryloxy group having 5 to 40 aromatic ring atoms, or an aralkyl or heteroaralkyl group having 5 to 40 aromatic ring atoms. The substituent $R^1$ at each instance is more preferably independently CN or an aryl group having 6 to 40 carbon atoms, as described above. $R^1$ at each instance is more preferably independently phenyl.

In compounds of the formulae (2), (2a), (2b) or (2c), the sum total of the indices q+r+s is preferably 0, 1 or 2, where $R^1$ has a definition given above. In compounds of the formulae (2), (2a), (2b) or (2c), the sum total of the indices q+r+s is preferably 0 or 1, where $R^1$ has a definition given above.

In compounds of the formulae (2), (2a), (2b) or (2c), q, r and s are preferably 0 or 1. Preferably, q is 1 if the sum total of the indices q+r+s is 1. Preferably, q, r and s are 0.

In formula (4)

Formula (4)

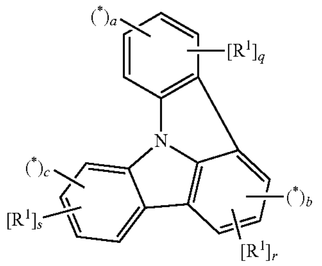

q, r and s are 0 or 1, where $R^1$ has a definition given above. Preferably, the sum total of the indices q+r+s in formula (4) is 0 or 1. In formula (4), q, r and s are more preferably 0.

In formula (3)

Formula (3)

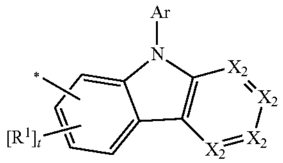

t is in each case independently preferably 0 or 1. In formula (3), t is preferably the same and is 0.

In compounds of the formulae (2), (2a), (2b) and (2c) or preferred compounds of the formulae (2), (2a), (2b) and (2c), $X_2$ is the same or different at each instance and is CH, $CR^1$ or N, where not more than 2 symbols $X_2$ can be N.

In compounds of the formulae (2), (2a), (2b) and (2c) or preferred compounds of the formulae (2), (2a), (2b) and (2c), $X_2$ is preferably the same or different at each instance and is CH, $CR^1$ or N, where not more than 1 symbol $X_2$ is N.

In compounds of the formulae (2), (2a), (2b) and (2c) or preferred compounds of the formulae (2), (2a), (2b) and (2c), $X_2$ is more preferably the same or different at each instance and is CH at two instances and $CR^1$ at two instances, or CH at three instances and $CR^1$ at one instance, where the substituents $R^1$ at each instance independently have a definition given above.

Ar at each instance is in each case independently an aryl group which has 6 to 40 aromatic ring atoms and may be substituted by one or more R #radicals, or a heteroaryl group which has 5 to 40 aromatic ring atoms and may be substituted by one or more R #radicals, where the R #radical has a definition given above or given with preference hereinafter.

Ar at each instance is preferably in each case independently an aryl group which has 6 to 40 aromatic ring atoms and may be substituted by one or more R #radicals, or a heteroaryl group having 5 to 40 aromatic ring atoms and containing 0 or S as heteroatom, which may be substituted by one or more R #radicals, where the R #radical has a definition given above or given with preference.

Ar at each instance is preferably an aryl group which has 6 to 18 carbon atoms and may be substituted by one or more R #radicals, or dibenzofuranyl or dibenzothiophenyl which may be substituted by one or more R #radicals, where the R #radical has a definition given above or given with preference hereinafter.

Ar is more preferably phenyl, dibenzofuran-substituted phenyl, dibenzothiophene-substituted phenyl, 1,3-biphenyl, 1,4-biphenyl, terphenyl, quaterphenyl, naphthyl, fluorenyl, 9,9-diphenylfluorenyl, bispirofluorenyl, triphenylenyl, dibenzofuranyl, phenyl-substituted dibenzofuranyl, dibenzothiophenyl or phenyl-substituted dibenzothiophenyl. Ar is most preferably phenyl, 1,3-biphenyl, 1,4-biphenyl, naphth-2-yl or triphenyl-2-yl.

In compounds of the formulae (2), (2a), (2b) and (2c) or preferred compounds of the formulae (2), (2a), (2b) and (2c), R #is the same or different at each instance and is preferably selected from the group consisting of D, CN and an aromatic or heteroaromatic ring system which has 5 to 40 aromatic ring atoms and may be substituted in each case by one or more $R^2$ radicals.

In compounds of the formulae (2), (2a), (2b) and (2c) or preferred compounds of the formulae (2), (2a), (2b) and (2c), R #is the same or different at each instance and is more preferably an unsubstituted aromatic ring system having 5 to 20 aromatic ring atoms, preferably phenyl.

In a preferred embodiment of the invention, A conforms to the formula (4) as described above or with substituents as described as preferred.

In a preferred embodiment of the invention, A conforms to the formula (3) as described above or with substituents as described as preferred.

Compounds of the formulae (2), (2a), (2b) and (2c) where A conforms to the formula (3) and q, r, s and t are 0 may be represented by the formulae (2d) and (2e)

Formula (2d)

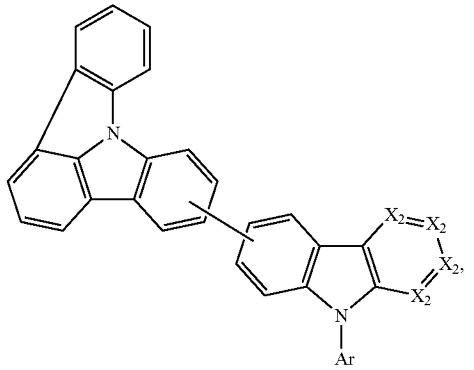

Formula (2d)

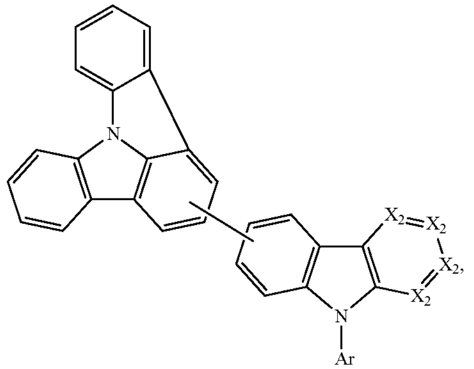

where $X_2$ and Ar have a definition given above or given as preferred.

The invention accordingly further provides an organic electroluminescent device as described above or described as preferred, wherein the at least one compound of the formula (2) corresponds to a compound of the formula (2d) or of the formula (2e).

In a preferred embodiment of the compounds of the formulae (2), (2a), (2b), (2c), (2d) or (2e), the substituents of the formulae (3) and (4) are each joined to one another in the 2 position or 5 position of the indolo[3,2,1-jk]carbazole, as shown in schematic form below, where the dotted line indicates the linkage to the substituents of the formulae (3) and (4):

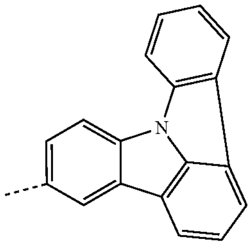

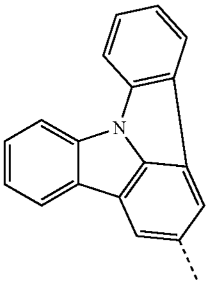

-continued

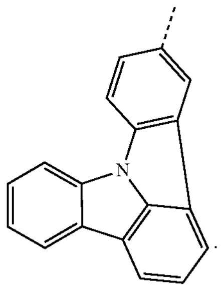

Examples of suitable host materials of the formulae (2), (2a), (2b), (2c), (2d) and (2e) that are selected in accordance with the invention and are preferably used in combination with at least one compound of the formula (1) in the electroluminescent device of the invention are the structures given below in table 3.

TABLE 3

| |
|---|
| 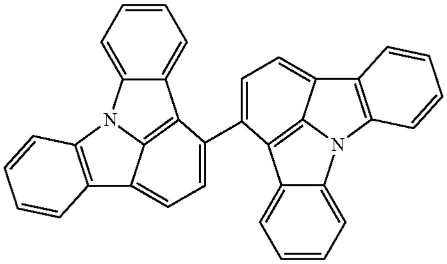 [SMILES: c1ccc2c(c1)c1ccc(-c3ccc4c5ccccc5n5c6ccccc6c3c45)c3c4ccccc4n2c13] |
| 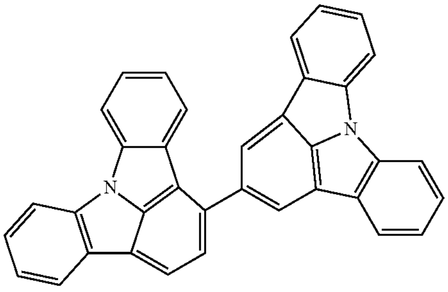 [SMILES: c1ccc2c(c1)c1cc(-c3ccc4c5ccccc5n5c6ccccc6c3c45)cc3c4ccccc4n2c13] |
| 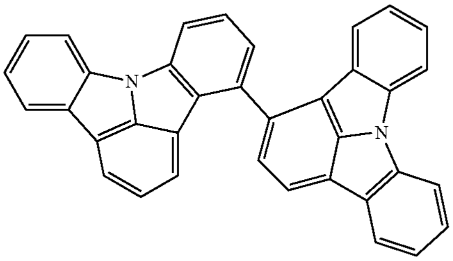 [SMILES: c1ccc2c(c1)c1cccc3c4c(-c5ccc6c7ccccc7n7c8ccccc8c5c67)cccc4n2c13] |

TABLE 3-continued
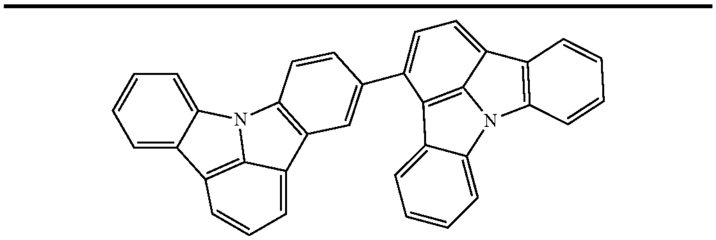
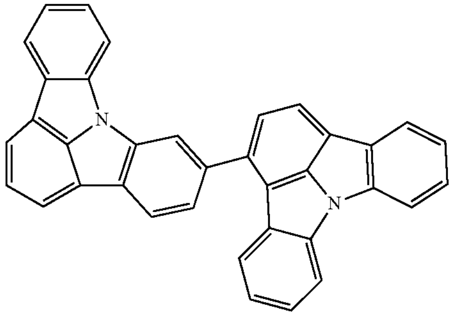 [SMILES: c1ccc2c(c1)c1cccc3c4ccc(-c5ccc6c7ccccc7n7c8ccccc8c5c67)cc4n2c13]
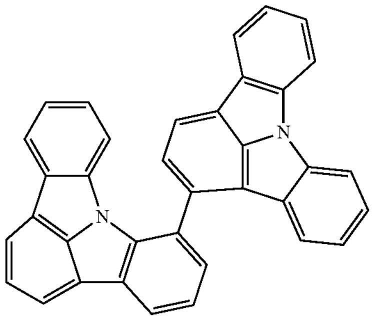 [SMILES: c1ccc2c(c1)c1ccc(-c3cccc4c5cccc6c7ccccc7n(c34)c65)c3c4ccccc4n2c13]
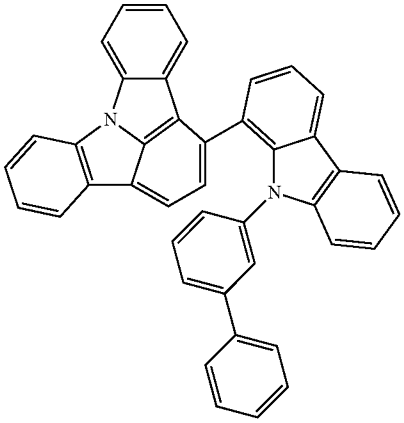 [SMILES: c1ccc(-c2cccc(-n3c4ccccc4c4cccc(-c5ccc6c7ccccc7n7c8ccccc8c5c67)c43)c2)cc1]
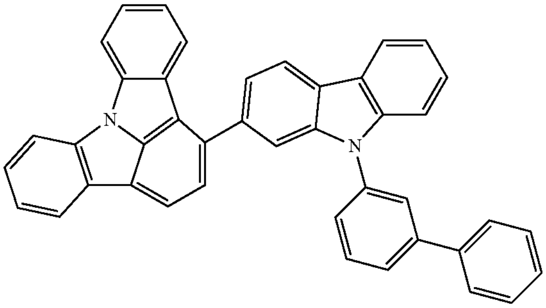 [SMILES: c1ccc(-c2cccc(-n3c4ccccc4c4ccc(-c5ccc6c7ccccc7n7c8ccccc8c5c67)cc43)c2)cc1]

TABLE 3-continued
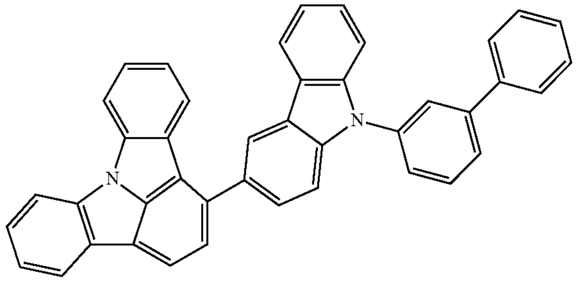 [SMILES: c1ccc(-c2cccc(-n3c4ccccc4c4cc(-c5ccc6c7ccccc7n7c8ccccc8c5c67)ccc43)c2)cc1]
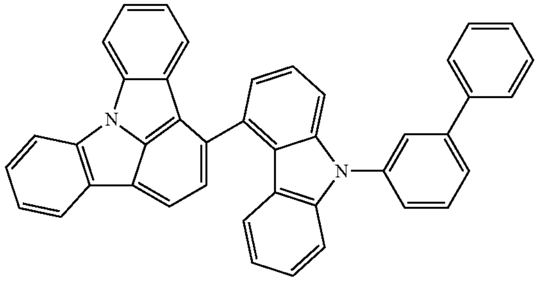 [SMILES: c1ccc(-c2cccc(-n3c4ccccc4c4c(-c5ccc6c7ccccc7n7c8ccccc8c5c67)cccc43)c2)cc1]
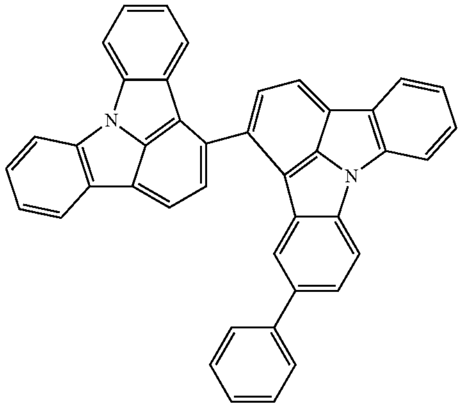 [SMILES: c1ccc(-c2ccc3c(c2)c2c(-c4ccc5c6ccccc6n6c7ccccc7c4c56)ccc4c5ccccc5n3c42)cc1]
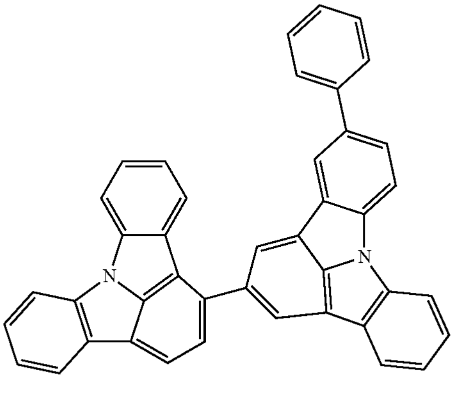 [SMILES: c1ccc(-c2ccc3c(c2)c2cc(-c4ccc5c6ccccc6n6c7ccccc7c4c56)cc4c5ccccc5n3c42)cc1]

TABLE 3-continued
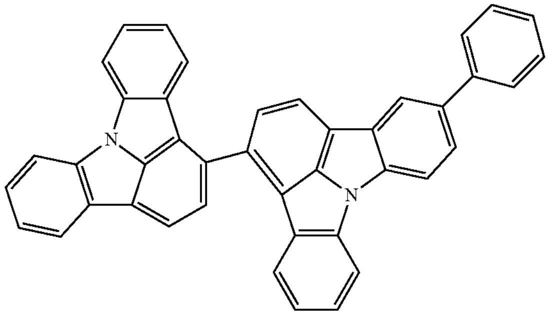 [SMILES: c1ccc(-c2ccc3c(c2)c2ccc(-c4ccc5c6ccccc6n6c7ccccc7c4c56)c4c5ccccc5n3c24)cc1]
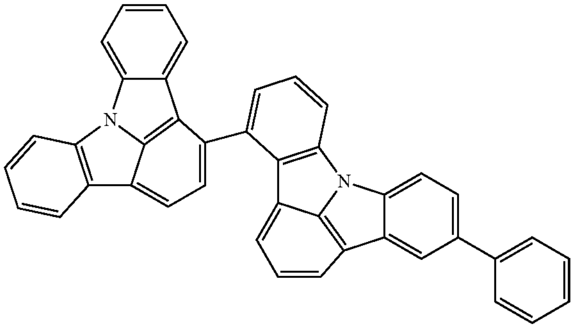 [SMILES: c1ccc(-c2ccc3c(c2)c2cccc4c5c(-c6ccc7c8ccccc8n8c9ccccc9c6c78)cccc5n3c24)cc1]
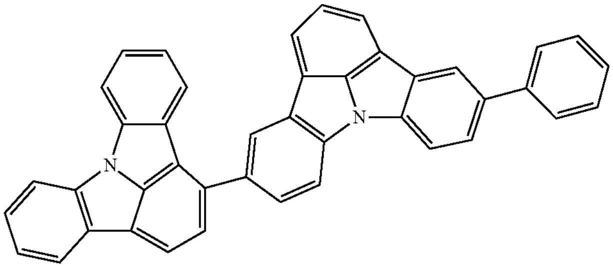 [SMILES: c1ccc(-c2ccc3c(c2)c2cccc4c5cc(-c6ccc7c8ccccc8n8c9ccccc9c6c78)ccc5n3c24)cc1]
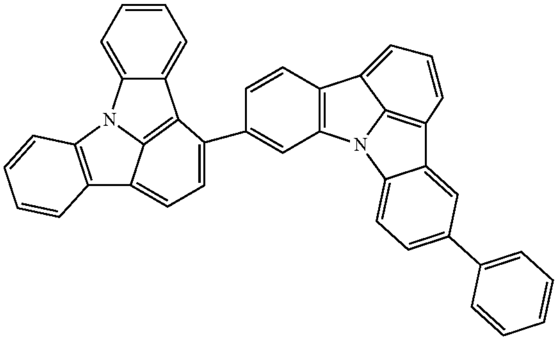 [SMILES: c1ccc(-c2ccc3c(c2)c2cccc4c5ccc(-c6ccc7c8ccccc8n8c9ccccc9c6c78)cc5n3c24)cc1]

TABLE 3-continued
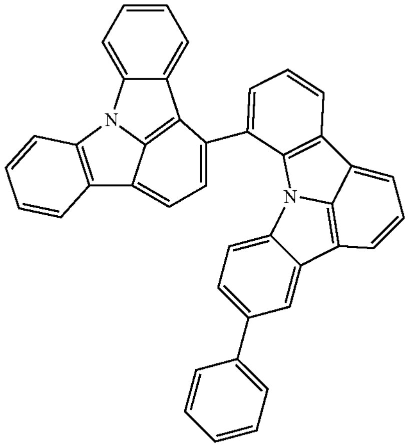 [SMILES: c1ccc(-c2ccc3c(c2)c2cccc4c5cccc(-c6ccc7c8ccccc8n8c9ccccc9c6c78)c5n3c24)cc1]
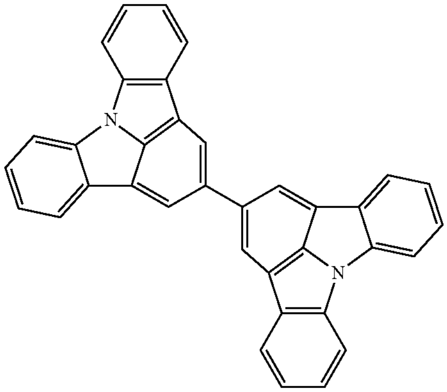 [SMILES: c1ccc2c(c1)c1cc(-c3cc4c5ccccc5n5c6ccccc6c(c3)c45)cc3c4ccccc4n2c13]
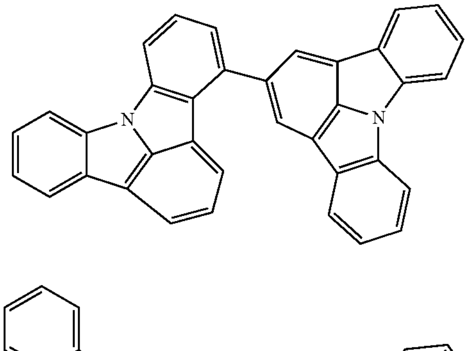
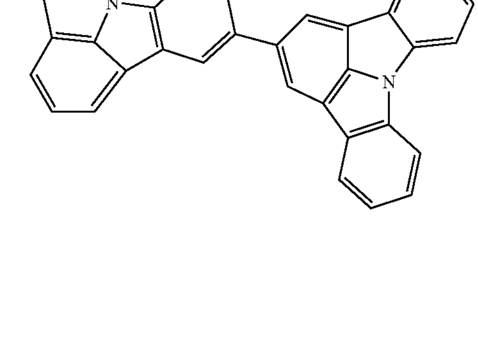

TABLE 3-continued
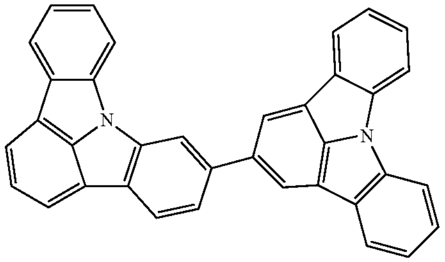 [SMILES: c1ccc2c(c1)c1cc(-c3ccc4c5cccc6c7ccccc7n(c4c3)c65)cc3c4ccccc4n2c13]
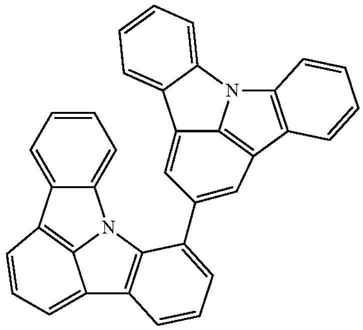 [SMILES: c1ccc2c(c1)c1cc(-c3cccc4c5cccc6c7ccccc7n(c34)c65)cc3c4ccccc4n2c13]
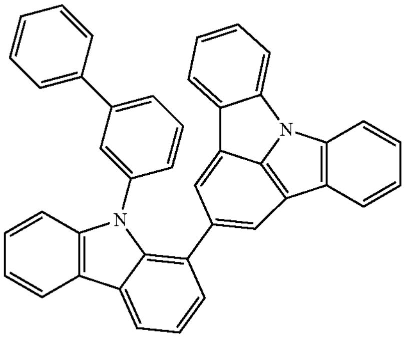 [SMILES: c1ccc(-c2cccc(-n3c4ccccc4c4cccc(-c5cc6c7ccccc7n7c8ccccc8c(c5)c67)c43)c2)cc1]
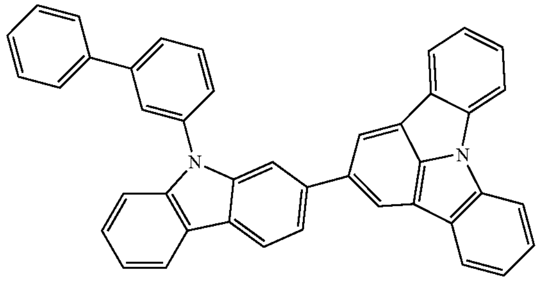 [SMILES: c1ccc(-c2cccc(-n3c4ccccc4c4ccc(-c5cc6c7ccccc7n7c8ccccc8c(c5)c67)cc43)c2)cc1]
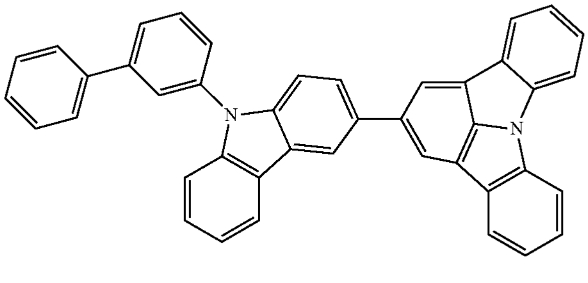 [SMILES: c1ccc(-c2cccc(-n3c4ccccc4c4cc(-c5cc6c7ccccc7n7c8ccccc8c(c5)c67)ccc43)c2)cc1]

TABLE 3-continued
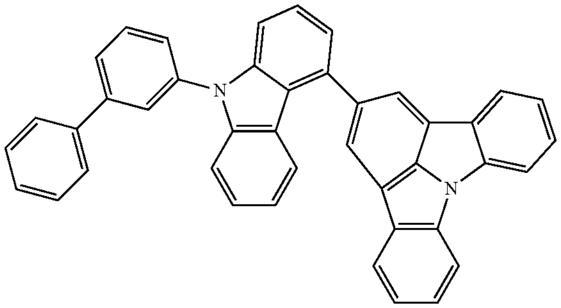 [SMILES: c1ccc(-c2cccc(-n3c4ccccc4c4c(-c5cc6c7ccccc7n7c8ccccc8c(c5)c67)cccc43)c2)cc1]
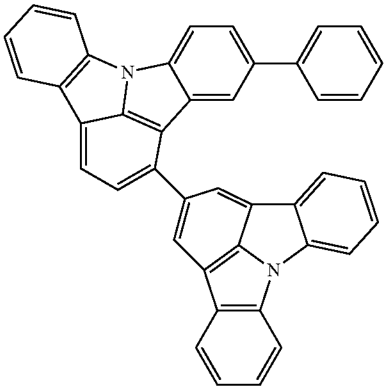 [SMILES: c1ccc(-c2ccc3c(c2)c2c(-c4cc5c6ccccc6n6c7ccccc7c(c4)c56)ccc4c5ccccc5n3c42)cc1]
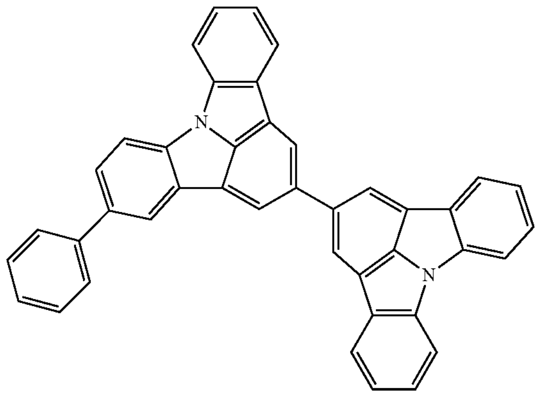 [SMILES: c1ccc(-c2ccc3c(c2)c2cc(-c4cc5c6ccccc6n6c7ccccc7c(c4)c56)cc4c5ccccc5n3c42)cc1]
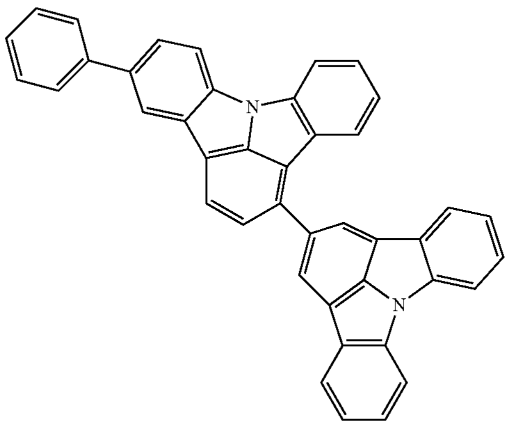 [SMILES: c1ccc(-c2ccc3c(c2)c2ccc(-c4cc5c6ccccc6n6c7ccccc7c(c4)c56)c4c5ccccc5n3c24)cc1]

TABLE 3-continued
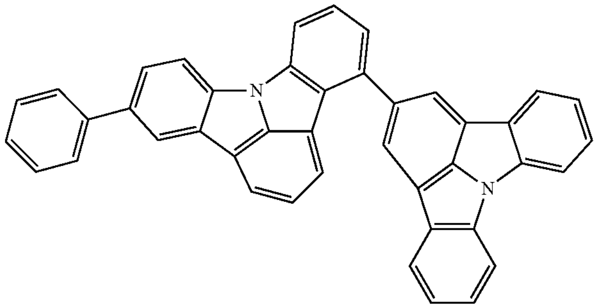 [SMILES: c1ccc(-c2ccc3c(c2)c2cccc4c5c(-c6cc7c8ccccc8n8c9ccccc9c(c6)c78)cccc5n3c24)cc1]
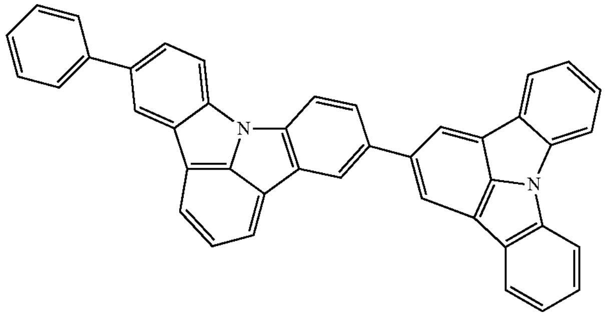 [SMILES: c1ccc(-c2ccc3c(c2)c2cccc4c5cc(-c6cc7c8ccccc8n8c9ccccc9c(c6)c78)ccc5n3c24)cc1]
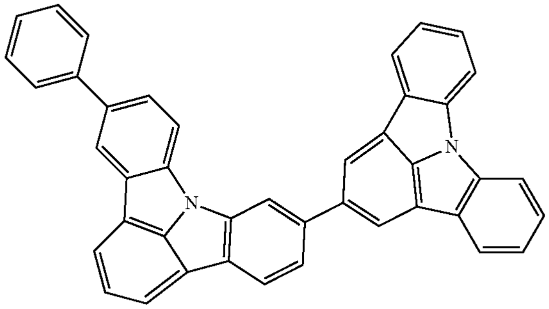 [SMILES: c1ccc(-c2ccc3c(c2)c2cccc4c5ccc(-c6cc7c8ccccc8n8c9ccccc9c(c6)c78)cc5n3c24)cc1]
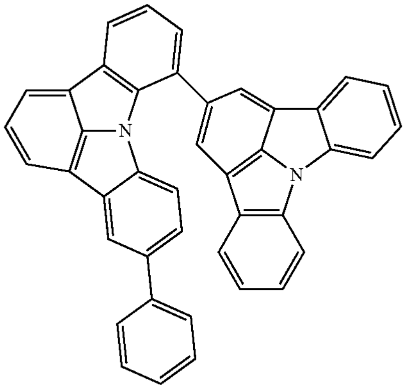 [SMILES: c1ccc(-c2ccc3c(c2)c2cccc4c5cccc(-c6cc7c8ccccc8n8c9ccccc9c(c6)c78)c5n3c24)cc1]
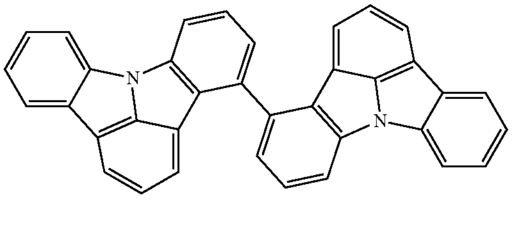 [SMILES: c1ccc2c(c1)c1cccc3c4c(-c5cccc6c5c5cccc7c8ccccc8n6c75)cccc4n2c13]

TABLE 3-continued
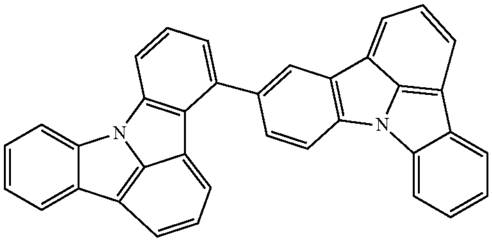 [SMILES: c1ccc2c(c1)c1cccc3c4cc(-c5cccc6c5c5cccc7c8ccccc8n6c75)ccc4n2c13]
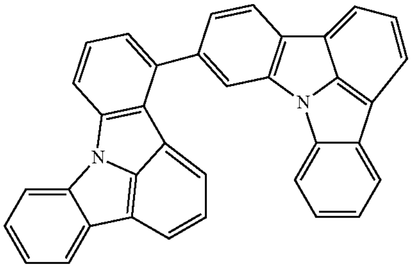 [SMILES: c1ccc2c(c1)c1cccc3c4ccc(-c5cccc6c5c5cccc7c8ccccc8n6c75)cc4n2c13]
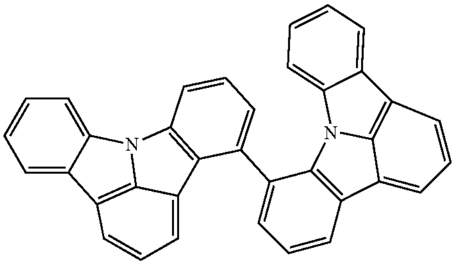 [SMILES: c1ccc2c(c1)c1cccc3c4c(-c5cccc6c7cccc8c9ccccc9n(c56)c87)cccc4n2c13]
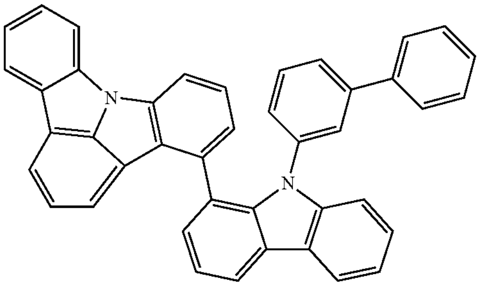 [SMILES: c1ccc(-c2cccc(-n3c4ccccc4c4cccc(-c5cccc6c5c5cccc7c8ccccc8n6c75)c43)c2)cc1]
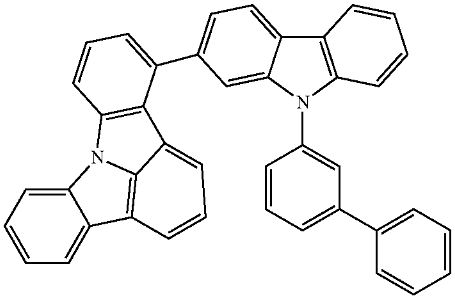 [SMILES: c1ccc(-c2cccc(-n3c4ccccc4c4ccc(-c5cccc6c5c5cccc7c8ccccc8n6c75)cc43)c2)cc1]

TABLE 3-continued
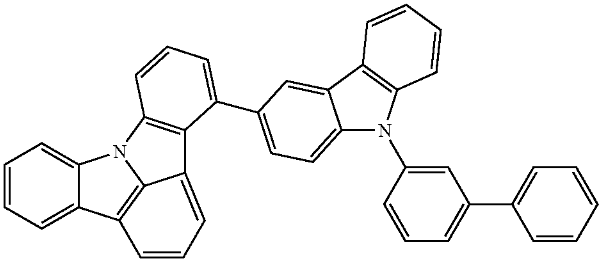 [SMILES: c1ccc(-c2cccc(-n3c4ccccc4c4cc(-c5cccc6c5c5cccc7c8ccccc8n6c75)ccc43)c2)cc1]
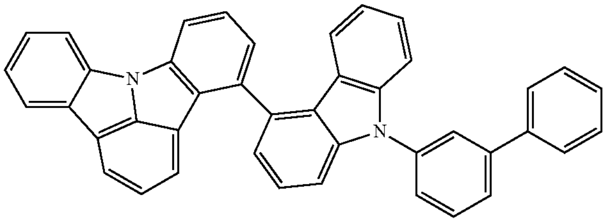 [SMILES: c1ccc(-c2cccc(-n3c4ccccc4c4c(-c5cccc6c5c5cccc7c8ccccc8n6c75)cccc43)c2)cc1]
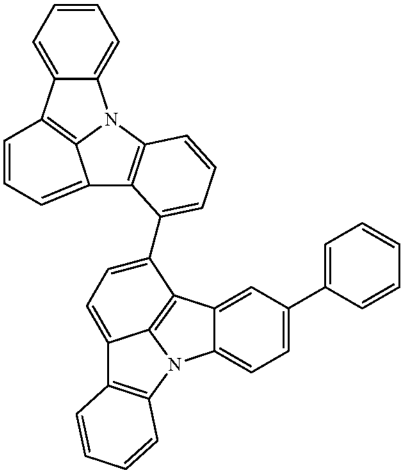 [SMILES: c1ccc(-c2ccc3c(c2)c2c(-c4cccc5c4c4cccc6c7ccccc7n5c64)ccc4c5ccccc5n3c42)cc1]
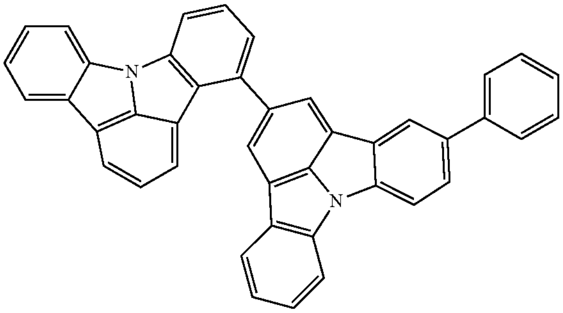 [SMILES: c1ccc(-c2ccc3c(c2)c2cc(-c4cccc5c4c4cccc6c7ccccc7n5c64)cc4c5ccccc5n3c42)cc1]
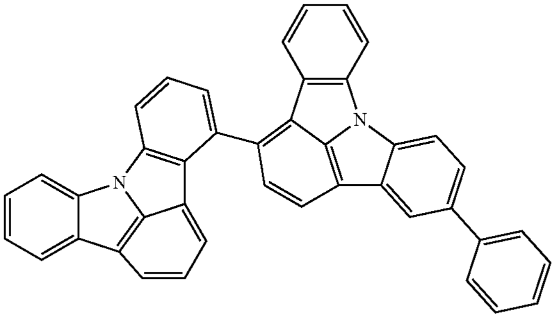 [SMILES: c1ccc(-c2ccc3c(c2)c2ccc(-c4cccc5c4c4cccc6c7ccccc7n5c64)c4c5ccccc5n3c24)cc1]

TABLE 3-continued
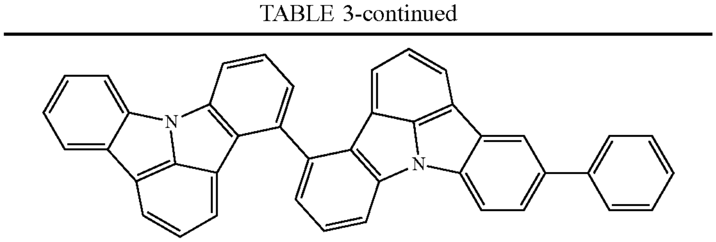
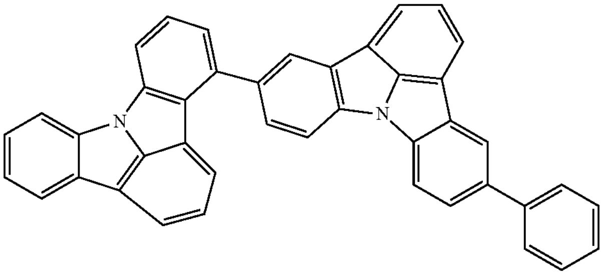 [SMILES: c1ccc(-c2ccc3c(c2)c2cccc4c5cc(-c6cccc7c6c6cccc8c9ccccc9n7c86)ccc5n3c24)cc1]
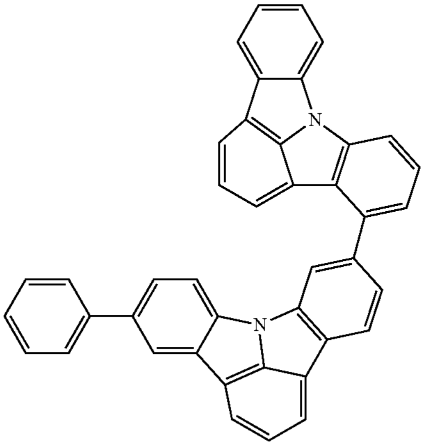 [SMILES: c1ccc(-c2ccc3c(c2)c2cccc4c5ccc(-c6cccc7c6c6cccc8c9ccccc9n7c86)cc5n3c24)cc1]
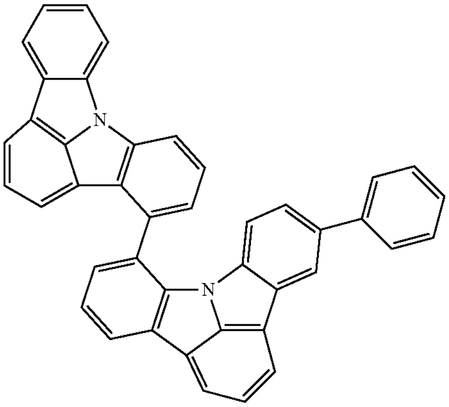 [SMILES: c1ccc(-c2ccc3c(c2)c2cccc4c5cccc(-c6cccc7c6c6cccc8c9ccccc9n7c86)c5n3c24)cc1]
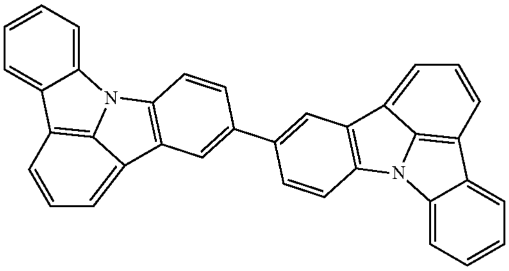 [SMILES: c1ccc2c(c1)c1cccc3c4cc(-c5ccc6c(c5)c5cccc7c8ccccc8n6c75)ccc4n2c13]

TABLE 3-continued
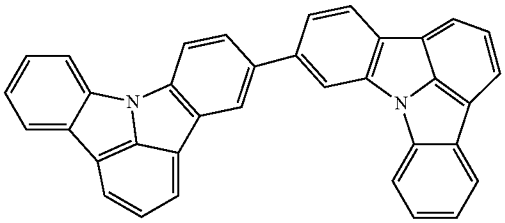 [SMILES: c1ccc2c(c1)c1cccc3c4cc(-c5ccc6c7cccc8c9ccccc9n(c6c5)c87)ccc4n2c13]
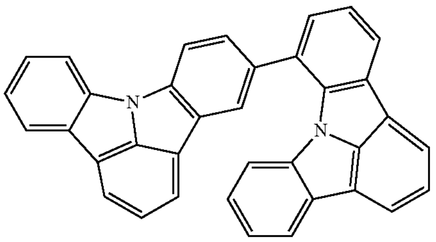 [SMILES: c1ccc2c(c1)c1cccc3c4cc(-c5cccc6c7cccc8c9ccccc9n(c56)c87)ccc4n2c13]
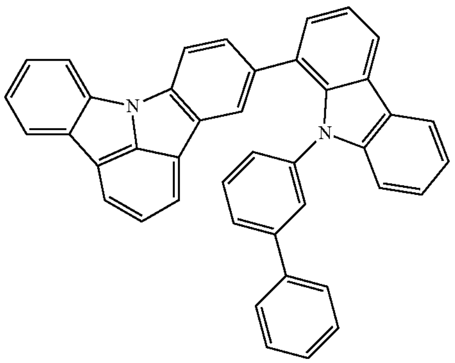 [SMILES: c1ccc(-c2cccc(-n3c4ccccc4c4cccc(-c5ccc6c(c5)c5cccc7c8ccccc8n6c75)c43)c2)cc1]
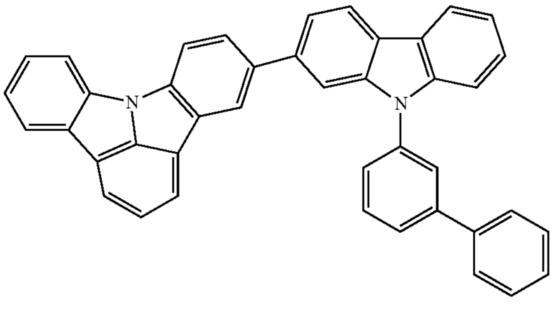 [SMILES: c1ccc(-c2cccc(-n3c4ccccc4c4ccc(-c5ccc6c(c5)c5cccc7c8ccccc8n6c75)cc43)c2)cc1]
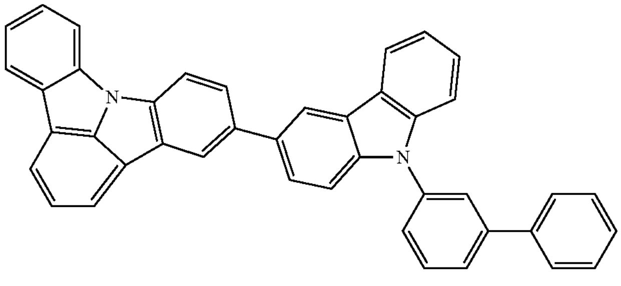 [SMILES: c1ccc(-c2cccc(-n3c4ccccc4c4cc(-c5ccc6c(c5)c5cccc7c8ccccc8n6c75)ccc43)c2)cc1]

TABLE 3-continued
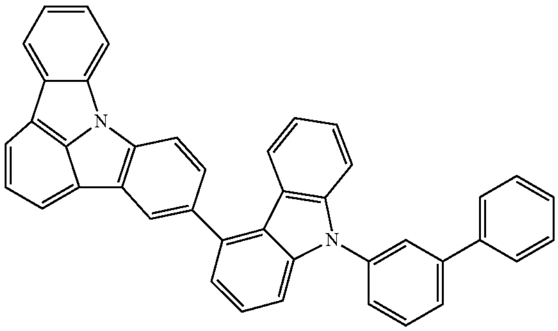 [SMILES: c1ccc(-c2cccc(-n3c4ccccc4c4c(-c5ccc6c(c5)c5cccc7c8ccccc8n6c75)cccc43)c2)cc1]
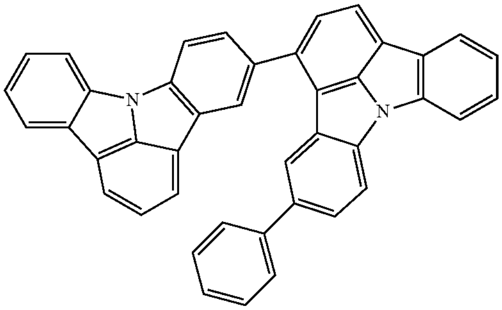 [SMILES: c1ccc(-c2ccc3c(c2)c2c(-c4ccc5c(c4)c4cccc6c7ccccc7n5c64)ccc4c5ccccc5n3c42)cc1]
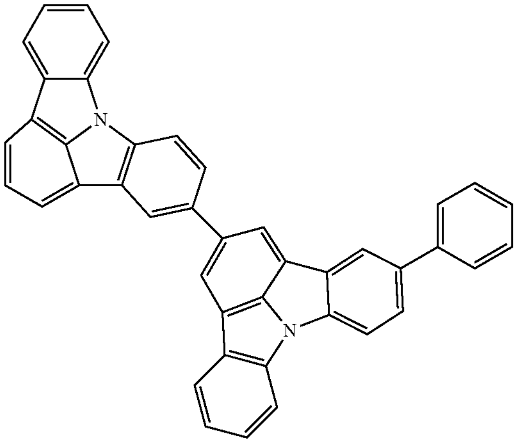 [SMILES: c1ccc(-c2ccc3c(c2)c2cc(-c4ccc5c(c4)c4cccc6c7ccccc7n5c64)cc4c5ccccc5n3c42)cc1]
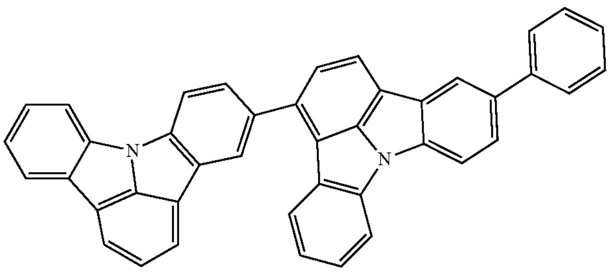 [SMILES: c1ccc(-c2ccc3c(c2)c2ccc(-c4ccc5c(c4)c4cccc6c7ccccc7n5c64)c4c5ccccc5n3c24)cc1]

TABLE 3-continued
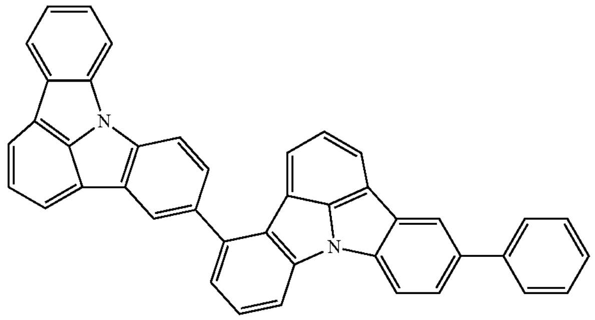 [SMILES: c1ccc(-c2ccc3c(c2)c2cccc4c5c(-c6ccc7c(c6)c6cccc8c9ccccc9n7c86)cccc5n3c24)cc1]
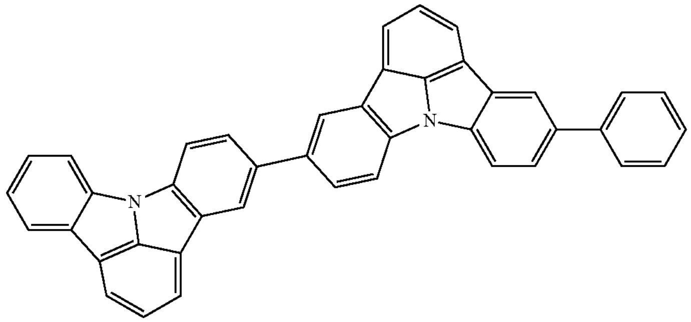 [SMILES: c1ccc(-c2ccc3c(c2)c2cccc4c5cc(-c6ccc7c(c6)c6cccc8c9ccccc9n7c86)ccc5n3c24)cc1]
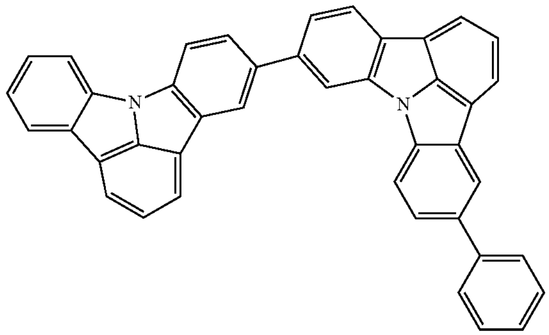 [SMILES: c1ccc(-c2ccc3c(c2)c2cccc4c5ccc(-c6ccc7c(c6)c6cccc8c9ccccc9n7c86)cc5n3c24)cc1]
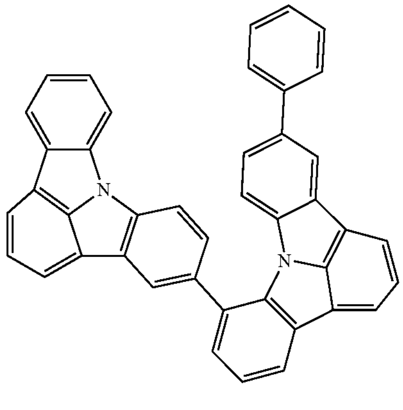 [SMILES: c1ccc(-c2ccc3c(c2)c2cccc4c5cccc(-c6ccc7c(c6)c6cccc8c9ccccc9n7c86)c5n3c24)cc1]

TABLE 3-continued
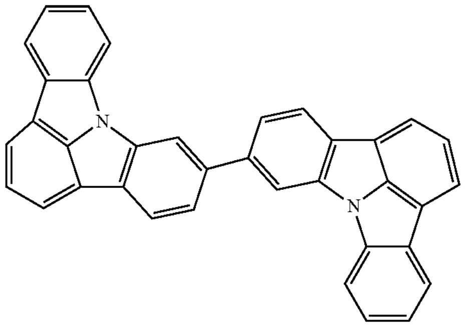 [SMILES: c1ccc2c(c1)c1cccc3c4ccc(-c5ccc6c7cccc8c9ccccc9n(c6c5)c87)cc4n2c13]
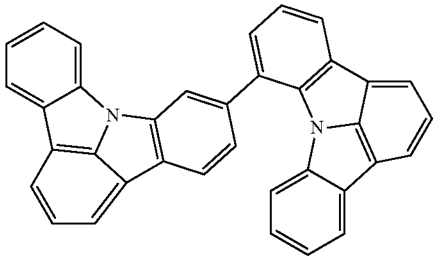 [SMILES: c1ccc2c(c1)c1cccc3c4ccc(-c5cccc6c7cccc8c9ccccc9n(c56)c87)cc4n2c13]
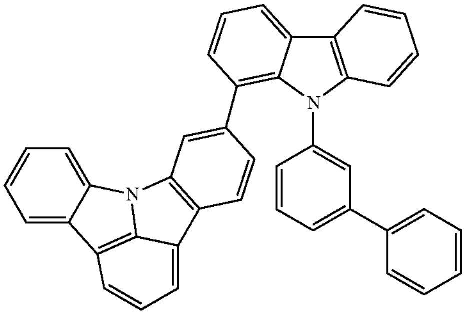 [SMILES: c1ccc(-c2cccc(-n3c4ccccc4c4cccc(-c5ccc6c7cccc8c9ccccc9n(c6c5)c87)c43)c2)cc1]
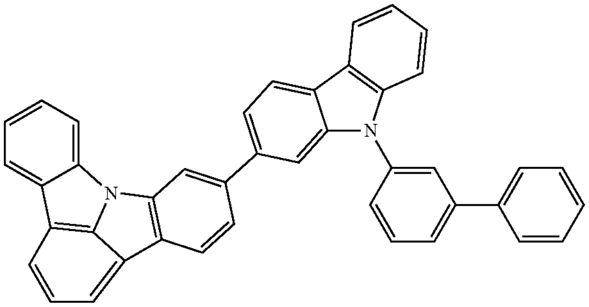 [SMILES: c1ccc(-c2cccc(-n3c4ccccc4c4ccc(-c5ccc6c7cccc8c9ccccc9n(c6c5)c87)cc43)c2)cc1]
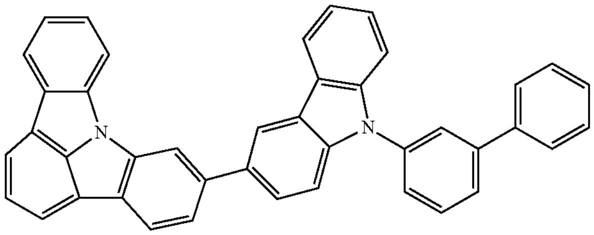 [SMILES: c1ccc(-c2cccc(-n3c4ccccc4c4cc(-c5ccc6c7cccc8c9ccccc9n(c6c5)c87)ccc43)c2)cc1]

TABLE 3-continued
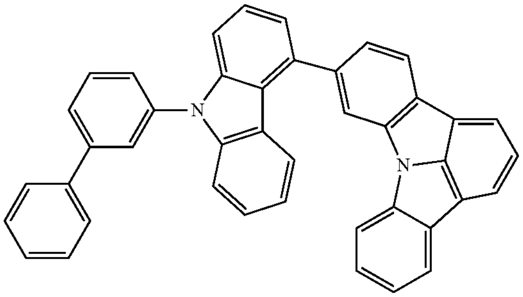 [SMILES: c1ccc(-c2cccc(-n3c4ccccc4c4c(-c5ccc6c7cccc8c9ccccc9n(c6c5)c87)cccc43)c2)cc1]
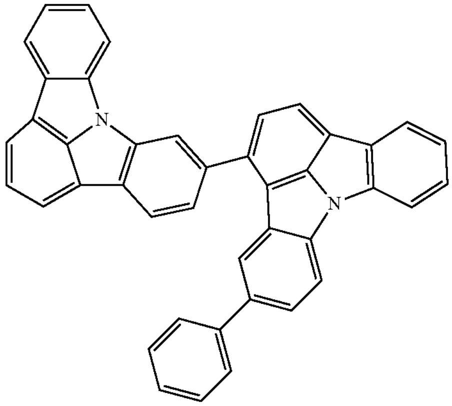 [SMILES: c1ccc(-c2ccc3c(c2)c2c(-c4ccc5c6cccc7c8ccccc8n(c5c4)c76)ccc4c5ccccc5n3c42)cc1]
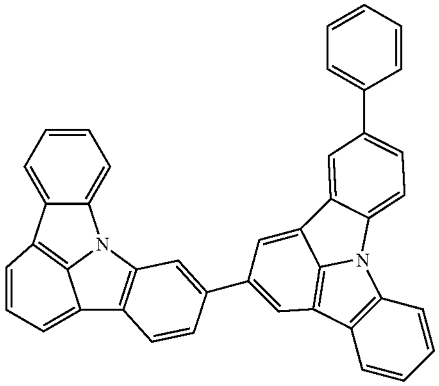 [SMILES: c1ccc(-c2ccc3c(c2)c2cc(-c4ccc5c6cccc7c8ccccc8n(c5c4)c76)cc4c5ccccc5n3c42)cc1]
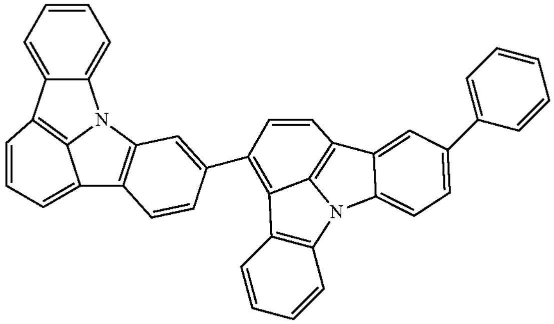 [SMILES: c1ccc(-c2ccc3c(c2)c2ccc(-c4ccc5c6cccc7c8ccccc8n(c5c4)c76)c4c5ccccc5n3c24)cc1]

TABLE 3-continued
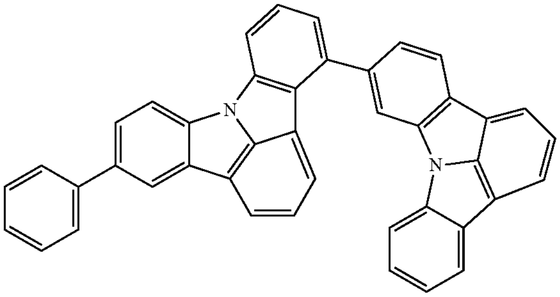 [SMILES: c1ccc(-c2ccc3c(c2)c2cccc4c5c(-c6ccc7c8cccc9c%10ccccc%10n(c7c6)c98)cccc5n3c24)cc1]
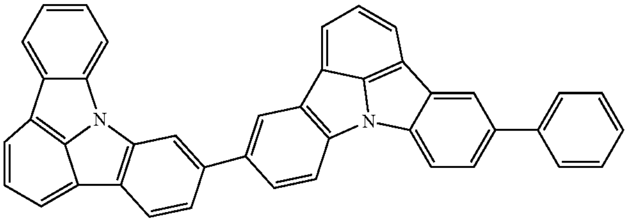 [SMILES: c1ccc(-c2ccc3c(c2)c2cccc4c5cc(-c6ccc7c8cccc9c%10ccccc%10n(c7c6)c98)ccc5n3c24)cc1]
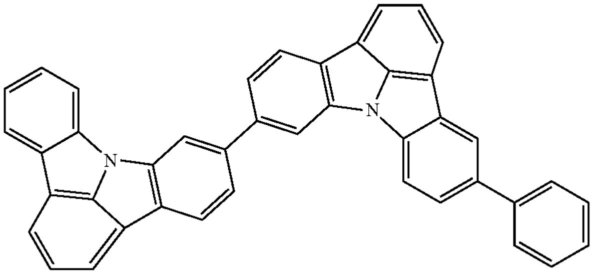 [SMILES: c1ccc(-c2ccc3c(c2)c2cccc4c5ccc(-c6ccc7c8cccc9c%10ccccc%10n(c7c6)c98)cc5n3c24)cc1]
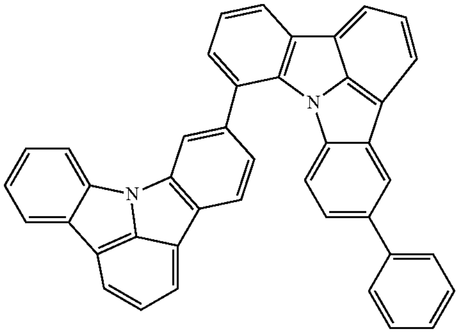 [SMILES: c1ccc(-c2ccc3c(c2)c2cccc4c5cccc(-c6ccc7c8cccc9c%10ccccc%10n(c7c6)c98)c5n3c24)cc1]
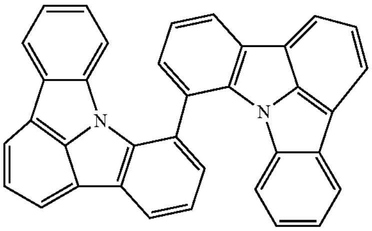 [SMILES: c1ccc2c(c1)c1cccc3c4cccc(-c5cccc6c7cccc8c9ccccc9n(c56)c87)c4n2c13]

TABLE 3-continued
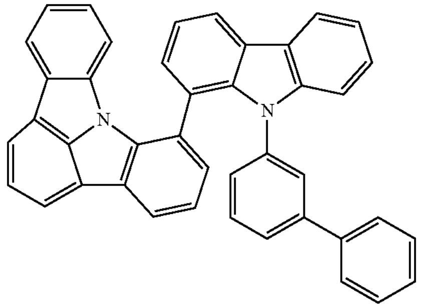 [SMILES: c1ccc(-c2cccc(-n3c4ccccc4c4cccc(-c5cccc6c7cccc8c9ccccc9n(c56)c87)c43)c2)cc1]
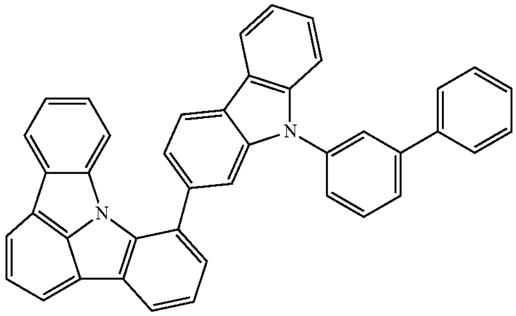 [SMILES: c1ccc(-c2cccc(-n3c4ccccc4c4ccc(-c5cccc6c7cccc8c9ccccc9n(c56)c87)cc43)c2)cc1]
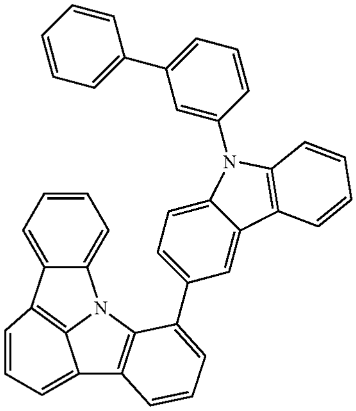 [SMILES: c1ccc(-c2cccc(-n3c4ccccc4c4cc(-c5cccc6c7cccc8c9ccccc9n(c56)c87)ccc43)c2)cc1]
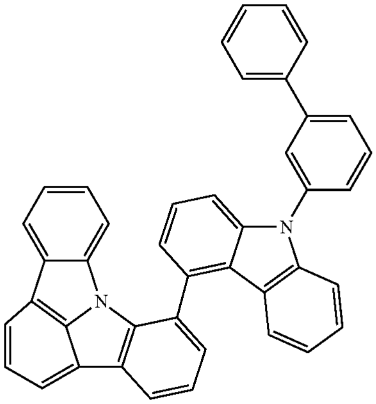 [SMILES: c1ccc(-c2cccc(-n3c4ccccc4c4c(-c5cccc6c7cccc8c9ccccc9n(c56)c87)cccc43)c2)cc1]

TABLE 3-continued
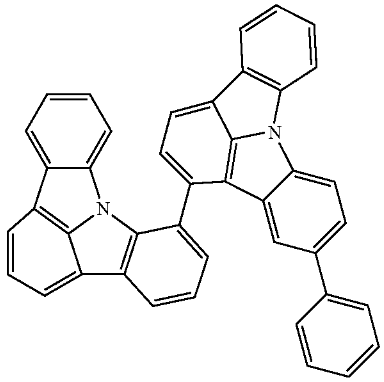 [SMILES: c1ccc(-c2ccc3c(c2)c2c(-c4cccc5c6cccc7c8ccccc8n(c45)c76)ccc4c5ccccc5n3c42)cc1]
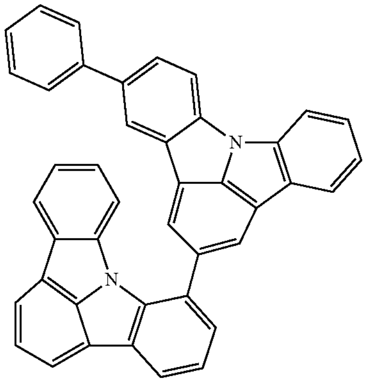 [SMILES: c1ccc(-c2ccc3c(c2)c2cc(-c4cccc5c6cccc7c8ccccc8n(c45)c76)cc4c5ccccc5n3c42)cc1]
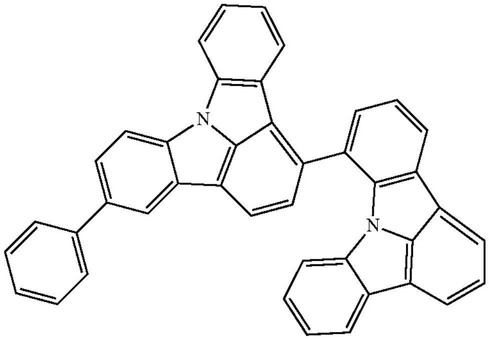 [SMILES: c1ccc(-c2ccc3c(c2)c2ccc(-c4cccc5c6cccc7c8ccccc8n(c45)c76)c4c5ccccc5n3c24)cc1]
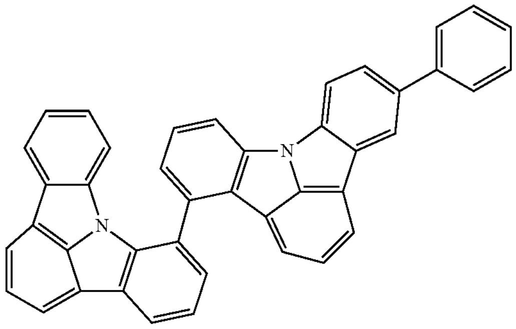 [SMILES: c1ccc(-c2ccc3c(c2)c2cccc4c5c(-c6cccc7c8cccc9c%10ccccc%10n(c67)c98)cccc5n3c24)cc1]

TABLE 3-continued
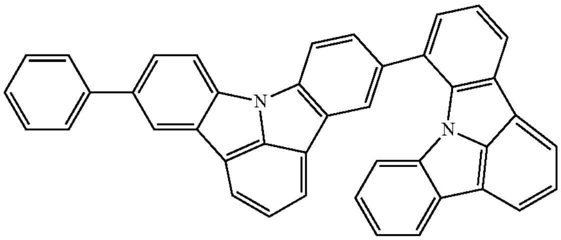 [SMILES: c1ccc(-c2ccc3c(c2)c2cccc4c5cc(-c6cccc7c8cccc9c%10ccccc%10n(c67)c98)ccc5n3c24)cc1]
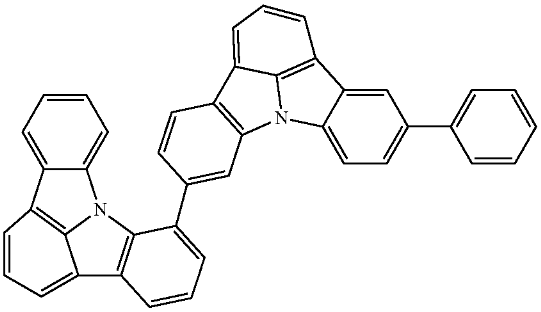 [SMILES: c1ccc(-c2ccc3c(c2)c2cccc4c5ccc(-c6cccc7c8cccc9c%10ccccc%10n(c67)c98)cc5n3c24)cc1]
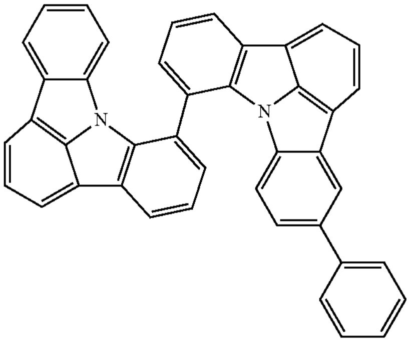 [SMILES: c1ccc(-c2ccc3c(c2)c2cccc4c5cccc(-c6cccc7c8cccc9c%10ccccc%10n(c67)c98)c5n3c24)cc1]
Particularly suitable compounds of the formula (2) that are preferably used in combination with at least one compound of the formula (1) in the electroluminescent device of the invention are the compounds H1 to H21 of table 4.
TABLE 4
H1
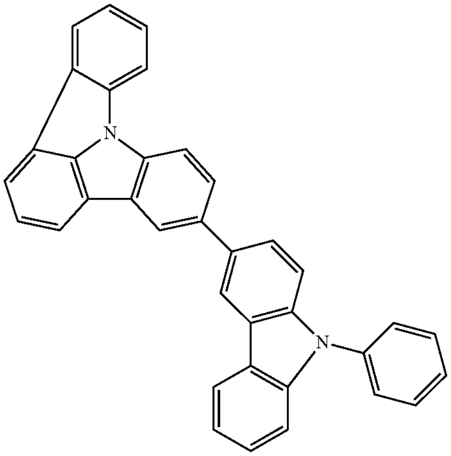 [SMILES: c1ccc(-n2c3ccccc3c3cc(-c4ccc5c(c4)c4cccc6c7ccccc7n5c64)ccc32)cc1]

TABLE 4-continued
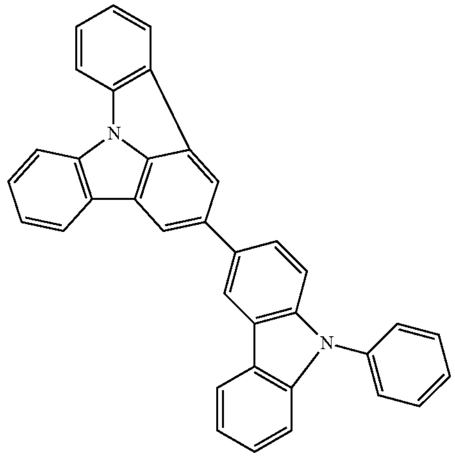 [SMILES: c1ccc(-n2c3ccccc3c3cc(-c4cc5c6ccccc6n6c7ccccc7c(c4)c56)ccc32)cc1]
H2
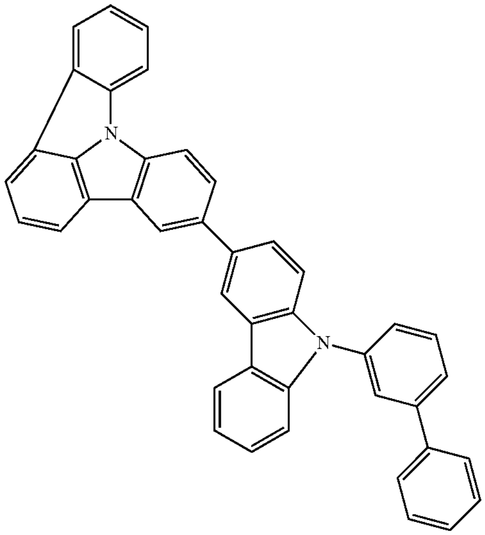 [SMILES: c1ccc(-c2cccc(-n3c4ccccc4c4cc(-c5ccc6c(c5)c5cccc7c8ccccc8n6c75)ccc43)c2)cc1]
H3
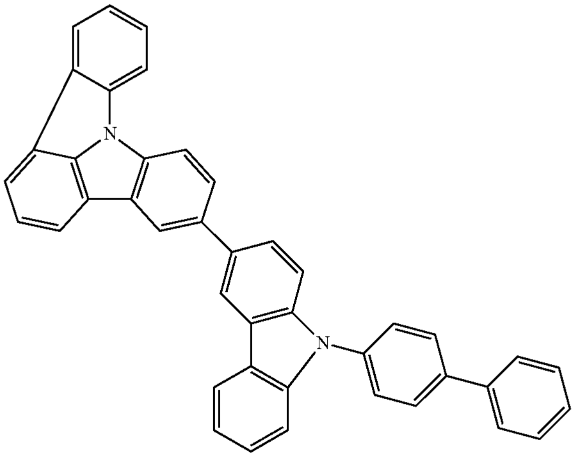 [SMILES: c1ccc(-c2ccc(-n3c4ccccc4c4cc(-c5ccc6c(c5)c5cccc7c8ccccc8n6c75)ccc43)cc2)cc1]
H4

TABLE 4-continued
H5
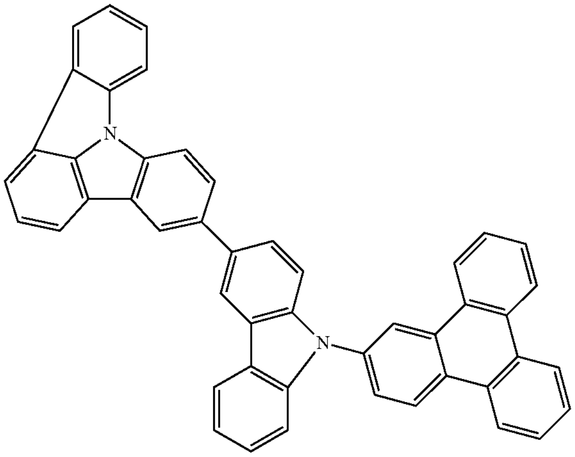 [SMILES: c1ccc2c(c1)c1ccccc1c1cc(-n3c4ccccc4c4cc(-c5ccc6c(c5)c5cccc7c8ccccc8n6c75)ccc43)ccc21]
H6
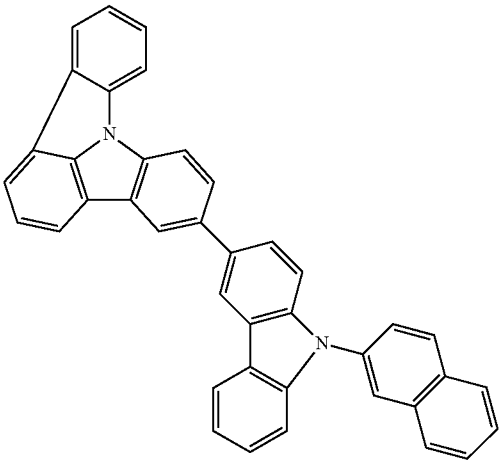 [SMILES: c1ccc2cc(-n3c4ccccc4c4cc(-c5ccc6c(c5)c5cccc7c8ccccc8n6c75)ccc43)ccc2c1]
H7
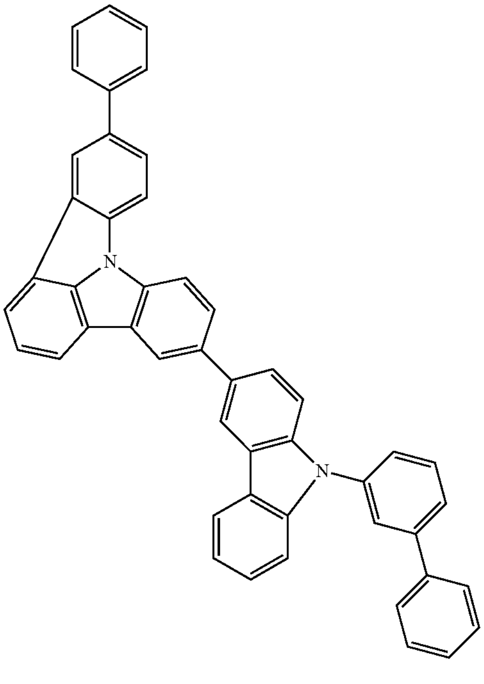 [SMILES: c1ccc(-c2cccc(-n3c4ccccc4c4cc(-c5ccc6c(c5)c5cccc7c8cc(-c9ccccc9)ccc8n6c75)ccc43)c2)cc1]

TABLE 4-continued
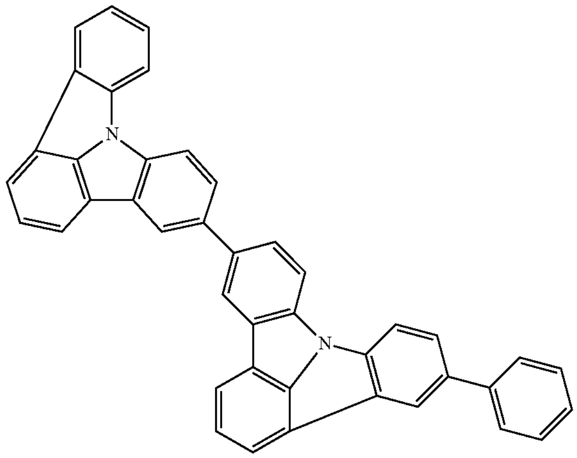 [SMILES: c1ccc(-c2ccc3c(c2)c2cccc4c5cc(-c6ccc7c(c6)c6cccc8c9ccccc9n7c86)ccc5n3c24)cc1]
H8
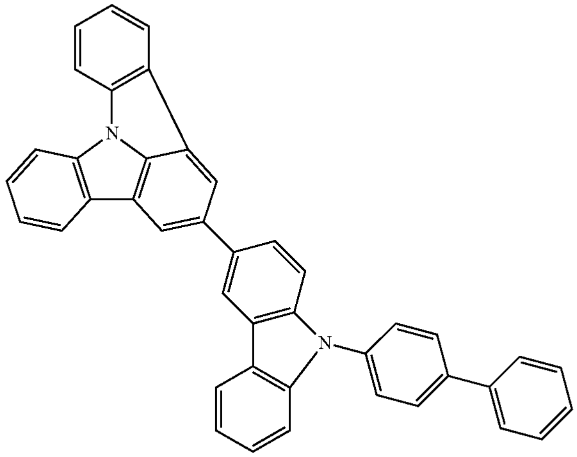 [SMILES: c1ccc(-c2ccc(-n3c4ccccc4c4cc(-c5cc6c7ccccc7n7c8ccccc8c(c5)c67)ccc43)cc2)cc1]
H9
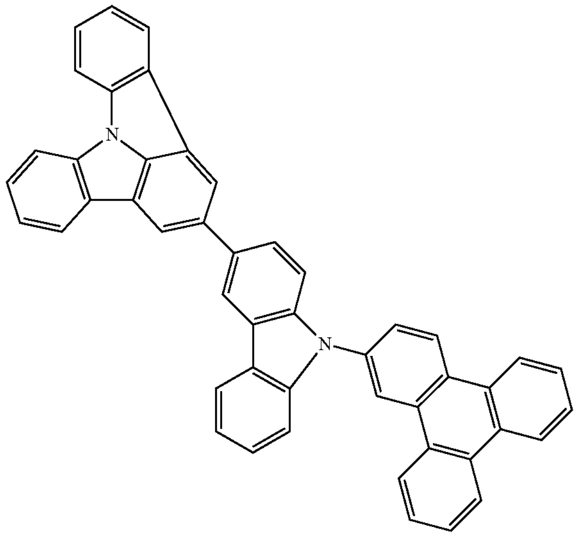 [SMILES: c1ccc2c(c1)c1ccccc1c1cc(-n3c4ccccc4c4cc(-c5cc6c7ccccc7n7c8ccccc8c(c5)c67)ccc43)ccc21]
H10

TABLE 4-continued
H11
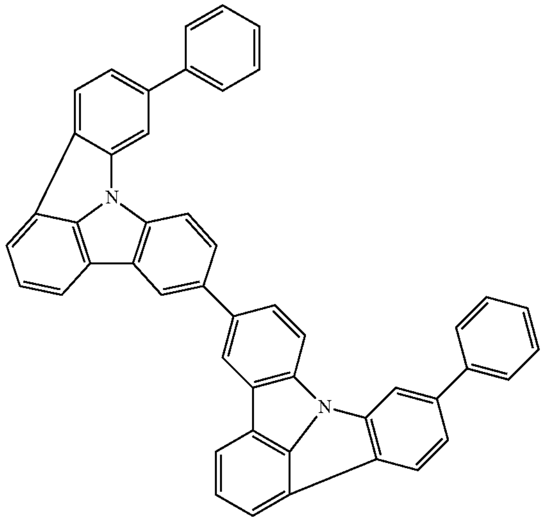 [SMILES: c1ccc(-c2ccc3c4cccc5c6cc(-c7ccc8c(c7)c7cccc9c%10ccc(-c%11ccccc%11)cc%10n8c79)ccc6n(c3c2)c54)cc1]
H12
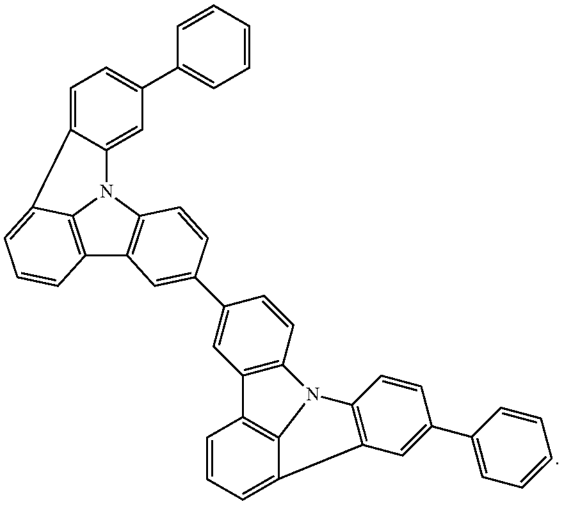 [SMILES: c1ccc(-c2ccc3c(c2)c2cccc4c5cc(-c6ccc7c(c6)c6cccc8c9ccc(-c%10ccccc%10)cc9n7c68)ccc5n3c24)cc1]
H13
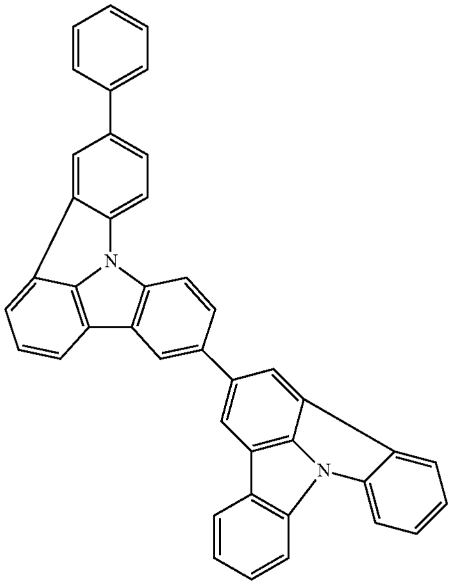 [SMILES: c1ccc(-c2ccc3c(c2)c2cccc4c5cc(-c6cc7c8ccccc8n8c9ccccc9c(c6)c78)ccc5n3c24)cc1]

TABLE 4-continued
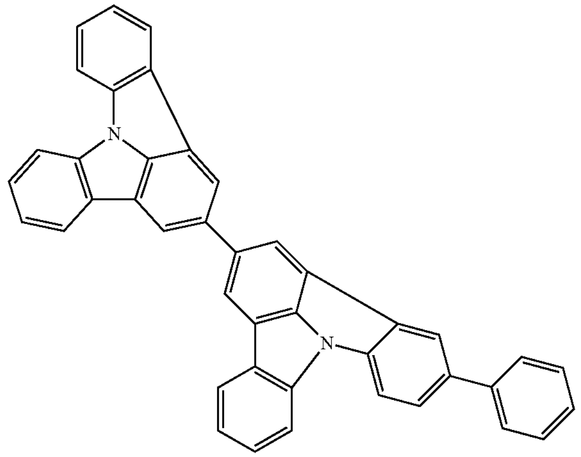 [SMILES: c1ccc(-c2ccc3c(c2)c2cc(-c4cc5c6ccccc6n6c7ccccc7c(c4)c56)cc4c5ccccc5n3c42)cc1]
H14
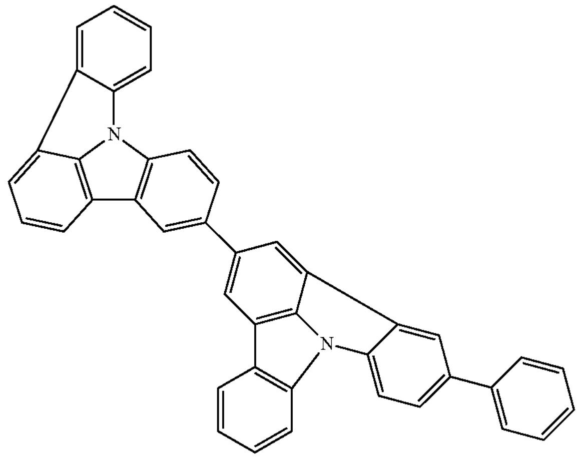 [SMILES: c1ccc(-c2ccc3c(c2)c2cc(-c4ccc5c(c4)c4cccc6c7ccccc7n5c64)cc4c5ccccc5n3c42)cc1]
H15
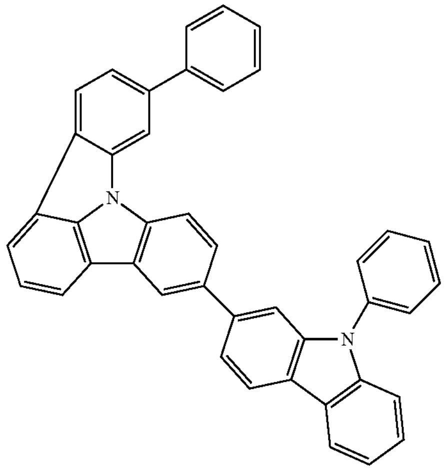 [SMILES: c1ccc(-c2ccc3c4cccc5c6cc(-c7ccc8c9ccccc9n(-c9ccccc9)c8c7)ccc6n(c3c2)c54)cc1]
H16

TABLE 4-continued
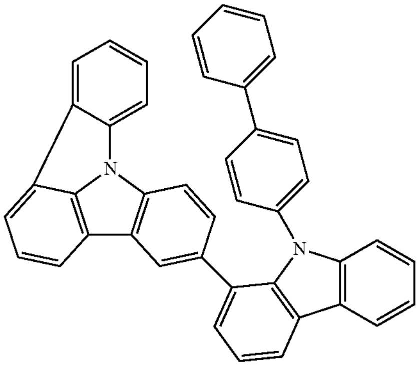 [SMILES: c1ccc(-c2ccc(-n3c4ccccc4c4cccc(-c5ccc6c(c5)c5cccc7c8ccccc8n6c75)c43)cc2)cc1]
H17
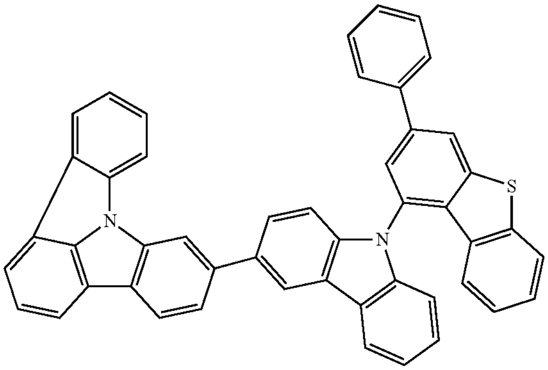 [SMILES: c1ccc(-c2cc(-n3c4ccccc4c4cc(-c5ccc6c7cccc8c9ccccc9n(c6c5)c87)ccc43)c3c(c2)sc2ccccc23)cc1]
H18
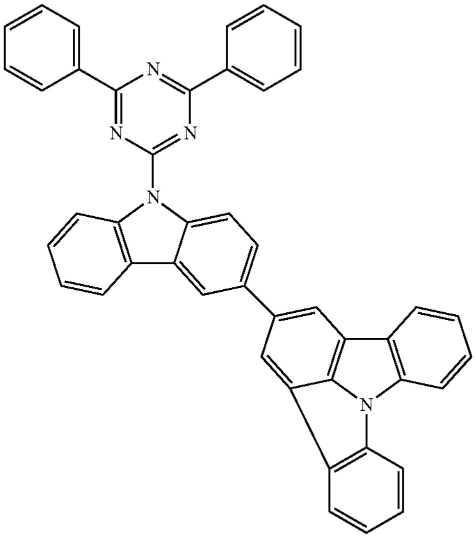 [SMILES: c1ccc(-c2nc(-c3ccccc3)nc(-n3c4ccccc4c4cc(-c5cc6c7ccccc7n7c8ccccc8c(c5)c67)ccc43)n2)cc1]
H19

TABLE 4-continued

H20

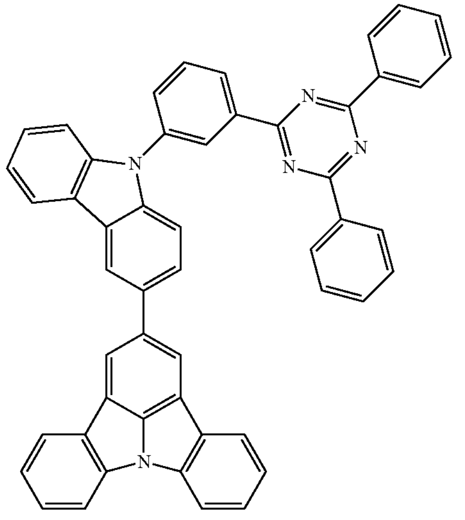 [SMILES: c1ccc(-c2nc(-c3ccccc3)nc(-c3cccc(-n4c5ccccc5c5cc(-c6cc7c8ccccc8n8c9ccccc9c(c6)c78)ccc54)c3)n2)cc1]

H21

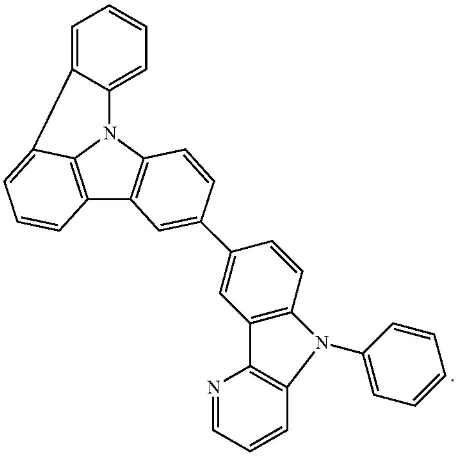 [SMILES: c1ccc(-n2c3ccc(-c4ccc5c(c4)c4cccc6c7ccccc7n5c64)cc3c3ncccc32)cc1]

Very particularly suitable compounds of the formula (2) that are preferably used in the electroluminescent device of the invention in combination with at least one compound of the formula (1) are the compounds H1, H3, H4, H5, H6, H7, H8, H11 and H12.

The preparation of the compounds of the formula (2) or of the preferred compounds of the formulae (2), (2a), (2b), (2c), (2d) and (2e) and of the compounds from table 3 and compounds H1 to H21 is known to the person skilled in the art. The compounds can be prepared by synthesis steps known to those skilled in the art, for example bromination, Suzuki coupling, Ullmann coupling, Hartwig-Buchwald coupling, etc. A suitable synthesis method is shown in general terms in scheme 2 below, where the symbols and indices used have the definitions given above.

Scheme 2

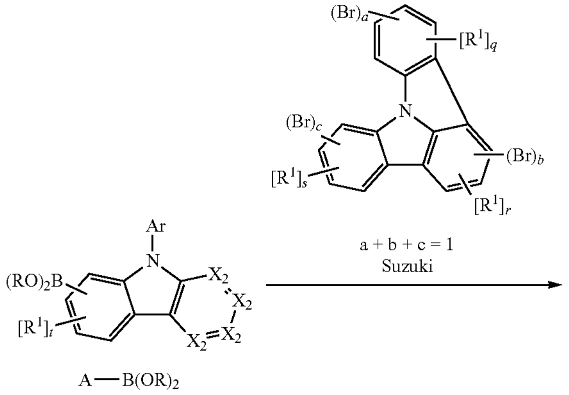

-continued

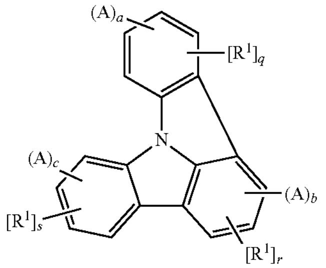

a + b + c = 1

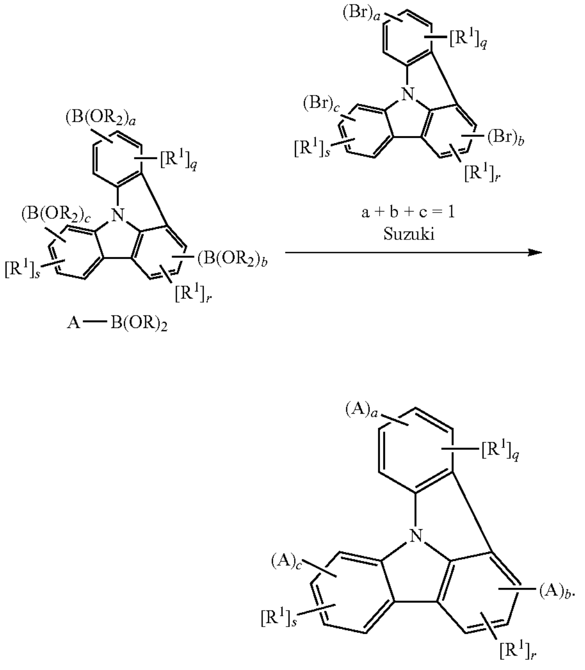

a + b + c = 1

The aforementioned host materials of the formula (1) and the embodiments thereof that are described as preferred or the compounds from table 1 and the compounds E1 to E54 can be combined as desired in the device of the invention with the host materials of the formulae (2), (2a), (2b), (2c), (2d) and (2e) mentioned and the embodiments thereof that are described as preferred or the compounds from table 3 or the compounds H1 to H21.

The invention likewise further provides mixtures comprising at least one compound of the formula (1) as host material 1 and at least one compound of the formula (2) as host material 2

Formula (1)

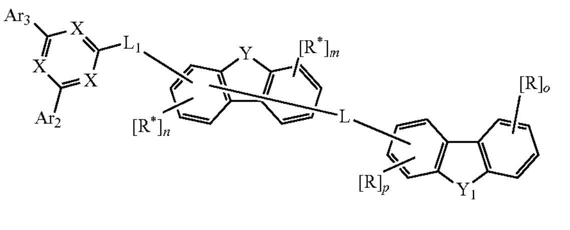

-continued

Formula (2)

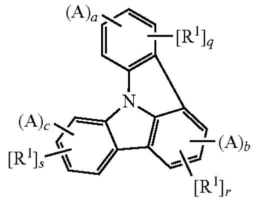

where the symbols and indices used are as follows:

X is the same or different at each instance and is $CR^0$ or N, where at least one symbol X is N;

$X_2$ is the same or different at each instance and is CH, $CR^1$ or N, where not more than 2 symbols $X_2$ can be N;

Y and $Y_1$ are the same or different at each instance and are selected from O and S;

L is the same or different at each instance and is a single bond or an aromatic ring system having 6 to 30 aromatic ring atoms;

$L_1$ is the same or different at each instance and is a single bond or an aromatic or heteroaromatic ring system having 5 to 30 aromatic ring atoms;

$R^0$ at each instance is independently H, D or an unsubstituted or partly or fully deuterated aromatic ring system having 6 to 18 carbon atoms;

R* at each instance is independently D or an aromatic or heteroaromatic ring system that has 6 to 18 carbon atoms and may be partly or fully deuterated;

R #is the same or different at each instance and is selected from the group consisting of D, F, Cl, Br, I, CN, $NO_2$, $C(=O)R^2$, $P(=O)(Ar_1)_2$, $P(Ar_1)_2$, $B(Ar_1)_2$, $Si(Ar_1)_3$, $Si(R^2)_3$, a straight-chain alkyl, alkoxy or thioalkyl group having 1 to 20 carbon atoms or a branched or cyclic alkyl, alkoxy or thioalkyl group having 3 to 20 carbon atoms or an alkenyl group having 2 to 20 carbon atoms, each of which may be substituted by one or more $R^2$ radicals, where one or more nonadjacent $CH_2$ groups may be replaced by $R^2C{=}CR^2$, $Si(R^2)_2$, C=O, C=S, $C{=}NR^2$, $P(=O)(R^2)$, SO, $SO_2$, $NR^2$, O, S or $CONR^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals;

R is the same or different at each instance and is selected from the CN group, an aromatic ring system having 6 to 40 aromatic ring atoms and a heteroaromatic ring system having 10 to 40 aromatic ring atoms, where the ring systems may be substituted by one or more $R^2$ radicals and where the heteroaromatic ring system is bonded via N when the heteroaromatic ring system contains a nitrogen atom;

$R^1$ is the same or different at each instance and is selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, or an aryloxy or heteroaryloxy group having 5 to 40 aromatic ring atoms, or an aralkyl or heteroaralkyl group having 5 to 40 aromatic ring atoms; at the same time, it is possible for two substituents bonded to the same carbon atom or to adjacent carbon atoms to form a monocyclic or polycyclic, aliphatic, aromatic or heteroaromatic ring system that may be substituted by one or more $R^2$ radicals;

$R^2$ is the same or different at each instance and is selected from the group consisting of H, D, F, Cl, Br, I, CN, $NO_2$, $N(Ar_1)_2$, $NH_2$, $N(R^3)_2$, $C(=O)Ar_1$, $C(=O)H$, $C(=O)R^3$, $P(=O)(Ar_1)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^3$ radicals, where one or more nonadjacent $CH_2$ groups may be replaced by $HC=CH$, $R^3C=CR^3$, $C\equiv C$, $Si(R^3)_2$, $Ge(R^3)_2$, $Sn(R^3)_2$, $C=O$, $C=S$, $C=Se$, $C=NR^3$, $P(=O)(R^3)$, SO, $SO_2$, NH, $NR^3$, O, S, CONH or $CONR^3$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^3$ radicals, an aryloxy or heteroaryloxy group which has 5 to 60 aromatic ring atoms and may be substituted by one or more $R^3$ radicals, or a combination of these systems, where it is optionally possible for two or more adjacent substituents $R^2$ to form a monocyclic or polycyclic, aliphatic, aromatic or heteroaromatic ring system which may be substituted by one or more $R^3$ radicals;

$R^3$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F, Cl, Br, I or CN and which may be substituted by one or more alkyl groups each having 1 to 4 carbon atoms; at the same time, it is possible for two or more adjacent $R^3$ substituents together to form a mono- or polycyclic, aliphatic ring system;

$Ar_1$ is the same or different at each instance and is an aromatic or heteroaromatic ring system which has 5 to 30 aromatic ring atoms and may be substituted by one or more nonaromatic $R^3$ radicals; at the same time, two $Ar_1$ radicals bonded to the same nitrogen atom, phosphorus atom or boron atom may also be bridged to one another by a single bond or a bridge selected from $N(R^3)$, $C(R^3)_2$, O and S;

$Ar_2$ and $Ar_3$ at each instance are each independently an aryl or heteroaryl group which has 5 to 40 aromatic ring atoms and may be substituted by one or more $R^2$ radicals;

A at each instance is independently a group of the formula (3) or (4),

Formula (3)

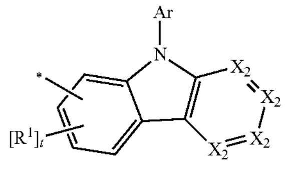

-continued

Formula (4)

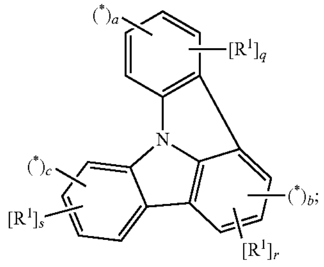

Ar at each instance is in each case independently an aryl group which has 6 to 40 aromatic ring atoms and may be substituted by one or more R #radicals, or a heteroaryl group which has 5 to 40 aromatic ring atoms and may be substituted by one or more R #radicals;

* indicates the binding site to the formula (2);

a, b, c at each instance are each independently 0 or 1, where the sum total of the indices at each instance a+b+c is 1;

m and o at each instance are independently 0, 1, 2, 3 or 4;

n and p at each instance are each independently 0, 1, 2 or 3; and q, r, s, t at each instance are each independently 0 or 1.

The details with regard to the host materials of the formulae (1) and (2) and the preferred embodiments thereof are correspondingly also applicable to the mixture of the invention.

Particularly preferred mixtures of the host materials of the formula (1) with the host materials of the formula (2) for the device of the invention are obtained by combination of the compounds E1 to E54 with the compounds from table 3.

Very particularly preferred mixtures of the host materials of the formula (1) with the host materials of the formula (2) for the device of the invention are obtained by combination of the compounds E1 to E54 with the compounds H1 to H21, as shown hereinafter in table 5.

TABLE 5

| | | | | | | | | |
|---|---|---|---|---|---|---|---|---|
| M1 | E1 | H1 | M2 | E2 | H1 | M3 | E3 | H1 |
| M4 | E4 | H1 | M5 | E5 | H1 | M6 | E6 | H1 |
| M7 | E7 | H1 | M8 | E8 | H1 | M9 | E9 | H1 |
| M10 | E10 | H1 | M11 | E11 | H1 | M12 | E12 | H1 |
| M13 | E13 | H1 | M14 | E14 | H1 | M15 | E15 | H1 |
| M16 | E16 | H1 | M17 | E17 | H1 | M18 | E18 | H1 |
| M19 | E19 | H1 | M20 | E20 | H1 | M21 | E21 | H1 |
| M22 | E22 | H1 | M23 | E23 | H1 | M24 | E24 | H1 |
| M25 | E25 | H1 | M26 | E26 | H1 | M27 | E27 | H1 |
| M28 | E28 | H1 | M29 | E29 | H1 | M30 | E30 | H1 |
| M31 | E31 | H1 | M32 | E32 | H1 | M33 | E33 | H1 |
| M34 | E34 | H1 | M35 | E35 | H1 | M36 | E36 | H1 |
| M37 | E37 | H1 | M38 | E38 | H1 | M39 | E39 | H1 |
| M40 | E40 | H1 | M41 | E41 | H1 | M42 | E42 | H1 |
| M43 | E1 | H2 | M44 | E2 | H2 | M45 | E3 | H2 |
| M46 | E4 | H2 | M47 | E5 | H2 | M48 | E6 | H2 |
| M49 | E7 | H2 | M50 | E8 | H2 | M51 | E9 | H2 |
| M52 | E10 | H2 | M53 | E11 | H2 | M54 | E12 | H2 |
| M55 | E13 | H2 | M56 | E14 | H2 | M57 | E15 | H2 |
| M58 | E16 | H2 | M59 | E17 | H2 | M60 | E18 | H2 |
| M61 | E19 | H2 | M62 | E20 | H2 | M63 | E21 | H2 |
| M64 | E22 | H2 | M65 | E23 | H2 | M66 | E24 | H2 |
| M67 | E25 | H2 | M68 | E26 | H2 | M69 | E27 | H2 |
| M70 | E28 | H2 | M71 | E29 | H2 | M72 | E30 | H2 |
| M73 | E31 | H2 | M74 | E32 | H2 | M75 | E33 | H2 |
| M76 | E34 | H2 | M77 | E35 | H2 | M78 | E36 | H2 |
| M79 | E37 | H2 | M80 | E38 | H2 | M81 | E39 | H2 |
| M82 | E40 | H2 | M83 | E41 | H2 | M84 | E42 | H2 |

TABLE 5-continued

| | | | | | | | | |
|---|---|---|---|---|---|---|---|---|
| M85 | E1 | H3 | M86 | E2 | H3 | M87 | E3 | H3 |
| M88 | E4 | H3 | M89 | E5 | H3 | M90 | E6 | H3 |
| M91 | E7 | H3 | M92 | E8 | H3 | M93 | E9 | H3 |
| M94 | E10 | H3 | M95 | E11 | H3 | M96 | E12 | H3 |
| M97 | E13 | H3 | M98 | E14 | H3 | M99 | E15 | H3 |
| M100 | E16 | H3 | M101 | E17 | H3 | M102 | E18 | H3 |
| M103 | E19 | H3 | M104 | E20 | H3 | M105 | E21 | H3 |
| M106 | E22 | H3 | M107 | E23 | H3 | M108 | E24 | H3 |
| M109 | E25 | H3 | M110 | E26 | H3 | M111 | E27 | H3 |
| M112 | E28 | H3 | M113 | E29 | H3 | M114 | E30 | H3 |
| M115 | E31 | H3 | M116 | E32 | H3 | M117 | E33 | H3 |
| M118 | E34 | H3 | M119 | E35 | H3 | M120 | E36 | H3 |
| M121 | E37 | H3 | M122 | E38 | H3 | M123 | E39 | H3 |
| M124 | E40 | H3 | M125 | E41 | H3 | M126 | E42 | H3 |
| M127 | E1 | H4 | M128 | E2 | H4 | M129 | E3 | H4 |
| M130 | E4 | H4 | M131 | E5 | H4 | M132 | E6 | H4 |
| M133 | E7 | H4 | M134 | E8 | H4 | M135 | E9 | H4 |
| M136 | E10 | H4 | M137 | E11 | H4 | M138 | E12 | H4 |
| M139 | E13 | H4 | M140 | E14 | H4 | M141 | E15 | H4 |
| M142 | E16 | H4 | M143 | E17 | H4 | M144 | E18 | H4 |
| M145 | E19 | H4 | M146 | E20 | H4 | M147 | E21 | H4 |
| M148 | E22 | H4 | M149 | E23 | H4 | M150 | E24 | H4 |
| M151 | E25 | H4 | M152 | E26 | H4 | M153 | E27 | H4 |
| M154 | E28 | H4 | M155 | E29 | H4 | M156 | E30 | H4 |
| M157 | E31 | H4 | M158 | E32 | H4 | M159 | E33 | H4 |
| M160 | E34 | H4 | M161 | E35 | H4 | M162 | E36 | H4 |
| M163 | E37 | H4 | M164 | E38 | H4 | M165 | E39 | H4 |
| M166 | E40 | H4 | M167 | E41 | H4 | M168 | E42 | H4 |
| M169 | E1 | H5 | M170 | E2 | H5 | M171 | E3 | H5 |
| M172 | E4 | H5 | M173 | E5 | H5 | M174 | E6 | H5 |
| M175 | E7 | H5 | M176 | E8 | H5 | M177 | E9 | H5 |
| M178 | E10 | H5 | M179 | E11 | H5 | M180 | E12 | H5 |
| M181 | E13 | H5 | M182 | E14 | H5 | M183 | E15 | H5 |
| M184 | E16 | H5 | M185 | E17 | H5 | M186 | E18 | H5 |
| M187 | E19 | H5 | M188 | E20 | H5 | M189 | E21 | H5 |
| M190 | E22 | H5 | M191 | E23 | H5 | M192 | E24 | H5 |
| M193 | E25 | H5 | M194 | E26 | H5 | M195 | E27 | H5 |
| M196 | E28 | H5 | M197 | E29 | H5 | M198 | E30 | H5 |
| M199 | E31 | H5 | M200 | E32 | H5 | M201 | E33 | H5 |
| M202 | E34 | H5 | M203 | E35 | H5 | M204 | E36 | H5 |
| M205 | E37 | H5 | M206 | E38 | H5 | M207 | E39 | H5 |
| M208 | E40 | H5 | M209 | E41 | H5 | M210 | E42 | H5 |
| M211 | E1 | H6 | M212 | E2 | H6 | M213 | E3 | H6 |
| M214 | E4 | H6 | M215 | E5 | H6 | M216 | E6 | H6 |
| M217 | E7 | H6 | M218 | E8 | H6 | M219 | E9 | H6 |
| M220 | E10 | H6 | M221 | E11 | H6 | M222 | E12 | H6 |
| M223 | E13 | H6 | M224 | E14 | H6 | M225 | E15 | H6 |
| M226 | E16 | H6 | M227 | E17 | H6 | M228 | E18 | H6 |
| M229 | E19 | H6 | M230 | E20 | H6 | M231 | E21 | H6 |
| M232 | E22 | H6 | M233 | E23 | H6 | M234 | E24 | H6 |
| M235 | E25 | H6 | M236 | E26 | H6 | M237 | E27 | H6 |
| M238 | E28 | H6 | M239 | E29 | H6 | M240 | E30 | H6 |
| M241 | E31 | H6 | M242 | E32 | H6 | M243 | E33 | H6 |
| M244 | E34 | H6 | M245 | E35 | H6 | M246 | E36 | H6 |
| M247 | E37 | H6 | M248 | E38 | H6 | M249 | E39 | H6 |
| M250 | E40 | H6 | M251 | E41 | H6 | M252 | E42 | H6 |
| M253 | E1 | H7 | M254 | E2 | H7 | M255 | E3 | H7 |
| M256 | E4 | H7 | M257 | E5 | H7 | M258 | E6 | H7 |
| M259 | E7 | H7 | M260 | E8 | H7 | M261 | E9 | H7 |
| M262 | E10 | H7 | M263 | E11 | H7 | M264 | E12 | H7 |
| M265 | E13 | H7 | M266 | E14 | H7 | M267 | E15 | H7 |
| M268 | E16 | H7 | M269 | E17 | H7 | M270 | E18 | H7 |
| M271 | E19 | H7 | M272 | E20 | H7 | M273 | E21 | H7 |
| M274 | E22 | H7 | M275 | E23 | H7 | M276 | E24 | H7 |
| M277 | E25 | H7 | M278 | E26 | H7 | M279 | E27 | H7 |
| M280 | E28 | H7 | M281 | E29 | H7 | M282 | E30 | H7 |
| M283 | E31 | H7 | M284 | E32 | H7 | M285 | E33 | H7 |
| M286 | E34 | H7 | M287 | E35 | H7 | M288 | E36 | H7 |
| M289 | E37 | H7 | M290 | E38 | H7 | M291 | E39 | H7 |
| M292 | E40 | H7 | M293 | E41 | H7 | M294 | E42 | H7 |
| M295 | E1 | H8 | M296 | E2 | H8 | M297 | E3 | H8 |
| M298 | E4 | H8 | M299 | E5 | H8 | M300 | E6 | H8 |
| M301 | E7 | H8 | M302 | E8 | H8 | M303 | E9 | H8 |
| M304 | E10 | H8 | M305 | E11 | H8 | M306 | E12 | H8 |
| M307 | E13 | H8 | M308 | E14 | H8 | M309 | E15 | H8 |
| M310 | E16 | H8 | M311 | E17 | H8 | M312 | E18 | H8 |
| M313 | E19 | H8 | M314 | E20 | H8 | M315 | E21 | H8 |
| M316 | E22 | H8 | M317 | E23 | H8 | M318 | E24 | H8 |
| M319 | E25 | H8 | M320 | E26 | H8 | M321 | E27 | H8 |
| M322 | E28 | H8 | M323 | E29 | H8 | M324 | E30 | H8 |
| M325 | E31 | H8 | M326 | E32 | H8 | M327 | E33 | H8 |
| M328 | E34 | H8 | M329 | E35 | H8 | M330 | E36 | H8 |
| M331 | E37 | H8 | M332 | E38 | H8 | M333 | E39 | H8 |
| M334 | E40 | H8 | M335 | E41 | H8 | M336 | E42 | H8 |
| M337 | E1 | H9 | M338 | E2 | H9 | M339 | E3 | H9 |
| M340 | E4 | H9 | M341 | E5 | H9 | M342 | E6 | H9 |
| M343 | E7 | H9 | M344 | E8 | H9 | M345 | E9 | H9 |
| M346 | E10 | H9 | M347 | E11 | H9 | M348 | E12 | H9 |
| M349 | E13 | H9 | M350 | E14 | H9 | M351 | E15 | H9 |
| M352 | E16 | H9 | M353 | E17 | H9 | M354 | E18 | H9 |
| M355 | E19 | H9 | M356 | E20 | H9 | M357 | E21 | H9 |
| M358 | E22 | H9 | M359 | E23 | H9 | M360 | E24 | H9 |
| M361 | E25 | H9 | M362 | E26 | H9 | M363 | E27 | H9 |
| M364 | E28 | H9 | M365 | E29 | H9 | M366 | E30 | H9 |
| M367 | E31 | H9 | M368 | E32 | H9 | M369 | E33 | H9 |
| M370 | E34 | H9 | M371 | E35 | H9 | M372 | E36 | H9 |
| M373 | E37 | H9 | M374 | E38 | H9 | M375 | E39 | H9 |
| M376 | E40 | H9 | M377 | E41 | H9 | M378 | E42 | H9 |
| M379 | E1 | H10 | M380 | E2 | H10 | M381 | E3 | H10 |
| M382 | E4 | H10 | M383 | E5 | H10 | M384 | E6 | H10 |
| M385 | E7 | H10 | M386 | E8 | H10 | M387 | E9 | H10 |
| M388 | E10 | H10 | M389 | E11 | H10 | M390 | E12 | H10 |
| M391 | E13 | H10 | M392 | E14 | H10 | M393 | E15 | H10 |
| M394 | E16 | H10 | M395 | E17 | H10 | M396 | E18 | H10 |
| M397 | E19 | H10 | M398 | E20 | H10 | M399 | E21 | H10 |
| M400 | E22 | H10 | M401 | E23 | H10 | M402 | E24 | H10 |
| M403 | E25 | H10 | M404 | E26 | H10 | M405 | E27 | H10 |
| M406 | E28 | H10 | M407 | E29 | H10 | M408 | E30 | H10 |
| M409 | E31 | H10 | M410 | E32 | H10 | M411 | E33 | H10 |
| M412 | E34 | H10 | M413 | E35 | H10 | M414 | E36 | H10 |
| M415 | E37 | H10 | M416 | E38 | H10 | M417 | E39 | H10 |
| M418 | E40 | H10 | M419 | E41 | H10 | M420 | E42 | H10 |
| M421 | E1 | H11 | M422 | E2 | H11 | M423 | E3 | H11 |
| M424 | E4 | H11 | M425 | E5 | H11 | M426 | E6 | H11 |
| M427 | E7 | H11 | M428 | E8 | H11 | M429 | E9 | H11 |
| M430 | E10 | H11 | M431 | E11 | H11 | M432 | E12 | H11 |
| M433 | E13 | H11 | M434 | E14 | H11 | M435 | E15 | H11 |
| M436 | E16 | H11 | M437 | E17 | H11 | M438 | E18 | H11 |
| M439 | E19 | H11 | M440 | E20 | H11 | M441 | E21 | H11 |
| M442 | E22 | H11 | M443 | E23 | H11 | M444 | E24 | H11 |
| M445 | E25 | H11 | M446 | E26 | H11 | M447 | E27 | H11 |
| M448 | E28 | H11 | M449 | E29 | H11 | M450 | E30 | H11 |
| M451 | E31 | H11 | M452 | E32 | H11 | M453 | E33 | H11 |
| M454 | E34 | H11 | M455 | E35 | H11 | M456 | E36 | H11 |
| M457 | E37 | H11 | M458 | E38 | H11 | M459 | E39 | H11 |
| M460 | E40 | H11 | M461 | E41 | H11 | M462 | E42 | H11 |
| M463 | E1 | H12 | M464 | E2 | H12 | M465 | E3 | H12 |
| M466 | E4 | H12 | M467 | E5 | H12 | M468 | E6 | H12 |
| M469 | E7 | H12 | M470 | E8 | H12 | M471 | E9 | H12 |
| M472 | E10 | H12 | M473 | E11 | H12 | M474 | E12 | H12 |
| M475 | E13 | H12 | M476 | E14 | H12 | M477 | E15 | H12 |
| M478 | E16 | H12 | M479 | E17 | H12 | M480 | E18 | H12 |
| M481 | E19 | H12 | M482 | E20 | H12 | M483 | E21 | H12 |
| M484 | E22 | H12 | M485 | E23 | H12 | M486 | E24 | H12 |
| M487 | E25 | H12 | M488 | E26 | H12 | M489 | E27 | H12 |
| M490 | E28 | H12 | M491 | E29 | H12 | M492 | E30 | H12 |
| M493 | E31 | H12 | M494 | E32 | H12 | M495 | E33 | H12 |
| M496 | E34 | H12 | M497 | E35 | H12 | M498 | E36 | H12 |
| M499 | E37 | H12 | M500 | E38 | H12 | M501 | E39 | H12 |
| M502 | E40 | H12 | M503 | E41 | H12 | M504 | E42 | H12 |
| M505 | E1 | H13 | M506 | E2 | H13 | M507 | E3 | H13 |
| M508 | E4 | H13 | M509 | E5 | H13 | M510 | E6 | H13 |
| M511 | E7 | H13 | M512 | E8 | H13 | M513 | E9 | H13 |
| M514 | E10 | H13 | M515 | E11 | H13 | M516 | E12 | H13 |
| M517 | E13 | H13 | M518 | E14 | H13 | M519 | E15 | H13 |
| M520 | E16 | H13 | M521 | E17 | H13 | M522 | E18 | H13 |
| M523 | E19 | H13 | M524 | E20 | H13 | M525 | E21 | H13 |
| M526 | E22 | H13 | M527 | E23 | H13 | M528 | E24 | H13 |
| M529 | E25 | H13 | M530 | E26 | H13 | M531 | E27 | H13 |
| M532 | E28 | H13 | M533 | E29 | H13 | M534 | E30 | H13 |
| M535 | E31 | H13 | M536 | E32 | H13 | M537 | E33 | H13 |
| M538 | E34 | H13 | M539 | E35 | H13 | M540 | E36 | H13 |
| M541 | E37 | H13 | M542 | E38 | H13 | M543 | E39 | H13 |
| M544 | E40 | H13 | M545 | E41 | H13 | M546 | E42 | H13 |
| M547 | E1 | H14 | M548 | E2 | H14 | M549 | E3 | H14 |
| M550 | E4 | H14 | M551 | E5 | H14 | M552 | E6 | H14 |
| M553 | E7 | H14 | M554 | E8 | H14 | M555 | E9 | H14 |
| M556 | E10 | H14 | M557 | E11 | H14 | M558 | E12 | H14 |
| M559 | E13 | H14 | M560 | E14 | H14 | M561 | E15 | H14 |
| M562 | E16 | H14 | M563 | E17 | H14 | M564 | E18 | H14 |

TABLE 5-continued

| | | | | | | | | |
|---|---|---|---|---|---|---|---|---|
| M565 | E19 | H14 | M566 | E20 | H14 | M567 | E21 | H14 |
| M568 | E22 | H14 | M569 | E23 | H14 | M570 | E24 | H14 |
| M571 | E25 | H14 | M572 | E26 | H14 | M573 | E27 | H14 |
| M574 | E28 | H14 | M575 | E29 | H14 | M576 | E30 | H14 |
| M577 | E31 | H14 | M578 | E32 | H14 | M579 | E33 | H14 |
| M580 | E34 | H14 | M581 | E35 | H14 | M582 | E36 | H14 |
| M583 | E37 | H14 | M584 | E38 | H14 | M585 | E39 | H14 |
| M586 | E40 | H14 | M587 | E41 | H14 | M588 | E42 | H14 |
| M589 | E1 | H15 | M590 | E2 | H15 | M591 | E3 | H15 |
| M592 | E4 | H15 | M593 | E5 | H15 | M594 | E6 | H15 |
| M595 | E7 | H15 | M596 | E8 | H15 | M597 | E9 | H15 |
| M598 | E10 | H15 | M599 | E11 | H15 | M600 | E12 | H15 |
| M601 | E13 | H15 | M602 | E14 | H15 | M603 | E15 | H15 |
| M604 | E16 | H15 | M605 | E17 | H15 | M606 | E18 | H15 |
| M607 | E19 | H15 | M608 | E20 | H15 | M609 | E21 | H15 |
| M610 | E22 | H15 | M611 | E23 | H15 | M612 | E24 | H15 |
| M613 | E25 | H15 | M614 | E26 | H15 | M615 | E27 | H15 |
| M616 | E28 | H15 | M617 | E29 | H15 | M618 | E30 | H15 |
| M619 | E31 | H15 | M620 | E32 | H15 | M621 | E33 | H15 |
| M622 | E34 | H15 | M623 | E35 | H15 | M624 | E36 | H15 |
| M625 | E37 | H15 | M626 | E38 | H15 | M627 | E39 | H15 |
| M628 | E40 | H15 | M629 | E41 | H15 | M630 | E42 | H15 |
| M631 | E1 | H16 | M632 | E2 | H16 | M633 | E3 | H16 |
| M634 | E4 | H16 | M635 | E5 | H16 | M636 | E6 | H16 |
| M637 | E7 | H16 | M638 | E8 | H16 | M639 | E9 | H16 |
| M640 | E10 | H16 | M641 | E11 | H16 | M642 | E12 | H16 |
| M643 | E13 | H16 | M644 | E14 | H16 | M645 | E15 | H16 |
| M646 | E16 | H16 | M647 | E17 | H16 | M648 | E18 | H16 |
| M649 | E19 | H16 | M650 | E20 | H16 | M651 | E21 | H16 |
| M652 | E22 | H16 | M653 | E23 | H16 | M654 | E24 | H16 |
| M655 | E25 | H16 | M656 | E26 | H16 | M657 | E27 | H16 |
| M658 | E28 | H16 | M659 | E29 | H16 | M660 | E30 | H16 |
| M661 | E31 | H16 | M662 | E32 | H16 | M663 | E33 | H16 |
| M664 | E34 | H16 | M665 | E35 | H16 | M666 | E36 | H16 |
| M667 | E37 | H16 | M668 | E38 | H16 | M669 | E39 | H16 |
| M670 | E40 | H16 | M671 | E41 | H16 | M672 | E42 | H16 |
| M673 | E1 | H17 | M674 | E2 | H17 | M675 | E3 | H17 |
| M676 | E4 | H17 | M677 | E5 | H17 | M678 | E6 | H17 |
| M679 | E7 | H17 | M680 | E8 | H17 | M681 | E9 | H17 |
| M682 | E10 | H17 | M683 | E11 | H17 | M684 | E12 | H17 |
| M685 | E13 | H17 | M686 | E14 | H17 | M687 | E15 | H17 |
| M688 | E16 | H17 | M689 | E17 | H17 | M690 | E18 | H17 |
| M691 | E19 | H17 | M692 | E20 | H17 | M693 | E21 | H17 |
| M694 | E22 | H17 | M695 | E23 | H17 | M696 | E24 | H17 |
| M697 | E25 | H17 | M698 | E26 | H17 | M699 | E27 | H17 |
| M700 | E28 | H17 | M701 | E29 | H17 | M702 | E30 | H17 |
| M703 | E31 | H17 | M704 | E32 | H17 | M705 | E33 | H17 |
| M706 | E34 | H17 | M707 | E35 | H17 | M708 | E36 | H17 |
| M709 | E37 | H17 | M710 | E38 | H17 | M711 | E39 | H17 |
| M712 | E40 | H17 | M713 | E41 | H17 | M714 | E42 | H17 |
| M715 | E1 | H18 | M716 | E2 | H18 | M717 | E3 | H18 |
| M718 | E4 | H18 | M719 | E5 | H18 | M720 | E6 | H18 |
| M721 | E7 | H18 | M722 | E8 | H18 | M723 | E9 | H18 |
| M724 | E10 | H18 | M725 | E11 | H18 | M726 | E12 | H18 |
| M727 | E13 | H18 | M728 | E14 | H18 | M729 | E15 | H18 |
| M730 | E16 | H18 | M731 | E17 | H18 | M732 | E18 | H18 |
| M733 | E19 | H18 | M734 | E20 | H18 | M735 | E21 | H18 |
| M736 | E22 | H18 | M737 | E23 | H18 | M738 | E24 | H18 |
| M739 | E25 | H18 | M740 | E26 | H18 | M741 | E27 | H18 |
| M742 | E28 | H18 | M743 | E29 | H18 | M744 | E30 | H18 |
| M745 | E31 | H18 | M746 | E32 | H18 | M747 | E33 | H18 |
| M748 | E34 | H18 | M749 | E35 | H18 | M750 | E36 | H18 |
| M751 | E37 | H18 | M752 | E38 | H18 | M753 | E39 | H18 |
| M754 | E40 | H18 | M755 | E41 | H18 | M756 | E42 | H18 |
| M757 | E1 | H19 | M758 | E2 | H19 | M759 | E3 | H19 |
| M760 | E4 | H19 | M761 | E5 | H19 | M762 | E6 | H19 |
| M763 | E7 | H19 | M764 | E8 | H19 | M765 | E9 | H19 |
| M766 | E10 | H19 | M767 | E11 | H19 | M768 | E12 | H19 |
| M769 | E13 | H19 | M770 | E14 | H19 | M771 | E15 | H19 |
| M772 | E16 | H19 | M773 | E17 | H19 | M774 | E18 | H19 |
| M775 | E19 | H19 | M776 | E20 | H19 | M777 | E21 | H19 |
| M778 | E22 | H19 | M779 | E23 | H19 | M780 | E24 | H19 |
| M781 | E25 | H19 | M782 | E26 | H19 | M783 | E27 | H19 |
| M784 | E28 | H19 | M785 | E29 | H19 | M786 | E30 | H19 |
| M787 | E31 | H19 | M788 | E32 | H19 | M789 | E33 | H19 |
| M790 | E34 | H19 | M791 | E35 | H19 | M792 | E36 | H19 |
| M793 | E37 | H19 | M794 | E38 | H19 | M795 | E39 | H19 |
| M796 | E40 | H19 | M797 | E41 | H19 | M798 | E42 | H19 |
| M799 | E1 | H20 | M800 | E2 | H20 | M801 | E3 | H20 |
| M802 | E4 | H20 | M803 | E5 | H20 | M804 | E6 | H20 |

TABLE 5-continued

| | | | | | | | | |
|---|---|---|---|---|---|---|---|---|
| M805 | E7 | H20 | M806 | E8 | H20 | M807 | E9 | H20 |
| M808 | E10 | H20 | M809 | E11 | H20 | M810 | E12 | H20 |
| M811 | E13 | H20 | M812 | E14 | H20 | M813 | E15 | H20 |
| M814 | E16 | H20 | M815 | E17 | H20 | M816 | E18 | H20 |
| M817 | E19 | H20 | M818 | E20 | H20 | M819 | E21 | H20 |
| M820 | E22 | H20 | M821 | E23 | H20 | M822 | E24 | H20 |
| M823 | E25 | H20 | M824 | E26 | H20 | M825 | E27 | H20 |
| M826 | E28 | H20 | M827 | E29 | H20 | M828 | E30 | H20 |
| M829 | E31 | H20 | M830 | E32 | H20 | M831 | E33 | H20 |
| M832 | E34 | H20 | M833 | E35 | H20 | M834 | E36 | H20 |
| M835 | E37 | H20 | M836 | E38 | H20 | M837 | E39 | H20 |
| M838 | E40 | H20 | M839 | E41 | H20 | M840 | E42 | H20 |
| M841 | E1 | H21 | M842 | E2 | H21 | M843 | E3 | H21 |
| M844 | E4 | H21 | M845 | E5 | H21 | M846 | E6 | H21 |
| M847 | E7 | H21 | M848 | E8 | H21 | M849 | E9 | H21 |
| M850 | E10 | H21 | M851 | E11 | H21 | M852 | E12 | H21 |
| M853 | E13 | H21 | M854 | E14 | H21 | M855 | E15 | H21 |
| M856 | E16 | H21 | M857 | E17 | H21 | M858 | E18 | H21 |
| M859 | E19 | H21 | M860 | E20 | H21 | M861 | E21 | H21 |
| M862 | E22 | H21 | M863 | E23 | H21 | M864 | E24 | H21 |
| M865 | E25 | H21 | M866 | E26 | H21 | M867 | E27 | H21 |
| M868 | E28 | H21 | M869 | E29 | H21 | M870 | E30 | H21 |
| M871 | E31 | H21 | M872 | E32 | H21 | M873 | E33 | H21 |
| M874 | E34 | H21 | M875 | E35 | H21 | M876 | E36 | H21 |
| M877 | E37 | H21 | M878 | E38 | H21 | M879 | E39 | H21 |
| M880 | E40 | H21 | M881 | E41 | H21 | M882 | E42 | H21 |
| M883 | E43 | H1 | M884 | E43 | H2 | M885 | E43 | H3 |
| M886 | E43 | H4 | M887 | E43 | H5 | M888 | E43 | H6 |
| M889 | E43 | H7 | M890 | E43 | H8 | M891 | E43 | H9 |
| M892 | E43 | H10 | M893 | E43 | H11 | M894 | E43 | H12 |
| M895 | E43 | H13 | M896 | E43 | H14 | M897 | E43 | H15 |
| M898 | E43 | H16 | M899 | E43 | H17 | M900 | E43 | H18 |
| M901 | E43 | H19 | M902 | E43 | H20 | M903 | E43 | H21 |
| M904 | E44 | H1 | M905 | E44 | H2 | M906 | E44 | H3 |
| M907 | E44 | H4 | M908 | E44 | H5 | M909 | E44 | H6 |
| M910 | E44 | H7 | M911 | E44 | H8 | M912 | E44 | H9 |
| M913 | E44 | H10 | M914 | E44 | H11 | M915 | E44 | H12 |
| M916 | E44 | H13 | M917 | E44 | H14 | M918 | E44 | H15 |
| M919 | E44 | H16 | M920 | E44 | H17 | M921 | E44 | H18 |
| M922 | E44 | H19 | M923 | E44 | H20 | M924 | E44 | H21 |
| M925 | E45 | H1 | M926 | E45 | H2 | M927 | E45 | H3 |
| M928 | E45 | H4 | M929 | E45 | H5 | M930 | E45 | H6 |
| M931 | E45 | H7 | M932 | E45 | H8 | M933 | E45 | H9 |
| M934 | E45 | H10 | M935 | E45 | H11 | M936 | E45 | H12 |
| M937 | E45 | H13 | M938 | E45 | H14 | M939 | E45 | H15 |
| M940 | E45 | H16 | M941 | E45 | H17 | M942 | E45 | H18 |
| M943 | E45 | H19 | M944 | E45 | H20 | M945 | E45 | H21 |
| M946 | E46 | H1 | M947 | E46 | H2 | M948 | E46 | H3 |
| M949 | E46 | H4 | M950 | E46 | H5 | M951 | E46 | H6 |
| M952 | E46 | H7 | M953 | E46 | H8 | M954 | E46 | H9 |
| M955 | E46 | H10 | M956 | E46 | H11 | M957 | E46 | H12 |
| M958 | E46 | H13 | M959 | E46 | H14 | M960 | E46 | H15 |
| M961 | E46 | H16 | M962 | E46 | H17 | M963 | E46 | H18 |
| M964 | E46 | H19 | M965 | E46 | H20 | M966 | E46 | H21 |
| M967 | E47 | H1 | M968 | E47 | H2 | M969 | E47 | H3 |
| M970 | E47 | H4 | M971 | E47 | H5 | M972 | E47 | H6 |
| M973 | E47 | H7 | M974 | E47 | H8 | M975 | E47 | H9 |
| M976 | E47 | H10 | M977 | E47 | H11 | M978 | E47 | H12 |
| M979 | E47 | H13 | M980 | E47 | H14 | M981 | E47 | H15 |
| M982 | E47 | H16 | M983 | E47 | H17 | M984 | E47 | H18 |
| M985 | E47 | H19 | M986 | E47 | H20 | M987 | E47 | H21 |
| M988 | E48 | H1 | M989 | E48 | H2 | M990 | E48 | H3 |
| M991 | E48 | H4 | M992 | E48 | H5 | M993 | E48 | H6 |
| M994 | E48 | H7 | M995 | E48 | H8 | M996 | E48 | H9 |
| M997 | E48 | H10 | M998 | E48 | H11 | M999 | E48 | H12 |
| M1000 | E48 | H13 | M1001 | E48 | H14 | M1002 | E48 | H15 |
| M1003 | E48 | H16 | M1004 | E48 | H17 | M1005 | E48 | H18 |
| M1006 | E48 | H19 | M1007 | E48 | H20 | M1008 | E48 | H21 |
| M1009 | E49 | H1 | M1010 | E49 | H2 | M1011 | E49 | H3 |
| M1012 | E49 | H4 | M1013 | E49 | H5 | M1014 | E49 | H6 |
| M1015 | E49 | H7 | M1016 | E49 | H8 | M1017 | E49 | H9 |
| M1018 | E49 | H10 | M1019 | E49 | H11 | M1020 | E49 | H12 |
| M1021 | E49 | H13 | M1022 | E49 | H14 | M1023 | E49 | H15 |
| M1024 | E49 | H16 | M1025 | E49 | H17 | M1026 | E49 | H18 |
| M1027 | E49 | H19 | M1028 | E49 | H20 | M1029 | E49 | H21 |
| M1030 | E50 | H1 | M1031 | E50 | H2 | M1032 | E50 | H3 |
| M1033 | E50 | H4 | M1034 | E50 | H5 | M1035 | E50 | H6 |
| M1036 | E50 | H7 | M1037 | E50 | H8 | M1038 | E50 | H9 |
| M1039 | E50 | H10 | M1040 | E50 | H11 | M1041 | E50 | H12 |
| M1042 | E50 | H13 | M1043 | E50 | H14 | M1044 | E50 | H15 |

TABLE 5-continued

| | | | | | | | | |
|---|---|---|---|---|---|---|---|---|
| M1045 | E50 | H16 | M1046 | E50 | H17 | M1047 | E50 | H18 |
| M1048 | E50 | H19 | M1049 | E50 | H20 | M1050 | E50 | H21 |
| M1051 | E51 | H1 | M1052 | E51 | H2 | M1053 | E51 | H3 |
| M1054 | E51 | H4 | M1055 | E51 | H5 | M1056 | E51 | H6 |
| M1057 | E51 | H7 | M1058 | E51 | H8 | M1059 | E51 | H9 |
| M1060 | E51 | H10 | M1061 | E51 | H11 | M1062 | E51 | H12 |
| M1063 | E51 | H13 | M1064 | E51 | H14 | M1065 | E51 | H15 |
| M1066 | E51 | H16 | M1067 | E51 | H17 | M1068 | E51 | H18 |
| M1069 | E51 | H19 | M1070 | E51 | H20 | M1071 | E51 | H21 |
| M1072 | E52 | H1 | M1073 | E52 | H2 | M1074 | E52 | H3 |
| M1075 | E52 | H4 | M1076 | E52 | H5 | M1077 | E52 | H6 |
| M1078 | E52 | H7 | M1079 | E52 | H8 | M1080 | E52 | H9 |
| M1081 | E52 | H10 | M1082 | E52 | H11 | M1083 | E52 | H12 |
| M1084 | E52 | H13 | M1085 | E52 | H14 | M1086 | E52 | H15 |
| M1087 | E52 | H16 | M1088 | E52 | H17 | M1089 | E52 | H18 |
| M1090 | E52 | H19 | M1091 | E52 | H20 | M1092 | E52 | H21 |
| M1093 | E53 | H1 | M1094 | E53 | H2 | M1095 | E53 | H3 |
| M1096 | E53 | H4 | M1097 | E53 | H5 | M1098 | E53 | H6 |
| M1099 | E53 | H7 | M1100 | E53 | H8 | M1101 | E53 | H9 |
| M1102 | E53 | H10 | M1103 | E53 | H11 | M1104 | E53 | H12 |
| M1105 | E53 | H13 | M1106 | E53 | H14 | M1107 | E53 | H15 |
| M1108 | E53 | H16 | M1109 | E53 | H17 | M1110 | E53 | H18 |
| M1111 | E53 | H19 | M1112 | E53 | H20 | M1113 | E53 | H21 |
| M1114 | E54 | H1 | M1115 | E54 | H2 | M1116 | E54 | H3 |
| M1117 | E54 | H4 | M1118 | E54 | H5 | M1119 | E54 | H6 |
| M1120 | E54 | H7 | M1121 | E54 | H8 | M1122 | E54 | H9 |
| M1123 | E54 | H10 | M1124 | E54 | H11 | M1125 | E54 | H12 |
| M1126 | E54 | H13 | M1127 | E54 | H14 | M1128 | E54 | H15 |
| M1129 | E54 | H16 | M1130 | E54 | H17 | M1131 | E54 | H18 |
| M1132 | E54 | H19 | M1133 | E54 | H20 | M1134 | E54 | H21. |

The concentration of the electron-transporting host material of the formula (1) as described above or described as preferred in the mixture of the invention or in the light-emitting layer of the device of the invention is in the range from 5% by weight to 90% by weight, preferably in the range from 10% by weight to 85% by weight, more preferably in the range from 20% by weight to 85% by weight, even more preferably in the range from 30% by weight to 80% by weight, very especially preferably in the range from 20% by weight to 60% by weight and most preferably in the range from 30% by weight to 50% by weight, based on the overall mixture or based on the overall composition of the light-emitting layer.

The concentration of the hole-transporting host material of the formula (2) as described above or described as preferred in the mixture of the invention or in the light-emitting layer of the device of the invention is in the range from 10% by weight to 95% by weight, preferably in the range from 15% by weight to 90% by weight, more preferably in the range from 15% by weight to 80% by weight, even more preferably in the range from 20% by weight to 70% by weight, very especially preferably in the range from 40% by weight to 80% by weight and most preferably in the range from 50% by weight to 70% by weight, based on the overall mixture or based on the overall composition of the light-emitting layer.

The present invention also relates to a mixture which, as well as the aforementioned host materials 1 and 2, as described above or described with preference, especially mixtures M1 to M1134, also contains at least one phosphorescent emitter.

The present invention also relates to an organic electroluminescent device as described above or described with preference, wherein the light-emitting layer, as well as the aforementioned host materials 1 and 2, as described above or described with preference, especially material combinations M1 to M1134, also comprises at least one phosphorescent emitter.

The term "phosphorescent emitters" typically encompasses compounds where the light is emitted through a spin-forbidden transition from an excited state having higher spin multiplicity, i.e. a spin state >1, for example through a transition from a triplet state or a state having an even higher spin quantum number, for example a quintet state. This is preferably understood to mean a transition from a triplet state.

Suitable phosphorescent emitters (=triplet emitters) are especially compounds which, when suitably excited, emit light, preferably in the visible region, and also contain at least one atom of atomic number greater than 20, preferably greater than 38 and less than 84, more preferably greater than 56 and less than 80, especially a metal having this atomic number. Preferred phosphorescence emitters used are compounds containing copper, molybdenum, tungsten, rhenium, ruthenium, osmium, rhodium, iridium, palladium, platinum, silver, gold or europium, especially compounds containing iridium or platinum. In the context of the present invention, all luminescent compounds containing the above-mentioned metals are regarded as phosphorescent emitters.

In general, all phosphorescent complexes as used for phosphorescent OLEDs according to the prior art and as known to those skilled in the art in the field of organic electroluminescent devices are suitable.

Examples of the above-described emitters can be found in applications WO 2016/015815, WO 00/70655, WO 2001/41512, WO 2002/02714, WO 2002/15645, EP 1191613, EP 1191612, EP 1191614, WO 05/033244, WO 05/019373, US 2005/0258742, WO 2009/146770, WO 2010/015307, WO 2010/031485, WO 2010/054731, WO 2010/054728, WO 2010/086089, WO 2010/099852, WO 2010/102709, WO 2011/032626, WO 2011/066898, WO 2011/157339, WO 2012/007086, WO 2014/008982, WO 2014/023377, WO 2014/094961, WO 2014/094960, WO 2015/036074, WO 2015/104045, WO 2015/117718, WO 2016/015815, WO 2016/124304, WO 2017/032439, WO 2015/036074, WO 2015/117718 and WO 2016/015815.

Preferred phosphorescent emitters according to the present invention conform to the formula (III)

Formula (III)

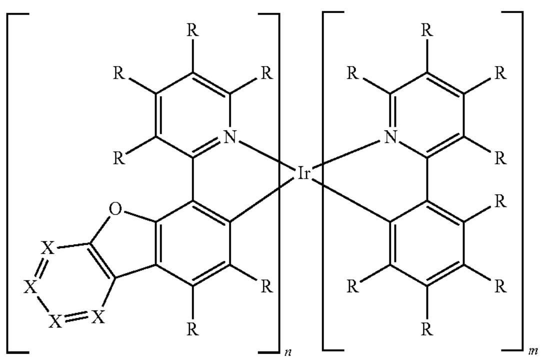

where the symbols and indices for this formula (III) are defined as follows:

n+m is 3, n is 1 or 2, m is 2 or 1,

X is N or CR,

R is H, D or a branched or linear alkyl group or a partly or fully deuterated, branched or linear alkyl group.

The invention accordingly further provides an organic electroluminescent device as described above or described as preferred, characterized in that the light-emitting layer, as well as the host materials 1 and 2, comprises at least one phosphorescent emitter conforming to the formula (III) as described above.

In emitters of the formula (III), n is preferably 1 and m is preferably 2.

In emitters of the formula (III), preferably, one X is selected from N and the other X are CR.

In emitters of the formula (III), at least one R is preferably different from H.

In emitters of the formula (III), preferably two R are different from H and have one of the other definitions given above for the emitters of the formula (III).

Preferred phosphorescent emitters according to the present invention conform to the formulae (Ia), (IIa) and (IIIa)

Formula (Ia)

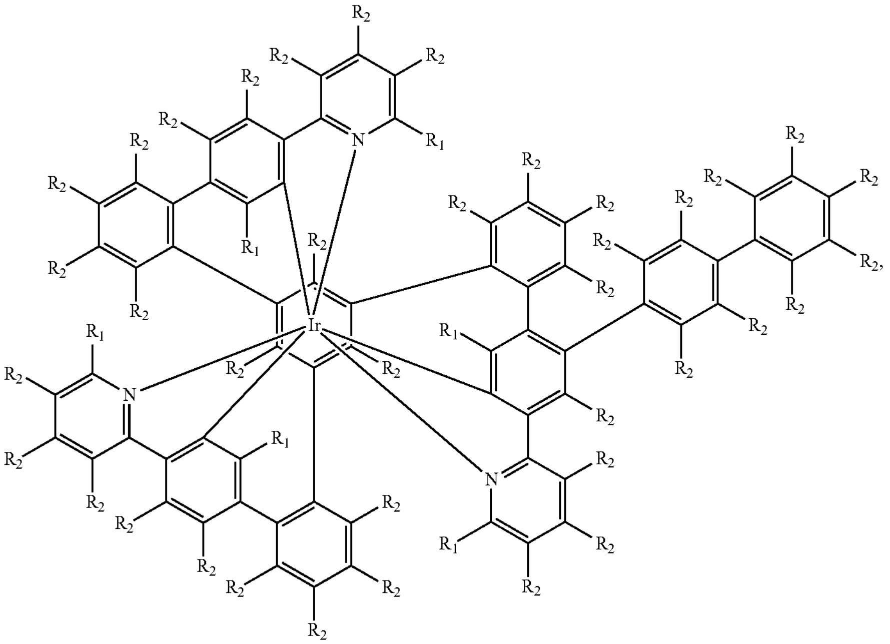

Formula (IIa)

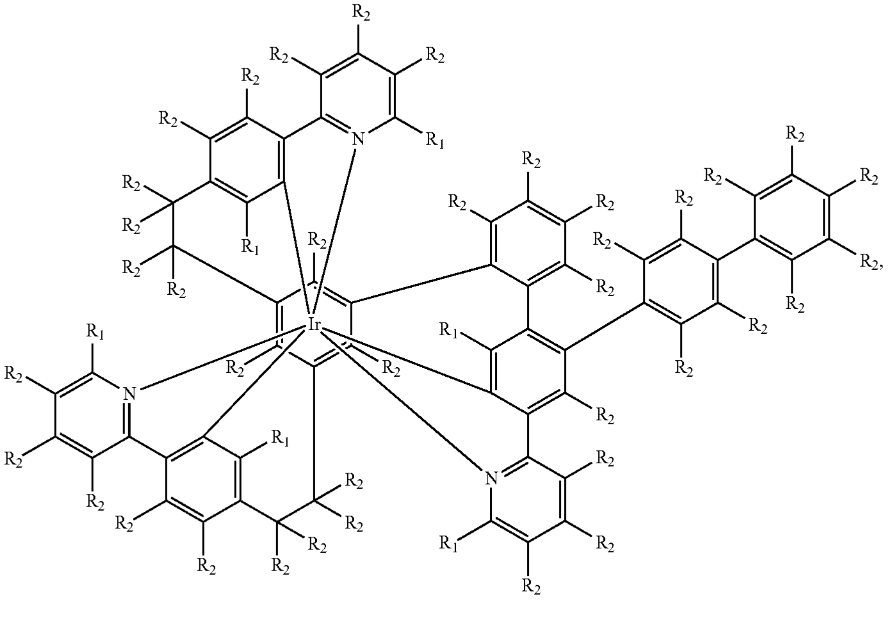

-continued

Formula (IIIa)

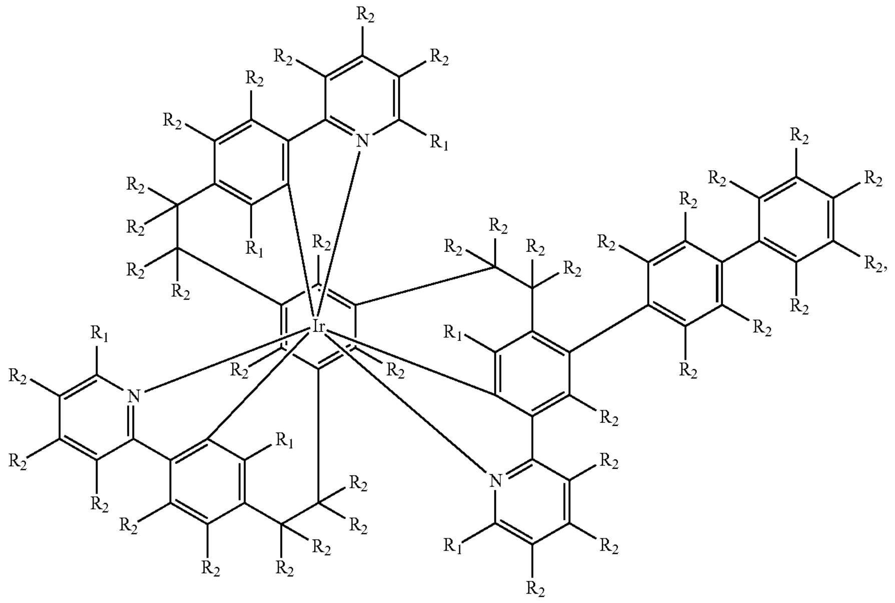

where the symbols and indices for these formulae (Ia), (IIa) and (IIIa) are defined as follows:

$R_1$ is H or D, $R_2$ is H, D, or a branched or linear alkyl group having 1 to 10 carbon atoms or a partly or fully deuterated branched or linear alkyl group having 1 to 10 carbon atoms or a cycloalkyl group which has 4 to 10 carbon atoms and may be partly or fully substituted by deuterium.

Preferred phosphorescent emitters according to the present invention conform to the formulae (IVa), (Va) and (VIa)

Formula (IVA)

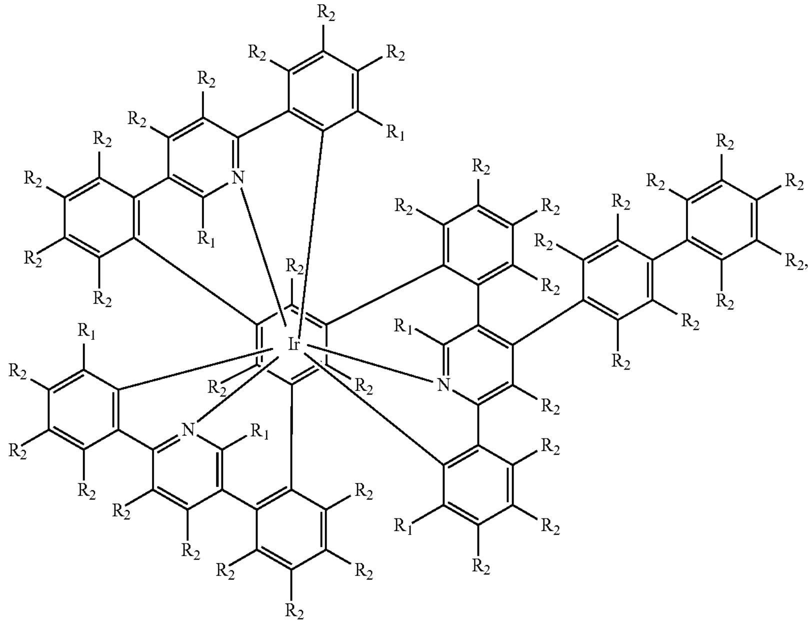

-continued

Formula (Va)

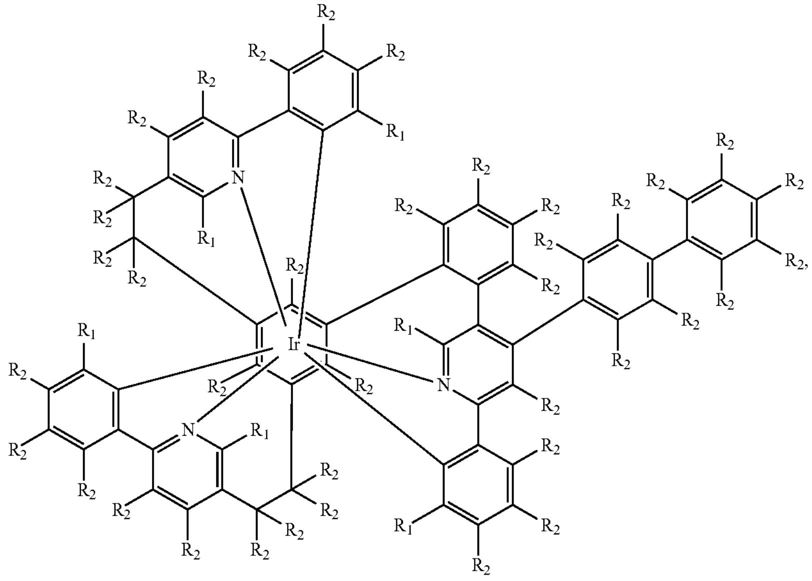

Formula (VIa)

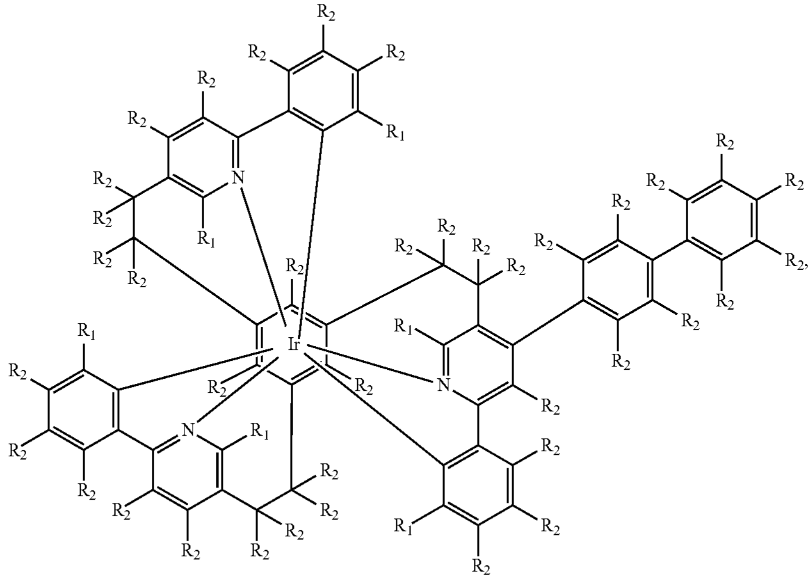

where the symbols and indices for these formulae (IVa), (Va) and (VIa) are defined as follows:

$R_1$ is H or D, $R_2$ is H, D, F or a branched or linear alkyl group having 1 to 10 carbon atoms or a partly or fully deuterated branched or linear alkyl group having 1 to 10 carbon atoms or a cycloalkyl group which has 4 to 10 carbon atoms and may be partly or fully substituted by deuterium.

Preferred examples of phosphorescent emitters are listed in table 6 below.

TABLE 6
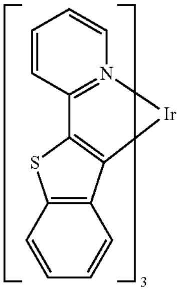
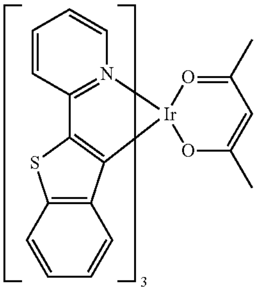
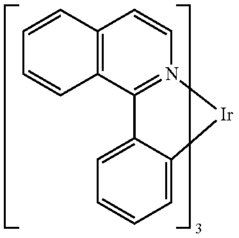
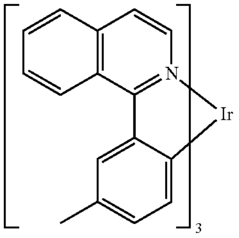
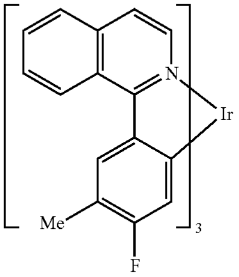

TABLE 6-continued
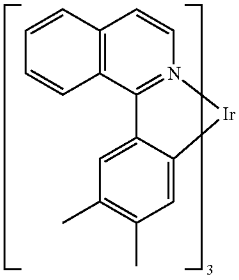
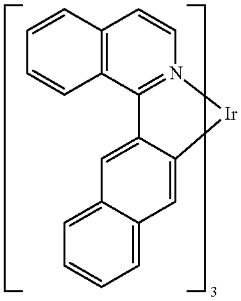
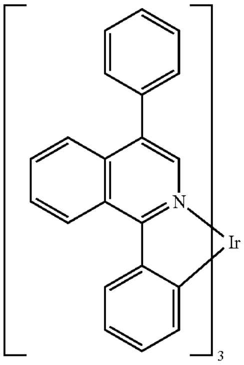
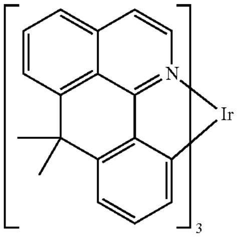
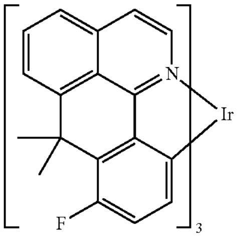

TABLE 6-continued
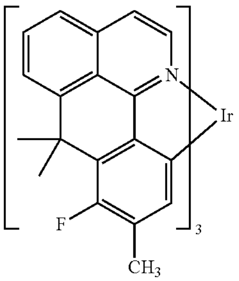
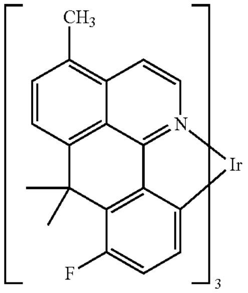
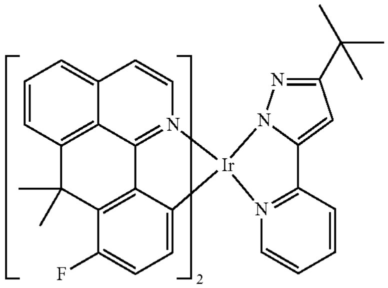
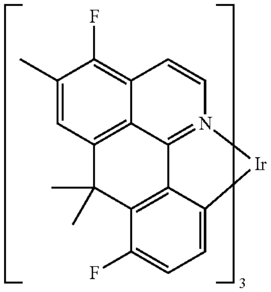
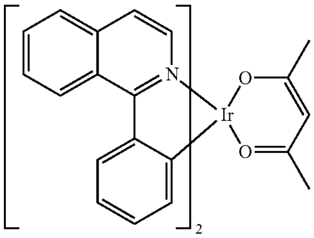

TABLE 6-continued
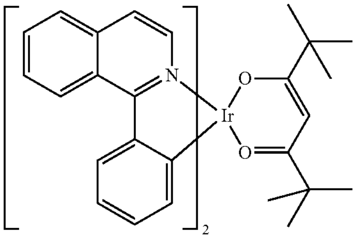
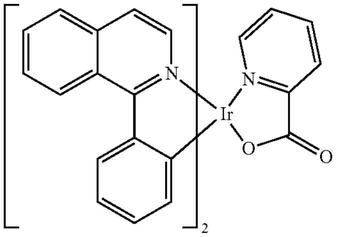
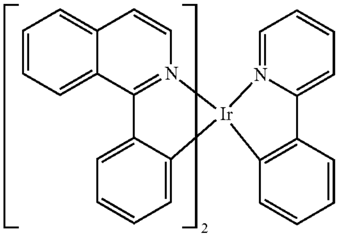
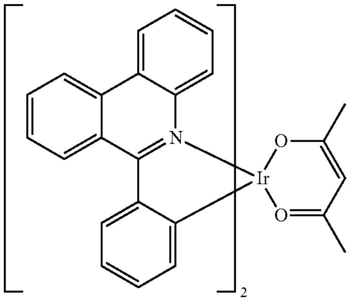
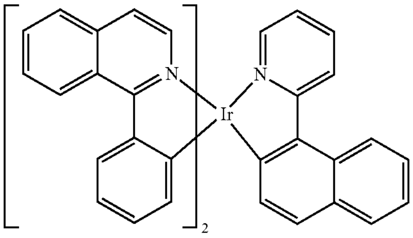
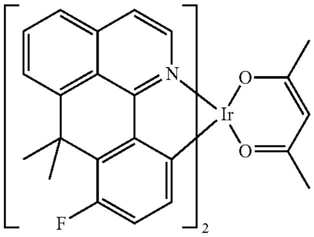

TABLE 6-continued
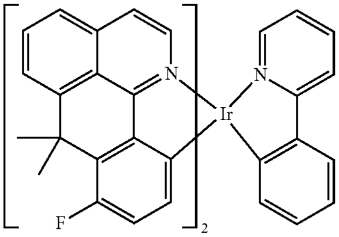
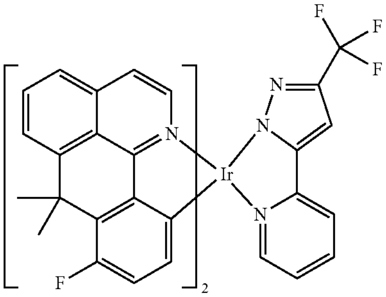
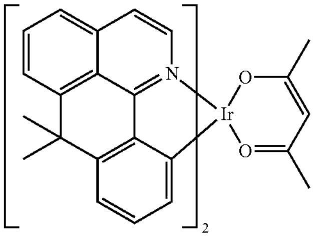
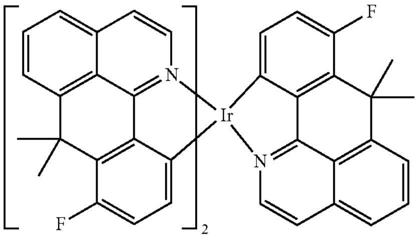
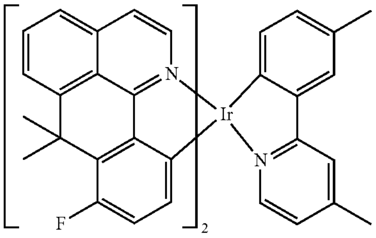
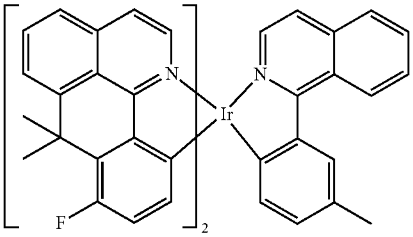

TABLE 6-continued
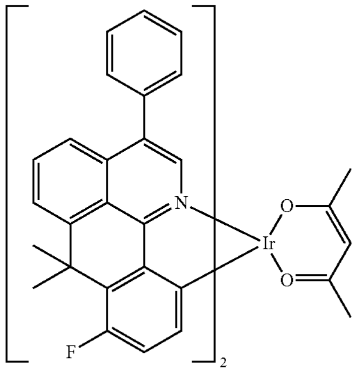
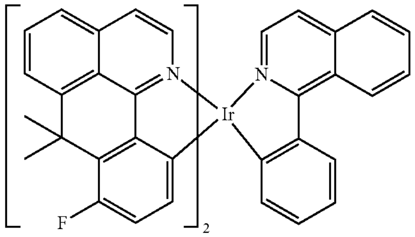
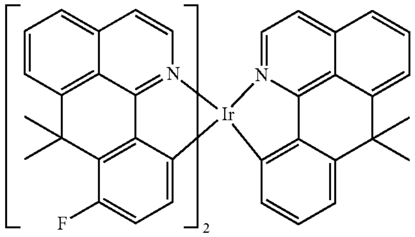
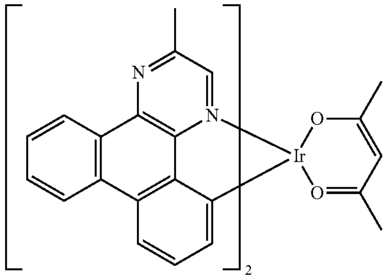
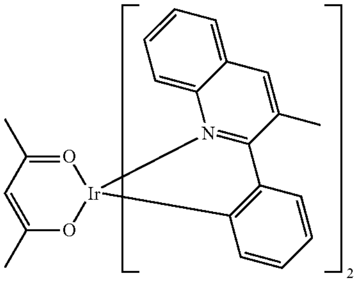

TABLE 6-continued
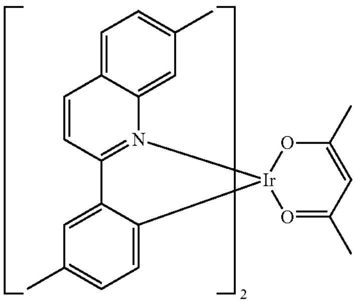
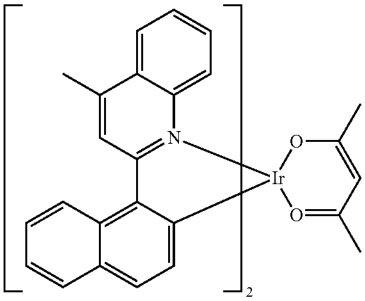
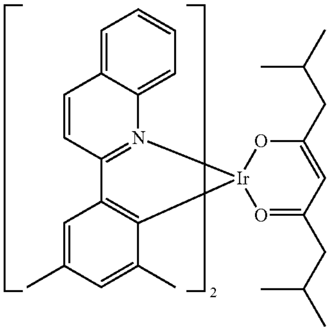
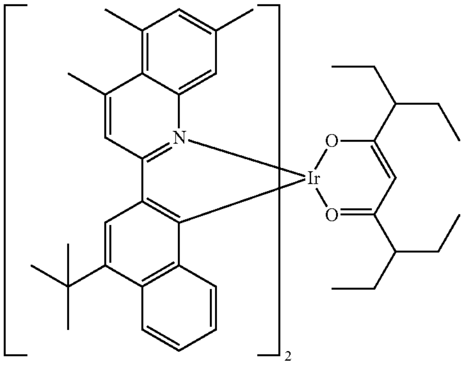
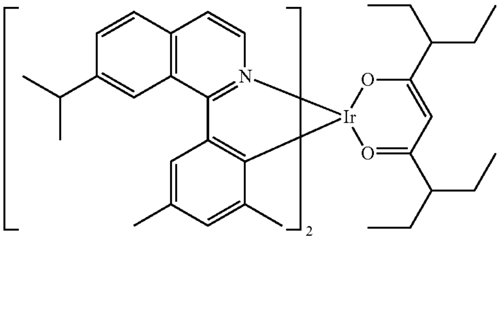

TABLE 6-continued
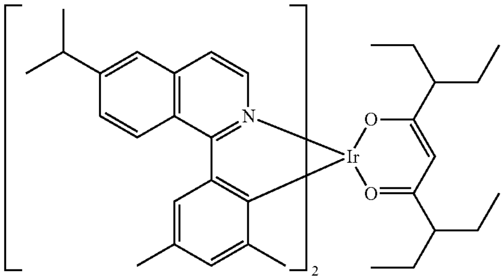
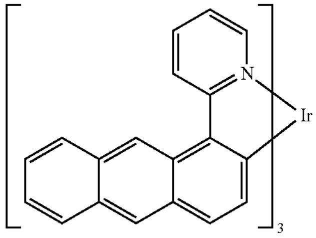
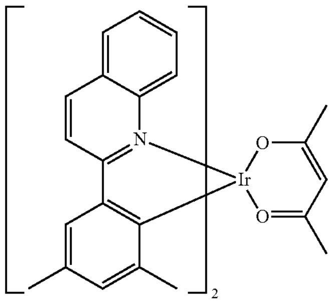
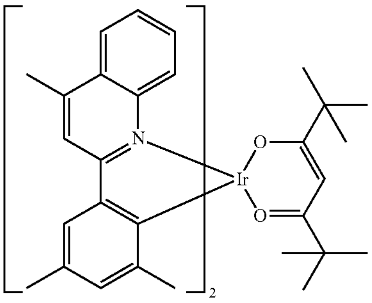
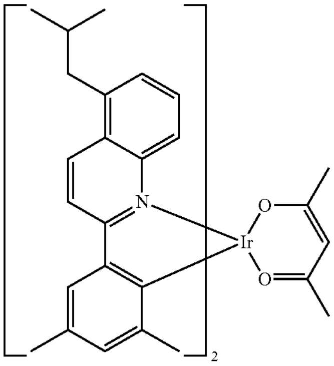

TABLE 6-continued
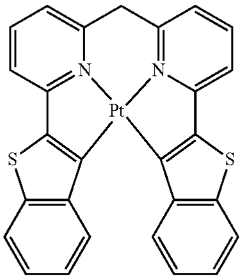
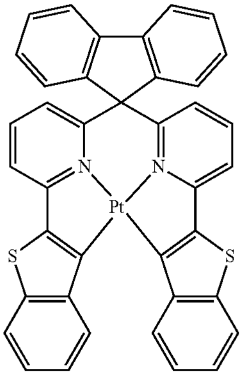
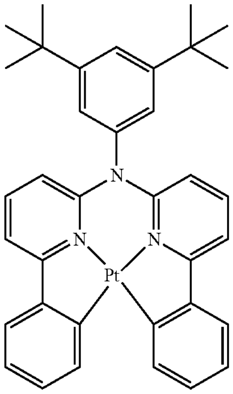
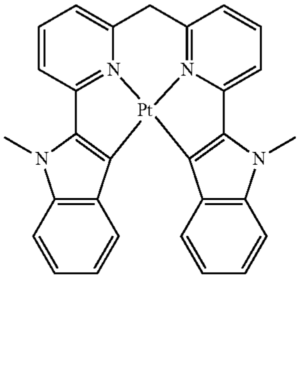

TABLE 6-continued
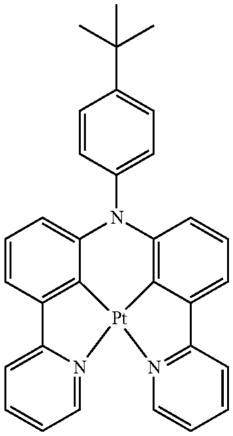
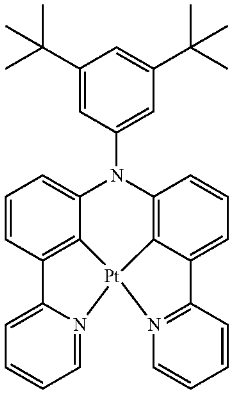
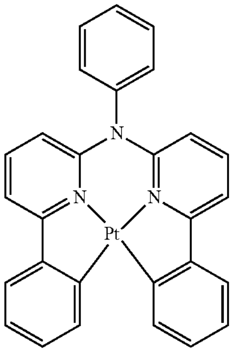
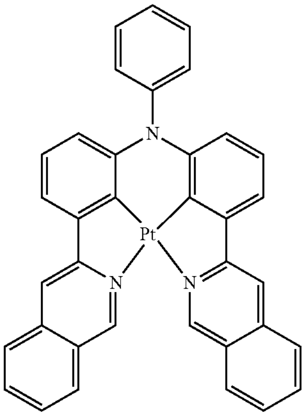

TABLE 6-continued
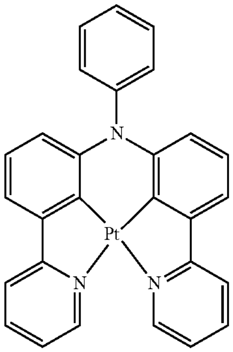
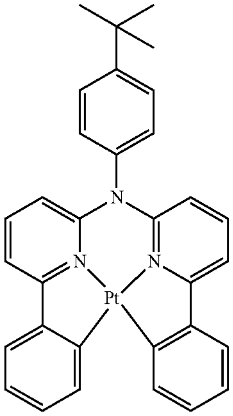
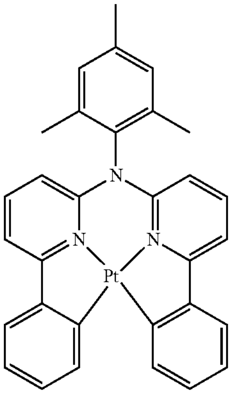
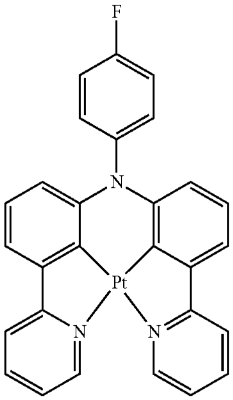

TABLE 6-continued
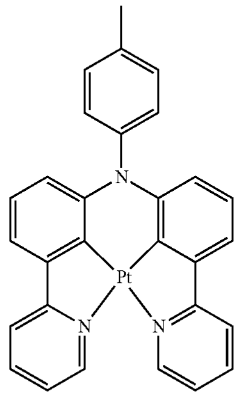
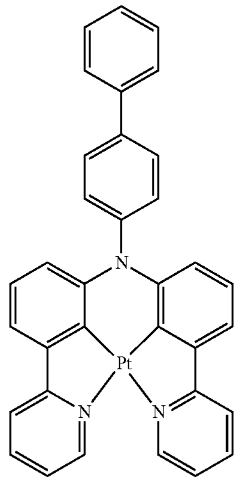
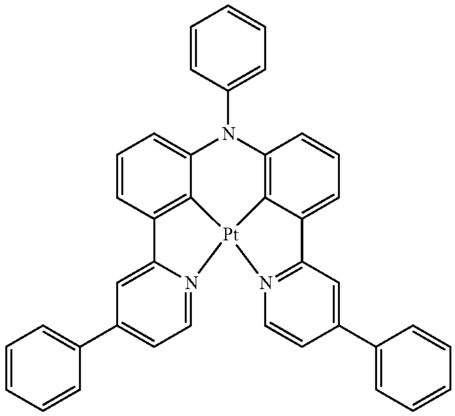

TABLE 6-continued
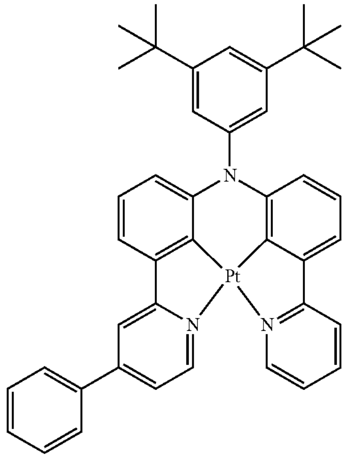
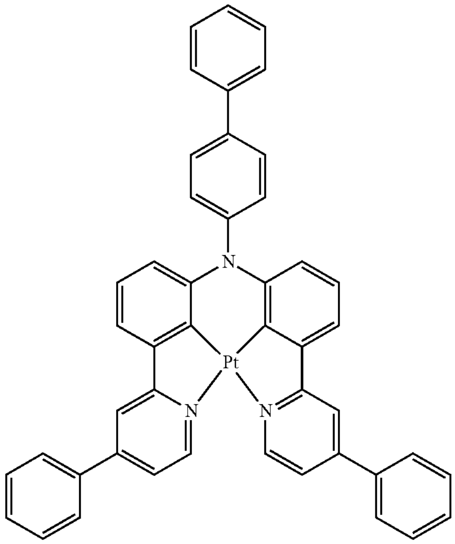
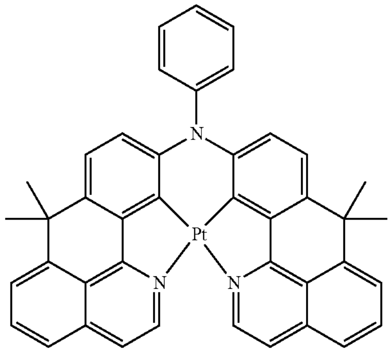

TABLE 6-continued
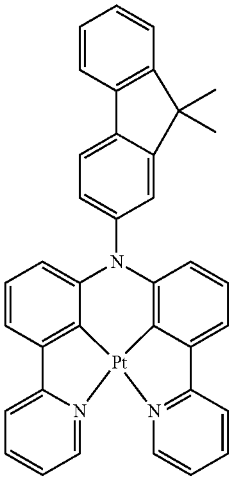
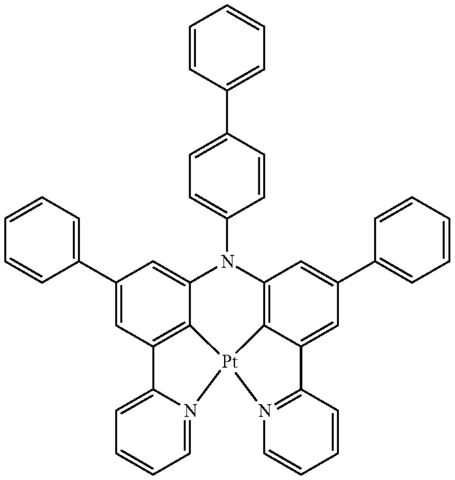
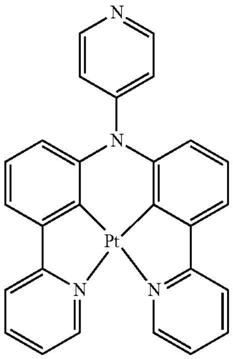
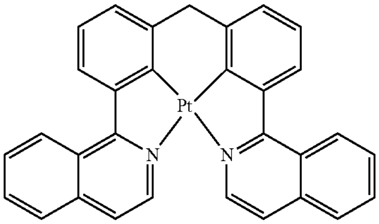

TABLE 6-continued
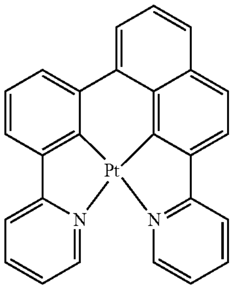
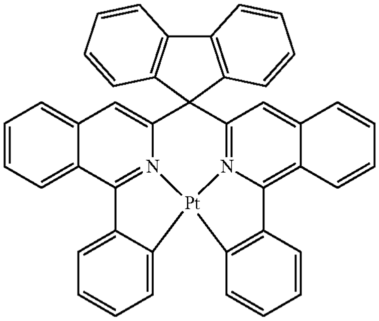
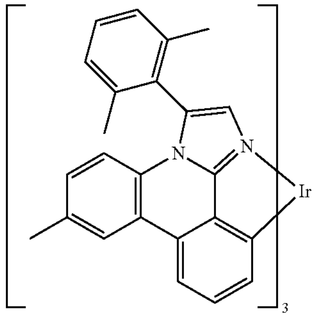
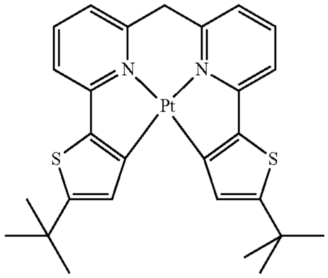
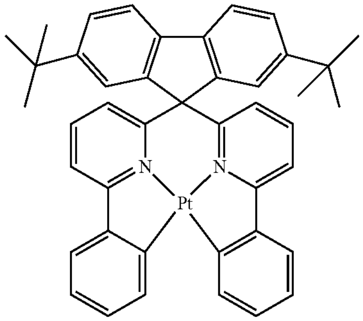

TABLE 6-continued
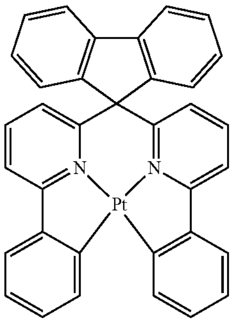
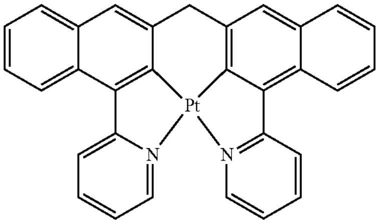
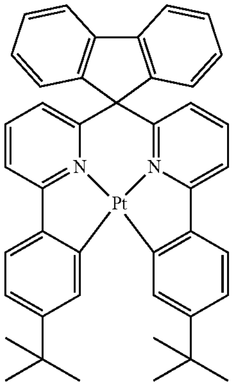
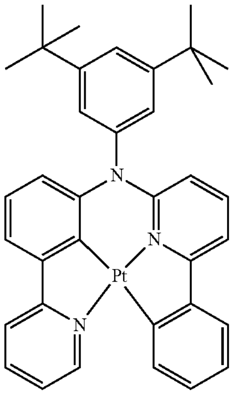

TABLE 6-continued
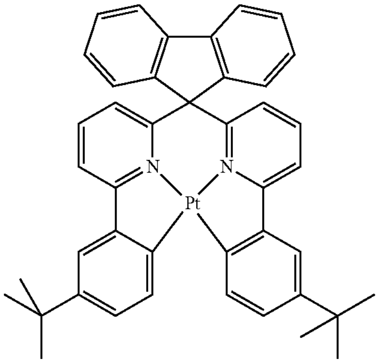
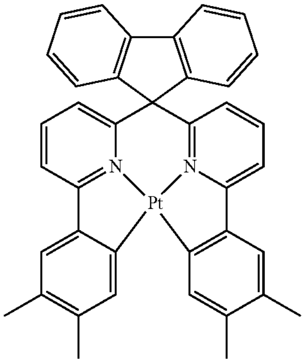
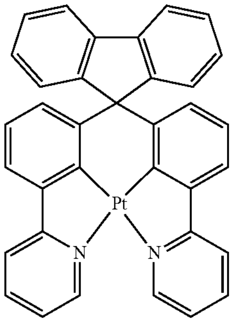
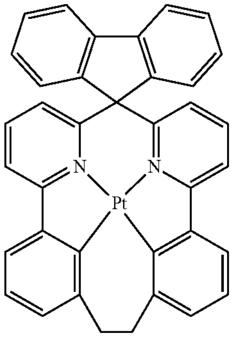

TABLE 6-continued
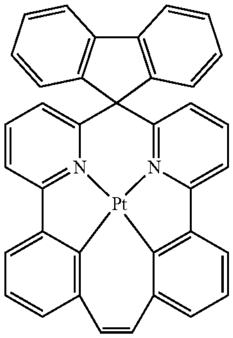
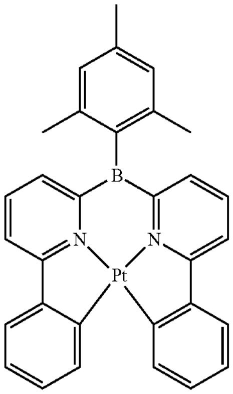
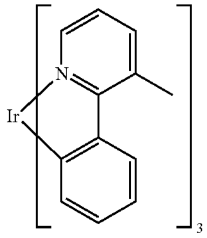
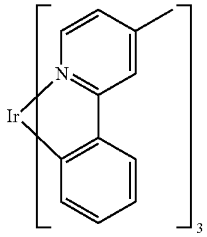
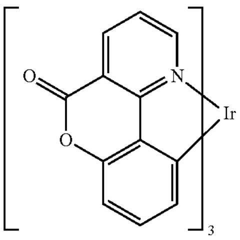

TABLE 6-continued
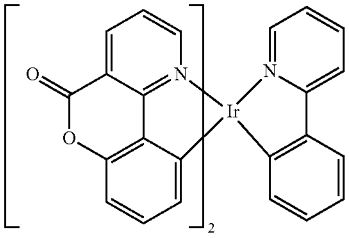
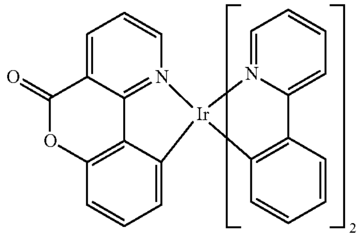
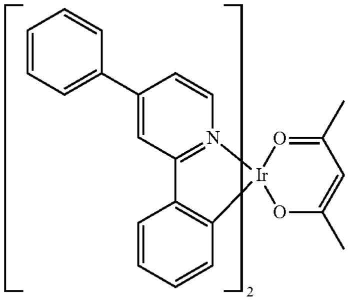
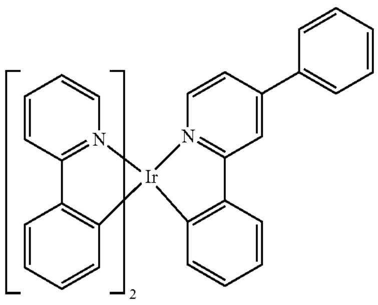
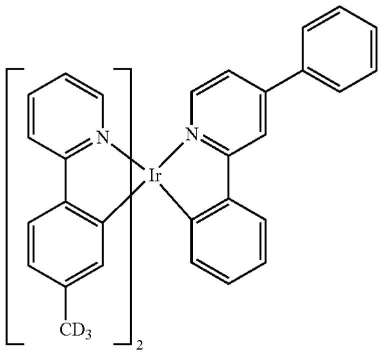

TABLE 6-continued
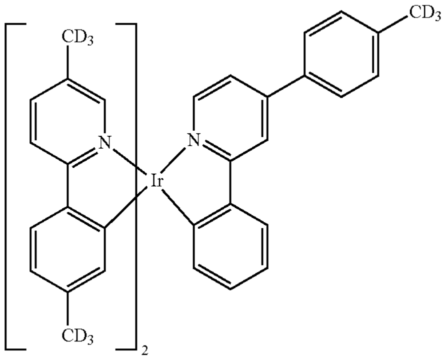
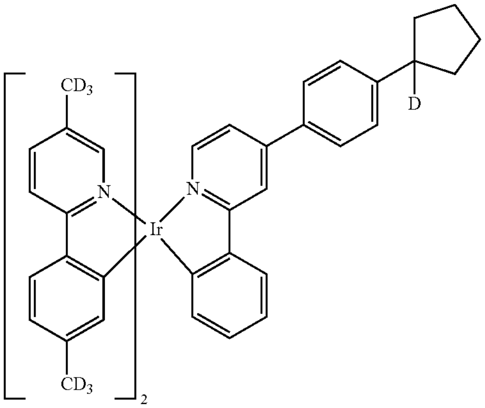
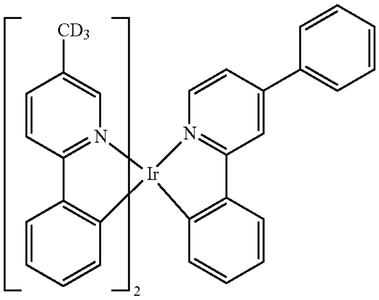
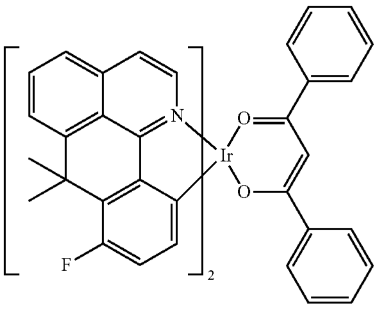

TABLE 6-continued
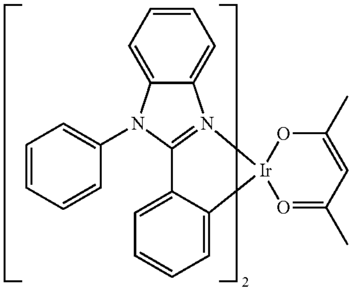
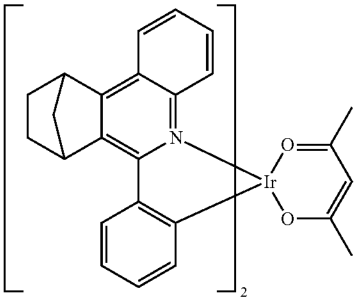
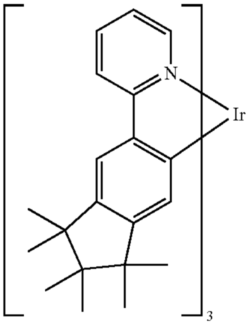
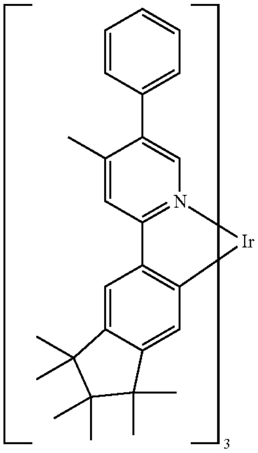

TABLE 6-continued
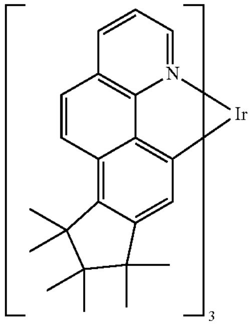
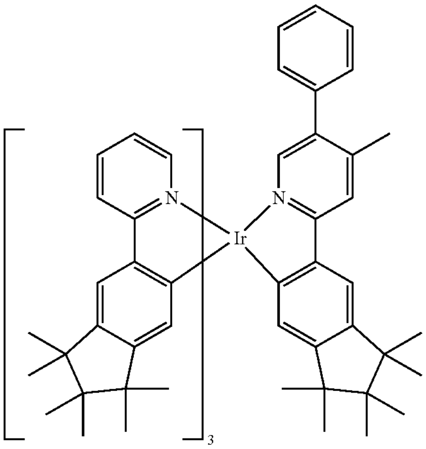
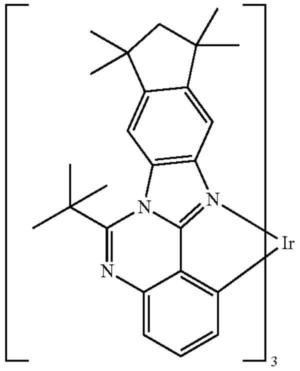
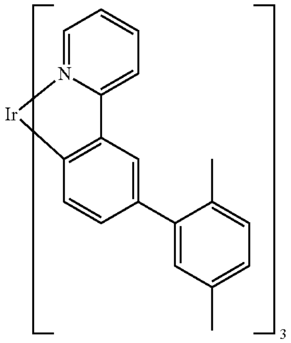

TABLE 6-continued
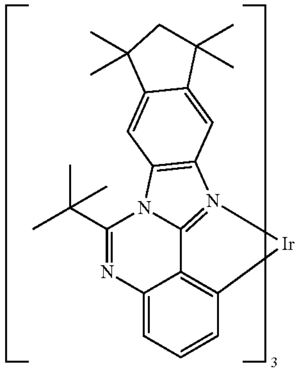
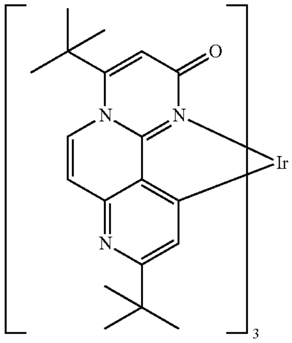
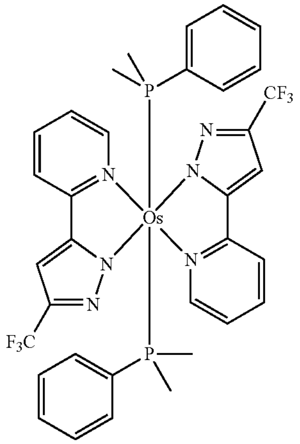
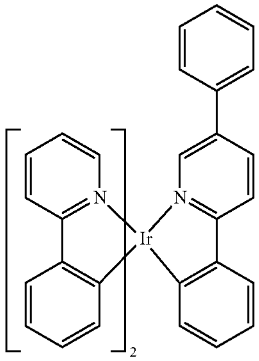

TABLE 6-continued
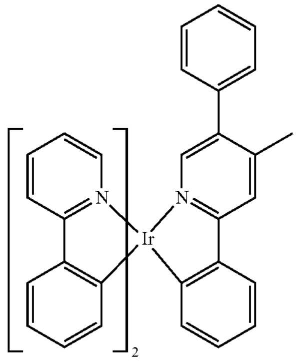
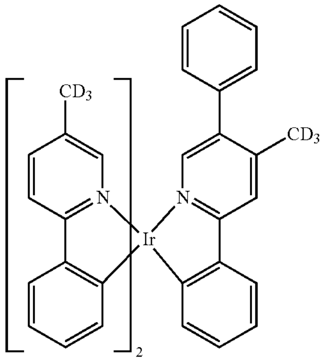
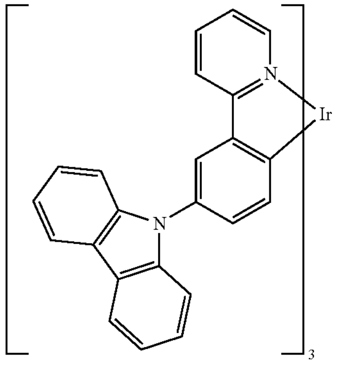
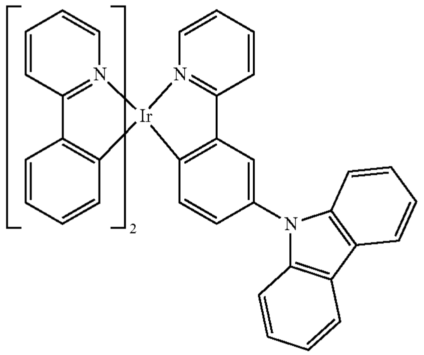

TABLE 6-continued
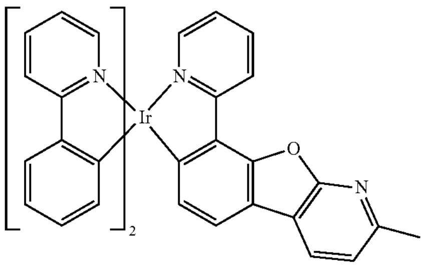
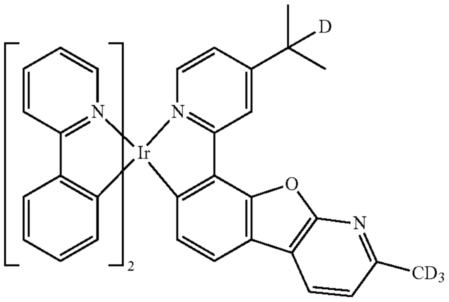
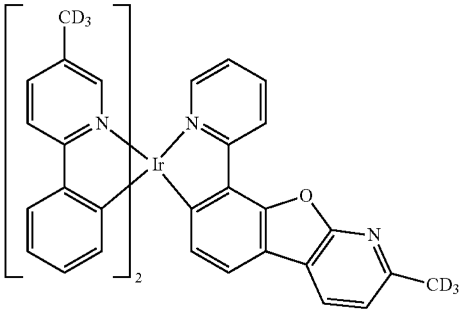
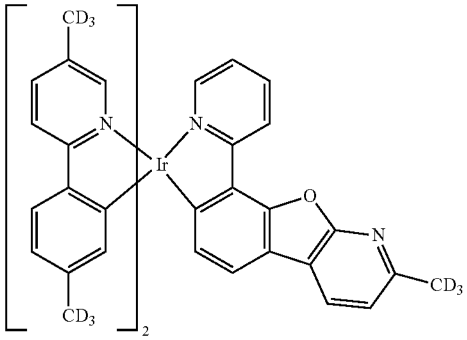
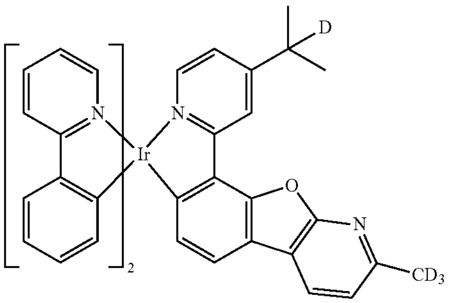

TABLE 6-continued
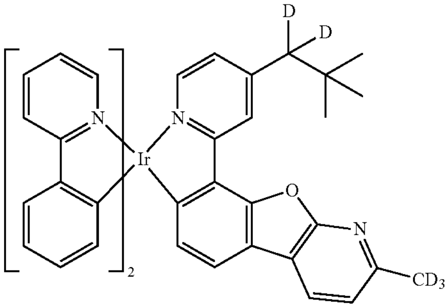
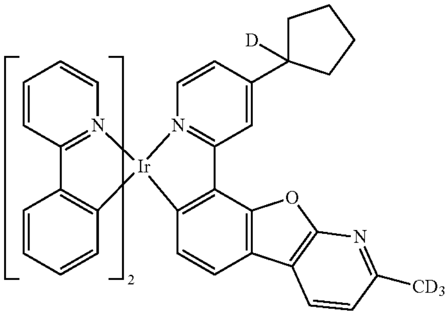
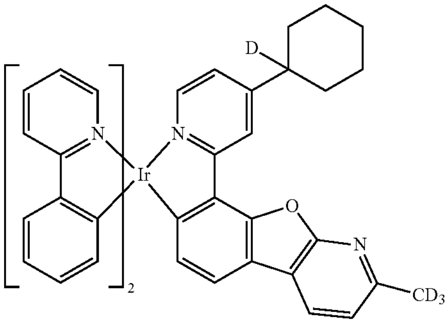
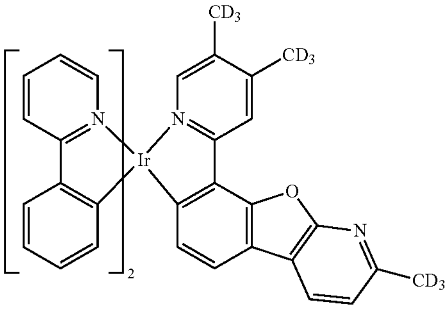
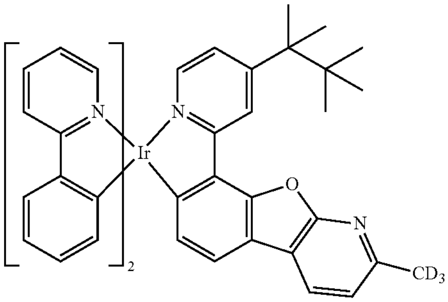

TABLE 6-continued
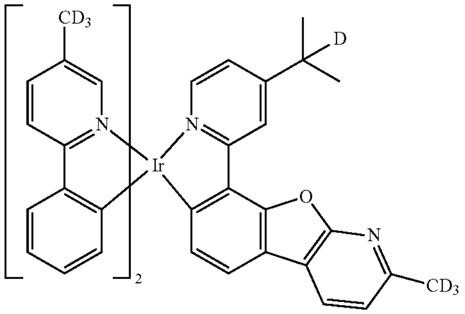
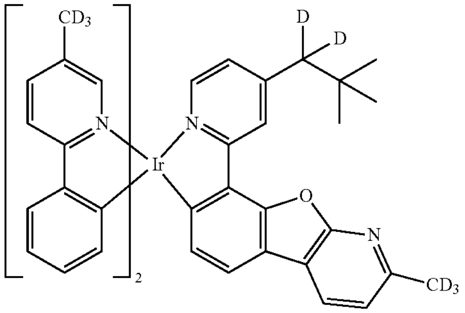
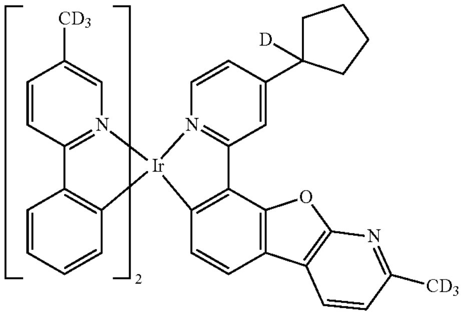
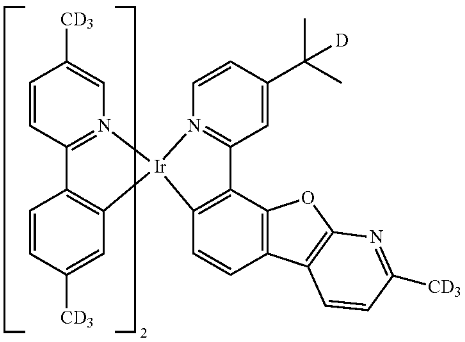
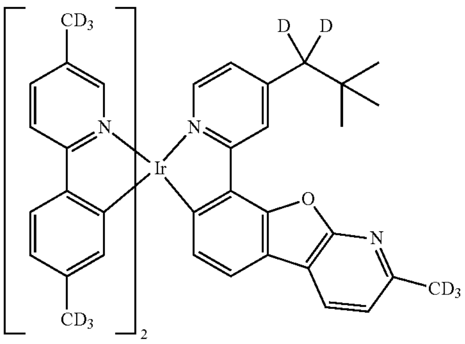

TABLE 6-continued
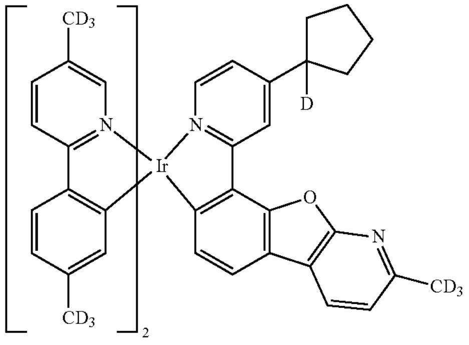
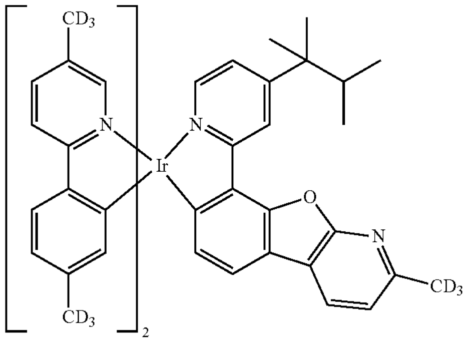
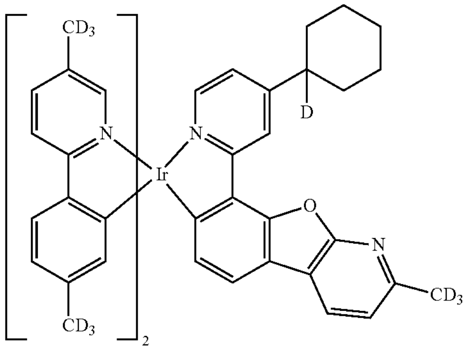
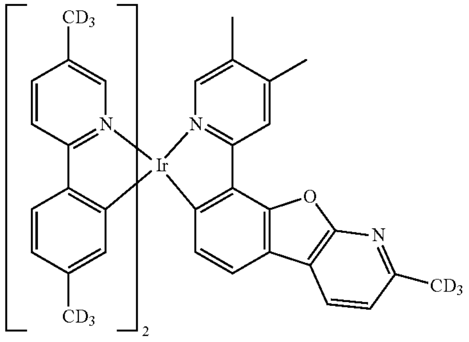

TABLE 6-continued
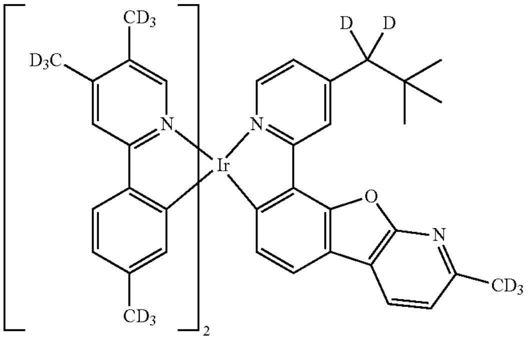
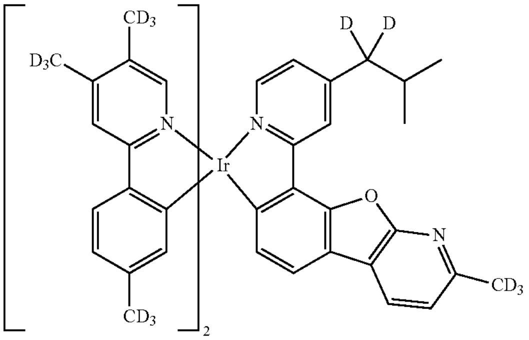
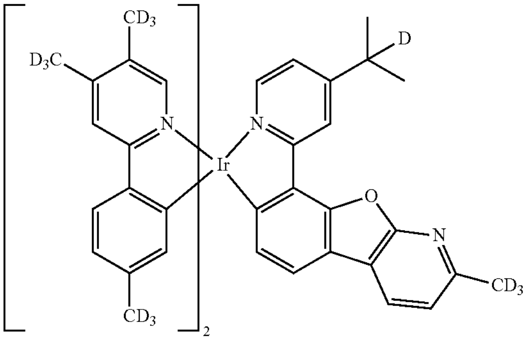
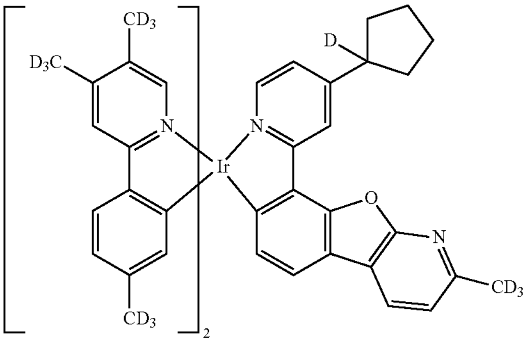

TABLE 6-continued
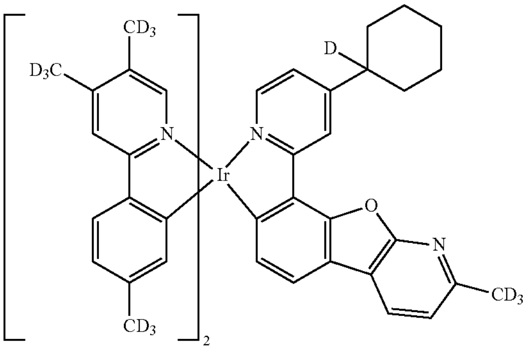
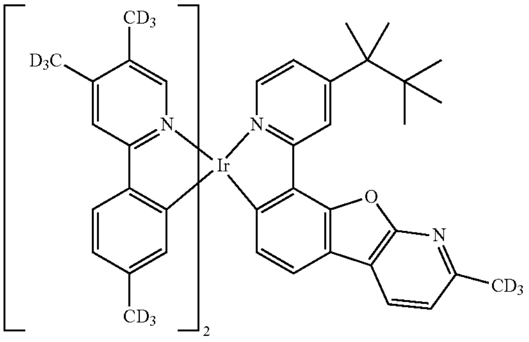
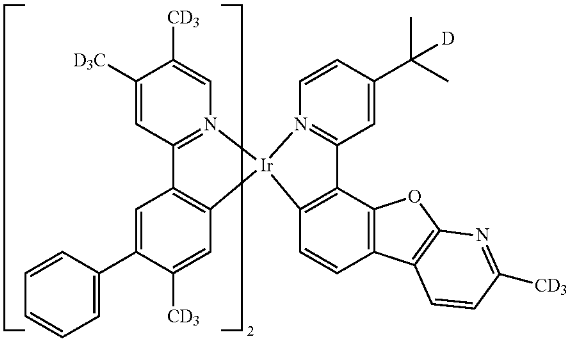
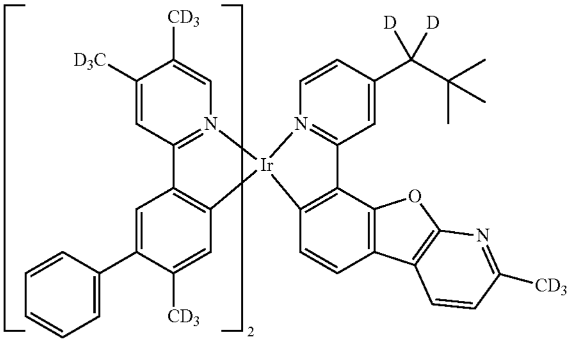

TABLE 6-continued
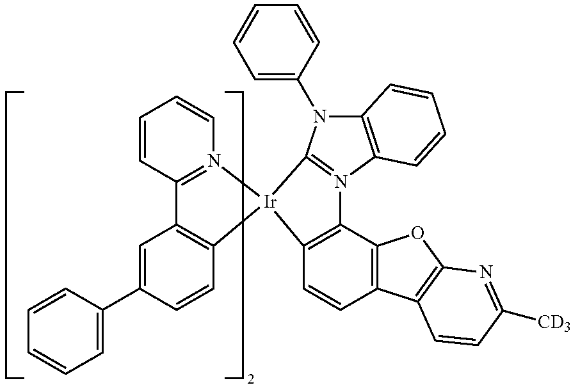
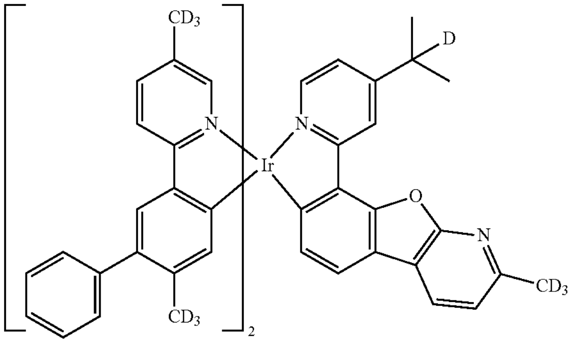
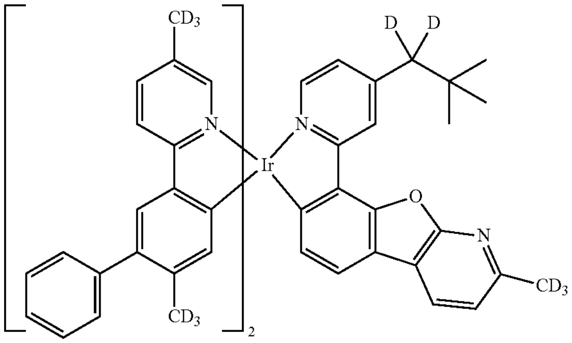
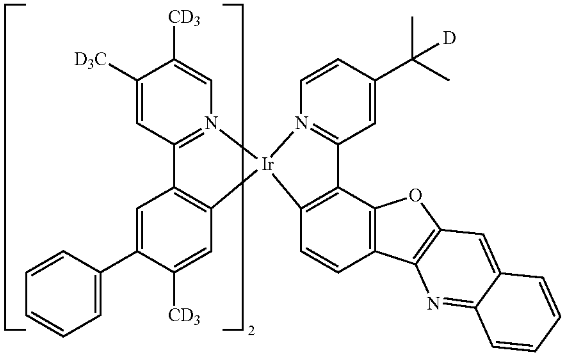

TABLE 6-continued
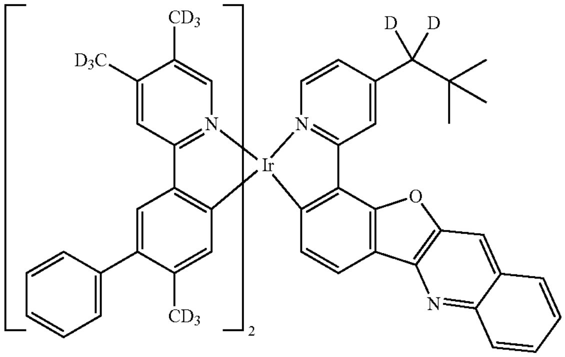
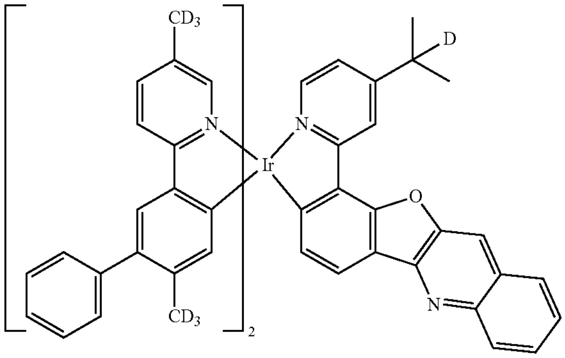
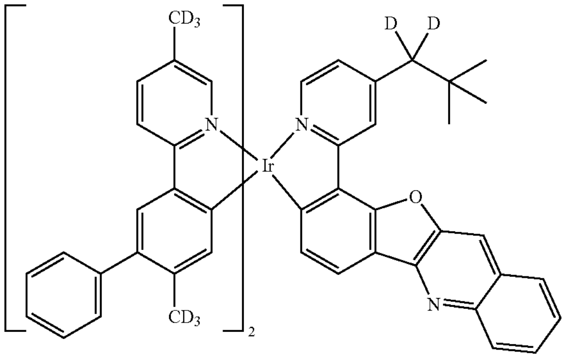
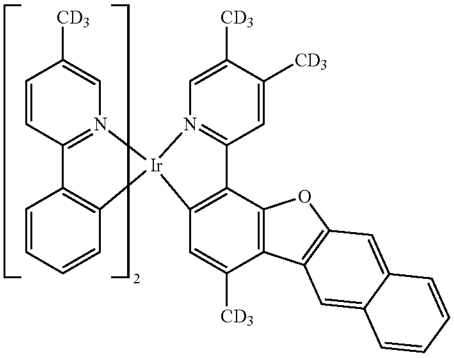

TABLE 6-continued
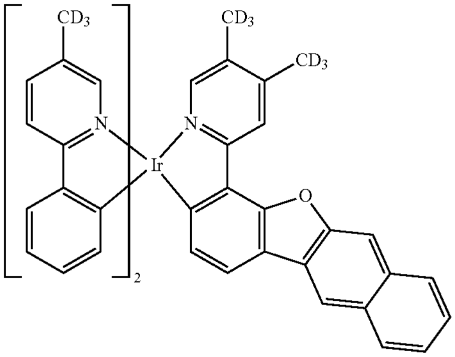
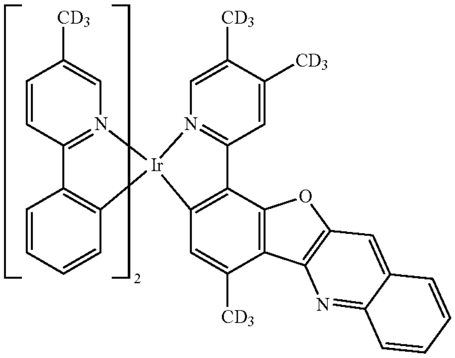
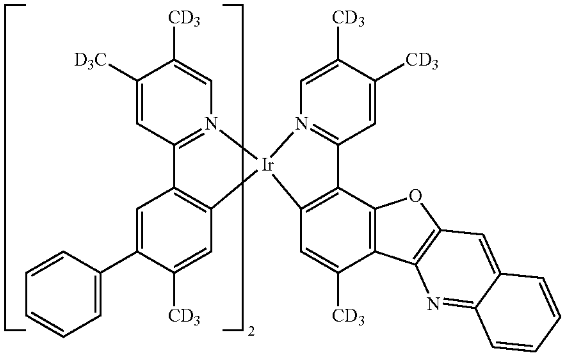
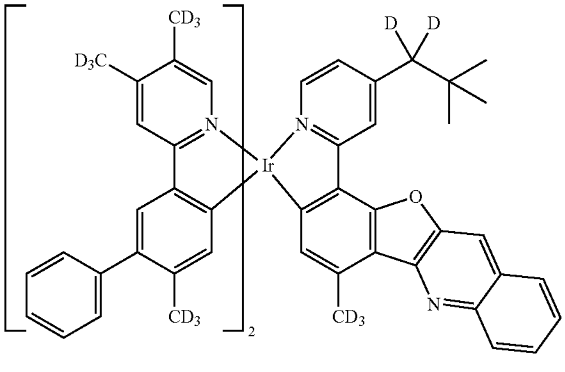

TABLE 6-continued
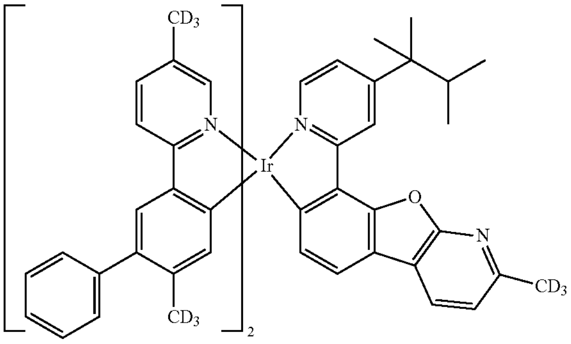
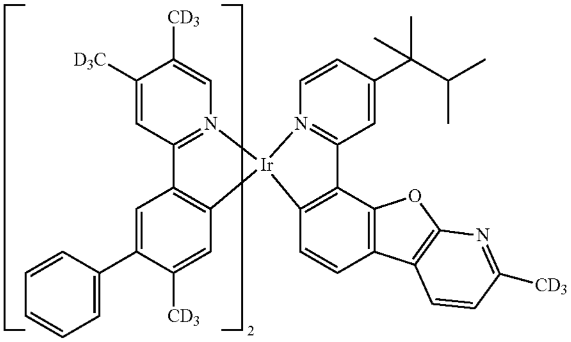
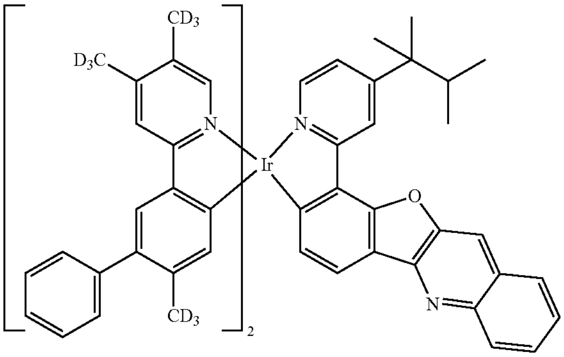
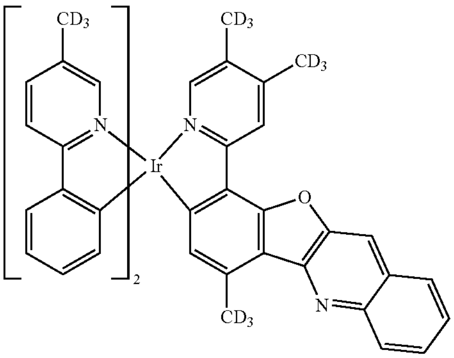

TABLE 6-continued
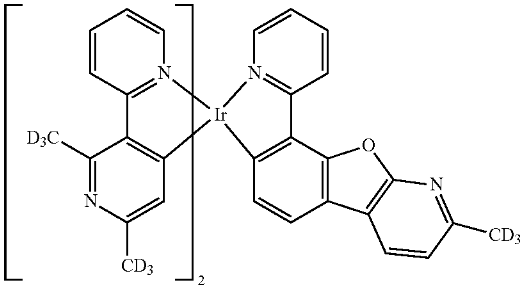
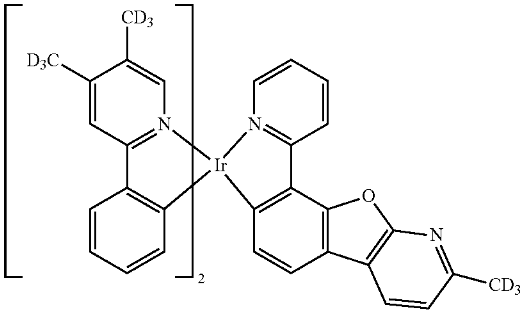
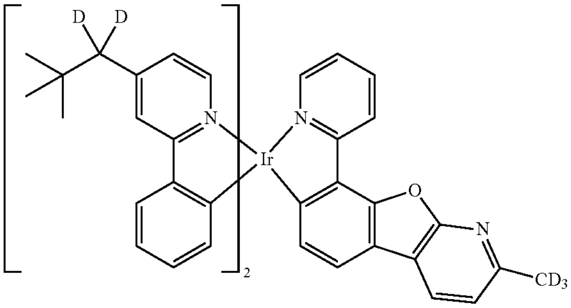
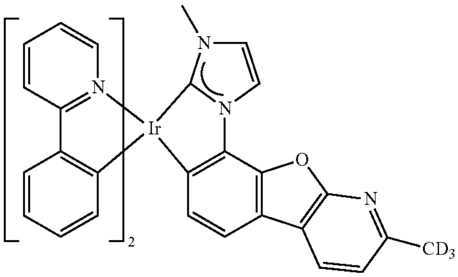
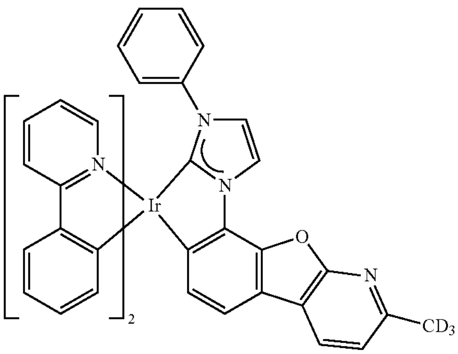

TABLE 6-continued
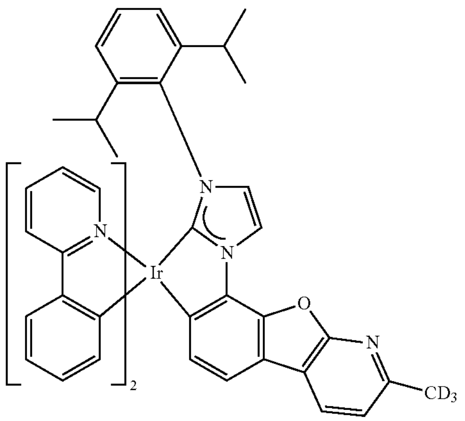
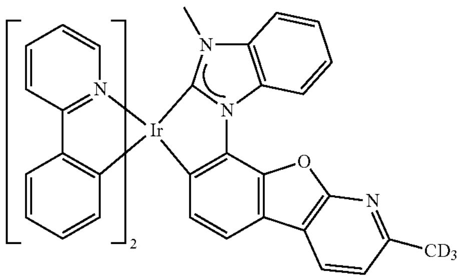
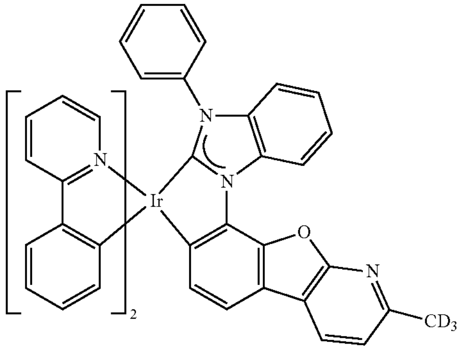
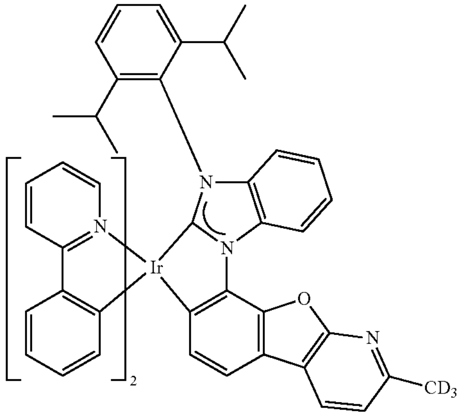

TABLE 6-continued
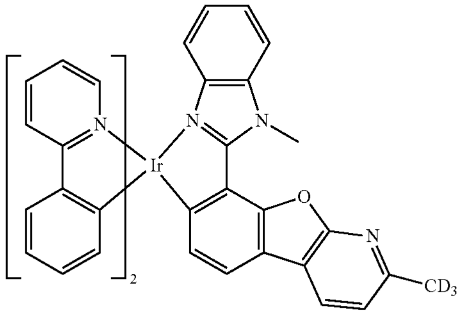
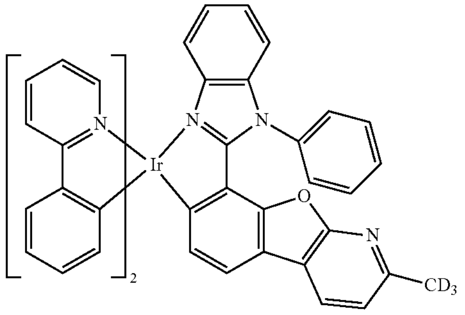
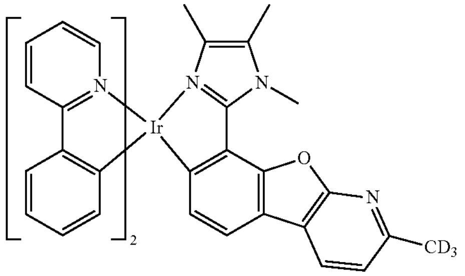
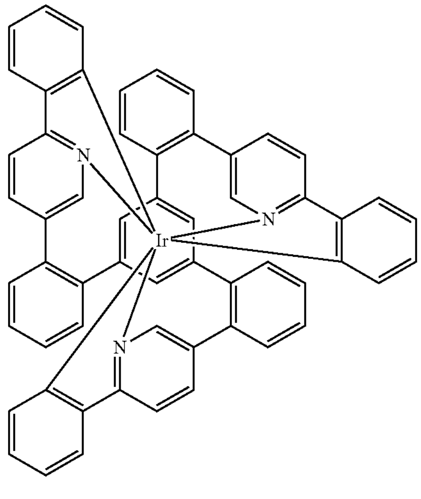

TABLE 6-continued
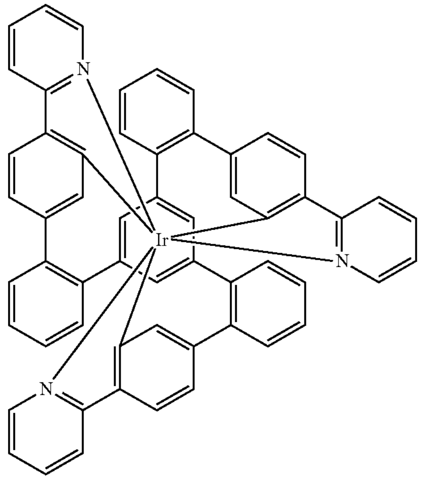
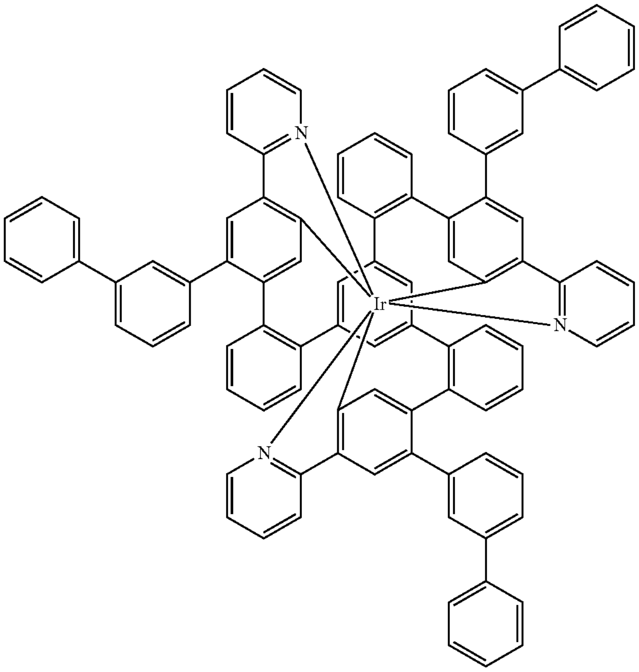
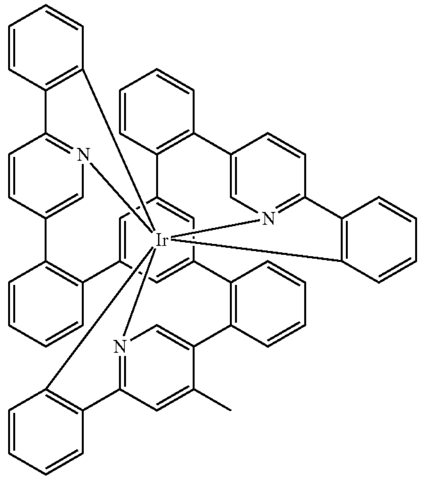

TABLE 6-continued
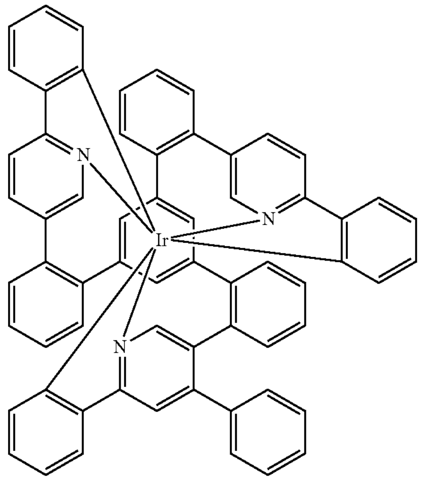
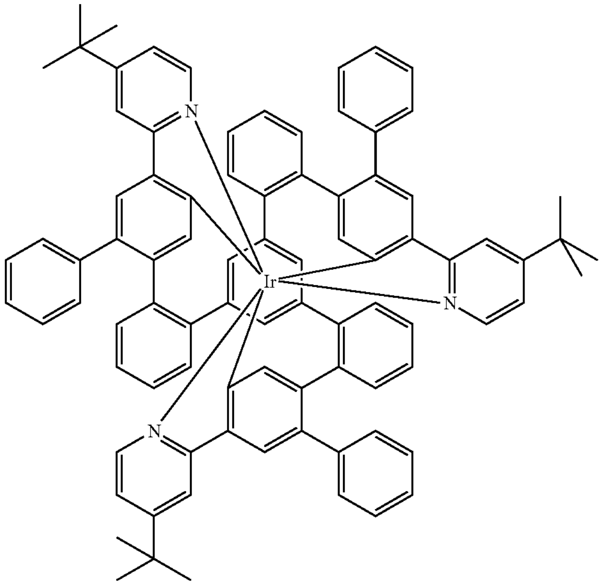
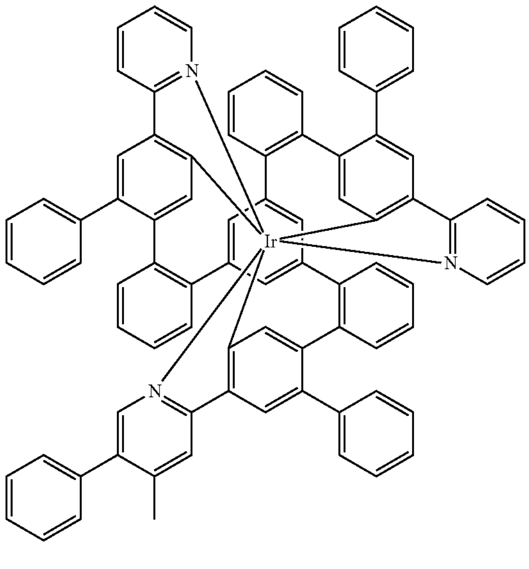

TABLE 6-continued
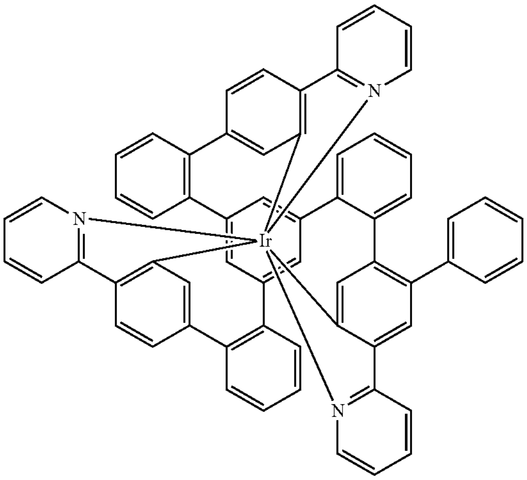
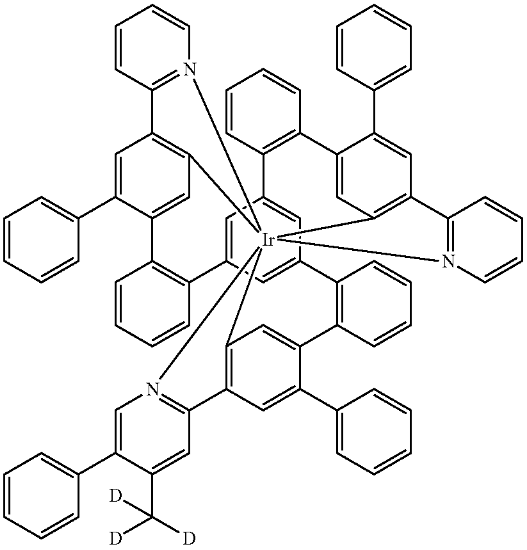
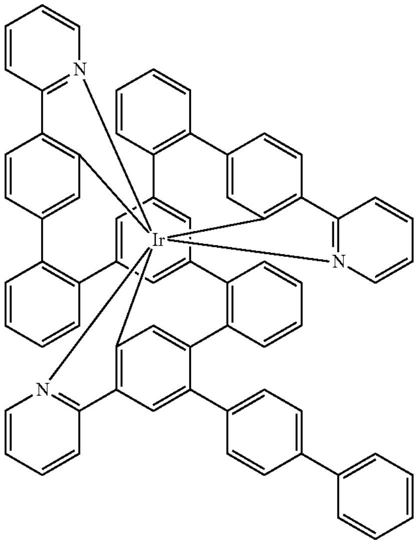

TABLE 6-continued
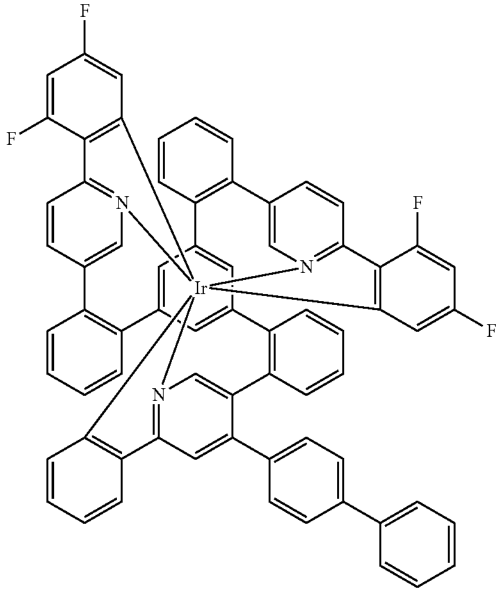
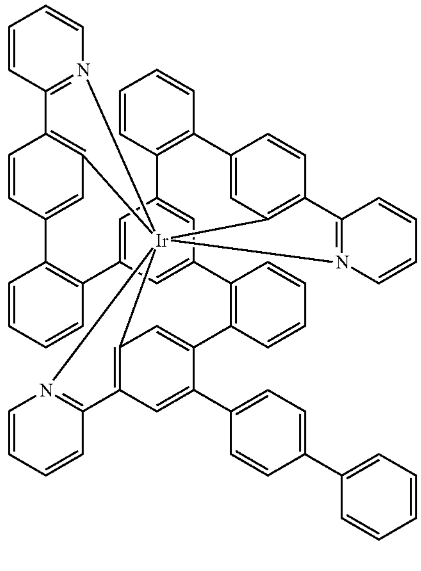

TABLE 6-continued
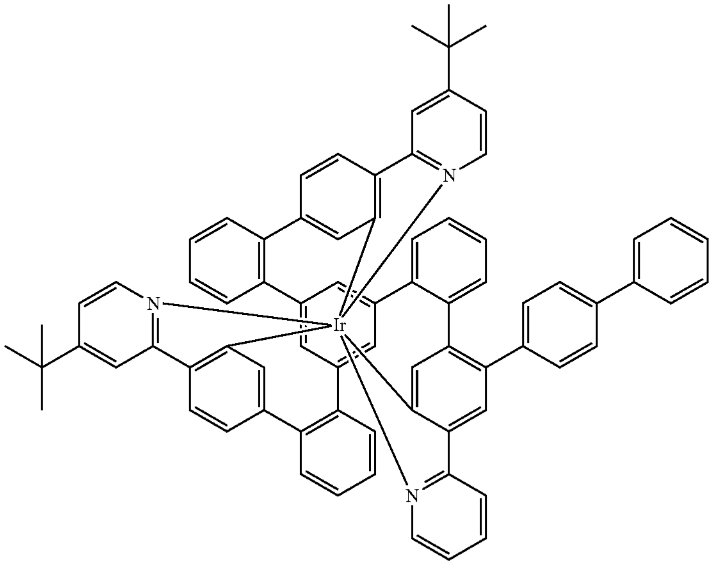
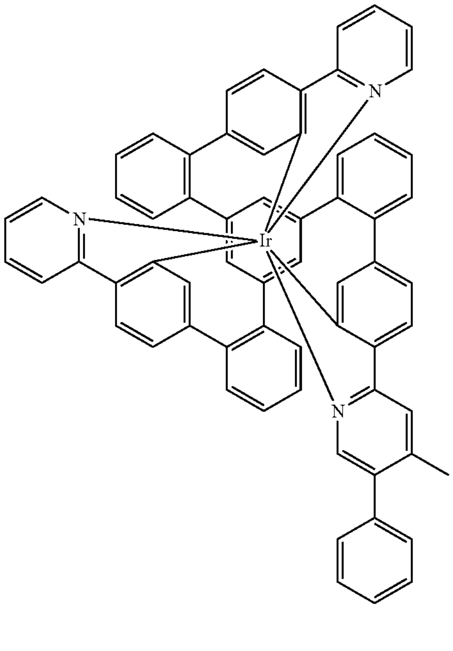

TABLE 6-continued
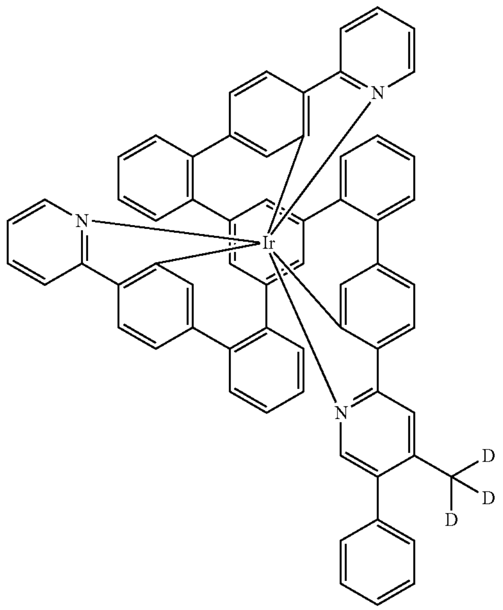
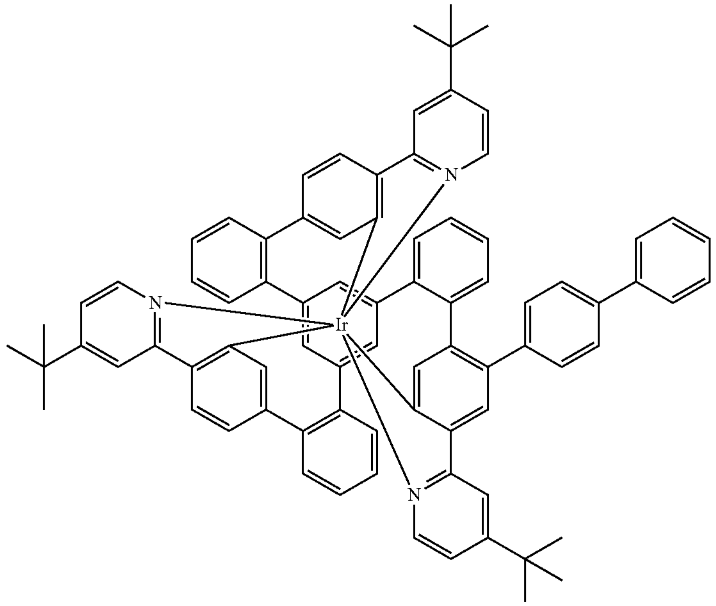

TABLE 6-continued
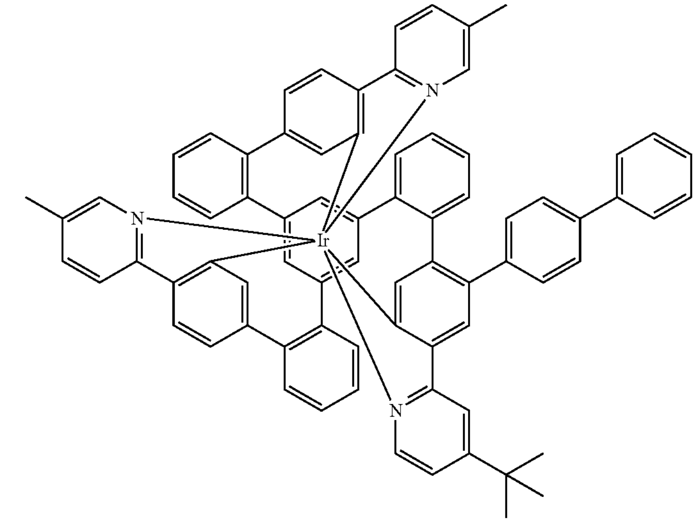
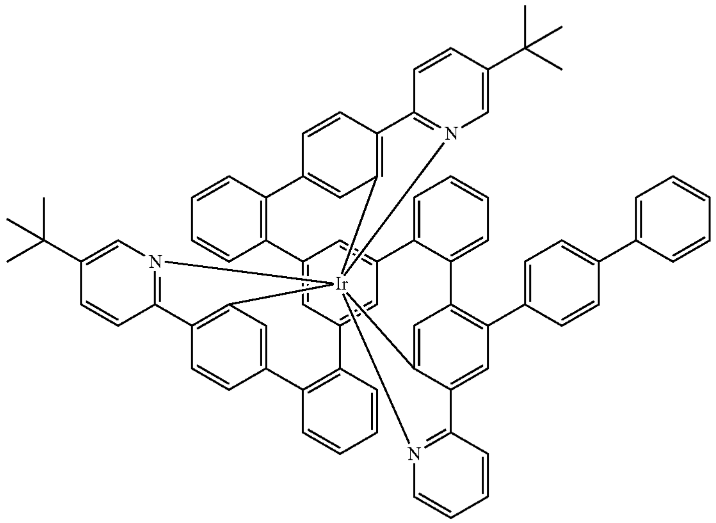
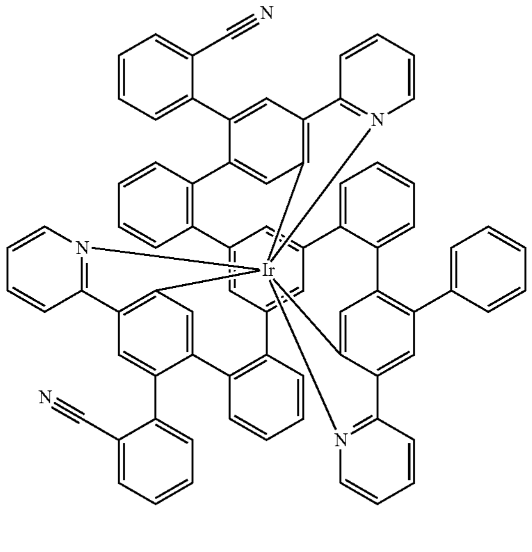

TABLE 6-continued
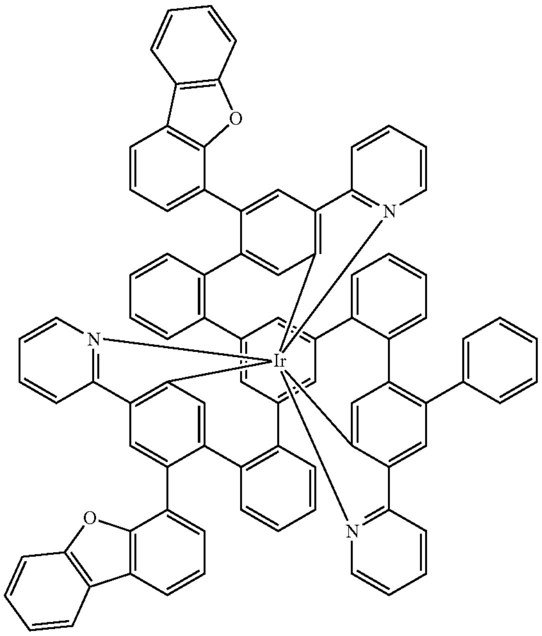
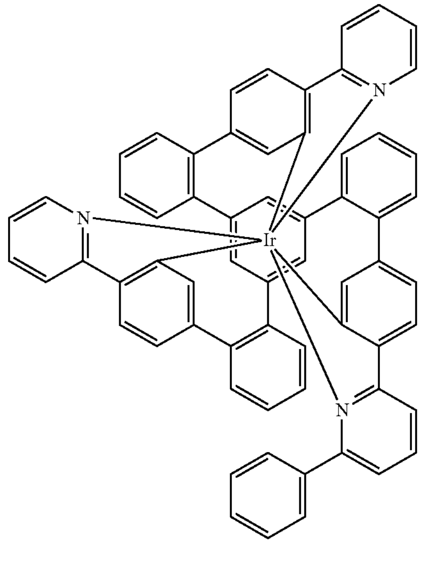

TABLE 6-continued
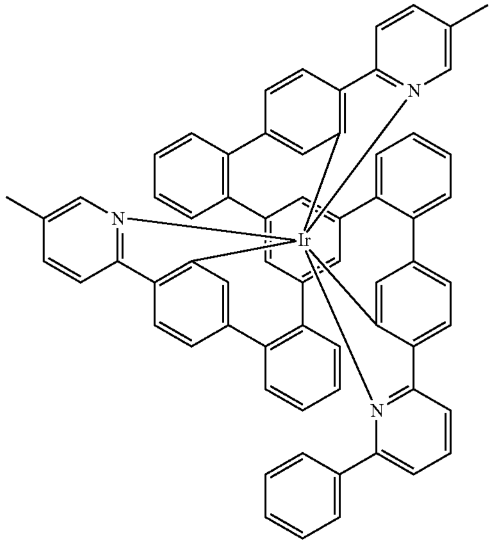
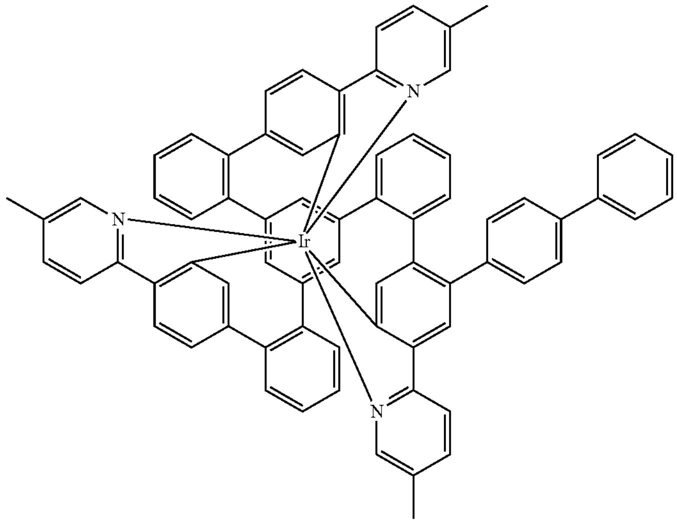
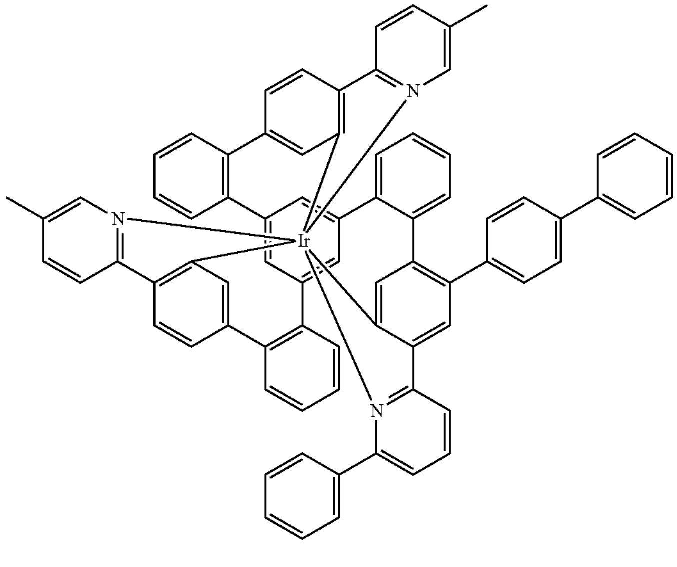

TABLE 6-continued
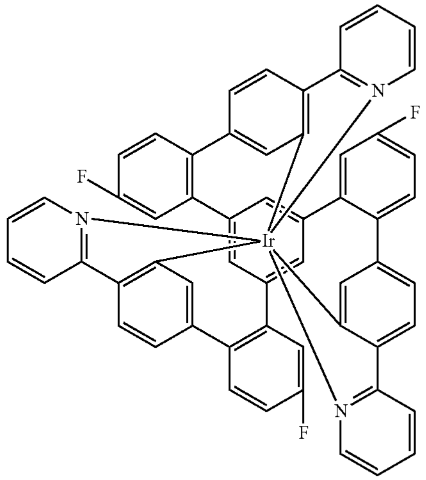
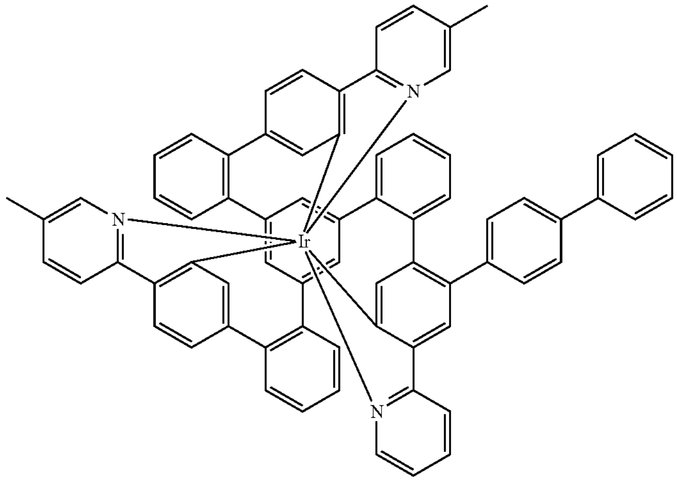
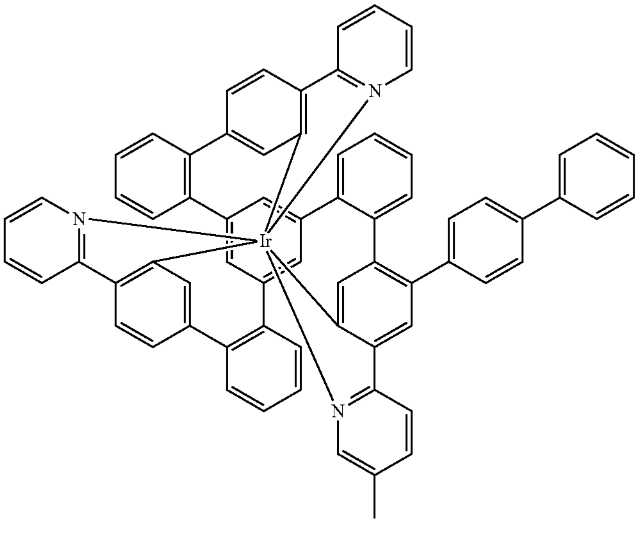

TABLE 6-continued
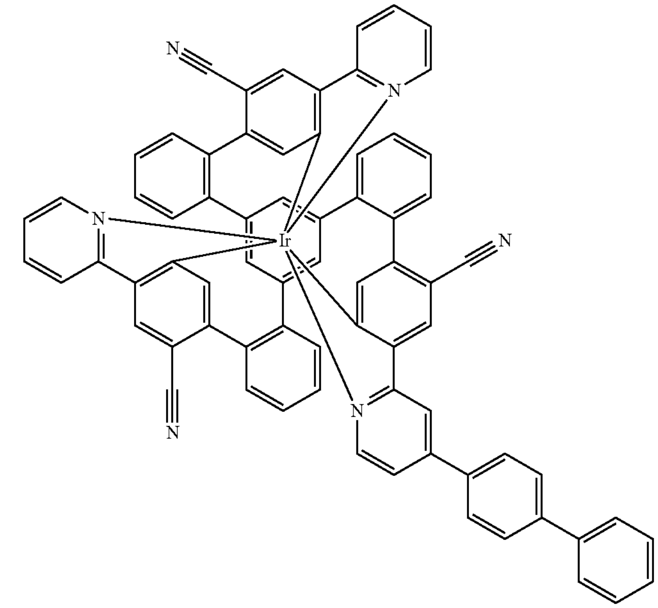
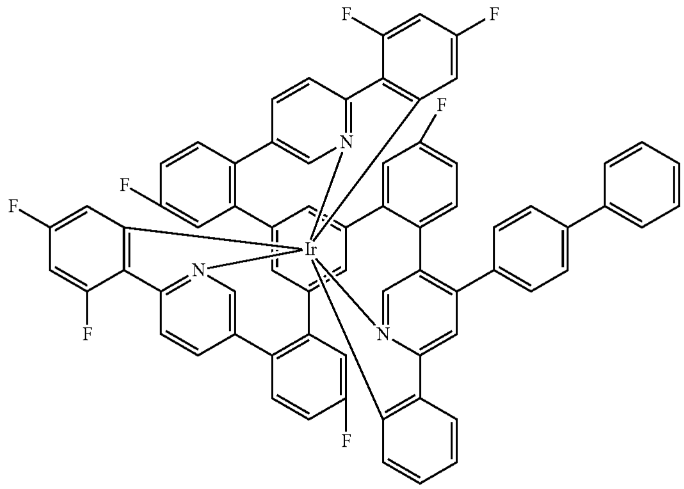
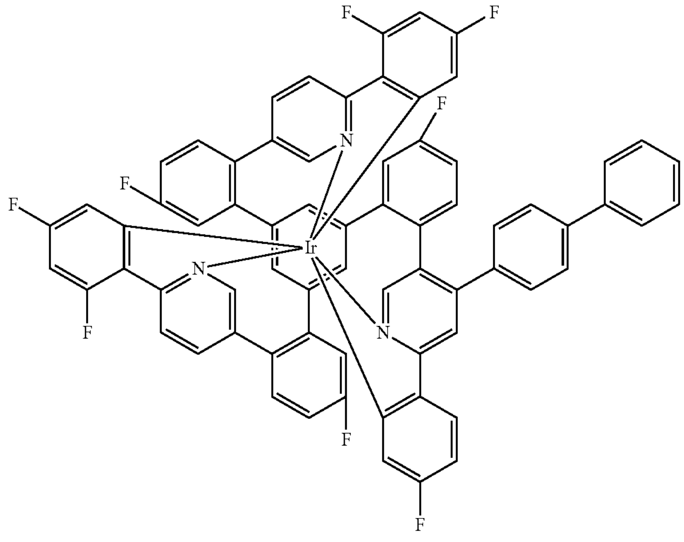

TABLE 6-continued
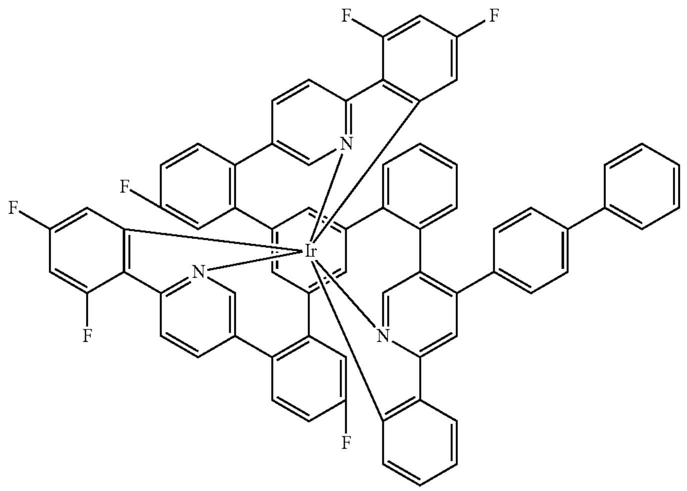
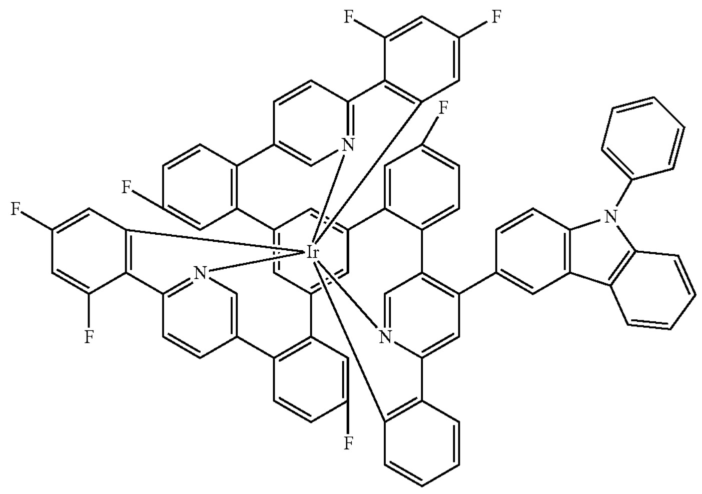
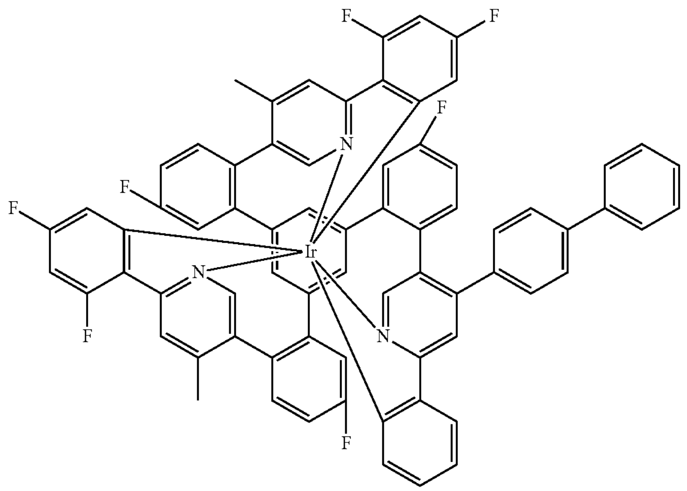

TABLE 6-continued
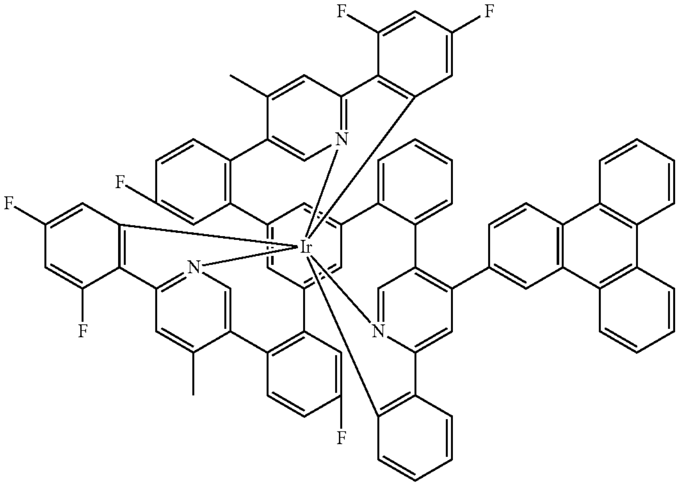
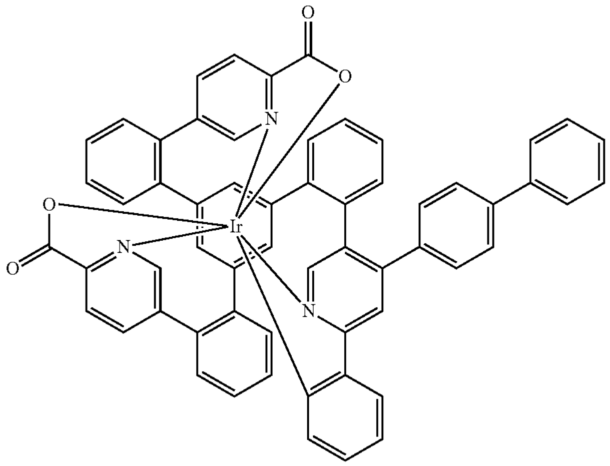
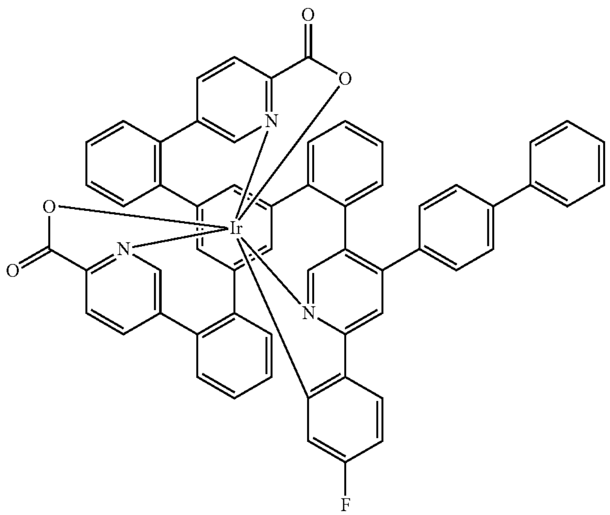

TABLE 6-continued
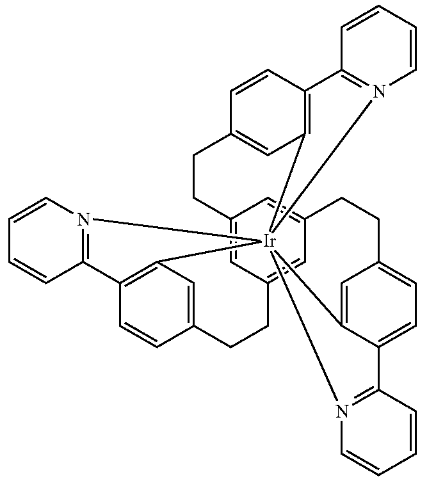
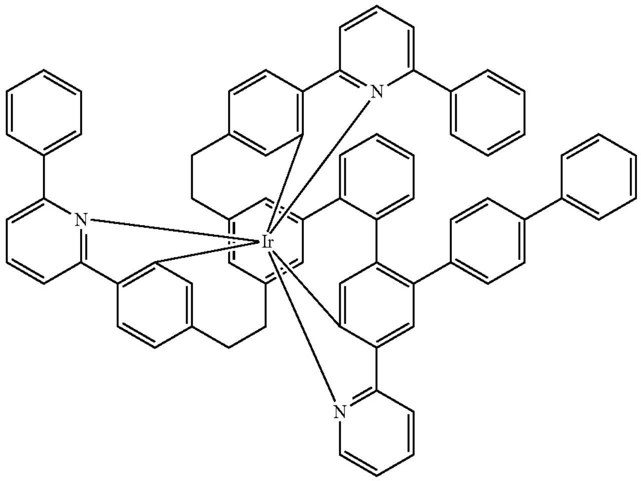
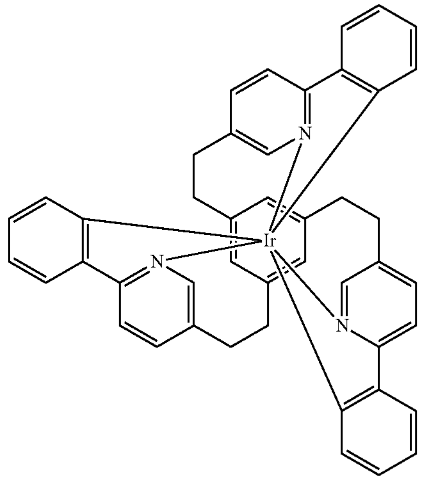

TABLE 6-continued
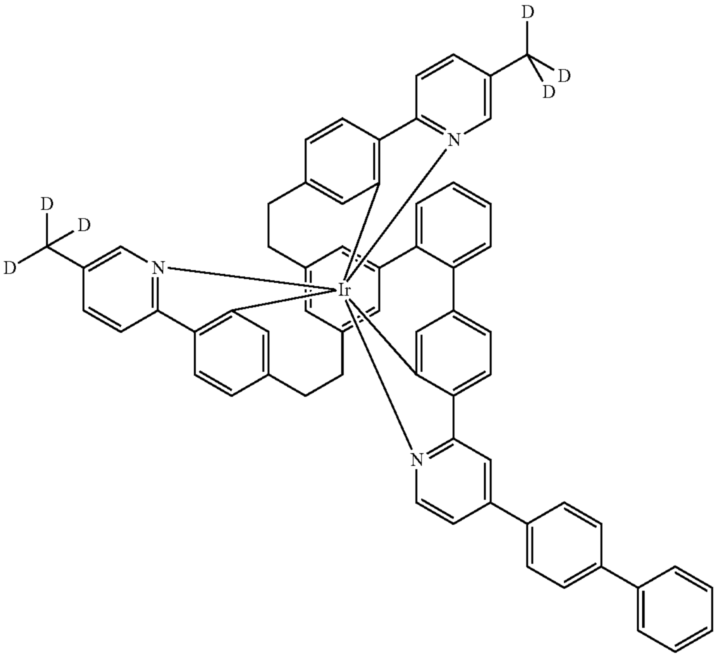
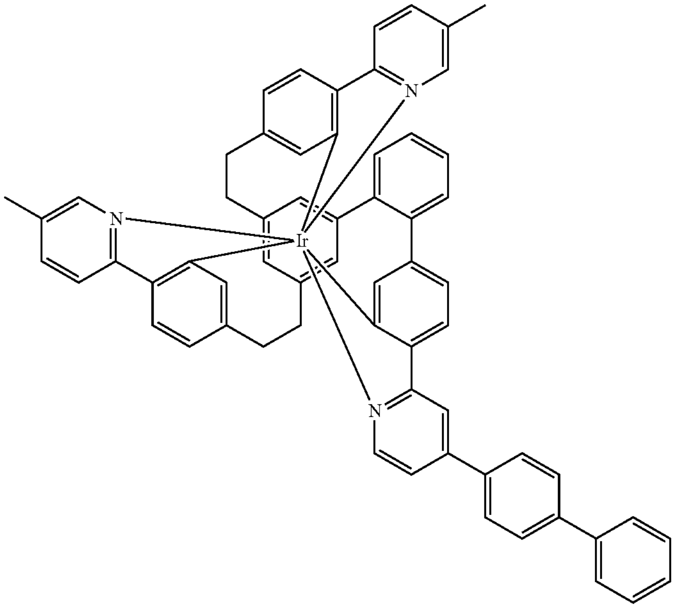

TABLE 6-continued
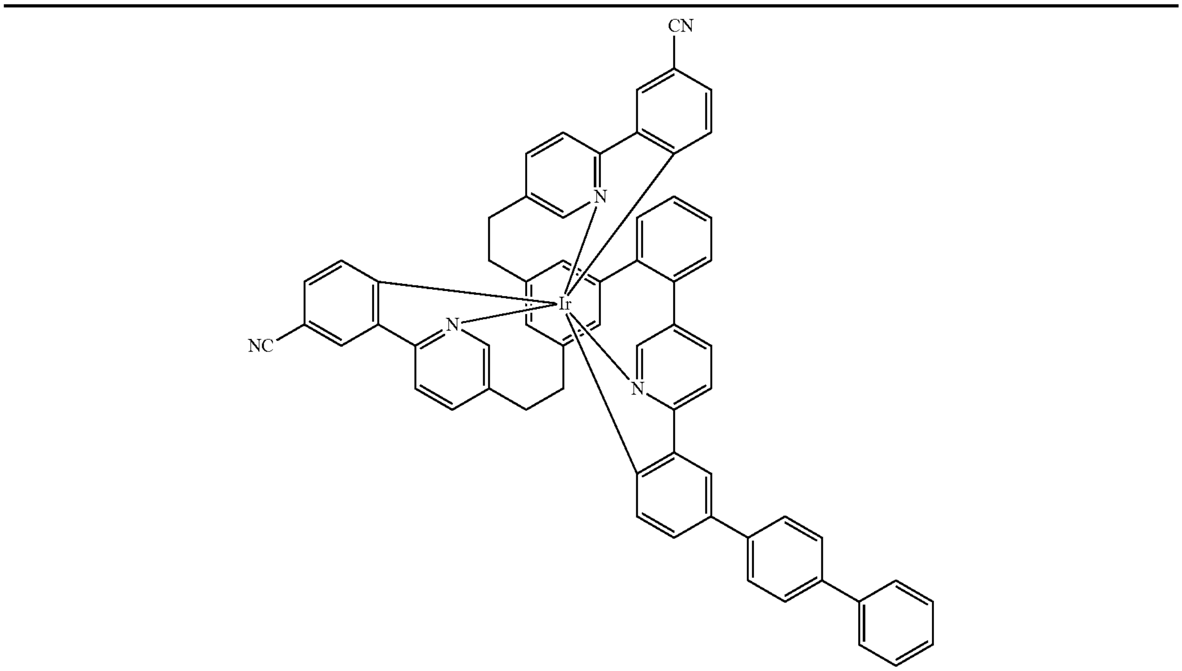
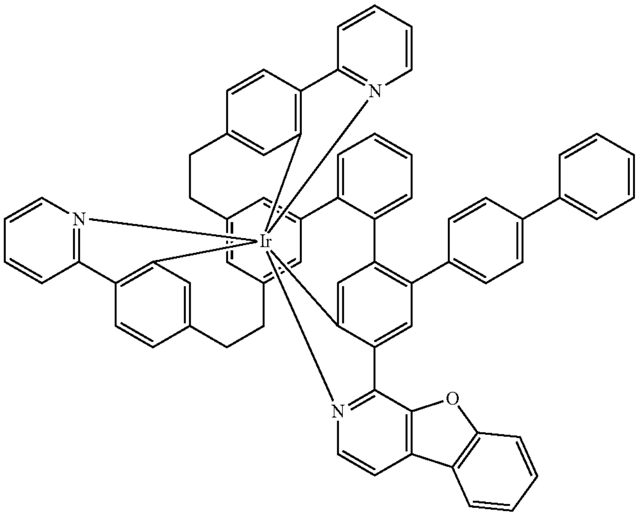
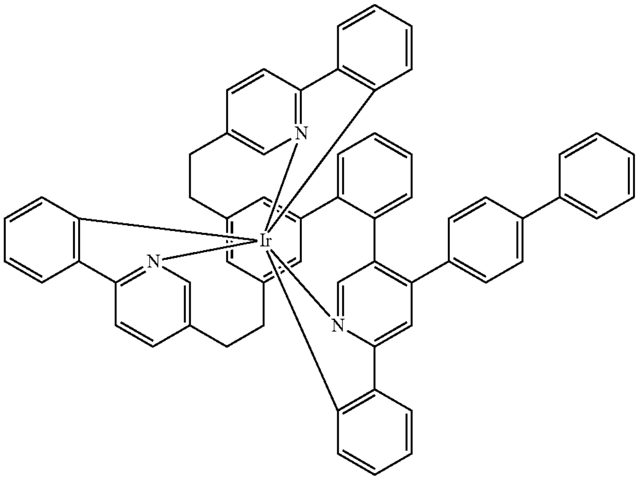

TABLE 6-continued
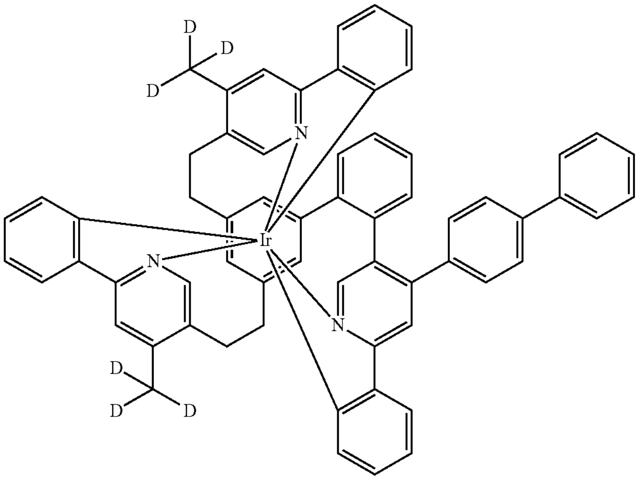
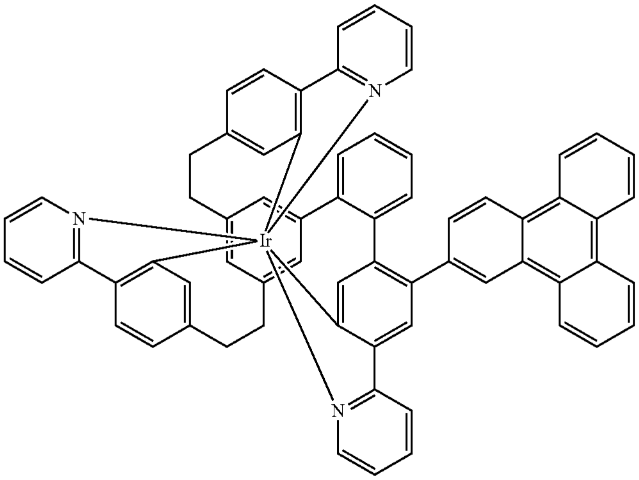
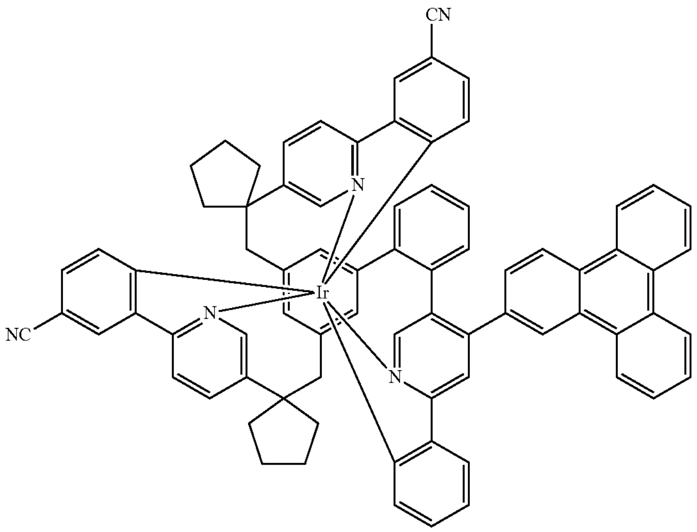

TABLE 6-continued
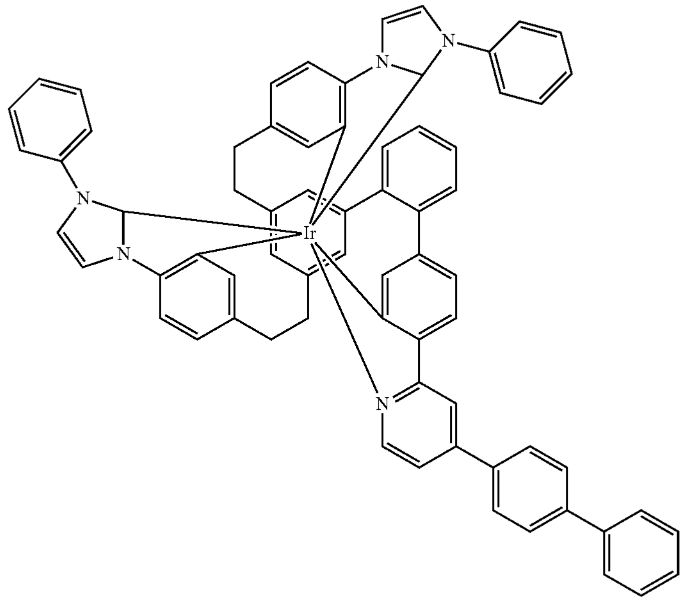
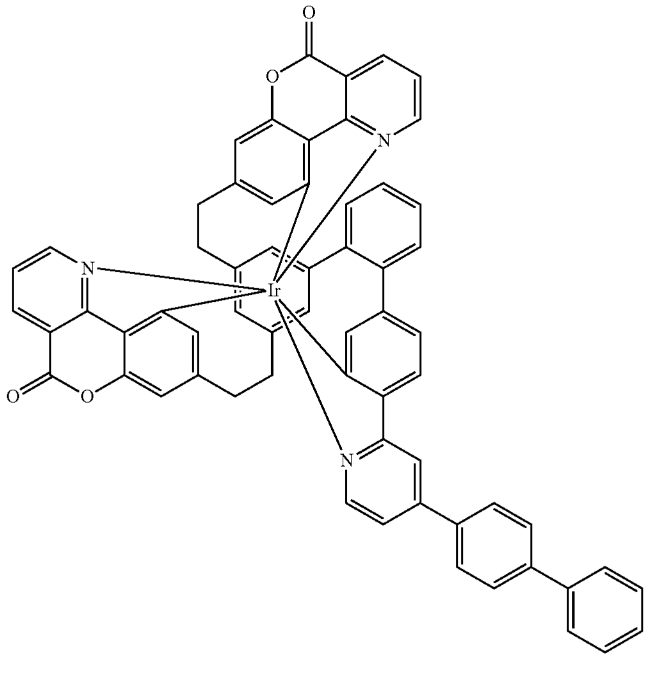

TABLE 6-continued
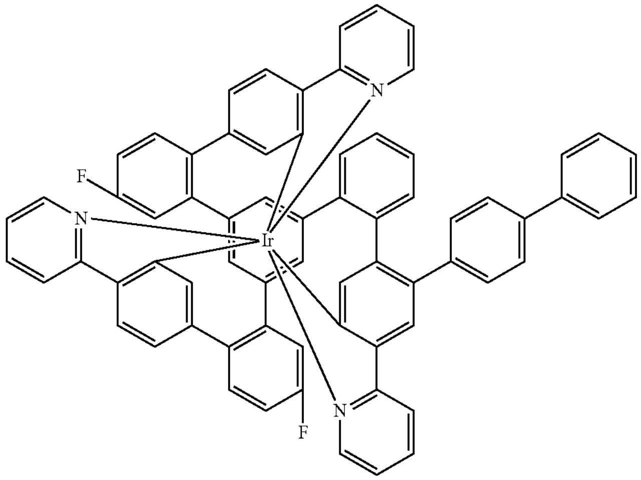
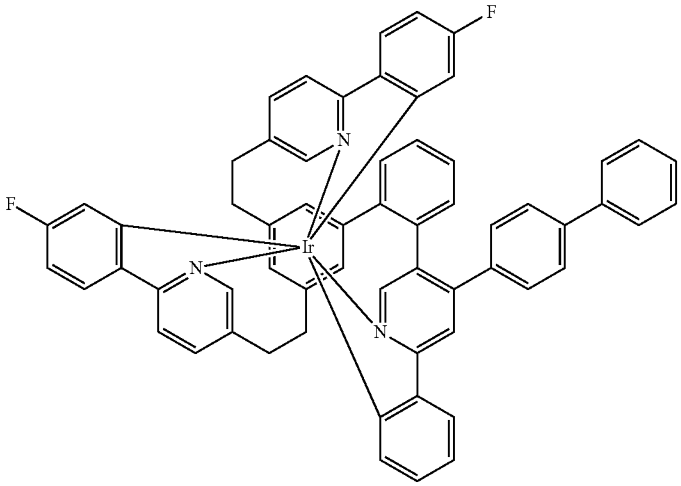
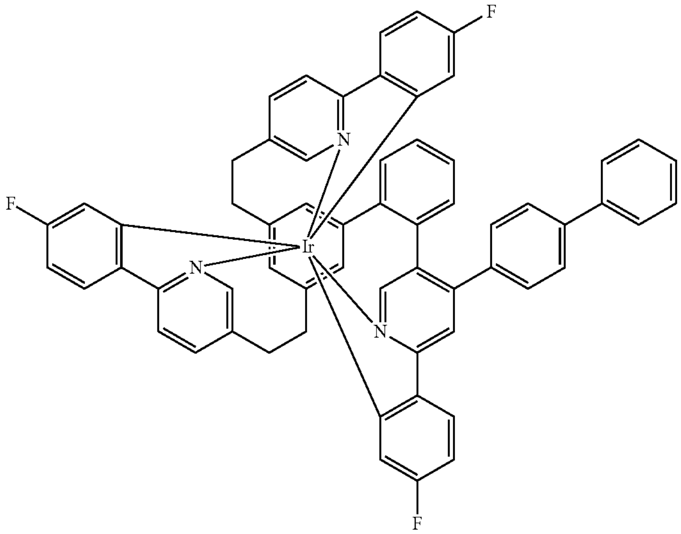

TABLE 6-continued
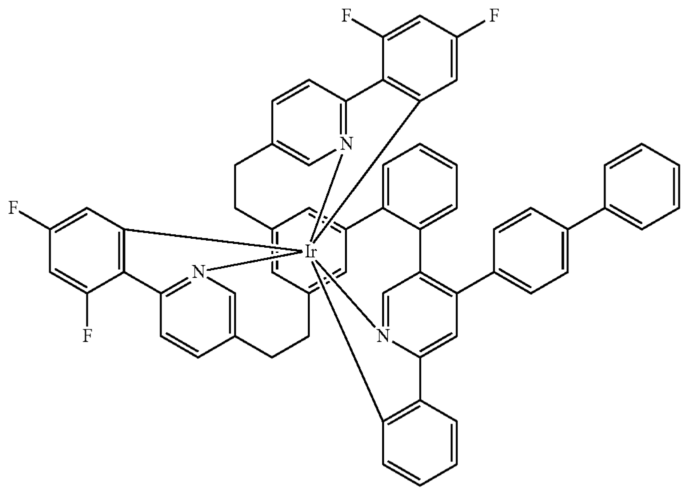
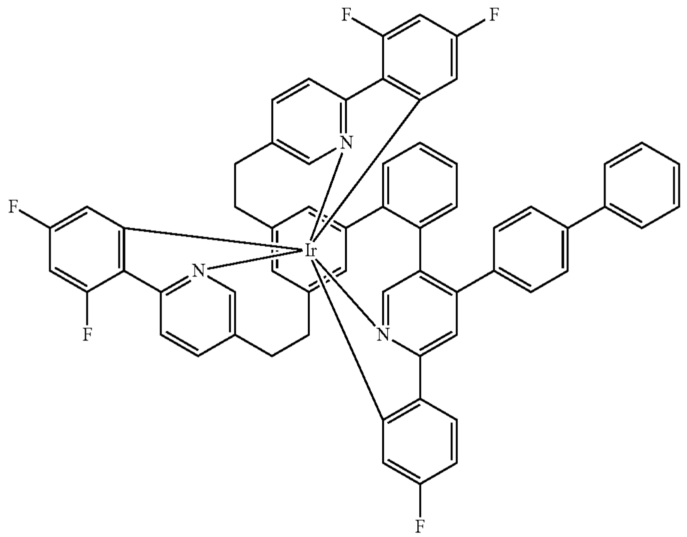
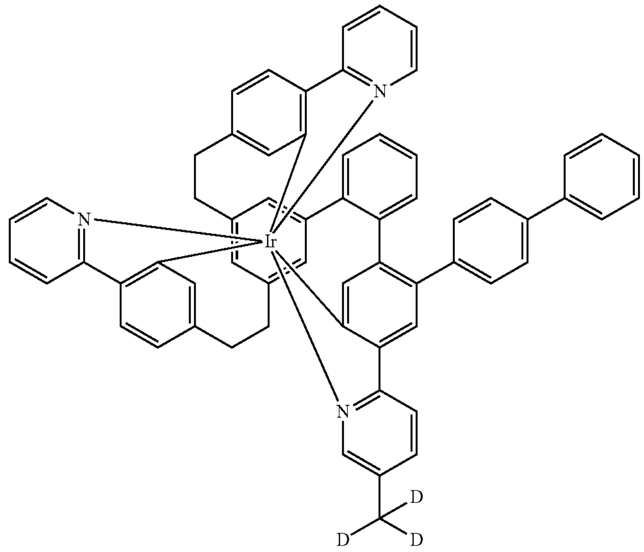

TABLE 6-continued
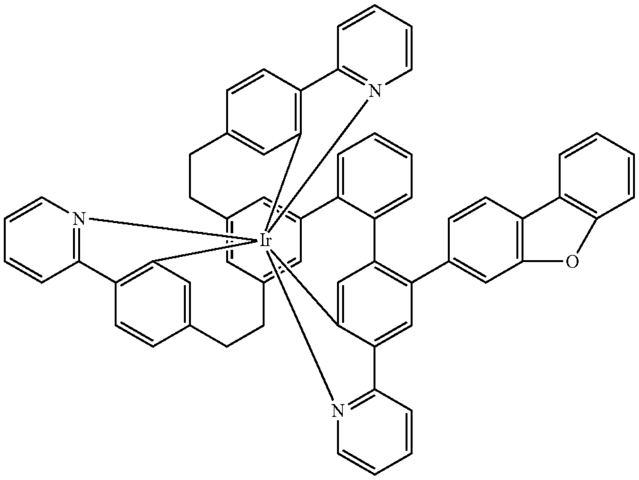
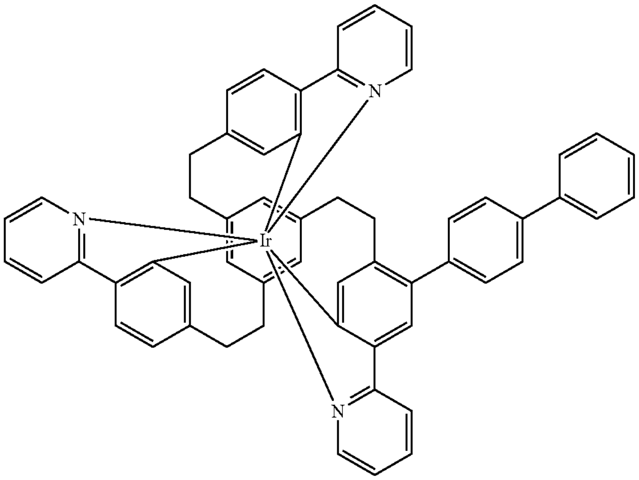
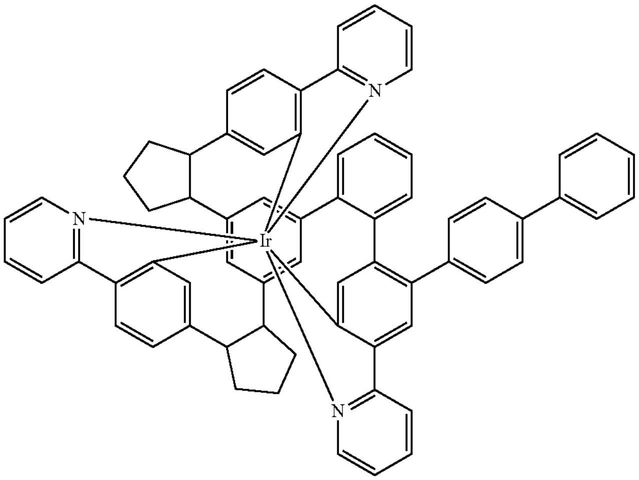

TABLE 6-continued
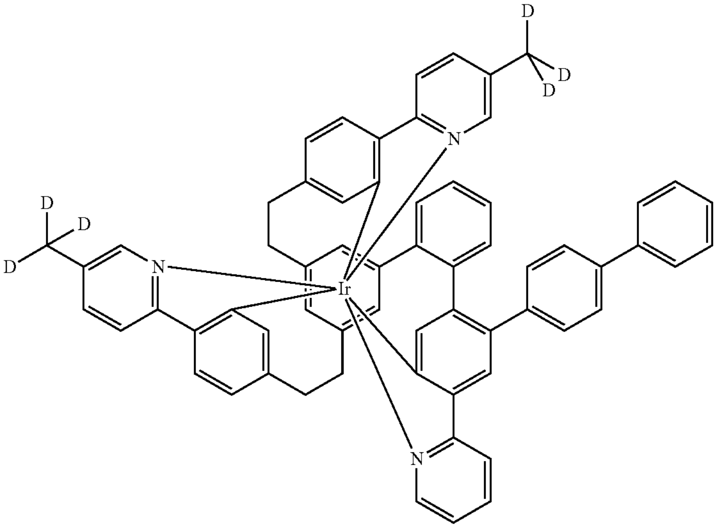
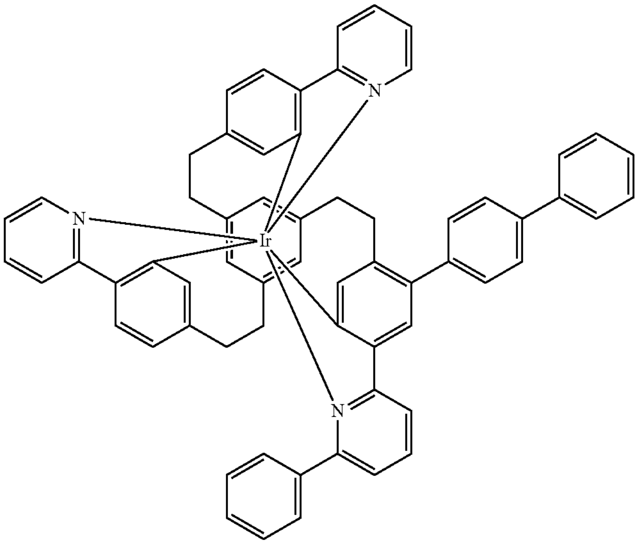
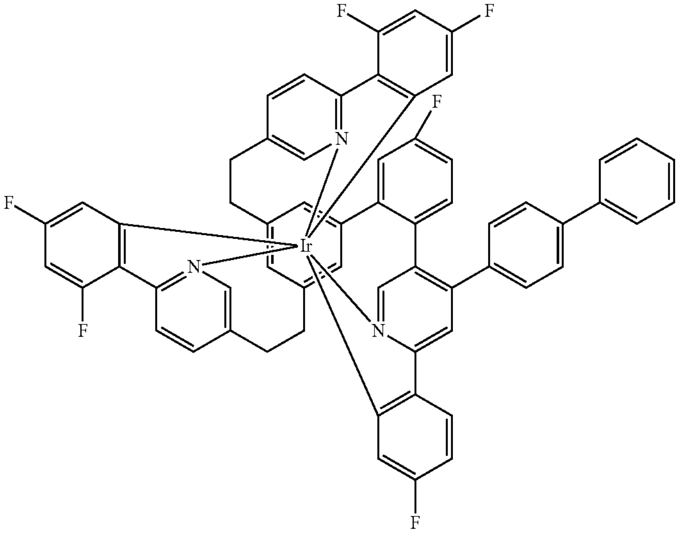

TABLE 6-continued
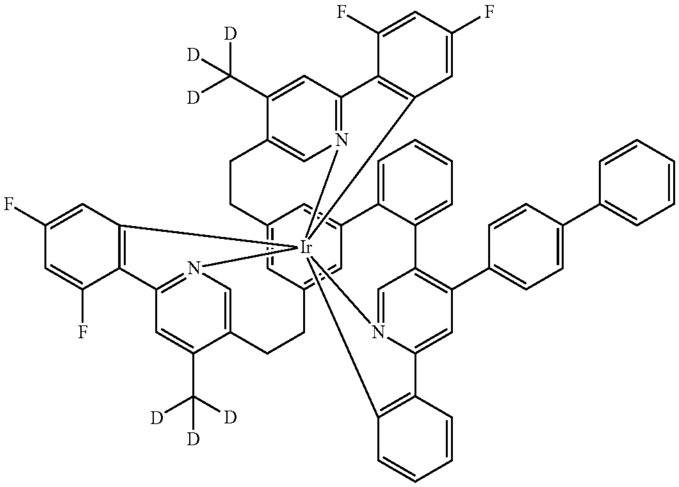
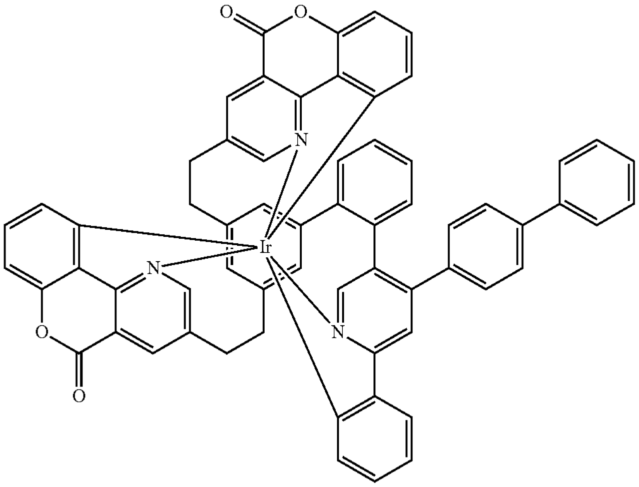
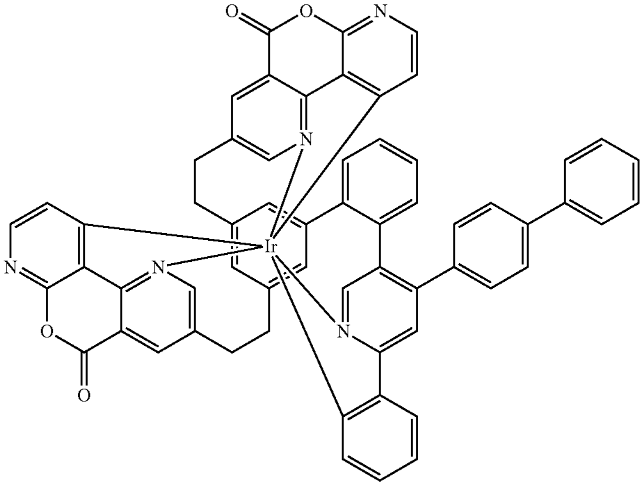

TABLE 6-continued
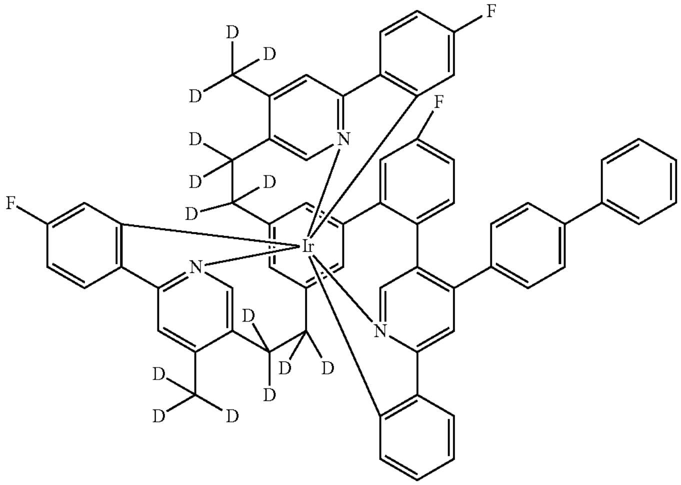
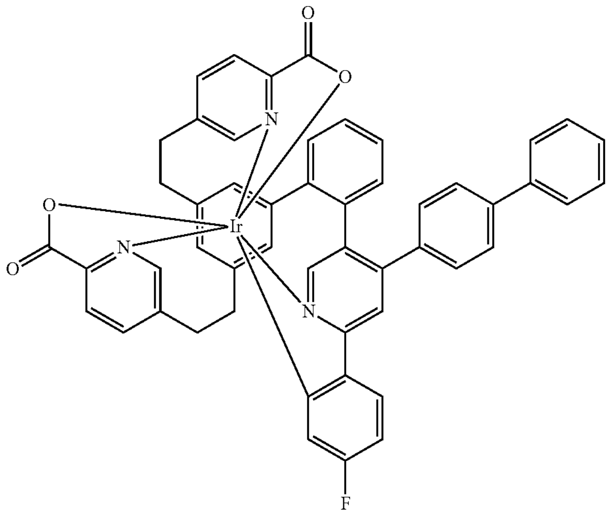
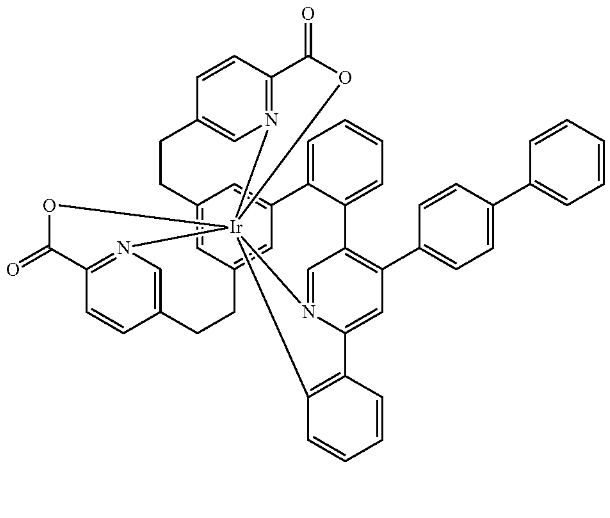

TABLE 6-continued
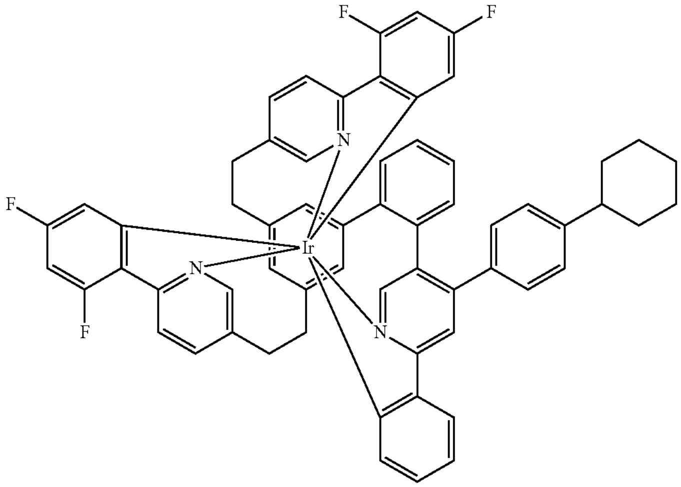
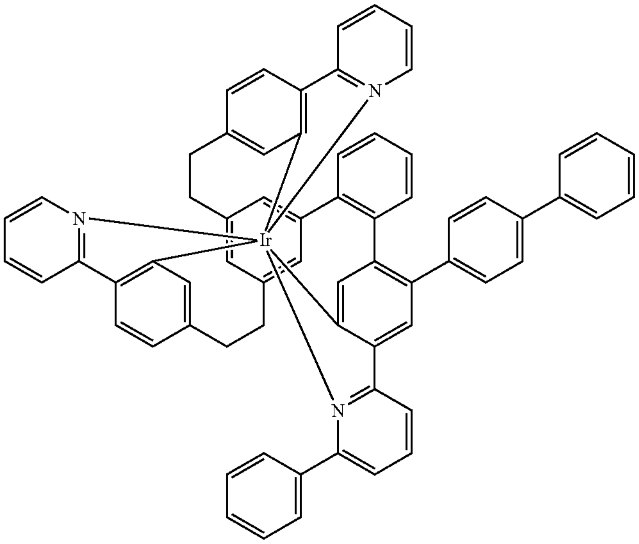
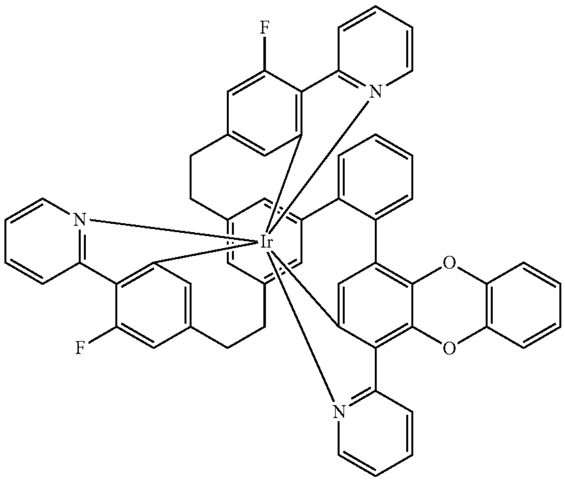

TABLE 6-continued
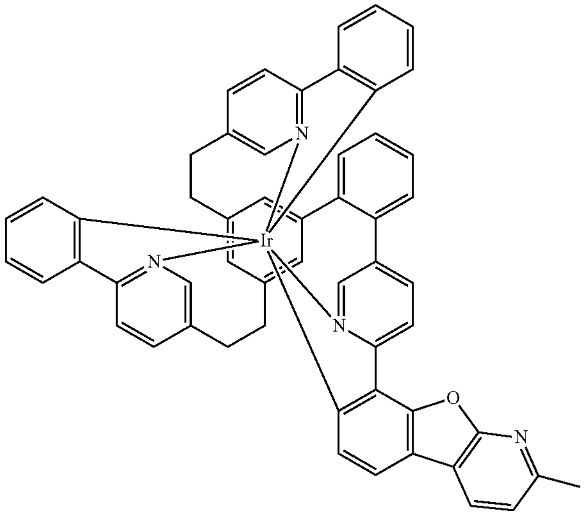
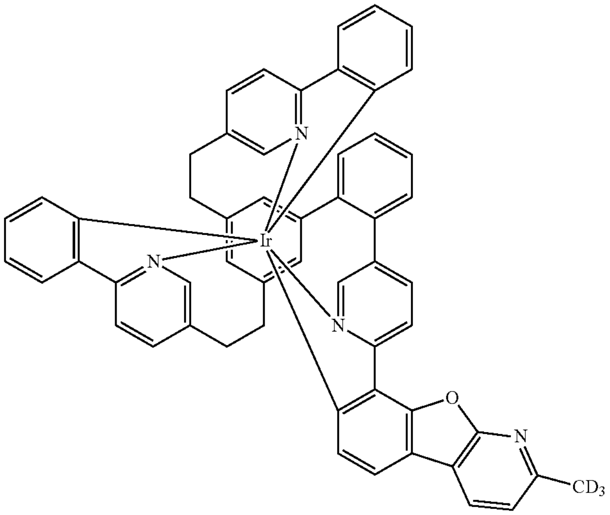
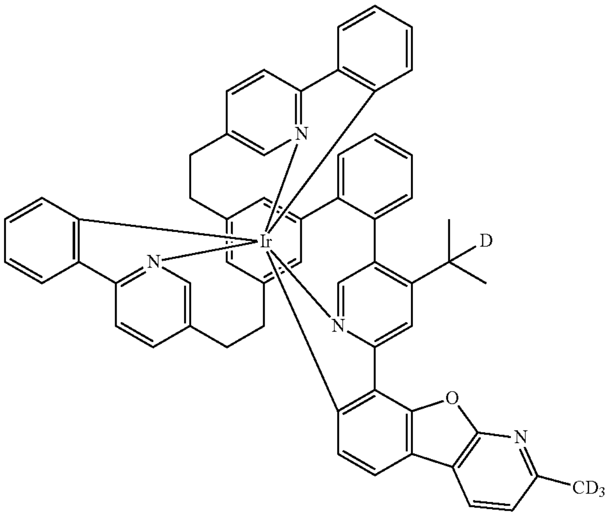

TABLE 6-continued
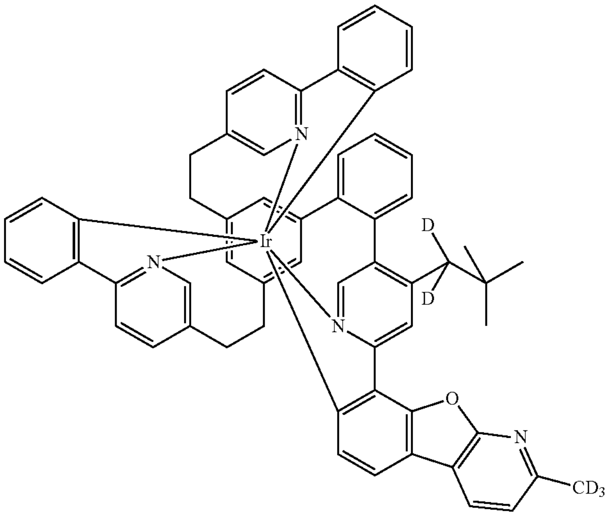
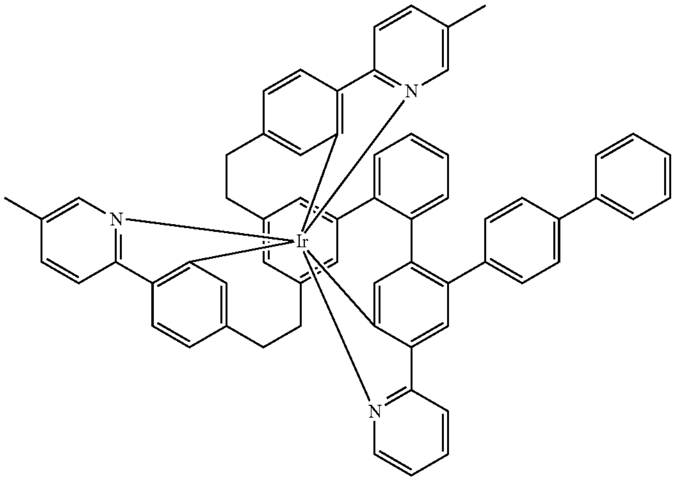
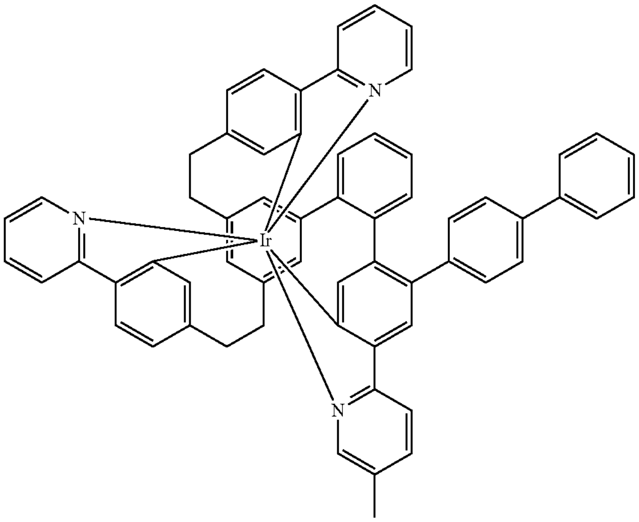

TABLE 6-continued
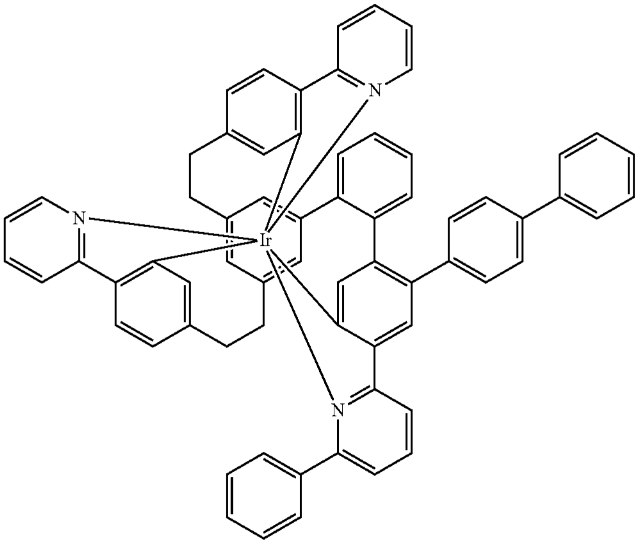
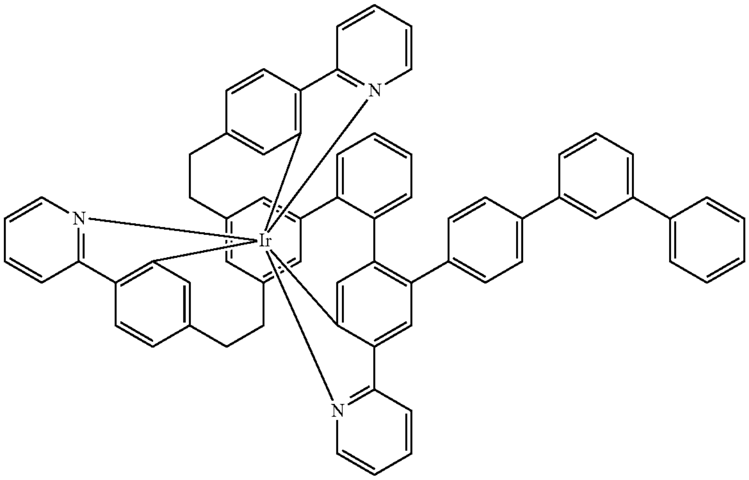
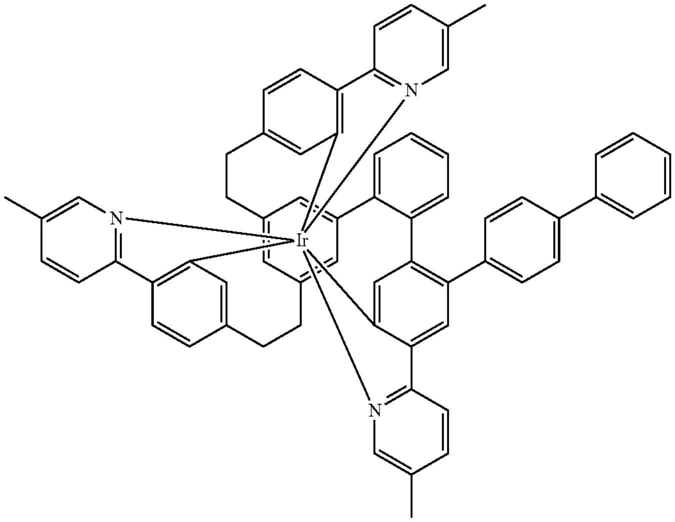

TABLE 6-continued
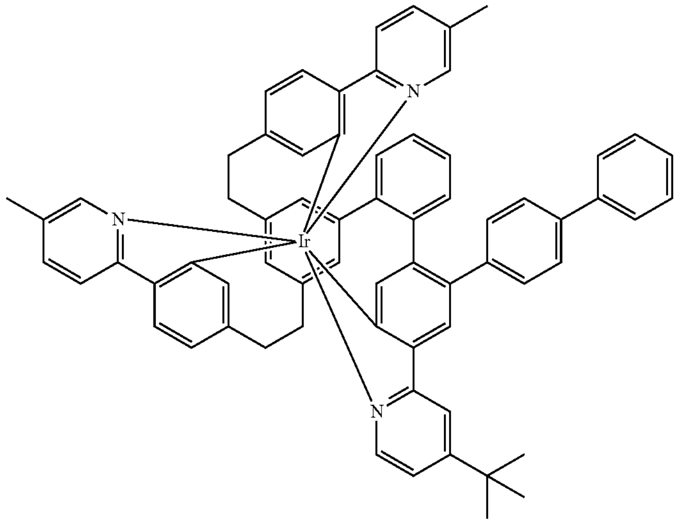
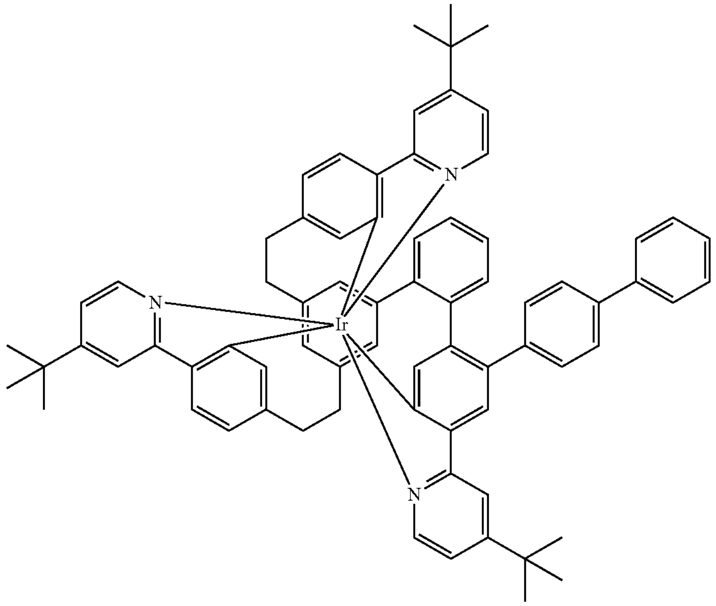

TABLE 6-continued
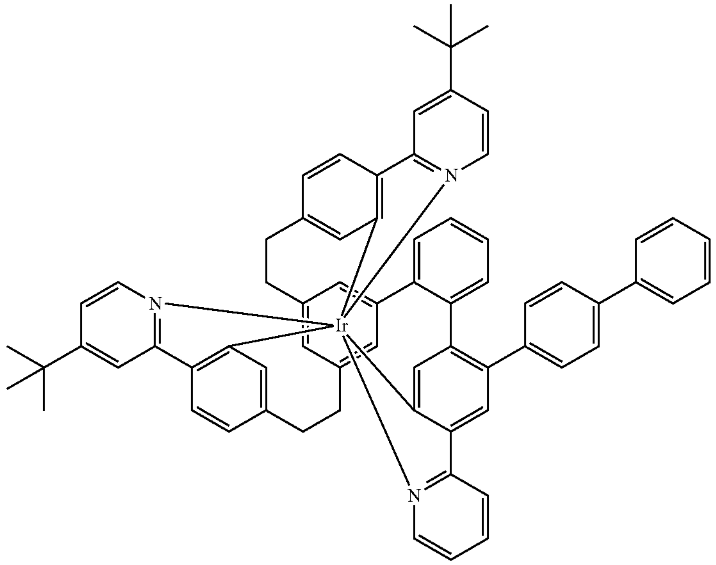
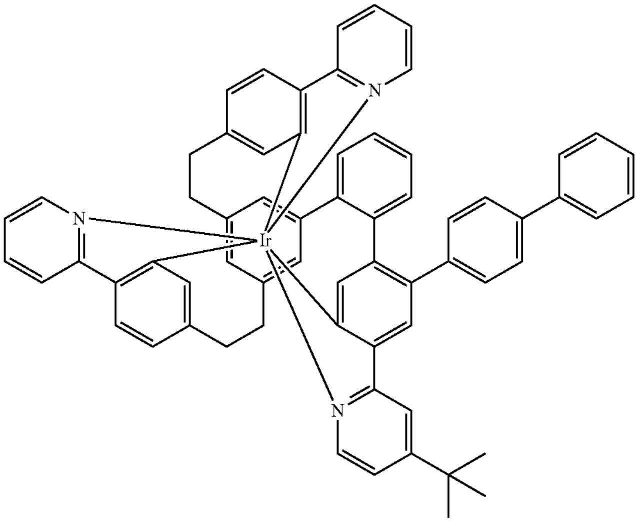

TABLE 6-continued
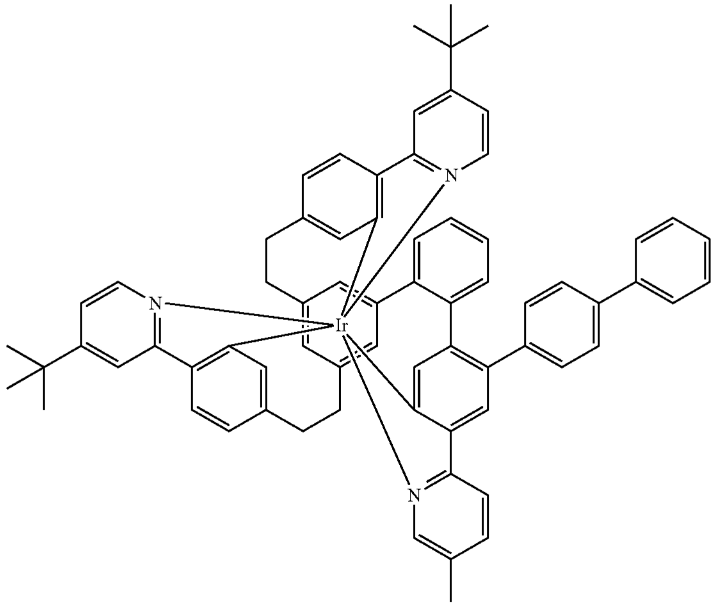
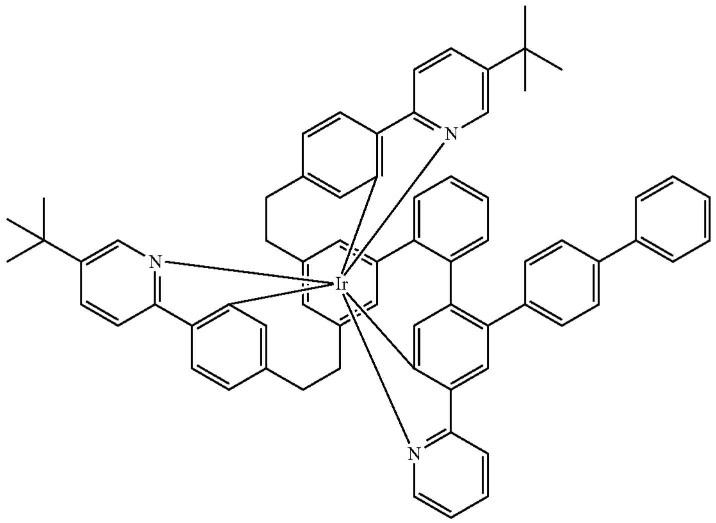

TABLE 6-continued
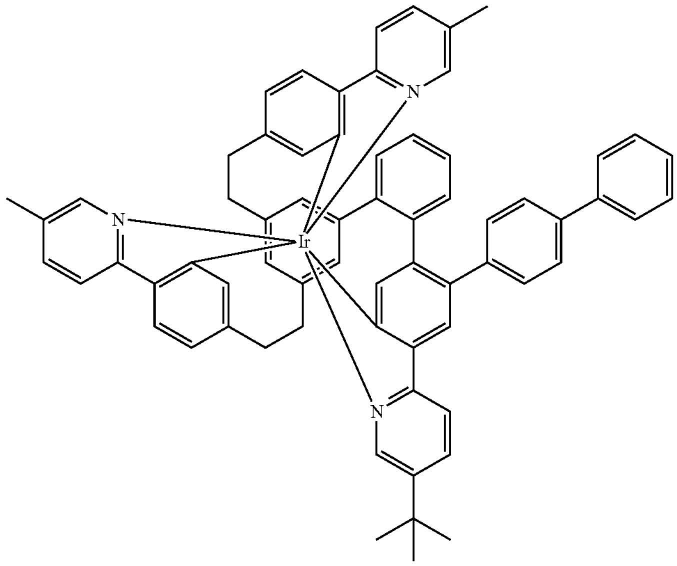
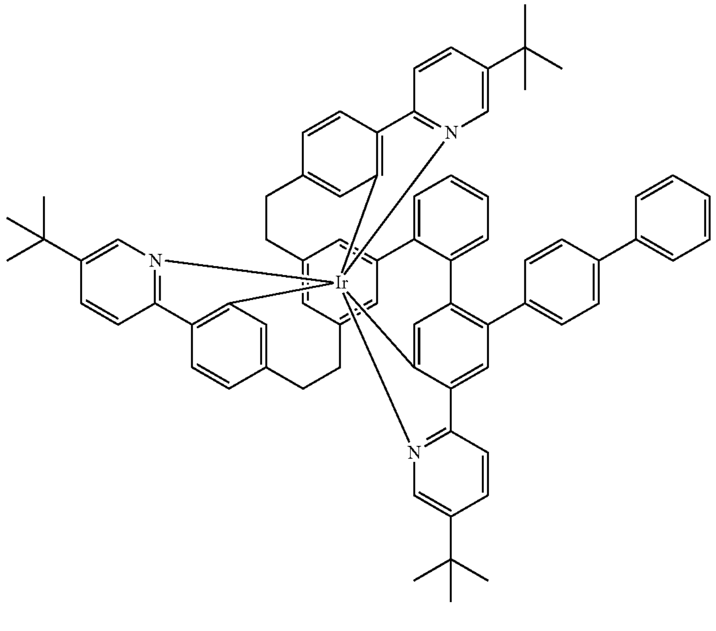

TABLE 6-continued
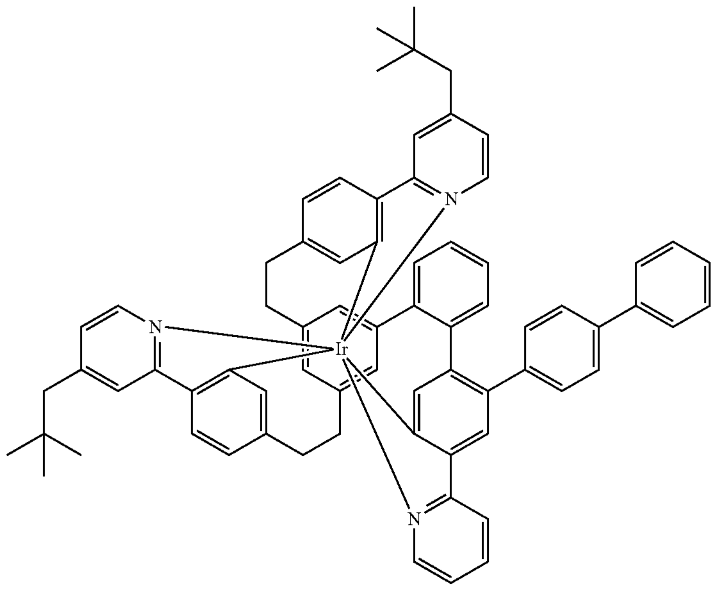
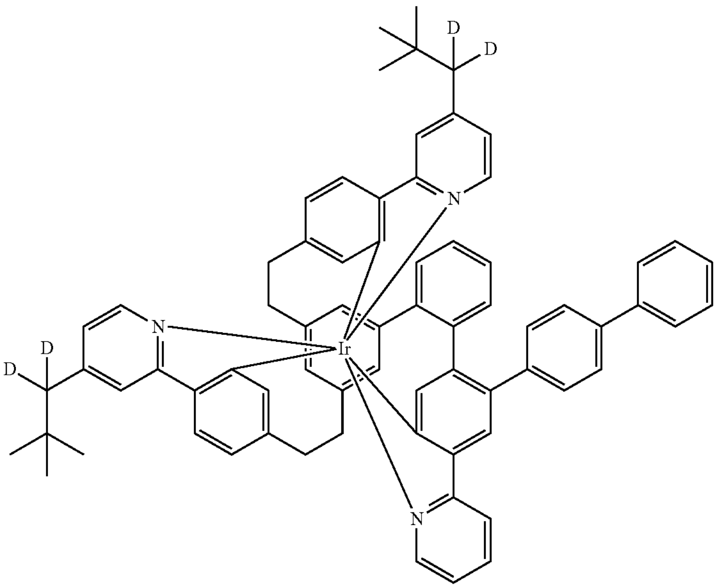

TABLE 6-continued
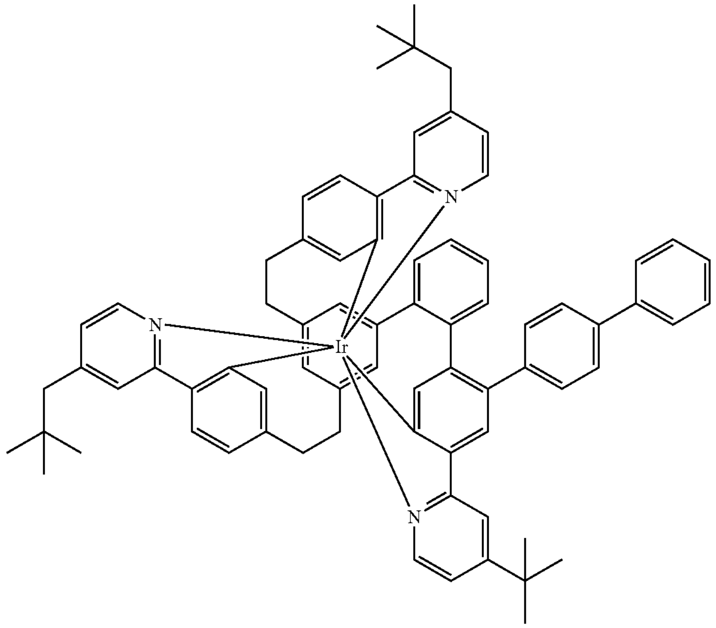
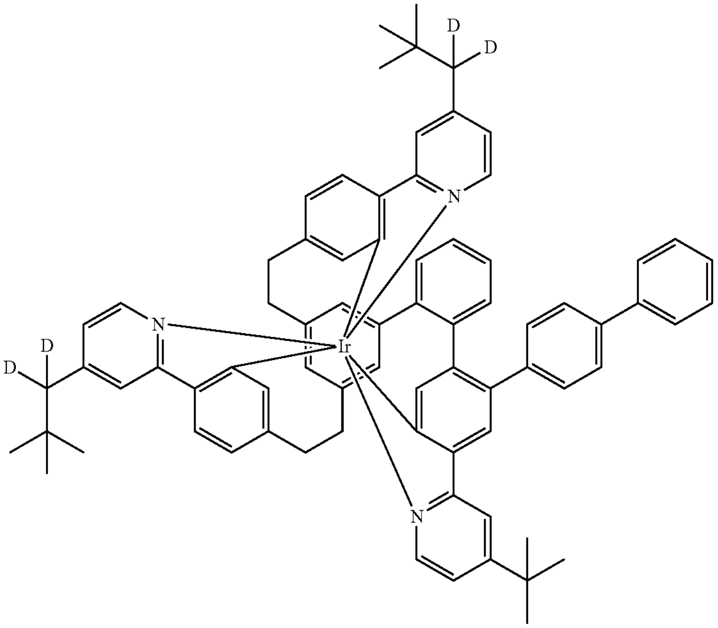

TABLE 6-continued
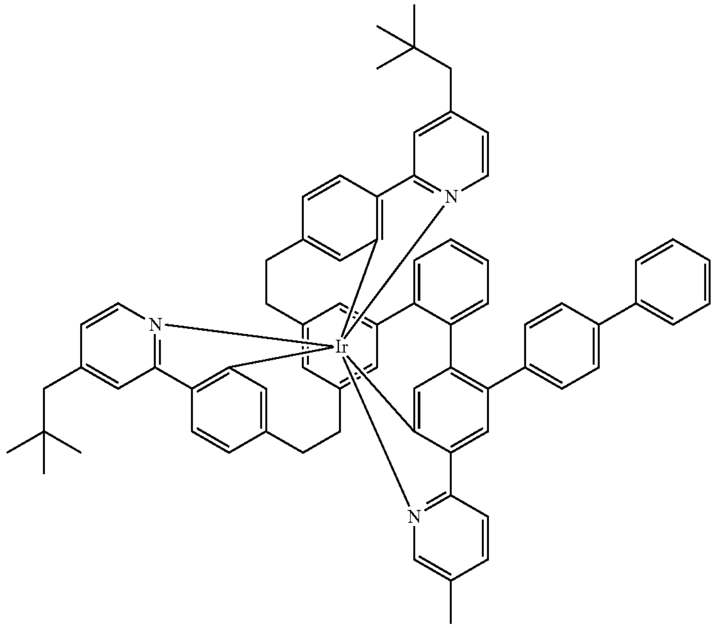
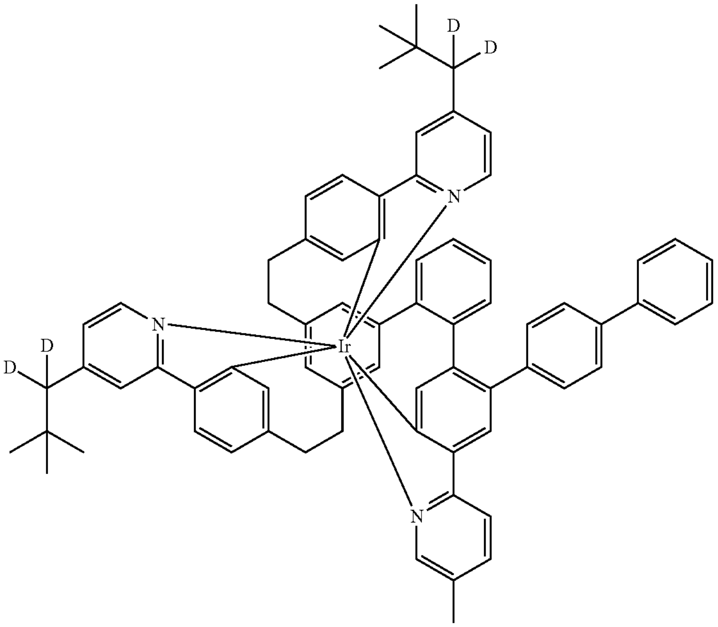

TABLE 6-continued
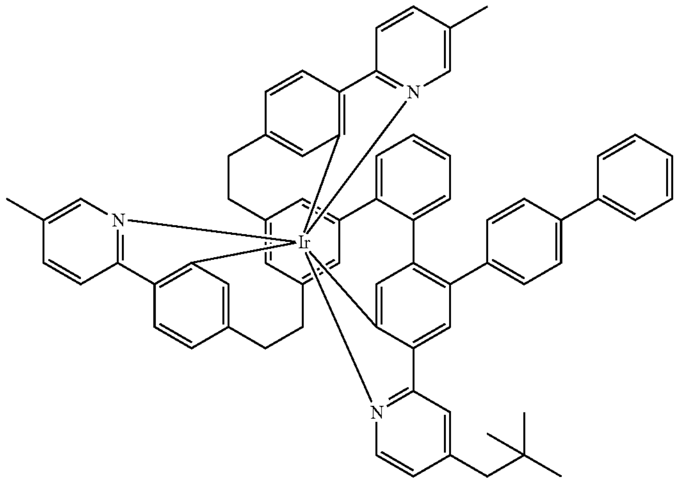
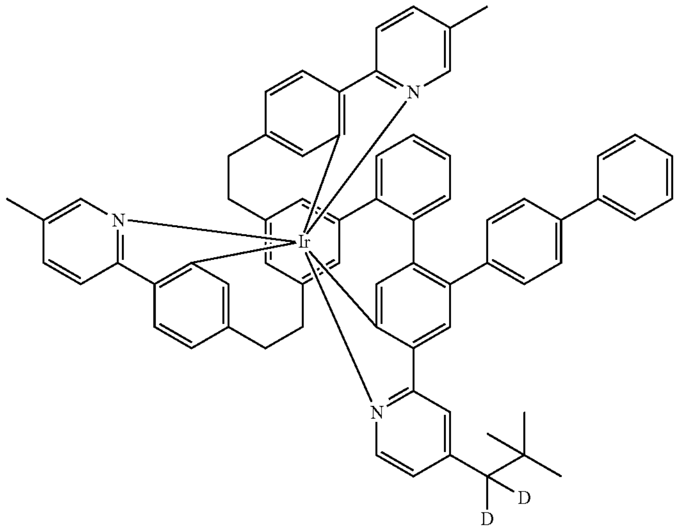
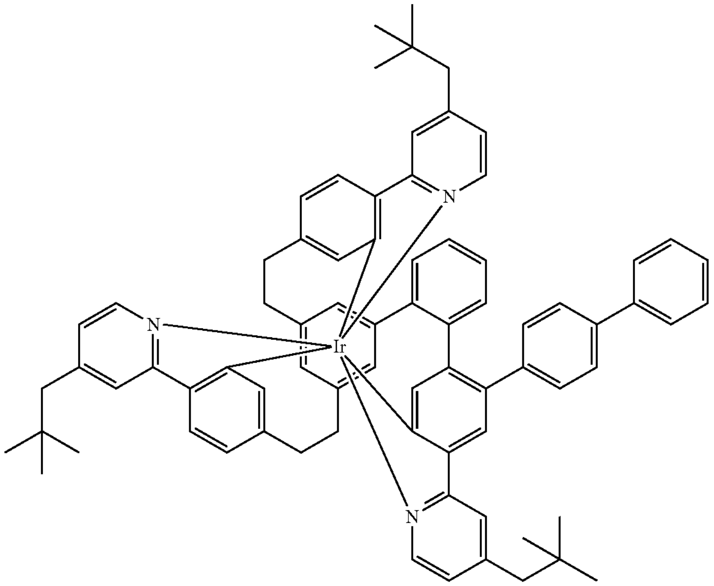

TABLE 6-continued
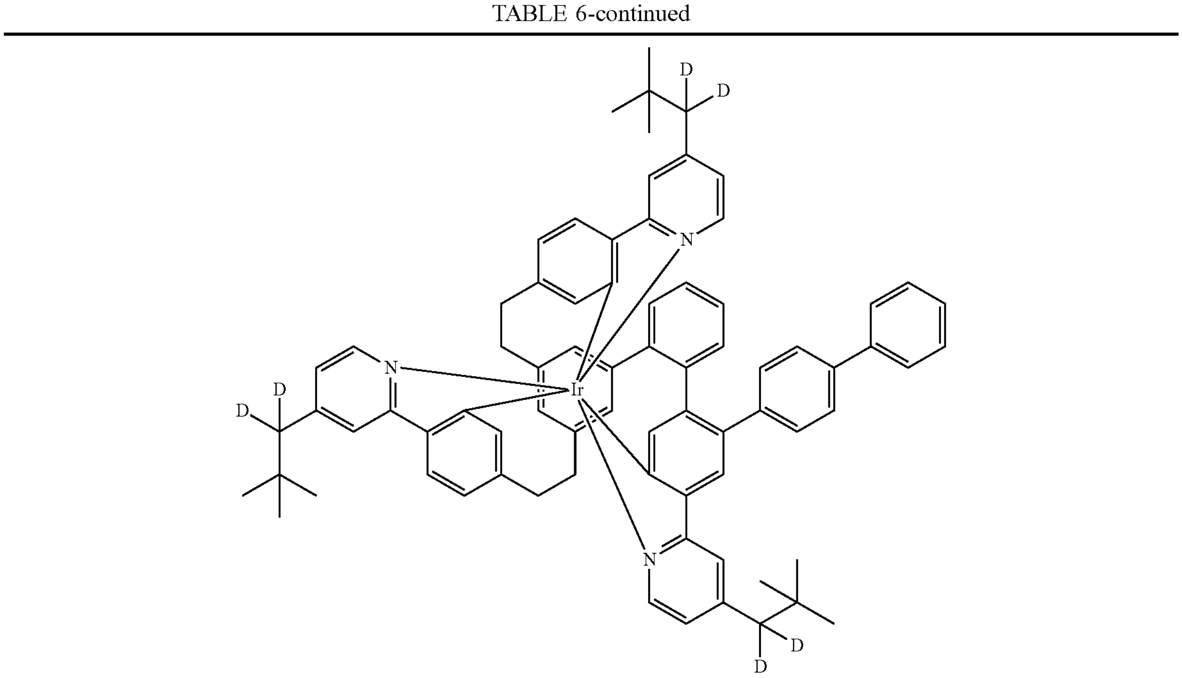
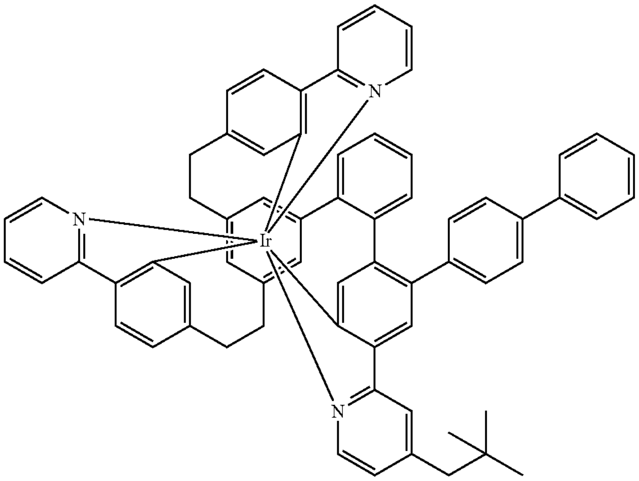
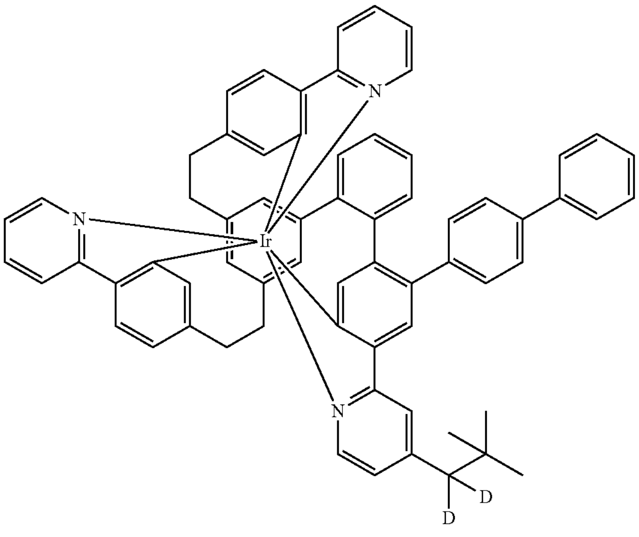

TABLE 6-continued
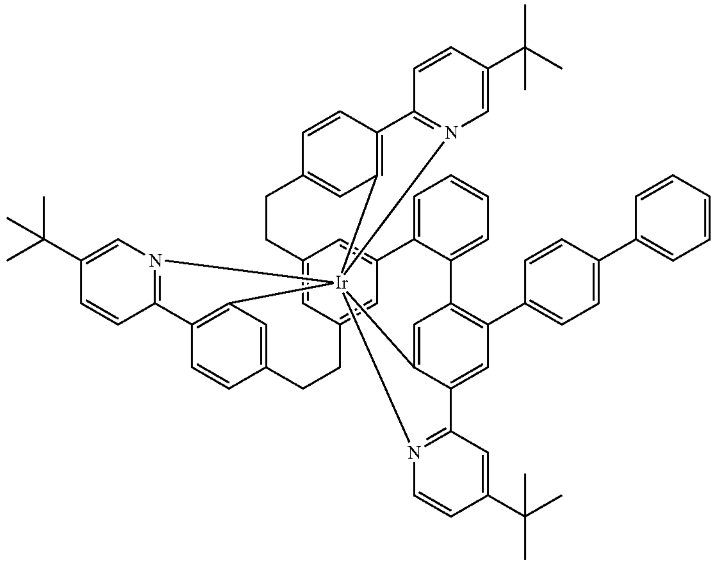
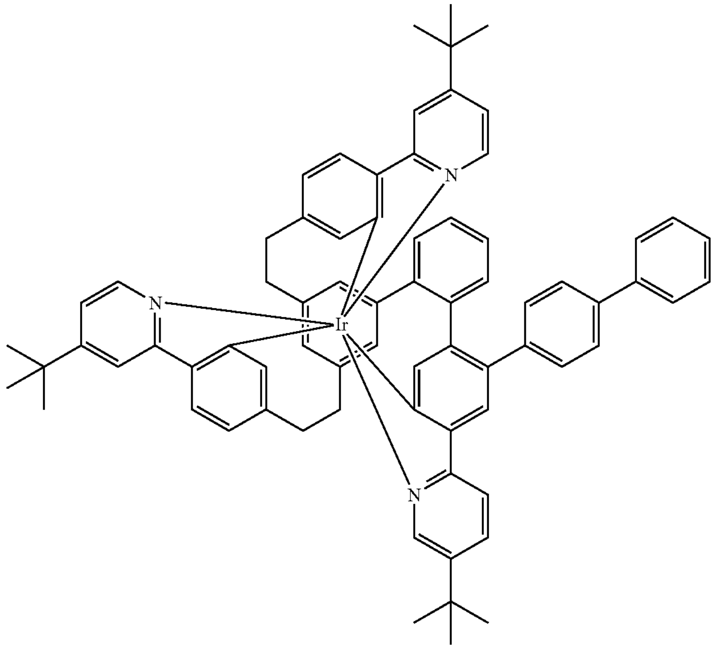

TABLE 6-continued
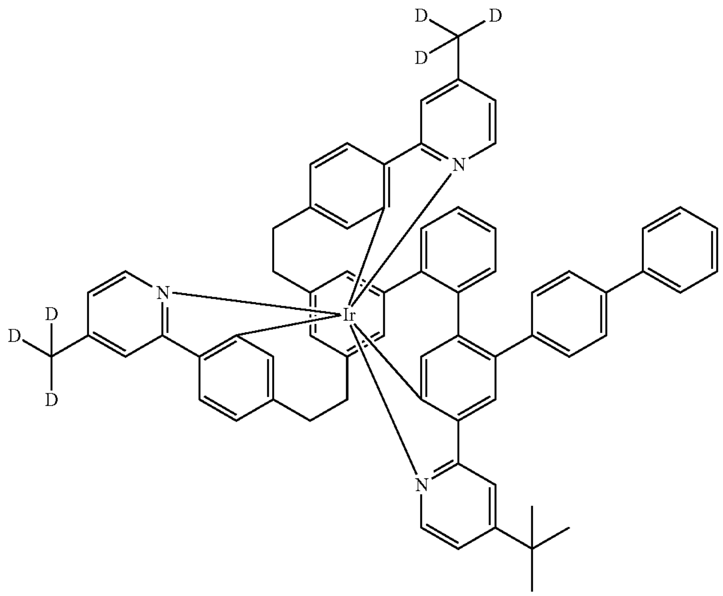
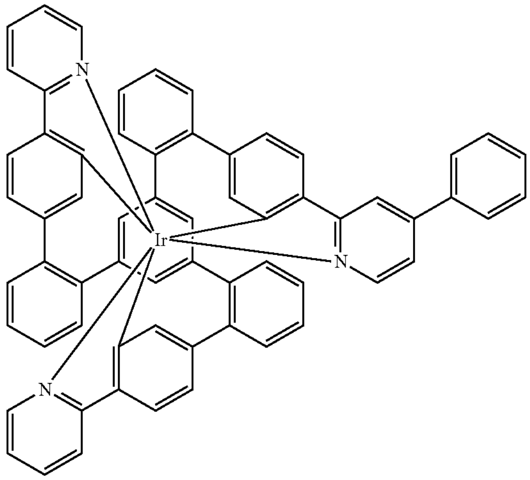

TABLE 6-continued
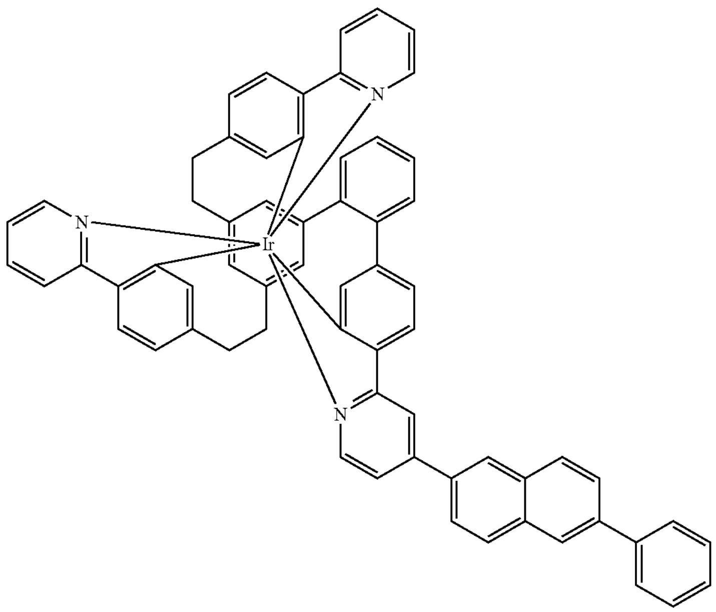
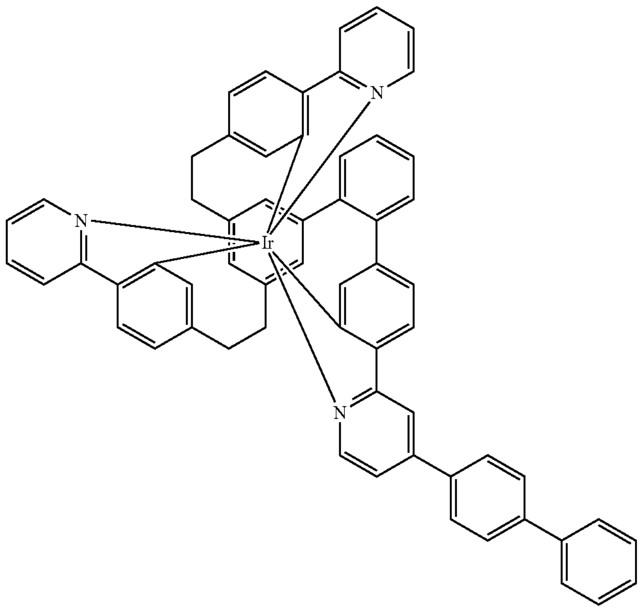

TABLE 6-continued
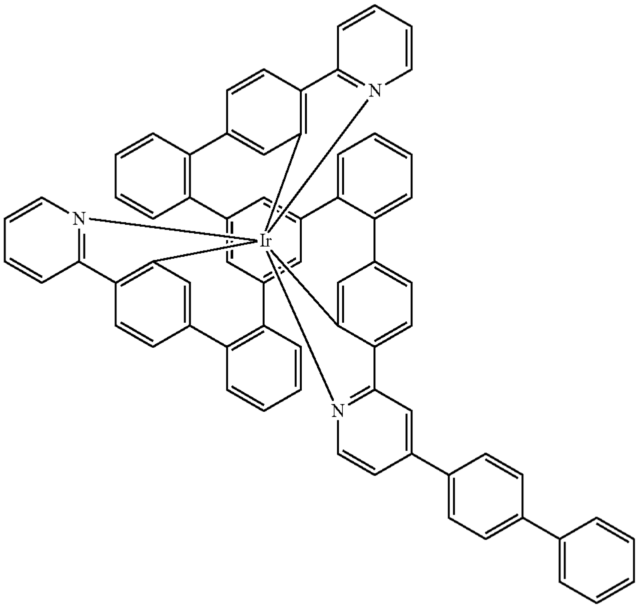
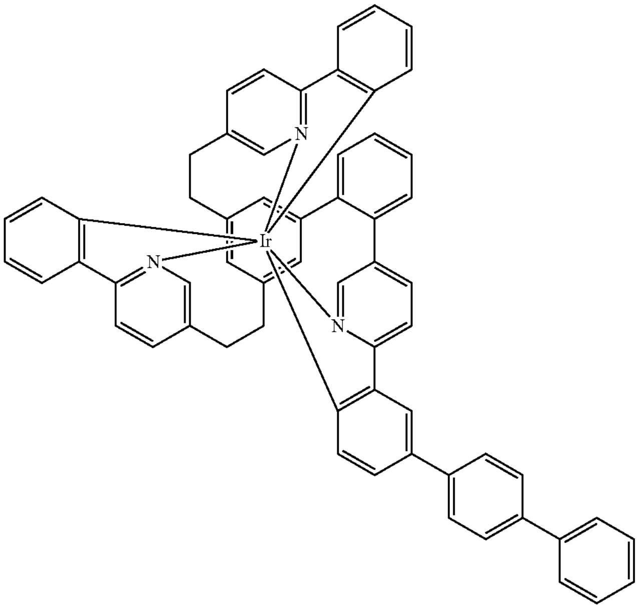

TABLE 6-continued
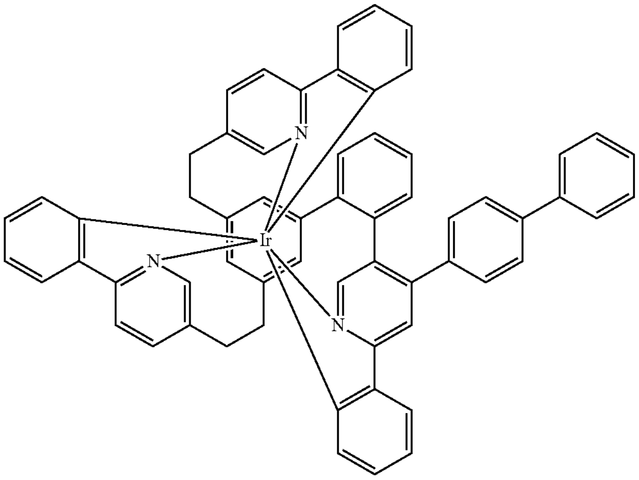
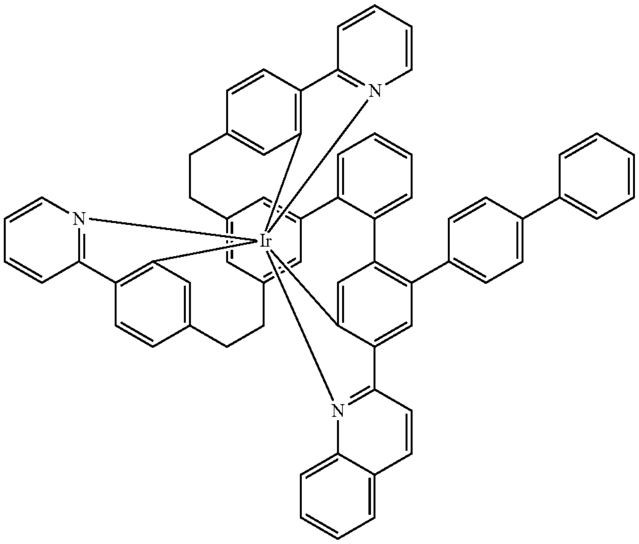
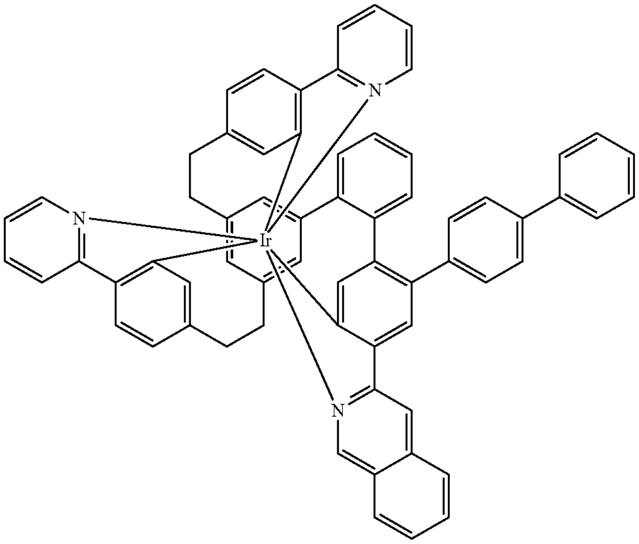

TABLE 6-continued
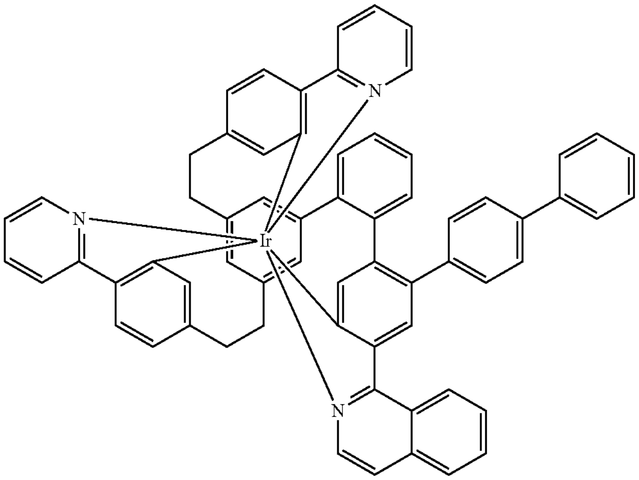
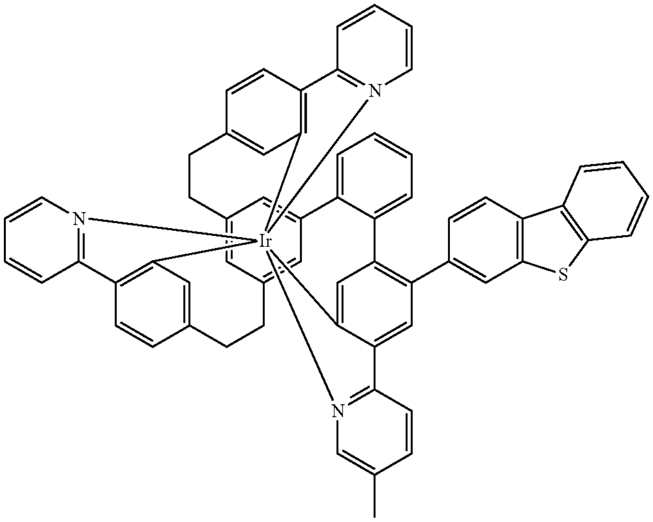
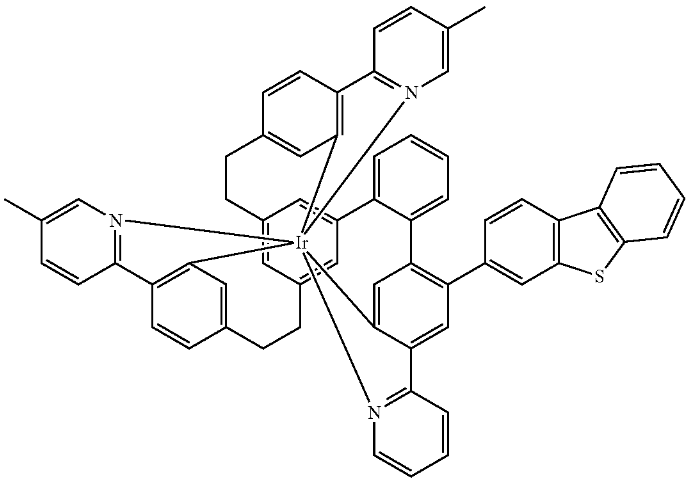

TABLE 6-continued
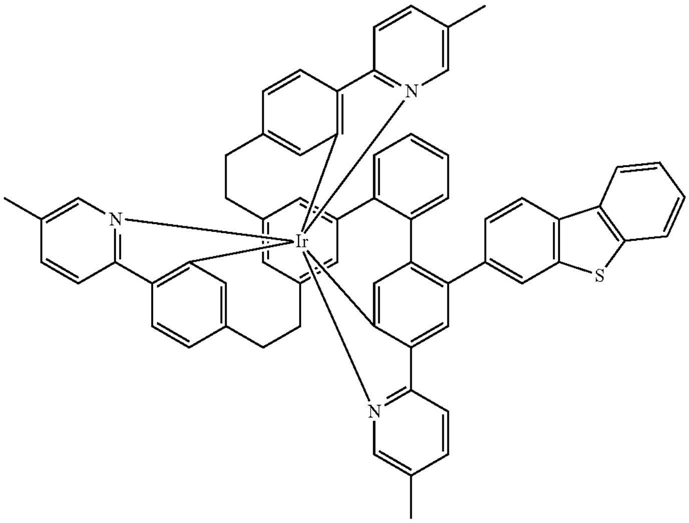
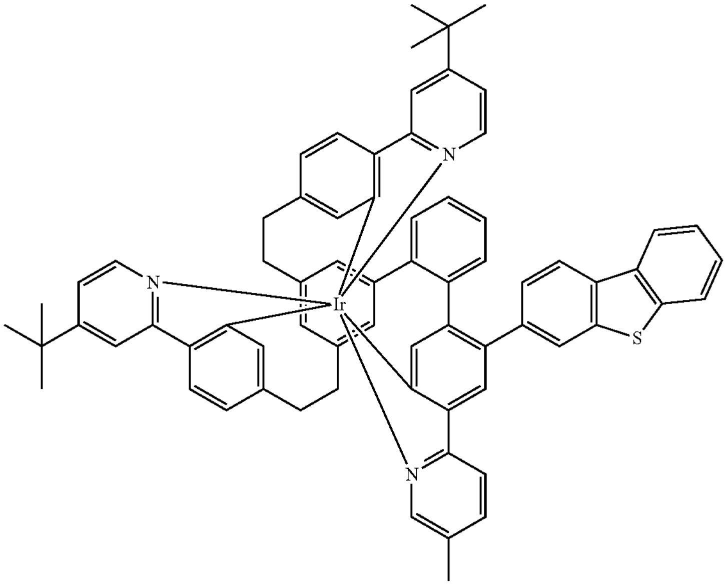
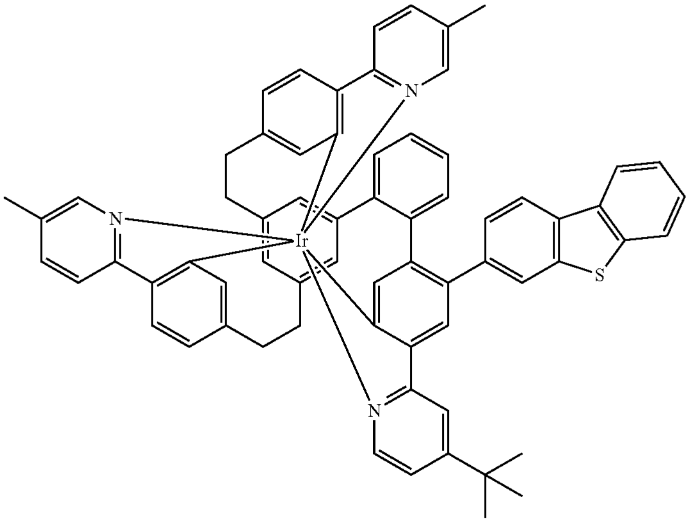

TABLE 6-continued
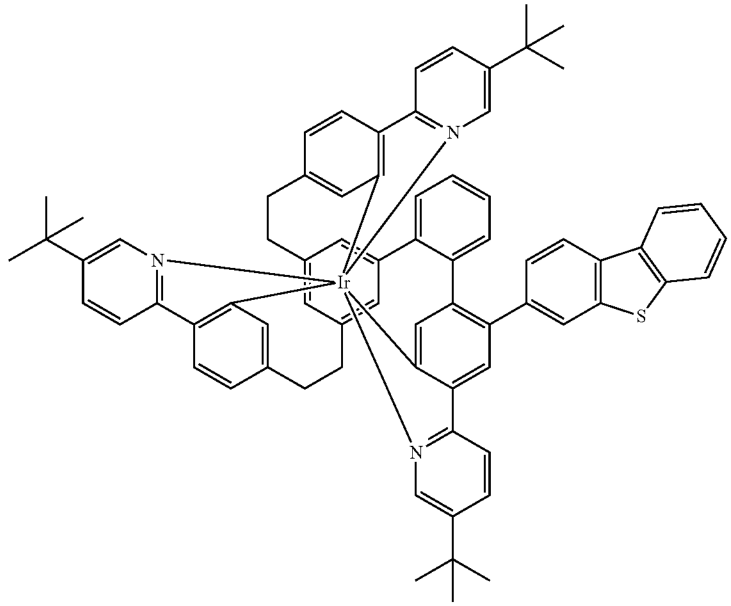
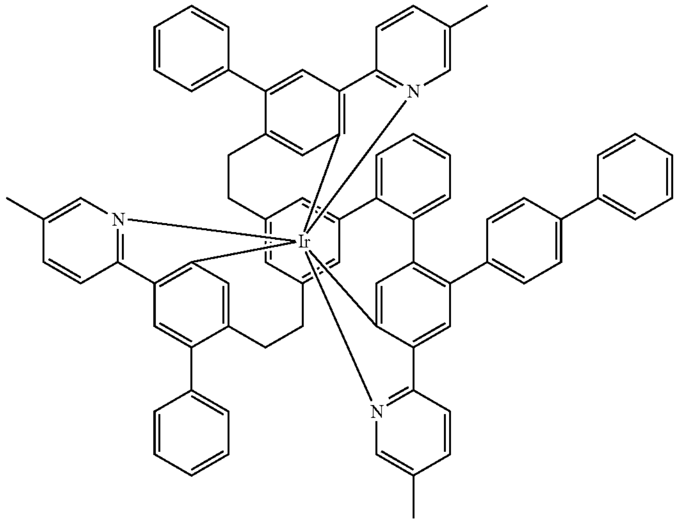

TABLE 6-continued
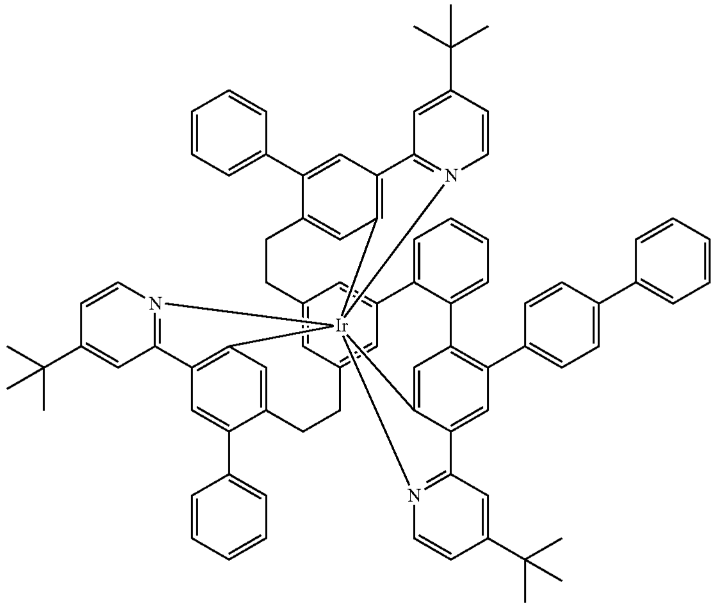
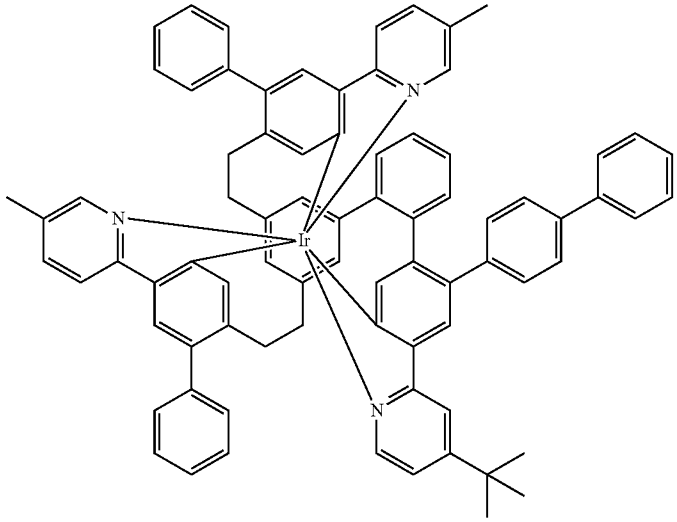

TABLE 6-continued
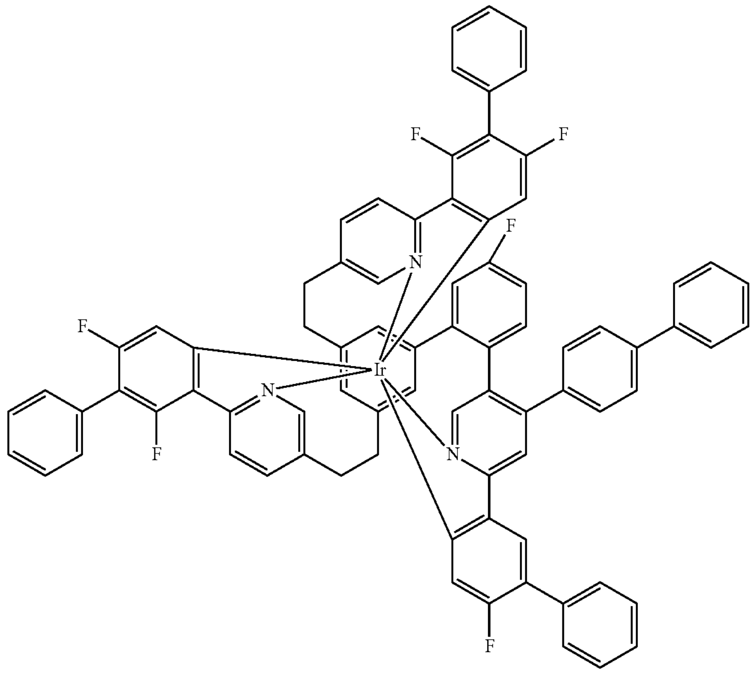
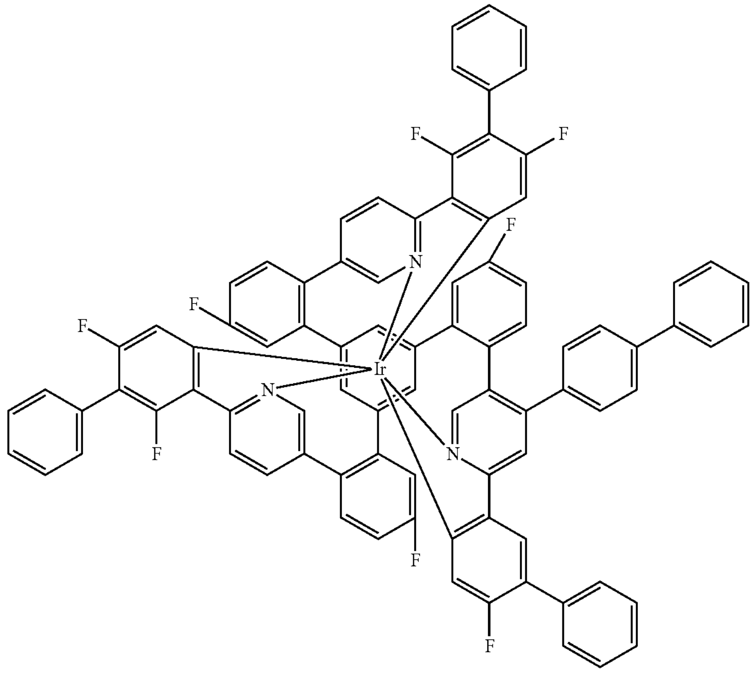

TABLE 6-continued
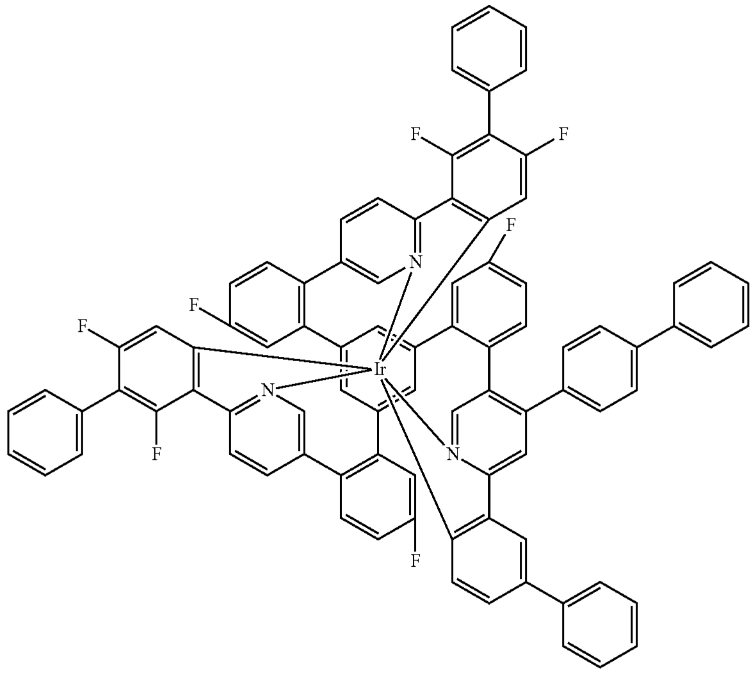
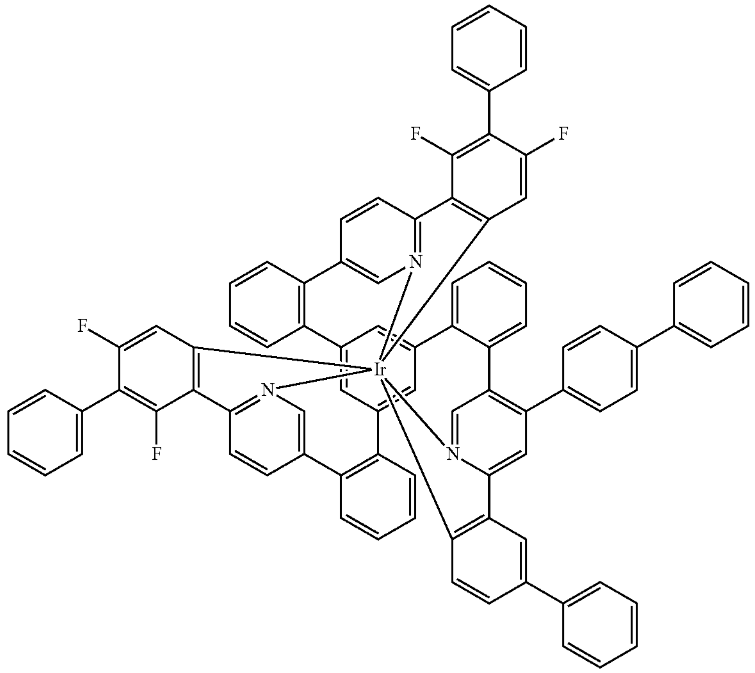

TABLE 6-continued
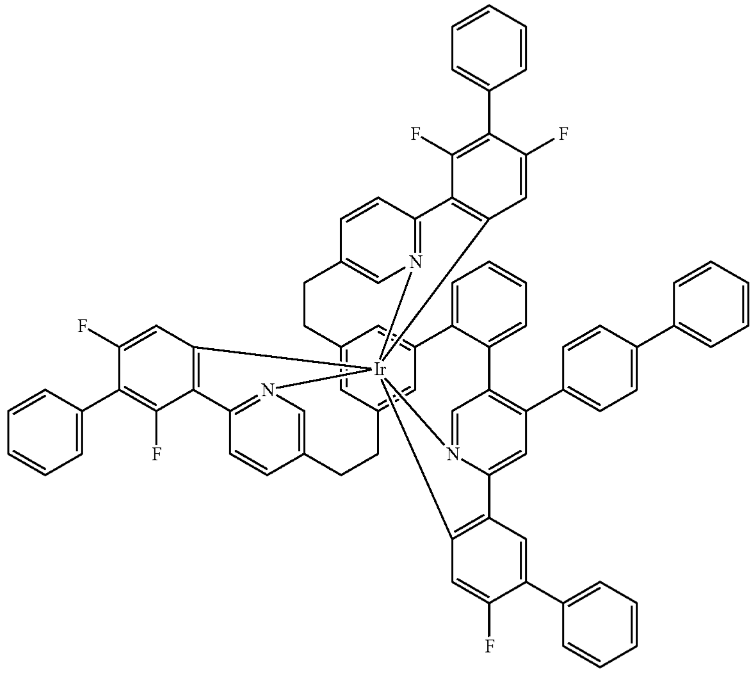
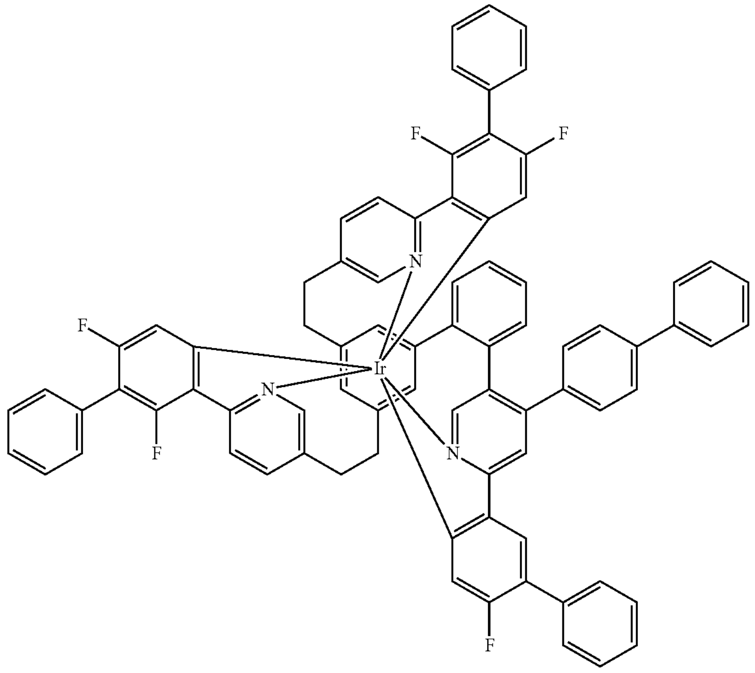

TABLE 6-continued
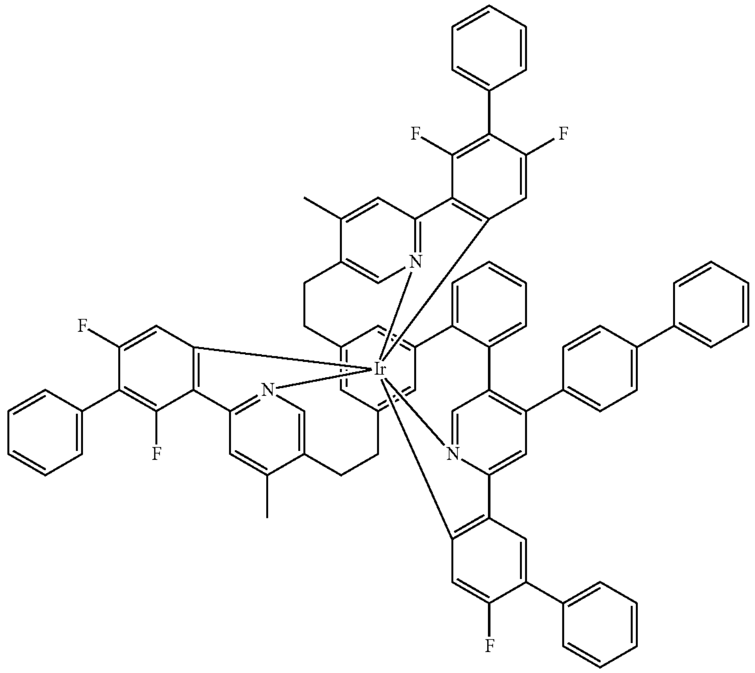
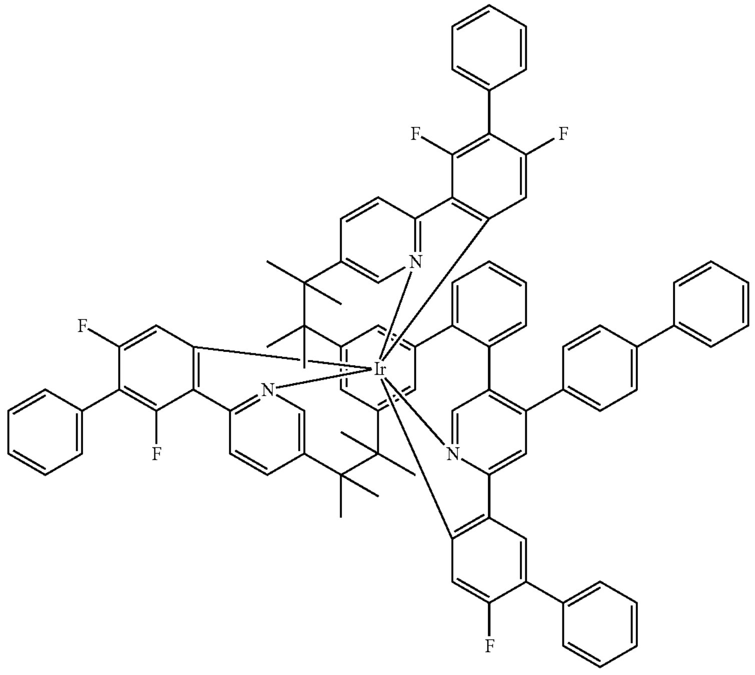

TABLE 6-continued
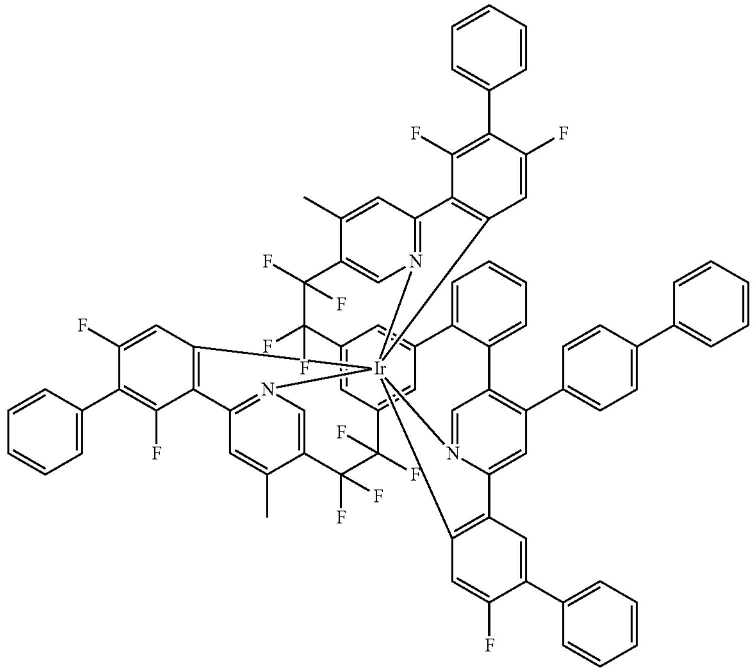
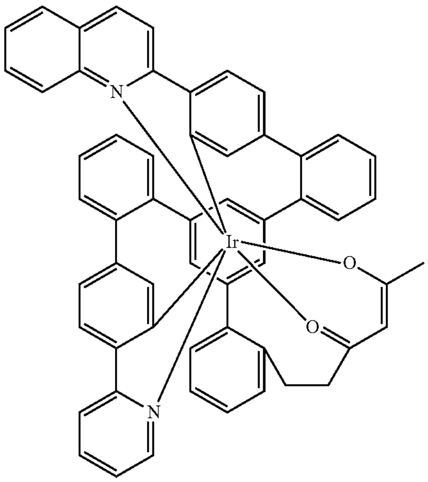

TABLE 6-continued
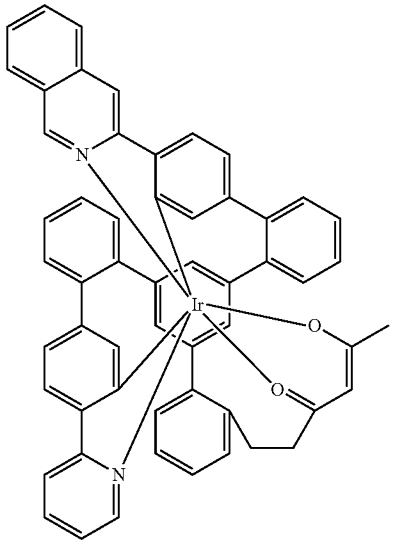
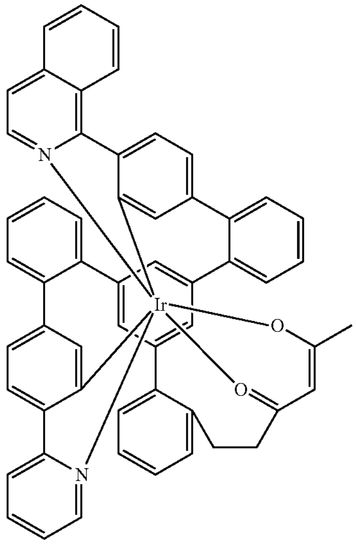
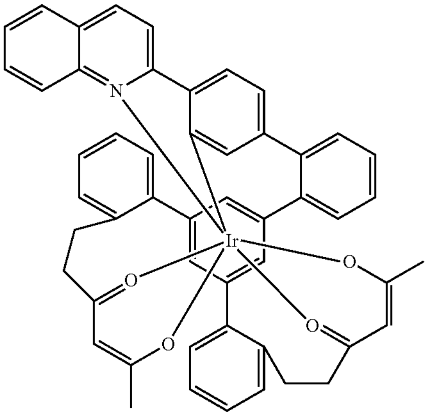

TABLE 6-continued
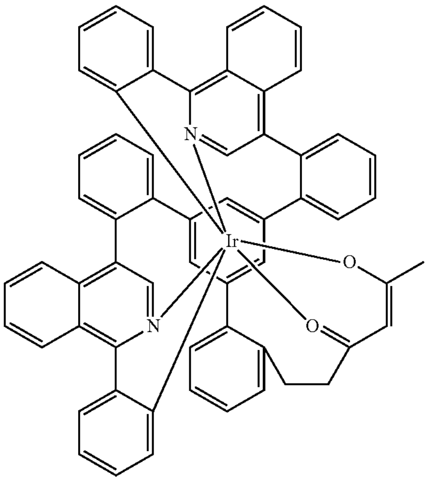
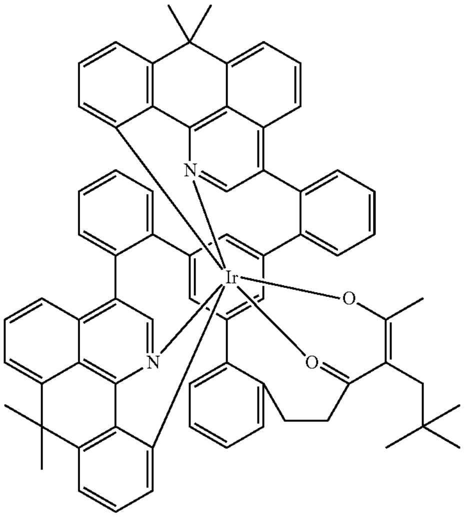
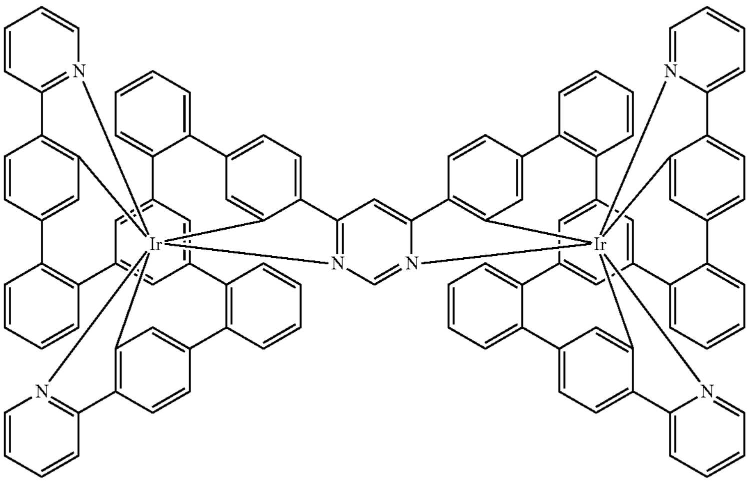

TABLE 6-continued
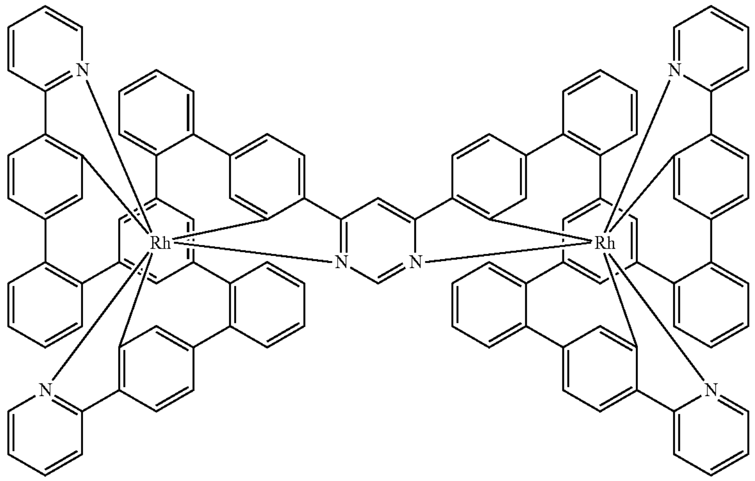
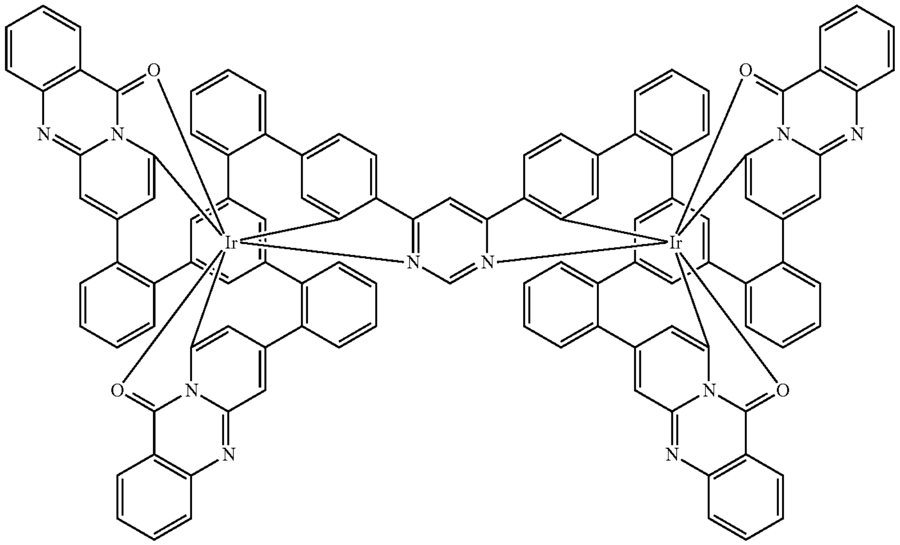

TABLE 6-continued
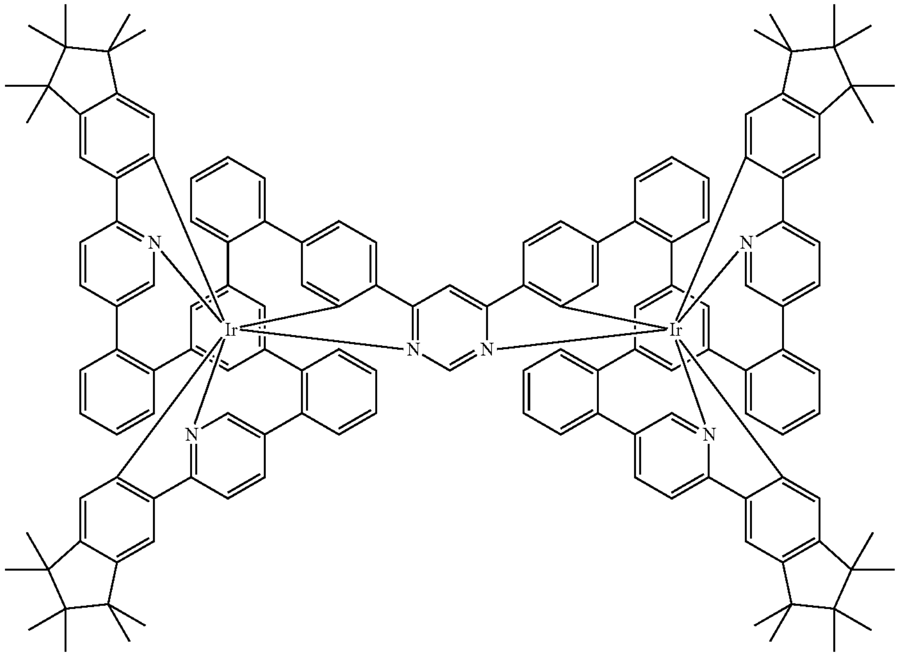
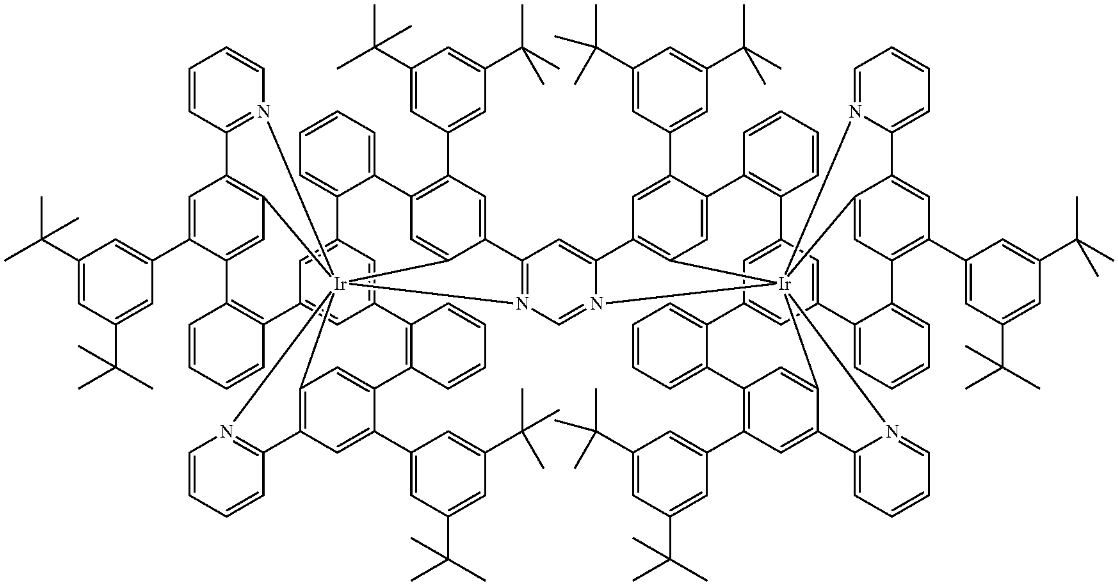

TABLE 6-continued

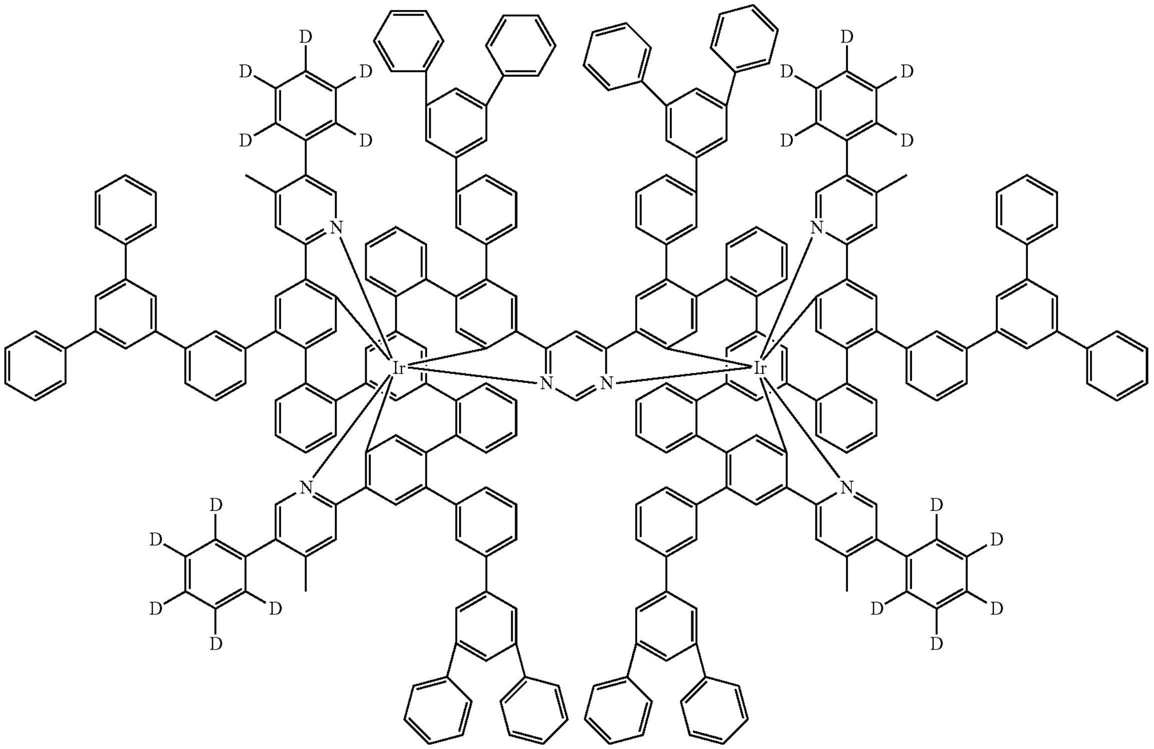

Preferred examples of phosphorescent polypodal emitters are listed in table 7 below.

TABLE 7

| | | | |
|---|---|---|---|
| CAS-1269508-30-6 | CAS-1989601-68-4 | CAS-1989602-19-8 | CAS-1989602-70-1 |
| CAS-1215692-34-4 | CAS-1989601-69-5 | CAS-1989602-20-1 | CAS-1989602-71-2 |
| CAS-1370364-40-1 | CAS-1989601-70-8 | CAS-1989602-21-2 | CAS-1989602-72-3 |
| CAS-1370364-42-3 | CAS-1989601-71-9 | CAS-1989602-22-3 | CAS-1989602-73-4 |
| CAS-1989600-74-9 | CAS-1989601-72-0 | CAS-1989602-23-4 | CAS-1989602-74-5 |
| CAS-1989600-75-0 | CAS-1989601-73-1 | CAS-1989602-24-5 | CAS-1989602-75-6 |
| CAS-1989600-77-2 | CAS-1989601-74-2 | CAS-1989602-25-6 | CAS-1989602-76-7 |
| CAS-1989600-78-3 | CAS-1989601-75-3 | CAS-1989602-26-7 | CAS-1989602-77-8 |
| CAS-1989600-79-4 | CAS-1989601-76-4 | CAS-1989602-27-8 | CAS-1989602-78-9 |
| CAS-1989600-82-9 | CAS-1989601-77-5 | CAS-1989602-28-9 | CAS-1989602-79-0 |
| CAS-1989600-83-0 | CAS-1989601-78-6 | CAS-1989602-29-0 | CAS-1989602-80-3 |
| CAS-1989600-84-1 | CAS-1989601-79-7 | CAS-1989602-30-3 | CAS-1989602-82-5 |
| CAS-1989600-85-2 | CAS-1989601-80-0 | CAS-1989602-31-4 | CAS-1989602-84-7 |
| CAS-1989600-86-3 | CAS-1989601-81-1 | CAS-1989602-32-5 | CAS-1989602-85-8 |
| CAS-1989600-87-4 | CAS-1989601-82-2 | CAS-1989602-33-6 | CAS-1989602-86-9 |
| CAS-1989600-88-5 | CAS-1989601-83-3 | CAS-1989602-34-7 | CAS-1989602-87-0 |
| CAS-1989600-89-6 | CAS-1989601-84-4 | CAS-1989602-35-8 | CAS-1989602-88-1 |
| CAS-1989601-11-7 | CAS-1989601-85-5 | CAS-1989602-36-9 | CAS-1989604-00-3 |
| CAS-1989601-23-1 | CAS-1989601-86-6 | CAS-1989602-37-0 | CAS-1989604-01-4 |
| CAS-1989601-26-4 | CAS-1989601-87-7 | CAS-1989602-38-1 | CAS-1989604-02-5 |
| CAS-1989601-28-6 | CAS-1989601-88-8 | CAS-1989602-39-2 | CAS-1989604-03-6 |
| CAS-1989601-29-7 | CAS-1989601-89-9 | CAS-1989602-40-5 | CAS-1989604-04-7 |
| CAS-1989601-33-3 | CAS-1989601-90-2 | CAS-1989602-41-6 | CAS-1989604-05-8 |
| CAS-1989601-40-2 | CAS-1989601-91-3 | CAS-1989602-42-7 | CAS-1989604-06-9 |
| CAS-1989601-41-3 | CAS-1989601-92-4 | CAS-1989602-43-8 | CAS-1989604-07-0 |
| CAS-1989601-42-4 | CAS-1989601-93-5 | CAS-1989602-44-9 | CAS-1989604-08-1 |
| CAS-1989601-43-5 | CAS-1989601-94-6 | CAS-1989602-45-0 | CAS-1989604-09-2 |
| CAS-1989601-44-6 | CAS-1989601-95-7 | CAS-1989602-46-1 | CAS-1989604-10-5 |
| CAS-1989601-45-7 | CAS-1989601-96-8 | CAS-1989602-47-2 | CAS-1989604-11-6 |
| CAS-1989601-46-8 | CAS-1989601-97-9 | CAS-1989602-48-3 | CAS-1989604-13-8 |
| CAS-1989601-47-9 | CAS-1989601-98-0 | CAS-1989602-49-4 | CAS-1989604-14-9 |
| CAS-1989601-48-0 | CAS-1989601-99-1 | CAS-1989602-50-7 | CAS-1989604-15-0 |
| CAS-1989601-49-1 | CAS-1989602-00-7 | CAS-1989602-51-8 | CAS-1989604-16-1 |
| CAS-1989601-50-4 | CAS-1989602-01-8 | CAS-1989602-52-9 | CAS-1989604-17-2 |
| CAS-1989601-51-5 | CAS-1989602-02-9 | CAS-1989602-53-0 | CAS-1989604-18-3 |
| CAS-1989601-52-6 | CAS-1989602-03-0 | CAS-1989602-54-1 | CAS-1989604-19-4 |

TABLE 7-continued

| | | | |
|---|---|---|---|
| CAS-1989601-53-7 | CAS-1989602-04-1 | CAS-1989602-55-2 | CAS-1989604-20-7 |
| CAS-1989601-54-8 | CAS-1989602-05-2 | CAS-1989602-56-3 | CAS-1989604-21-8 |
| CAS-1989601-55-9 | CAS-1989602-06-3 | CAS-1989602-57-4 | CAS-1989604-22-9 |
| CAS-1989601-56-0 | CAS-1989602-07-4 | CAS-1989602-58-5 | CAS-1989604-23-0 |
| CAS-1989601-57-1 | CAS-1989602-08-5 | CAS-1989602-59-6 | CAS-1989604-24-1 |
| CAS-1989601-58-2 | CAS-1989602-09-6 | CAS-1989602-60-9 | CAS-1989604-25-2 |
| CAS-1989601-59-3 | CAS-1989602-10-9 | CAS-1989602-61-0 | CAS-1989604-26-3 |
| CAS-1989601-60-6 | CAS-1989602-11-0 | CAS-1989602-62-1 | CAS-1989604-27-4 |
| CAS-1989601-61-7 | CAS-1989602-12-1 | CAS-1989602-63-2 | CAS-1989604-28-5 |
| CAS-1989601-62-8 | CAS-1989602-13-2 | CAS-1989602-64-3 | CAS-1989604-29-6 |
| CAS-1989601-63-9 | CAS-1989602-14-3 | CAS-1989602-65-4 | CAS-1989604-30-9 |
| CAS-1989601-64-0 | CAS-1989602-15-4 | CAS-1989602-66-5 | CAS-1989604-31-0 |
| CAS-1989601-65-1 | CAS-1989602-16-5 | CAS-1989602-67-6 | CAS-1989604-32-1 |
| CAS-1989601-66-2 | CAS-1989602-17-6 | CAS-1989602-68-7 | CAS-1989604-33-2 |
| CAS-1989601-67-3 | CAS-1989602-18-7 | CAS-1989602-69-8 | CAS-1989604-34-3 |
| CAS-1989604-35-4 | CAS-1989604-88-7 | CAS-1989605-52-8 | CAS-1989606-07-6 |
| CAS-1989604-36-5 | CAS-1989604-89-8 | CAS-1989605-53-9 | CAS-1989606-08-7 |
| CAS-1989604-37-6 | CAS-1989604-90-1 | CAS-1989605-54-0 | CAS-1989606-09-8 |
| CAS-1989604-38-7 | CAS-1989604-92-3 | CAS-1989605-55-1 | CAS-1989606-10-1 |
| CAS-1989604-39-8 | CAS-1989604-93-4 | CAS-1989605-56-2 | CAS-1989606-11-2 |
| CAS-1989604-40-1 | CAS-1989604-94-5 | CAS-1989605-57-3 | CAS-1989606-12-3 |
| CAS-1989604-41-2 | CAS-1989604-95-6 | CAS-1989605-58-4 | CAS-1989606-13-4 |
| CAS-1989604-42-3 | CAS-1989604-96-7 | CAS-1989605-59-5 | CAS-1989606-14-5 |
| CAS-1989604-43-4 | CAS-1989604-97-8 | CAS-1989605-61-9 | CAS-1989606-15-6 |
| CAS-1989604-45-6 | CAS-1989605-09-5 | CAS-1989605-62-0 | CAS-1989606-16-7 |
| CAS-1989604-46-7 | CAS-1989605-10-8 | CAS-1989605-63-1 | CAS-1989606-17-8 |
| CAS-1989604-47-8 | CAS-1989605-11-9 | CAS-1989605-64-2 | CAS-1989606-18-9 |
| CAS-1989604-48-9 | CAS-1989605-13-1 | CAS-1989605-65-3 | CAS-1989606-19-0 |
| CAS-1989604-49-0 | CAS-1989605-14-2 | CAS-1989605-66-4 | CAS-1989606-20-3 |
| CAS-1989604-50-3 | CAS-1989605-15-3 | CAS-1989605-67-5 | CAS-1989606-21-4 |
| CAS-1989604-52-5 | CAS-1989605-16-4 | CAS-1989605-68-6 | CAS-1989606-22-5 |
| CAS-1989604-53-6 | CAS-1989605-17-5 | CAS-1989605-69-7 | CAS-1989606-23-6 |
| CAS-1989604-54-7 | CAS-1989605-18-6 | CAS-1989605-70-0 | CAS-1989606-24-7 |
| CAS-1989604-55-8 | CAS-1989605-19-7 | CAS-1989605-71-1 | CAS-1989606-26-9 |
| CAS-1989604-56-9 | CAS-1989605-20-0 | CAS-1989605-72-2 | CAS-1989606-27-0 |
| CAS-1989604-57-0 | CAS-1989605-21-1 | CAS-1989605-73-3 | CAS-1989606-28-1 |
| CAS-1989604-58-1 | CAS-1989605-22-2 | CAS-1989605-74-4 | CAS-1989606-29-2 |
| CAS-1989604-59-2 | CAS-1989605-23-3 | CAS-1989605-75-5 | CAS-1989606-30-5 |
| CAS-1989604-60-5 | CAS-1989605-24-4 | CAS-1989605-76-6 | CAS-1989606-31-6 |
| CAS-1989604-61-6 | CAS-1989605-25-5 | CAS-1989605-77-7 | CAS-1989606-32-7 |
| CAS-1989604-62-7 | CAS-1989605-26-6 | CAS-1989605-78-8 | CAS-1989606-33-8 |
| CAS-1989604-63-8 | CAS-1989605-27-7 | CAS-1989605-79-9 | CAS-1989606-34-9 |
| CAS-1989604-64-9 | CAS-1989605-28-8 | CAS-1989605-81-3 | CAS-1989606-35-0 |
| CAS-1989604-65-0 | CAS-1989605-29-9 | CAS-1989605-82-4 | CAS-1989606-36-1 |
| CAS-1989604-66-1 | CAS-1989605-30-2 | CAS-1989605-83-5 | CAS-1989606-37-2 |
| CAS-1989604-67-2 | CAS-1989605-31-3 | CAS-1989605-84-6 | CAS-1989606-38-3 |
| CAS-1989604-68-3 | CAS-1989605-32-4 | CAS-1989605-85-7 | CAS-1989606-39-4 |
| CAS-1989604-69-4 | CAS-1989605-33-5 | CAS-1989605-86-8 | CAS-1989606-40-7 |
| CAS-1989604-70-7 | CAS-1989605-34-6 | CAS-1989605-87-9 | CAS-1989606-41-8 |
| CAS-1989604-71-8 | CAS-1989605-35-7 | CAS-1989605-88-0 | CAS-1989606-42-9 |
| CAS-1989604-72-9 | CAS-1989605-36-8 | CAS-1989605-89-1 | CAS-1989606-43-0 |
| CAS-1989604-73-0 | CAS-1989605-37-9 | CAS-1989605-90-4 | CAS-1989606-44-1 |
| CAS-1989604-74-1 | CAS-1989605-38-0 | CAS-1989605-91-5 | CAS-1989606-45-2 |
| CAS-1989604-75-2 | CAS-1989605-39-1 | CAS-1989605-92-6 | CAS-1989606-46-3 |
| CAS-1989604-76-3 | CAS-1989605-40-4 | CAS-1989605-93-7 | CAS-1989606-48-5 |
| CAS-1989604-77-4 | CAS-1989605-41-5 | CAS-1989605-94-8 | CAS-1989606-49-6 |
| CAS-1989604-78-5 | CAS-1989605-42-6 | CAS-1989605-95-9 | CAS-1989606-53-2 |
| CAS-1989604-79-6 | CAS-1989605-43-7 | CAS-1989605-96-0 | CAS-1989606-55-4 |
| CAS-1989604-80-9 | CAS-1989605-44-8 | CAS-1989605-97-1 | CAS-1989606-56-5 |
| CAS-1989604-81-0 | CAS-1989605-45-9 | CAS-1989605-98-2 | CAS-1989606-61-2 |
| CAS-1989604-82-1 | CAS-1989605-46-0 | CAS-1989605-99-3 | CAS-1989606-62-3 |
| CAS-1989604-83-2 | CAS-1989605-47-1 | CAS-1989606-00-9 | CAS-1989606-63-4 |
| CAS-1989604-84-3 | CAS-1989605-48-2 | CAS-1989606-01-0 | CAS-1989606-67-8 |
| CAS-1989604-85-4 | CAS-1989605-49-3 | CAS-1989606-04-3 | CAS-1989606-69-0 |
| CAS-1989604-86-5 | CAS-1989605-50-6 | CAS-1989606-05-4 | CAS-1989606-70-3 |
| CAS-1989604-87-6 | CAS-1989605-51-7 | CAS-1989606-06-5 | CAS-1989606-74-7 |
| CAS-1989658-39-0 | CAS-2088184-56-7 | CAS-2088185-07-1 | CAS-2088185-66-2 |
| CAS-1989658-41-4 | CAS-2088184-57-8 | CAS-2088185-08-2 | CAS-2088185-67-3 |
| CAS-1989658-43-6 | CAS-2088184-58-9 | CAS-2088185-09-3 | CAS-2088185-68-4 |
| CAS-1989658-47-0 | CAS-2088184-59-0 | CAS-2088185-10-6 | CAS-2088185-69-5 |
| CAS-1989658-49-2 | CAS-2088184-60-3 | CAS-2088185-11-7 | CAS-2088185-70-8 |
| CAS-2088184-07-8 | CAS-2088184-61-4 | CAS-2088185-12-8 | CAS-2088185-71-9 |
| CAS-2088184-08-9 | CAS-2088184-62-5 | CAS-2088185-13-9 | CAS-2088185-72-0 |
| CAS-2088184-09-0 | CAS-2088184-63-6 | CAS-2088185-14-0 | CAS-2088185-73-1 |
| CAS-2088184-10-3 | CAS-2088184-64-7 | CAS-2088185-15-1 | CAS-2088185-74-2 |
| CAS-2088184-11-4 | CAS-2088184-65-8 | CAS-2088185-16-2 | CAS-2088185-75-3 |
| CAS-2088184-13-6 | CAS-2088184-66-9 | CAS-2088185-17-3 | CAS-2088185-76-4 |
| CAS-2088184-14-7 | CAS-2088184-67-0 | CAS-2088185-18-4 | CAS-2088185-77-5 |
| CAS-2088184-15-8 | CAS-2088184-68-1 | CAS-2088185-19-5 | CAS-2088185-78-6 |
| CAS-2088184-16-9 | CAS-2088184-69-2 | CAS-2088185-20-8 | CAS-2088185-79-7 |

TABLE 7-continued

| | | | |
|---|---|---|---|
| CAS-2088184-17-0 | CAS-2088184-70-5 | CAS-2088185-21-9 | CAS-2088185-80-0 |
| CAS-2088184-18-1 | CAS-2088184-71-6 | CAS-2088185-22-0 | CAS-2088185-81-1 |
| CAS-2088184-19-2 | CAS-2088184-72-7 | CAS-2088185-23-1 | CAS-2088185-82-2 |
| CAS-2088184-20-5 | CAS-2088184-73-8 | CAS-2088185-32-2 | CAS-2088185-83-3 |
| CAS-2088184-21-6 | CAS-2088184-74-9 | CAS-2088185-33-3 | CAS-2088185-84-4 |
| CAS-2088184-22-7 | CAS-2088184-75-0 | CAS-2088185-34-4 | CAS-2088185-85-5 |
| CAS-2088184-23-8 | CAS-2088184-76-1 | CAS-2088185-35-5 | CAS-2088185-86-6 |
| CAS-2088184-24-9 | CAS-2088184-77-2 | CAS-2088185-36-6 | CAS-2088185-87-7 |
| CAS-2088184-25-0 | CAS-2088184-78-3 | CAS-2088185-37-7 | CAS-2088185-88-8 |
| CAS-2088184-26-1 | CAS-2088184-79-4 | CAS-2088185-38-8 | CAS-2088185-89-9 |
| CAS-2088184-27-2 | CAS-2088184-80-7 | CAS-2088185-39-9 | CAS-2088185-90-2 |
| CAS-2088184-28-3 | CAS-2088184-81-8 | CAS-2088185-40-2 | CAS-2088185-91-3 |
| CAS-2088184-29-4 | CAS-2088184-82-9 | CAS-2088185-41-3 | CAS-2088185-92-4 |
| CAS-2088184-30-7 | CAS-2088184-83-0 | CAS-2088185-42-4 | CAS-2088185-93-5 |
| CAS-2088184-32-9 | CAS-2088184-84-1 | CAS-2088185-43-5 | CAS-2088185-94-6 |
| CAS-2088184-34-1 | CAS-2088184-85-2 | CAS-2088185-44-6 | CAS-2088185-95-7 |
| CAS-2088184-35-2 | CAS-2088184-86-3 | CAS-2088185-45-7 | CAS-2088185-96-8 |
| CAS-2088184-36-3 | CAS-2088184-87-4 | CAS-2088185-46-8 | CAS-2088185-97-9 |
| CAS-2088184-37-4 | CAS-2088184-88-5 | CAS-2088185-47-9 | CAS-2088185-98-0 |
| CAS-2088184-38-5 | CAS-2088184-89-6 | CAS-2088185-48-0 | CAS-2088185-99-1 |
| CAS-2088184-39-6 | CAS-2088184-90-9 | CAS-2088185-49-1 | CAS-2088186-00-7 |
| CAS-2088184-40-9 | CAS-2088184-91-0 | CAS-2088185-50-4 | CAS-2088186-01-8 |
| CAS-2088184-41-0 | CAS-2088184-92-1 | CAS-2088185-51-5 | CAS-2088186-02-9 |
| CAS-2088184-42-1 | CAS-2088184-93-2 | CAS-2088185-52-6 | CAS-2088195-88-2 |
| CAS-2088184-43-2 | CAS-2088184-94-3 | CAS-2088185-53-7 | CAS-2088195-89-3 |
| CAS-2088184-44-3 | CAS-2088184-95-4 | CAS-2088185-54-8 | CAS-2088195-90-6 |
| CAS-2088184-45-4 | CAS-2088184-96-5 | CAS-2088185-55-9 | CAS-2088195-91-7 |
| CAS-2088184-46-5 | CAS-2088184-97-6 | CAS-2088185-56-0 | CAS-861806-70-4 |
| CAS-2088184-47-6 | CAS-2088184-98-7 | CAS-2088185-57-1 | CAS-1269508-30-6 |
| CAS-2088184-48-7 | CAS-2088184-99-8 | CAS-2088185-58-2 | |
| CAS-2088184-49-8 | CAS-2088185-00-4 | CAS-2088185-59-3 | |
| CAS-2088184-50-1 | CAS-2088185-01-5 | CAS-2088185-60-6 | |
| CAS-2088184-51-2 | CAS-2088185-02-6 | CAS-2088185-61-7 | |
| CAS-2088184-52-3 | CAS-2088185-03-7 | CAS-2088185-62-8 | |
| CAS-2088184-53-4 | CAS-2088185-04-8 | CAS-2088185-63-9 | |
| CAS-2088184-54-5 | CAS-2088185-05-9 | CAS-2088185-64-0 | |
| CAS-2088184-55-6 | CAS-2088185-06-0 | CAS-2088185-65-1 | |

In the mixtures of the invention or in the light-emitting layer of the device of the invention, preference is given to combining any mixture M1, M2, M3, M4, M5, M6, M7, M8, M9, M10, M11, M12, M13, M14, M15, M16, M17, M18, M19, M20, M21, M22, M23, M24, M25, M26, M27, M28, M29, M30, M31, M32, M33, M34, M35, M36, M37, M38, M39, M40, M41, M42, M43, M44, M45, M46, M47, M48, M49, M50, M51, M52, M53, M54, M55, M56, M57, M58, M59, M60, M61, M62, M63, M64, M65, M66, M67, M68, M69, M70, M71, M72, M73, M74, M75, M76, M77, M78, M79, M80, M81, M82, M83, M84, M85, M86, M87, M88, M89, M90, M91, M92, M93, M94, M95, M96, M97, M98, M99, M100, M101, M102, M103, M104, M105, M106, M107, M108, M109, M110, M111, M112, M113, M114, M115, M116, M117, M118, M119, M120, M121, M122, M123, M124, M125, M126, M127, M128, M129, M130, M131, M132, M133, M134, M135, M136, M137, M138, M139, M140, M141, M142, M143, M144, M145, M146, M147, M148, M149, M150, M151, M152, M153, M154, M155, M156, M157, M158, M159, M160, M161, M162, M163, M164, M165, M166, M167, M168, M169, M170, M171, M172, M173, M174, M175, M176, M177, M178, M179, M180, M181, M182, M183, M184, M185, M186, M187, M188, M189, M190, M191, M192, M193, M194, M195, M196, M197, M198, M199, M200, M201, M202, M203, M204, M205, M206, M207, M208, M209, M210, M211, M212, M213, M214, M215, M216, M217, M218, M219, M220, M221, M222, M223, M224, M225, M226, M227, M228, M229, M230, M231, M232, M233, M234, M235, M236, M237, M238, M239, M240, M241, M242, M243, M244, M245, M246, M247, M248, M249, M250, M251, M252, M253, M254, M255, M256, M257, M258, M259, M260, M261, M262, M263, M264, M265, M266, M267, M268, M269, M270, M271, M272, M273, M274, M275, M276, M277, M278, M279, M280, M281, M282, M283, M284, M285, M286, M287, M288, M289, M290, M291, M292, M293, M294, M295, M296, M297, M298, M299, M300, M301, M302, M303, M304, M305, M306, M307, M308, M309, M310, M311, M312, M313, M314, M315, M316, M317, M318, M319, M320, M321, M322, M323, M324, M325, M326, M327, M328, M329, M330, M331, M332, M333, M334, M335, M336, M337, M338, M339, M340, M341, M342, M343, M344, M345, M346, M347, M348, M349, M350, M351, M352, M353, M354, M355, M356, M357, M358, M359, M360, M361, M362, M363, M364, M365, M366, M367, M368, M369, M370, M371, M372, M373, M374, M375, M376, M377, M378, M379, M380, M381, M382, M383, M384, M385, M386, M387, M388, M389, M390, M391, M392, M393, M394, M395, M396, M397, M398, M399, M400, M401, M402, M403, M404, M405, M406, M407, M408, M409, M410, M411, M412, M413, M414, M415, M416, M417, M418, M419, M420, M421, M422, M423, M424, M425, M426, M427, M428, M429, M430, M431, M432, M433, M434, M435, M436, M437, M438, M439, M440, M441, M442, M443, M444, M445, M446, M447, M448, M449, M450, M451, M452, M453, M454, M455, M456, M457, M458, M459, M460, M461, M462, M463, M464, M465, M466, M467, M468, M469, M470, M471, M472, M473, M474, M475, M476, M477, M478, M479, M480, M481, M482, M483, M484, M485, M486, M487, M488, M489, M490, M491, M492, M493, M494, M495, M496, M497, M498, M499, M500, M501, M502, M503, M504, M505, M506, M507, M508, M509, M510, M511, M512, M513, M514, M515, M516, M517, M518, M519, M520, M521, M522, M523, M524, M525, M526, M527, M528, M529, M530, M531, M532, M533, M534, M535, M536, M537, M538, M539, M540, M541, M542, M543, M544, M545, M546, M547, M548, M549, M550, M551, M552, M553, M554, M555, M556, M557, M558, M559, M560, M561, M562, M563, M564, M565, M566, M567, M568, M569, M570, M571, M572, M573, M574, M575, M576, M577, M578, M579, M580, M581, M582, M583, M584, M585, M586, M587, M588, M589, M590, M591, M592, M593, M594, M595, M596, M597, M598, M599, M600, M601, M602, M603, M604, M605, M606, M607, M608, M609, M610, M611, M612, M613, M614, M615, M616, M617, M618, M619, M620, M621, M622, M623, M624, M625, M626, M627, M628, M629, M630, M631, M632, M633, M634, M635, M636, M637, M638, M639, M640, M641, M642, M643, M644, M645, M646, M647, M648, M649, M650, M651, M652, M653, M654, M655, M656, M657, M658, M659, M660, M661, M662, M663, M664, M665, M666, M667, M668, M669, M670, M671, M672, M673, M674, M675, M676, M677, M678, M679, M680, M681, M682, M683, M684, M685, M686, M687, M688, M689, M690, M691, M692, M693, M694, M695, M696, M697, M698, M699, M700, M701, M702, M703, M704, M705, M706, M707, M708, M709, M710, M711, M712, M713, M714, M715, M716, M717, M718, M719, M720, M721, M722, M723, M724, M725, M726, M727, M728, M729, M730, M731, M732, M733, M734, M735, M736, M737, M738, M739, M740, M741, M742, M743, M744, M745, M746, M747, M748, M749, M750, M751, M752, M753, M754, M755, M756, M757, M758, M759, M760, M761, M762, M763, M764, M765, M766, M767, M768, M769, M770, M771, M772, M773, M774, M775, M776, M777, M778, M779, M780, M781, M782, M783, M784, M785, M786, M787, M788, M789, M790, M791, M792, M793, M794, M795, M796, M797, M798, M799, M800, M801, M802, M803, M804, M805, M806, M807, M808, M809, M810, M811, M812, M813, M814, M815, M816, M817, M818, M819, M820, M821, M822, M823, M824, M825, M826, M827, M828, M829, M830, M831, M832, M833, M834, M835, M836, M837, M838, M839, M840, M841, M842, M843, M844, M845, M846, M847, M848, M849, M850, M851, M852, M853, M854, M855, M856, M857, M858, M859, M860, M861, M862, M863, M864, M865, M866, M867, M868, M869, M870, M871, M872, M873, M874, M875, M876, M877, M878, M879, M880, M881, M882, M892, M893, M894, M895, M896, M897, M898, M899, M900, M901, M902, M903, M904, M905, M906, M907, M908, M909, M910, M911, M912, M913, M914, M915, M916, M917, M918, M919, M920, M921, M922, M923, M924, M925, M926, M927, M928, M929, M930, M931, M932, M933, M934, M935, M936, M937, M938, M939, M940, M941, M942, M943, M944, M945, M946, M947, M948, M949, M950, M951, M952, M953, M954, M955, M956, M957, M958, M959, M960, M961, M962, M963, M964, M965, M966, M967, M968, M969, M970, M971, M972, M973, M974, M975, M976, M977, M978, M979, M980, M981, M982, M983, M984, M985, M986, M987, M988, M989, M990, M991, M992, M993, M994, M995, M996, M997, M998, M999, M1000, M1001, M1002, M1003, M1004, M1005, M1006, M1007, M1008, M1009, M1010, M1011, M1012, M1013, M1014, M1015, M1016, M1017, M1018, M1019, M1020, M1021, M1022, M1023, M1024, M1025, M1026, M1027, M1028, M1029, M1030, M1031, M1032, M1033, M1034, M1035, M1036, M1037, M1038, M1039, M1040, M1041, M1042, M1043, M1044, M1045, M1046, M1047, M1048, M1049, M1050, M1051, M1052, M1053, M1054, M1055, M1056, M1057, M1058, M1059, M1060, M1061, M1062, M1063, M1064, M1065, M1066, M1067, M1068, M1069, M1070, M1071, M1072, M1073, M1074, M1075, M1076, M1077, M1078, M1079, M1080, M1081, M1082, M1083, M1084, M1085, M1086, M1087, M1088, M1089, M1090, M1091, M1092, M1093, M1094, M1095, M1096, M1097, M1098, M1099, M1100, M1101, M1102, M1103, M1104, M1105, M1106, M1107, M1108, M1109, M1110, M1111, M1112, M1113, M1114, M1115, M1116, M1117, M1118, M1119, M1120, M1121, M1122, M1123, M1124, M1125, M1126, M1127, M1128, M1129, M1130, M1131, M1132, M1133, M1134 with a compound of the formula (III), (Ia), (IIa), (IIIa), (IVa), (Va), (VIa) or a compound from table 6 or 7.

The light-emitting layer in the organic electroluminescent device of the invention, comprising at least one phosphorescent emitter, is preferably an infrared-emitting or yellow-, orange-, red-, green-, blue- or ultraviolet-emitting layer, more preferably a yellow- or green-emitting layer and most preferably a green-emitting layer.

A yellow-emitting layer is understood here to mean a layer having a photoluminescence maximum within the range from 540 to 570 nm. An orange-emitting layer is understood to mean a layer having a photoluminescence maximum within the range from 570 to 600 nm. A red-emitting layer is understood to mean a layer having a photoluminescence maximum within the range from 600 to 750 nm. A green-emitting layer is understood to mean a layer having a photoluminescence maximum within the range from 490 to 540 nm. A blue-emitting layer is understood to mean a layer having a photoluminescence maximum within the range from 440 to 490 nm. The photoluminescence maximum of the layer is determined here by measuring the photoluminescence spectrum of the layer having a layer thickness of 50 nm at room temperature, said layer having the inventive combination of the host materials of the formulae (1) and (2) and the appropriate emitter.

The photoluminescence spectrum of the layer is recorded, for example, with a commercial photoluminescence spectrometer.

The photoluminescence spectrum of the emitter chosen is generally measured in oxygen-free solution, $10^{-5}$ molar, at room temperature, a suitable solvent being any in which the chosen emitter dissolves in the concentration mentioned. Particularly suitable solvents are typically toluene or 2-methyl-THF, but also dichloromethane. Measurement is effected with a commercial photoluminescence spectrometer. The triplet energy T1 in eV is determined from the photoluminescence spectra of the emitters. Firstly, the peak maximum Plmax. (in nm) of the photoluminescence spectrum is determined. The peak maximum Plmax. (in nm) is then converted to eV by: E(T1 in eV)=1240/E(T1 in nm)=1240/PLmax. (in nm).

Preferred phosphorescent emitters are accordingly infrared emitters, preferably of the formula (III), (Ia), (IIa), (IIIa), (IVa), (Va), (VIa) or from table 6 or 7, the triplet energy $T_1$ of which is preferably ~1.9 eV to ~1.0 eV.

Preferred phosphorescent emitters are accordingly red emitters, preferably of the formula (III), (Ia), (IIa), (IIIa), (IVa), (Va), (VIa) or from table 6 or 7, the triplet energy $T_1$ of which is preferably ~2.1 eV to ~1.9 eV.

Preferred phosphorescent emitters are accordingly yellow emitters, preferably of the formula (III), (Ia), (IIa), (IIIa), (IVa), (Va), (VIa) or from table 6 or 7, the triplet energy $T_1$ of which is preferably ~2.3 eV to ~2.1 eV.

Preferred phosphorescent emitters are accordingly green emitters, preferably of the formula (III), (Ia), (IIa), (IIIa), (IVa), (Va), (VIa) or from table 6 or 7, the triplet energy $T_1$ of which is preferably ~2.5 eV to ~2.3 eV.

Preferred phosphorescent emitters are accordingly blue emitters, preferably of the formula (III), (Ia), (IIa), (IIIa), (IVa), (Va), (VIa) or from table 6 or 7, the triplet energy $T_1$ of which is preferably ~3.1 eV to ~2.5 eV.

Preferred phosphorescent emitters are accordingly ultraviolet emitters of the formula (III), (Ia), (IIa), (IIIa), (IVa), (Va), (VIa) or from table 6 or 7, the triplet energy $T_1$ of which is preferably ~4.0 eV to ~3.1 eV.

Particularly preferred phosphorescent emitters are accordingly green or yellow emitters, preferably of the formula (III), (Ia), (IIa), (IIIa), (IVa), (Va), (VIa) or from table 6 or 7 as described above.

Very particularly preferred phosphorescent emitters are accordingly green emitters, preferably of the formula (III), (Ia), (IIa), (IIIa), (IVa), (Va), (VIa) or from table 6 or 7, the triplet energy $T_1$ of which is preferably ~2.5 eV to ~2.3 eV.

Most preferably, green emitters, preferably of the formula (III), (Ia), (IIa), (IIIa), (IVa), (Va), (VIa) or from table 6 or 7, as described above, are selected for the composition of the invention or emitting layer of the invention.

It is also possible for fluorescent emitters to be present in the light-emitting layer of the device of the invention.

Preferred fluorescent emitters are selected from the class of the arylamines. An arylamine or an aromatic amine in the context of this invention is understood to mean a compound containing three substituted or unsubstituted aromatic or heteroaromatic ring systems bonded directly to the nitrogen. Preferably, at least one of these aromatic or heteroaromatic ring systems is a fused ring system, more preferably having at least 14 aromatic ring atoms. Preferred examples of these are aromatic anthraceneamines, aromatic anthracenediamines, aromatic pyreneamines, aromatic pyrenediamines, aromatic chryseneamines or aromatic chrysenediamines. An aromatic anthraceneamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 9, 10 positions. Aromatic pyreneamines, pyrenediamines, chryseneamines and chrysenediamines are defined analogously, where the diarylamino groups are bonded to the pyrene preferably in the 1 position or 1,6 position. Further preferred fluorescent emitters are indenofluoreneamines or -diamines, for example according to WO 2006/108497 or WO 2006/122630, benzoindenofluoreneamines or -diamines, for example according to WO 2008/006449, and dibenzoindenofluoreneamines or -diamines, for example according to WO 2007/140847, and the indenofluorene derivatives having fused aryl groups disclosed in WO 2010/012328.

In a further preferred embodiment of the invention, the at least one light-emitting layer of the organic electroluminescent device, as well as the host materials 1 and 2, as described above or described as preferred, may comprise further host materials or matrix materials, called mixed matrix systems. The mixed matrix systems preferably comprise three or four different matrix materials, more preferably three different matrix materials (in other words, one further matrix component in addition to the host materials 1 and 2, as described above). Particularly suitable matrix materials which can be used in combination as matrix component in a mixed matrix system are selected from wide-band gap materials, bipolar host materials, electron transport materials (ETM) and hole transport materials (HTM).

A wide-band gap material is understood herein to mean a material within the scope of the disclosure of U.S. Pat. No. 7,294,849 which is characterized by a band gap of at least 3.5 eV, the band gap being understood to mean the gap between the HOMO and LUMO energy of a material.

In one embodiment of the present invention, the mixture does not comprise any further constituents, i.e. functional materials, aside from the constituents of electron-transporting host material of the formula (1) and hole-transporting host material of the formula (2). These are material mixtures that are used as such for production of the light-emitting layer. These mixtures are also referred to as premix systems that are used as the sole material source in the vapour deposition of the host materials for the light-emitting layer and have a constant mixing ratio in the vapour deposition. In this way, it is possible in a simple and rapid manner to achieve the vapour deposition of a layer with homogeneous distribution of the components without the need for precise actuation of a multitude of material sources.

In an alternative embodiment of the present invention, the mixture also comprises the phosphorescent emitter, as described above, in addition to the constituents of electron-transporting host material of the formula (1) and hole-transporting host material of the formula (2). In the case of a suitable mixing ratio in the vapour deposition, this mixture may also be used as the sole material source, as described above.

The components or constituents of the light-emitting layer of the device of the invention may thus be processed by vapour deposition or from solution. The material combination of host materials 1 and 2, as described above or described as preferred, optionally with the phosphorescent emitter, as described above or described as preferred, are provided for the purpose in a formulation containing at least one solvent. These formulations may, for example, be solutions, dispersions or emulsions. For this purpose, it may be preferable to use mixtures of two or more solvents.

The present invention therefore further provides a formulation comprising an inventive mixture of host materials 1 and 2, as described above, optionally in combination with a phosphorescent emitter, as described above or described as preferred, and at least one solvent.

Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane or mixtures of these solvents.

The formulation here may also comprise at least one further organic or inorganic compound which is likewise used in the light-emitting layer of the device of the invention, especially a further emitting compound and/or a further matrix material.

The light-emitting layer in the device of the invention, according to the preferred embodiments and the emitting compound, contains preferably between 99.9% and 1% by volume, further preferably between 99% and 10% by volume, especially preferably between 98% and 60% by volume, very especially preferably between 97% and 80% by volume, of matrix material composed of at least one compound of the formula (1) and at least one compound of the formula (2) according to the preferred embodiments, based on the overall composition of emitter and matrix material. Correspondingly, the light-emitting layer in the device of the invention preferably contains between 0.1% and 99% by volume, further preferably between 1% and 90% by volume, more preferably between 2% and 40% by volume, most preferably between 3% and 20% by volume, of the emitter based on the overall composition of the light-emitting layer composed of emitter and matrix material. If the compounds are processed from solution, preference is given to using the corresponding amounts in % by weight rather than the above-specified amounts in % by volume.

The light-emitting layer in the device of the invention, according to the preferred embodiments and the emitting compound, preferably contains the matrix material of the formula (1) and the matrix material of the formula (2) in a percentage by volume ratio between 3:1 and 1:3, preferably between 1:2.5 and 1:1, more preferably between 1:2 and 1:1. If the compounds are processed from solution, preference is given to using the corresponding ratio in % by weight rather than the above-specified ratio in % by volume.

The sequence of layers in the organic electroluminescent device of the invention is preferably as follows:

anode/hole injection layer/hole transport layer/emitting layer/electron transport layer/electron injection layer/cathode.

This sequence of the layers is a preferred sequence.

At the same time, it should be pointed out again that not all the layers mentioned need be present and/or that further layers may additionally be present.

The organic electroluminescent device of the invention may contain two or more emitting layers. At least one of the emitting layers is the light-emitting layer of the invention containing at least one compound of the formula (1) as host material 1 and at least one compound of the formula (2) as host material 2 as described above. More preferably, these emission layers in this case have several emission maxima between 380 nm and 750 nm overall, such that the overall result is white emission; in other words, various emitting compounds which may fluoresce or phosphoresce and which emit blue or yellow or orange or red light are used in the emitting layers. Especially preferred are three-layer systems, i.e. systems having three emitting layers, where the three layers show blue, green and orange or red emission (for the basic construction see, for example, WO 2005/011013). It should be noted that, for the production of white light, rather than a plurality of colour-emitting emitter compounds, an emitter compound used individually which emits over a broad wavelength range may also be suitable.

Suitable charge transport materials as usable in the hole injection or hole transport layer or electron blocker layer or in the electron transport layer of the organic electroluminescent device of the invention are, for example, the compounds disclosed in Y. Shirota et al., Chem. Rev. 2007, 107(4), 953-1010, or other materials as used in these layers according to the prior art.

Materials used for the electron transport layer may be any materials as used according to the prior art as electron transport materials in the electron transport layer. Especially suitable are aluminium complexes, for example $Alq_3$, zirconium complexes, for example $Zrq_4$, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Further suitable materials are derivatives of the abovementioned compounds as disclosed in JP 2000/053957, WO 2003/060956, WO 2004/028217, WO 2004/080975 and WO 2010/072300.

Preferred hole transport materials are especially materials which can be used in a hole transport, hole injection or electron blocker layer, such as indenofluoreneamine derivatives (for example according to WO 06/122630 or WO 06/100896), the amine derivatives disclosed in EP 1661888, hexaazatriphenylene derivatives (for example according to WO 01/049806), amine derivatives having fused aromatic systems (for example according to U.S. Pat. No. 5,061,569), the amine derivatives disclosed in WO 95/09147, monobenzoindenofluoreneamines (for example according to WO 08/006449), dibenzoindenofluoreneamines (for example according to WO 07/140847), spirobifluoreneamines (for example according to WO 2012/034627 or the as yet unpublished EP 12000929.5), fluoreneamines (for example according to WO 2014/015937, WO 2014/015938 and WO 2014/015935), spirodibenzopyranamines (for example according to WO 2013/083216) and dihydroacridine derivatives (for example WO 2012/150001).

Suitable cathodes of the device of the invention are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag or Al, in which case combinations of the metals such as Ca/Ag, Mg/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). It is also possible to use lithium quinolinate (LiQ) for this purpose. The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (organic solar cell) or the emission of light (OLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers. In addition, the anode may also consist of two or more layers, for example of an inner layer of ITO and an outer layer of a metal oxide, preferably tungsten oxide, molybdenum oxide or vanadium oxide.

The organic electroluminescent device of the invention, in the course of production, is appropriately (according to the application) structured, contact-connected and finally sealed, since the lifetime of the devices of the invention is shortened in the presence of water and/or air.

The production of the device of the invention is not restricted here. It is possible that one or more organic layers, including the light-emitting layer, are coated by a sublimation method. In this case, the materials are applied by vapour deposition in vacuum sublimation systems at an initial pressure of less than $10^{-5}$ mbar, preferably less than $10^{-6}$ mbar. In this case, however, it is also possible that the initial pressure is even lower, for example less than $10^{-7}$ mbar.

The organic electroluminescent device of the invention is preferably characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example, M. S. Arnold et al., Appl. Phys. Lett. 2008, 92, 053301).

The organic electroluminescent device of the invention is further preferably characterized in that one or more organic layers comprising the composition of the invention are produced from solution, for example by spin-coating, or by any printing method, for example screen printing, flexographic printing, nozzle printing or offset printing, but more preferably LITI (light-induced thermal imaging, thermal transfer printing) or inkjet printing. For this purpose, soluble host materials 1 and 2 and phosphorescent emitters are needed. Processing from solution has the advantage that, for example, the light-emitting layer can be applied in a very simple and inexpensive manner. This technique is especially suitable for the mass production of organic electroluminescent devices.

In addition, hybrid methods are possible, in which, for example, one or more layers are applied from solution and one or more further layers are applied by vapour deposition.

These methods are known in general terms to those skilled in the art and can be applied to organic electroluminescent devices.

The invention therefore further provides a process for producing the organic electroluminescent device of the invention as described above or described as preferred, characterized in that the light-emitting layer is applied by gas phase deposition, especially by a sublimation method and/or by an OVPD (organic vapour phase deposition) method and/or with the aid of a carrier gas sublimation, or from solution, especially by spin-coating or by a printing method.

In the case of production by means of gas phase deposition, there are in principle two ways in which the light-emitting layer of the invention can be applied or vapour-deposited onto any substrate or the prior layer. Firstly, the materials used can each be initially charged in a material source and ultimately evaporated from the different material sources ("co-evaporation"). Secondly, the various materials can be premixed (premix systems) and the mixture can be initially charged in a single material source from which it is ultimately evaporated ("premix evaporation"). In this way, it is possible in a simple and rapid manner to achieve the vapour deposition of the light-emitting layer with homogeneous distribution of the components without the need for precise actuation of a multitude of material sources.

The invention accordingly further provides a process for producing the device of the invention, characterized in that the at least one compound of the formula (1) as described above or described as preferred and the at least one compound of the formula (2) as described above or described as preferred are deposited from the gas phase successively or simultaneously from at least two material sources, optionally with the at least one phosphorescent emitter as described above or described as preferred, and form the light-emitting layer.

In a preferred embodiment of the present invention, the light-emitting layer is applied by means of gas phase deposition, wherein the constituents of the composition are premixed and evaporated from a single material source.

The invention accordingly further provides a process for producing the device of the invention, characterized in that the at least one compound of the formula (1) and the at least one compound of the formula (2) are deposited from the gas phase as a mixture, successively or simultaneously with the at least one phosphorescent emitter, and form the light-emitting layer.

The invention further provides a process for producing the device of the invention, as described above or described as preferred, characterized in that the at least one compound of the formula (1) and the at least one compound of the formula (2), as described above or described as preferred, are applied from solution together with the at least one phosphorescent emitter in order to form the light-emitting layer.

The devices of the invention feature the following surprising advantages over the prior art:

The use of the described material combination of host materials 1 and 2, as described above, especially leads to an increase in the lifetime of the devices.

As apparent in the example given hereinafter, it is possible to determine by comparison of the data for OLEDs with combinations from the prior art that the inventive combinations of matrix materials in the EML lead to devices having an increase in lifetime by about 19% to 65%, irrespective of the emitter concentration.

It should be pointed out that variations of the embodiments described in the present invention are covered by the scope of this invention. Any feature disclosed in the present invention may, unless this is explicitly ruled out, be exchanged for alternative features which serve the same purpose or an equivalent or similar purpose. Any feature disclosed in the present invention, unless stated otherwise, should therefore be considered as an example from a generic series or as an equivalent or similar feature.

All features of the present invention may be combined with one another in any manner, unless particular features and/or steps are mutually exclusive. This is especially true of preferred features of the present invention. Equally, features of non-essential combinations may be used separately (and not in combination).

The technical teaching disclosed with the present invention may be abstracted and combined with other examples.

The invention is illustrated in more detail by the examples which follow, without any intention of restricting it thereby.

General Methods:

In all quantum-chemical calculations, the Gaussian16 (Rev. B.01) software package is used. The neutral singlet ground state is optimized at the B3LYP/6-31G(d) level. HOMO and LUMO values are determined at the B3LYP/6-31G(d) level for the B3LYP/6-31G(d)-optimized ground state energy. Then TD-DFT singlet and triplet excitations (vertical excitations) are calculated by the same method (B3LYP/6-31G(d)) and with the optimized ground state geometry. The standard settings for SCF and gradient convergence are used.

From the energy calculation, the HOMO is obtained as the last orbital occupied by two electrons (alpha occ. eigenvalues) and LUMO as the first unoccupied orbital (alpha virt. eigenvalues) in Hartree units, where HEh and LEh represent the HOMO energy in Hartree units and the LUMO energy in Hartree units respectively. This is used to determine the HOMO and LUMO value in electron volts, calibrated by cyclic voltammetry measurements, as follows:

HOMOcorr=0.90603*HOMO−0.84836

LUMOcorr=0.99687*LUMO−0.72445

The triplet level T1 of a material is defined as the relative excitation energy (in eV) of the triplet state having the lowest energy which is found by the quantum-chemical energy calculation.

The singlet level S1 of a material is defined as the relative excitation energy (in eV) of the singlet state having the second-lowest energy which is found by the quantum-chemical energy calculation.

The energetically lowest singlet state is referred to as S0.

The method described herein is independent of the software package used and always gives the same results. Examples of frequently utilized programs for this purpose are "Gaussian09" (Gaussian Inc.) and Q-Chem 4.1 (Q-Chem, Inc.). In the present case, the energies are calculated using the software package "Gaussian16 (Rev. B.01)".

EXAMPLE 1: PRODUCTION OF THE OLEDS

The examples which follow (see tables 8 to 10) present the use of the material combinations of the invention in OLEDs by comparison with material combinations from the prior art.

Pretreatment for examples V1 to V5 and E1a to E5g: Glass plates coated with structured ITO (indium tin oxide) of thickness 50 nm are treated prior to coating, first with an oxygen plasma, followed by an argon plasma. These plasma-treated glass plates form the substrates to which the OLEDs are applied.

The OLEDs basically have the following layer structure: substrate/hole injection layer (HIL)/hole transport layer (HTL)/electron blocker layer (EBL)/emission layer (EML)/optional hole blocker layer (HBL)/electron transport layer (ETL)/optional electron injection layer (EIL) and finally a cathode. The cathode is formed by an aluminium layer of thickness 100 nm. The exact structure of the OLEDs can be found in table 8. The materials required for production of the OLEDs, if they have not already been described before, are shown in table 10. The device data of the OLEDs are listed in table 9.

Examples V1 and V5 are comparative examples with a biscarbazole as hole-transporting host according to the prior art.

Examples E1a to E5f show data for OLEDs of the invention.

All materials are applied by thermal vapour deposition in a vacuum chamber. In this case, the emission layer always consists of at least two matrix materials and an emitting dopant (emitter) which is added to the matrix material(s) in a particular proportion by volume by co-evaporation. Details given in such a form as E13:BCbz1:TE2 (32%:60%:8%) mean here that the material E13 is present in the layer in a proportion by volume of 32%, BCbz1 in a proportion of 60% and TE2 in a proportion of 8%. Analogously, the electron transport layer may also consist of a mixture of two materials.

The electroluminescence spectra are determined at a luminance of 1000 cd/$m^2$, and the CIE 1931 x and y colour coordinates are calculated therefrom. The parameter U10 in table 9 refers to the voltage which is required for a current density of 10 mA/$cm^2$. SE10 and EQE10 respectively denote the current efficiency and external quantum efficiency that are attained at 10 mA/$m^2$.

The lifetime LT is defined as the time after which luminance, measured in cd/$m^2$ in forward direction, drops from the starting luminance to a certain proportion L1 in the course of operation with constant current density $j_0$. A figure of L1=80% in table 9 means that the lifetime reported in the LT column corresponds to the time after which luminance in cd/$m^2$ falls to 80% of its starting value.

Use of Mixtures of the Invention in OLEDs

The material combinations of the invention are used in examples E1a-k, E2a-h, E3a-g, E4a-j, E5a-g as matrix materials in the emission layer of green-phosphorescing OLEDs. As a comparison with the prior art, materials E7, E8, E13, E15, E18, BCbz1 to BCbz5 are used in examples V1 to V5. On comparison of the inventive examples with the corresponding comparative examples, it is clearly apparent that the inventive examples each show a distinct advantage in device lifetime, with otherwise comparable performance data of the OLEDs.

TABLE 8

Structure of the OLEDs

| Ex. | HIL thickness | HTL thickness | EBL thickness | EML thickness | HBL thickness | ETL thickness | EIL thickness |
|---|---|---|---|---|---|---|---|
| V1 | SpMA1:PD1 (95%:5%) 20 nm | SpMA1 200 nm | SpMA2 20 nm | E13:BCbz1:TE2 (32%:60%:8%) 40 nm | ST2 5 nm | ST2:LiQ (50%:50%) 30 nm | LiQ 1 nm |
| E1a | SpMA1:PD1 (95%:5%) 20 nm | SpMA1 200 nm | SpMA2 20 nm | E13:H4:TE2 (32%:60%:8%) 40 nm | ST2 5 nm | ST2:LiQ (50%:50%) 30 nm | LiQ 1 nm |
| E1b | SpMA1:PD1 (95%:5%) 20 nm | SpMA1 200 nm | SpMA2 20 nm | E10:H5:TE2 (32%:60%:8%) 40 nm | ST2 5 nm | ST2:LiQ (50%:50%) 30 nm | LiQ 1 nm |
| E1c | SpMA1:PD1 (95%:5%) 20 nm | SpMA1 200 nm | SpMA2 20 nm | E20:H1:TE2 (32%:60%:8%) 40 nm | ST2 5 nm | ST2:LiQ (50%:50%) 30 nm | LiQ 1 nm |
| E1d | SpMA1:PD1 (95%:5%) 20 nm | SpMA1 200 nm | SpMA2 20 nm | E21:H13:TE2 (32%:60%:8%) 40 nm | ST2 5 nm | ST2:LiQ (50%:50%) 30 nm | LiQ 1 nm |
| E1e | SpMA1:PD1 (95%:5%) 20 nm | SpMA1 200 nm | SpMA2 20 nm | E24:H17:TE2 (32%:60%:8%) 40 nm | ST2 5 nm | ST2:LiQ (50%:50%) 30 nm | LiQ 1 nm |
| E1f | SpMA1:PD1 (95%:5%) 20 nm | SpMA1 200 nm | SpMA2 20 nm | E26:H3:TE2 (32%:60%:8%) 40 nm | ST2 5 nm | ST2:LiQ (50%:50%) 30 nm | LiQ 1 nm |
| E1g | SpMA1:PD1 (95%:5%) 20 nm | SpMA1 200 nm | SpMA2 20 nm | E28:H12:TE2 (32%:60%:8%) 40 nm | ST2 5 nm | ST2:LiQ (50%:50%) 30 nm | LiQ 1 nm |
| E1h | SpMA1:PD1 (95%:5%) 20 nm | SpMA1 200 nm | SpMA2 20 nm | E31:H8:TE2 (32%:60%:8%) 40 nm | ST2 5 nm | ST2:LiQ (50%:50%) 30 nm | LiQ 1 nm |

TABLE 8-continued

Structure of the OLEDs

| Ex. | HIL thickness | HTL thickness | EBL thickness | EML thickness | HBL thickness | ETL thickness | EIL thickness |
|---|---|---|---|---|---|---|---|
| E1i | SpMA1:PD1 (95%:5%) 20 nm | SpMA1 200 nm | SpMA2 20 nm | E36:H18:TE2 (32%:60%:8%) 40 nm | ST2 5 nm | ST2:LiQ (50%:50%) 30 nm | LiQ 1 nm |
| E1j | SpMA1:PD1 (95%:5%) 20 nm | SpMA1 200 nm | SpMA2 20 nm | E46:H6:TE2 (32%:60%:8%) 40 nm | ST2 5 nm | ST2:LiQ (50%:50%) 30 nm | LiQ 1 nm |
| E1k | SpMA1:PD1 (95%:5%) 20 nm | SpMA1 200 nm | SpMA2 20 nm | E48:H7:TE2 (32%:60%:8%) 40 nm | ST2 5 nm | ST2:LiQ (50%:50%) 30 nm | LiQ 1 nm |
| V2 | SpMA1:PD1 (95%:5%) 20 nm | SpMA1 200 nm | SpMA2 20 nm | E15:BCbz2:TE1 (32%:60%:8%) 40 nm | ST2 5 nm | ST2:LiQ (50%:50%) 30 nm | LiQ 1 nm |
| E2a | SpMA1:PD1 (95%:5%) 20 nm | SpMA1 200 nm | SpMA2 20 nm | E15:H3:TE1 (32%:60%:8%) 40 nm | ST2 5 nm | ST2:LiQ (50%:50%) 30 nm | LiQ 1 nm |
| E2b | SpMA1:PD1 (95%:5%) 20 nm | SpMA1 200 nm | SpMA2 20 nm | E12:H16:TE1 (32%:60%:8%) 40 nm | ST2 5 nm | ST2:LiQ (50%:50%) 30 nm | LiQ 1 nm |
| E2c | SpMA1:PD1 (95%:5%) 20 nm | SpMA1 200 nm | SpMA2 20 nm | E11:H5:TE1 (32%:60%:8%) 40 nm | ST2 5 nm | ST2:LiQ (50%:50%) 30 nm | LiQ 1 nm |
| E2d | SpMA1:PD1 (95%:5%) 20 nm | SpMA1 200 nm | SpMA2 20 nm | E5:H4:TE1 (32%:60%:8%) 40 nm | ST2 5 nm | ST2:LiQ (50%:50%) 30 nm | LiQ 1 nm |
| E2e | SpMA1:PD1 (95%:5%) 20 nm | SpMA1 200 nm | SpMA2 20 nm | E16:H10:TE1 (32%:60%:8%) 40 nm | ST2 5 nm | ST2:LiQ (50%:50%) 30 nm | LiQ 1 nm |
| E2f | SpMA1:PD1 (95%:5%) 20 nm | SpMA1 200 nm | SpMA2 20 nm | E49:H11:TE1 (32%:60%:8%) 40 nm | ST2 5 nm | ST2:LiQ (50%:50%) 30 nm | LiQ 1 nm |
| E2g | SpMA1:PD1 (95%:5%) 20 nm | SpMA1 200 nm | SpMA2 20 nm | E50:H12:TE1 (32%:60%:8%) 40 nm | ST2 5 nm | ST2:LiQ (50%:50%) 30 nm | LiQ 1 nm |
| E2h | SpMA1:PD1 (95%:5%) 20 nm | SpMA1 200 nm | SpMA2 20 nm | E51:H18:TE1 (32%:60%:8%) 40 nm | ST2 5 nm | ST2:LiQ (50%:50%) 30 nm | LiQ 1 nm |
| V3 | SpMA1:PD1 (95%:5%) 20 nm | SpMA1 200 nm | SpMA2 20 nm | E7:BCbz4:TE2 (32%:60%:8%) 40 nm | ST2 5 nm | ST2:LiQ (50%:50%) 30 nm | LiQ 1 nm |
| E3a | SpMA1:PD1 (95%:5%) 20 nm | SpMA1 200 nm | SpMA2 20 nm | E7:H6:TE2 (32%:60%:8%) 40 nm | ST2 5 nm | ST2:LiQ (50%:50%) 30 nm | LiQ 1 nm |
| E3b | SpMA1:PD1 (95%:5%) 20 nm | SpMA1 200 nm | SpMA2 20 nm | E6:H3:TE2 (32%:60%:8%) 40 nm | ST2 5 nm | ST2:LiQ (50%:50%) 30 nm | LiQ 1 nm |
| E3c | SpMA1:PD1 (95%:5%) 20 nm | SpMA1 200 nm | SpMA2 20 nm | E2:H7:TE2 (32%:60%:8%) 40 nm | ST2 5 nm | ST2:LiQ (50%:50%) 30 nm | LiQ 1 nm |
| E3d | SpMA1:PD1 (95%:5%) 20 nm | SpMA1 200 nm | SpMA2 20 nm | E27:H12:TE2 (32%:60%:8%) 40 nm | ST2 5 nm | ST2:LiQ (50%:50%) 30 nm | LiQ 1 nm |
| E3e | SpMA1:PD1 (95%:5%) 20 nm | SpMA1 200 nm | SpMA2 20 nm | E22:H15:TE2 (32%:60%:8%) 40 nm | ST2 5 nm | ST2:LiQ (50%:50%) 30 nm | LiQ 1 nm |
| E3f | SpMA1:PD1 (95%:5%) 20 nm | SpMA1 200 nm | SpMA2 20 nm | E3:H20:TE2 (32%:60%:8%) 40 nm | ST2 5 nm | ST2:LiQ (50%:50%) 30 nm | LiQ 1 nm |
| E3g | SpMA1:PD1 (95%:5%) 20 nm | SpMA1 200 nm | SpMA2 20 nm | E53:H19:TE2 (32%:60%:8%) 40 nm | ST2 5 nm | ST2:LiQ (50%:50%) 30 nm | LiQ 1 nm |
| V4 | SpMA1:PD1 (95%:5%) 20 nm | SpMA1 200 nm | SpMA2 20 nm | E8:BCbz5:TE1 (38%:50%:12%) 40 nm | ST2 5 nm | ST2:LiQ (50%:50%) 30 nm | LiQ 1 nm |
| E4a | SpMA1:PD1 (95%:5%) 20 nm | SpMA1 200 nm | SpMA2 20 nm | E8:H3:TE1 (38%:50%:12%) 40 nm | ST2 5 nm | ST2:LiQ (50%:50%) 30 nm | LiQ 1 nm |
| E4b | SpMA1:PD1 (95%:5%) 20 nm | SpMA1 200 nm | SpMA2 20 nm | E4:H4:TE1 (38%:50%:12%) 40 nm | ST2 5 nm | ST2:LiQ (50%:50%) 30 nm | LiQ 1 nm |
| E4c | SpMA1:PD1 (95%:5%) 20 nm | SpMA1 200 nm | SpMA2 20 nm | E23:H5:TE1 (38%:50%:12%) 40 nm | ST2 5 nm | ST2:LiQ (50%:50%) 30 nm | LiQ 1 nm |
| E4d | SpMA1:PD1 (95%:5%) 20 nm | SpMA1 200 nm | SpMA2 20 nm | E32:H9:TE1 (38%:50%:12%) 40 nm | ST2 5 nm | ST2:LiQ (50%:50%) 30 nm | LiQ 1 nm |
| E4e | SpMA1:PD1 (95%:5%) 20 nm | SpMA1 200 nm | SpMA2 20 nm | E19:H11:TE1 (38%:50%:12%) 40 nm | ST2 5 nm | ST2:LiQ (50%:50%) 30 nm | LiQ 1 nm |
| E4f | SpMA1:PD1 (95%:5%) 20 nm | SpMA1 200 nm | SpMA2 20 nm | E29:H8:TE1 (38%:50%:12%) 40 nm | ST2 5 nm | ST2:LiQ (50%:50%) 30 nm | LiQ 1 nm |
| E4g | SpMA1:PD1 (95%:5%) 20 nm | SpMA1 200 nm | SpMA2 20 nm | E39:H8:TE1 (38%:50%:12%) 40 nm | ST2 5 nm | ST2:LiQ (50%:50%) 30 nm | LiQ 1 nm |
| E4h | SpMA1:PD1 (95%:5%) 20 nm | SpMA1 200 nm | SpMA2 20 nm | E1:H10:TE1 (38%:50%:12%) 40 nm | ST2 5 nm | ST2:LiQ (50%:50%) 30 nm | LiQ 1 nm |
| E4i | SpMA1:PD1 (95%:5%) 20 nm | SpMA1 200 nm | SpMA2 20 nm | E43:H3:TE1 (38%:50%:12%) 40 nm | ST2 5 nm | ST2:LiQ (50%:50%) 30 nm | LiQ 1 nm |
| E4j | SpMA1:PD1 (95%:5%) 20 nm | SpMA1 200 nm | SpMA2 20 nm | E43:H4:TE1 (38%:50%:12%) 40 nm | ST2 5 nm | ST2:LiQ (50%:50%) 30 nm | LiQ 1 nm |
| V5 | SpMA1:PD1 (95%:5%) 20 nm | SpMA1 200 nm | SpMA2 20 nm | E18:BCbz3:TE2 (38%:50%:12%) 40 nm | ST2 5 nm | ST2:LiQ (50%:50%) 30 nm | LiQ 1 nm |
| E5a | SpMA1:PD1 (95%:5%) 20 nm | SpMA1 200 nm | SpMA2 20 nm | E18:H5:TE2 (38%:50%:12%) 40 nm | ST2 5 nm | ST2:LiQ (50%:50%) 30 nm | LiQ 1 nm |
| E5b | SpMA1:PD1 (95%:5%) 20 nm | SpMA1 200 nm | SpMA2 20 nm | E37:H12:TE2 (38%:50%:12%) 40 nm | ST2 5 nm | ST2:LiQ (50%:50%) 30 nm | LiQ 1 nm |
| E5c | SpMA1:PD1 (95%:5%) 20 nm | SpMA1 200 nm | SpMA2 20 nm | E14:H21:TE2 (38%:50%:12%) 40 nm | ST2 5 nm | ST2:LiQ (50%:50%) 30 nm | LiQ 1 nm |
| E5d | SpMA1:PD1 (95%:5%) 20 nm | SpMA1 200 nm | SpMA2 20 nm | E9:48:TE2 (38%:50%:12%) 40 nm | ST2 5 nm | ST2:LiQ (50%:50%) 30 nm | LiQ 1 nm |
| E5e | SpMA1:PD1 (95%:5%) 20 nm | SpMA1 200 nm | SpMA2 20 nm | E41:H3:TE2 (38%:50%:12%) 40 nm | ST2 5 nm | ST2:LiQ (50%:50%) 30 nm | LiQ 1 nm |

TABLE 8-continued

| Structure of the OLEDs | | | | | | | |
|---|---|---|---|---|---|---|---|
| Ex. | HIL thickness | HTL thickness | EBL thickness | EML thickness | HBL thickness | ETL thickness | EIL thickness |
| E5f | SpMA1:PD1 (95%:5%) 20 nm | SpMA1 200 nm | SpMA2 20 nm | E42:H5:TE2 (38%:50%:12%) 40 nm | ST2 5 nm | ST2:LiQ (50%:50%) 30 nm | LiQ 1 nm |
| E5g | SpMA1:PD1 (95%:5%) 20 nm | SpMA1 200 nm | SpMA2 20 nm | E54:H8:TE2 (38%:50%:12%) 40 nm | ST2 5 nm | ST2:LiQ (50%:50%) 30 nm | LiQ 1 nm |

TABLE 9

| Data of the OLEDs | | | | | | |
|---|---|---|---|---|---|---|
| Ex. | U10 (V) | EQE10 (%) | CIE x/y at 1000 cd/$m^2$ | $j_0$ (mA/$cm^2$) | L1 (%) | LT (h) |
| V1 | 4.4 | 22.8 | 0.35/0.63 | 40 | 80 | 675 |
| E1a | 4.5 | 23.0 | 0.35/0.63 | 40 | 80 | 805 |
| E1b | 4.3 | 23.7 | 0.35/0.63 | 40 | 80 | 850 |
| E1c | 4.6 | 22.7 | 0.35/0.63 | 40 | 80 | 930 |
| E1d | 4.5 | 23.1 | 0.35/0.63 | 40 | 80 | 810 |
| E1e | 4.7 | 22.2 | 0.35/0.63 | 40 | 80 | 765 |
| E1f | 4.4 | 23.3 | 0.35/0.63 | 40 | 80 | 730 |
| E1g | 4.6 | 22.2 | 0.35/0.63 | 40 | 80 | 820 |
| E1h | 4.5 | 23.2 | 0.35/0.63 | 40 | 80 | 1010 |
| E1i | 4.3 | 23.5 | 0.35/0.63 | 40 | 80 | 900 |
| E1j | 4.2 | 23.0 | 0.35/0.63 | 40 | 80 | 970 |
| E1k | 4.1 | 23.0 | 0.35/0.63 | 40 | 80 | 1050 |
| V2 | 5.3 | 18.3 | 0.35/0.63 | 40 | 80 | 610 |
| E2a | 5.6 | 18.4 | 0.35/0.63 | 40 | 80 | 980 |
| E2b | 5.4 | 18.0 | 0.35/0.63 | 40 | 80 | 755 |
| E2c | 5.3 | 18.6 | 0.35/0.63 | 40 | 80 | 880 |
| E2d | 5.1 | 19.0 | 0.35/0.63 | 40 | 80 | 1075 |
| E2e | 5.5 | 19.2 | 0.35/0.63 | 40 | 80 | 790 |
| E2f | 5.3 | 19.5 | 0.35/0.63 | 40 | 80 | 800 |
| E2g | 5.5 | 18.4 | 0.35/0.62 | 40 | 80 | 880 |
| E2h | 5.3 | 19.3 | 0.34/0.62 | 40 | 80 | 965 |
| V3 | 4.2 | 23.0 | 0.35/0.63 | 40 | 80 | 660 |
| E3a | 4.5 | 22.7 | 0.35/0.63 | 40 | 80 | 825 |
| E3b | 4.5 | 23.7 | 0.35/0.63 | 40 | 80 | 950 |
| E3c | 4.3 | 23.4 | 0.35/0.63 | 40 | 80 | 1005 |
| E3d | 4.8 | 22.5 | 0.35/0.63 | 40 | 80 | 760 |
| E3e | 4.4 | 23.1 | 0.35/0.63 | 40 | 80 | 780 |
| E3f | 4.2 | 21.7 | 0.35/0.63 | 40 | 80 | 710 |
| E3g | 4.4 | 21.1 | 0.35/0.63 | 40 | 80 | 850 |
| V4 | 4.7 | 17.6 | 0.34/0.62 | 40 | 80 | 1240 |
| E4a | 4.8 | 17.4 | 0.34/0.62 | 40 | 80 | 1810 |
| E4b | 4.7 | 17.0 | 0.34/0.62 | 40 | 80 | 1660 |
| E4c | 4.9 | 16.9 | 0.34/0.62 | 40 | 80 | 1540 |
| E4d | 4.5 | 18.0 | 0.34/0.62 | 40 | 80 | 1715 |
| E4e | 4.7 | 17.0 | 0.34/0.62 | 40 | 80 | 1635 |
| E4f | 5.0 | 17.2 | 0.34/0.62 | 40 | 80 | 1480 |
| E4g | 4.5 | 17.6 | 0.34/0.62 | 40 | 80 | 1500 |
| E4h | 4.7 | 17.5 | 0.34/0.62 | 40 | 80 | 1410 |
| E4i | 4.8 | 17.8 | 0.34/0.62 | 40 | 80 | 1905 |
| E4j | 4.7 | 18.2 | 0.34/0.63 | 40 | 80 | 1820 |
| V5 | 4.4 | 21.0 | 0.34/0.62 | 40 | 80 | 1070 |
| E5a | 4.5 | 20.8 | 0.34/0.62 | 40 | 80 | 1310 |
| E5b | 4.7 | 21.3 | 0.34/0.62 | 40 | 80 | 1455 |
| E5c | 4.4 | 20.4 | 0.34/0.62 | 40 | 80 | 1210 |
| E5d | 4.6 | 21.3 | 0.34/0.62 | 40 | 80 | 1335 |
| E5e | 4.2 | 21.7 | 0.34/0.62 | 40 | 80 | 1250 |
| E5f | 4.2 | 20.5 | 0.34/0.62 | 40 | 80 | 1240 |
| E5g | 4.3 | 21.5 | 0.34/0.62 | 40 | 80 | 1405 |

TABLE 10

Structural formulae of the materials of the OLEDs used, if not already described before:

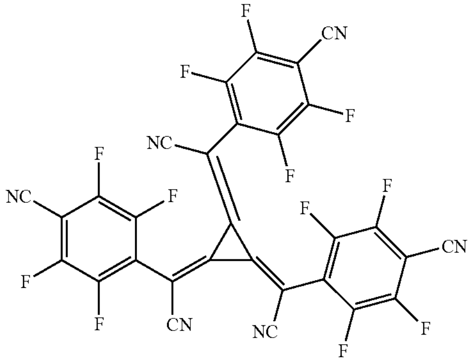 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

PD1 (CAS Reg. No. 1224447-88-4)

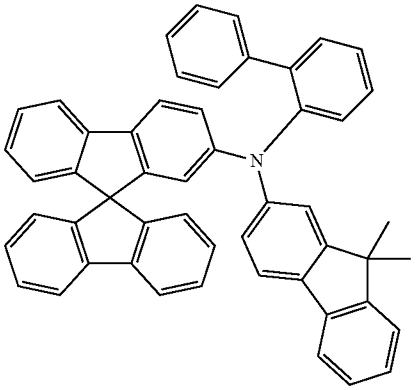 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

SpMA1

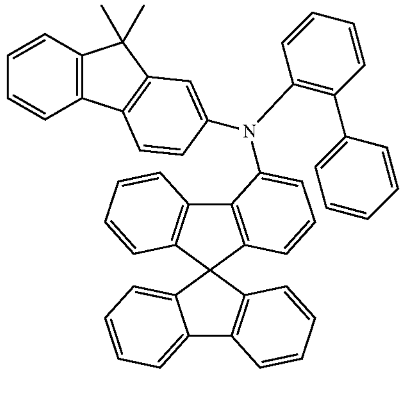 [SMILES: CC1(C)c2ccccc2-c2ccc(N(c3ccccc3-c3ccccc3)c3cccc4c3-c3ccccc3C43c4ccccc4-c4ccccc43)cc21]

SpMA2

TABLE 10-continued
Structural formulae of the materials of the OLEDs used, if not already described before:
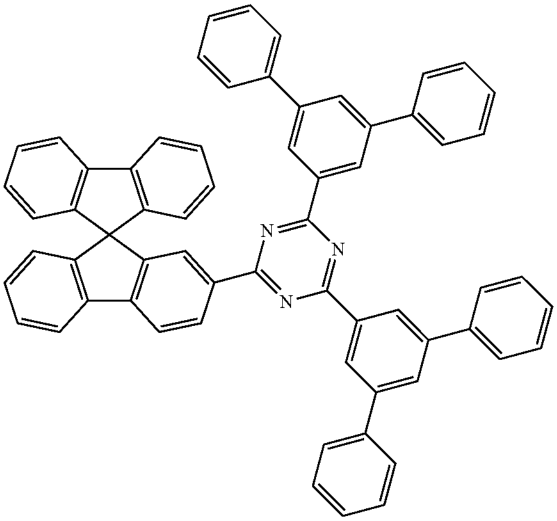 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
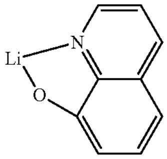
LiQ
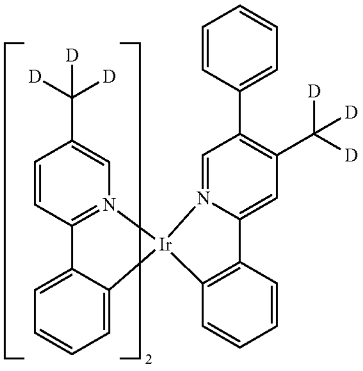
TE1
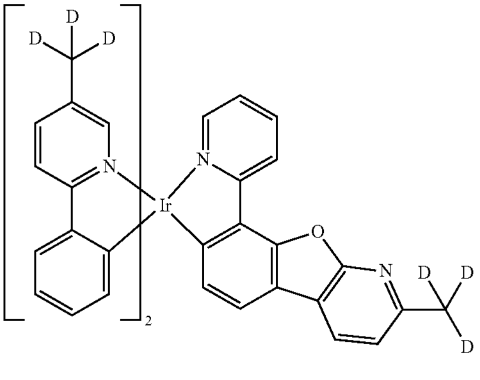
TE2
TABLE 10-continued
Structural formulae of the materials of the OLEDs used, if not already described before:
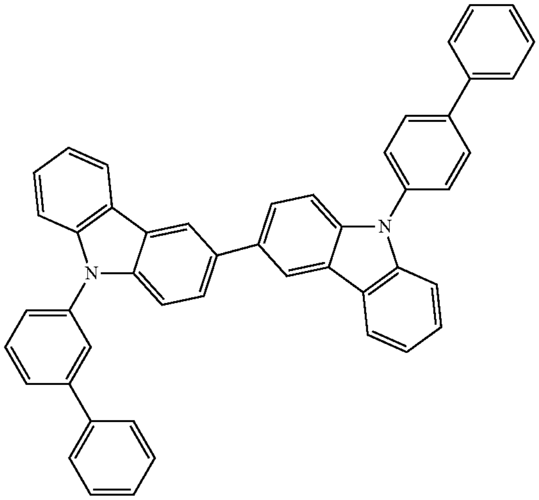 [SMILES: c1ccc(-c2ccc(-n3c4ccccc4c4cc(-c5ccc6c(c5)c5ccccc5n6-c5cccc(-c6ccccc6)c5)ccc43)cc2)cc1]
BCbz1
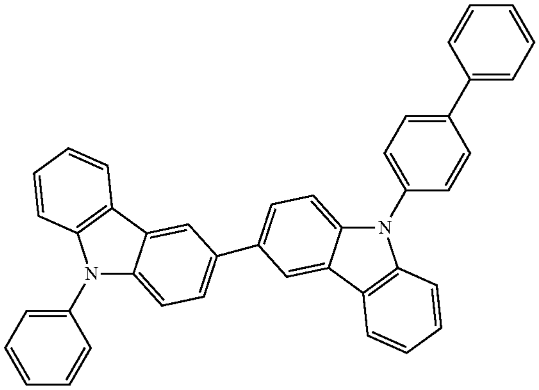 [SMILES: c1ccc(-c2ccc(-n3c4ccccc4c4cc(-c5ccc6c(c5)c5ccccc5n6-c5ccccc5)ccc43)cc2)cc1]
BCbz2
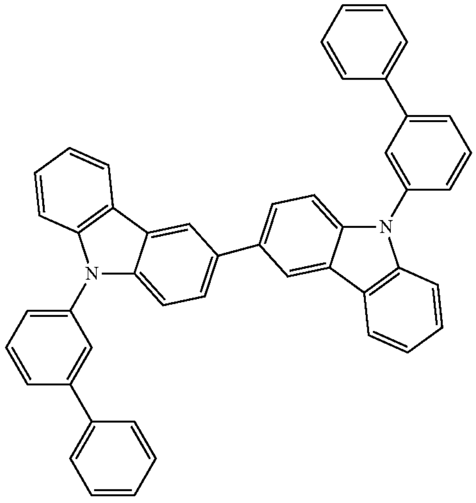 [SMILES: c1ccc(-c2cccc(-n3c4ccccc4c4cc(-c5ccc6c(c5)c5ccccc5n6-c5cccc(-c6ccccc6)c5)ccc43)c2)cc1]
BCbz3

TABLE 10-continued

| Structural formulae of the materials of the OLEDs used, if not already described before: |
| --- |
| 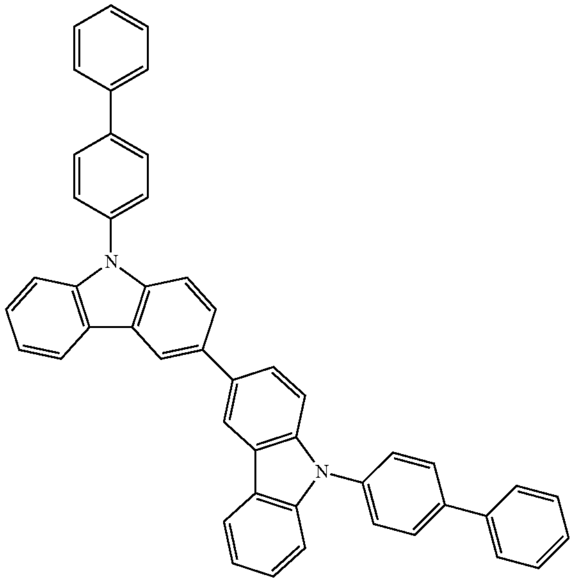 [SMILES: c1ccc(-c2ccc(-n3c4ccccc4c4cc(-c5ccc6c(c5)c5ccccc5n6-c5ccc(-c6ccccc6)cc5)ccc43)cc2)cc1] BCbz4 |
| 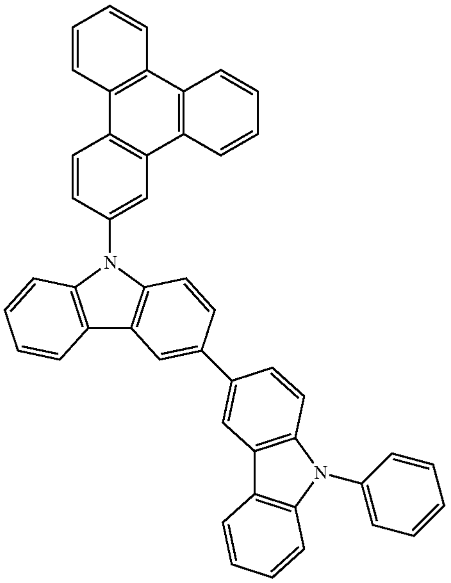 [SMILES: c1ccc(-n2c3ccccc3c3cc(-c4ccc5c(c4)c4ccccc4n5-c4ccc5c6ccccc6c6ccccc6c5c4)ccc32)cc1] BCbz5 |

The syntheses which follow, unless stated otherwise, are conducted under a protective gas atmosphere in dried solvents. The solvents and reagents can be purchased, for example, from Sigma-ALDRICH or ABCR. The respective figures in square brackets or the numbers quoted for individual compounds relate to the CAS numbers of the compounds known from the literature.

S1a:

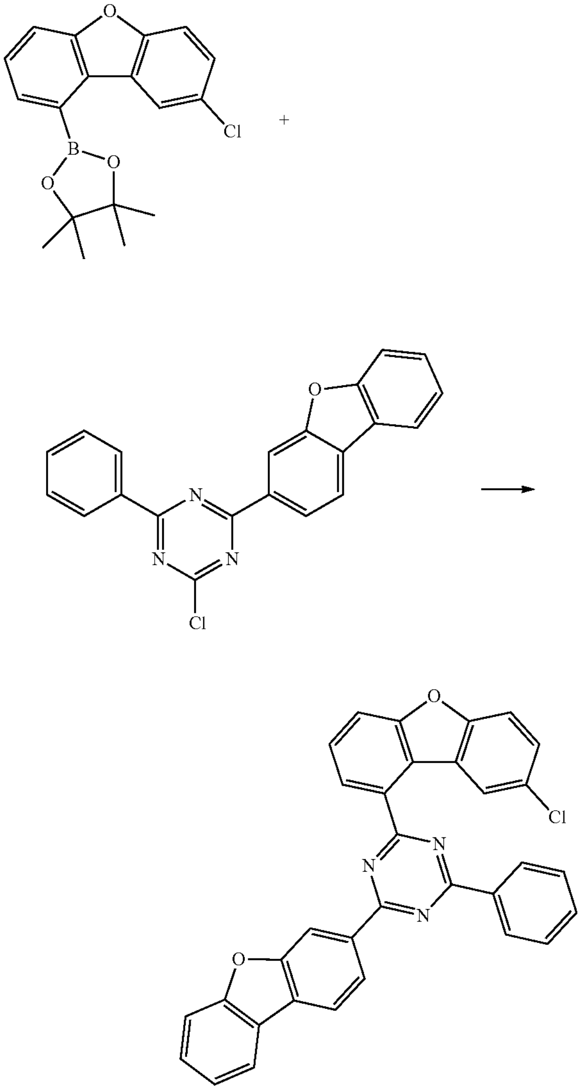

2-(8-Chlorodibenzofuran-1-yl)-4,4,5,5-tetramethyl-1,3,2-dioxaborolane [2140871-51-6] (32.86 g, 100.0 mmol), 2-chloro-4-dibenzofuran-3-yl-6-phenyl-1,3,5-triazine [2142681-84-1] (37.57 g, 105.0 mmol) and sodium carbonate (22.26 g, 210.0 mmol) are suspended in 600 ml of ethylene glycol dimethyl ether and 300 ml of water and inertized for 30 min. Subsequently, tri-o-tolylphosphine (913 mg, 3.0 mmol) and then palladium(II) acetate (112 mg, 0.5 mmol) are added, and the reaction mixture is heated under reflux for 20 h. After cooling, the precipitated solids are filtered off with suction and washed with ethanol. The crude product is recrystallized from m-xylene. Yield: 46.11 g (88 mmol, 88%) of solids, 98% by HPLC.

The following compounds can be prepared analogously: Purification can be effected using column chromatography, or recrystallization can be effected using standard solvents such as ethanol, butanol, acetone, ethyl acetate, acetonitrile, toluene, xylene, dichloromethane, methanol, tetrahydrofuran, n-butyl acetate, 1,4-dioxane, dimethyl sulfoxide, N,N-dimethylformamide, N,N-dimethylacetamide, N-methylpyrrolidone etc.

| Reactant 1 | Reactant 2 | Product | Yield |
| --- | --- | --- | --- |
| 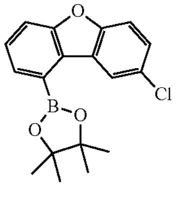 [SMILES: CC1(C)OB(c2cccc3oc4ccc(Cl)cc4c23)OC1(C)C] CAS-2140871-51-6 | 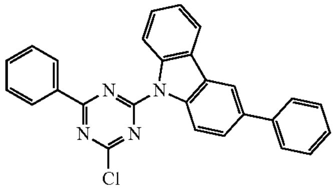 [SMILES: Clc1nc(-c2ccccc2)nc(-n2c3ccccc3c3cc(-c4ccccc4)ccc32)n1] CAS-2260688-83-1 | 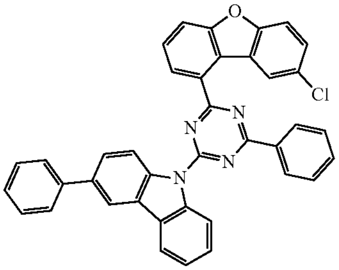 [SMILES: Clc1ccc2oc3cccc(-c4nc(-c5ccccc5)nc(-n5c6ccccc6c6cc(-c7ccccc7)ccc65)n4)c3c2c1] S2a | 88% |
| 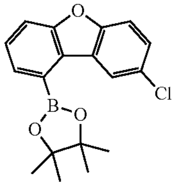 [SMILES: CC1(C)OB(c2cccc3oc4ccc(Cl)cc4c23)OC1(C)C] CAS-2140871-51-6 | 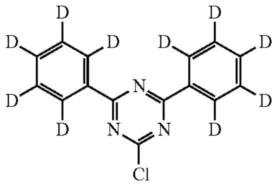 [SMILES: [2H]c1c([2H])c([2H])c(-c2nc(Cl)nc(-c3c([2H])c([2H])c([2H])c([2H])c3[2H])n2)c([2H])c1[2H]] CAS-1300115-09-6 | 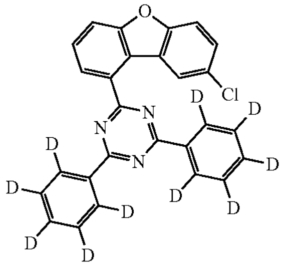 [SMILES: [2H]c1c([2H])c([2H])c(-c2nc(-c3c([2H])c([2H])c([2H])c([2H])c3[2H])nc(-c3cccc4oc5ccc(Cl)cc5c34)n2)c([2H])c1[2H]] S3a | 78% |
| 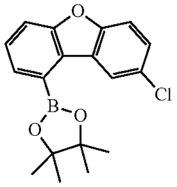 [SMILES: CC1(C)OB(c2cccc3oc4ccc(Cl)cc4c23)OC1(C)C] CAS-2140871-51-6 | 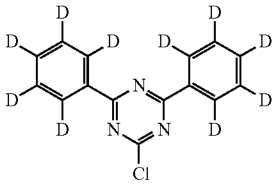 [SMILES: [2H]c1c([2H])c([2H])c(-c2nc(Cl)nc(-c3c([2H])c([2H])c([2H])c([2H])c3[2H])n2)c([2H])c1[2H]] CAS-1852466-09-1 | 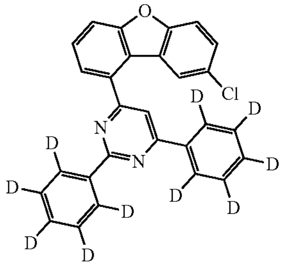 [SMILES: [2H]c1c([2H])c([2H])c(-c2cc(-c3cccc4oc5ccc(Cl)cc5c34)nc(-c3c([2H])c([2H])c([2H])c([2H])c3[2H])n2)c([2H])c1[2H]] S4a | 81% |
S1b:
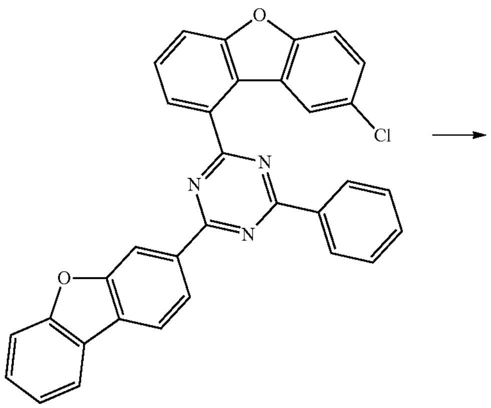
-continued
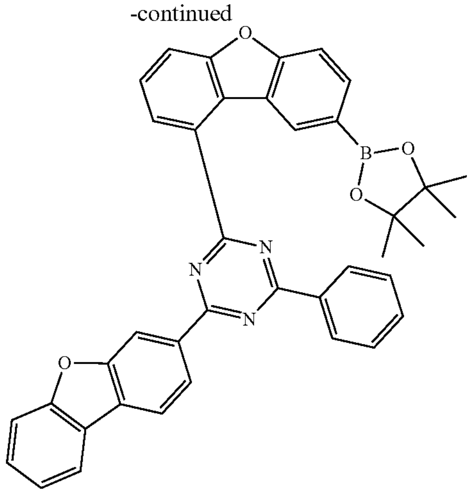
An initial charge of S1a (46.11 g, 88.0 mmol), bis(pinacolato)diboron [73183-34-3] (25.39 g, 100.0 mmol) and potassium acetate (28.82 g, 293.6 mmol) in 1,4-dioxane (700 ml) is inertized with argon for 2 min. Subsequently, XPhos [564483-18-7] (456 mg, 0.96 mmol) and $Pd_2(dba)_3$

[51364-51-3] (435 mg, 0.48 mmol) are added and the reaction mixture is stirred under reflux for 26 h. After cooling, the solvent is removed by rotary evaporation and the residue is worked up by extraction with toluene/water. The organic phase is dried over $Na_2SO_4$ and concentrated to dryness by rotary evaporation. The residue is boiled under reflux with ethyl acetate for 2 h, and the solids are filtered off with suction and washed with ethyl acetate. Yield: 49.4 g (80.2 mmol, 91%) of solids; 97% by $^{1}H$ NMR.

The following compounds can be prepared analogously: Rather than X-Phos, it is also possible to use S-Phos or tricyclohexylphosphine as ligand, or $Pd(dppf)Cl_2$ x $CH_2Cl_2$ [95464-05-4] for borylation of functional bromide groups. Purification can be effected using column chromatography, or recrystallization can be effected using standard solvents such as ethanol, butanol, acetone, ethyl acetate, acetonitrile, toluene, xylene, dichloromethane, methanol, tetrahydrofuran, n-butyl acetate, 1,4-dioxane, dimethyl sulfoxide, N,N-dimethylformamide, N,N-dimethylacetamide, N-methylpyrrolidone etc.

| Reactant | Product | Yield |
|---|---|---|
| 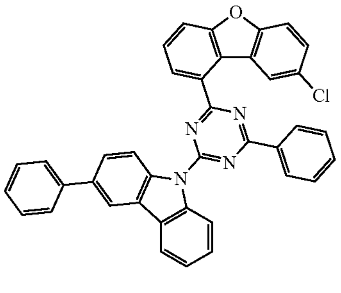 [SMILES: Clc1ccc2oc3cccc(-c4nc(-c5ccccc5)nc(-n5c6ccccc6c6cc(-c7ccccc7)ccc65)n4)c3c2c1] S2a | 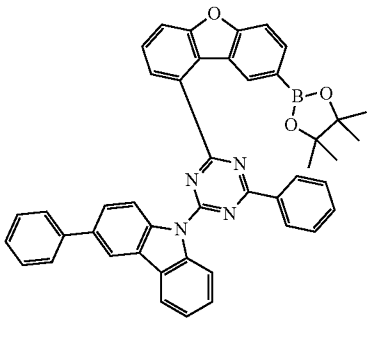 [SMILES: CC1(C)OB(c2ccc3oc4cccc(-c5nc(-c6ccccc6)nc(-n6c7ccccc7c7cc(-c8ccccc8)ccc76)n5)c4c3c2)OC1(C)C] S2b | 80% |
| 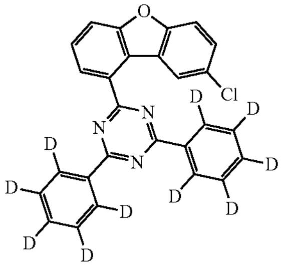 [SMILES: [2H]c1c([2H])c([2H])c(-c2nc(-c3c([2H])c([2H])c([2H])c([2H])c3[2H])nc(-c3cccc4oc5ccc(Cl)cc5c34)n2)c([2H])c1[2H]] S3a | 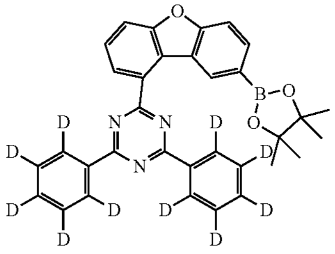 [SMILES: [2H]c1c([2H])c([2H])c(-c2nc(-c3c([2H])c([2H])c([2H])c([2H])c3[2H])nc(-c3cccc4oc5ccc(B6OC(C)(C)C(C)(C)O6)cc5c34)n2)c([2H])c1[2H]] S3b | 82% |
| 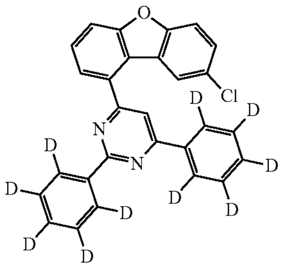 [SMILES: [2H]c1c([2H])c([2H])c(-c2cc(-c3cccc4oc5ccc(Cl)cc5c34)nc(-c3c([2H])c([2H])c([2H])c([2H])c3[2H])n2)c([2H])c1[2H]] S4a | 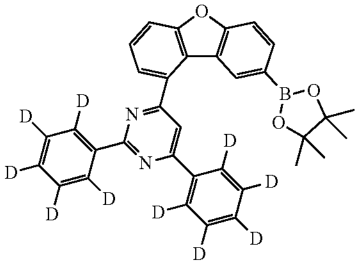 [SMILES: [2H]c1c([2H])c([2H])c(-c2cc(-c3cccc4oc5ccc(B6OC(C)(C)C(C)(C)O6)cc5c34)nc(-c3c([2H])c([2H])c([2H])c([2H])c3[2H])n2)c([2H])c1[2H]] S4b | 79% |
| 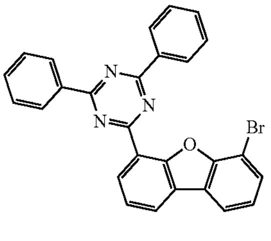 [SMILES: Brc1cccc2c1oc1c(-c3nc(-c4ccccc4)nc(-c4ccccc4)n3)cccc12] CAS-1651196-06-3 | 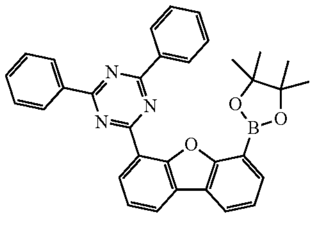 [SMILES: CC1(C)OB(c2cccc3c2oc2c(-c4nc(-c5ccccc5)nc(-c5ccccc5)n4)cccc23)OC1(C)C] S5b | 72% |

-continued
| Reactant | Product | Yield |
|---|---|---|
| 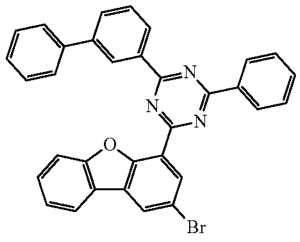 [SMILES: Brc1cc(-c2nc(-c3ccccc3)nc(-c3cccc(-c4ccccc4)c3)n2)c2oc3ccccc3c2c1] CAS-2375066-17-2 | 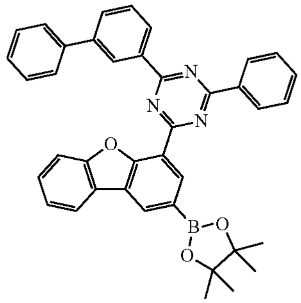 [SMILES: CC1(C)OB(c2cc(-c3nc(-c4ccccc4)nc(-c4cccc(-c5ccccc5)c4)n3)c3oc4ccccc4c3c2)OC1(C)C] S6b | 79% |
| 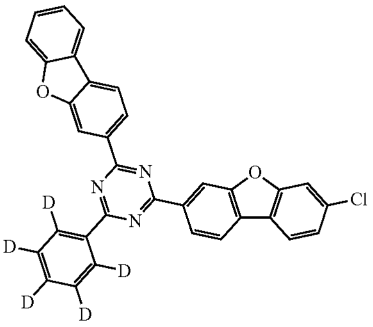 [SMILES: [2H]c1c([2H])c([2H])c(-c2nc(-c3ccc4c(c3)oc3ccccc34)nc(-c3ccc4c(c3)oc3cc(Cl)ccc34)n2)c([2H])c1[2H]] CAS-2408705-82-6 | 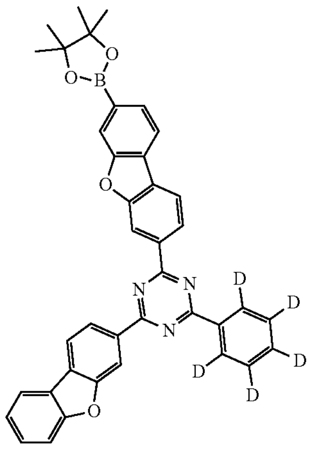 [SMILES: [2H]c1c([2H])c([2H])c(-c2nc(-c3ccc4c(c3)oc3ccccc34)nc(-c3ccc4c(c3)oc3cc(B5OC(C)(C)C(C)(C)O5)ccc34)n2)c([2H])c1[2H]] 7b | 85% |
| 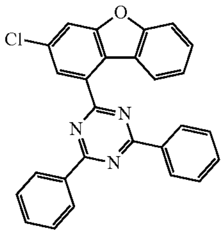 [SMILES: Clc1cc(-c2nc(-c3ccccc3)nc(-c3ccccc3)n2)c2c(c1)oc1ccccc12] CAS-2247123-78-8 | 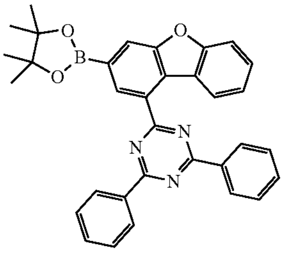 [SMILES: CC1(C)OB(c2cc(-c3nc(-c4ccccc4)nc(-c4ccccc4)n3)c3c(c2)oc2ccccc23)OC1(C)C] 8b | 80% |
| 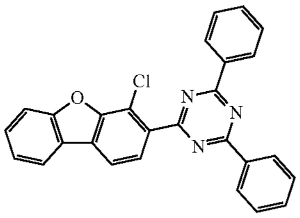 [SMILES: Clc1c(-c2nc(-c3ccccc3)nc(-c3ccccc3)n2)ccc2c1oc1ccccc12] CAS-2254639-58-0 | 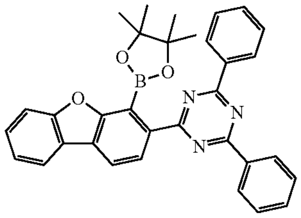 [SMILES: CC1(C)OB(c2c(-c3nc(-c4ccccc4)nc(-c4ccccc4)n3)ccc3c2oc2ccccc23)OC1(C)C] 9b | 28% |

-continued

| Reactant | Product | Yield |
|---|---|---|
| 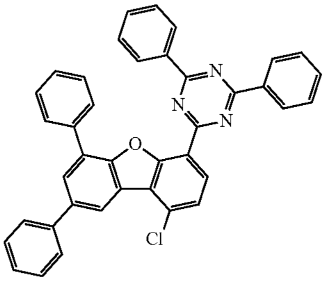 [SMILES: Clc1ccc(-c2nc(-c3ccccc3)nc(-c3ccccc3)n2)c2oc3c(-c4ccccc4)cc(-c4ccccc4)cc3c12] CAS-2399473-96-0 | 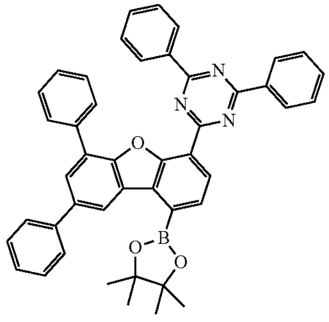 [SMILES: CC1(C)OB(c2ccc(-c3nc(-c4ccccc4)nc(-c4ccccc4)n3)c3oc4c(-c5ccccc5)cc(-c5ccccc5)cc4c23)OC1(C)C] 10b | 48% |
| 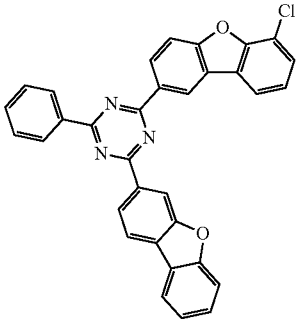 [SMILES: Clc1cccc2c1oc1ccc(-c3nc(-c4ccccc4)nc(-c4ccc5c(c4)oc4ccccc45)n3)cc12] | 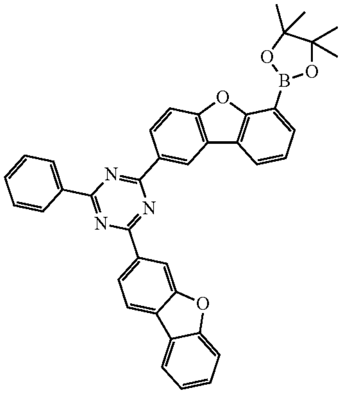 [SMILES: CC1(C)OB(c2cccc3c2oc2ccc(-c4nc(-c5ccccc5)nc(-c5ccc6c(c5)oc5ccccc56)n4)cc23)OC1(C)C] 11b | 78% |

S1c:

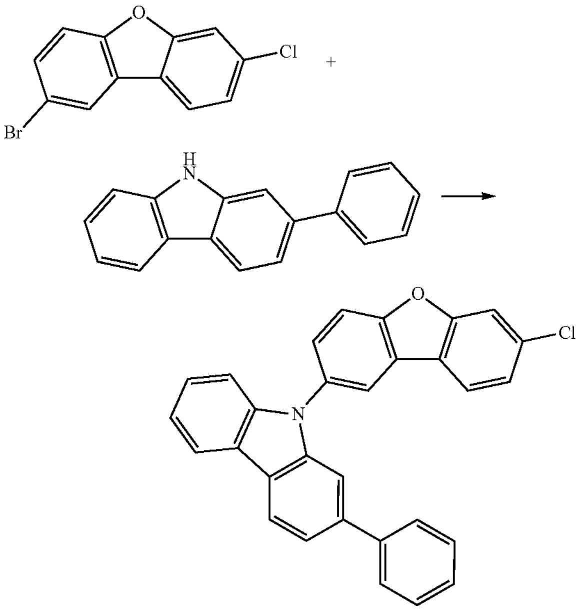

Under inert atmosphere, 2-bromo-7-chlorodibenzofuran [CAS-2355229-03-5] (28.15 g, 100 mmol), 2-phenyl-9H-carbazole [88590-00-5] (25.54 g, 105 mmol) and sodium tert-butoxide (19.21 g, 200 mmol) were initially charged in 1000 ml of ortho-xylene. Subsequently, tri-tert-butylphosphine [13716-12-6] (1 mol/l solution in toluene, 5.0 ml, 5.0 mmol) and tris(dibenzylideneacetone)dipalladium [51364-51-3] (1.14 g, 1.25 mmol) are added one after the other, and the reaction mixture is heated under reflux for 16 h. The reaction mixture is cooled down to room temperature and worked up by extraction with toluene/water. The organic phases are combined and dried over $Na_2SO_4$, and the solvent is removed under reduced pressure on a rotary evaporator. The resultant solids are suspended in 300 ml of ethanol, stirred under reflux for 1 h and filtered off with suction. The crude product is recrystallized from ethyl acetate. Yield: 28.4 g (64 mmol, 48%) of solids, 98% by $^1H$ NMR.

The following compounds can be prepared analogously: Purification can be effected using column chromatography, or recrystallization can be effected using standard solvents such as ethanol, butanol, acetone, ethyl acetate, acetonitrile, toluene, xylene, dichloromethane, methanol, tetrahydrofuran, n-butyl acetate, 1,4-dioxane, dimethyl sulfoxide, N,N-dimethylformamide, N,N-dimethylacetamide, N-methylpyrrolidone etc.

| Reactant 1 | Reactant 2 | Product | Yield |
|---|---|---|---|
| 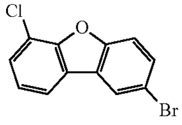 [SMILES: Clc1cccc2c1oc1ccc(Br)cc12] CAS-2144800-21-3 | 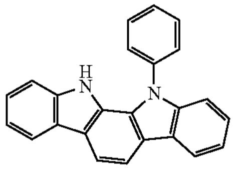 [SMILES: c1ccc(-n2c3ccccc3c3ccc4c5ccccc5[nH]c4c32)cc1] CAS-1024598-06-8 | 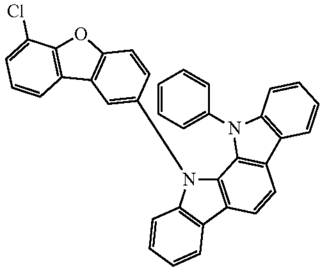 [SMILES: Clc1cccc2c1oc1ccc(-n3c4ccccc4c4ccc5c6ccccc6n(-c6ccccc6)c5c43)cc12] S2c | 37% |

S1d:

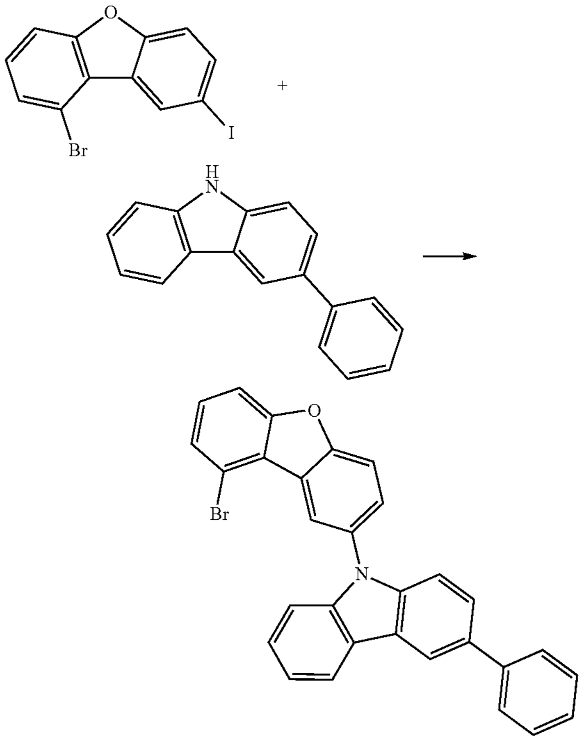

Under an inert atmosphere, an initial charge of 1-bromo-8-iododibenzofuran [1822311-11-4] (37.28 g, 100 mmol), 3-phenyl-9H-carbazole [103012-26-6] (16.71 g, 100 mmol), potassium carbonate (34.55 g, 250 mmol), copper iodide (3.81 g, 20.0 mmol) and 1,3-di(2-pyridinyl)propane-1,3-dione (4.52 g, 20.0 mmol) in DMF (350 ml) are inertized with argon for a further 15 min and then stirred at 115° C. for 32 h. The mixture is left to cool down to room temperature, filtered through a Celite bed and washed through twice with 200 ml of DMF, and the filtrate is concentrated to dryness on a rotary evaporator. The residue is worked up by extraction with dichloromethane/water, and the organic phase is washed twice with water and once with saturated NaCl solution and dried over $Na_2SO_4$. 150 ml of ethanol are added, dichloromethane is drawn off on a rotary evaporator to 500 mbar, and the precipitated solids are filtered off with suction and washed with ethanol. Yield: 24.71 g (50.6 mmol, 51%) of grey solid; 95% by $^1H$ NMR.

The following compounds can be prepared analogously: Purification can be effected using column chromatography, or recrystallization can be effected using standard solvents such as ethanol, butanol, acetone, ethyl acetate, acetonitrile, toluene, xylene, dichloromethane, methanol, tetrahydrofuran, n-butyl acetate, 1,4-dioxane, dimethyl sulfoxide, N,N-dimethylformamide, N,N-dimethylacetamide, N-methylpyrrolidone etc.

| Reactant 1 | Reactant 2 | Product | Yield |
|---|---|---|---|
| 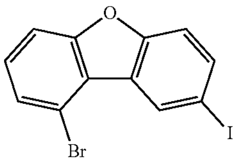 [SMILES: Brc1cccc2oc3ccc(I)cc3c12] CAS-1822311-11-4 | 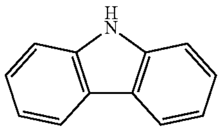 [SMILES: c1ccc2c(c1)[nH]c1ccccc12] CAS-86-74-8 | 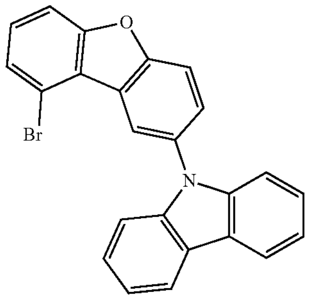 [SMILES: Brc1cccc2oc3ccc(-n4c5ccccc5c5ccccc54)cc3c12] S2d | 61% |

S1e:

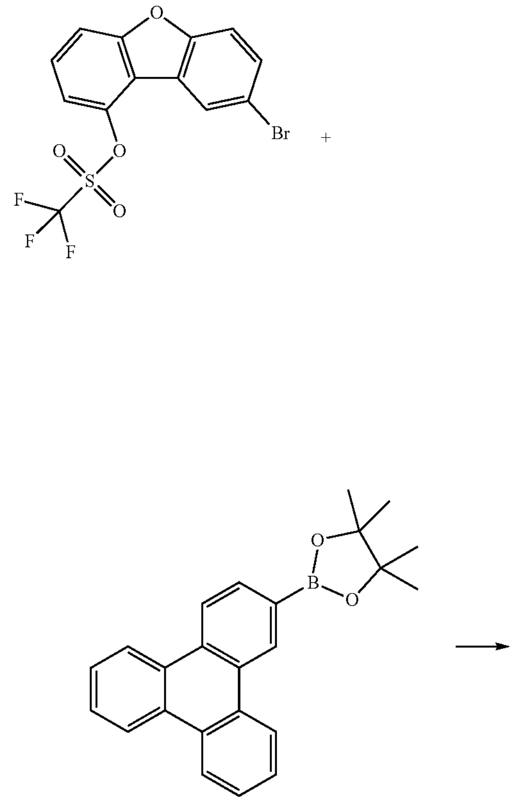

-continued

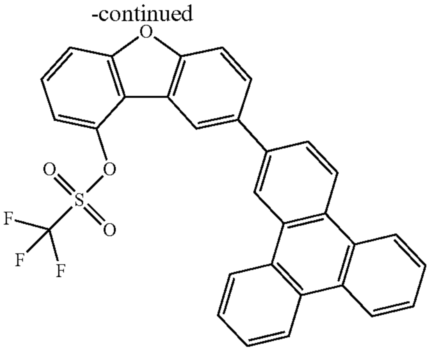

To an initial charge of 8-bromodibenzofuran-1-yl trifluoromethanesulfonate [2247123-46-0] (47.00 g, 118.9 mmol), 4,4,5,5-tetramethyl-2-(2-triphenylenyl)-1,3,2-dioxaborolane (49.72 g, 140.4 mmol) and $K_2CO_3$ (32.88 g, 237.9 mmol) in a flask are added toluene (500 ml) and water (150 ml), and the mixture is inertized with argon for 30 min. Subsequently, $Pd_2(dba)_3$ (545 mg, 0.59 mmol) and tri-ortho-tolylphosphine [6163-58-2] (724 mg, 2.38 mmol) are added and the mixture is heated under reflux for 24 h. After cooling, the precipitated solids are filtered off with suction and washed twice with ethanol. The crude product is extracted by stirring under reflux in ethanol for 2 h, and the solids are filtered off with suction after cooling. Yield: 58.8 g (108 mmol, 91%) of solids; purity 98% by $^1H$ NMR.

The following compounds can be prepared analogously: Purification can be effected using column chromatography, or recrystallization can be effected using standard solvents such as ethanol, butanol, acetone, ethyl acetate, acetonitrile, toluene, xylene, dichloromethane, methanol, tetrahydrofuran, n-butyl acetate, 1,4-dioxane, dimethyl sulfoxide, N,N-dimethylformamide, N,N-dimethylacetamide, N-methylpyrrolidone etc.

| Reactant 1 | Reactant 2 | Product | Yield |
|---|---|---|---|
| 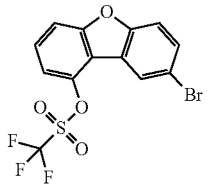 [SMILES: O=S(=O)(Oc1cccc2oc3ccc(Br)cc3c12)C(F)(F)F] CAS-2247123-46-0 | 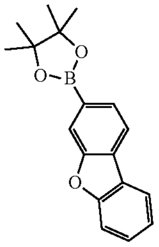 [SMILES: CC1(C)OB(c2ccc3c(c2)oc2ccccc23)OC1(C)C] CAS-1056113-50-8 | 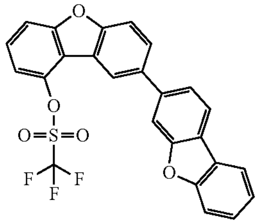 [SMILES: O=S(=O)(Oc1cccc2oc3ccc(-c4ccc5c(c4)oc4ccccc45)cc3c12)C(F)(F)F] S2e | 89% |
| 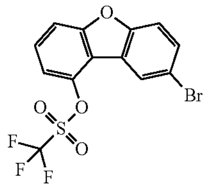 [SMILES: O=S(=O)(Oc1cccc2oc3ccc(Br)cc3c12)C(F)(F)F] CAS-2247123-46-0 | 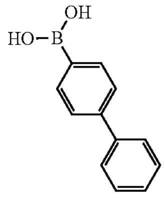 [SMILES: OB(O)c1ccc(-c2ccccc2)cc1] CAS-5122-94-1 | 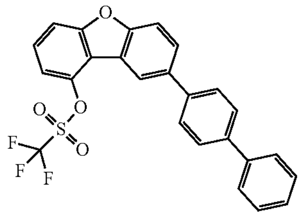 [SMILES: O=S(=O)(Oc1cccc2oc3ccc(-c4ccc(-c5ccccc5)cc4)cc3c12)C(F)(F)F] S3e | 92% |

-continued
| Reactant 1 | Reactant 2 | Product | Yield |
|---|---|---|---|
| 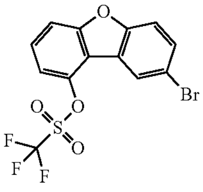 [SMILES: O=S(=O)(Oc1cccc2oc3ccc(Br)cc3c12)C(F)(F)F] CAS-2247123-46-0 | 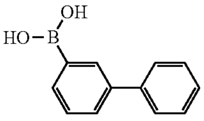 [SMILES: OB(O)c1cccc(-c2ccccc2)c1] CAS-5122-95-2 | 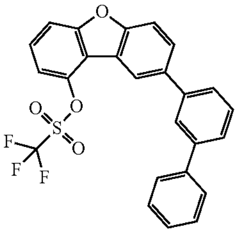 [SMILES: O=S(=O)(Oc1cccc2oc3ccc(-c4cccc(-c5ccccc5)c4)cc3c12)C(F)(F)F] S4e | 83% |
| 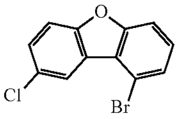 [SMILES: Clc1ccc2oc3cccc(Br)c3c2c1] CAS-2173554-83-9 | 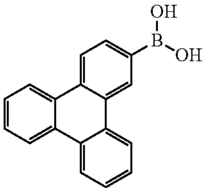 [SMILES: OB(O)c1ccc2c3ccccc3c3ccccc3c2c1] CAS-654664-63-8 | 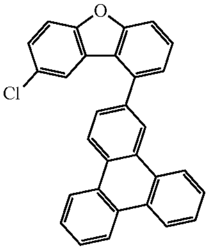 [SMILES: Clc1ccc2oc3cccc(-c4ccc5c6ccccc6c6ccccc6c5c4)c3c2c1] S5e | 67% |
| 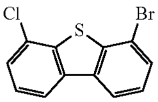 | 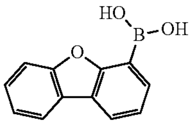 [SMILES: OB(O)c1cccc2c1oc1ccccc12] CAS-100124-06-9 | 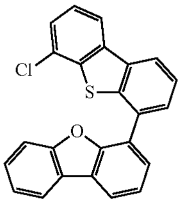 [SMILES: Clc1cccc2c1sc1c(-c3cccc4c3oc3ccccc34)cccc12] S6e | 66% |
| 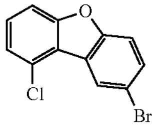 [SMILES: Clc1cccc2oc3ccc(Br)cc3c12] CAS-2225909-61-3 | 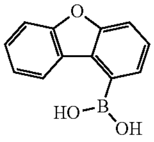 [SMILES: OB(O)c1cccc2oc3ccccc3c12] CAS-162607-19-4 | 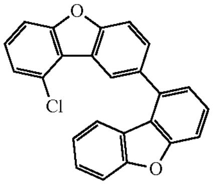 [SMILES: Clc1cccc2oc3ccc(-c4cccc5oc6ccccc6c45)cc3c12] S7e | 75% |
| 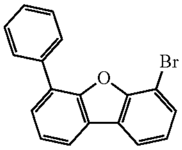 [SMILES: Brc1cccc2c1oc1c(-c3ccccc3)cccc12] CAS-1010068-84-4 | 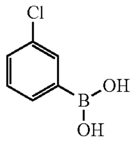 | 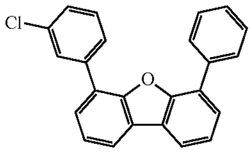 [SMILES: Clc1cccc(-c2cccc3c2oc2c(-c4ccccc4)cccc23)c1] S8e | 90% |
| 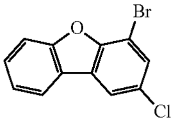 [SMILES: Clc1cc(Br)c2oc3ccccc3c2c1] CAS-2087889-86-7 | 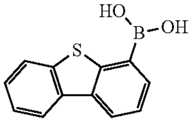 [SMILES: OB(O)c1cccc2c1sc1ccccc12] CAS-108847-20-7 | 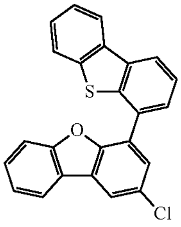 [SMILES: Clc1cc(-c2cccc3c2sc2ccccc23)c2oc3ccccc3c2c1] S9e | 70% |

-continued

| Reactant 1 | Reactant 2 | Product | Yield |
|---|---|---|---|
| 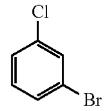 | 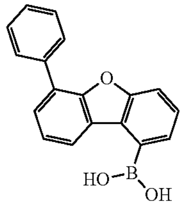 [SMILES: OB(O)c1cccc2oc3c(-c4ccccc4)cccc3c12] CAS-2395885-26-2 | 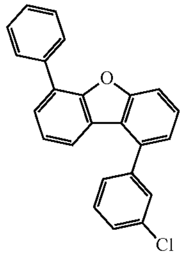 [SMILES: Clc1cccc(-c2cccc3oc4c(-c5ccccc5)cccc4c23)c1] 10e | 78% |
| 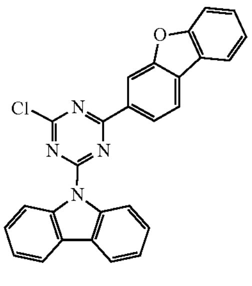 [SMILES: Clc1nc(-c2ccc3c(c2)oc2ccccc23)nc(-n2c3ccccc3c3ccccc32)n1] CAS-2260688-95-5 | 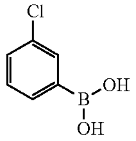 | 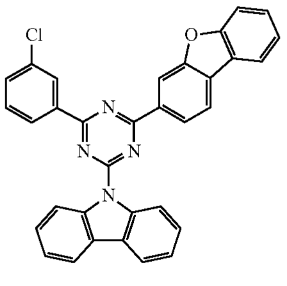 [SMILES: Clc1cccc(-c2nc(-c3ccc4c(c3)oc3ccccc34)nc(-n3c4ccccc4c4ccccc43)n2)c1] S11e | 82% |

Preparation of the Compounds

Synthesis of E1:

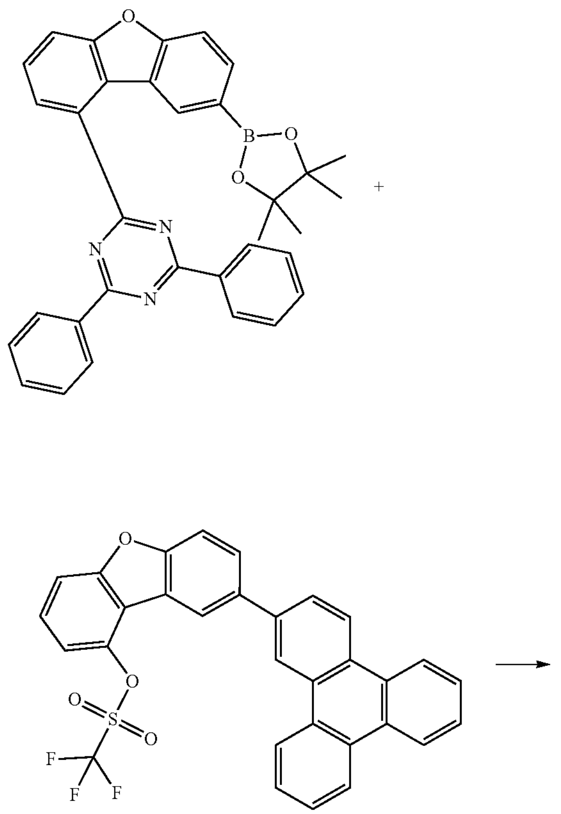

-continued

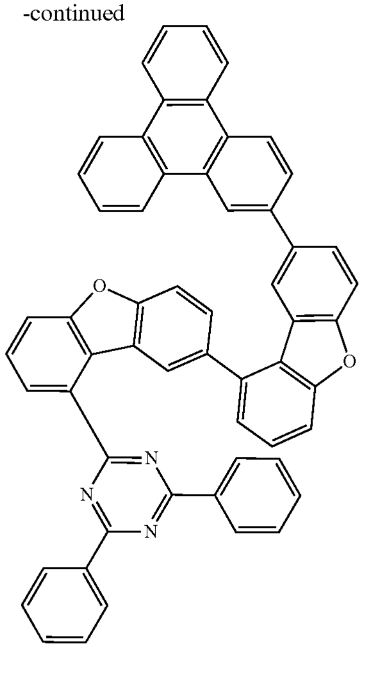

To an initial charge of 2,4-diphenyl-6-[8-(4,4,5,5-tetramethyl-1,3,2-dioxaborolan-2-yl)-1-dibenzofuranyl]-1,3,5-triazine [2138490-96-5] (15.31 g, 29.1 mmol), S1e (15.06 g, 27.8 mmol) and $K_3PO_4$ (12.17 g, 57.3 mmol) in a flask are added tetrahydrofuran (200 ml) and water (50 ml), and the mixture is inertized with argon for 30 min. Subsequently, $Pd(OAc)_2$ (124 mg, 0.55 mmol) and XPhos [564483-18-7] (556 mg, 1.11 mmol) are added and the mixture is heated under reflux for 24 h. After cooling, the precipitated solids are filtered off with suction and washed twice with water and twice with ethanol. The crude product is subjected to hot extraction with toluene/heptane (1:1) three times, then recrystallized three times from toluene and finally sublimed under high vacuum. Yield: 14.8 g (18.7 mmol, 67%); purity: >99.9% by HPLC.

The following compounds can be prepared analogously: The catalyst system used here (palladium source and ligand) may also be $Pd_2(dba)_3$ with SPhos [657408-07-6] or bis(triphenylphosphine)palladium(II) chloride [13965-03-2]. Purification can also be effected using column chromatography, or recrystallization or hot extraction using other standard solvents such as ethanol, butanol, acetone, ethyl acetate, acetonitrile, toluene, xylene, dichloromethane, methanol, tetrahydrofuran, n-butyl acetate, 1,4-dioxane, or recrystallization using high boilers such as dimethyl sulfoxide, N,N-dimethylformamide, N,N-dimethylacetamide, N-methylpyrrolidone, etc.

| Reactant 1 | Reactant 2 | Product | Yield |
|---|---|---|---|
| 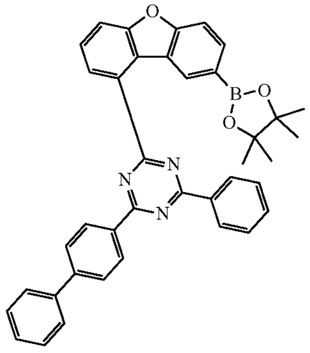 [SMILES: CC1(C)OB(c2ccc3oc4cccc(-c5nc(-c6ccccc6)nc(-c6ccc(-c7ccccc7)cc6)n5)c4c3c2)OC1(C)C] CAS-2173554-87-3 | 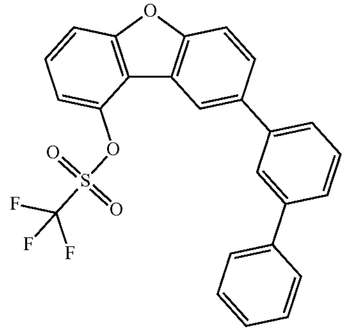 [SMILES: O=S(=O)(Oc1cccc2oc3ccc(-c4cccc(-c5ccccc5)c4)cc3c12)C(F)(F)F] S4e | 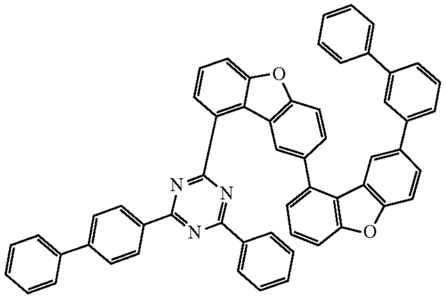 E2 | 50% |
| 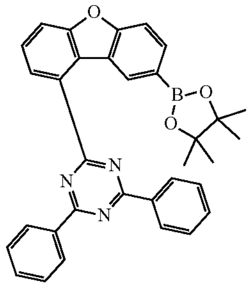 [SMILES: CC1(C)OB(c2ccc3oc4cccc(-c5nc(-c6ccccc6)nc(-c6ccccc6)n5)c4c3c2)OC1(C)C] CAS-2138490-96-5 | 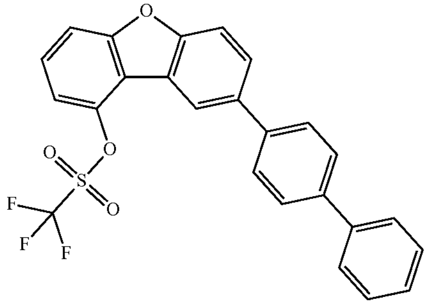 [SMILES: O=S(=O)(Oc1cccc2oc3ccc(-c4ccc(-c5ccccc5)cc4)cc3c12)C(F)(F)F] S3e | 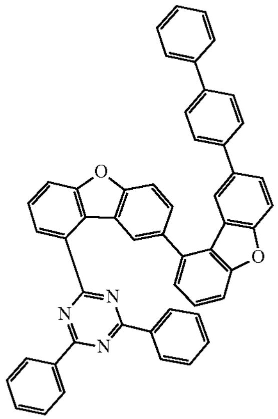 E3 | 48% |

-continued
| Reactant 1 | Reactant 2 | Product | Yield |
| --- | --- | --- | --- |
| 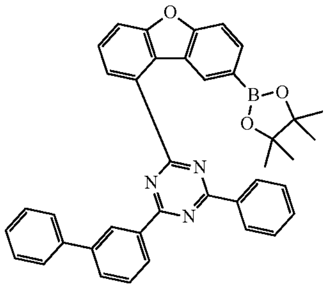 [SMILES: CC1(C)OB(c2ccc3oc4cccc(-c5nc(-c6ccccc6)nc(-c6cccc(-c7ccccc7)c6)n5)c4c3c2)OC1(C)C] CAS-2173554-91-9 | 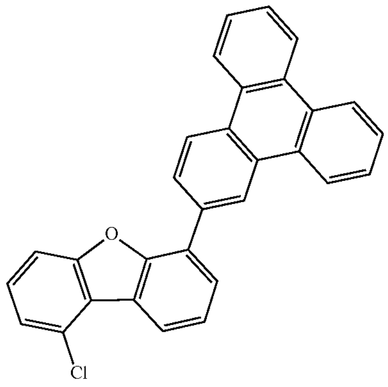 [SMILES: Clc1cccc2oc3c(-c4ccc5c6ccccc6c6ccccc6c5c4)cccc3c12] CAS-2173555-60-5 | 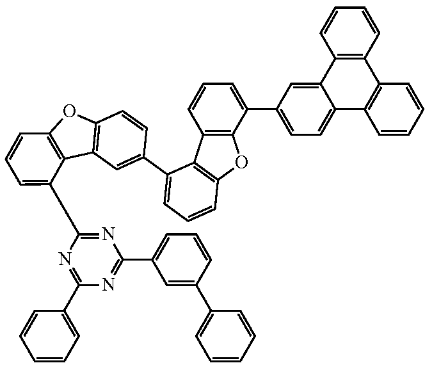 E4 | 55% |
| 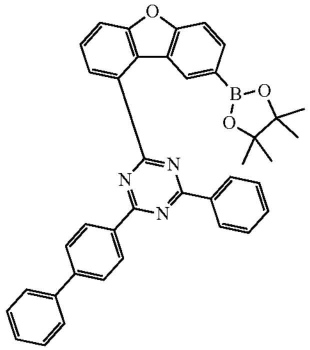 [SMILES: CC1(C)OB(c2ccc3oc4cccc(-c5nc(-c6ccccc6)nc(-c6ccc(-c7ccccc7)cc6)n5)c4c3c2)OC1(C)C] CAS-2173554-87-3 | 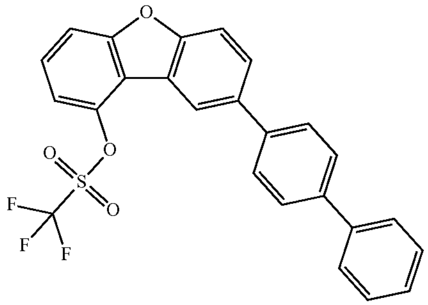 [SMILES: O=S(=O)(Oc1cccc2oc3ccc(-c4ccc(-c5ccccc5)cc4)cc3c12)C(F)(F)F] S3e | 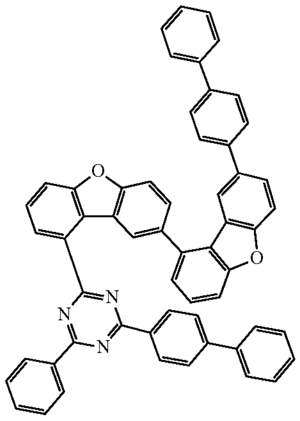 E5 | 47% |

-continued
| Reactant 1 | Reactant 2 | Product | Yield |
|---|---|---|---|
| 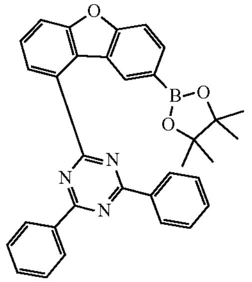 [SMILES: CC1(C)OB(c2ccc3oc4cccc(-c5nc(-c6ccccc6)nc(-c6ccccc6)n5)c4c3c2)OC1(C)C] CAS-2138490-96-5 | 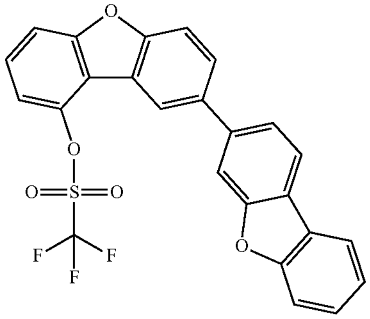 [SMILES: O=S(=O)(Oc1cccc2oc3ccc(-c4ccc5c(c4)oc4ccccc45)cc3c12)C(F)(F)F] S2e | 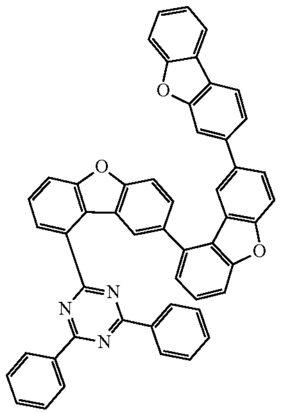 E6 | 57% |
| 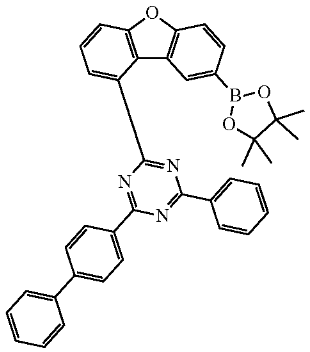 [SMILES: CC1(C)OB(c2ccc3oc4cccc(-c5nc(-c6ccccc6)nc(-c6ccc(-c7ccccc7)cc6)n5)c4c3c2)OC1(C)C] CAS-2173554-87-3 | 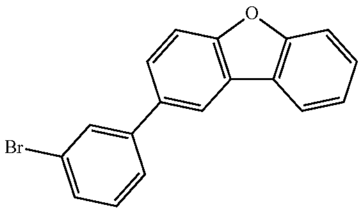 [SMILES: Brc1cccc(-c2ccc3oc4ccccc4c3c2)c1] CAS-1084334-27-9 | 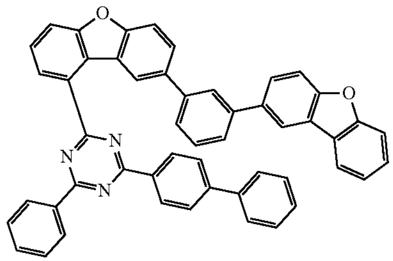 E7 | 50% |

-continued
| Reactant 1 | Reactant 2 | Product | Yield |
| --- | --- | --- | --- |
| 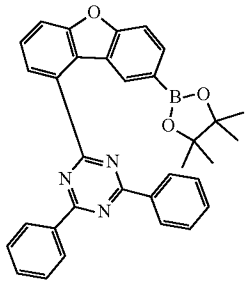 [SMILES: CC1(C)OB(c2ccc3oc4cccc(-c5nc(-c6ccccc6)nc(-c6ccccc6)n5)c4c3c2)OC1(C)C] CAS-2138490-96- | 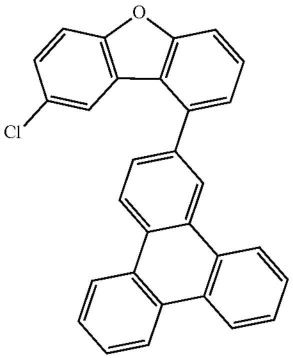 [SMILES: Clc1ccc2oc3cccc(-c4ccc5c6ccccc6c6ccccc6c5c4)c3c2c1] S5e | 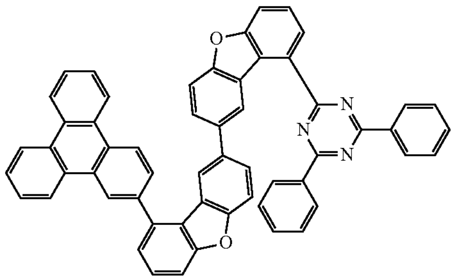 [SMILES: c1ccc(-c2nc(-c3ccccc3)nc(-c3cccc4oc5ccc(-c6ccc7oc8cccc(-c9ccc%10c%11ccccc%11c%11ccccc%11c%10c9)c8c7c6)cc5c34)n2)cc1] | 43% |
| 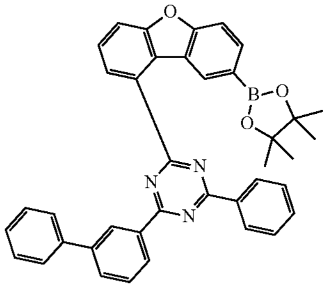 [SMILES: CC1(C)OB(c2ccc3oc4cccc(-c5nc(-c6ccccc6)nc(-c6cccc(-c7ccccc7)c6)n5)c4c3c2)OC1(C)C] CAS-2173554-91-9 | 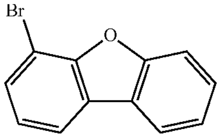 [SMILES: Brc1cccc2c1oc1ccccc12] CAS-89827-45-2 | 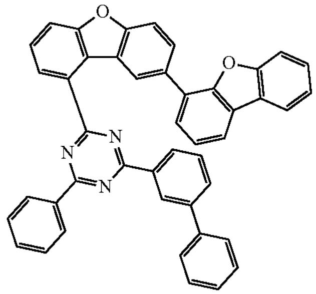 [SMILES: c1ccc(-c2cccc(-c3nc(-c4ccccc4)nc(-c4cccc5oc6ccc(-c7cccc8c7oc7ccccc78)cc6c45)n3)c2)cc1] E9 | 54% |

-continued
| Reactant 1 | Reactant 2 | Product | Yield |
|---|---|---|---|
| 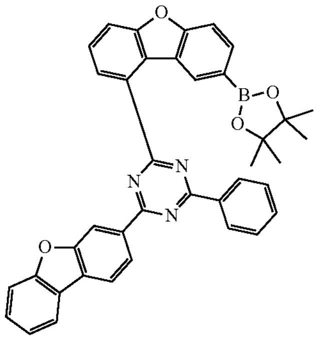 [SMILES: CC1(C)OB(c2ccc3oc4cccc(-c5nc(-c6ccccc6)nc(-c6ccc7c(c6)oc6ccccc67)n5)c4c3c2)OC1(C)C] S1b | 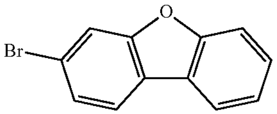 [SMILES: Brc1ccc2c(c1)oc1ccccc12] CAS-26608-06-0 | 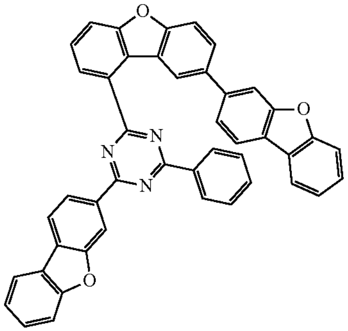 E10 | 45% |
| 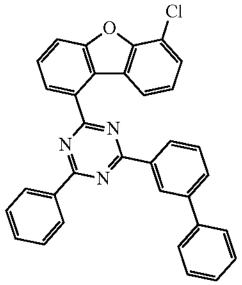 [SMILES: Clc1cccc2c1oc1cccc(-c3nc(-c4ccccc4)nc(-c4cccc(-c5ccccc5)c4)n3)c12] CAS-2268673-85-2 | 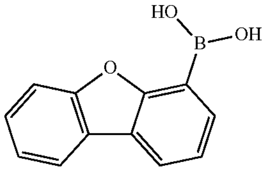 [SMILES: OB(O)c1cccc2c1oc1ccccc12] CAS-100124-06-9 | 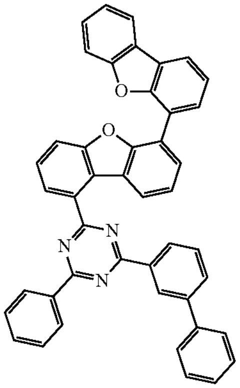 E11 | 48% |

-continued
| Reactant 1 | Reactant 2 | Product | Yield |
|---|---|---|---|
| 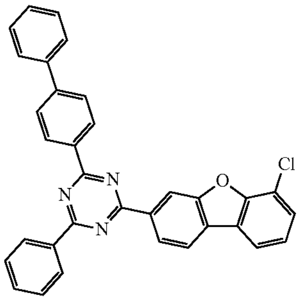 [SMILES: Clc1cccc2c1oc1cc(-c3nc(-c4ccccc4)nc(-c4ccc(-c5ccccc5)cc4)n3)ccc12] | 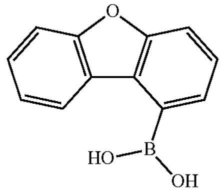 [SMILES: OB(O)c1cccc2oc3ccccc3c12] CAS-162607-19-4 | 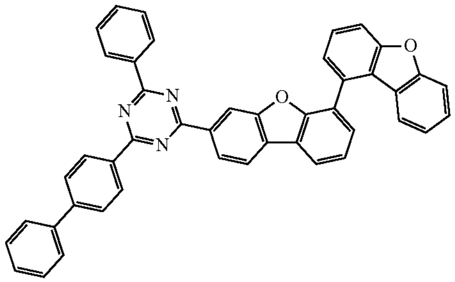 E12 | 41% |
| 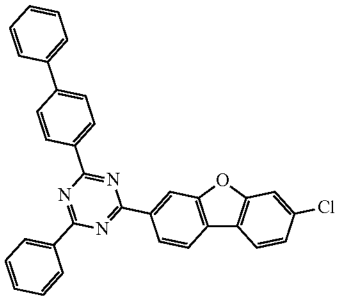 [SMILES: Clc1ccc2c(c1)oc1cc(-c3nc(-c4ccccc4)nc(-c4ccc(-c5ccccc5)cc4)n3)ccc12] CAS-2255372-57-5 | 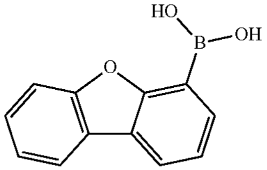 [SMILES: OB(O)c1cccc2c1oc1ccccc12] CAS-100124-06-9 | 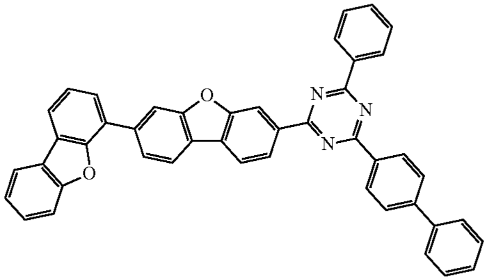 E13 | 56% |

-continued
| Reactant 1 | Reactant 2 | Product | Yield |
|---|---|---|---|
| 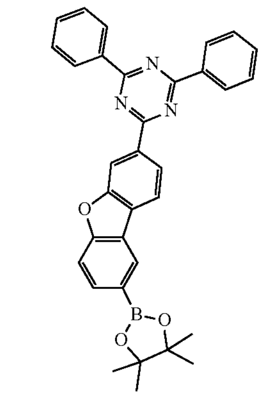 [SMILES: CC1(C)OB(c2ccc3oc4cc(-c5nc(-c6ccccc6)nc(-c6ccccc6)n5)ccc4c3c2)OC1(C)C] CAS-2226916-85-2 | 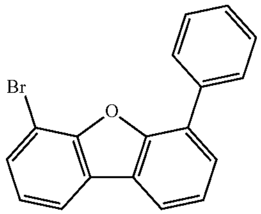 [SMILES: Brc1cccc2c1oc1c(-c3ccccc3)cccc12] CAS-1010068-84-4 | 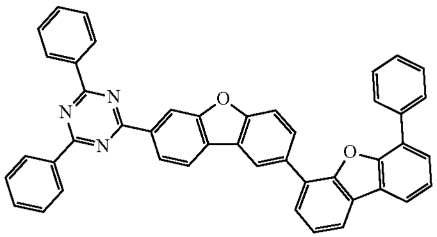 E14 | 50% |
| 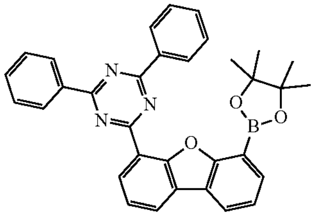 [SMILES: CC1(C)OB(c2cccc3c2oc2c(-c4nc(-c5ccccc5)nc(-c5ccccc5)n4)cccc23)OC1(C)C] S5b | 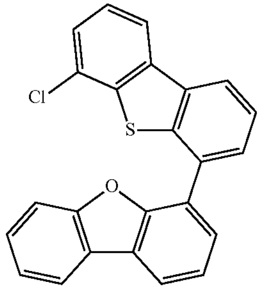 [SMILES: Clc1cccc2c1sc1c(-c3cccc4c3oc3ccccc34)cccc12] S6e | 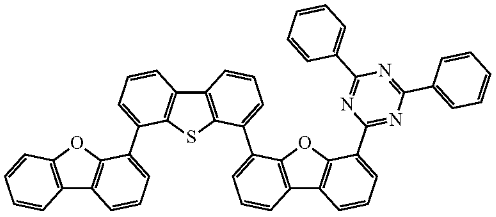 E15 | 46% |

-continued
| Reactant 1 | Reactant 2 | Product | Yield |
| --- | --- | --- | --- |
| 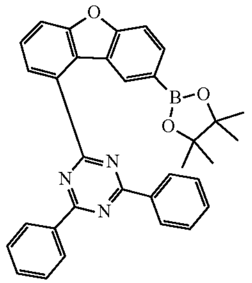 [SMILES: CC1(C)OB(c2ccc3oc4cccc(-c5nc(-c6ccccc6)nc(-c6ccccc6)n5)c4c3c2)OC1(C)C]<br>CAS-2138490-96-5 | 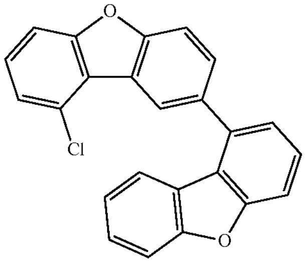 [SMILES: Clc1cccc2oc3ccc(-c4cccc5oc6ccccc6c45)cc3c12]<br>S7e | 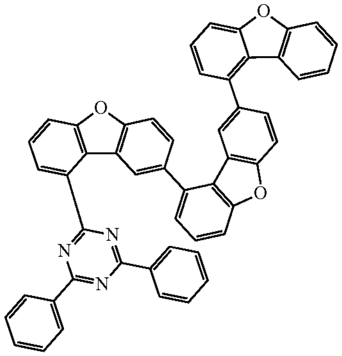 [SMILES: c1ccc(-c2nc(-c3ccccc3)nc(-c3cccc4oc5ccc(-c6cccc7oc8ccc(-c9cccc%10oc%11ccccc%11c9%10)cc8c67)cc5c34)n2)cc1]<br>E16 | 42% |
| 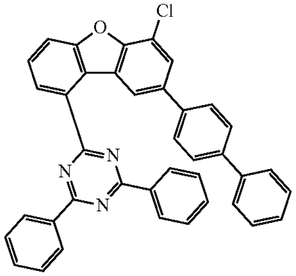 [SMILES: Clc1cc(-c2ccc(-c3ccccc3)cc2)cc2c1oc1cccc(-c3nc(-c4ccccc4)nc(-c4ccccc4)n3)c12]<br>CAS-2390017-23-7 | 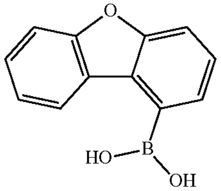 [SMILES: OB(O)c1cccc2oc3ccccc3c12]<br>CAS-162607-19-4 | 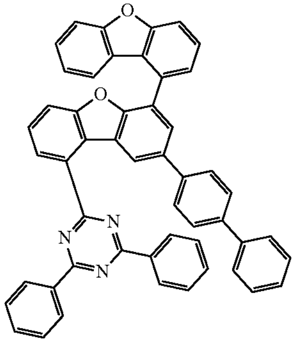 [SMILES: c1ccc(-c2ccc(-c3cc(-c4cccc5oc6ccccc6c45)c4oc5cccc(-c6nc(-c7ccccc7)nc(-c7ccccc7)n6)c5c4c3)cc2)cc1]<br>E17 | 48% |

-continued
| Reactant 1 | Reactant 2 | Product | Yield |
|---|---|---|---|
| 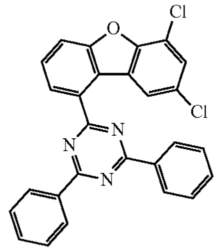 [SMILES: Clc1cc(Cl)c2oc3cccc(-c4nc(-c5ccccc5)nc(-c5ccccc5)n4)c3c2c1] CAS2265924-71-6 | 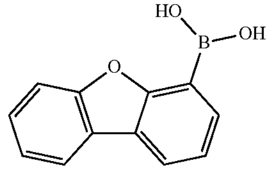 [SMILES: OB(O)c1cccc2c1oc1ccccc12] CAS-100124-06-9 | 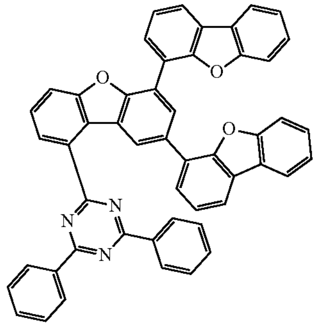 E18 | 39% |
| 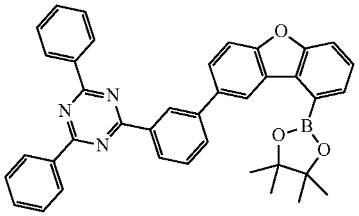 [SMILES: CC1(C)OB(c2cccc3oc4ccc(-c5cccc(-c6nc(-c7ccccc7)nc(-c7ccccc7)n6)c5)cc4c23)OC1(C)C] CAS-2226943-88-8 | 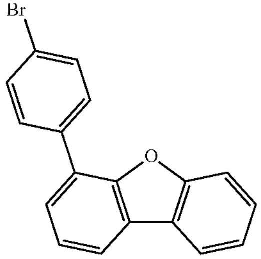 [SMILES: Brc1ccc(-c2cccc3c2oc2ccccc23)cc1] CAS-955959-84-9 | 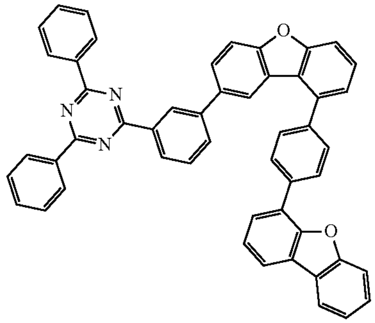 E19 | 59% |

-continued
| Reactant 1 | Reactant 2 | Product | Yield |
| --- | --- | --- | --- |
| 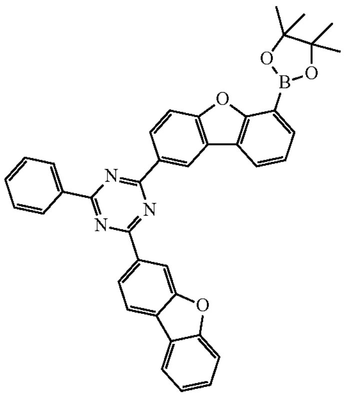 [SMILES: CC1(C)OB(c2cccc3c2oc2ccc(-c4nc(-c5ccccc5)nc(-c5ccc6c(c5)oc5ccccc56)n4)cc23)OC1(C)C] S7b | 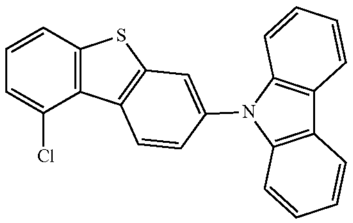 [SMILES: Clc1cccc2sc3cc(-n4c5ccccc5c5ccccc54)ccc3c12] CAS-1622440-74-7 | 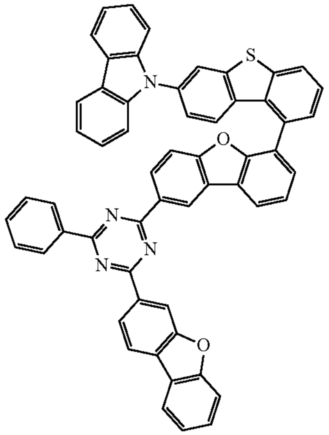 E22 | 48% |
| 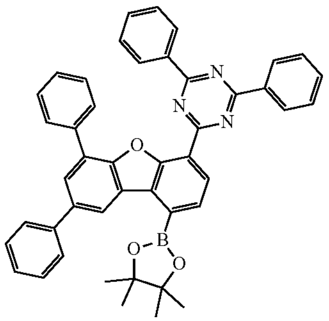 [SMILES: CC1(C)OB(c2ccc(-c3nc(-c4ccccc4)nc(-c4ccccc4)n3)c3oc4c(-c5ccccc5)cc(-c5ccccc5)cc4c23)OC1(C)C] S10b | 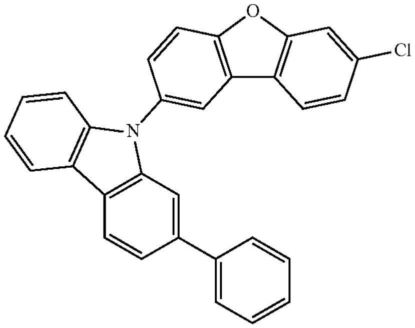 [SMILES: Clc1ccc2c(c1)oc1ccc(-n3c4ccccc4c4ccc(-c5ccccc5)cc43)cc12] 1c | 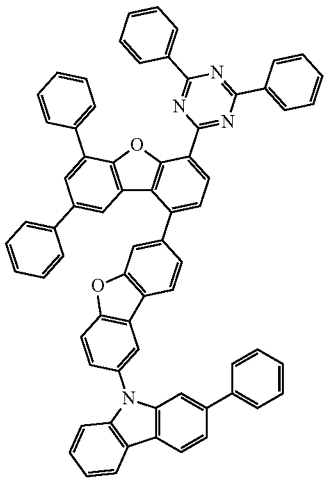 E23 | 54% |

-continued
| Reactant 1 | Reactant 2 | Product | Yield |
| --- | --- | --- | --- |
| 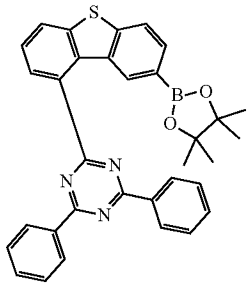 [SMILES: CC1(C)OB(c2ccc3sc4cccc(-c5nc(-c6ccccc6)nc(-c6ccccc6)n5)c4c3c2)OC1(C)C] CAS-2140928-40-9 | 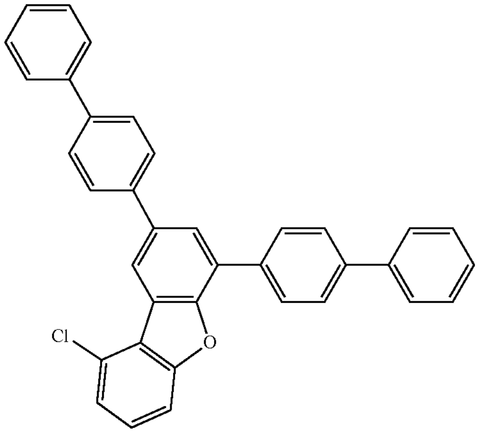 [SMILES: Clc1cccc2oc3c(-c4ccc(-c5ccccc5)cc4)cc(-c4ccc(-c5ccccc5)cc4)cc3c12] CAS-2299272-10-7 | 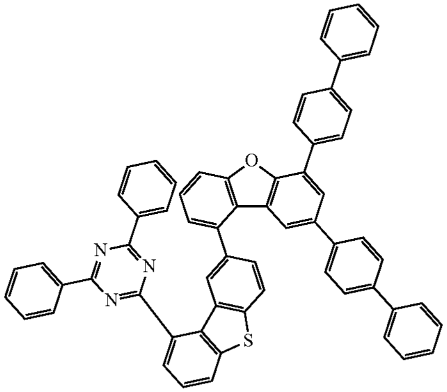 E24 | 45% |
| 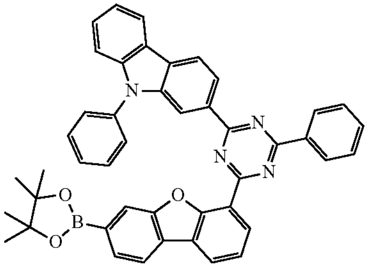 [SMILES: CC1(C)OB(c2ccc3c(c2)oc2c(-c4nc(-c5ccccc5)nc(-c5ccc6c7ccccc7n(-c7ccccc7)c6c5)n4)cccc23)OC1(C)C] CAS-2361279-87-8 | 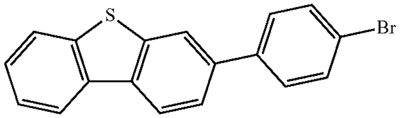 [SMILES: Brc1ccc(-c2ccc3c(c2)sc2ccccc23)cc1] CAS-1557258-01-1 | 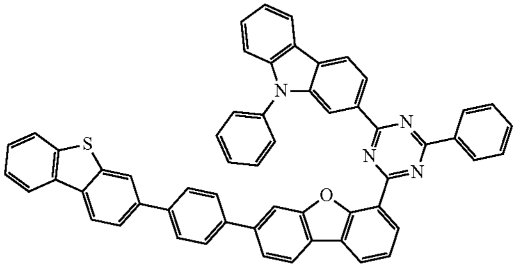 E27 | 57% |

-continued
| Reactant 1 | Reactant 2 | Product | Yield |
|---|---|---|---|
| 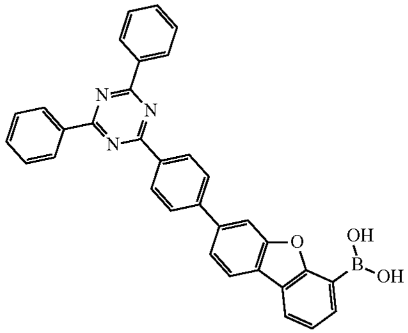 [SMILES: OB(O)c1cccc2c1oc1cc(-c3ccc(-c4nc(-c5ccccc5)nc(-c5ccccc5)n4)cc3)ccc12] CAS-1651203-50-7 | 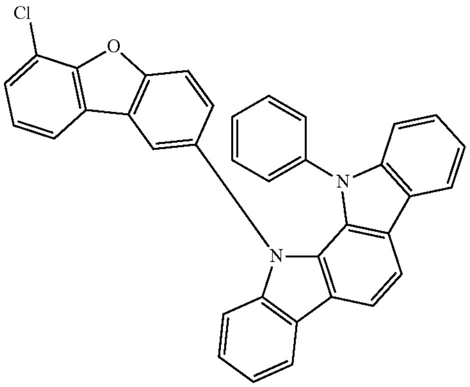 [SMILES: Clc1cccc2c1oc1ccc(-n3c4ccccc4c4ccc5c6ccccc6n(-c6ccccc6)c5c43)cc12] 2c | 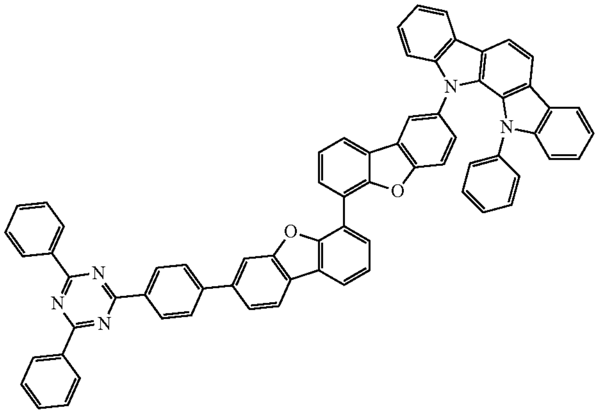 E33 | 34% |
| 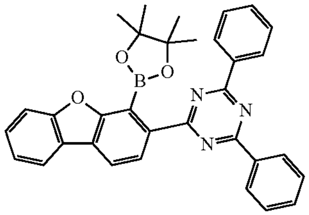 [SMILES: CC1(C)OB(c2c(-c3nc(-c4ccccc4)nc(-c4ccccc4)n3)ccc3c2oc2ccccc23)OC1(C)C] 9b | 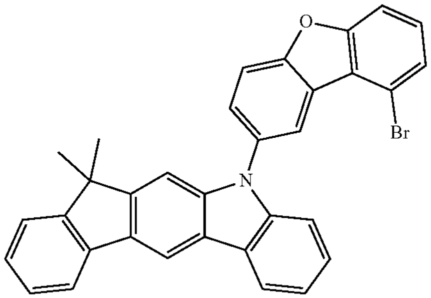 [SMILES: CC1(C)c2ccccc2-c2cc3c4ccccc4n(-c4ccc5oc6cccc(Br)c6c5c4)c3cc21] CAS-2226483-41-4 | 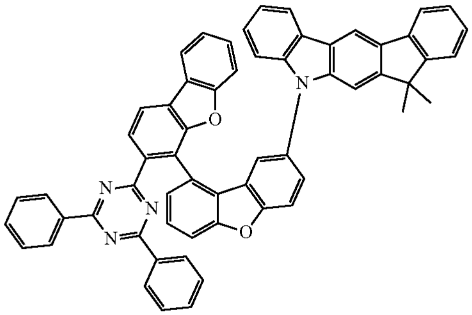 E34 | 24% |

-continued
| Reactant 1 | Reactant 2 | Product | Yield |
| --- | --- | --- | --- |
| 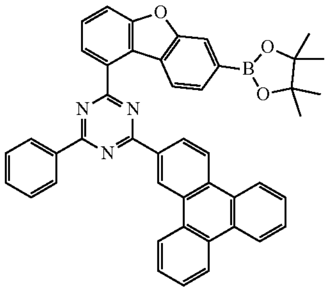 [SMILES: CC1(C)OB(c2ccc3c(c2)oc2cccc(-c4nc(-c5ccccc5)nc(-c5ccc6c7ccccc7c7ccccc7c6c5)n4)c23)OC1(C)C] CAS-2268673-97-6 | 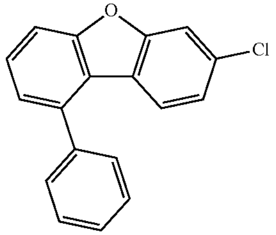 [SMILES: Clc1ccc2c(c1)oc1cccc(-c3ccccc3)c12] CAS-2360830-97-1 | 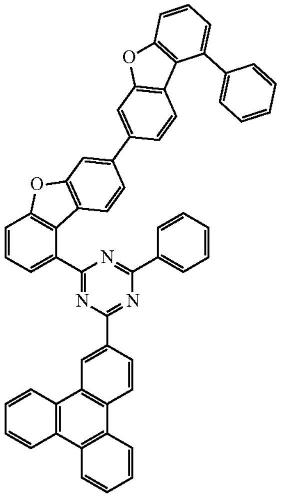 E35 | 47% |
| 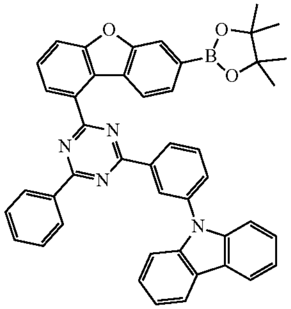 [SMILES: CC1(C)OB(c2ccc3c(c2)oc2cccc(-c4nc(-c5ccccc5)nc(-c5cccc(-n6c7ccccc7c7ccccc76)c5)n4)c23)OC1(C)C] CAS-2268674-01-5 | 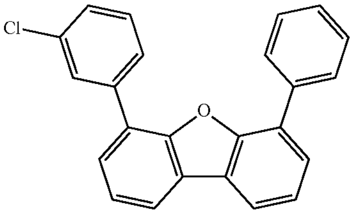 [SMILES: Clc1cccc(-c2cccc3c2oc2c(-c4ccccc4)cccc23)c1] S8e | 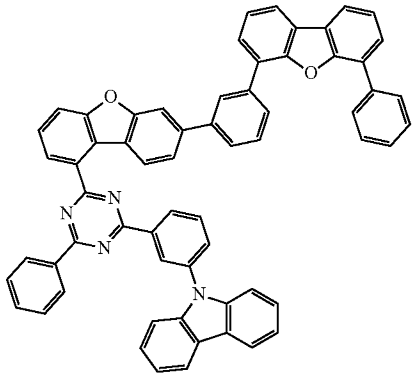 E36 | 61% |

-continued
| Reactant 1 | Reactant 2 | Product | Yield |
|---|---|---|---|
| 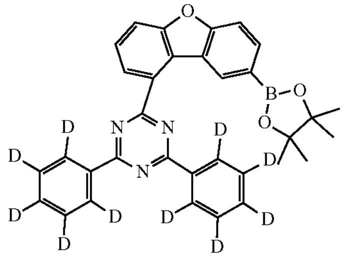 [SMILES: [2H]c1c([2H])c([2H])c(-c2nc(-c3c([2H])c([2H])c([2H])c([2H])c3[2H])nc(-c3cccc4oc5ccc(B6OC(C)(C)C(C)(C)O6)cc5c34)n2)c([2H])c1[2H]] S3b | 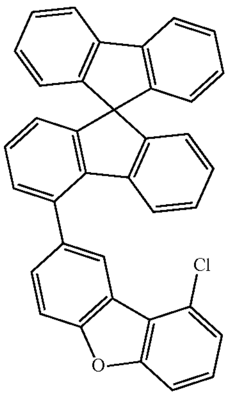 [SMILES: Clc1cccc2oc3ccc(-c4cccc5c4-c4ccccc4C54c5ccccc5-c5ccccc54)cc3c12] CAS-2055863-76-6 | 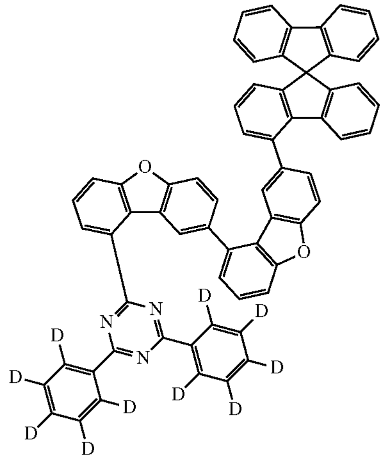 E38 | 62% |
| 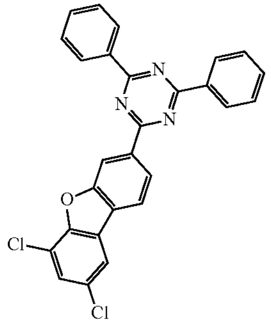 [SMILES: Clc1cc(Cl)c2oc3cc(-c4nc(-c5ccccc5)nc(-c5ccccc5)n4)ccc3c2c1] CAS-2226020-22-8 | 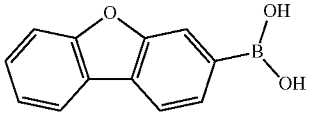 [SMILES: OB(O)c1ccc2c(c1)oc1ccccc12] CAS-395087-89-5 | 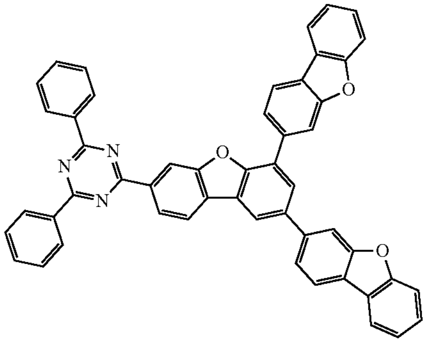 E40 | 33% |

-continued
| Reactant 1 | Reactant 2 | Product | Yield |
| --- | --- | --- | --- |
| 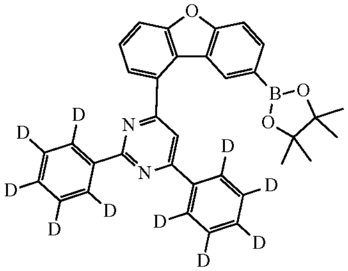 [SMILES: [2H]c1c([2H])c([2H])c(-c2cc(-c3cccc4oc5ccc(B6OC(C)(C)C(C)(C)O6)cc5c34)nc(-c3c([2H])c([2H])c([2H])c([2H])c3[2H])n2)c([2H])c1[2H]] S4b | 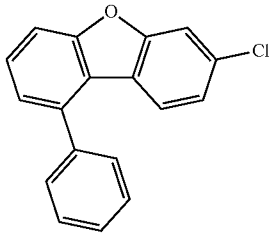 [SMILES: Clc1ccc2c(c1)oc1cccc(-c3ccccc3)c12] CAS-2360830-97-1 | 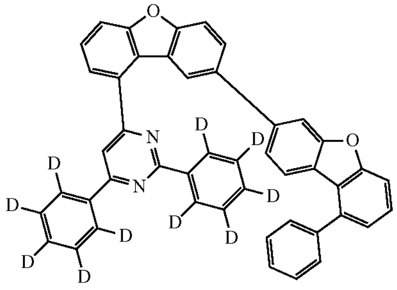 E41 | 58% |
| 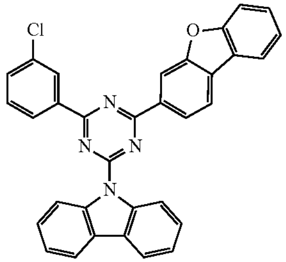 [SMILES: Clc1cccc(-c2nc(-c3ccc4c(c3)oc3ccccc34)nc(-n3c4ccccc4c4ccccc43)n2)c1] S11e | 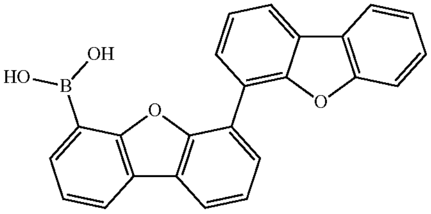 [SMILES: OB(O)c1cccc2c1oc1c(-c3cccc4c3oc3ccccc34)cccc12] CAS-2249768-42-9 | 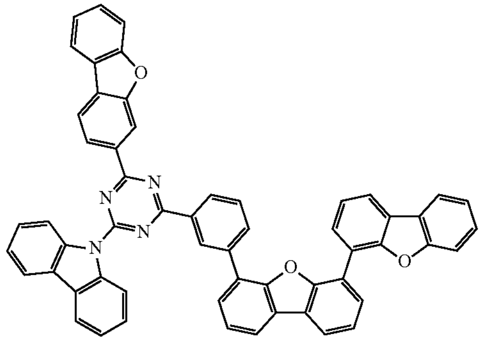 E42 | 55% |

E20:

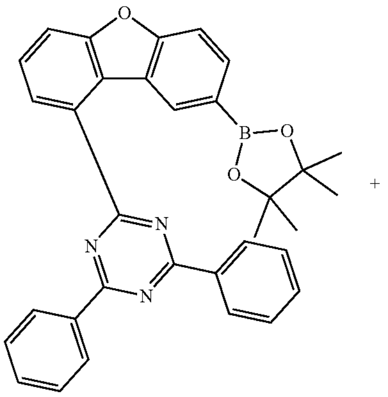

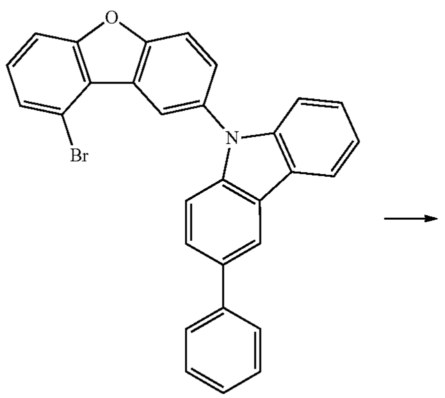

-continued

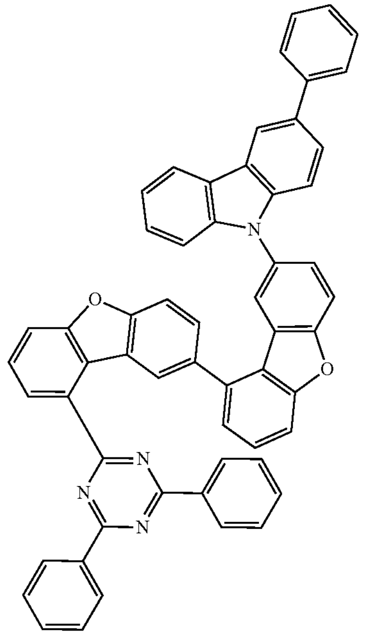

To an initial charge of 2,4-diphenyl-6-[8-(4,4,5,5-tetramethyl-1,3,2-dioxaborolan-2-yl)-1-dibenzofuranyl]-1,3,5-triazine [2138490-96-5] (15.31 g, 29.1 mmol), S1d (14.41 g, 29.5 mmol) and $Na_2CO_3$ (6.17 g, 58.2 mmol) in a flask are added toluene (300 ml) and water (100 ml), and the mixture is inertized with argon for 30 min. Subsequently, tetrakis (triphenylphosphine)palladium(0) [14221-01-3] (1.00 g, 0.87 mmol) is added and the mixture is heated under reflux for 36 h. After cooling, the reaction mixture is worked up by extraction with toluene and water, the combined organic phases are dried over $Na_2SO_4$, and the filtrate is concentrated to dryness by rotary evaporation. The residue is suspended in 350 ml of hot EtOH and stirred under reflux for 1 h, and the solids are filtered off with suction after cooling. The crude product is subjected to hot extraction with toluene/heptane (1:1) twice, then recrystallized three times from n-butyl acetate and finally sublimed under high vacuum. Yield: 14.8 g (18.7 mmol, 67%); purity: >99.9% by HPLC.

The following compounds can be prepared analogously: The catalyst system used here, rather than tetrakis(triphenylphosphine)palladium(0), may also be $Pd_2(dba)_3$ with SPhos [657408-07-6] (palladium source and ligand) or bis (triphenylphosphine)palladium(II) chloride [13965-03-2]. Purification can also be effected using column chromatography, or recrystallization or hot extraction using other standard solvents such as ethanol, butanol, acetone, ethyl acetate, acetonitrile, toluene, xylene, dichloromethane, methanol, tetrahydrofuran, n-butyl acetate, 1,4-dioxane, or recrystallization using high boilers such as dimethyl sulfoxide, N,N-dimethylformamide, N,N-dimethylacetamide, N-methylpyrrolidone, etc.

| Reactant 1 | Reactant 2 | Product | Yield |
|---|---|---|---|
| 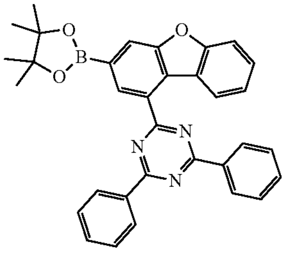 [SMILES: CC1(C)OB(c2cc(-c3nc(-c4ccccc4)nc(-c4ccccc4)n3)c3c(c2)oc2ccccc23)OC1(C)C] S8b | 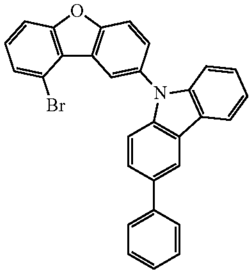 [SMILES: Brc1cccc2oc3ccc(-n4c5ccccc5c5cc(-c6ccccc6)ccc54)cc3c12] S1d | 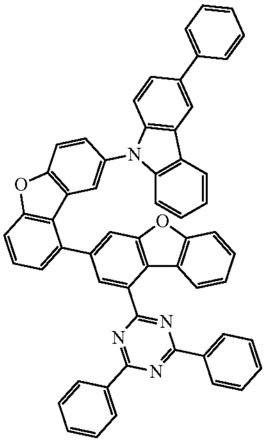 E21 | 51% |
| 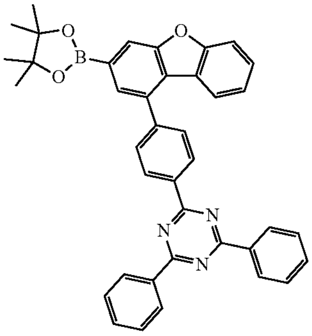 [SMILES: CC1(C)OB(c2cc(-c3ccc(-c4nc(-c5ccccc5)nc(-c5ccccc5)n4)cc3)c3c(c2)oc2ccccc23)OC1(C)C] CAS-2247264-76-0 | 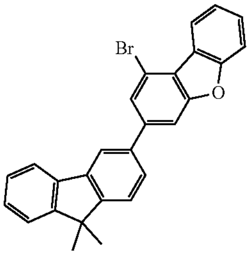 [SMILES: CC1(C)c2ccccc2-c2cc(-c3cc(Br)c4c(c3)oc3ccccc34)ccc21] CAS-1821235-72-6 | 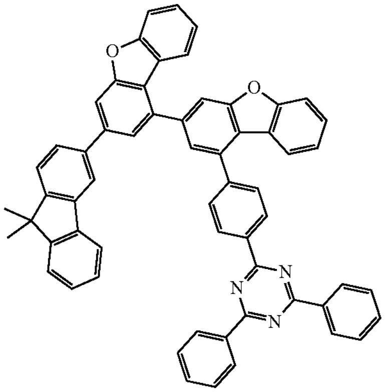 E26 | 40% |
| 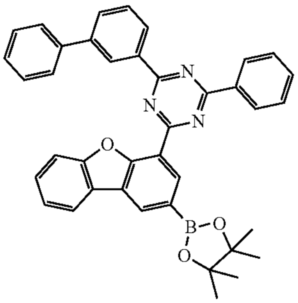 [SMILES: CC1(C)OB(c2cc(-c3nc(-c4ccccc4)nc(-c4cccc(-c5ccccc5)c4)n3)c3oc4ccccc4c3c2)OC1(C)C] CAS-2375066-17-2 | 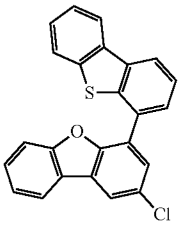 [SMILES: Clc1cc(-c2cccc3c2sc2ccccc23)c2oc3ccccc3c2c1] S9e | 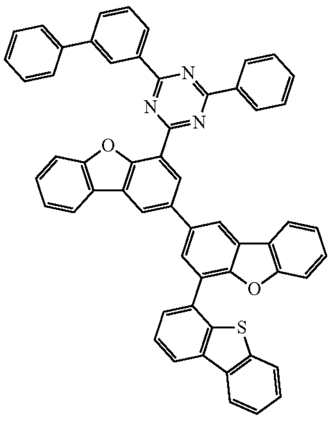 E28 | 54% |

-continued
| Reactant 1 | Reactant 2 | Product | Yield |
| --- | --- | --- | --- |
| 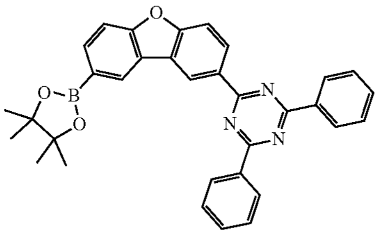 [SMILES: CC1(C)OB(c2ccc3oc4ccc(-c5nc(-c6ccccc6)nc(-c6ccccc6)n5)cc4c3c2)OC1(C)C] CAS-2138490-98-7 | 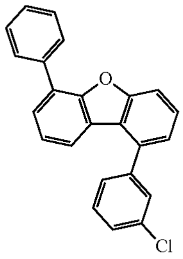 [SMILES: Clc1cccc(-c2cccc3oc4c(-c5ccccc5)cccc4c23)c1] 10e | 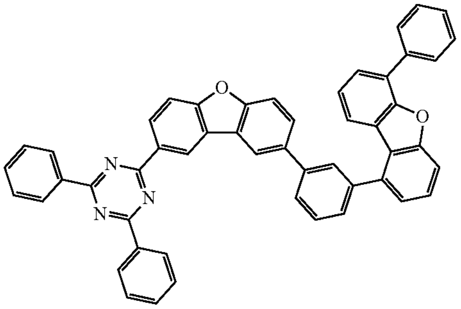 E29 | 46% |
| 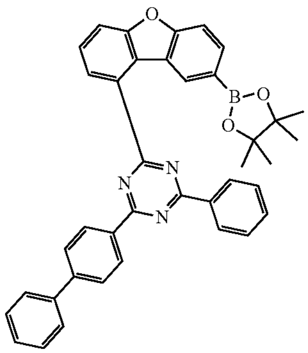 [SMILES: CC1(C)OB(c2ccc3oc4cccc(-c5nc(-c6ccccc6)nc(-c6ccc(-c7ccccc7)cc6)n5)c4c3c2)OC1(C)C] CAS-2173554-87-3 | 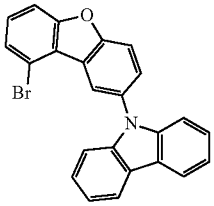 [SMILES: Brc1cccc2oc3ccc(-n4c5ccccc5c5ccccc54)cc3c12] S2d | 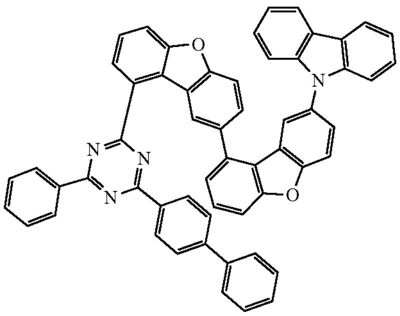 E31 | 40% |
| 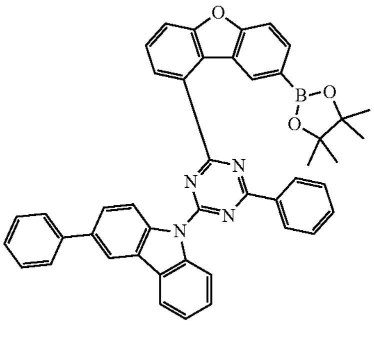 [SMILES: CC1(C)OB(c2ccc3oc4cccc(-c5nc(-c6ccccc6)nc(-n6c7ccccc7c7cc(-c8ccccc8)ccc76)n5)c4c3c2)OC1(C)C] S2b | 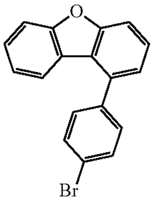 [SMILES: Brc1ccc(-c2cccc3oc4ccccc4c23)cc1] CAS-1786416-89-4 | 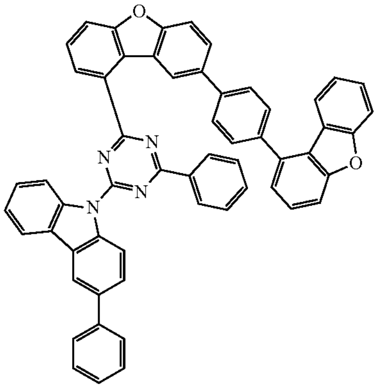 E37 | 60% |

-continued

| Reactant 1 | Reactant 2 | Product | Yield |
|---|---|---|---|
| 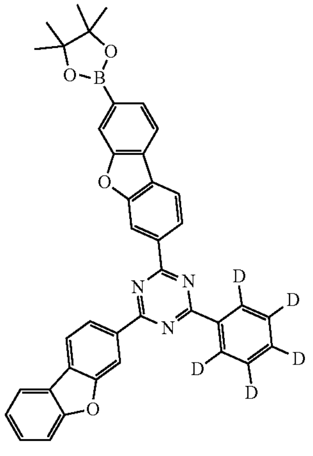 [SMILES: [2H]c1c([2H])c([2H])c(-c2nc(-c3ccc4c(c3)oc3ccccc34)nc(-c3ccc4c(c3)oc3cc(B5OC(C)(C)C(C)(C)O5)ccc34)n2)c([2H])c1[2H]] S11b | 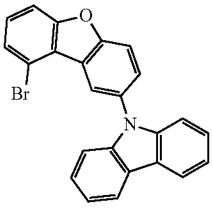 [SMILES: Brc1cccc2oc3ccc(-n4c5ccccc5c5ccccc54)cc3c12] S2d | 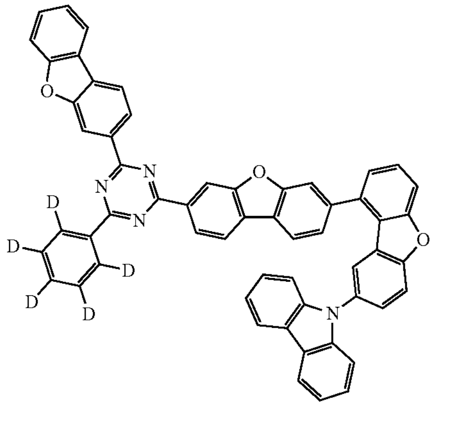 E39 | 38% |

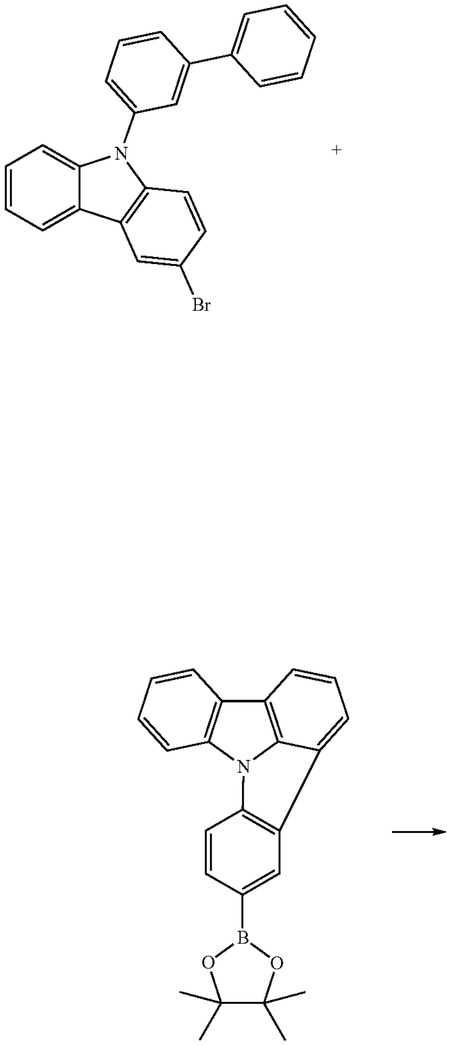

-continued

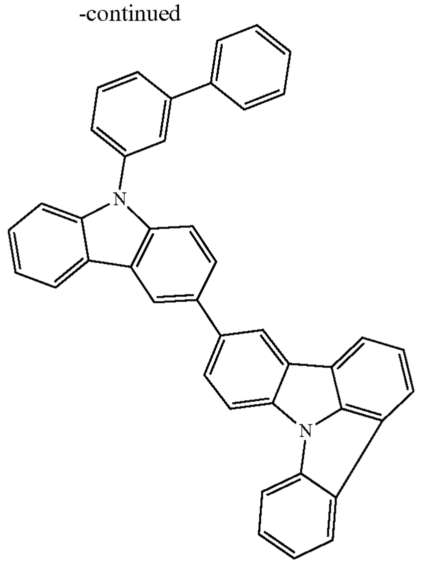

To an initial charge of 9-[1,1'-biphenyl]-3-yl-3-bromo-9H-carbazole (59.88 g, 150.3 mmol) [CAS-1428551-28-3], 5-(4,4,5,5-tetramethyl-1,3,2-dioxaborolan-2-yl)indolo[3,2,1-jk]carbazole (51.1 g, 147.3 mmol) [CAS-1454807-26-1] in toluene (1200 ml), 1,4-dioxane (1200 ml) and water (600 ml) under inert atmosphere are added $K_3PO_4$ (95.7 g, 451 mmol), tri(ortho-tolyl)phosphine (2.33 g, 7.52 mmol) and $Pd(OAc)_2$ (840 mg, 3.76 mmol), and the mixture is stirred under reflux for 32 h. After cooling, the mixture is worked up by extraction with toluene/water, the aqueous phase is extracted 3 times with toluene (500 ml each time), and the combined organic phases are dried over $Na_2SO_4$. The crude product is first extracted by stirring in EtOH (1500 ml). The solids filtered off with suction are subjected to extraction with hot heptane/toluene twice, recrystallized from DMAc twice and finally sublimed under high vacuum.

Yield: 40.5 g (72.5 mmol, 48%); purity: >99.9% by HPLC.

The following compounds can be prepared analogously: The catalyst system used here (palladium source and ligand)

may also be $Pd_2(dba)_3$ with SPhos [657408-07-6], or tetrakis (triphenylphosphine)palladium(0) or bis(triphenylphosphine)palladium(II) chloride [13965-03-2]. Purification can also be accomplished using column chromatography, or recrystallization or hot extraction using other standard solvents such as ethanol, butanol, acetone, ethyl acetate, acetonitrile, toluene, xylene, dichloromethane, methanol, tetrahydrofuran, n-butyl acetate, 1,4-dioxane, or recrystallization using high boilers such as dimethyl sulfoxide, N,N-dimethylformamide, N,N-dimethylacetamide, N-methylpyrrolidone, etc.

| Reactant 1 | Reactant 2 | Product | Yield |
|---|---|---|---|
| 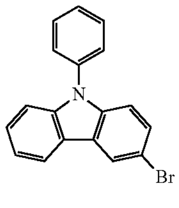 [SMILES: Brc1ccc2c(c1)c1ccccc1n2-c1ccccc1] CAS-1153-85-1 | 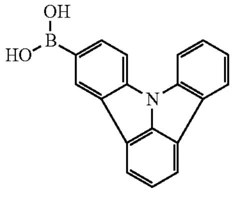 [SMILES: OB(O)c1ccc2c(c1)c1cccc3c4ccccc4n2c31] CAS-1174032-92-8 | 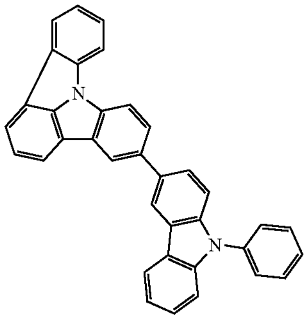 H1 | 47% |
| 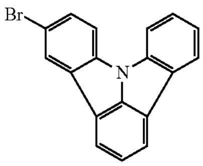 [SMILES: Brc1ccc2c(c1)c1cccc3c4ccccc4n2c31] CAS-109589-98-2 | 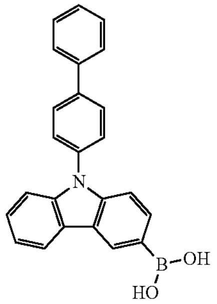 [SMILES: OB(O)c1ccc2c(c1)c1ccccc1n2-c1ccc(-c2ccccc2)cc1] CAS-1028648-22- | 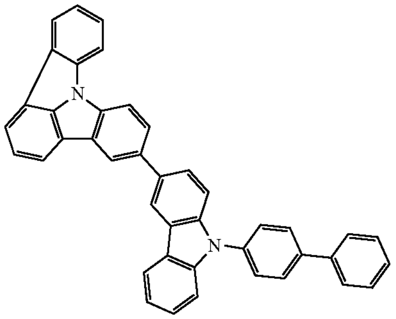 H4 | 59% |
| 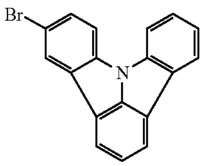 [SMILES: Brc1ccc2c(c1)c1cccc3c4ccccc4n2c31] CAS-109589-98-2 | 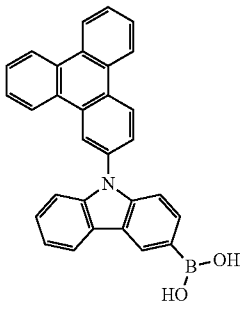 [SMILES: OB(O)c1ccc2c(c1)c1ccccc1n2-c1ccc2c3ccccc3c3ccccc3c2c1] CAS-854952-58-2 | 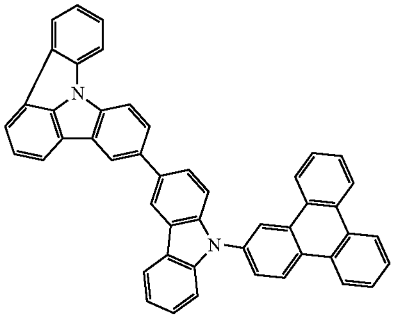 H5 | 64% |

-continued
| Reactant 1 | Reactant 2 | Product | Yield |
| --- | --- | --- | --- |
| 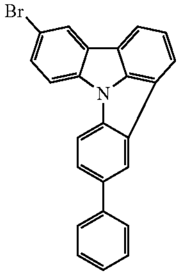 [SMILES: Brc1ccc2c(c1)c1cccc3c4cc(-c5ccccc5)ccc4n2c13] CAS-2108078-02-8 | 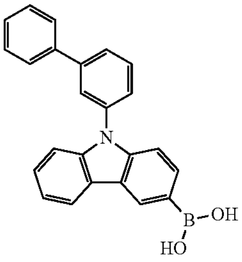 [SMILES: OB(O)c1ccc2c(c1)c1ccccc1n2-c1cccc(-c2ccccc2)c1] CAS-1416814-68-0 | 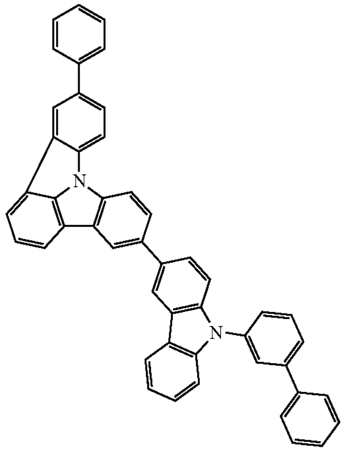 H7 | 55% |
| 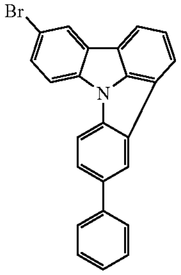 [SMILES: Brc1ccc2c(c1)c1cccc3c4cc(-c5ccccc5)ccc4n2c13] CAS-2108078-02- | 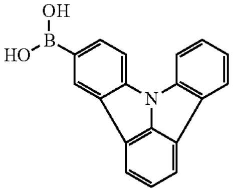 CAS-1174032-92-8 | 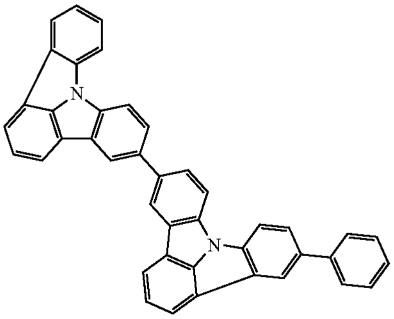 H8 | 50% |
| 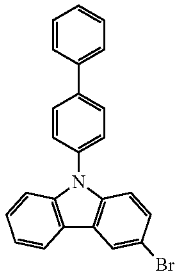 [SMILES: Brc1ccc2c(c1)c1ccccc1n2-c1ccc(-c2ccccc2)cc1] CAS-894791-46-9 | 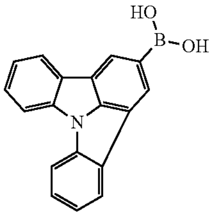 [SMILES: OB(O)c1cc2c3ccccc3n3c4ccccc4c(c1)c23] CAS-1174032-85-9 | 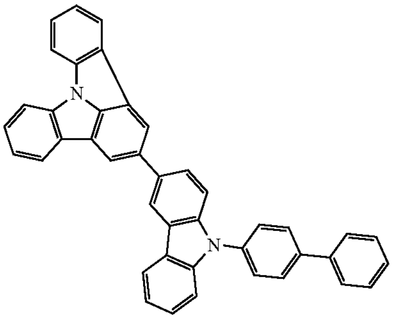 H9 | 45% |
| 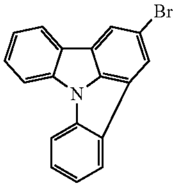 [SMILES: Brc1cc2c3ccccc3n3c4ccccc4c(c1)c23] CAS-1174032-81-5 | 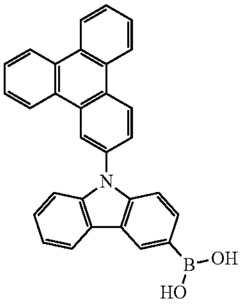 [SMILES: OB(O)c1ccc2c(c1)c1ccccc1n2-c1ccc2c3ccccc3c3ccccc3c2c1] CAS-854952-58-2 | 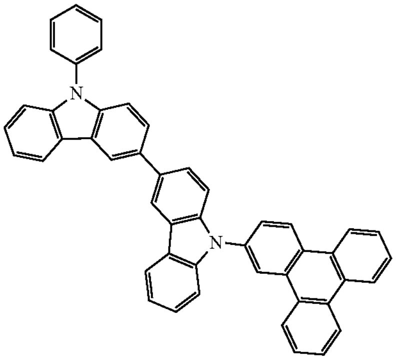 | 58% |

-continued
| Reactant 1 | Reactant 2 | Product | Yield |
| --- | --- | --- | --- |
| 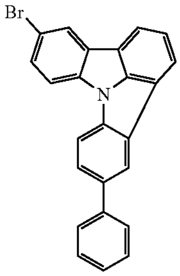 [SMILES: Brc1ccc2c(c1)c1cccc3c4cc(-c5ccccc5)ccc4n2c13] CAS-2108078-02- | 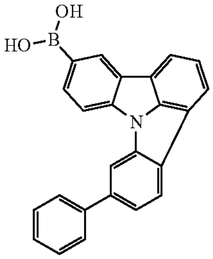 [SMILES: OB(O)c1ccc2c(c1)c1cccc3c4ccc(-c5ccccc5)cc4n2c13] | H10 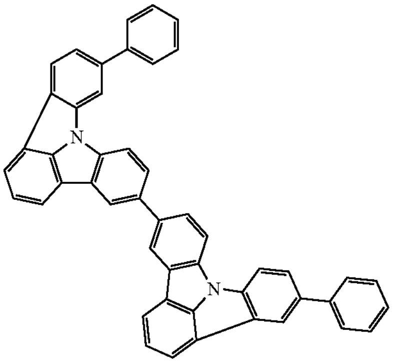 | 62% |
| 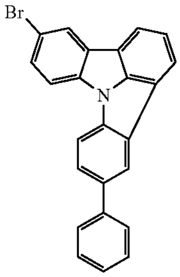 [SMILES: Brc1ccc2c(c1)c1cccc3c4cc(-c5ccccc5)ccc4n2c13] CAS-2108078-02 | 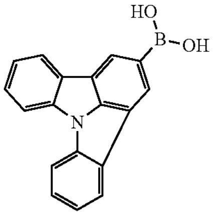 [SMILES: OB(O)c1cc2c3ccccc3n3c4ccccc4c(c1)c23] CAS-1174032-85-9 | H12 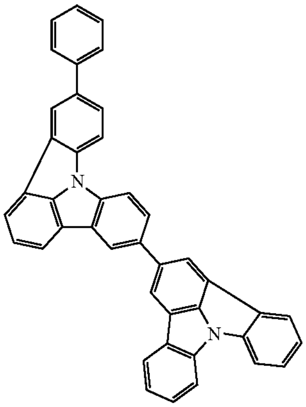 | 38% |
| 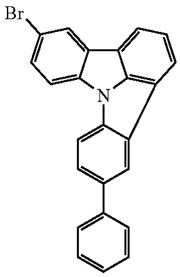 [SMILES: Brc1ccc2c(c1)c1cccc3c4cc(-c5ccccc5)ccc4n2c13] CAS-2108078-02- | 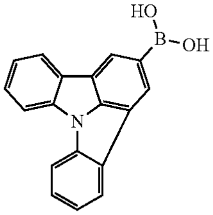 [SMILES: OB(O)c1cc2c3ccccc3n3c4ccccc4c(c1)c23] CAS-1174032-85-9 | H13 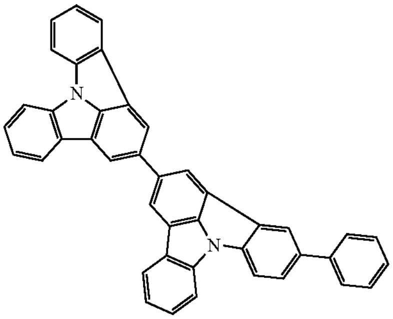 | 46% |
| 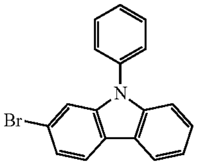 [SMILES: Brc1ccc2c3ccccc3n(-c3ccccc3)c2c1] CAS-94994-62-4 | 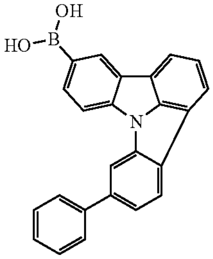 [SMILES: OB(O)c1ccc2c(c1)c1cccc3c4ccc(-c5ccccc5)cc4n2c13] | H14 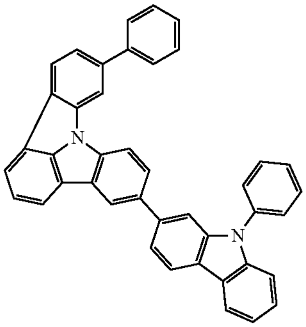 | 40% |

-continued

| Reactant 1 | Reactant 2 | Product | Yield |
|---|---|---|---|
| | | H16 | |
| 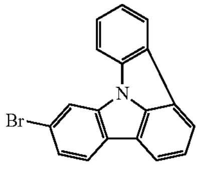 [SMILES: Brc1ccc2c3cccc4c5ccccc5n(c2c1)c43] CAS-858507-84-3 | 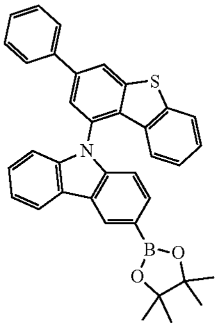 [SMILES: CC1(C)OB(c2ccc3c(c2)c2ccccc2n3-c2cc(-c3ccccc3)cc3sc4ccccc4c23)OC1(C)C] | 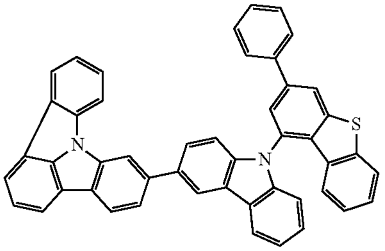 H18 | 52% |
| 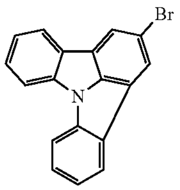 [SMILES: Brc1cc2c3ccccc3n3c4ccccc4c(c1)c23] CAS-1174032-81-5 | 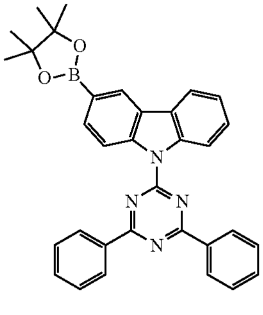 [SMILES: CC1(C)OB(c2ccc3c(c2)c2ccccc2n3-c2nc(-c3ccccc3)nc(-c3ccccc3)n2)OC1(C)C] CAS-1361094-91-8 | 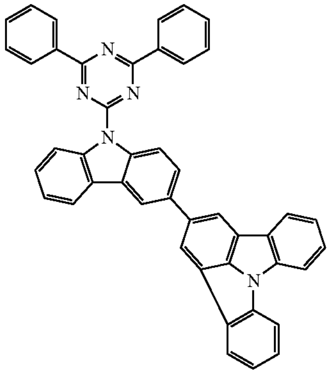 H19 | 41% |

The invention claimed is:

1. An organic electroluminescent device comprising an anode, a cathode and at least one organic layer, containing at least one light-emitting layer, wherein the at least one light-emitting layer contains at least one compound of the formula (1) as host material 1 and at least one compound of the formula (2) as host material 2

Formula (1)

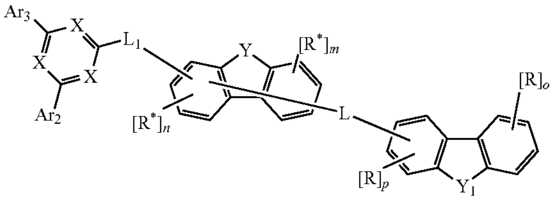

Formula (2)

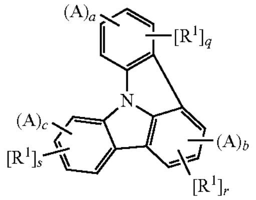

where the symbols and indices used are as follows:

X is the same or different at each instance and is $CR^0$ or N, where at least one symbol X is N;

X2 is the same or different at each instance and is CH, $CR^1$ or N, where not more than 2 symbols X2 can be N;

Y and $Y_1$ are the same or different at each instance and are selected from O and S;

L is the same or different at each instance and is a single bond or an aromatic ring system having 6 to 30 aromatic ring atoms;

$L_1$ is the same or different at each instance and is a single bond or an aromatic or heteroaromatic ring system having 5 to 30 aromatic ring atoms;

$R^0$ at each instance is independently H, D or an unsubstituted or partly or fully deuterated aromatic ring system having 6 to 18 carbon atoms;

R* at each instance is independently D or an aromatic or heteroaromatic ring system that has 6 to 18 carbon atoms and may be partly or fully deuterated;

R #is the same or different at each instance and is selected from the group consisting of D, F, Cl, Br, I, CN, $NO_2$, $C(=O)R^2$, $P(=O)(Ar_1)_2$, $P(Ar_1)_2$, $B(Ar_1)_2$, $Si(Ar_1)_3$, $Si(R^2)_3$, a straight-chain alkyl, alkoxy or thioalkyl group having 1 to 20 carbon atoms or a branched or cyclic alkyl, alkoxy or thioalkyl group having 3 to 20 carbon atoms or an alkenyl group having 2 to 20 carbon atoms, each of which may be substituted by one or more $R^2$ radicals, where one or more nonadjacent $CH_2$ groups may be replaced by $R^2C=CR^2$, $Si(R^2)_2$, C=O, C=S, $C=NR^2$, $P(=O)(R^2)$, SO, $SO_2$, $NR^2$, O, S or CONR$^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals;

R is the same or different at each instance and is selected from the CN group, an aromatic ring system having 6 to 40 aromatic ring atoms and a heteroaromatic ring system having 10 to 40 aromatic ring atoms, where the ring systems may be substituted by one or more $R^2$ radicals and where the heteroaromatic ring system is bonded via N when the heteroaromatic ring system contains a nitrogen atom;

$R^1$ is the same or different at each instance and is selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, or an aryloxy or heteroaryloxy group having 5 to 40 aromatic ring atoms, or an aralkyl or heteroaralkyl group having 5 to 40 aromatic ring atoms; at the same time, it is possible for two substituents $R^1$ bonded to the same carbon atom or to adjacent carbon atoms to form a monocyclic or polycyclic, aliphatic, aromatic or heteroaromatic ring system that may be substituted by one or more $R^2$ radicals;

$R^2$ is the same or different at each instance and is selected from the group consisting of H, D, F, Cl, Br, I, CN, $NO_2$, $N(Ar_1)_2$, $NH_2$, $N(R^3)_2$, $C(=O)Ar_1$, C(=O) H, $C(=O)R^3$, $P(=O)(Ar_1)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^3$ radicals, where one or more nonadjacent $CH_2$ groups may be replaced by HC=CH, $R^3C=CR^3$, C≡C, $Si(R^3)_2$, $Ge(R^3)_2$, $Sn(R^3)_2$, C=O, C=S, C=Se, $C=NR^3$, $P(=O)(R^3)$, SO, $SO_2$, NH, $NR^3$, O, S, CONH or $CONR^3$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^3$ radicals, an aryloxy or heteroaryloxy group which has 5 to 60 aromatic ring atoms and may be substituted by one or more $R^3$ radicals, or a combination of these systems, where it is optionally possible for two or more adjacent substituents $R^2$ to form a monocyclic or polycyclic, aliphatic, aromatic or heteroaromatic ring system which may be substituted by one or more $R^3$ radicals;

$R^3$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F, Cl, Br, I or CN and which may be substituted by one or more alkyl groups each having 1 to 4 carbon atoms; at the same time, it is possible for two or more adjacent $R^3$ substituents together to form a mono- or polycyclic, aliphatic ring system;

$Ar_1$ is the same or different at each instance and is an aromatic or heteroaromatic ring system which has 5 to 30 aromatic ring atoms and may be substituted by one or more nonaromatic $R^3$ radicals; at the same time, two $Ar_1$ radicals bonded to the same nitrogen atom, phosphorus atom or boron atom may also be bridged to one another by a single bond or a bridge selected from $N(R^3)$, $C(R^3)_2$, O and S;

$Ar_2$ and $Ar_3$ at each instance are each independently an aryl or heteroaryl group which has 5 to 40 aromatic ring atoms and may be substituted by one or more $R^2$ radicals;

A at each instance is independently a group of the formula (3) or (4),

Formula (3)

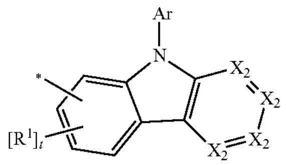

Formula (4)

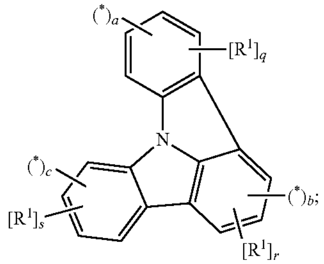

Ar at each instance is in each case independently an aryl group which has 6 to 40 aromatic ring atoms and may be substituted by one or more R #radicals, or a heteroaryl group which has 5 to 40 aromatic ring atoms and may be substituted by one or more R #radicals;

* indicates the binding site to the formula (2);

a, b, c at each instance are each independently 0 or 1, where the sum total of the indices at each instance a+b+c is 1;

m and o at each instance are independently 0, 1, 2, 3 or 4;

n and p at each instance are each independently 0, 1, 2 or 3; and q, r, s, t at each instance are each independently 0 or 1.

2. The organic electroluminescent device according to claim 1, wherein the symbol Y in host material 1 is O.

3. The organic electroluminescent device according to claim 1, wherein host material 2 conforms to one of the formulae (2a), (2b) or (2c)

Formula (2a)

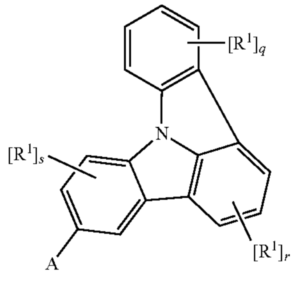

-continued

Formula (2b)

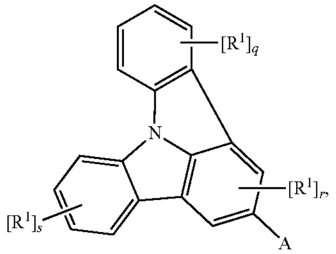

Formula (2c)

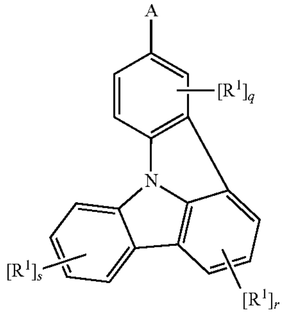

where the symbols and indices A, $R^1$, q, r and s used are as defined in claim 1.

4. The organic electroluminescent device according to claim 1, wherein, in the host material 1, X is N at two instances or X is N at three instances.

5. The organic electroluminescent device according to claim 1, wherein the device is an electroluminescent device selected from organic light-emitting transistors (OLETs), organic field quench devices (OFQDs), organic light-emitting electrochemical cells (OLECs, LECs, LEECs), organic laser diodes (O-lasers) and organic light-emitting diodes (OLEDs).

6. The organic electroluminescent device according to claim 1, wherein the device comprises, in addition to the light-emitting layer (EML), a hole injection layer (HIL), a hole transport layer (HTL), an electron transport layer (ETL), an electron injection layer (EIL) and/or a hole blocker layer (HBL).

7. The organic electroluminescent device according to claim 1, wherein the light-emitting layer, as well as the at least one host material 1 and the at least one host material 2, contains at least one phosphorescent emitter.

8. The organic electroluminescent device according to claim 7, wherein the phosphorescent emitter conforms to the formula (III)

Formula (III)

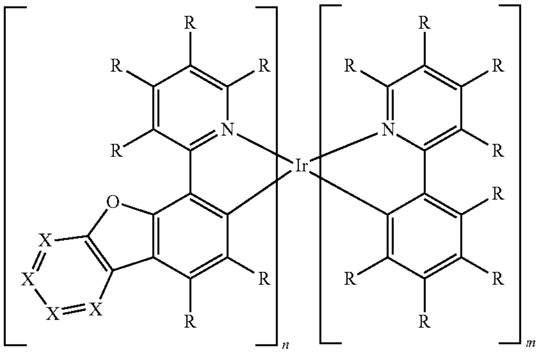

where the symbols and indices for this formula (III) are defined as follows:

n+m is 3, n is 1 or 2, m is 2 or 1,

X is N or CR,

R is H, D or a branched or linear alkyl group or a partly or fully deuterated, branched or linear alkyl group.

9. A process for producing the device according to claim 1 comprising applying the light-emitting layer by gas phase deposition or from solution.

10. The process according to claim 9, wherein the at least one compound of the formula (1) and the at least one compound of the formula (2) are deposited from the gas phase successively or simultaneously from at least two material sources, optionally with the at least one phosphorescent emitter, and form the light-emitting layer.

11. The process according to claim 9, wherein the at least one compound of the formula (1) and the at least one compound of the formula (2) are deposited from the gas phase as a mixture, successively or simultaneously with the at least one phosphorescent emitter, and form the light-emitting layer.

12. The process according to claim 9, wherein the at least one compound of the formula (1) and the at least one compound of the formula (2) are applied from a solution together with the at least one phosphorescent emitter to form the light-emitting layer.

13. A mixture comprising at least one compound of the formula (1) as host material 1 and at least one compound of the formula (2) as host material 2

Formula (1)

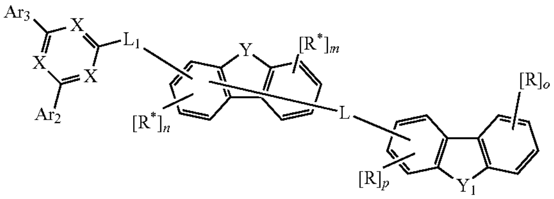

Formula (2)

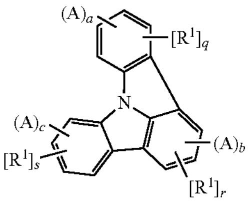

where the symbols and indices used are as follows:

X is the same or different at each instance and is $CR^0$ or N, where at least one symbol X is N;

$X_2$ is the same or different at each instance and is CH, $CR^1$ or N, where not more than 2 symbols $X_2$ can be N;

Y and $Y_1$ are the same or different at each instance and are selected from O and S;

L is the same or different at each instance and is a single bond or an aromatic ring system having 6 to 30 aromatic ring atoms;

$L_1$ is the same or different at each instance and is a single bond or an aromatic or heteroaromatic ring system having 5 to 30 aromatic ring atoms;

$R^0$ at each instance is independently H, D or an unsubstituted or partly or fully deuterated aromatic ring system having 6 to 18 carbon atoms;

R* at each instance is independently D or an aromatic or heteroaromatic ring system that has 6 to 18 carbon atoms and may be partly or fully deuterated;

R #is the same or different at each instance and is selected from the group consisting of D, F, Cl, Br, I, CN, $NO_2$, $C({=}O)R^2$, $P({=}O)(Ar_1)_2$, $P(Ar_1)_2$, $B(Ar_1)_2$, $Si(Ar_1)_3$, $Si(R^2)_3$, a straight-chain alkyl, alkoxy or thioalkyl group having 1 to 20 carbon atoms or a branched or cyclic alkyl, alkoxy or thioalkyl group having 3 to 20 carbon atoms or an alkenyl group having 2 to 20 carbon atoms, each of which may be substituted by one or more $R^2$ radicals, where one or more nonadjacent $CH_2$ groups may be replaced by $R^2C{=}CR^2$, $Si(R^2)_2$, C=O, C=S, $C{=}NR^2$, $P({=}O)(R^2)$, SO, $SO_2$, $NR^2$, O, S or $CONR^2$ and where one or more hydrogen atoms may be replaced by D, F, Cl, Br, I, CN or $NO_2$, an aromatic or heteroaromatic ring system which has 5 to 40 aromatic ring atoms and may be substituted in each case by one or more $R^2$ radicals, an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals;

R is the same or different at each instance and is selected from the CN group, an aromatic ring system having 6 to 40 aromatic ring atoms and a heteroaromatic ring system having 10 to 40 aromatic ring atoms, where the ring systems may be substituted by one or more $R^2$ radicals and where the heteroaromatic ring system is bonded via N when the heteroaromatic ring system contains a nitrogen atom;

$R^1$ is the same or different at each instance and is selected from the group consisting of CN, a straight-chain alkyl, alkoxy or thioalkyl group having 1 to 20 carbon atoms or a branched or cyclic alkyl, alkoxy or thioalkyl group having 3 to 20 carbon atoms, an aromatic or heteroaromatic ring system having 5 to 40 aromatic ring atoms, or an aryloxy or heteroaryloxy group having 5 to 40 aromatic ring atoms, or an aralkyl or heteroaralkyl group having 5 to 40 aromatic ring atoms; at the same time, it is possible for two substituents $R^1$ bonded to the same carbon atom or to adjacent carbon atoms to form a monocyclic or polycyclic, aliphatic, aromatic or heteroaromatic ring system that may be substituted by one or more $R^2$ radicals;

$R^2$ is the same or different at each instance and is selected from the group consisting of H, D, F, Cl, Br, I, CN, $NO_2$, $N(Ar_1)_2$, $NH_2$, $N(R^3)_2$, $C({=}O)Ar_1$, C(=O) H, $C({=}O)R^3$, $P({=}O)(Ar_1)_2$, a straight-chain alkyl, alkoxy or thioalkyl group having 1 to 40 carbon atoms or a branched or cyclic alkyl, alkoxy or thioalkyl group having 3 to 40 carbon atoms or an alkenyl or alkynyl group having 2 to 40 carbon atoms, each of which may be substituted by one or more $R^3$ radicals, where one or more nonadjacent $CH_2$ groups may be replaced by HC=CH, $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, NH, $NR^3$, O, S, CONH or $CONR^3$ and where one or more hydrogen atoms may be replaced by D, F, Cl, Br, I, CN or $NO_2$, an aromatic or heteroaromatic ring system which has 5 to 60 aromatic ring atoms and may be substituted in each case by one or more $R^3$ radicals, an aryloxy or heteroaryloxy group which has 5 to 60 aromatic ring atoms and may be substituted by one or more $R^3$ radicals, or a combination of these systems, where it is optionally possible for two or more adjacent substituents $R^2$ to form a monocyclic or polycyclic, aliphatic, aromatic or heteroaromatic ring system which may be substituted by one or more $R^3$ radicals;

$R^3$ is the same or different at each instance and is selected from the group consisting of H, D, F, CN, an aliphatic hydrocarbyl radical having 1 to 20 carbon atoms, or an aromatic or heteroaromatic ring system having 5 to 30 aromatic ring atoms in which one or more hydrogen atoms may be replaced by D, F, Cl, Br, I or CN and which may be substituted by one or more alkyl groups each having 1 to 4 carbon atoms; at the same time, it is possible for two or more adjacent $R^3$ substituents together to form a mono- or polycyclic, aliphatic ring system;

$Ar_1$ is the same or different at each instance and is an aromatic or heteroaromatic ring system which has 5 to 30 aromatic ring atoms and may be substituted by one or more nonaromatic $R^3$ radicals; at the same time, two $Ar_1$ radicals bonded to the same nitrogen atom, phosphorus atom or boron atom may also be bridged to one another by a single bond or a bridge selected from $N(R^3)$, $C(R^3)_2$, O and S;

$Ar_2$ and $Ar_3$ at each instance are each independently an aryl or heteroaryl group which has 5 to 40 aromatic ring atoms and may be substituted by one or more $R^2$ radicals;

at each instance is independently a group of the formula (3) or (4), A

Formula (3)

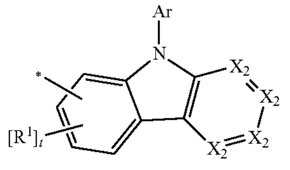

Formula (4)

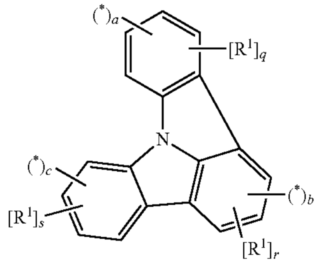

Ar at each instance is in each case independently an aryl group which has 6 to 40 aromatic ring atoms and may be substituted by one or more R #radicals, or a heteroaryl group which has 5 to 40 aromatic ring atoms and may be substituted by one or more R #radicals;

* indicates the binding site to the formula (2);

a, b, c at each instance are each independently 0 or 1, where the sum total of the indices at each instance a+b+c is 1;

m and o at each instance are independently 0, 1, 2, 3 or 4;

n and p at each instance are each independently 0, 1, 2 or 3; and q, r, s, t at each instance are each independently 0 or 1.

14. The mixture according to claim 13, wherein the mixture consists of at least one compound of the formula (1), at least one compound of the formula (2) and a phosphorescent emitter.

15. A formulation comprising a mixture according to claim 13 and at least one solvent.

* * * * *